US010455006B2

(12) United States Patent
Aoyama et al.

(10) Patent No.: US 10,455,006 B2
(45) Date of Patent: Oct. 22, 2019

(54) SIGNAL GENERATING METHOD, SIGNAL GENERATING UNIT, AND NON-TRANSITORY RECORDING MEDIUM STORING COMPUTER PROGRAM

(71) Applicant: PANASONIC INTELLECTUAL PROPERTY CORPORATION OF AMERICA, Torrance, CA (US)

(72) Inventors: Hideki Aoyama, Osaka (JP); Mitsuaki Oshima, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 16/383,206

(22) Filed: Apr. 12, 2019

(65) Prior Publication Data

US 2019/0238631 A1 Aug. 1, 2019

Related U.S. Application Data

(63) Continuation of application No. 15/647,300, filed on Jul. 12, 2017, now Pat. No. 10,326,831, which is a continuation of application No. PCT/JP2016/000993, filed on Feb. 25, 2016.

(30) Foreign Application Priority Data

Feb. 27, 2015 (JP) ................................ 2015-039605
Mar. 2, 2015 (JP) ................................ 2015-040806

(51) Int. Cl.

| | |
|---|---|
| ***H04L 29/08*** | (2006.01) |
| ***H04B 10/116*** | (2013.01) |
| ***H04L 27/26*** | (2006.01) |
| ***G06F 16/958*** | (2019.01) |
| ***G01R 27/04*** | (2006.01) |
| ***H04B 3/14*** | (2006.01) |

(52) U.S. Cl.

CPC .......... *H04L 67/1006* (2013.01); *G01R 27/04* (2013.01); *G06F 16/958* (2019.01); *H04B 3/14* (2013.01); *H04B 10/116* (2013.01); *H04L 27/2602* (2013.01); *H04L 67/02* (2013.01)

(58) Field of Classification Search

None
See application file for complete search history.

(56) References Cited

U.S. PATENT DOCUMENTS

| | | | |
|---|---|---|---|
| 9,955,541 | B2 | 4/2018 | Dowling |
| 2002/0167701 | A1 | 11/2002 | Hirata |
| 2005/0007312 | A1 | 1/2005 | Tanaka |
| 2008/0215391 | A1 | 9/2008 | Dowling |
| 2008/0279304 | A1 | 11/2008 | Fukae et al. |
| 2009/0154496 | A1 | 6/2009 | Fujinami |
| 2010/0247112 | A1 | 9/2010 | Chang |
| 2011/0002695 | A1 | 1/2011 | Choi et al. |
| 2011/0141929 | A1 | 6/2011 | Razdan |

FOREIGN PATENT DOCUMENTS

| | | |
|---|---|---|
| JP | 2002-290335 | 10/2002 |
| JP | 2008-301472 | 12/2008 |
| JP | 2011-517868 | 6/2011 |
| JP | 4922458 B | 4/2012 |
| JP | 2014-225790 | 12/2014 |
| WO | 2011/055895 | 5/2011 |

OTHER PUBLICATIONS

International Search Report of PCT application No. PCT/JP2016/000993 dated May 17, 2016.

The Extended European Search Report dated Jan. 29, 2018 for European Patent Application No. 16755006.0.

*Primary Examiner* — Brian Whipple

(74) *Attorney, Agent, or Firm* — Greenblum & Bernstein, P.L.C.

(57) ABSTRACT

A signal generating method for generating a visible light signal is provided. The method includes determining, as a method for transmitting a visible light signal from a transmitter, one of a single-frame transmitting method for transmitting data as one frame and a multiple-frame transmitting method for transmitting the data while dividing the data into a plurality of frames. The method further includes, when the multiple-frame transmitting method is determined, generating partition type information indicating a type of data to be transmitted, and generating combination data by adding the partition type information to the data to be transmitted. Further, the method includes generating the plurality of frames each of which includes each of a plurality of data parts by dividing the combination data into the plurality of data parts, and generating the visible light signal by adding a preamble to a head of each of the plurality of frames.

7 Claims, 499 Drawing Sheets

FIG. 35A
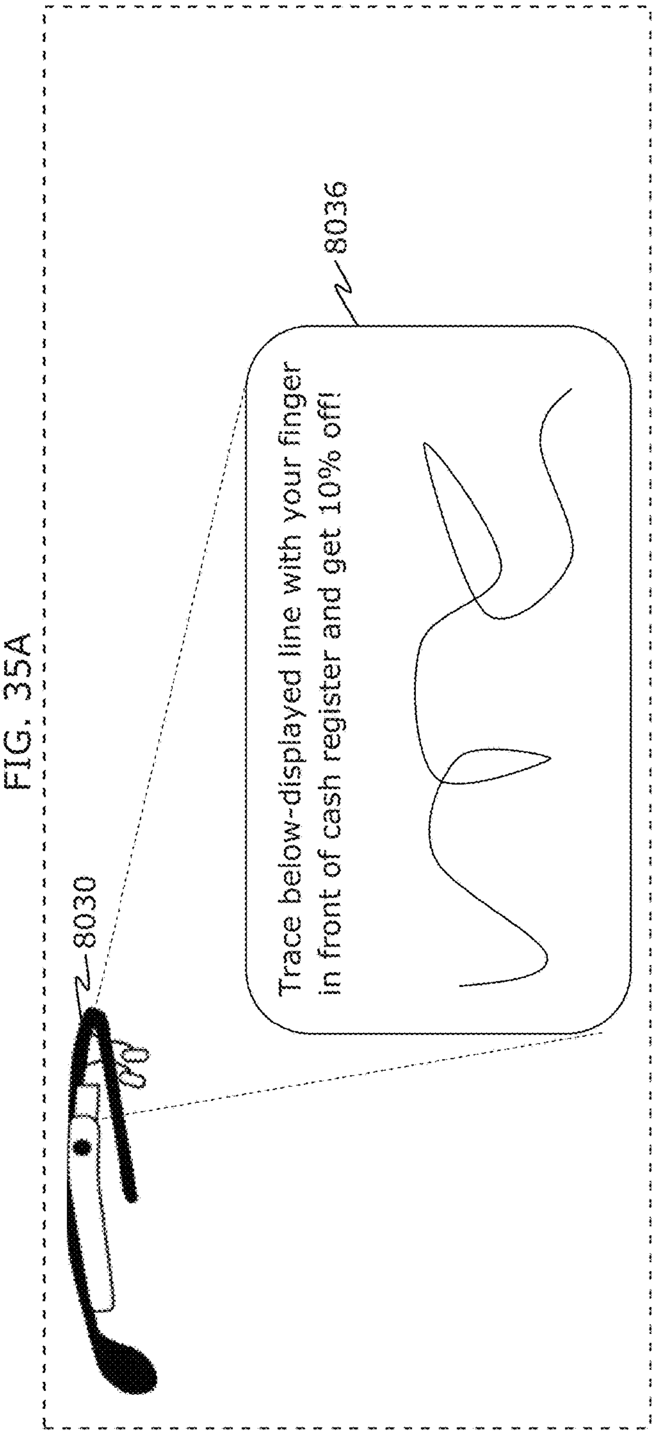
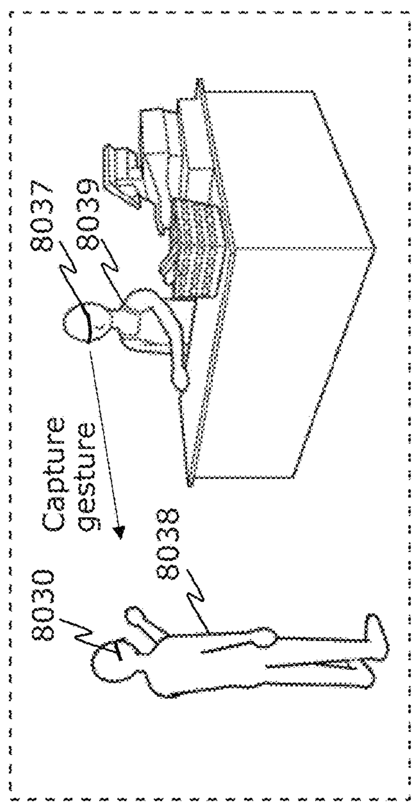
FIG. 35B

FIG. 36A
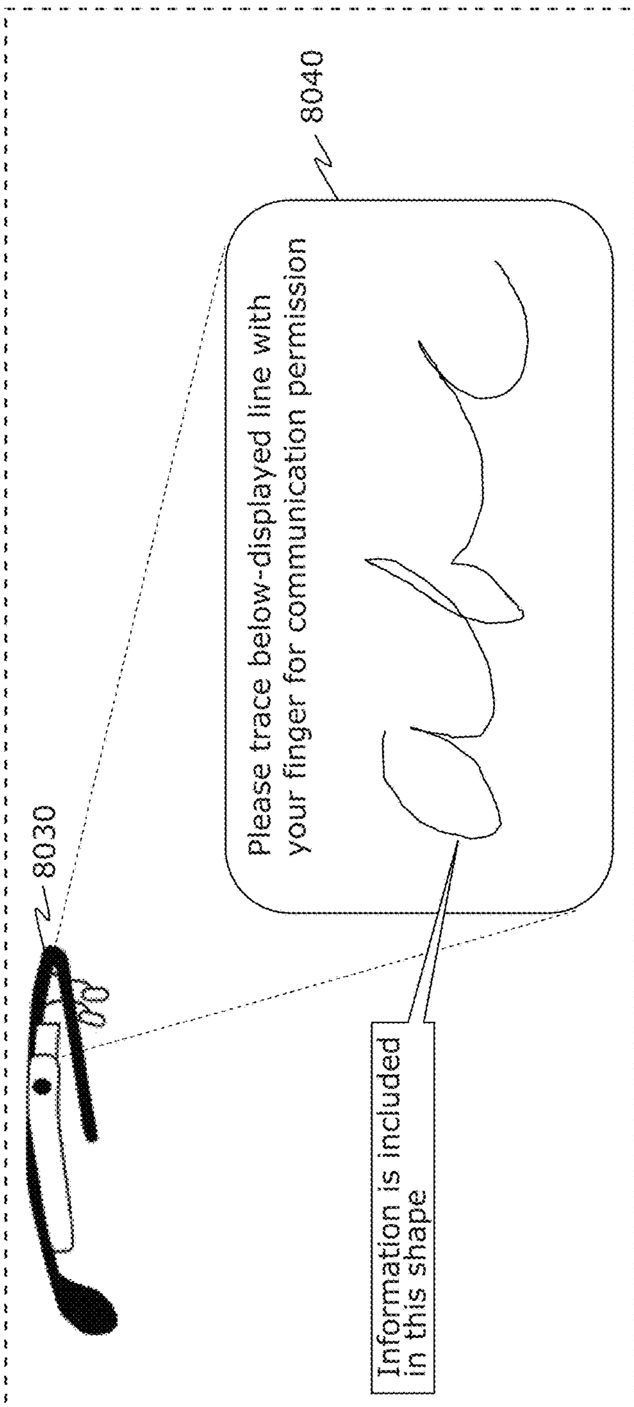
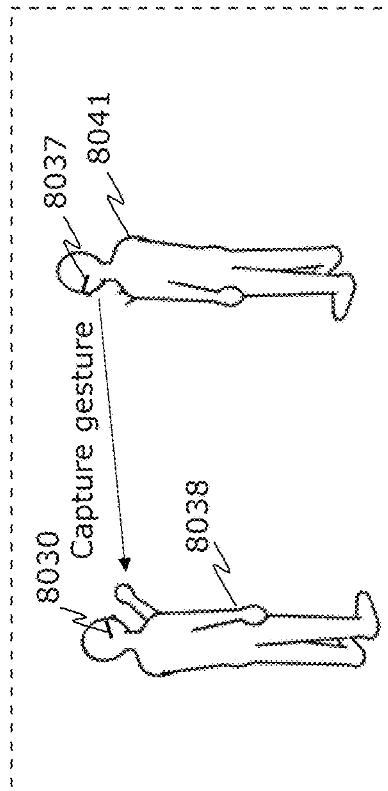
FIG. 36B

FIG. 78
| Signal | Rise position | Brightness 75 % | Brightness 99 % | Brightness 1 % |
| --- | --- | --- | --- | --- |
| 00 | Position of 25% | 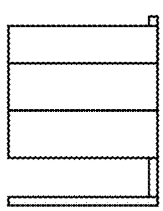 | 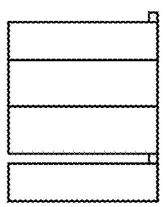 | 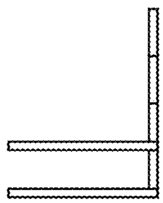 |
| 01 | Position of 50% | 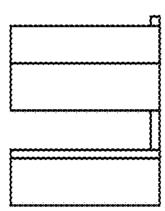 | 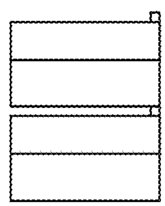 | 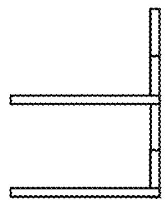 |
| 10 | Position of 75% | 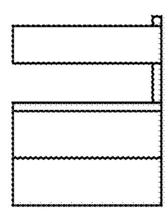 | 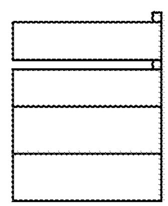 | 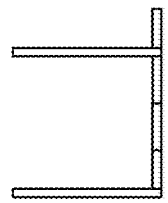 |
| 11 | None | 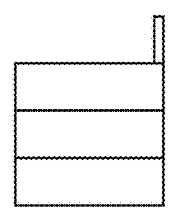 | 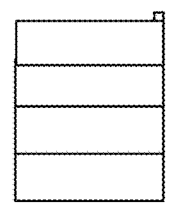 | 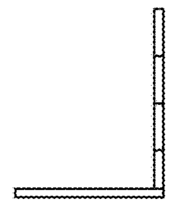 |

FIG. 116

| ID | 100 | 110 |
|---|---|---|
| Frequency | 2 kHz | 1 kHz |
| Signal | 1002 | 1101 |

FIG. 139

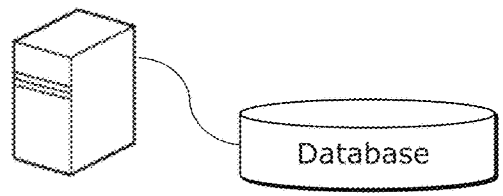

| ID | Data | Condition | Number of accesses | Number of successful accesses |
|---|---|---|---|---|
| 1000 | http://~~~ | From 2013/10/10 09:00 to 2013/10/25 20:00 | 1234 | 567 |
| 2000 | "Hello world" | Number of successful accesses is less than or equal to 100 | 153 | 100 |
| 3000 | 10% off | Female only | 9999 | 666 |
| 4000 | Position data (east longitude, north latitude, altitude, floor number, room number, etc.) | None | 2 | 2 |

(a)ID-data table

| ID | User ID | Time | Ancillary information | Whether or not data is provided |
|---|---|---|---|---|
| 1000 | 35393 | 2013/10/25 19:11 | Male, age 20, student ... | ○ / http://~~~ |
| 1000 | 49282 | 2013/10/25 19:57 | Female, age 30, housewife ... | ○ / http://~~~ |
| 1000 | 222 | 2013/10/25 20:15 | Male, age 40, civil servant ... | × / "Error" |
| 2000 | 30455 | 2013/10/27 12:12 | Female, age 50, unemployed ... | ○ / "Hello world" |

(b) Access log table

FIG. 228

| TYPE definition | TYPEBIT | BODY length | ADDR length | DATA length | Concatenation number | Effective DATA length | CRC type |
|---|---|---|---|---|---|---|---|
| TYPE1 | 000 | 20 SLOT | 2 BIT | 5 BIT | 4 | 16 BIT | CRC-4 |
| TYPE2 | 001 | 24 SLOT | 4 BIT | 5 BIT | 8 | 32 BIT | CRC-8 |
| TYPE3 | 010 | 24 SLOT | 5 BIT | 4 BIT | 19 | 64 BIT | CRC-12 |
| TYPE4 | 011 | 28 SLOT | 5 BIT | 6 BIT | 24 | 128 BIT | CRC-16 |

FIG. 271

| Header | Body (4PPM) |
|---|---|

| | Header pattern | Required number of slots for identification | Greatest number of continuous 0 slots |
|---|---|---|---|
| (a) | 111111111000 | 4 | 4 |
| (b) | 111111110001 | 5 | 3 |
| (c) | 111111101001 | 6 | 2 |
| (d) | 111111100101 | 6 | 2 |

(a) When address size is variable (When transmission data size is not variable)

(b) When address size is fixed at 4 bits (When transmission data size is variable)

(a) Flow in receiver (b) Flow in electronic device (transmitter)

(a) Analog sine wave (b) ON/OFF signal at ELR of 50% (c) ON/OFF signal at ELR of 75%

(a) V4PPM symbols (b) VPPM symbols in ELR of 75%

Symbol transmission time is equal when the shortest recognizable length of luminance state is the same.
In this case, the efficiency of V4PPM with 2 bit information volume is double that of VPPM with 1 bit information volume.

(a) Distribution of frequencies measured on real devices (b) Distribution of frequencies of simulated signals

FIG. 402A

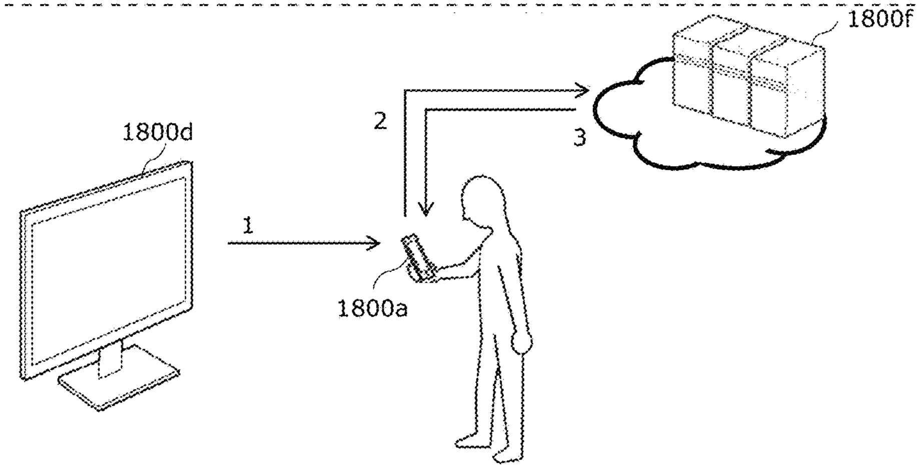

| | 1 | 2 | Server | 3 | Receiver operation |
|---|---|---|---|---|---|
| a | Content ID, ongoing content reproduction time point | Content ID | | Content | Reproduce content from point of time of (ongoing content reproduction time point + elapsed time since ID reception) |
| b | Content ID, ongoing content reproduction time point | Content ID, ongoing content reproduction time point | | Partial content on and after ongoing content reproduction time point | Reproduce partial content after point of time of (elapsed time since ID reception) |
| c | Transmitter ID, ongoing content reproduction time point | Transmitter ID | Identify content that is being reproduced, from reproduction schedule of each transmitter and server time point | Content | Reproduce content from point of time of (ongoing content reproduction time point + elapsed time since ID reception) |
| d | Transmitter ID, transmitter time point | Transmitter ID, transmitter time point | Identify content that is being reproduced, from reproduction schedule of each transmitter and server time point | Content, ongoing content reproduction time point | Reproduce content from point of time of (ongoing content reproduction time point + elapsed time since ID reception) |
| e | Transmitter ID | Transmitter ID | Identify content that is being reproduced, from reproduction schedule of each transmitter and server time point | Content, content reproduction start time point | Clock setting of receiver Reproduce content from point of time of (receiver time point − content reproduction start time point) |

FIG. 428

| Basic pattern | Preamble |
| --- | --- |
| 000 | 0001 1111 1111 |
| | 1111 0001 1111 |
| | 1111 1111 1000 |
| 0010 | 0010 1111 1111 |
| | 1111 0010 1111 |
| | 1111 1111 0010 |
| 0100 | 0100 1111 1111 |
| | 1111 0100 1111 |
| | 1111 1111 0100 |
| 01010 | 0101 0111 1111 |
| | 1111 1110 1010 |
| 01100 | 0110 0111 1111 |
| | 1111 1110 1100 |
| 00110 | 0011 0111 1111 |
| | 1111 1110 0110 |
| 0111 1111 0 | 0111 1111 0011 |
| | 0111 1111 0101 |
| | 0111 1111 0110 |
| | 1100 1111 1110 |
| | 1010 1111 1110 |
| | 0110 1111 1110 |
| 0111 1111 10 | 0111 1111 1001 |
| | 0111 1111 1010 |
| | 1001 1111 1110 |
| | 0101 1111 1110 |
| 0111 1111 110 | 0111 1111 1100 |
| | 0011 1111 1110 |

FIG. 429

| Preamble | Number of divisions |
|---|---|
| 0001 1111 1111 | - |
| 0010 1111 1111 | 2 |
| 0100 1111 1111 | 4 |
| 0101 0111 1111 | 8 |
| 0110 0111 1111 | 16 |
| 0011 0111 1111 | streaming |
| 0111 1111 0011 | 6 |
| 0111 1111 1001 | 10 |
| 0111 1111 1100 | 12 |

(a)

| Preamble | Number of divisions |
|---|---|
| 0001 1111 1111 | - |
| 1111 1111 0010 | 2 |
| 1111 1111 0100 | 4 |
| 1111 1110 1010 | 8 |
| 1111 1110 1100 | 16 |
| 1111 1110 0110 | streaming |
| 1100 1111 1110 | 6 |
| 1001 1111 1110 | 10 |
| 0111 1111 1100 | 12 |

(b)

| Preamble | Number of divisions |
|---|---|
| 0001 1111 1111 | - |
| 1111 1110 0101 | 2 |
| 1111 1110 1001 | 4 |
| 1111 1101 0101 | 8 |
| 1111 1101 1001 | 16 |
| 1111 1100 1101 | streaming |
| 1001 1111 1101 | 6 |
| 0011 1111 1101 | 10 |
| 0111 1111 1100 | 12 |

| TYPE | Payload length [bit] |
|---|---|
| 0000 | - |
| 0001 | 2 |
| 0010 | 4 |
| 0011 | 8 |
| 0100 | 16 |
| 0101 | 32 |
| 0110 | 64 |
| 0111 | 128 |
| 1000 | 256 |
| 1001 | 512 |
| 1010 | 1024 |
| 1011 | 2048 |
| 1100 | 4096 |
| 1101 | 8192 |
| 1110 | 16384 |
| 1111 | reserved |

(a)

| TYPE | Data length |
|---|---|
| 000 | - |
| 001 | 32 |
| 010 | 64 |
| 011 | 128 |
| 100 | 256 |
| 101 | 512 |
| 110 | 1024 |
| 111 | - |

(b)

| Number of divisions | TYPE length [bit] |
|---|---|
| - | 8 |
| 2 | 4 |
| 4 | 5 |
| 8 | 6 |
| 16 | 7 |
| 32 | 8 |
| 64 | 9 |
| Streaming | 3 or 4 |

| Payload [bit] | Check part A [bit] | Check part B [bit] |
|---|---|---|
| 1 | 2 | 0 |
| 2 | 2 | 2 |
| 4 | 2 | 2 |
| 8 | 2 | 2 |
| 16 | 4 | 4 |
| 32 | 8 | 8 |
| 64 | 16 | 16 |
| 128 | 32 | 32 |
| 256 | 32 | 32 |
| 512 | 32 | 64 |
| 1024 | 32 | 64 |
| 2048 | 32 | 128 |
| 4096 | 32 | 128 |
| 8192 | 32 | 128 |
| 16384 | 32 | 256 |
| 32768 | 32 | 256 |

FIG. 433

| Luminance | Preamble | Body | Luminance adjustment part |
|---|---|---|---|
| 77.55% | 111000111 | 4PPM (75%) | 1 1111 111 |
| ⋮ | 111000111 | 4PPM (75%) | ⋮ |
| 61.22% | 111000111 | 4PPM (75%) | 0 0000 000 |
| 61.22% | 111000111 | 4PPM (50%) | 1 1111 111 |
| ⋮ | 111000111 | 4PPM (50%) | ⋮ |
| 44.90% | 111000111 | 4PPM (50%) | 0 0000 000 |
| 55.10% | 000111000 | 4PPM (50%) | 1 1111 111 |
| ⋮ | 000111000 | 4PPM (50%) | ⋮ |
| 38.78% | 000111000 | 4PPM (50%) | 0 0000 000 |
| 38.78% | 000111000 | 4PPM (25%) | 1 1111 111 |
| ⋮ | 000111000 | 4PPM (25%) | ⋮ |
| 22.45% | 000111000 | 4PPM (25%) | 0 0000 000 |

(a)

Preamble: 9 slot
Body: 32 slot
Luminance adjustment part: 8 slot

| Luminance | Preamble | Body | Luminance adjustment part |
|---|---|---|---|
| 77.27% | 111000111 | 4PPM (75%) | 1111 111 |
| ⋮ | 111000111 | 4PPM (75%) | ⋮ |
| 61.36% | 111000111 | 4PPM (75%) | 0000 000 |
| 61.36% | 111000111 | 4PPM (50%) | 1111 111 |
| ⋮ | 111000111 | 4PPM (50%) | ⋮ |
| 45.45% | 111000111 | 4PPM (50%) | 0000 000 |
| 54.55% | 000111000 | 4PPM (50%) | 1111 111 |
| ⋮ | 000111000 | 4PPM (50%) | ⋮ |
| 38.64% | 000111000 | 4PPM (50%) | 0000 000 |
| 38.64% | 000111000 | 4PPM (25%) | 1111 111 |
| ⋮ | 000111000 | 4PPM (25%) | ⋮ |
| 22.73% | 000111000 | 4PPM (25%) | 0000 000 |

(b)

Preamble: 9 slot
Body: 28 slot
Luminance adjustment part: 7 slot

FIG. 441

| FLEN [bit] | Lengthof ID/DATA [bit] |
|---|---|
| 000 | For experiment |
| 001 | 32 |
| 010 | 64 |
| 011 | 128 |
| 100 | 256 |
| 101 | 512 |
| 110 | 1024 |
| 111 | 2048 |

(a)

| FLEN [bit] | Lengthof ID/DATA [bit] |
|---|---|
| 0000 | For experiment |
| 0001 | For experiment |
| 0010 | 4 |
| 0011 | 8 |
| 0100 | 16 |
| 0101 | 32 |
| 0110 | 64 |
| 0111 | 128 |
| 1000 | 256 |
| 1001 | 512 |
| 1010 | 1024 |
| 1011 | 2048 |
| 1100 | 4096 |
| 1101 | 8192 |
| 1110 | 16384 |
| 1111 | 32768 |

| FLEN [bit] | Lengthof ID/DATA [bit] |
|---|---|
| 000 | 4096 |
| 001 | 2048 |
| 010 | 1024 |
| 011 | 512 |
| 100 | 256 |
| 101 | 128 |
| 110 | 64 |
| 111 | 32 |

(a)

| FLEN [bit] | Lengthof ID/DATA [bit] |
|---|---|
| 0000 | 4 |
| 0001 | 8 |
| 0010 | 16 |
| 0011 | 32 |
| 0100 | 64 |
| 0101 | 128 |
| 0110 | 256 |
| 0111 | 512 |
| 1000 | 1024 |
| 1001 | 2048 |
| 1010 | 4096 |
| 1011 | 8192 |
| 1100 | 16384 |
| 1101 | 32768 |
| 1110 | 65536 |
| 1111 | reserved |

| Length tobe checked | Length of CRC | Generator polynomial |
|---|---|---|
| <= 16 | 8 | X8 + X7 + X6 + X4 + X2 + 1 |
| <= 64 | 12 | X12 + X11 + X3 + X2 + X + 1 |
| <= 256 | 16 | X16 + X15 + X2 + 1 |
| <= 1024 | 20 | |

(a)

| Length tobe checked | Length of CRC | Generator polynomial |
|---|---|---|
| <= 16 | 8 | X8 + X7 + X6 + X4 + X2 + 1 |
| <= 64 | 12 | X12 + X11 + X3 + X2 + X + 1 |
| <= 256 | 16 | X16 + X15 + X2 + 1 |
| >256 | 24 | X24 + X23 + X18 + X17 + X14 + X11 + X10 + X7 + X6 + X5 + X4 + X3 + X + 1 |

| PRE [slot] | | Length of DATAPART [bit] |
|---|---|---|
| Last address | Not last address | |
| 1101 0000 0000 | 0000 0000 1101 | 64 |
| 1011 0000 0000 | 0000 0000 1011 | 32 |
| 1100 1000 0000 | 0000 0001 1001 | 16 |
| 1001 1000 0000 | 0000 0001 0011 | 8 |
| 1010 1000 0000 | 0000 0001 0101 | 4 |

(a)

| PRE [slot] | Length of DATAPART [bit] |
|---|---|
| 1101 0000 0000 | 64 (Not last address) |
| 1011 0000 0000 | 32 (Not last address) |
| 1100 1000 0000 | 16 (Not last address) |
| 1001 1000 0000 | 8 (Not last address) |
| 1010 1000 0000 | 4 (Not last address) |
| 0000 0001 0101 | Last address |

(b)

| PRE [slot] | The number of divisions |
|---|---|
| 1110 0000 0000 | 1 (Not divided) |
| 0000 0000 0111 | 1 (Not divided) |
| 0000 0000 1101 | 2 |
| 0000 0000 1011 | 4 |
| 0000 0001 0101 | 6 |
| 0000 0001 0011 | 8 |
| 0000 0001 1001 | 10 |

| ADDR [bit] | Address of DATAPART |
|---|---|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |
| 1100 | 12 |
| 1101 | 13 |
| 1110 | 14 |
| 1111 | 15 |

(a)

| PARTNUM [bit] | The number of divisions |
|---|---|
| 000 | 2 |
| 001 | 4 |
| 010 | 6 |
| 011 | 8 |
| 100 | 10 |
| 101 | 12 |
| 110 | 14 |
| 111 | 16 |

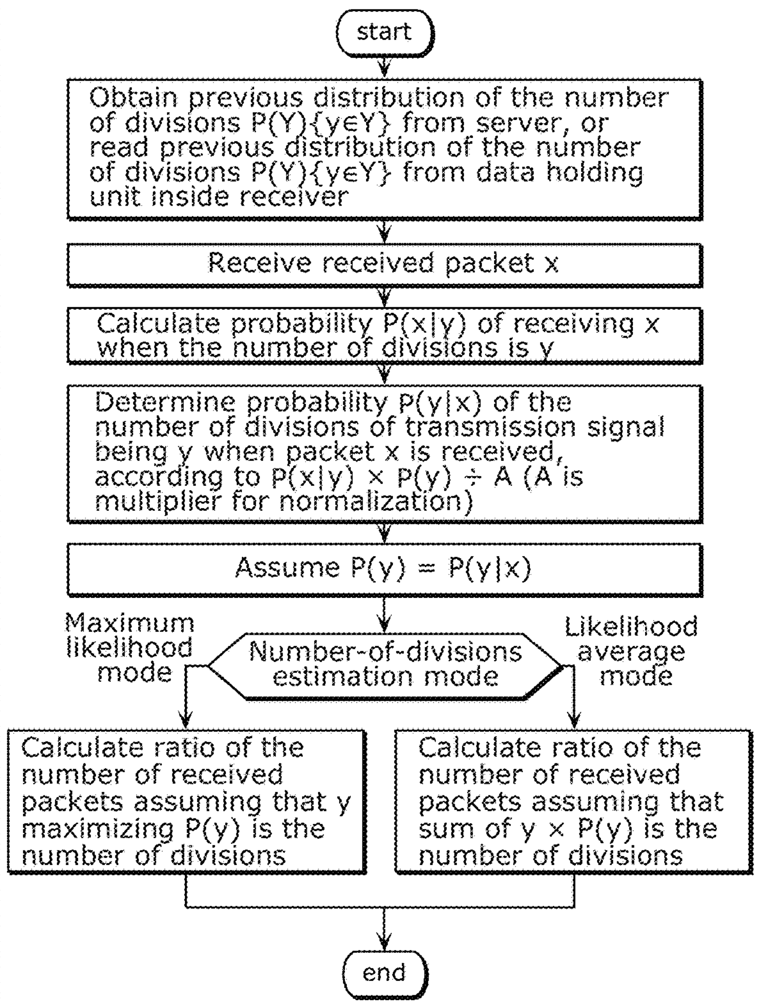

Previous distribution of the number of divisions is:
- determined as distribution of the number of transmitters that transmit data divided by such number of divisions
- determined for each packet length
- determined for each application
- determined for each identifiable range where receiver is present

| Address of received packet | | The number of divisions y | | | A | The number-of-divisions estimation mode | |
|---|---|---|---|---|---|---|---|
| | | 4 | 6 | 8 | | Maximum likelihood mode | Likelihood average mode |
| | P(y) | 0.333 | 0.333 | 0.333 | | 6 | 6.000 |
| Address 1 | P(x\|y) | 0.250 | 0.167 | 0.125 | | | |
| | P(y)P(x\|y) | 0.083 | 0.056 | 0.042 | 0.181 | | |
| | P(y\|x) | 0.462 | 0.308 | 0.231 | | 4 | 5.538 |
| Address 2 | P(x\|y) | 0.250 | 0.167 | 0.125 | | | |
| | P(y)P(x\|y) | 0.115 | 0.051 | 0.029 | 0.196 | | |
| | P(y\|x) | 0.590 | 0.262 | 0.148 | | 4 | 5.115 |
| Address 5 | P(x\|y) | 0.000 | 0.167 | 0.125 | | | |
| | P(y)P(x\|y) | 0.000 | 0.044 | 0.018 | 0.062 | | |
| | P(y\|x) | 0.000 | 0.703 | 0.297 | | 6 | 6.593 |

Calculation example

FIG. 455

| Length to be checked | Length of CRC | Generator polynomial |
|---|---|---|
| <= 16 | 8 | X8 + X7 + X6 + X4 + X2 + 1 |
| <= 64 | 12 | X12 + X11 + X3 + X2 + X + 1 |
| <= 256 | 16 | X16 + X15 + X2 + 1 |
| <= 1024 | 20 | |
| <= 4096 | 24 | X24 + X23 + X18 + X17 + X14 + X11 + X10 + X7 + X6 + X5 + X4 + X3 + X + 1 |
| <= 16384 | 28 | |
| <= 65536 | 32 | X32 + X26 + X23 + X22 + X16 + X12 + X11 + X10 + X8 + X7 + X5 + X4 + X2 + X + 1 |

(a)

| Length to be checked | Length of CRC | Generator polynomial |
|---|---|---|
| <= 16 | 8 | X8 + X7 + X6 + X4 + X2 + 1 |
| <= 32 | 10 | X10 + X9 + X5 + X4 + X + 1 |
| <= 64 | 12 | X12 + X11 + X3 + X2 + X + 1 |
| <= 128 | 14 | X14 + X12 + X8 + X6 + X4 + X + 1 |
| <= 256 | 16 | X16 + X15 + X2 + 1 |
| <= 512 | 18 | |
| <= 1024 | 20 | |
| <= 2048 | 22 | |
| <= 4096 | 24 | X24 + X23 + X18 + X17 + X14 + X11 + X10 + X7 + X6 + X5 + X4 + X3 + X + 1 |
| <= 8192 | 26 | |
| <= 16384 | 28 | |
| <= 32768 | 30 | X30 + X29 + X21 + X20 + X15 + X13 + X12 + X11 + X8 + X7 + X6 + X2 + X + 1 |
| <= 65536 | 32 | X32 + X26 + X23 + X22 + X16 + X12 + X11 + X10 + X8 + X7 + X5 + X4 + X2 + X + 1 |
| <= 131072 | 34 | |

(b)

FIG. 464
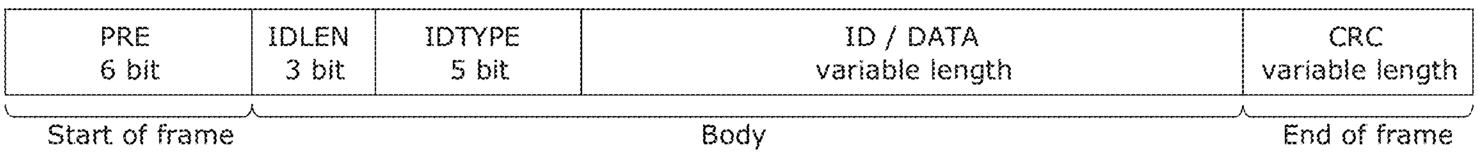
(a)
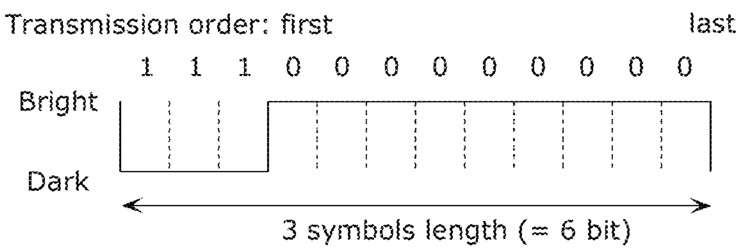
(b)
| IDLEN [bit] | Lengthof ID/DATA [bit] |
|---|---|
| 000 | reserved |
| 001 | 32 |
| 010 | 64 |
| 011 | 128 |
| 100 | 256 |
| 101 | 512 |
| 110 | 1024 |
| 111 | reserved |
(c)

FIG. 466

| Number of frames | Length of DATAPART [bit] | | | | |
|---|---|---|---|---|---|
| | 4 | 8 | 16 | 32 | 64 |
| 1 | 4 | 8 | 16 | 32 | 64 |
| 2 | 8 | 16 | 32 | 64 | 128 |
| 3 | 12 | 24 | 48 | 96 | 192 |
| 4 | 16 | 32 | 64 | 128 | 256 |
| 5 | 20 | 40 | 80 | <u>160</u> | <u>320</u> |
| 6 | 24 | 48 | <u>96</u> | 192 | 384 |
| 7 | 28 | <u>56</u> | 112 | 224 | 448 |
| 8 | 32 | 64 | 128 | 256 | 512 |
| 9 | 36 | 72 | 144 | 288 | <u>576</u> |
| 10 | 40 | 80 | <u>160</u> | <u>320</u> | 640 |
| 11 | 44 | 88 | 176 | 352 | 704 |
| 12 | 48 | <u>96</u> | 192 | 384 | 768 |
| 13 | 52 | 104 | 208 | 416 | 832 |
| 14 | <u>56</u> | 112 | 224 | 448 | 896 |
| 15 | 60 | 120 | 240 | 480 | 960 |
| 16 | 64 | 128 | 256 | 512 | 1024 |

FIG. 468

| PTYPE [bit] | Partitiontype of BODY |
|---|---|
| 00 | Singleframe compatible |
| 01 | Data stream |
| 10 | reserved |
| 11 | reserved |

(a)

| PTYPE [bit] | Partitiontype of BODY |
|---|---|
| 0 | Singleframe compatible |
| 1 | Data stream |

| Lengthof ID [bit] | Number of frames | DATAPART [bit] | Joined data [bit] | IELEN [bit] | IDTYPE [bit] | CRC [bit] | PADDING [bit] |
|---|---|---|---|---|---|---|---|
| 32 | 7<br>14 | 8<br>4 | 56 | 3 | 5 | 12 | 2 |
| 64 | 6<br>12 | 16<br>8 | 96 | 3 | 5 | 16 | 6 |
| 128 | 5<br>10 | 32<br>16 | 160 | 3 | 5 | 16 | 6 |
| 256 | 5<br>10 | 64<br>32 | 320 | 3 | 5 | 24 | 30 |
| 512 | 9 | 64 | 576 | 3 | 5 | 24 | 30 |

SIGNAL GENERATING METHOD, SIGNAL GENERATING UNIT, AND NON-TRANSITORY RECORDING MEDIUM STORING COMPUTER PROGRAM

CROSS-REFERENCE TO RELATED APPLICATIONS

This application is a Continuation of U.S. patent application Ser. No. 15/647,300, filed on Jul. 12, 2017, which is a Continuation of International Application No. PCT/JP2016/000993, filed on Feb. 25, 2016, which in turn claims the benefit of Japanese Application Nos.: 2015-040806, filed on Mar. 2, 2015, and 2015-039605, filed on Feb. 27, 2015, the entire disclosures of which Applications are incorporated by reference herein.

BACKGROUND

1. Technical Field

The present disclosure relates to a visible light signal generating method, a signal generating unit, and a non-transitory recording medium having a computer program stored thereon.

2. Description of the Related Art

In recent years, a home-electric-appliance cooperation function has been introduced for a home network, with which various home electric appliances are connected to a network by a home energy management system (HEMS) having a function of managing power usage for addressing an environmental issue, turning power on/off from outside a house, and the like, in addition to cooperation of AV home electric appliances by internet protocol (IP) connection using Ethernet® or wireless local area network (LAN). However, there are home electric appliances whose computational performance is insufficient to have a communication function, and home electric appliances which do not have a communication function due to a matter of cost.

In order to solve such a problem, Patent Literature (PTL) 1 discloses a technique of efficiently establishing communication between devices among limited optical spatial transmission devices which transmit information to a free space using light, by performing communication using plural single color light sources of illumination light.

CITATION LIST

Patent Literature

PTL 1: Unexamined Japanese Patent Publication No. 2002-290335

However, the conventional method is limited to a case in which a device to which the method is applied has three color light sources such as an illuminator.

SUMMARY

To solve such a problem, one non-limiting and exemplary embodiment provides a signal generating method, a signal generating unit, and a non-transitory recording medium having a computer program stored thereon for a visible light signal enabling communication between various devices.

In one general aspect, the techniques disclosed here feature a signal generating method for generating a visible light signal transmitted by way of a luminance change of a light source included in a transmitter, the method including: determining, as a method for transmitting the visible light signal from the transmitter, one of a single-frame transmitting method for transmitting data as one frame and a multiple-frame transmitting method for transmitting the data while dividing the data into a plurality of frames; when the multiple-frame transmitting method is determined to be the method for transmitting the visible light signal, generating partition type information indicating a type of data to be transmitted, and generating combination data by adding the partition type information to the data to be transmitted; generating the plurality of frames, each of which includes each of a plurality of data parts, by dividing the combination data into the plurality of data parts; and generating the visible light signal by adding a preamble, being data indicating a head of a frame, to the head of each of the plurality of frames.

The present disclosure can provide the signal generating method, the signal generating unit, and the non-transitory recording medium having the computer program stored thereon for the visible light signal enabling the communication between various devices other than lightings.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

BRIEF DESCRIPTION OF DRAWINGS

FIG. 35A is a diagram illustrating another example of operation of a receiver in Embodiment 2;

FIG. 35B is a diagram illustrating an example of application using a receiver in Embodiment 2;

FIG. 36A is a diagram illustrating another example of operation of a receiver in Embodiment 2;

FIG. 36B is a diagram illustrating an example of application using a receiver in Embodiment 2;

FIG. 78 is a diagram illustrating an example of a PPM modulation scheme by a transmitter in Embodiment 3;

FIG. 97 is a diagram illustrating an example of next operation of a receiver in a store search situation in Embodiment 4;

FIG. 98 is a diagram illustrating an example of operation of a receiver in a movie advertisement situation in Embodiment 4;

FIG. 99 is a diagram illustrating an example of next operation of a receiver in a movie advertisement situation in Embodiment 4;

FIG. 100 is a diagram illustrating an example of next operation of a receiver in a movie advertisement situation in Embodiment 4;

FIG. 101 is a diagram illustrating an example of next operation of a receiver in a movie advertisement situation in Embodiment 4;

FIG. 102 is a diagram illustrating an example of operation of a receiver in a museum situation in Embodiment 4;

FIG. 103 is a diagram illustrating an example of next operation of a receiver in a museum situation in Embodiment 4;

FIG. 104 is a diagram illustrating an example of next operation of a receiver in a museum situation in Embodiment 4;

FIG. 105 is a diagram illustrating an example of next operation of a receiver in a museum situation in Embodiment 4;

FIG. 106 is a diagram illustrating an example of next operation of a receiver in a museum situation in Embodiment 4;

FIG. 107 is a diagram illustrating an example of next operation of a receiver in a museum situation in Embodiment 4;

FIG. 108 is a diagram illustrating an example of operation of a receiver in a bus stop situation in Embodiment 4;

Figure 109:
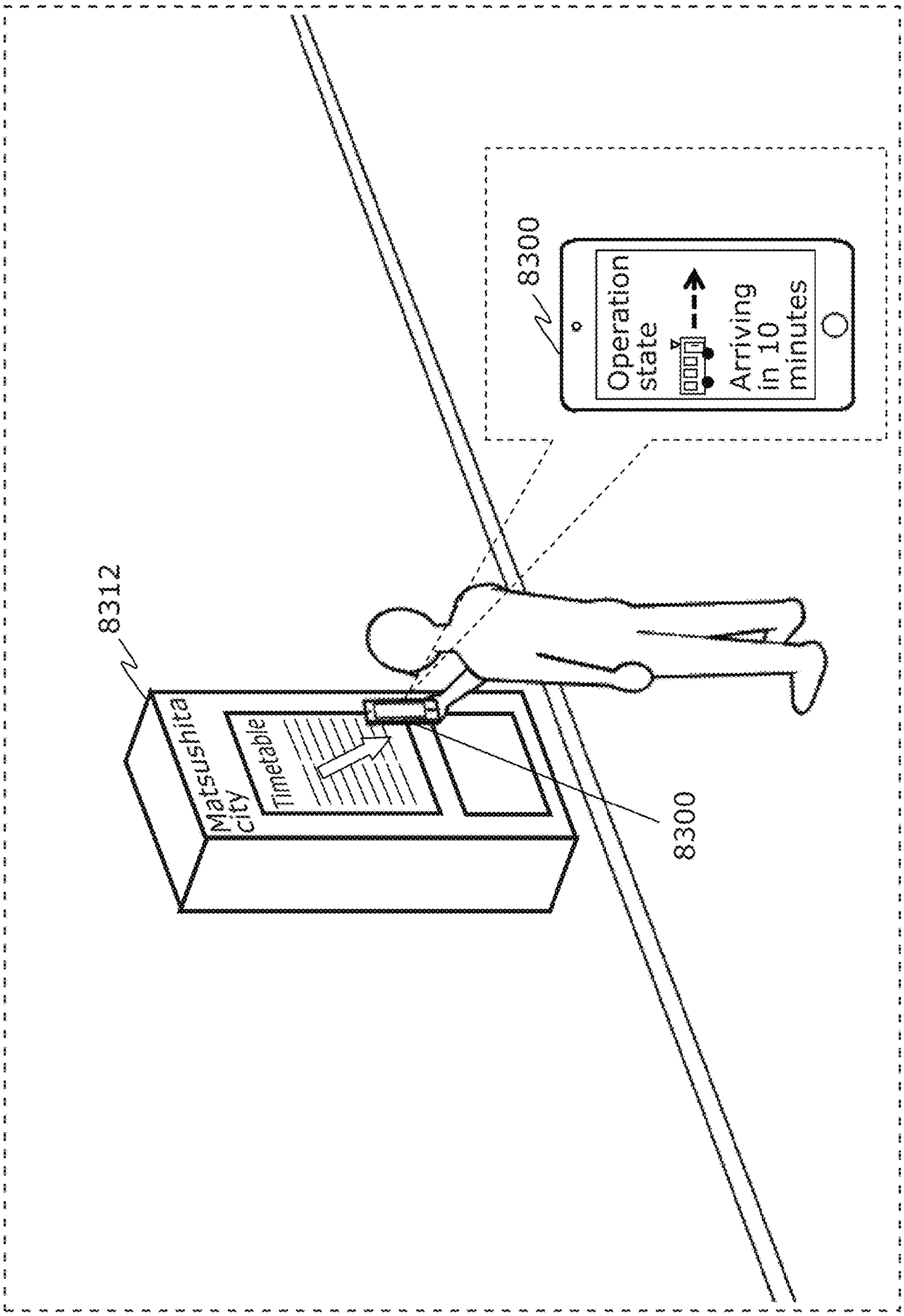
Figure 110:
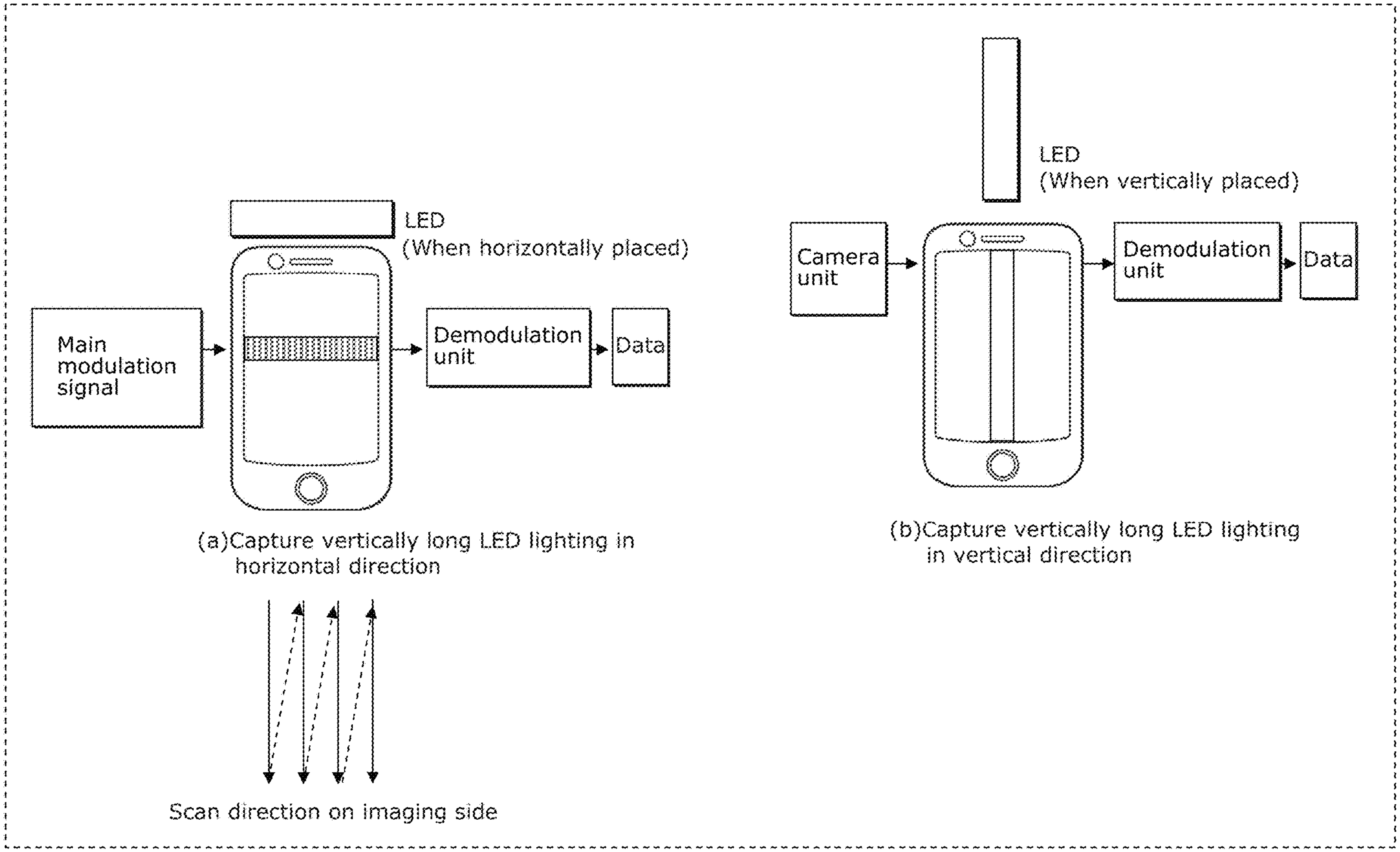
Figure 111:
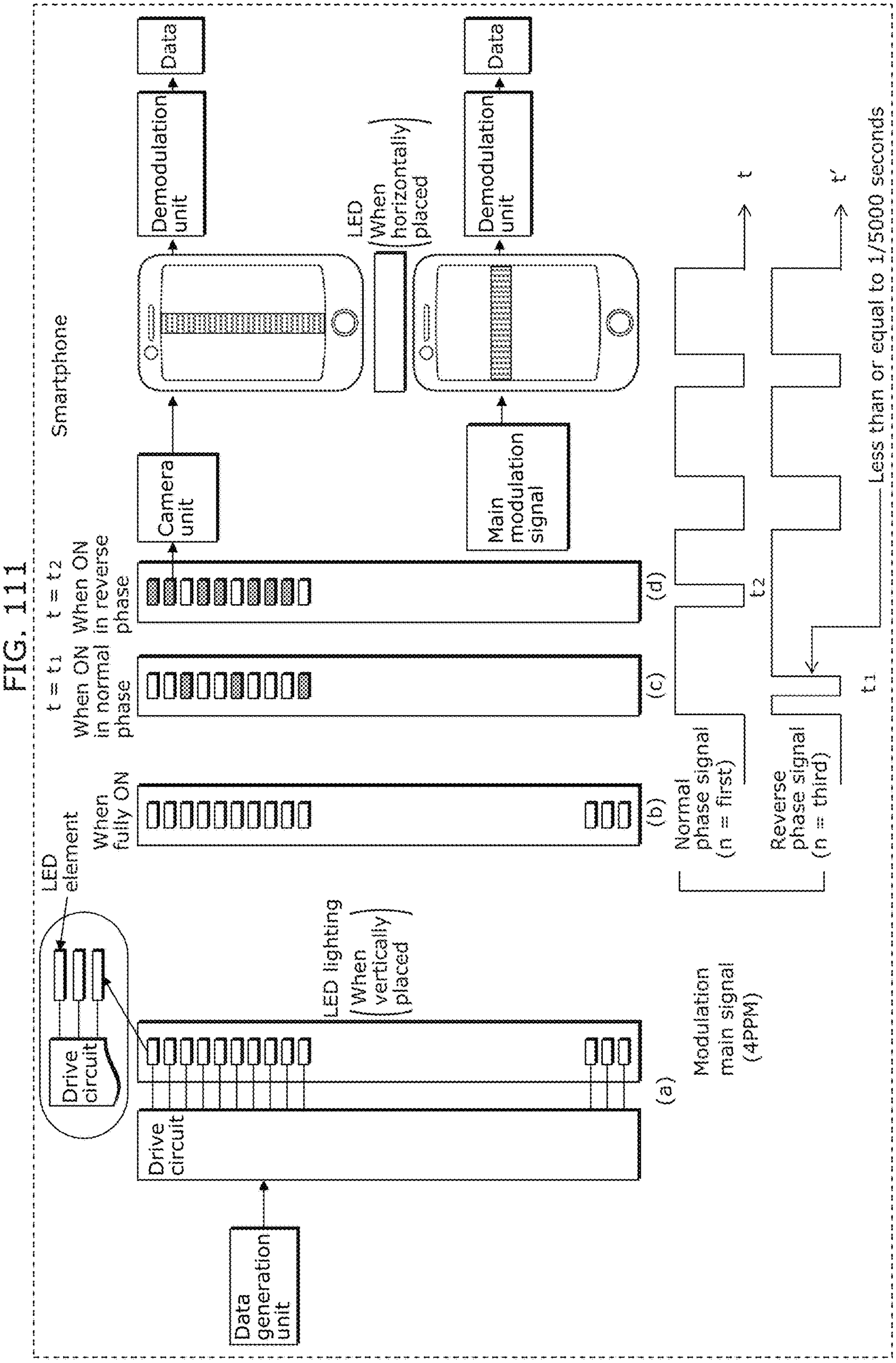
Figure 112:
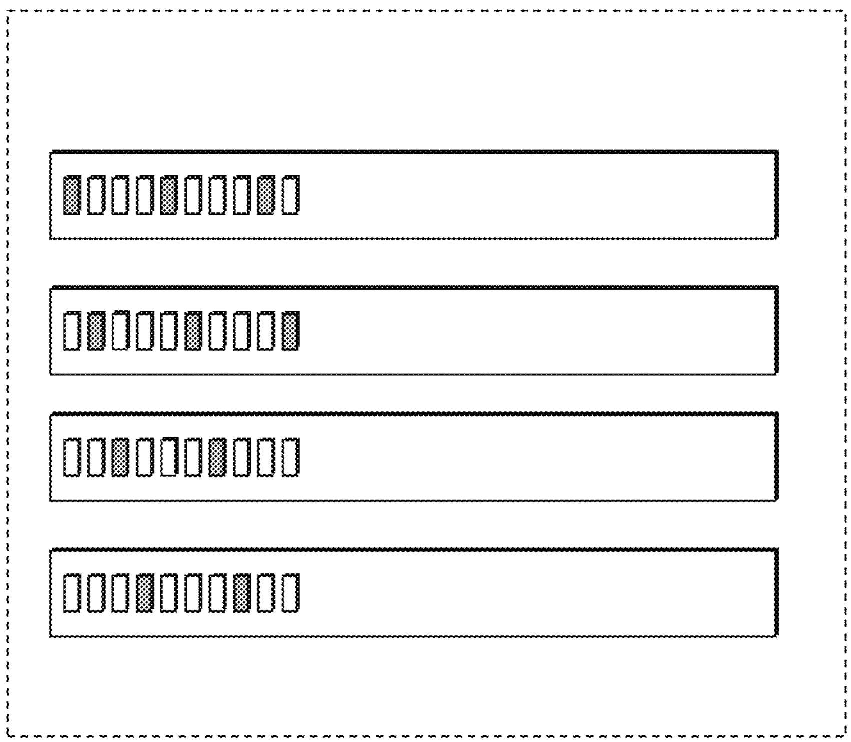
Figure 113:
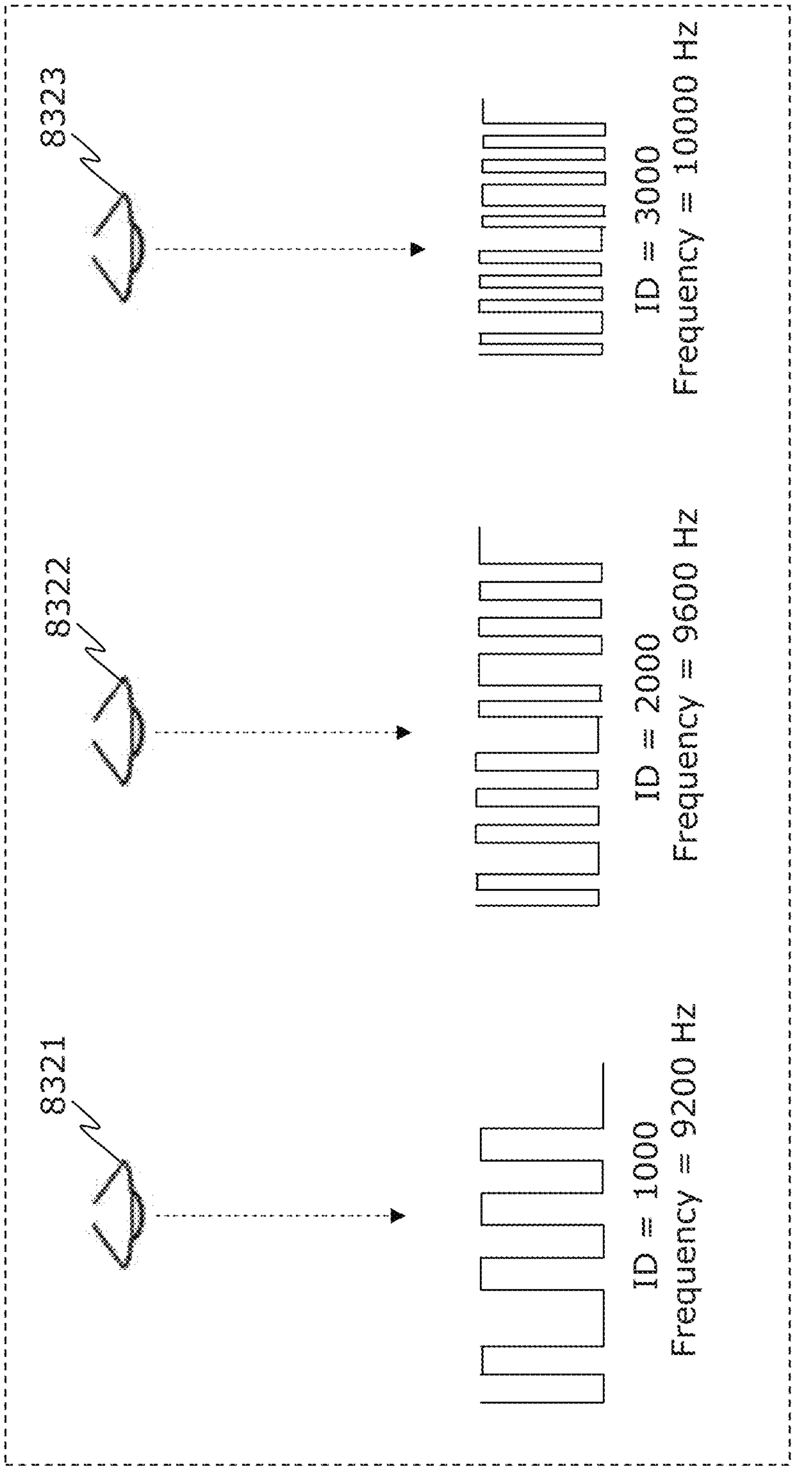
Figure 114:
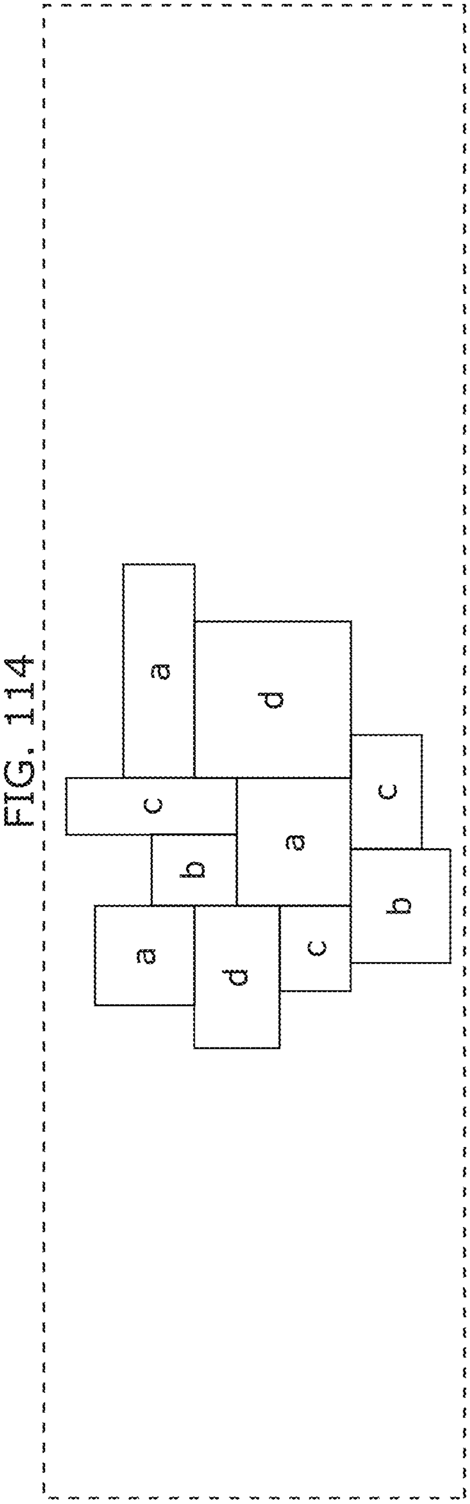
Figure 115:
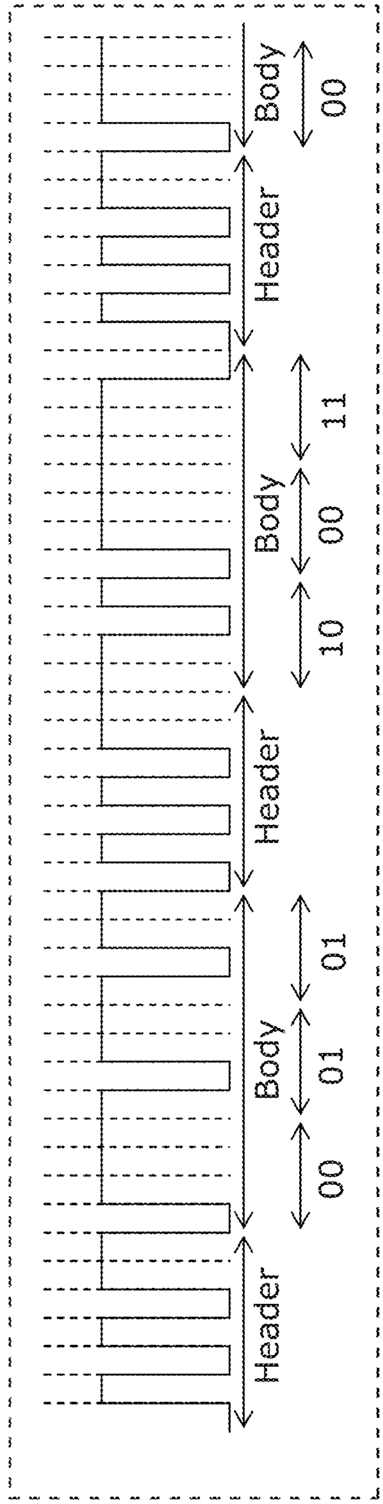
Figure 117:
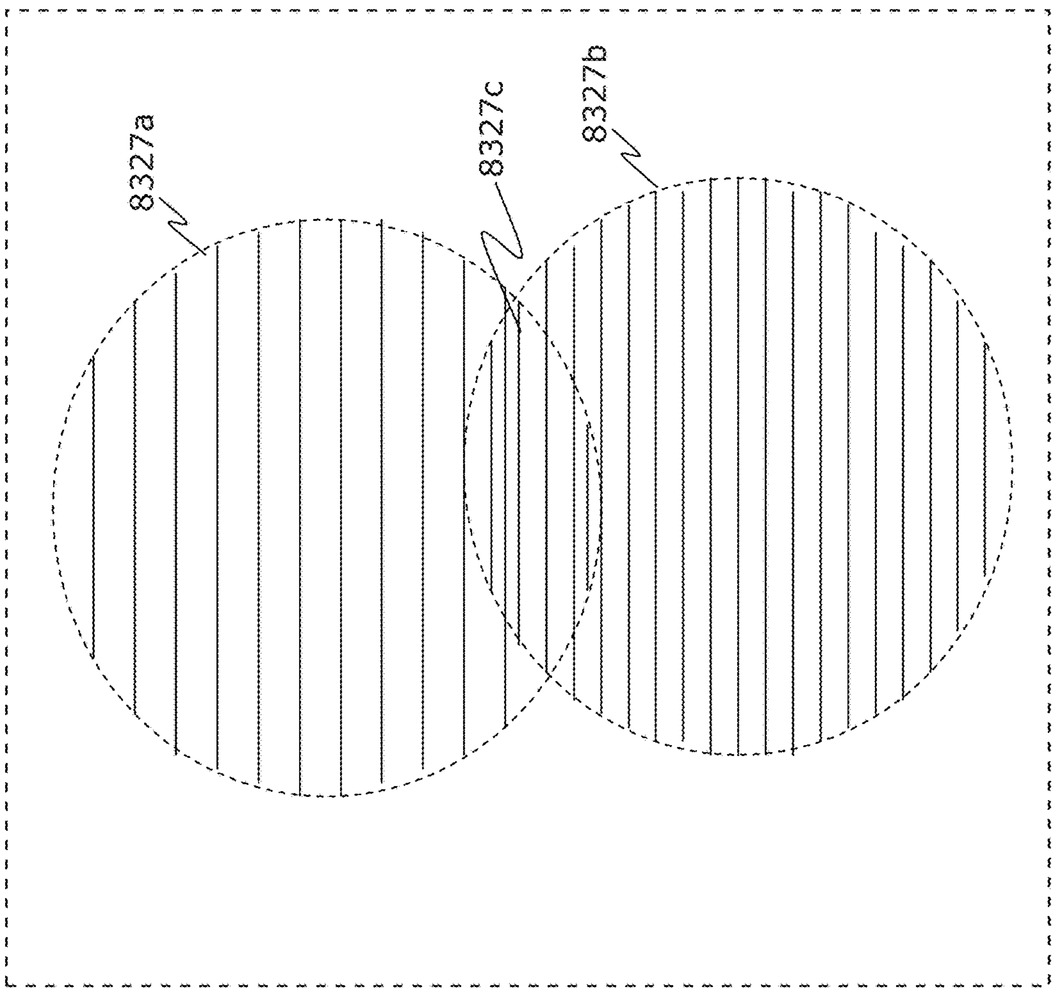
Figure 118:
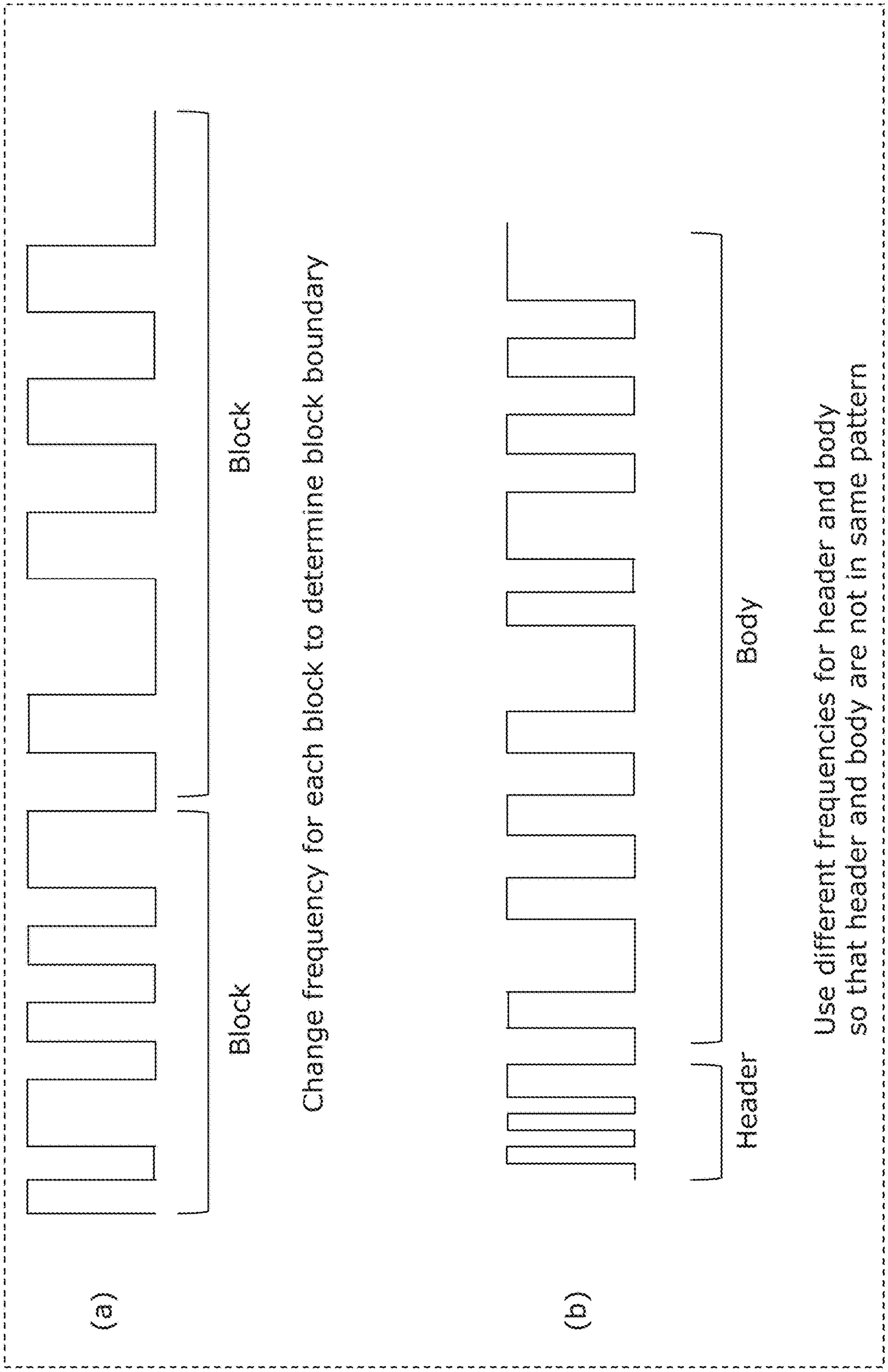
Figure 119:
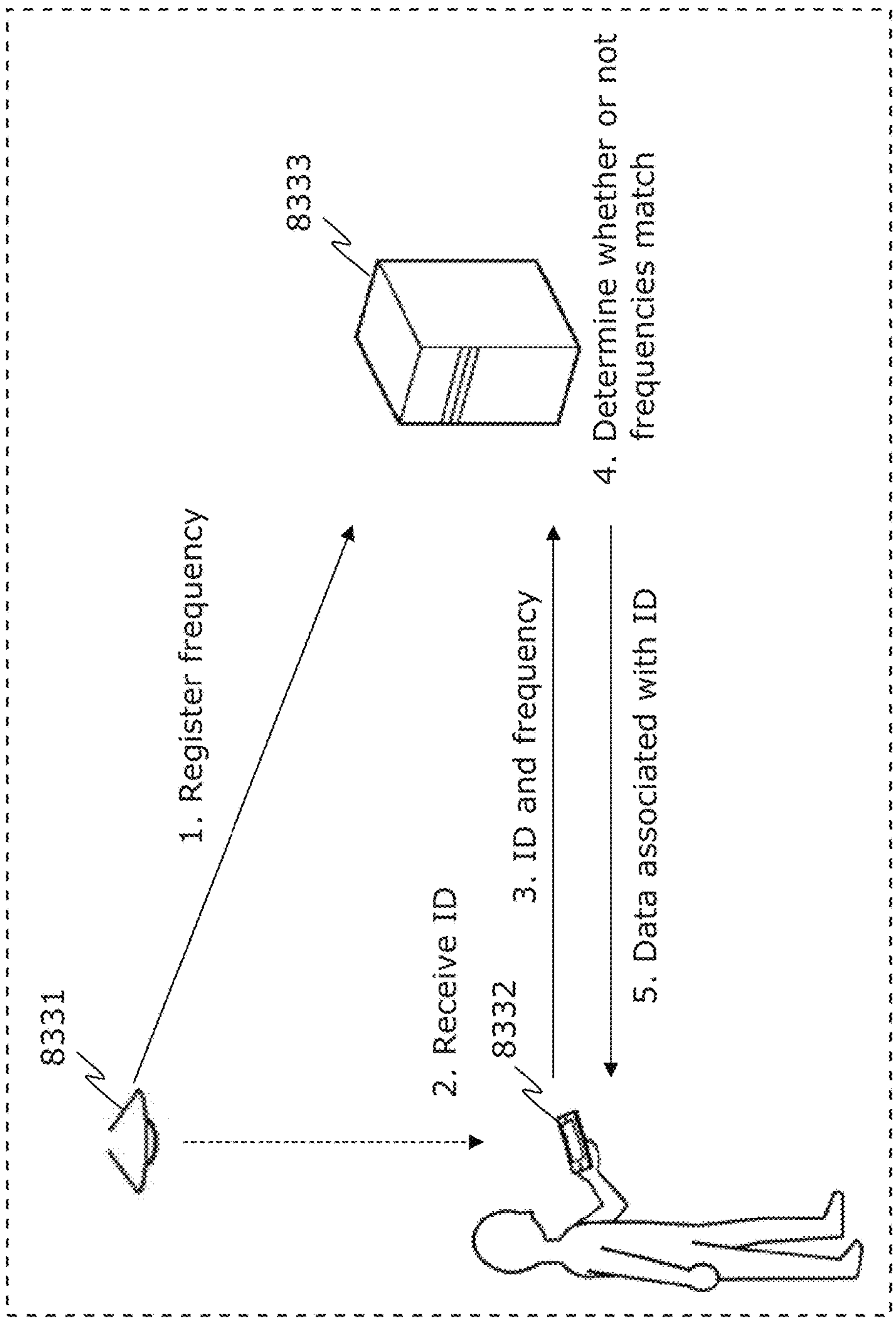
Figure 120:
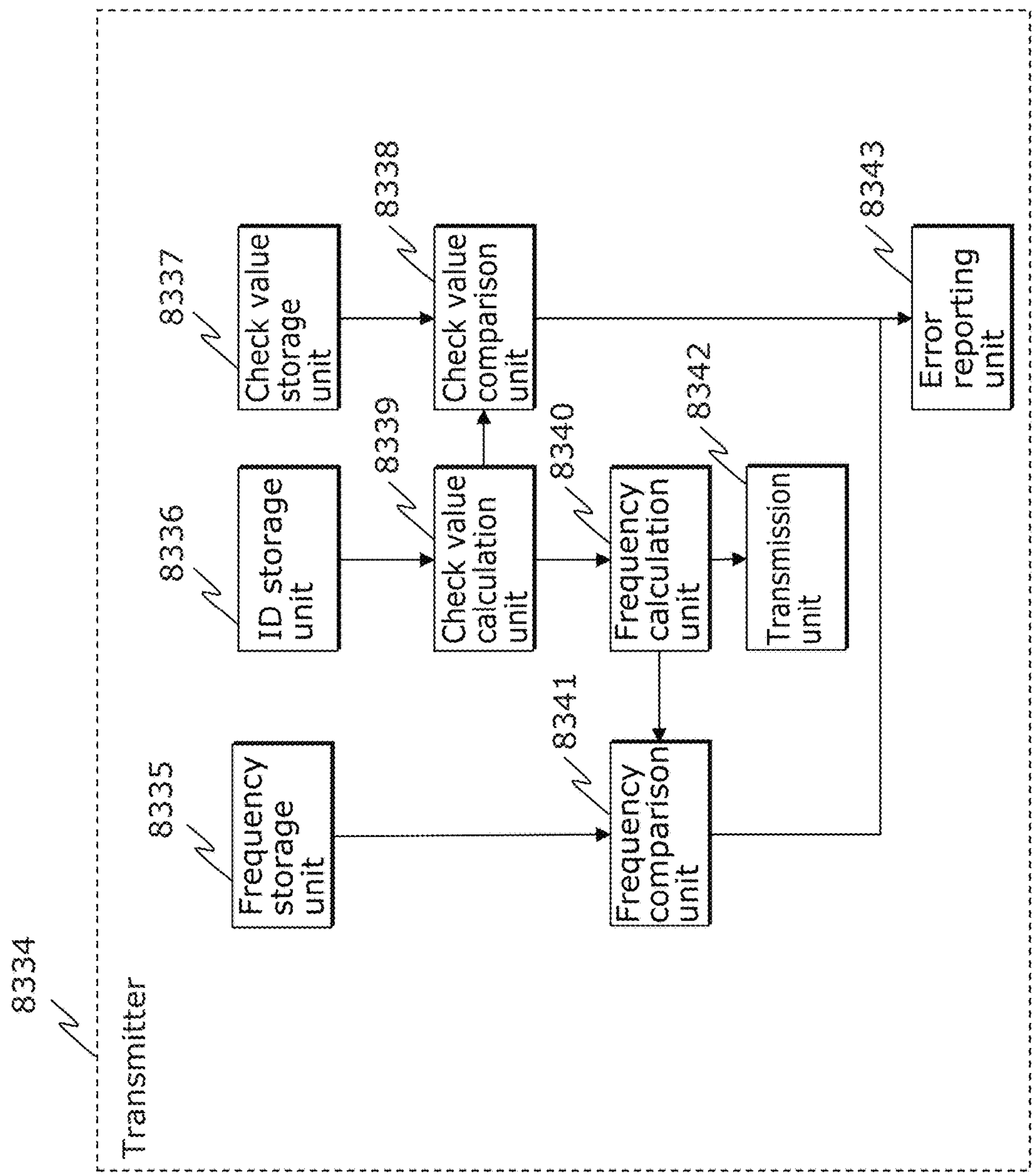
Figure 121:
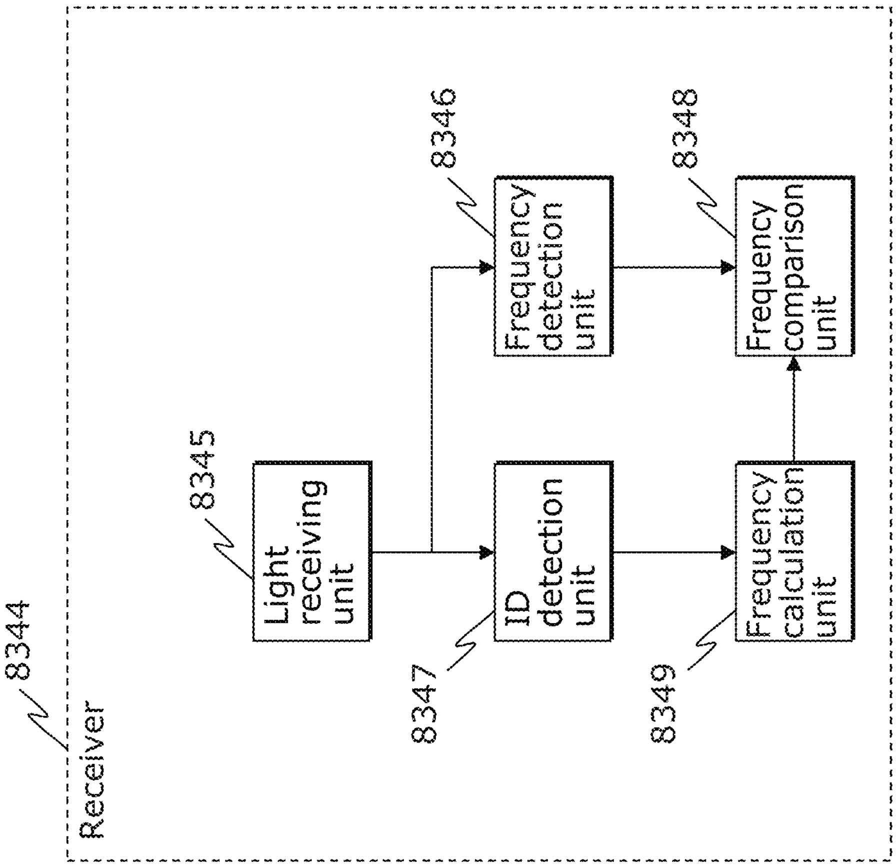
Figure 122:
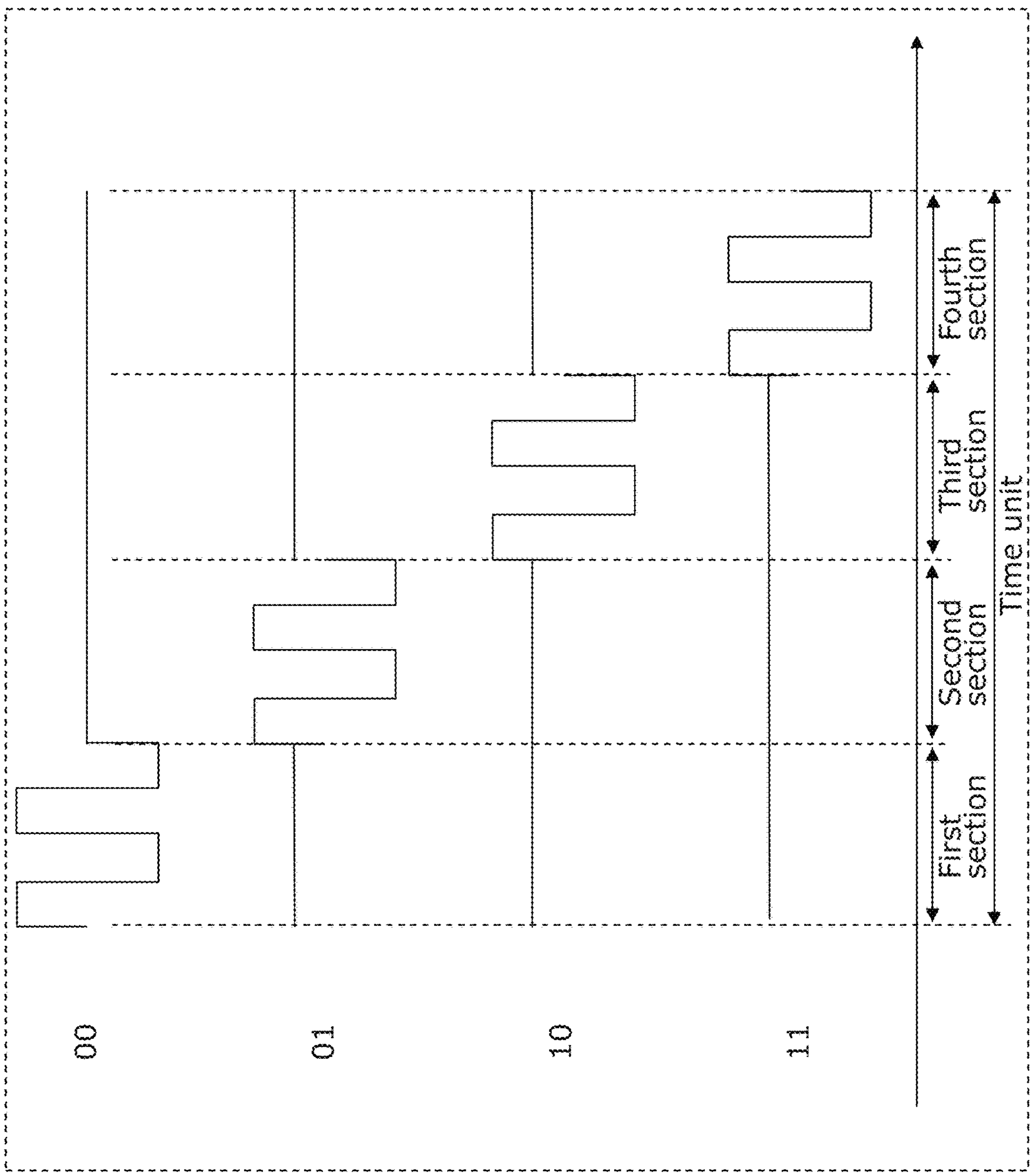
Figure 124:
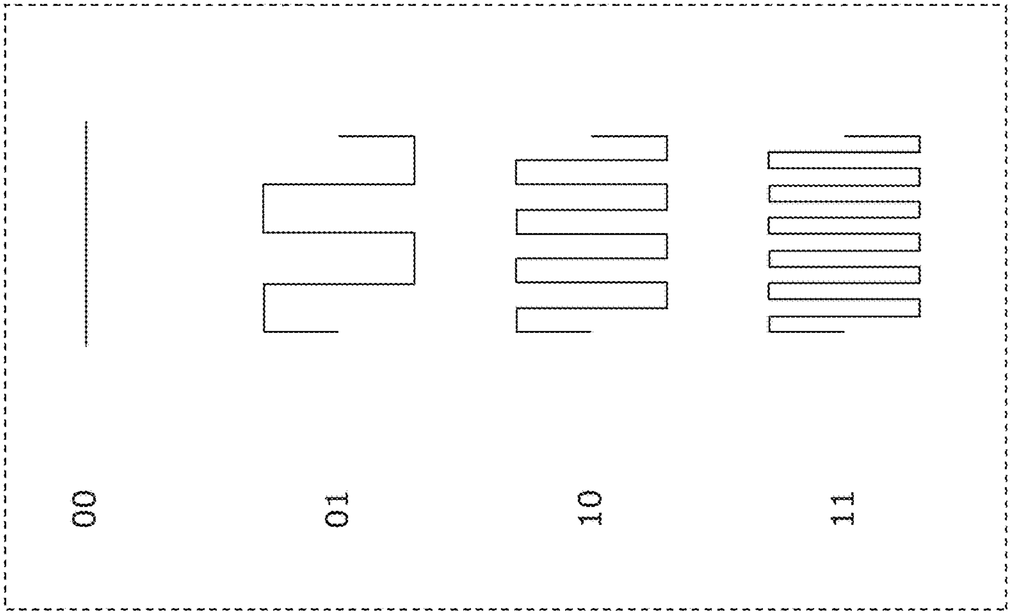
Figure 123:
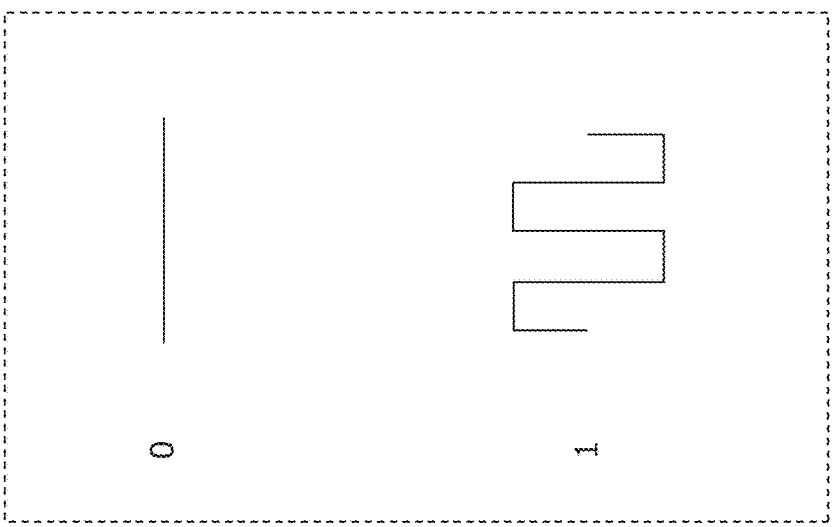
Figure 125:
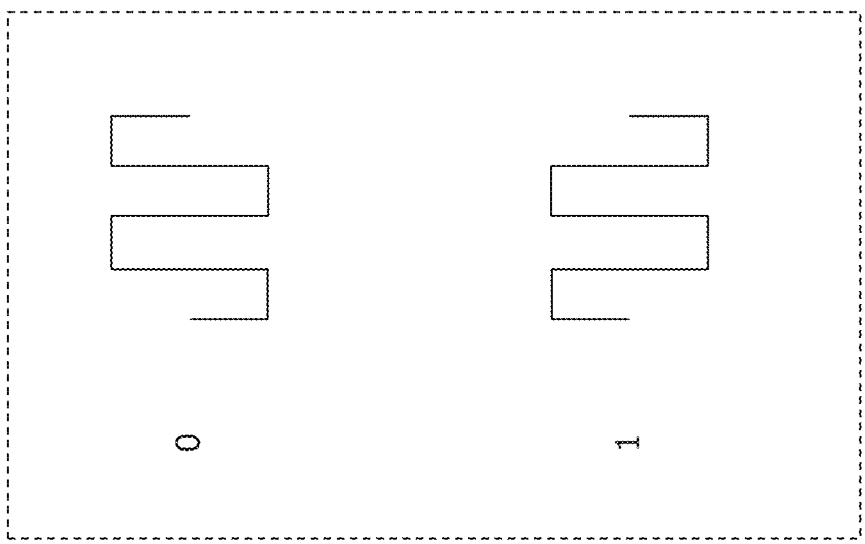
Figure 126:
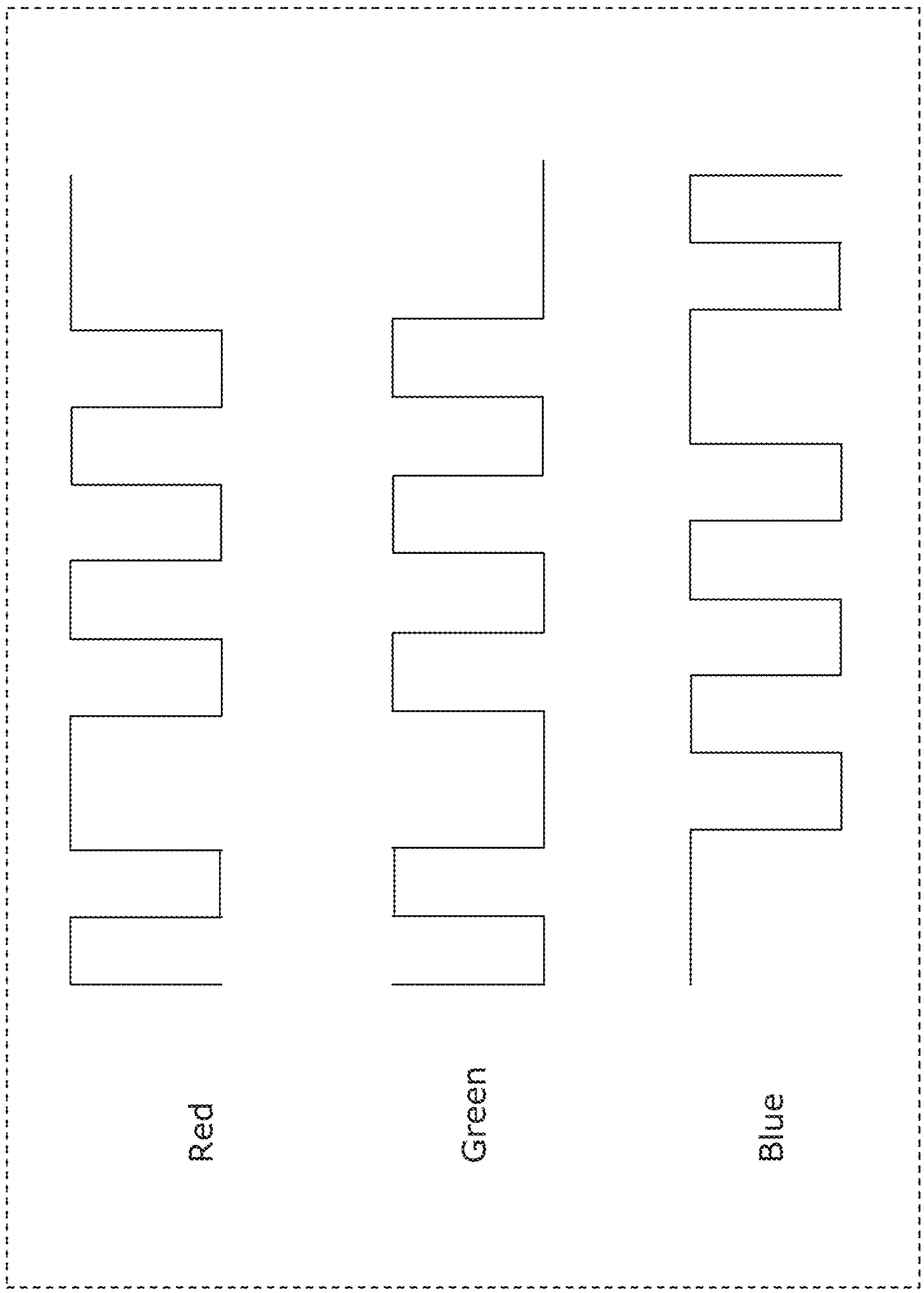
Figure 127:
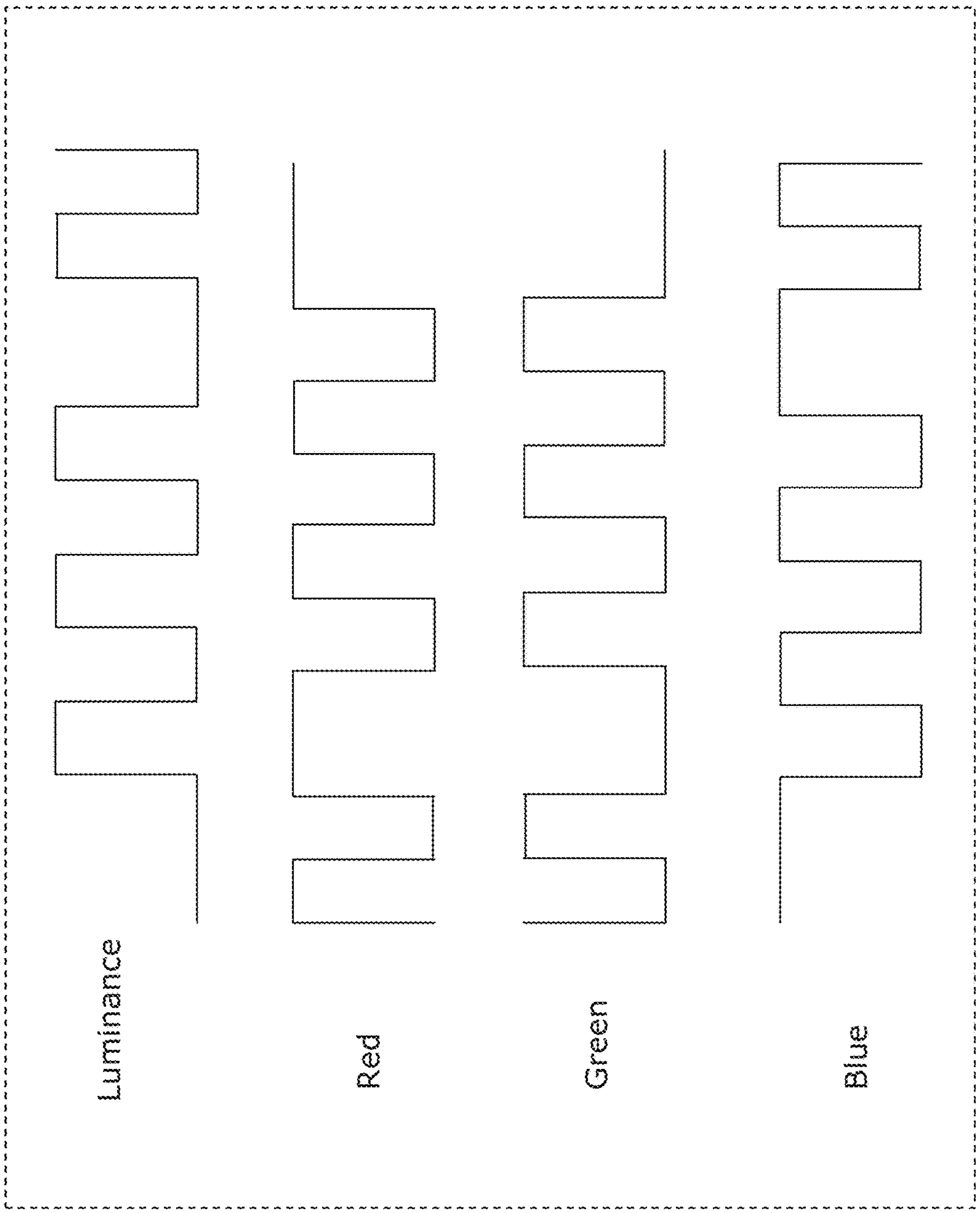
Figure 128:
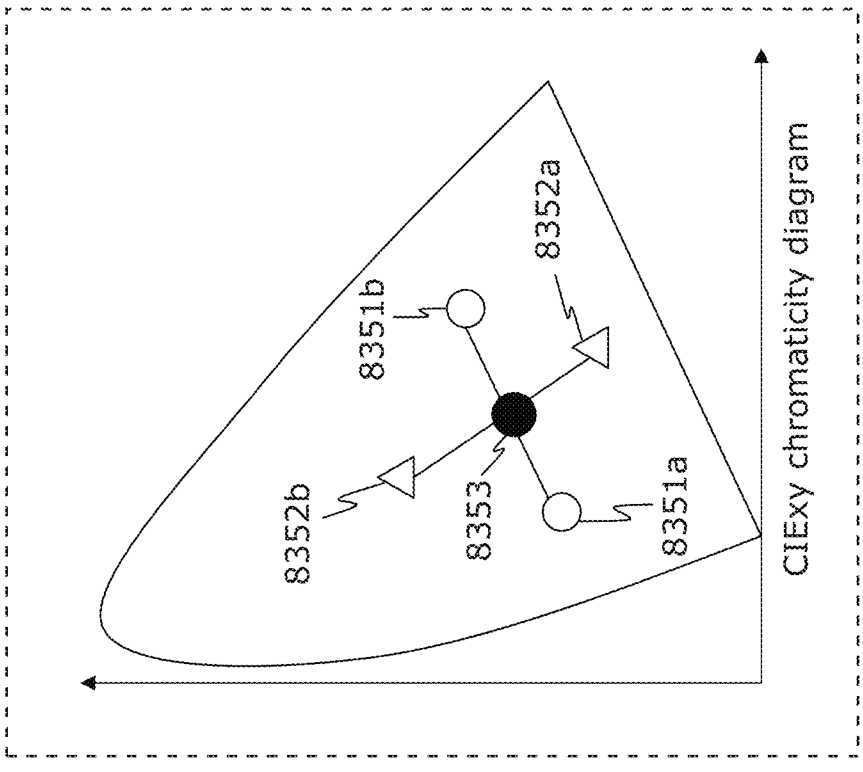
Figure 129:
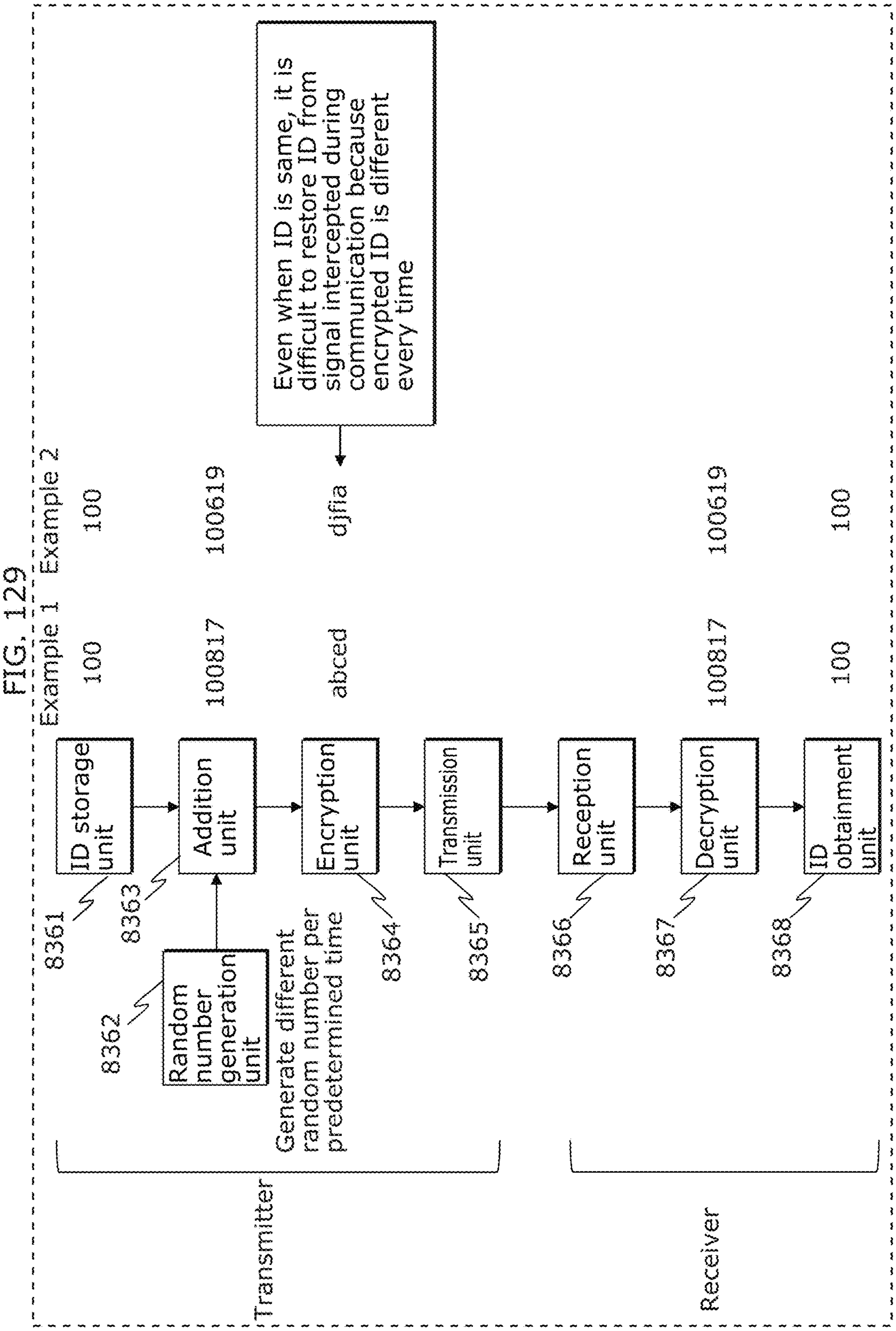
Figure 130:
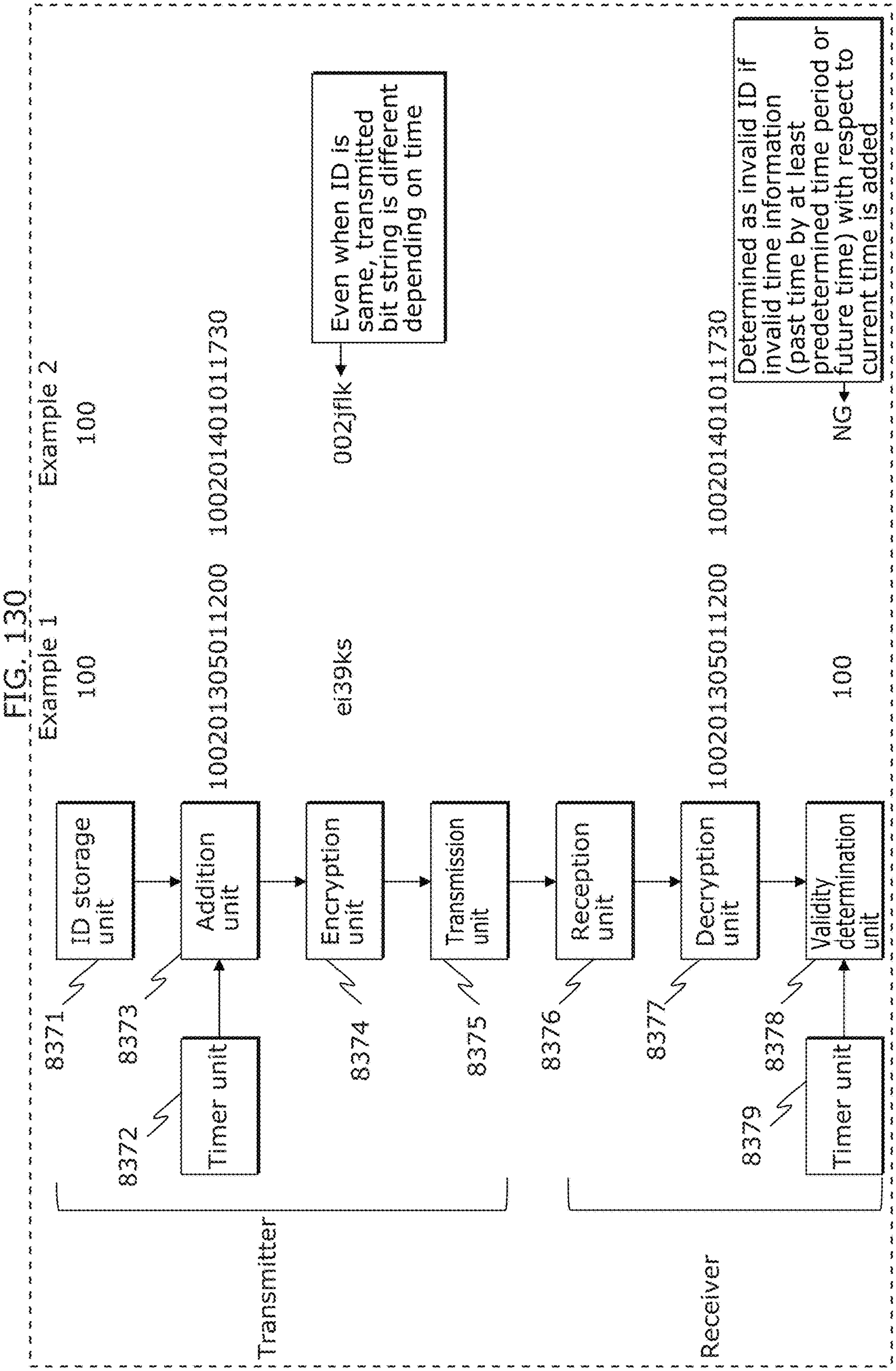
Figure 131:
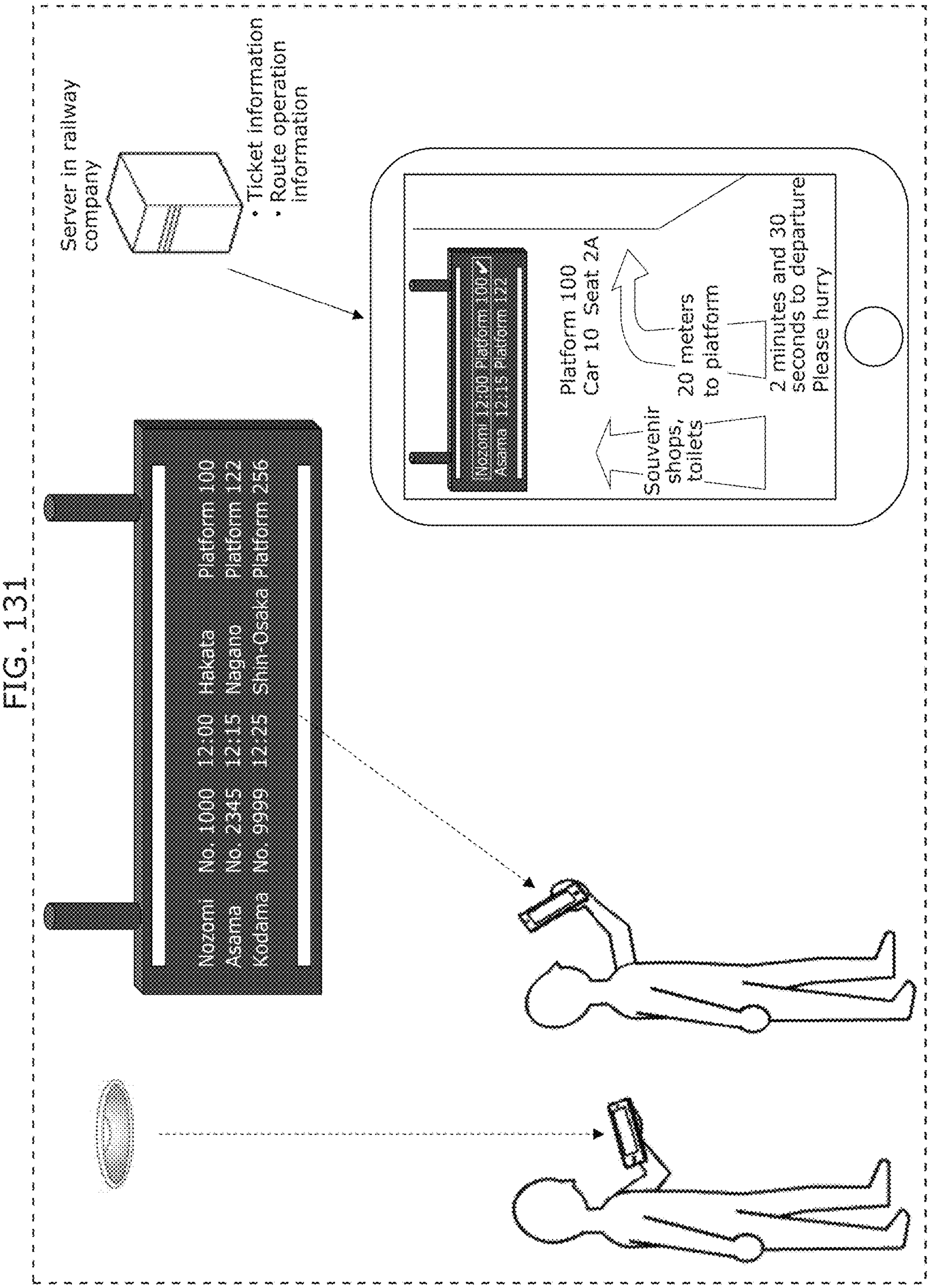
Figure 132:
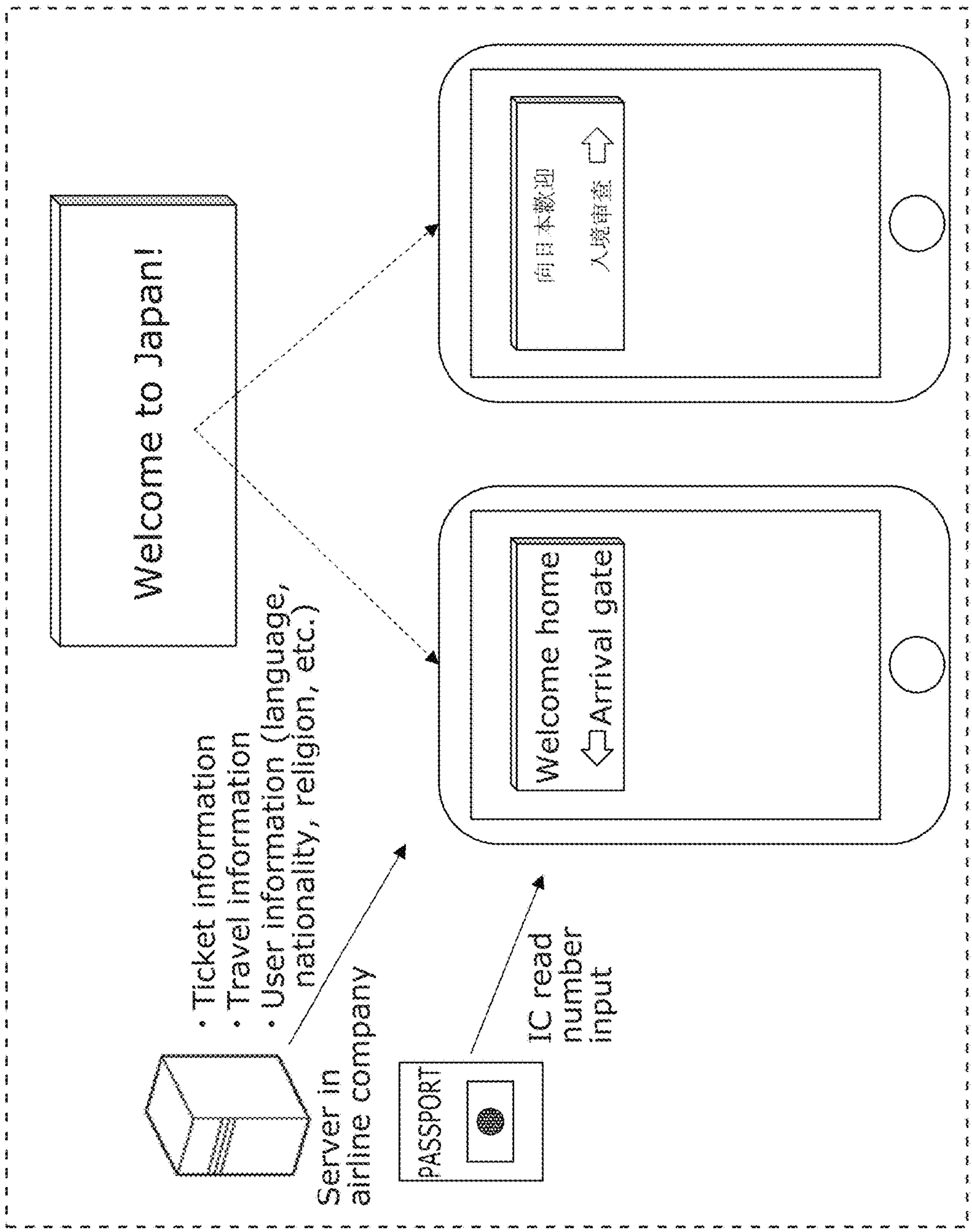
Figure 133:
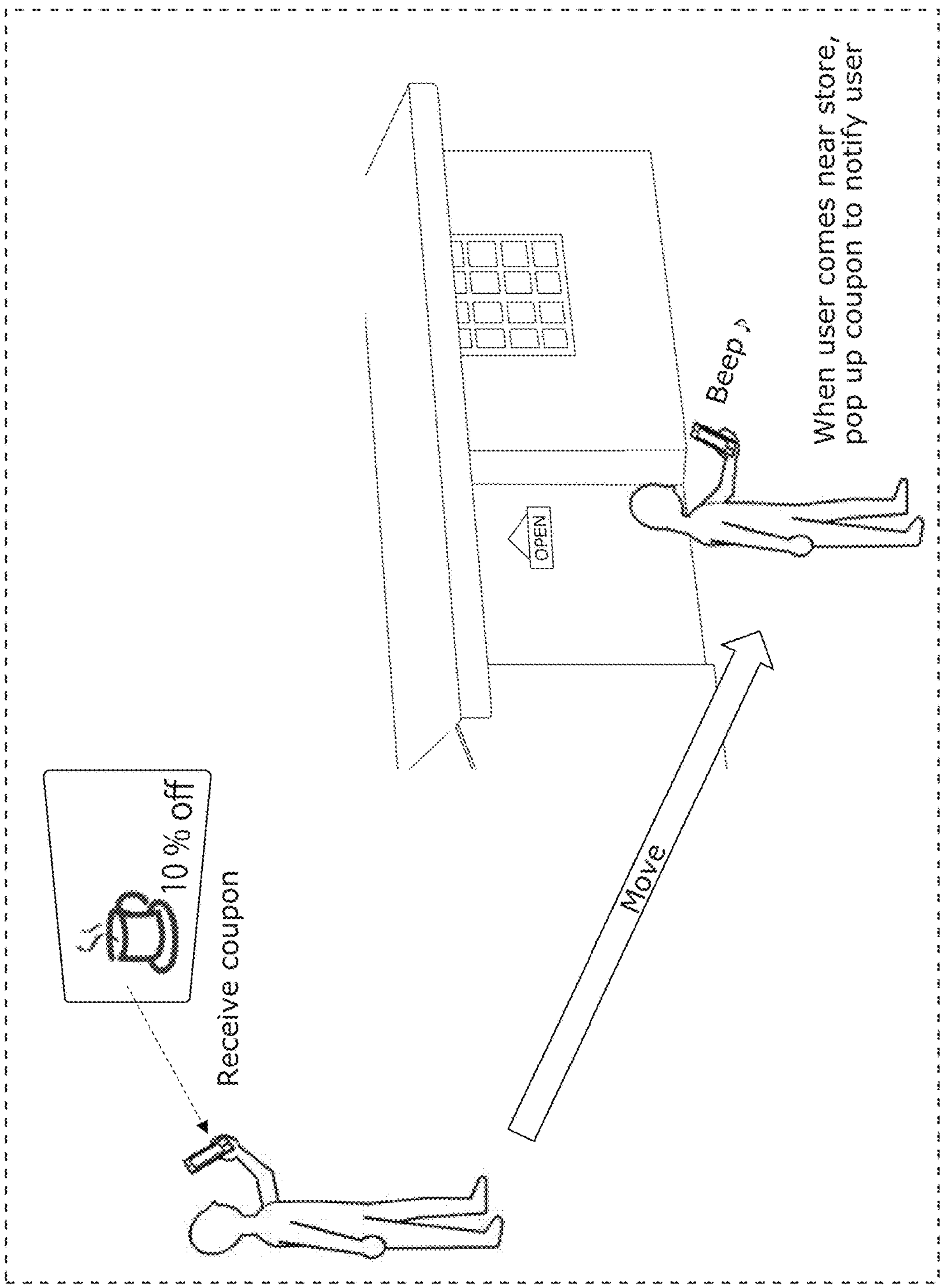
Figure 134:
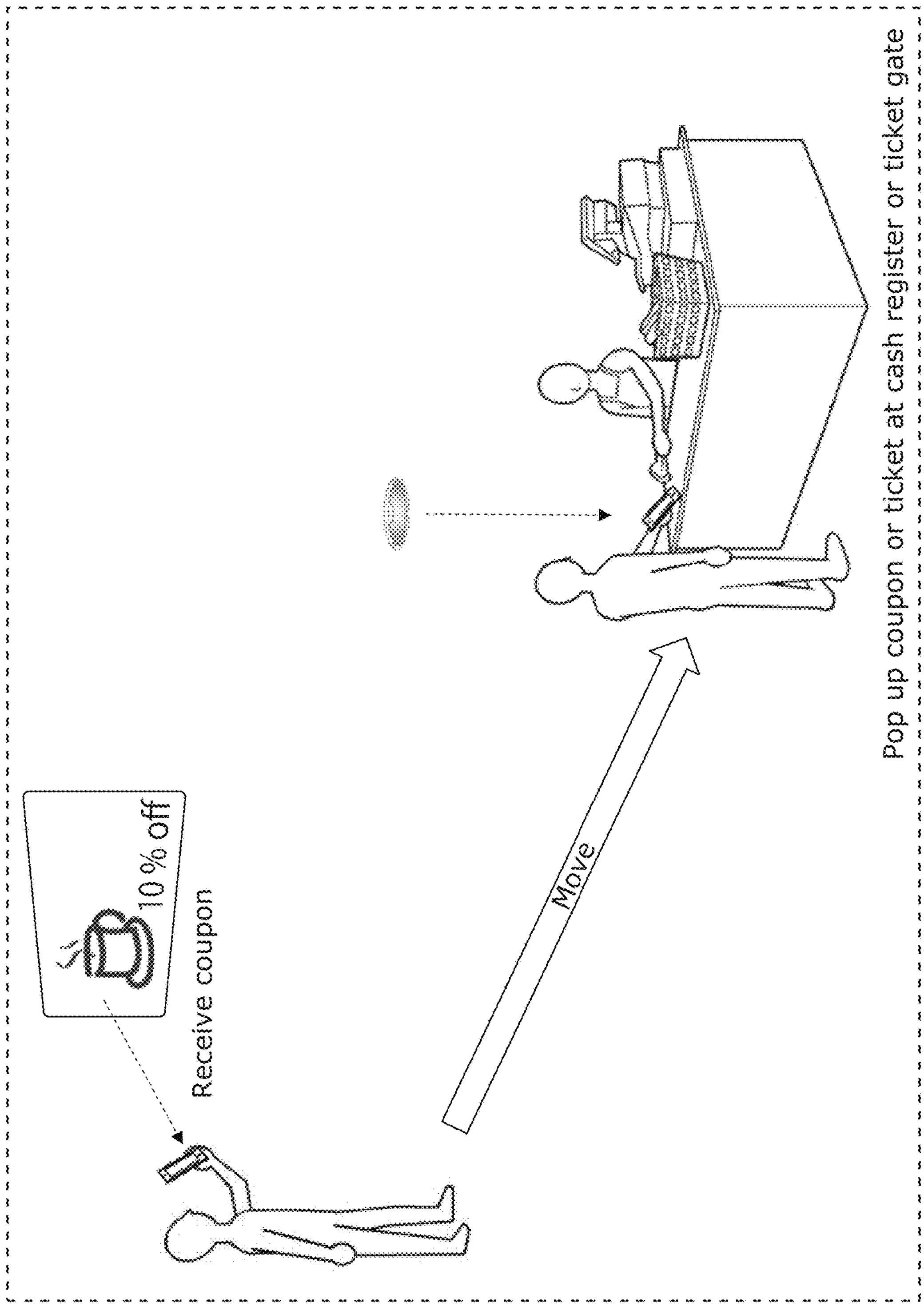
Figure 135:
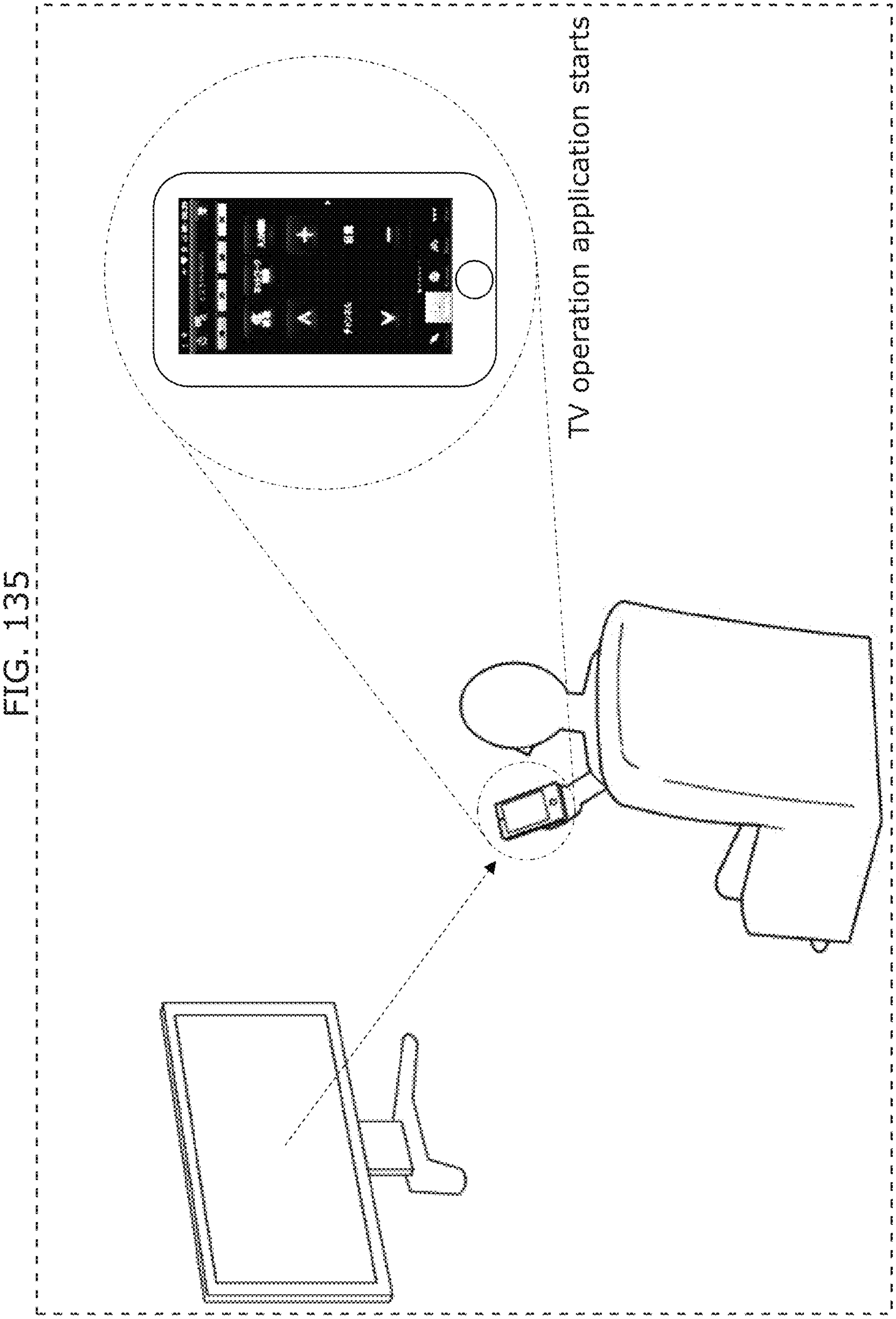
Figure 136:
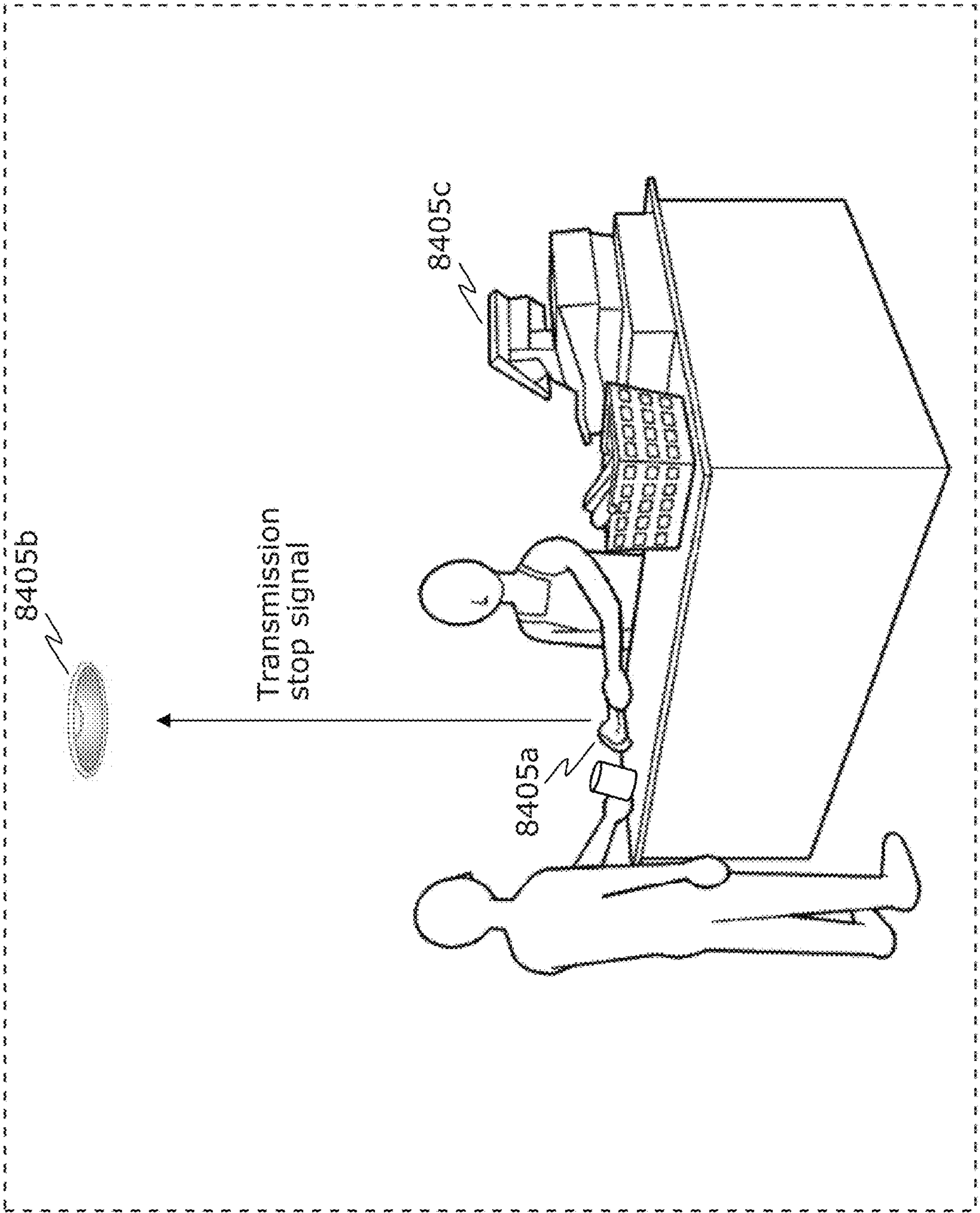
Figure 137:
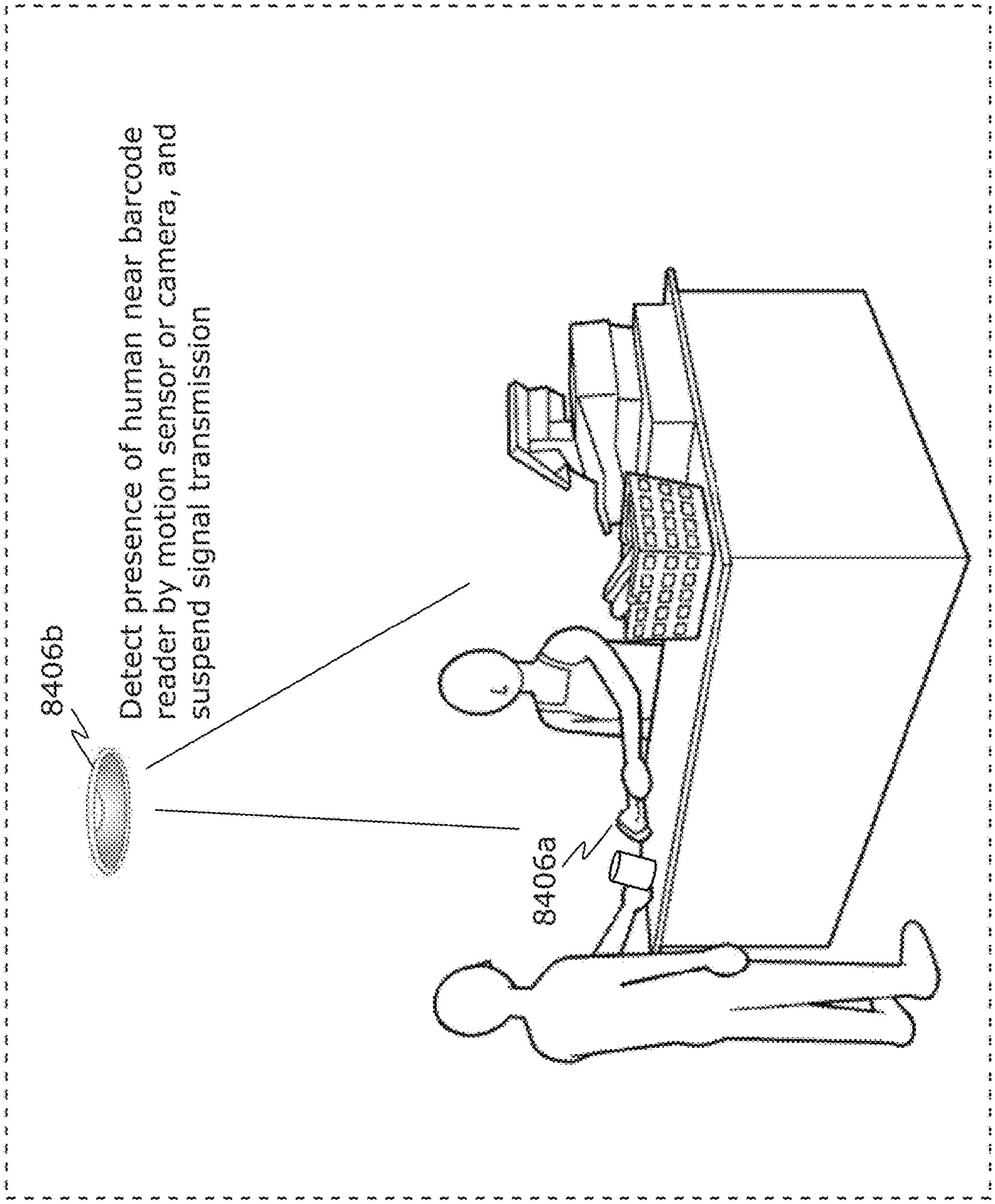
Figure 138:
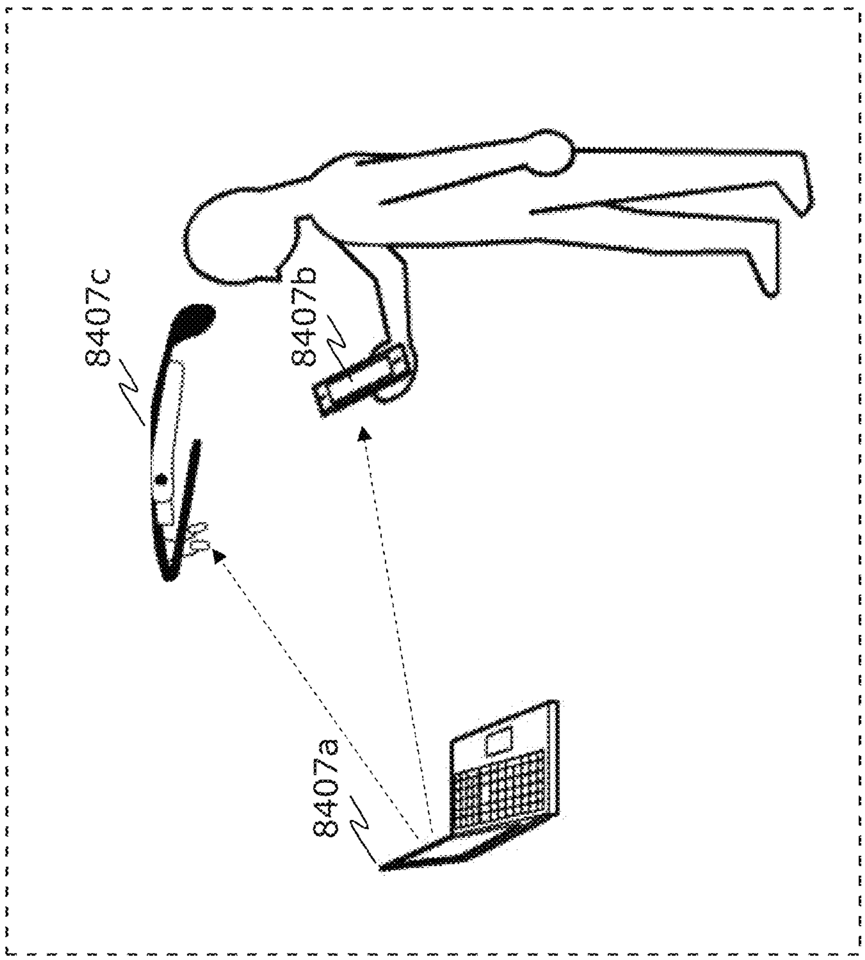
Figure 140:
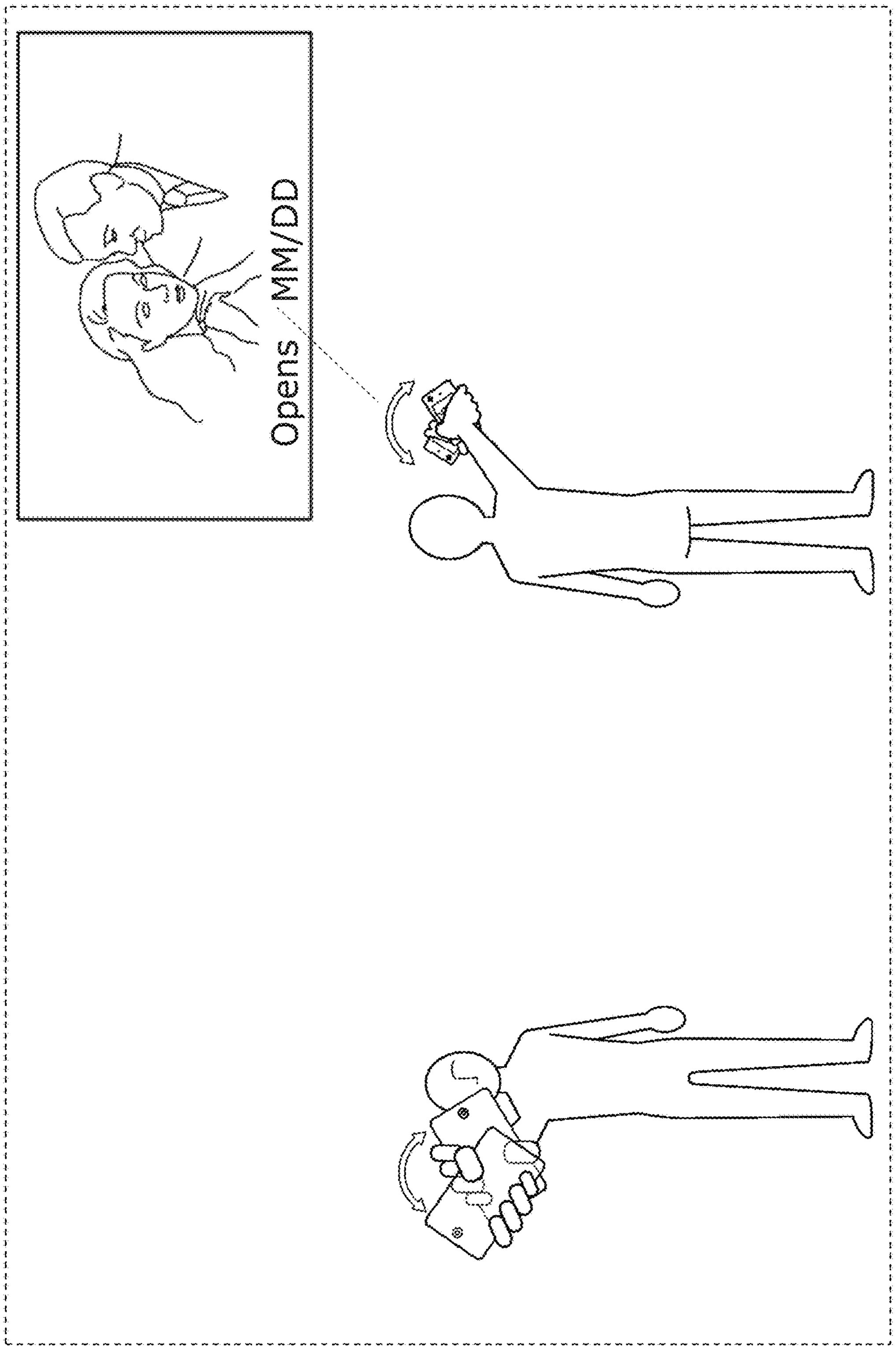
Figure 141:
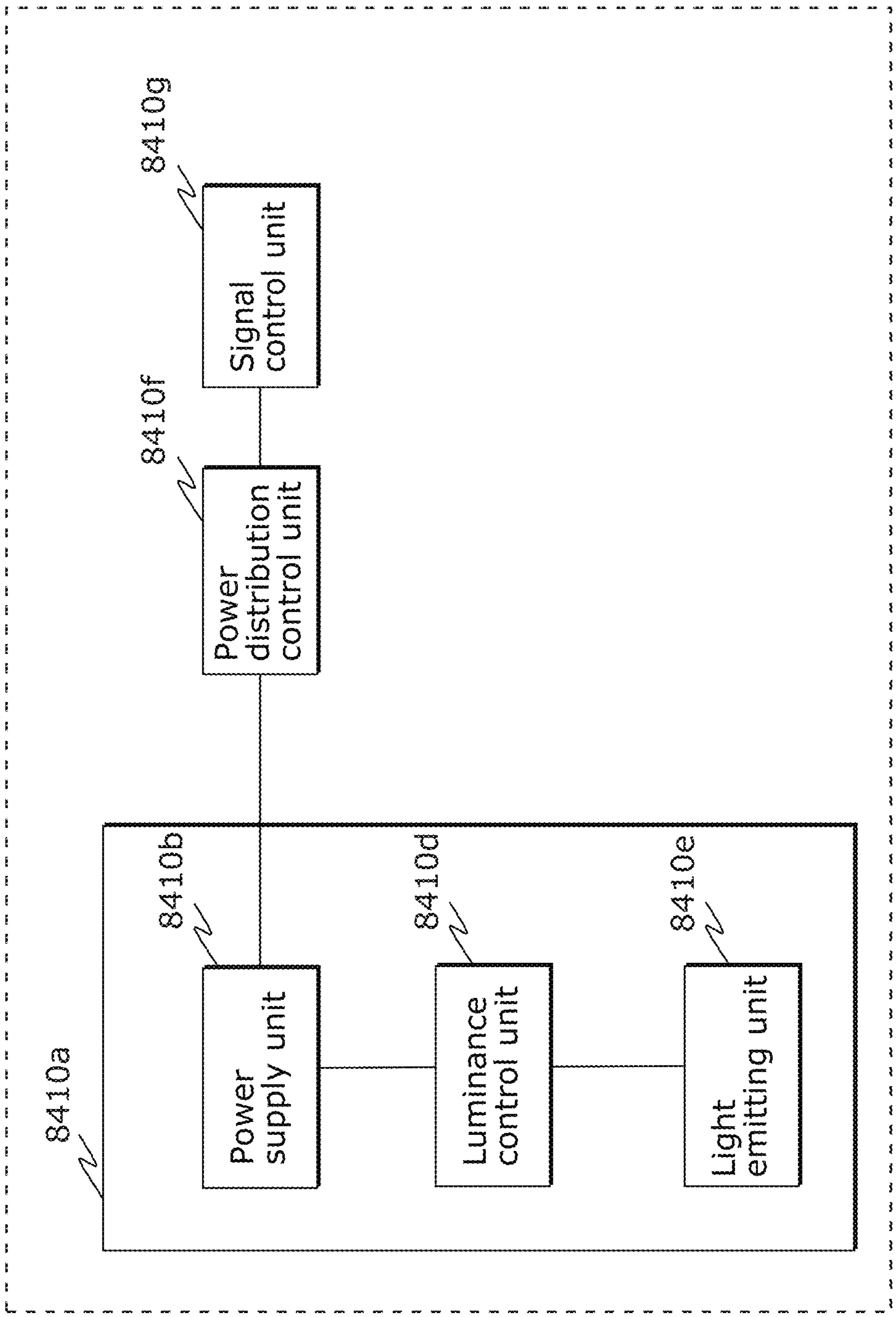
Figure 142:
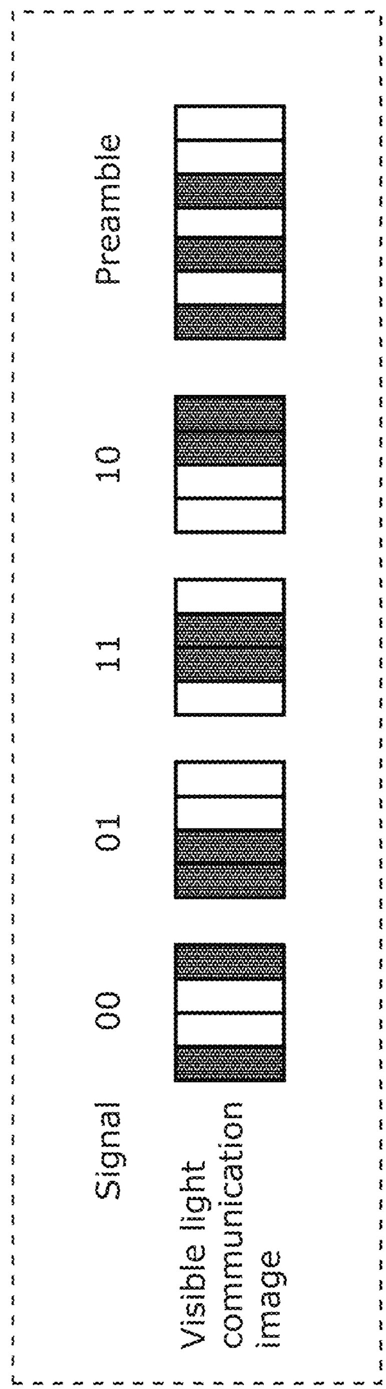
Figure 143:
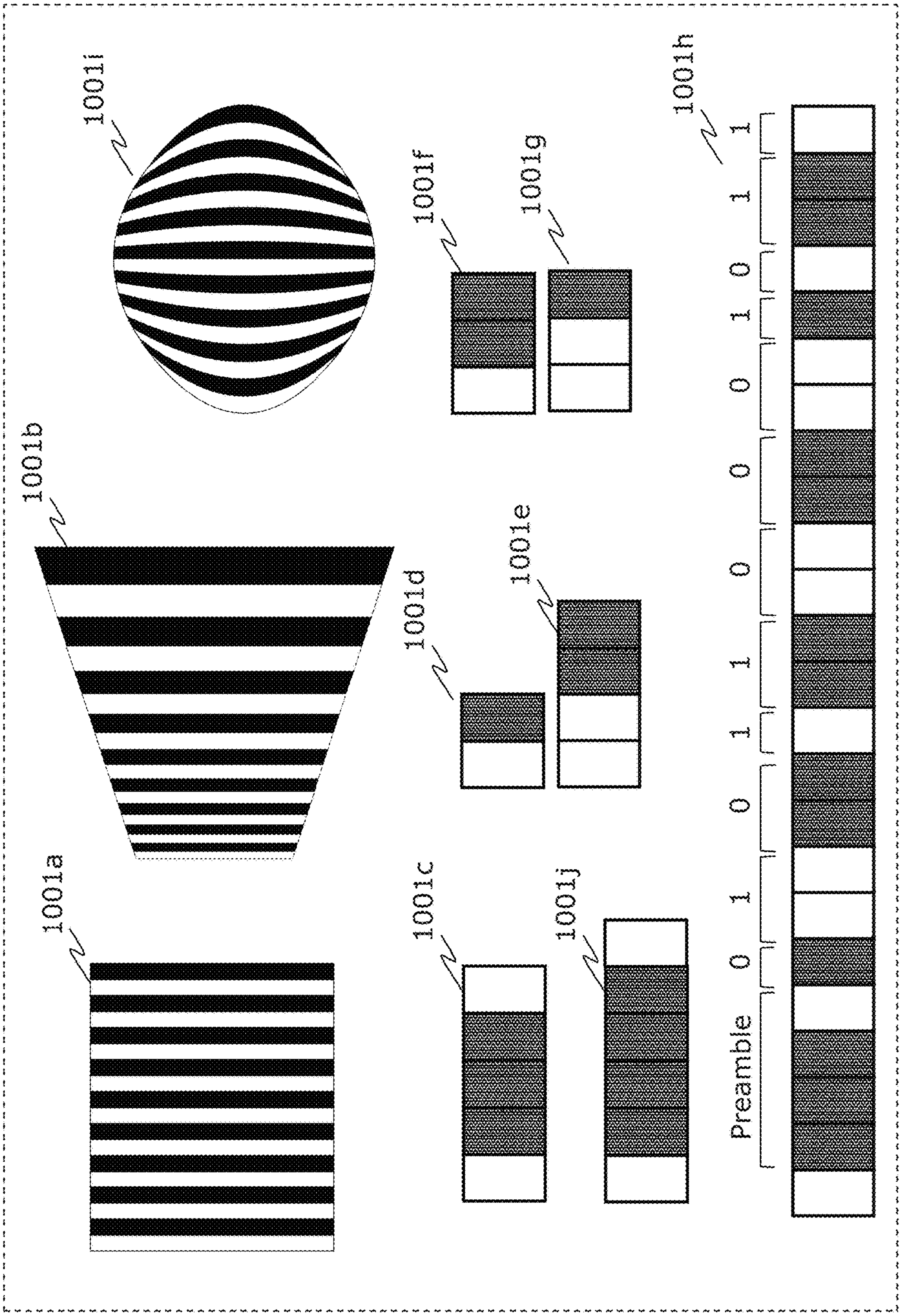
Figure 144:
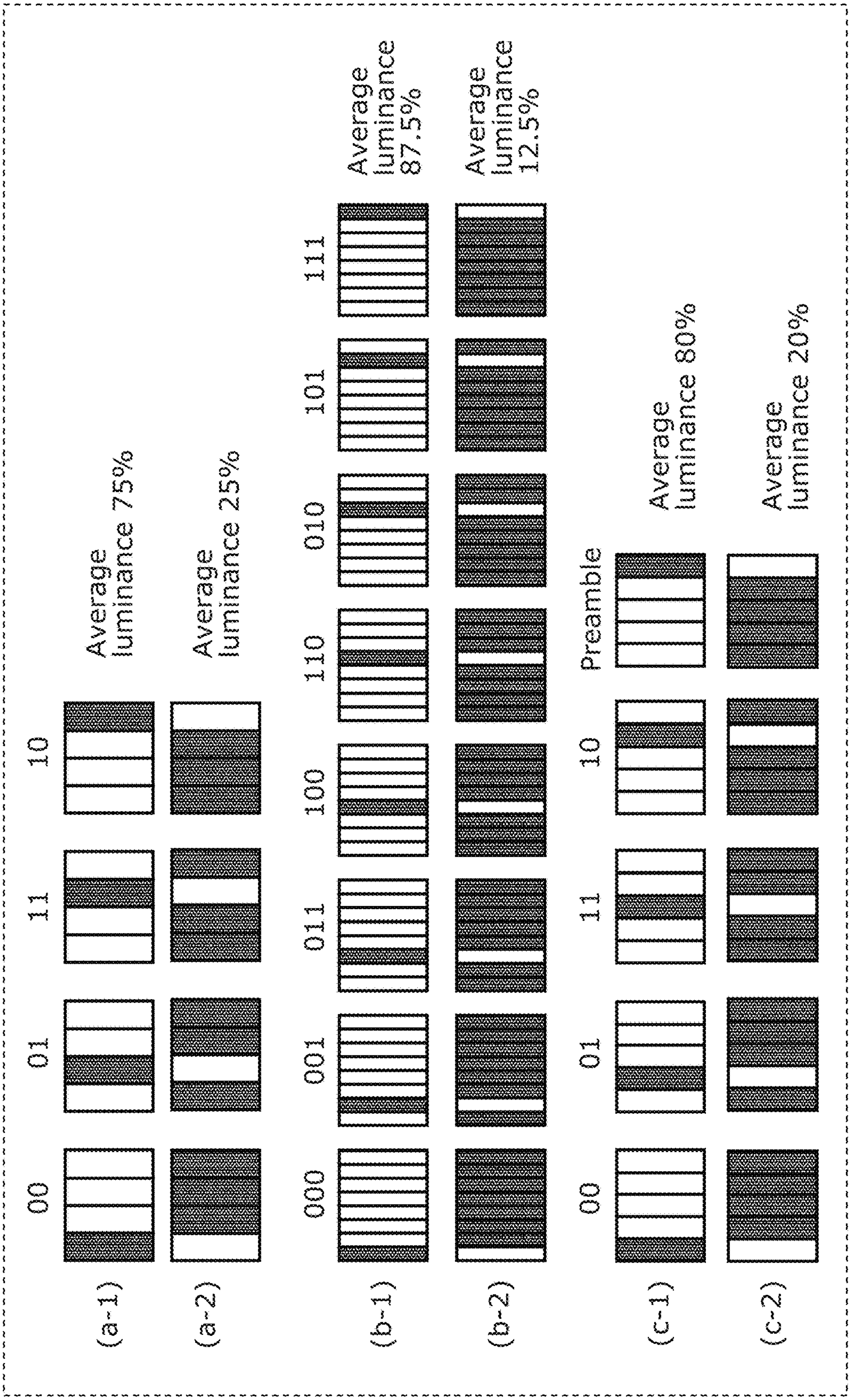
Figure 145:
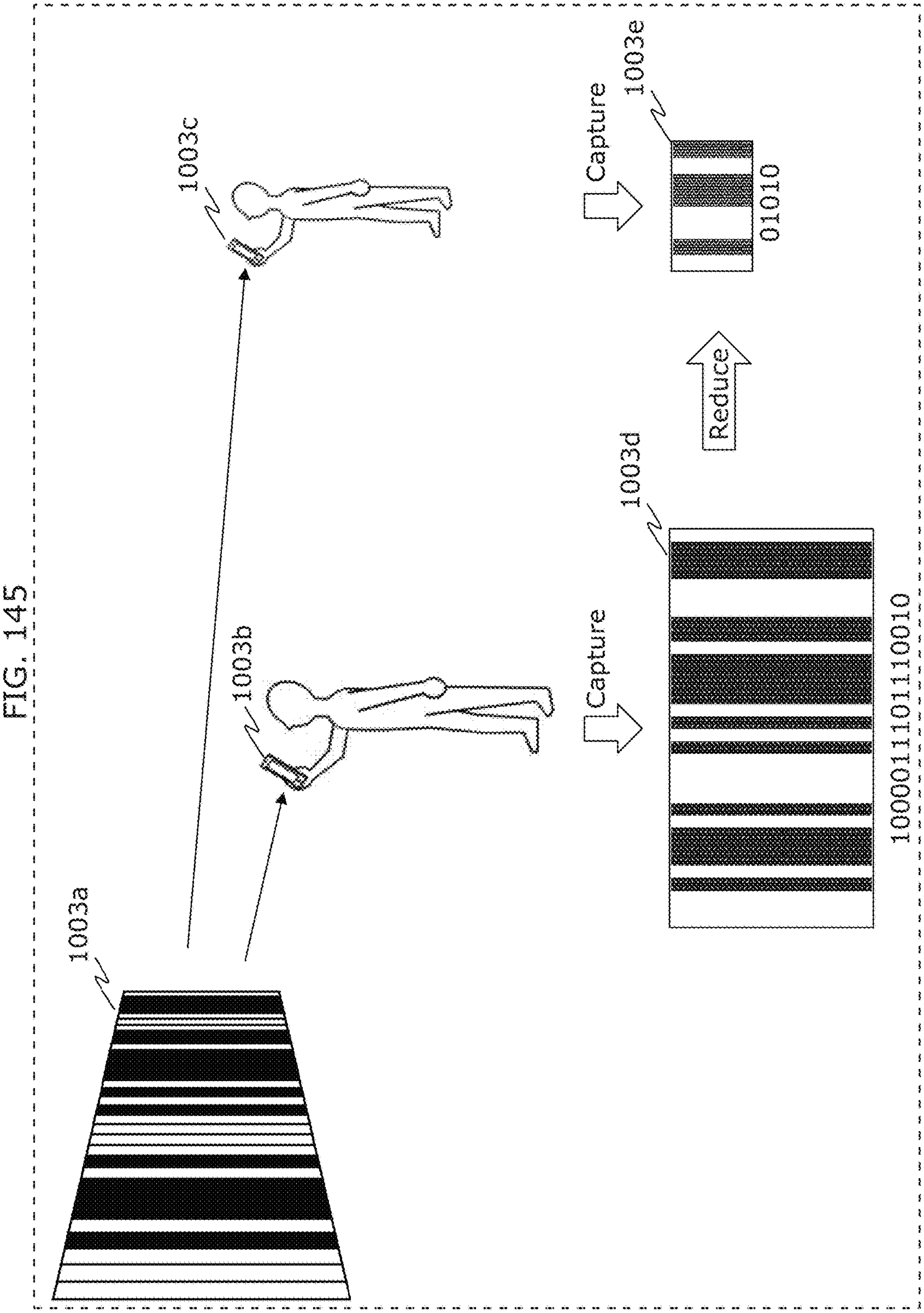
Figure 146:
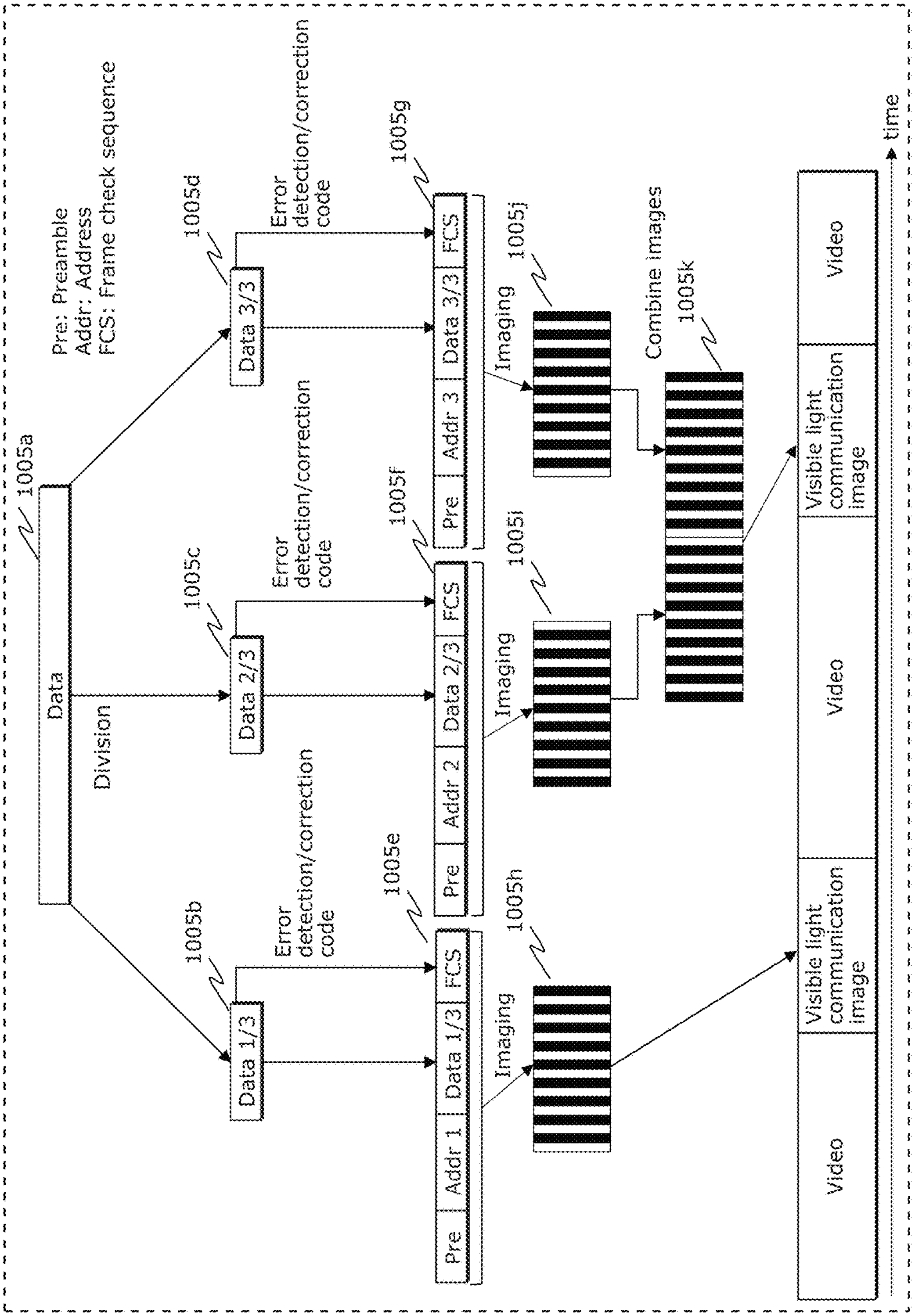
Figure 147:
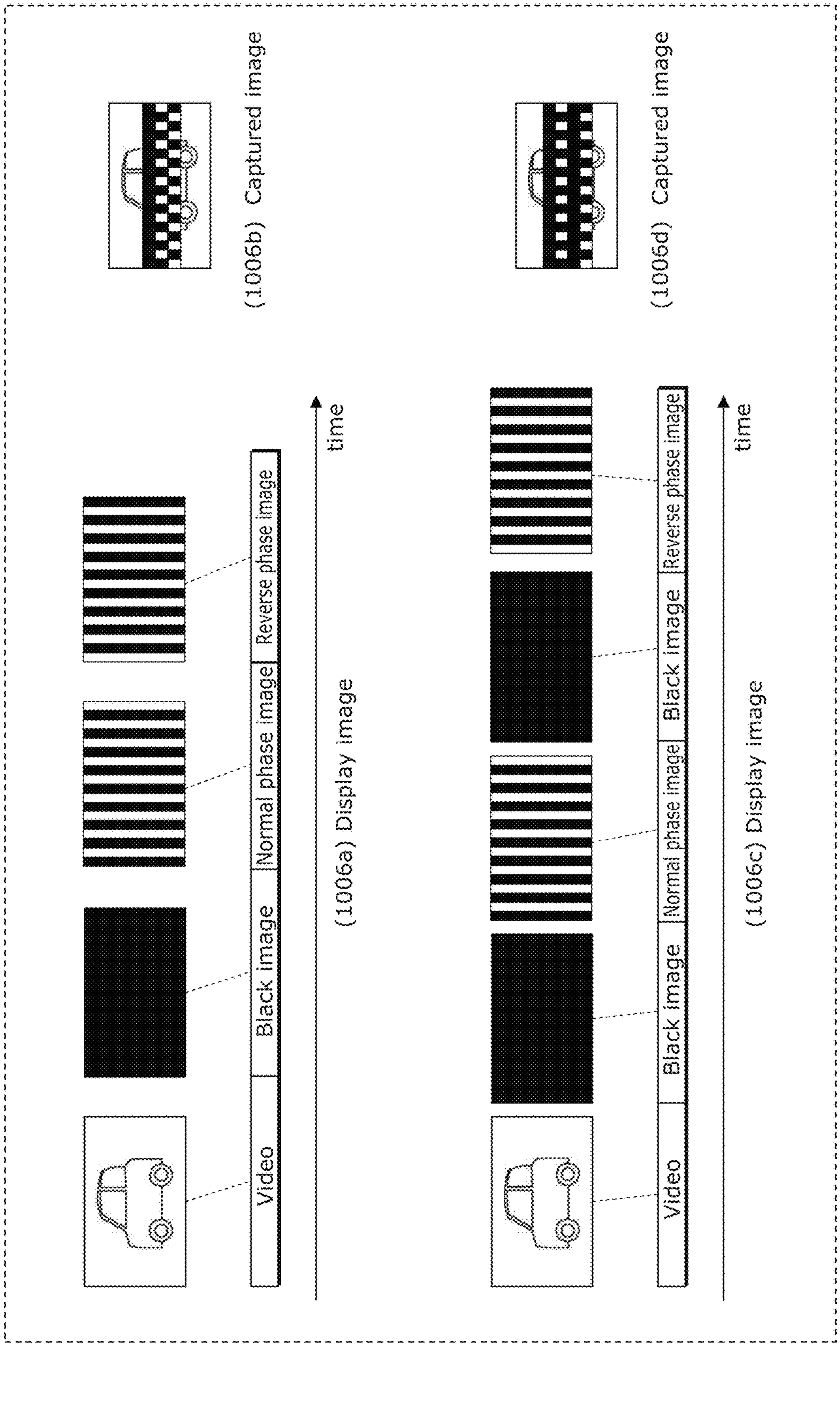
Figure 148:
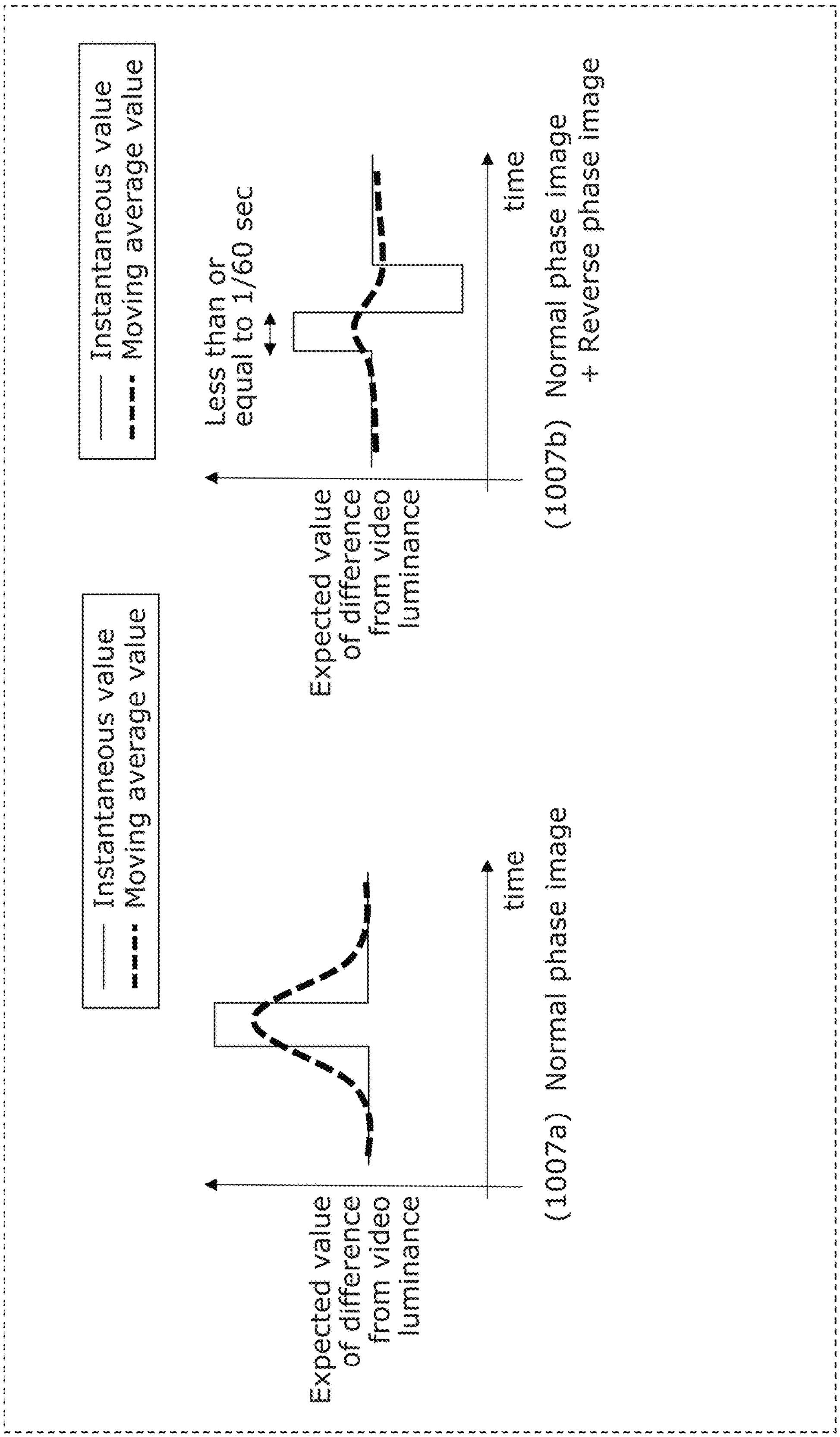
Figure 149:
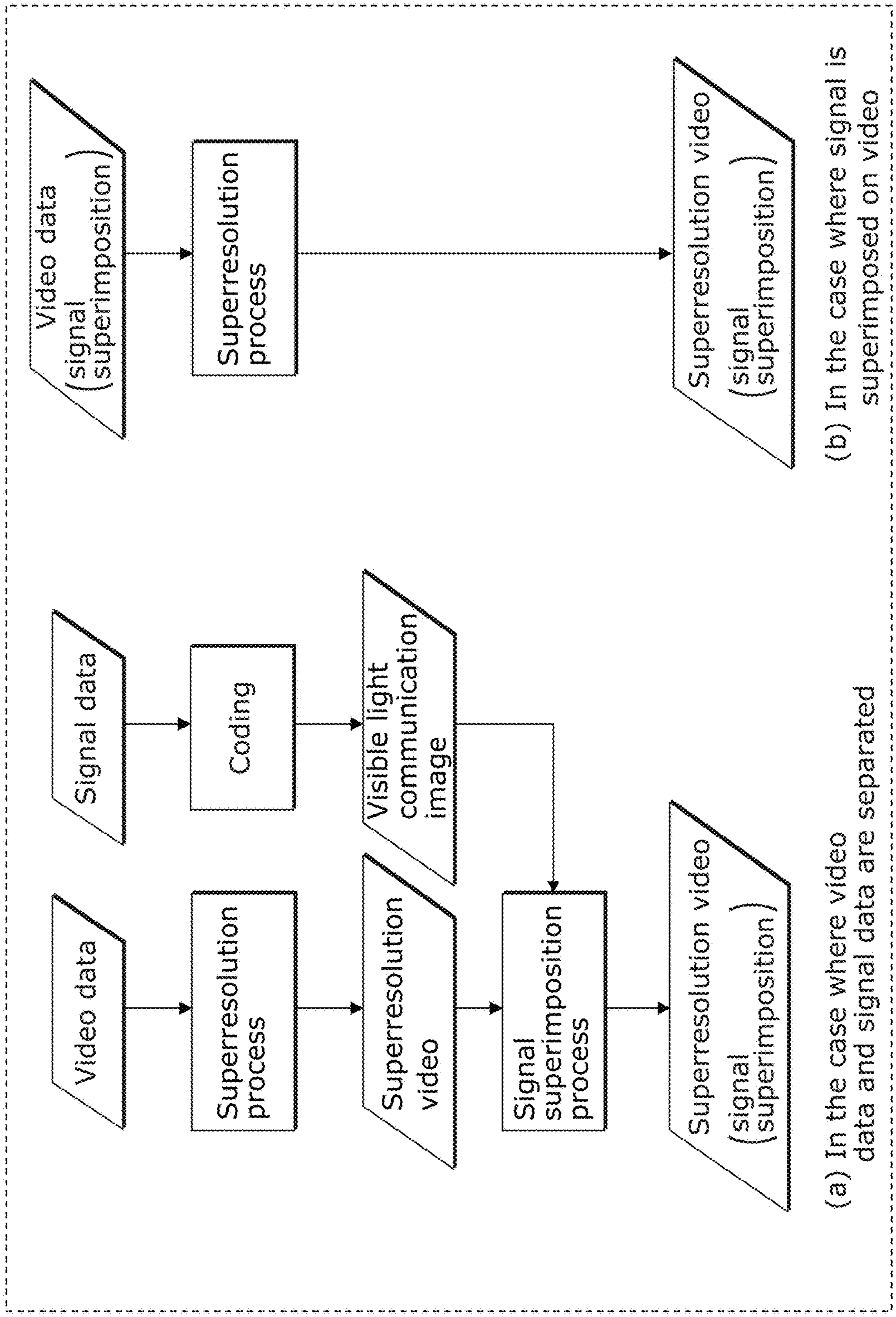
Figure 150:
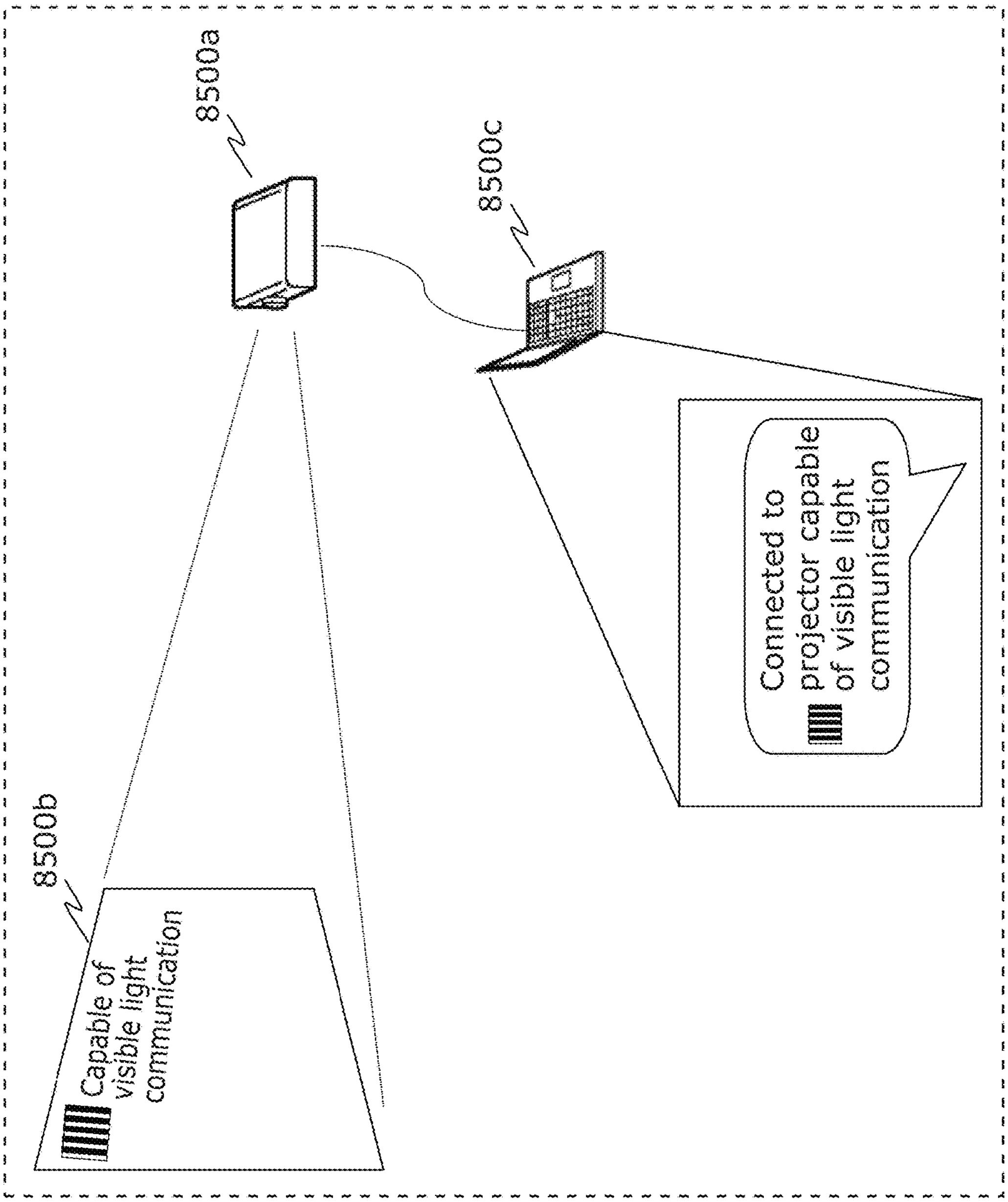
Figure 151:
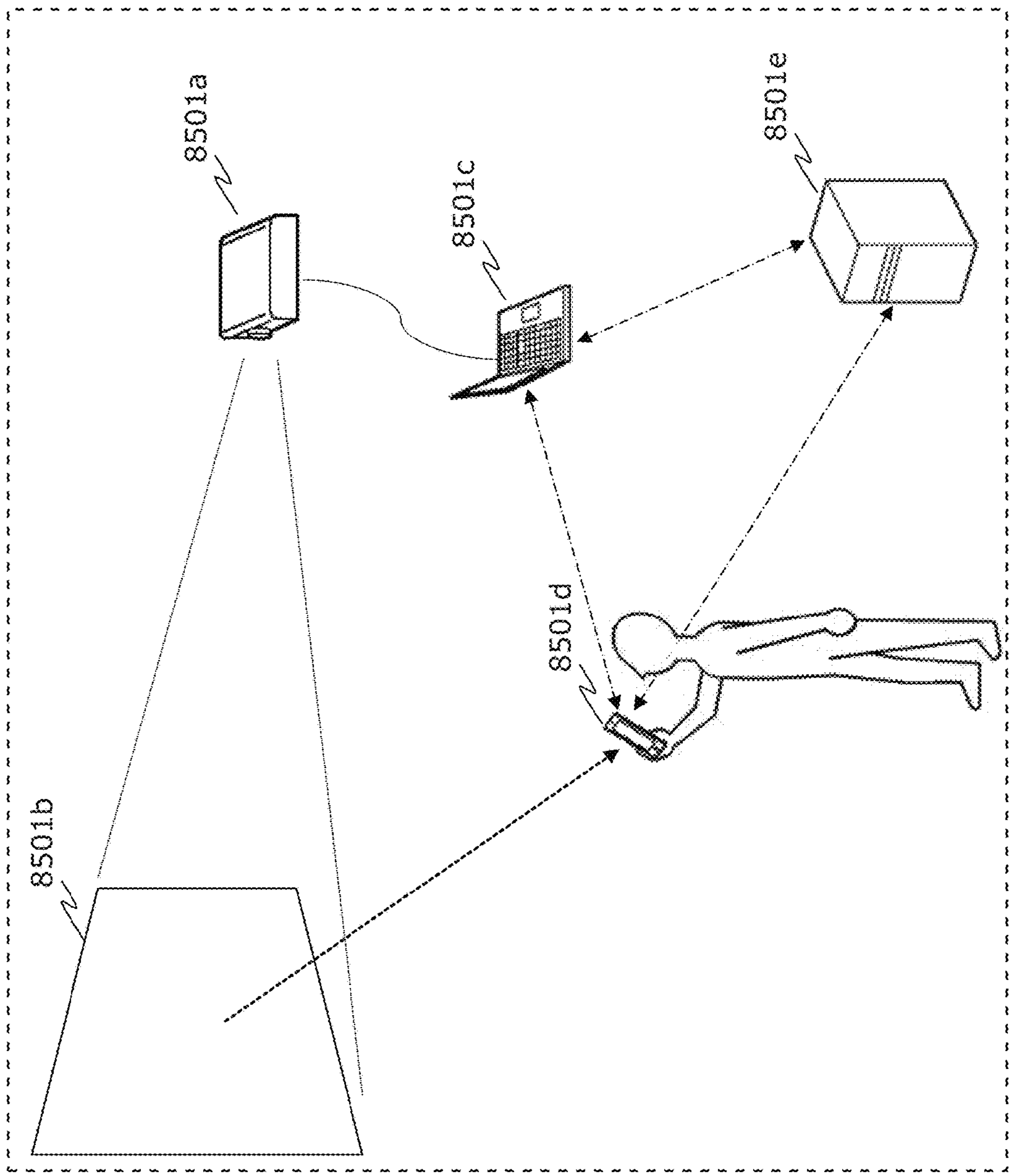
Figure 152:
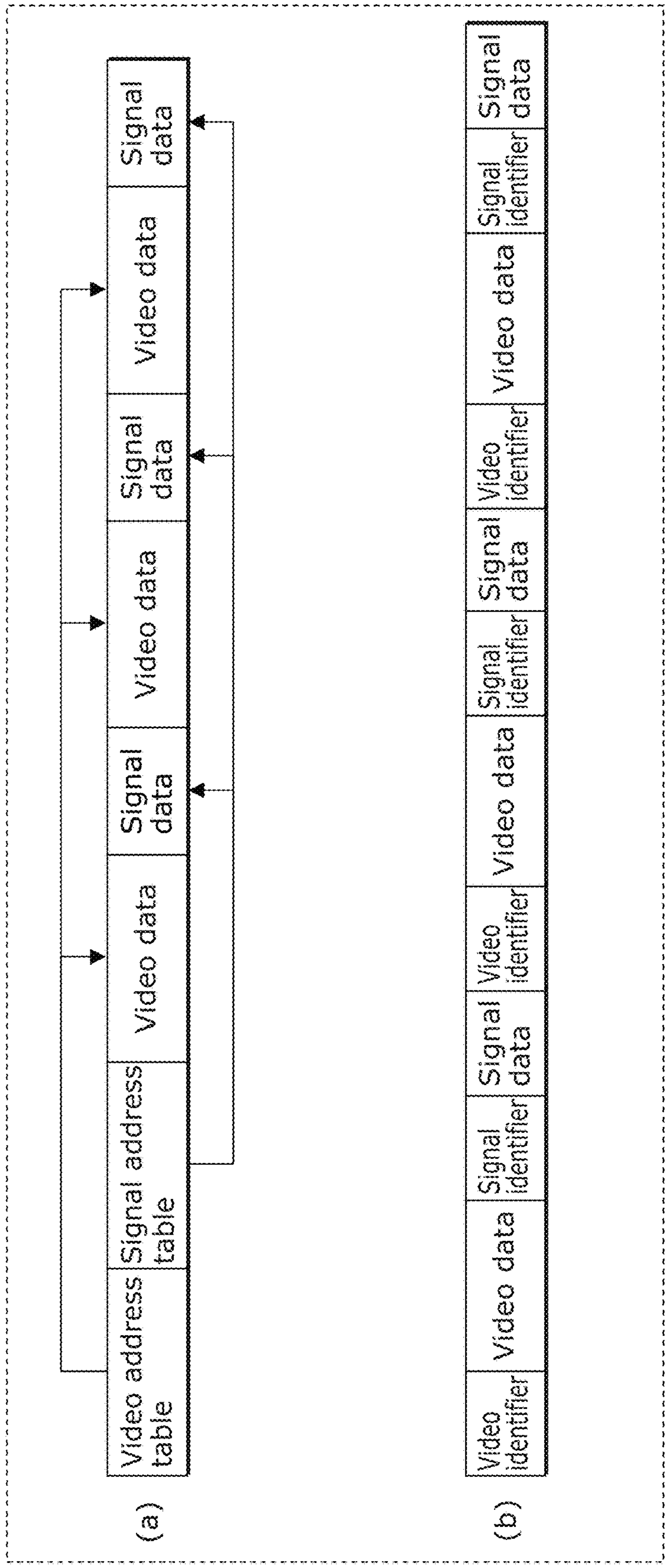
Figure 153:
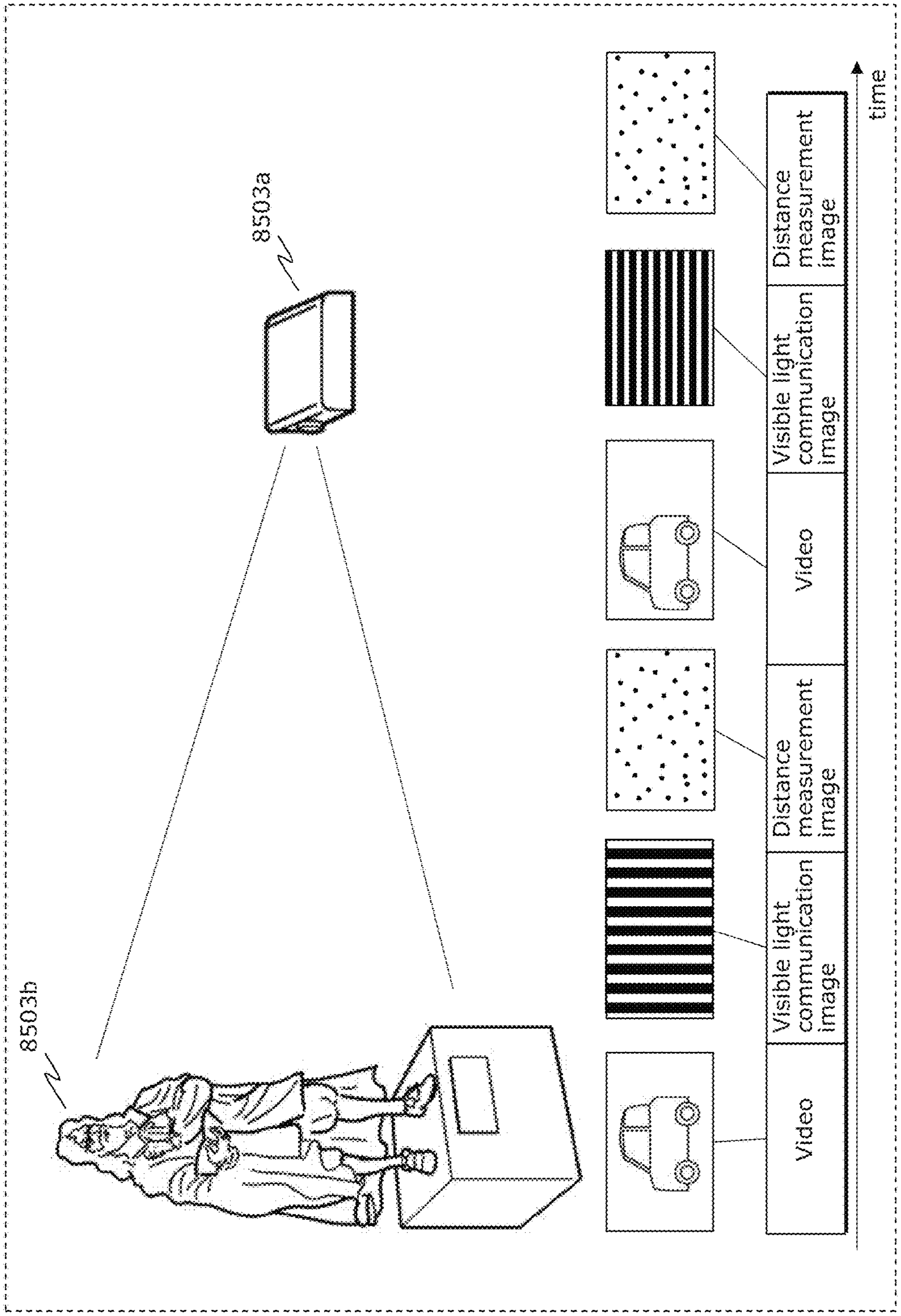
Figure 154:
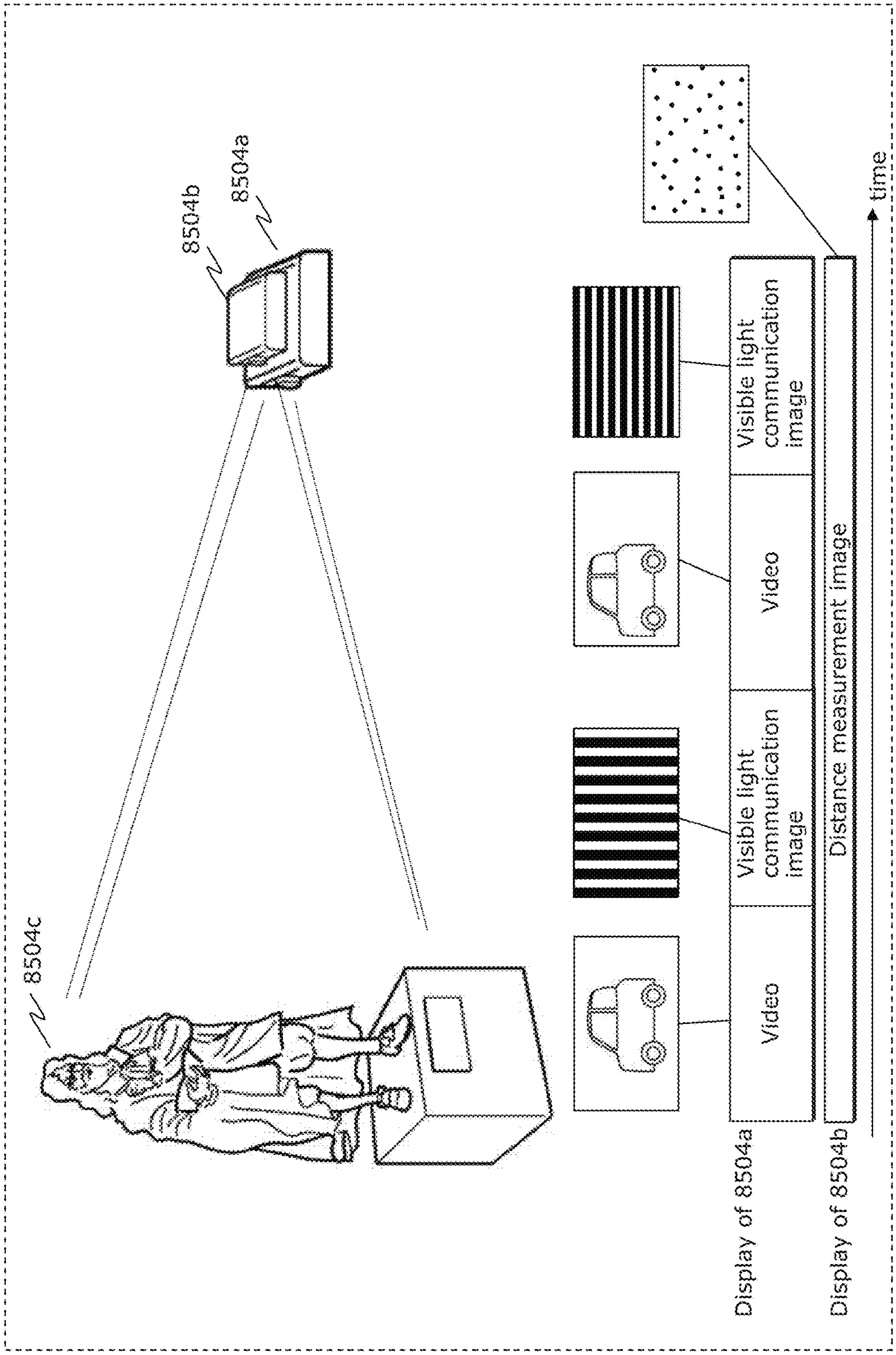
Figure 155:
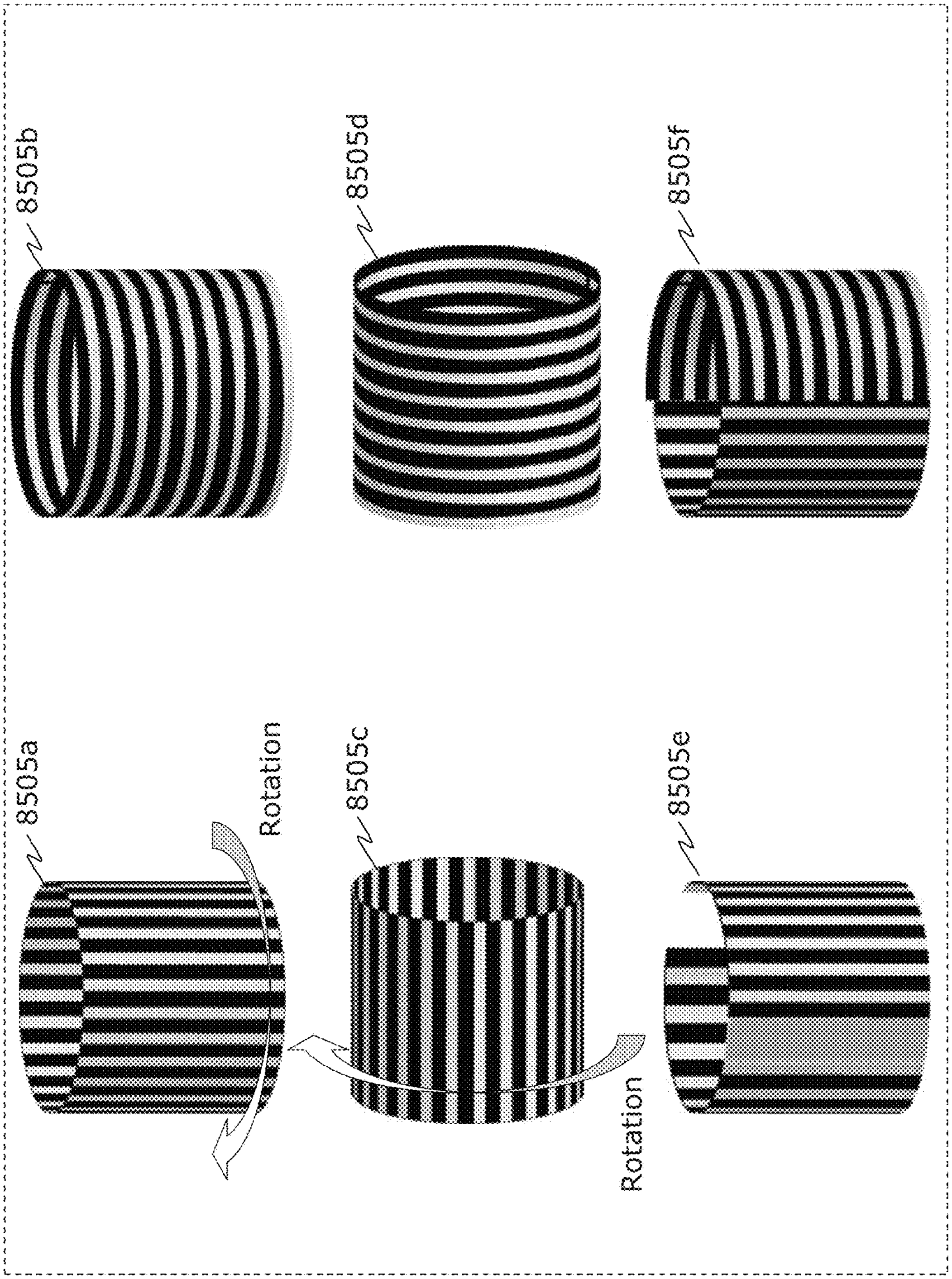
Figure 156:
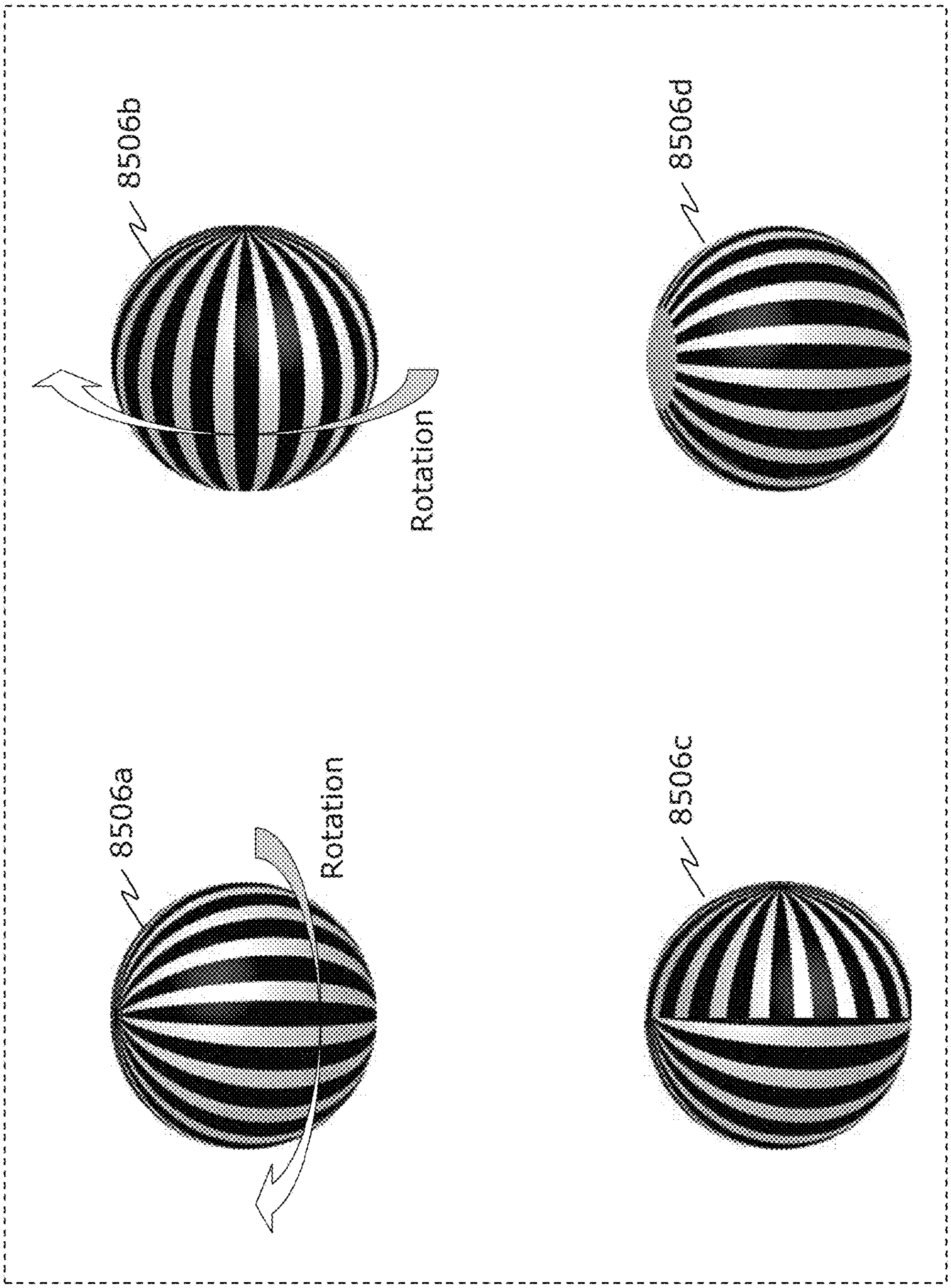
Figure 157:
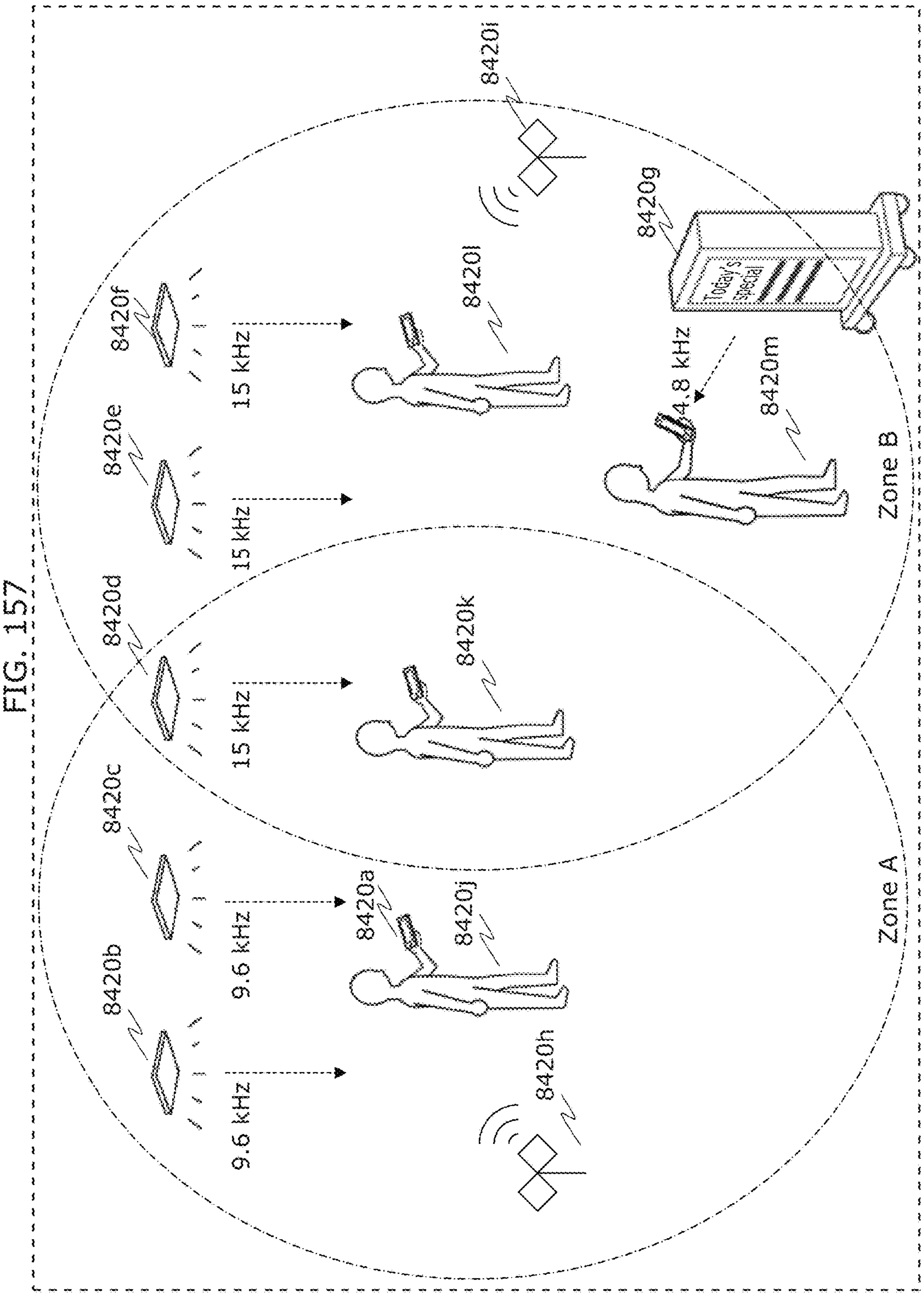
Figure 158:
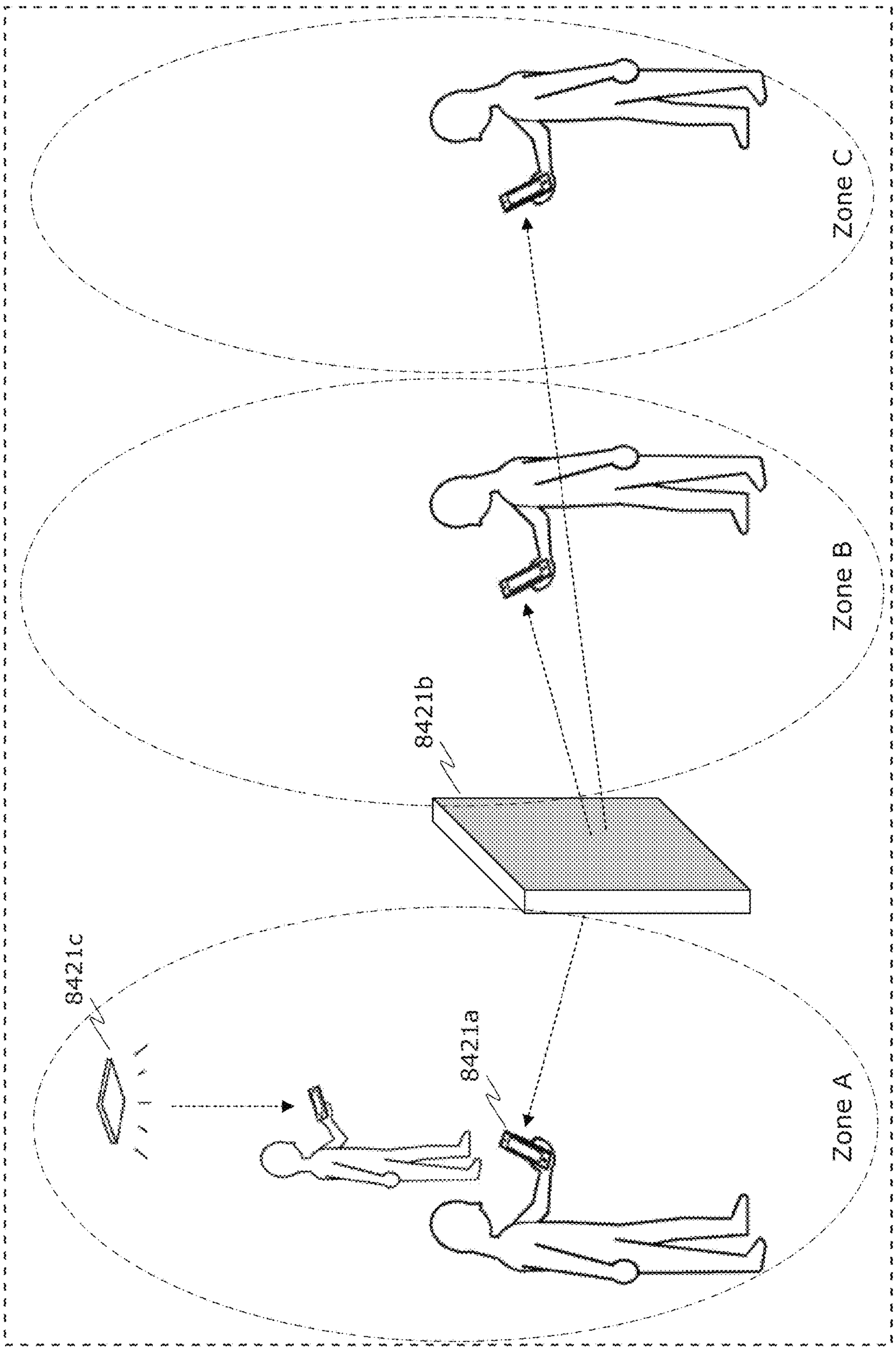
Figure 159:
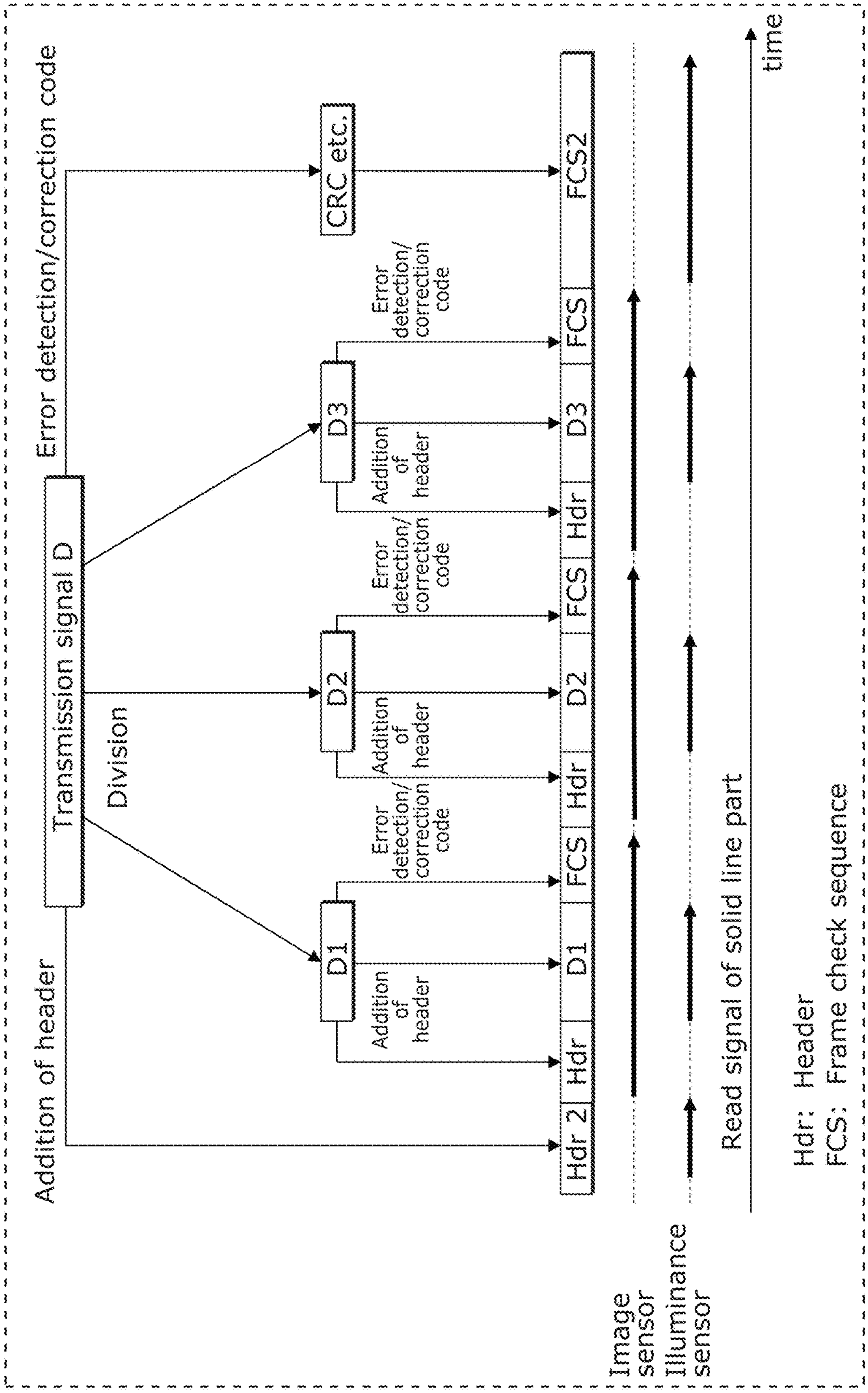
Figure 160:
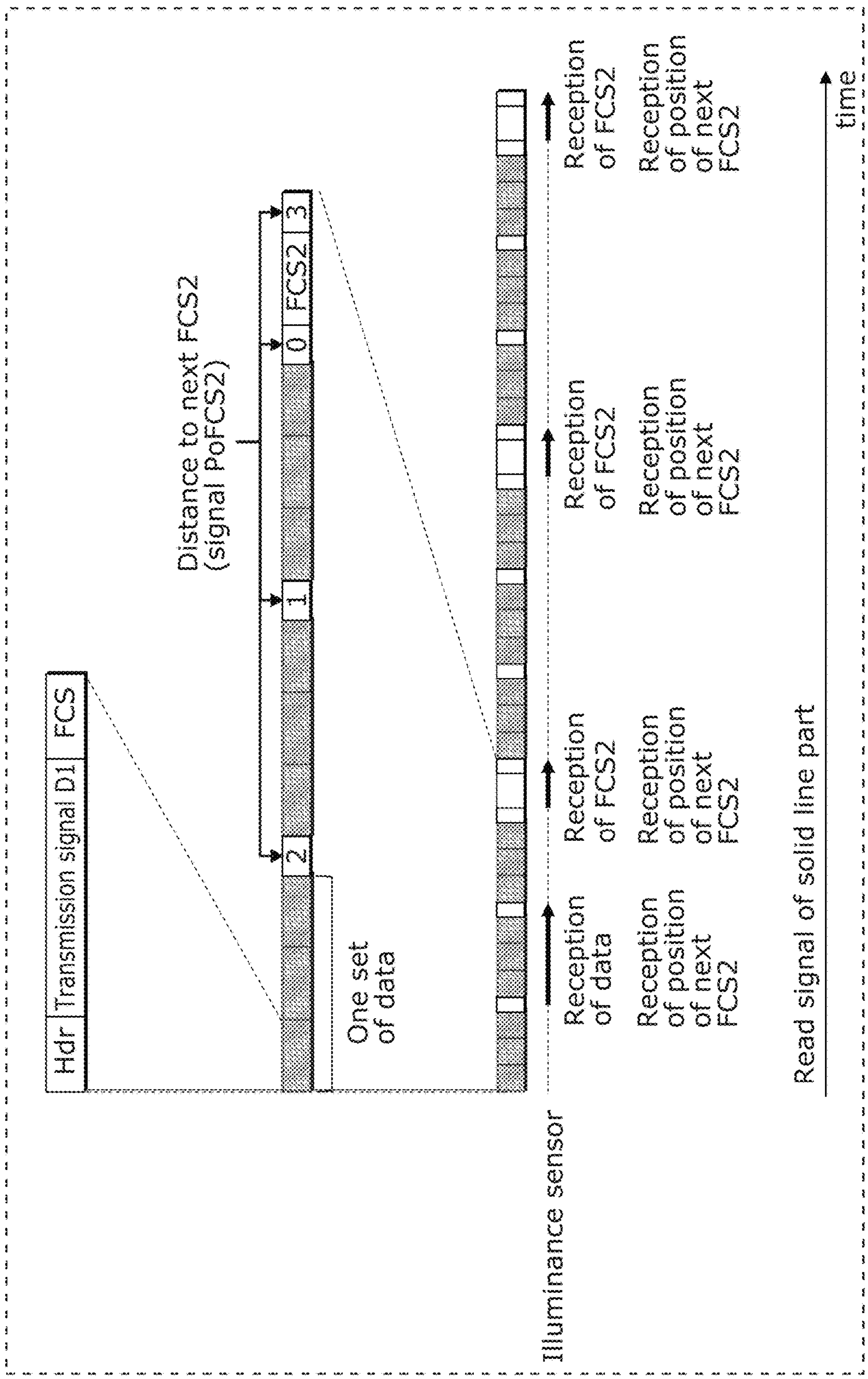
Figure 161B:
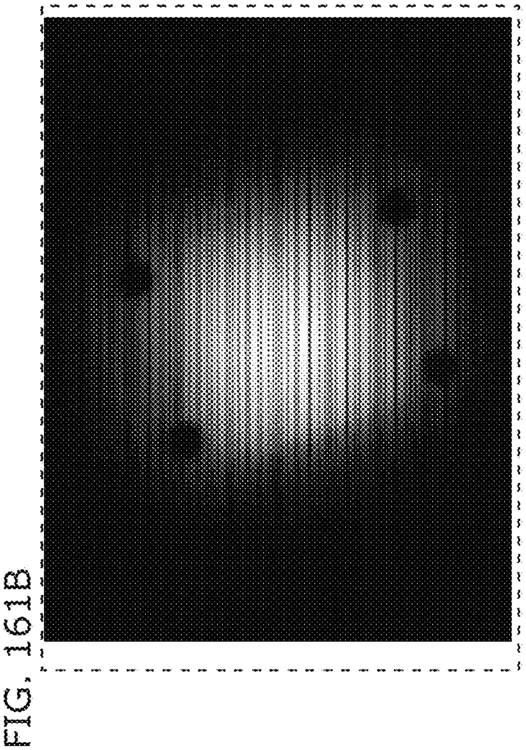
Figure 161A:
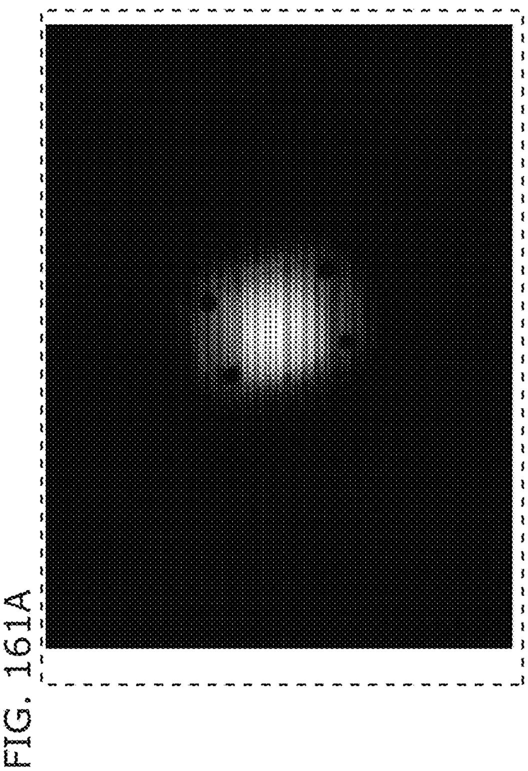
Figure 161C:
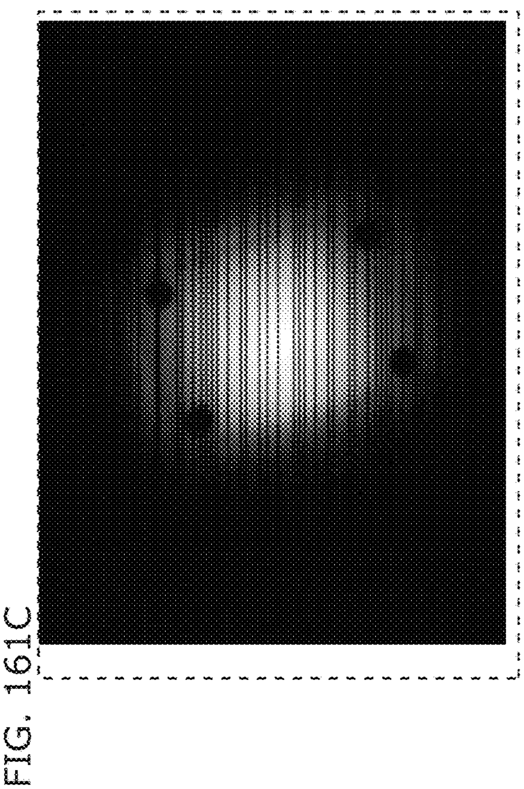

FIG. 109 is a diagram illustrating an example of next operation of a receiver in a bus stop situation in Embodiment 4;

FIG. 110 is a diagram for describing imaging in Embodiment 4;

FIG. 111 is a diagram for describing transmission and imaging in Embodiment 4;

FIG. 112 is a diagram for describing transmission in Embodiment 4;

FIG. 113 is a diagram illustrating an example of operation of a transmitter in Embodiment 5;

FIG. 114 is a diagram illustrating an example of operation of a transmitter in Embodiment 5;

FIG. 115 is a diagram illustrating an example of operation of a transmitter in Embodiment 5;

FIG. 116 is a diagram illustrating an example of operation of a transmitter and a receiver in Embodiment 5;

FIG. 117 is a diagram illustrating an example of operation of a receiver in Embodiment 5;

FIG. 118 is a diagram illustrating an example of operation of a receiver in Embodiment 5;

FIG. 119 is a diagram illustrating an example of operation of a system including a transmitter, a receiver, and a server in Embodiment 5;

FIG. 120 is a block diagram illustrating a structure of a transmitter in Embodiment 5;

FIG. 121 is a block diagram illustrating a structure of a receiver in Embodiment 5;

FIG. 122 is a diagram illustrating an example of operation of a transmitter in Embodiment 5;

FIG. 123 is a diagram illustrating an example of operation of a transmitter in Embodiment 5;

FIG. 124 is a diagram illustrating an example of operation of a transmitter in Embodiment 5;

FIG. 125 is a diagram illustrating an example of operation of a transmitter in Embodiment 5;

FIG. 126 is a diagram illustrating an example of operation of a transmitter in Embodiment 5;

FIG. 127 is a diagram illustrating an example of operation of a transmitter in Embodiment 5;

FIG. 128 is a diagram illustrating an example of operation of a transmitter in Embodiment 5;

FIG. 129 is a diagram illustrating an example of operation of a transmitter and a receiver in Embodiment 5;

FIG. 130 is a diagram illustrating an example of operation of a transmitter and a receiver in Embodiment 5;

FIG. 131 is a diagram illustrating an example of operation of a transmitter and a receiver in Embodiment 5;

FIG. 132 is a diagram illustrating an example of operation of a transmitter and a receiver in Embodiment 5;

FIG. 133 is a diagram illustrating an example of operation of a transmitter and a receiver in Embodiment 5;

FIG. 134 is a diagram illustrating an example of operation of a transmitter and a receiver in Embodiment 5;

FIG. 135 is a diagram illustrating an example of operation of a transmitter and a receiver in Embodiment 5;

FIG. 136 is a diagram illustrating an example of operation of a transmitter and a receiver in Embodiment 5;

FIG. 137 is a diagram illustrating an example of operation of a transmitter and a receiver in Embodiment 5;

FIG. 138 is a diagram illustrating an example of operation of a transmitter and a receiver in Embodiment 5;

FIG. 139 is a diagram illustrating an example of operation of a transmitter and a receiver in Embodiment 5;

FIG. 140 is a diagram illustrating an example of operation of a transmitter and a receiver in Embodiment 5;

FIG. 141 is a diagram illustrating an example of operation of a transmitter and a receiver in Embodiment 5;

FIG. 142 is a diagram illustrating a coding scheme in Embodiment 5;

FIG. 143 is a diagram illustrating a coding scheme that can receive light even in the case of capturing an image in an oblique direction in Embodiment 5;

FIG. 144 is a diagram illustrating a coding scheme that differs in information amount depending on distance in Embodiment 5;

FIG. 145 is a diagram illustrating a coding scheme that differs in information amount depending on distance in Embodiment 5;

FIG. 146 is a diagram illustrating a coding scheme that divides data in Embodiment 5;

FIG. 147 is a diagram illustrating an opposite-phase image insertion effect in Embodiment 5;

FIG. 148 is a diagram illustrating an opposite-phase image insertion effect in Embodiment 5;

FIG. 149 is a diagram illustrating a superresolution process in Embodiment 5;

FIG. 150 is a diagram illustrating a display indicating visible light communication capability in Embodiment 5;

FIG. 151 is a diagram illustrating information obtainment using a visible light communication signal in Embodiment 5;

FIG. 152 is a diagram illustrating a data format in Embodiment 5;

FIG. 153 is a diagram illustrating reception by estimating a stereoscopic shape in Embodiment 5;

FIG. 154 is a diagram illustrating reception by estimating a stereoscopic shape in Embodiment 5;

FIG. 155 is a diagram illustrating stereoscopic projection in Embodiment 5;

FIG. 156 is a diagram illustrating stereoscopic projection in Embodiment 5;

FIG. 157 is a diagram illustrating an example of operation of a transmitter and a receiver in Embodiment 5;

FIG. 158 is a diagram illustrating an example of operation of a transmitter and a receiver in Embodiment 5;

FIG. 159 is a diagram illustrating an example of a transmission signal in Embodiment 6;

FIG. 160 is a diagram illustrating an example of a transmission signal in Embodiment 6;

FIG. 161A is a diagram illustrating an example of an image (bright line image) captured by a receiver in Embodiment 6;

FIG. 161B is a diagram illustrating an example of an image (bright line image) captured by a receiver in Embodiment 6;

FIG. 161C is a diagram illustrating an example of an image (bright line image) captured by a receiver in Embodiment 6.

Figure 162B:
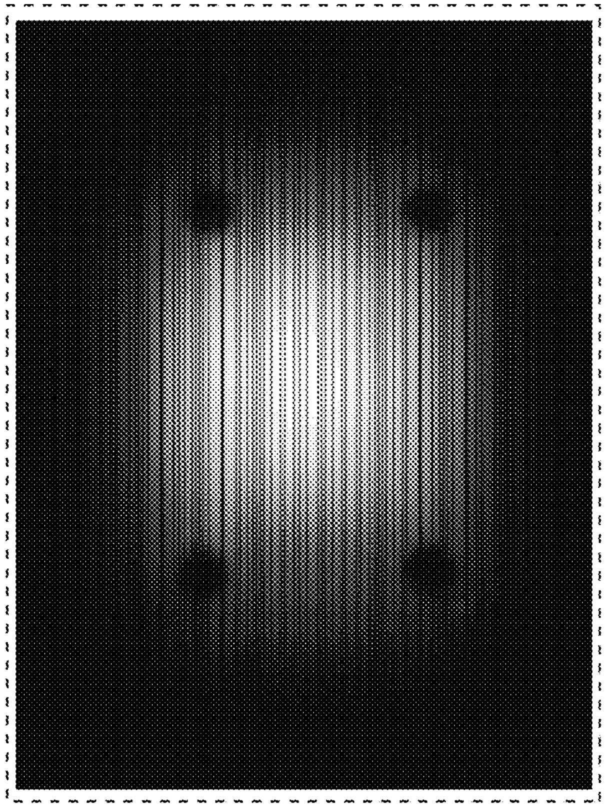
Figure 162A:
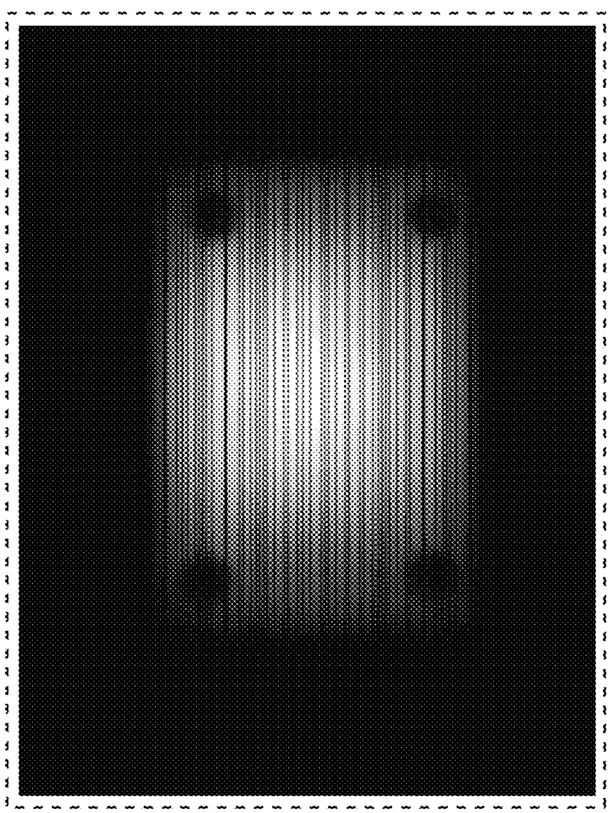
Figure 163C:
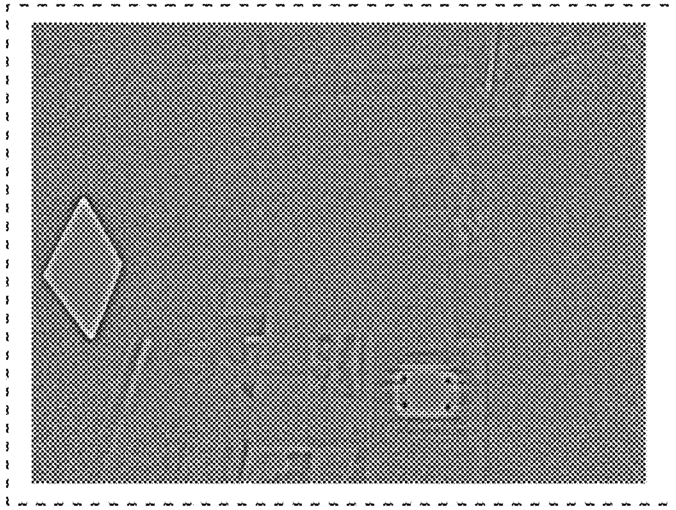
Figure 163B:
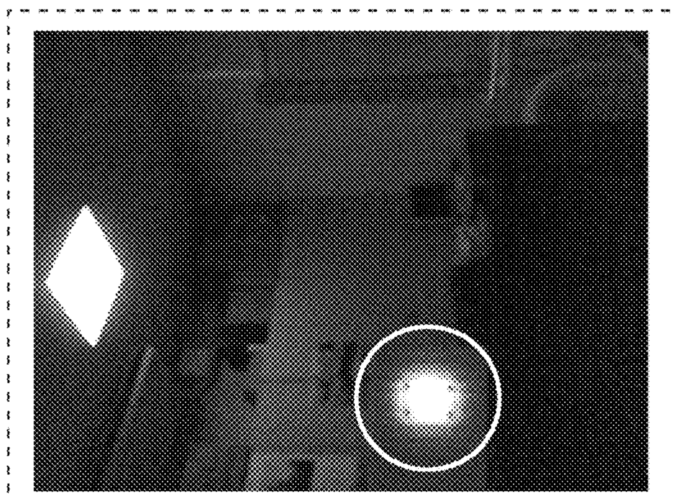
Figure 163A:
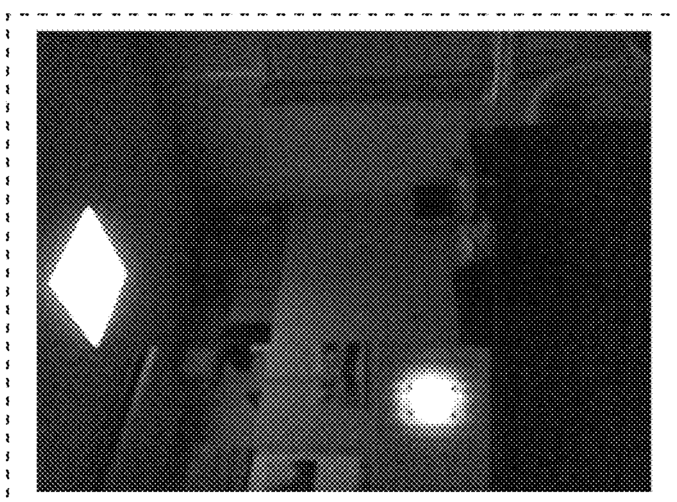
Figure 164:
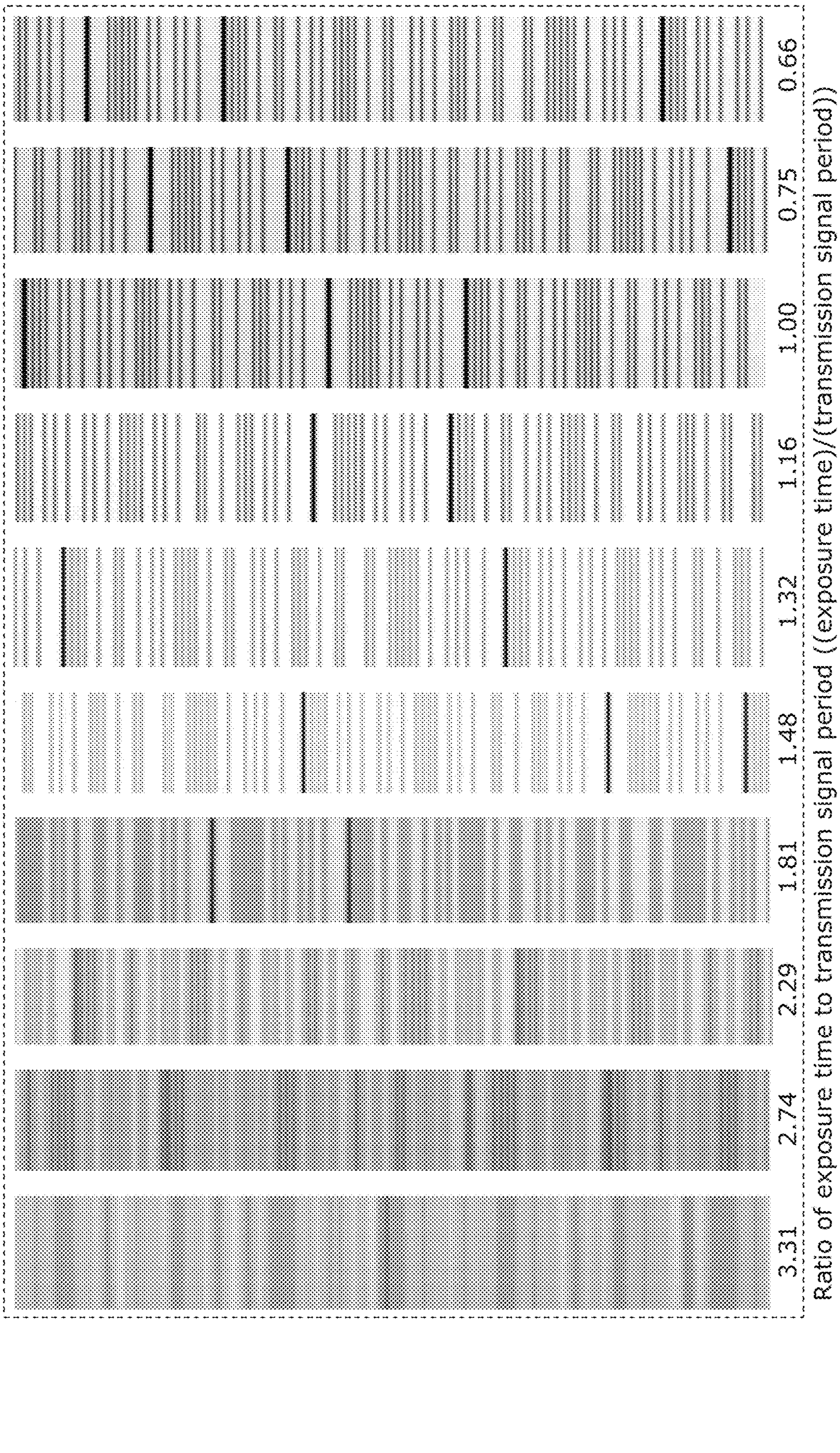
Figure 165:
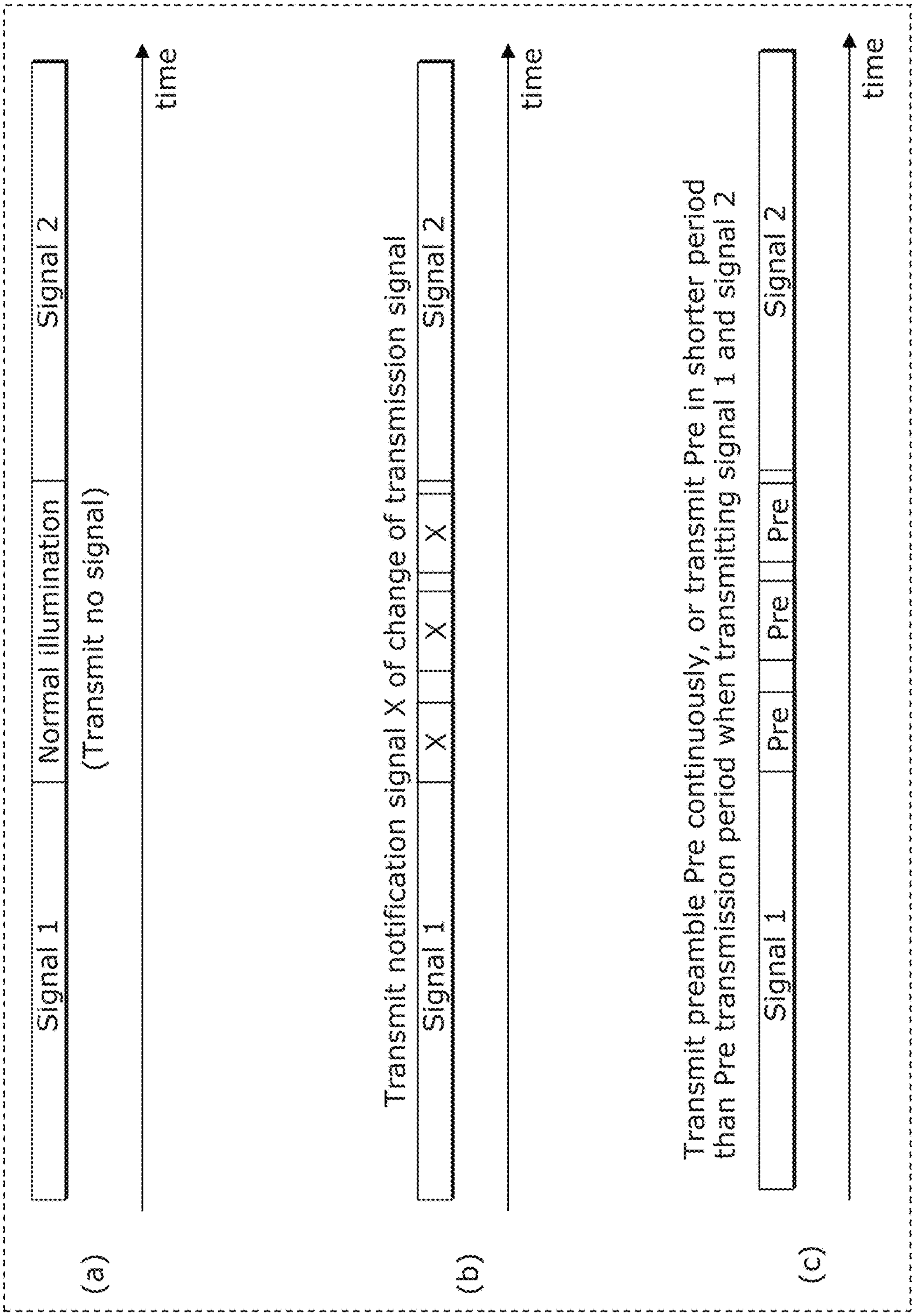
Figure 166:
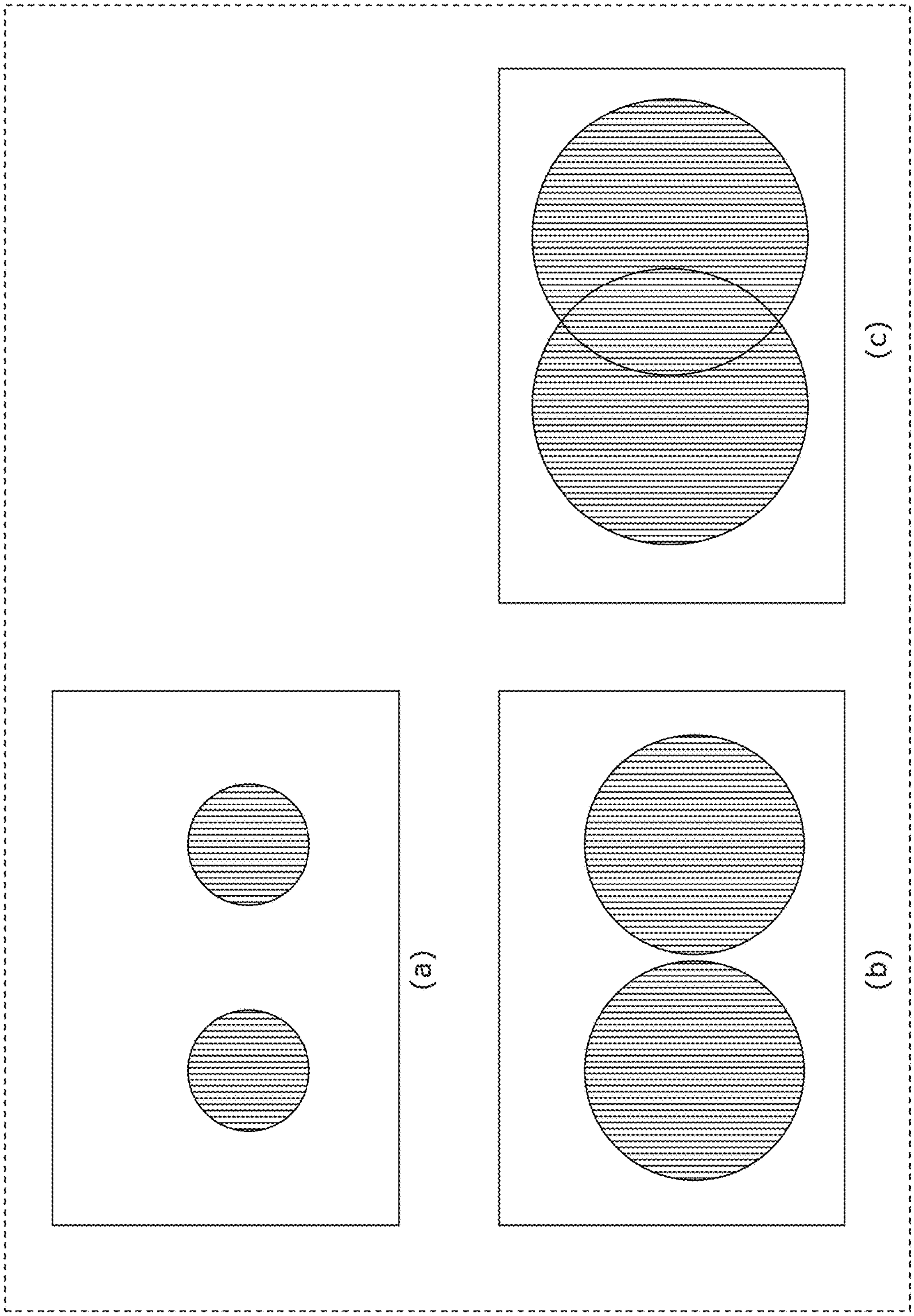
Figure 167:
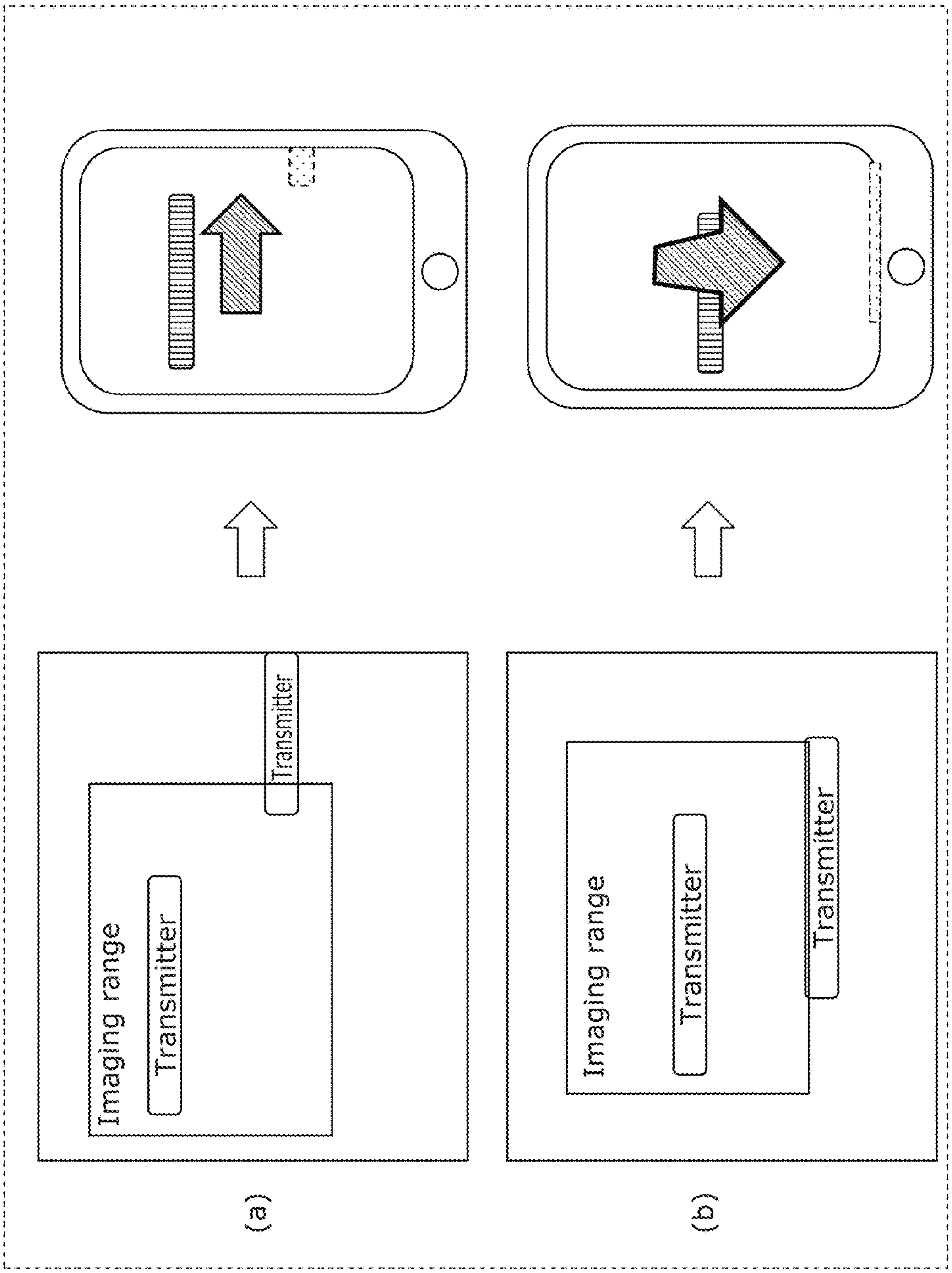
Figure 168:
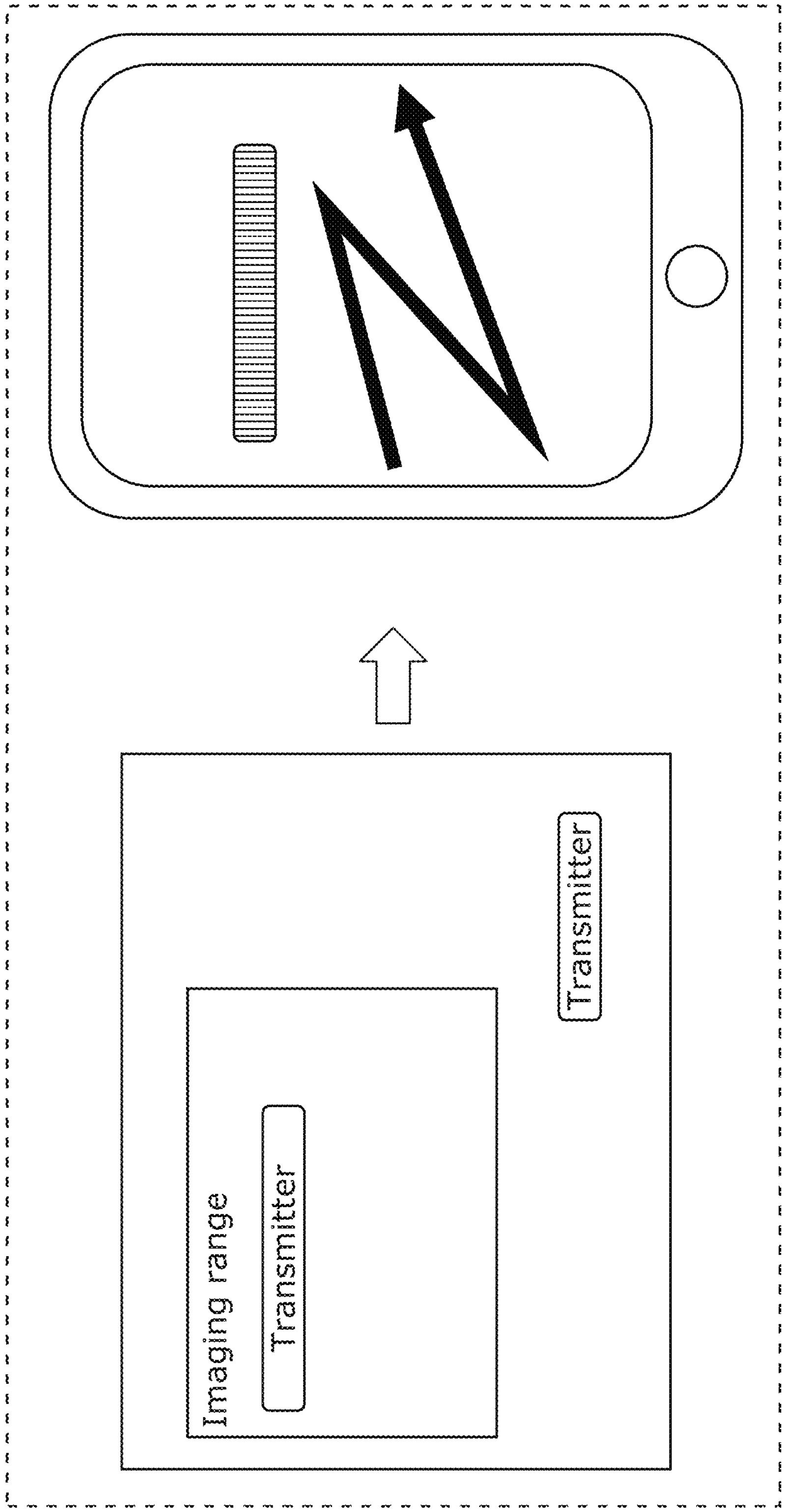
Figure 169:
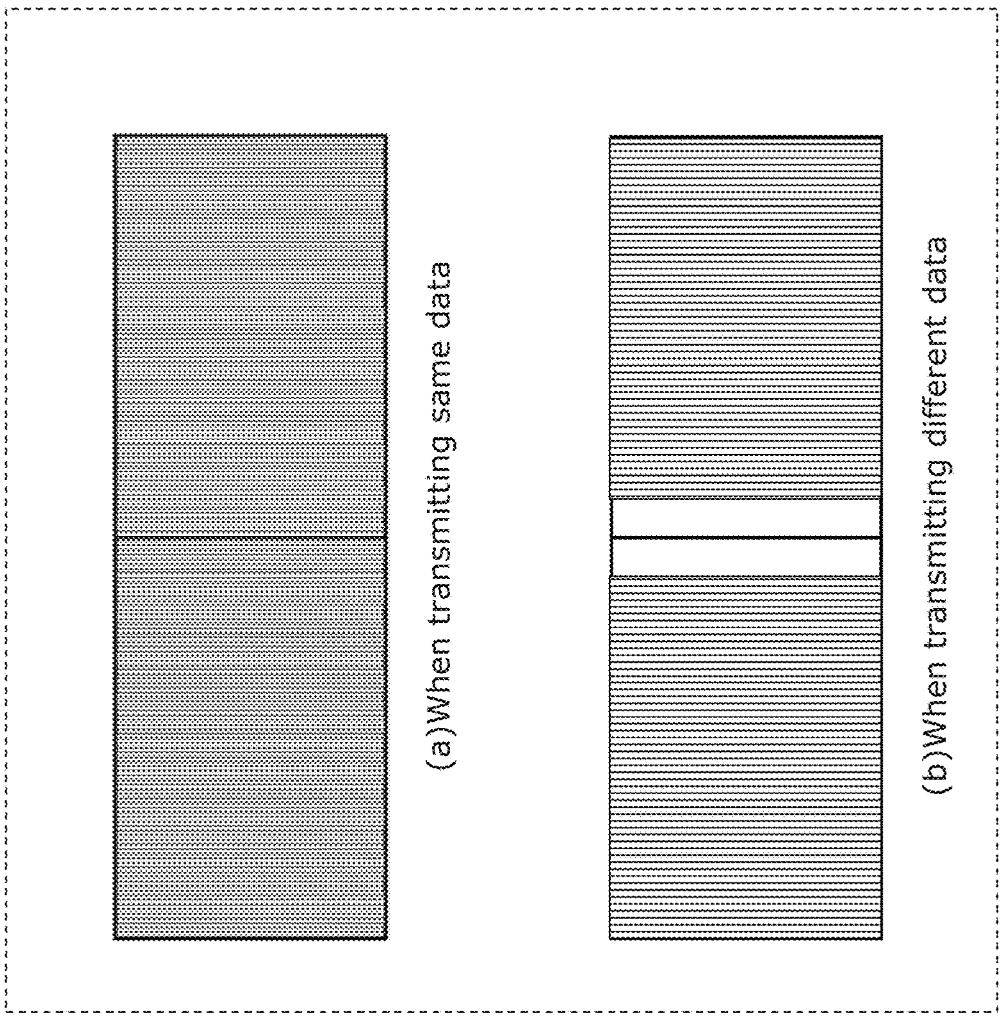
Figure 170:
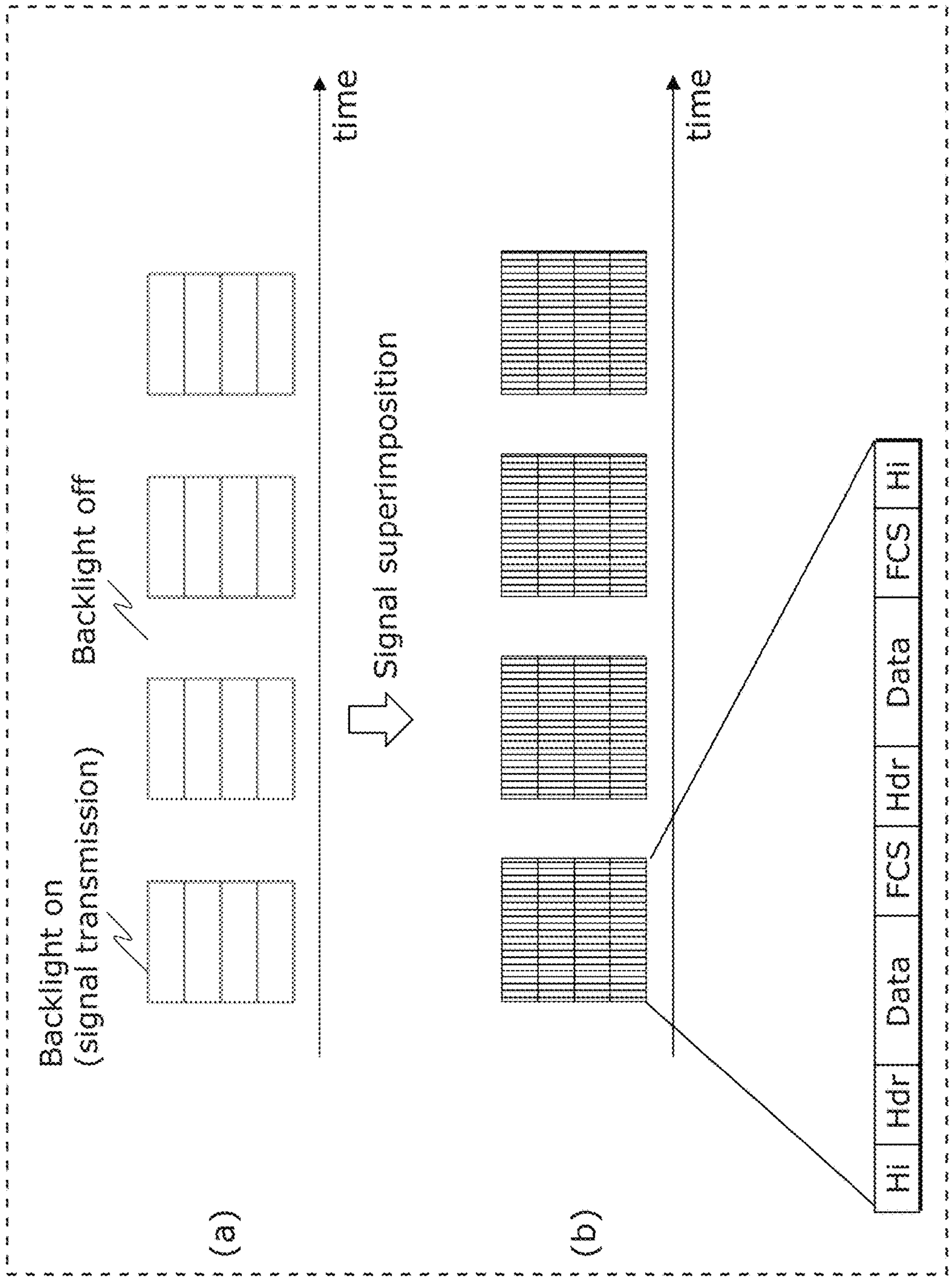
Figure 171:
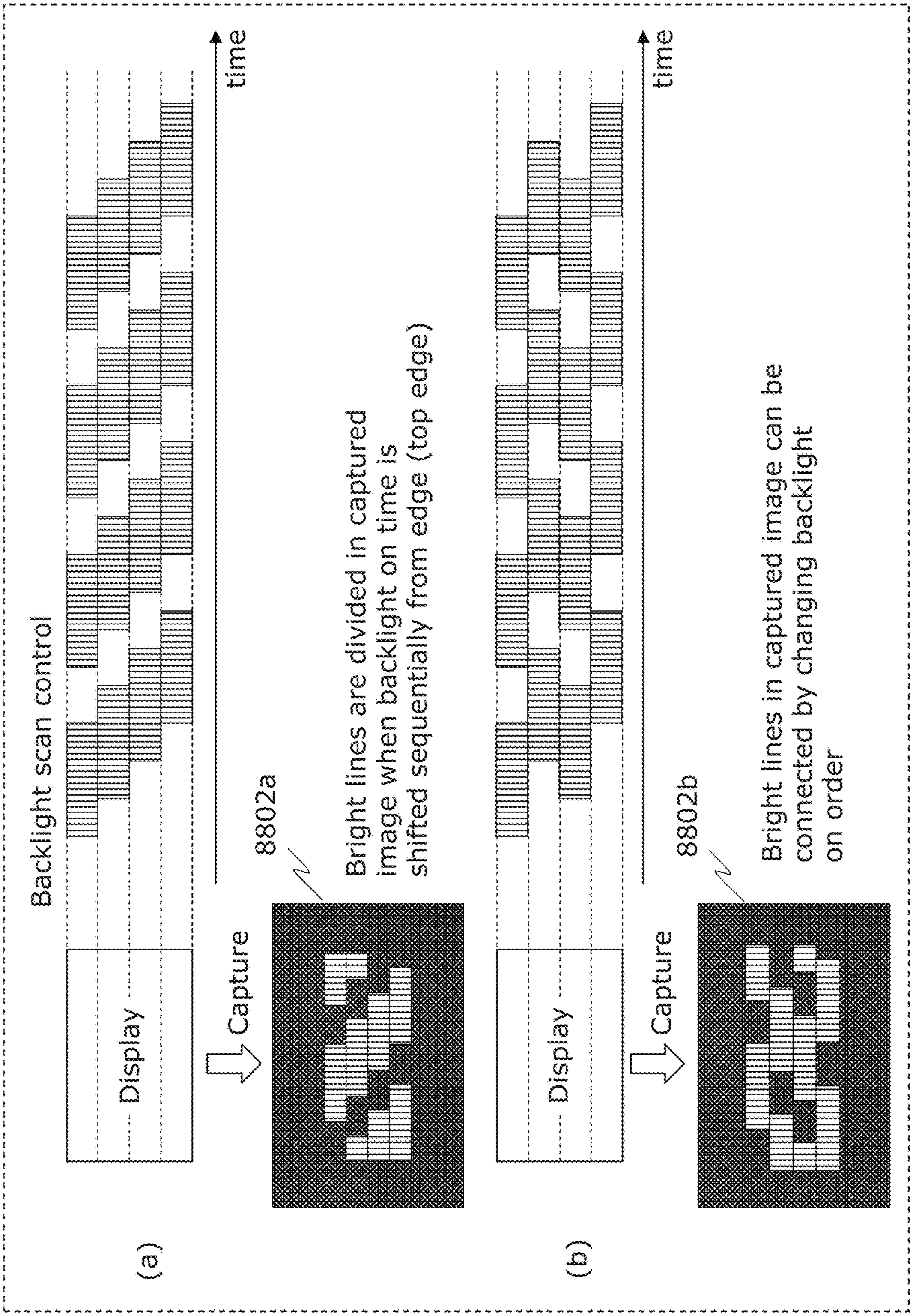
Figure 172:
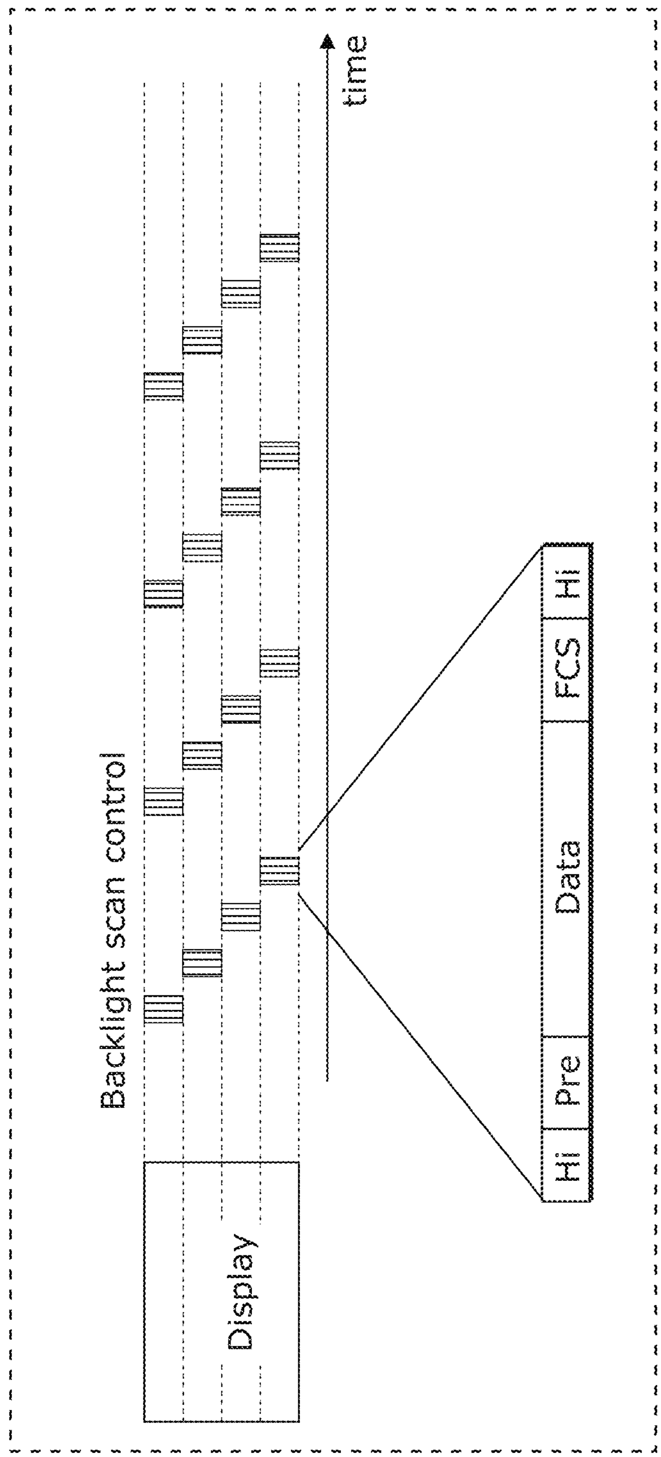
Figure 173:
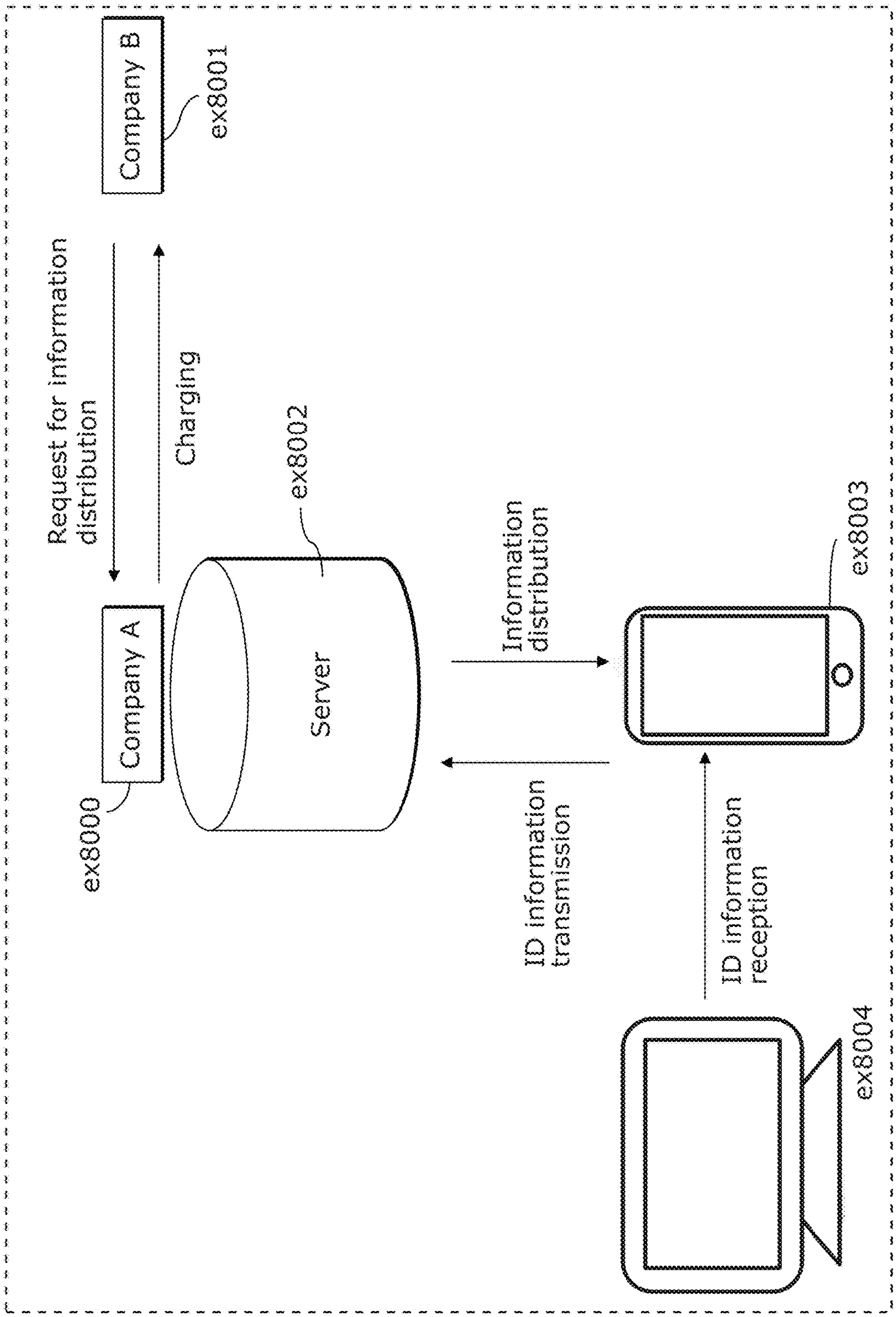
Figure 174:
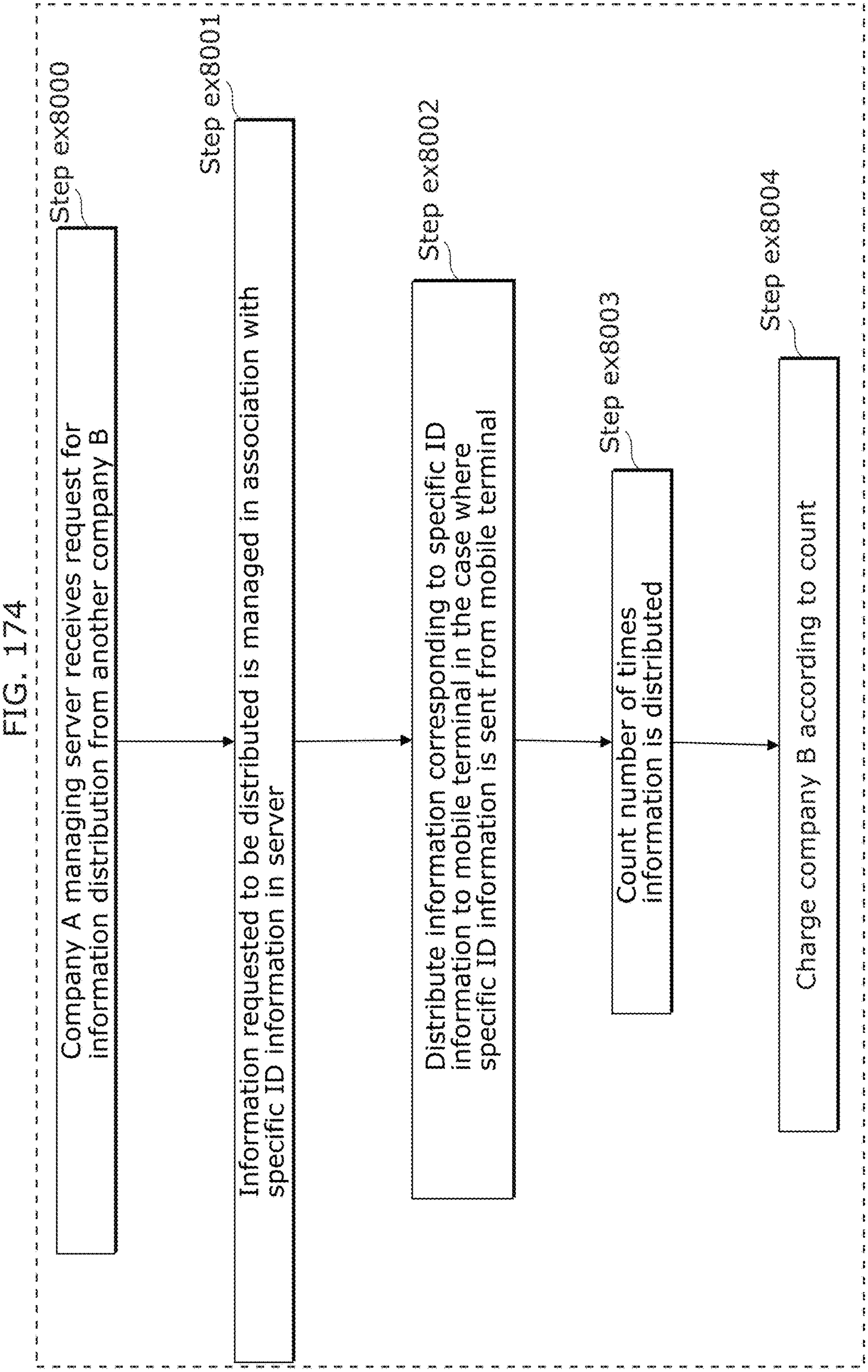
Figure 175:
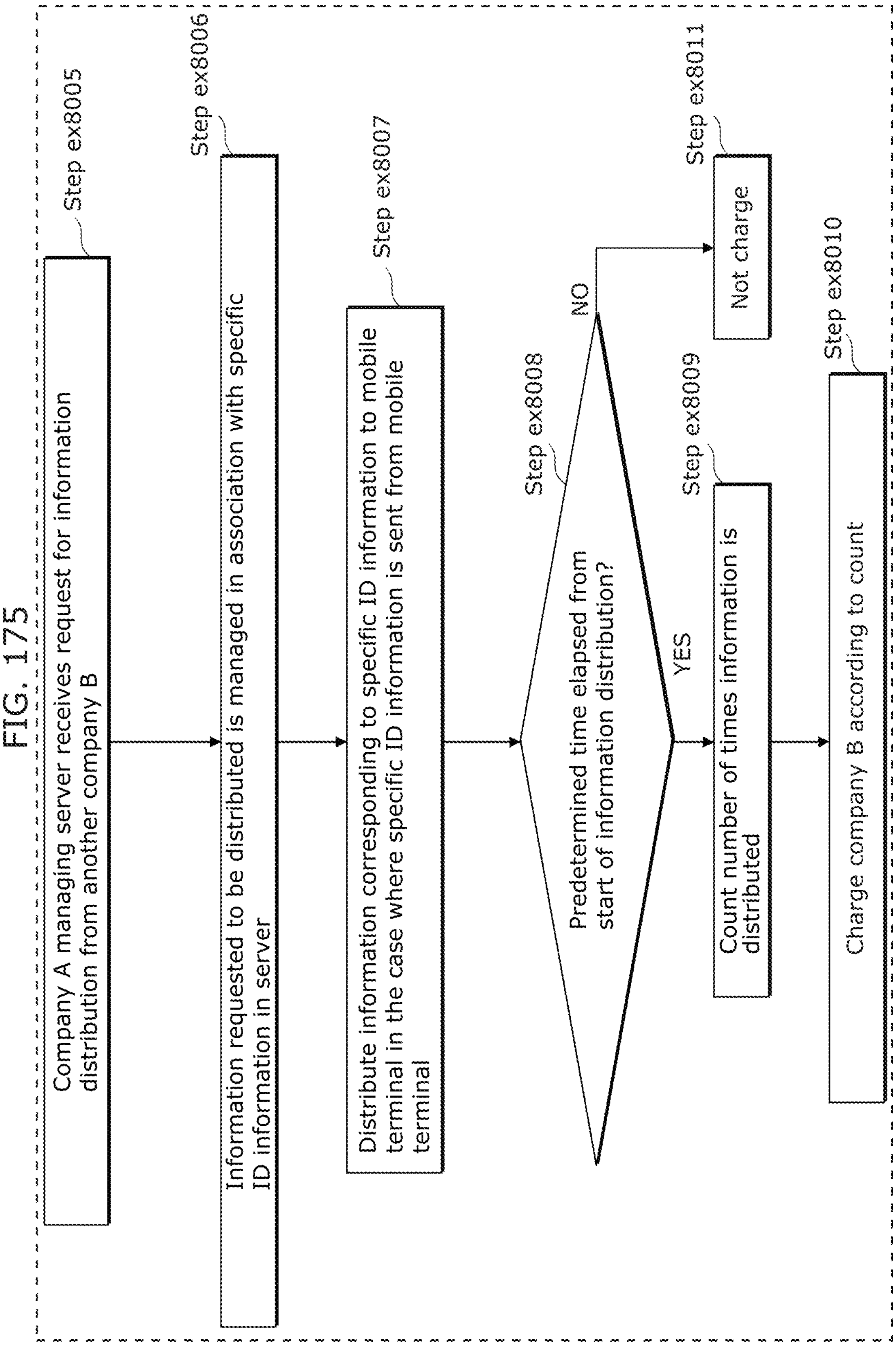
Figure 176:
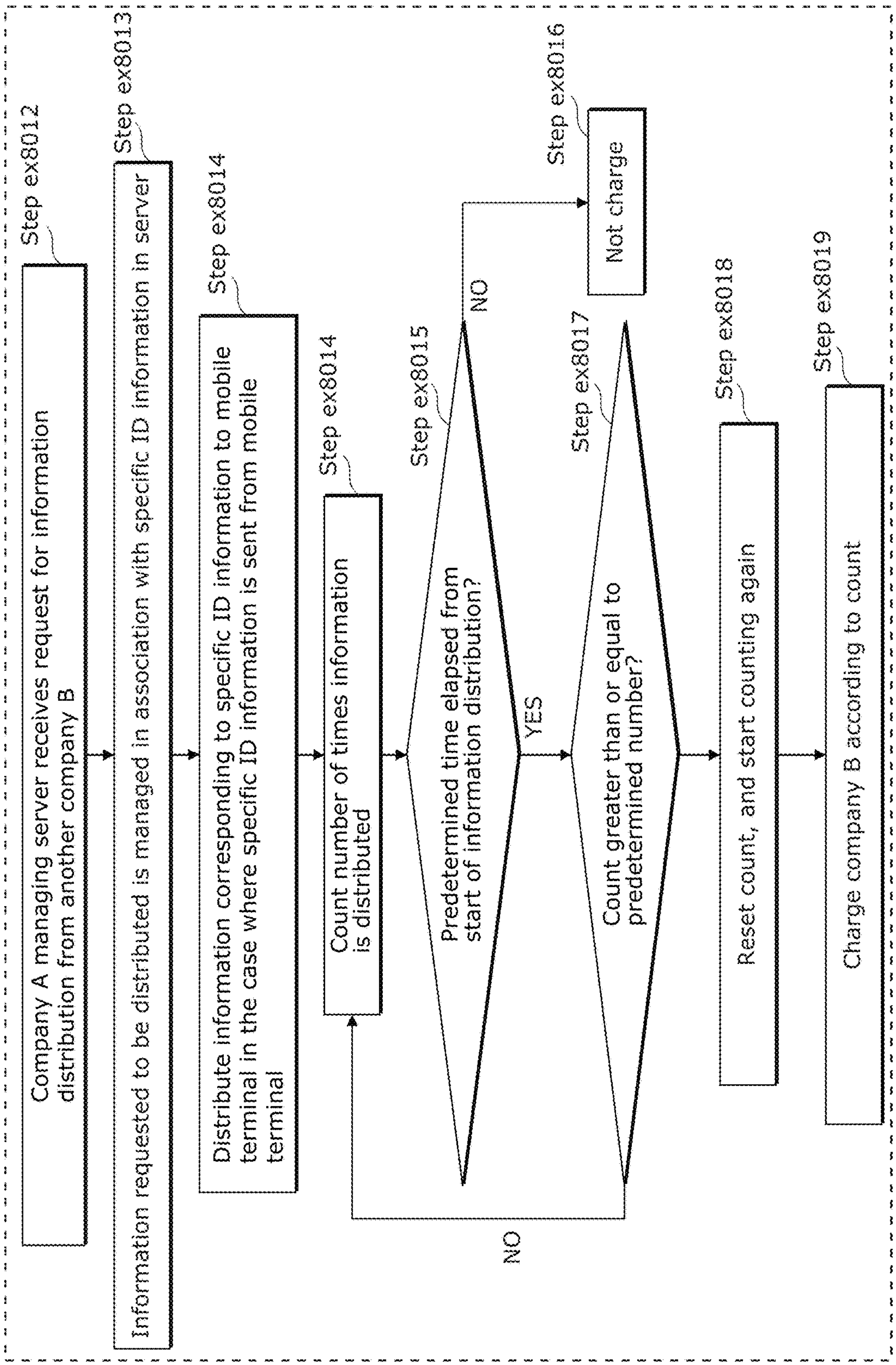
Figure 177A:
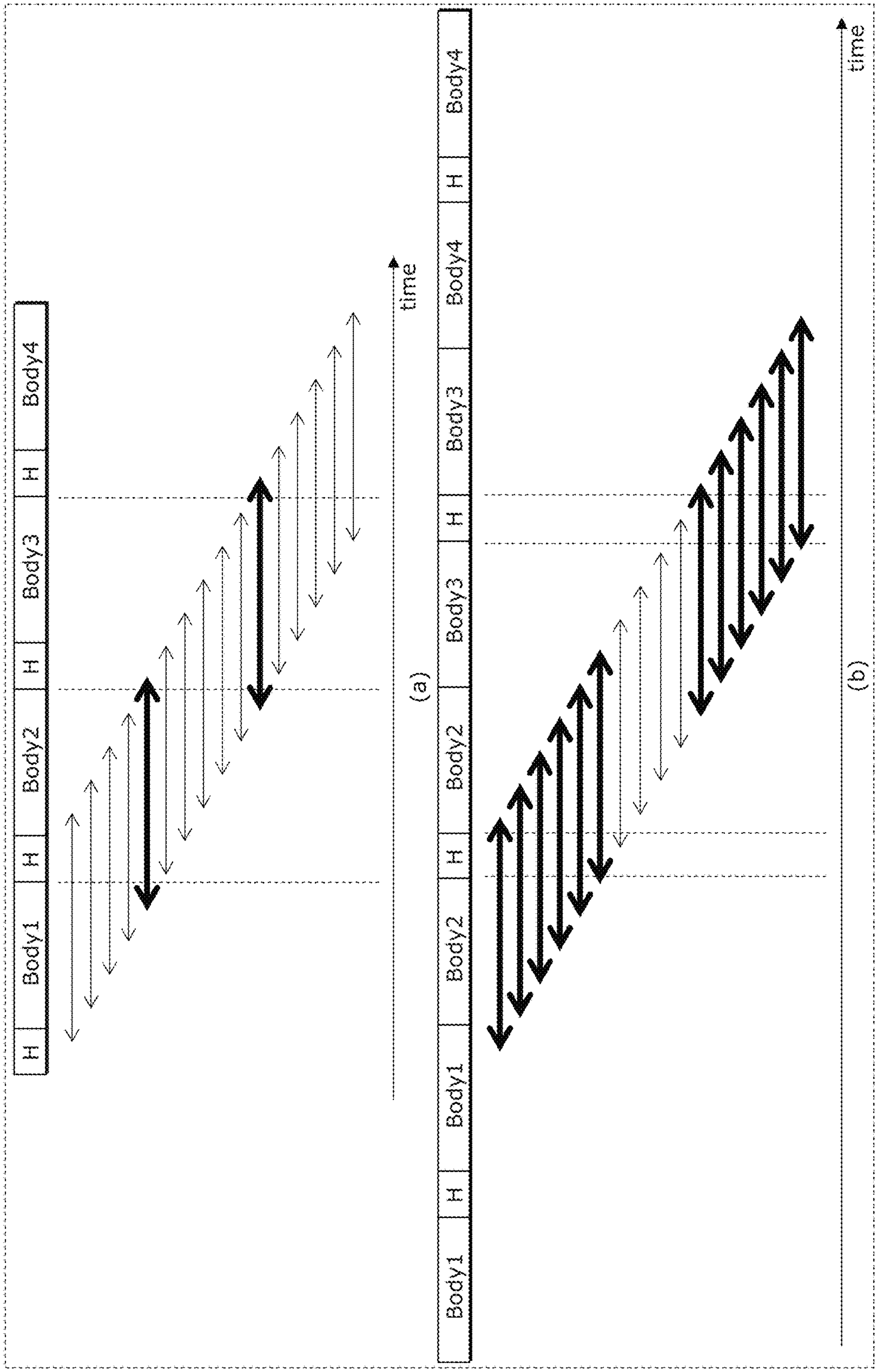
Figure 177B:
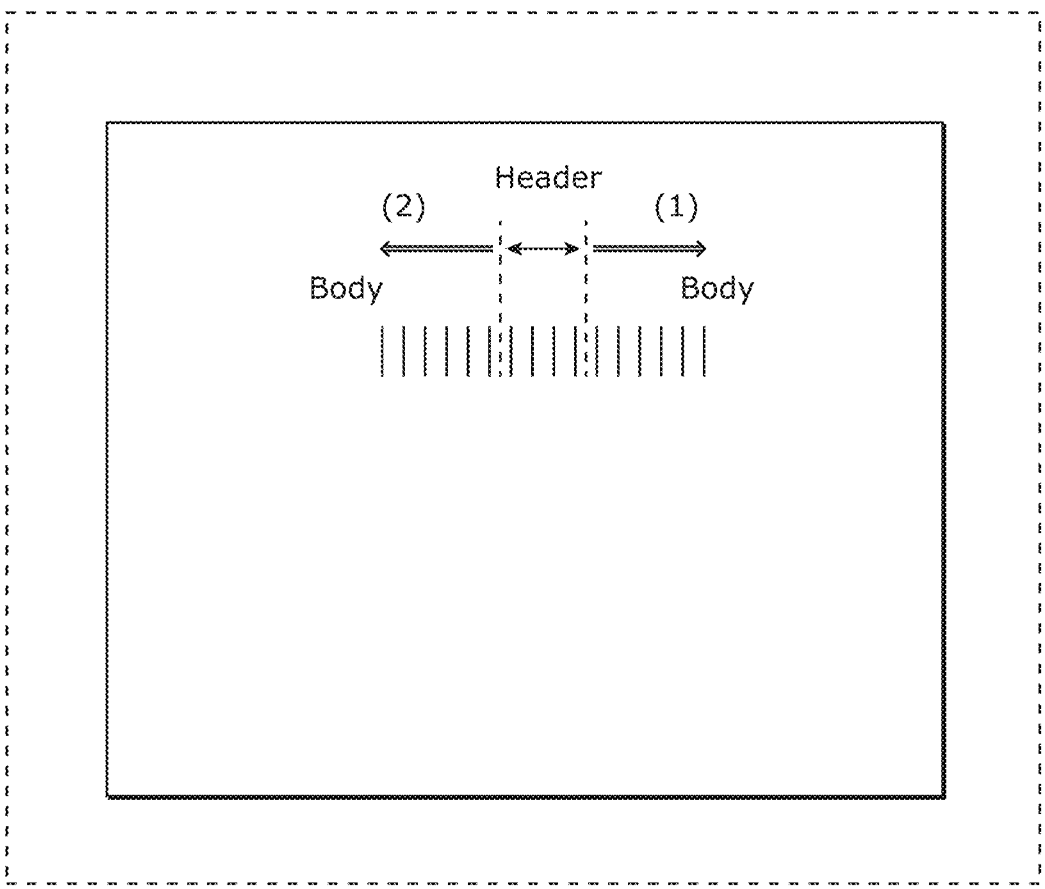
Figure 178:
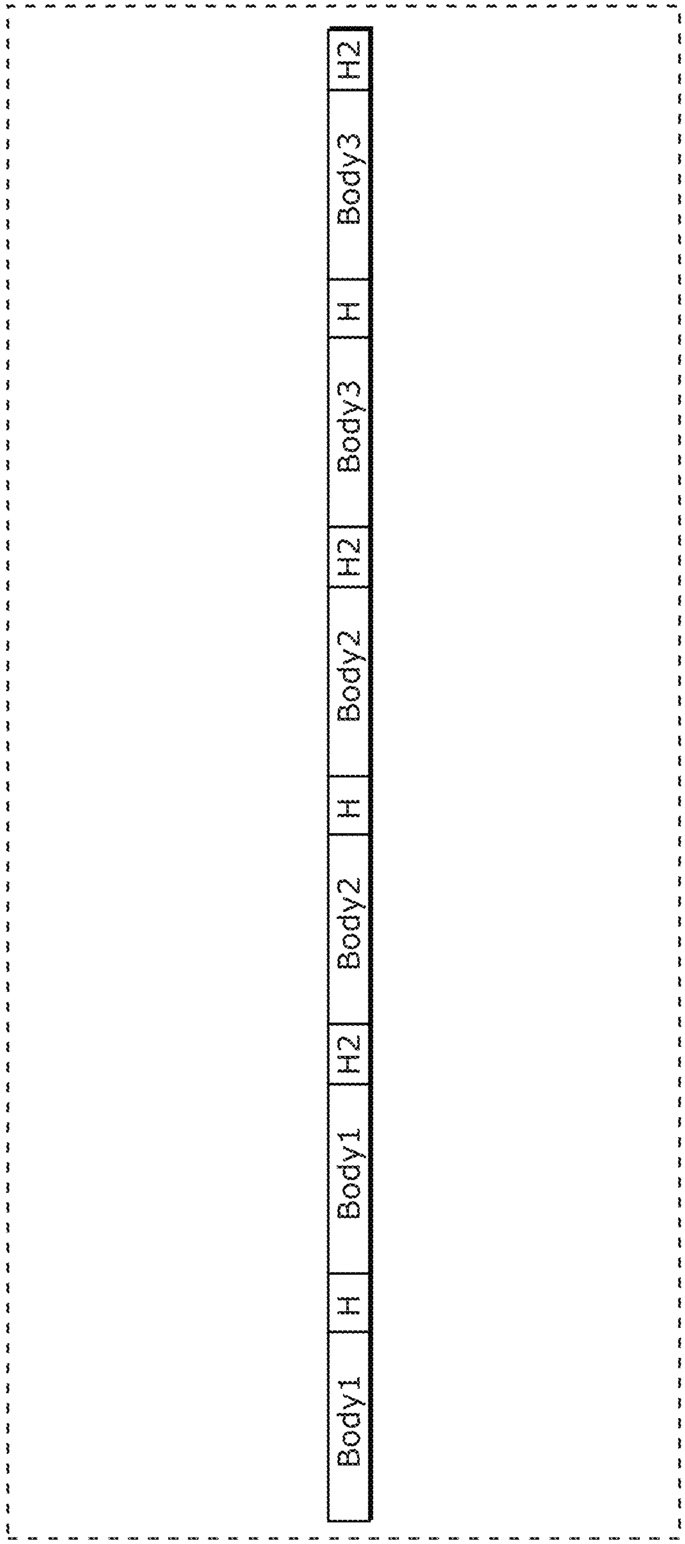
Figure 179:
Figure 180A:
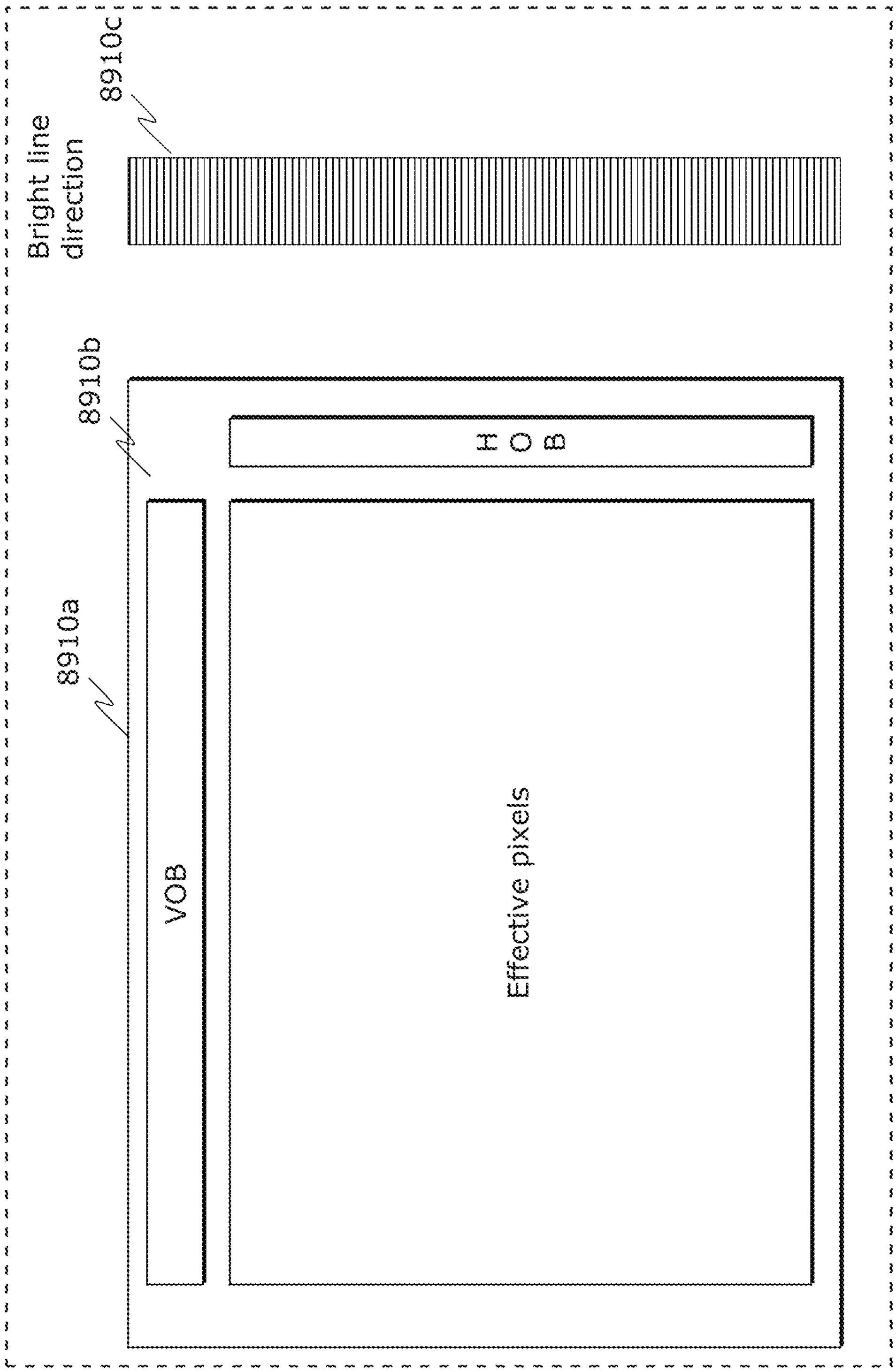
Figure 180B:
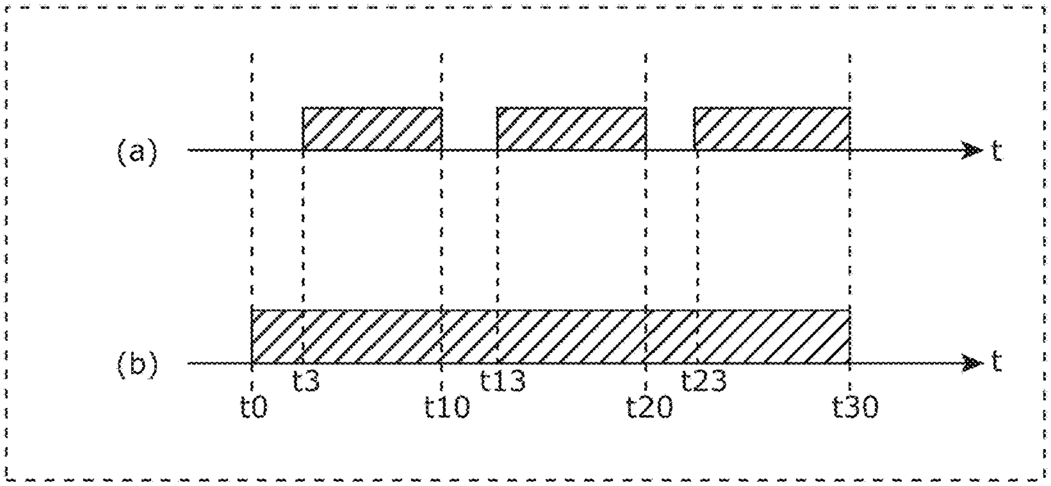
Figure 180C:
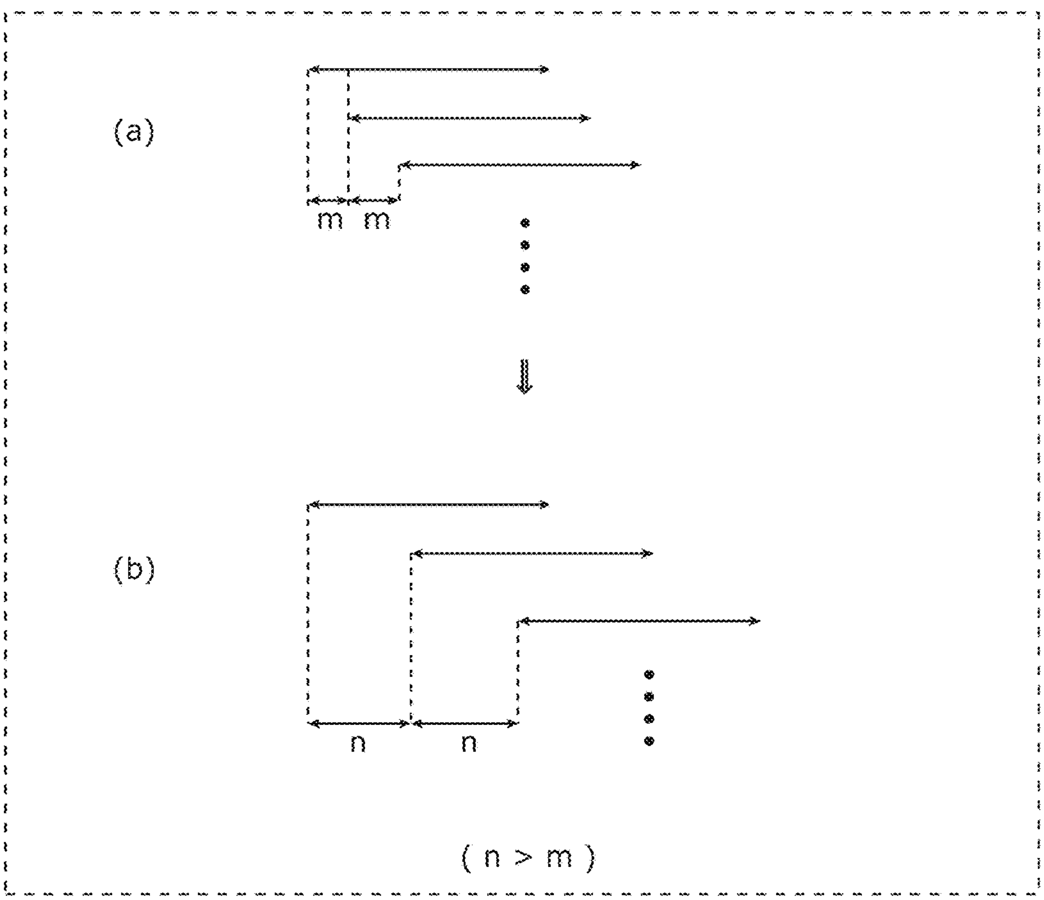
Figure 180D:
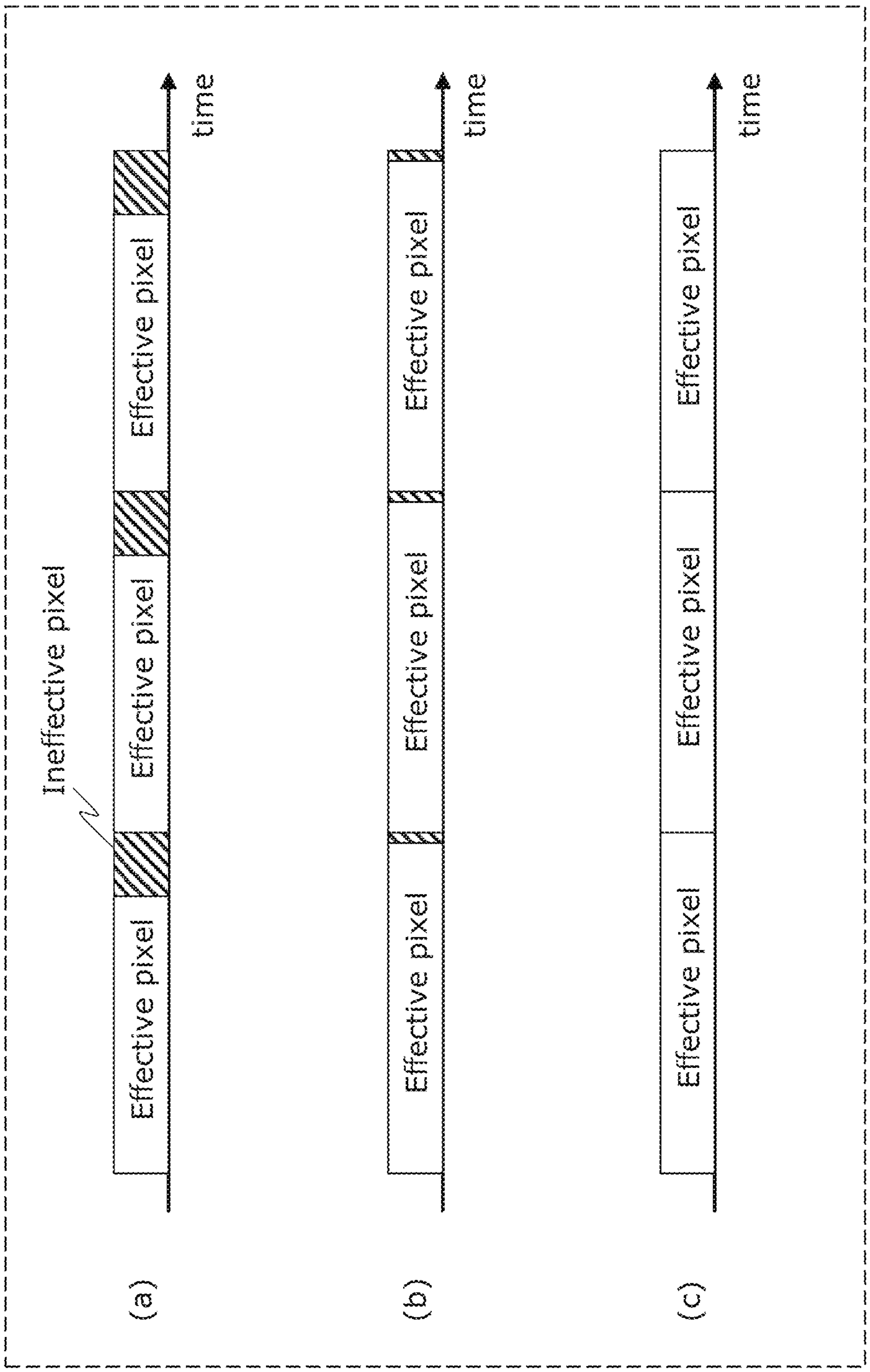
Figure 180E:
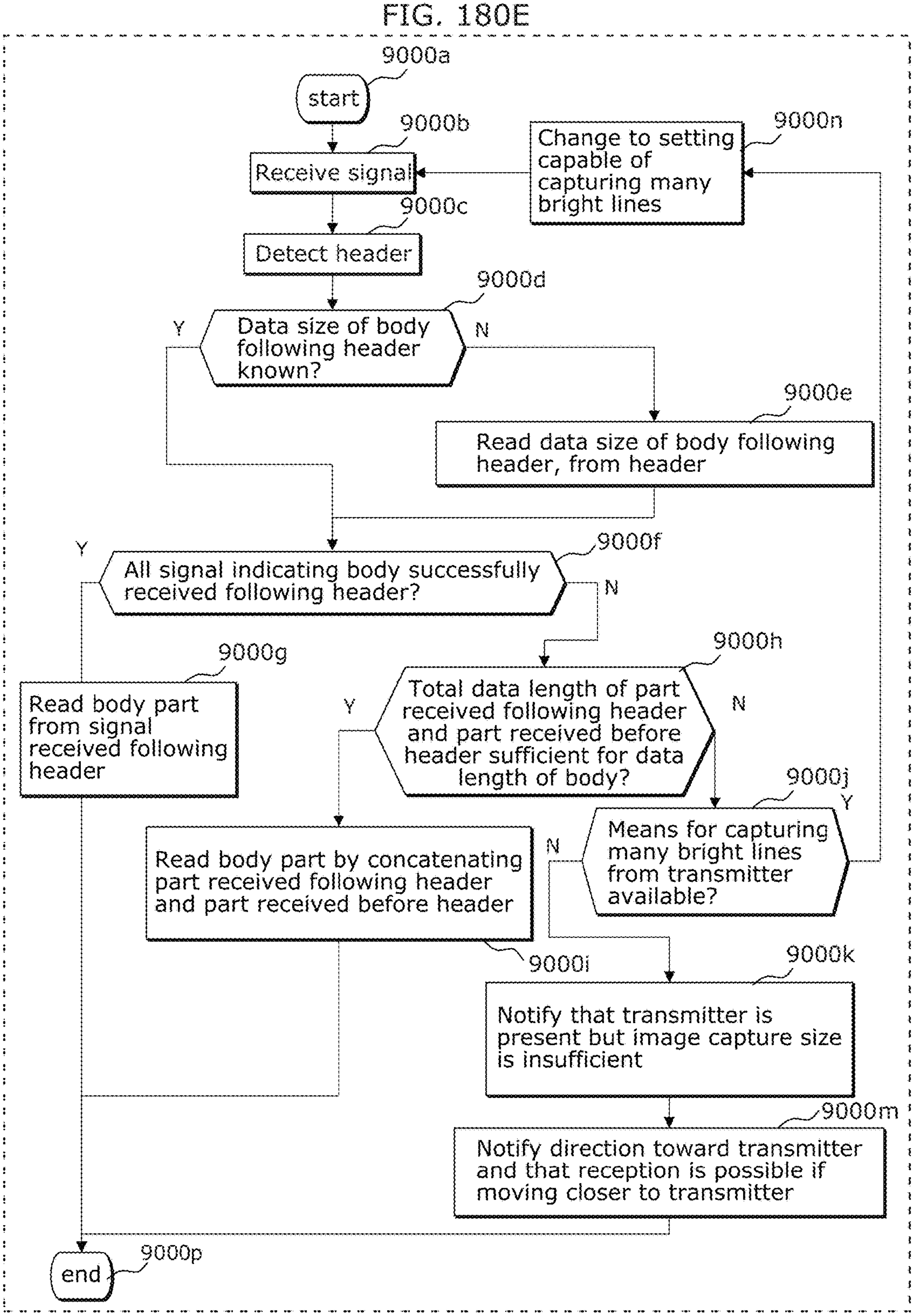
Figure 181:
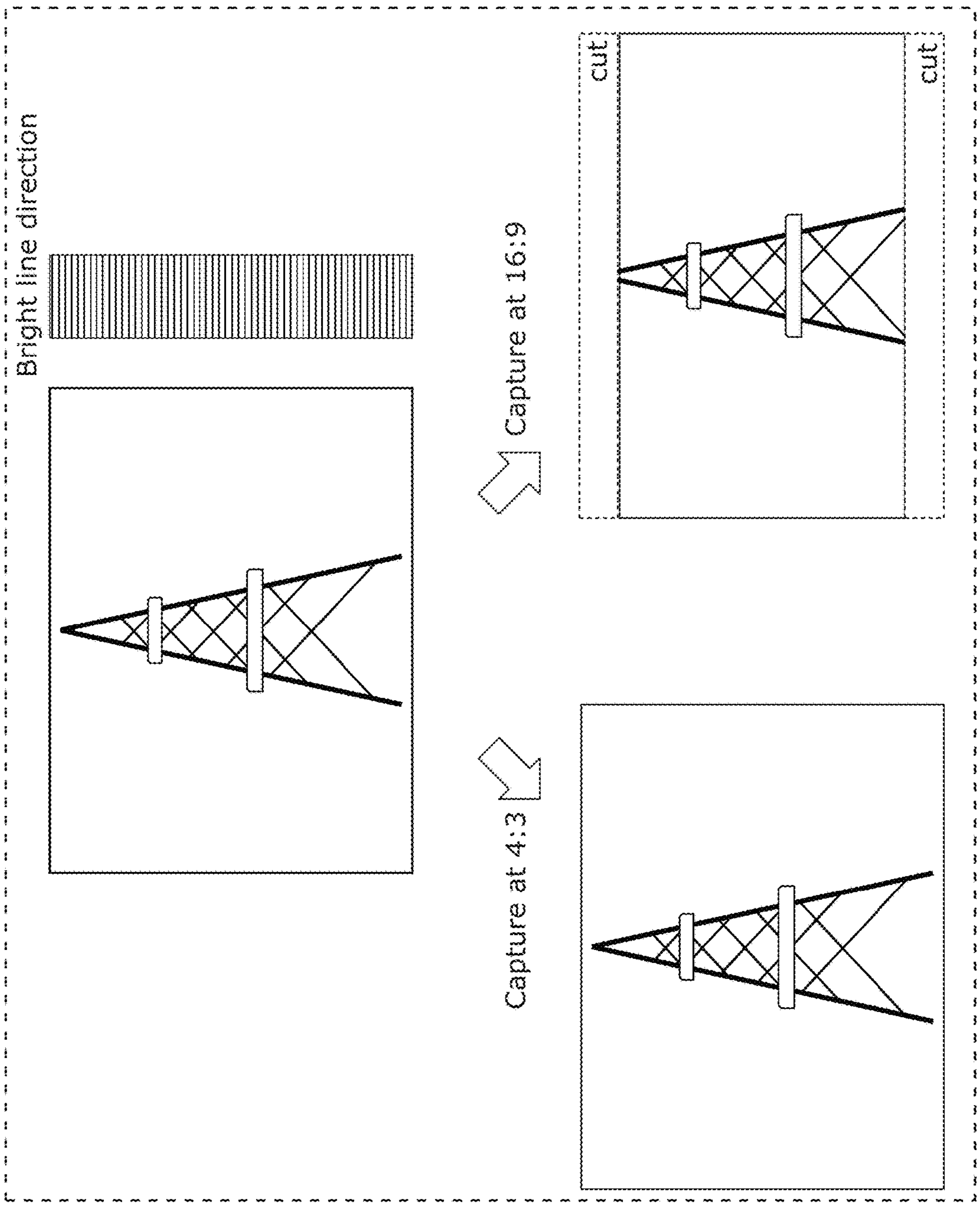
Figure 182A:
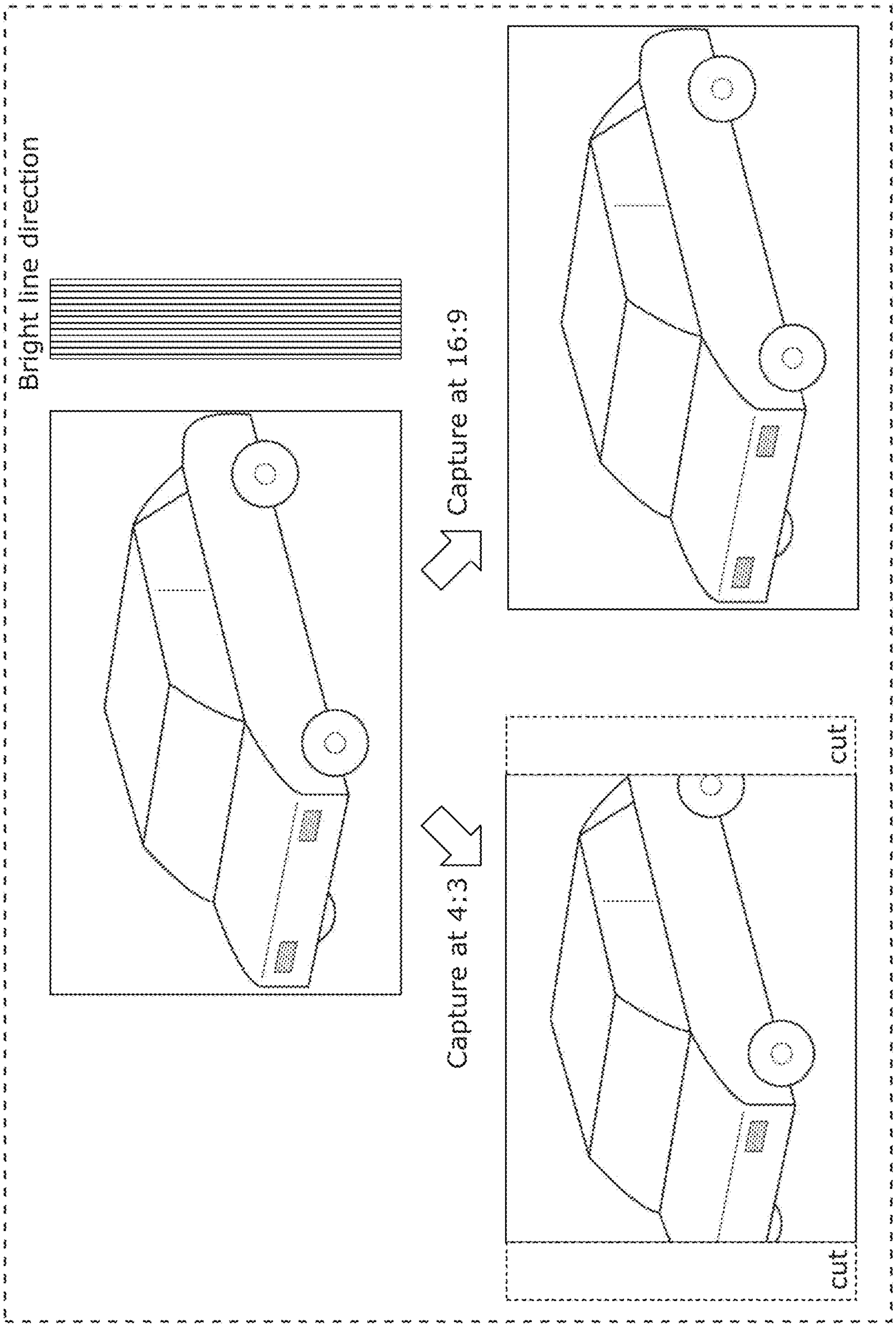
Figure 182B:
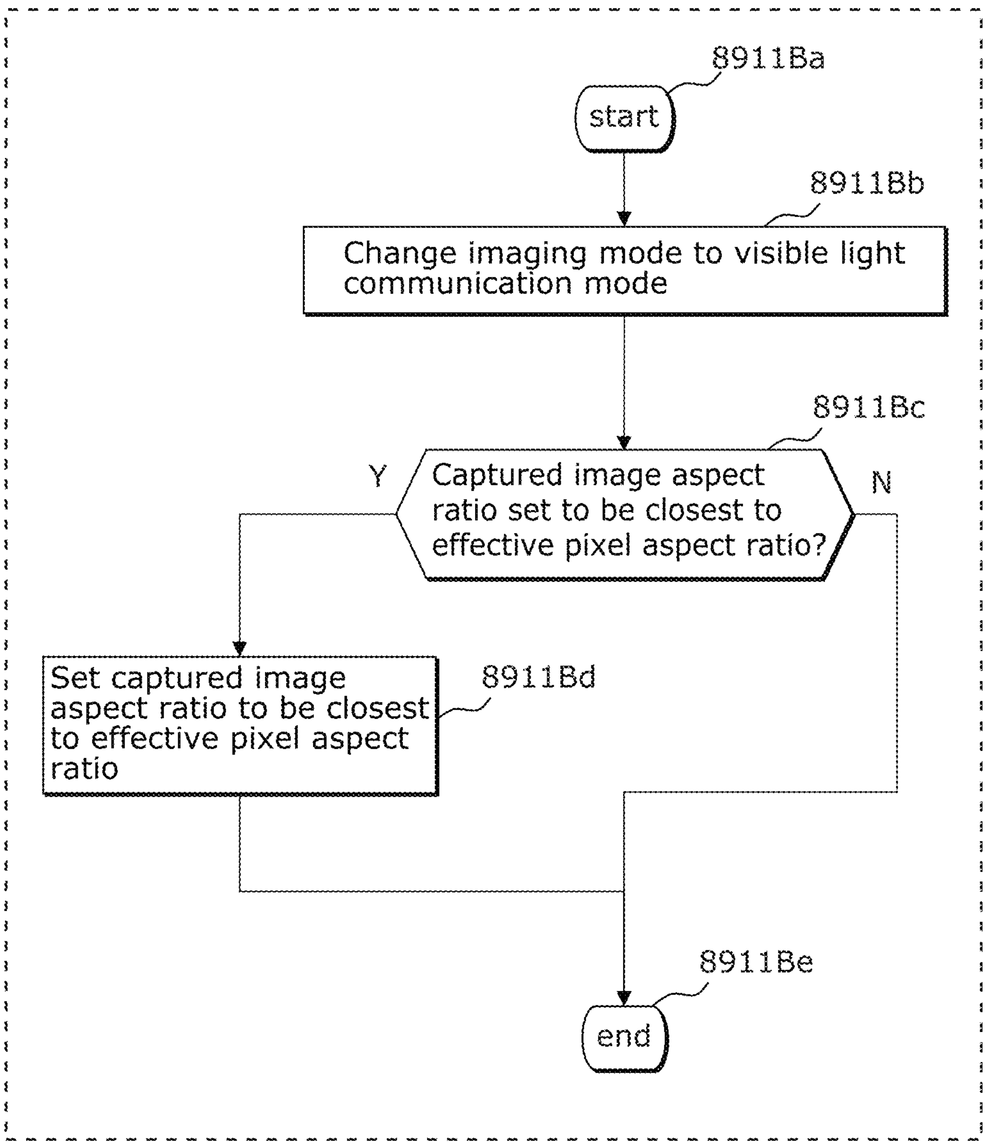
Figure 182C:
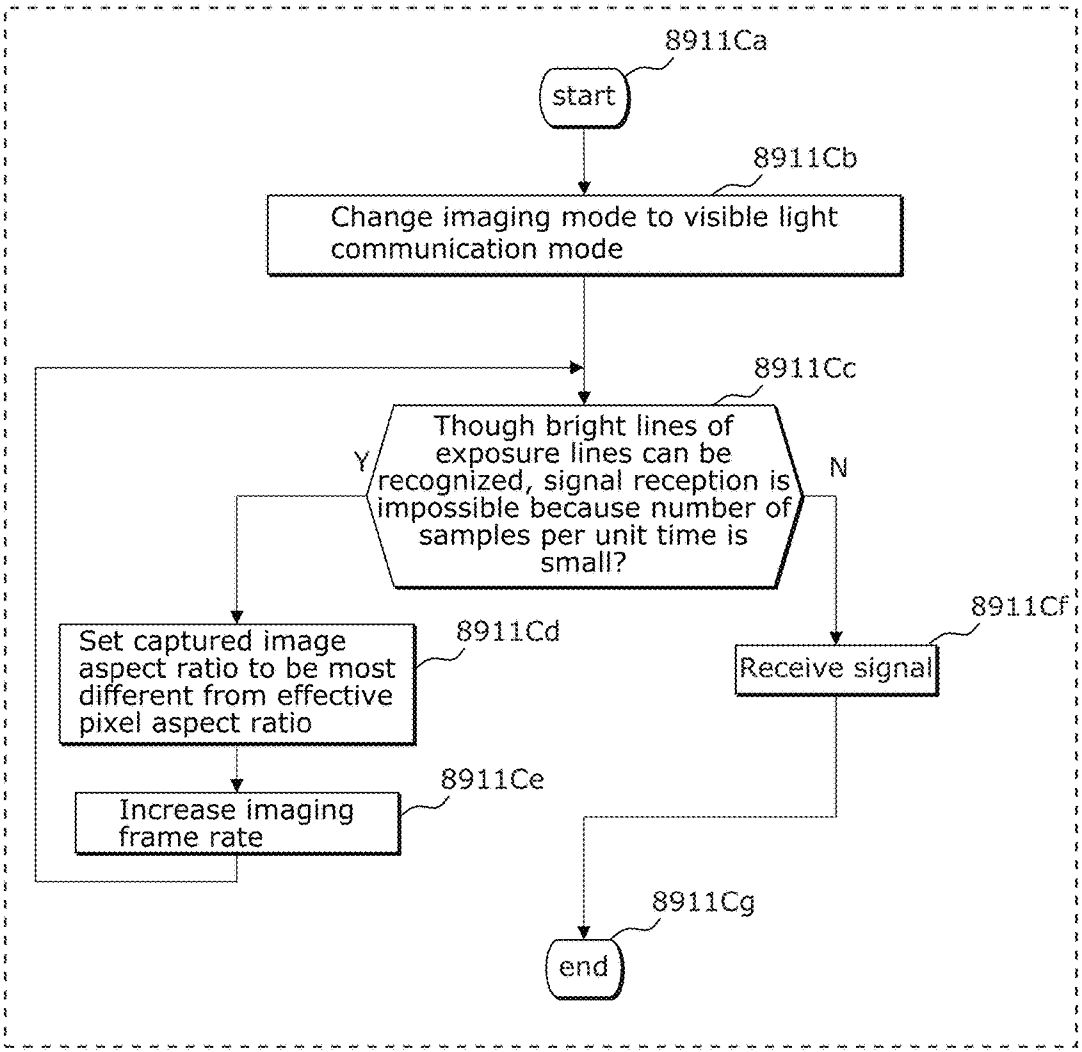
Figure 183:
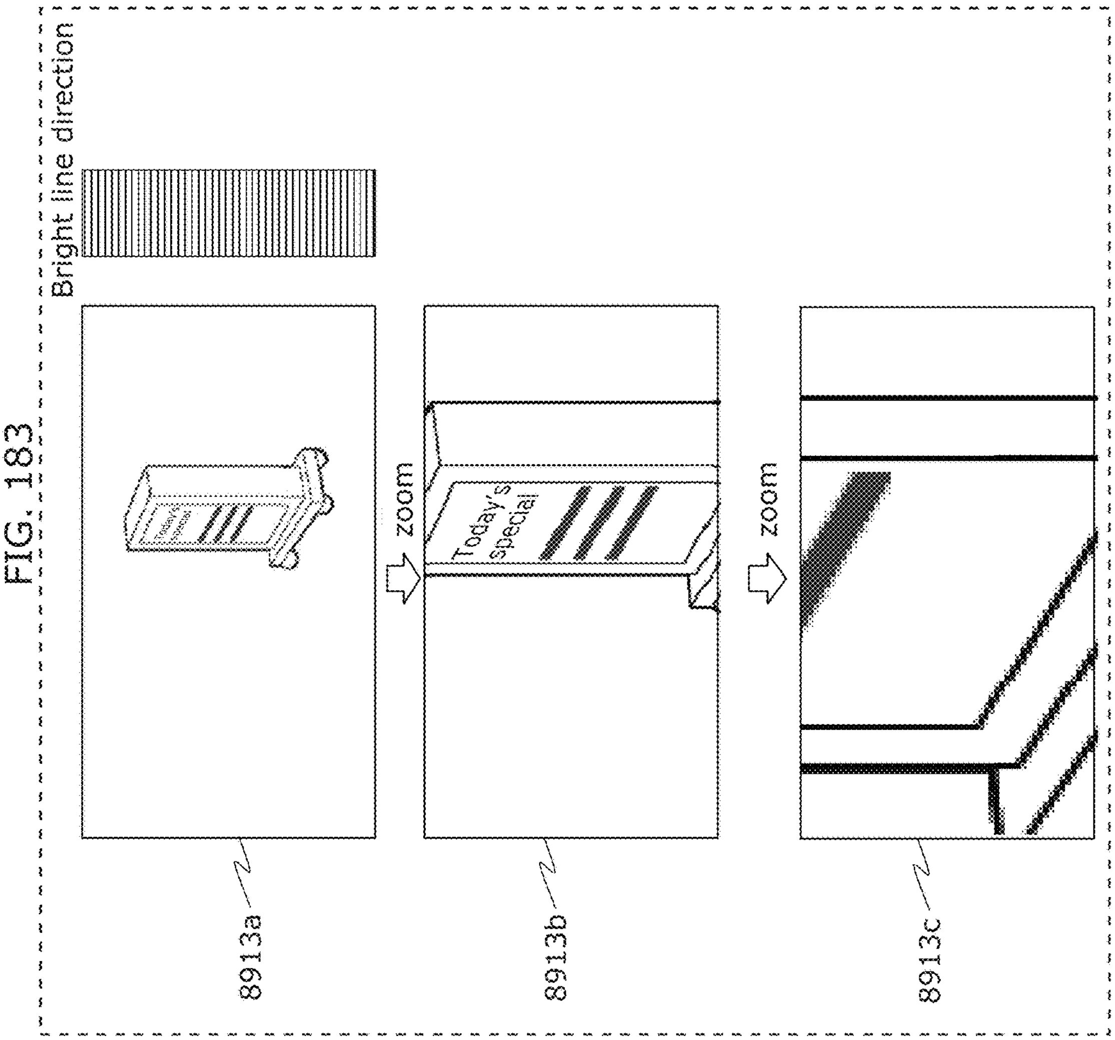
Figure 184:
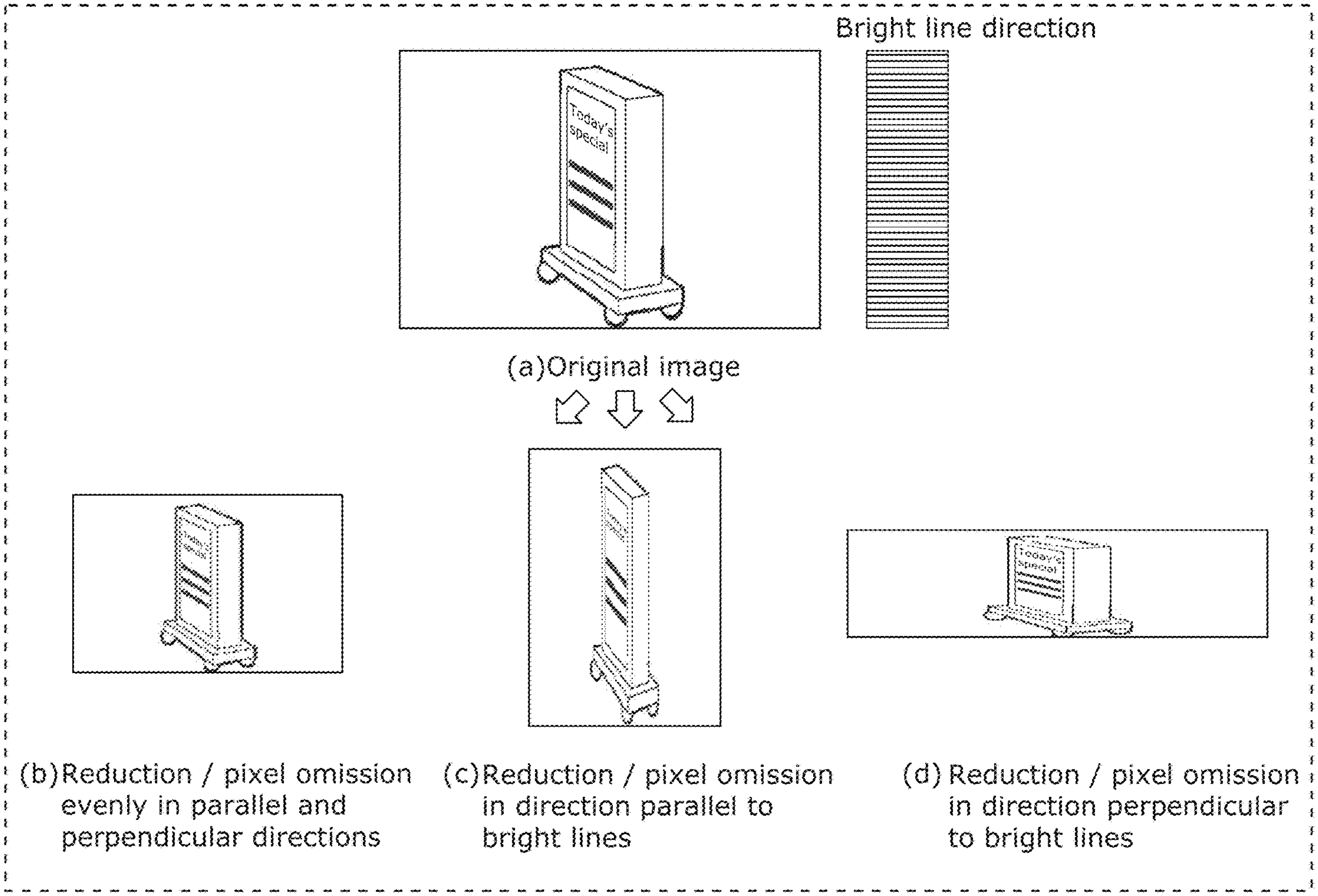
Figure 185:
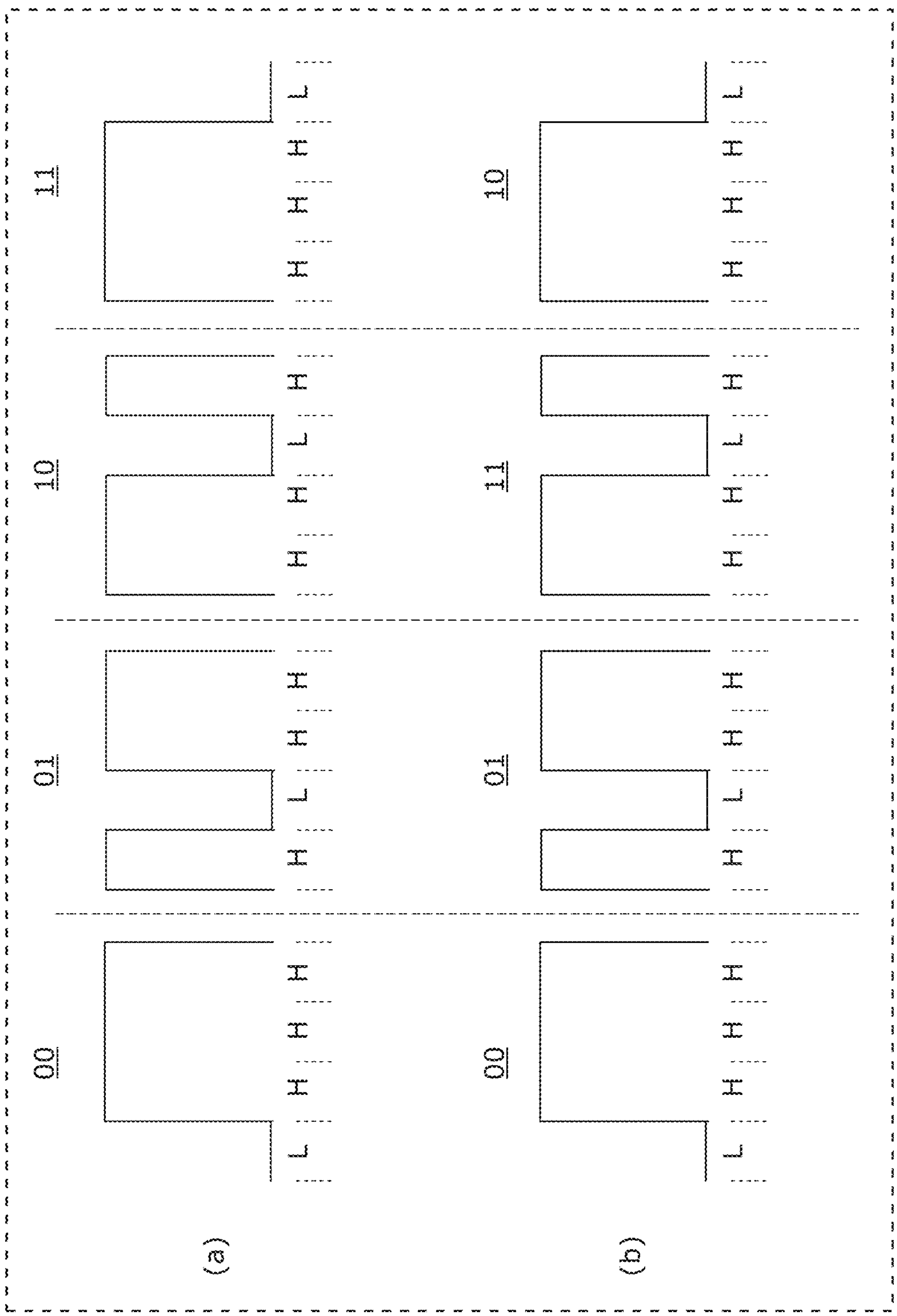
Figure 186:
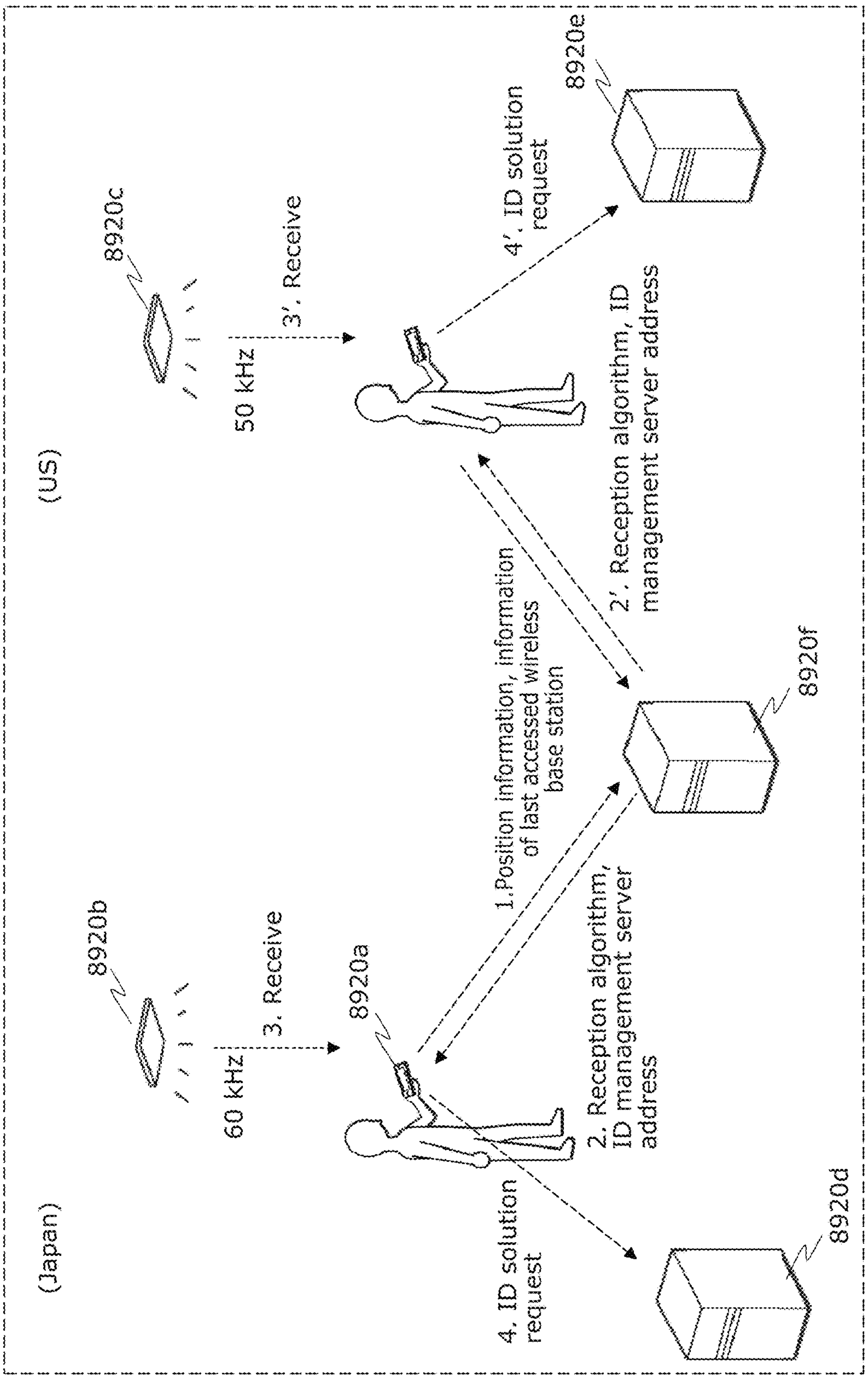
Figure 187:
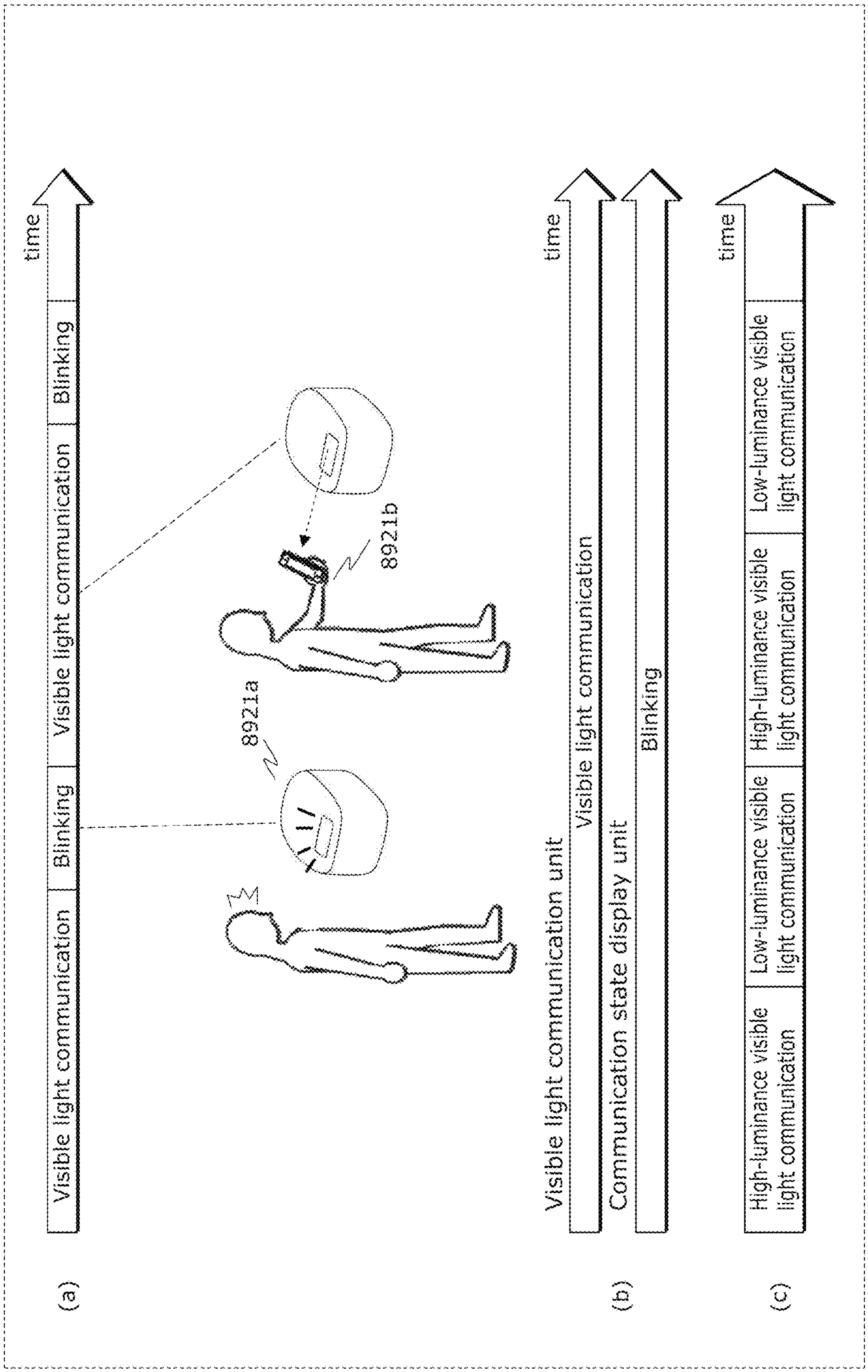
Figure 188:
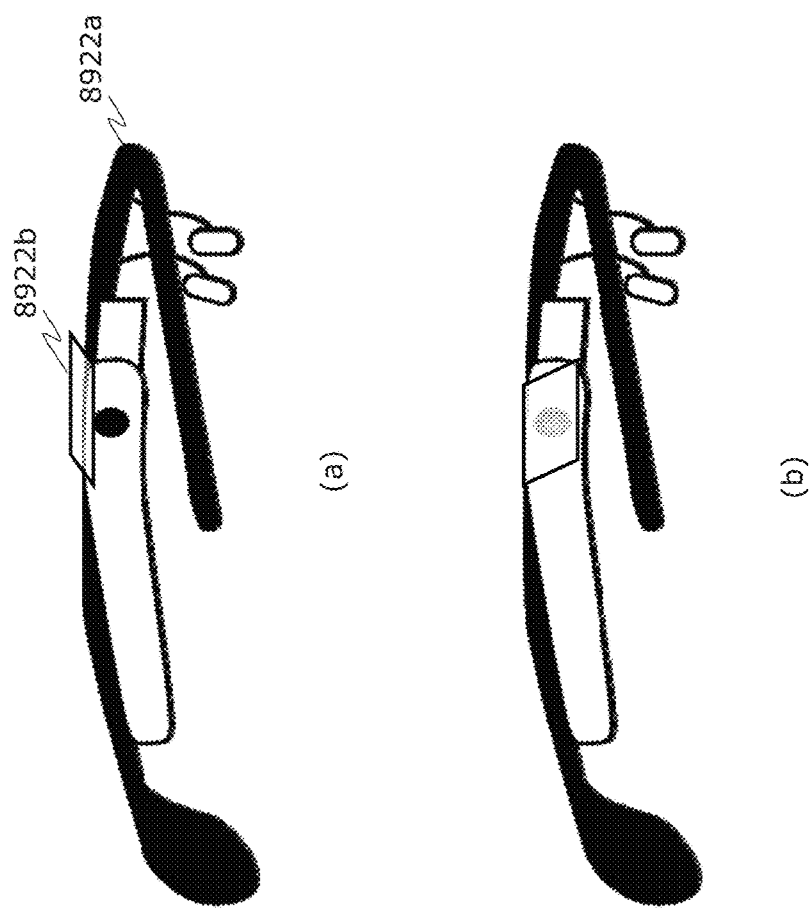
Figure 189:
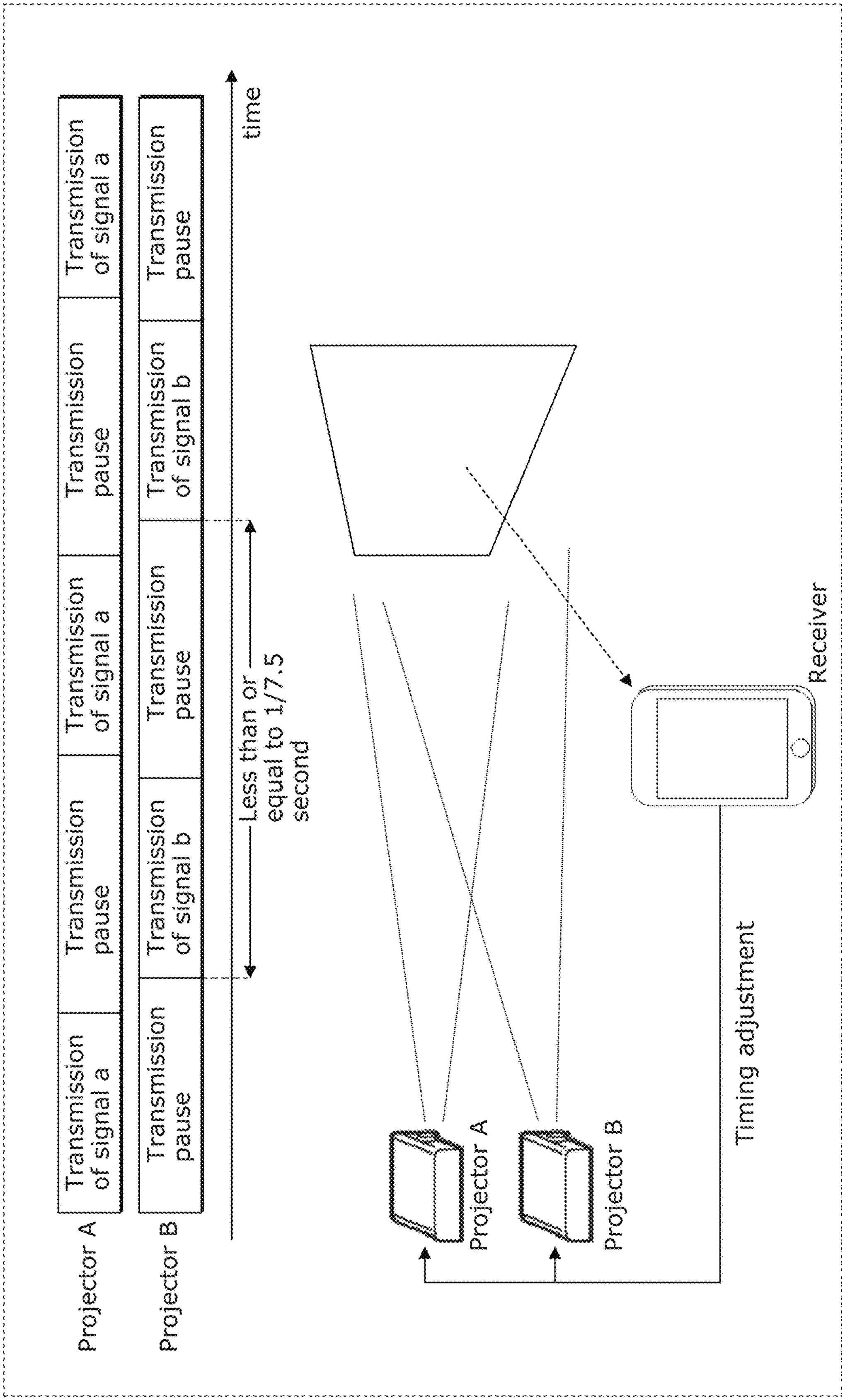
Figure 190:
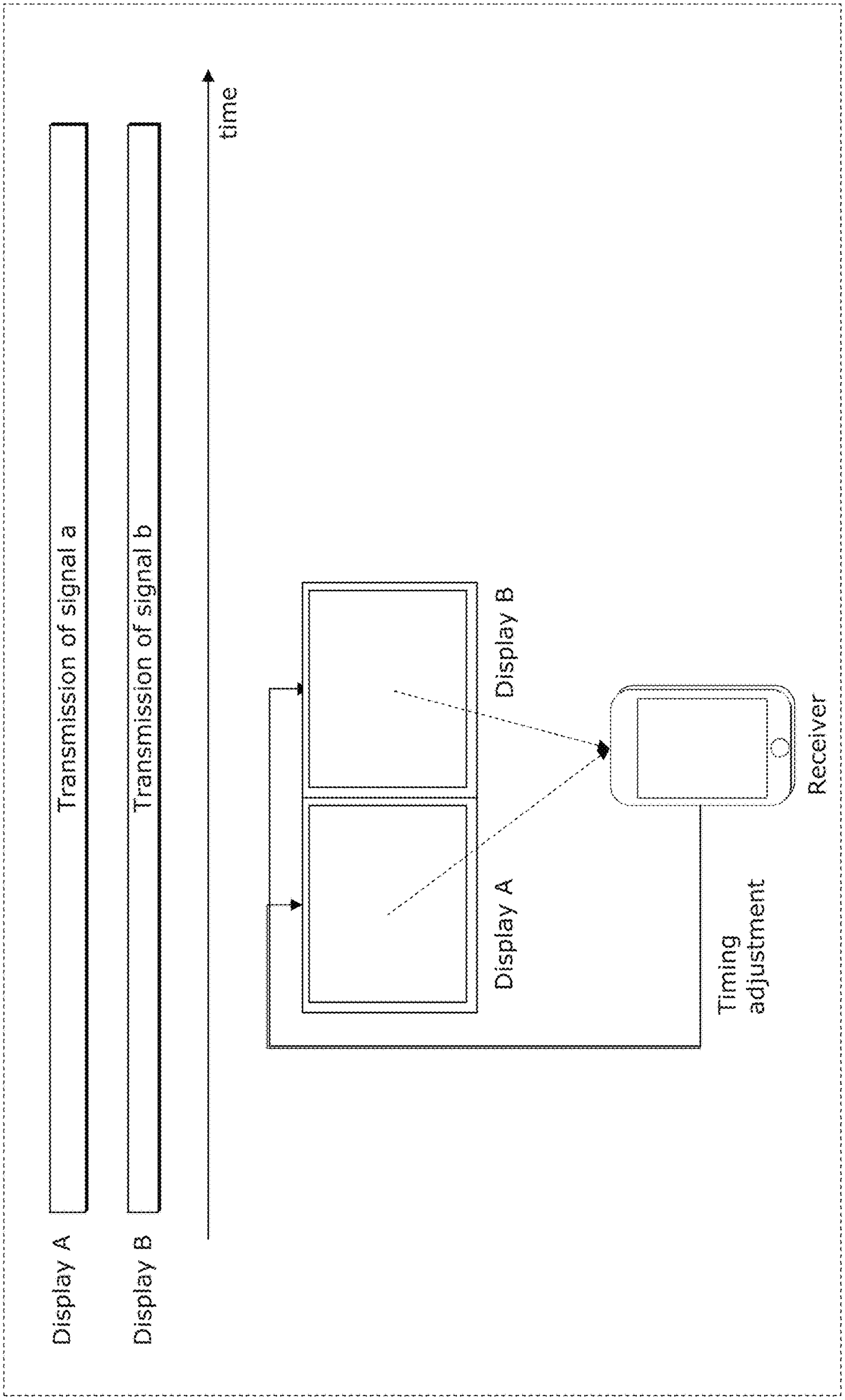
Figure 191:
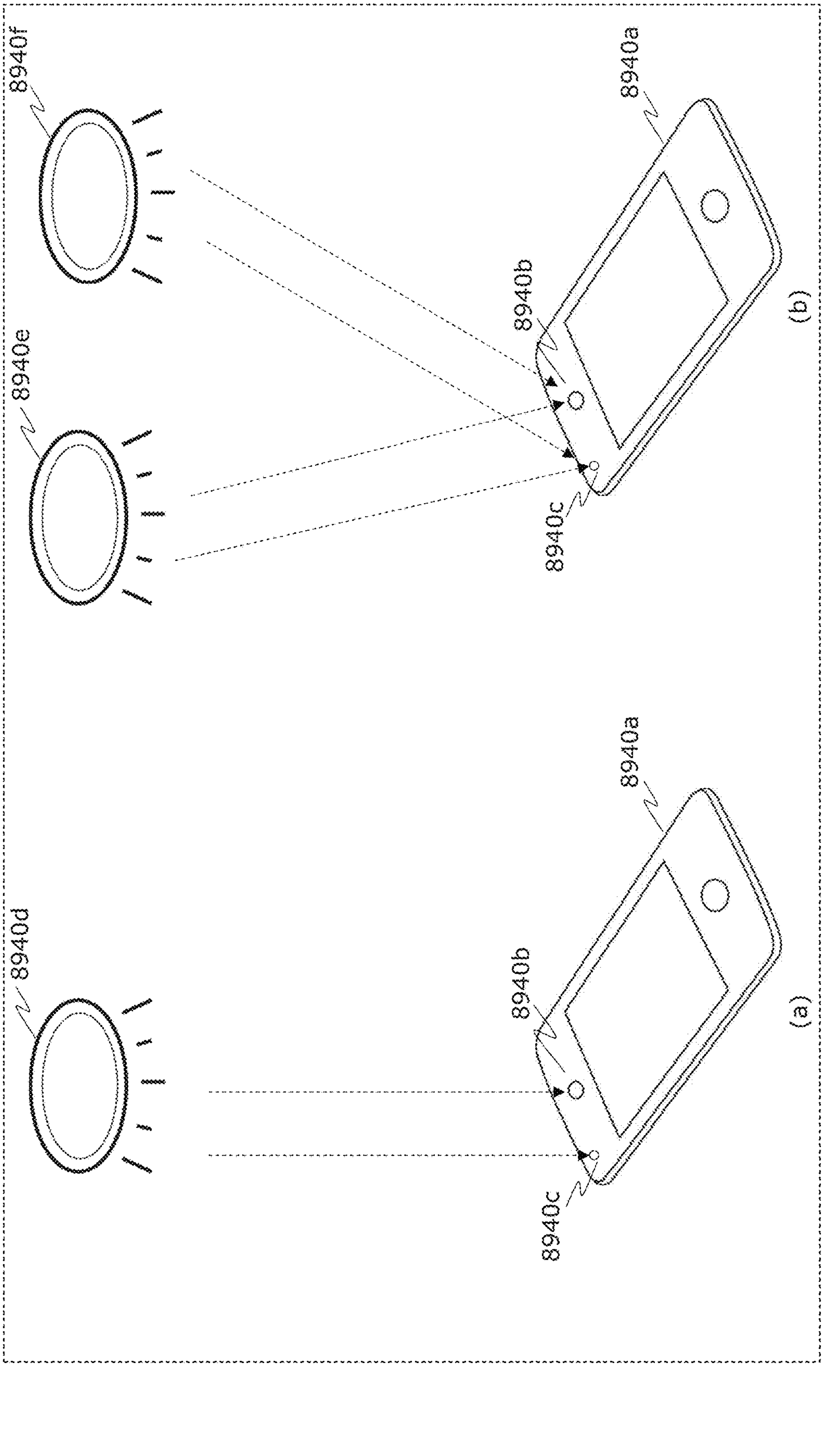
Figure 192:
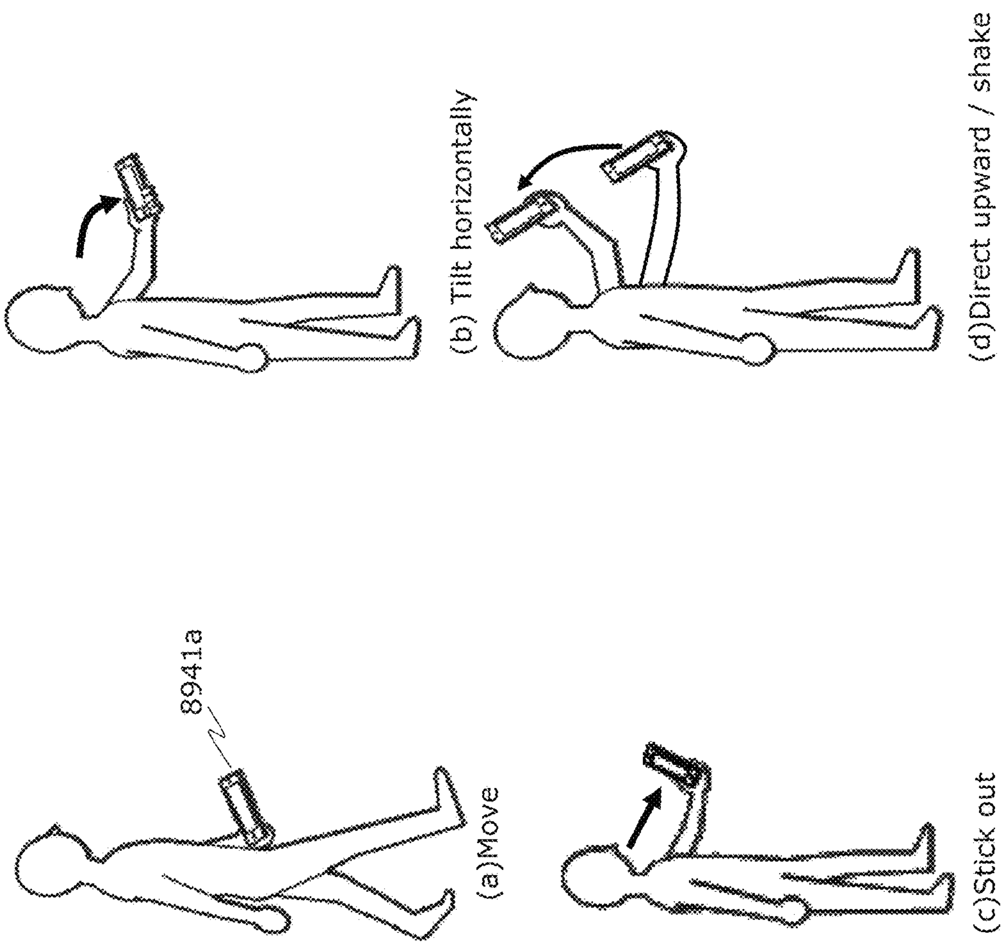
Figure 193:
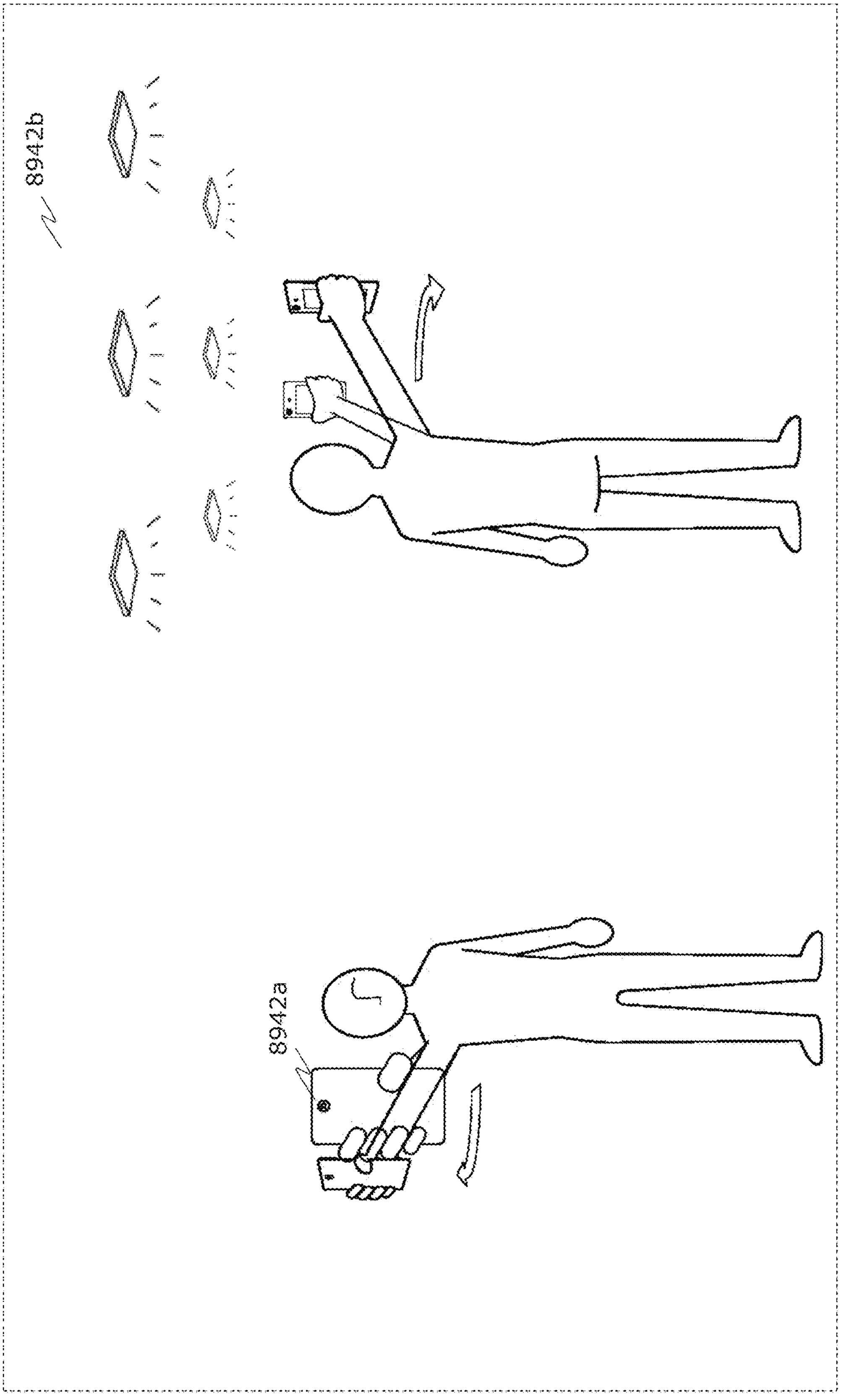
Figure 194:
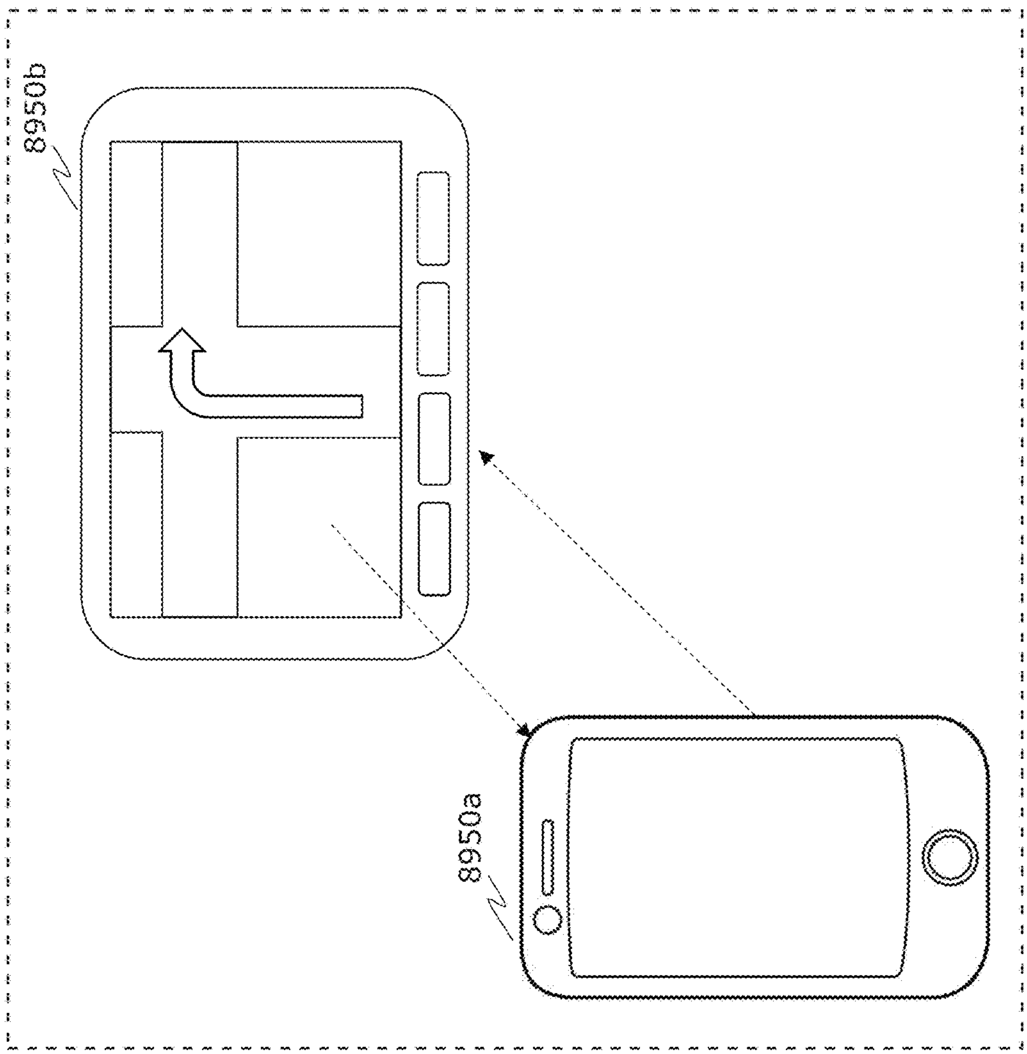
Figure 195:
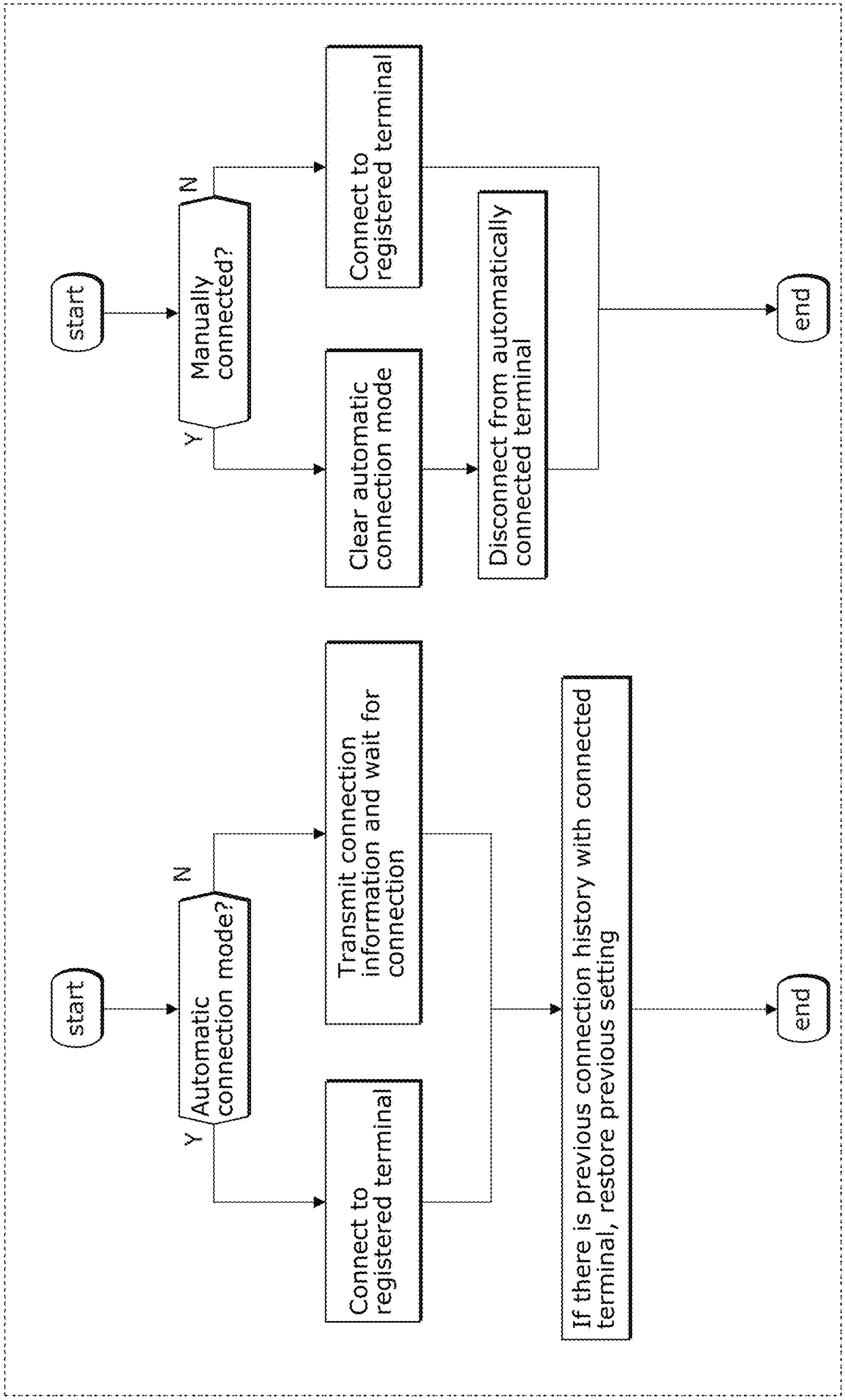
Figure 196:
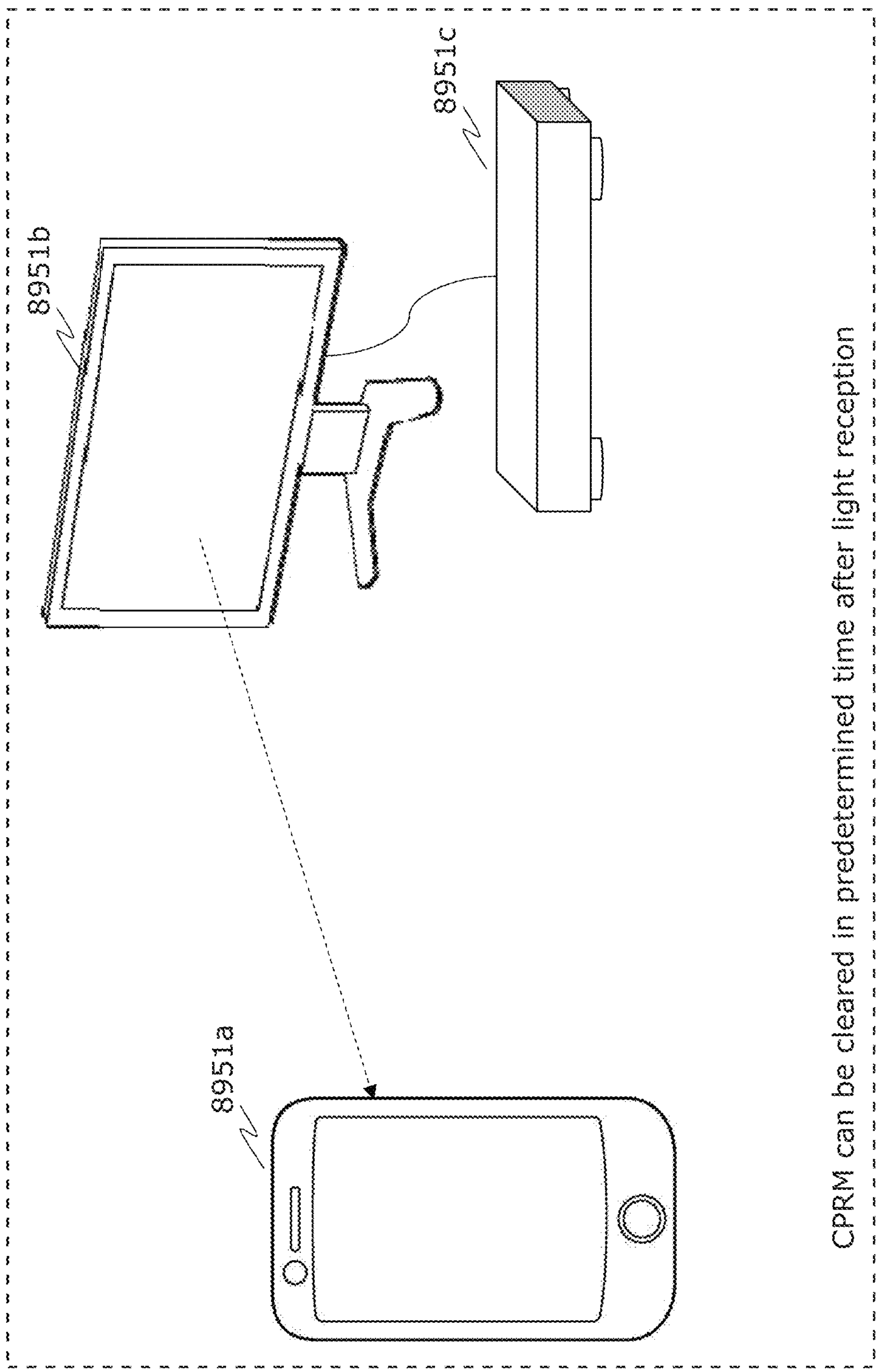
Figure 197A:
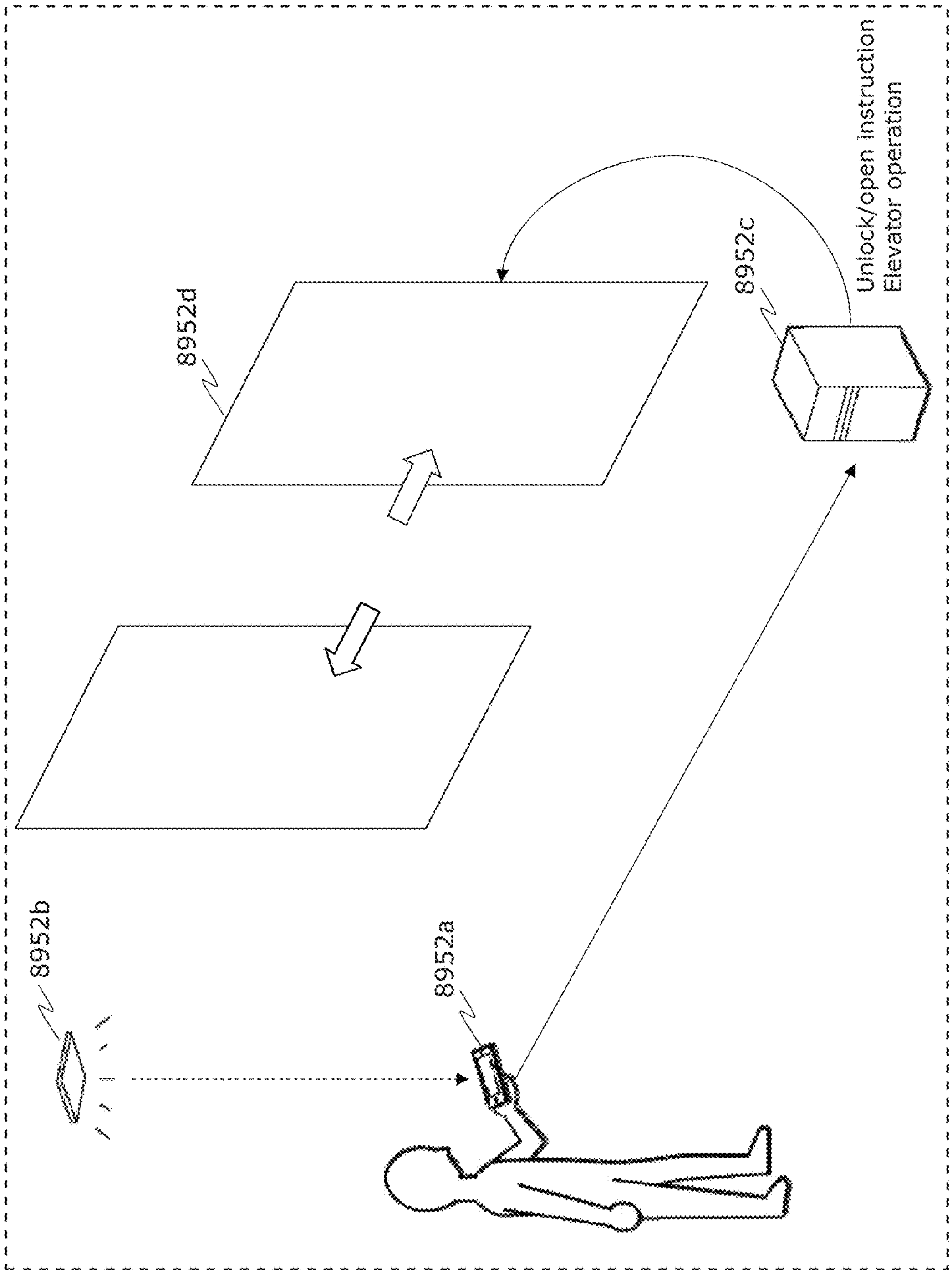
Figure 197B:
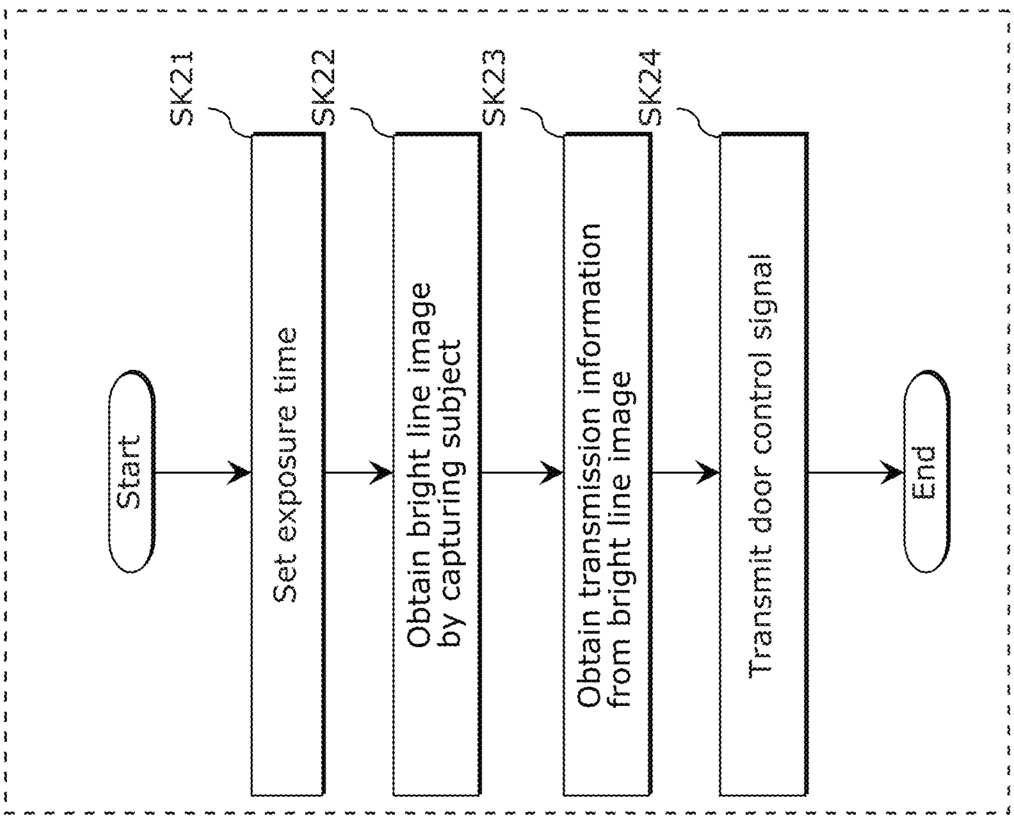
Figure 197C:
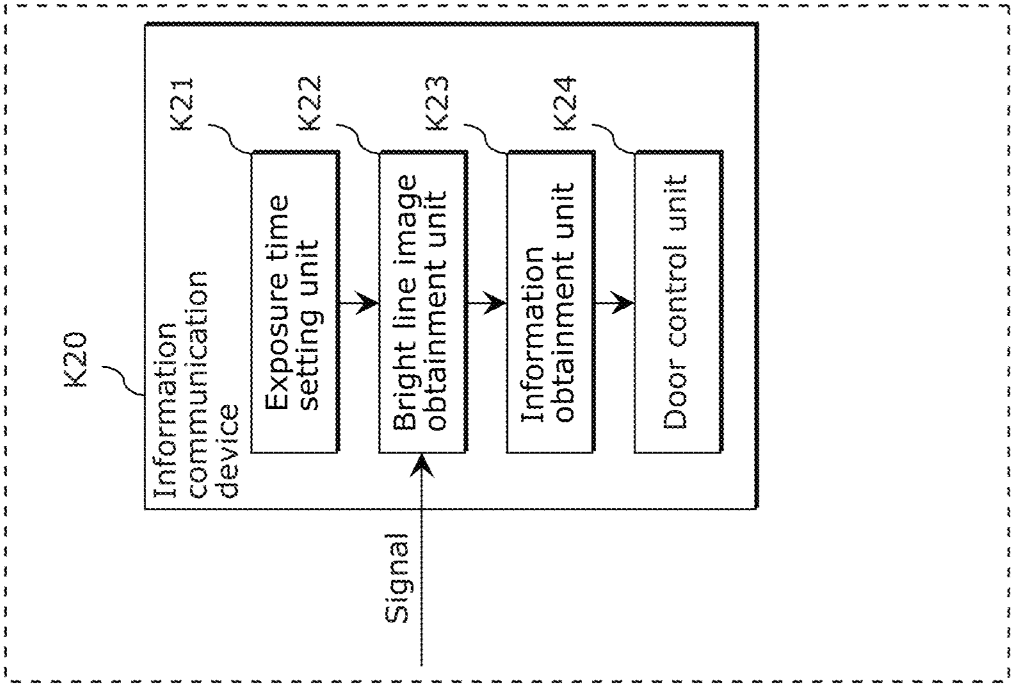
Figure 198:
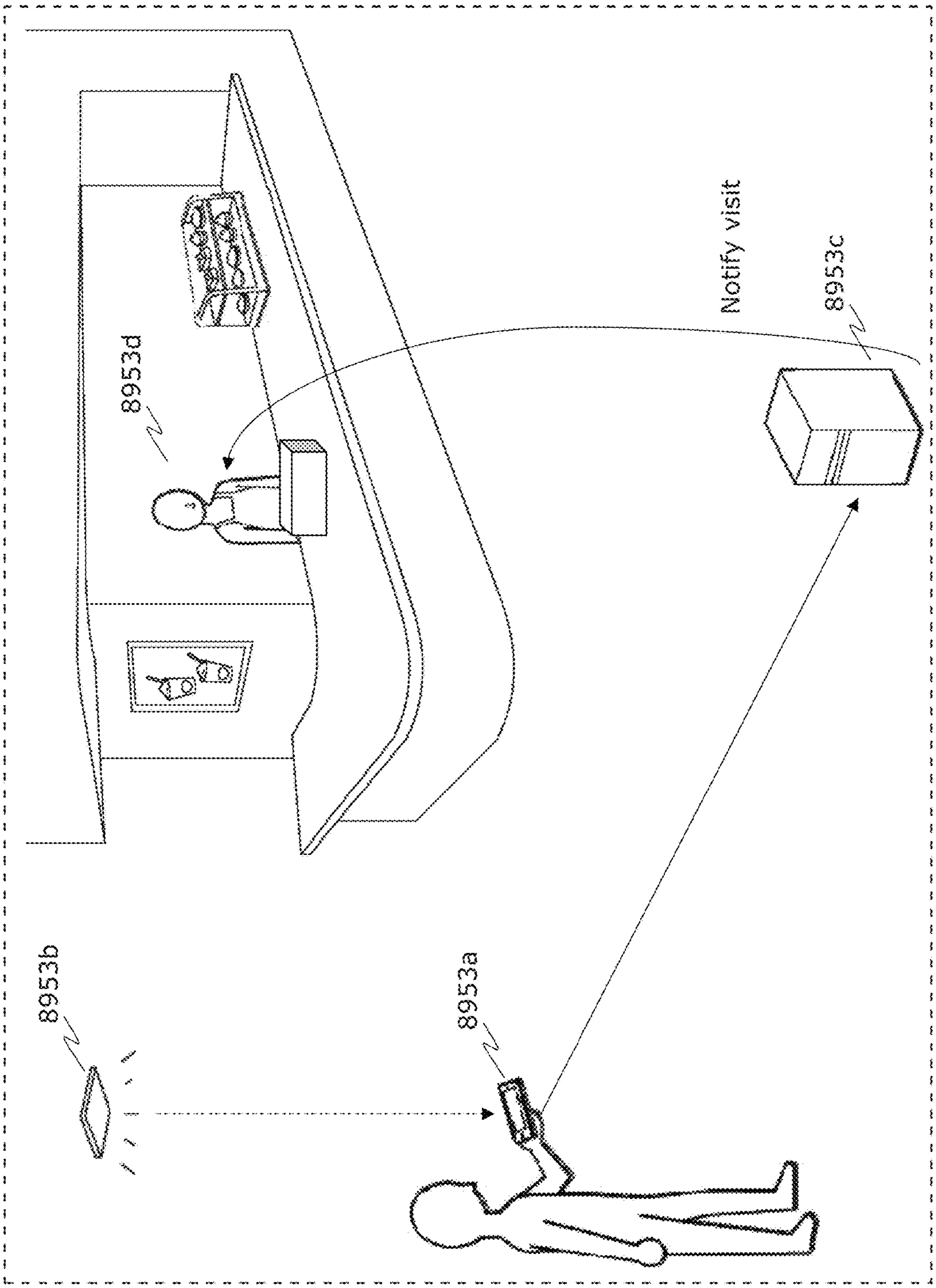
Figure 199:
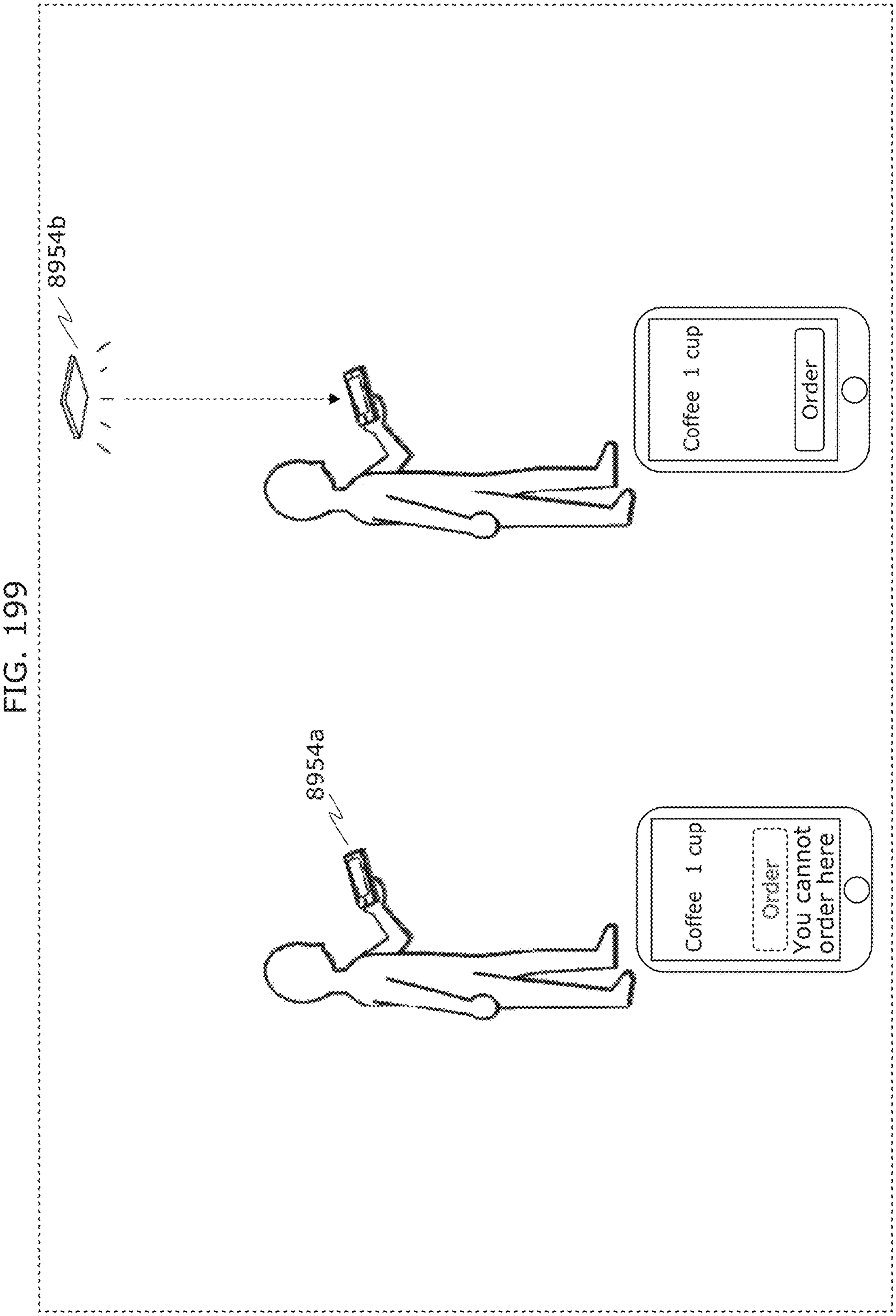
Figure 200:
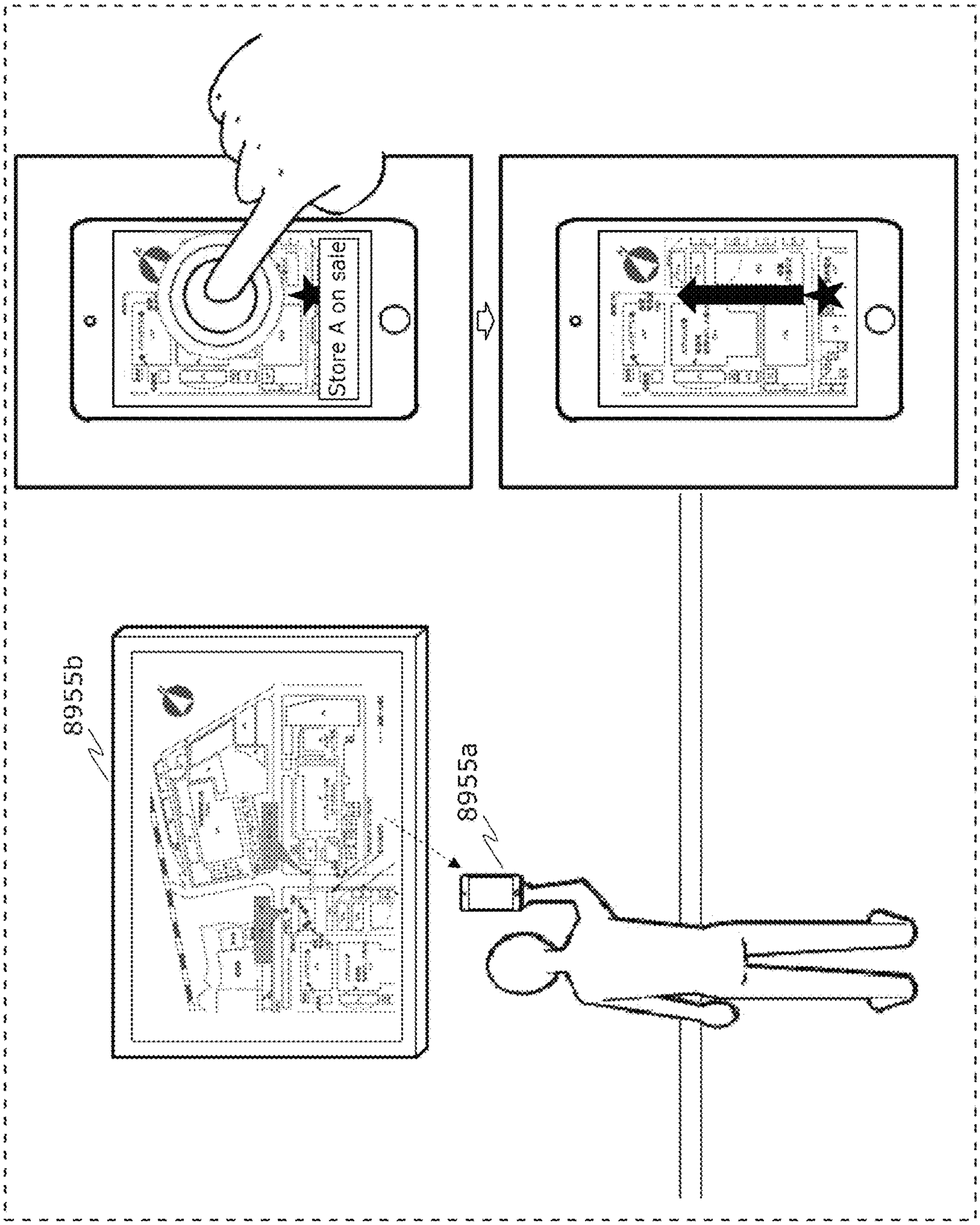
Figure 201:
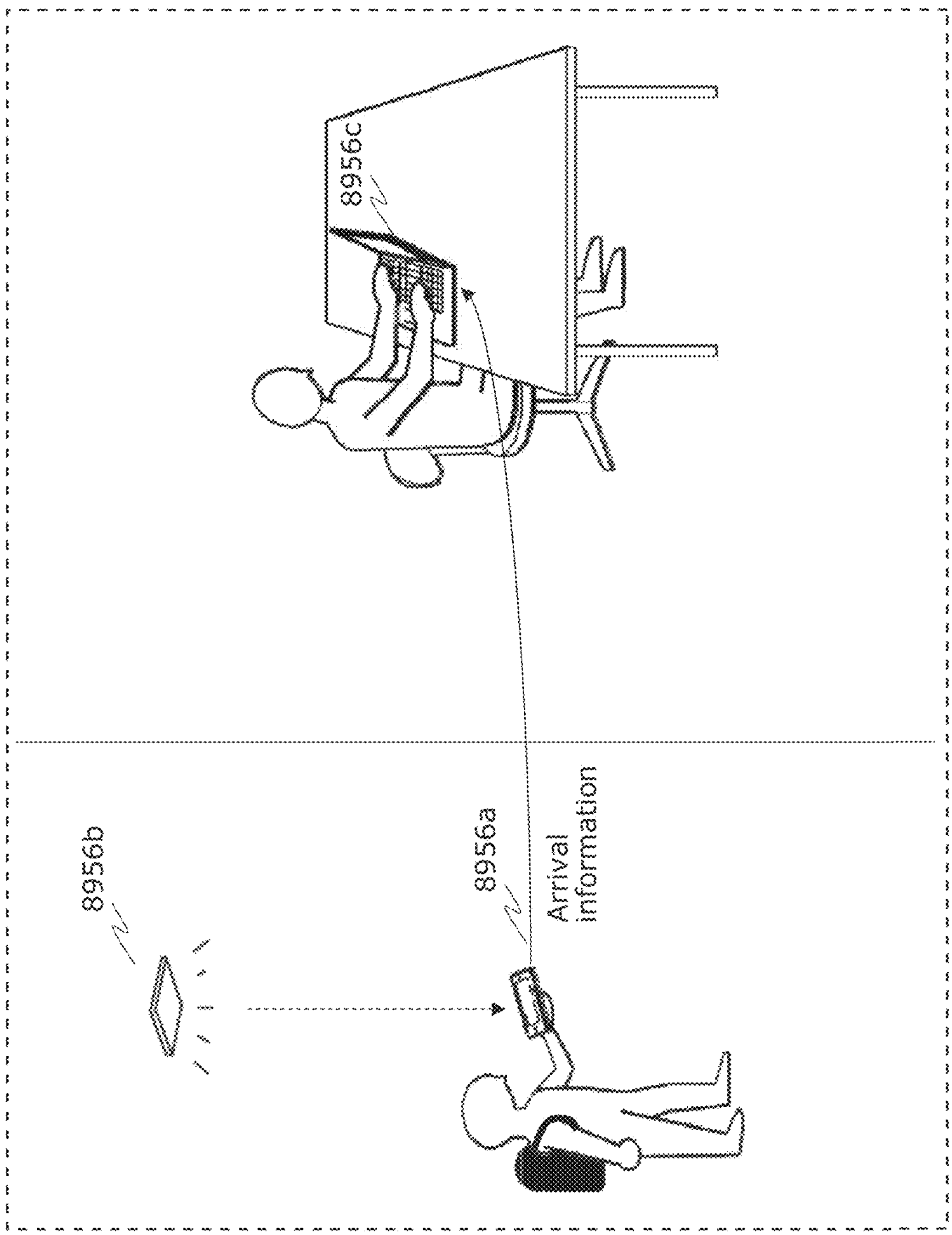
Figure 202:
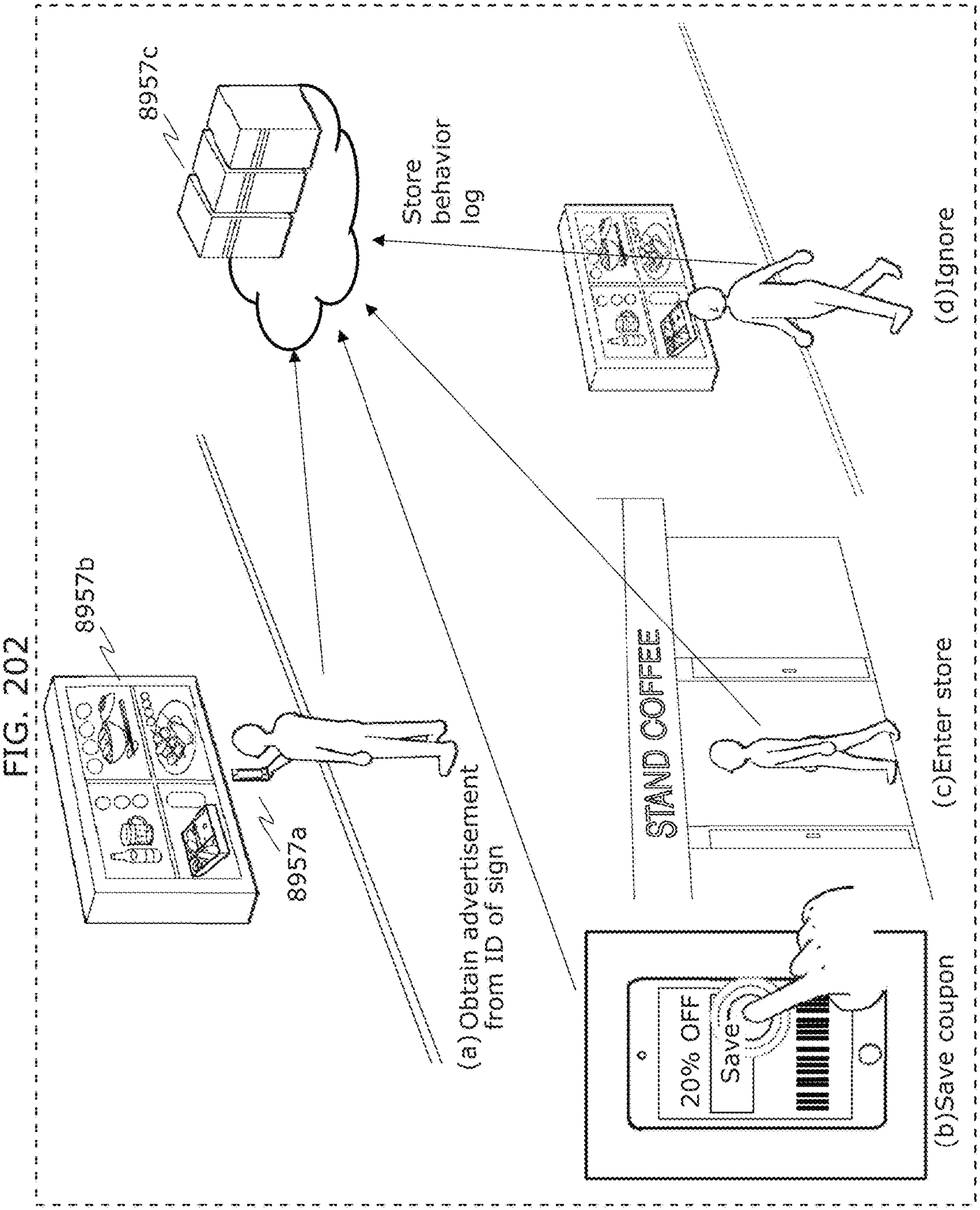
Figure 203:
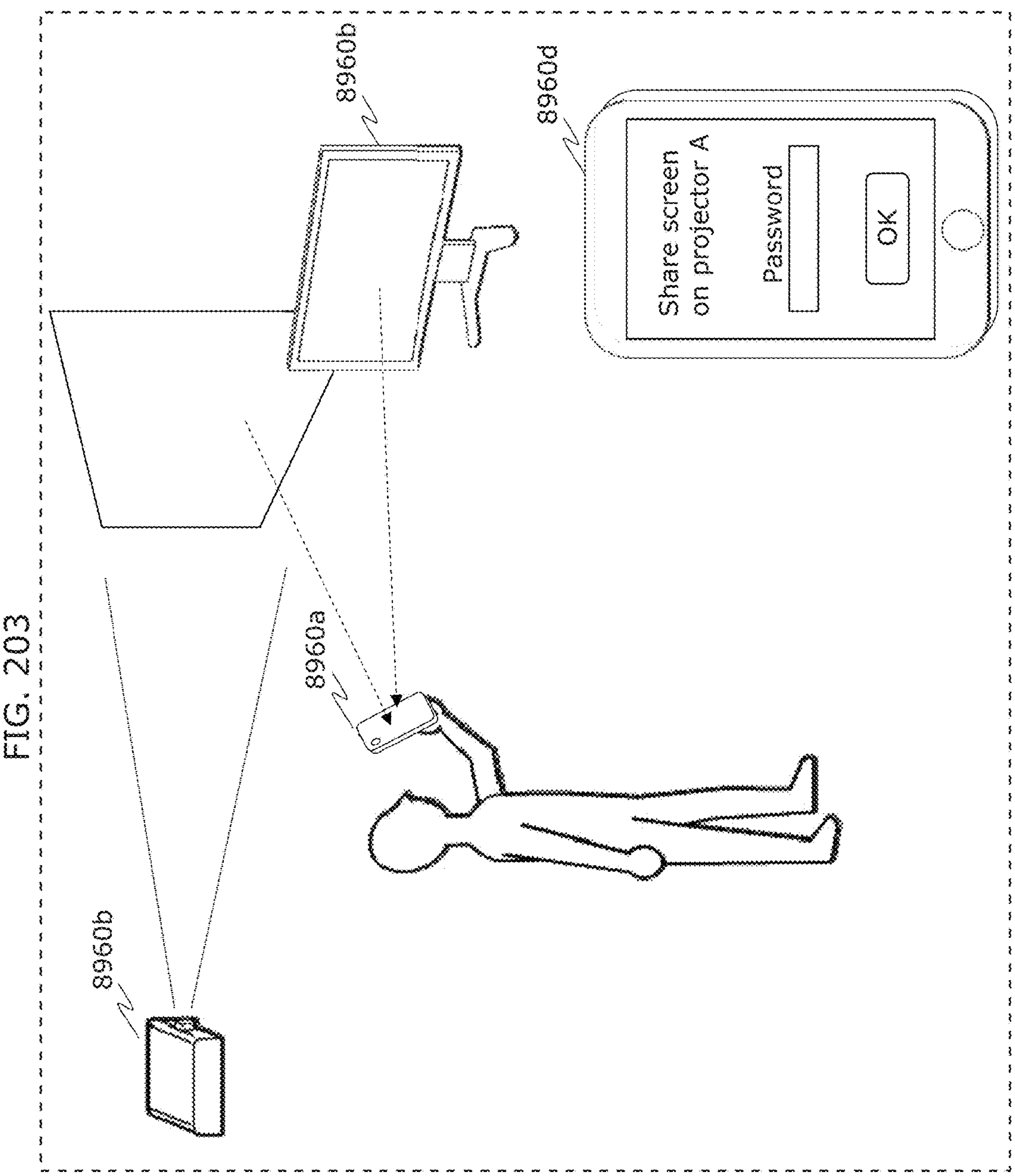
Figure 204:
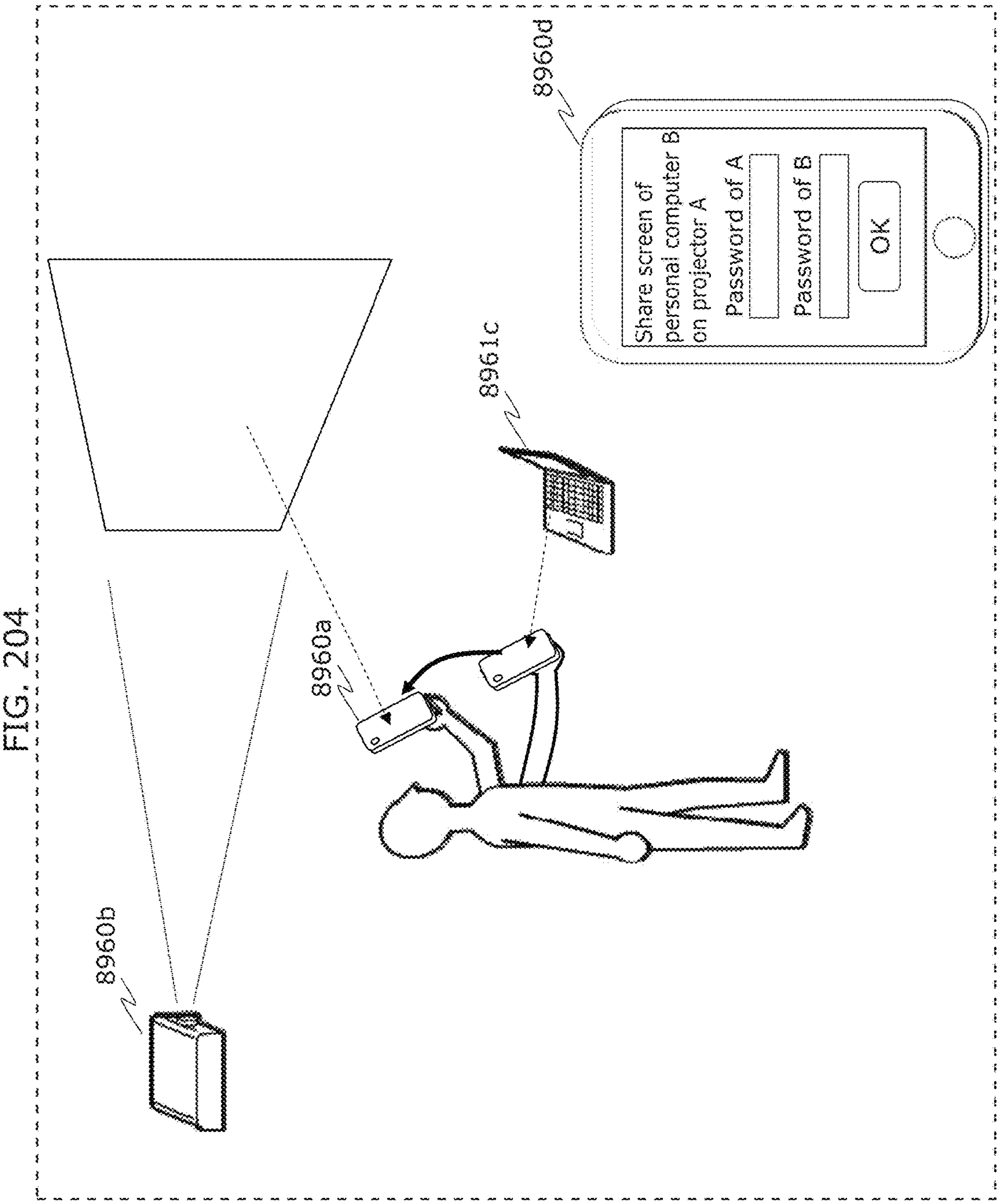
Figure 205:
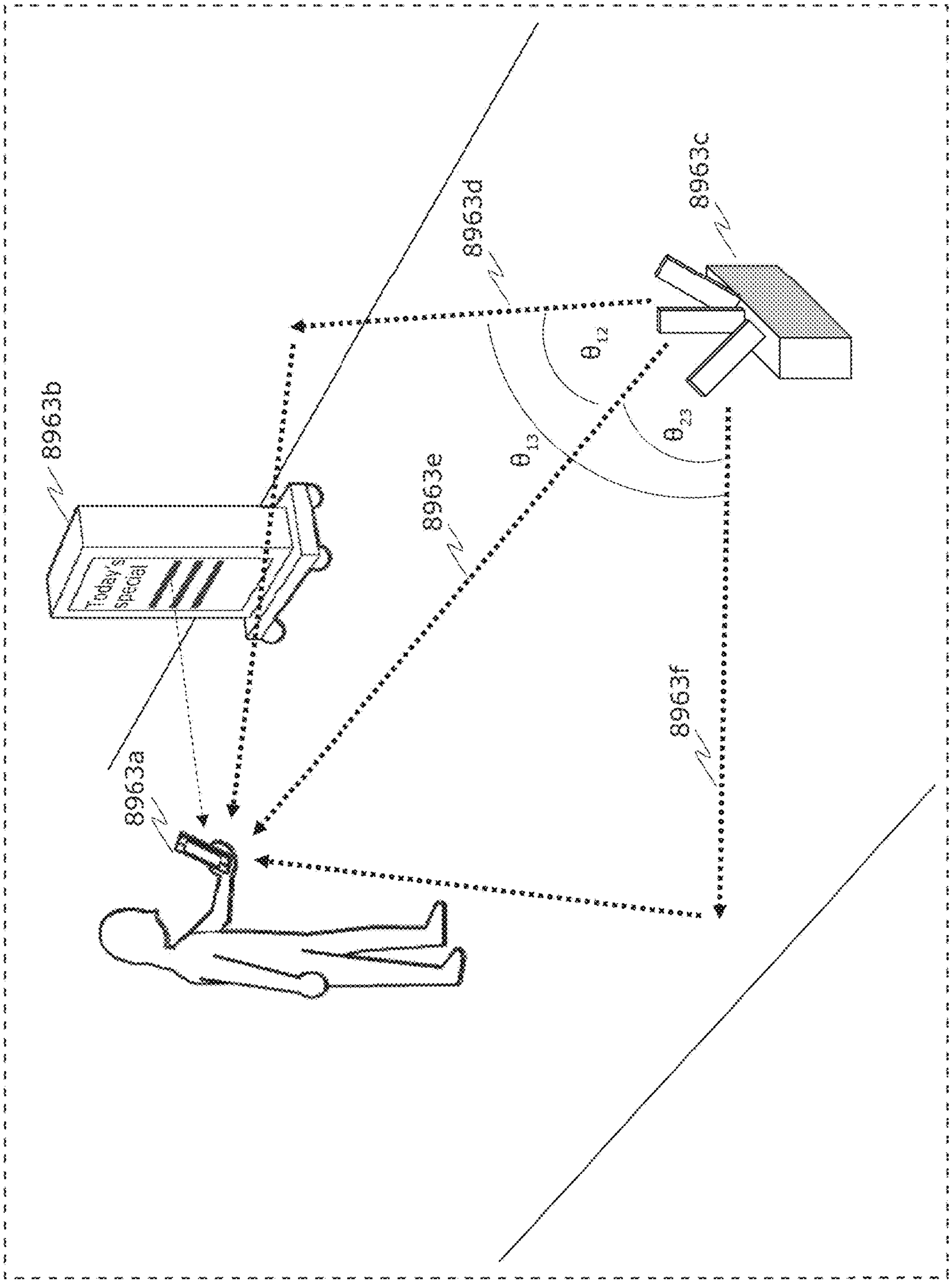
Figure 206:
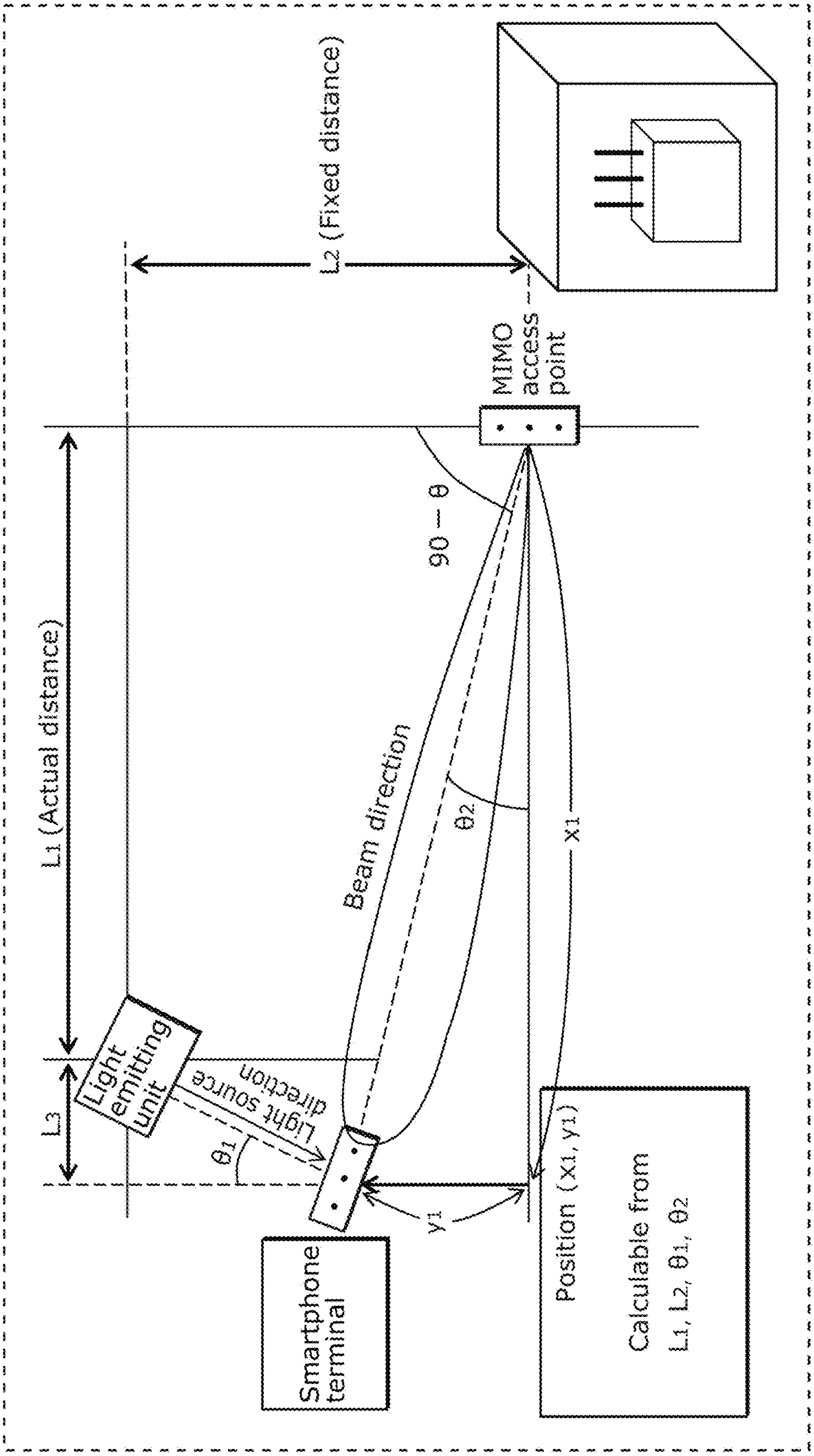
Figure 207:
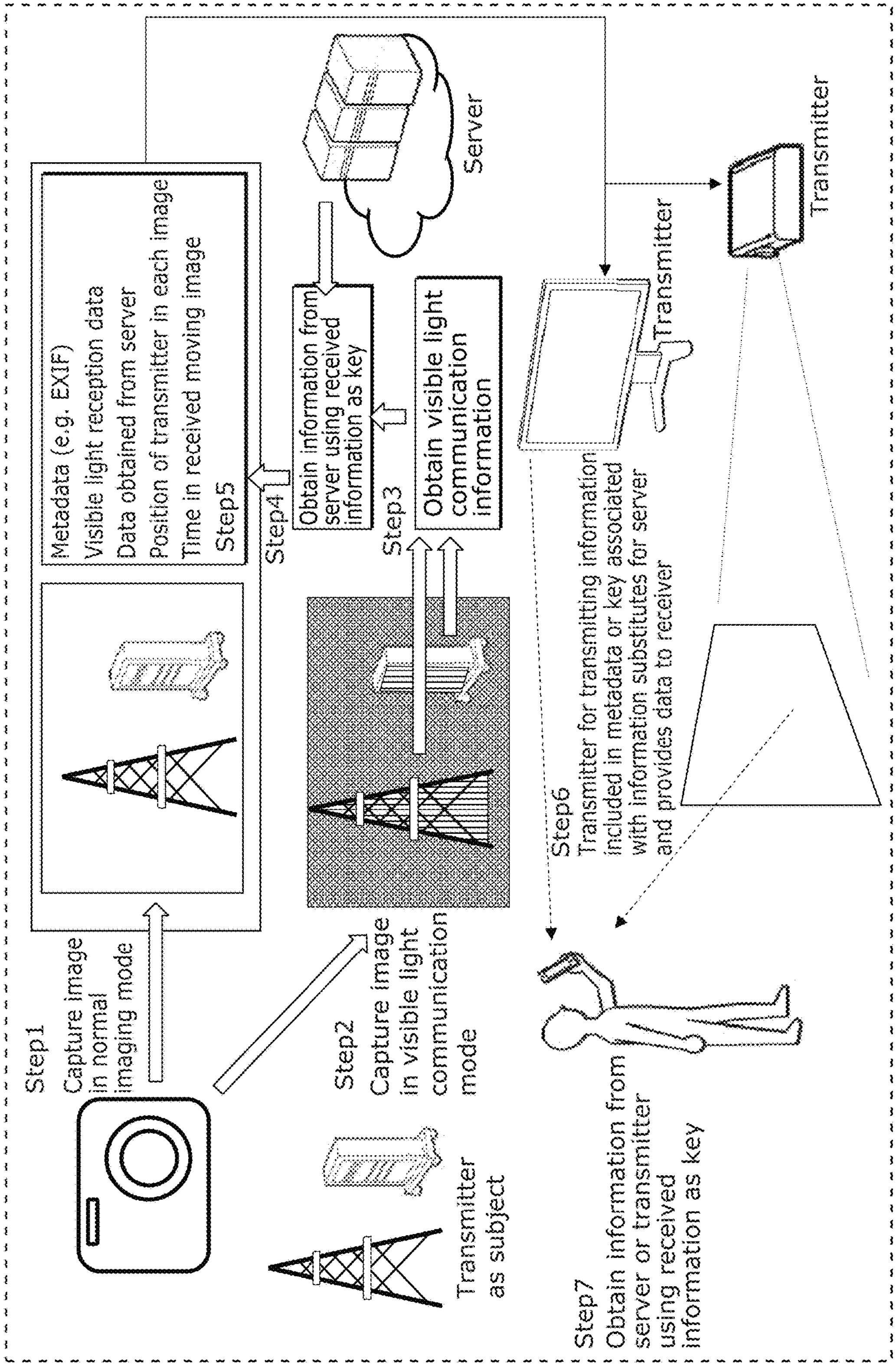
Figure 208:
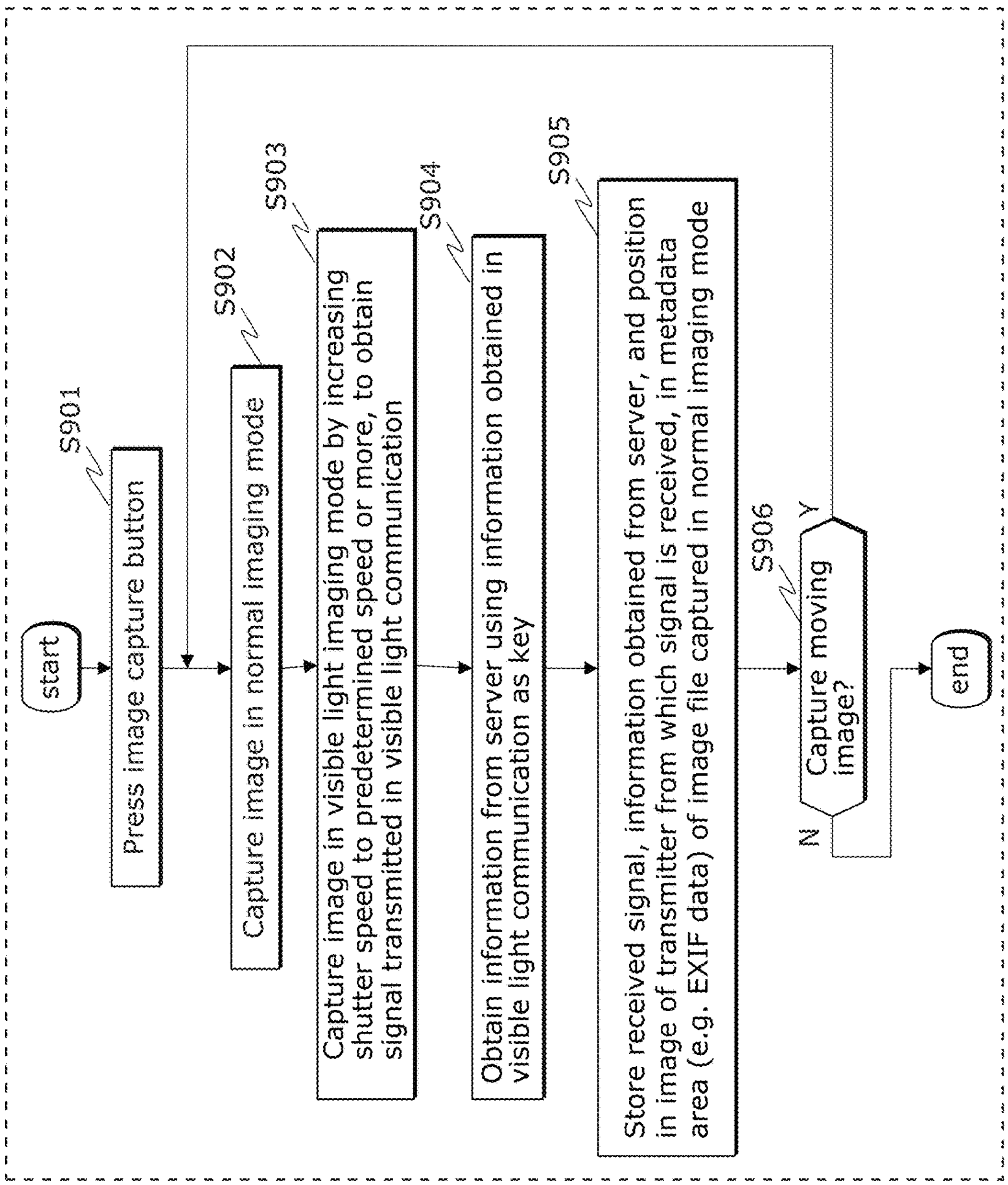
Figure 209:
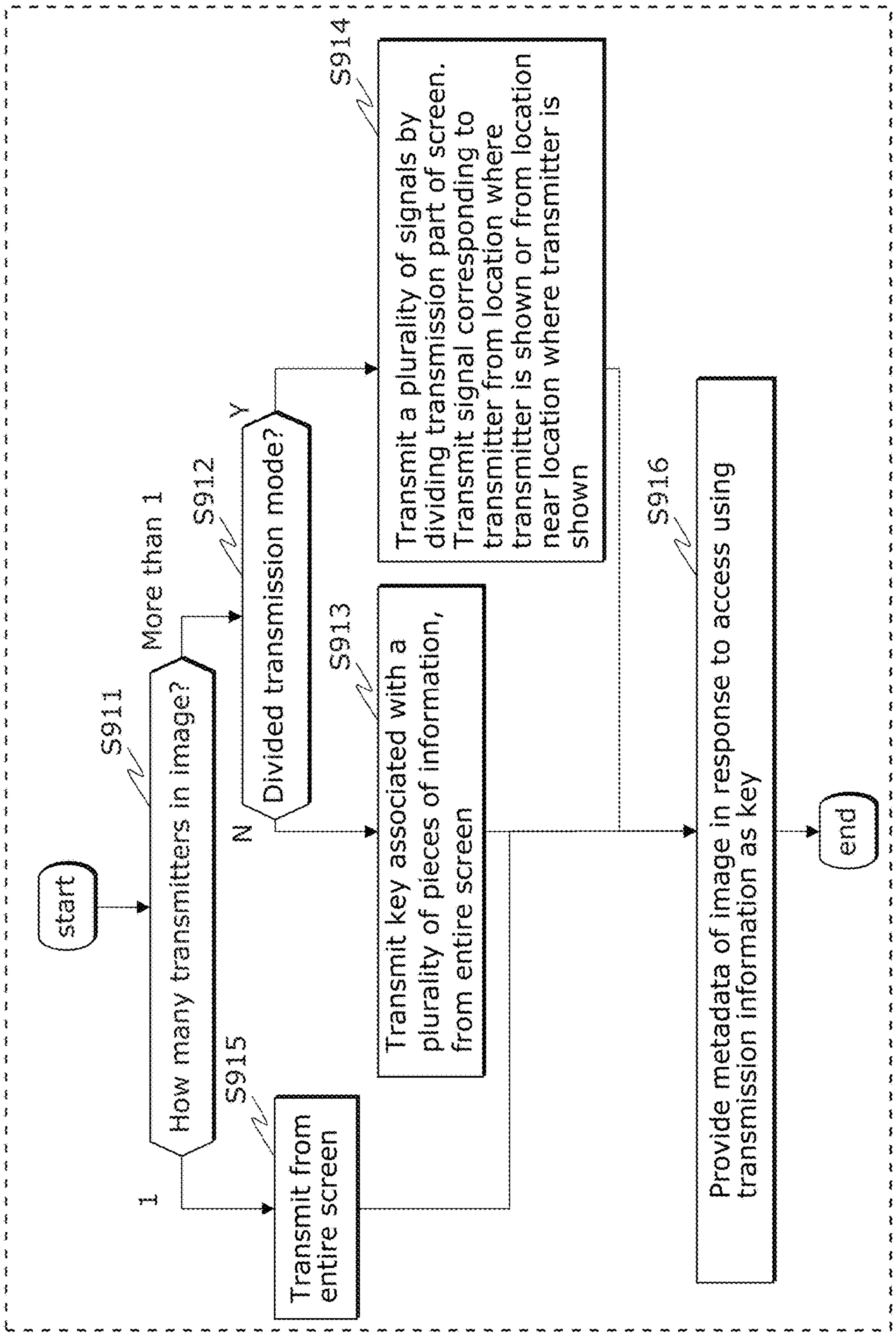
Figure 210:
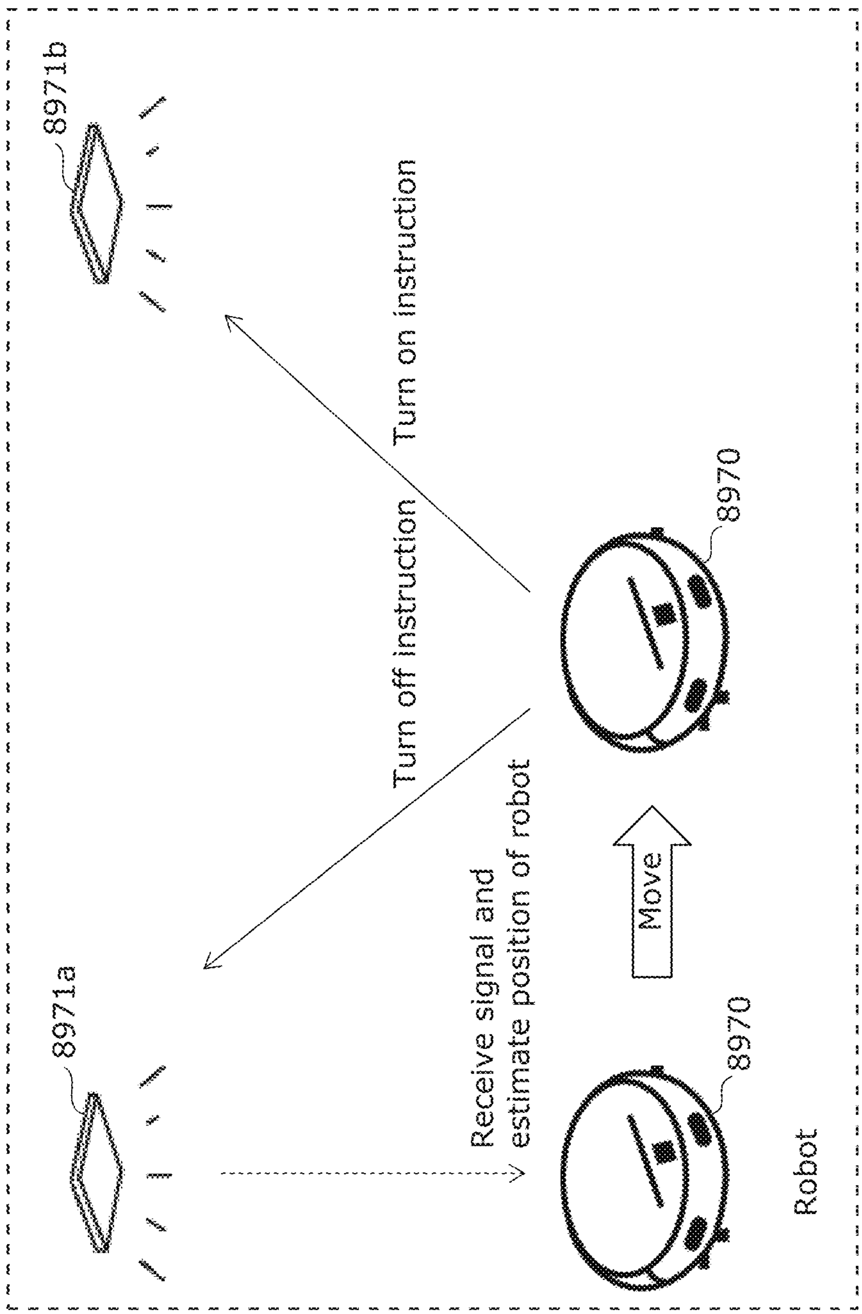
Figure 211:
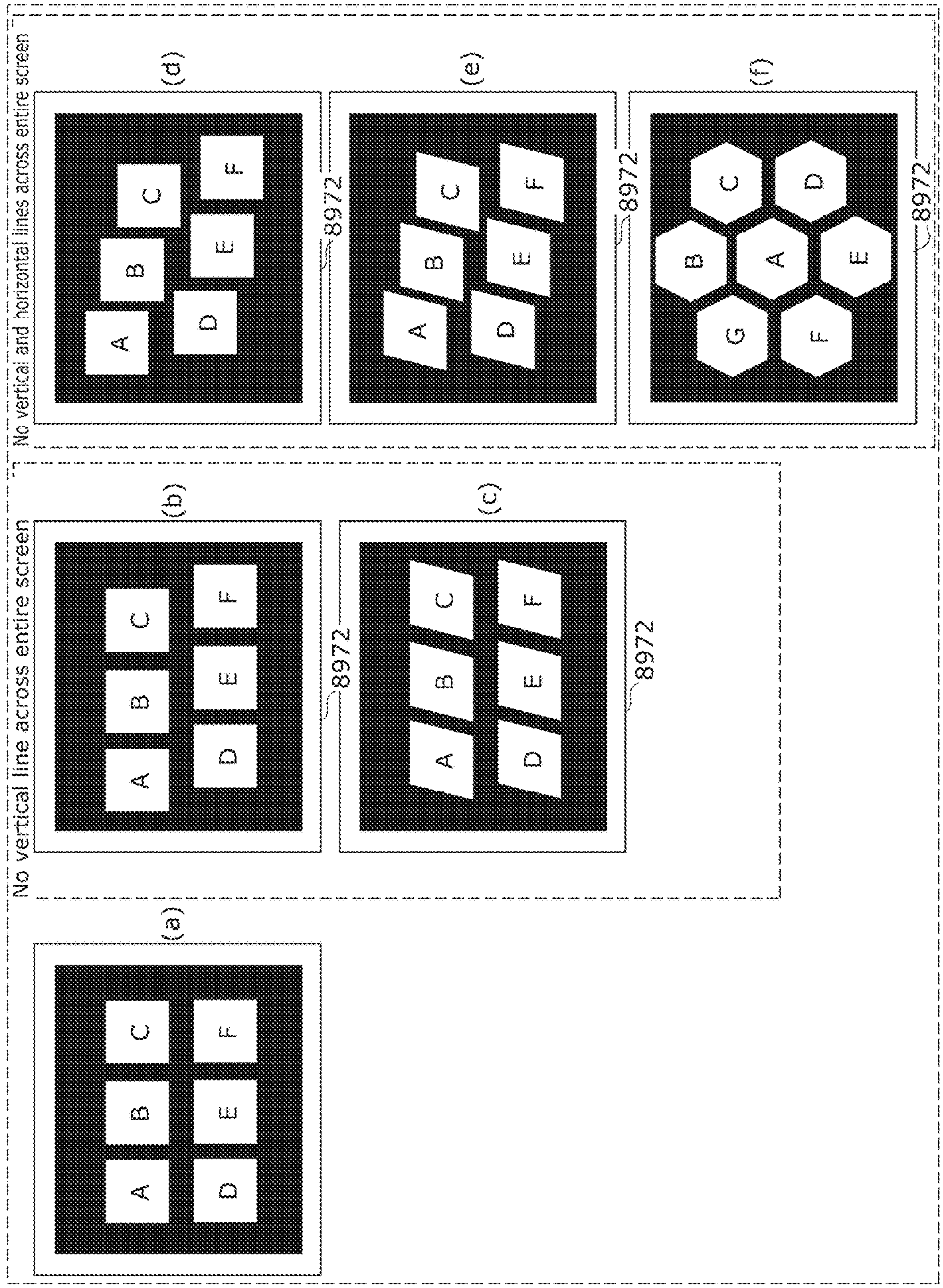
Figure 212:
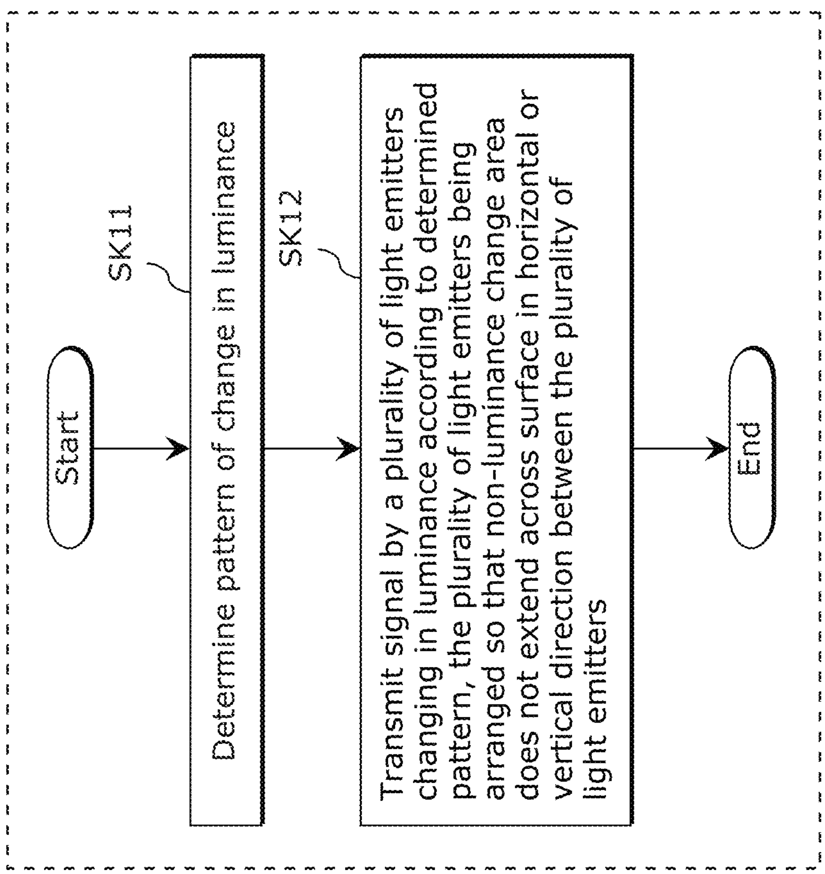
Figure 213:
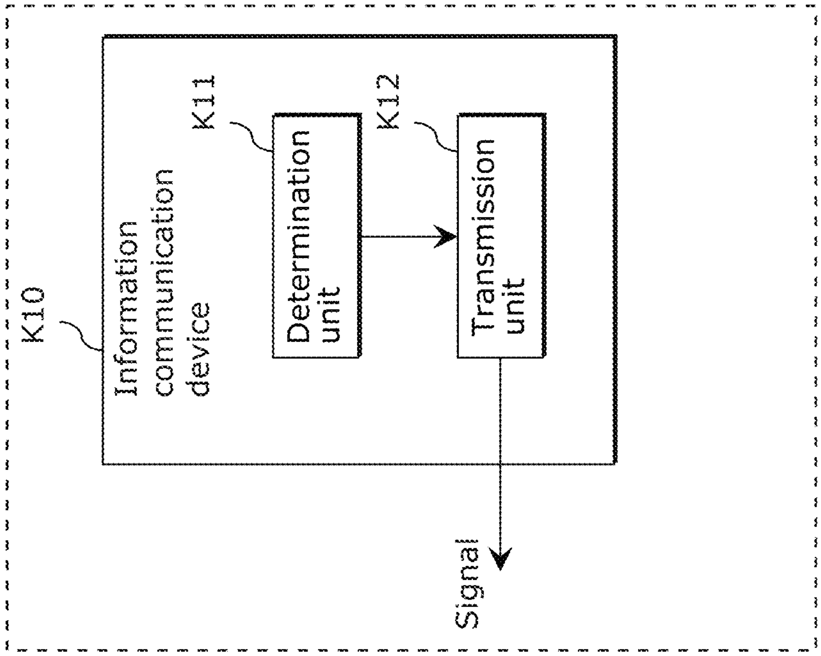
Figure 214A:
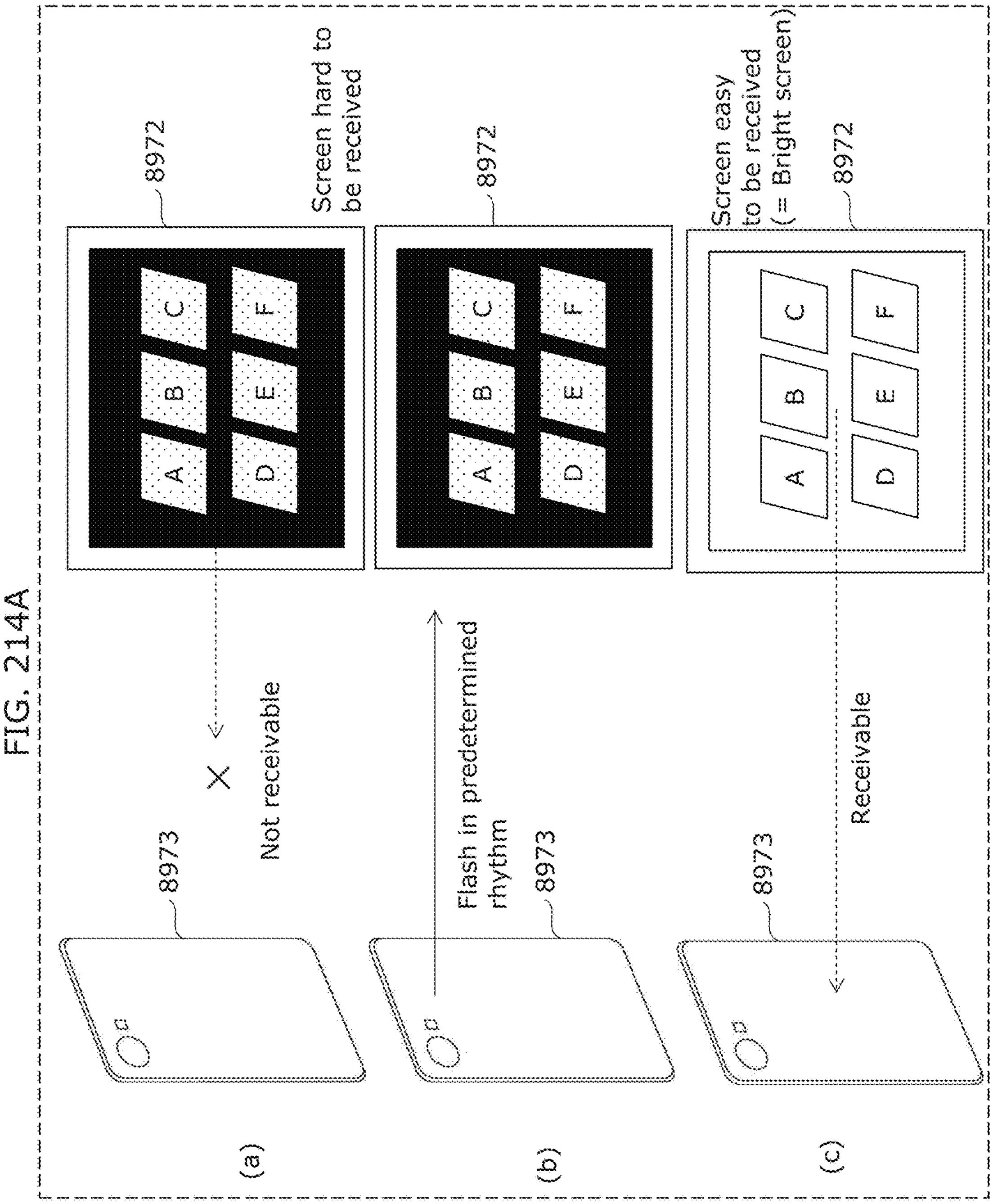
Figure 215:
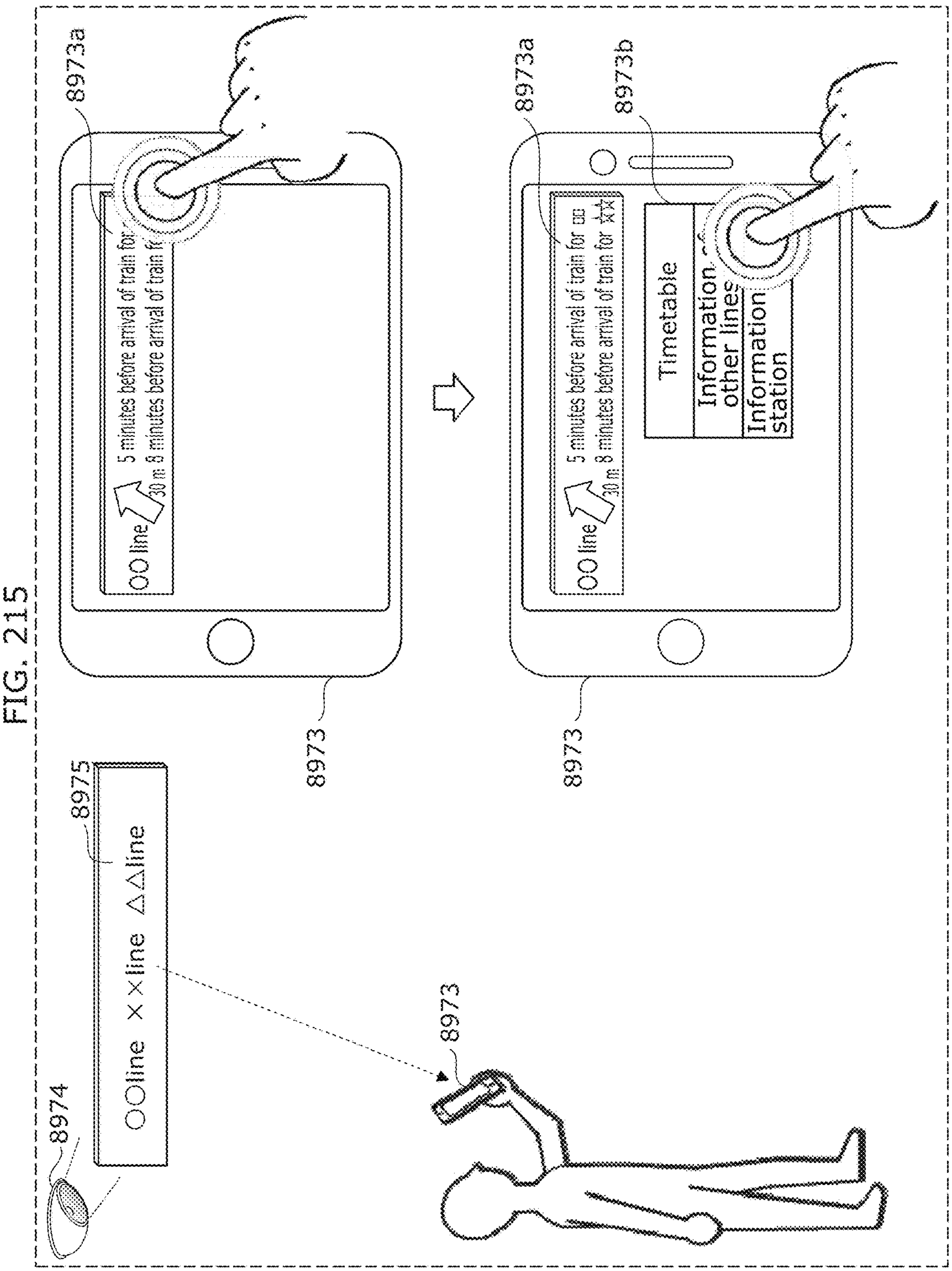
Figure 216:
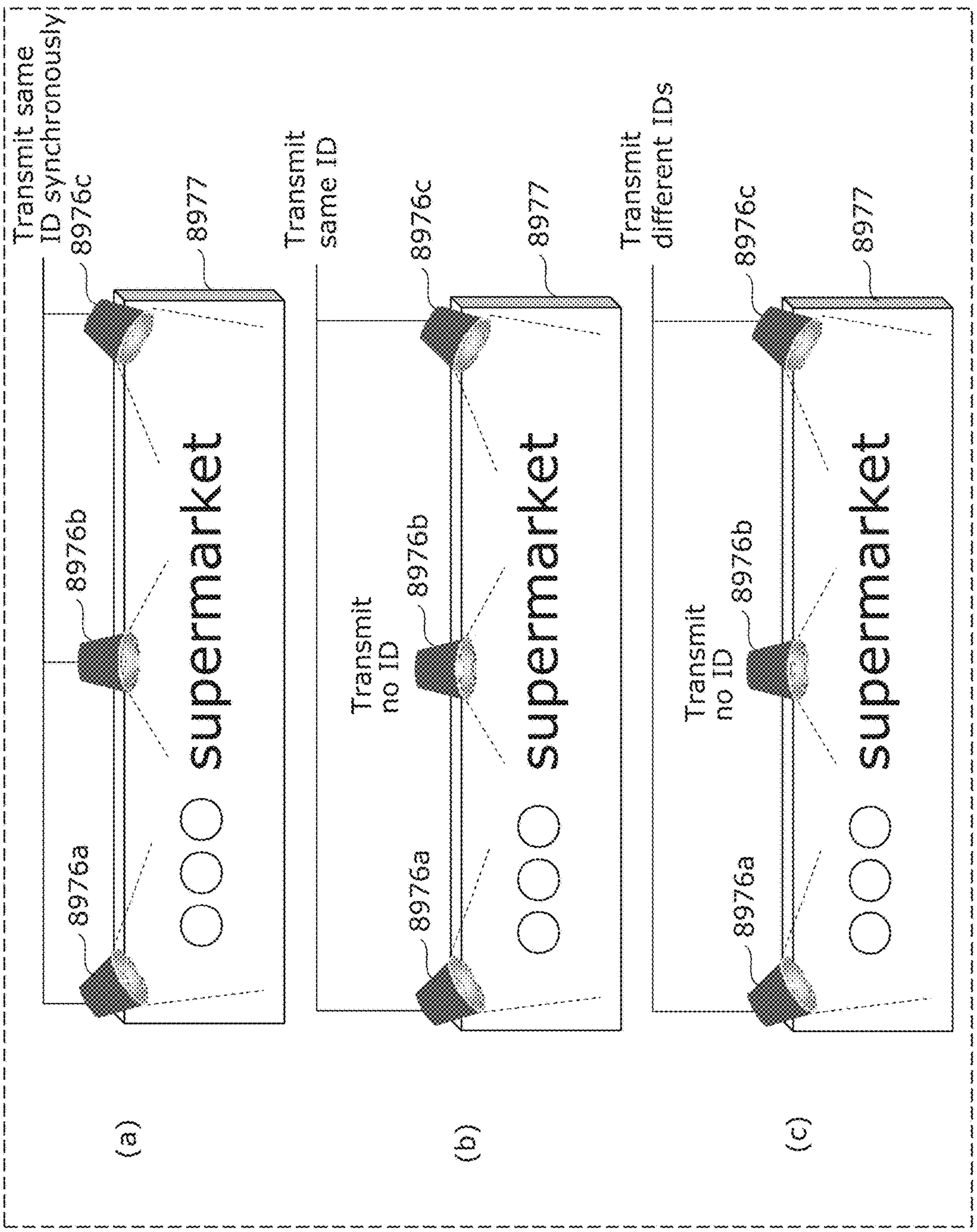
Figure 217A:
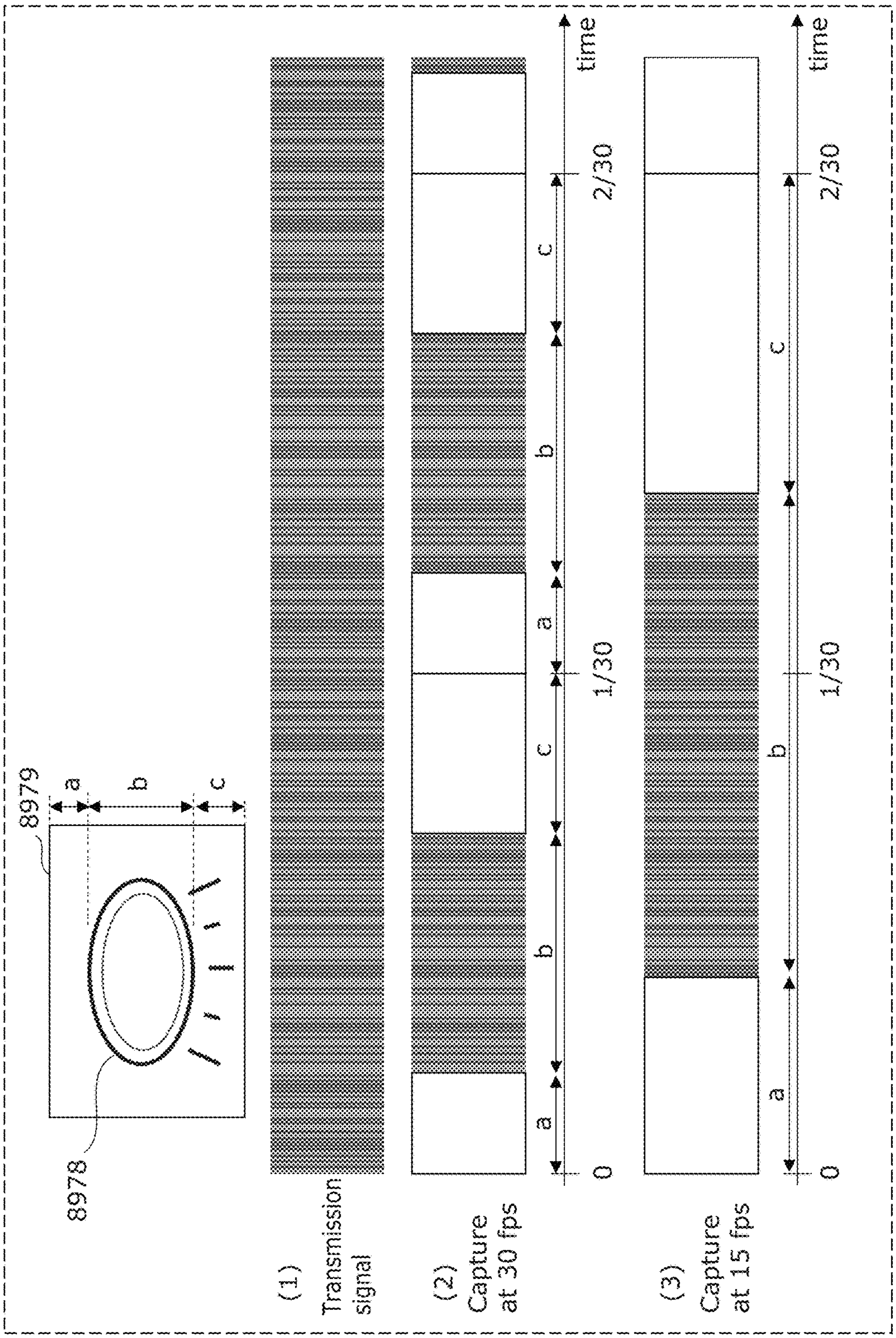
Figure 218:
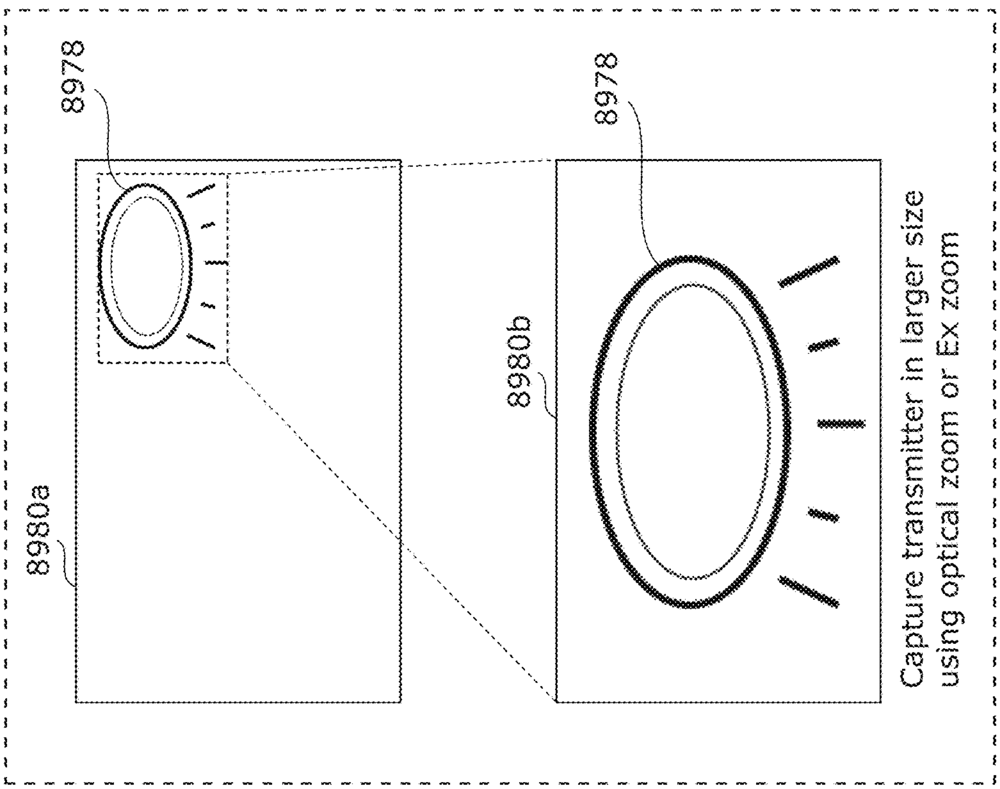
Figure 219:
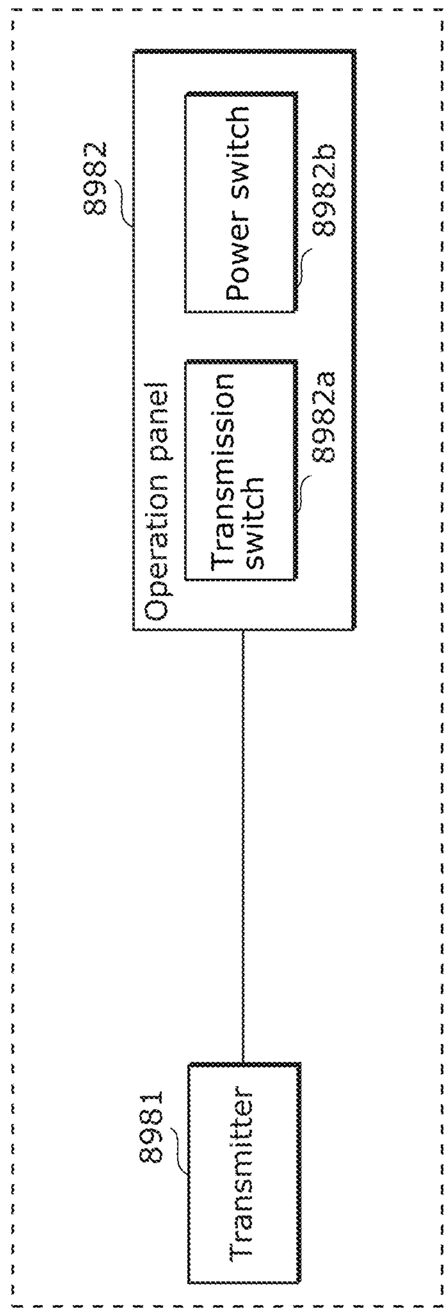
Figure 220:
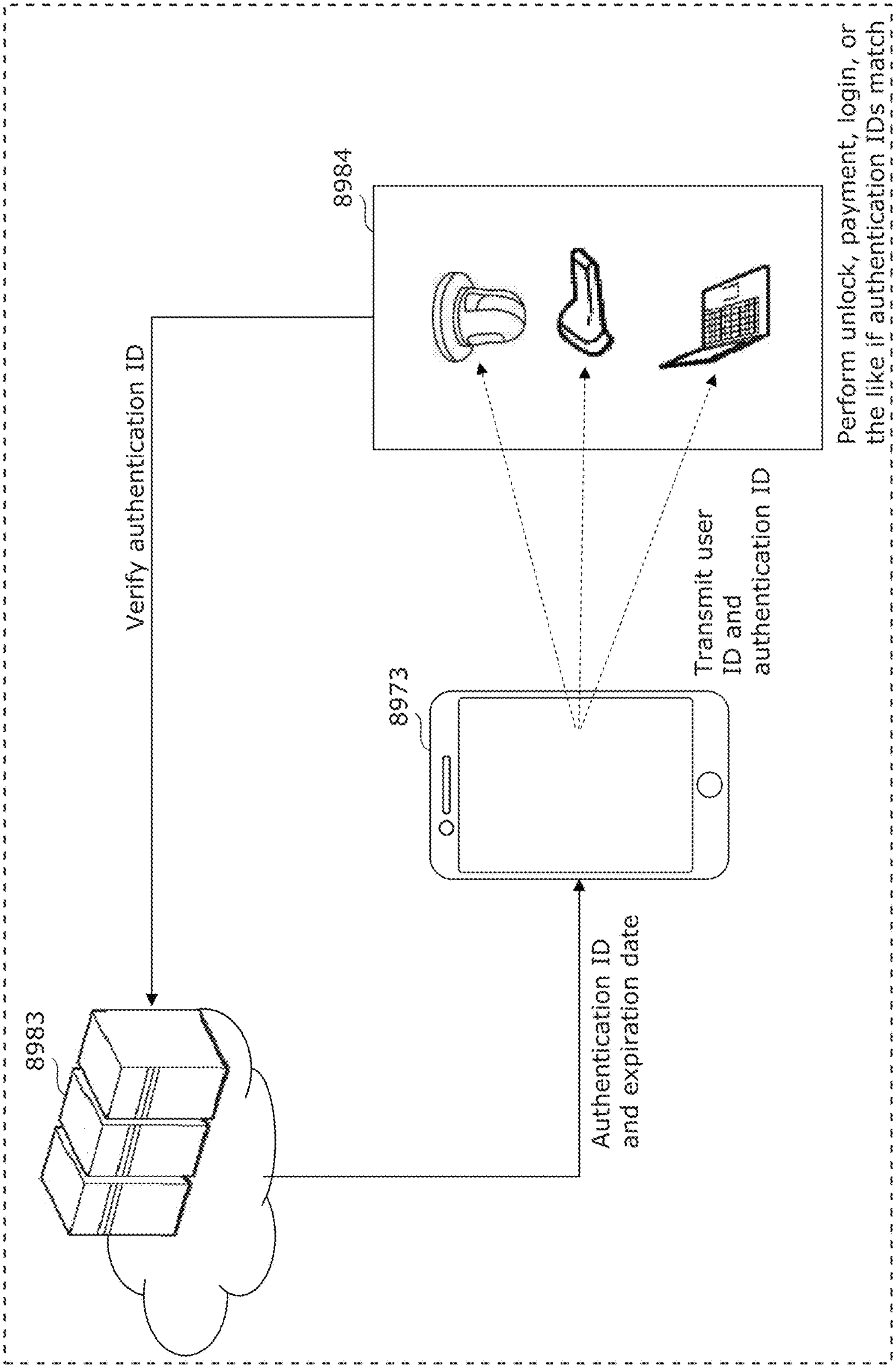
Figure 221A:
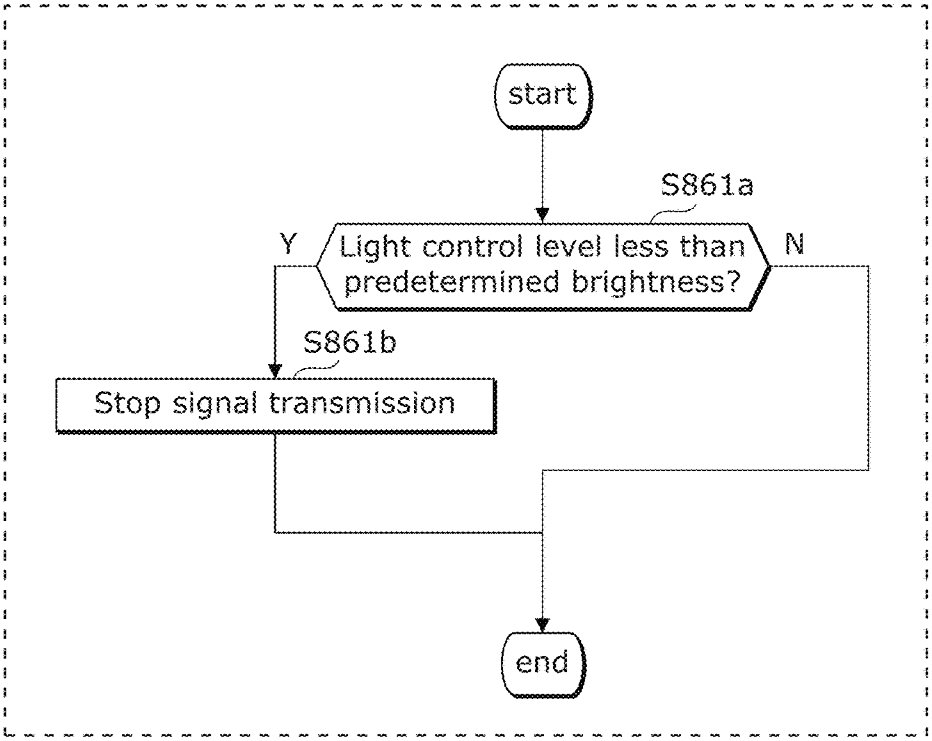
Figure 221B:
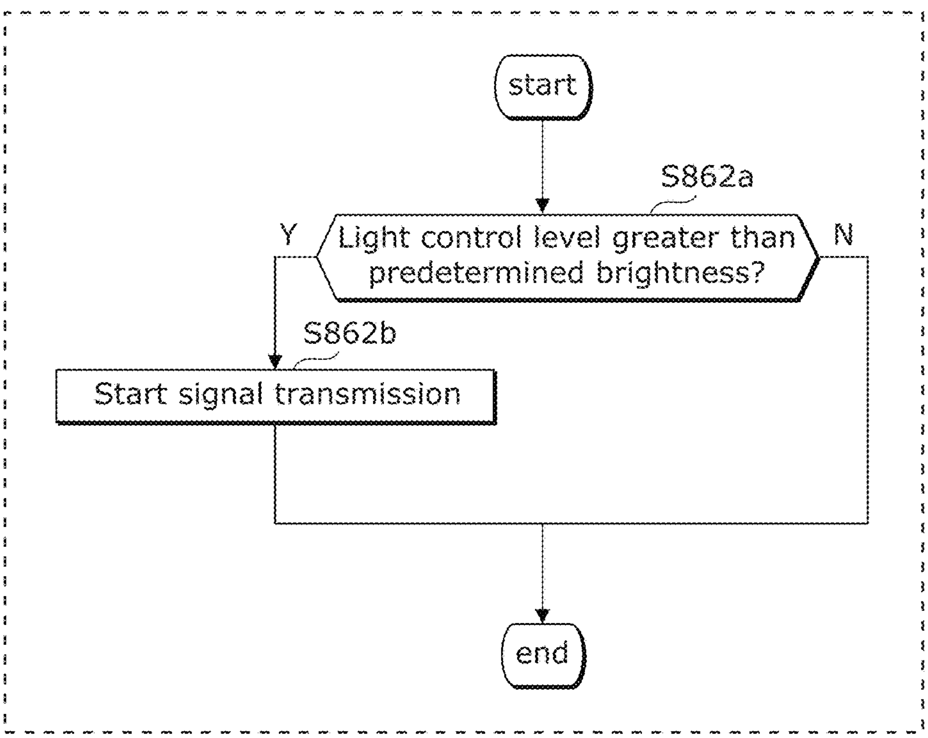
Figure 222:
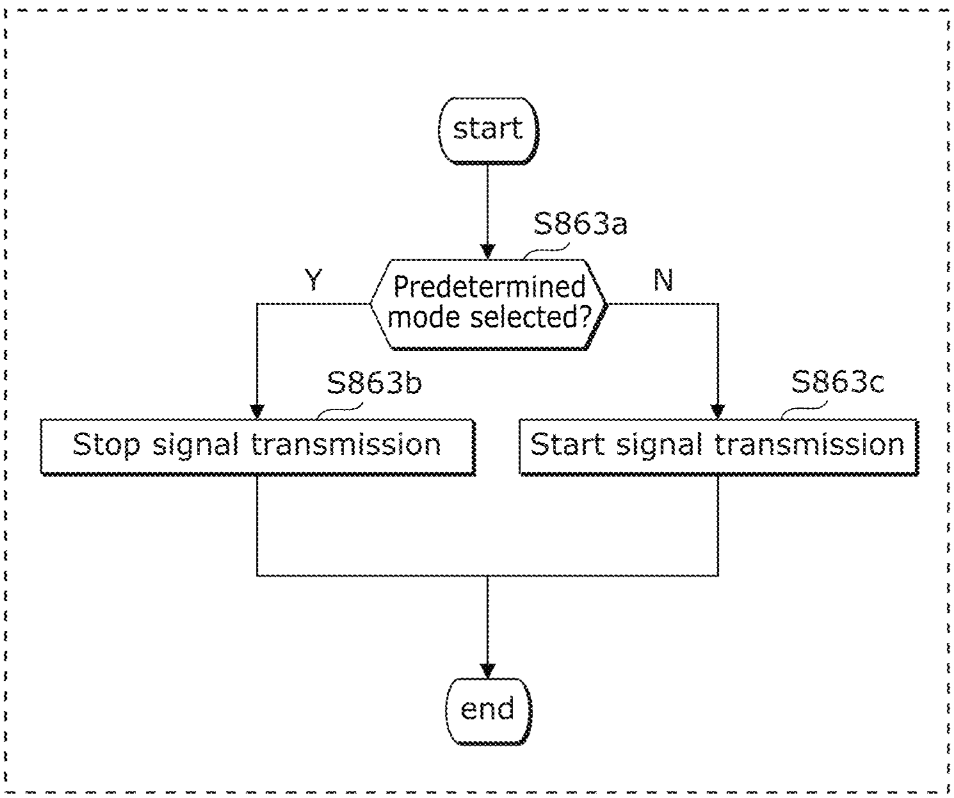
Figure 223:
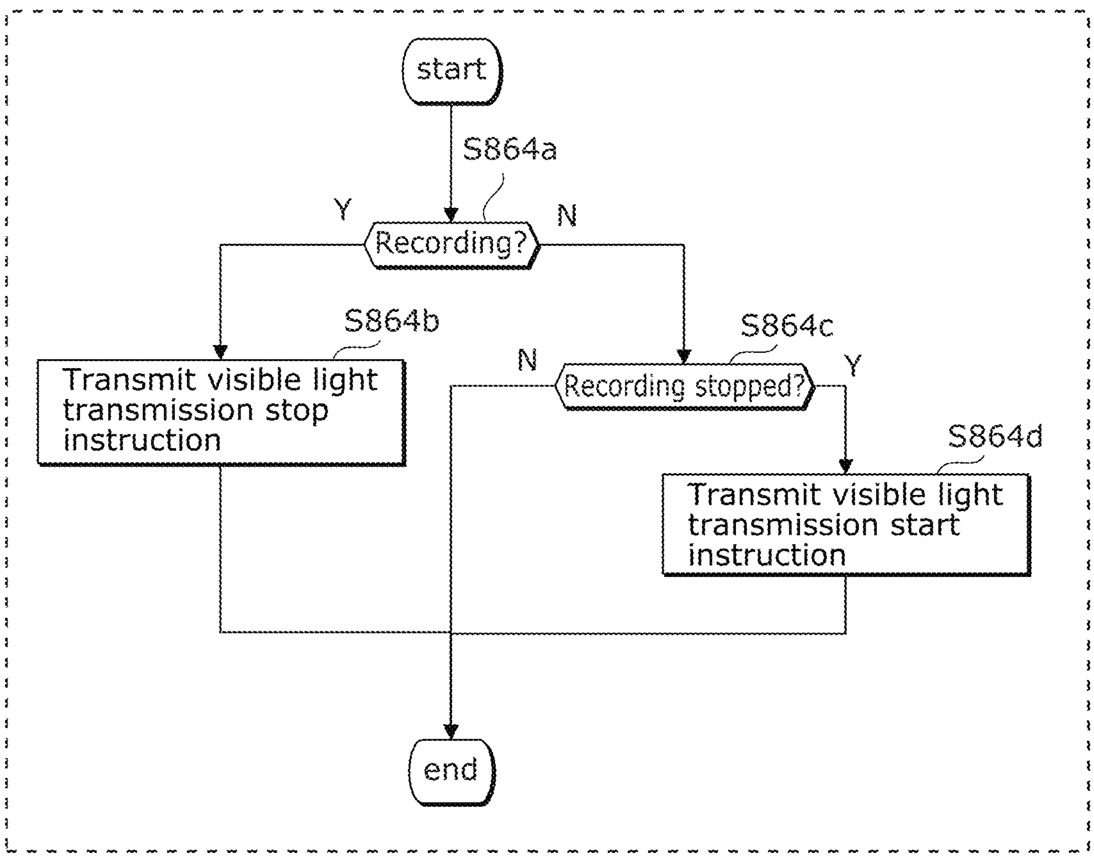
Figure 224:
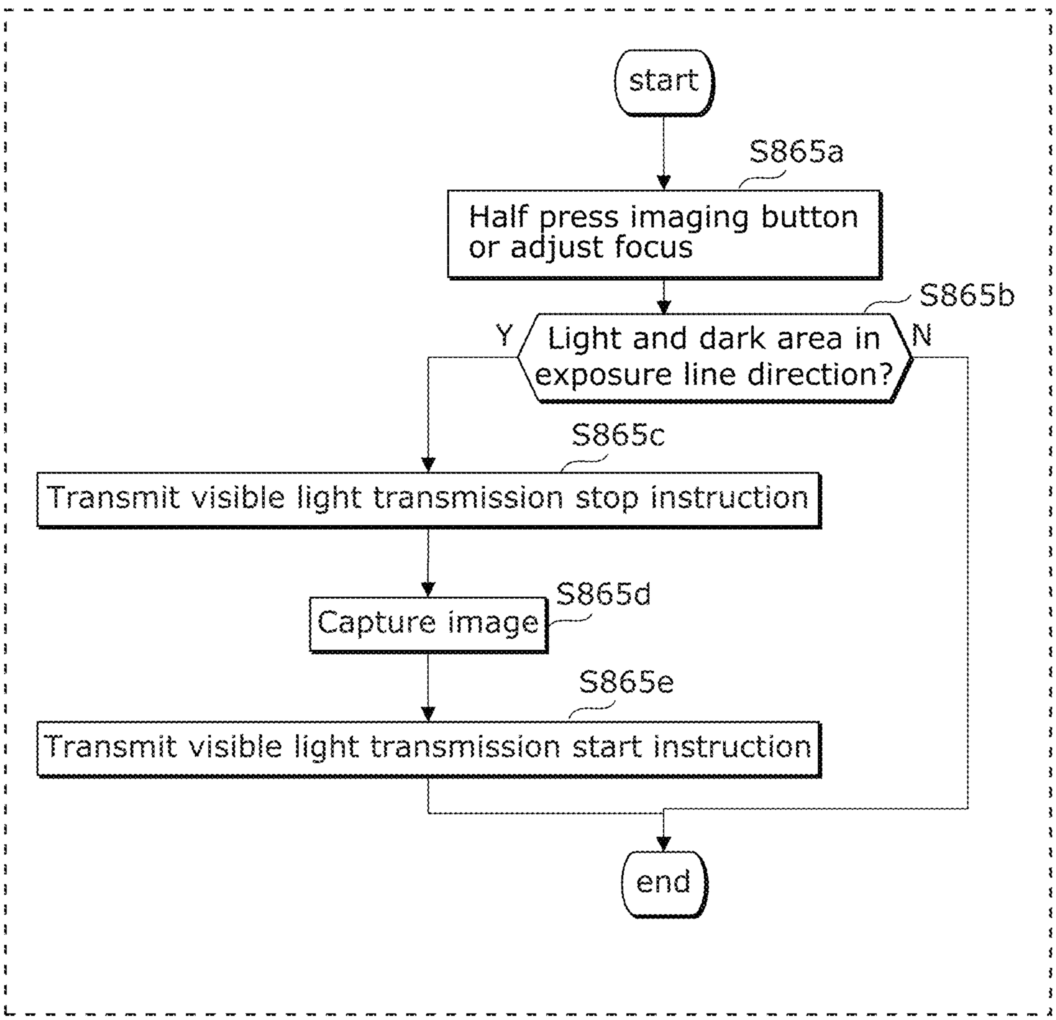
Figure 225:
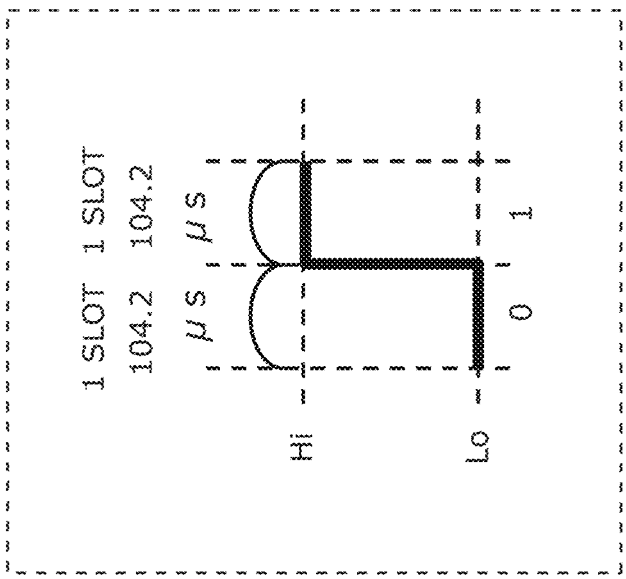
Figure 226:
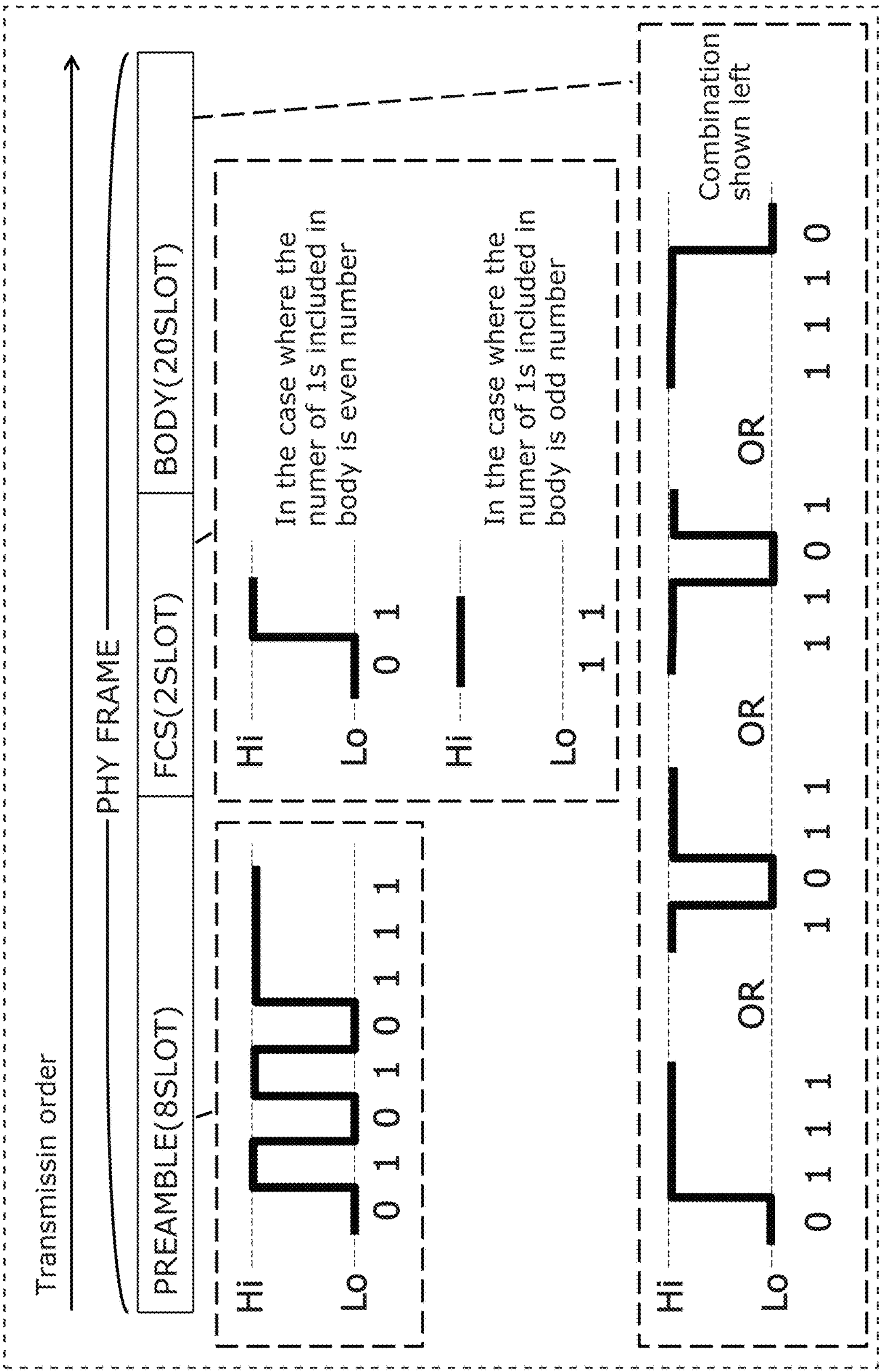
Figure 227:
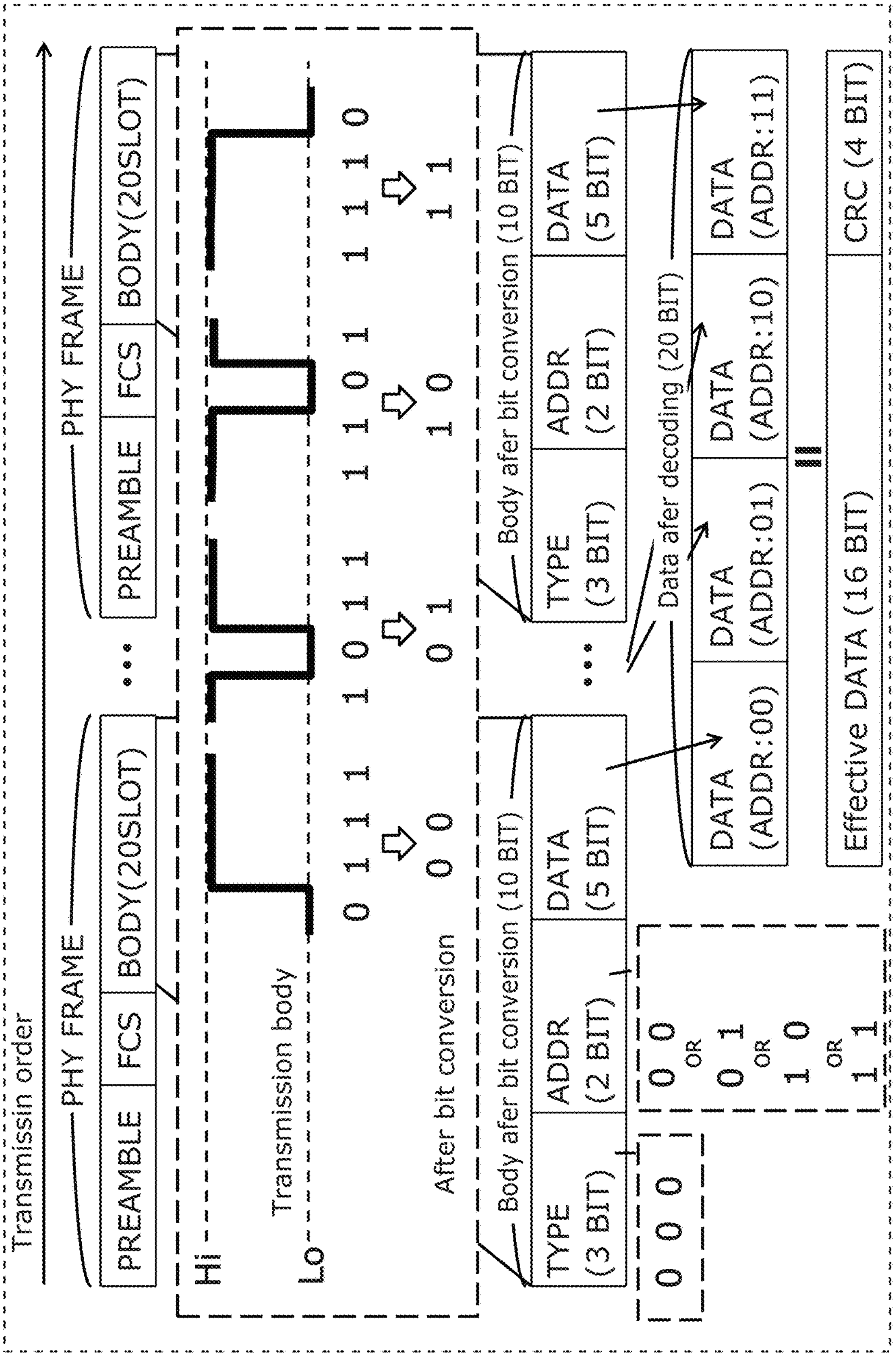
Figure 229:
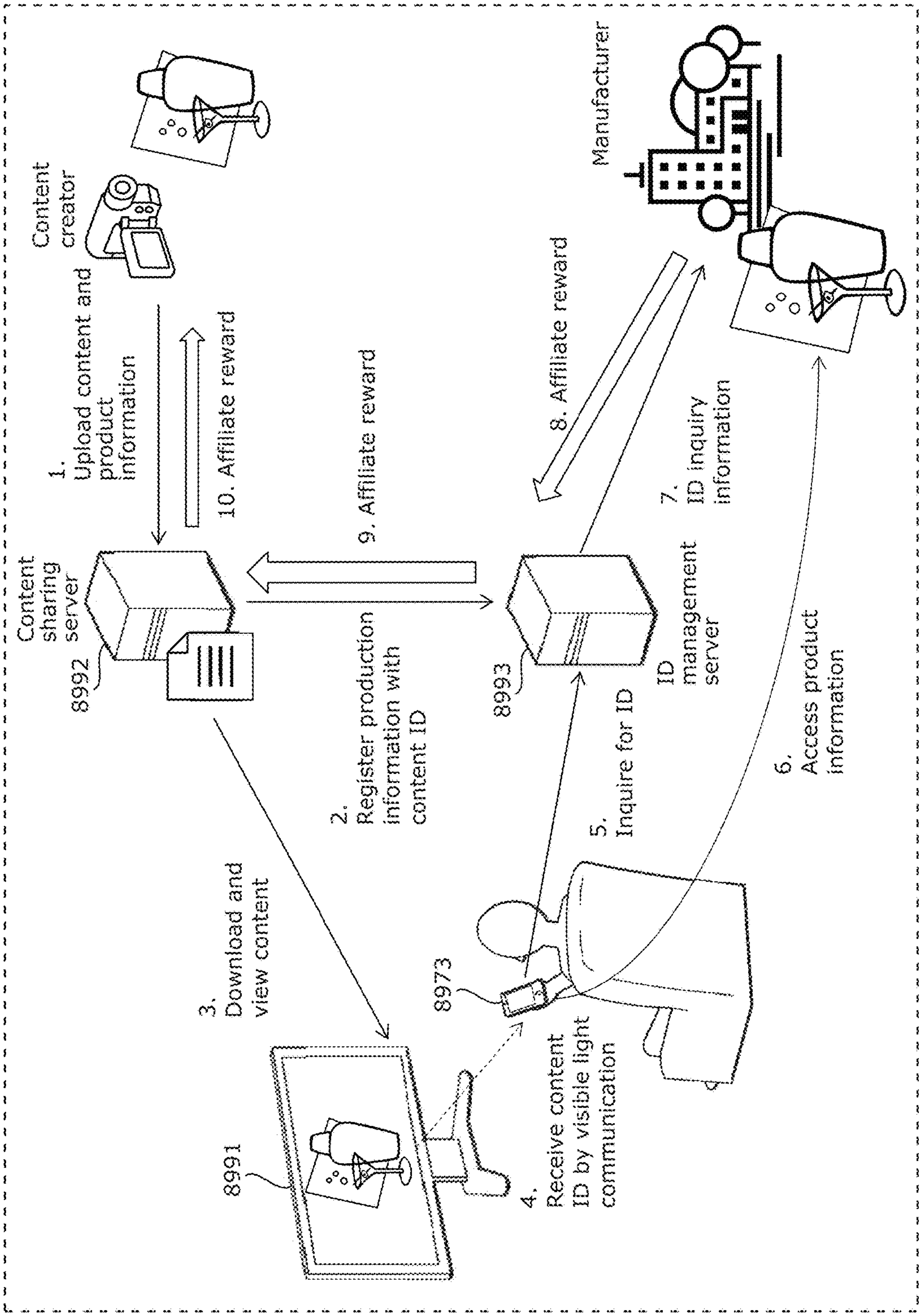
Figure 230:
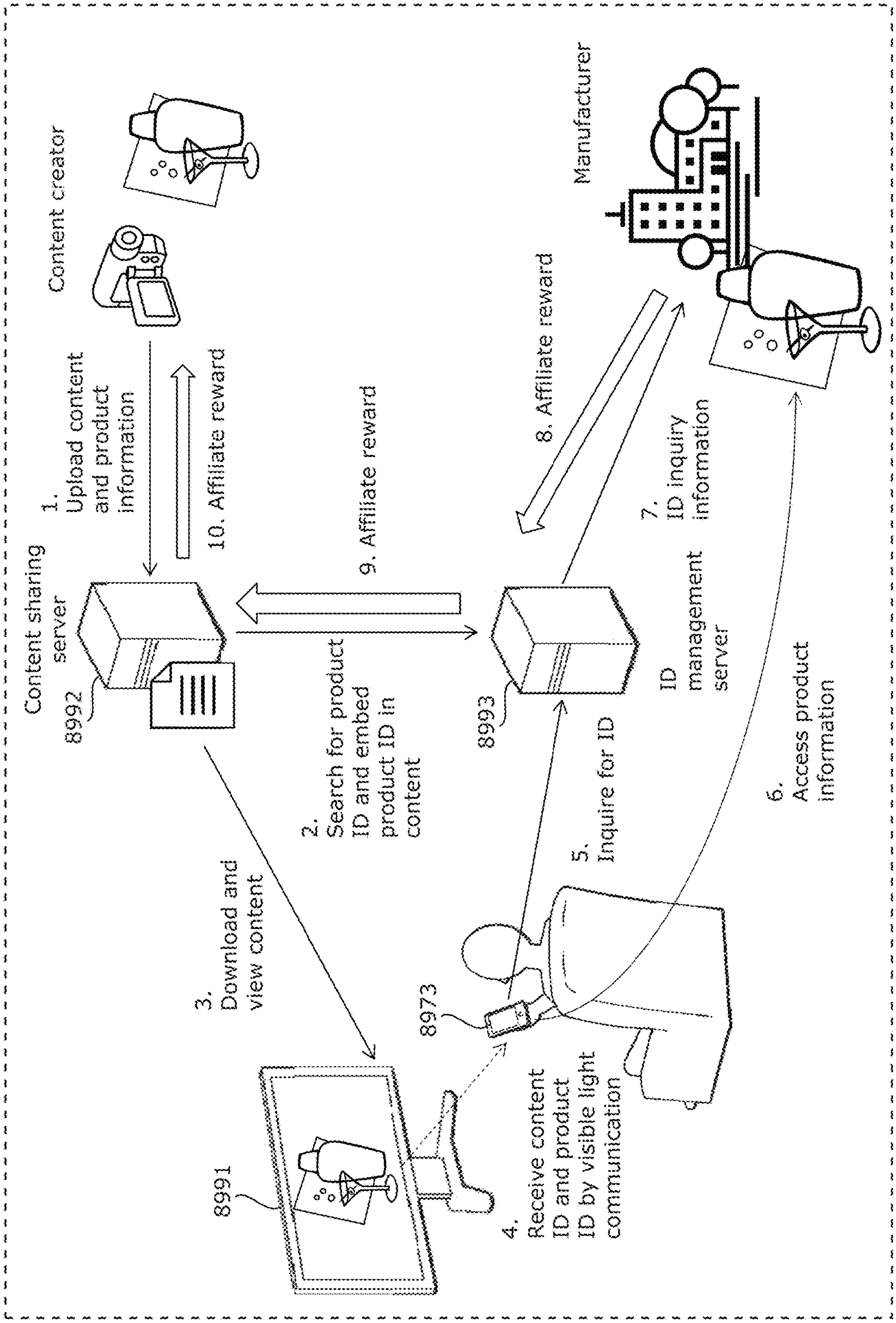
Figure 231:
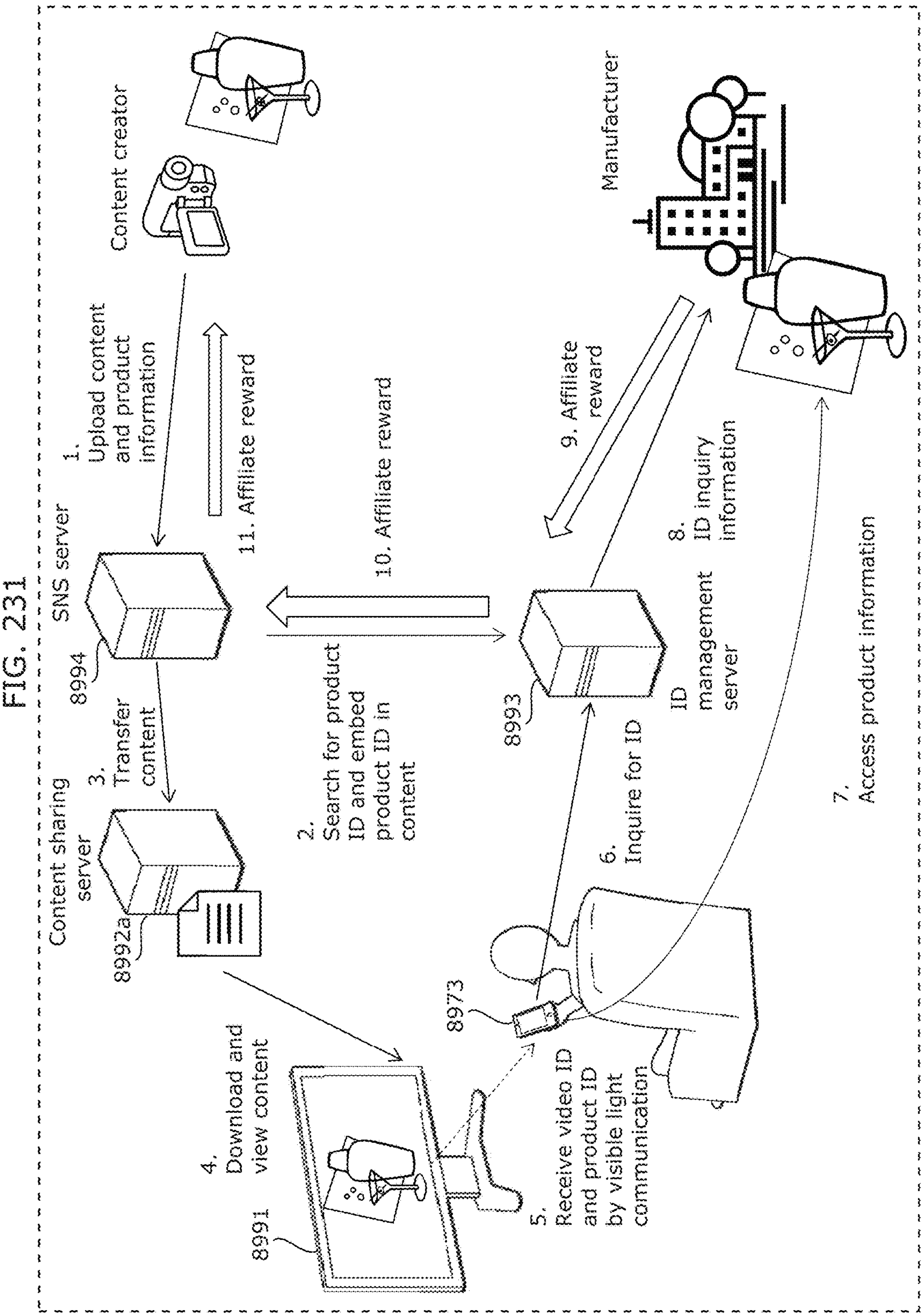
Figure 232:
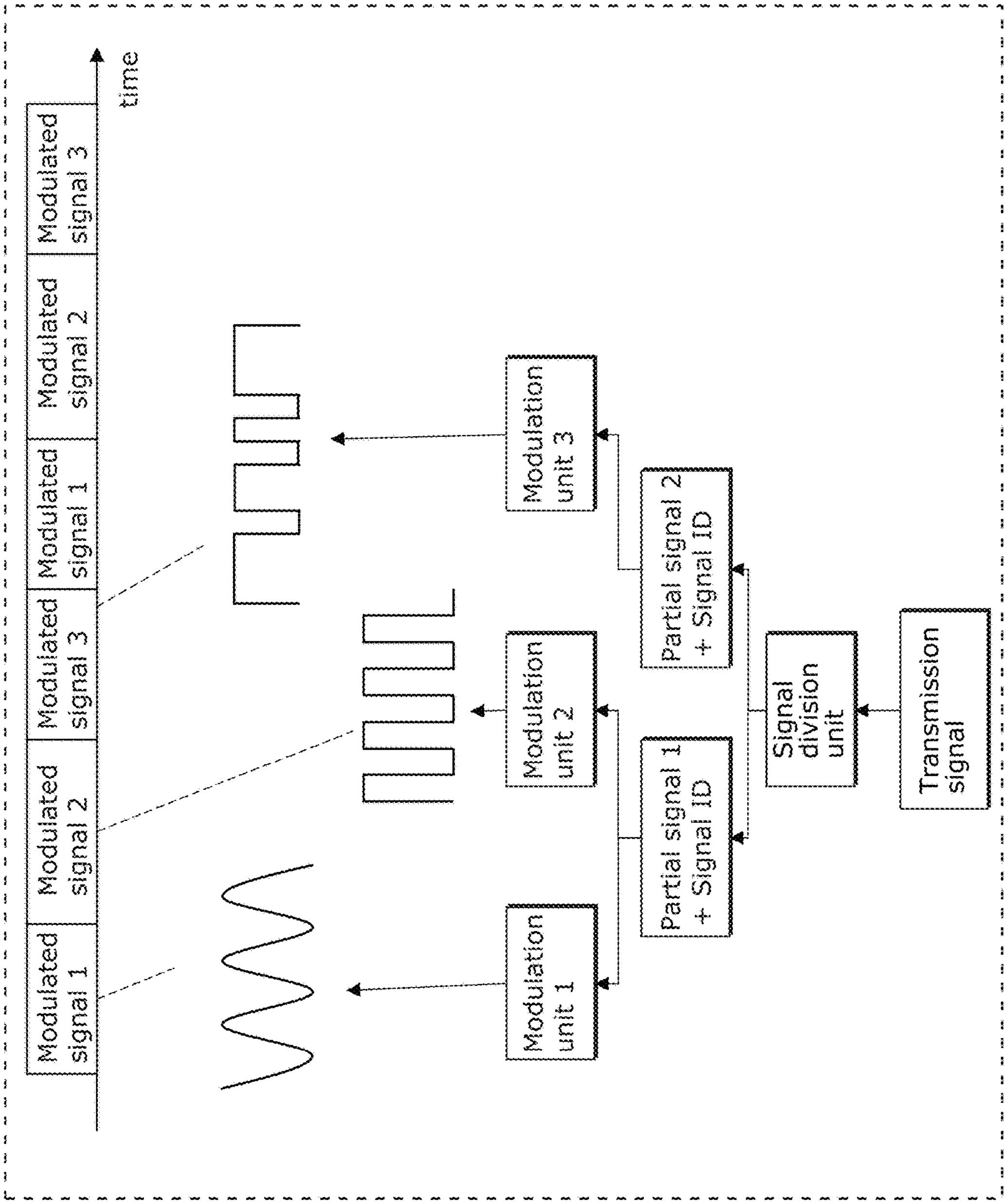
Figure 233:
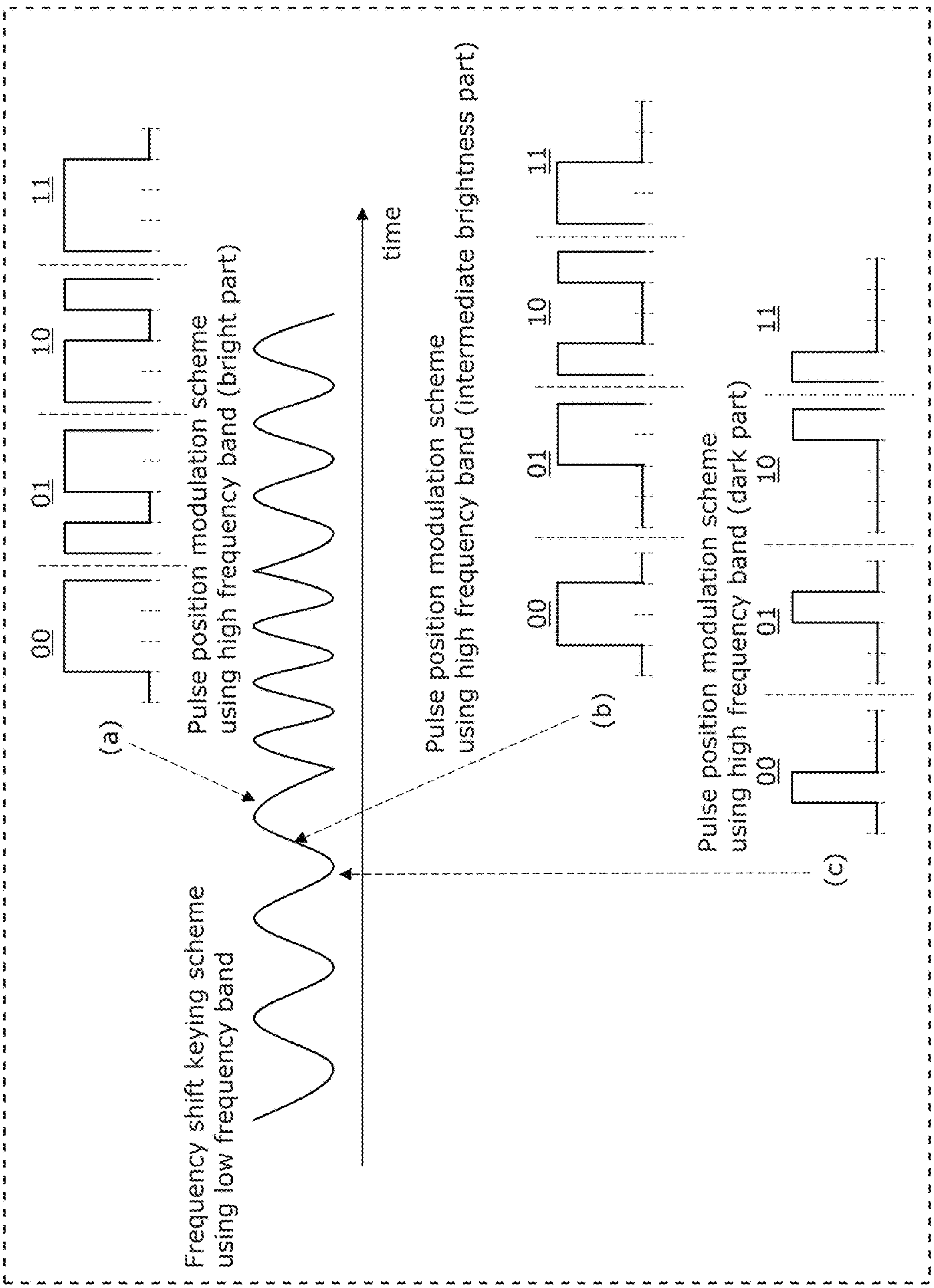
Figure 234:
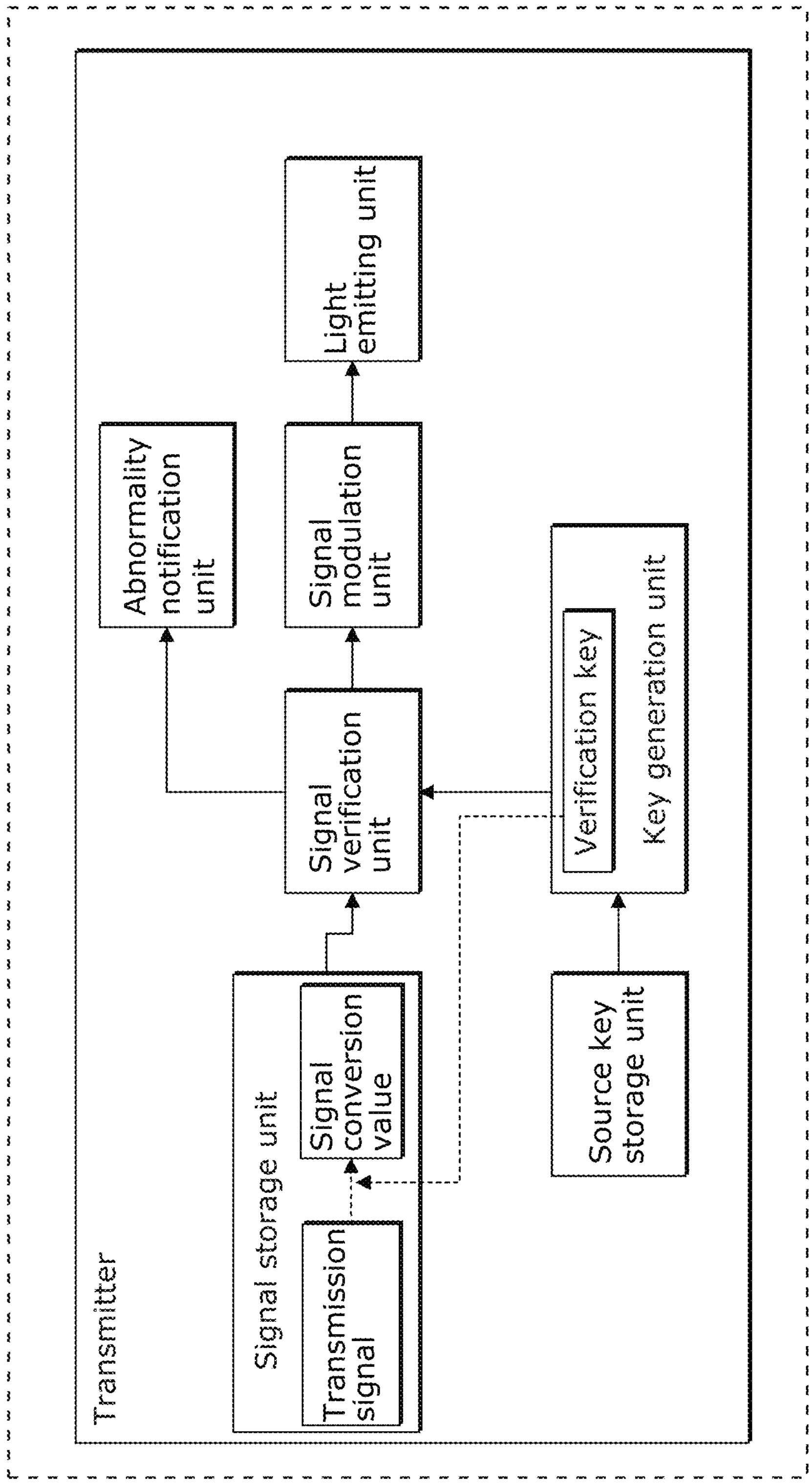
Figure 235:
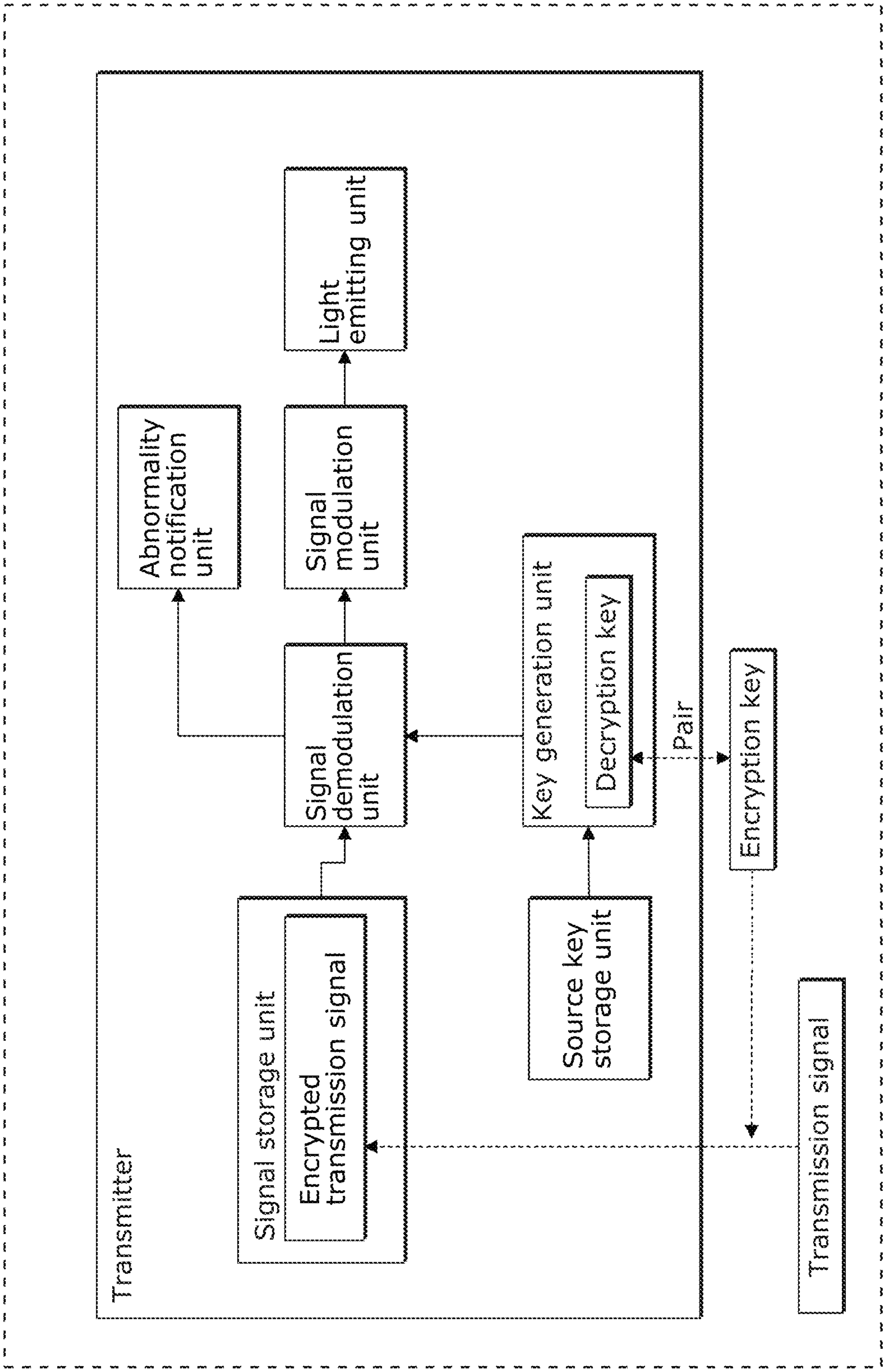
Figure 236:
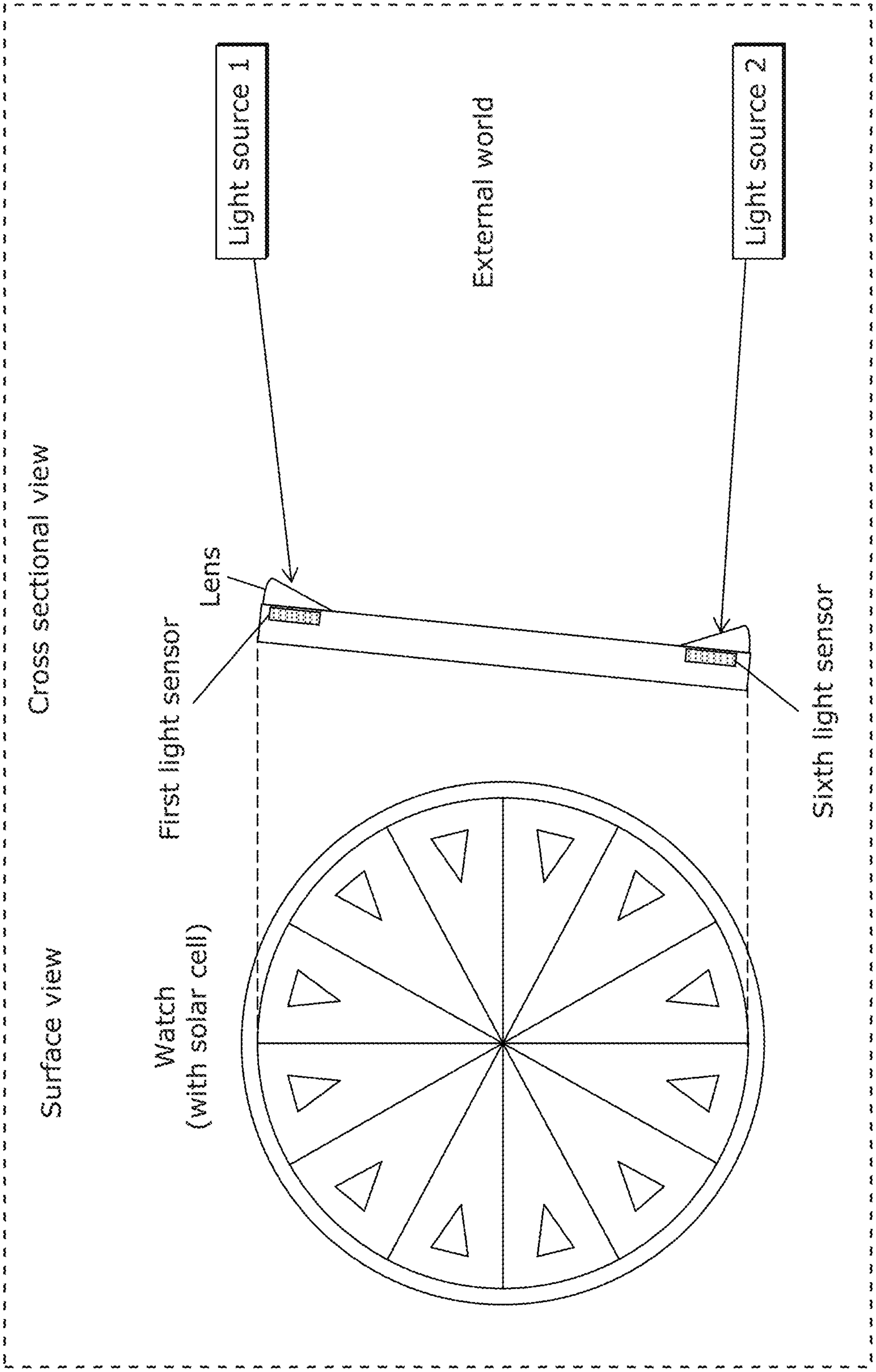
Figure 237:
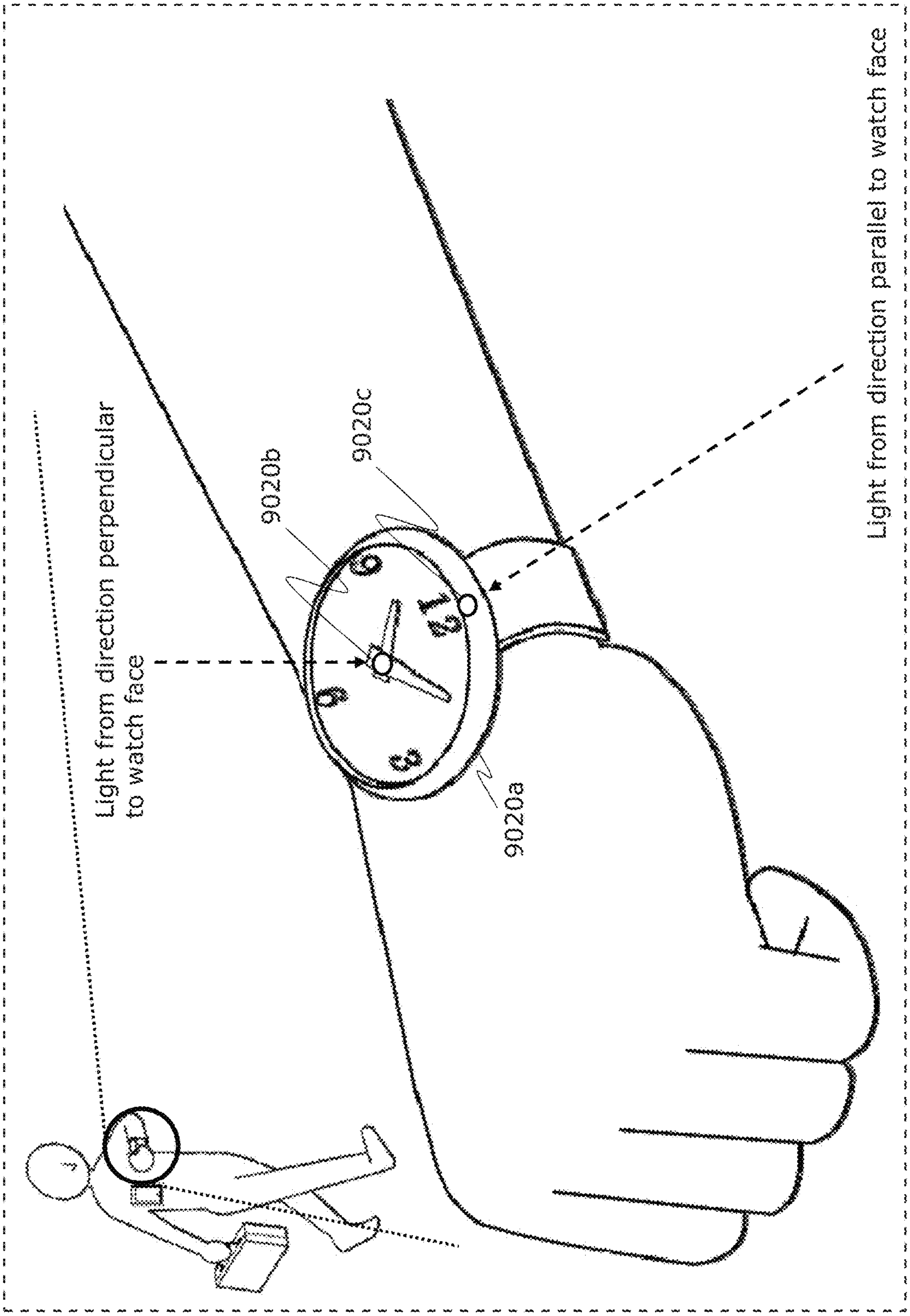
Figure 238:
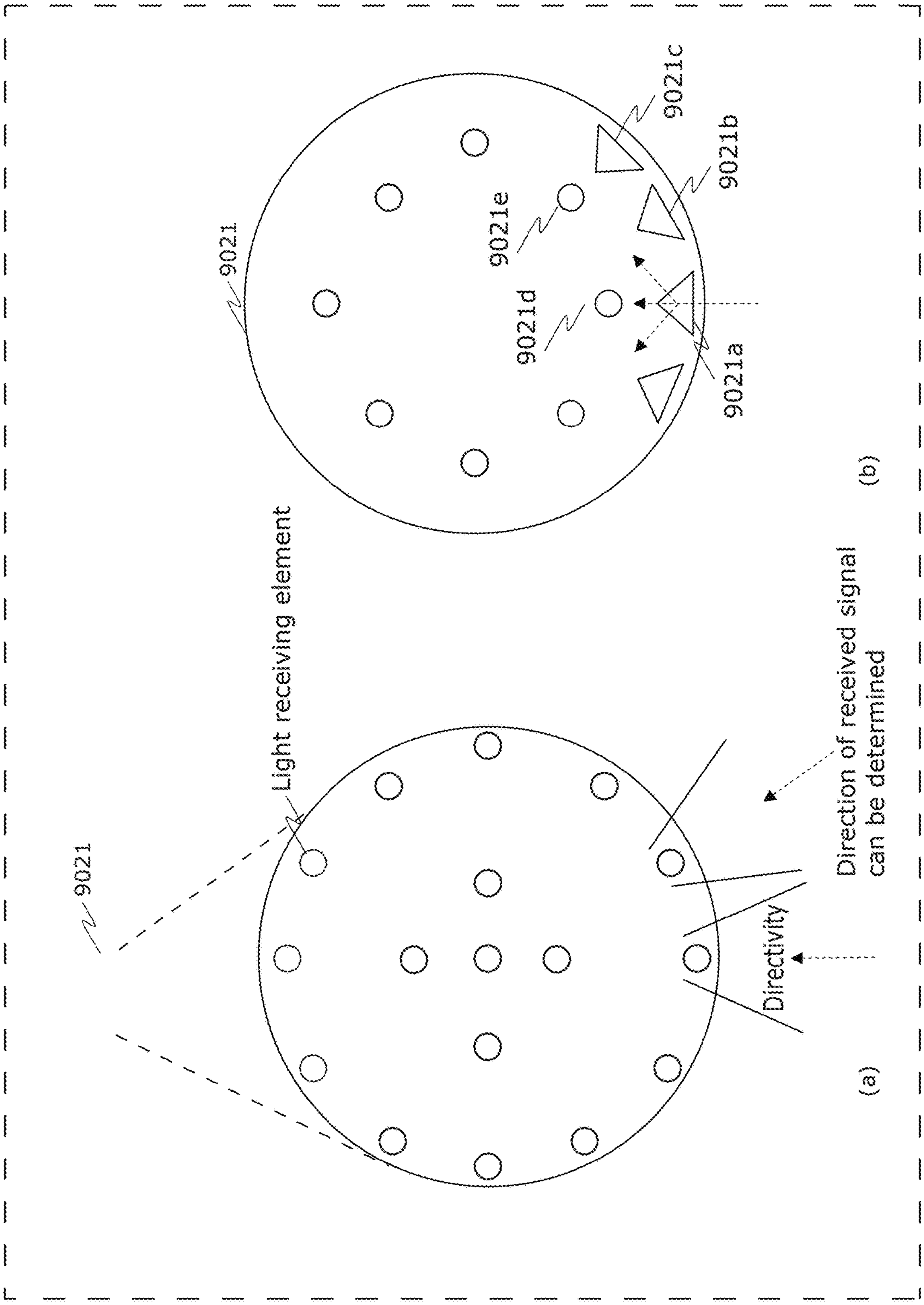
Figure 239A:
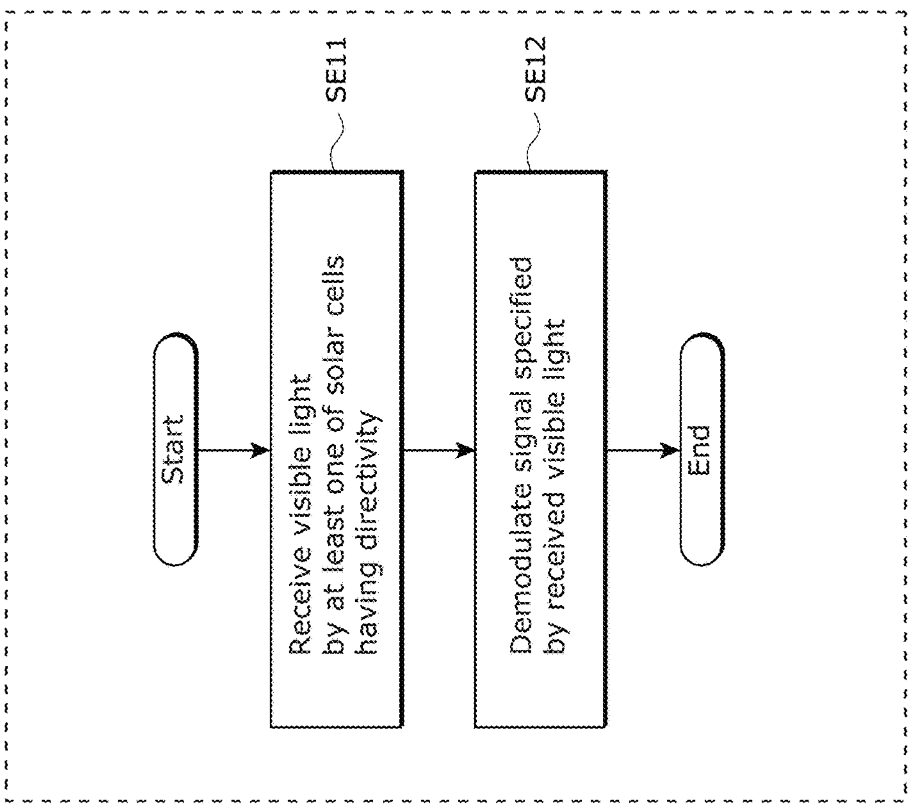
Figure 239B:
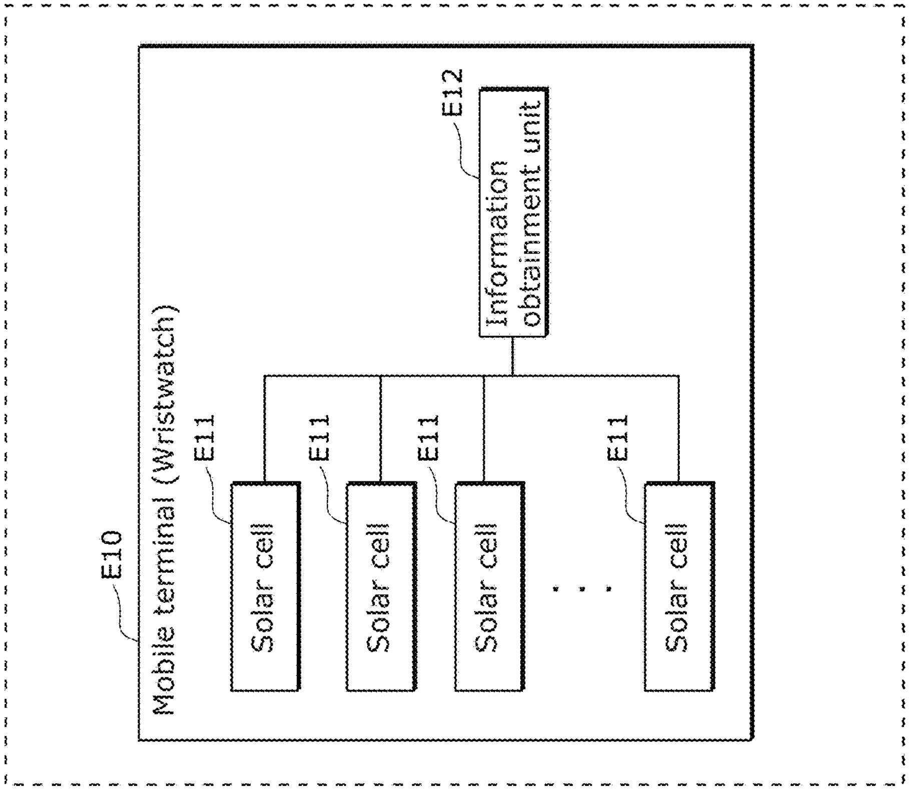
Figure 240:
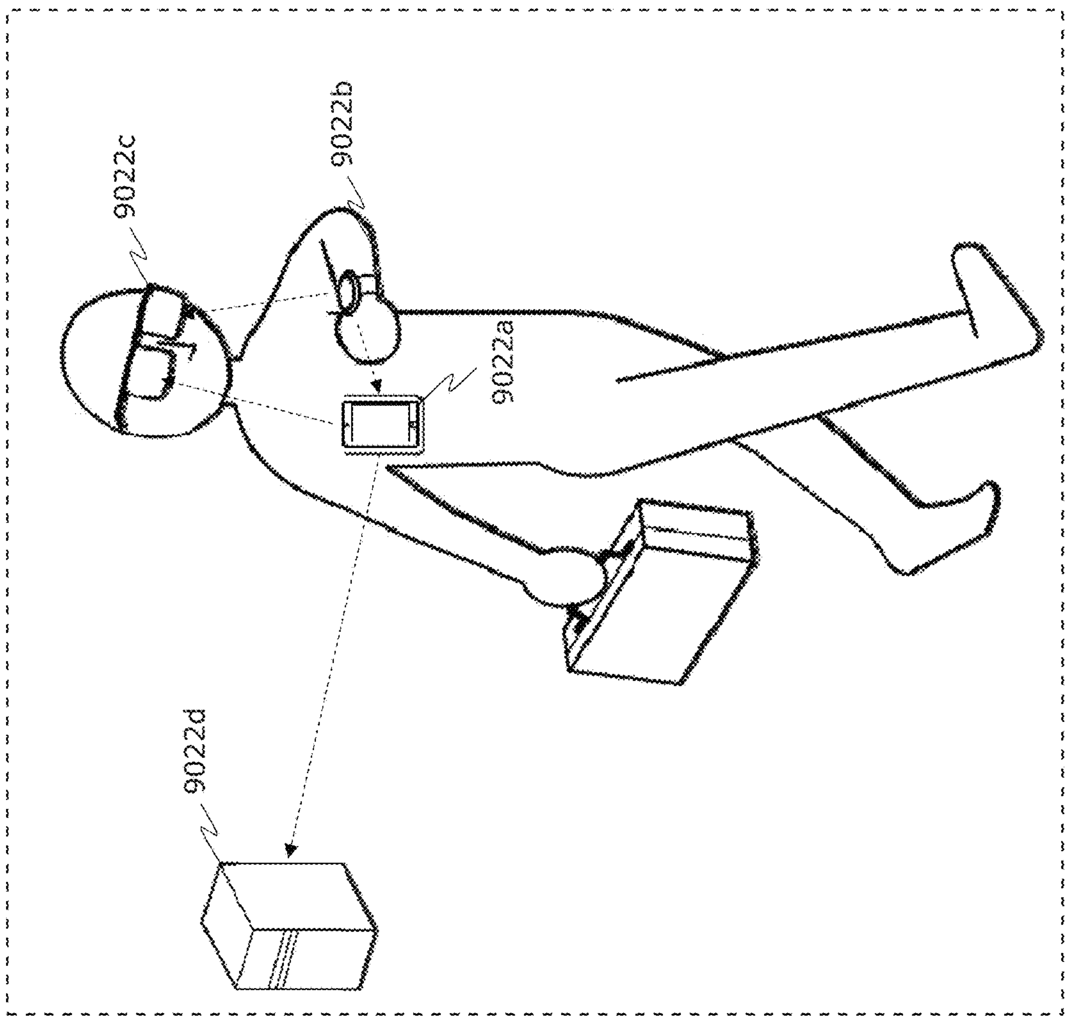
Figure 241:
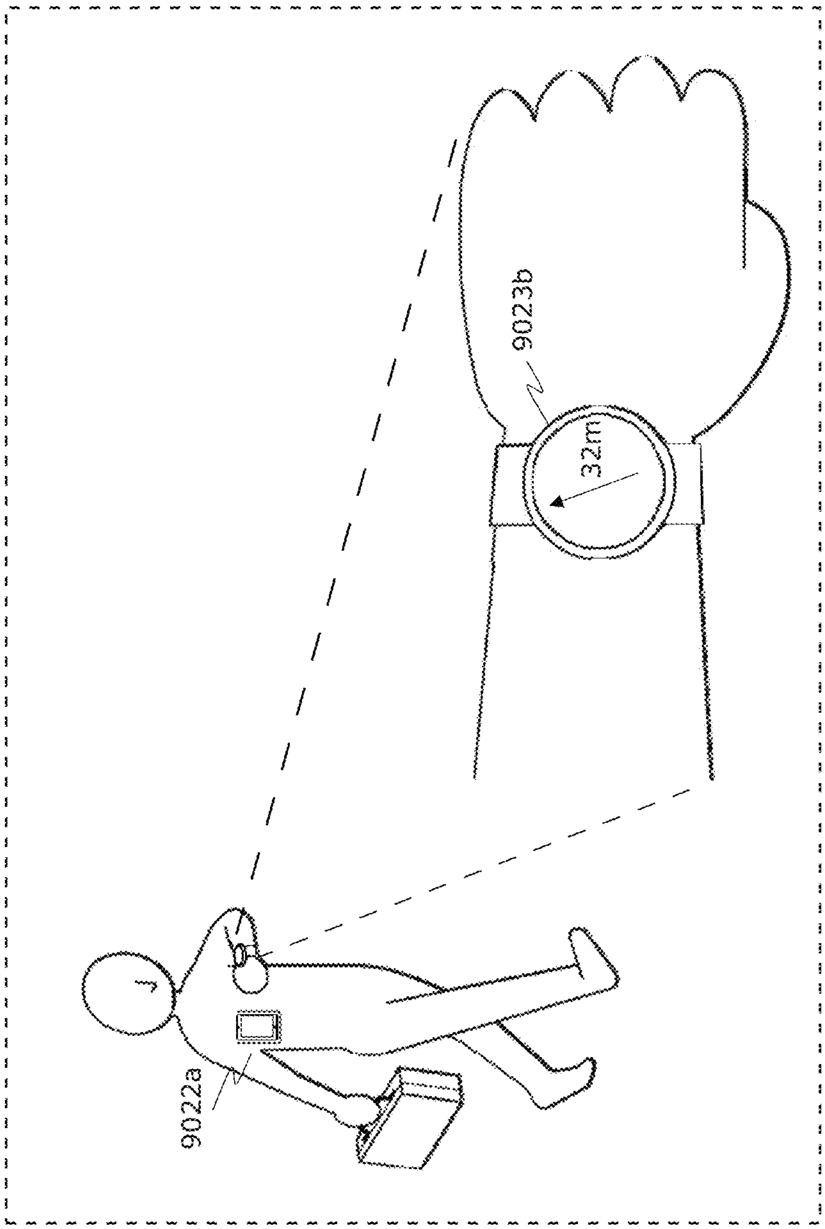
Figure 242A:
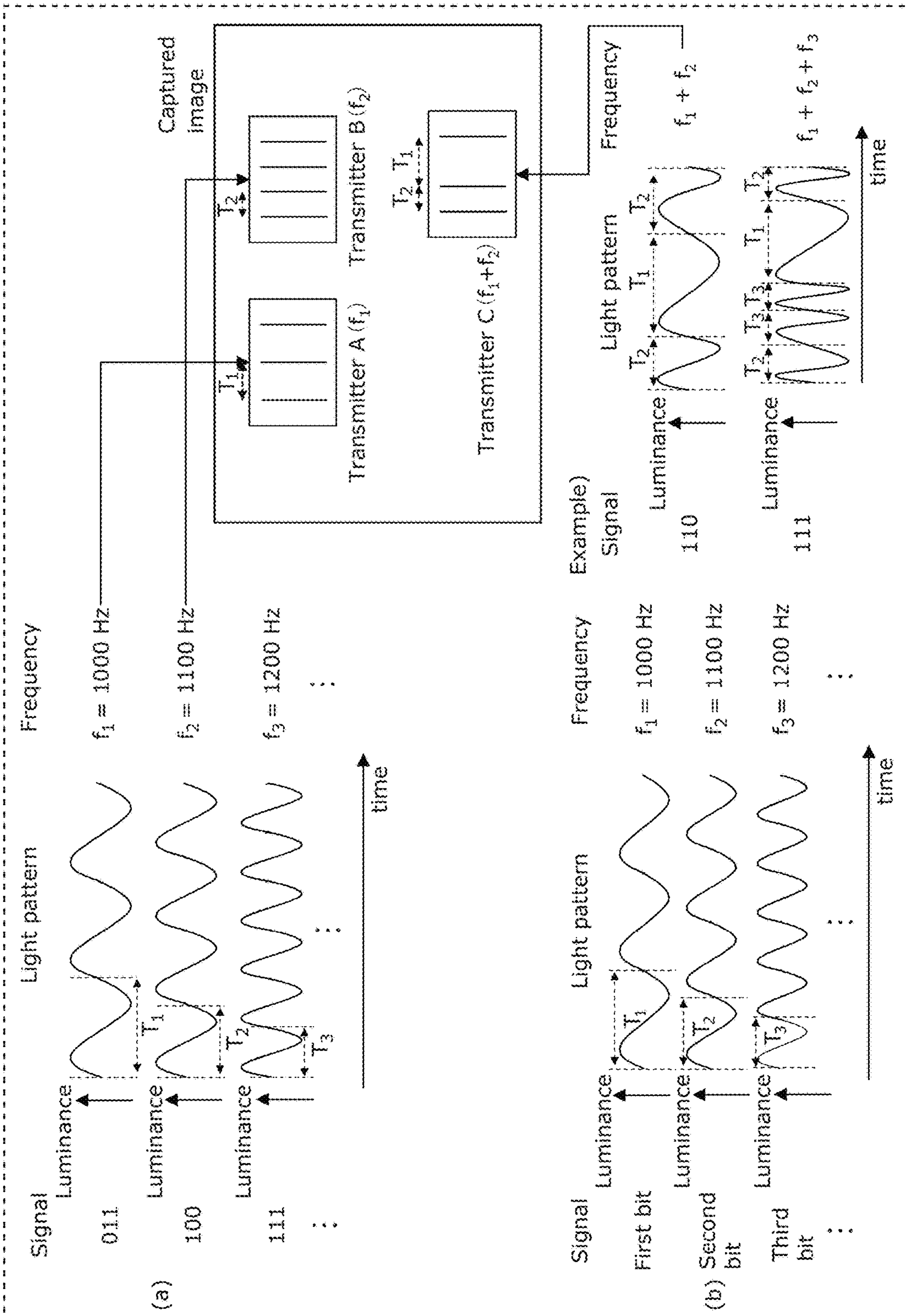
Figure 242B:
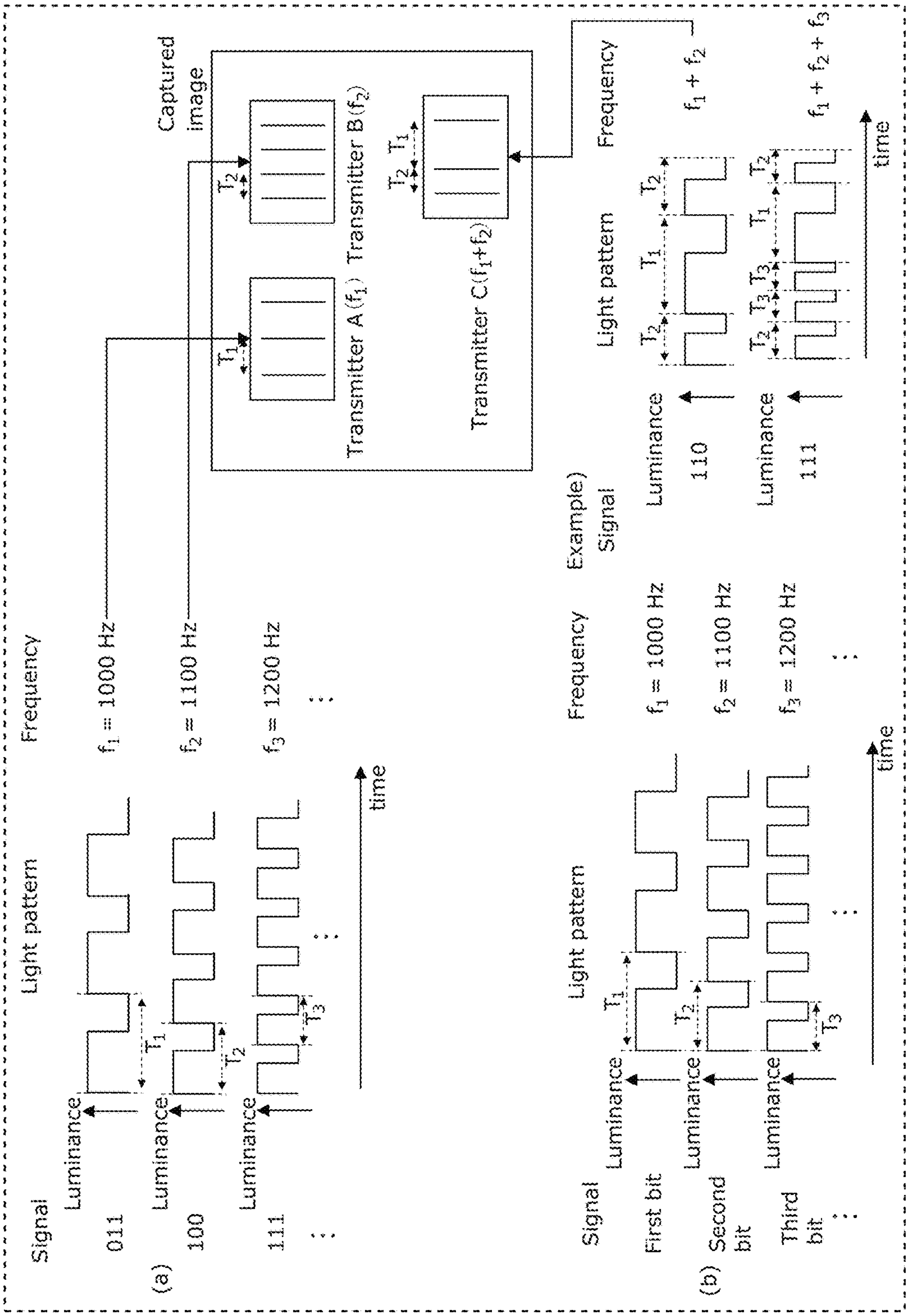
Figure 242C:
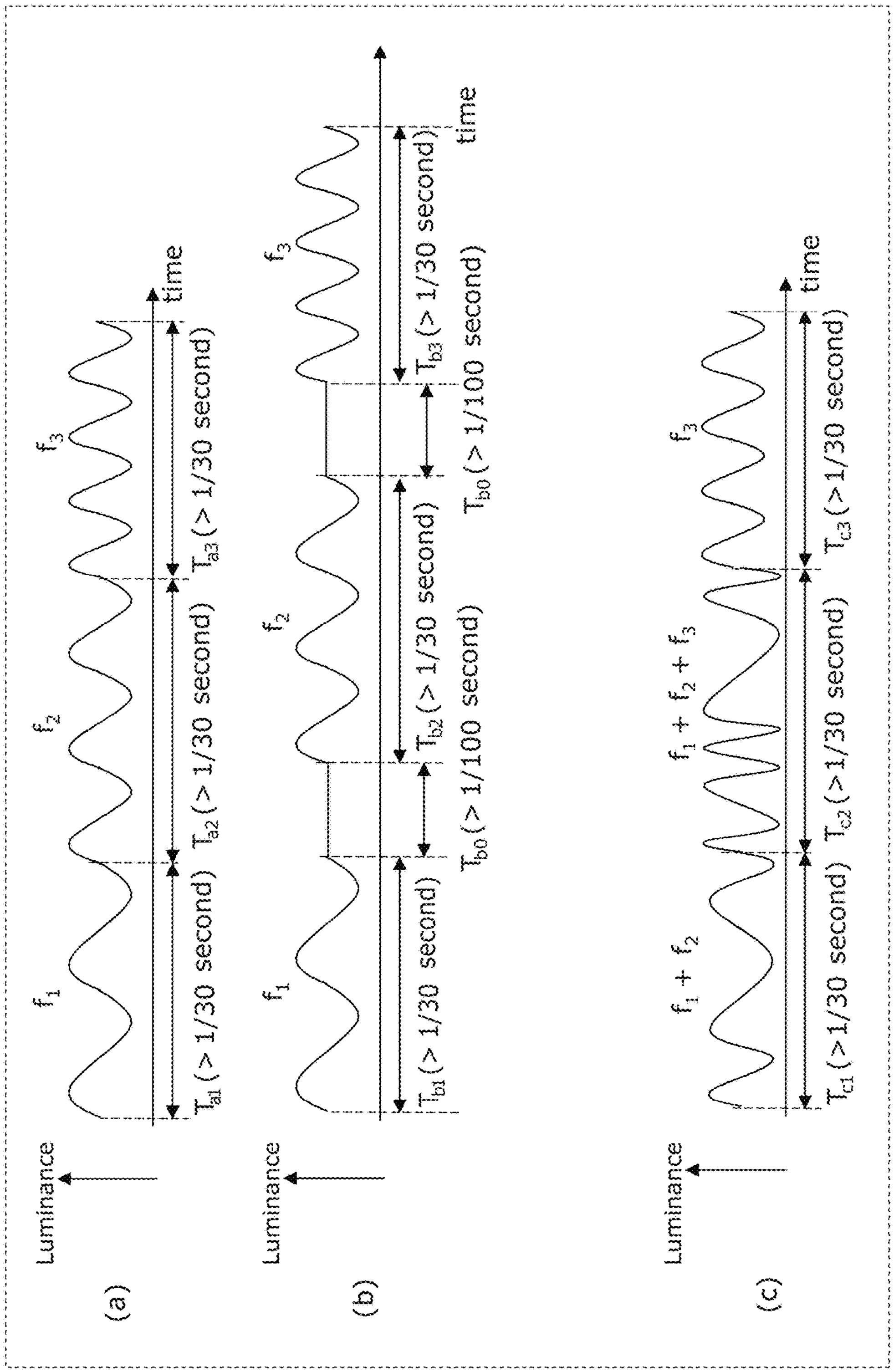
Figure 242D:
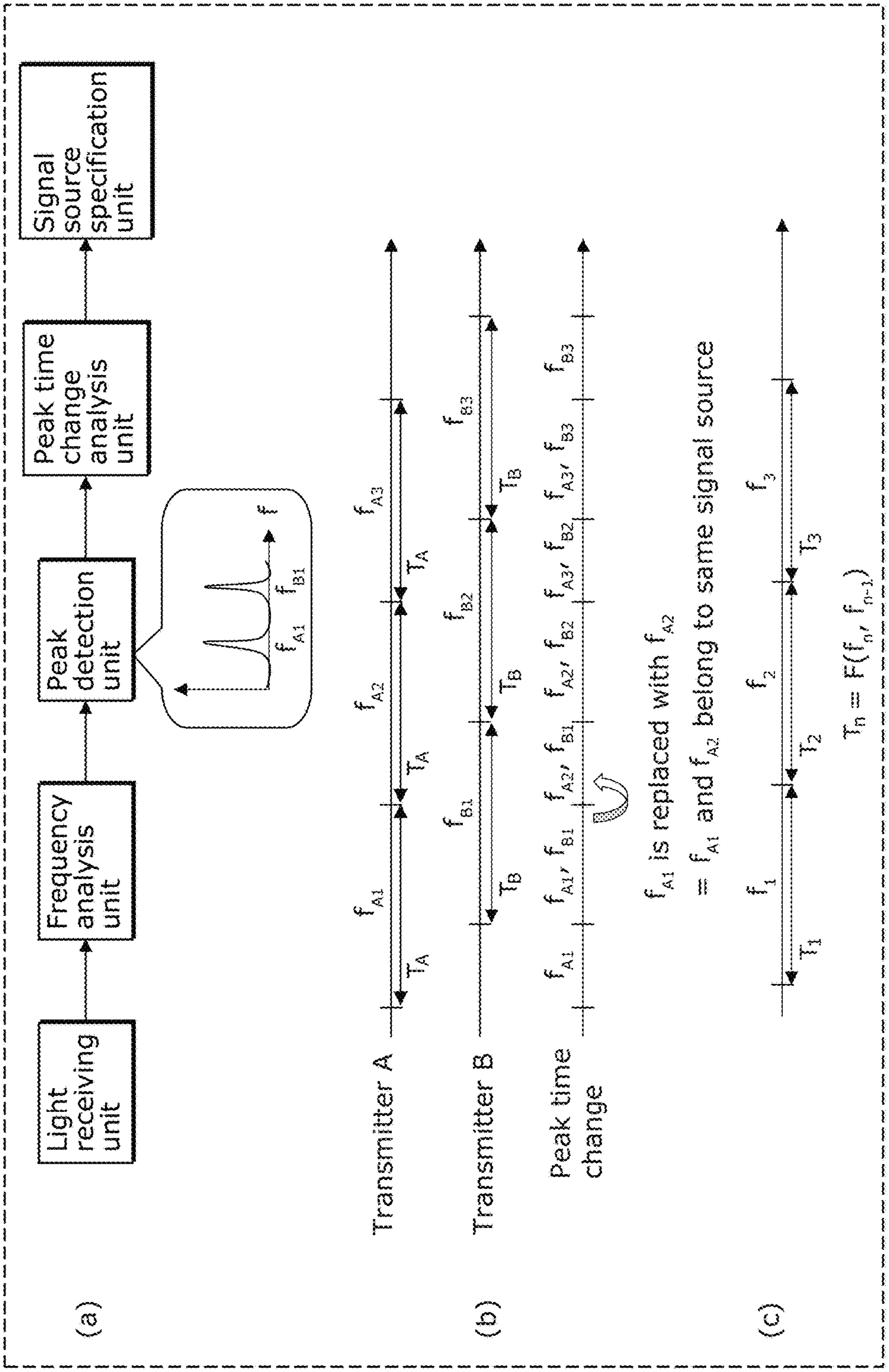
Figure 242E:
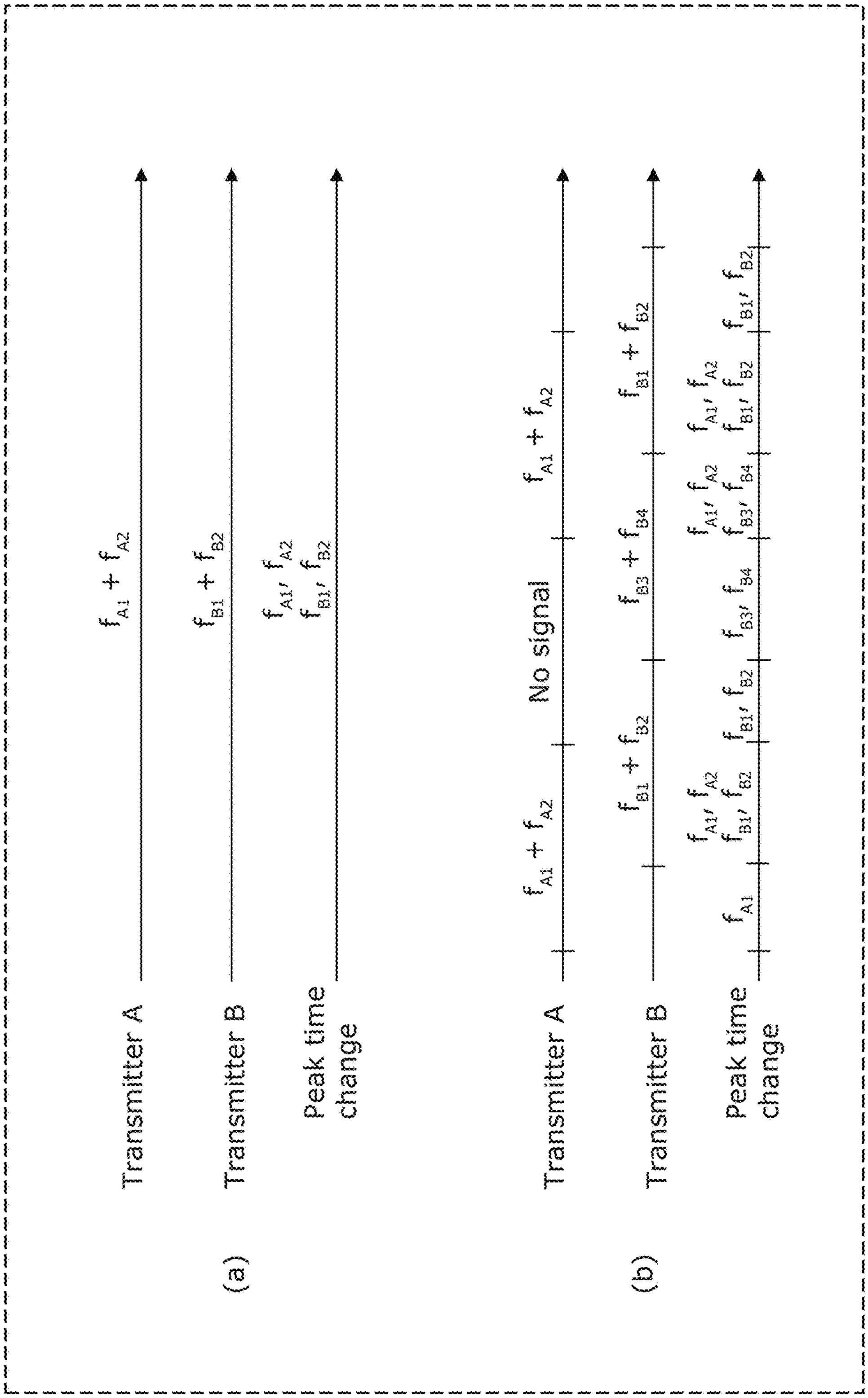
Figure 242F:
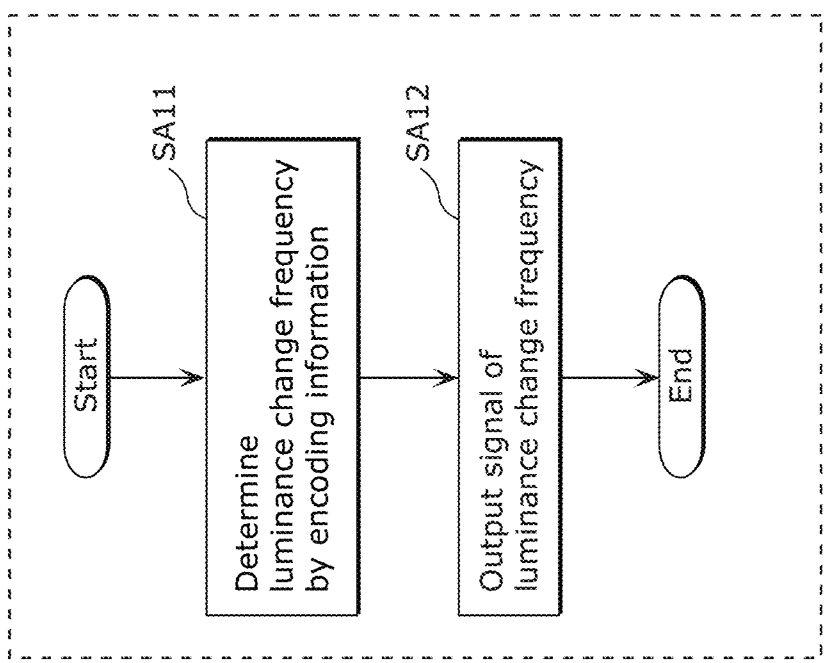
Figure 242G:
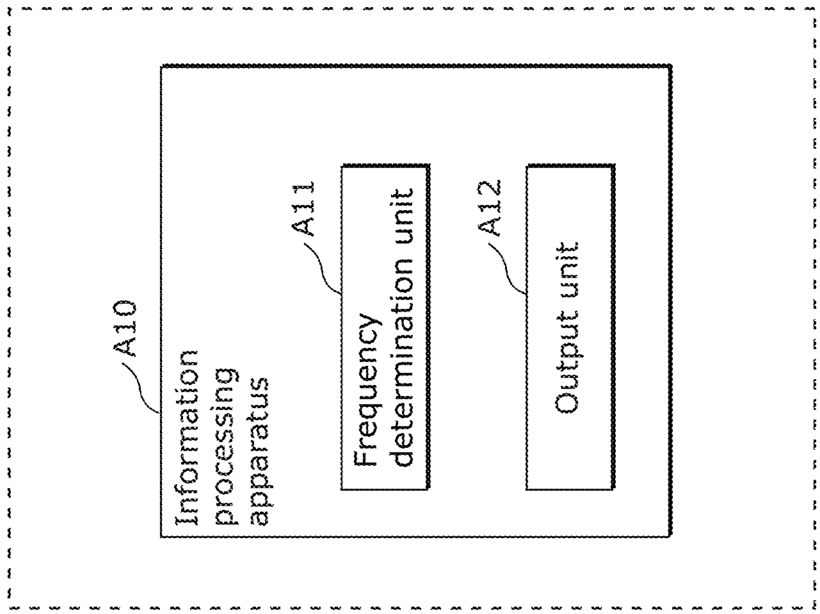
Figure 243A:
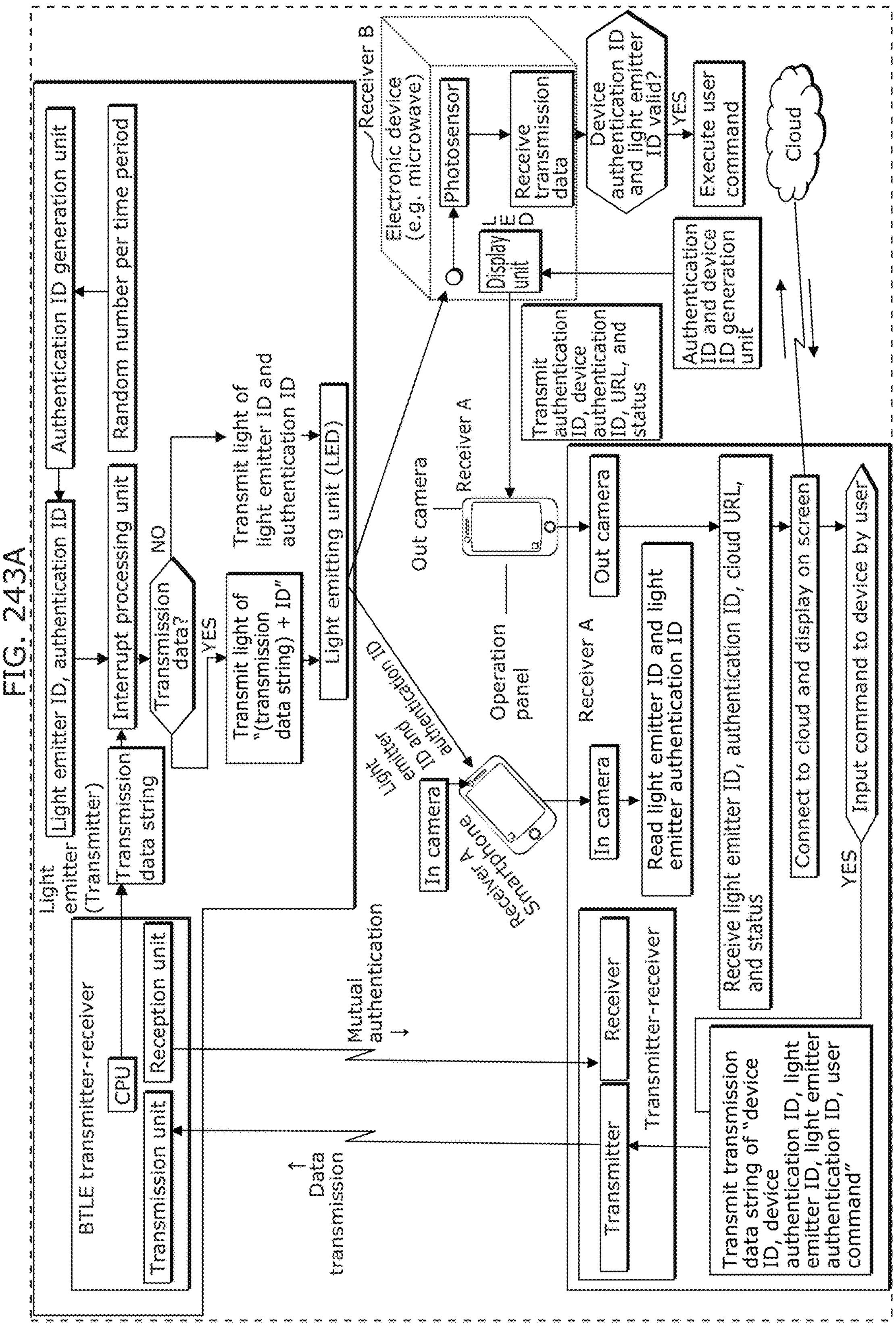
Figure 243B:
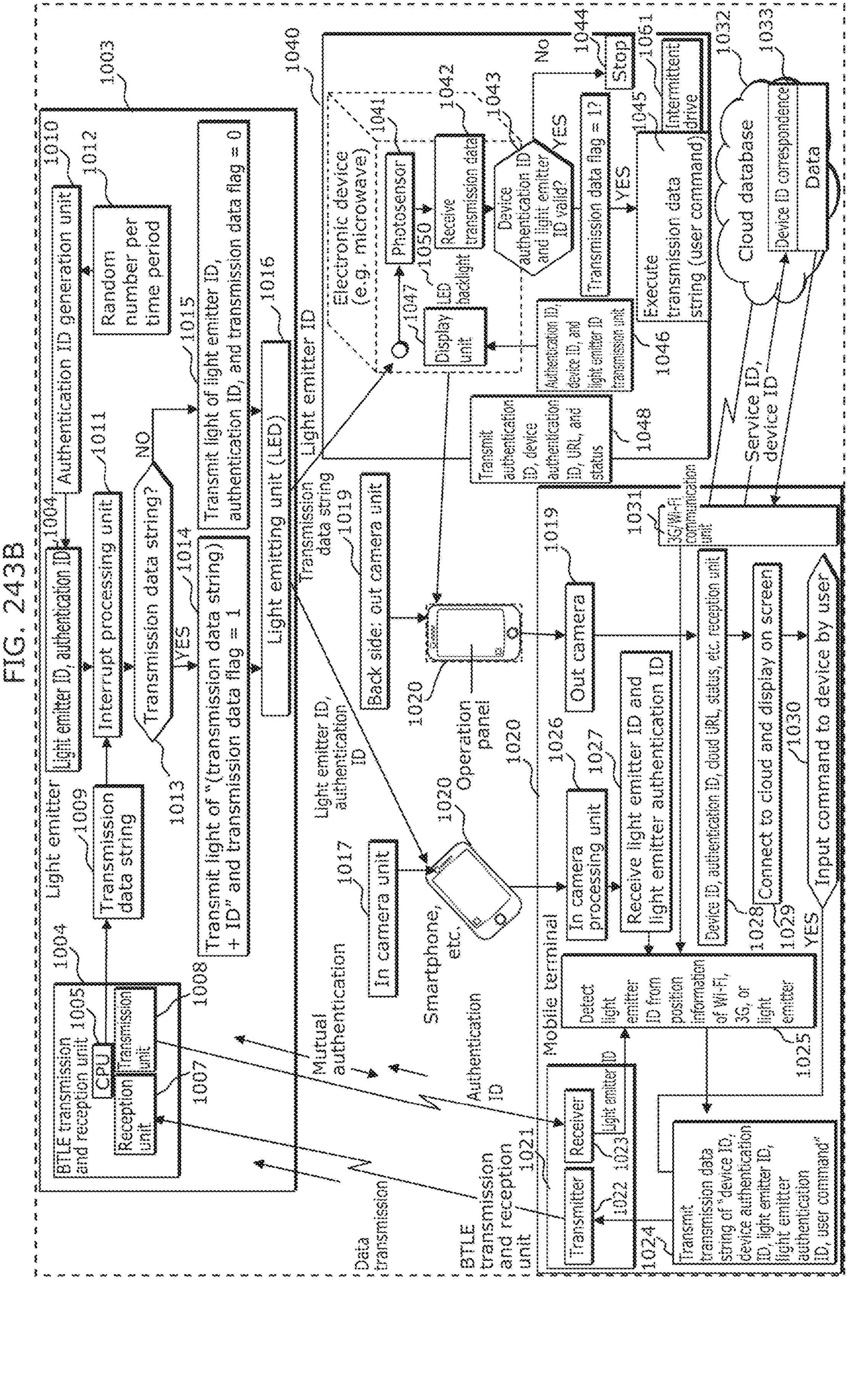
Figure 243C:
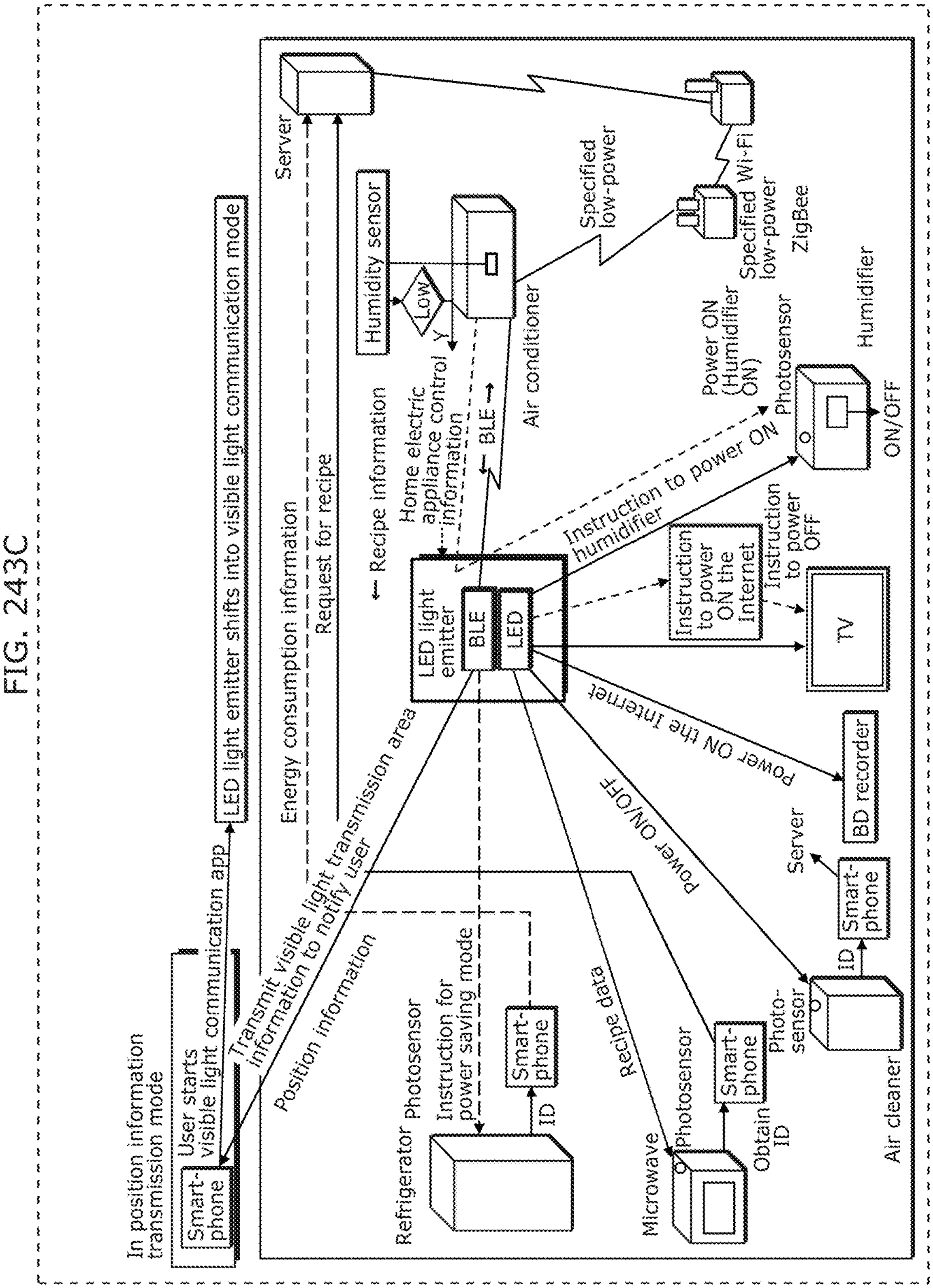
Figure 244:
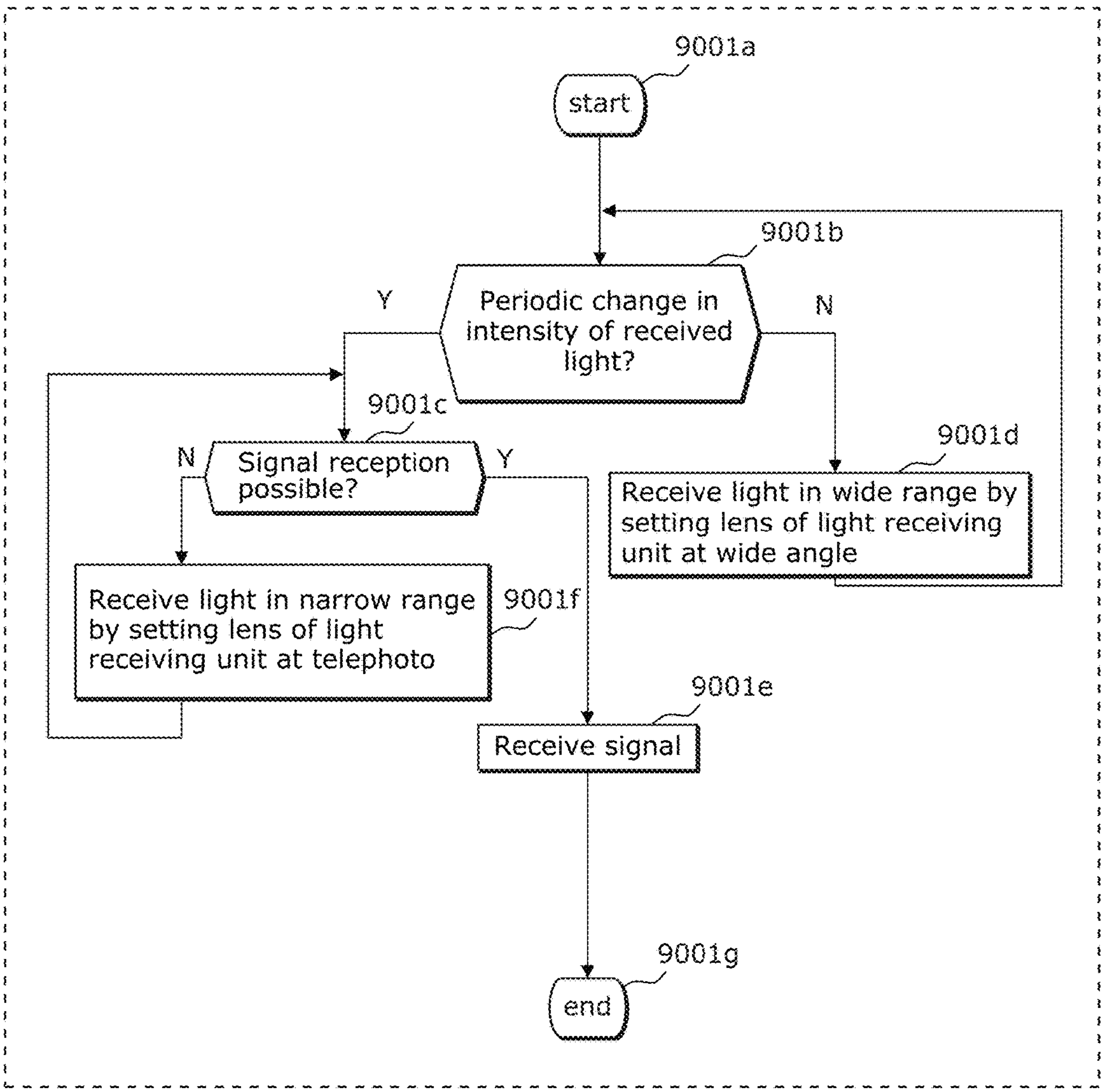
Figure 245:
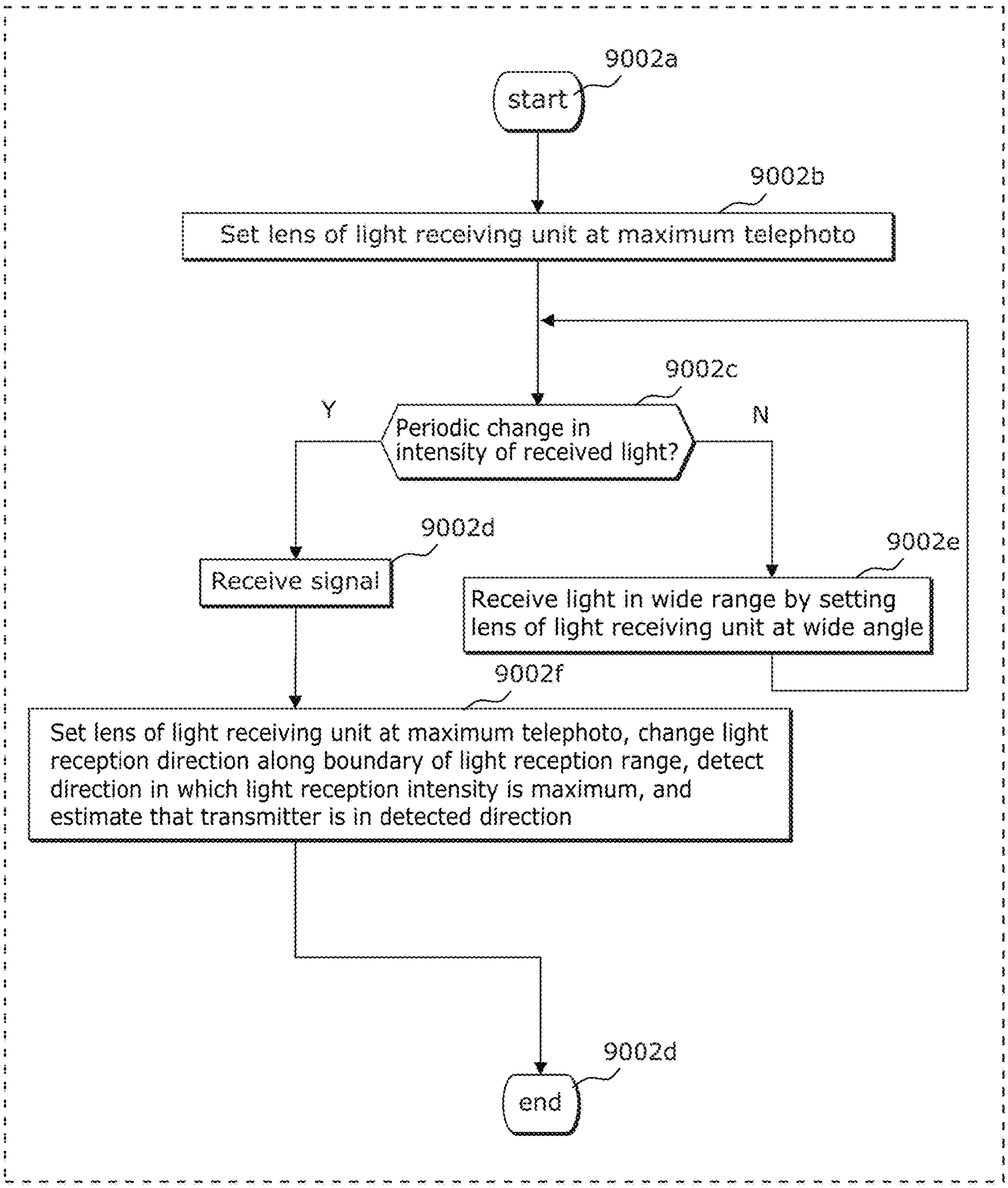
Figure 246:
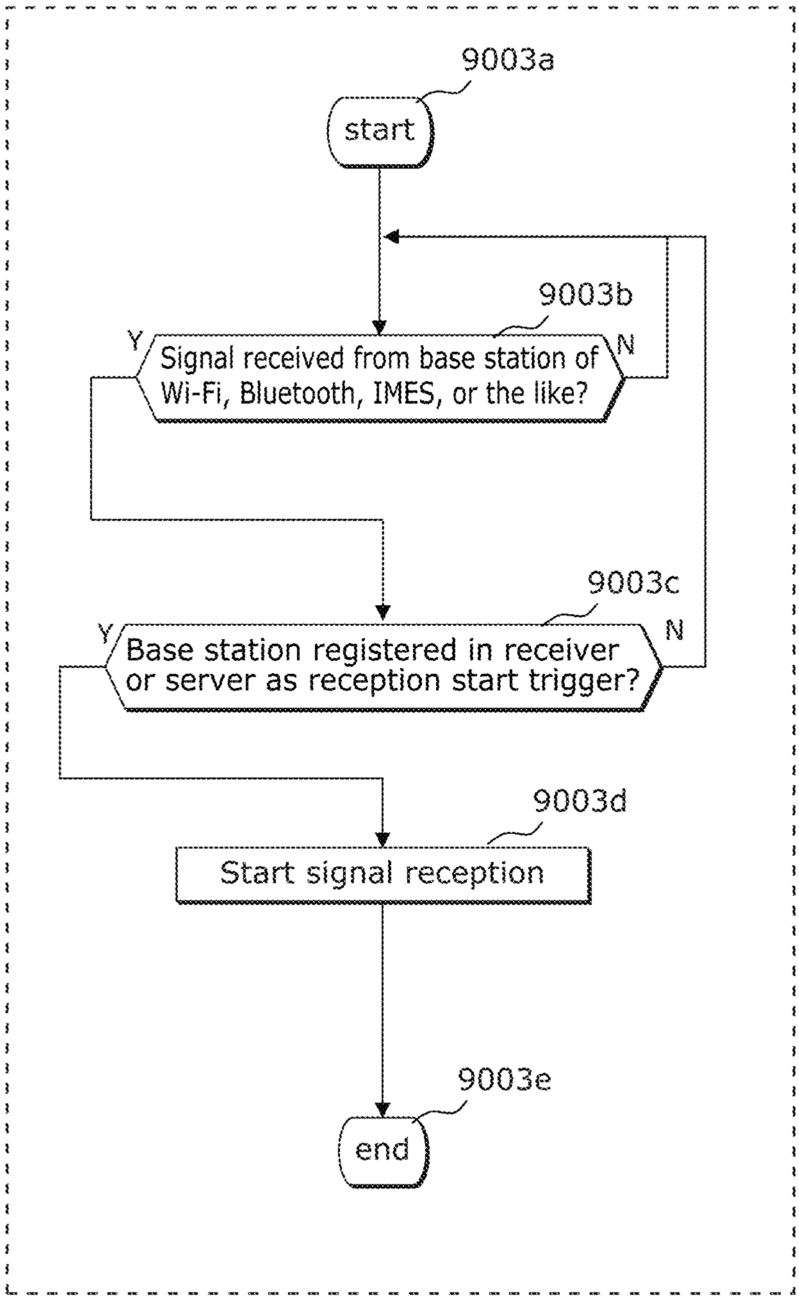
Figure 247:
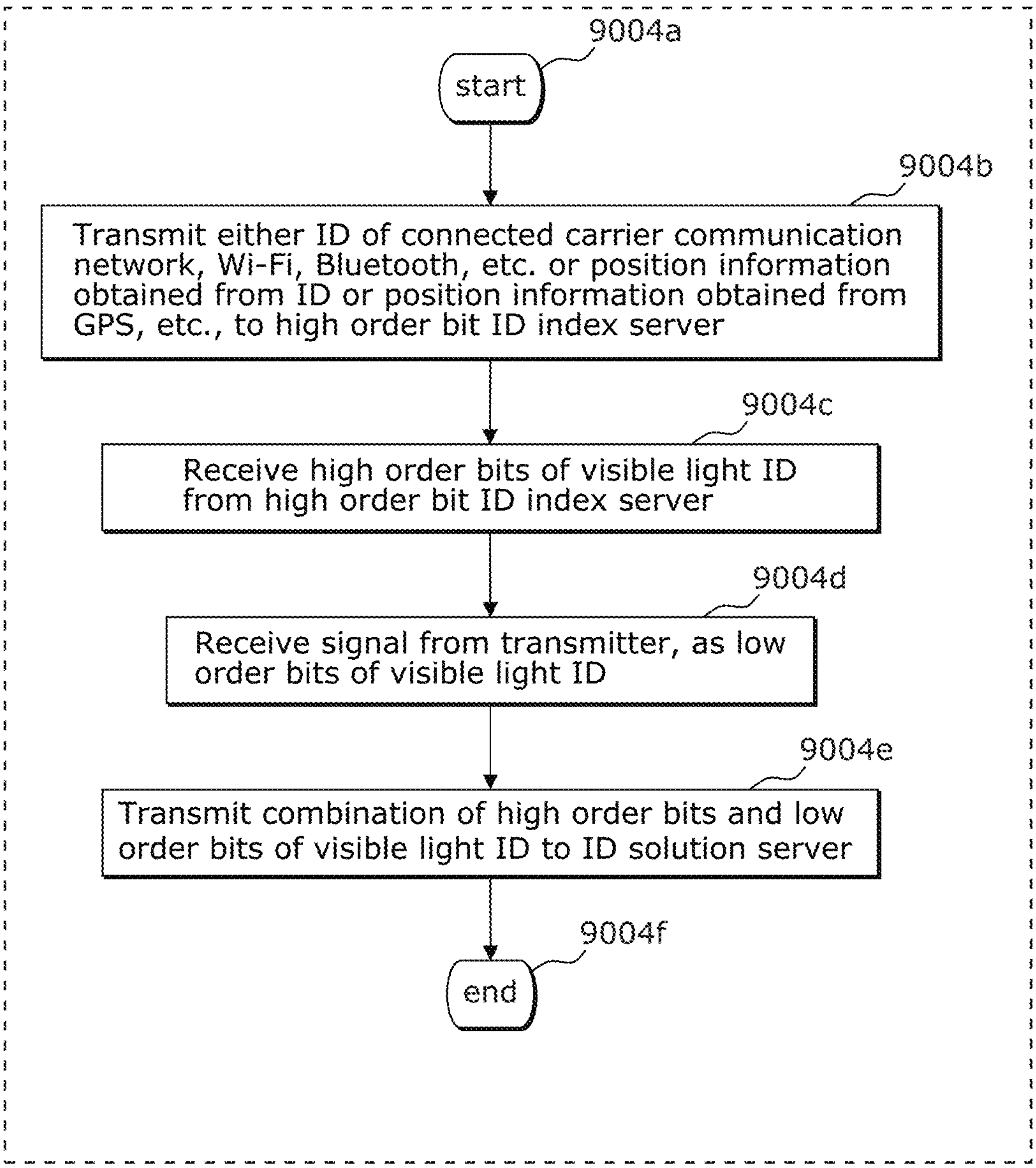
Figure 248:
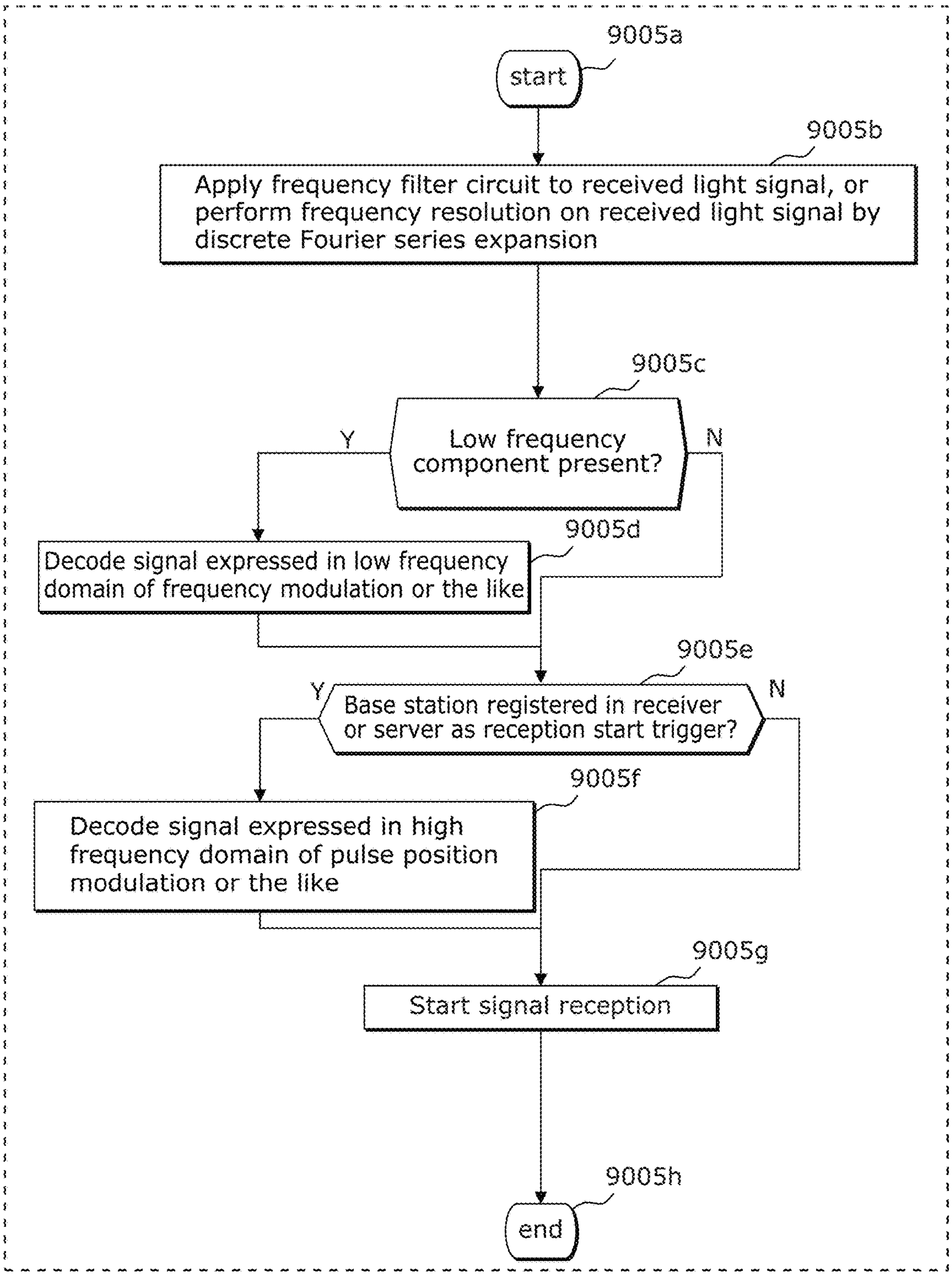

FIG. 162A is a diagram illustrating an example of an image (bright line image) captured by a receiver in Embodiment 6;

FIG. 162B is a diagram illustrating an example of an image (bright line image) captured by a receiver in Embodiment 6;

FIG. 163A is a diagram illustrating an example of an image (bright line image) captured by a receiver in Embodiment 6;

FIG. 163B is a diagram illustrating an example of an image (bright line image) captured by a receiver in Embodiment 6;

FIG. 163C is a diagram illustrating an example of an image (bright line image) captured by a receiver in Embodiment 6;

FIG. 164 is a diagram illustrating an example of an image (bright line image) captured by a receiver in Embodiment 6;

FIG. 165 is a diagram illustrating an example of a transmission signal in Embodiment 6;

FIG. 166 is a diagram illustrating an example of operation of a receiver in Embodiment 6;

FIG. 167 is a diagram illustrating an example of an instruction to a user displayed on a screen of a receiver in Embodiment 6;

FIG. 168 is a diagram illustrating an example of an instruction to a user displayed on a screen of a receiver in Embodiment 6;

FIG. 169 is a diagram illustrating an example of a signal transmission method in Embodiment 6;

FIG. 170 is a diagram illustrating an example of a signal transmission method in Embodiment 6;

FIG. 171 is a diagram illustrating an example of a signal transmission method in Embodiment 6;

FIG. 172 is a diagram illustrating an example of a signal transmission method in Embodiment 6;

FIG. 173 is a diagram illustrating a service provision system using the reception method described in any of the foregoing embodiments;

FIG. 174 is a flowchart illustrating service provision flow;

FIG. 175 is a flowchart illustrating service provision in another example;

FIG. 176 is a flowchart illustrating service provision in another example;

FIG. 177A is a diagram for describing a modulation scheme that facilitates reception in Embodiment 8;

FIG. 177B is a diagram for describing a modulation scheme that facilitates reception in Embodiment 8;

FIG. 178 is a diagram for describing a modulation scheme that facilitates reception in Embodiment 8;

FIG. 179 is a diagram for describing communication using bright lines and image recognition in Embodiment 8;

FIG. 180A is a diagram for describing an imaging element use method suitable for visible light signal reception in Embodiment 8;

FIG. 180B is a diagram for describing an imaging element use method suitable for visible light signal reception in Embodiment 8;

FIG. 180C is a diagram for describing an imaging element use method suitable for visible light signal reception in Embodiment 8;

FIG. 180D is a diagram for describing an imaging element use method suitable for visible light signal reception in Embodiment 8;

FIG. 180E is a flowchart for describing an imaging element use method suitable for visible light signal reception in Embodiment 8;

FIG. 181 is a diagram illustrating a captured image size suitable for visible light signal reception in Embodiment 8;

FIG. 182A is a diagram illustrating a captured image size suitable for visible light signal reception in Embodiment 8;

FIG. 182B is a flowchart illustrating operation for switching to a captured image size suitable for visible light signal reception in Embodiment 8;

FIG. 182C is a flowchart illustrating operation for switching to a captured image size suitable for visible light signal reception in Embodiment 8;

FIG. 183 is a diagram for describing visible light signal reception using zoom in Embodiment 8;

FIG. 184 is a diagram for describing an image data size reduction method suitable for visible light signal reception in Embodiment 8;

FIG. 185 is a diagram for describing a modulation scheme with high reception error detection accuracy in Embodiment 8;

FIG. 186 is a diagram for describing a change of operation of a receiver according to situation in Embodiment 8;

FIG. 187 is a diagram for describing notification of visible light communication to humans in Embodiment 8;

FIG. 188 is a diagram for describing expansion in reception range by a diffusion plate in Embodiment 8;

FIG. 189 is a diagram for describing a method of synchronizing signal transmission from a plurality of projectors in Embodiment 8;

FIG. 190 is a diagram for describing a method of synchronizing signal transmission from a plurality of displays in Embodiment 8;

FIG. 191 is a diagram for describing visible light signal reception by an illuminance sensor and an image sensor in Embodiment 8;

FIG. 192 is a diagram for describing a reception start trigger in Embodiment 8;

FIG. 193 is a diagram for describing a reception start gesture in Embodiment 8;

FIG. 194 is a diagram for describing an example of application to a car navigation system in Embodiment 8;

FIG. 195 is a diagram for describing an example of application to a car navigation system in Embodiment 8;

FIG. 196 is a diagram for describing an example of application to content protection system in Embodiment 8;

FIG. 197A is a diagram for describing an example of application to an electronic lock in Embodiment 8;

FIG. 197B is a flowchart of an information communication method in Embodiment 8;

FIG. 197C is a block diagram of an information communication device in Embodiment 8;

FIG. 198 is a diagram for describing an example of application to store visit information transmission in Embodiment 8;

FIG. 199 is a diagram for describing an example of application to location-dependent order control in Embodiment 8;

FIG. 200 is a diagram for describing an example of application to route guidance in Embodiment 8;

FIG. 201 is a diagram for describing an example of application to location notification in Embodiment 8;

FIG. 202 is a diagram for describing an example of application to use log storage and analysis in Embodiment 8;

FIG. 203 is a diagram for describing an example of application to screen sharing in Embodiment 8;

FIG. 204 is a diagram for describing an example of application to screen sharing in Embodiment 8;

FIG. 205 is a diagram for describing an example of application to position estimation using a wireless access point in Embodiment 8;

FIG. 206 is a diagram illustrating a structure of performing position estimation by visible light communication and wireless communication in Embodiment 8;

FIG. 207 is a diagram illustrating an example of application of an information communication method in Embodiment 8;

FIG. 208 is a flowchart illustrating an example of application of an information communication method in Embodiment 8;

FIG. 209 is a flowchart illustrating an example of application of an information communication method in Embodiment 8;

FIG. 210 is a diagram illustrating an example of application of a transmitter and a receiver in Embodiment 9;

FIG. 211 is a diagram illustrating an example of application of a transmitter in Embodiment 9;

FIG. 212 is a flowchart of an information communication method in Embodiment 9;

FIG. 213 is a block diagram of an information communication device in Embodiment 9;

FIG. 214A is a diagram illustrating an example of application of a transmitter and a receiver in Embodiment 9;

FIG. 2148 is a flowchart illustrating an example of operation of a receiver in Embodiment 9;

FIG. 215 is a diagram illustrating an example of application of a transmitter and a receiver in Embodiment 9;

FIG. 216 is a diagram illustrating an example of application of a transmitter in Embodiment 9;

FIG. 217A is a diagram illustrating an example of application of a transmitter and a receiver in Embodiment 9;

FIG. 2178 is a flowchart illustrating an example of operation of a receiver in Embodiment 9;

FIG. 218 is a diagram illustrating operation of a receiver in Embodiment 9;

FIG. 219 is a diagram illustrating an example of application of a transmitter in Embodiment 9;

FIG. 220 is a diagram illustrating an example of application of a receiver in Embodiment 9;

FIG. 221A is a flowchart illustrating an example of operation of a transmitter in Embodiment 9;

FIG. 221B is a flowchart illustrating an example of operation of a transmitter in Embodiment 9;

FIG. 222 is a flowchart illustrating an example of operation of a transmitter in Embodiment 9;

FIG. 223 is a flowchart illustrating an example of operation of an imaging device in Embodiment 9;

FIG. 224 is a flowchart illustrating an example of operation of an imaging device in Embodiment 9;

FIG. 225 is a diagram illustrating an example of a signal transmitted by a transmitter in Embodiment 9;

FIG. 226 is a diagram illustrating an example of a signal transmitted by a transmitter in Embodiment 9;

FIG. 227 is a diagram illustrating an example of a signal transmitted by a transmitter in Embodiment 9;

FIG. 228 is a diagram illustrating an example of a signal transmitted by a transmitter in Embodiment 9;

FIG. 229 is a diagram illustrating an example of a structure of a system including a transmitter and a receiver in Embodiment 9;

FIG. 230 is a diagram illustrating an example of a structure of a system including a transmitter and a receiver in Embodiment 9;

FIG. 231 is a diagram illustrating an example of a structure of a system including a transmitter and a receiver in Embodiment 9;

FIG. 232 is a diagram illustrating an example of operation of a transmitter in Embodiment 9;

FIG. 233 is a diagram illustrating an example of operation of a transmitter in Embodiment 9;

FIG. 234 is a diagram illustrating an example of operation of a transmitter in Embodiment 9;

FIG. 235 is a diagram illustrating an example of operation of a transmitter in Embodiment 9;

FIG. 236 is a diagram illustrating a watch including light sensors in Embodiment 10;

FIG. 237 is a diagram illustrating an example of a receiver in Embodiment 10;

FIG. 238 is a diagram illustrating an example of a receiver in Embodiment 10;

FIG. 239A is a flowchart of an information communication method according to an aspect of the present disclosure;

FIG. 239B is a block diagram of a mobile terminal according to an aspect of the present disclosure;

FIG. 240 is a diagram illustrating an example of a reception system in Embodiment 10;

FIG. 241 is a diagram illustrating an example of a reception system in Embodiment 10;

FIG. 242A is a diagram illustrating an example of a modulation scheme in Embodiment 10;

FIG. 242B is a diagram illustrating an example of a modulation scheme in Embodiment 10;

FIG. 242C is a diagram illustrating an example of a modulation scheme in Embodiment 10;

FIG. 242D is a diagram illustrating an example of separation of a mixed signal in Embodiment 10;

FIG. 242E is a diagram illustrating an example of separation of a mixed signal in Embodiment 10;

FIG. 242F is a flowchart illustrating processing of an image processing program in Embodiment 10;

FIG. 242G is a block diagram of an information processing apparatus in Embodiment 10;

FIG. 243A is a diagram illustrating an example of a visible light communication system in Embodiment 10;

FIG. 243B is a diagram for describing a use case in Embodiment 10;

FIG. 243C is a diagram illustrating an example of a signal transmission and reception system in Embodiment 10;

FIG. 244 is a flowchart illustrating a reception method in which interference is eliminated in Embodiment 10;

FIG. 245 is a flowchart illustrating a transmitter direction estimation method in Embodiment 10;

FIG. 246 is a flowchart illustrating a reception start method in Embodiment 10;

FIG. 247 is a flowchart illustrating a method of generating an ID additionally using information of another medium in Embodiment 10;

FIG. 248 is a flowchart illustrating a reception scheme selection method by frequency separation in Embodiment 10.

Figure 249:
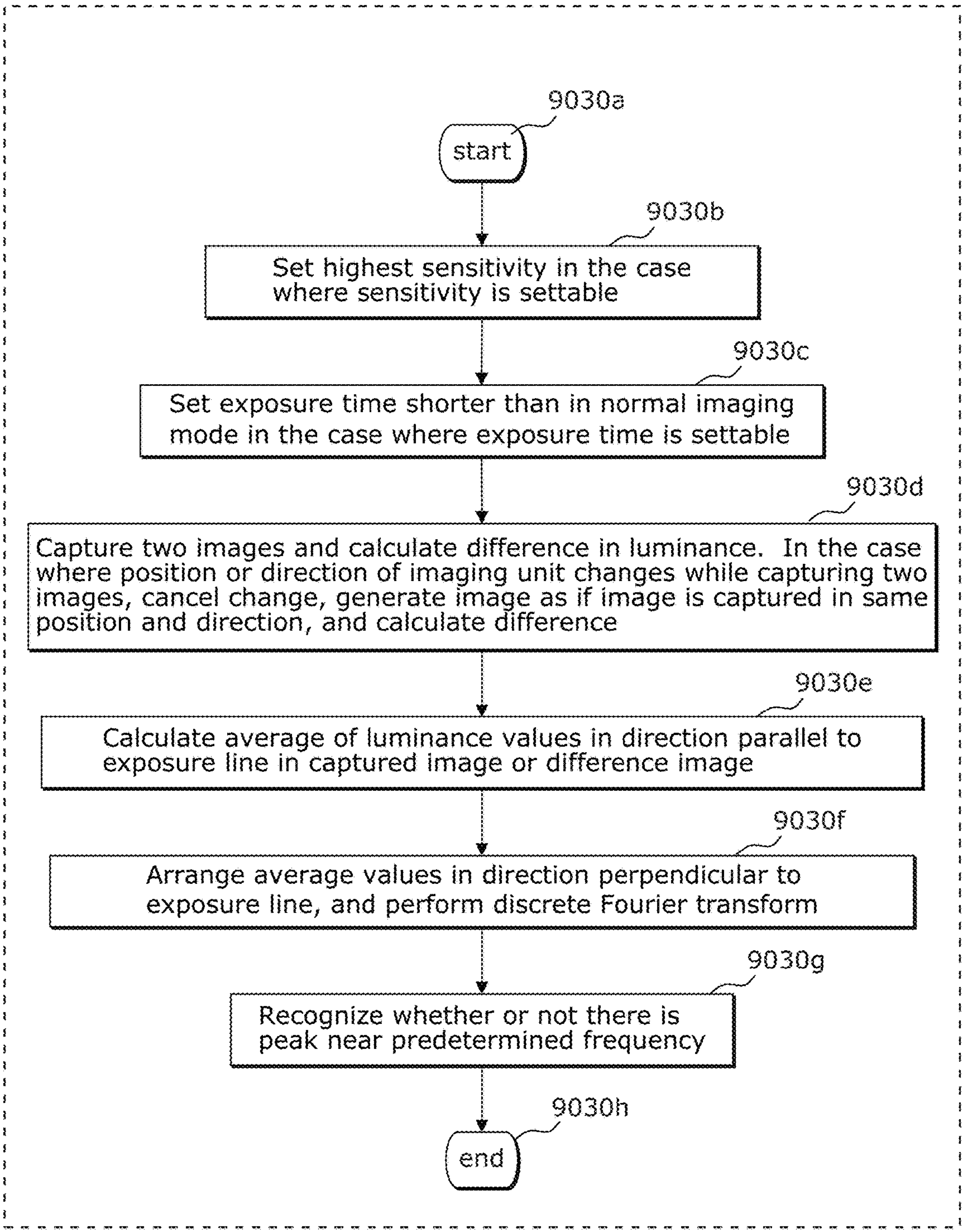
Figure 250:
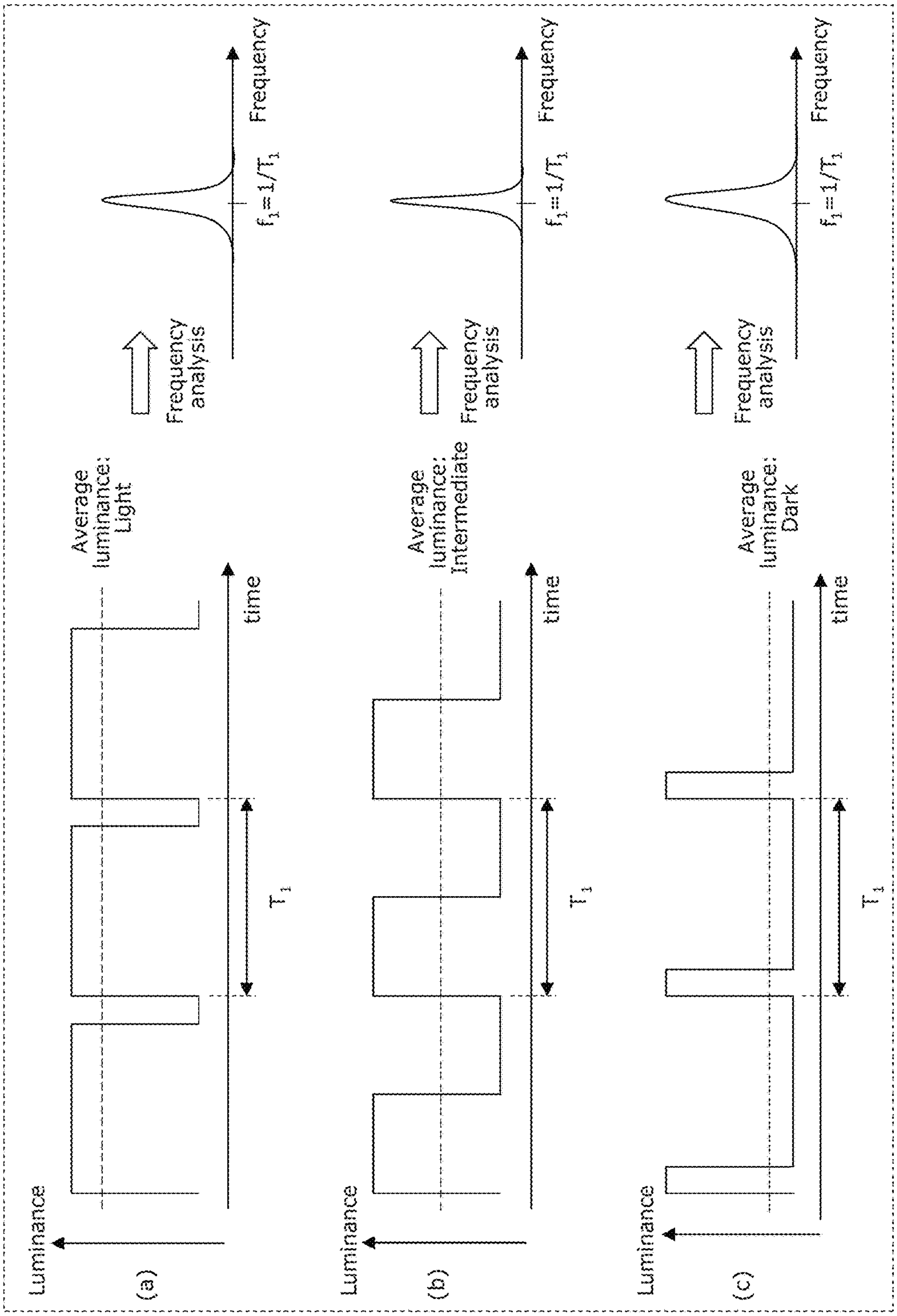
Figure 251:
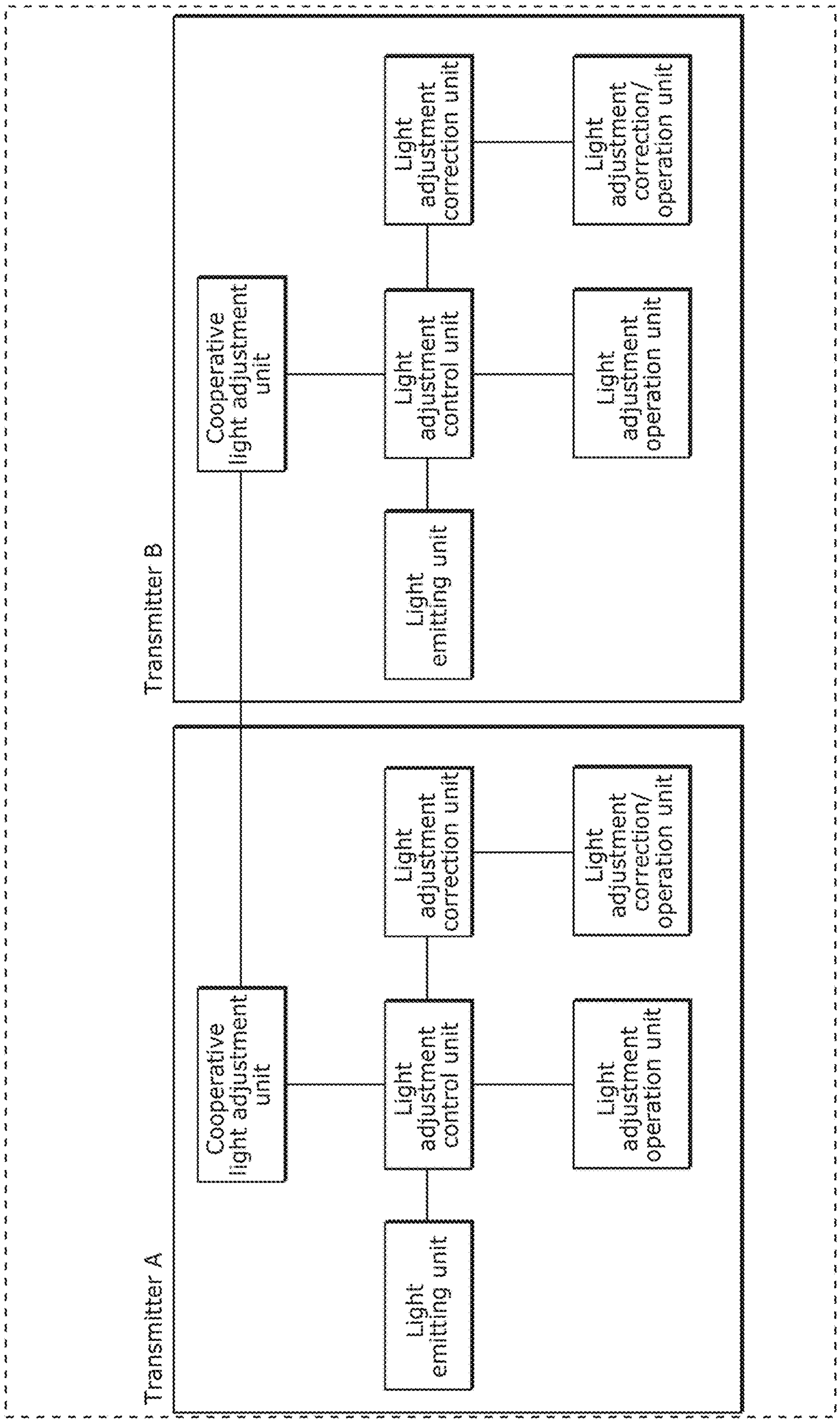
Figure 252A:
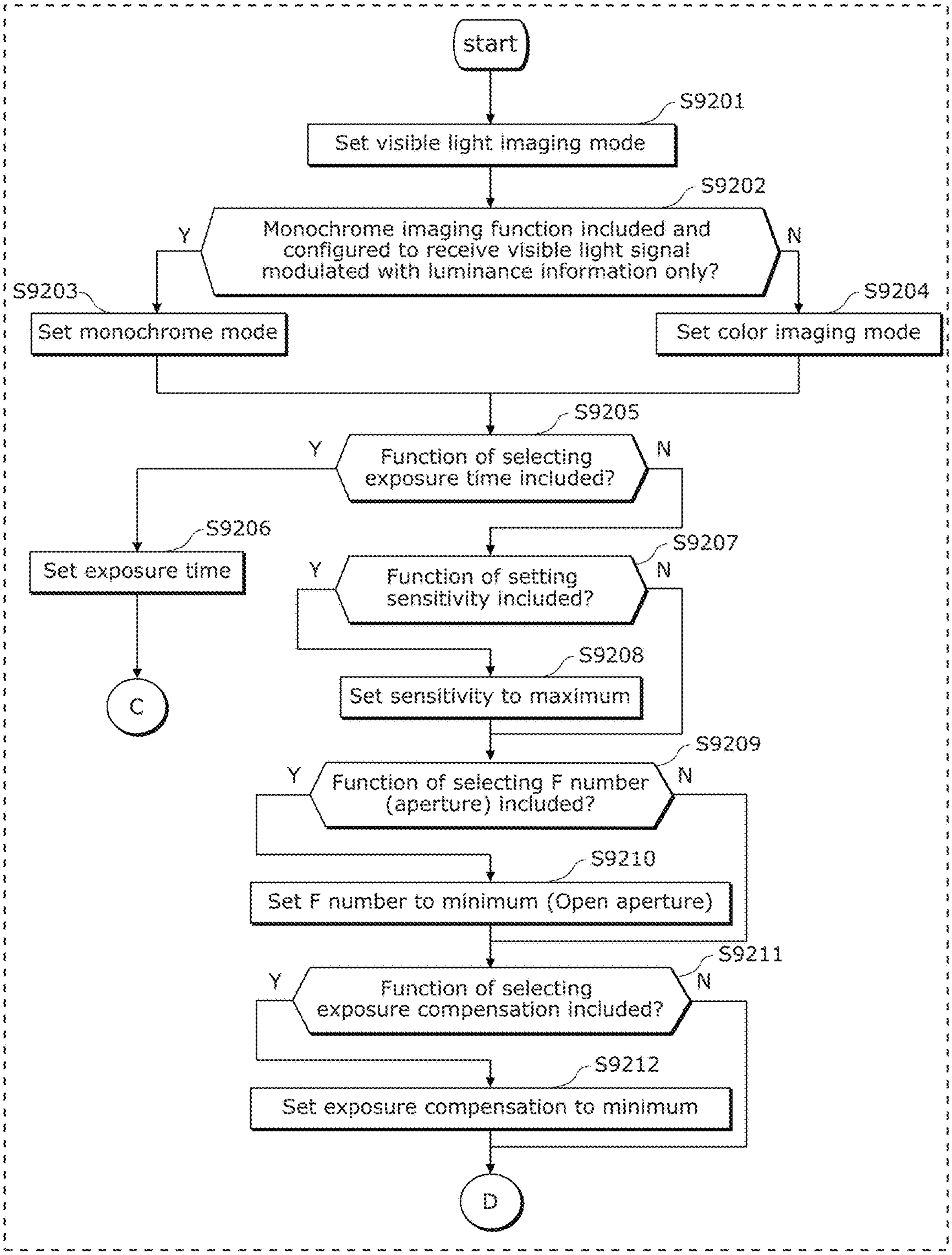
Figure 252B:
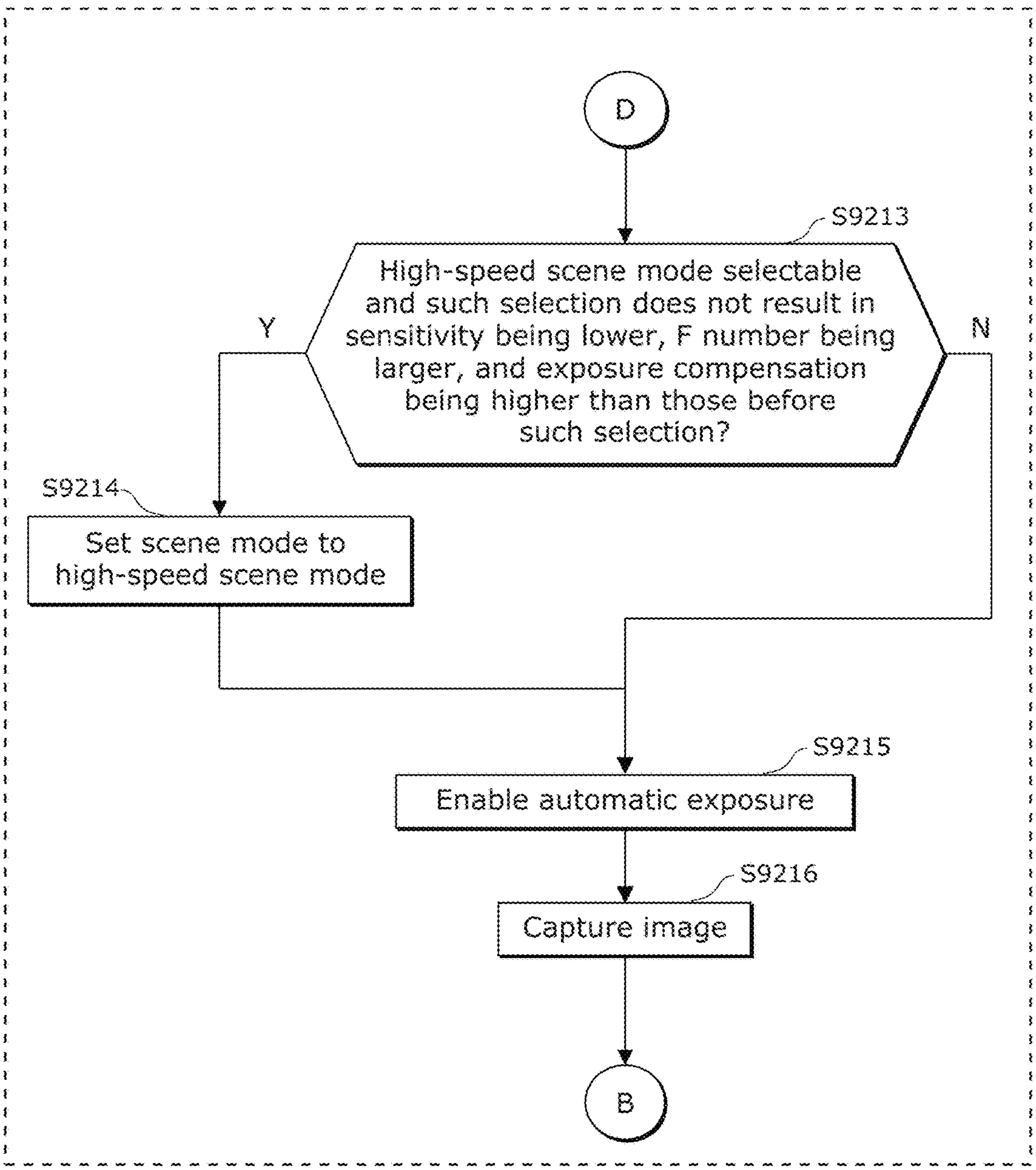
Figure 252C:
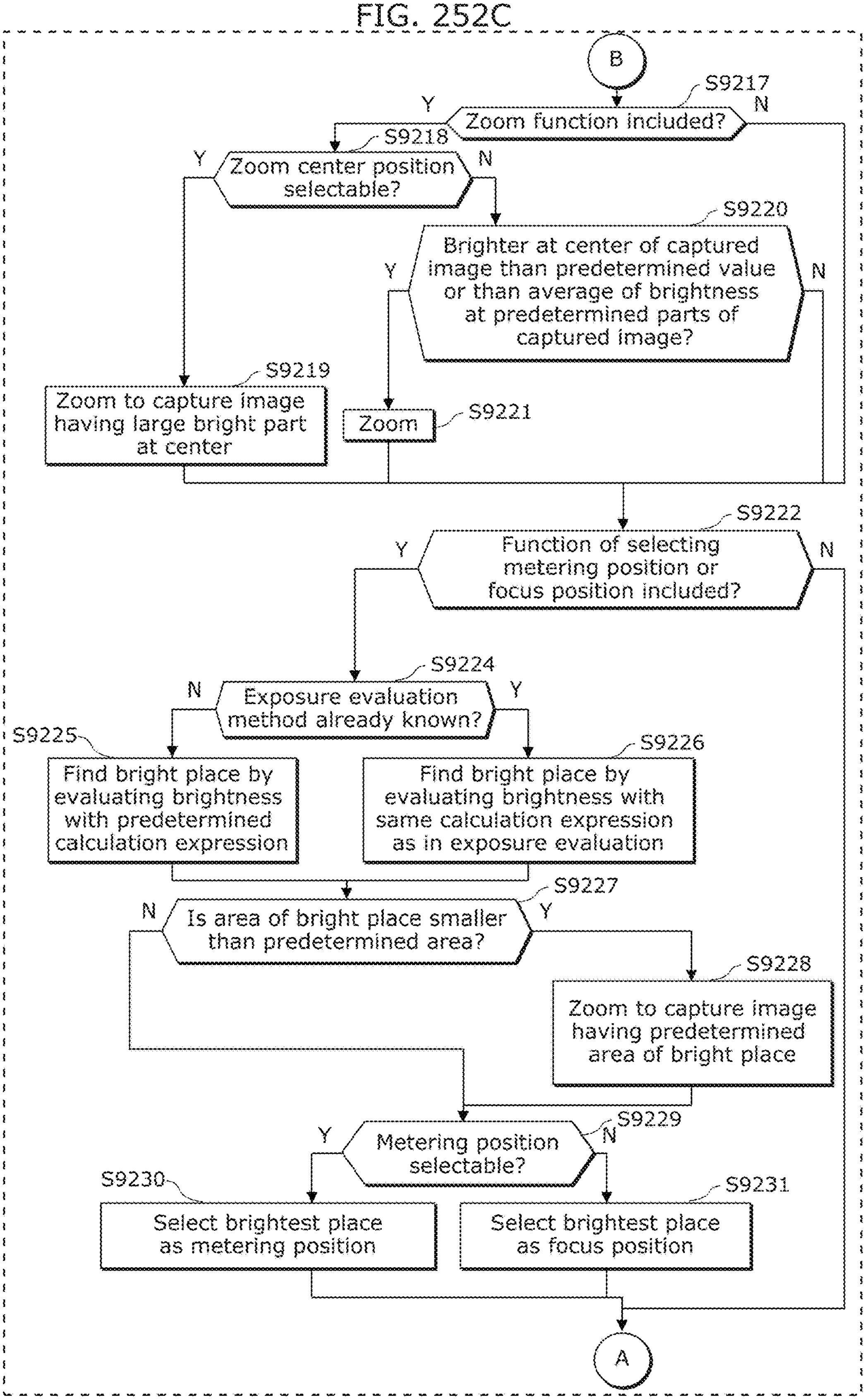
Figure 252D:
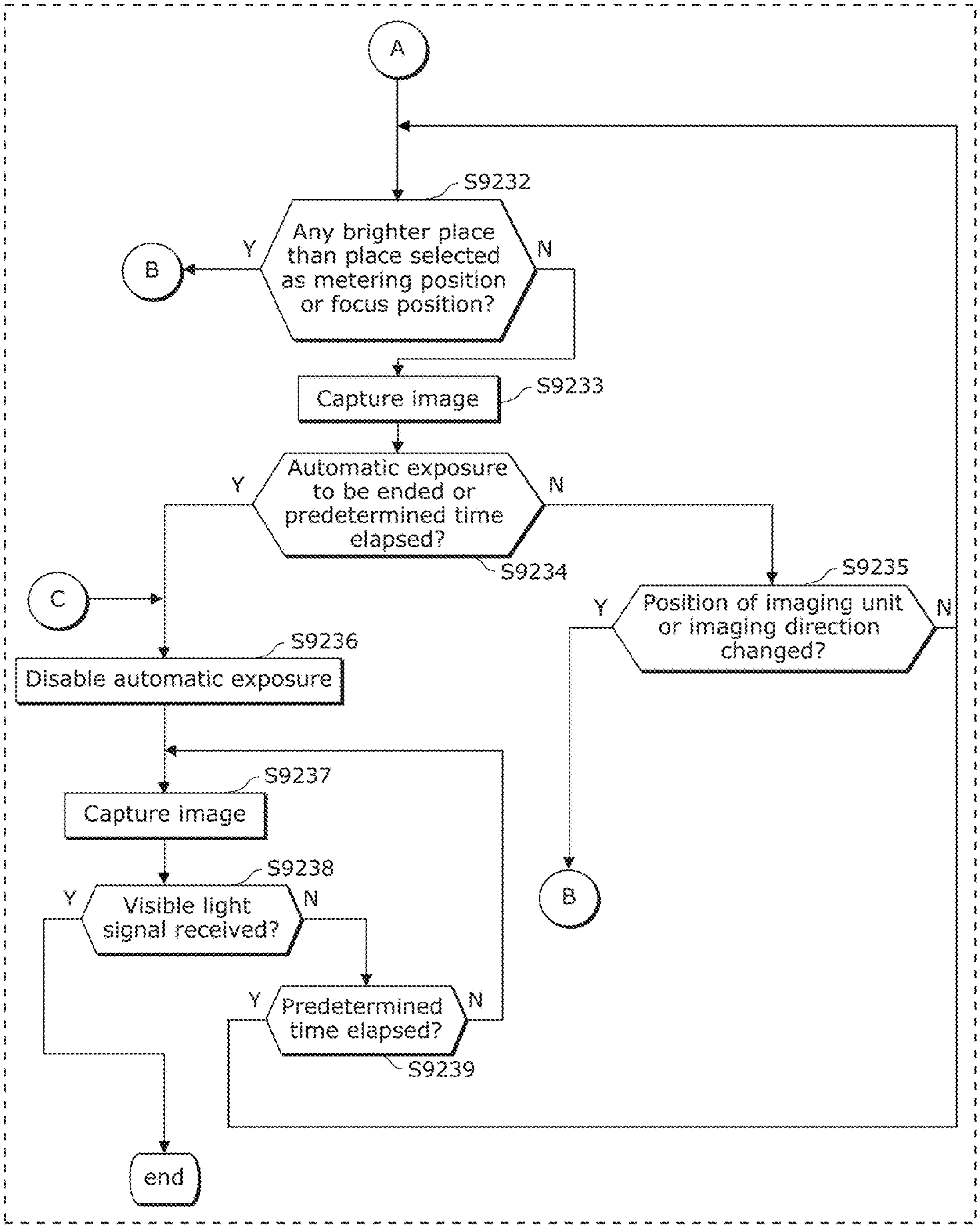
Figure 253:
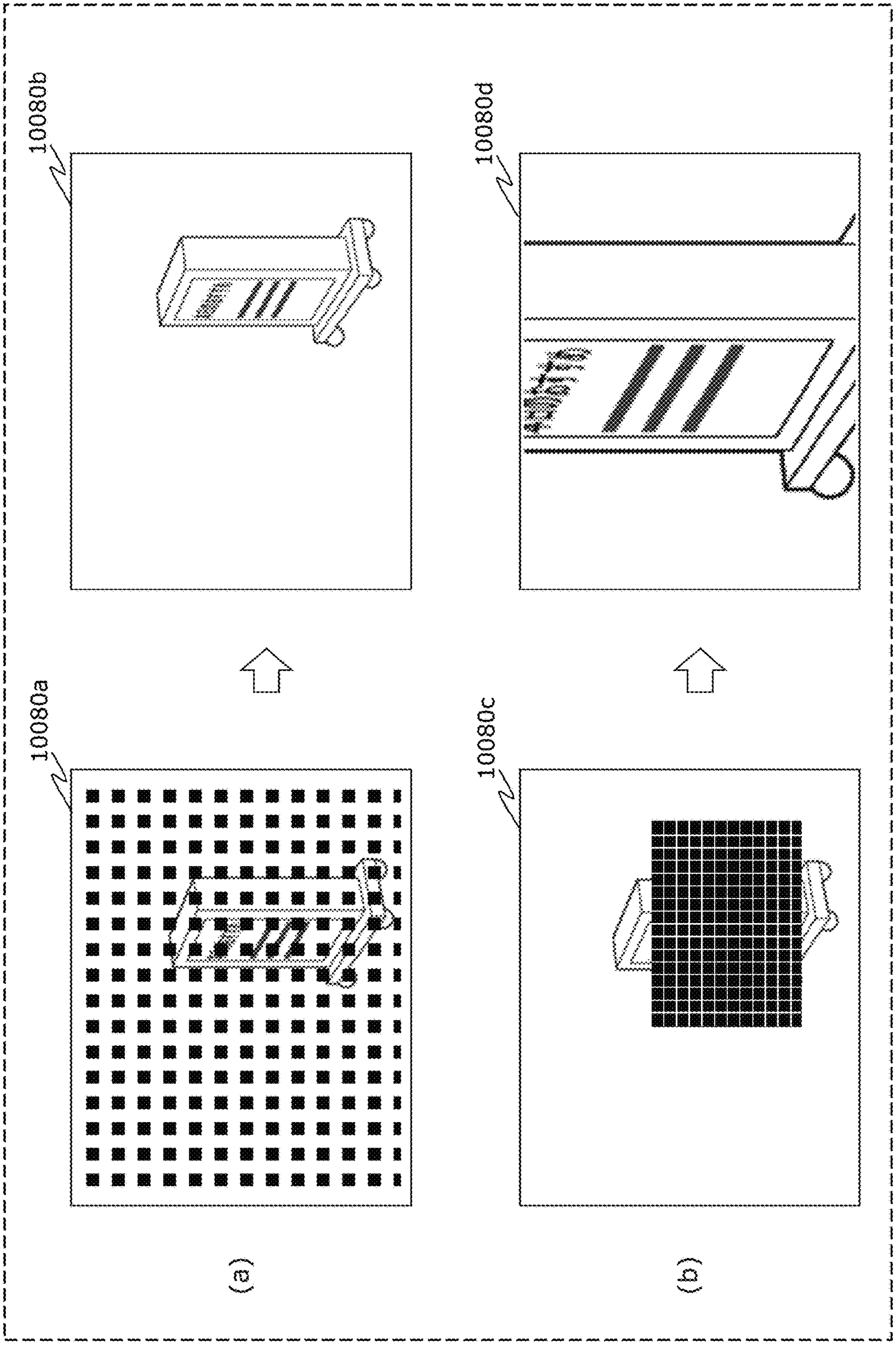
Figure 254A:
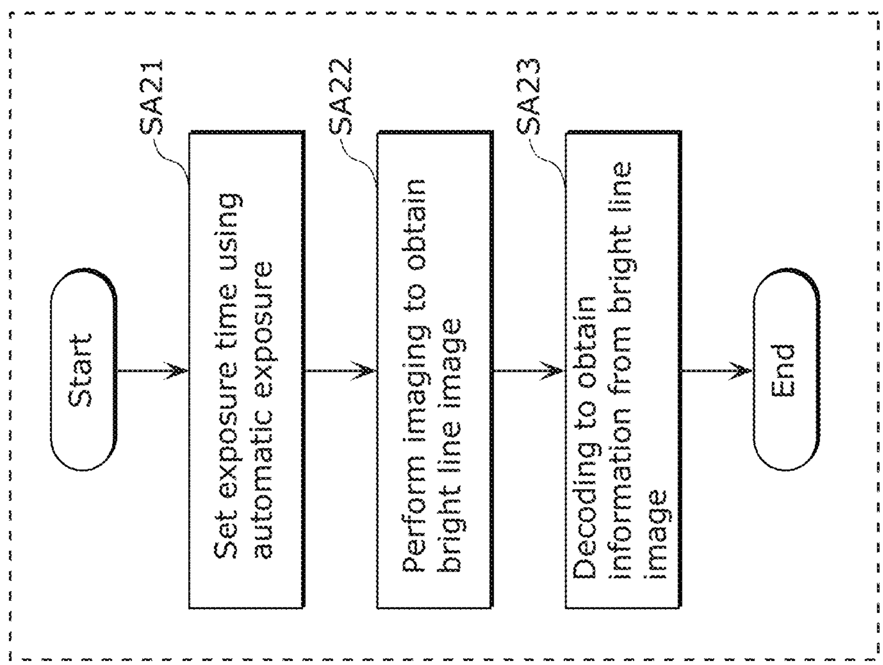
Figure 254B:
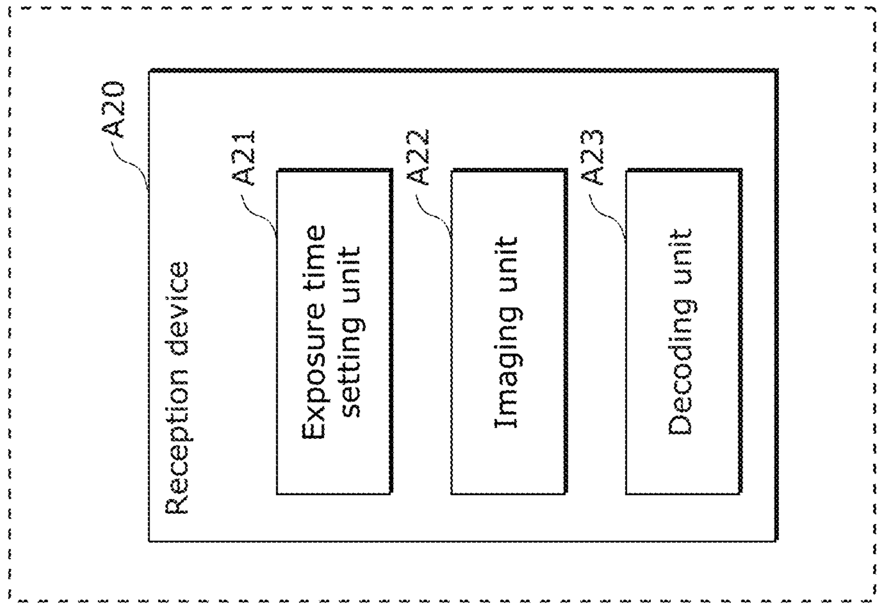
Figure 255:
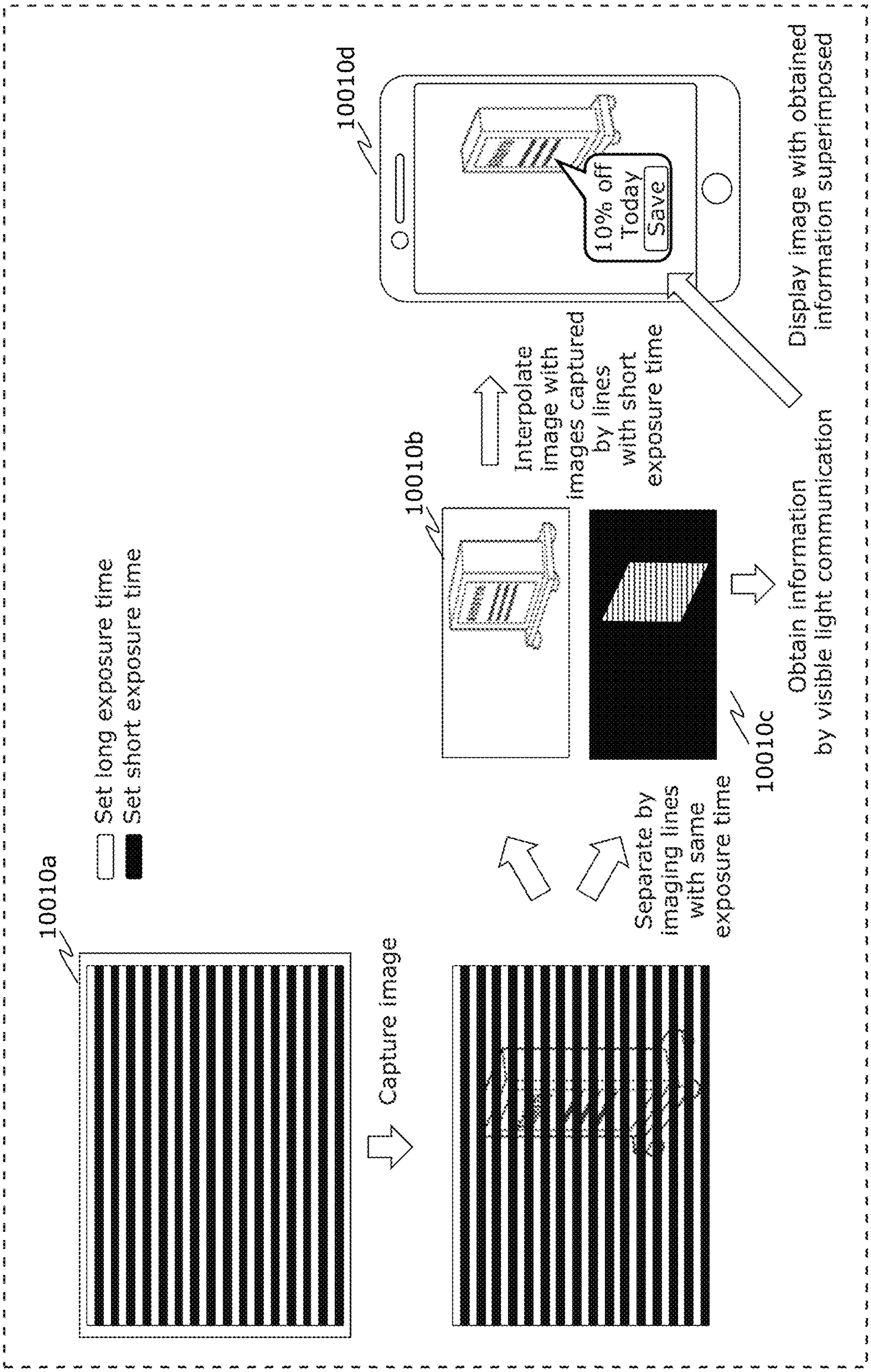
Figure 256:
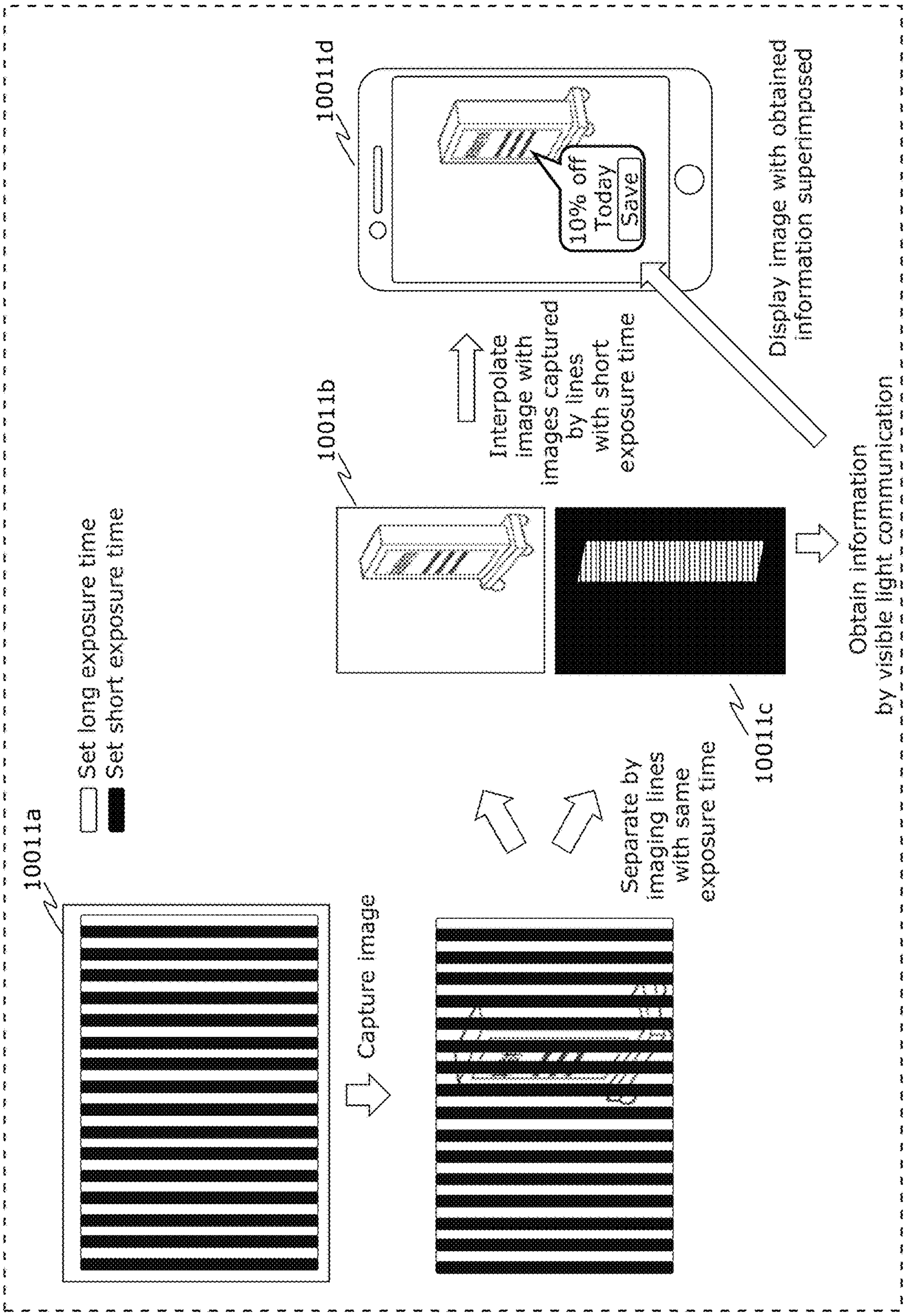
Figure 257:
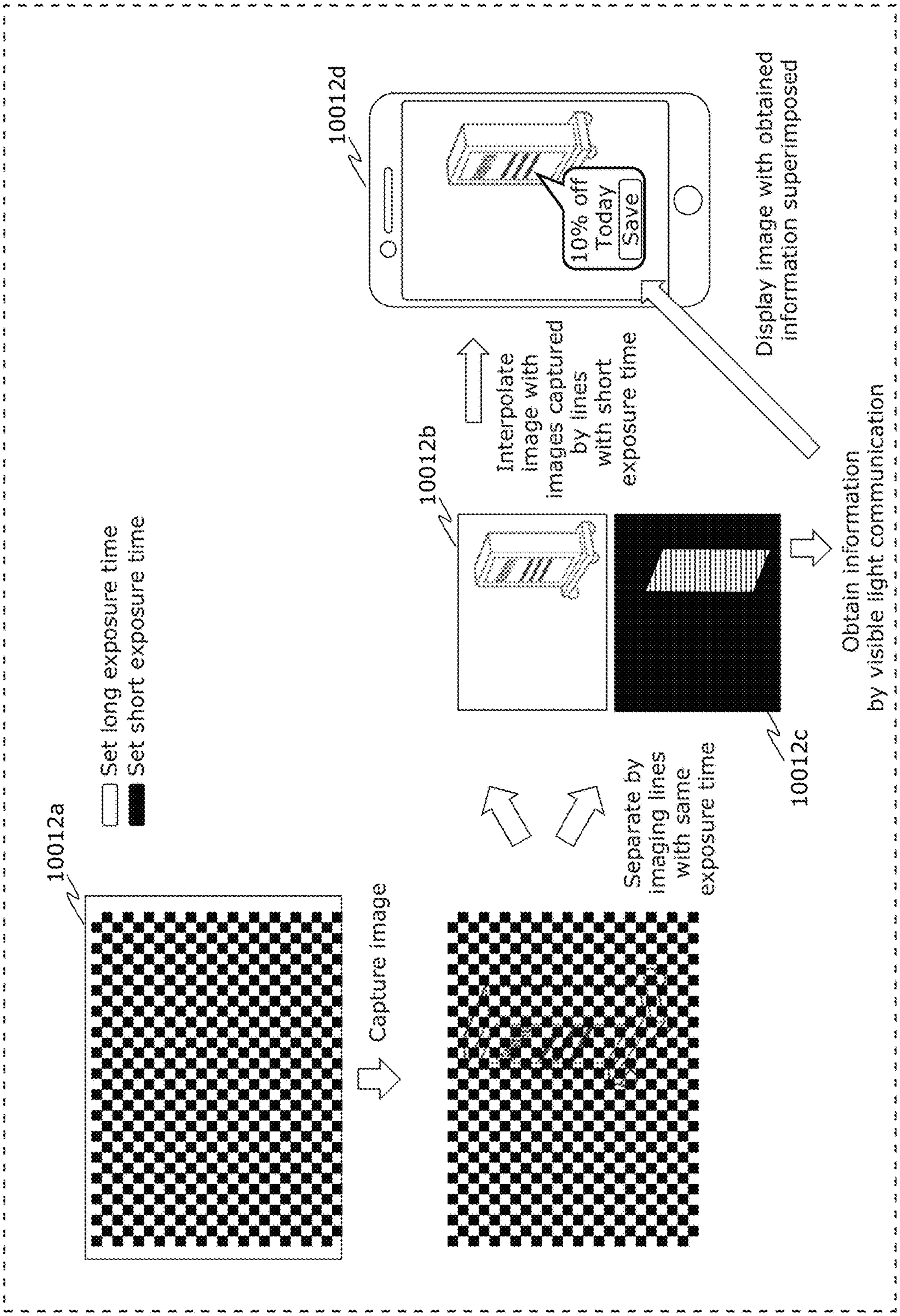
Figure 258:
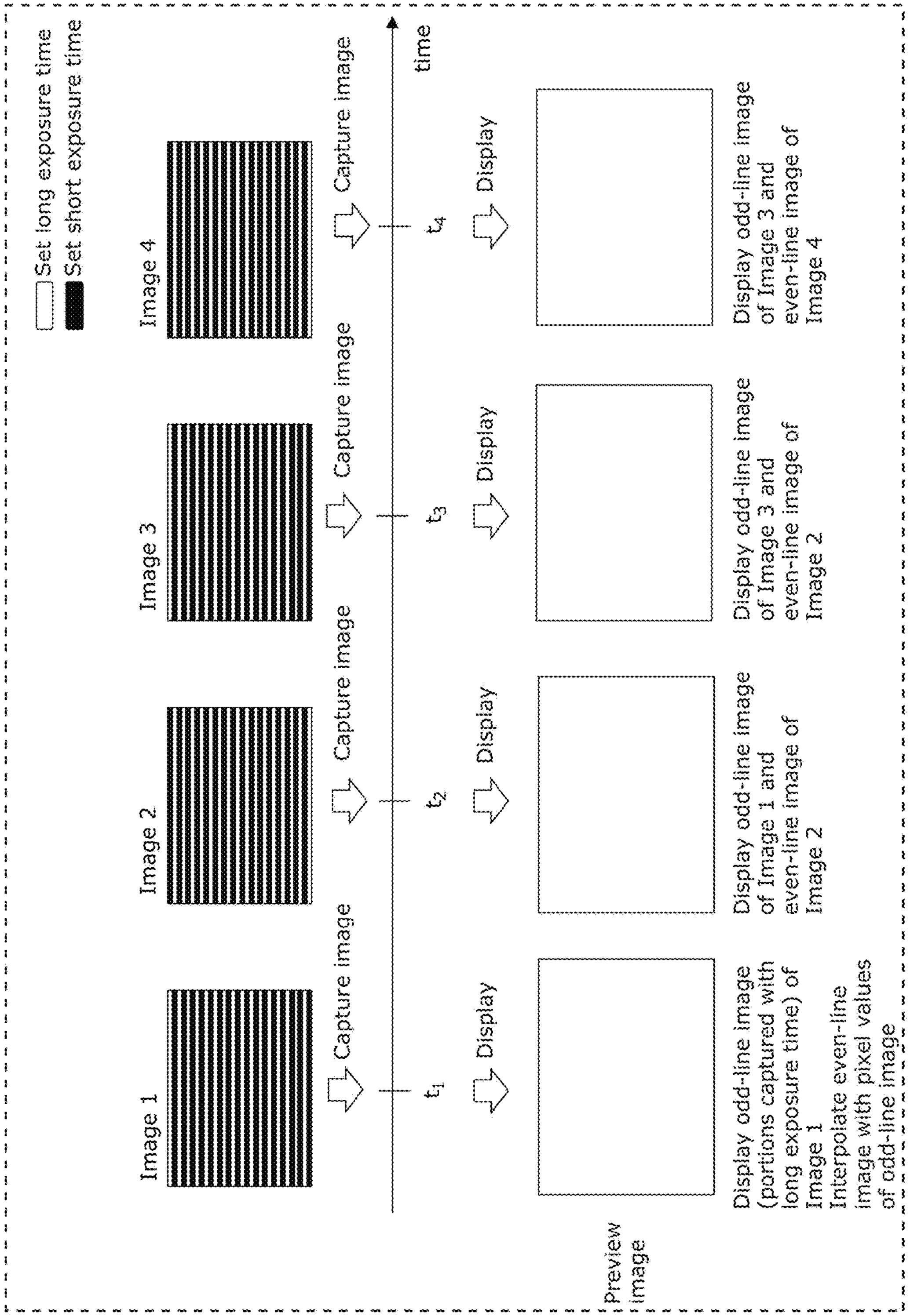
Figure 259:
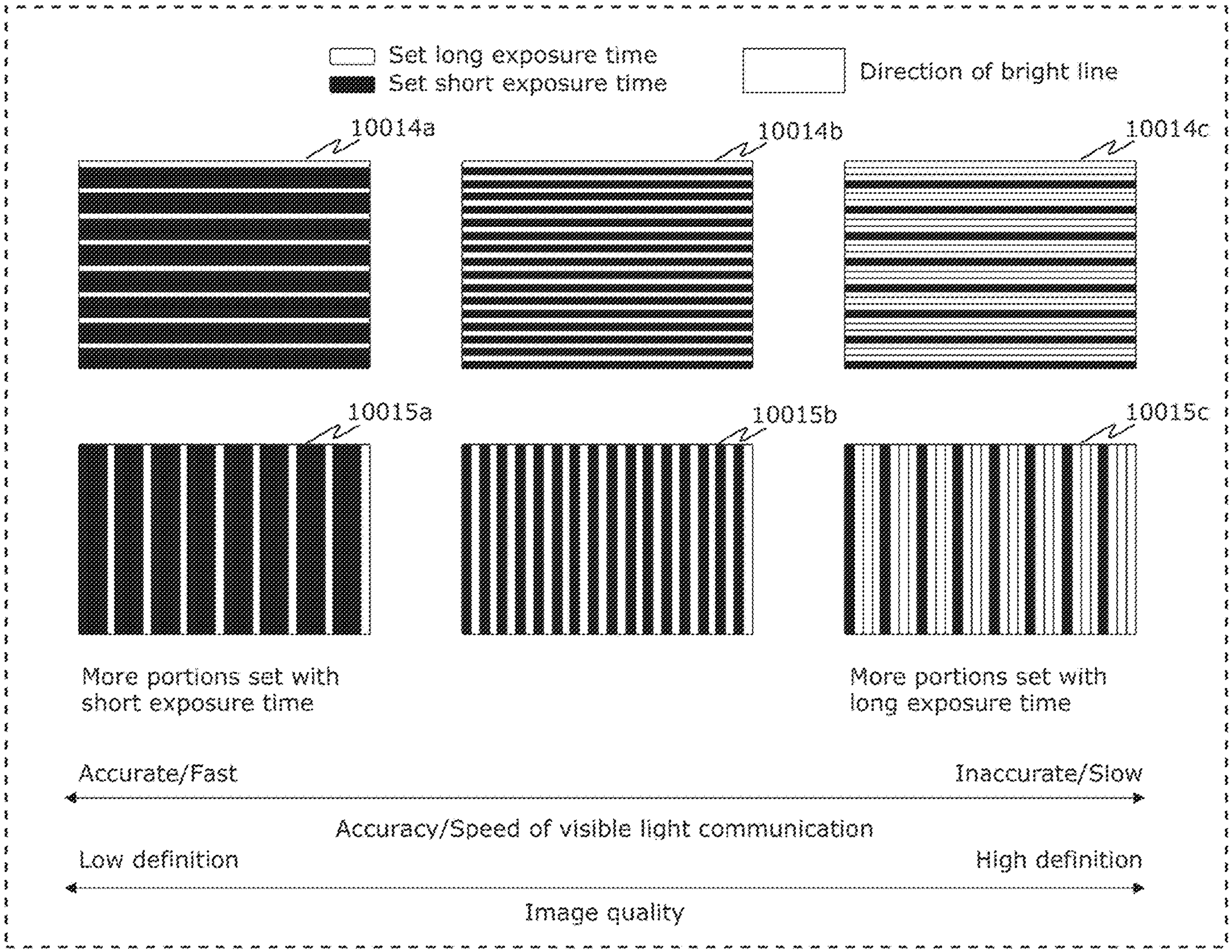
Figure 260:
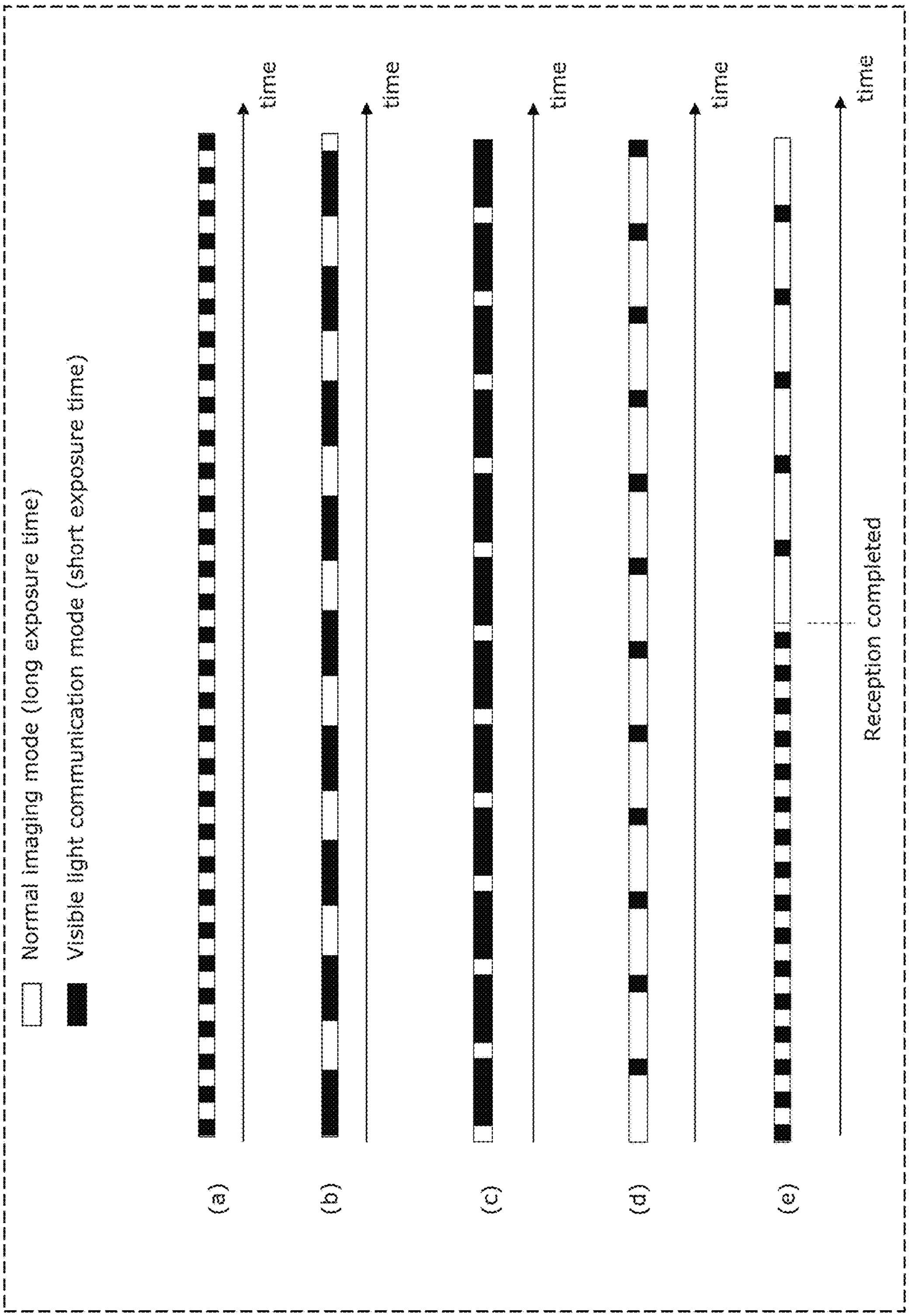
Figure 261:
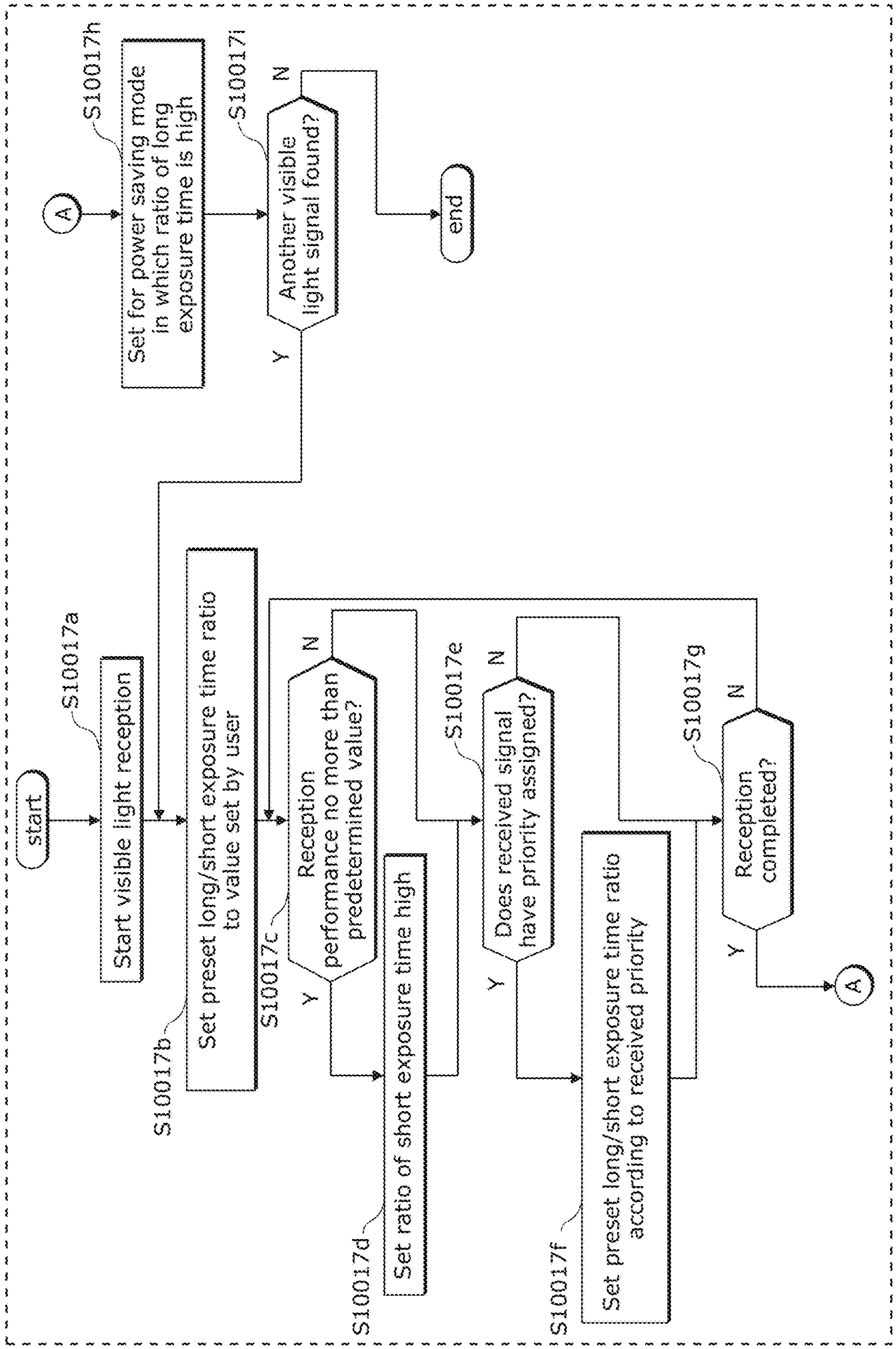
Figure 262:
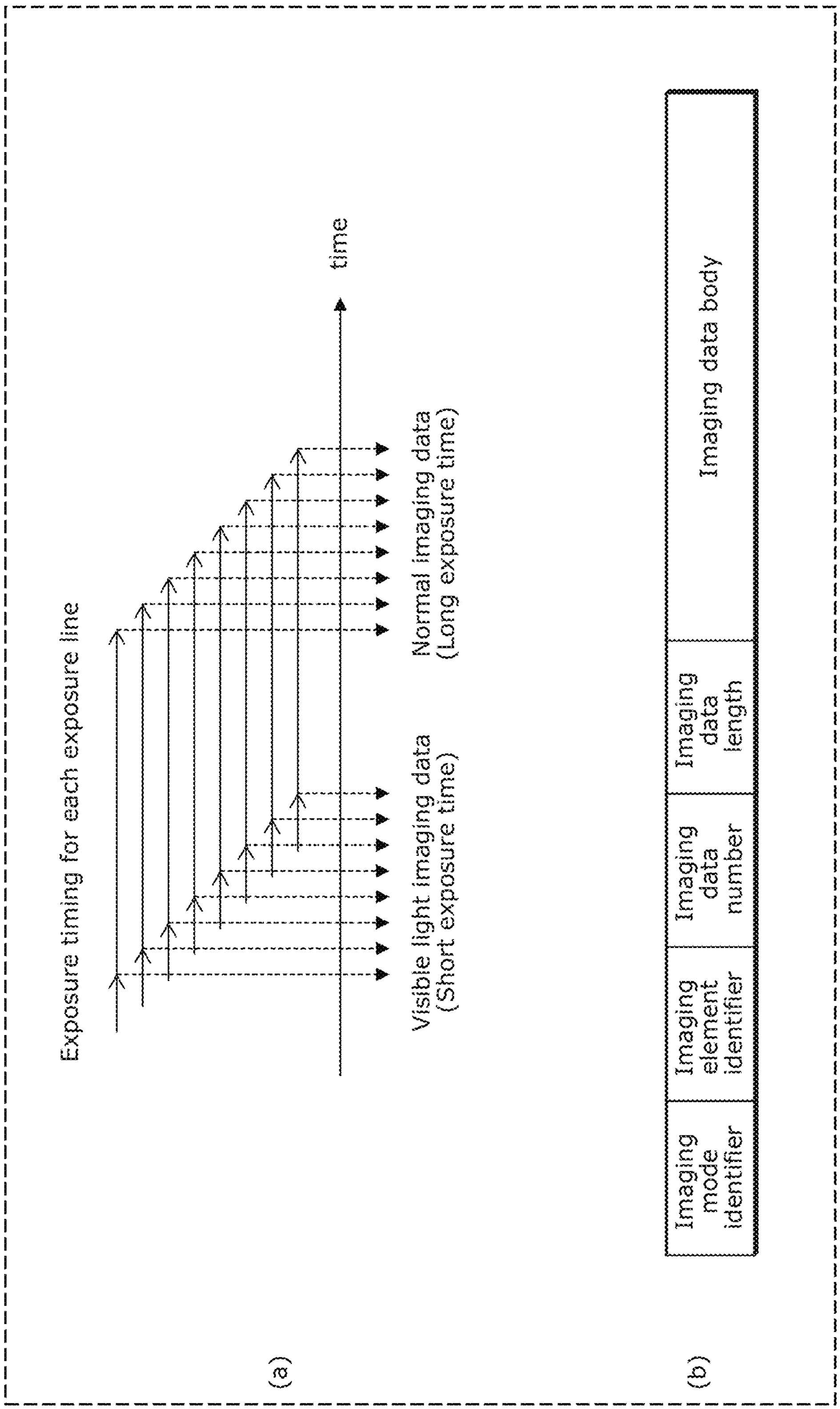
Figure 263A:
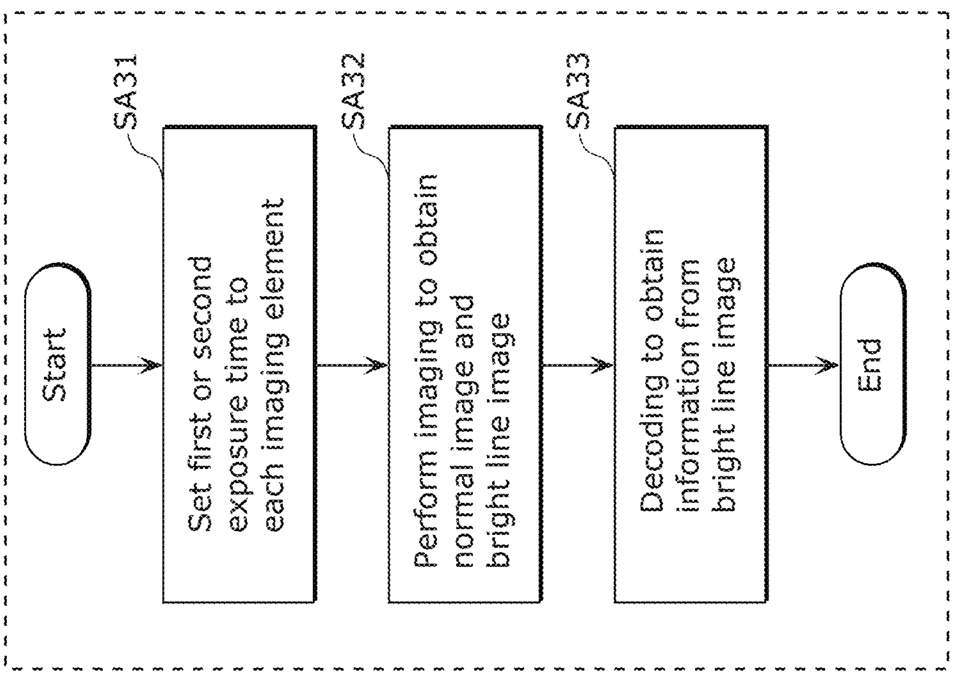
Figure 263B:
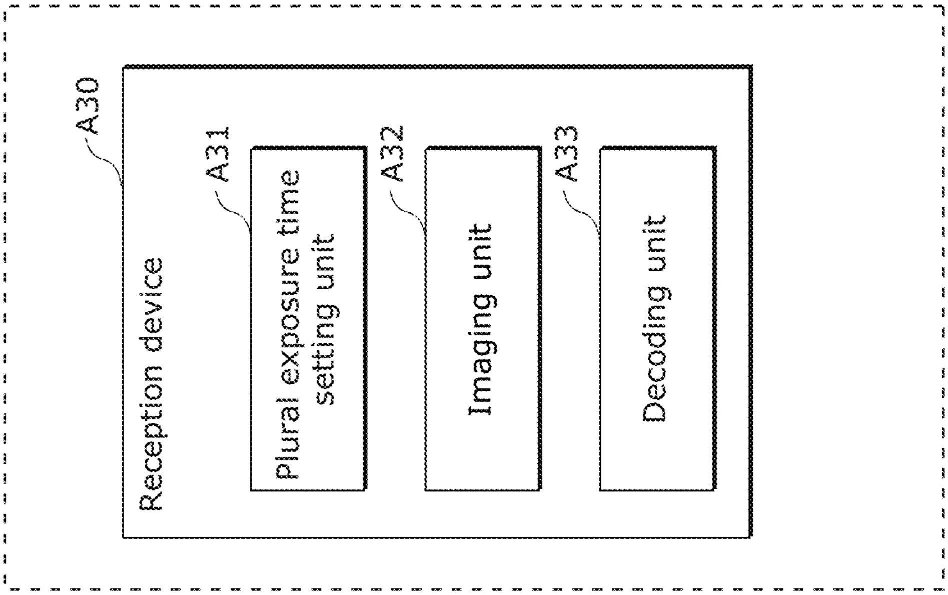
Figure 264:
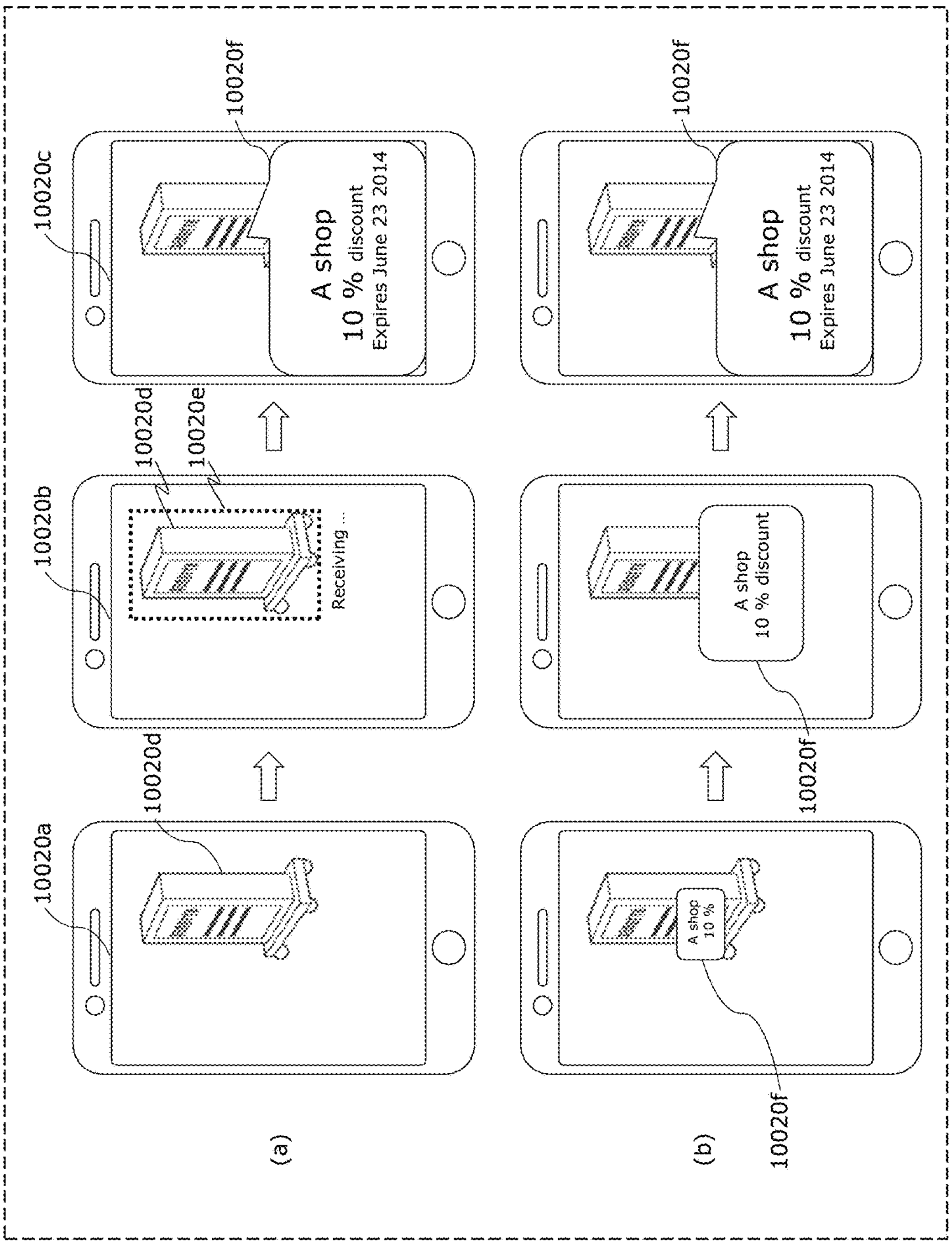
Figure 265:
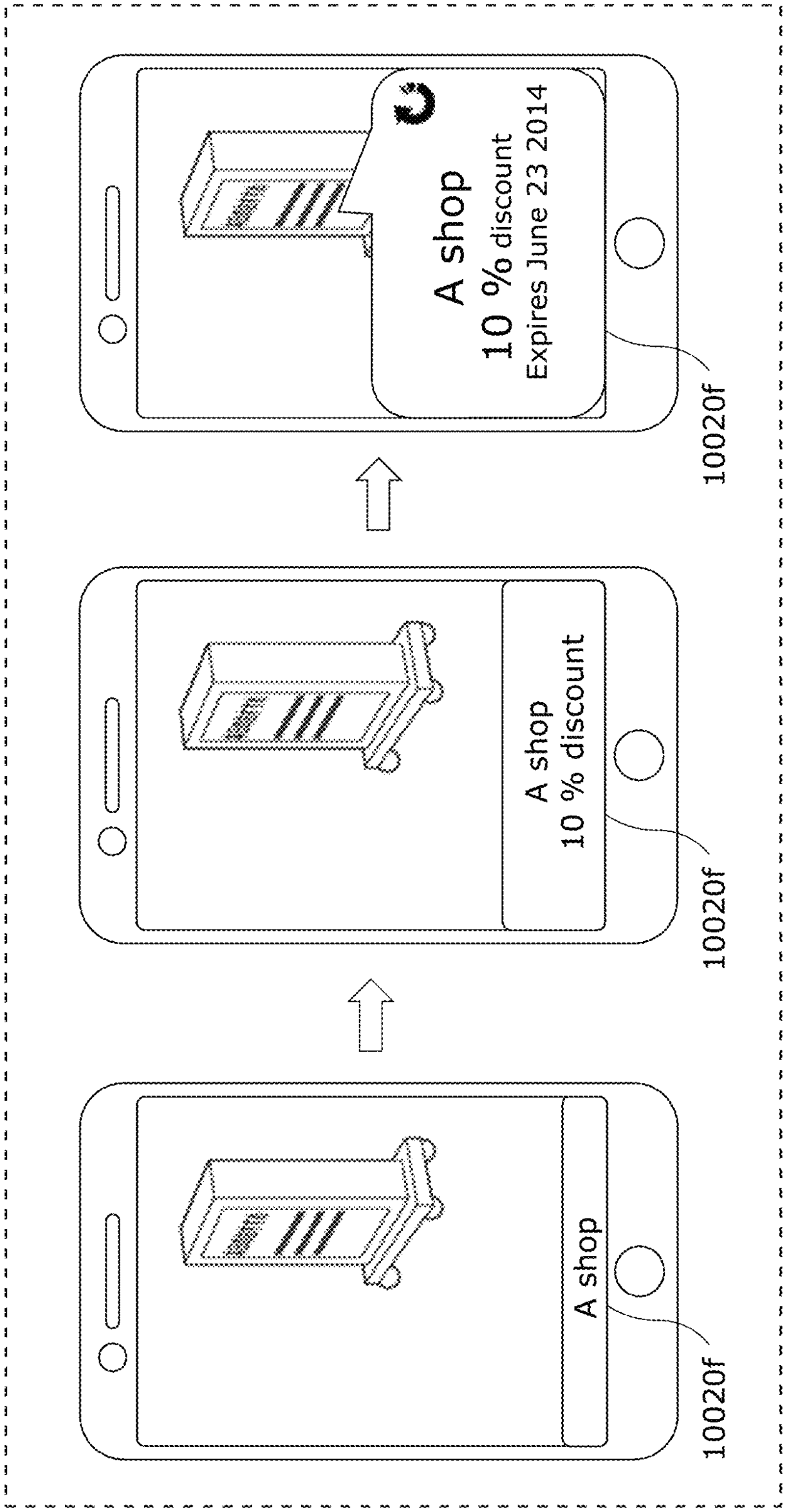
Figure 266:
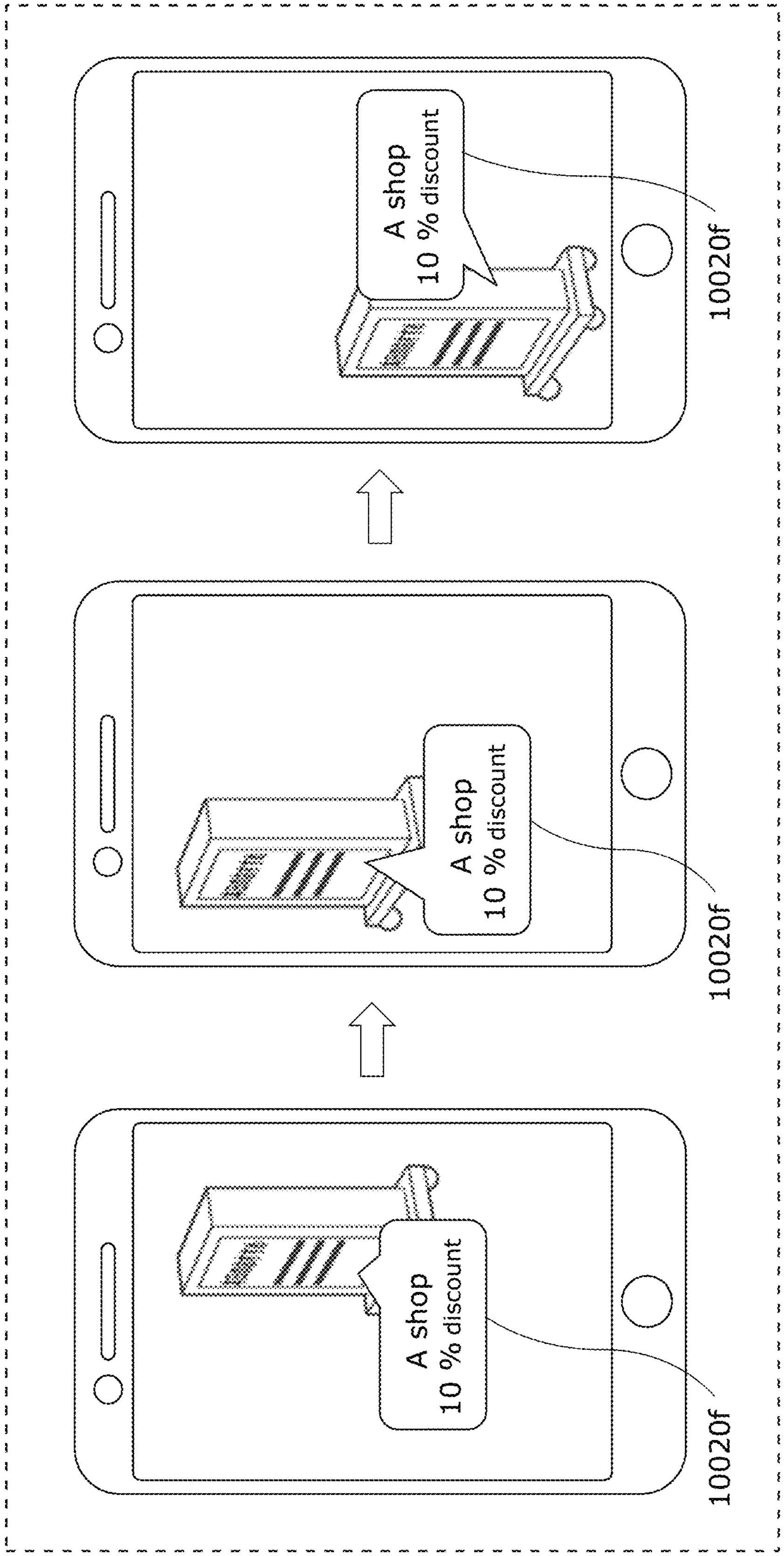
Figure 267:
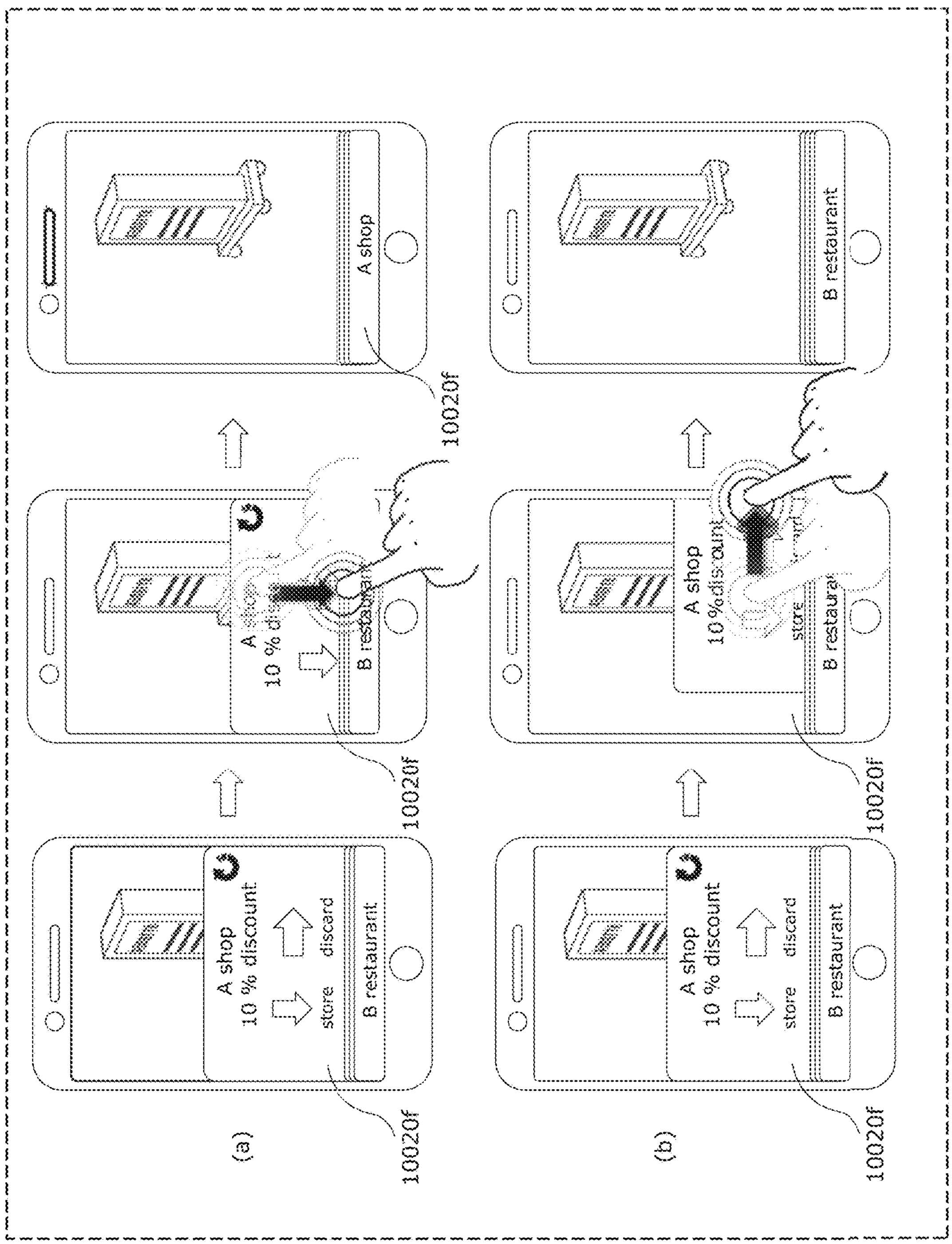
Figure 268:
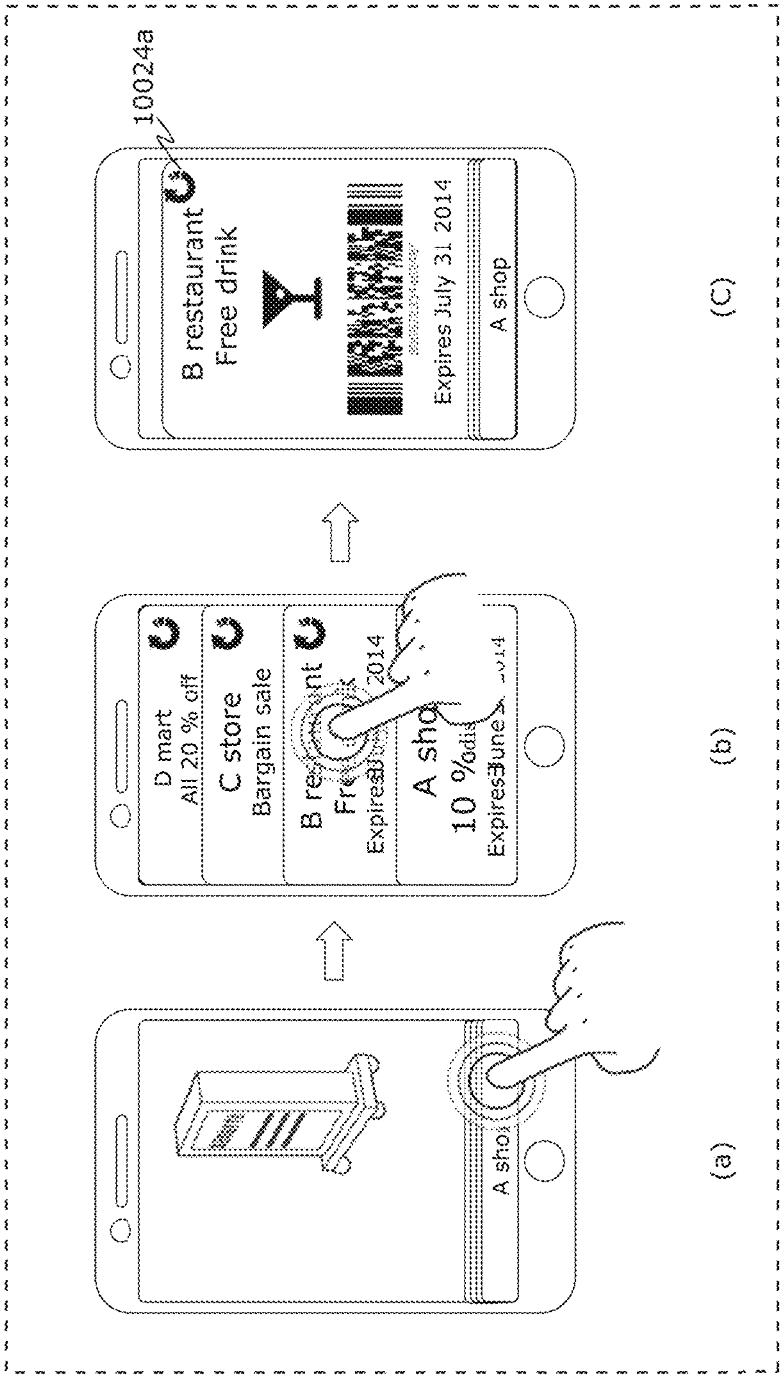
Figure 269:
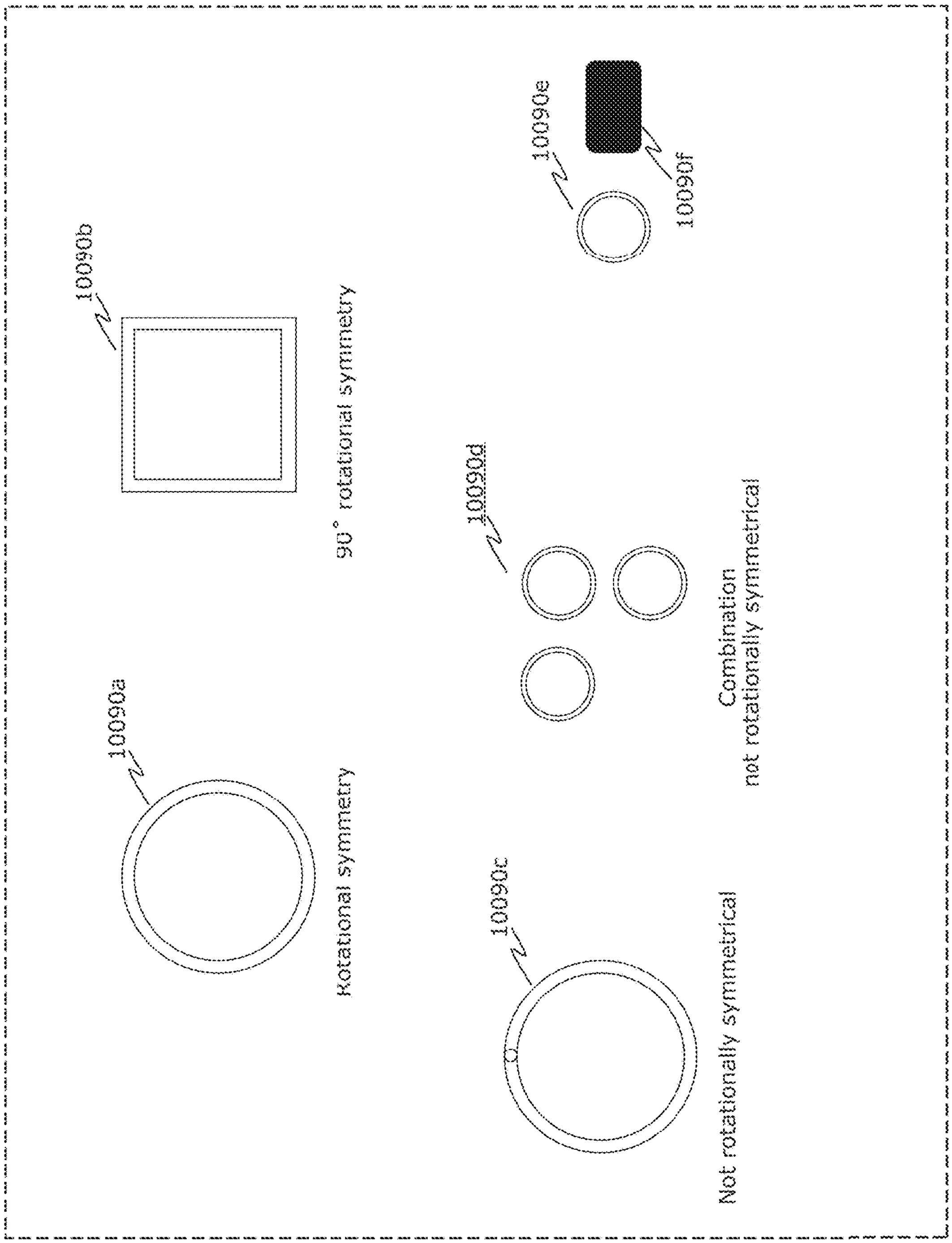
Figure 270:
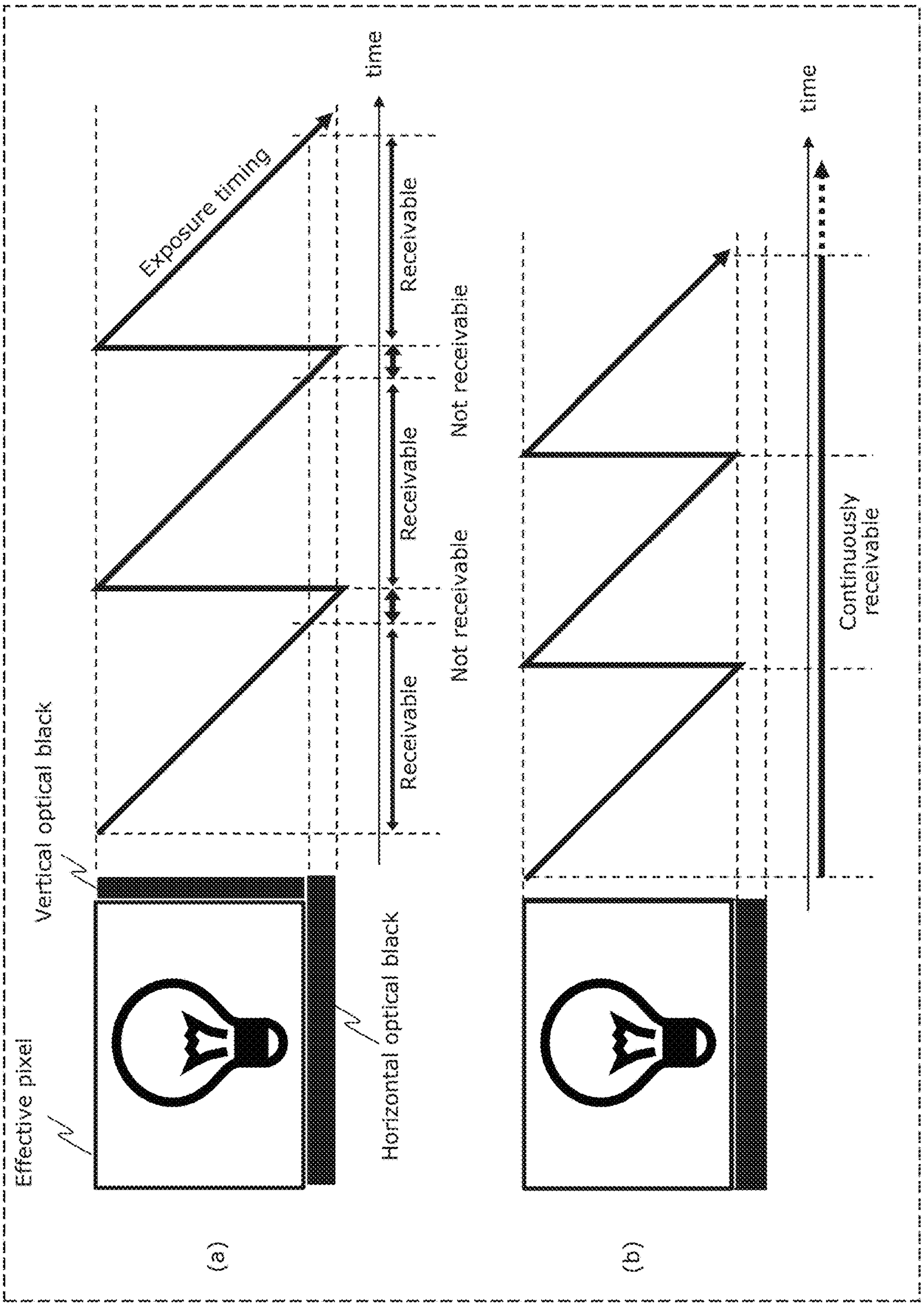
Figure 272:
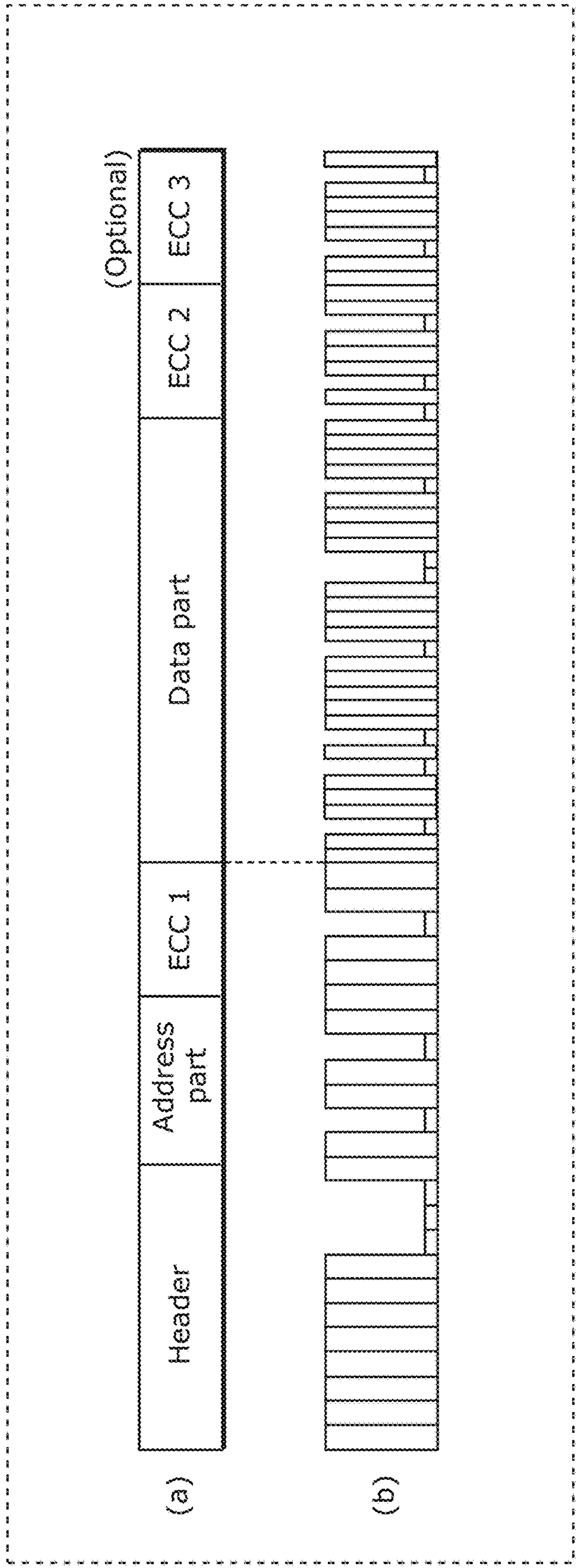
Figure 273:
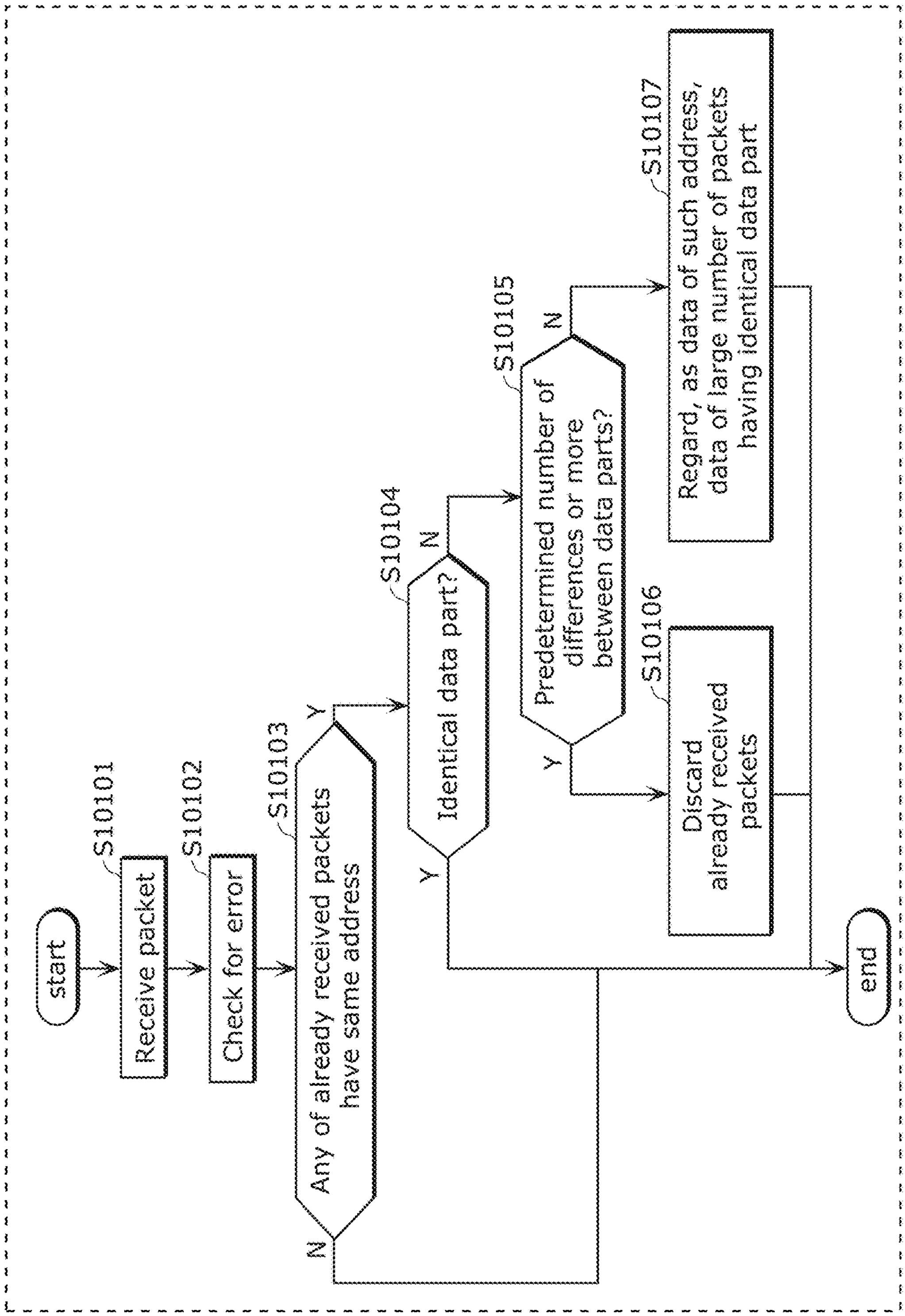
Figure 274:
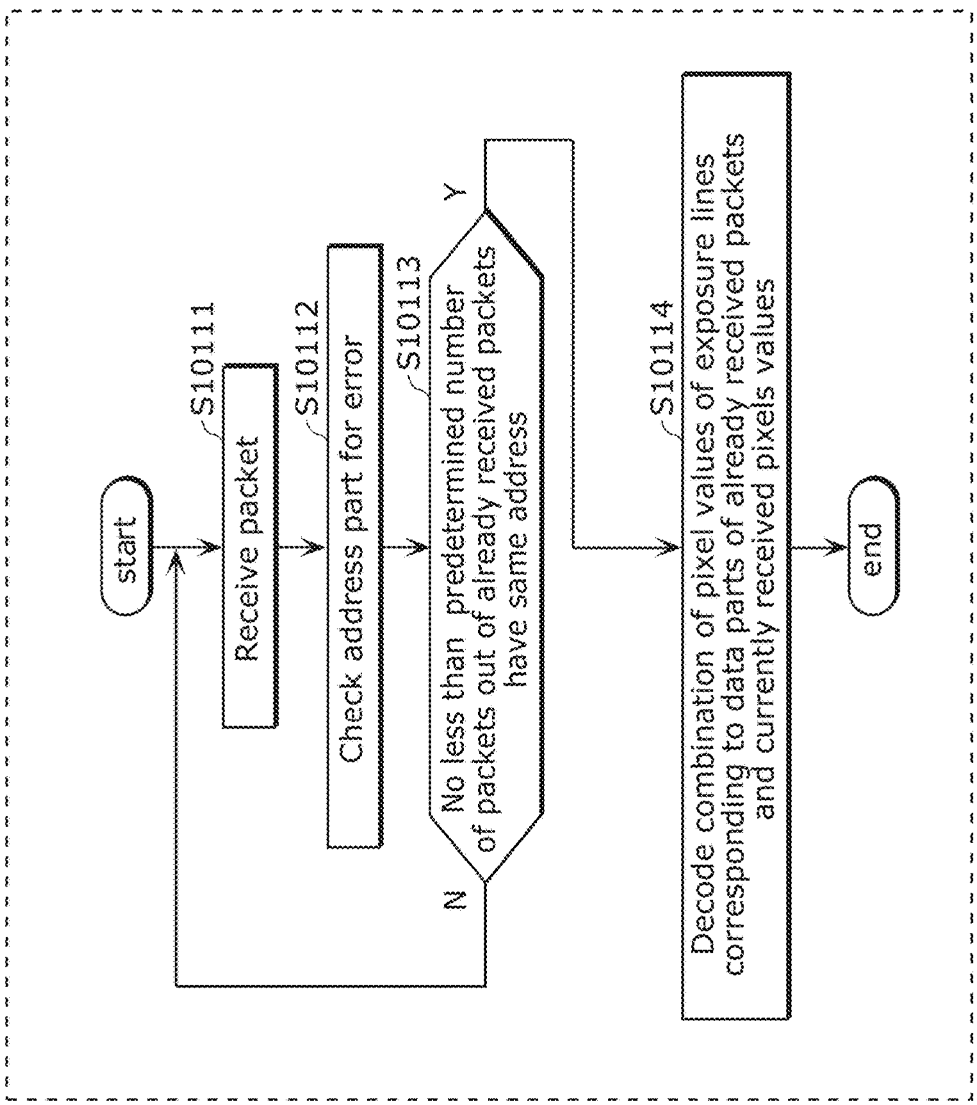
Figure 275:
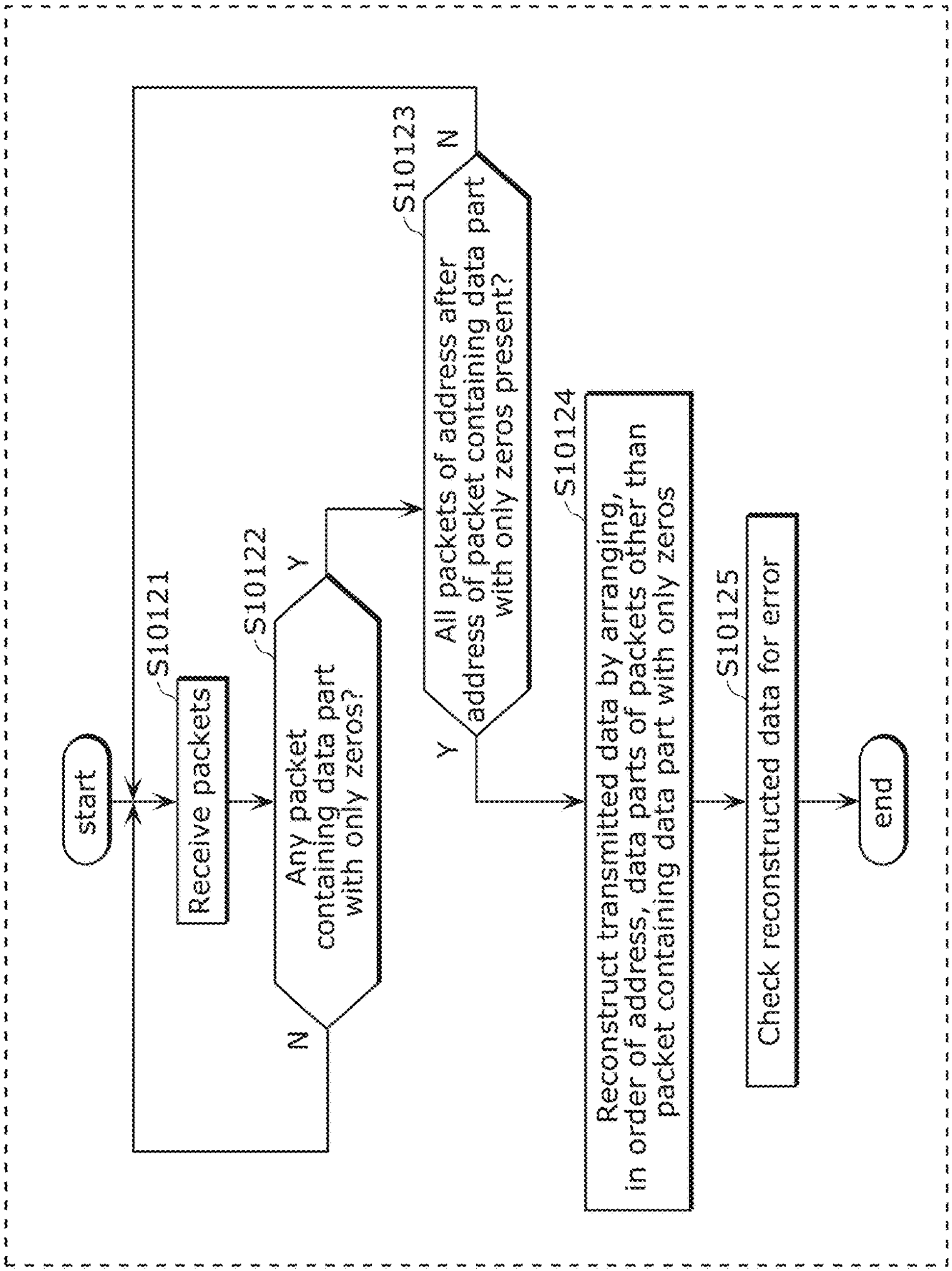
Figure 276:
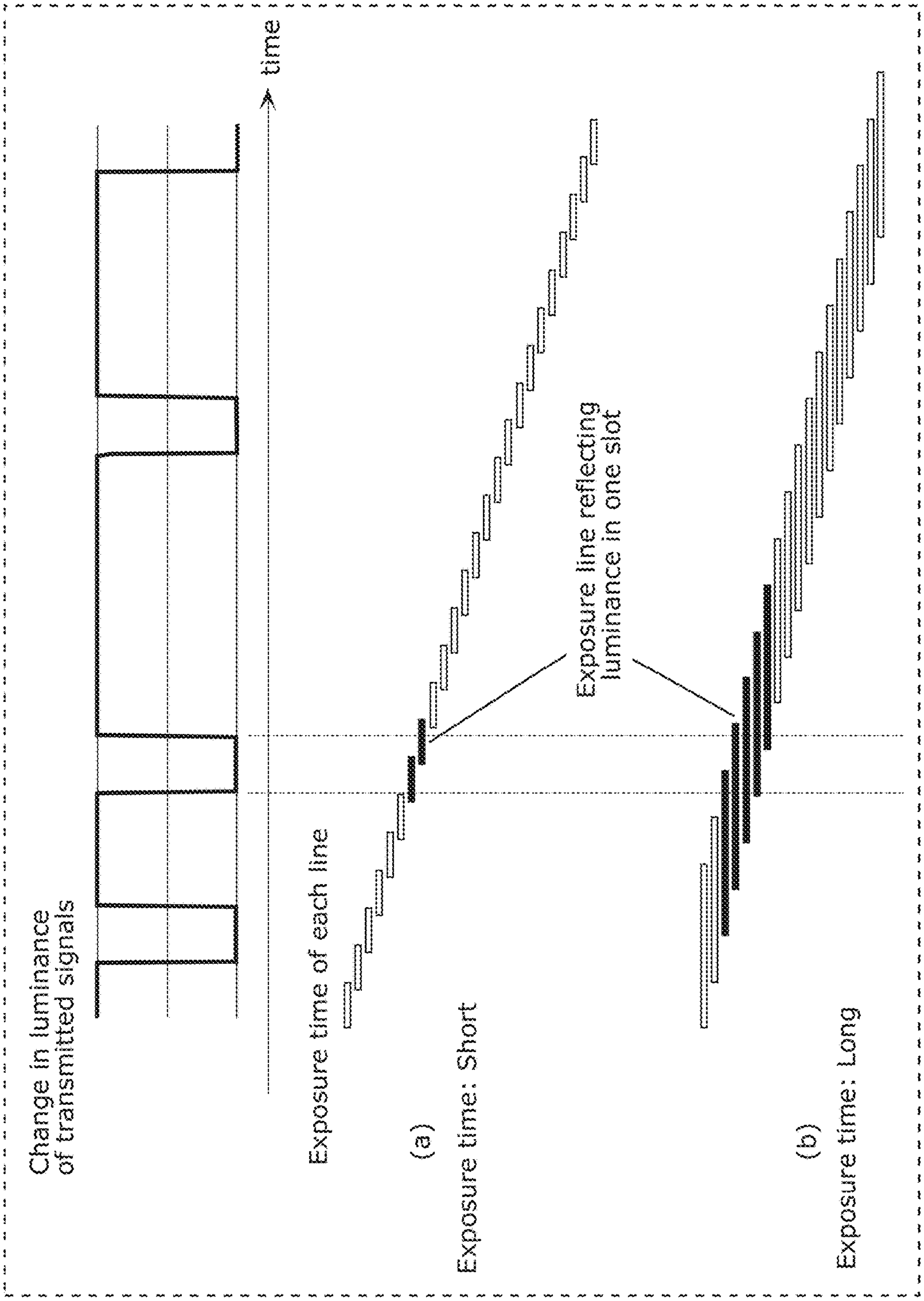
Figure 277:
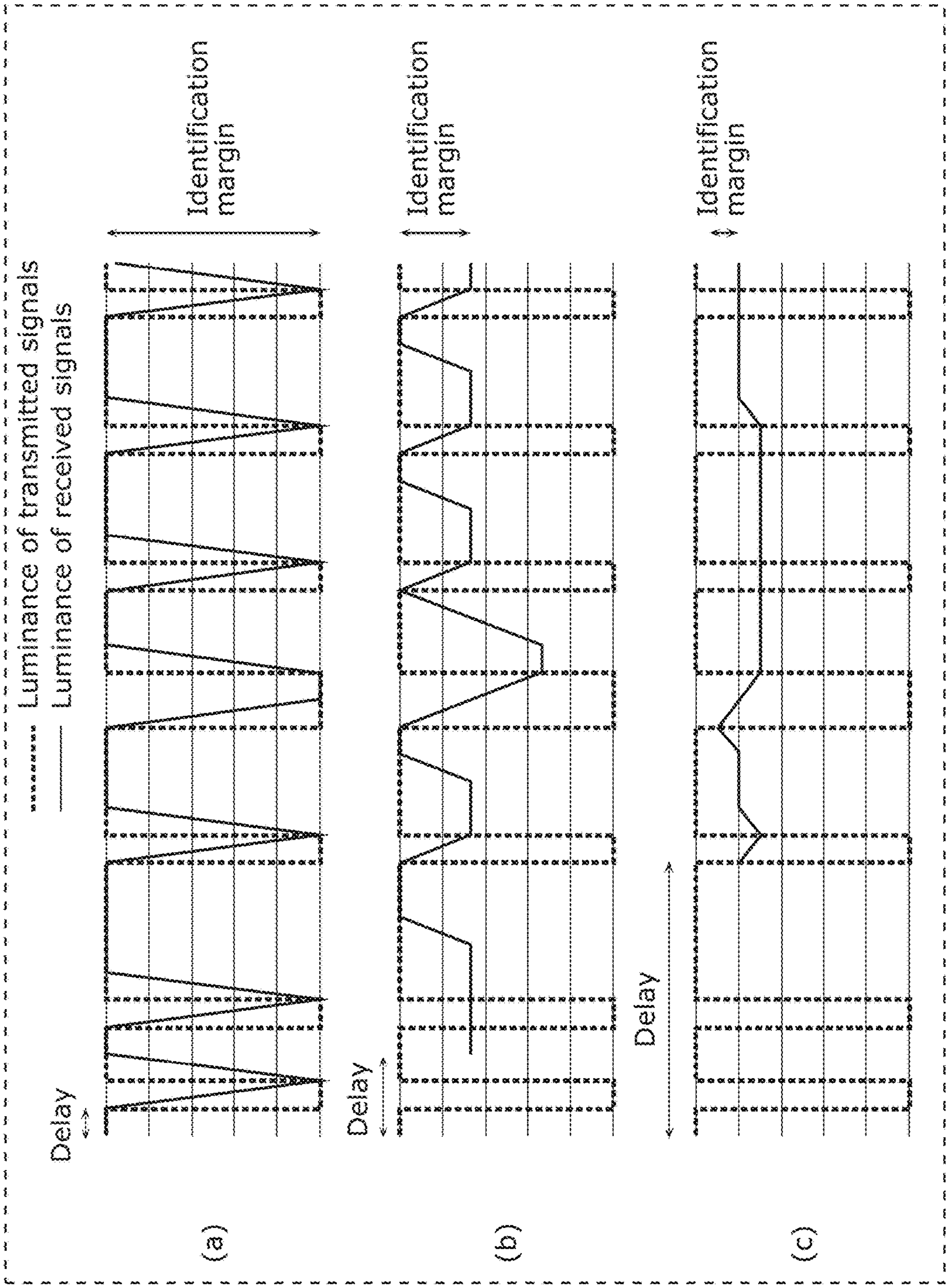
Figure 278:
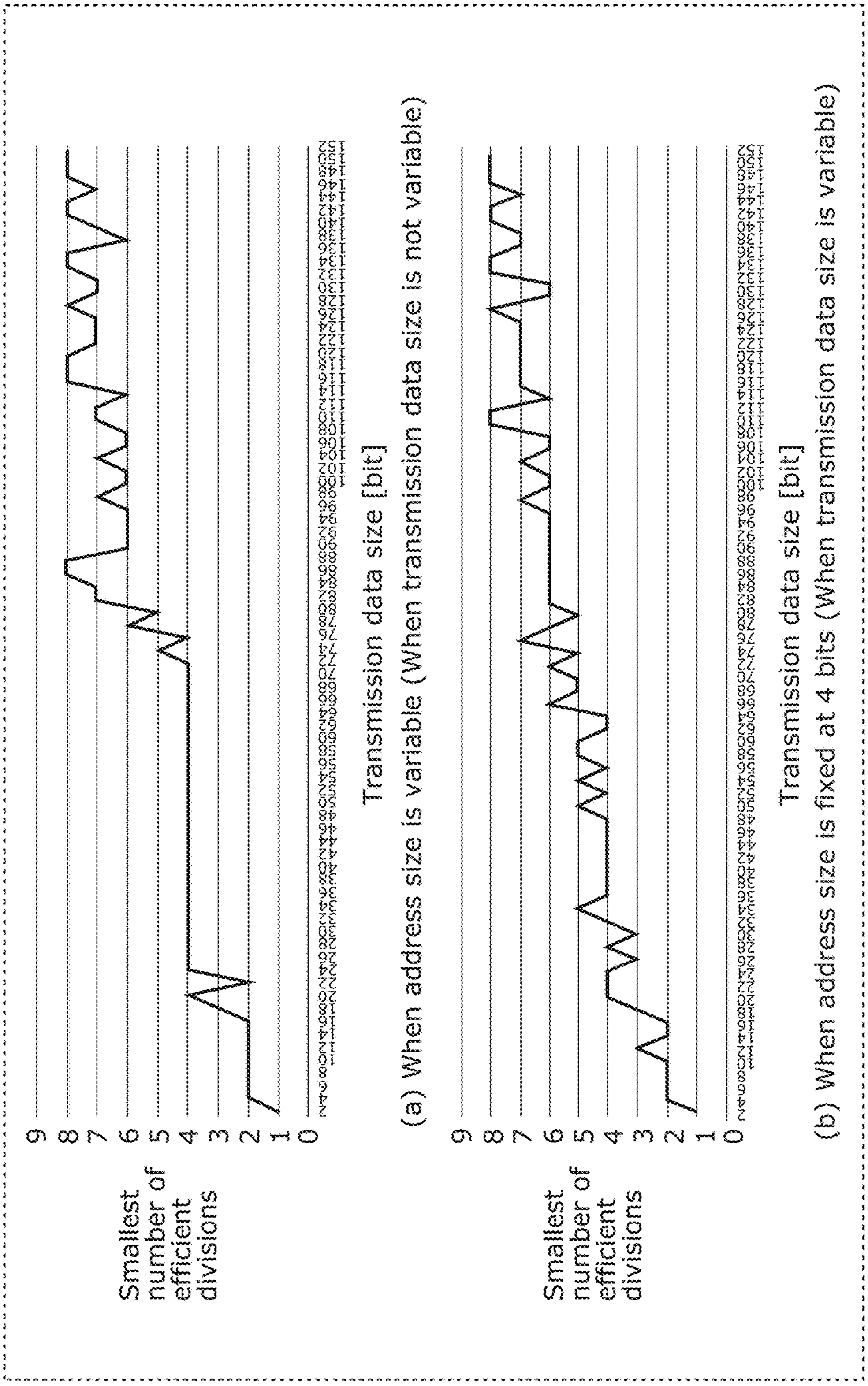
Figure 279A:
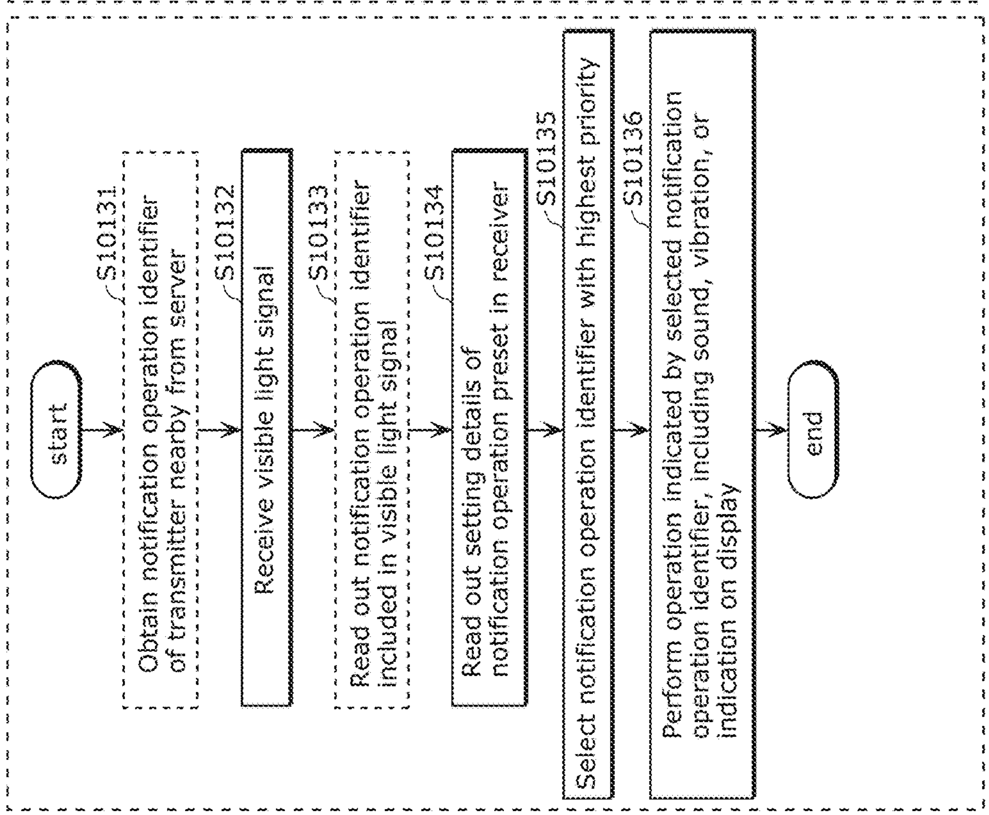
Figure 279B:
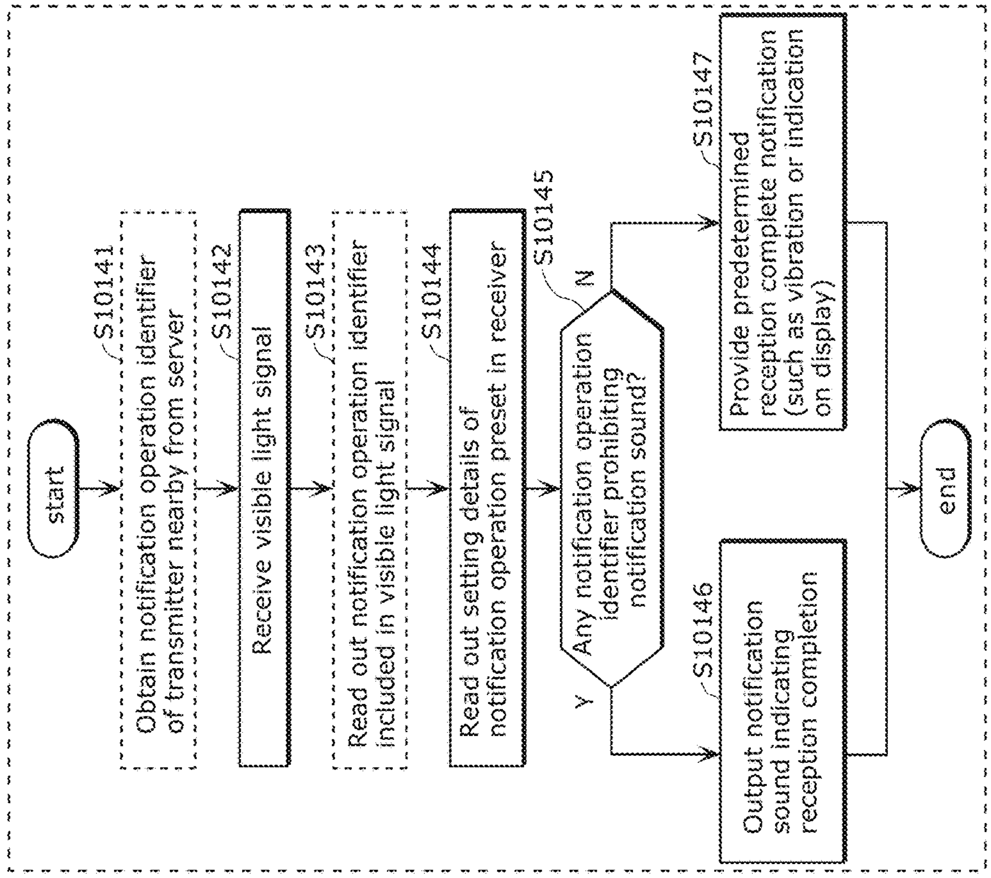
Figure 280A:
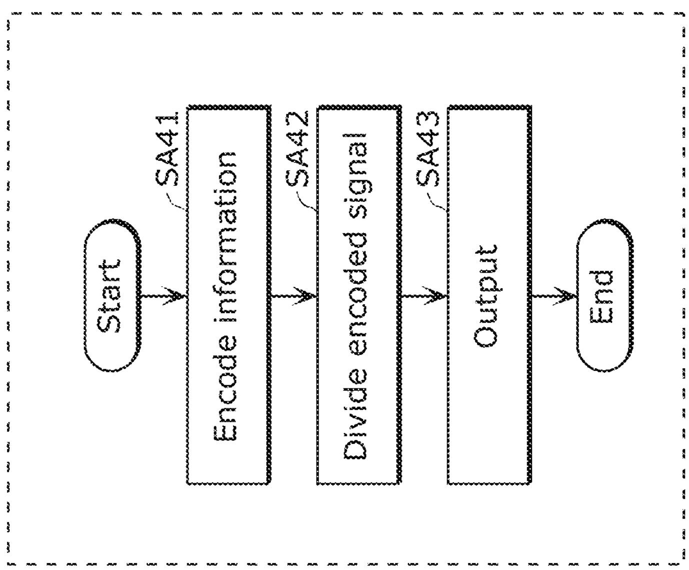
Figure 280B:
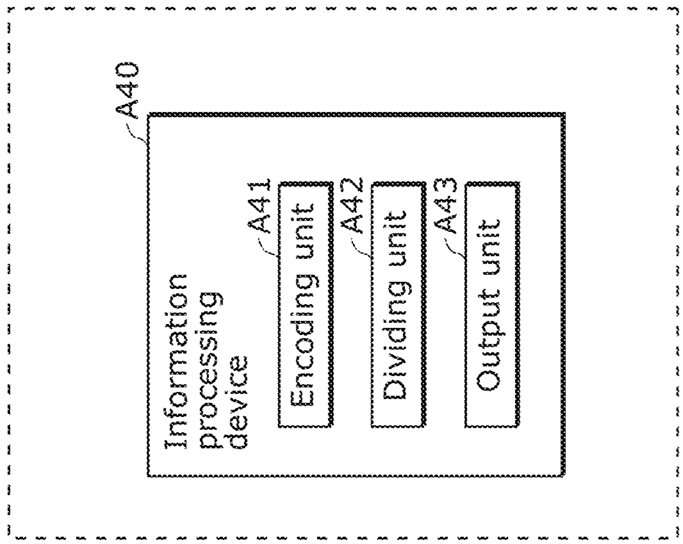
Figure 281:
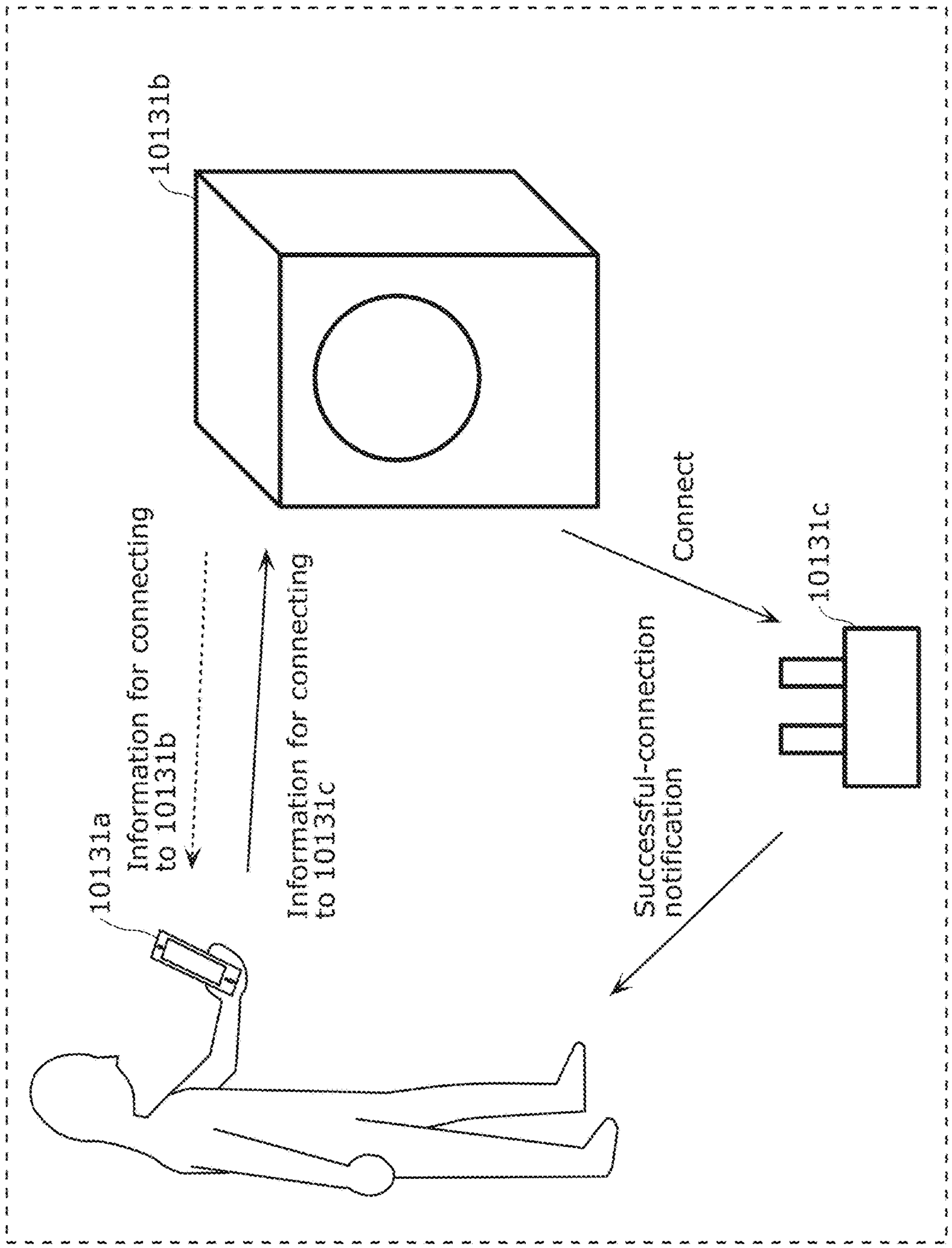
Figure 282:
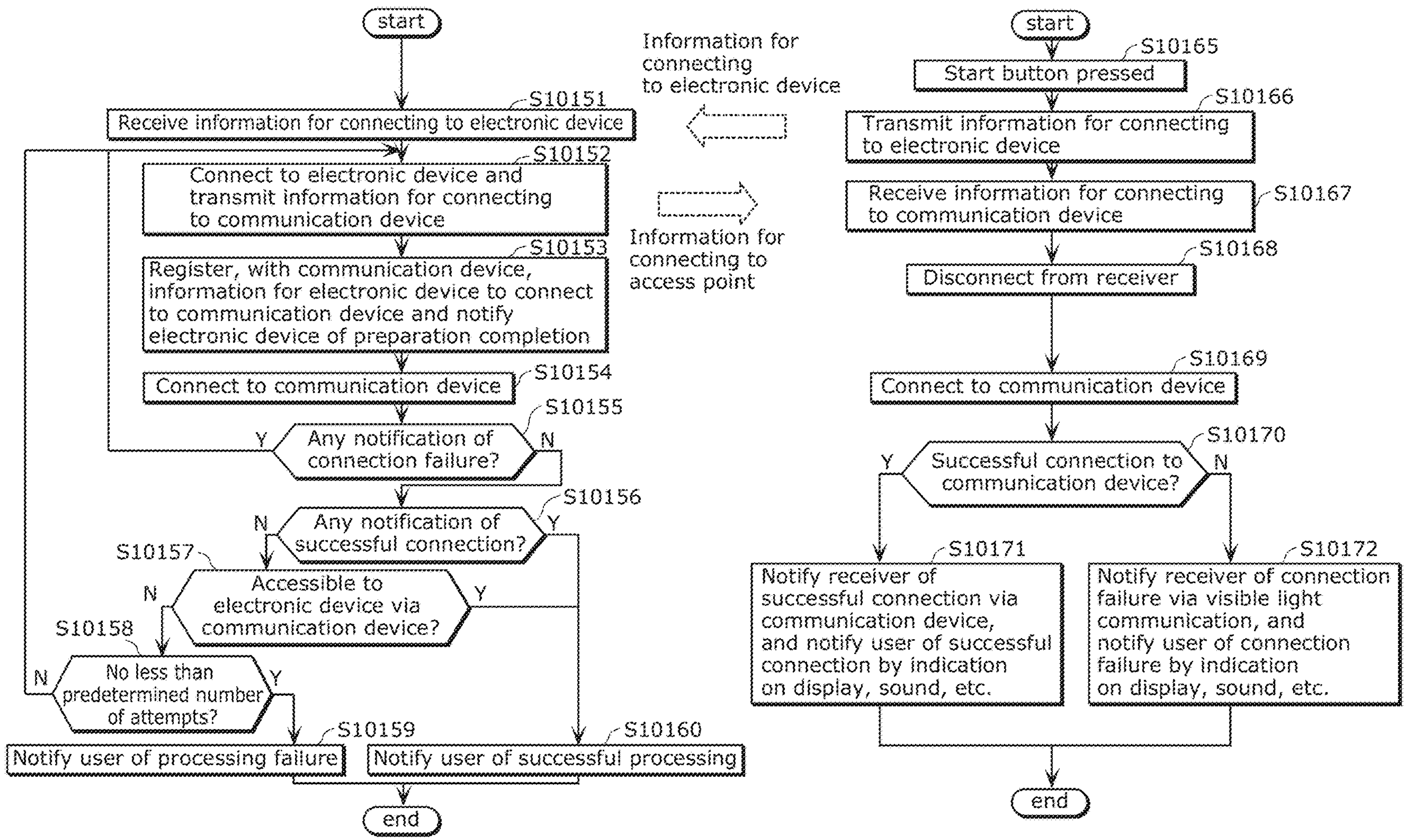
Figure 283:
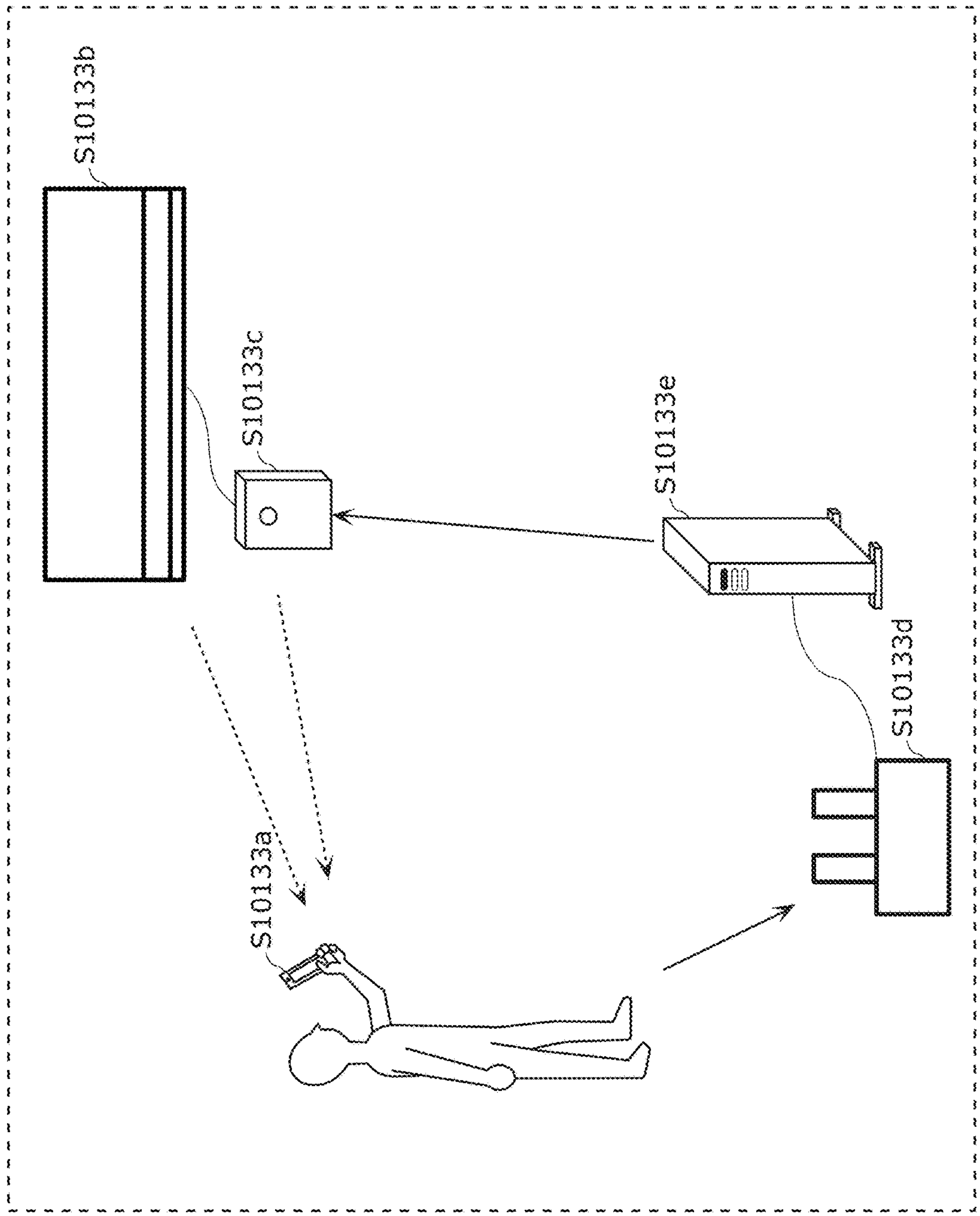
Figure 284:
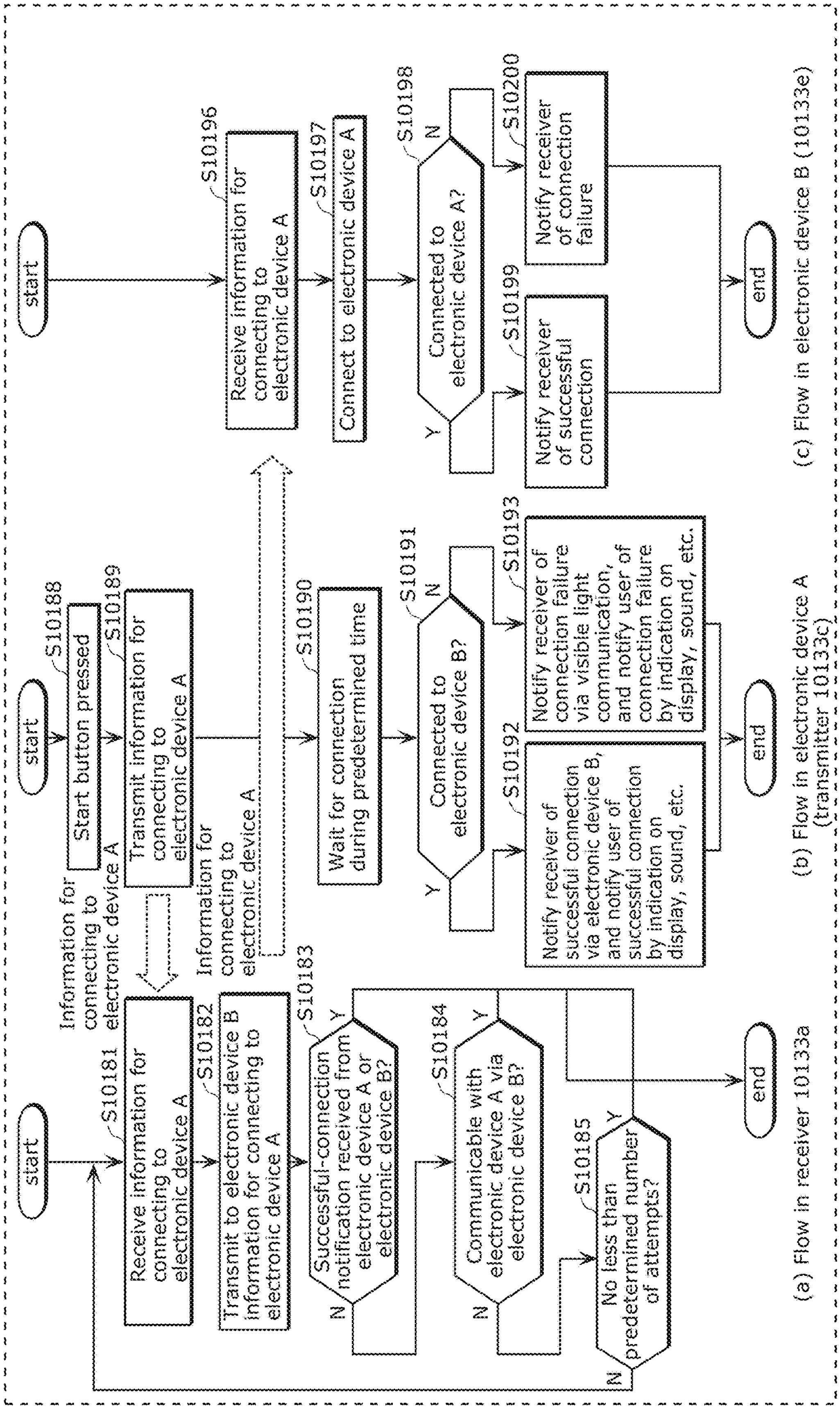
Figure 285:
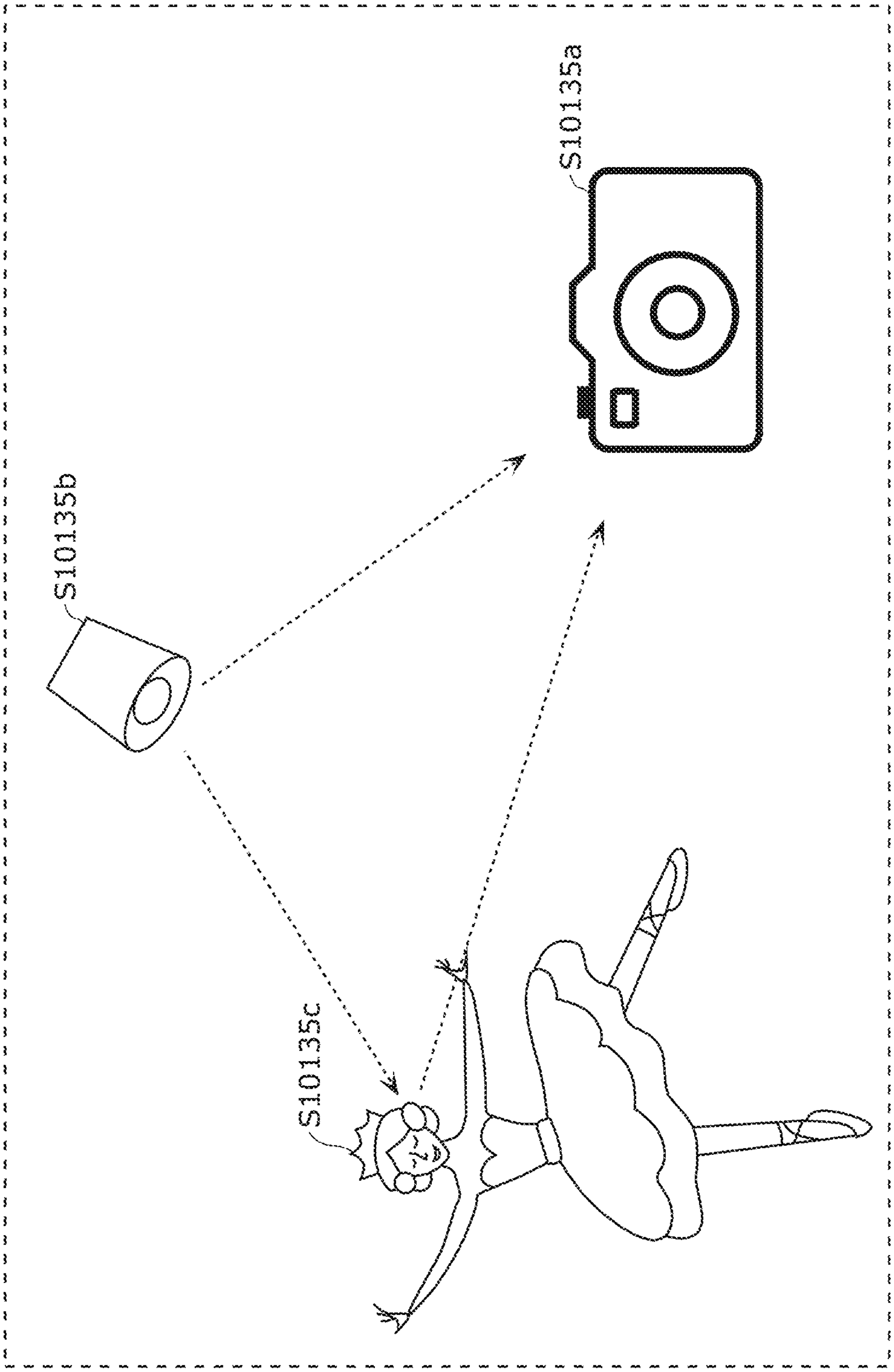
Figure 286:
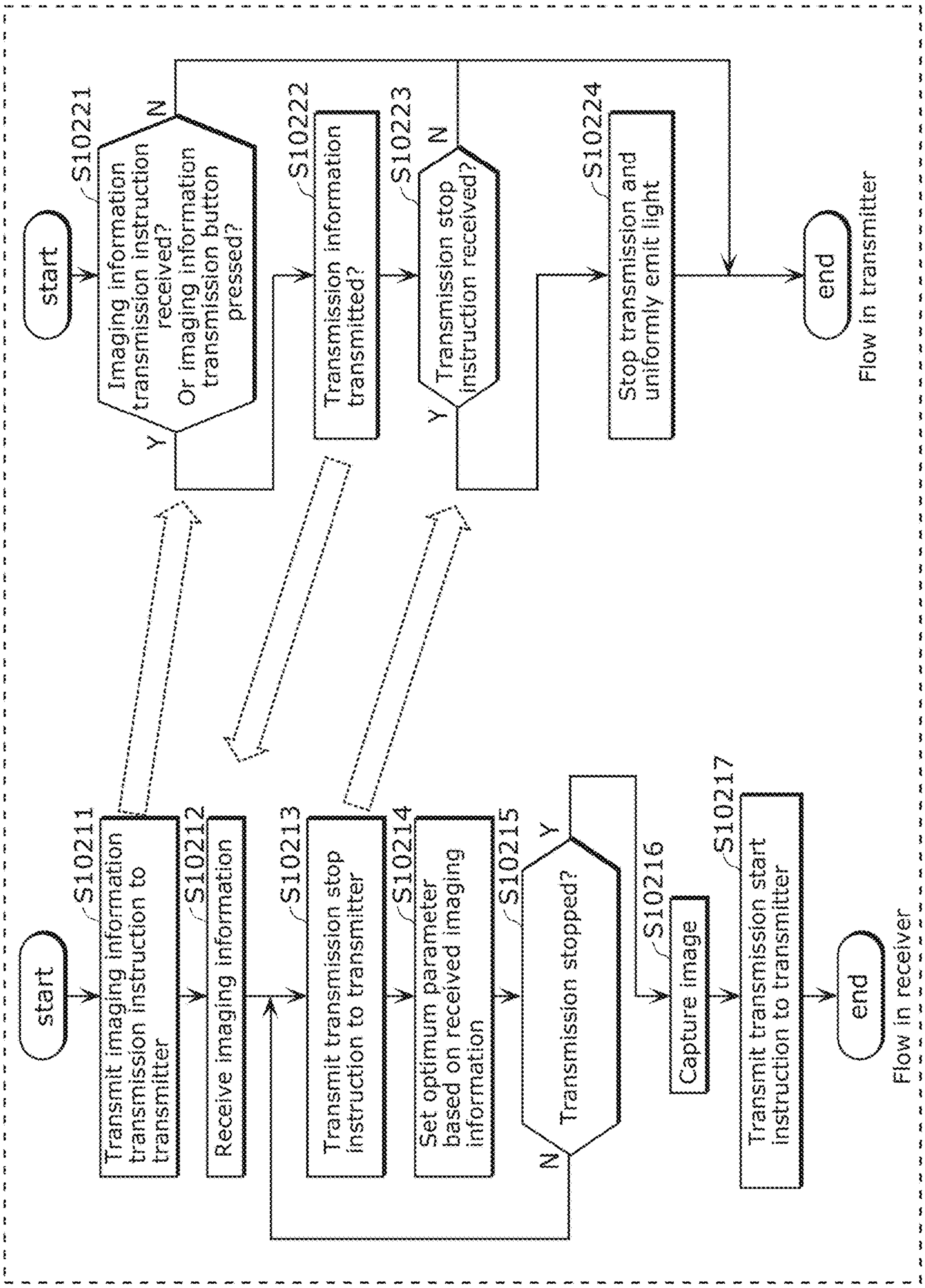
Figure 287:
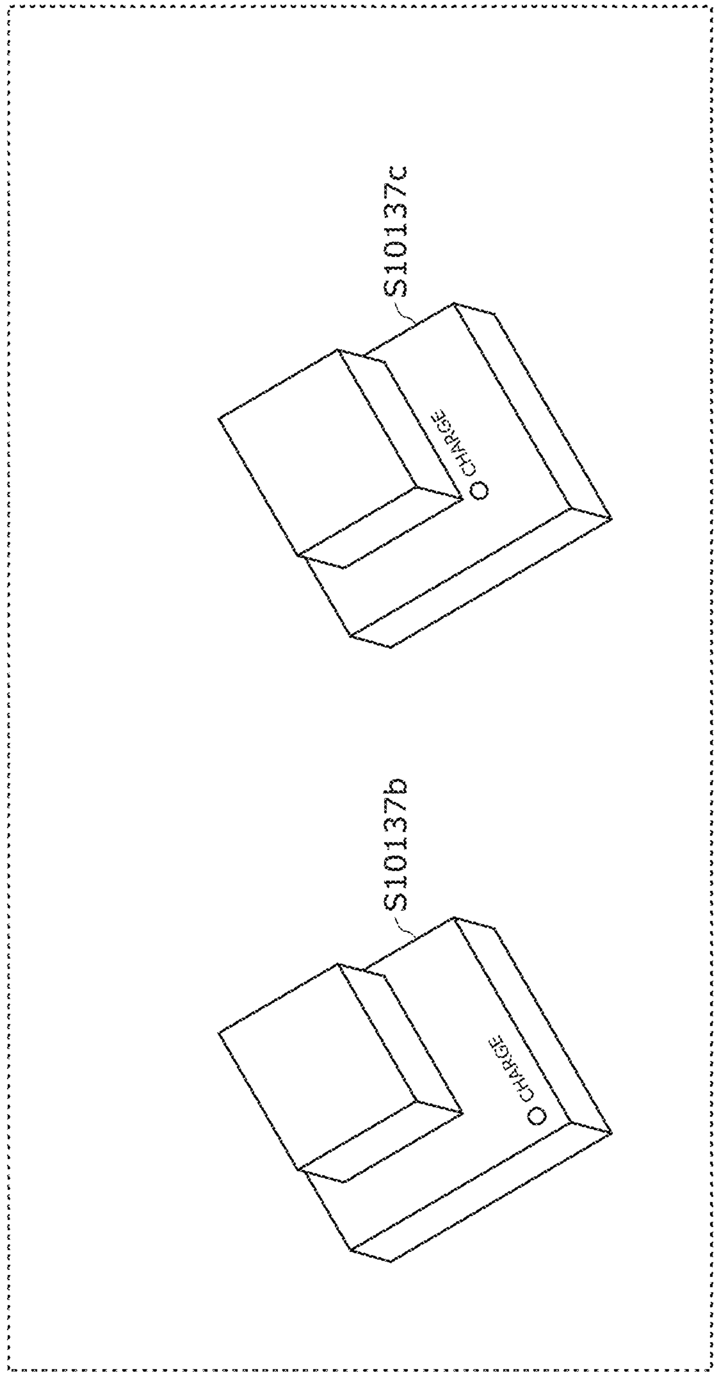
Figure 288:
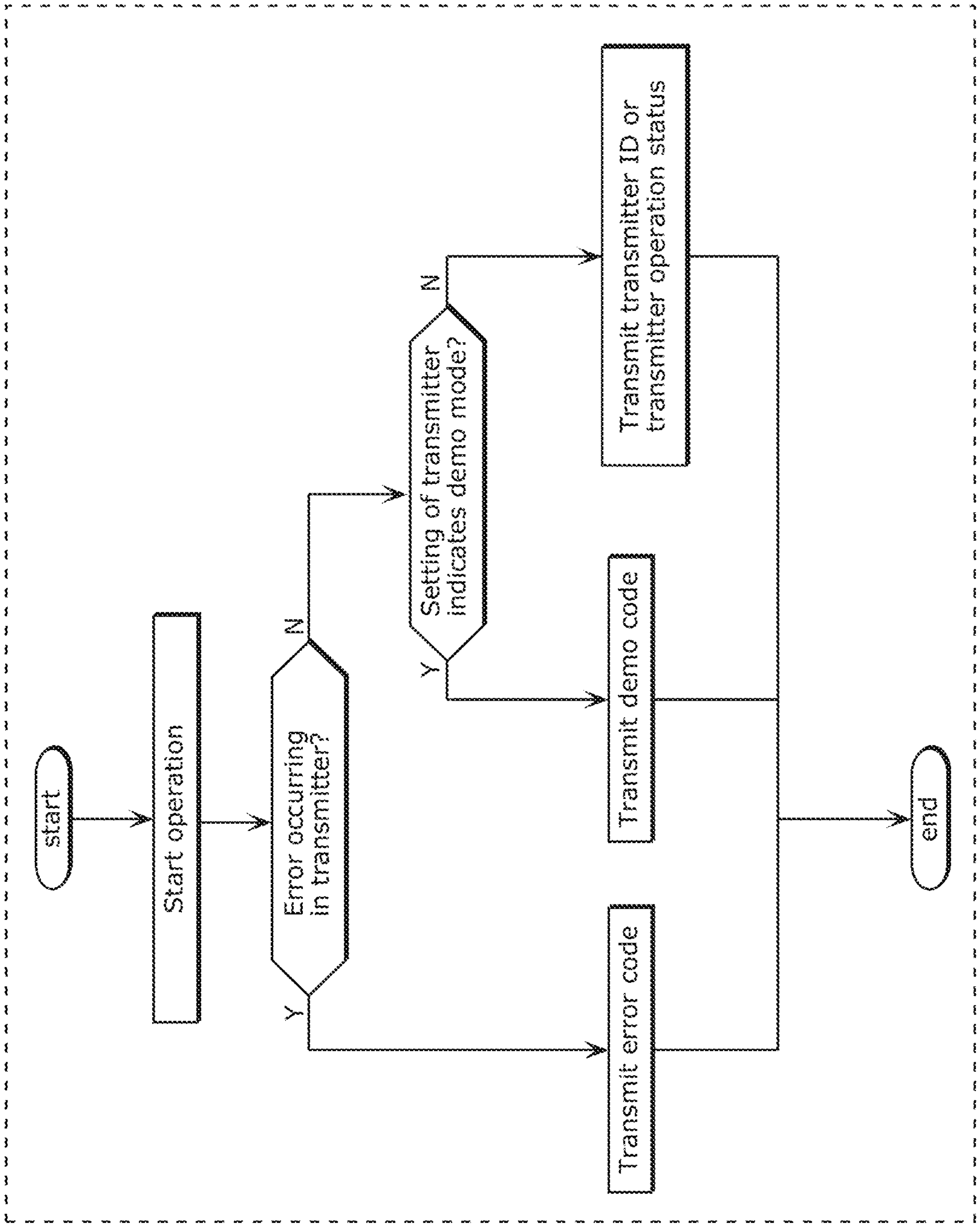
Figure 289:
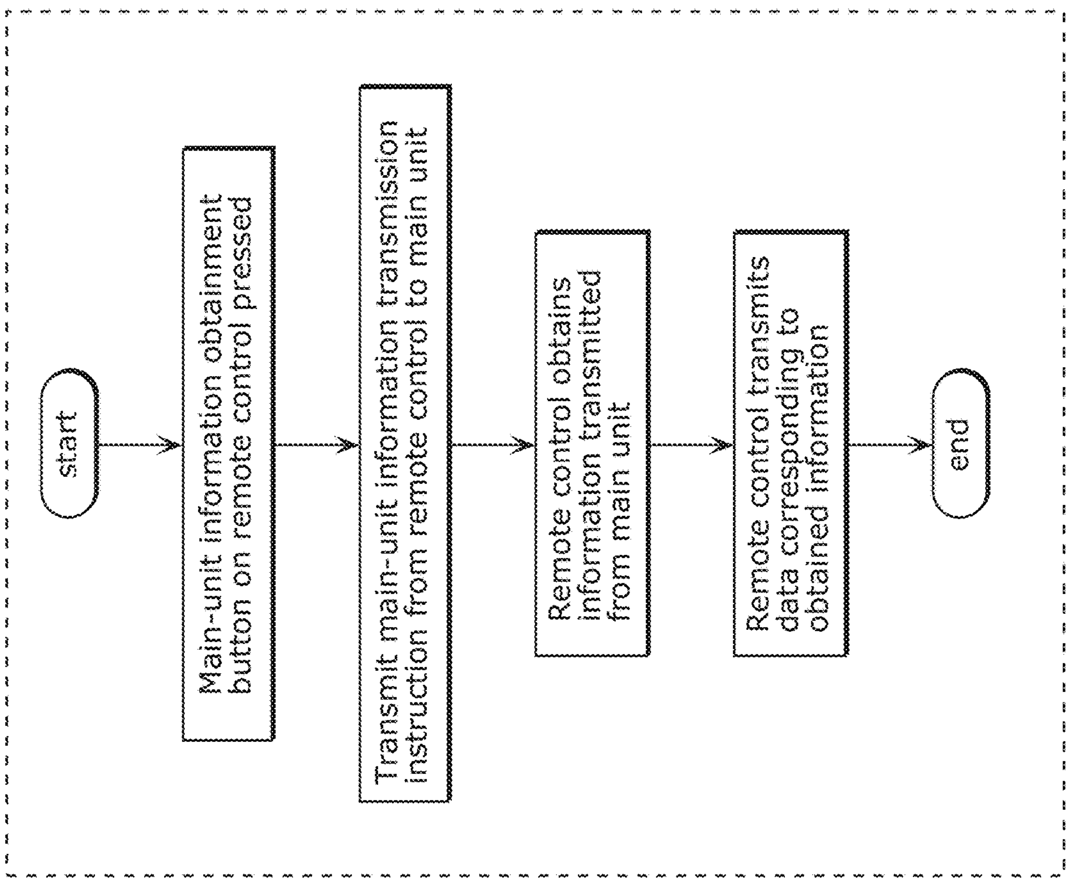
Figure 290:
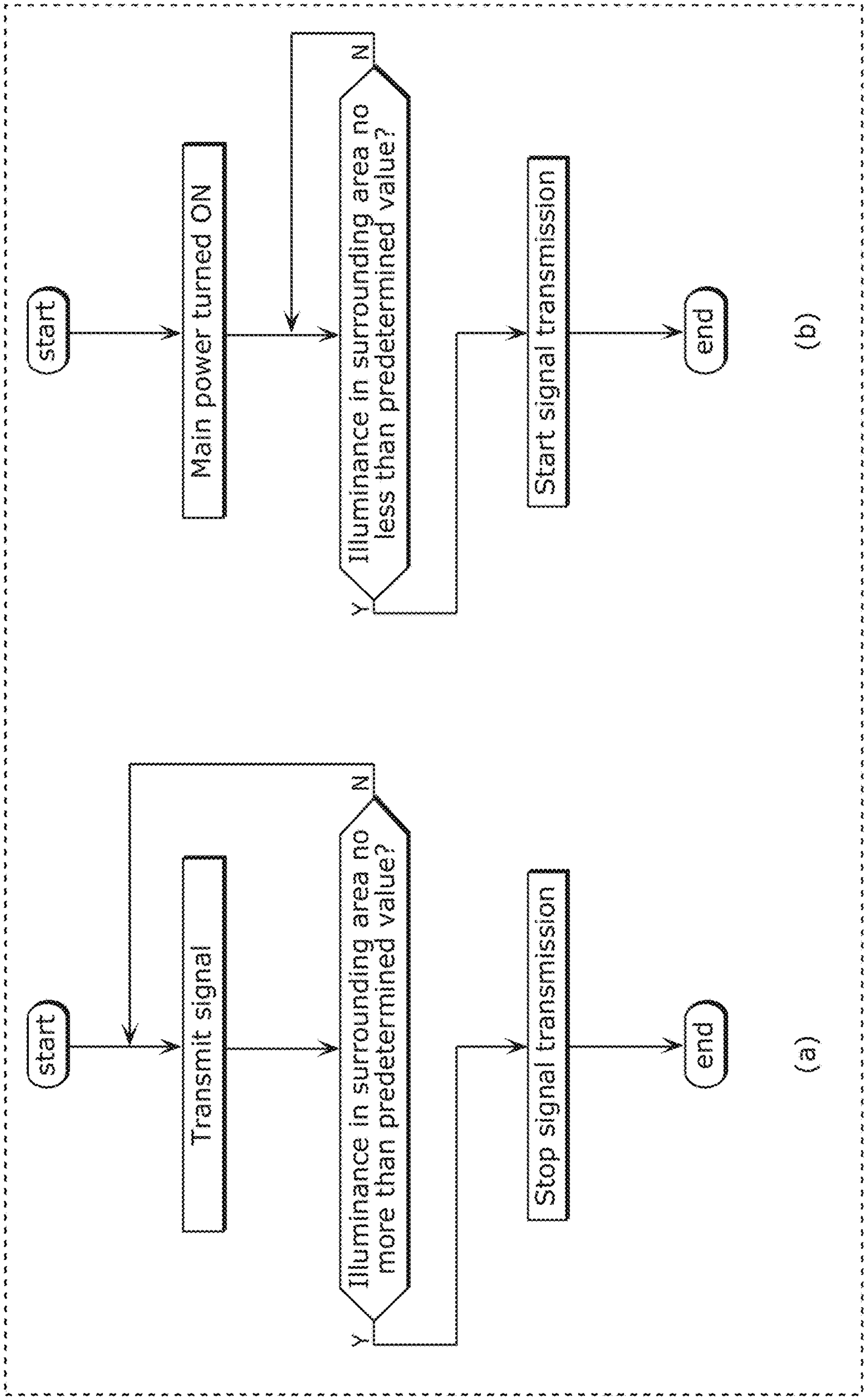
Figure 291:
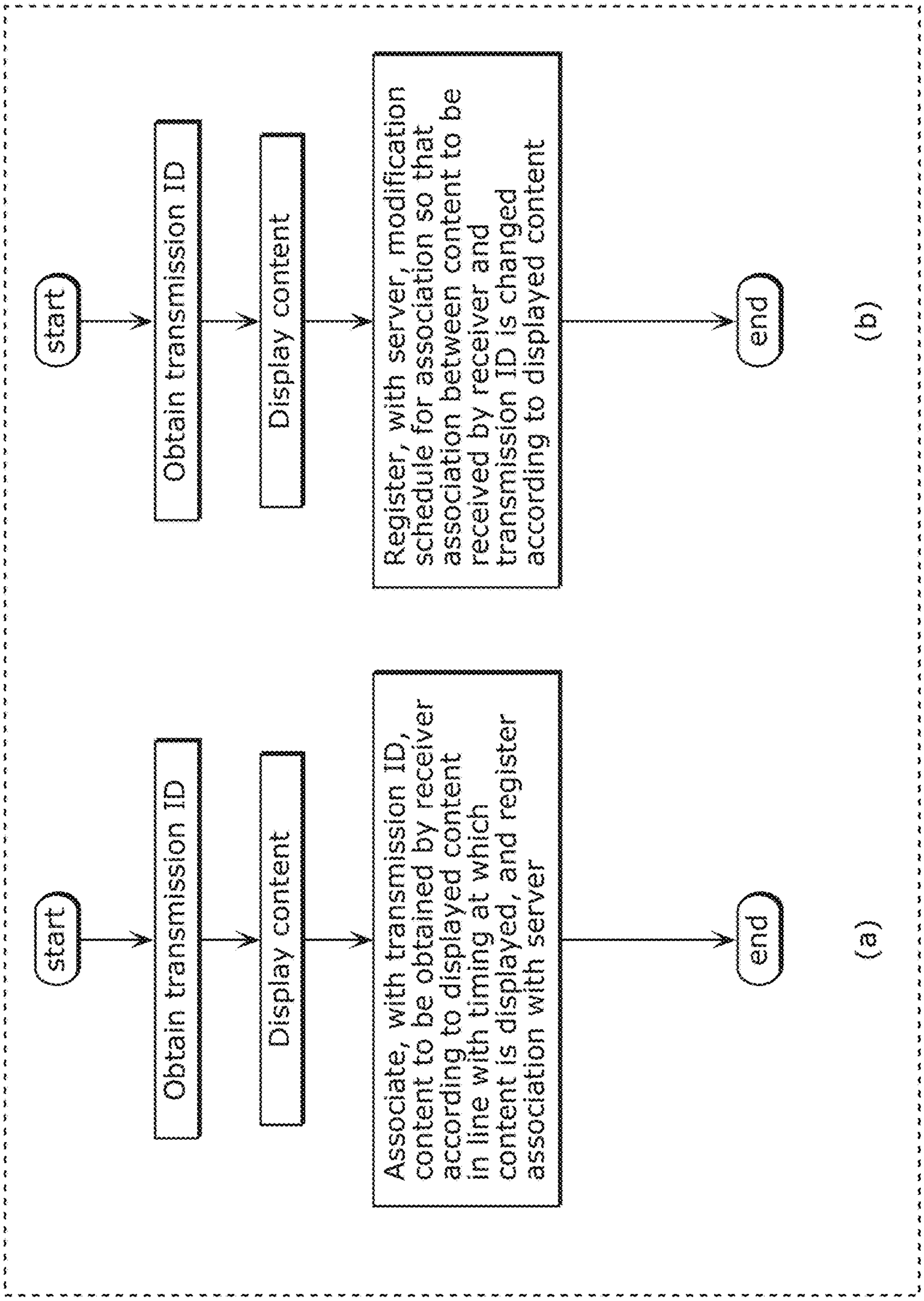
Figure 292:
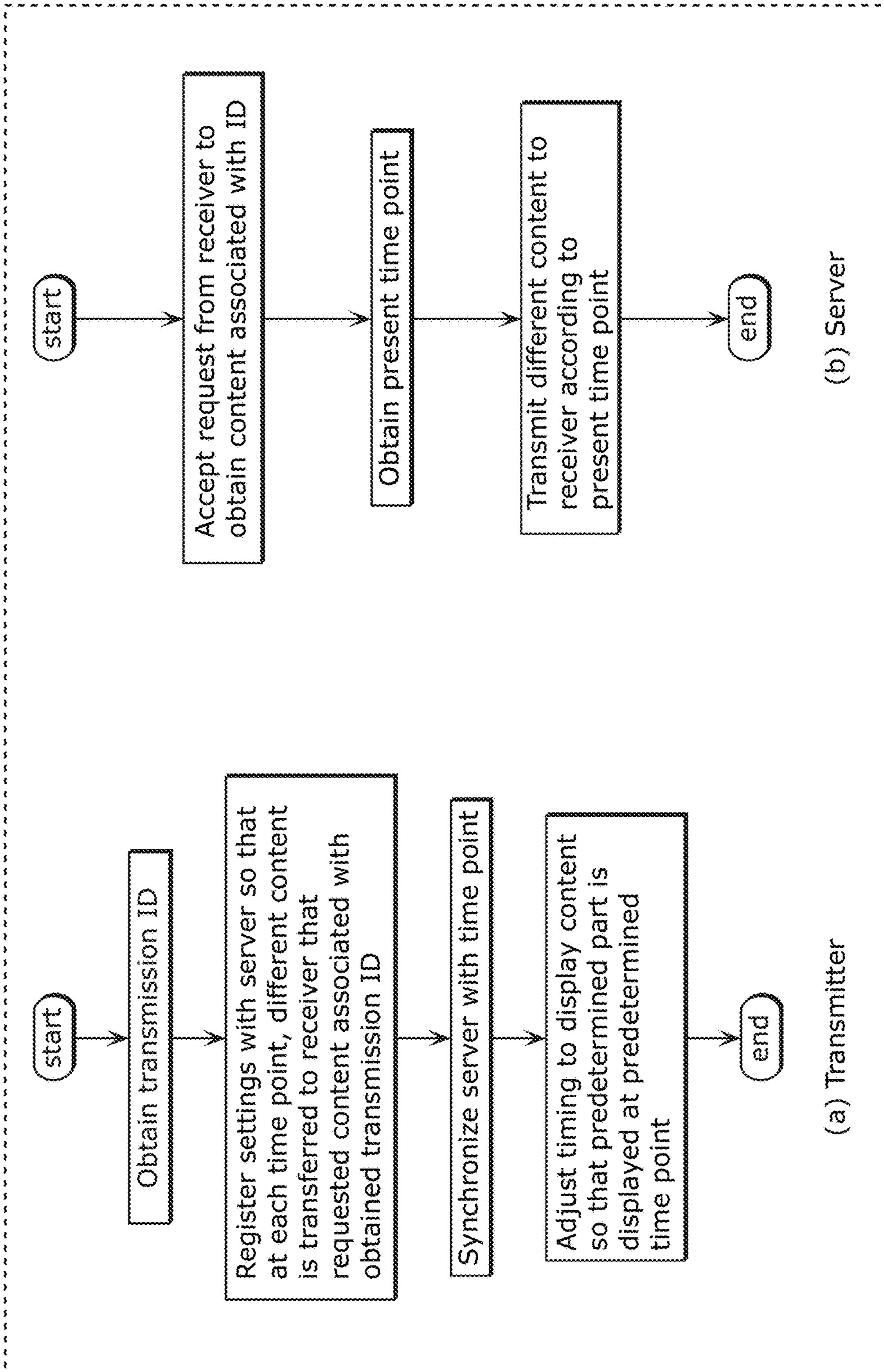
Figure 293:
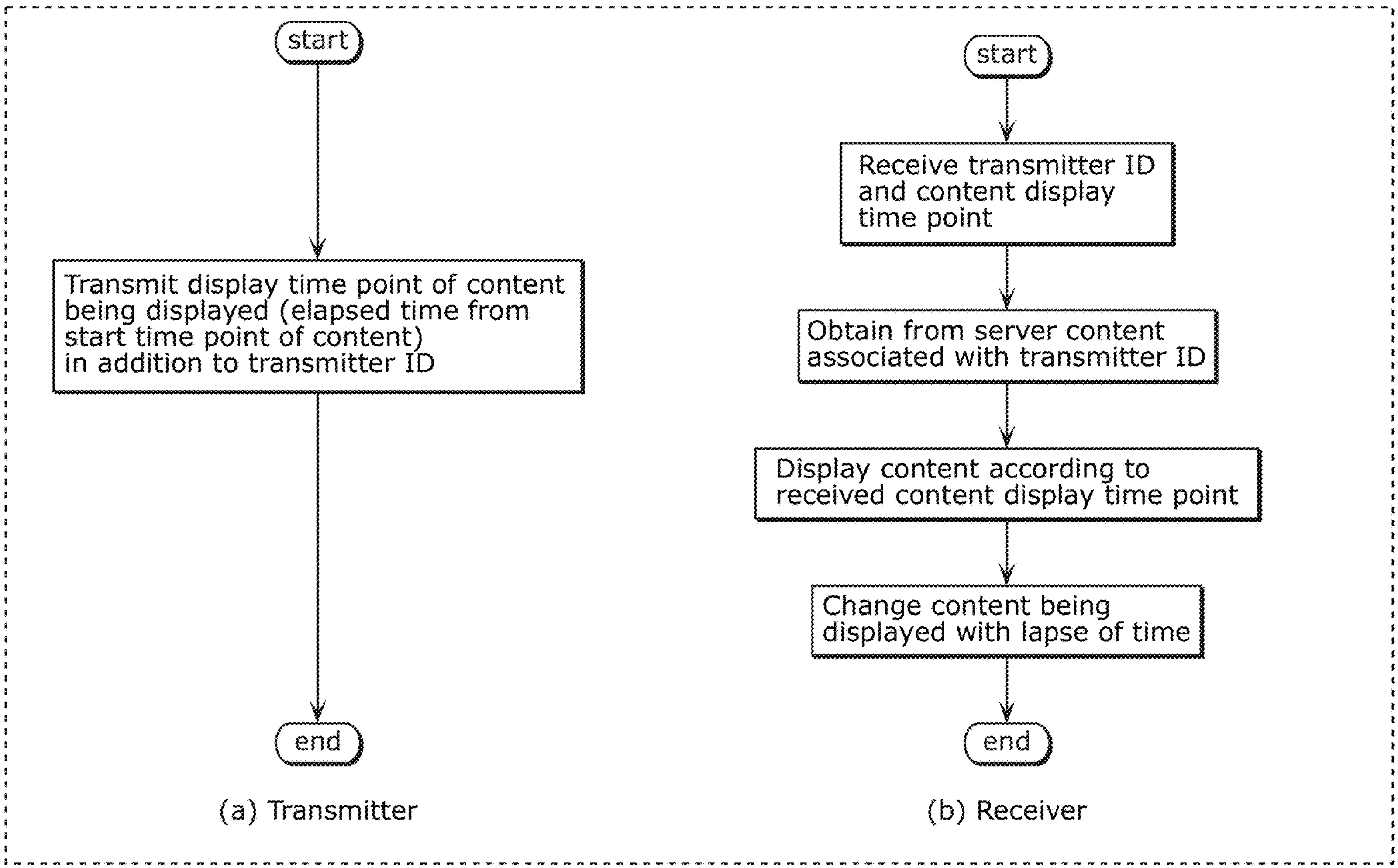
Figure 294:
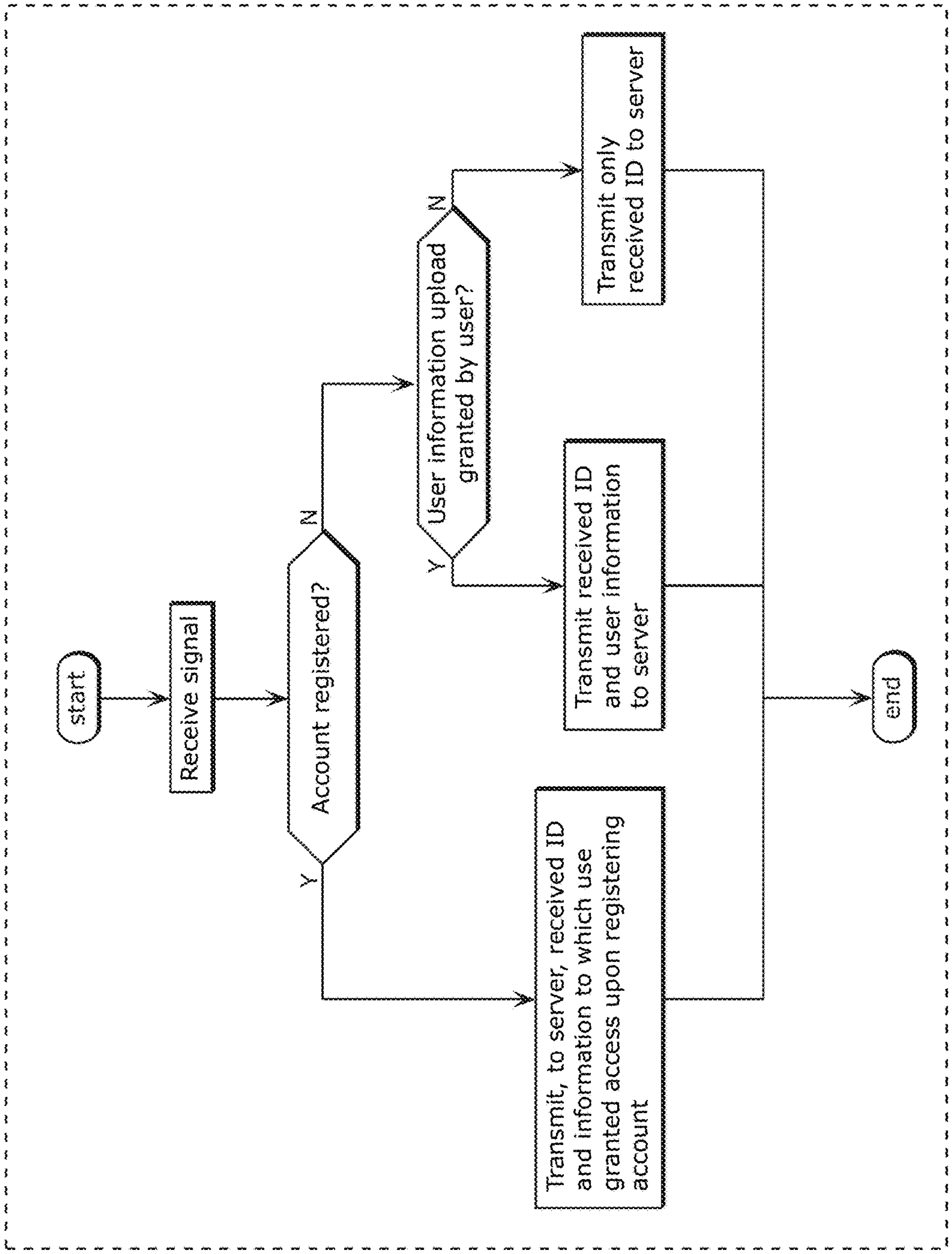
Figure 295:
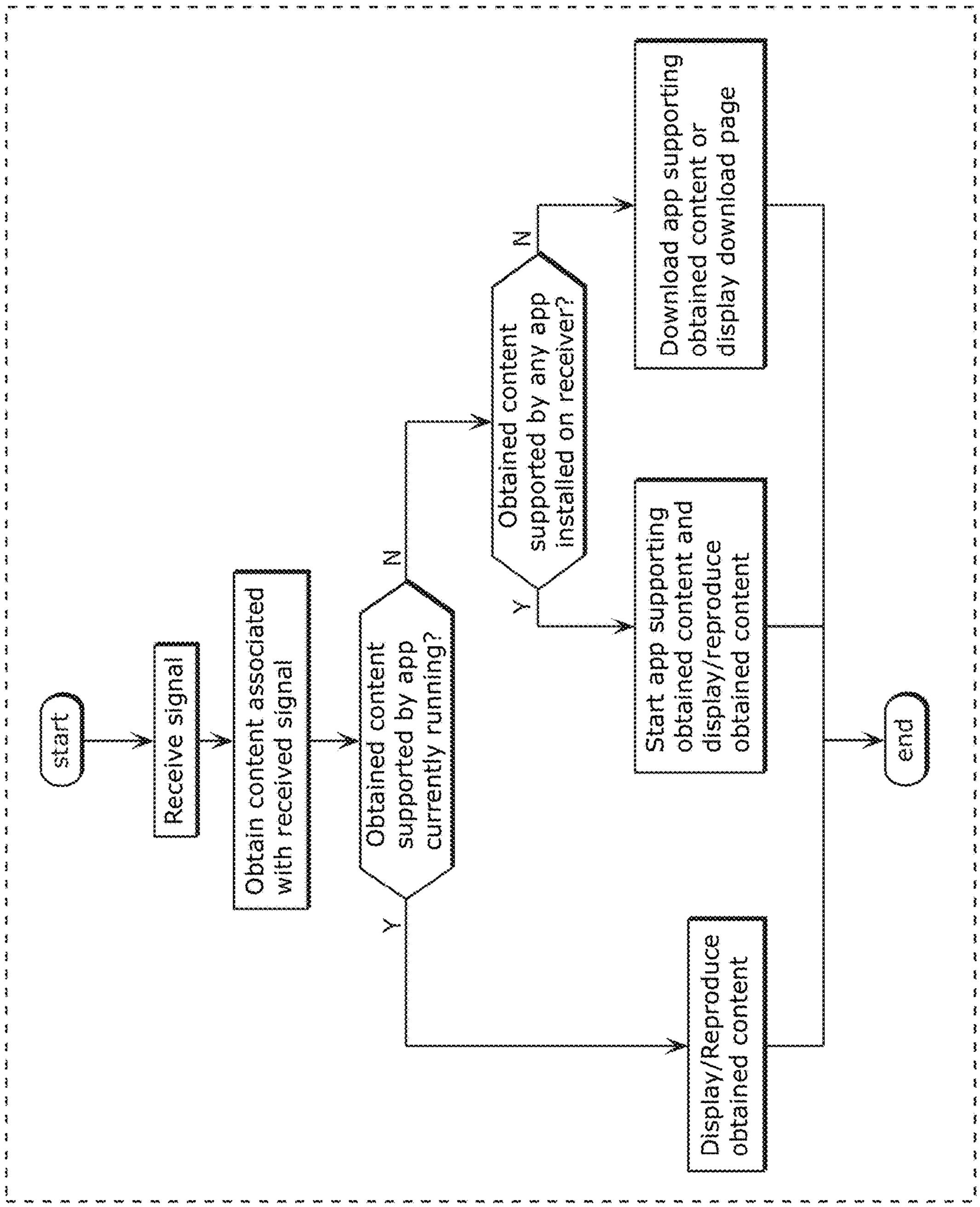
Figure 296:
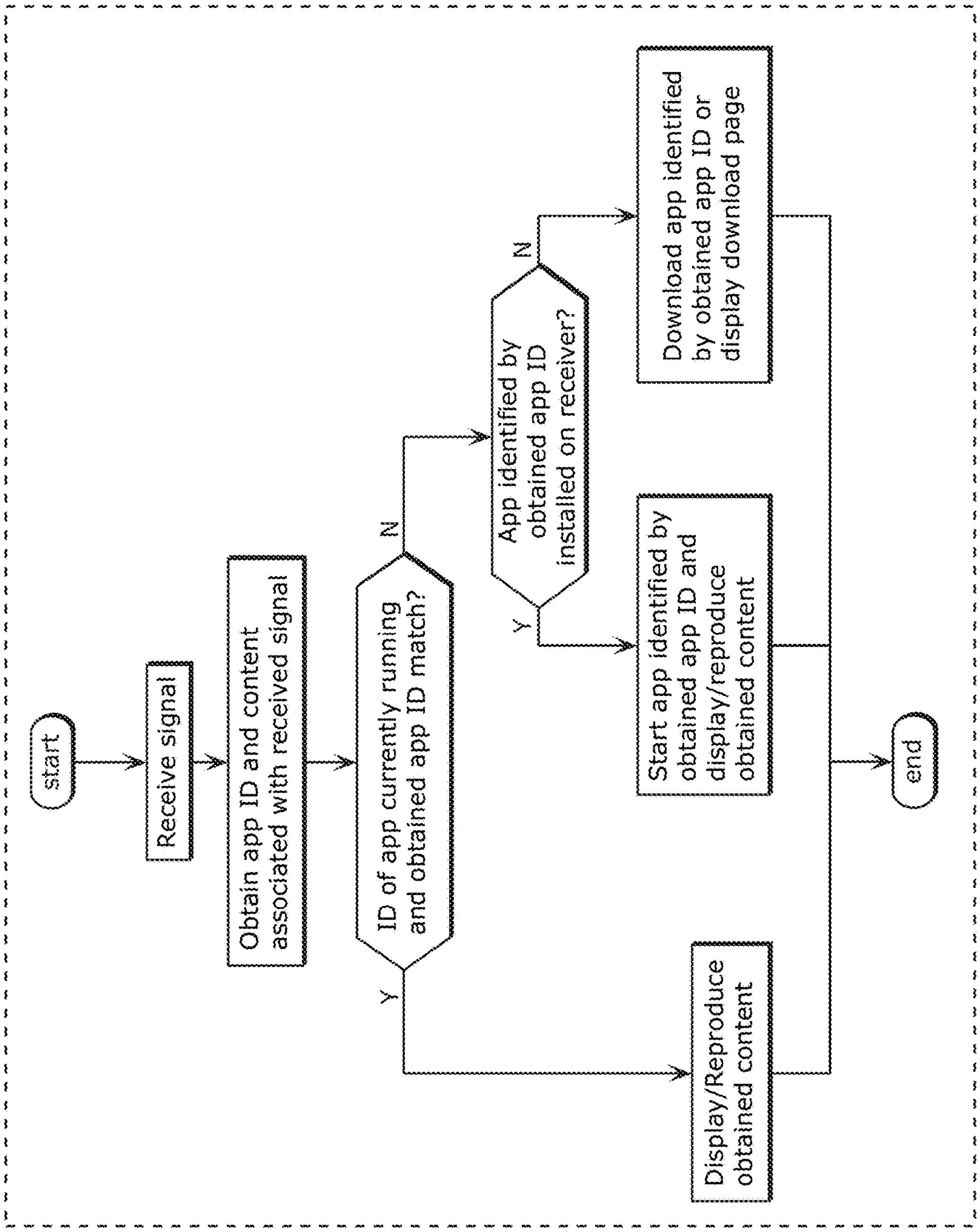
Figure 297:
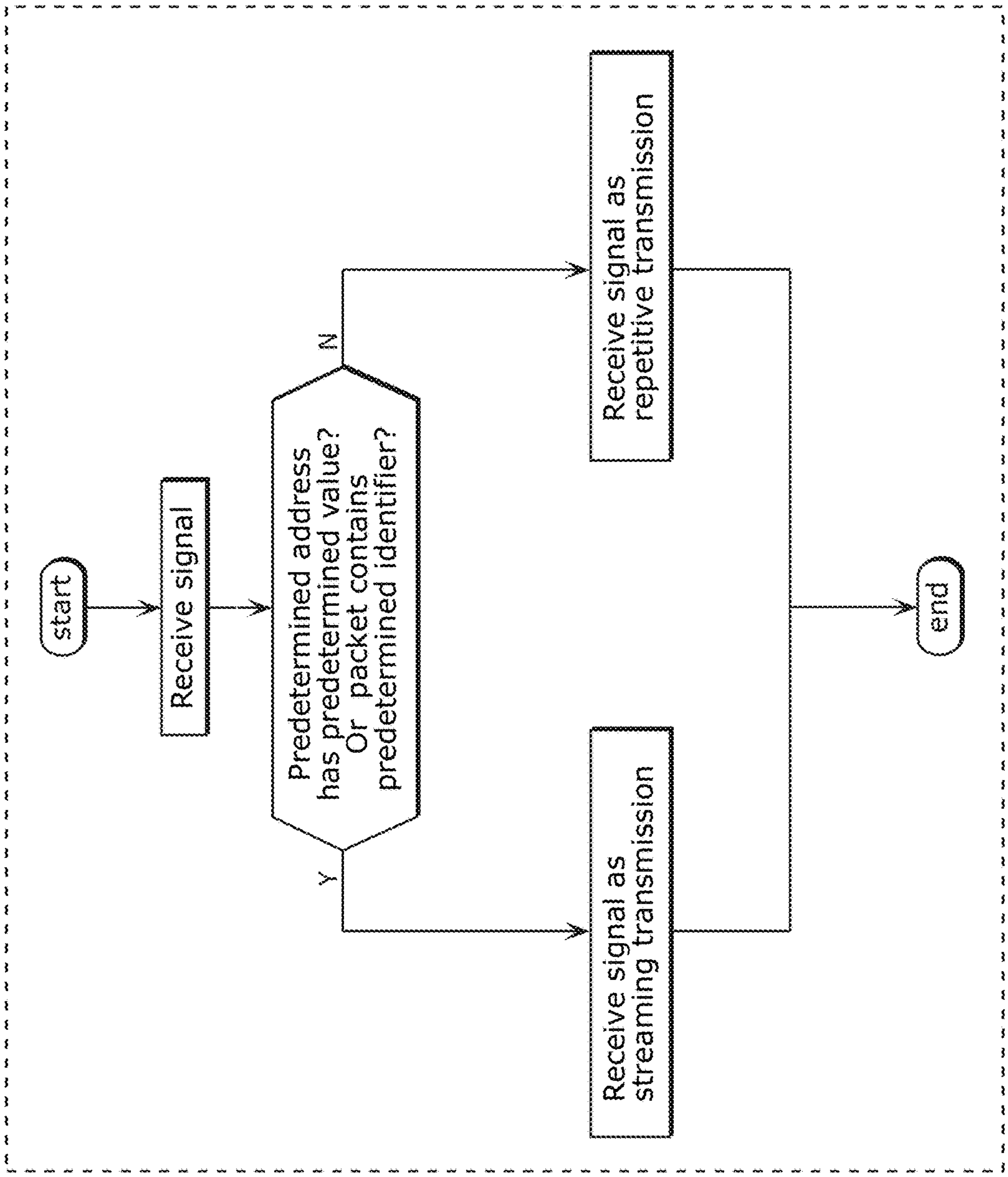
Figure 298:
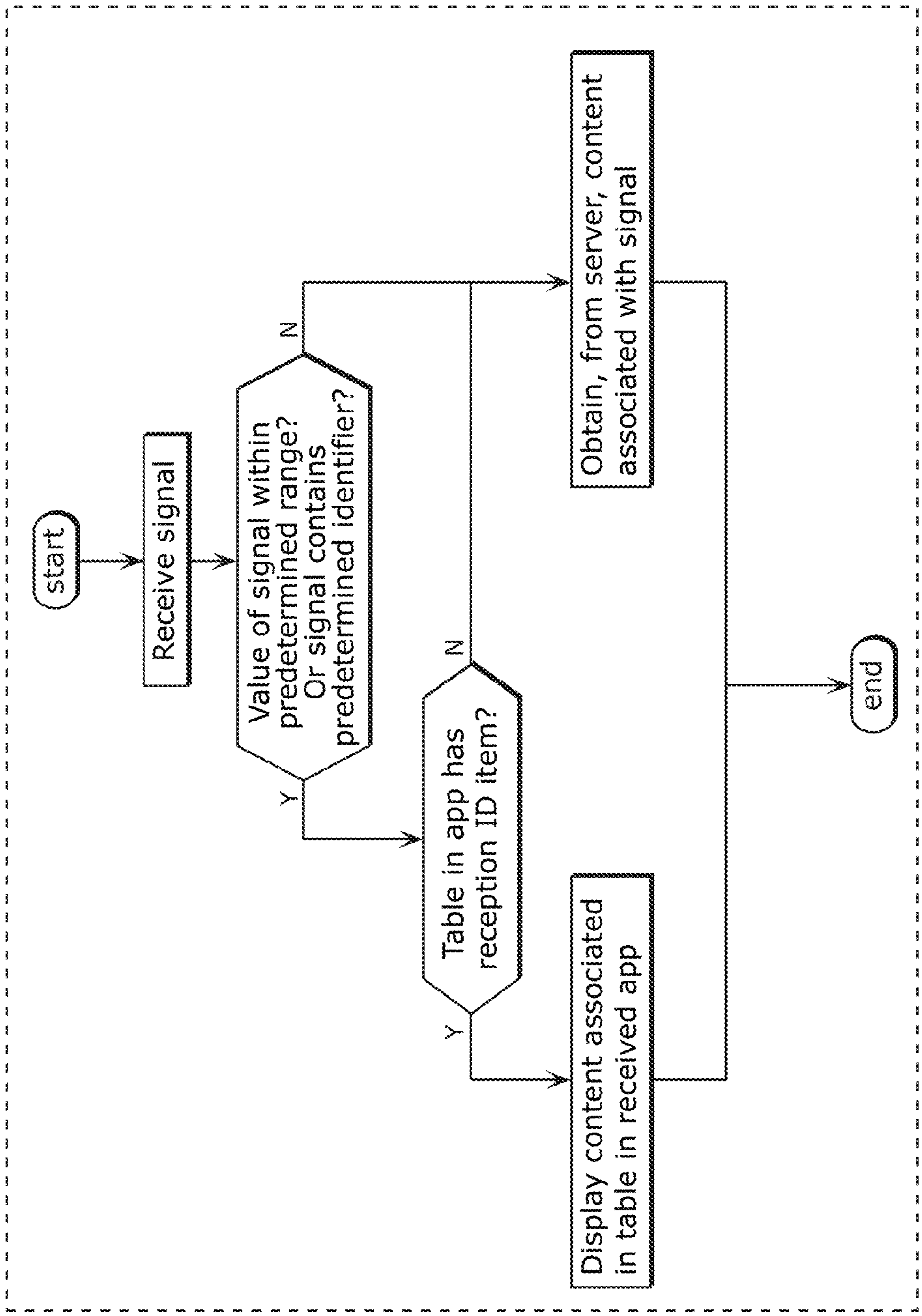
Figure 299:
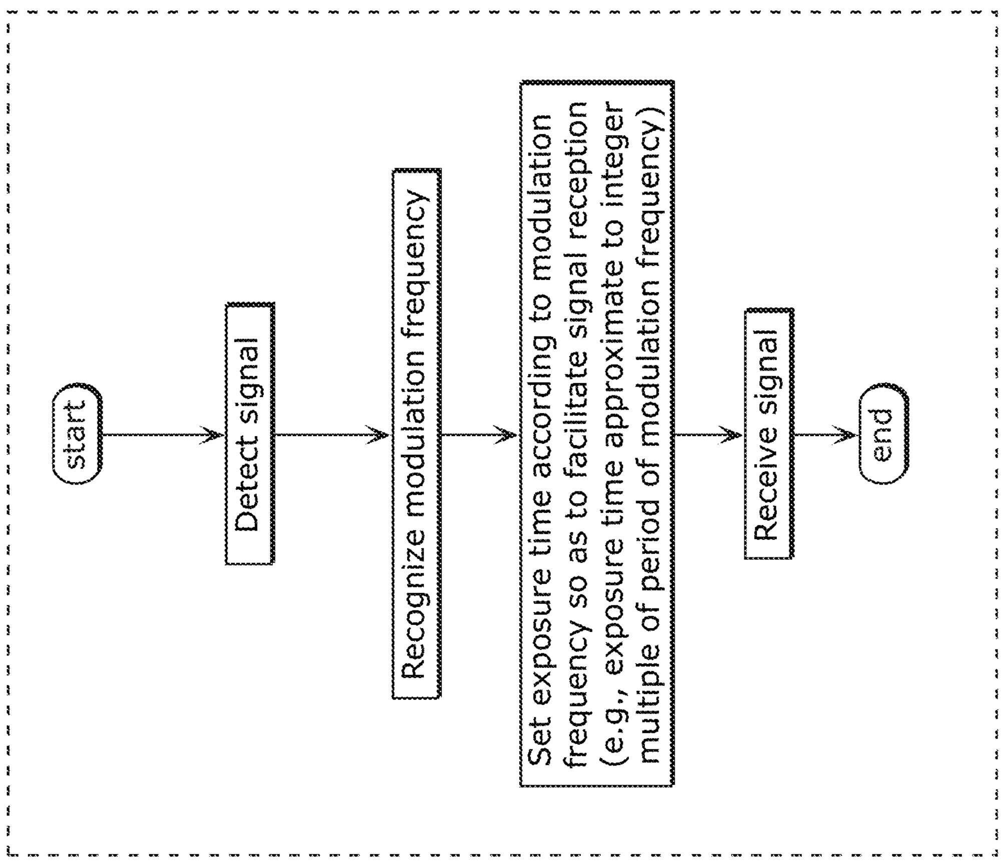
Figure 300:
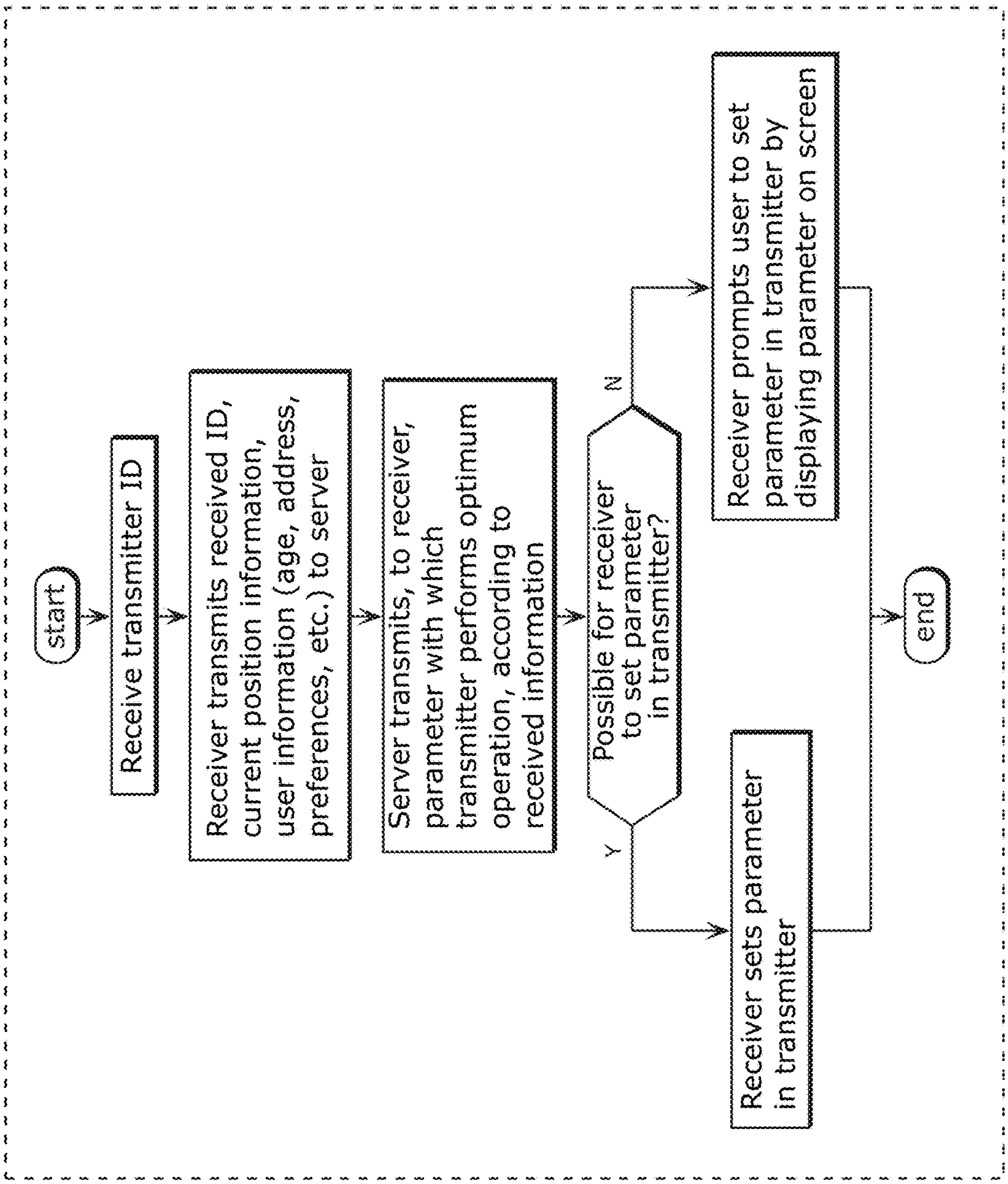
Figure 301:
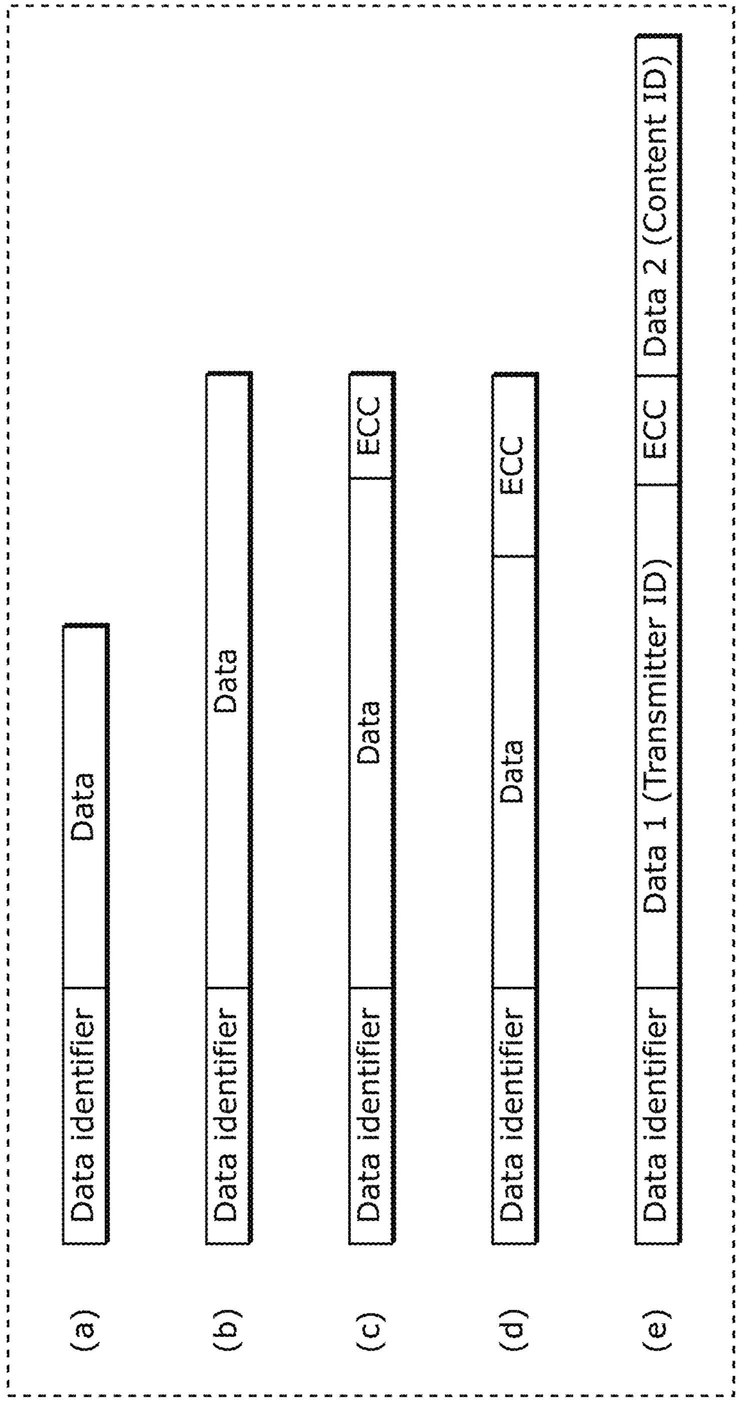
Figure 302:
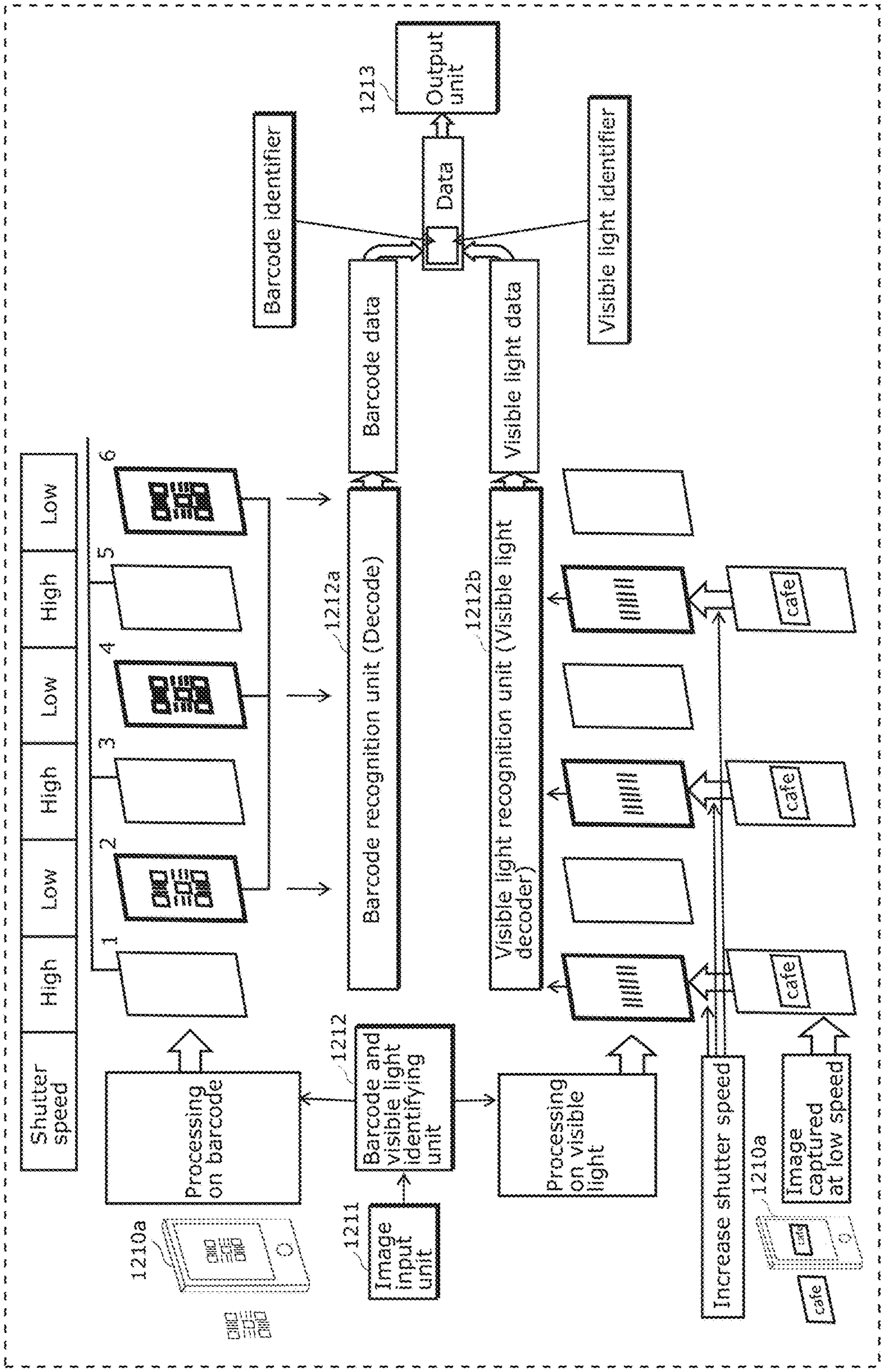
Figure 303A:
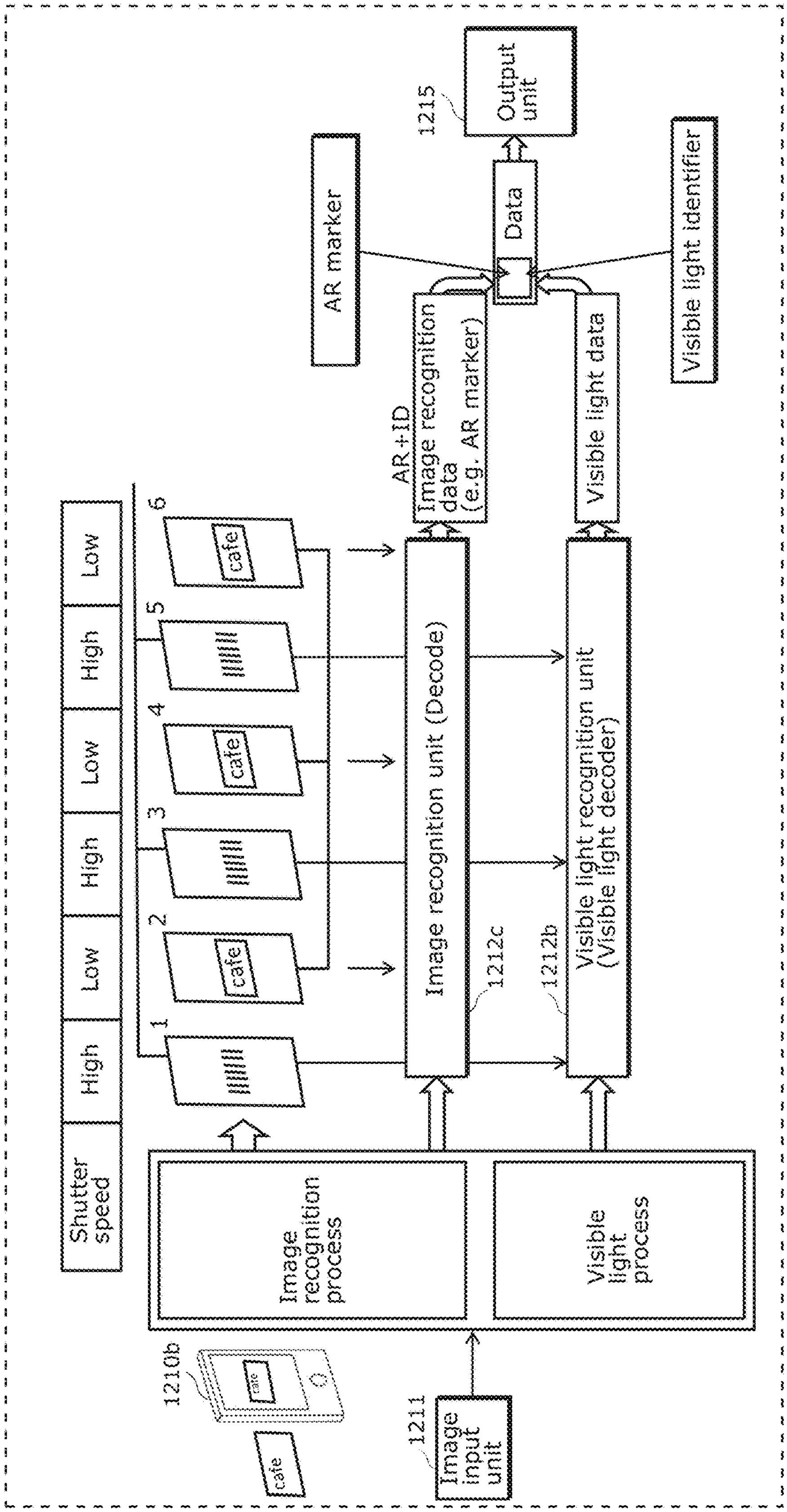
Figure 303B:
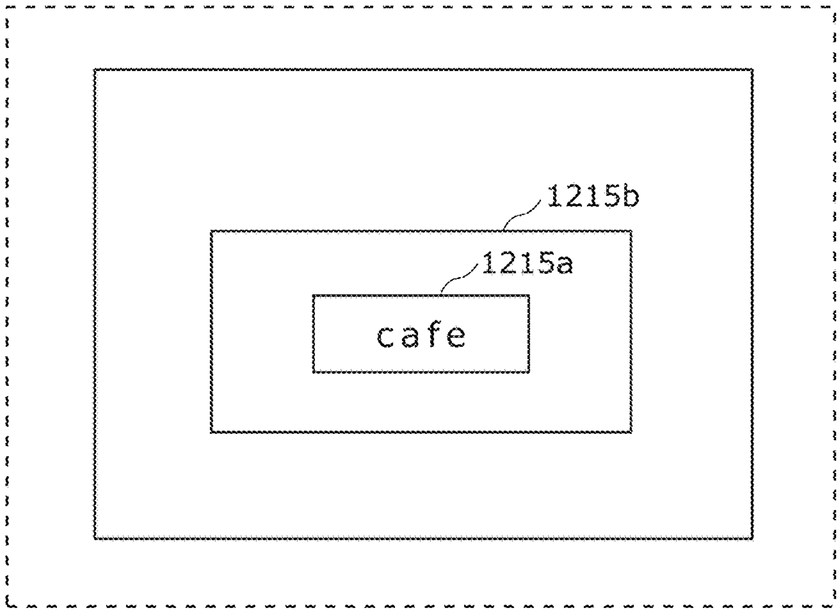
Figure 303C:
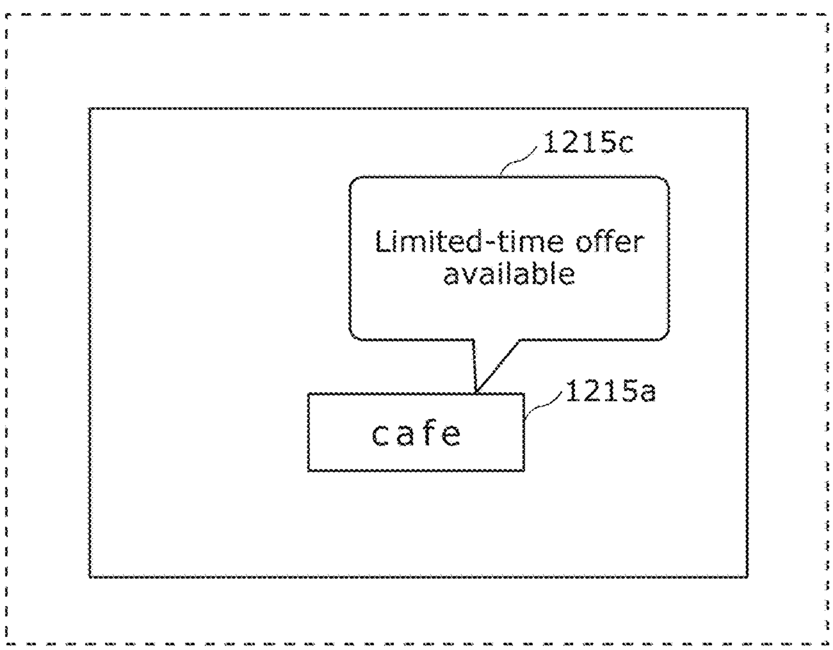
Figure 304A:
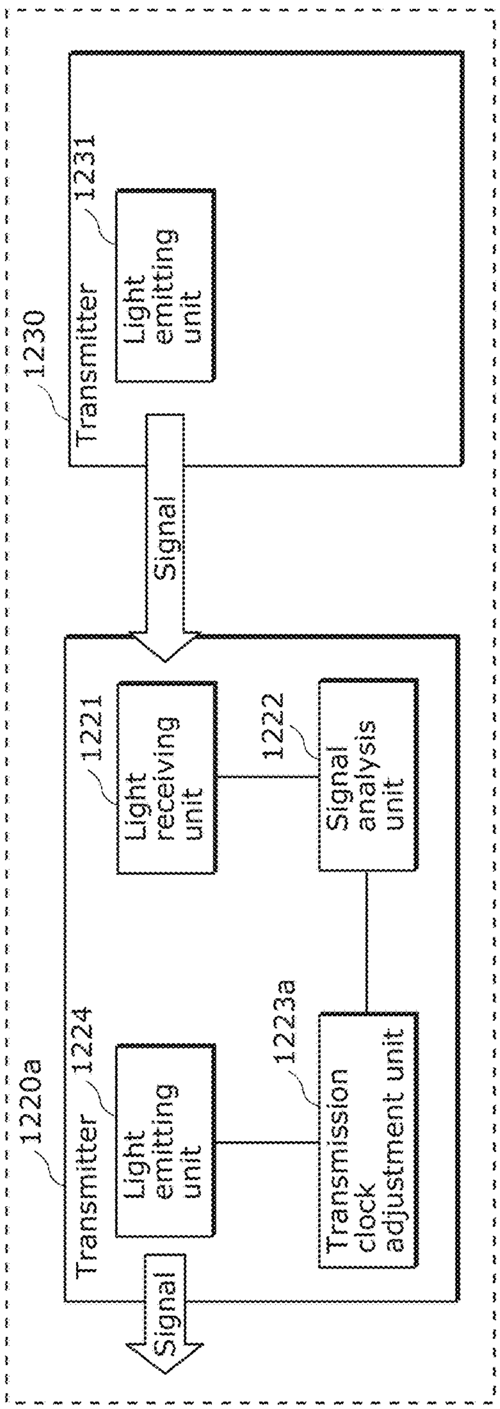
Figure 304B:
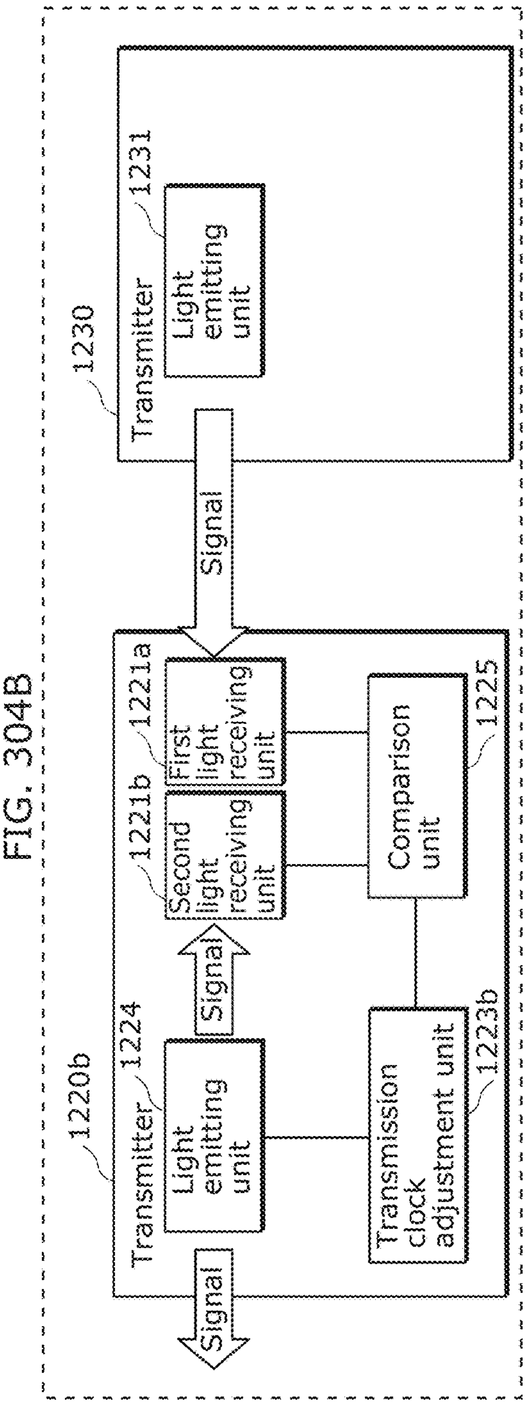
Figure 305A:
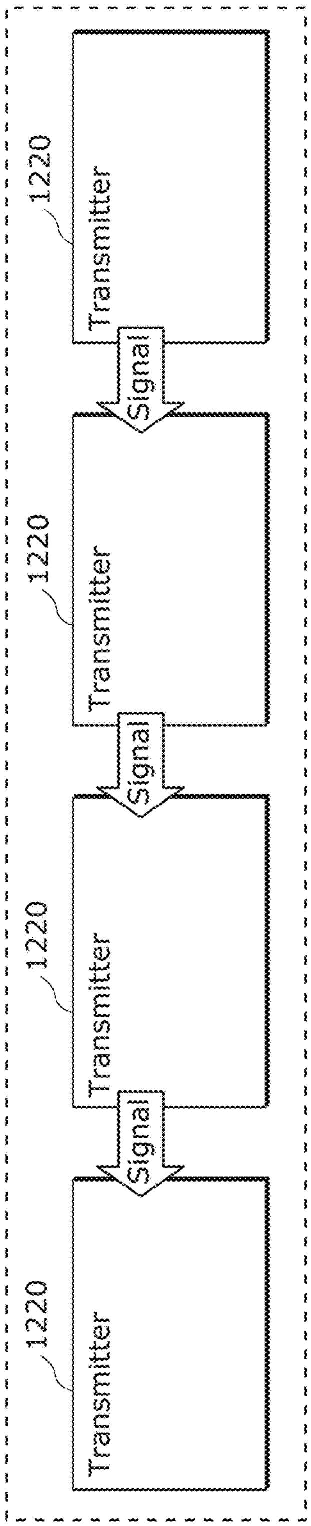
Figure 305B:
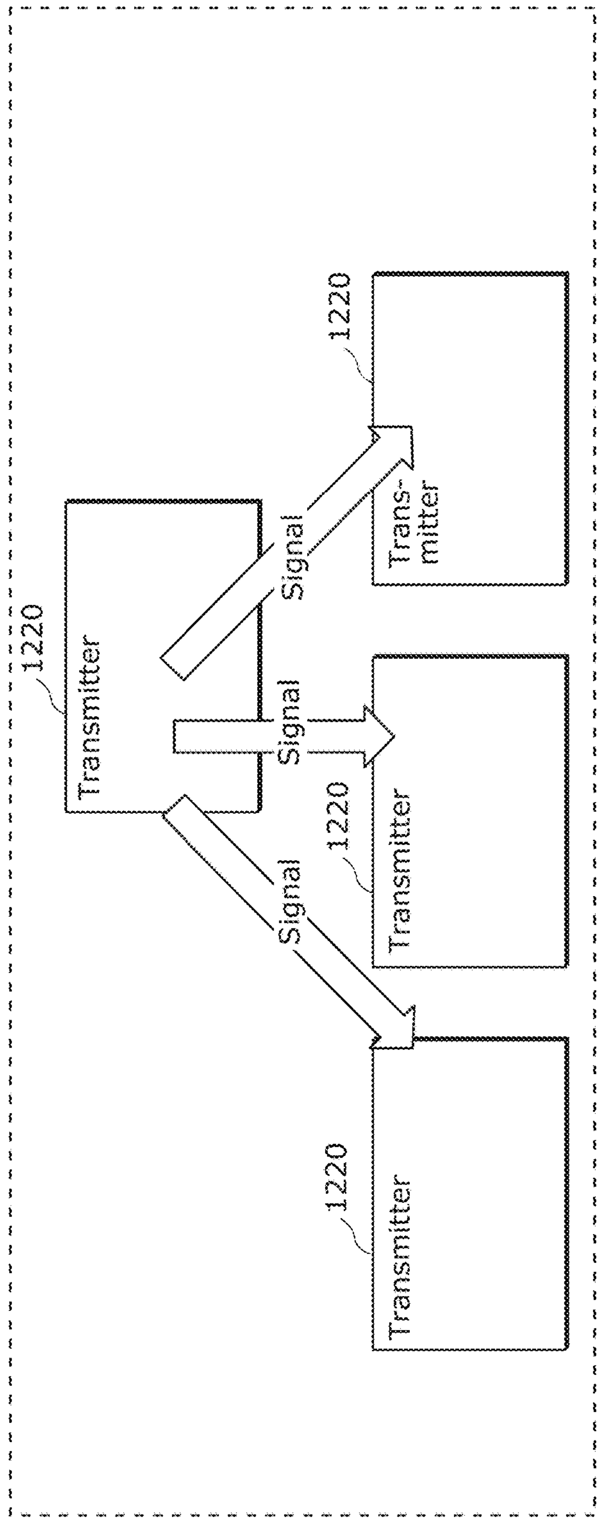
Figure 306:
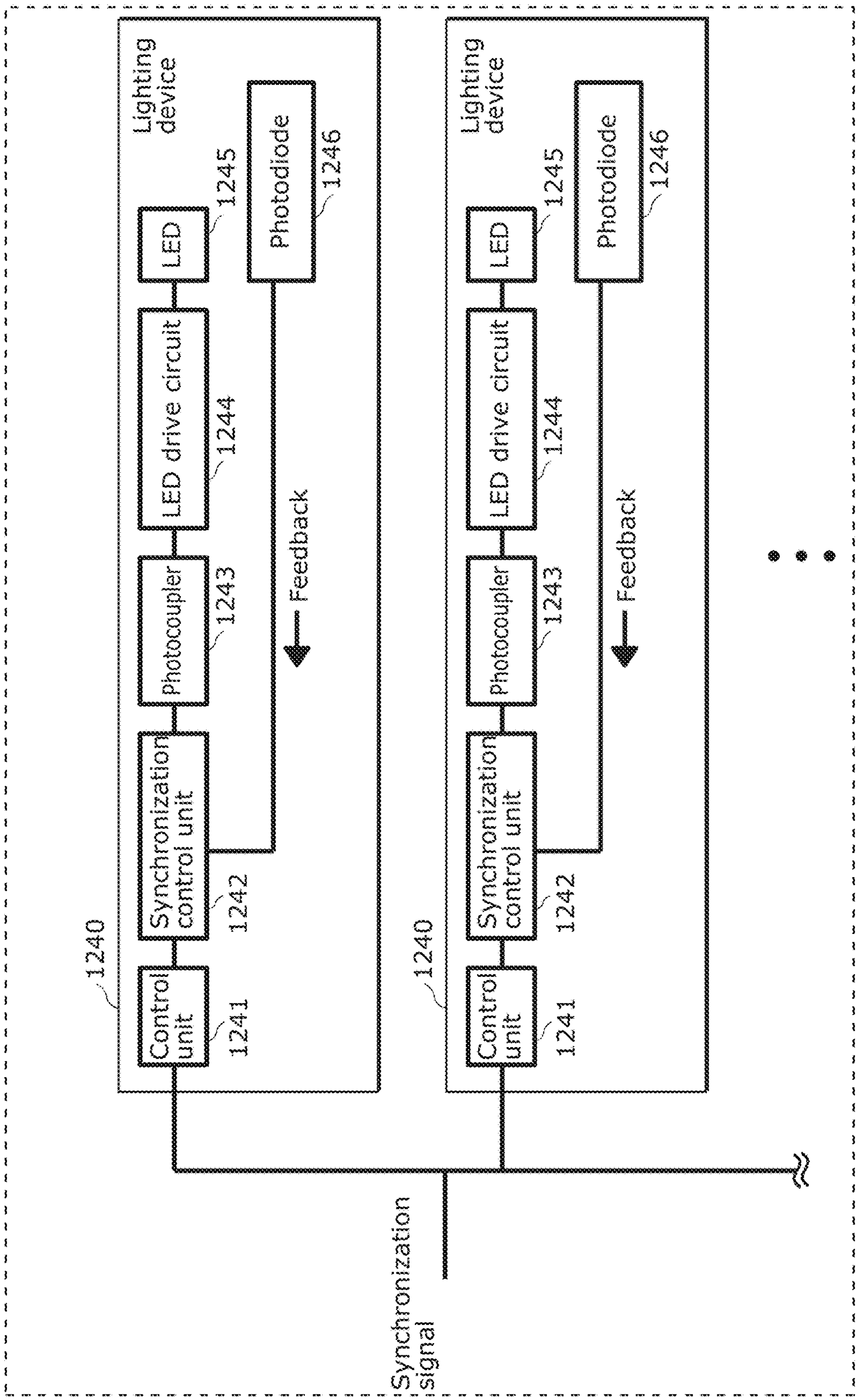
Figure 307:
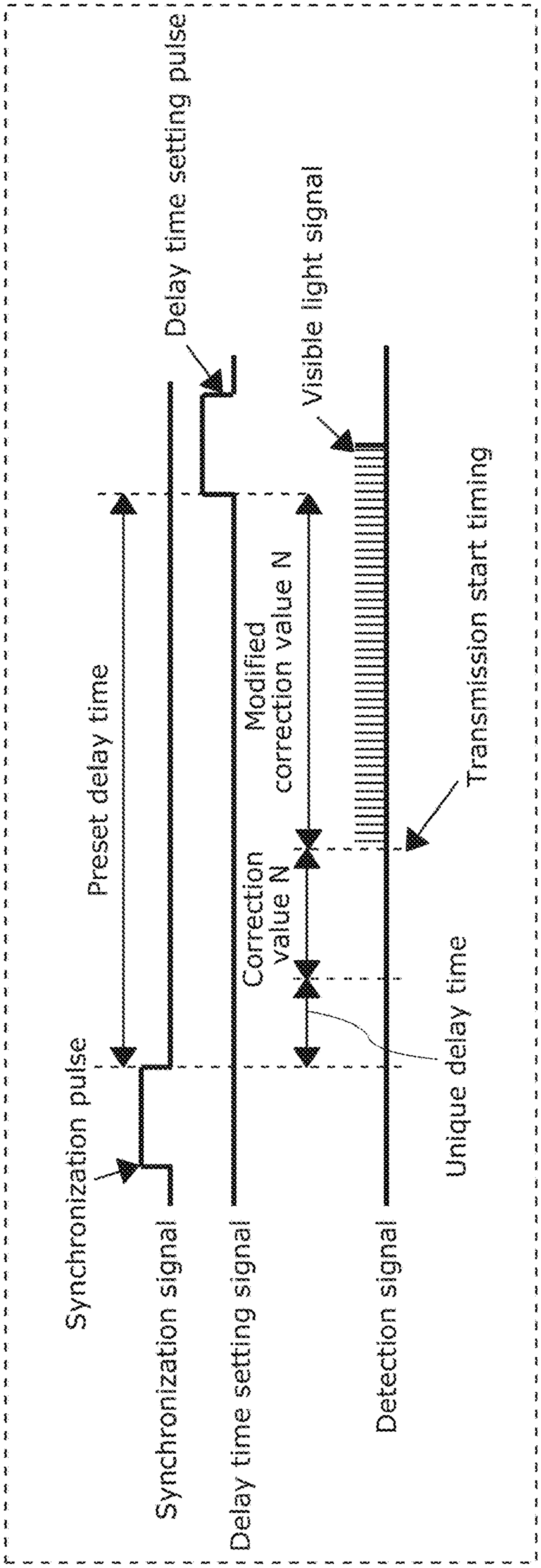
Figure 308:
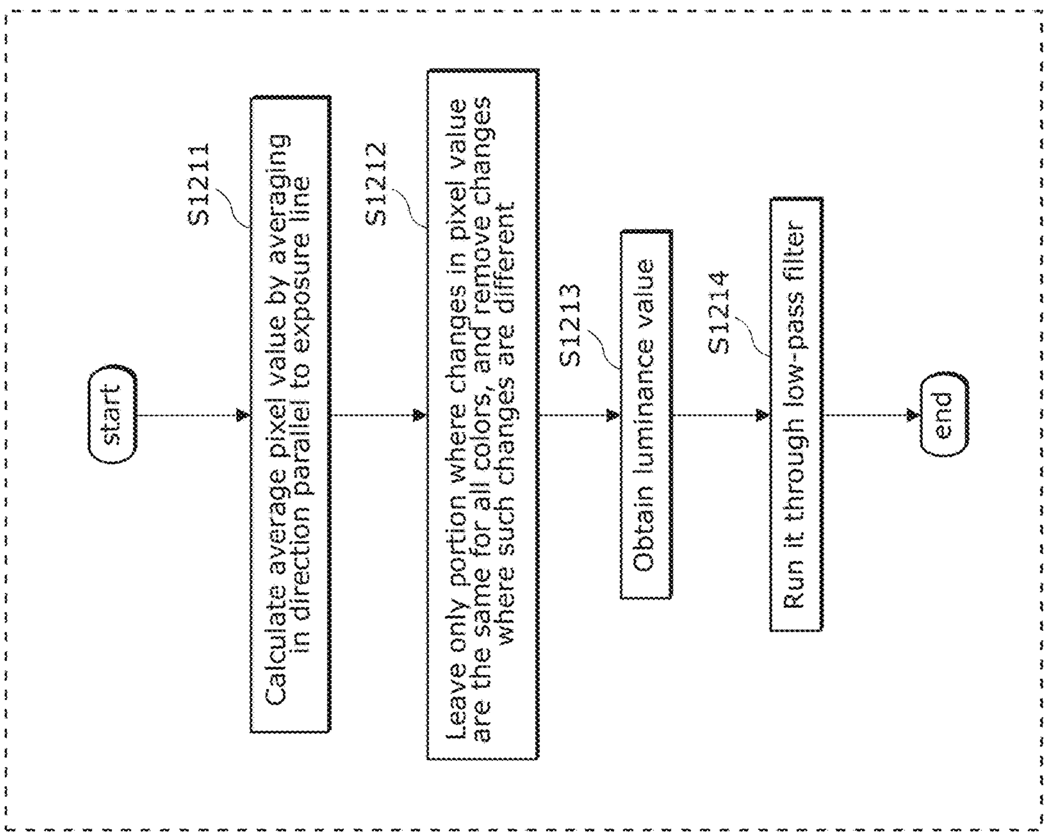
Figure 309:
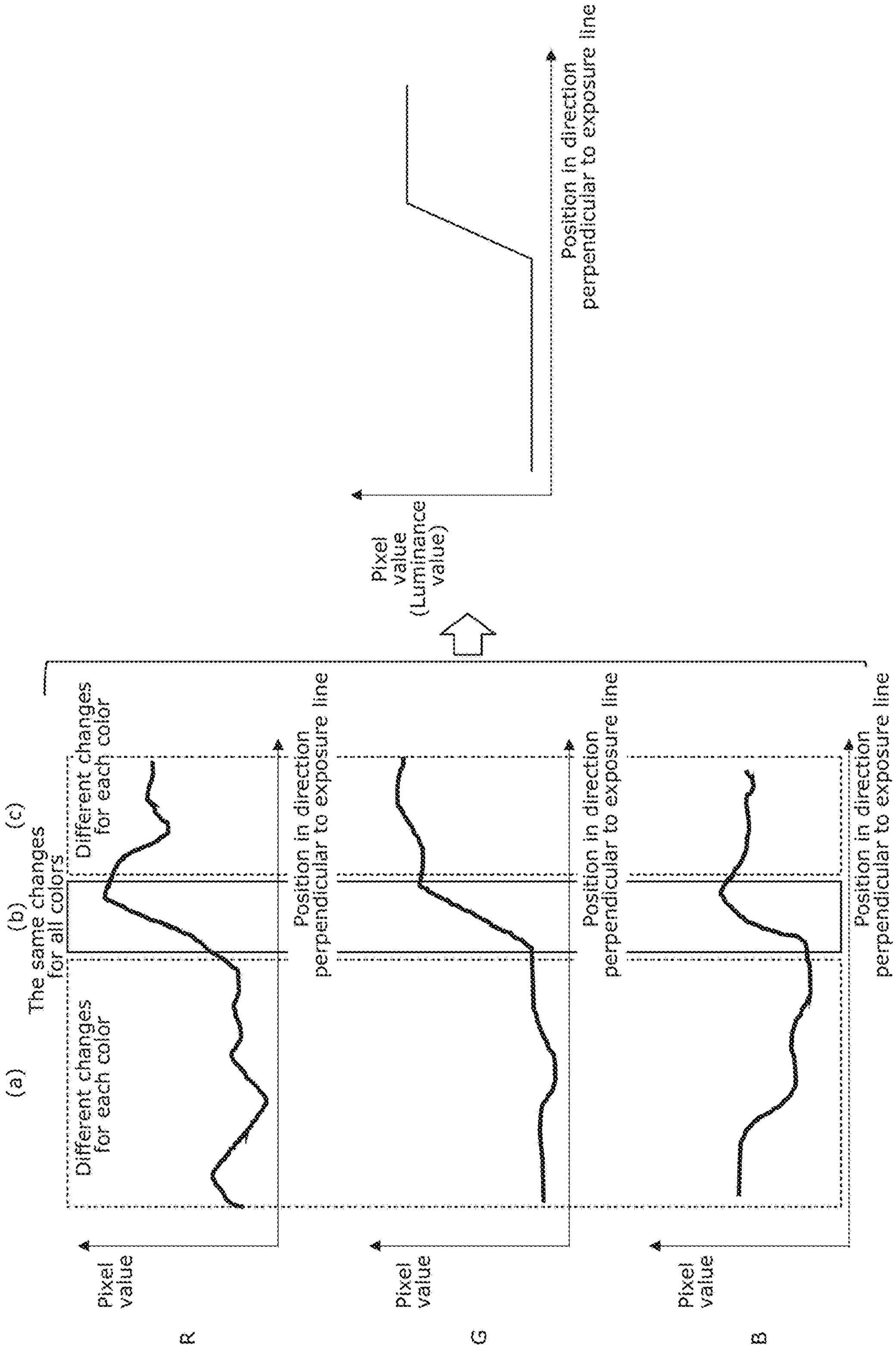
Figure 310:
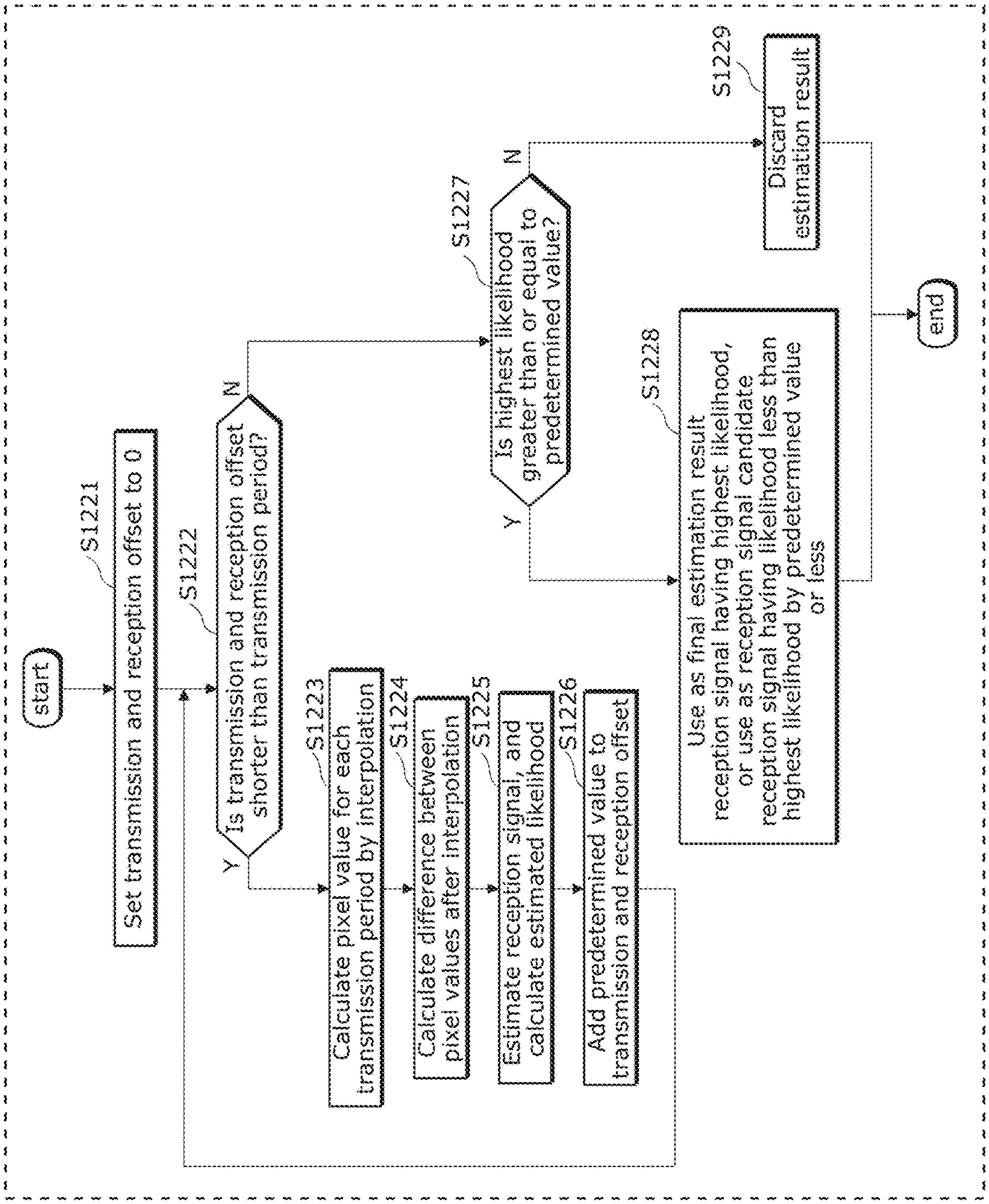
Figure 311:
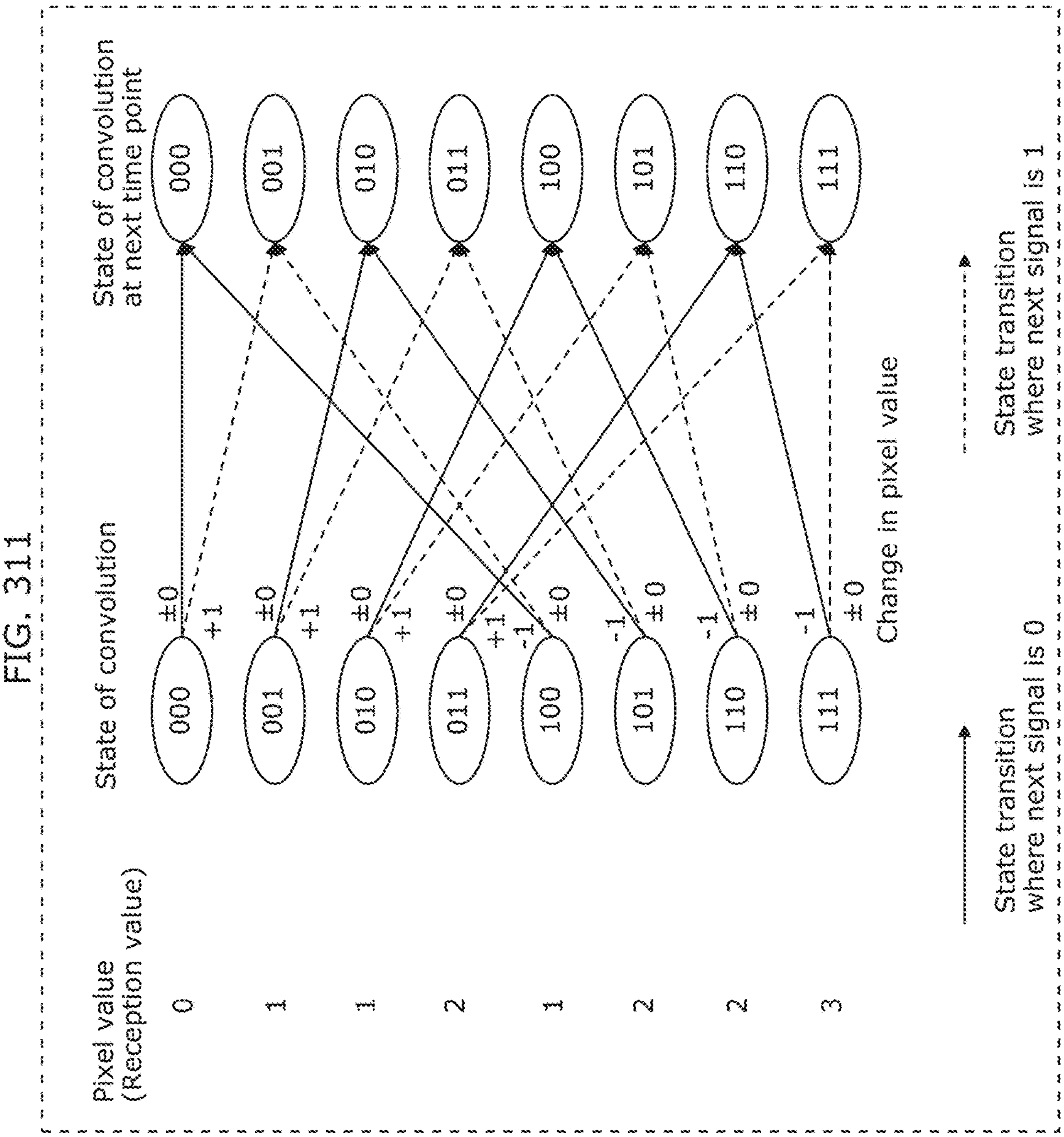
Figure 312:
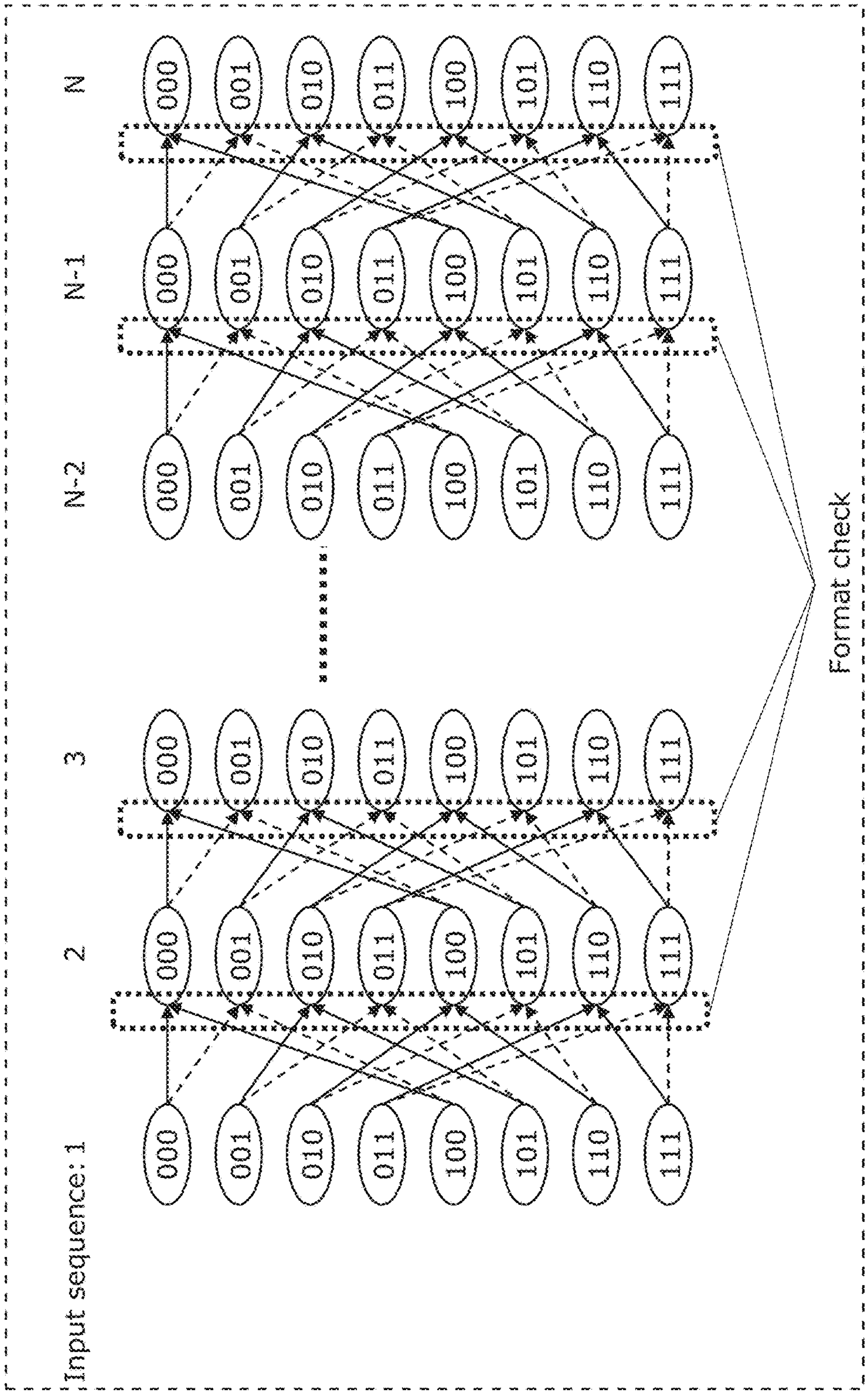
Figure 313:
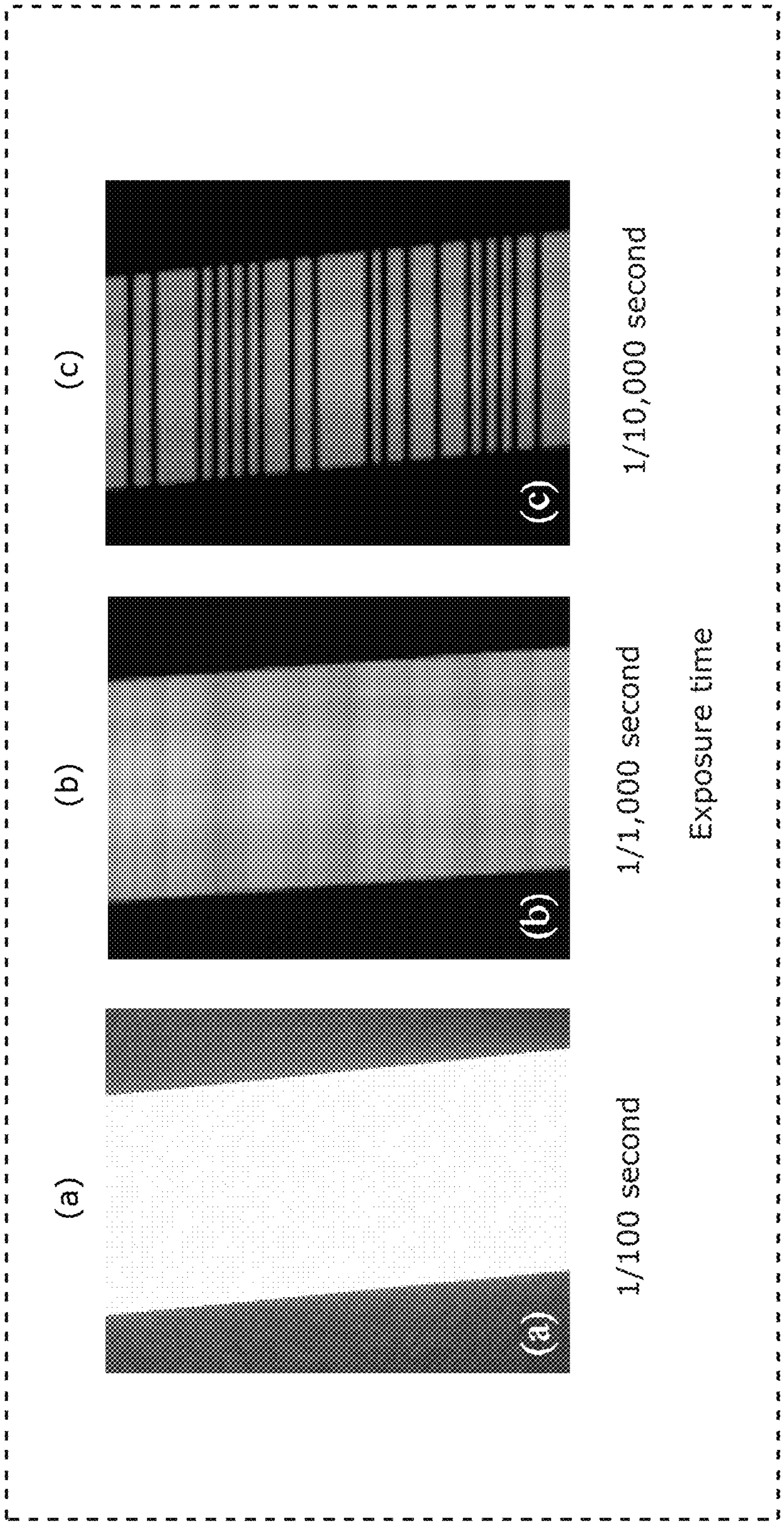
Figure 314:
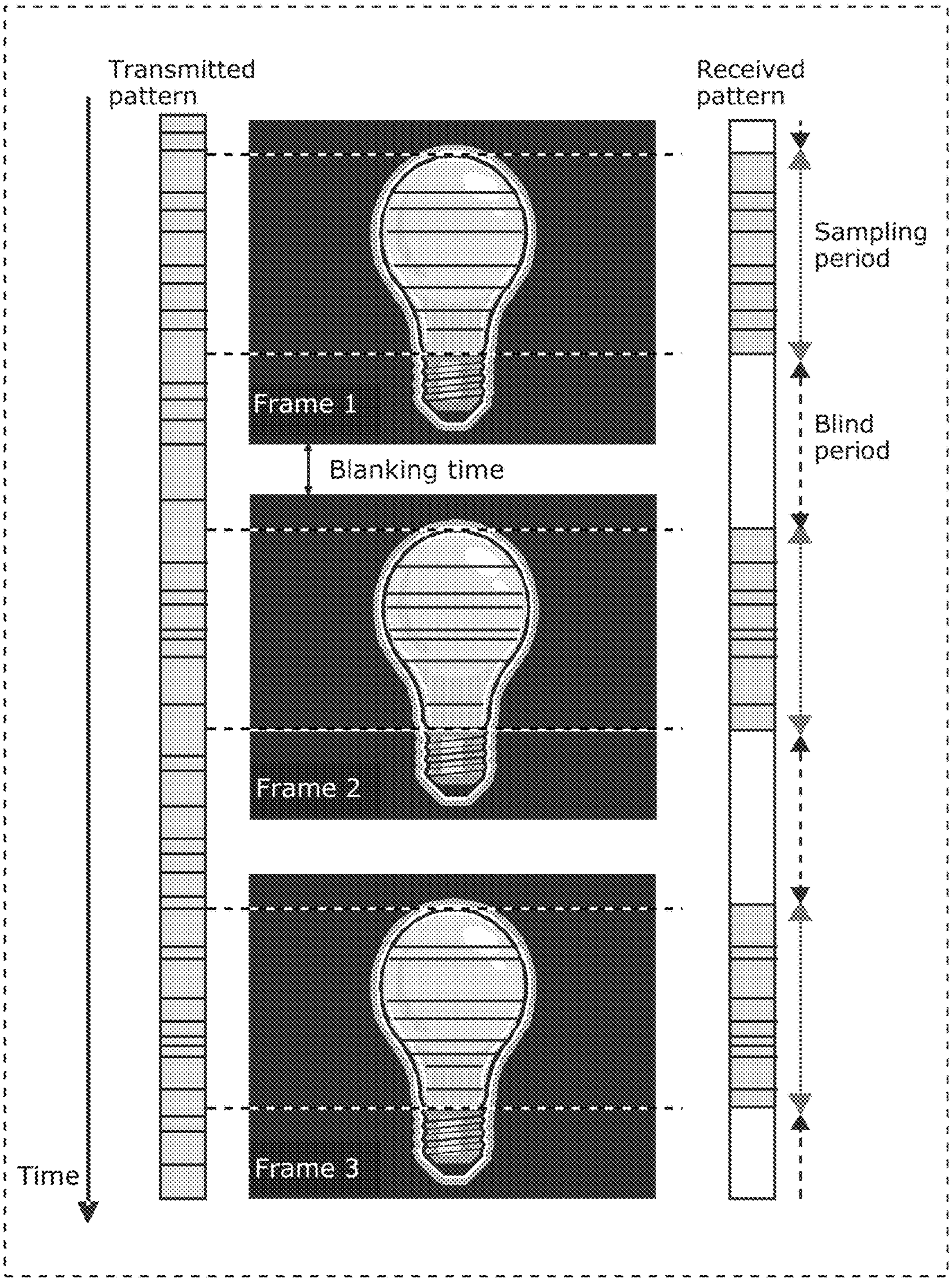
Figure 315:
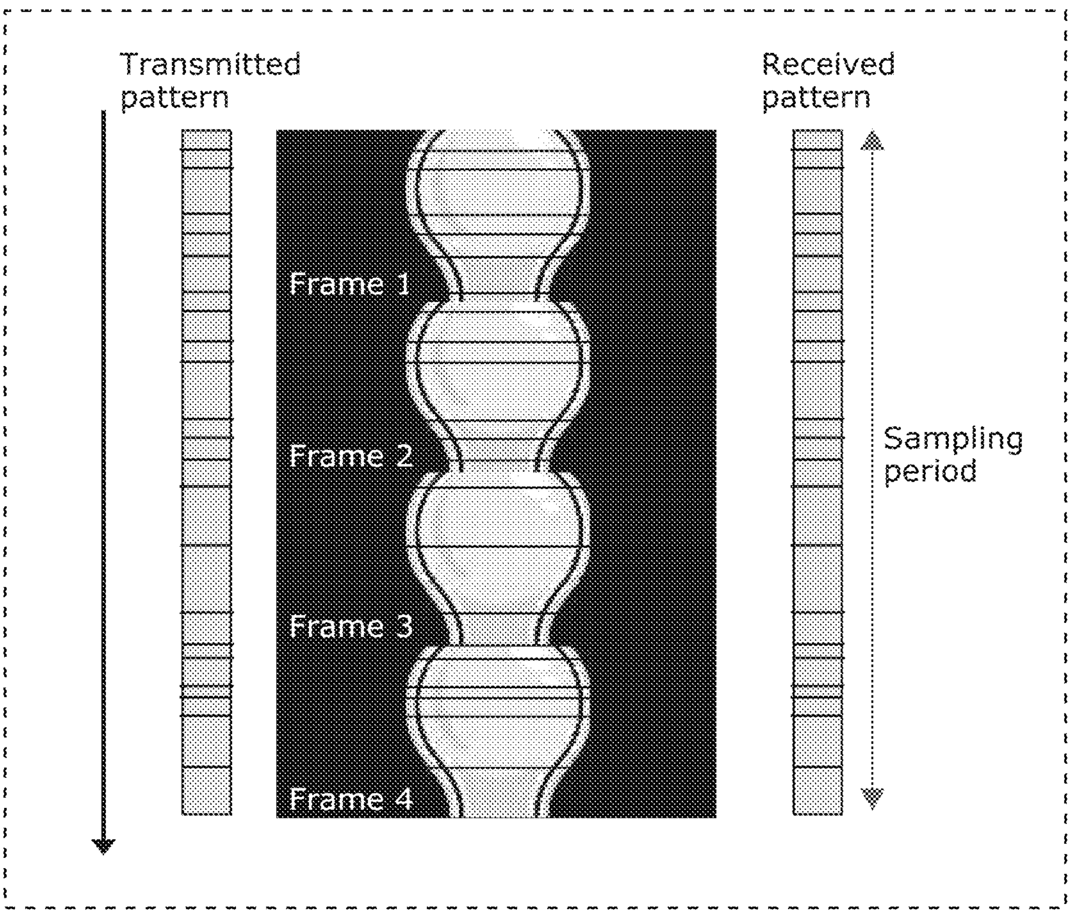
Figure 316:
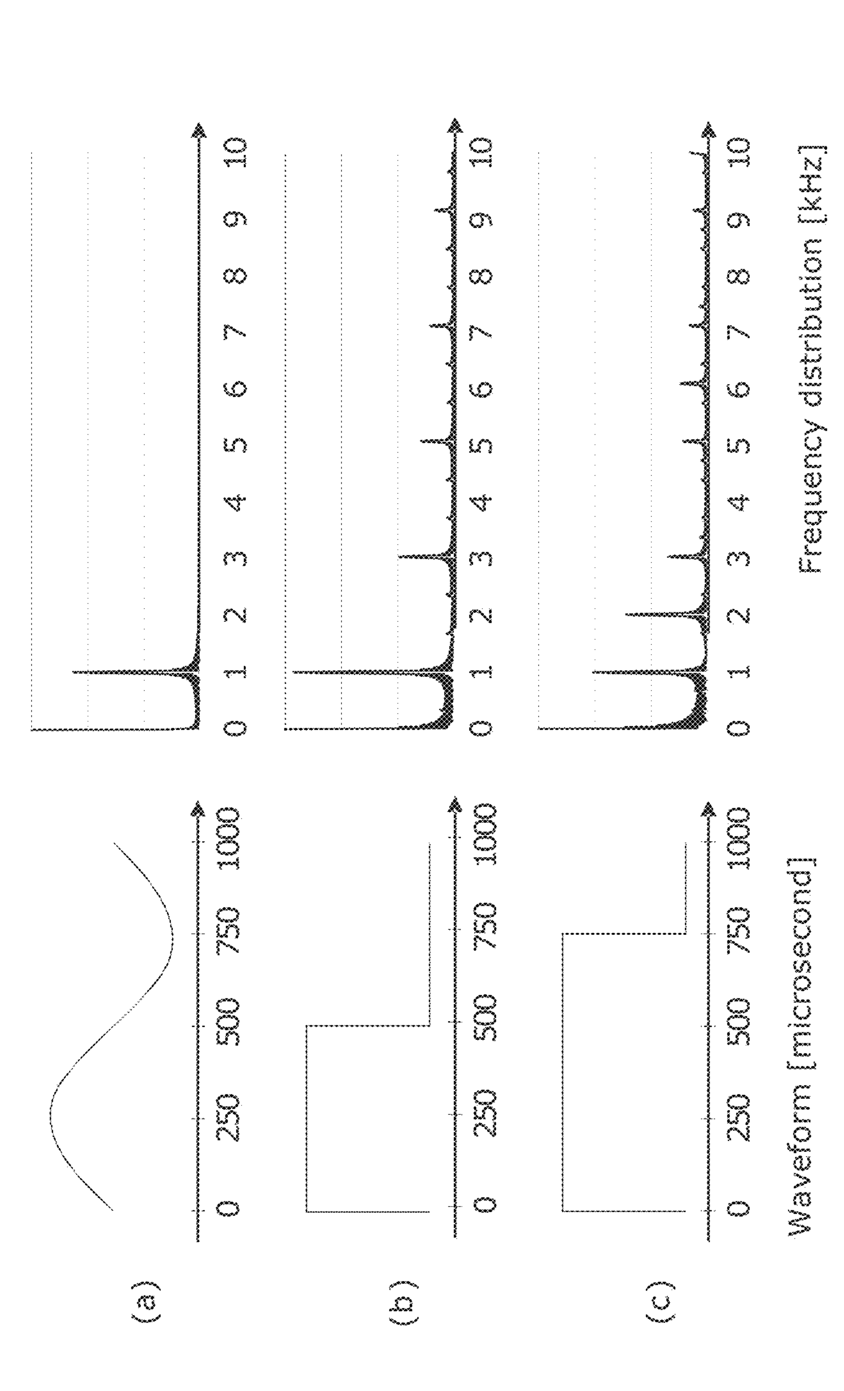
Figure 317:
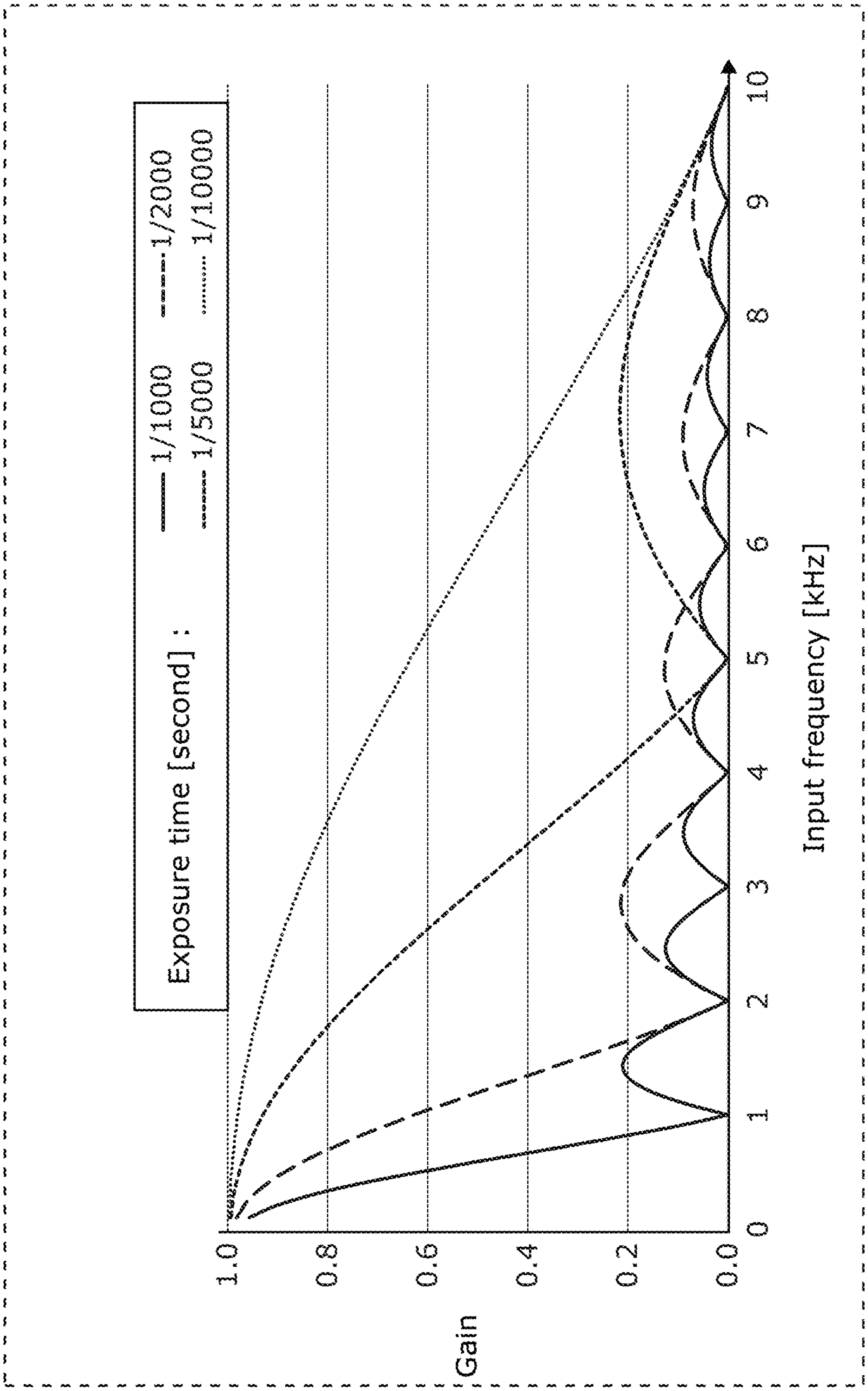
Figure 318:
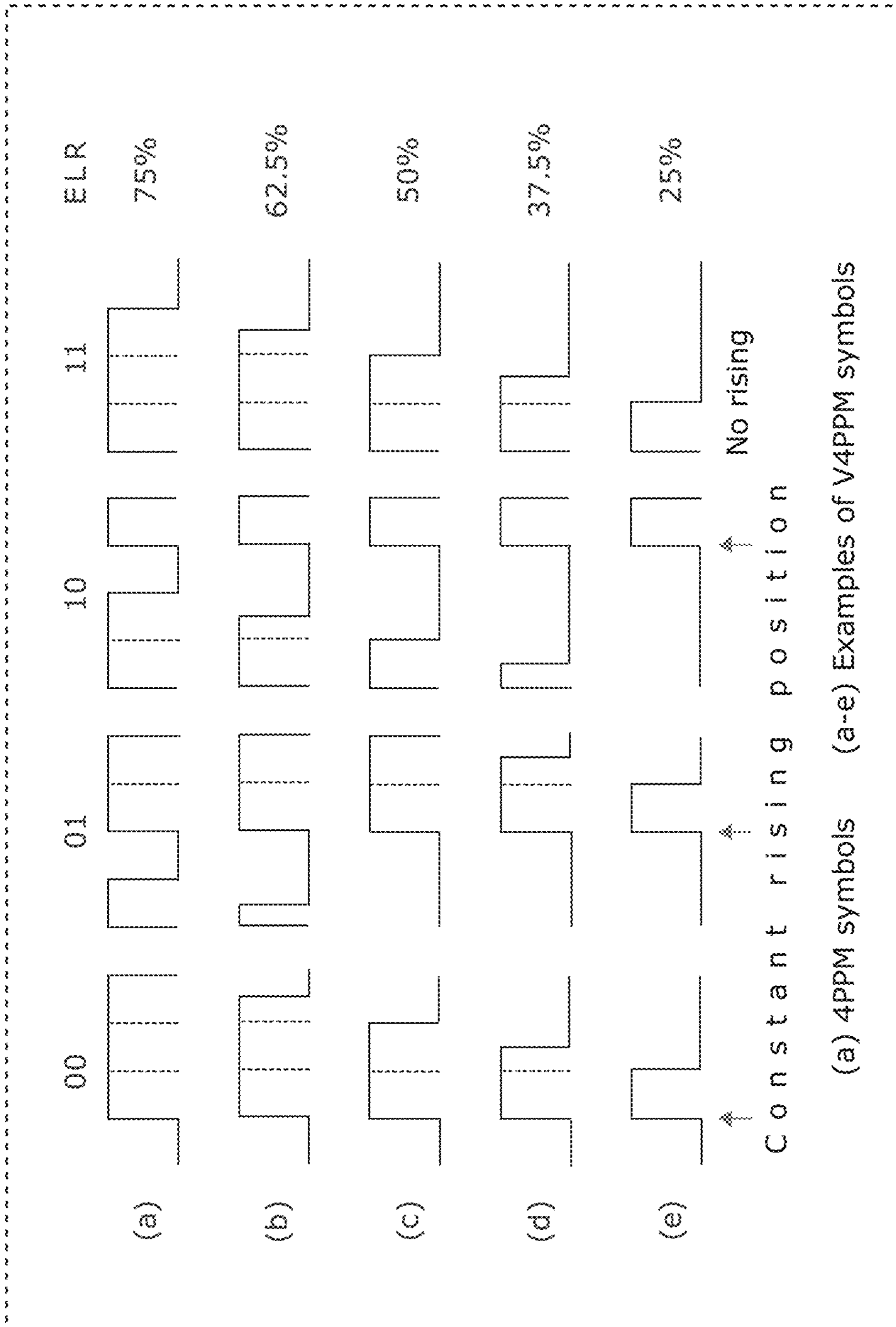
Figure 319:
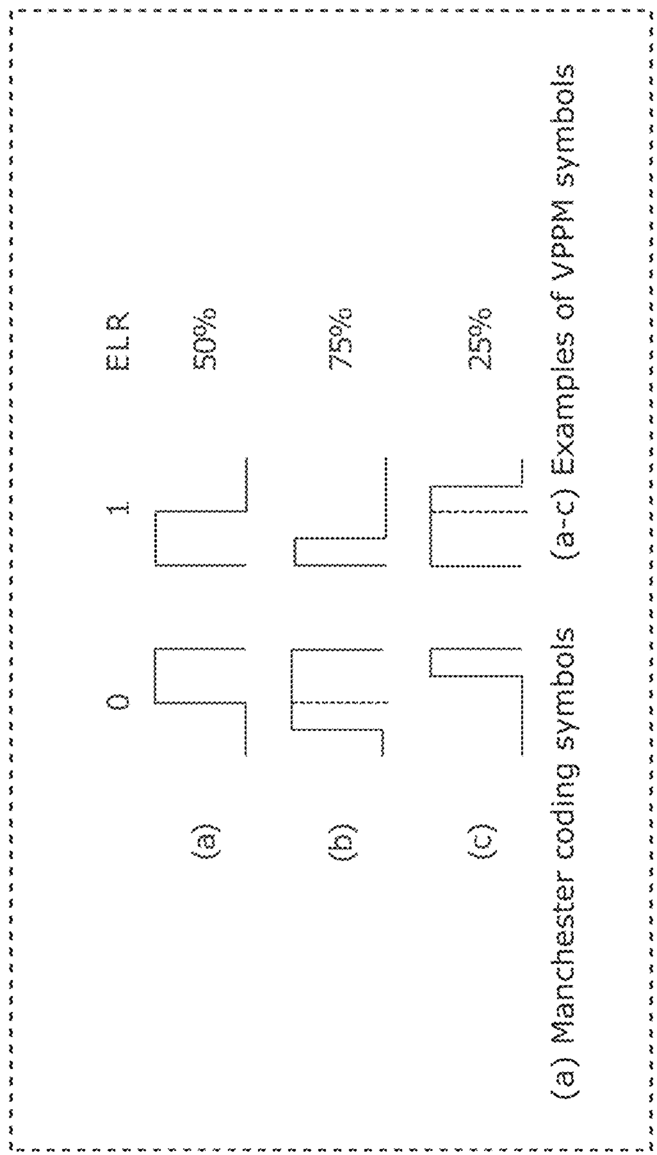
Figure 320:
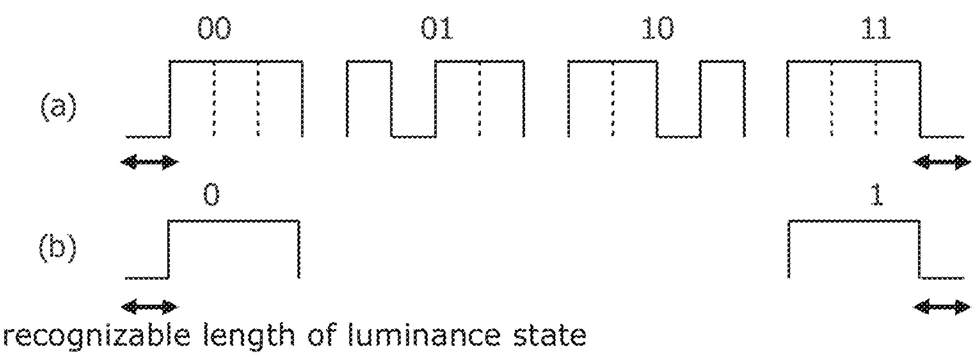
Figure 321:
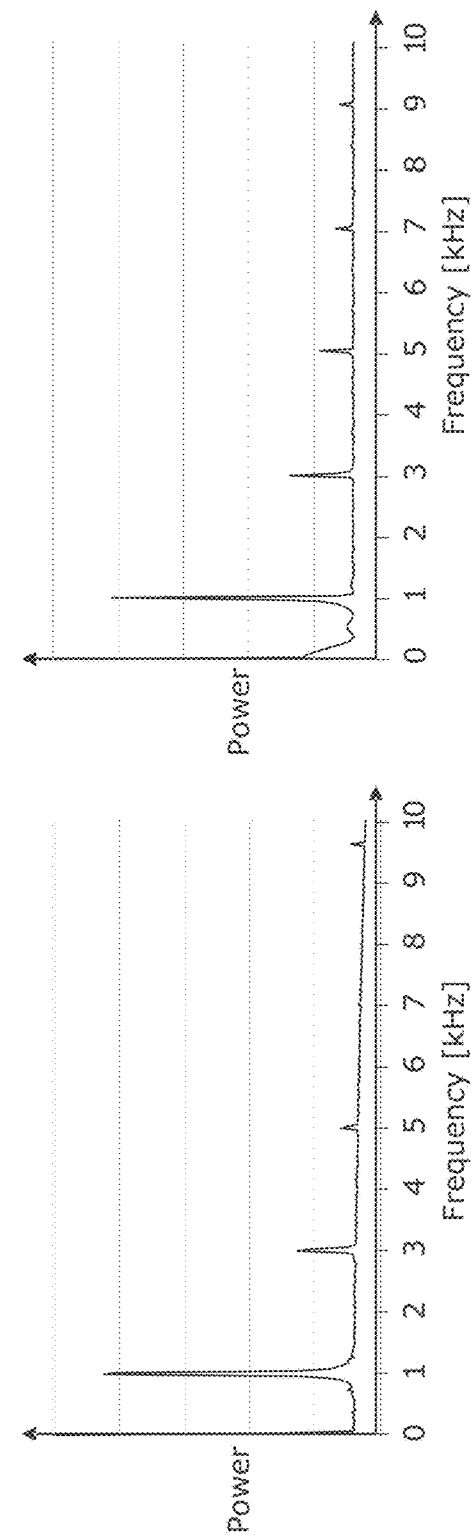
Figure 322A:
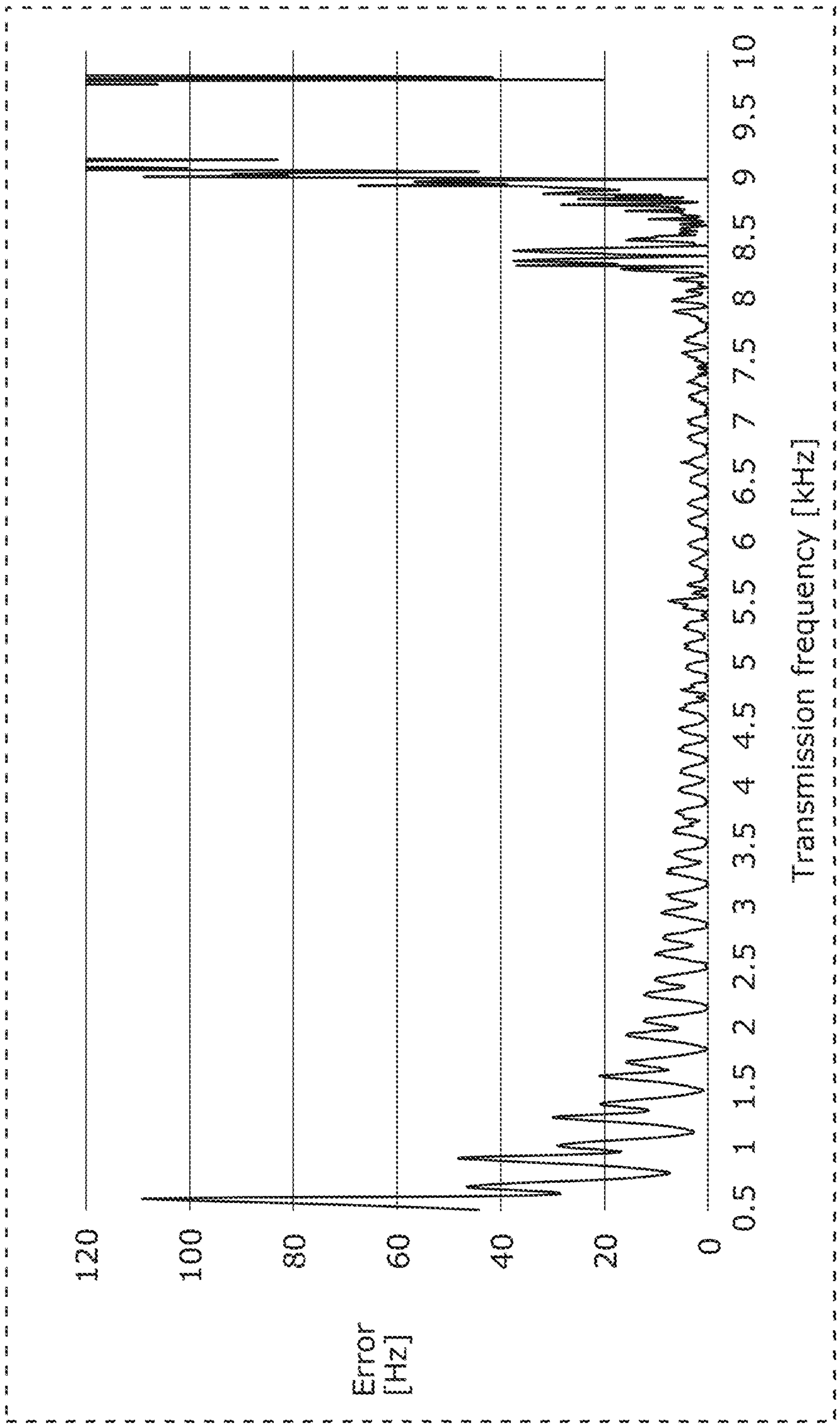
Figure 322B:
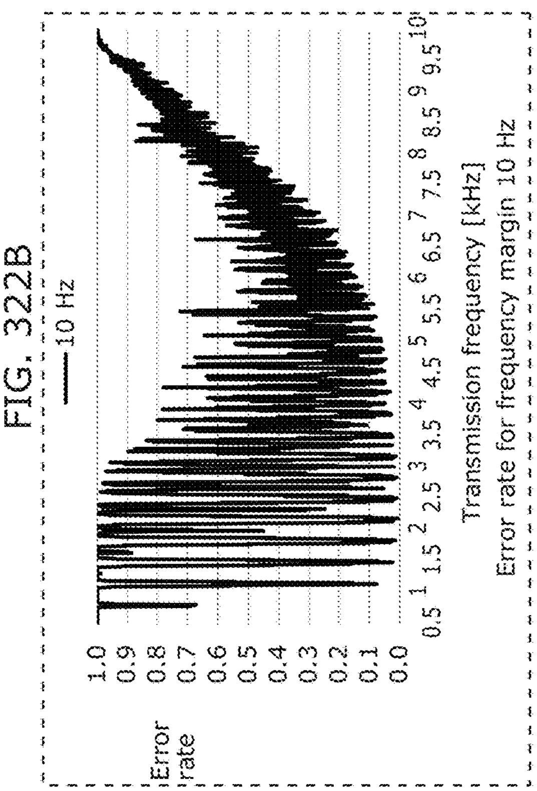
Figure 322C:
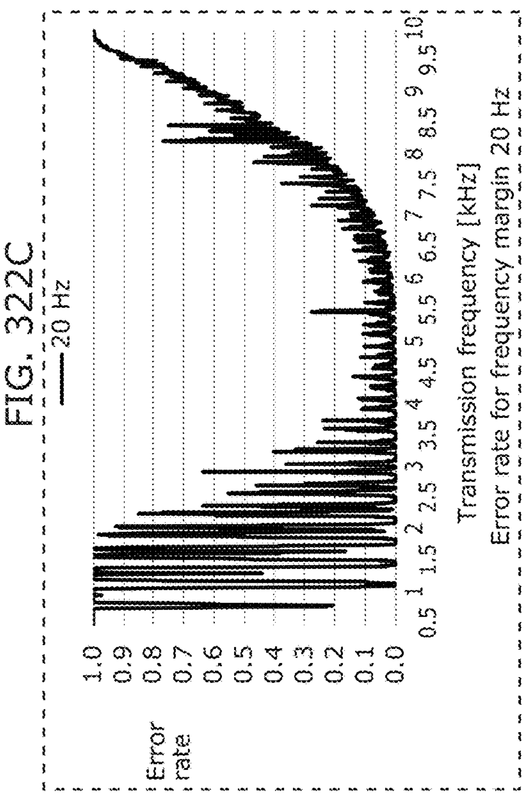
Figure 322D:
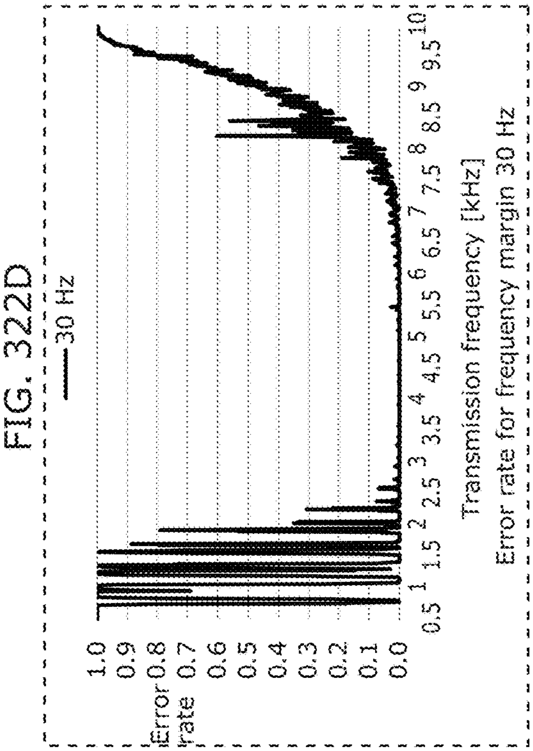
Figure 322E:
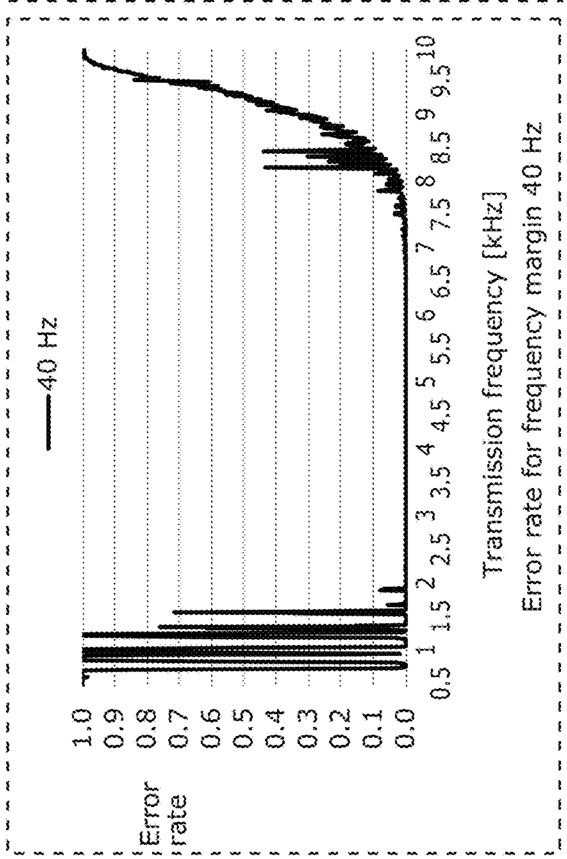
Figure 322F:
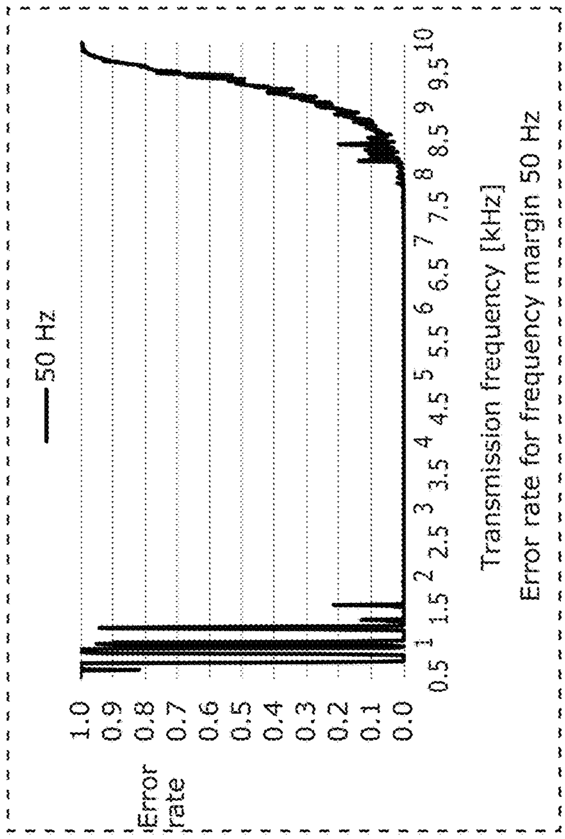
Figure 323:
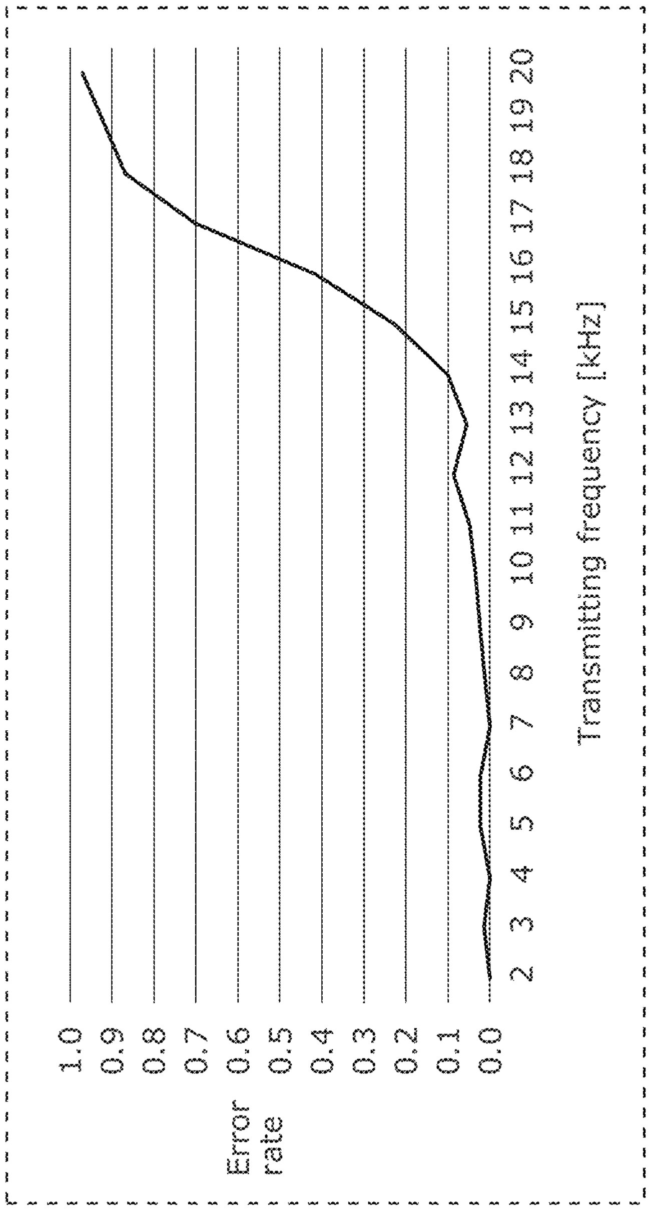
Figure 324:
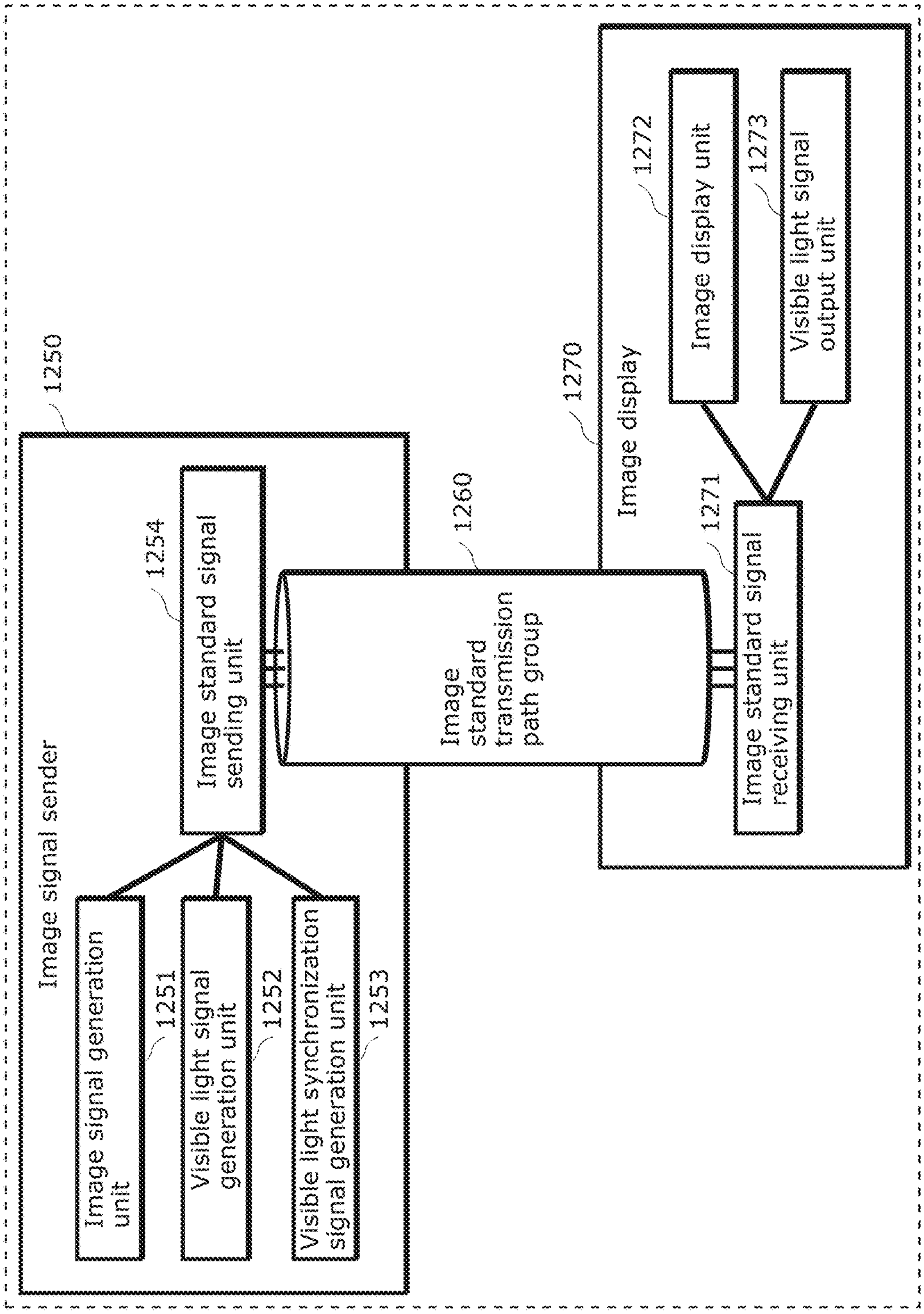
Figure 325:
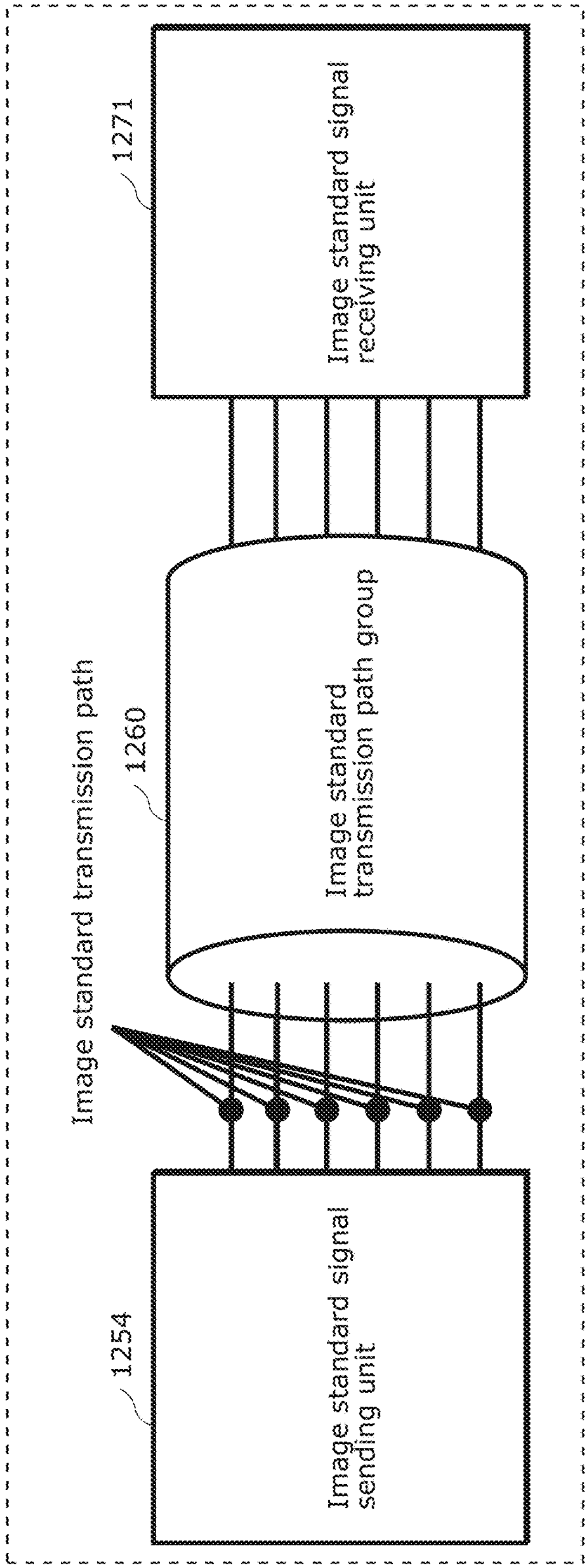
Figure 326:
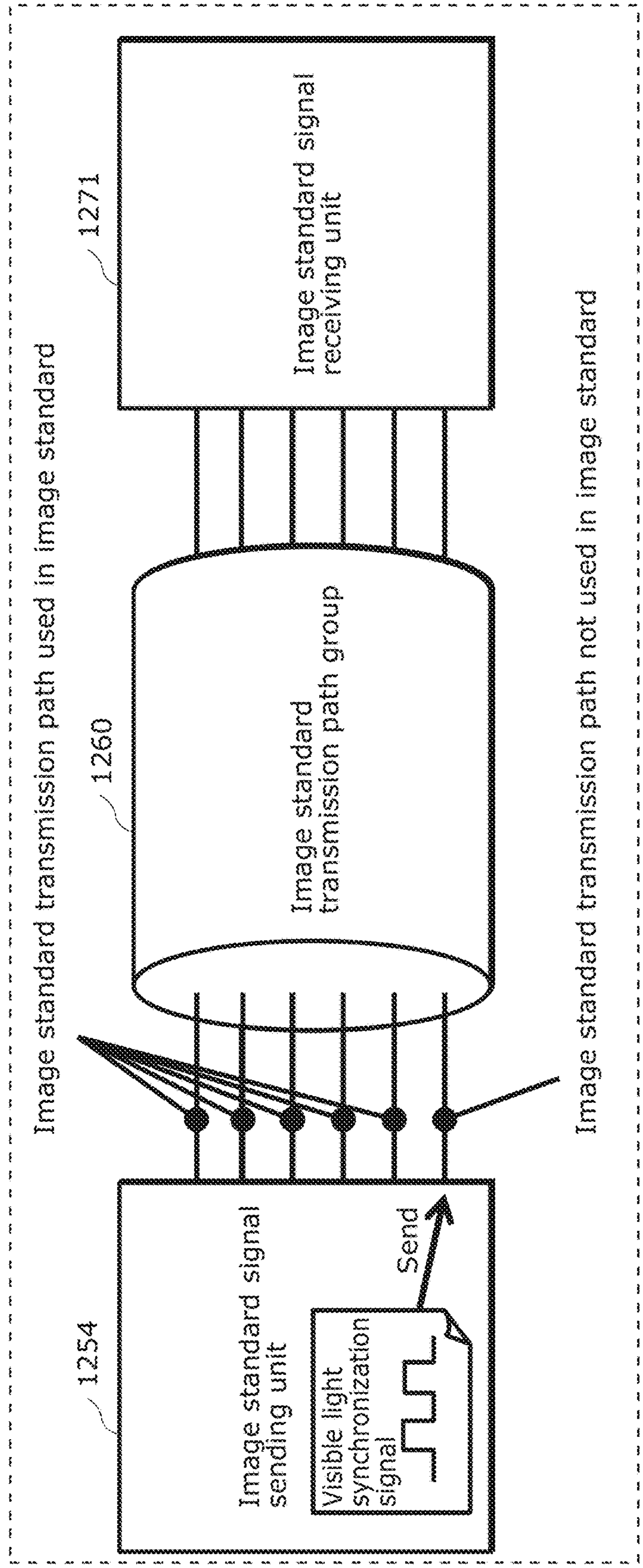
Figure 327:
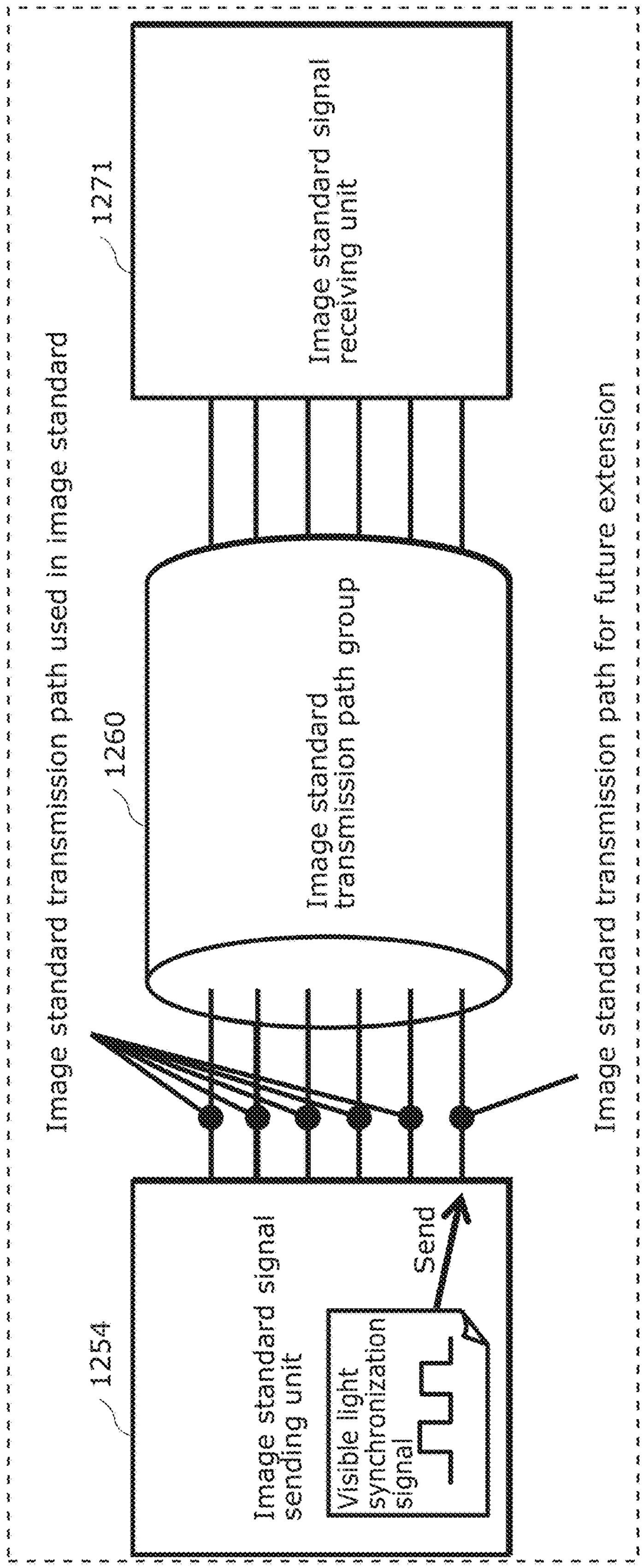
Figure 328:
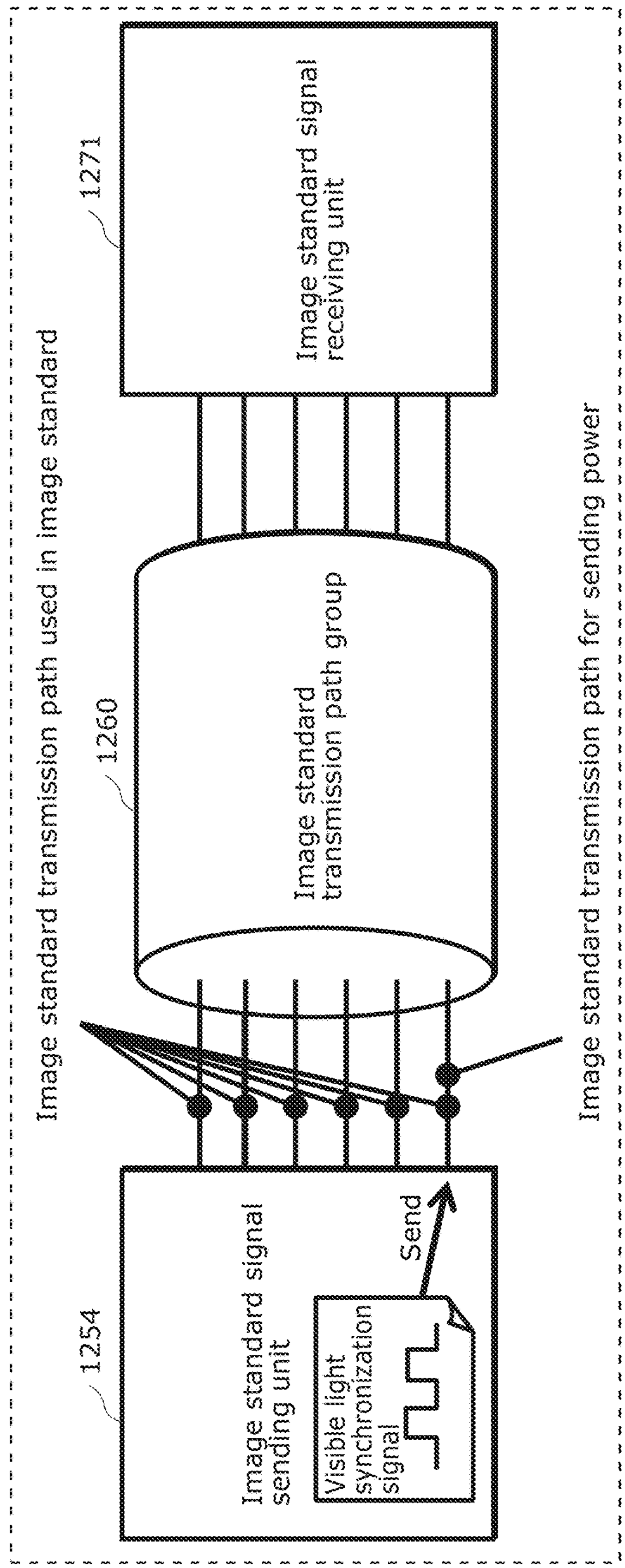
Figure 329A:
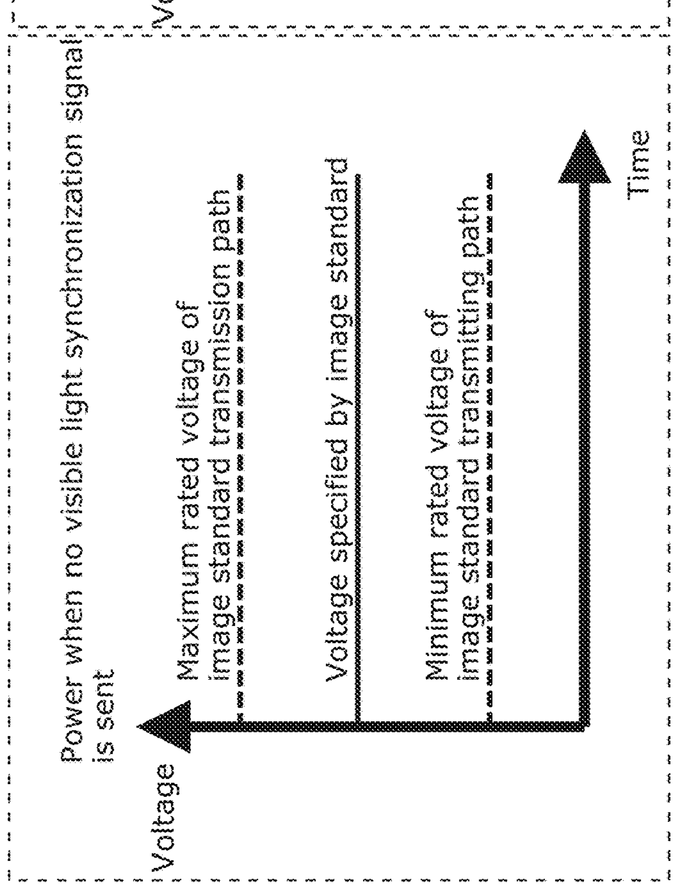
Figure 329B:
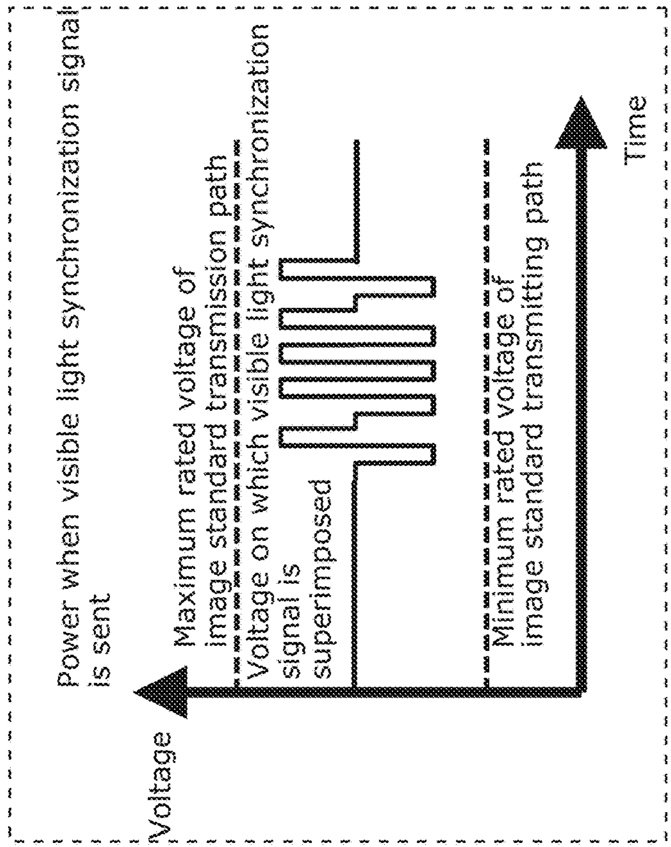
Figure 330:
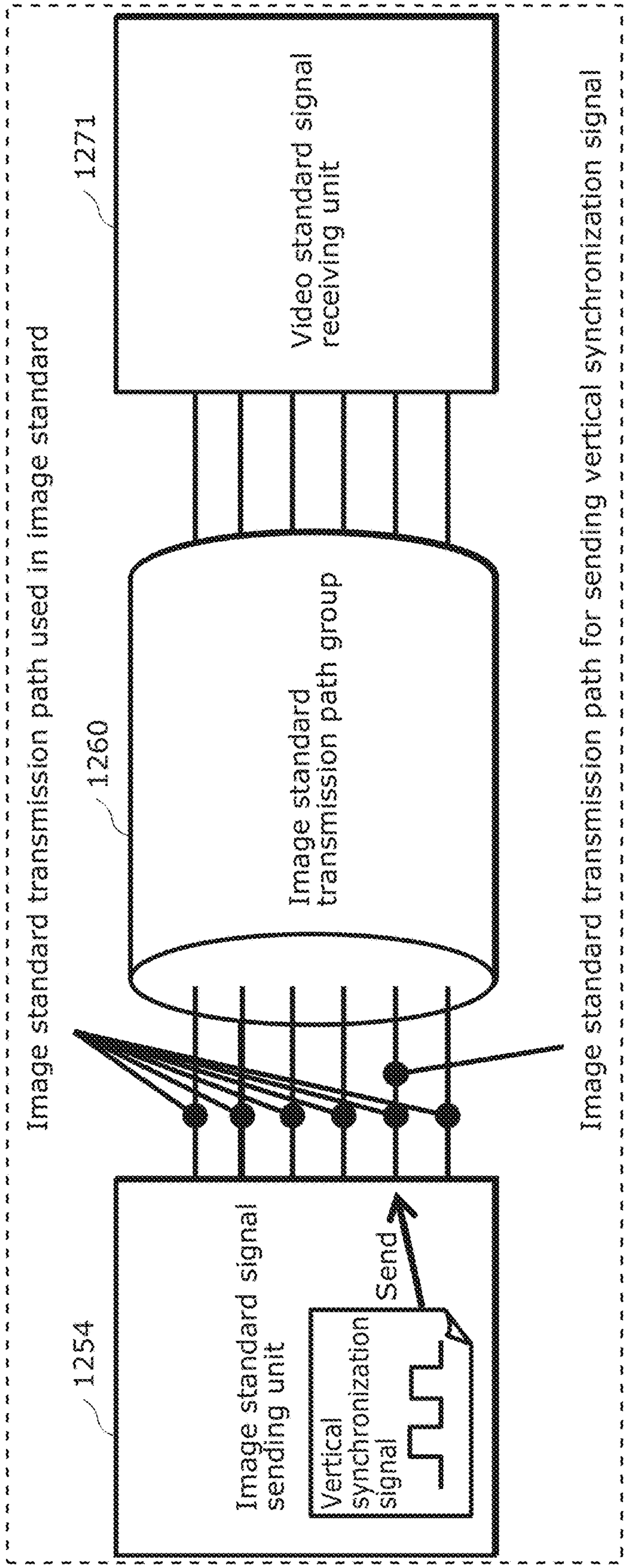
Figure 331:
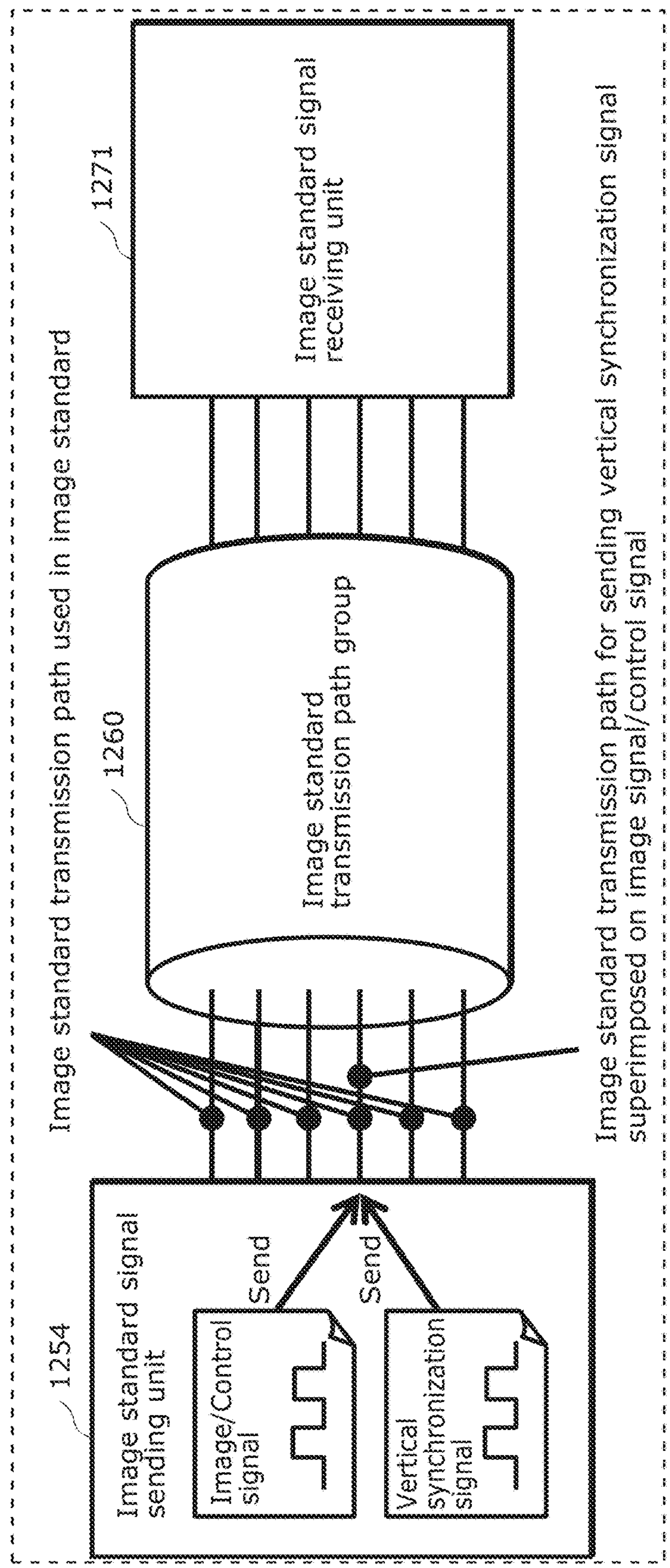
Figure 332:
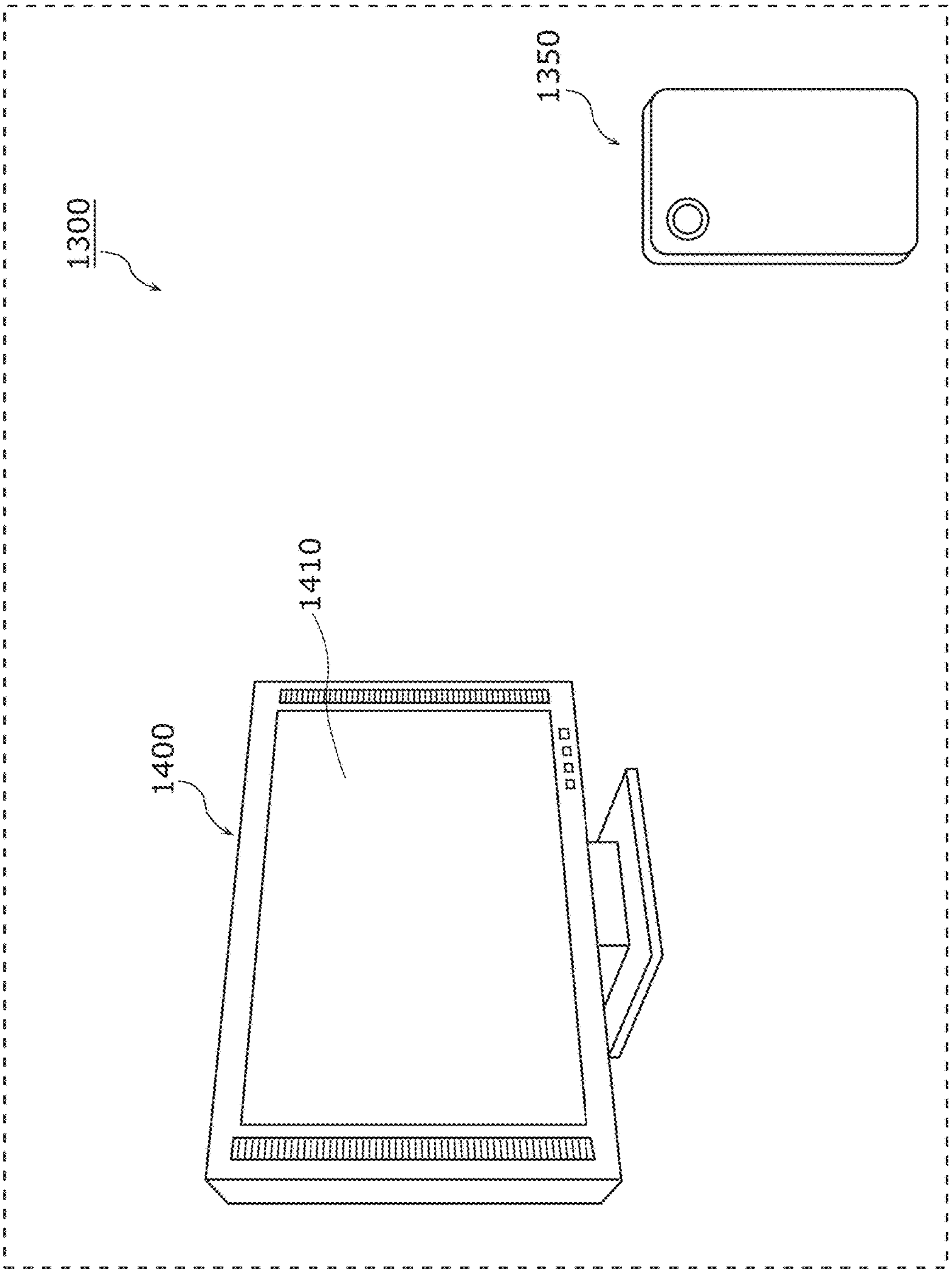
Figure 333:
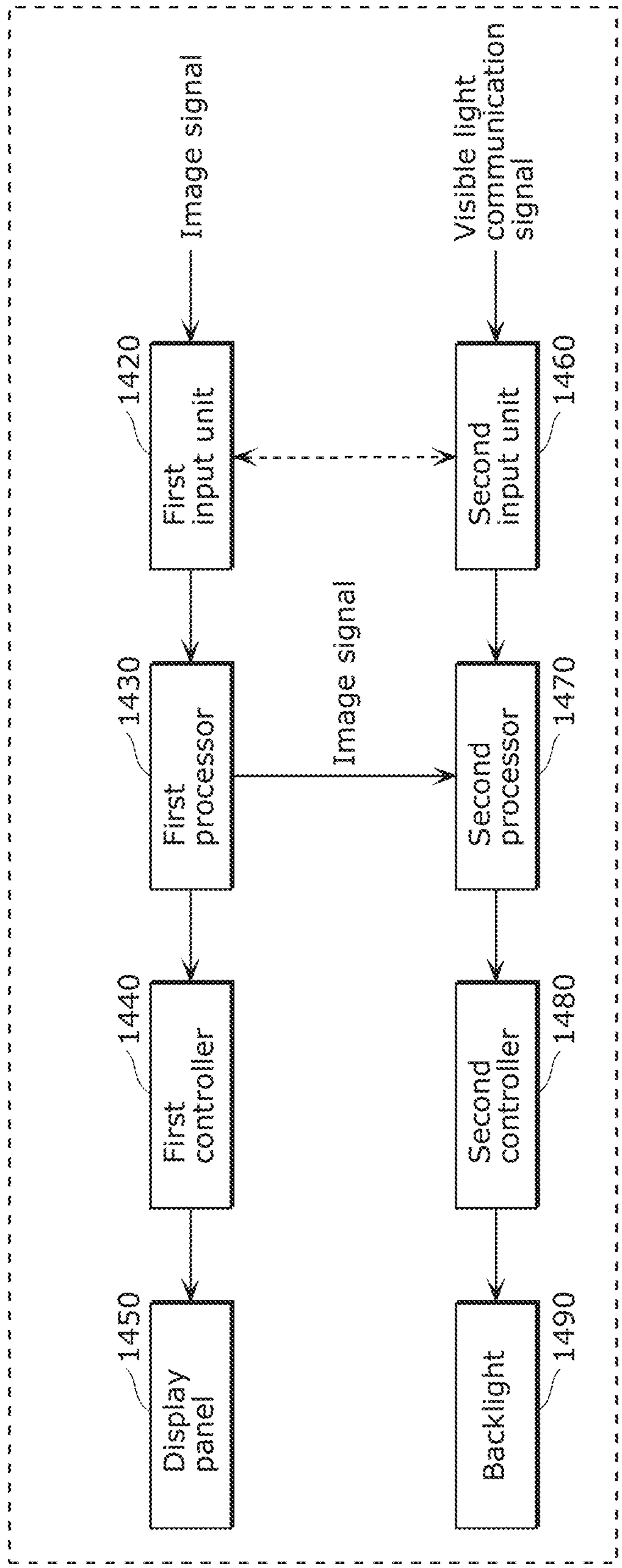
Figure 334A:
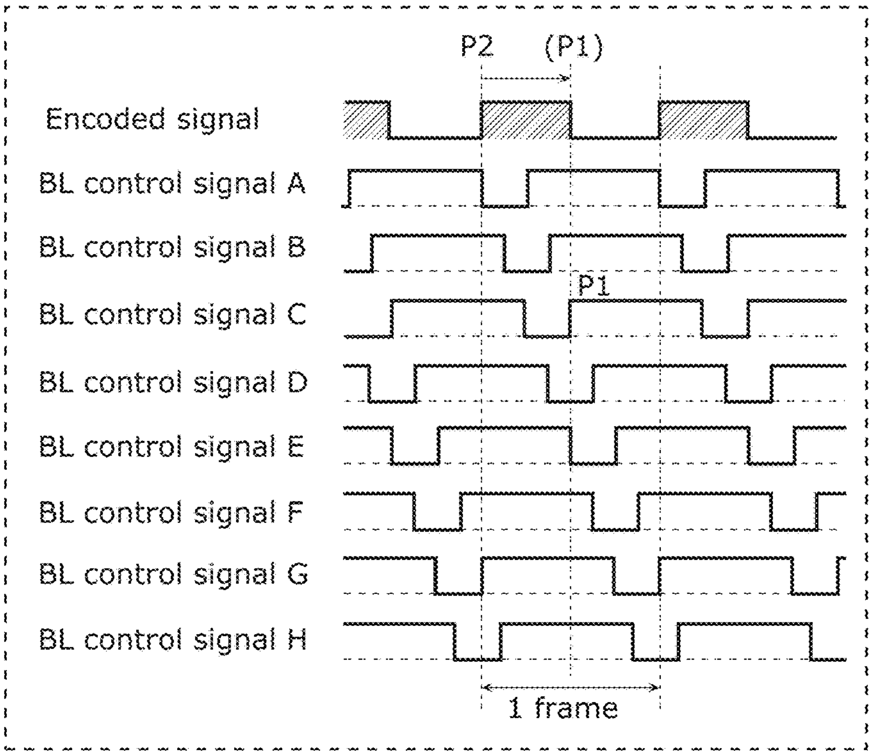
Figure 334B:
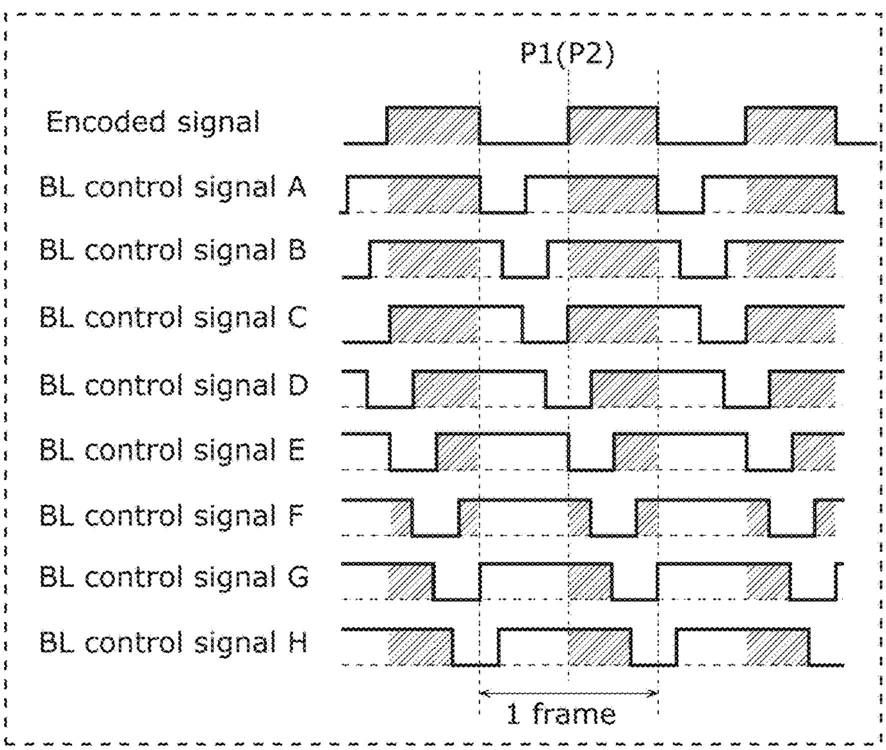
Figure 335:
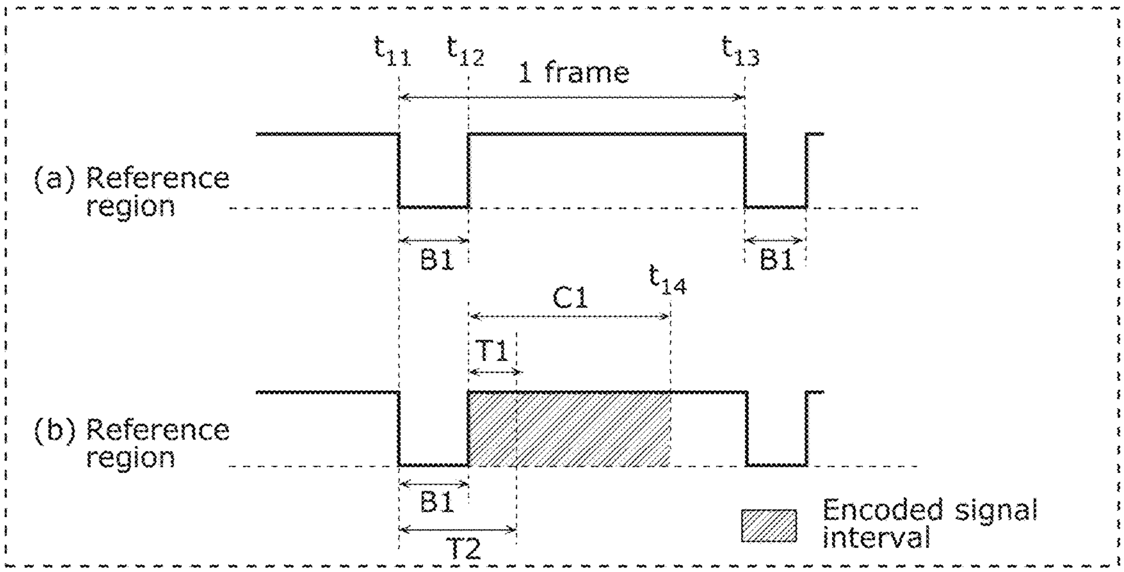
Figure 336:
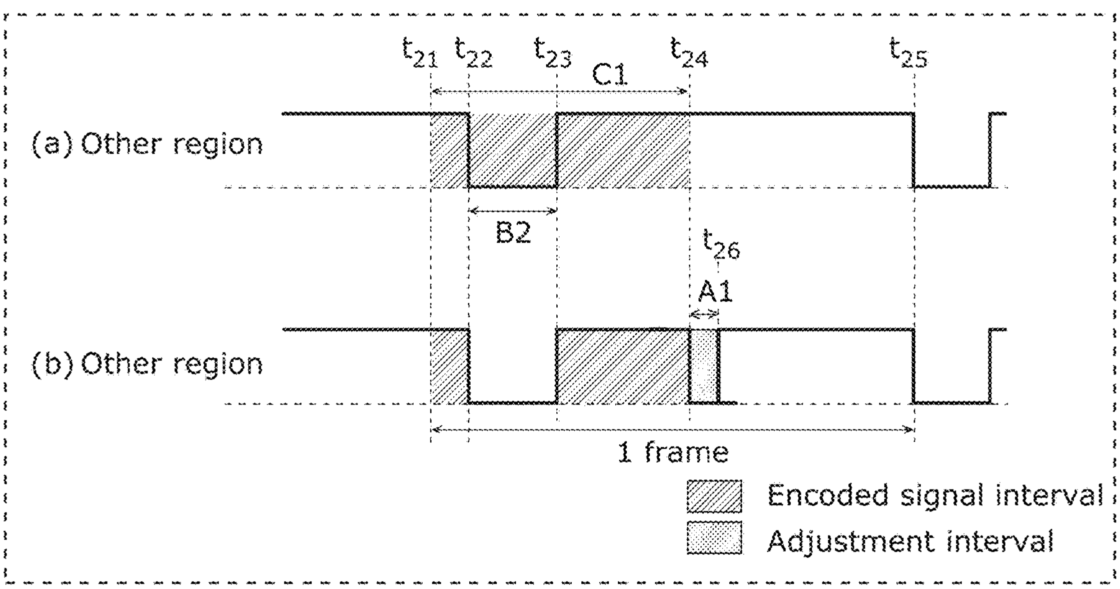
Figure 337A:
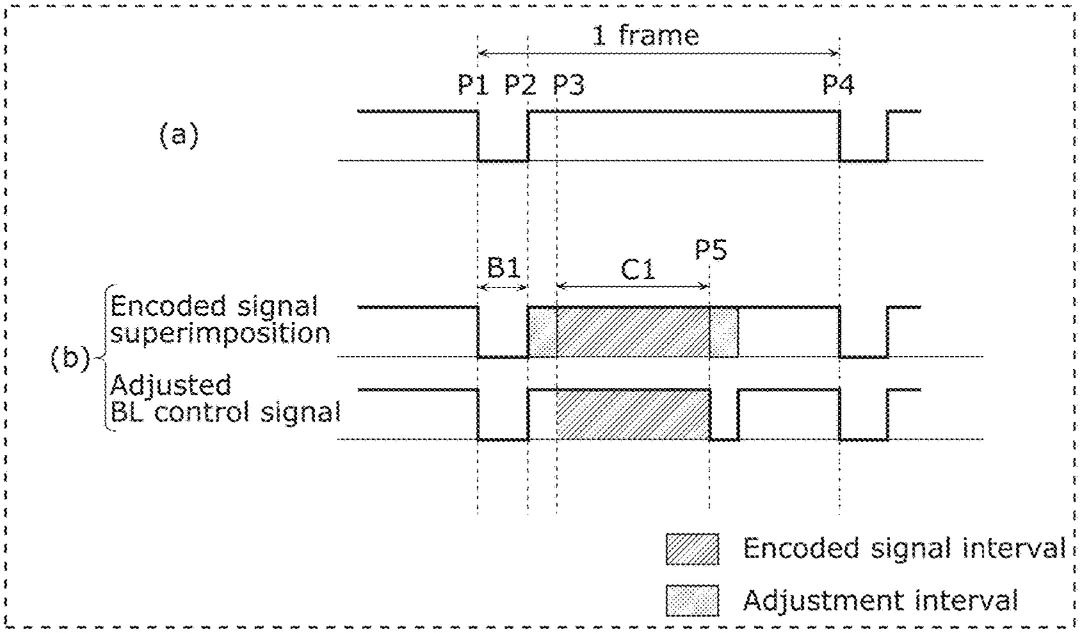
Figure 337B:
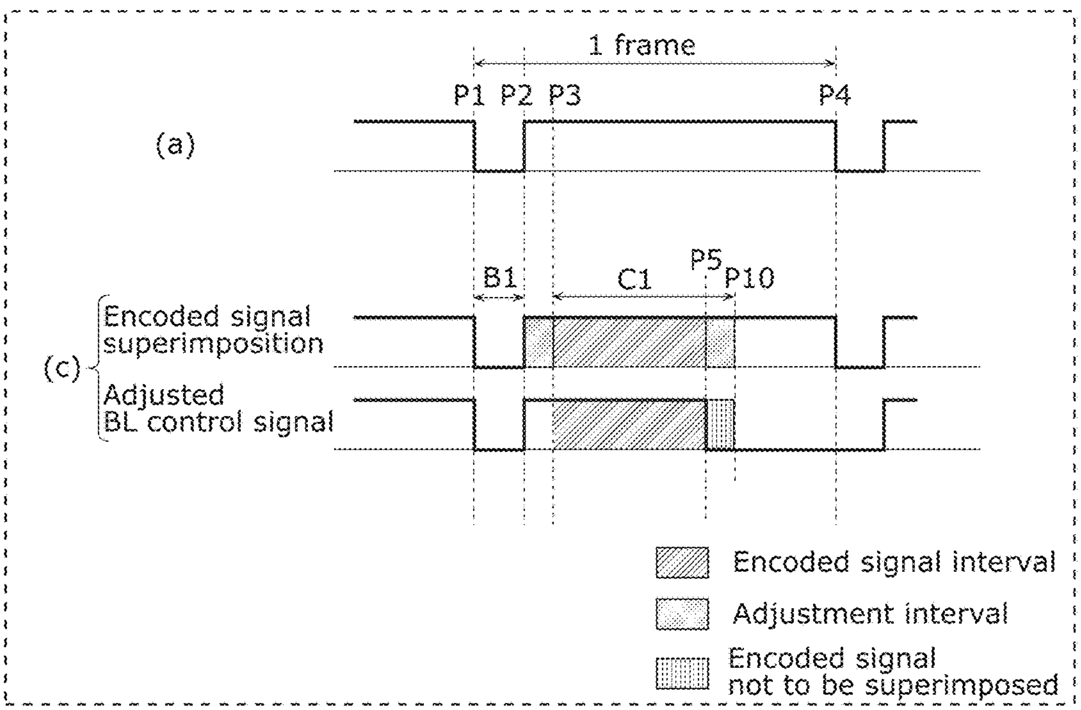
Figure 337C:
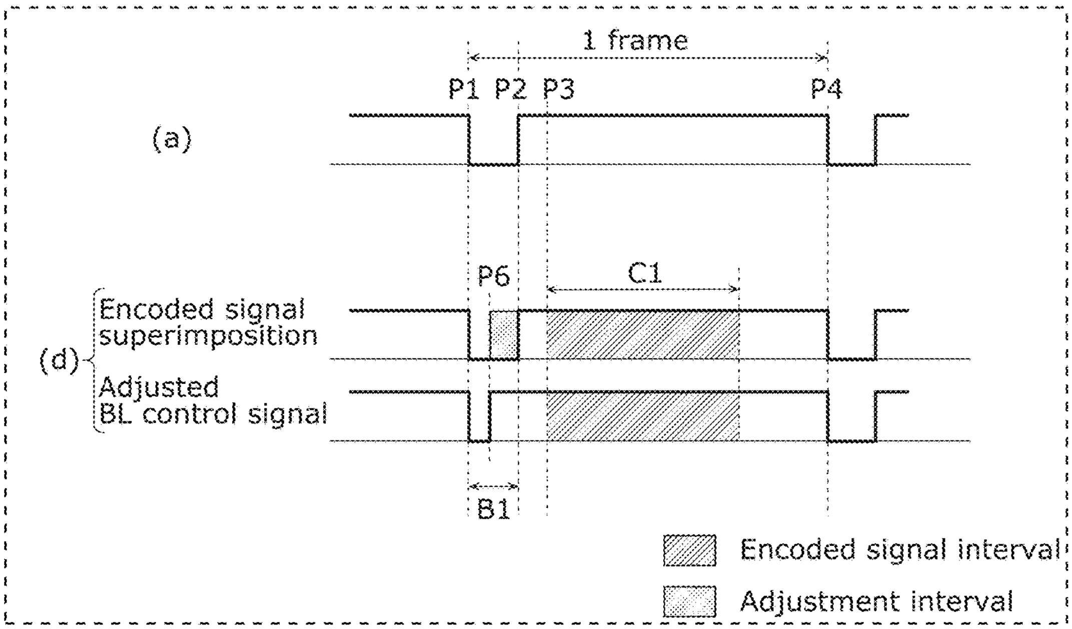
Figure 337D:
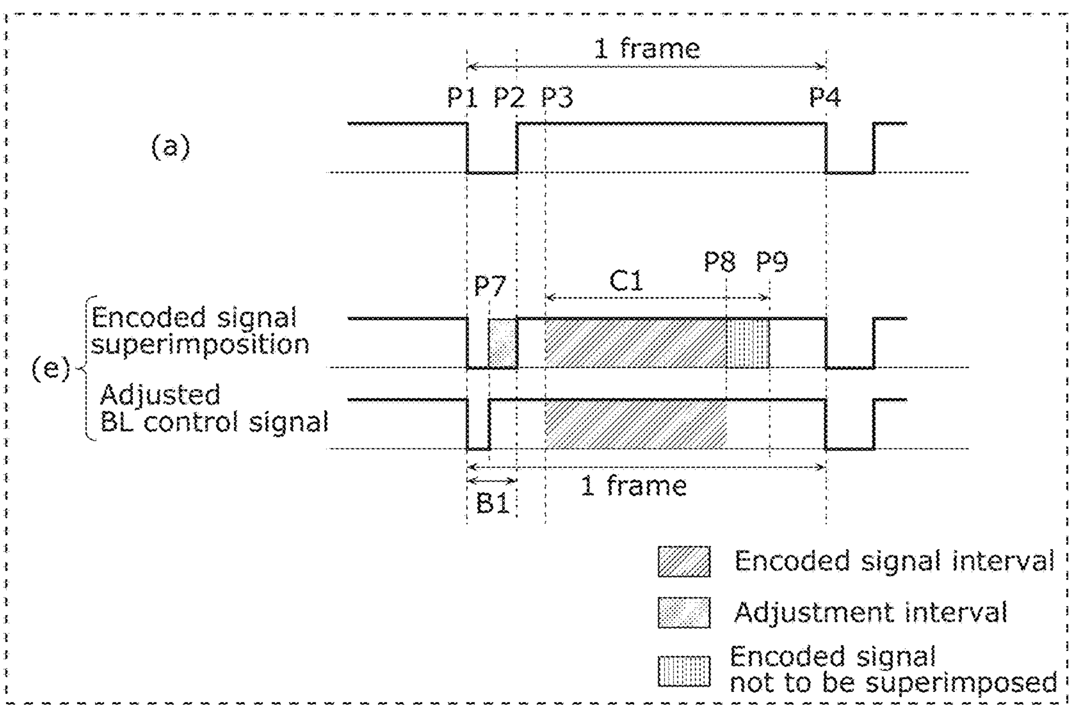
Figure 338A:
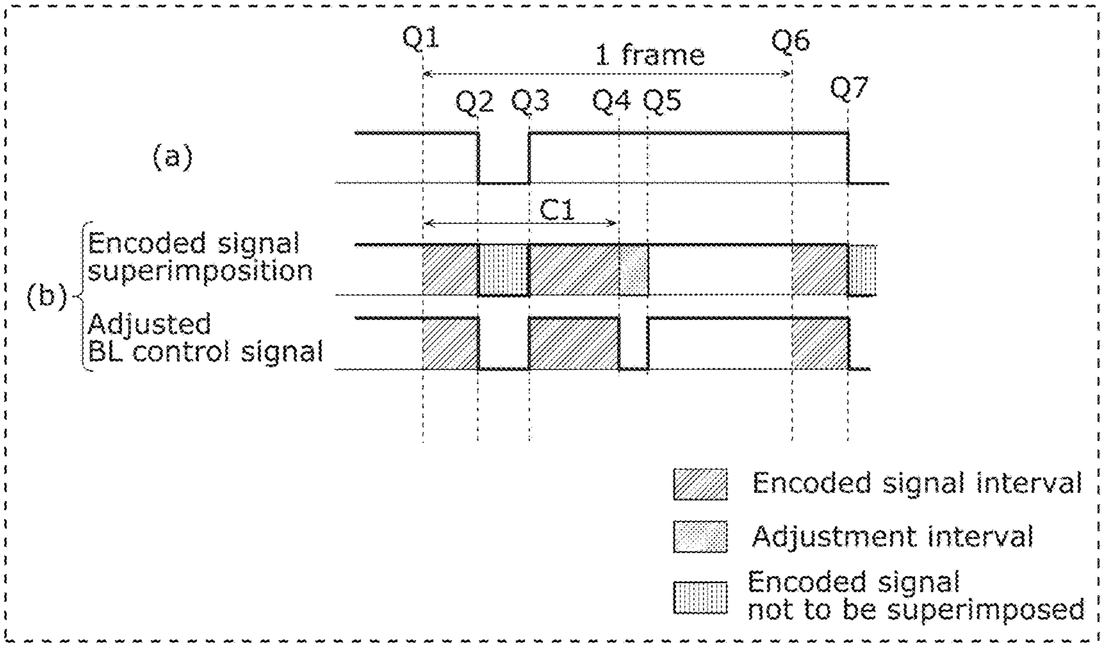
Figure 338B:
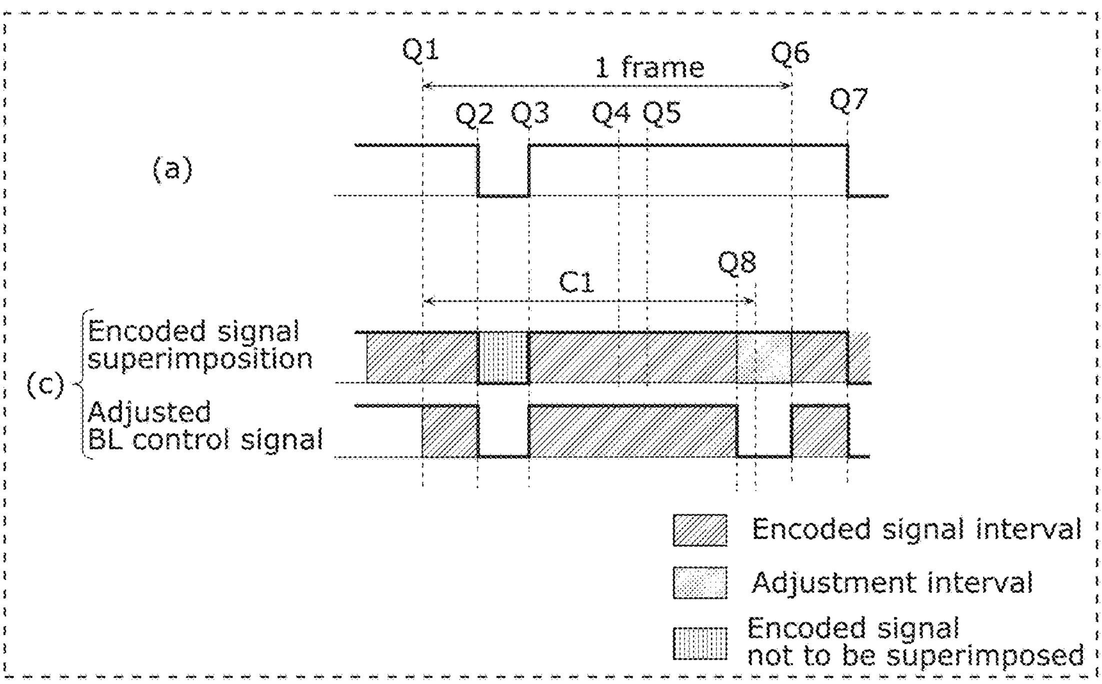
Figure 338C:
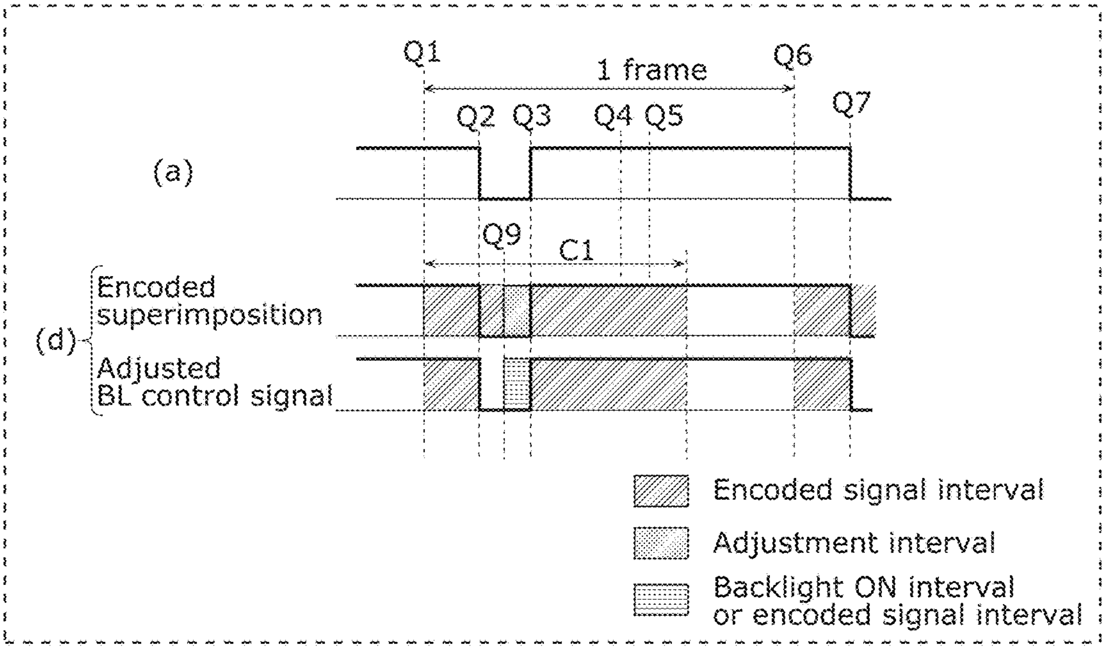
Figure 338D:
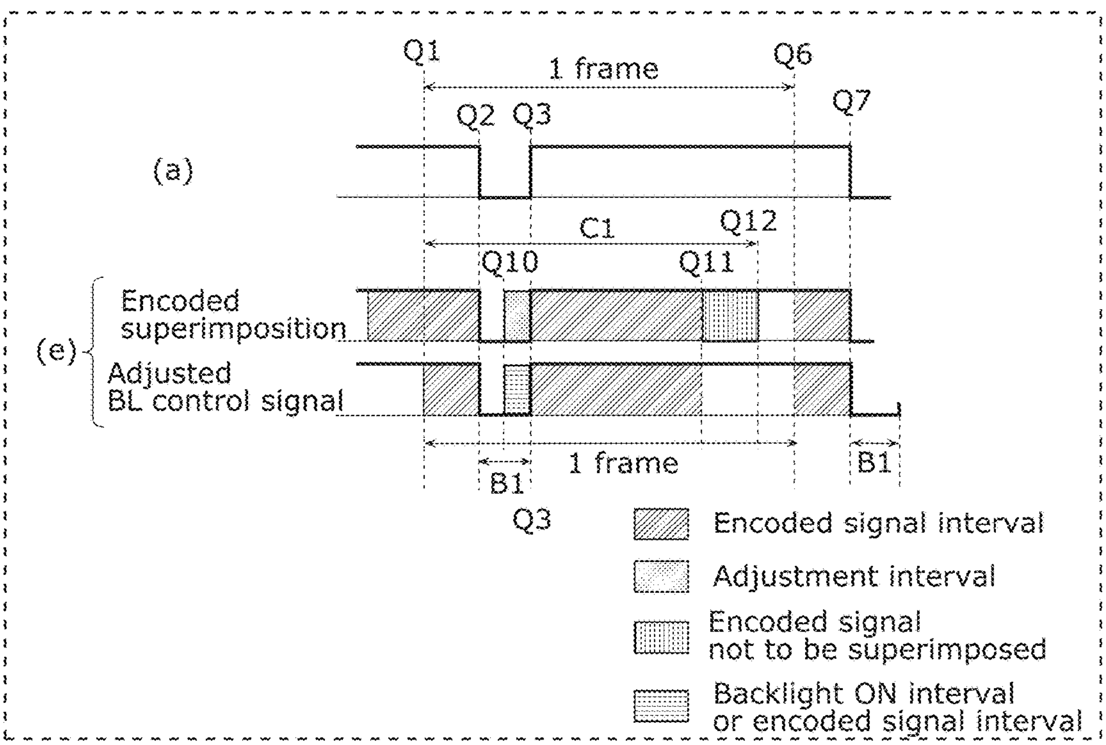
Figure 339:
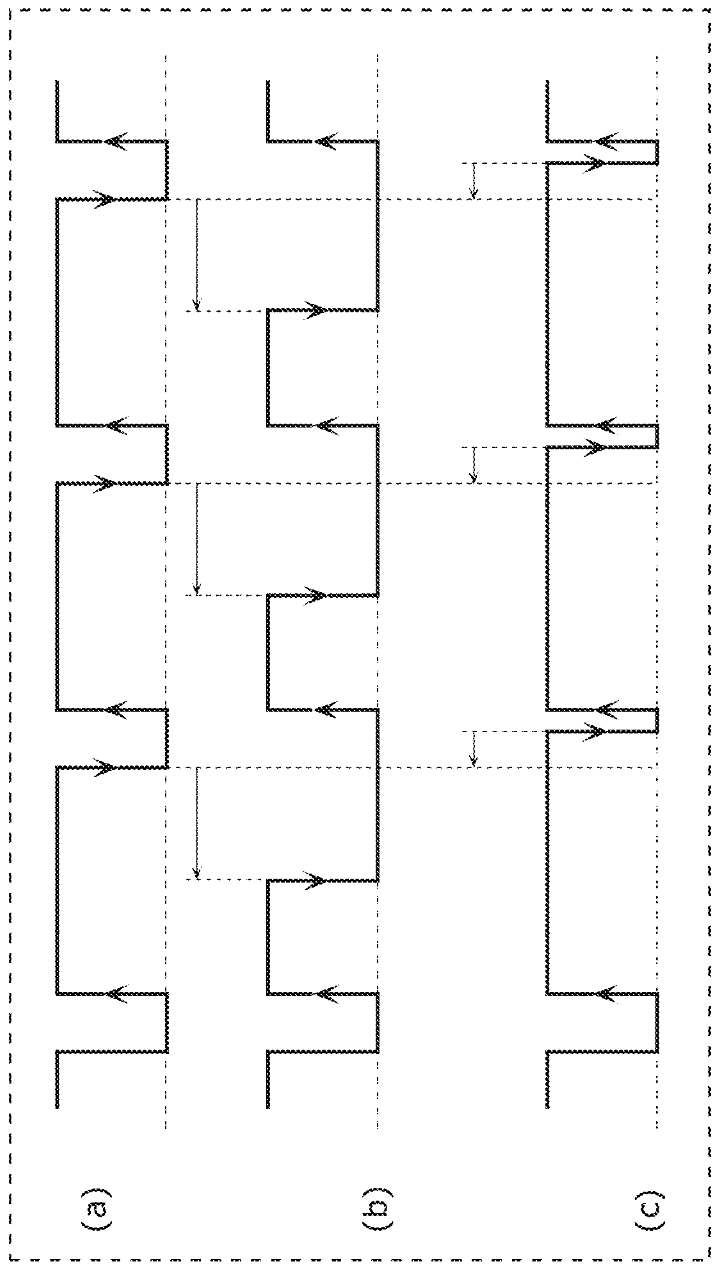
Figure 340:
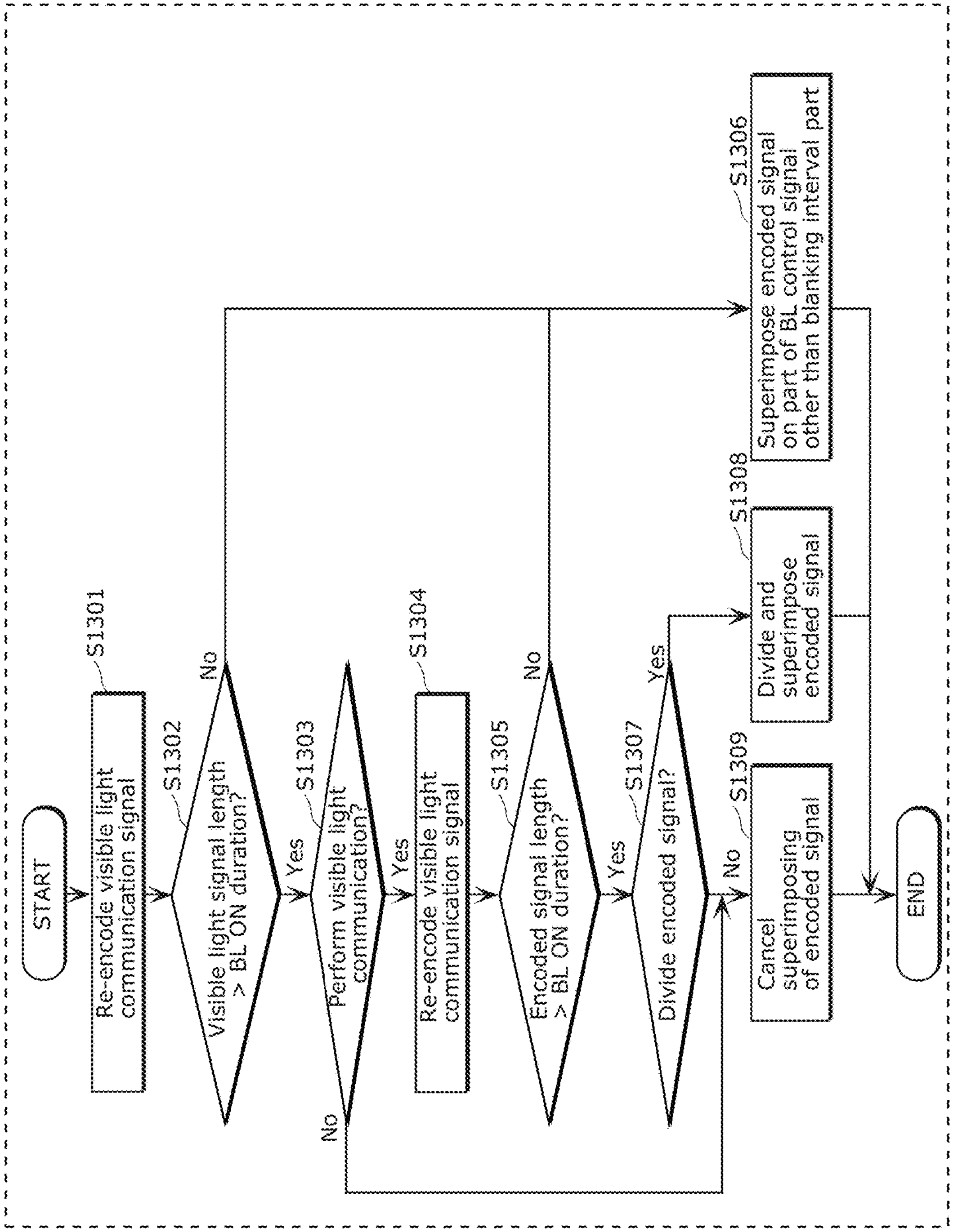
Figure 341A:
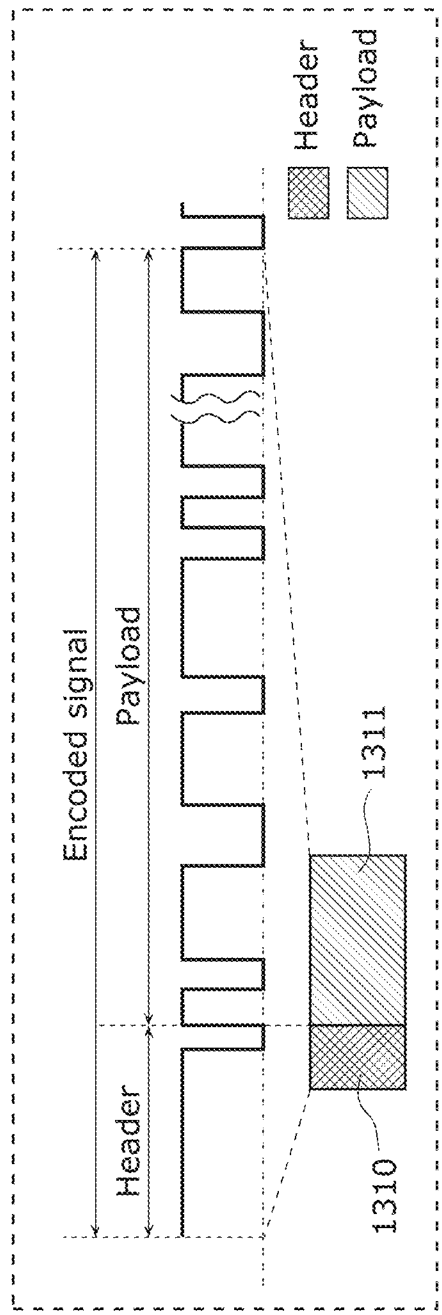
Figure 341B:
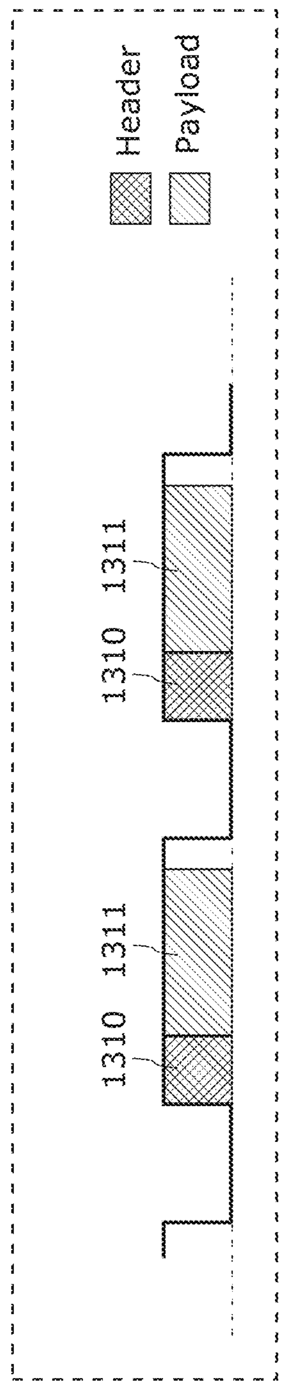
Figure 341C:
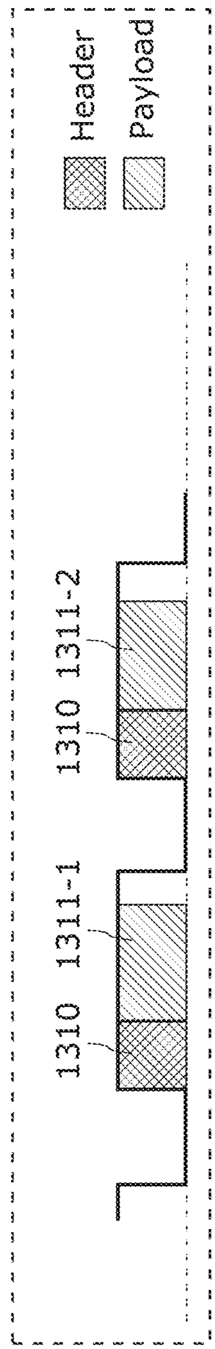
Figure 341D:
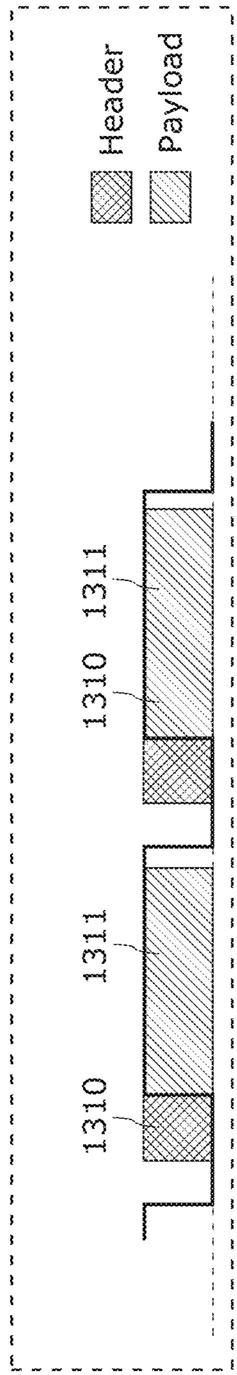
Figure 342:
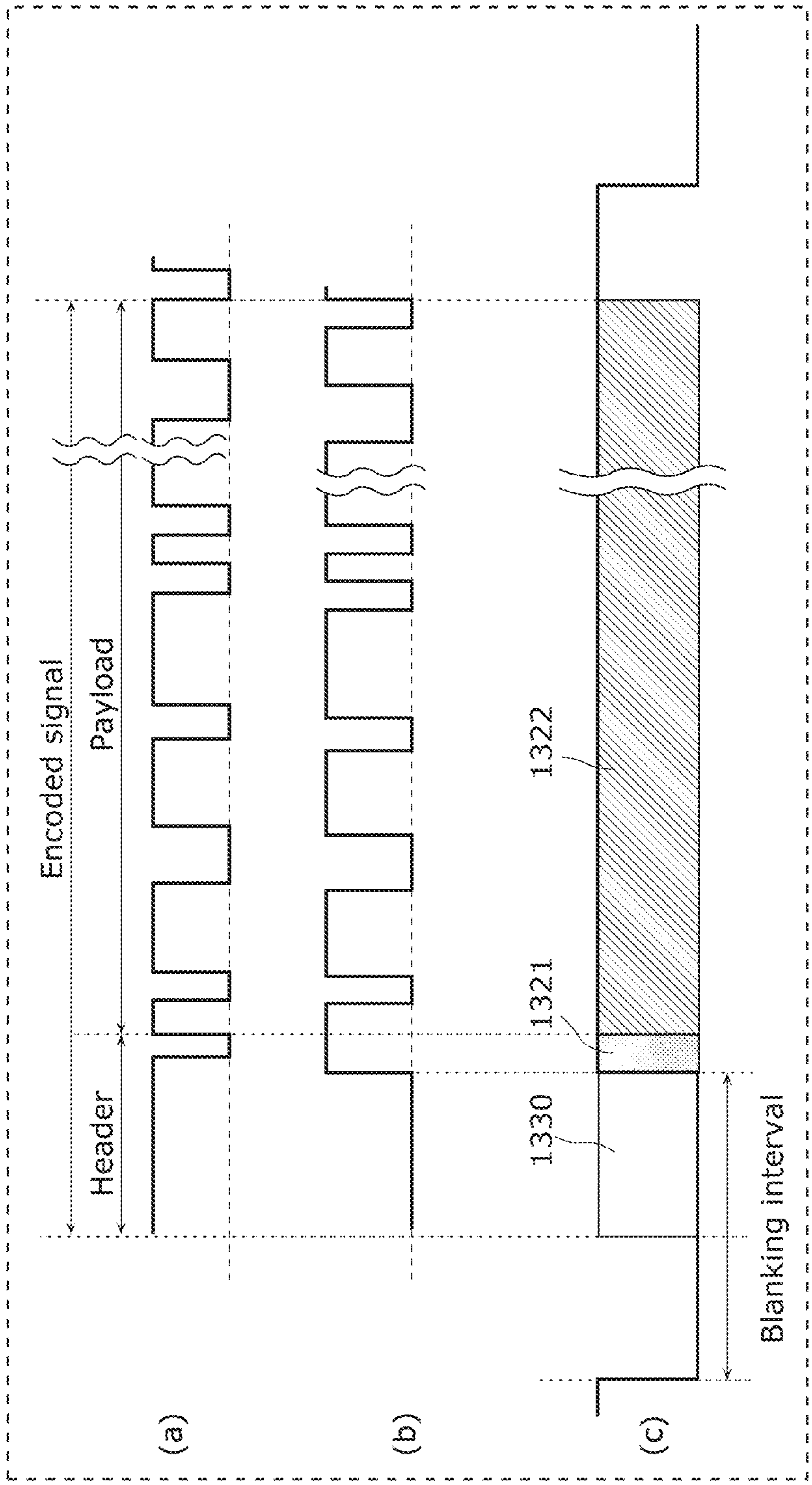
Figure 343:
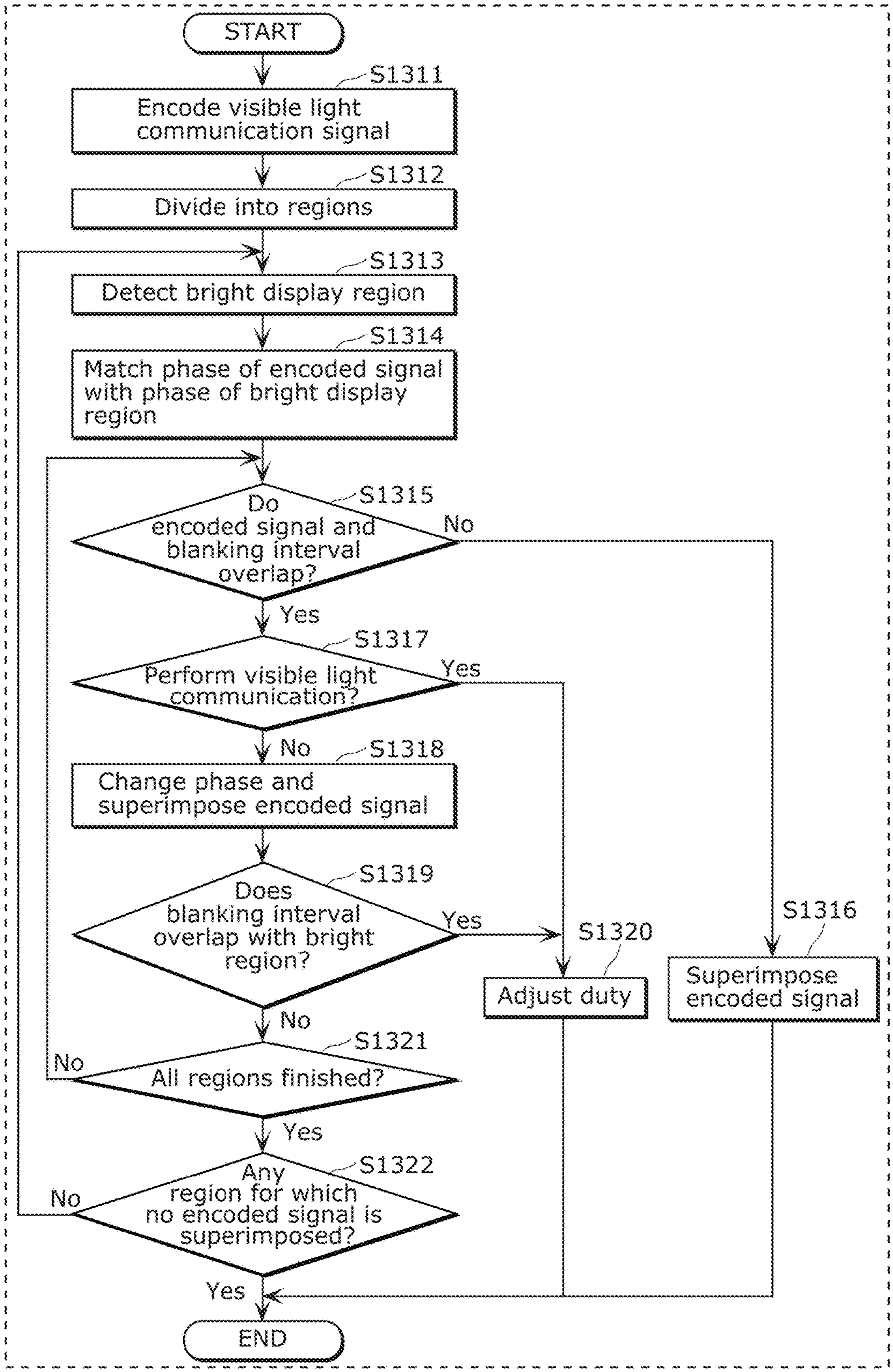
Figure 344:
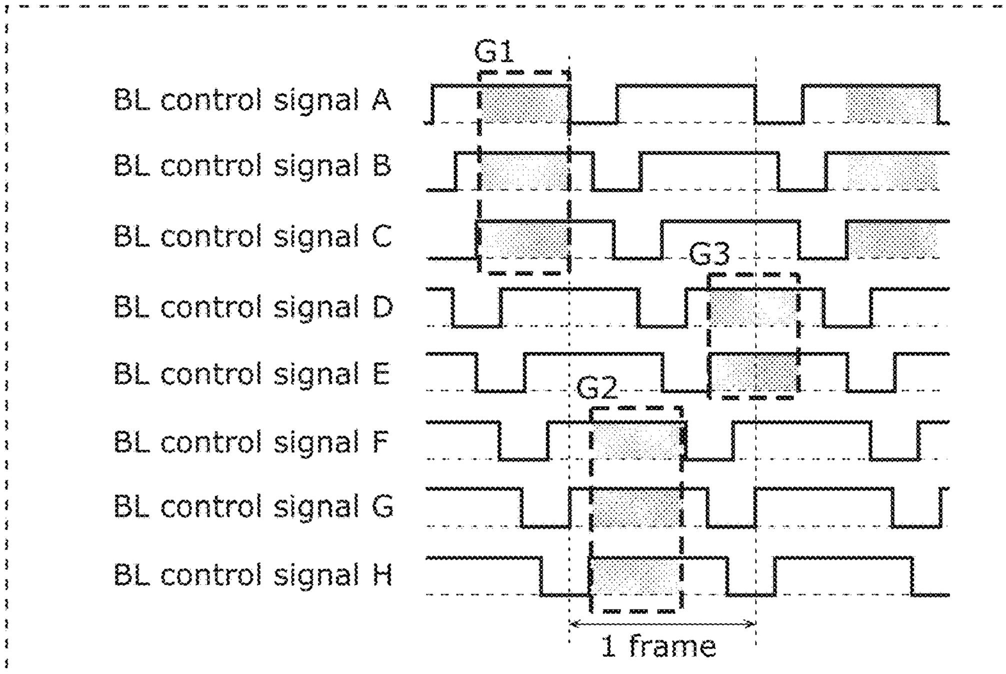
Figure 345:
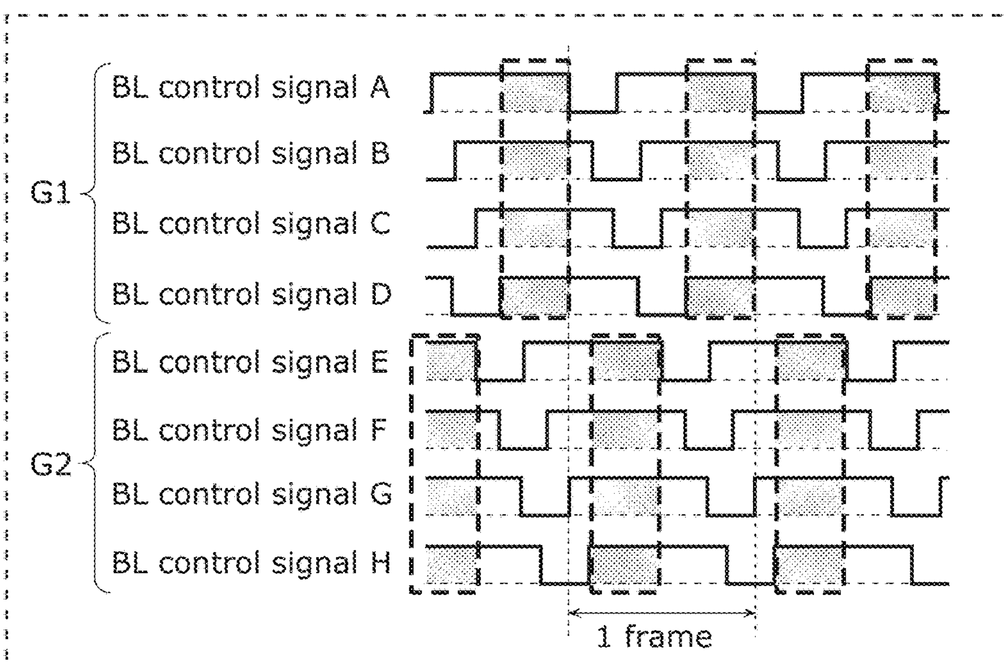
Figure 346:
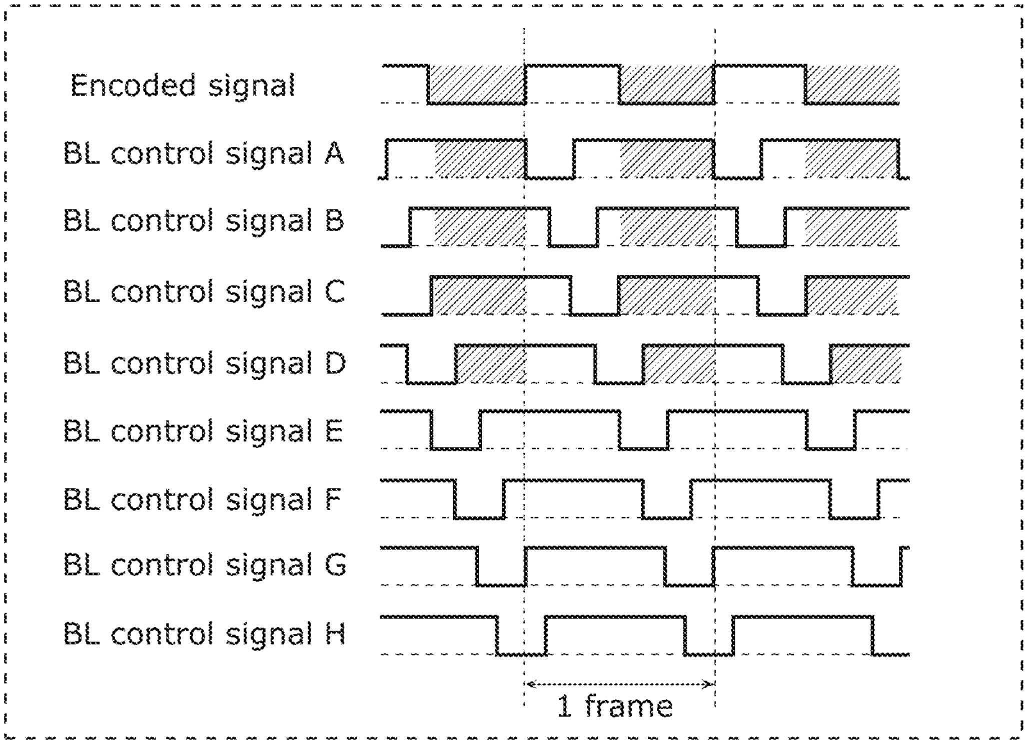
Figure 347:
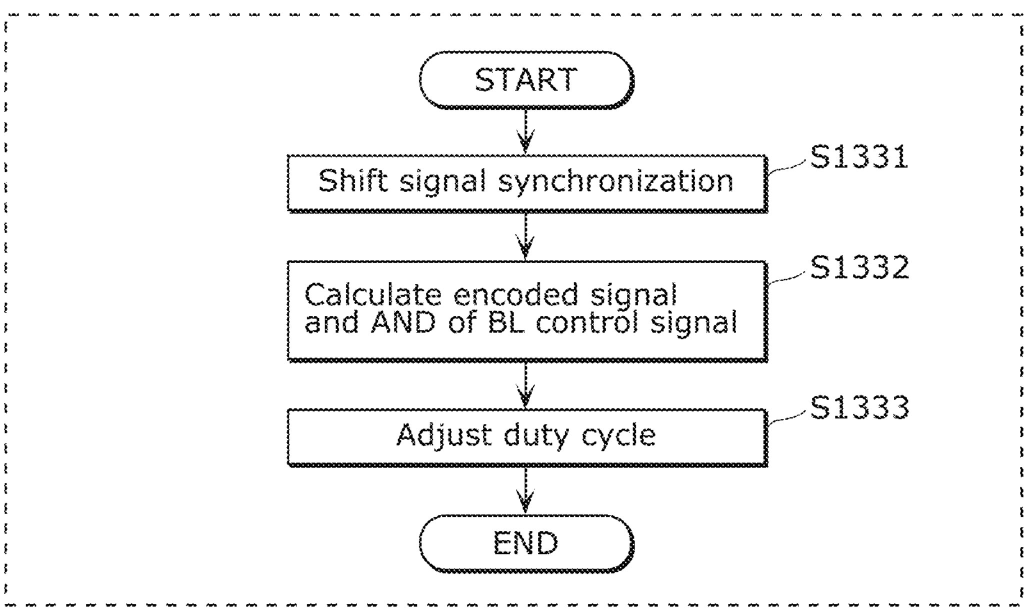
Figure 348A:
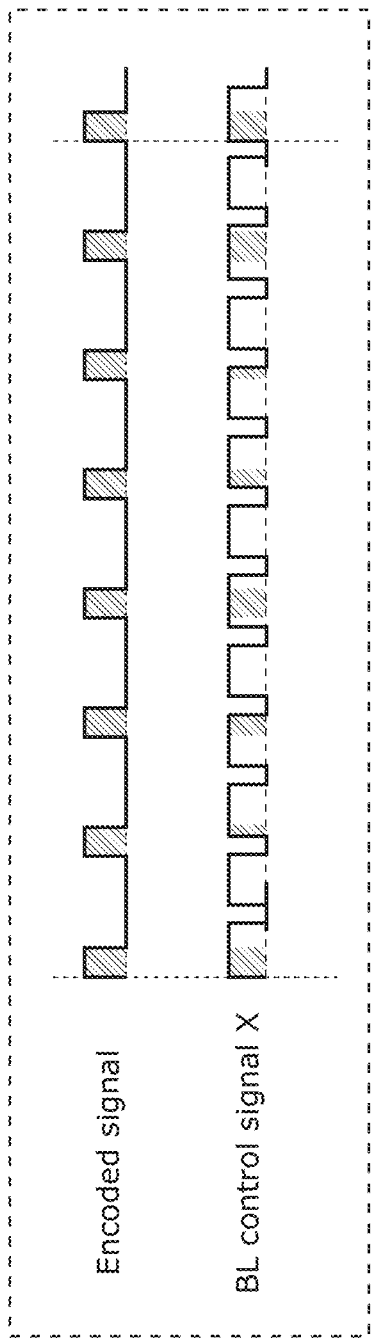
Figure 348B:
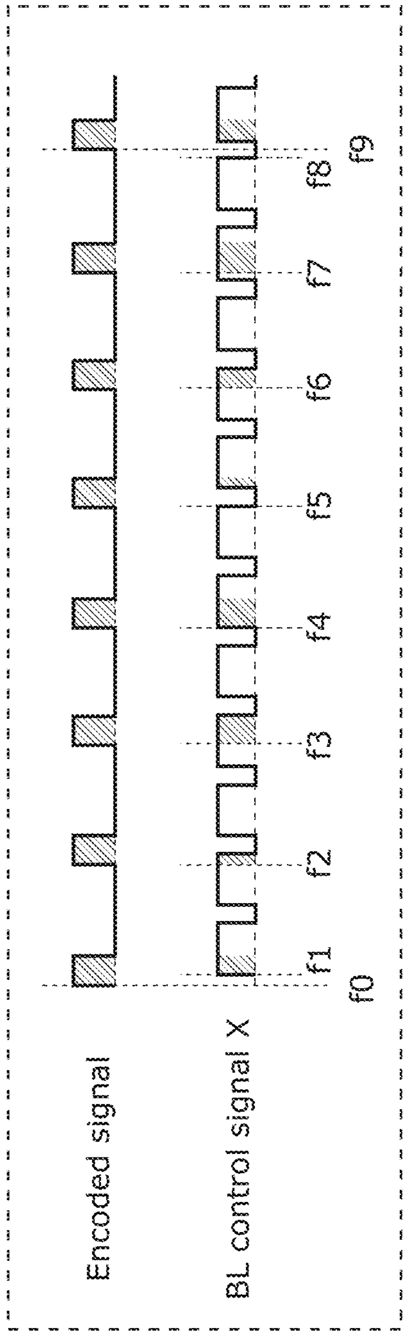
Figure 349A:
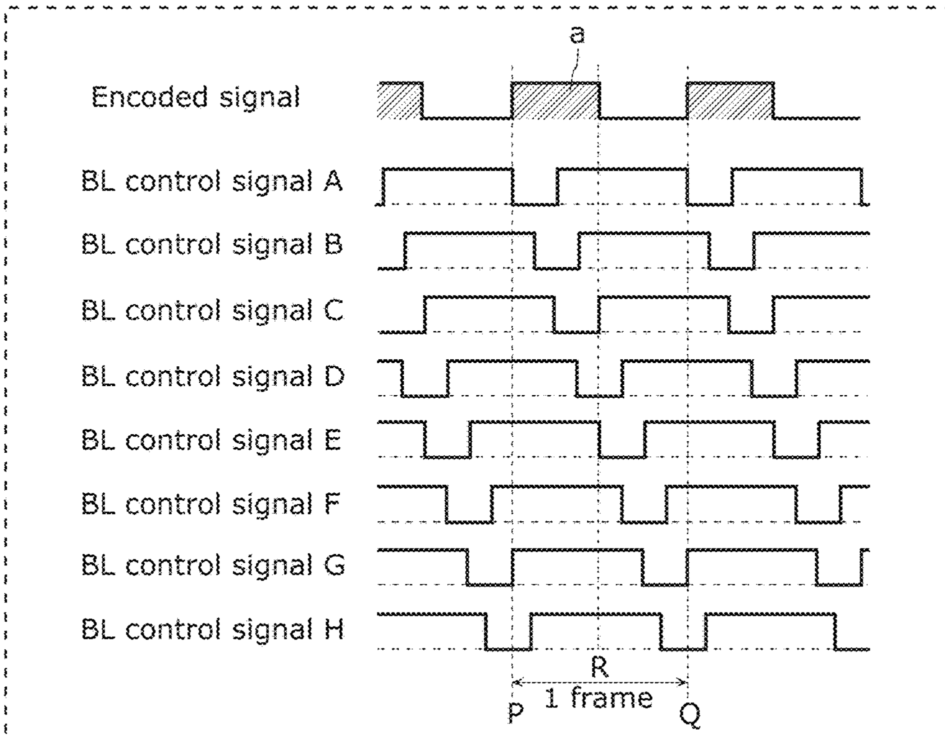
Figure 349B:
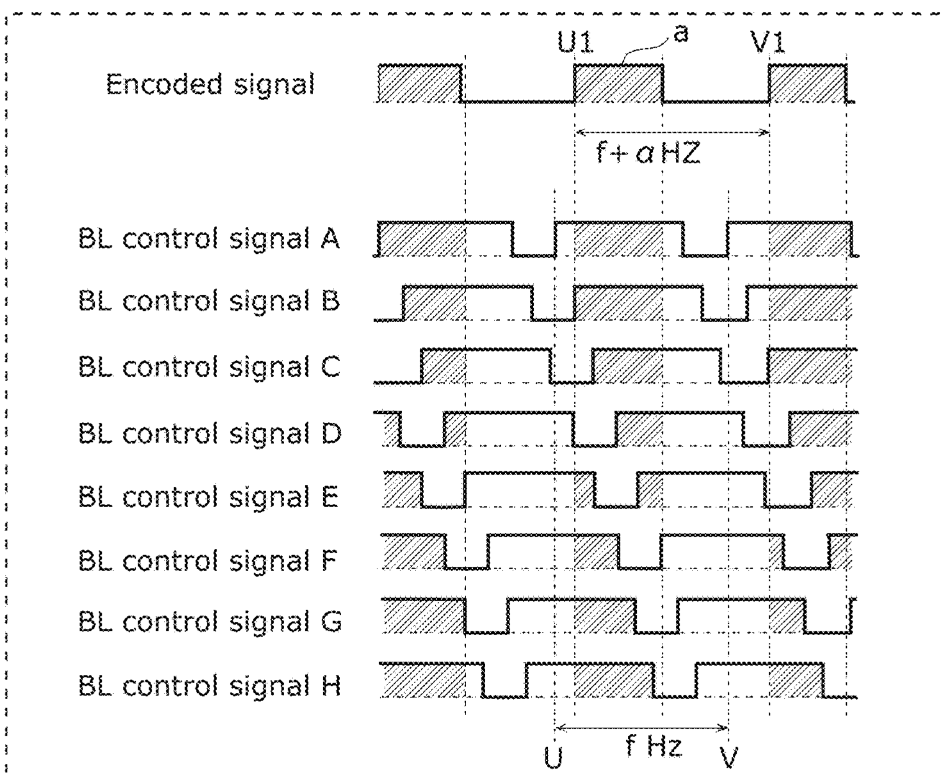
Figure 349C:
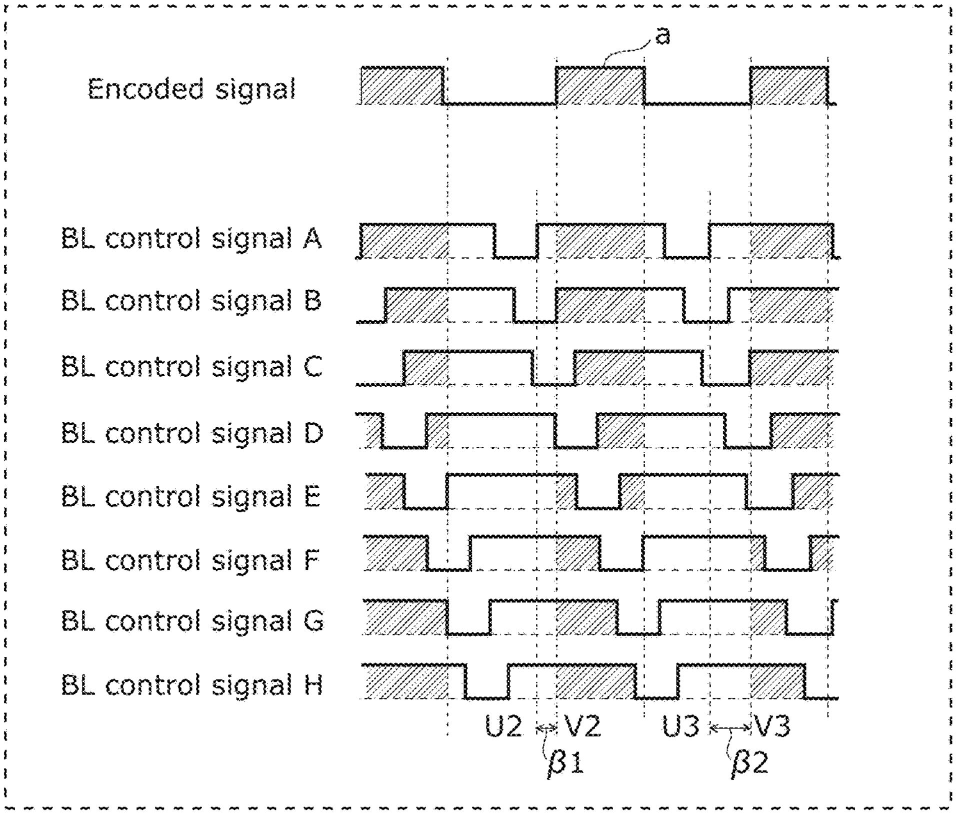
Figure 350A:
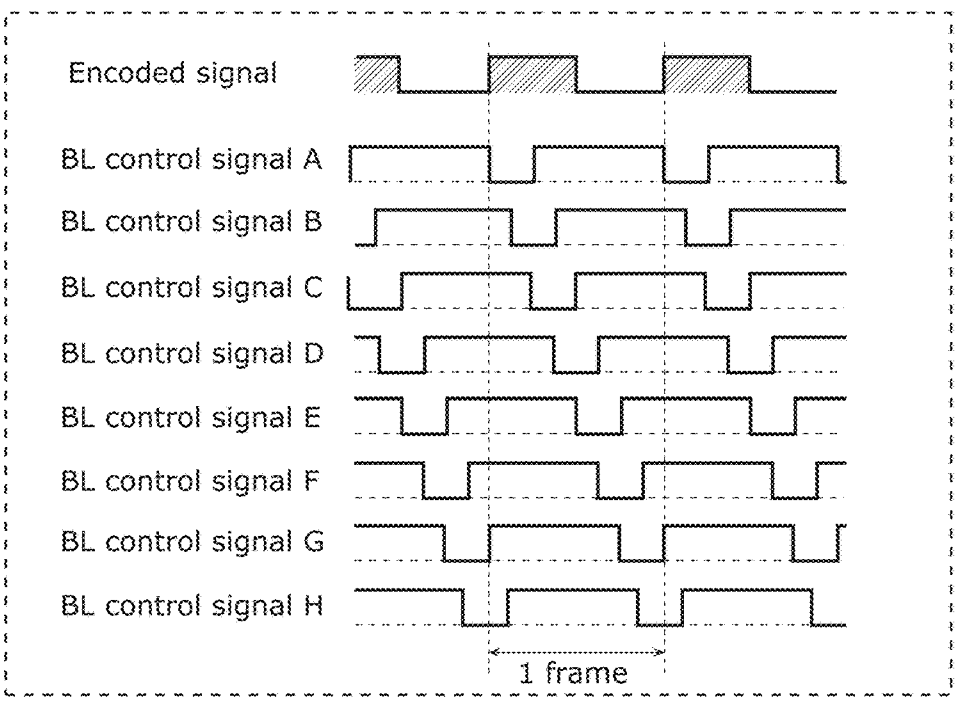
Figure 350B:
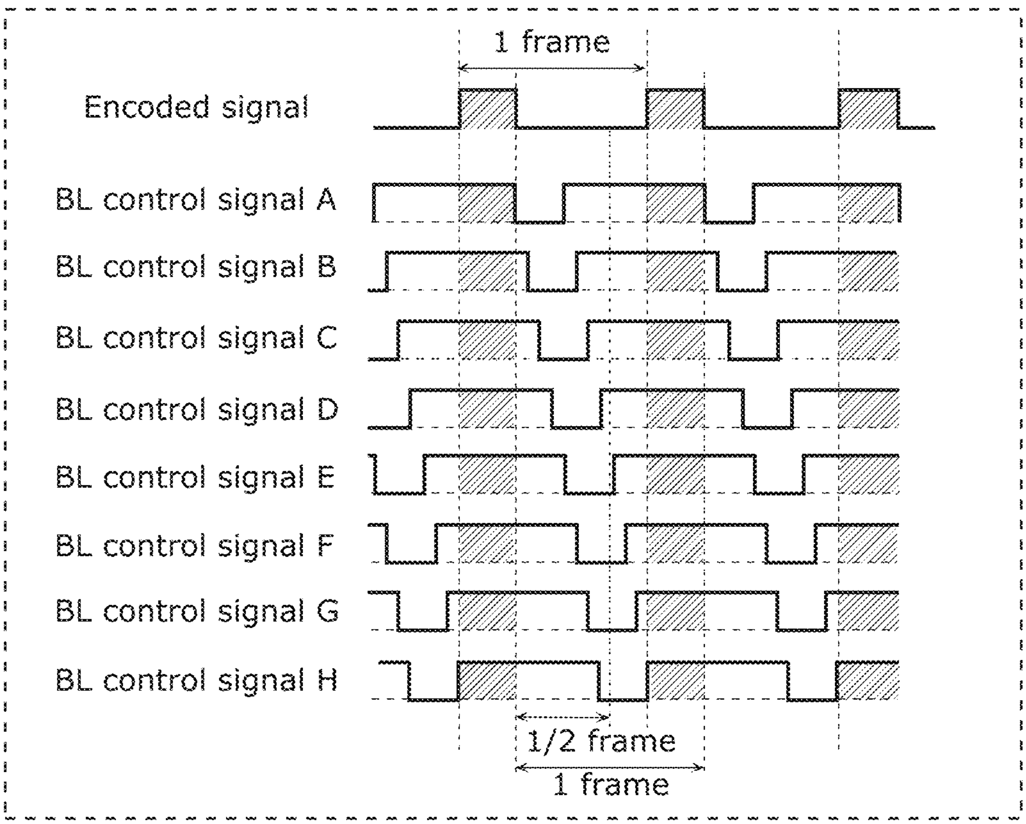
Figure 351:
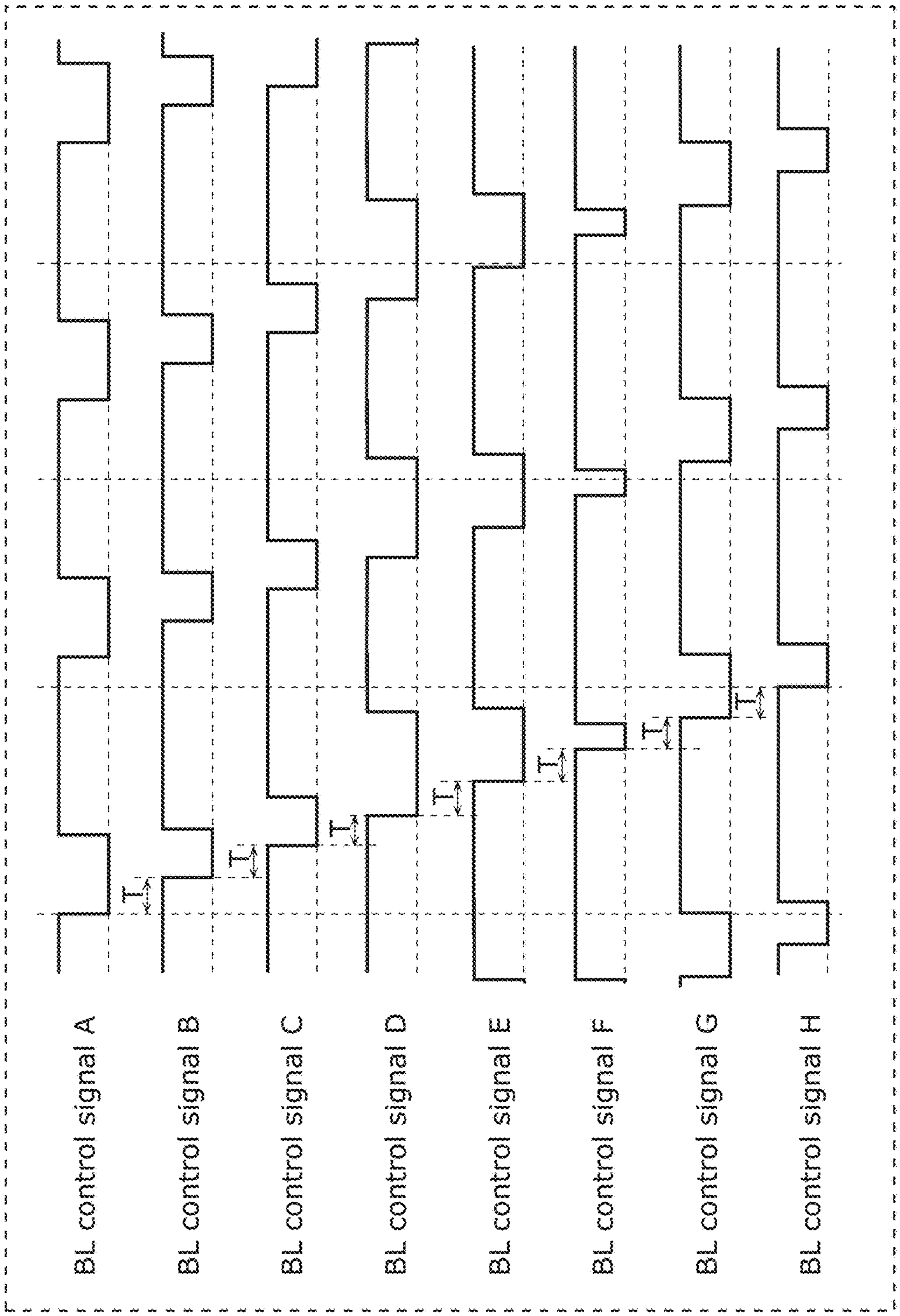
Figure 352:
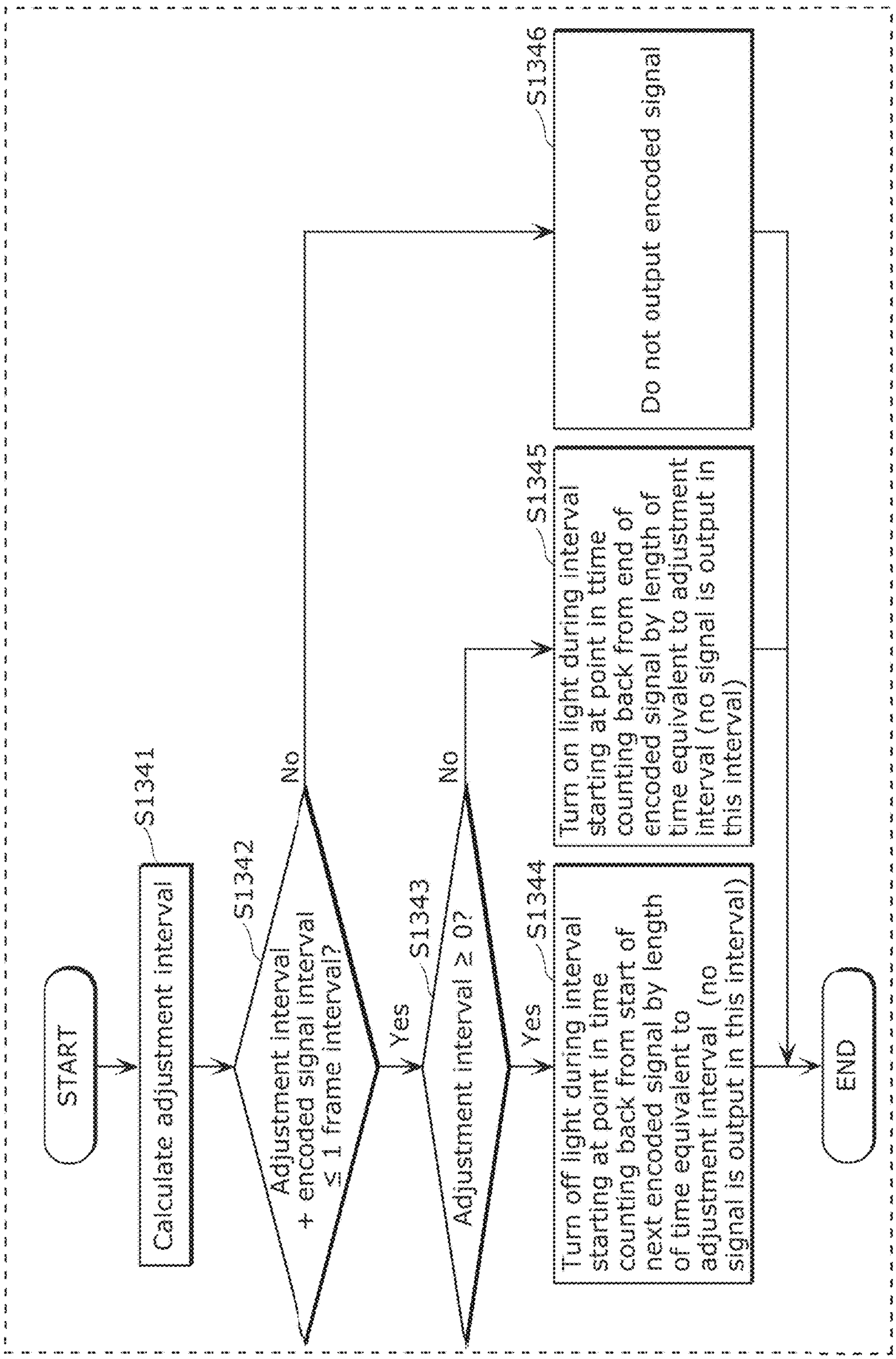
Figure 353:
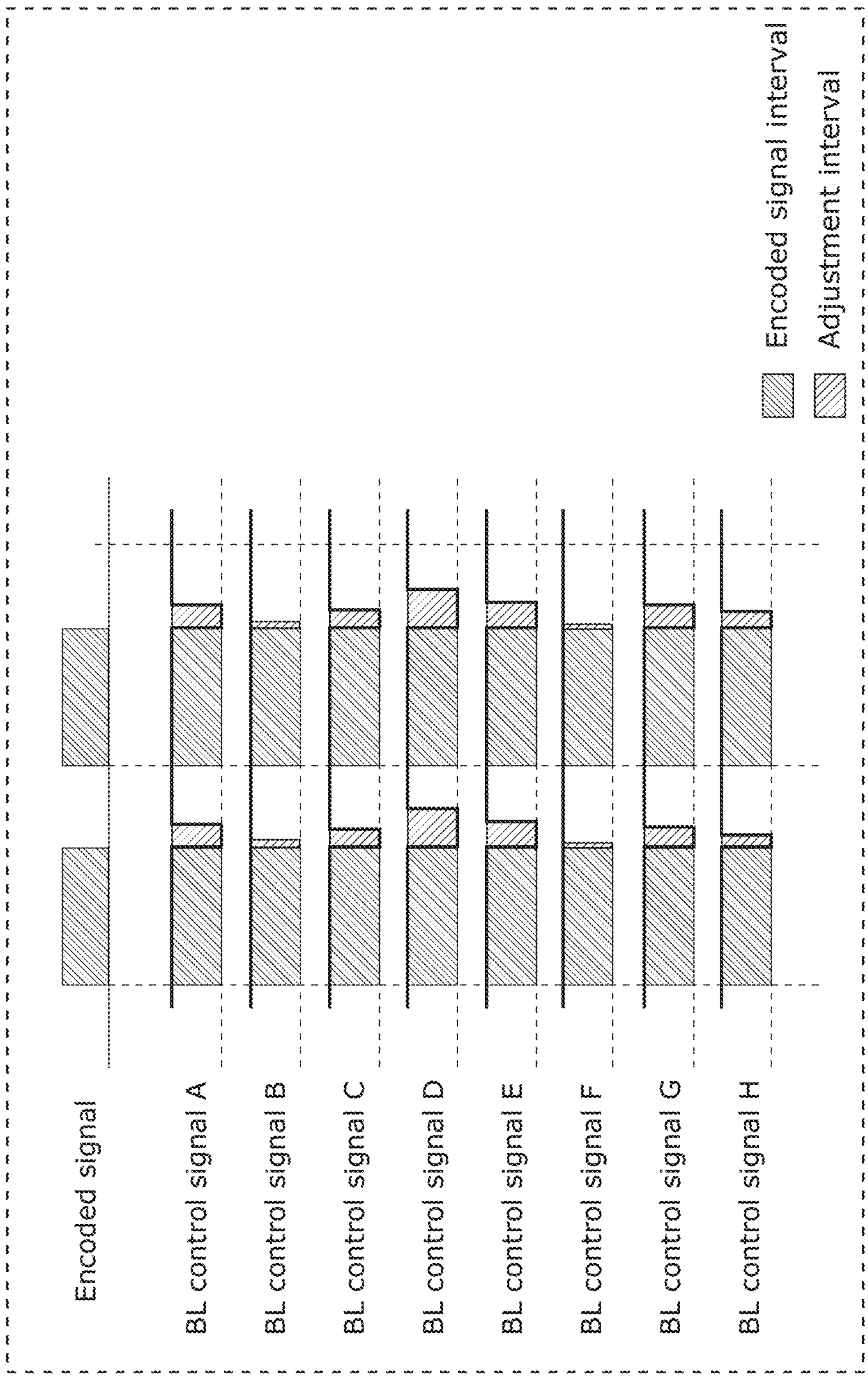
Figure 354:
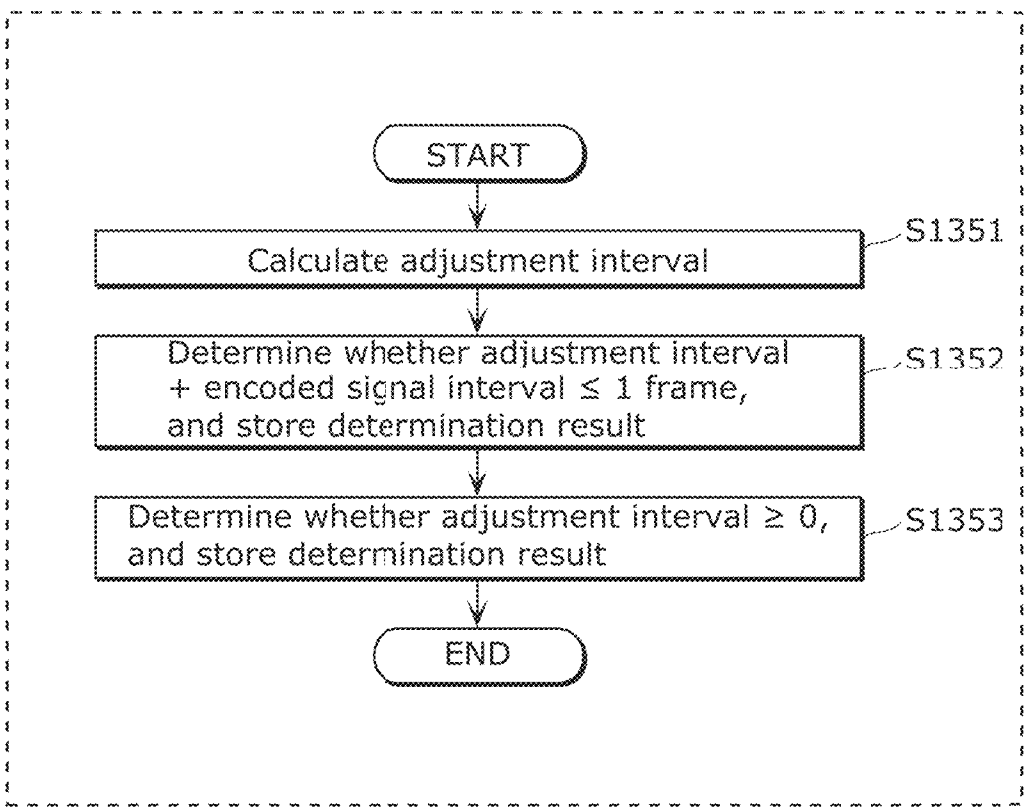
Figure 355:
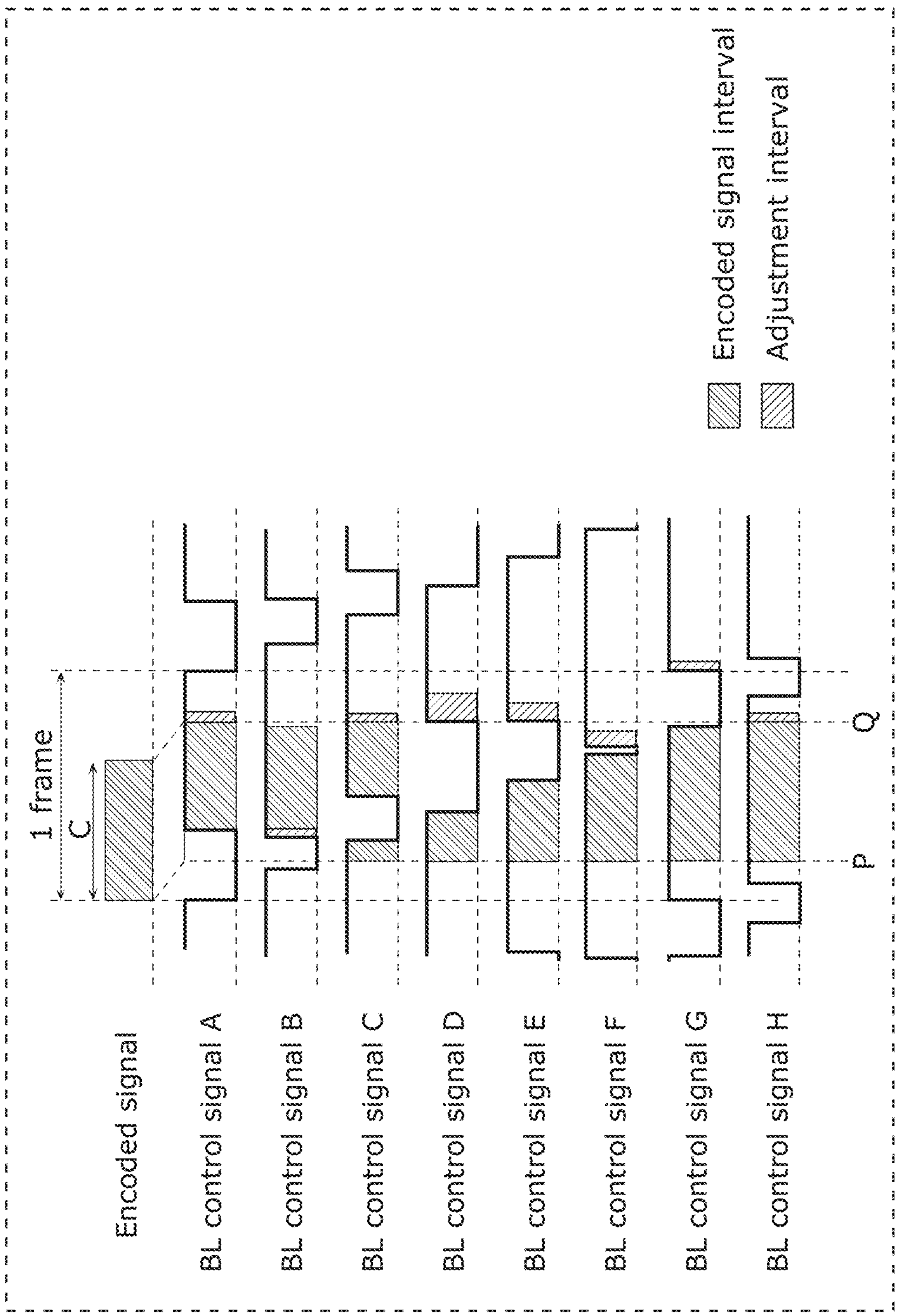
Figure 356:
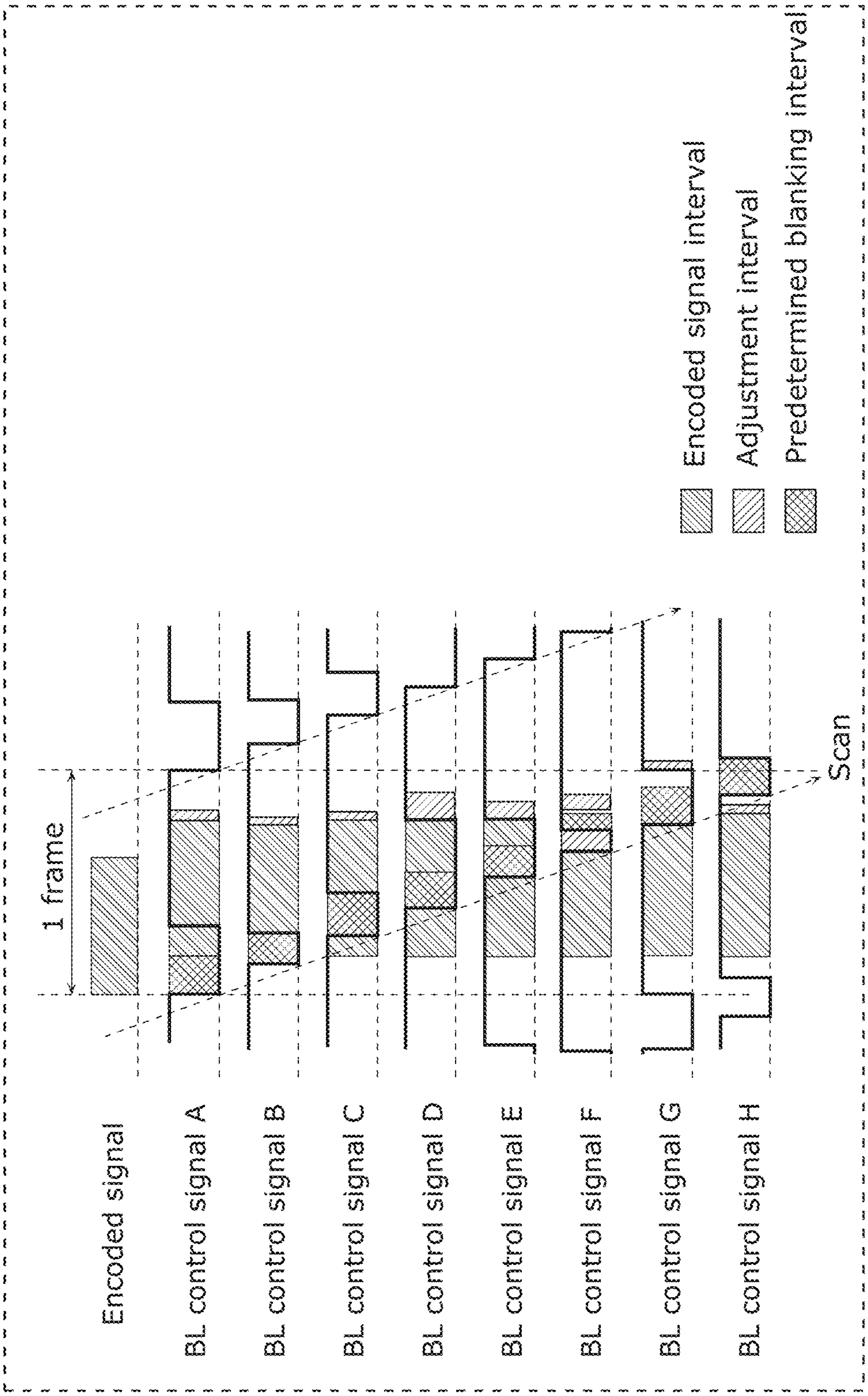
Figure 357:
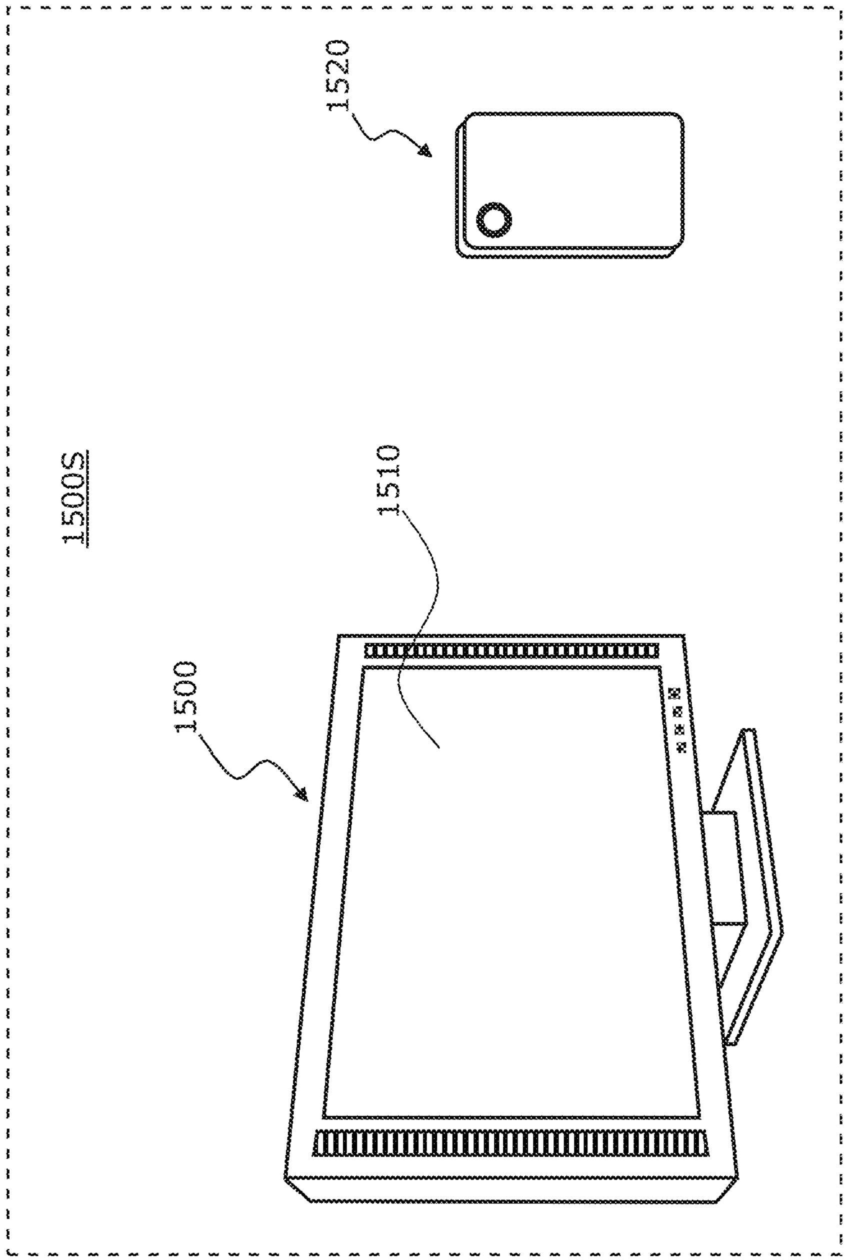
Figure 358:
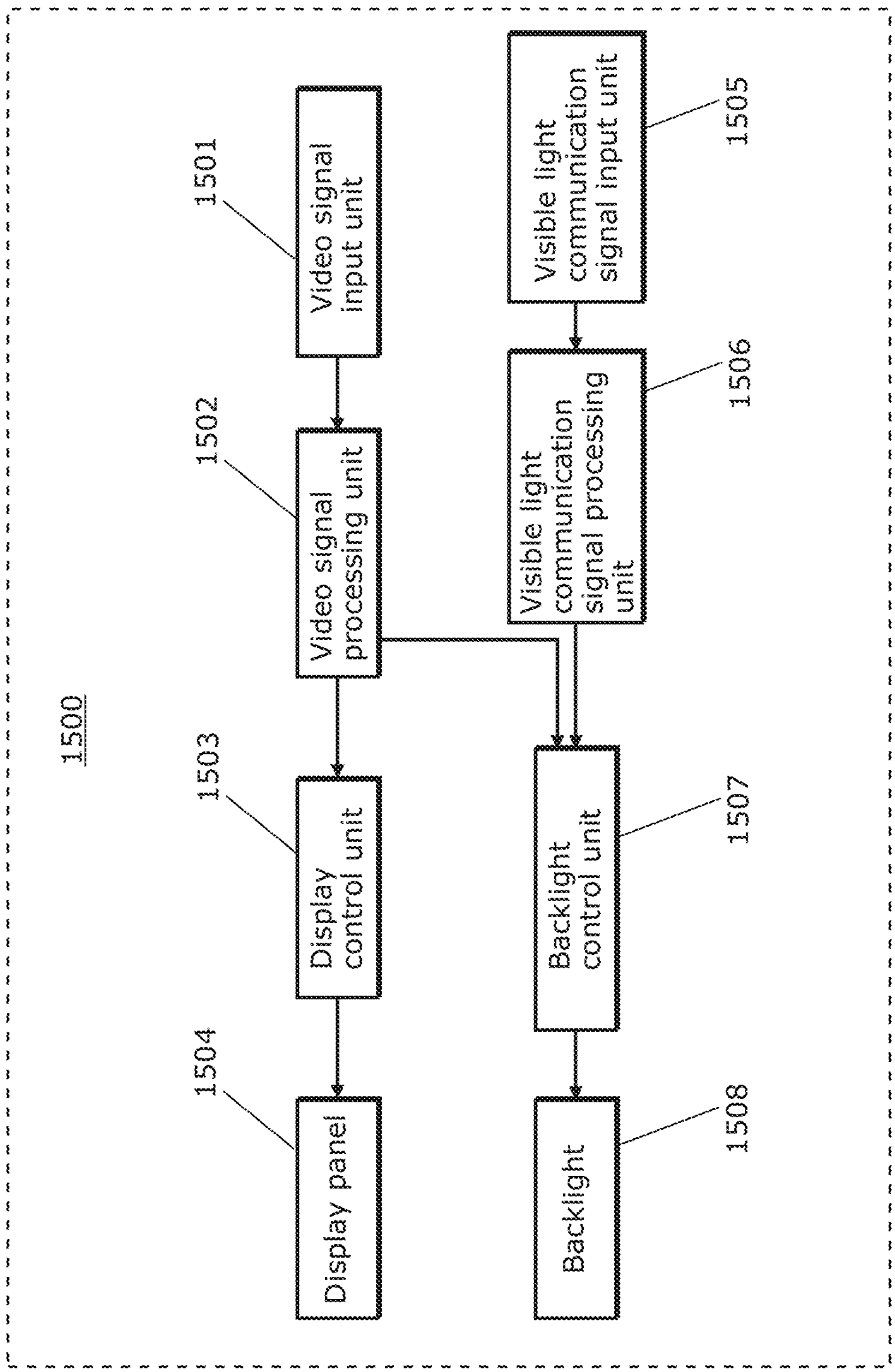
Figure 359:
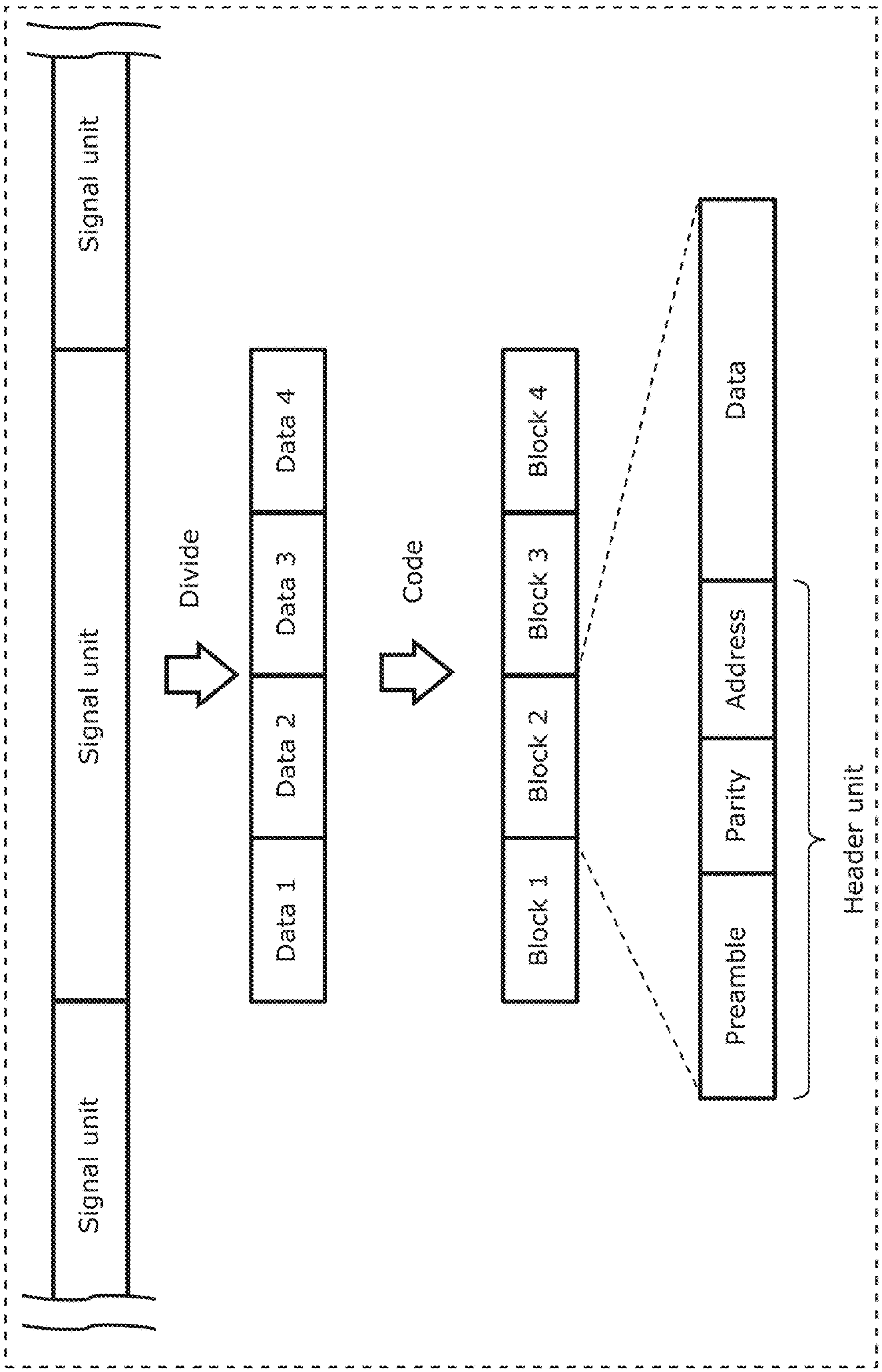
Figure 360:
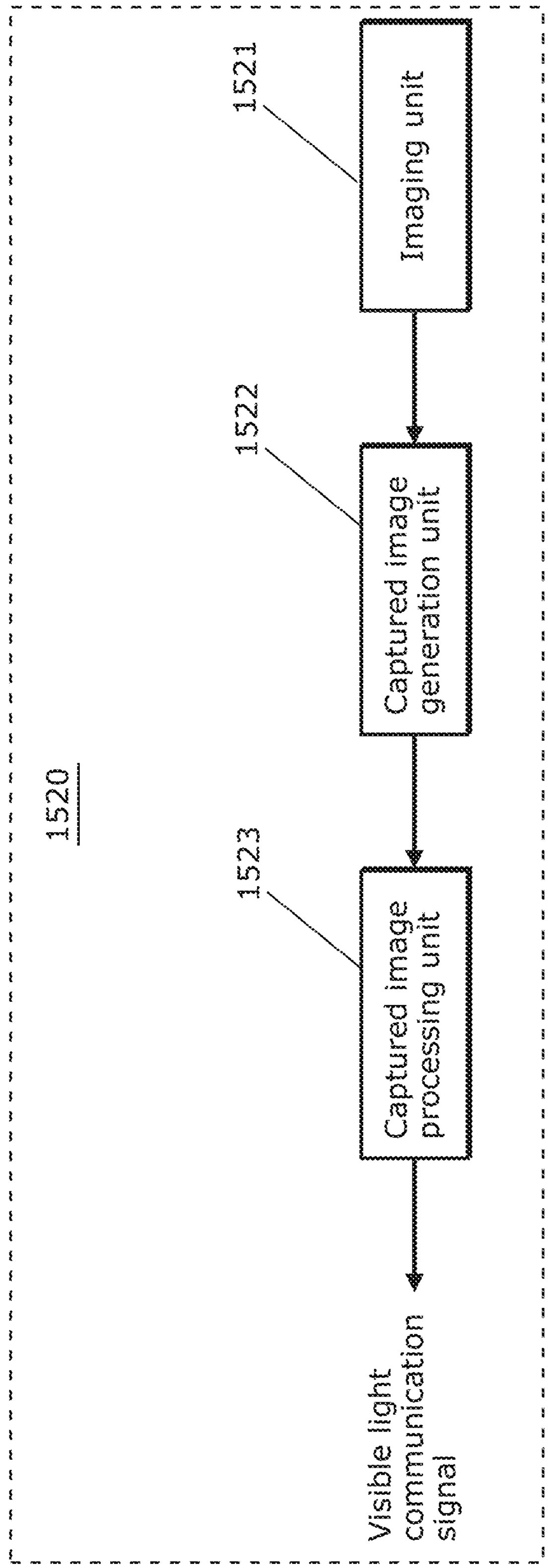
Figure 361:
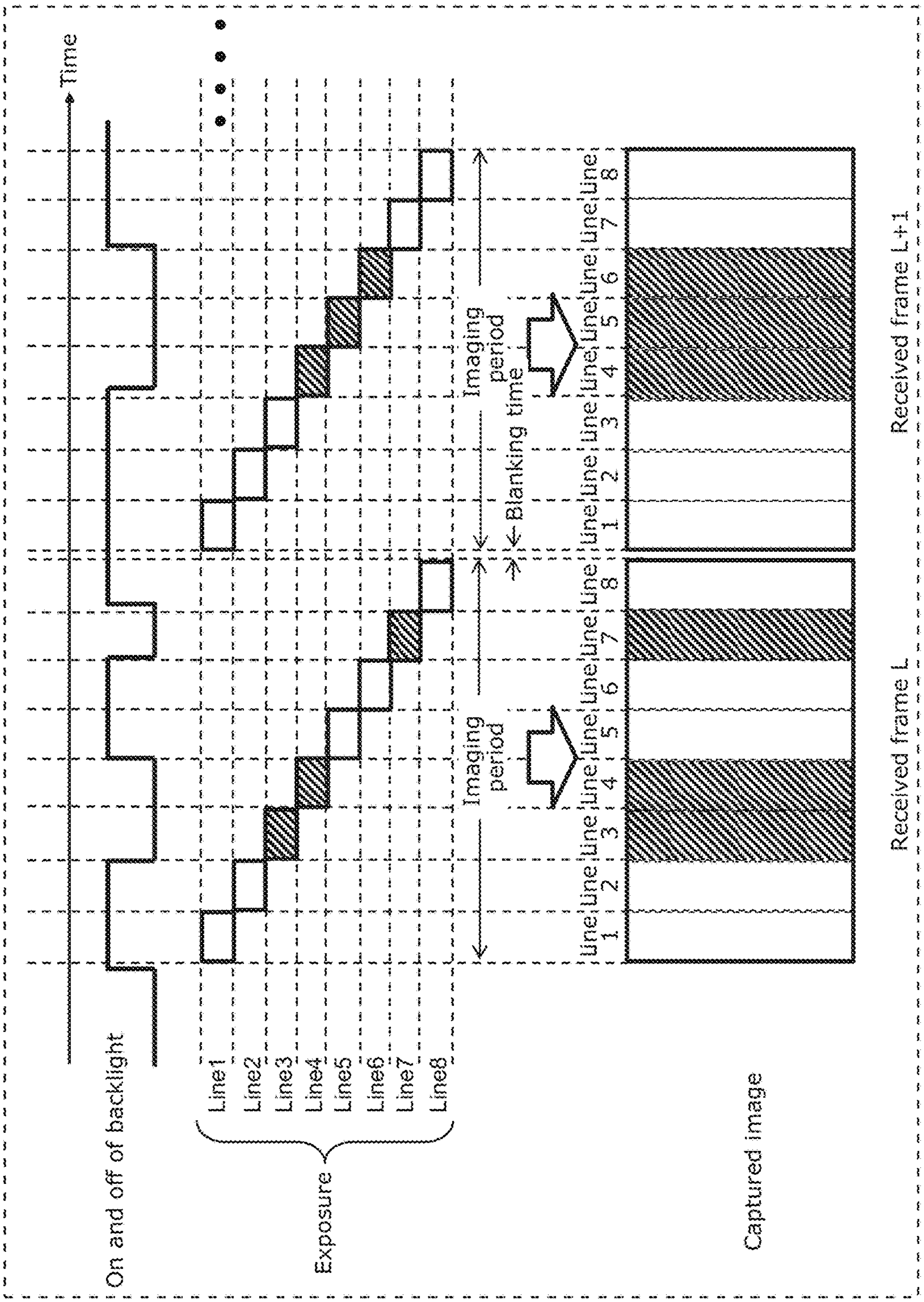
Figure 362:
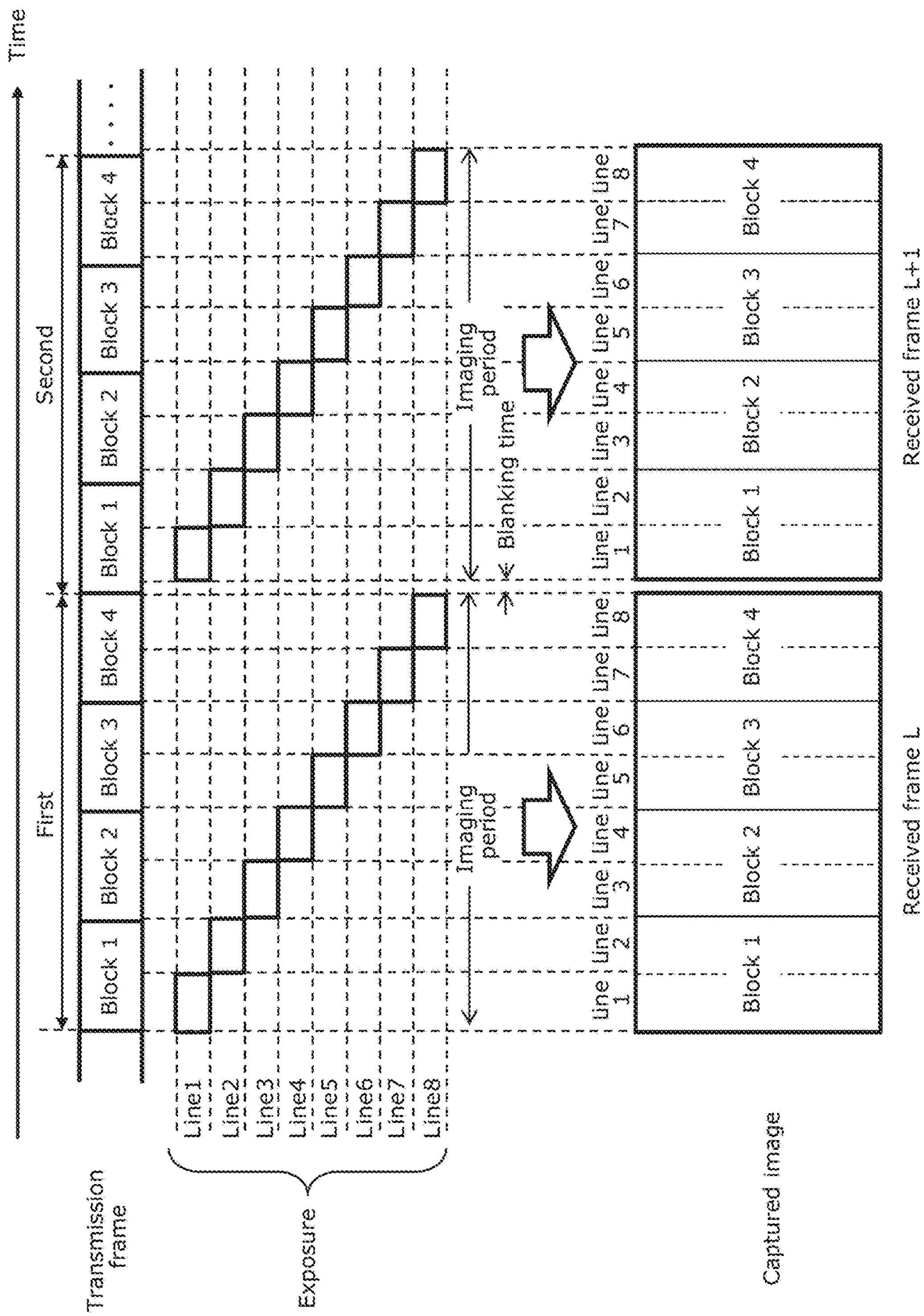
Figure 363:
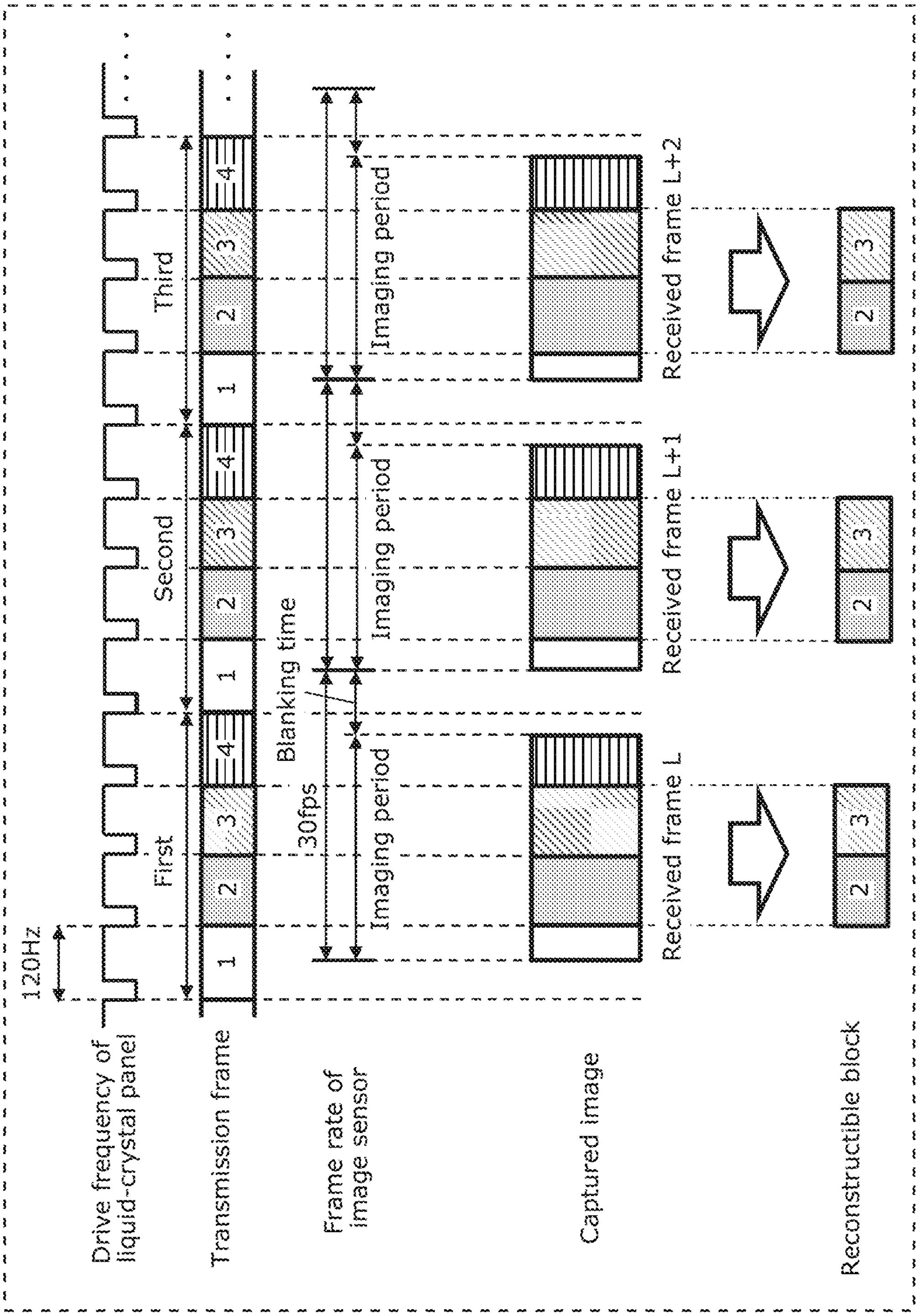
Figure 364:
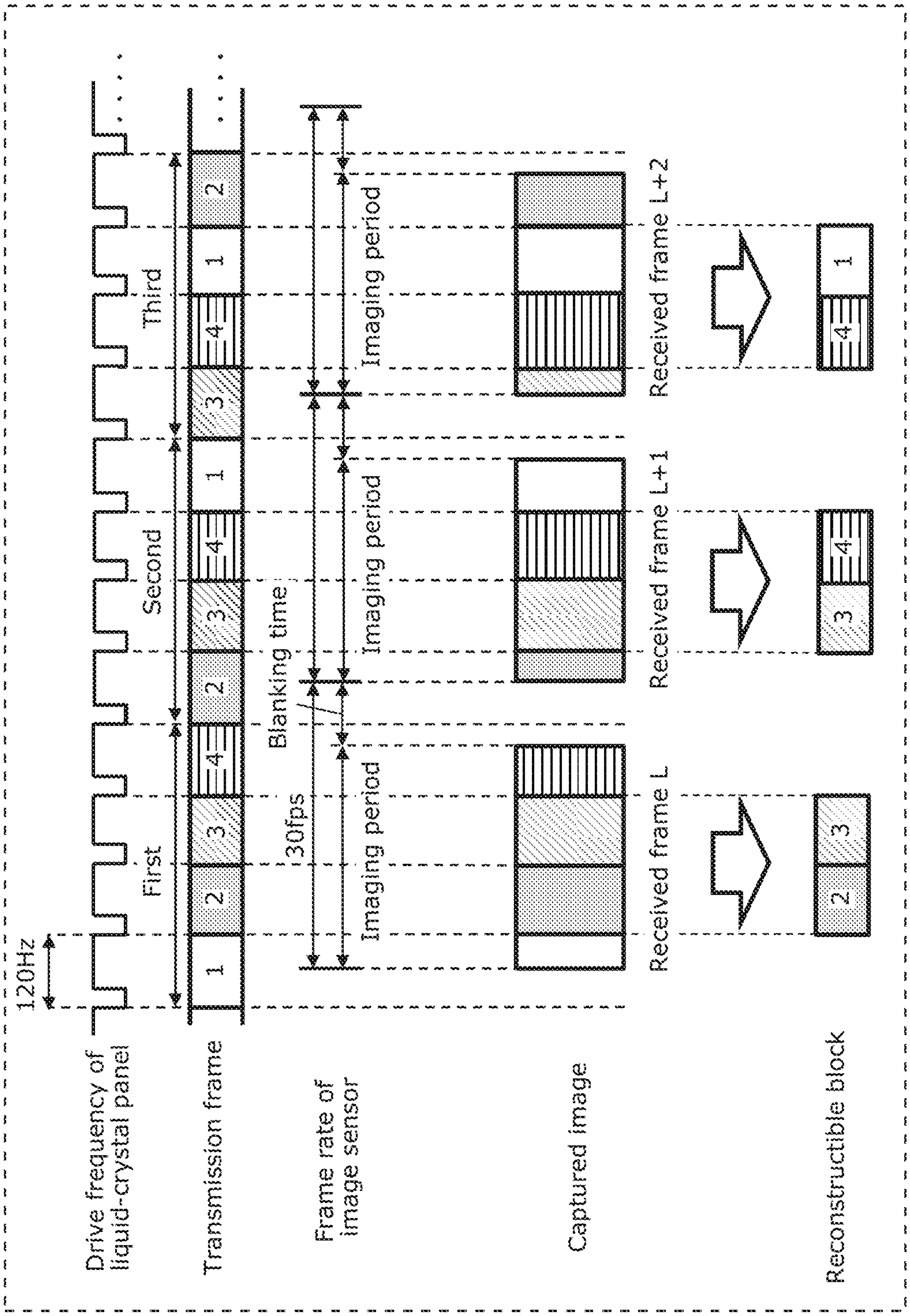
Figure 365A:
Figure 365B:
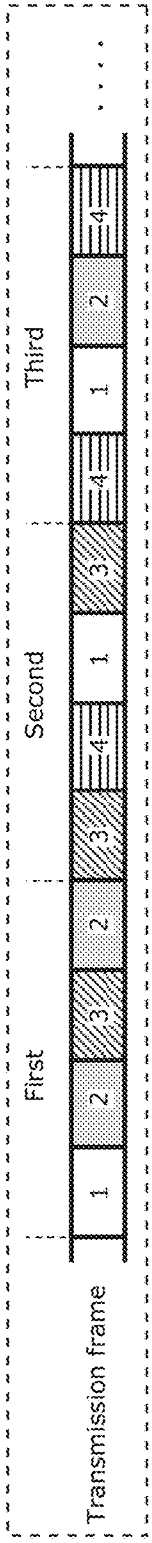
Figure 365C:
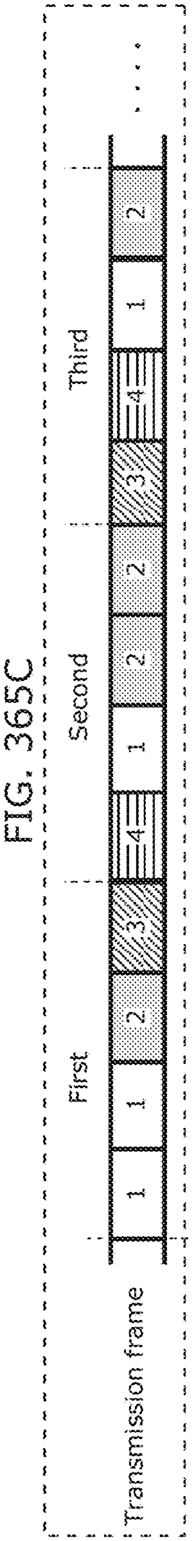
Figure 365D:
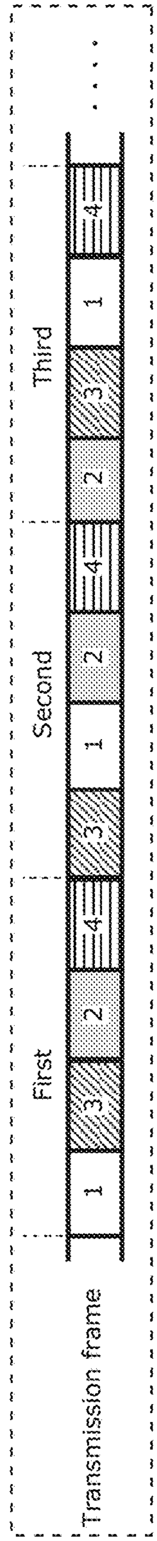
Figure 365E:
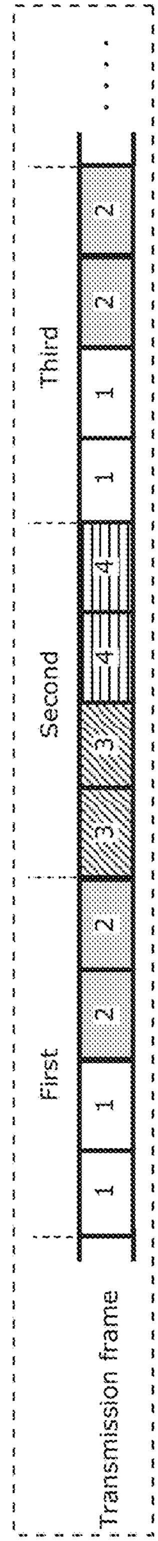
Figure 366:
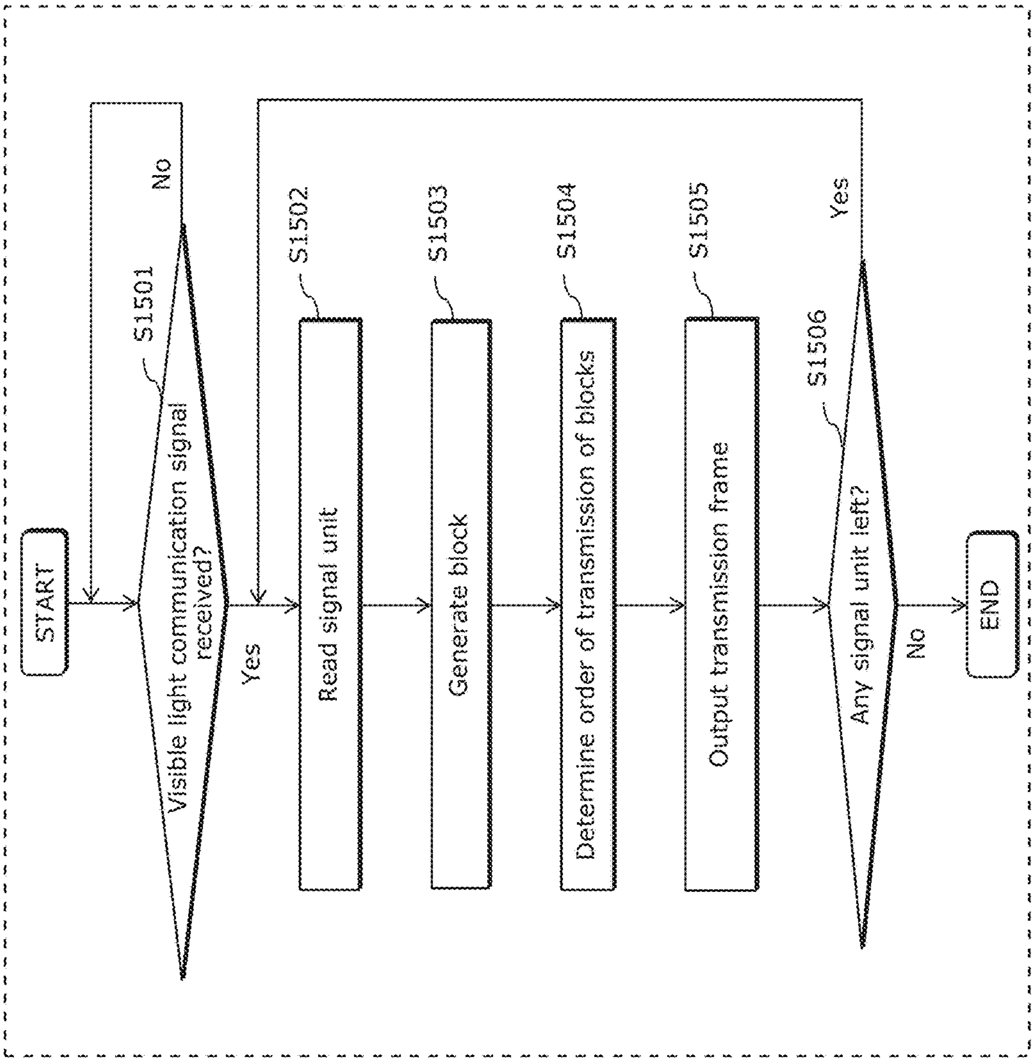
Figure 367:
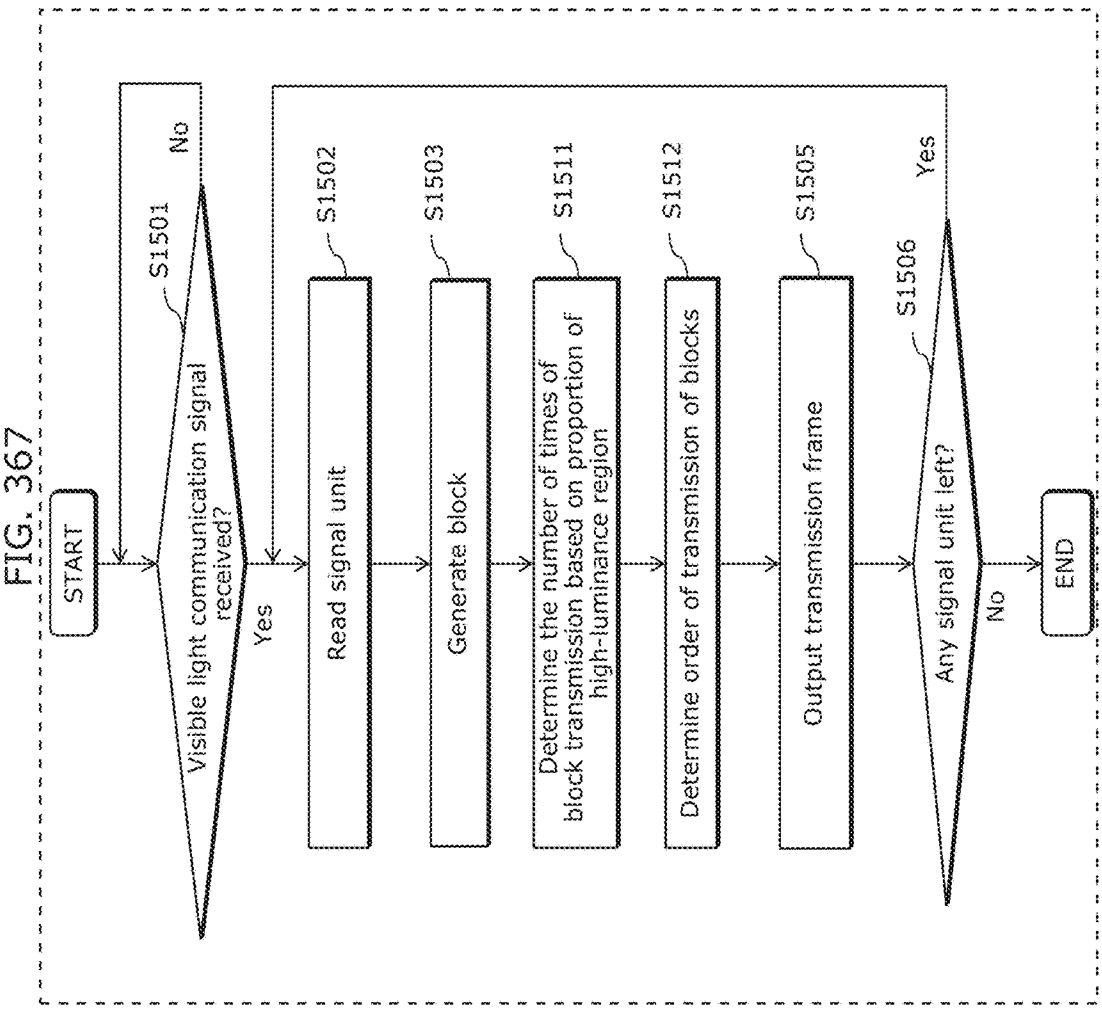
Figure 368:
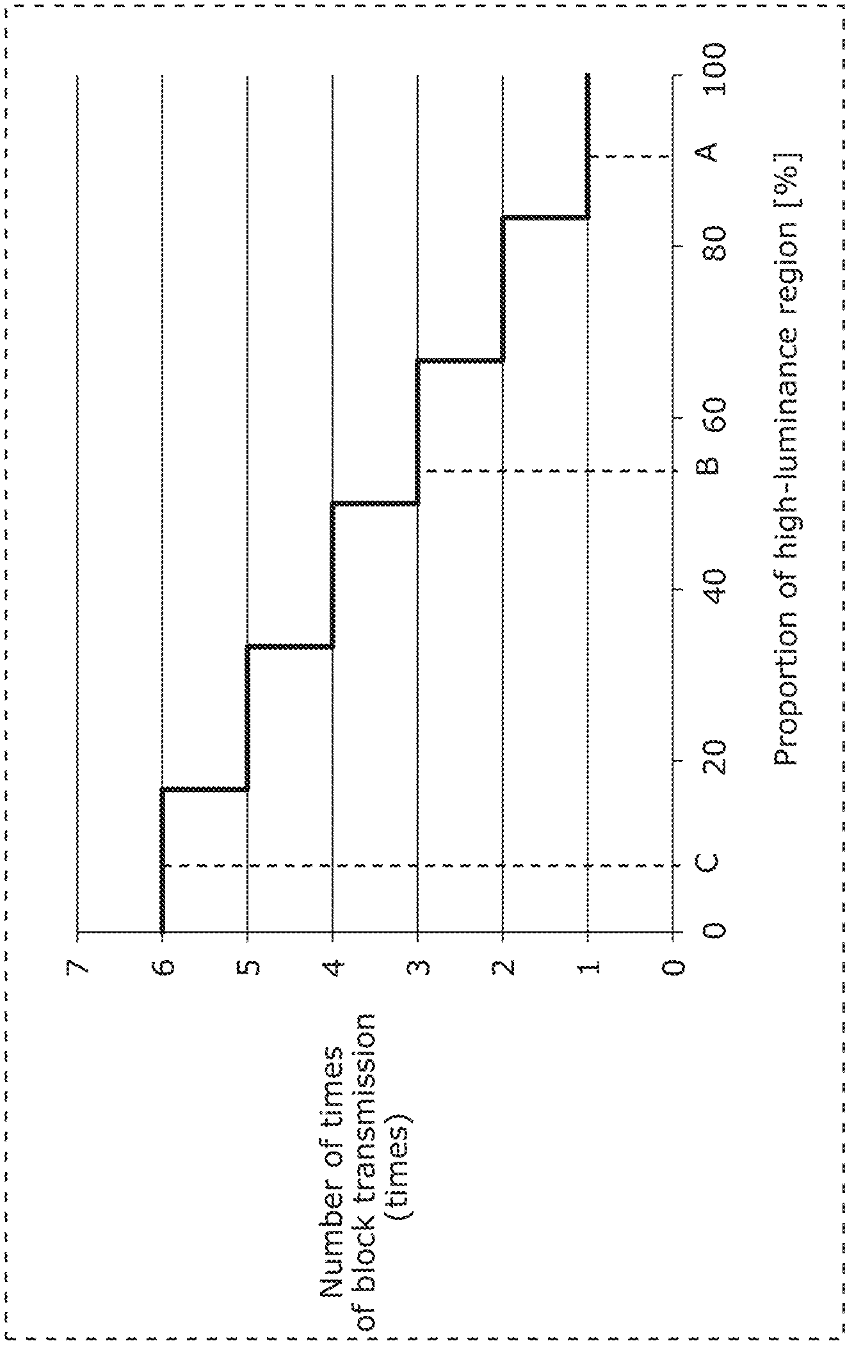
Figure 369:
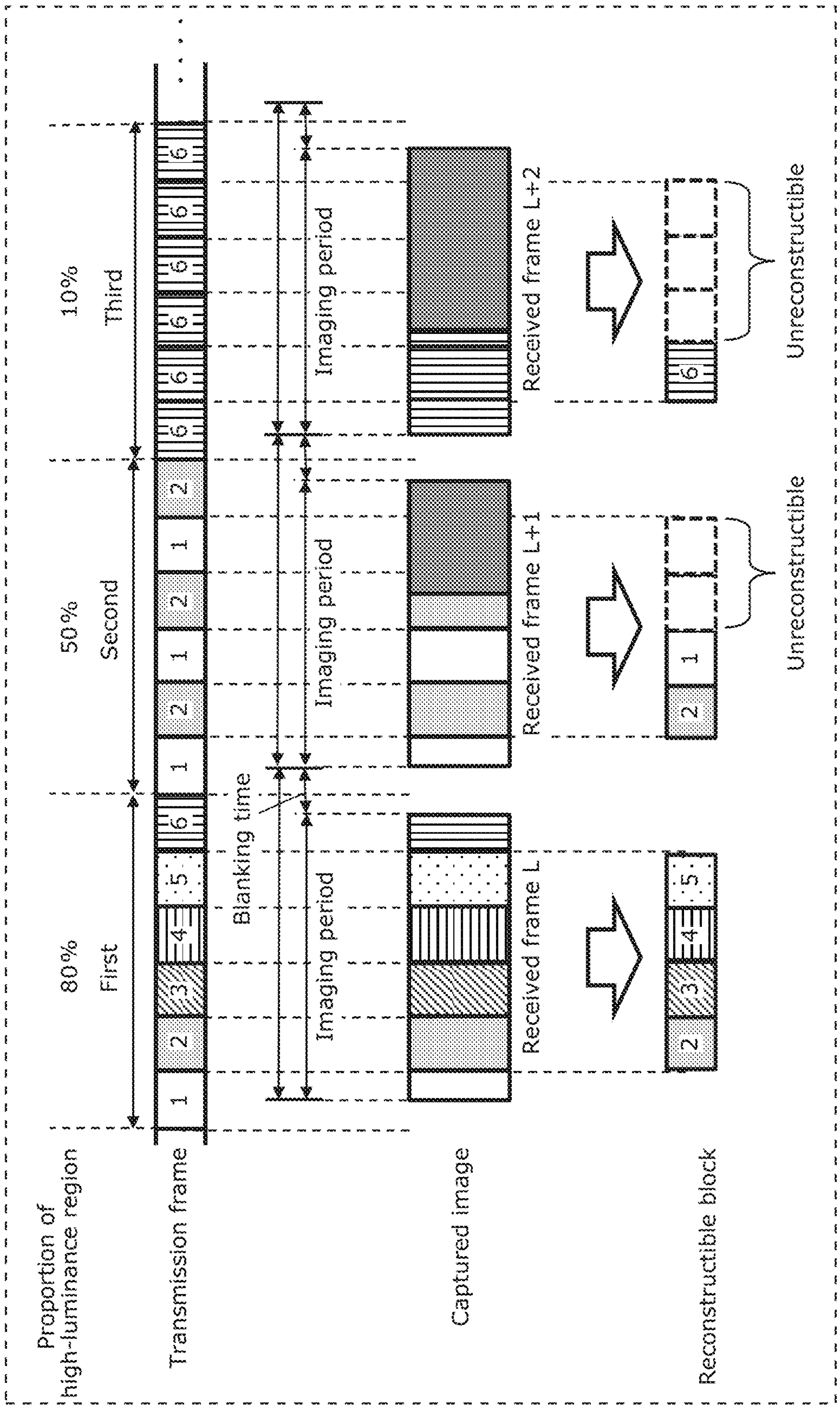
Figure 370:
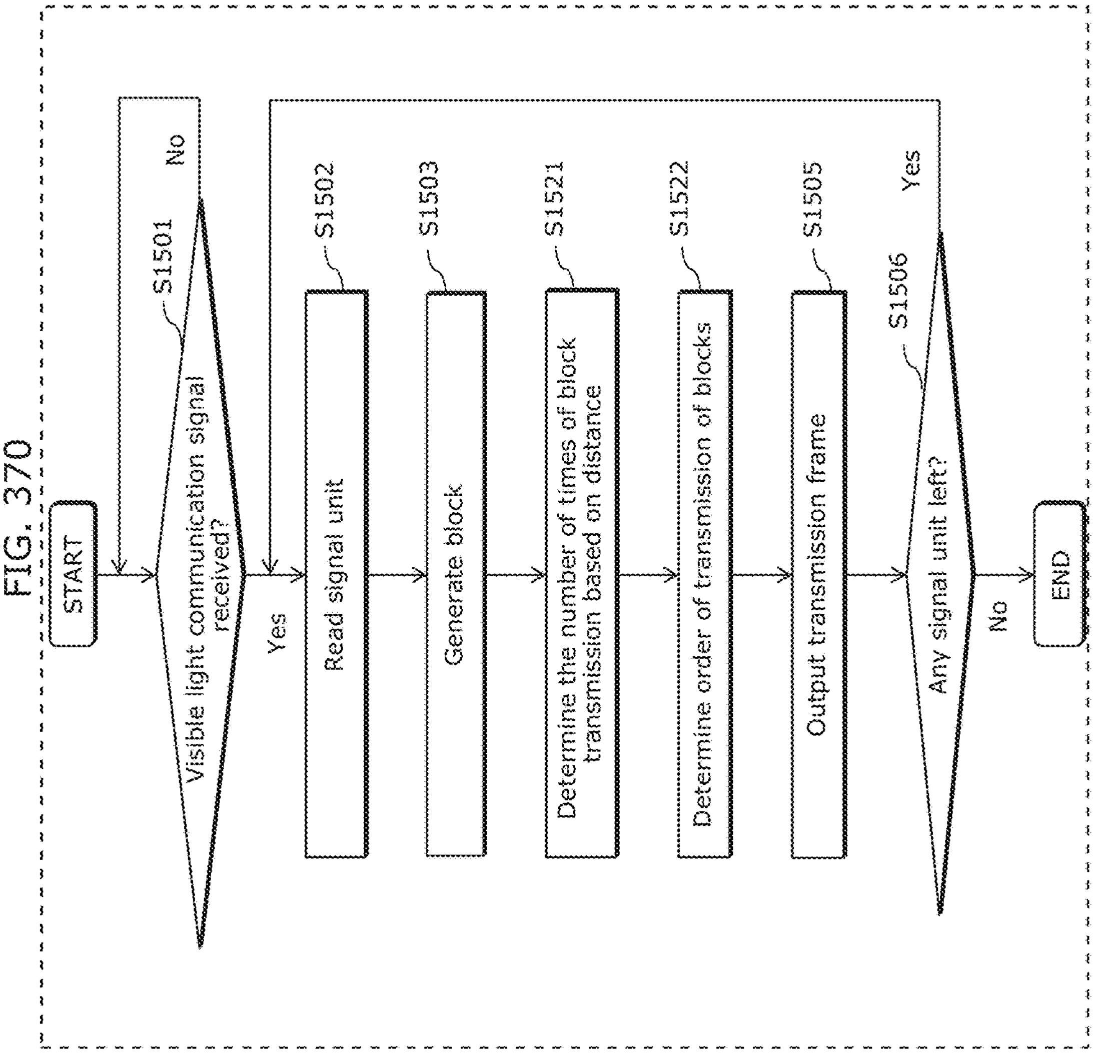
Figure 371:
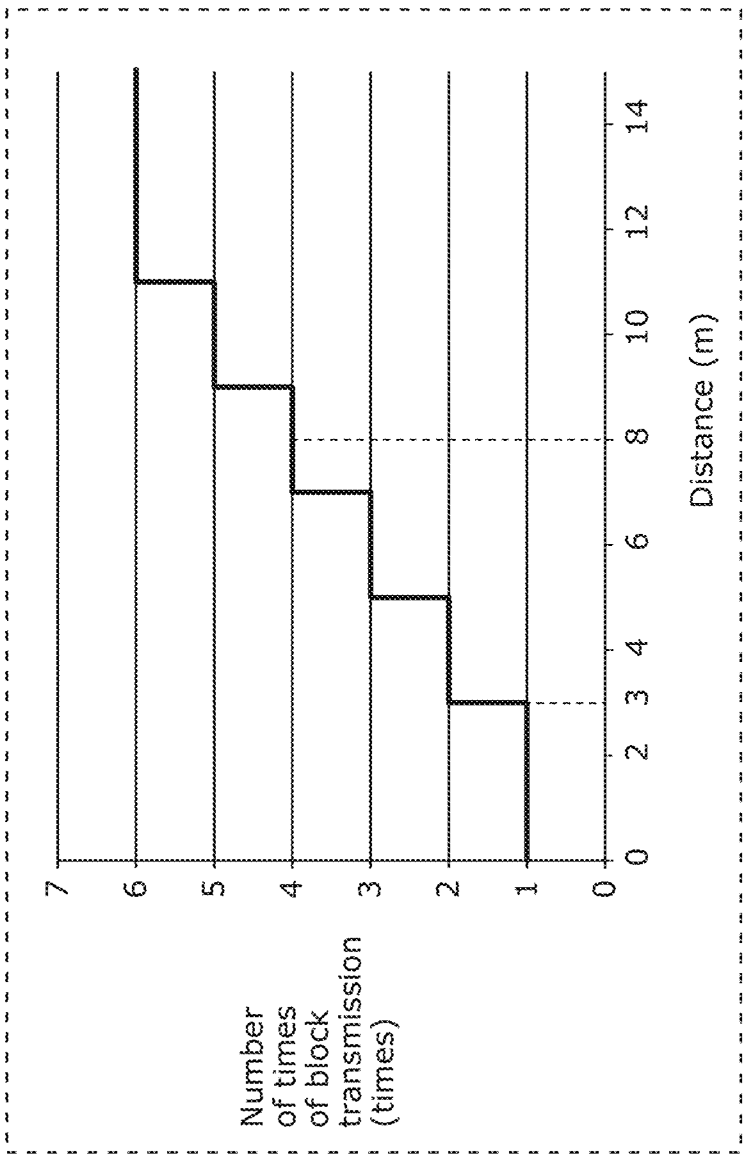
Figure 372:
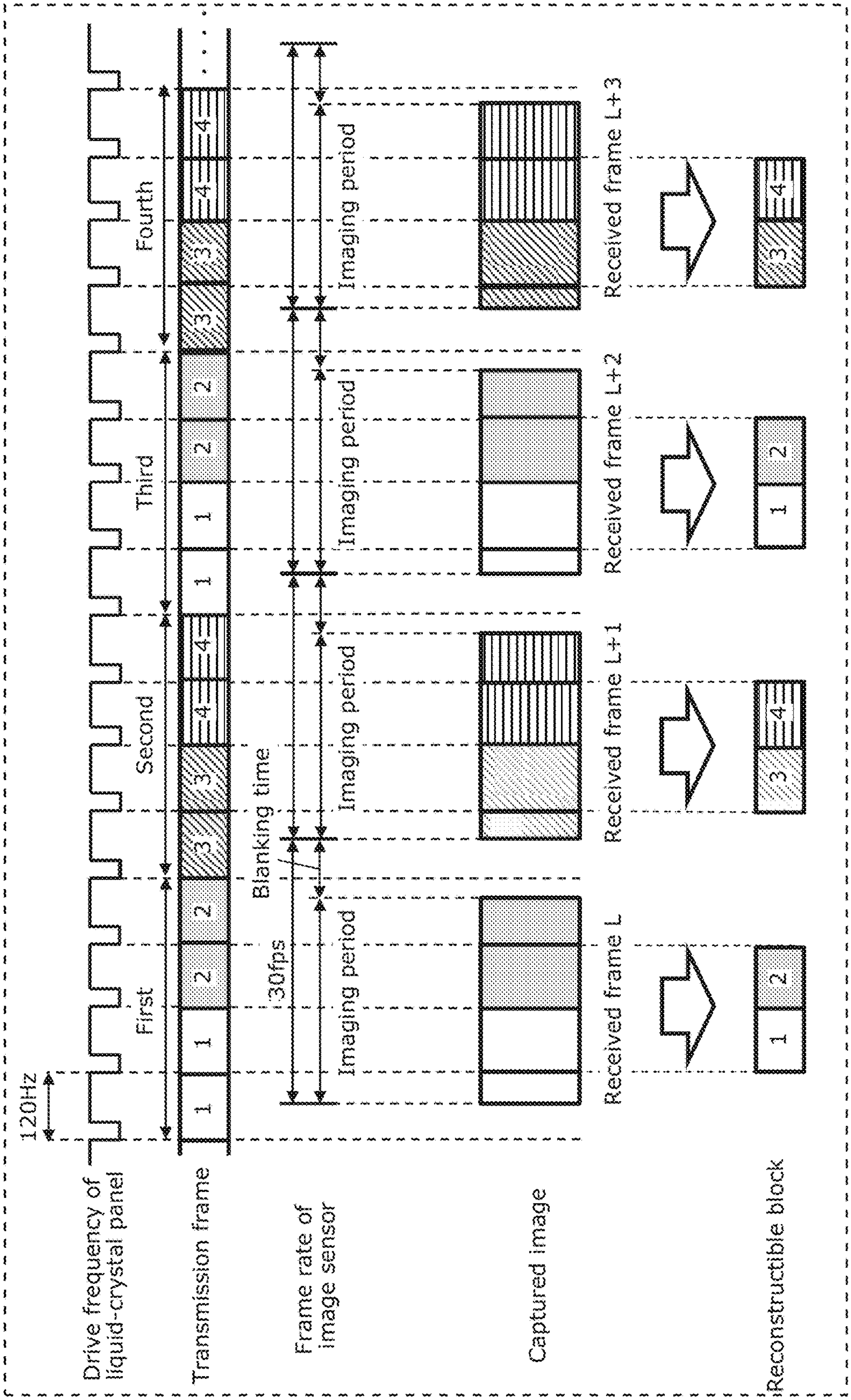
Figure 373:
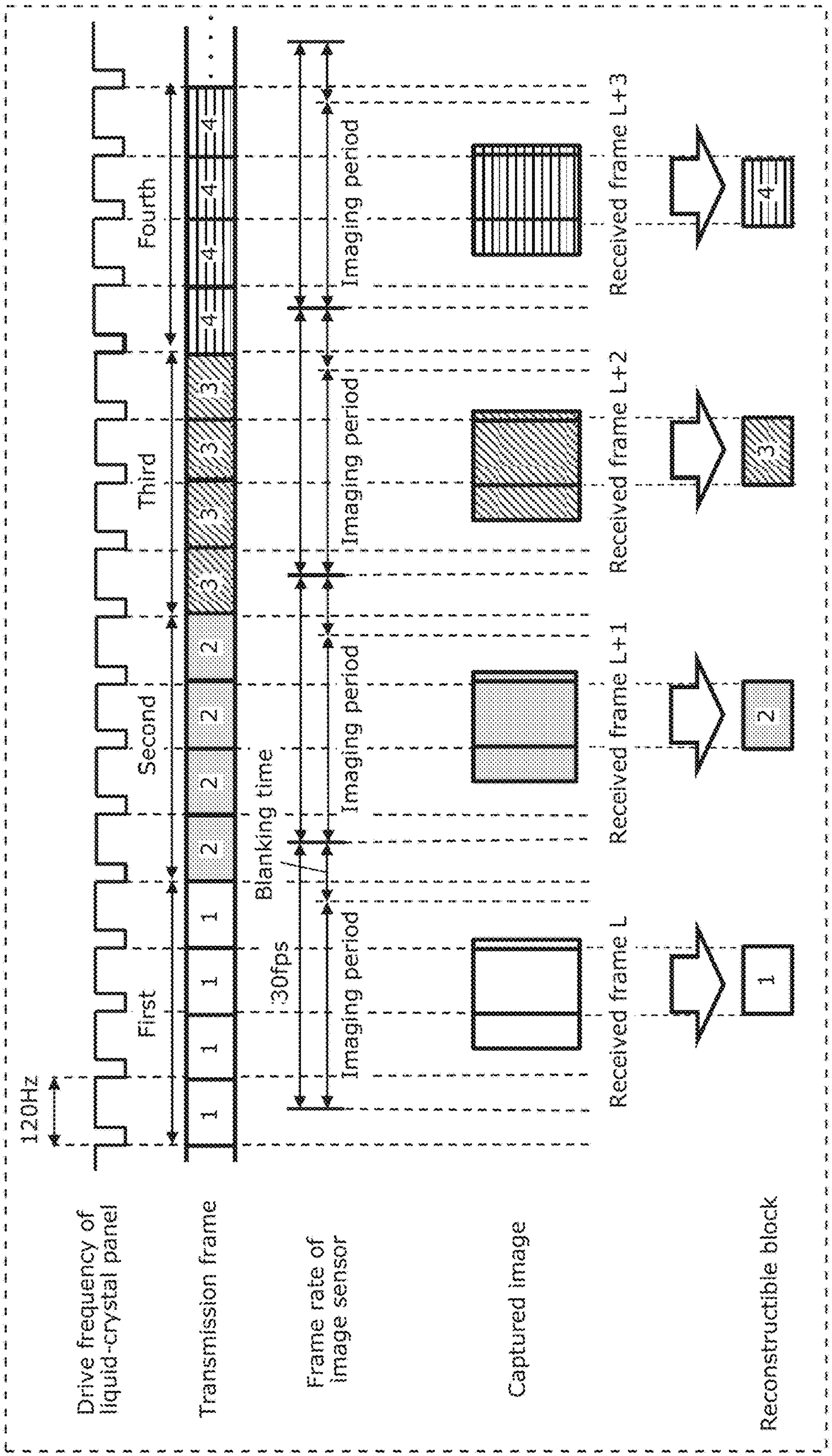
Figure 374:
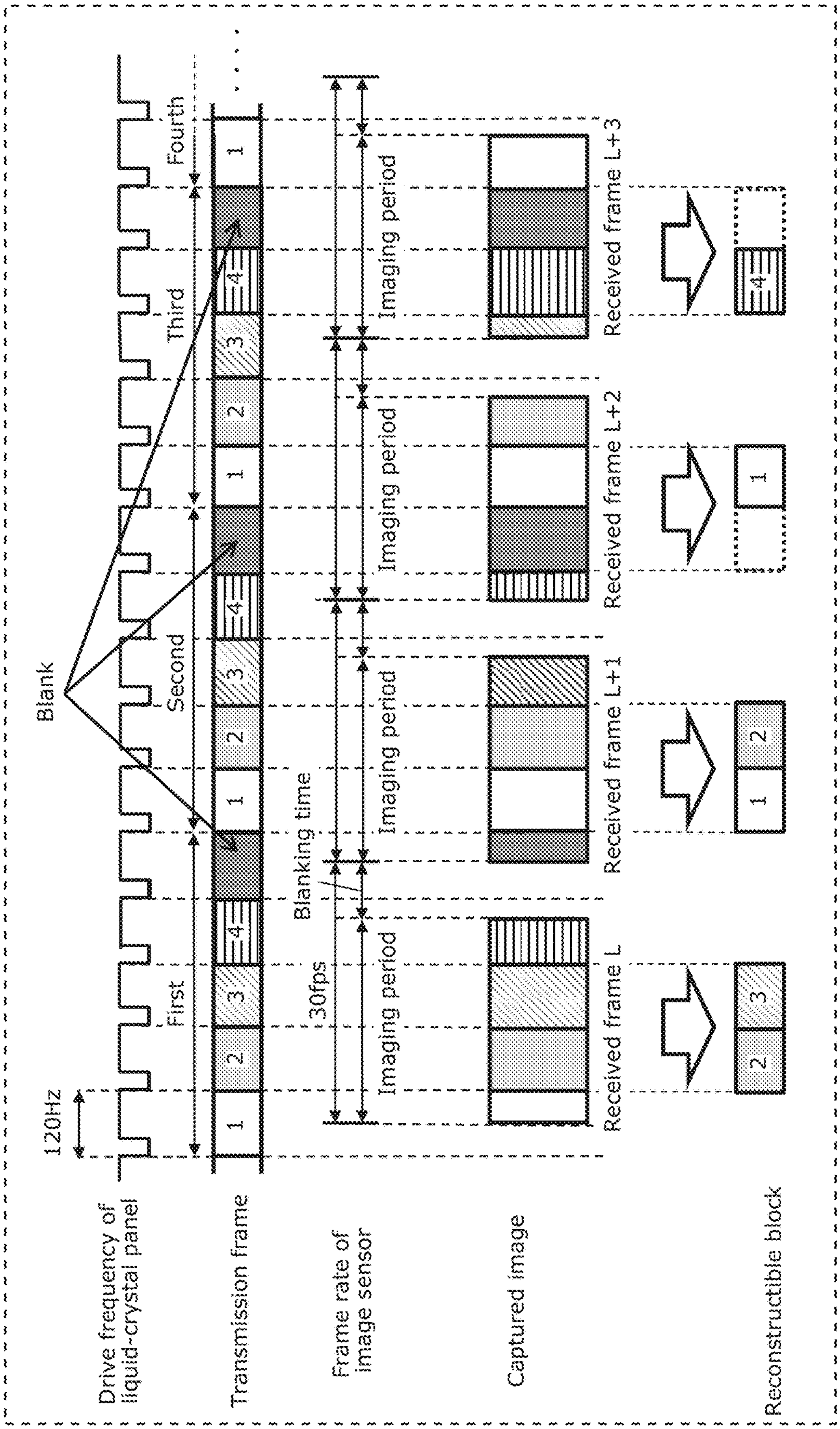
Figure 375A:
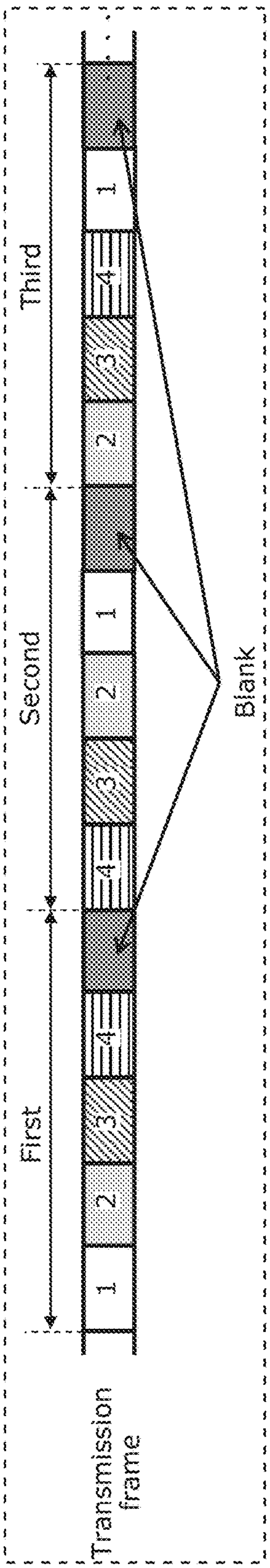
Figure 375B:
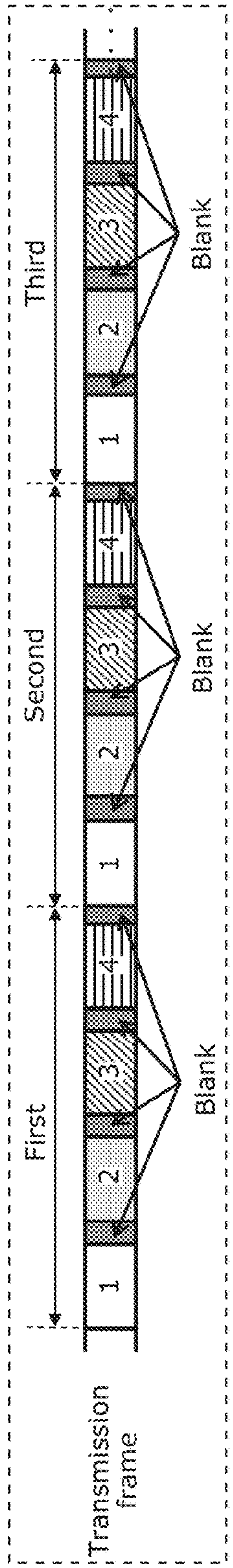
Figure 375C:
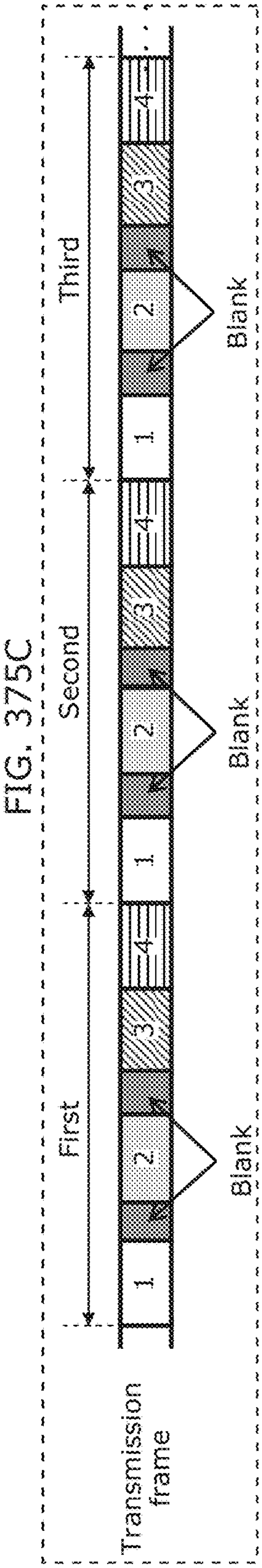
Figure 376:
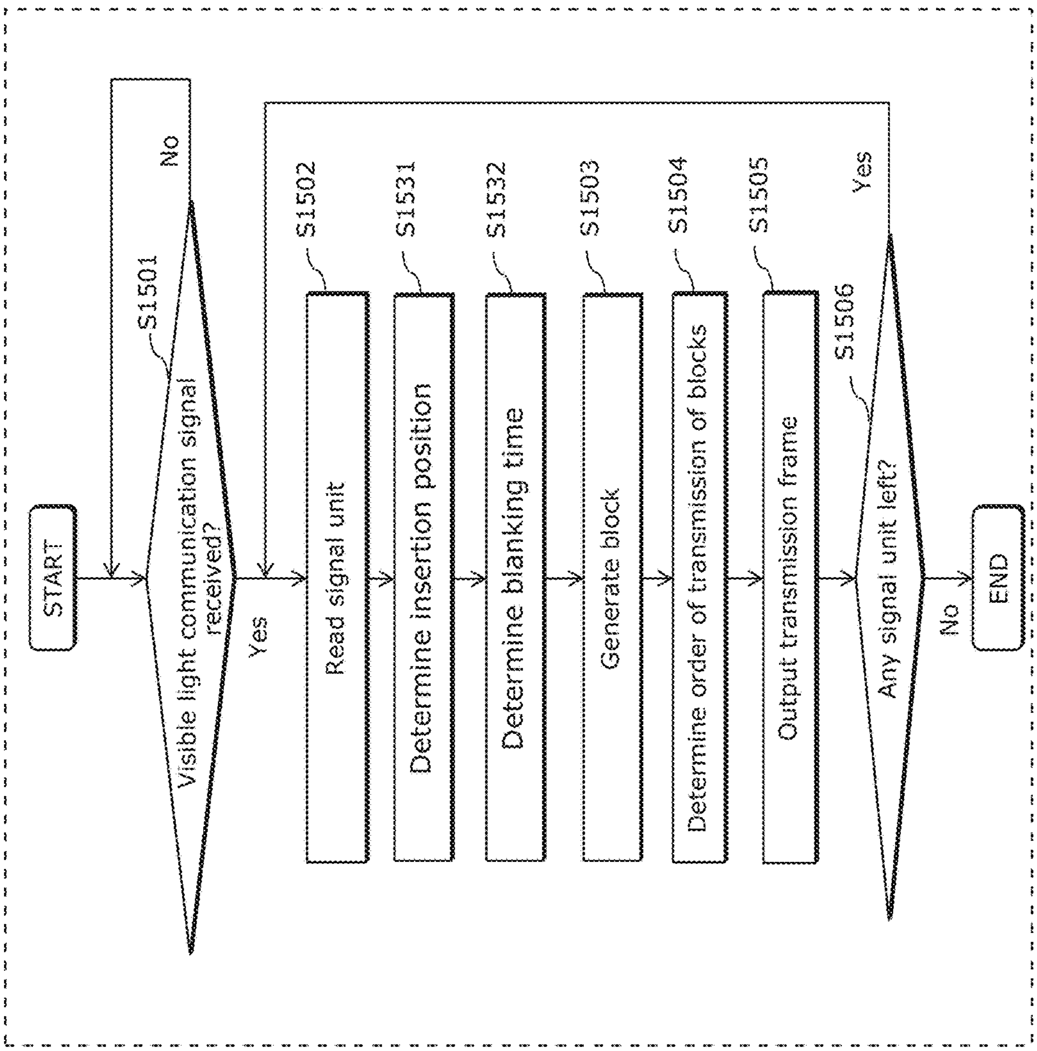
Figure 377:
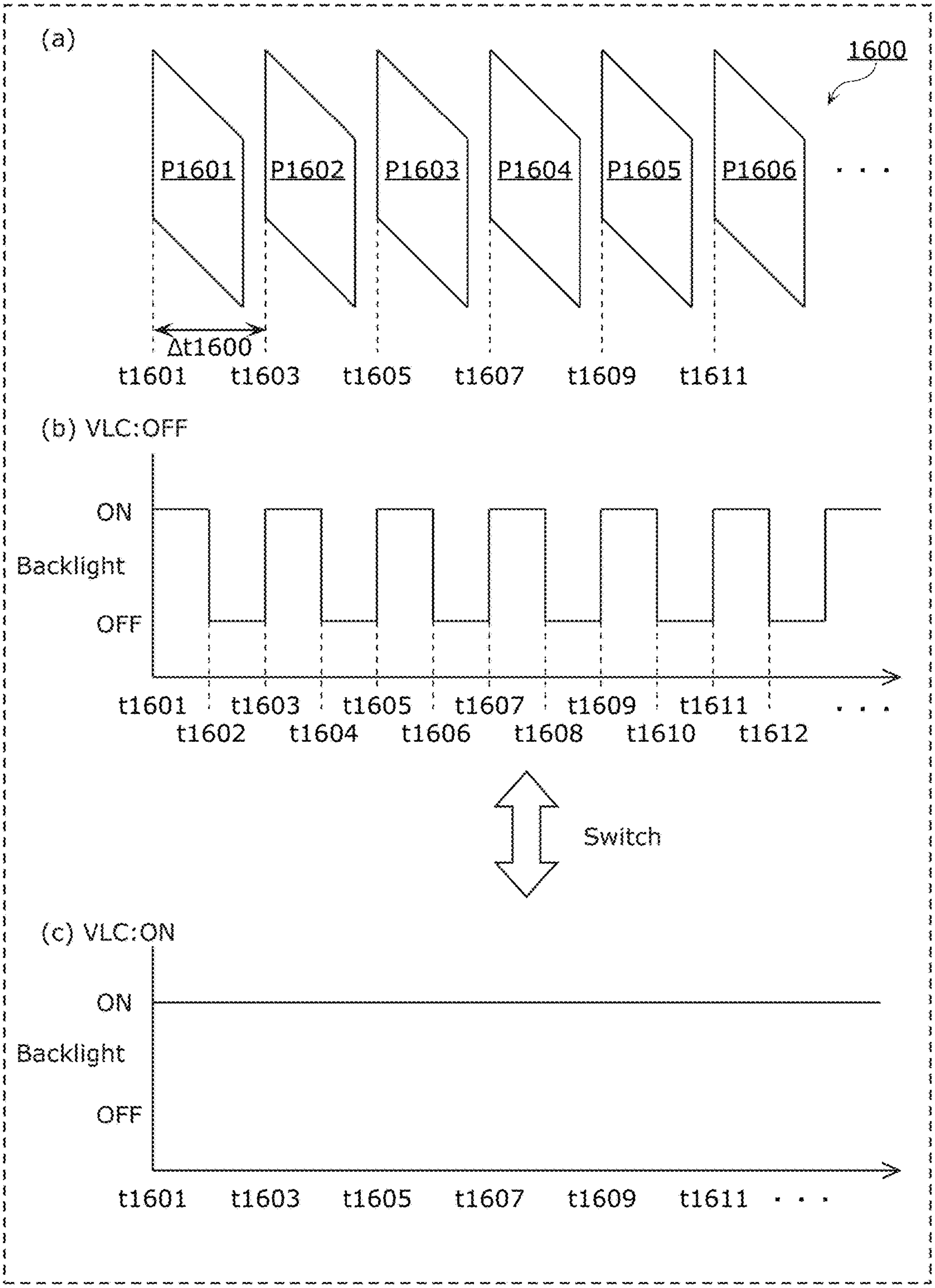
Figure 378:
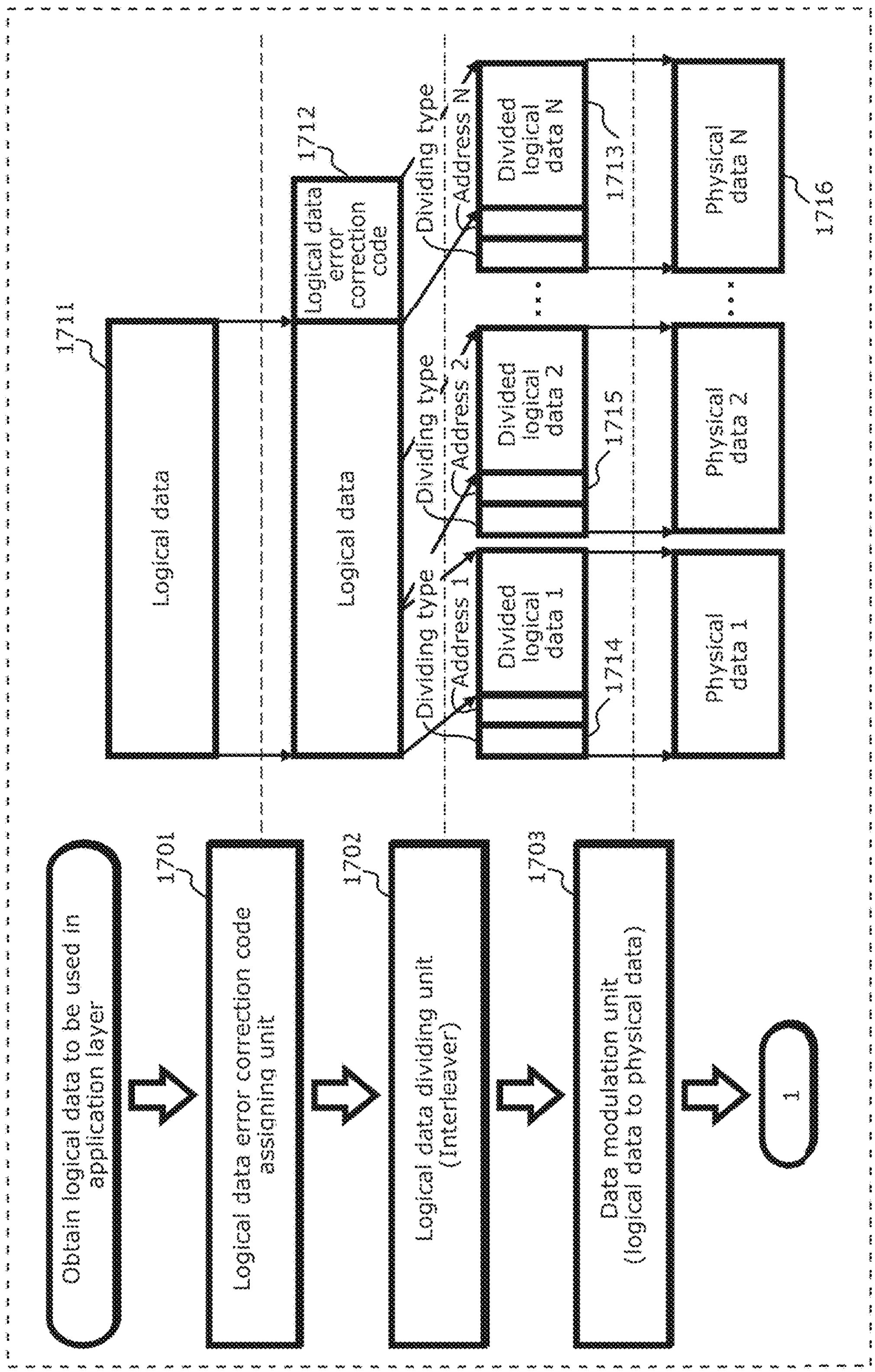
Figure 379:
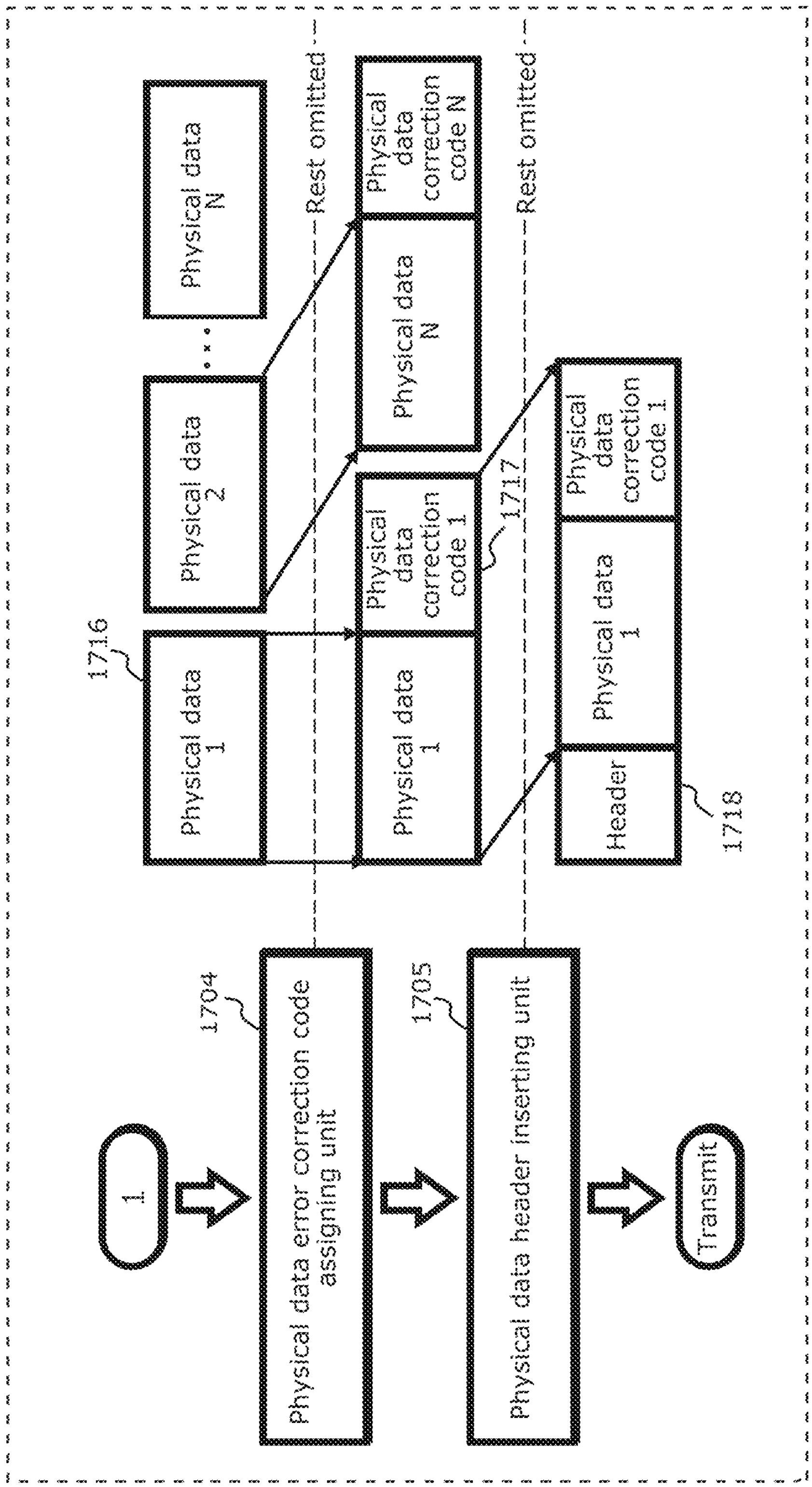
Figure 380:
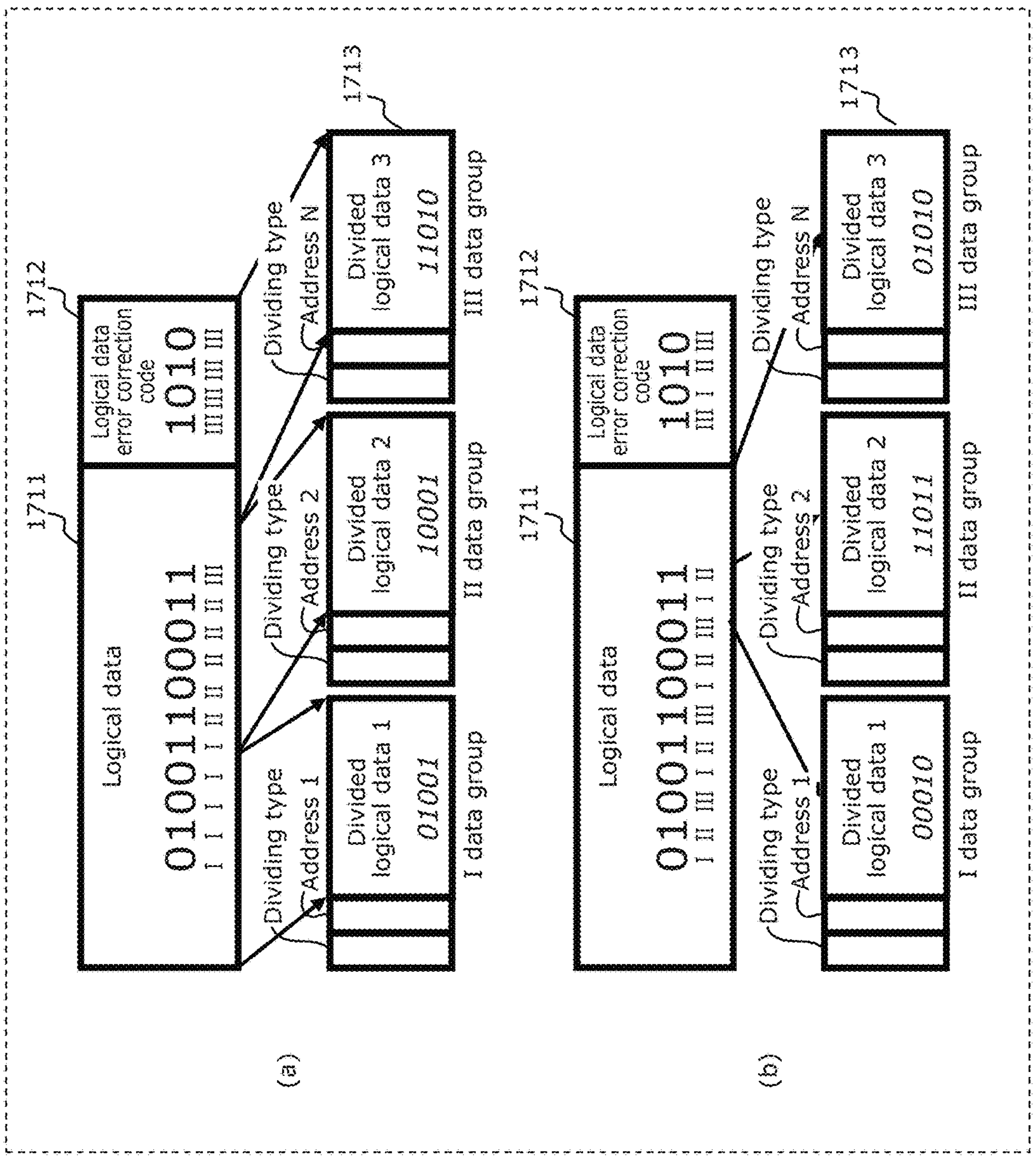
Figure 381:
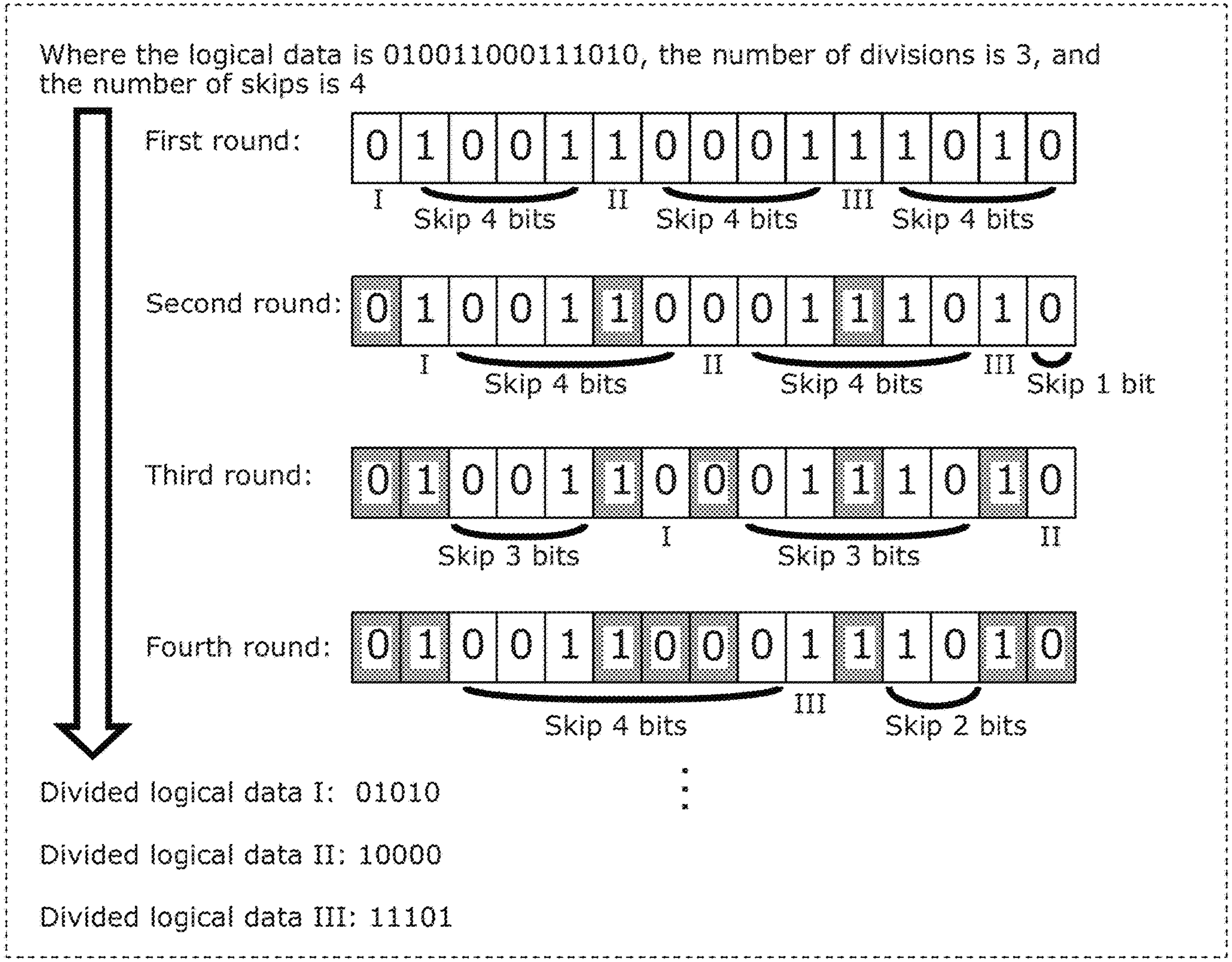
Figure 382:
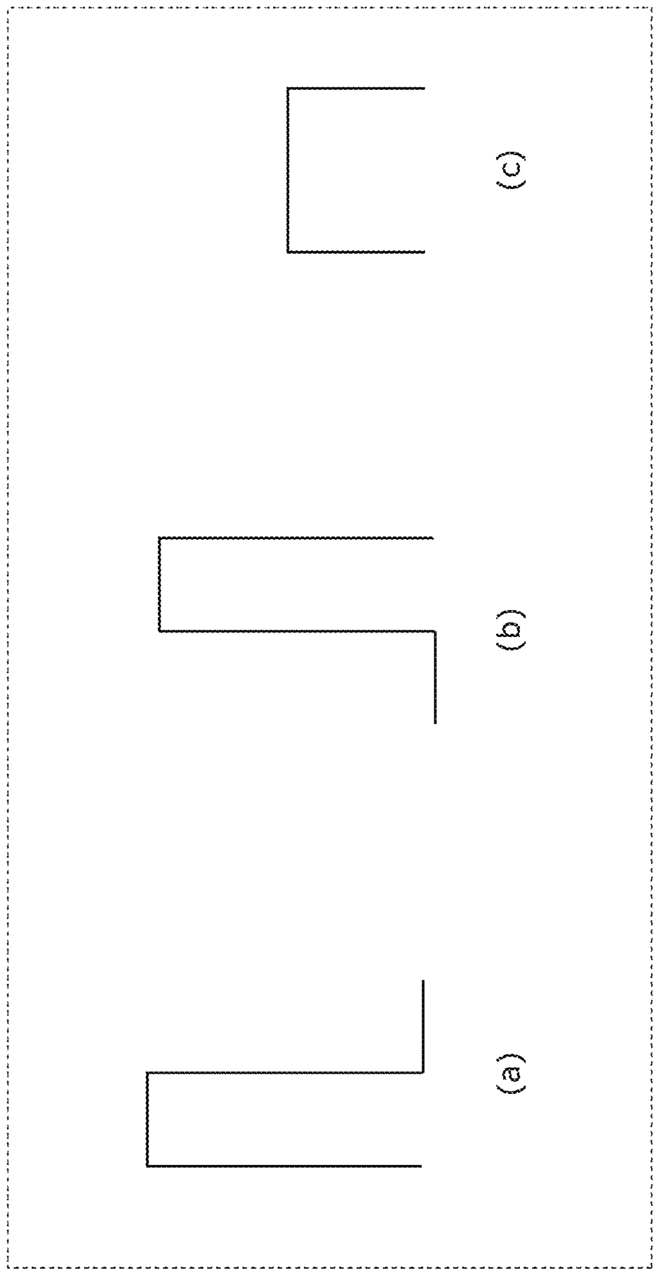
Figure 383:
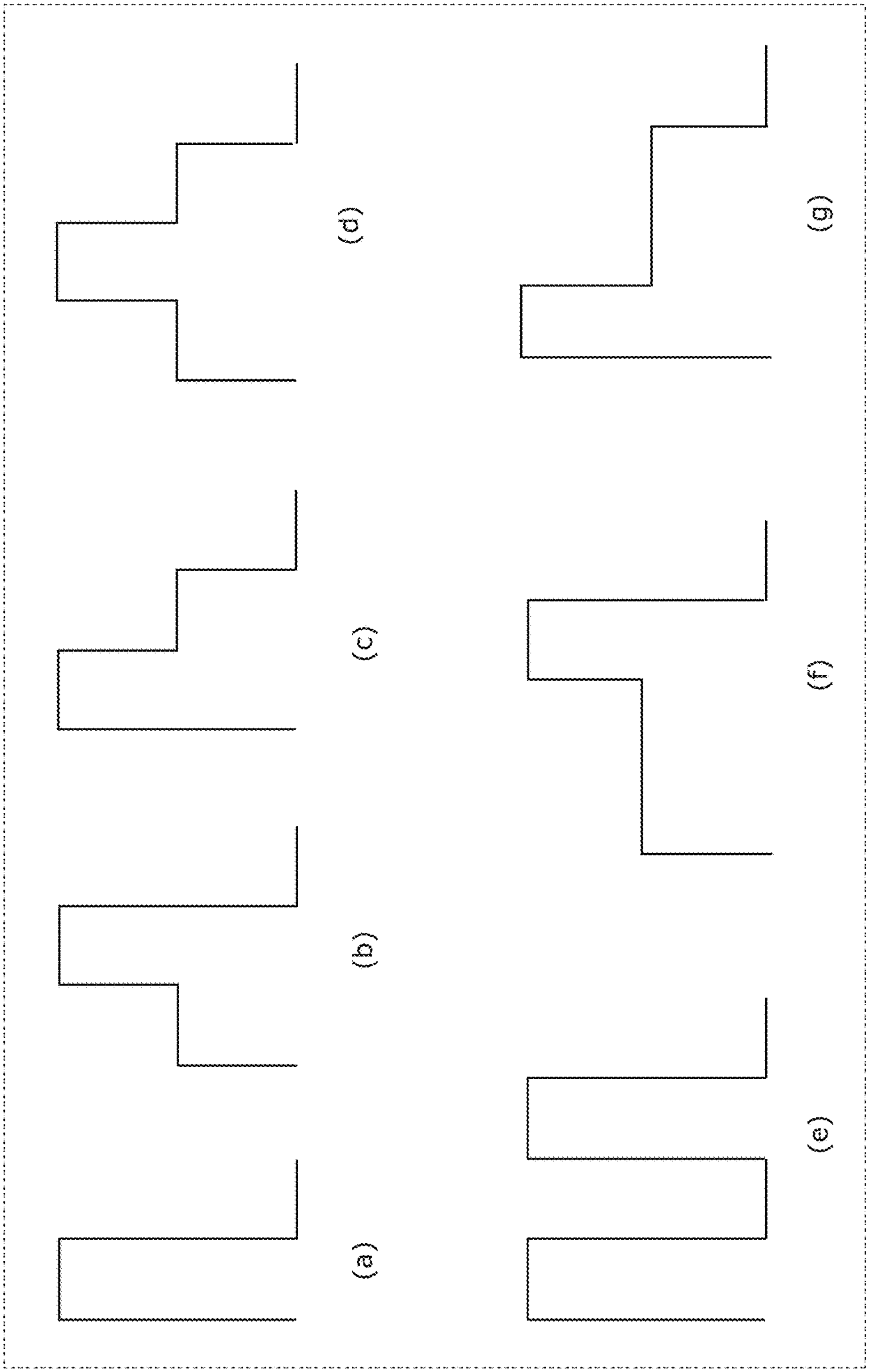
Figure 384:
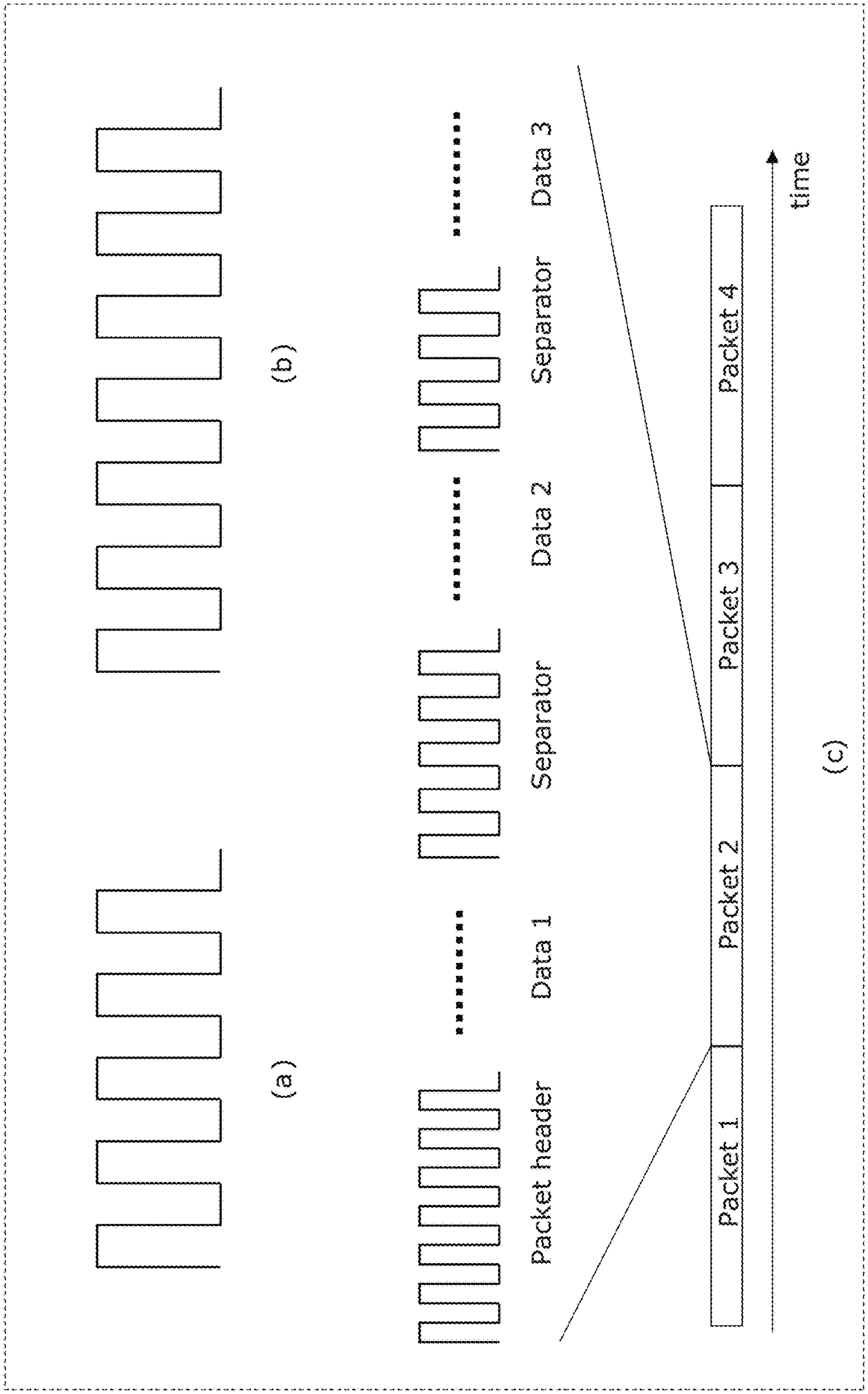
Figure 385A:
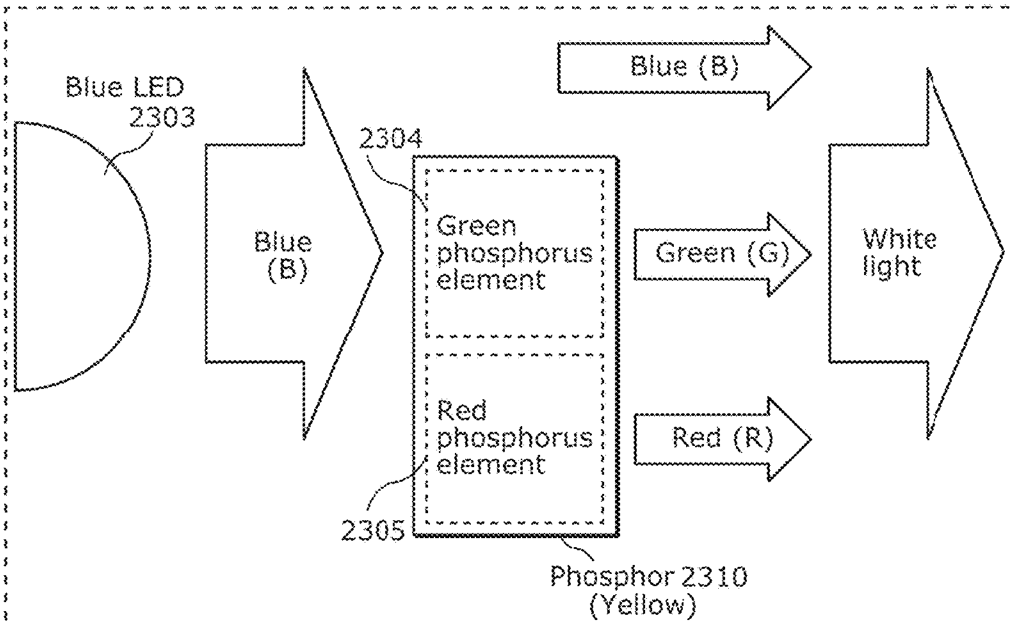
Figure 385B:
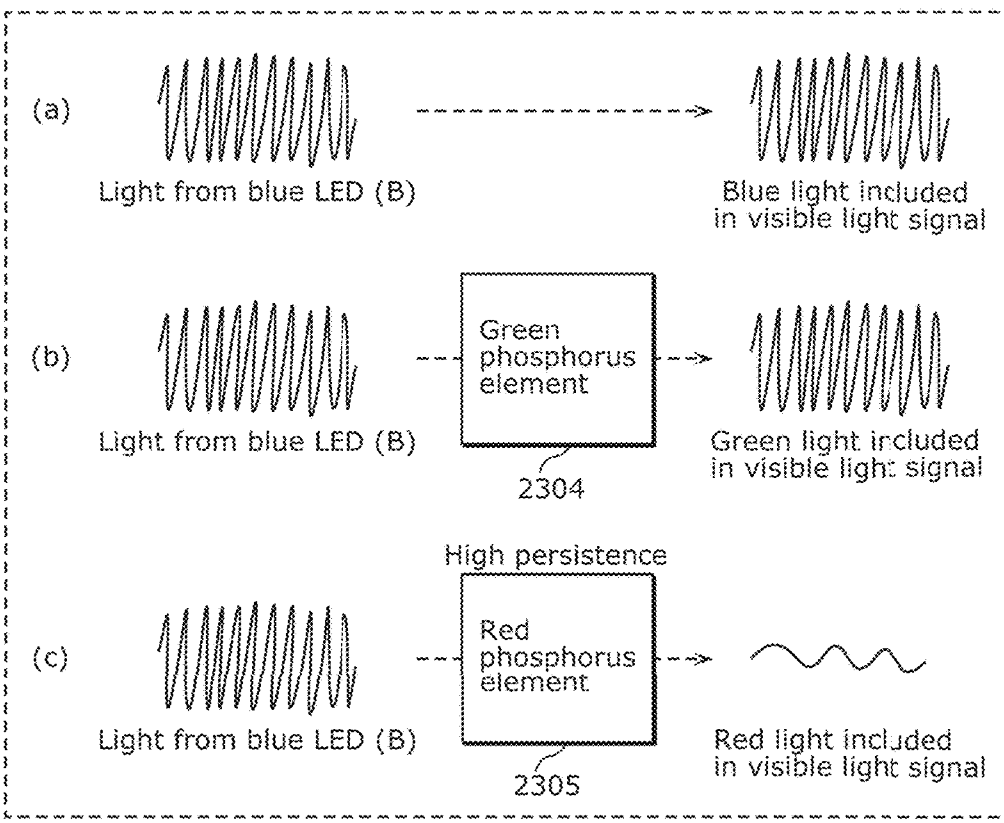
Figure 386:
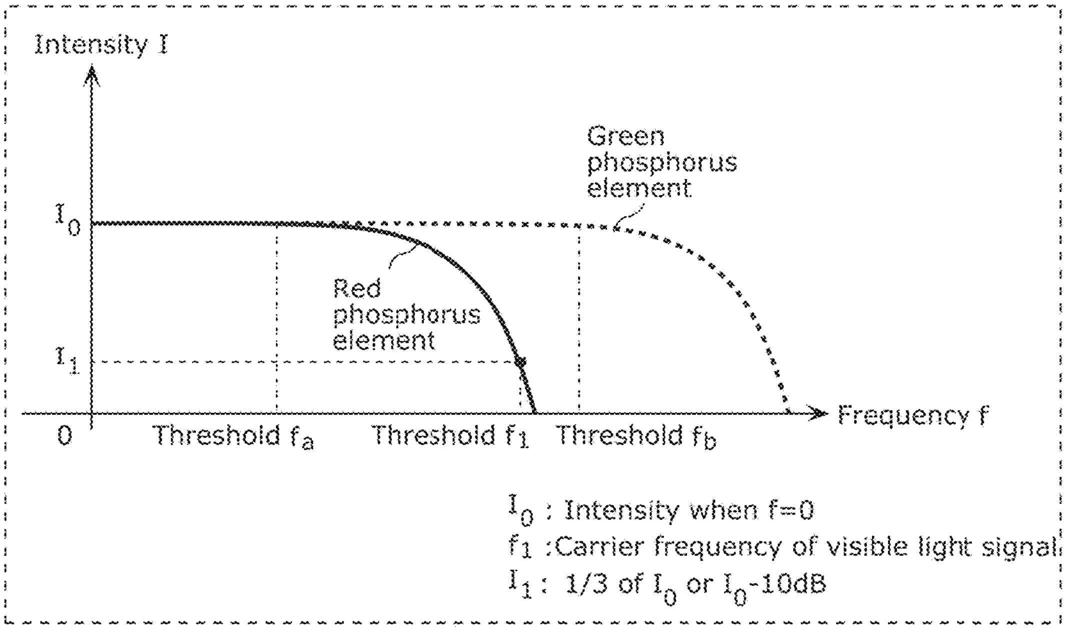
Figure 387:
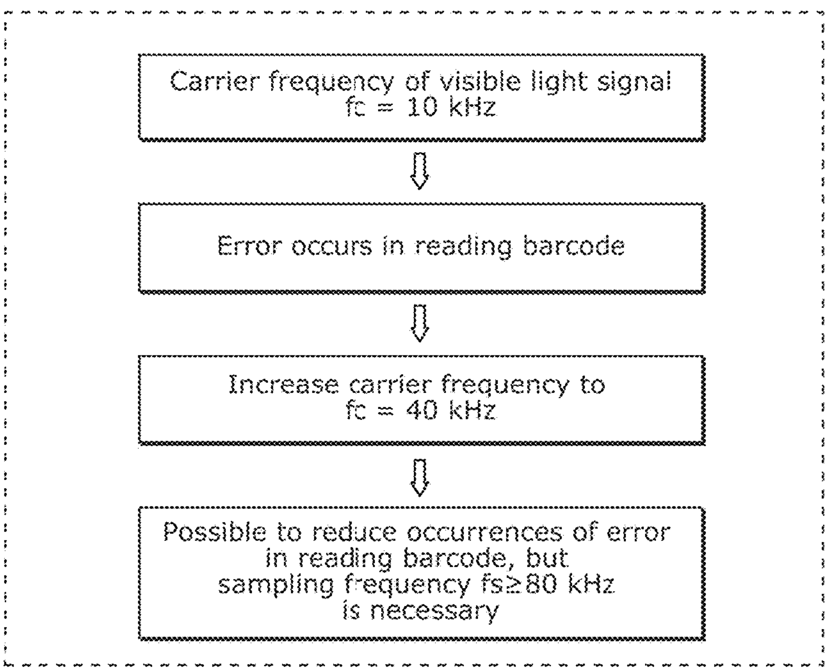
Figure 388:
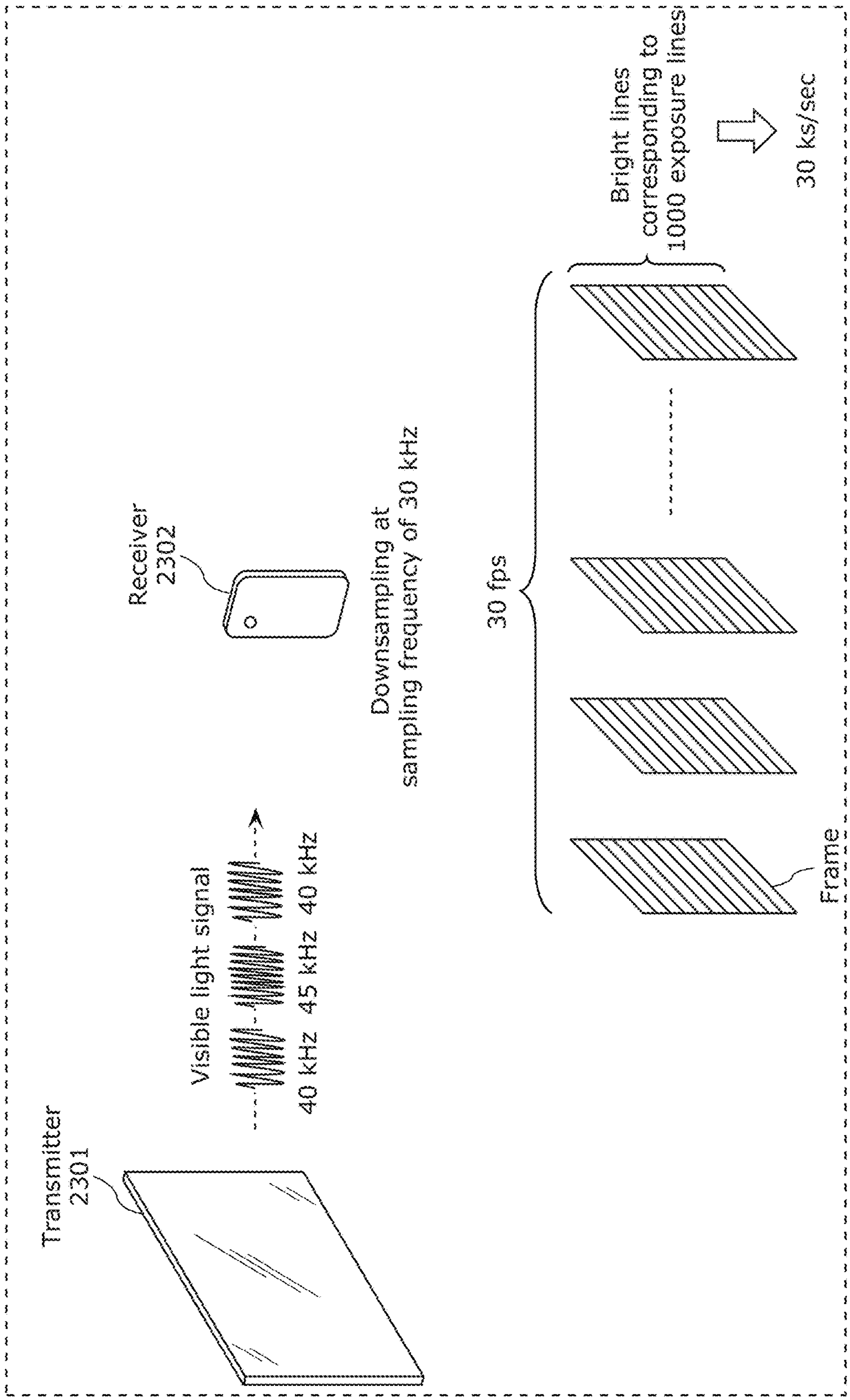
Figure 389:
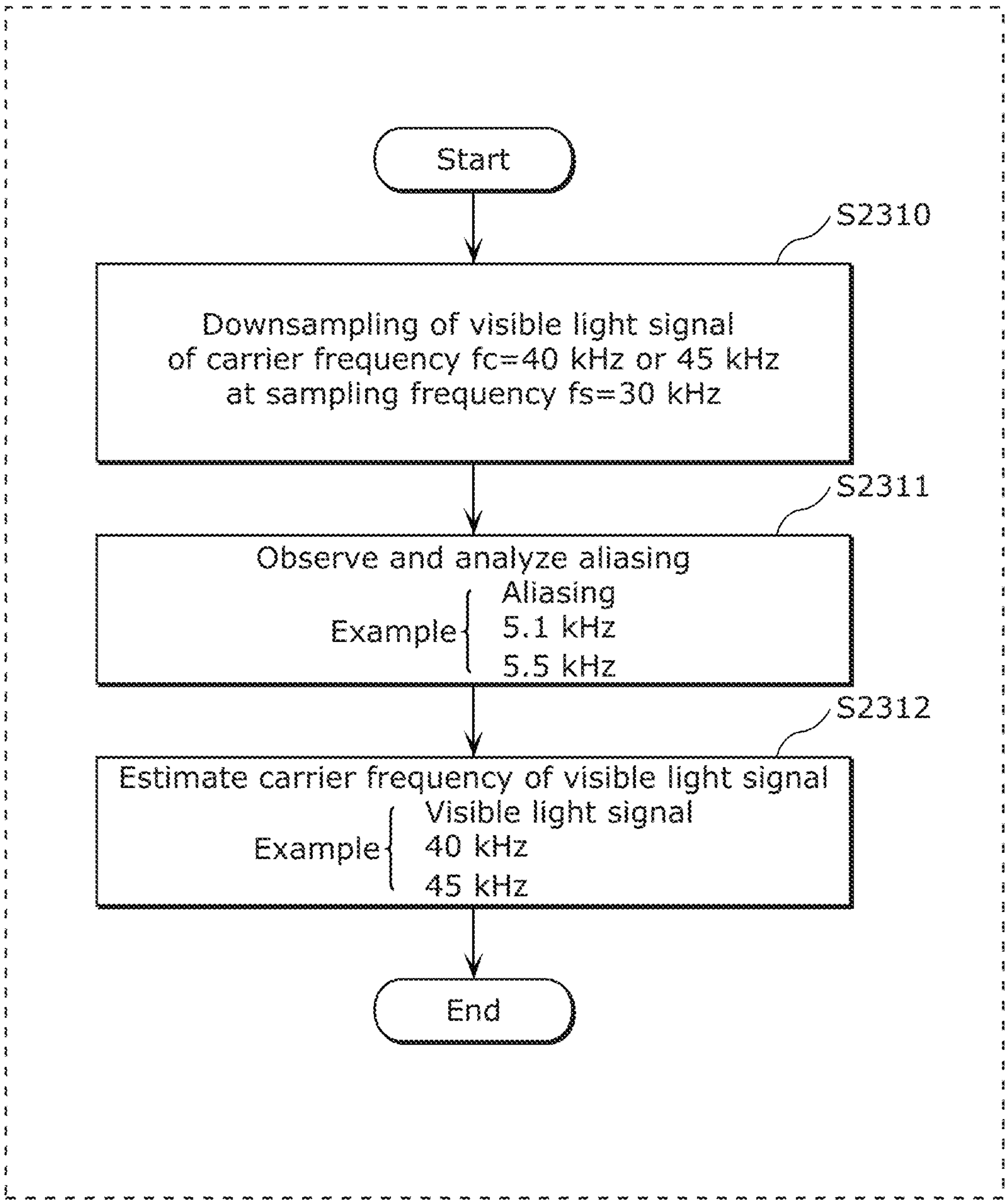
Figure 390:
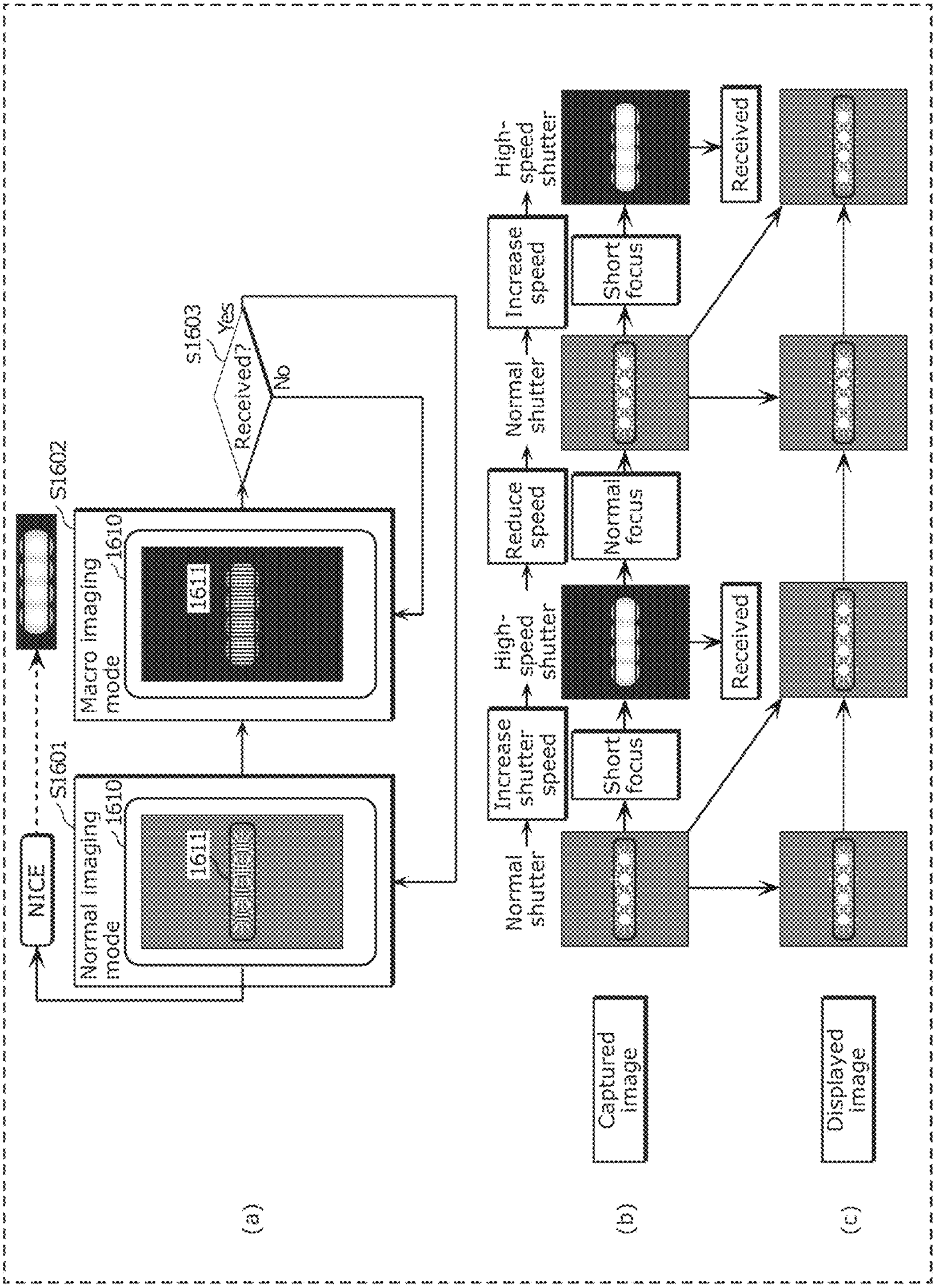
Figure 391:
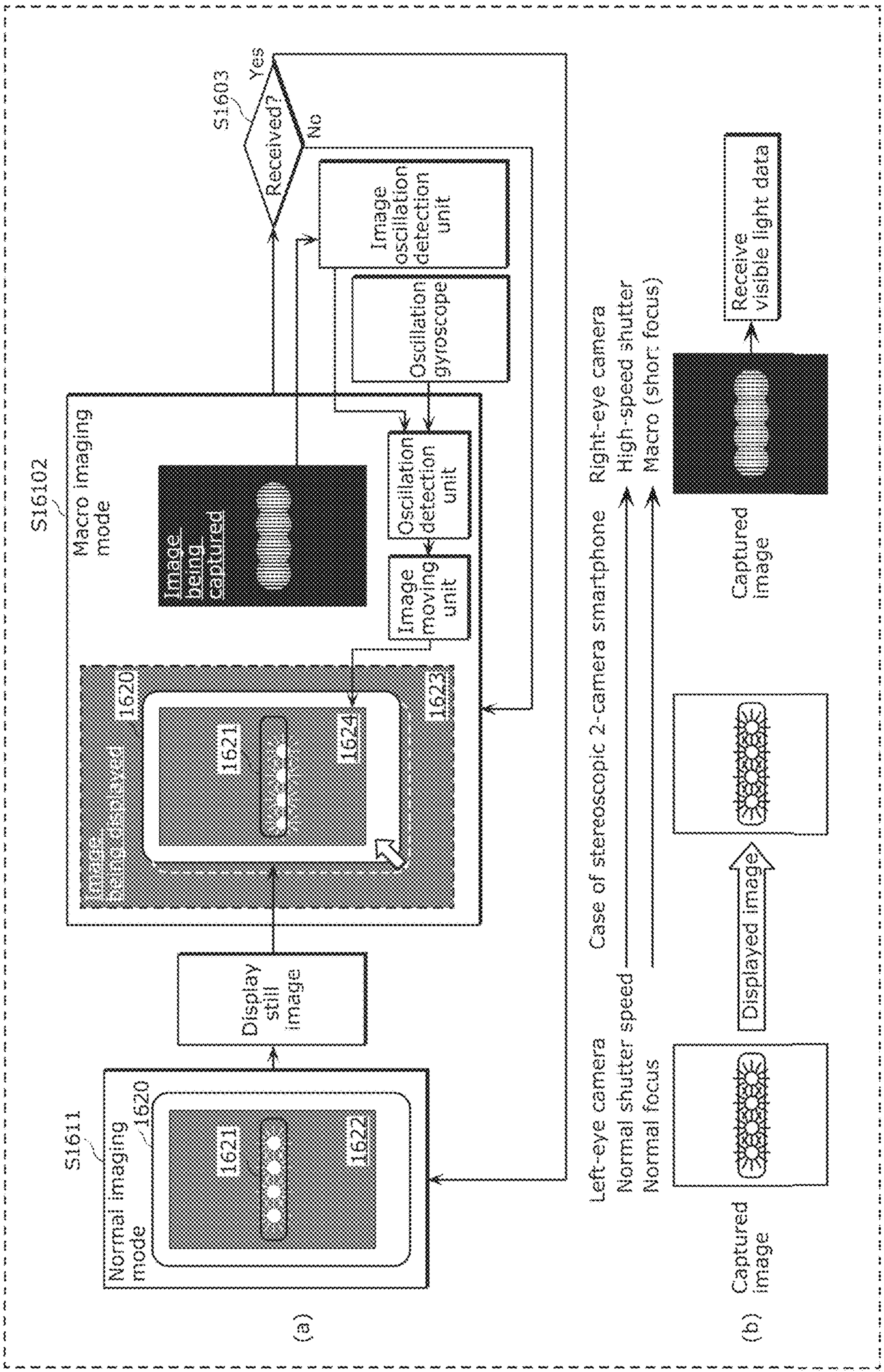
Figure 392:
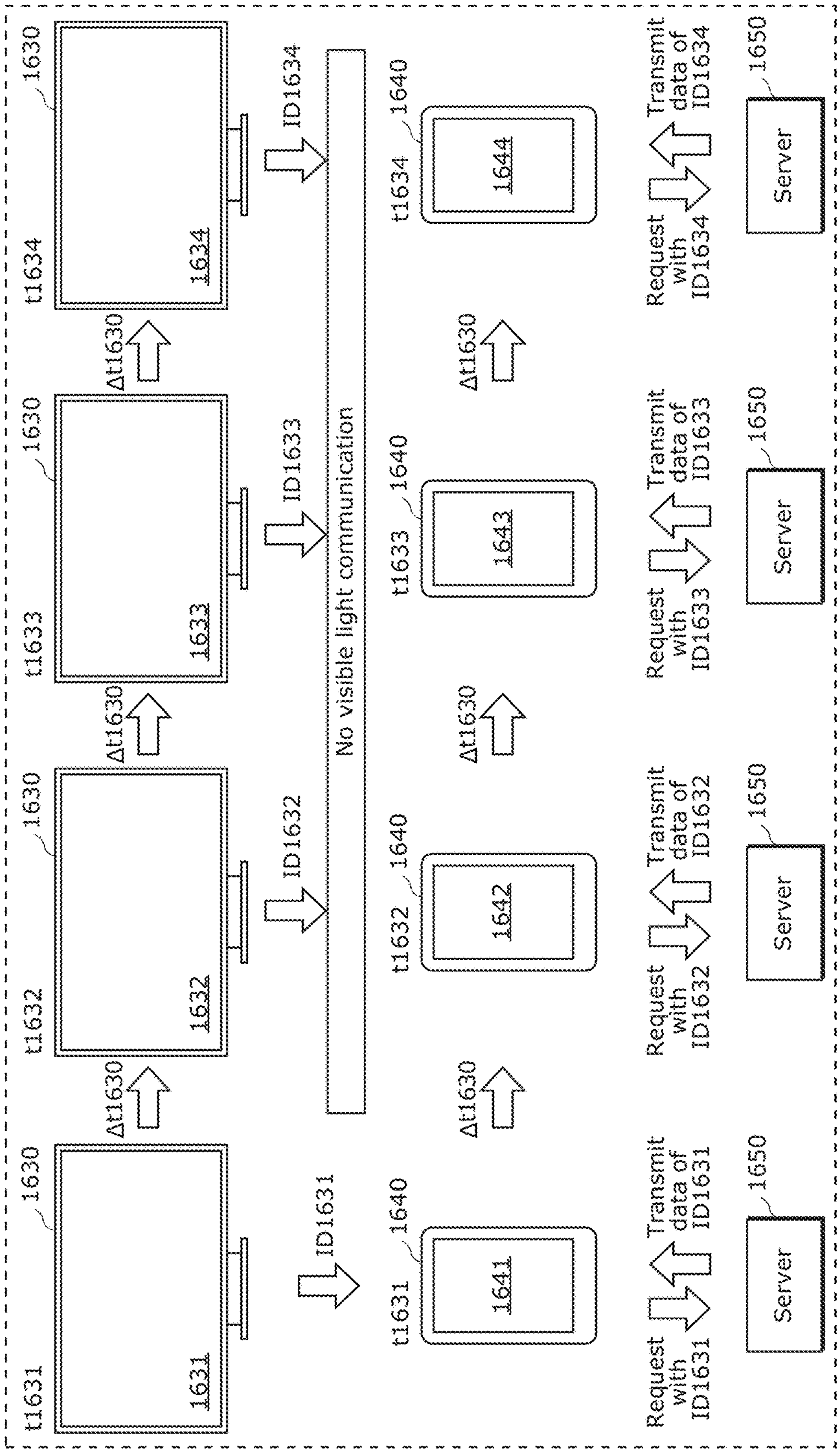
Figure 393:
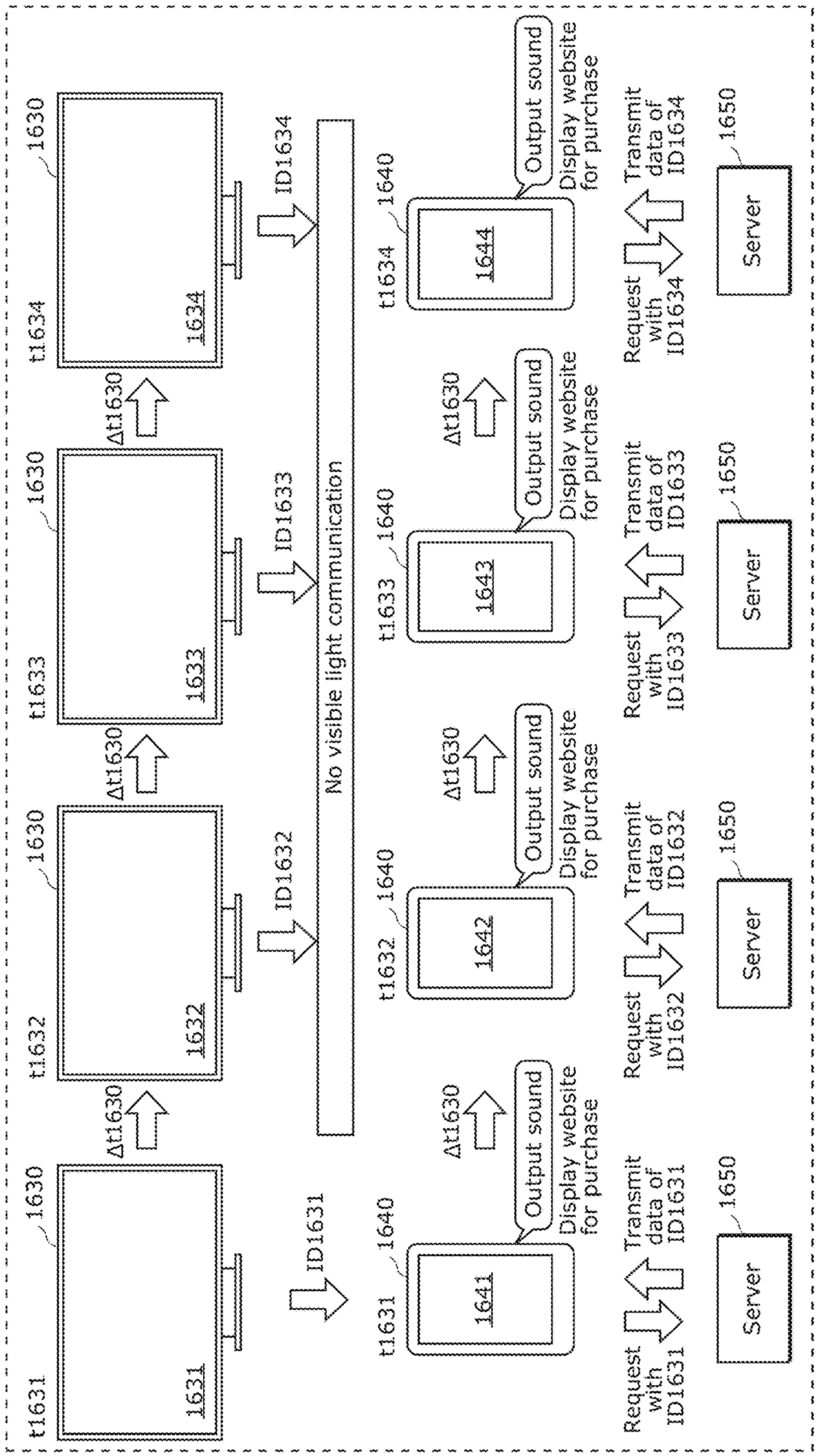
Figure 394:
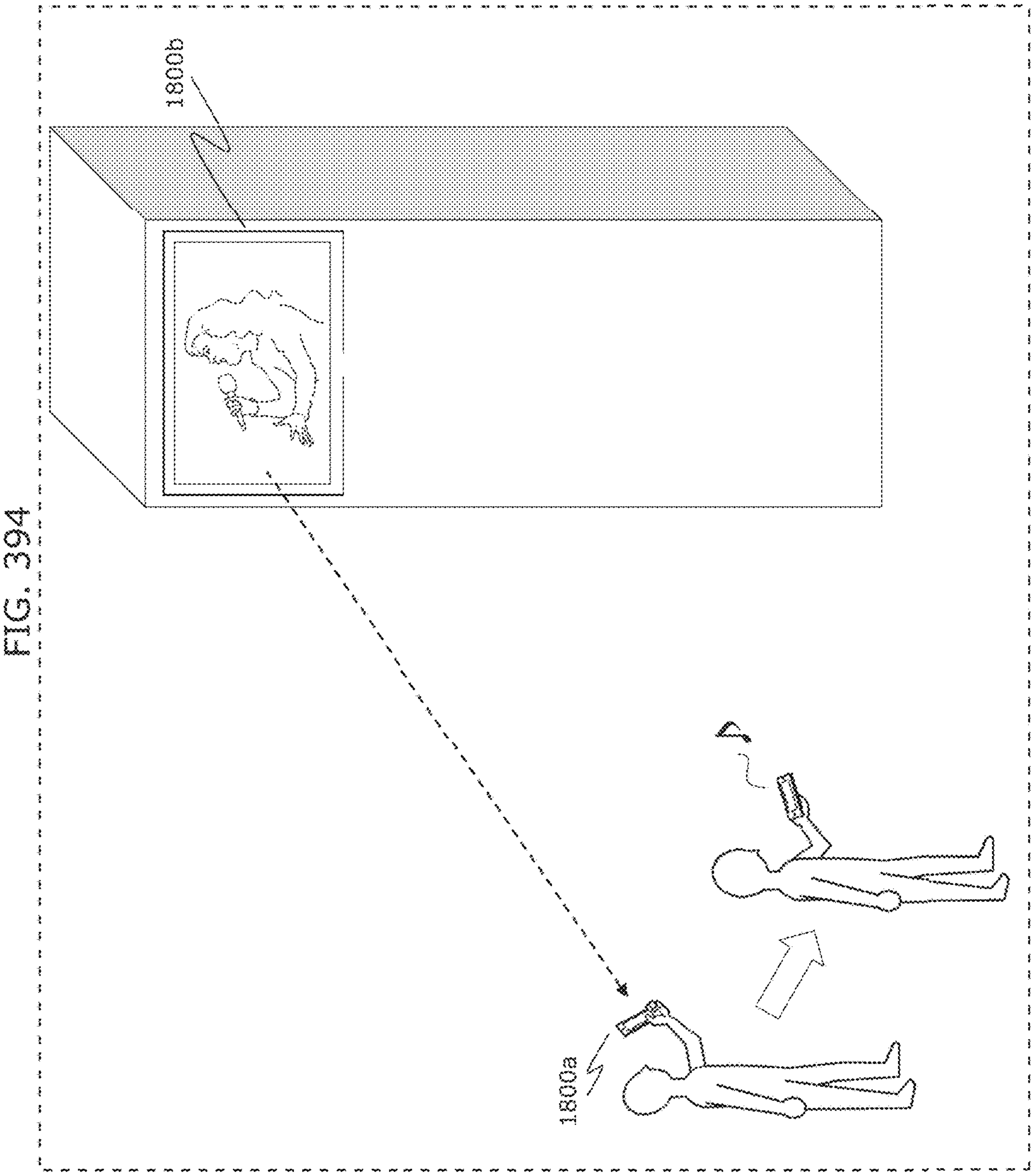
Figure 395:
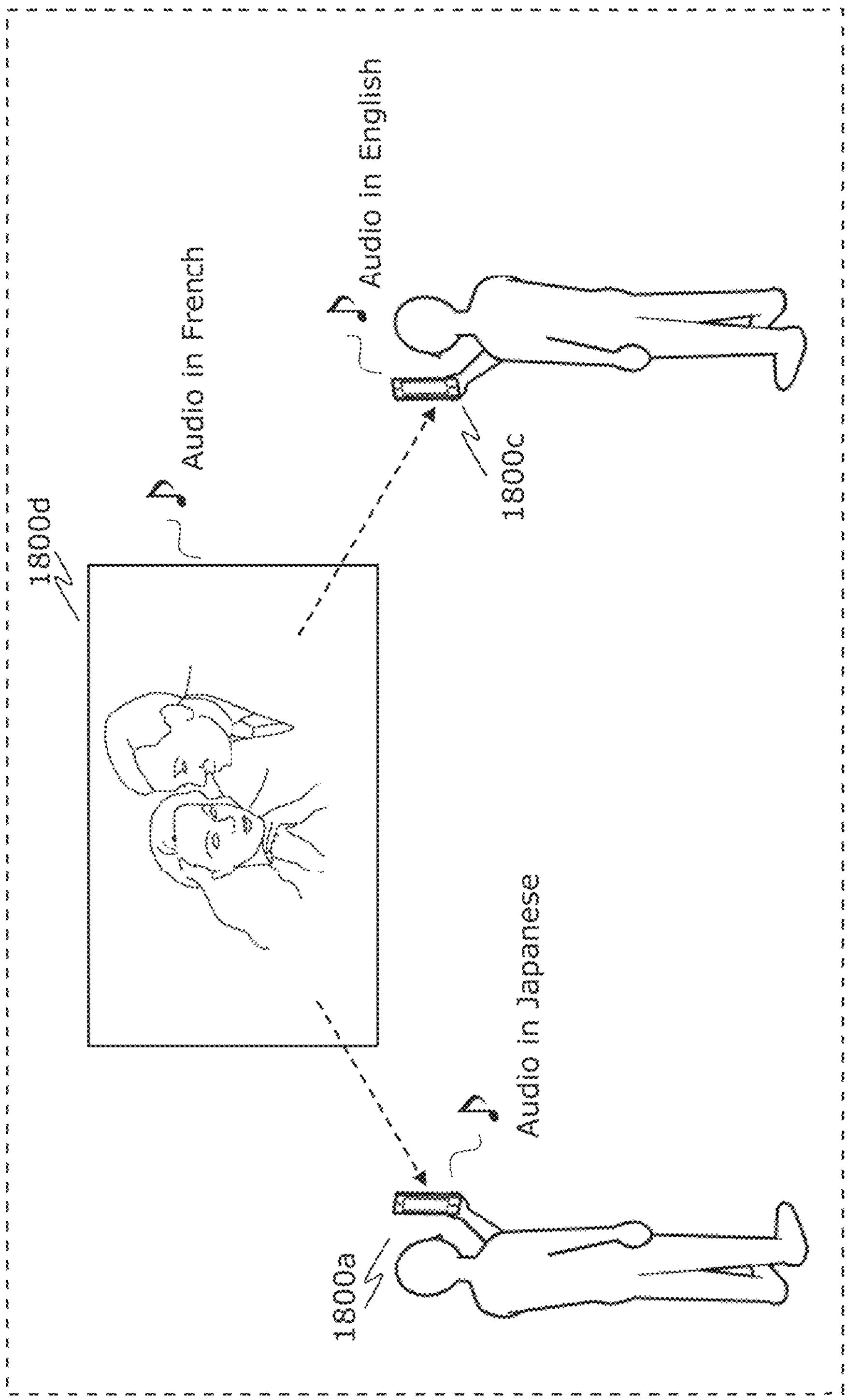
Figure 396:
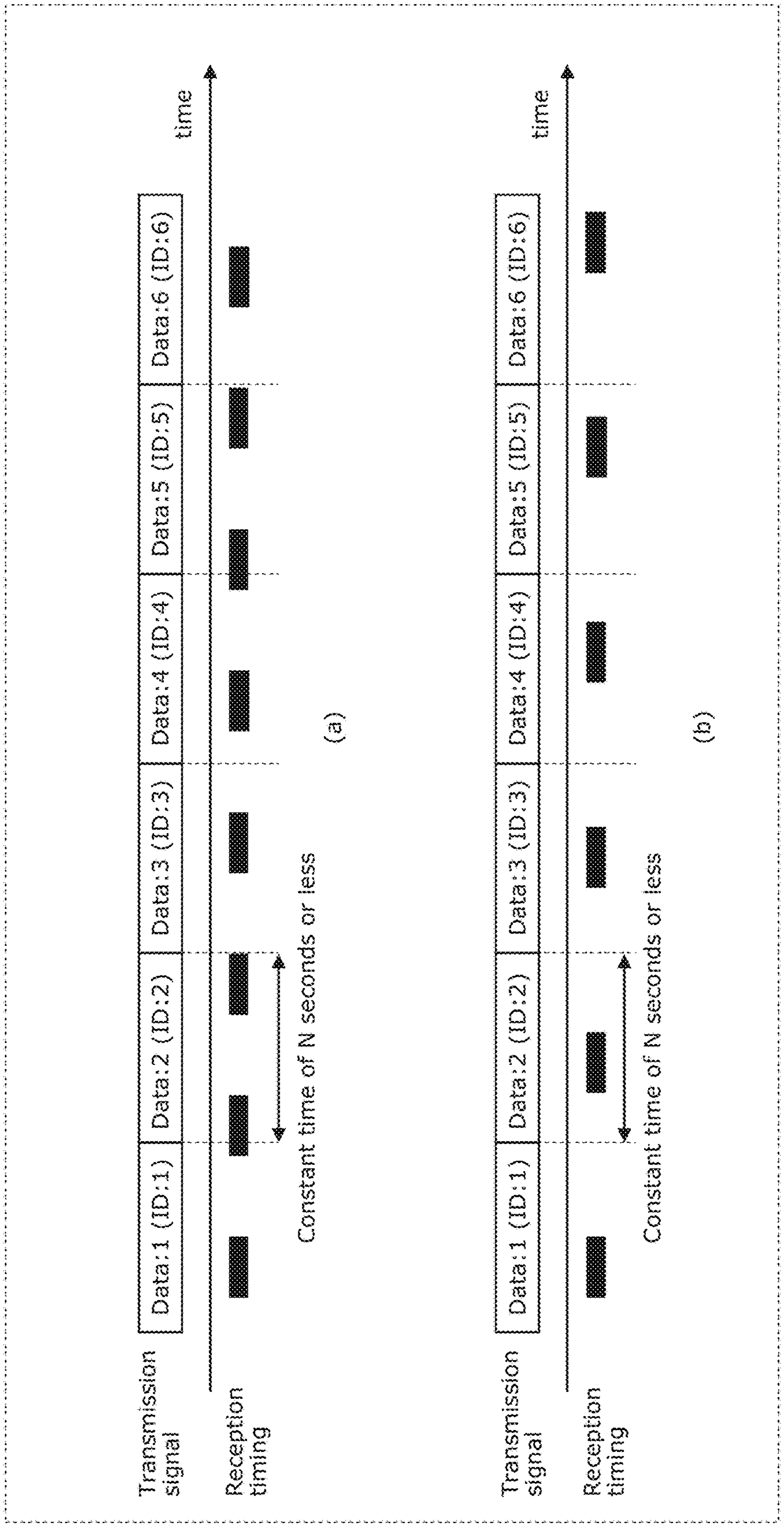
Figure 397:
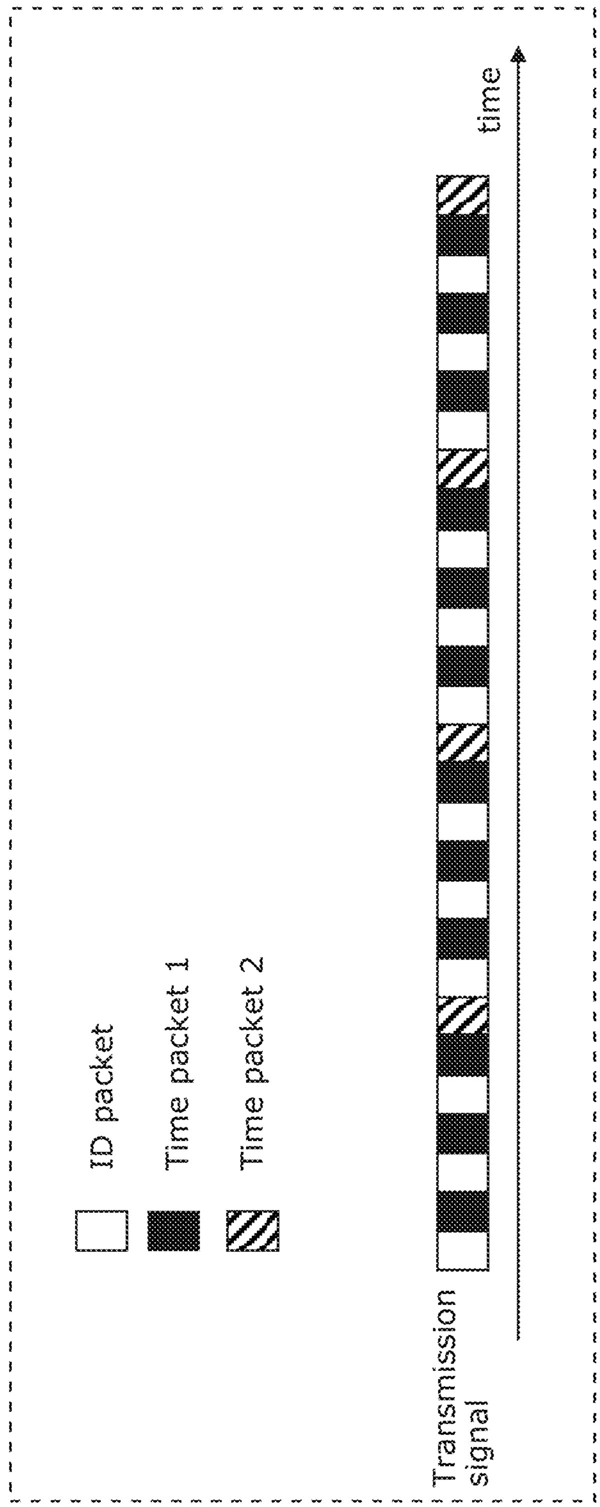
Figure 398:
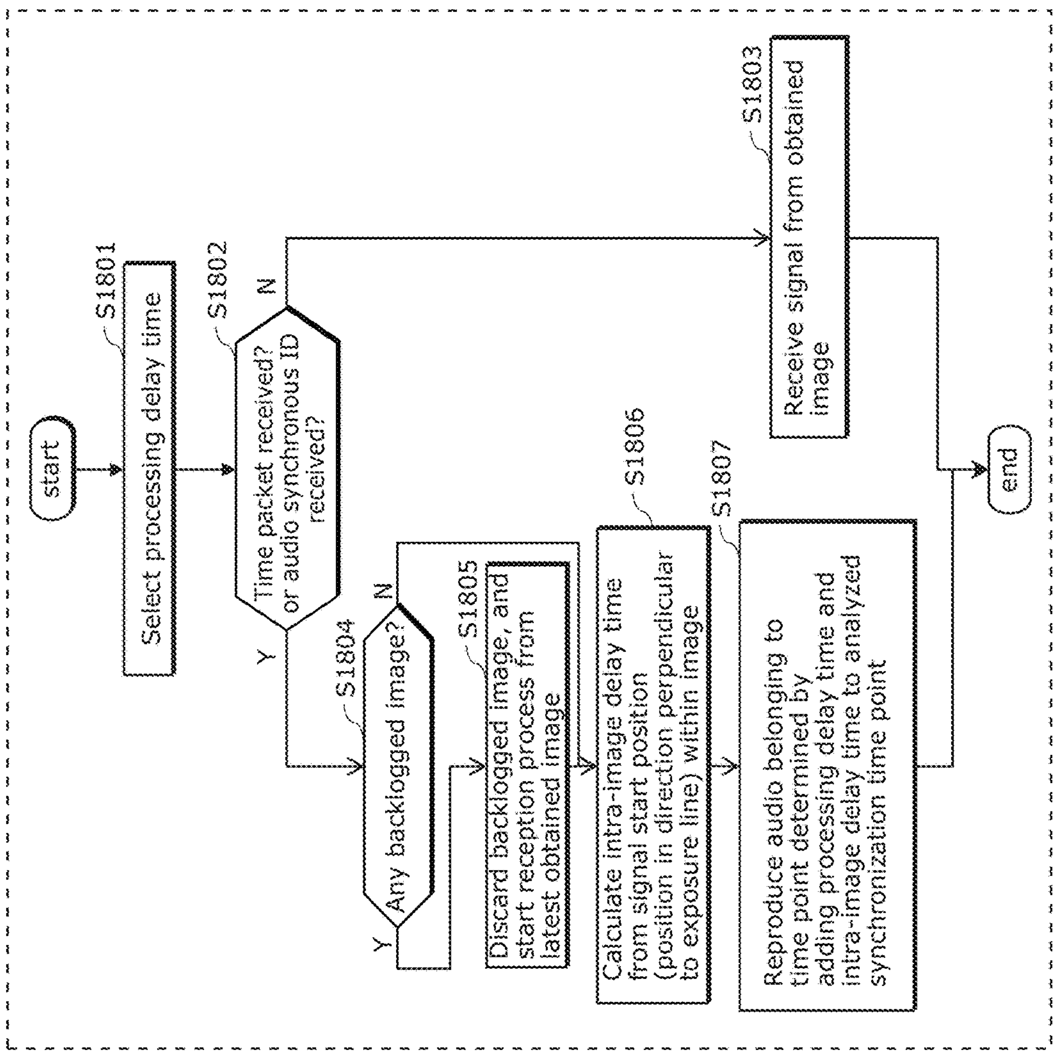
Figure 399:
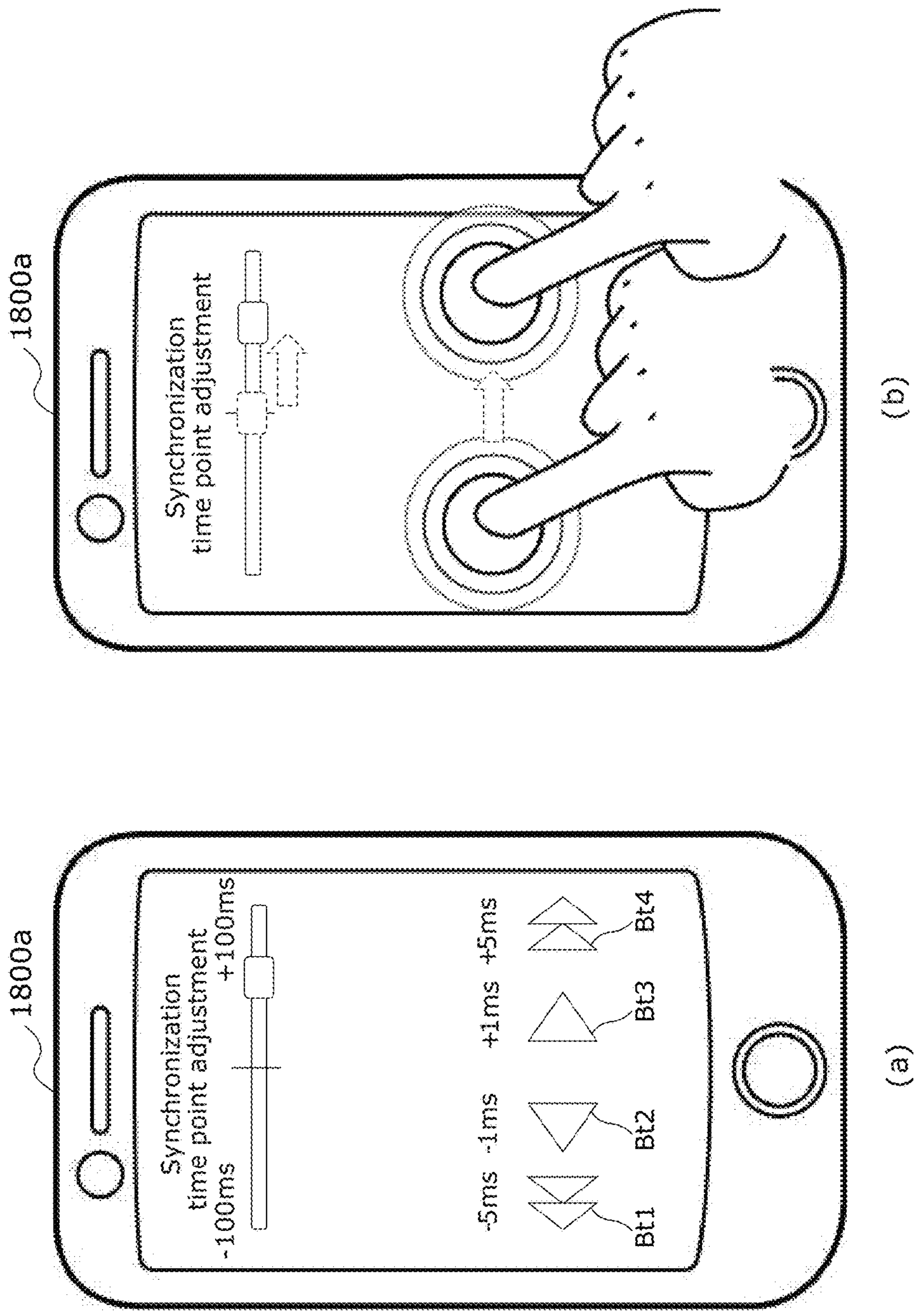
Figure 400:
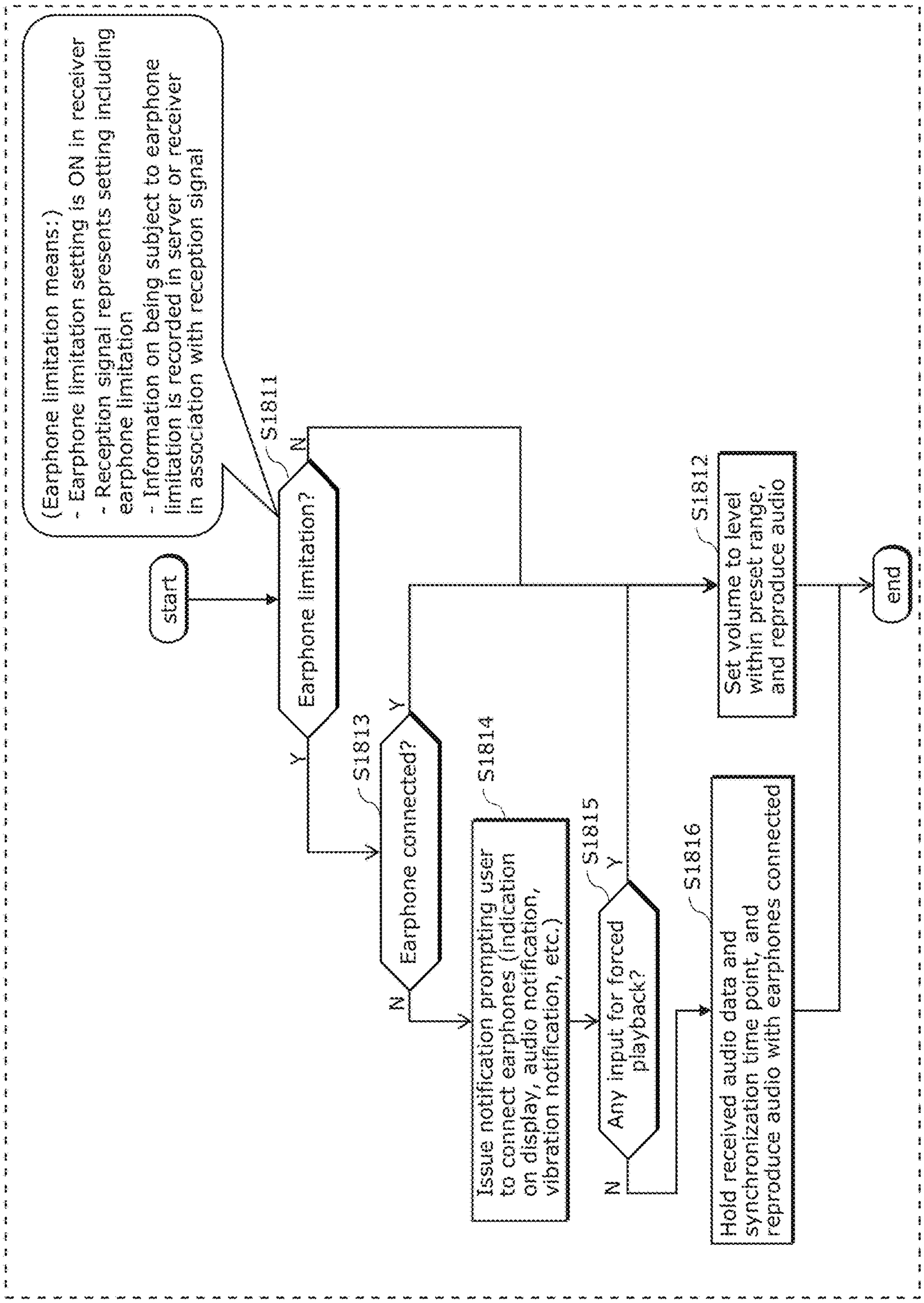
Figure 401:
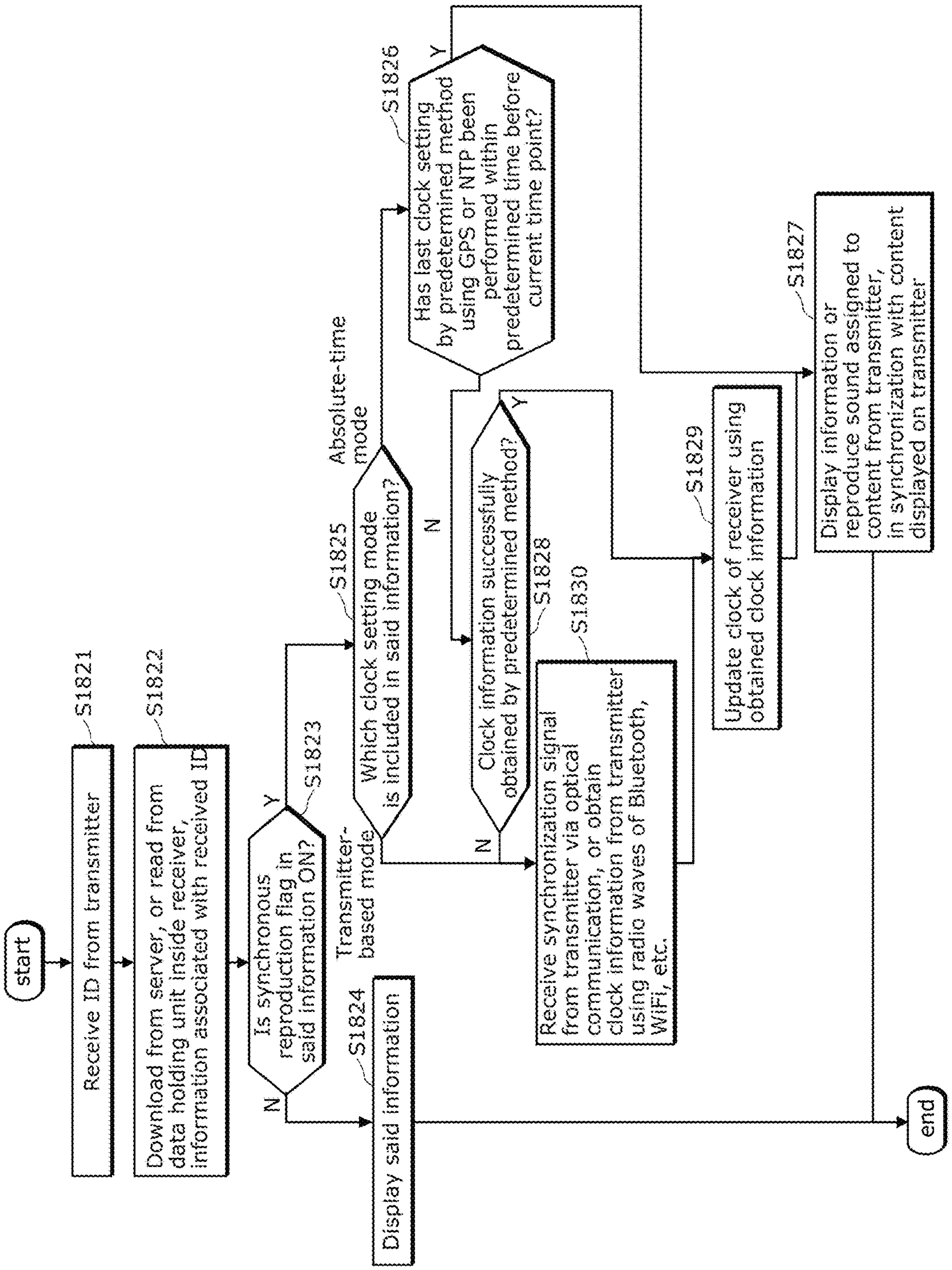
Figure 402B:
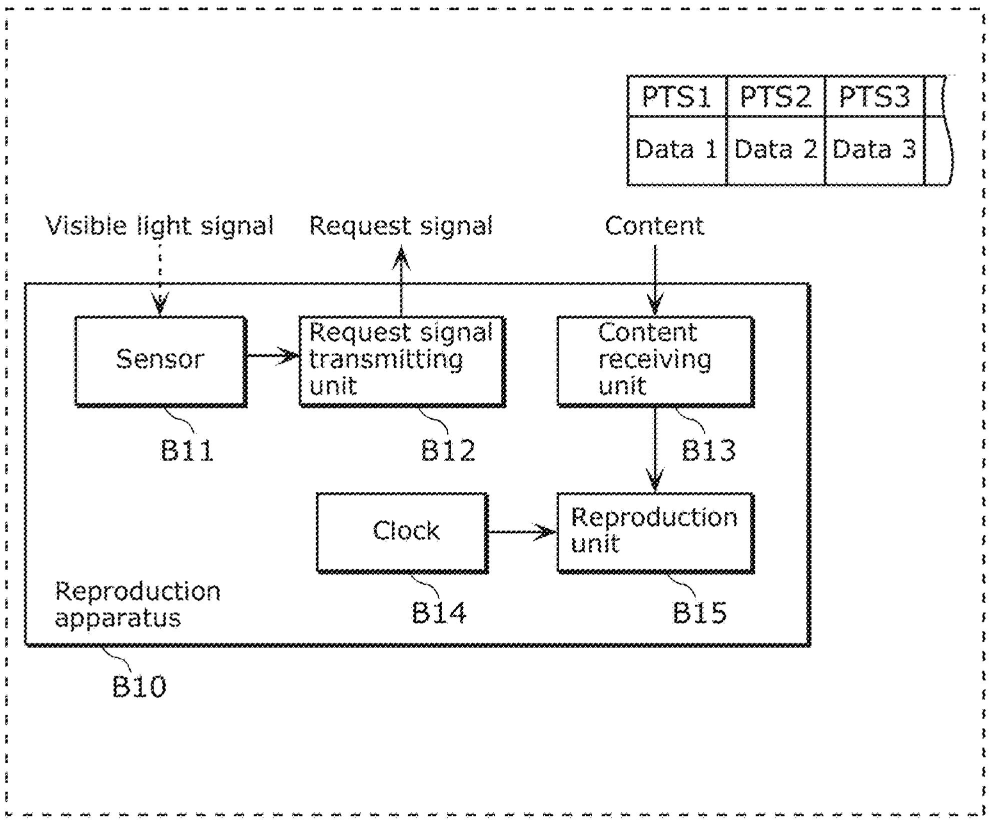
Figure 402C:
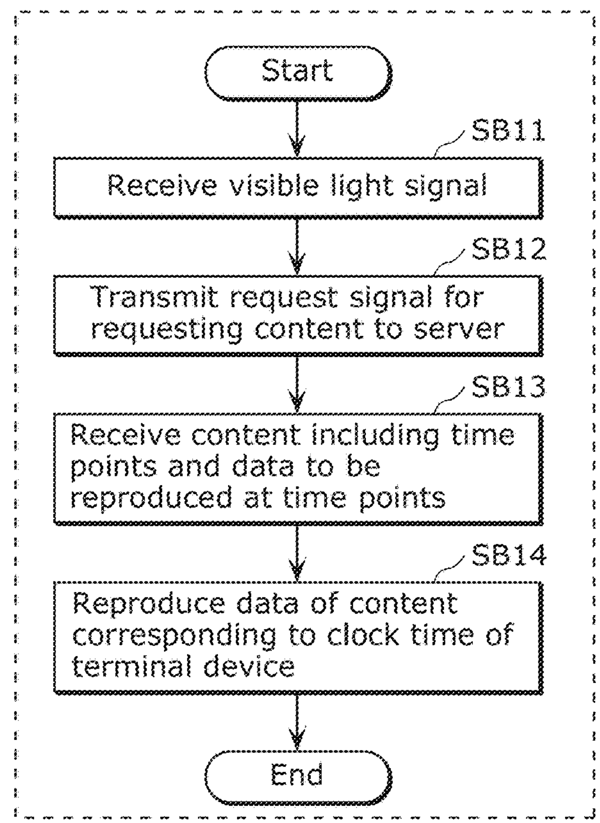
Figure 403:
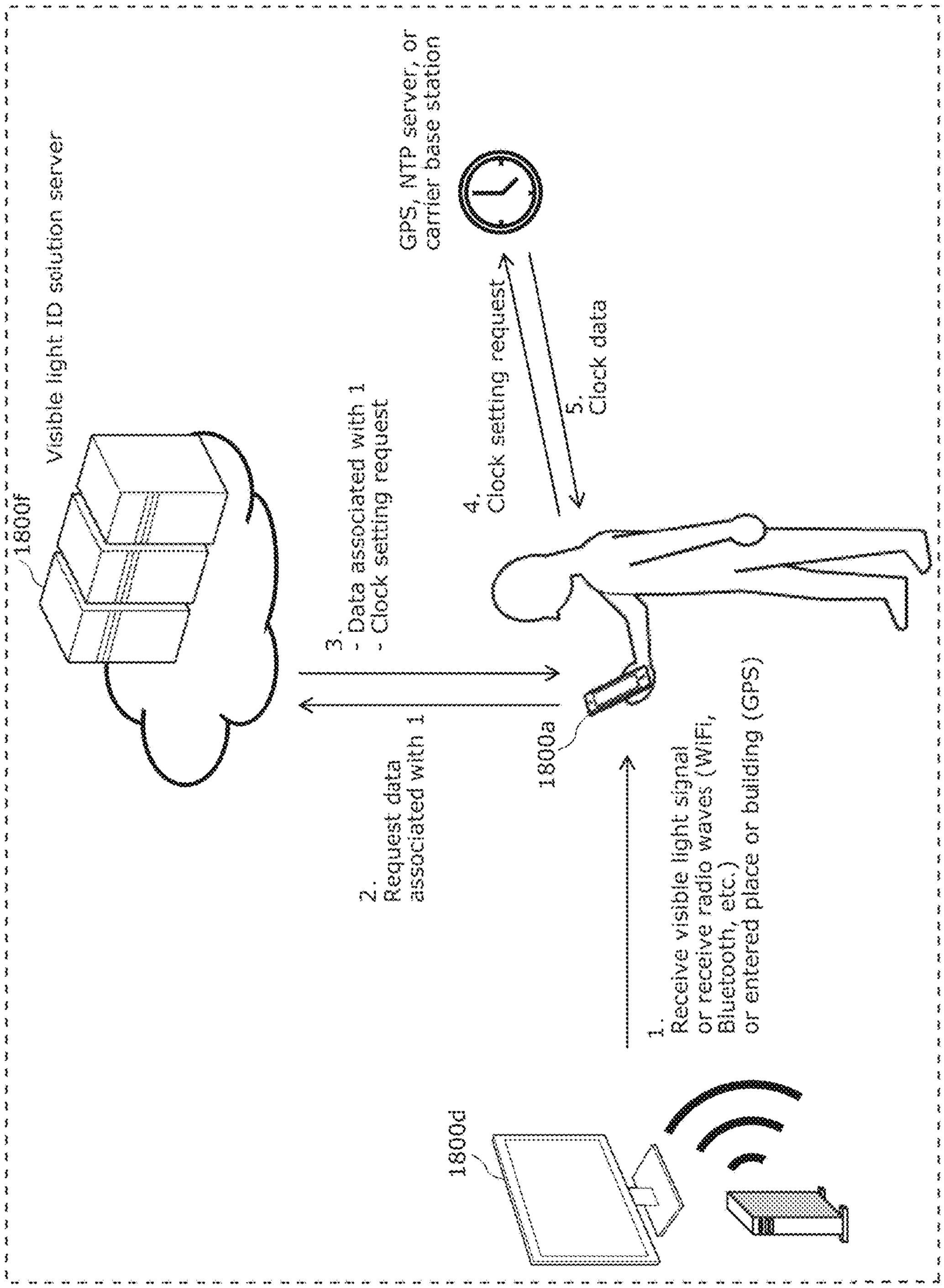
Figure 404:
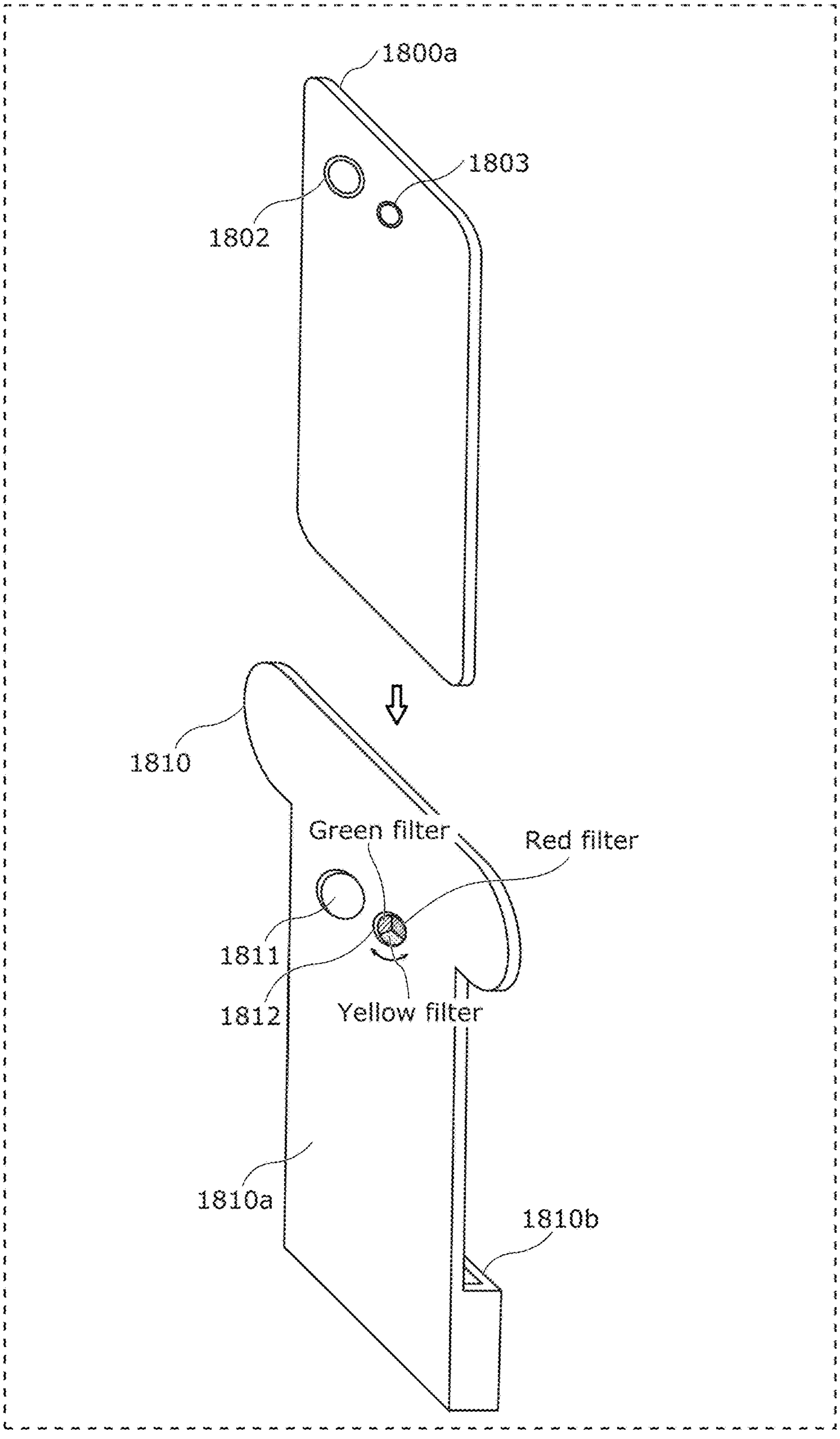
Figure 405A:
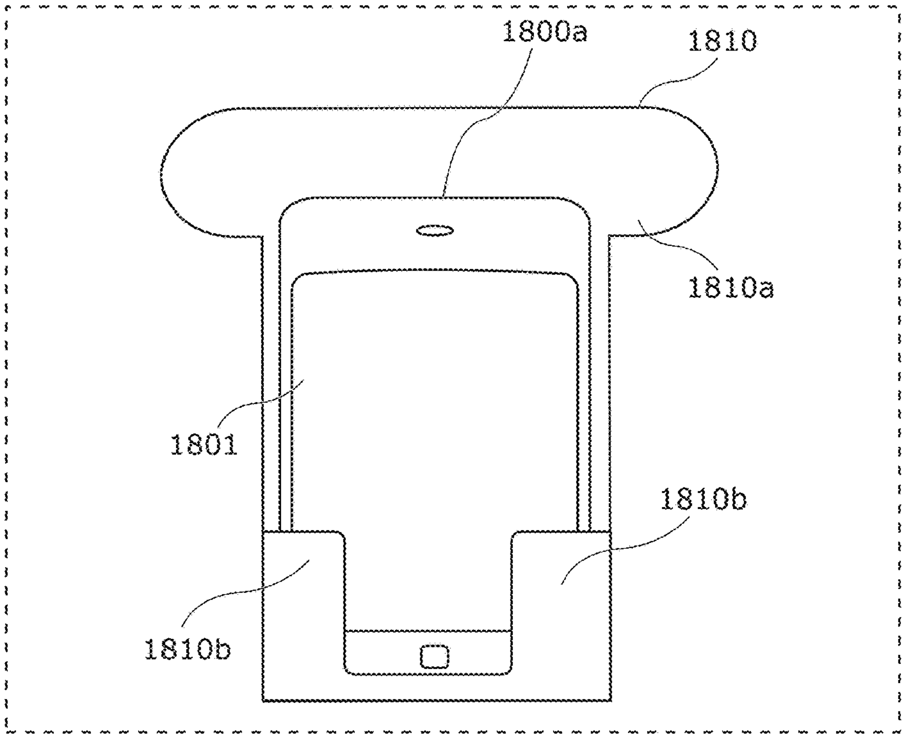
Figure 405B:
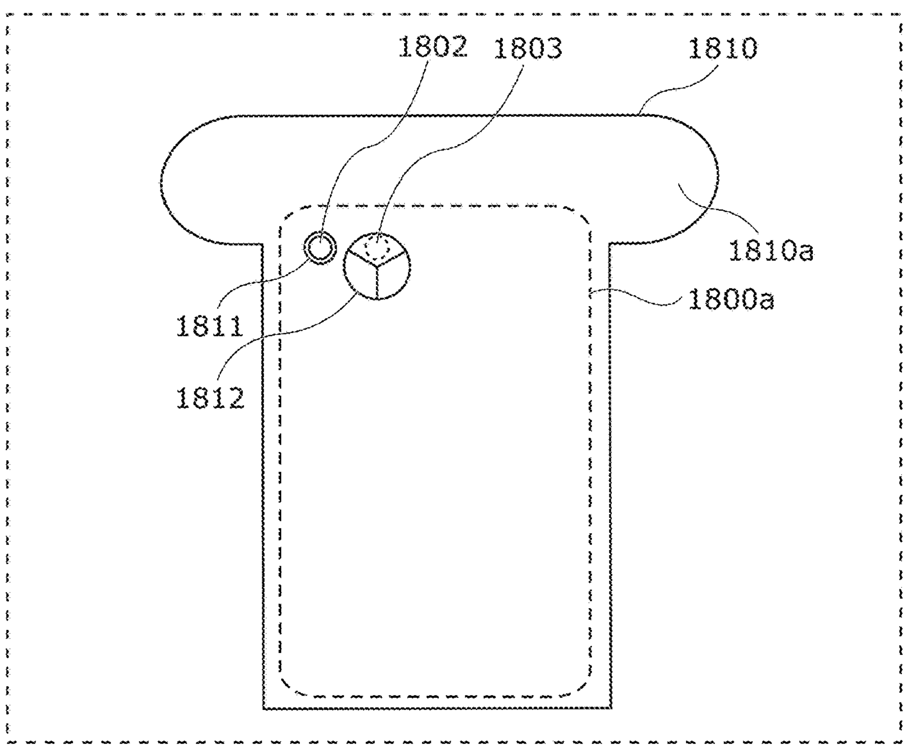
Figure 406:
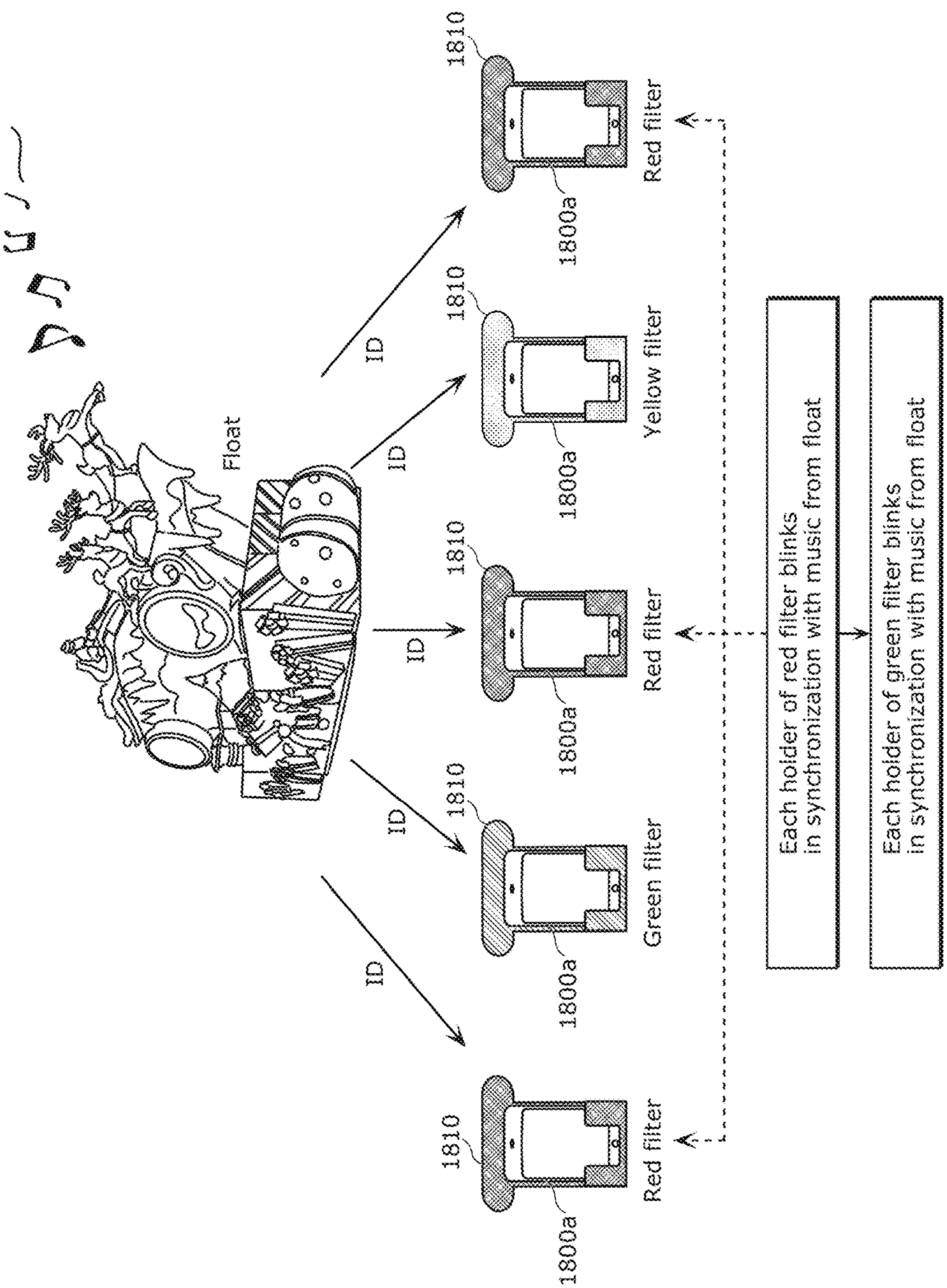
Figure 407:
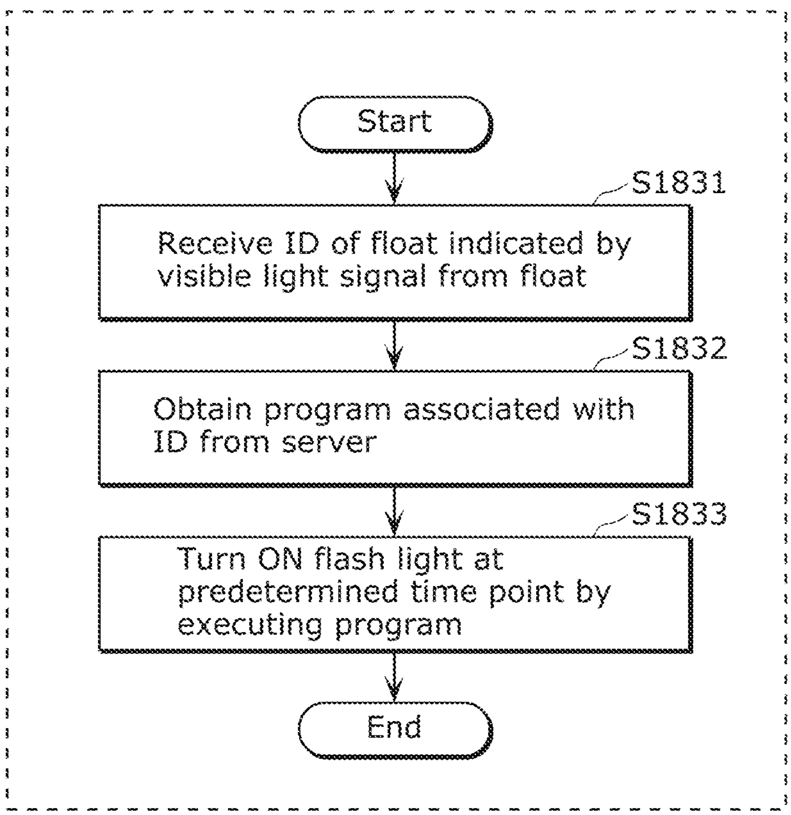
Figure 408:
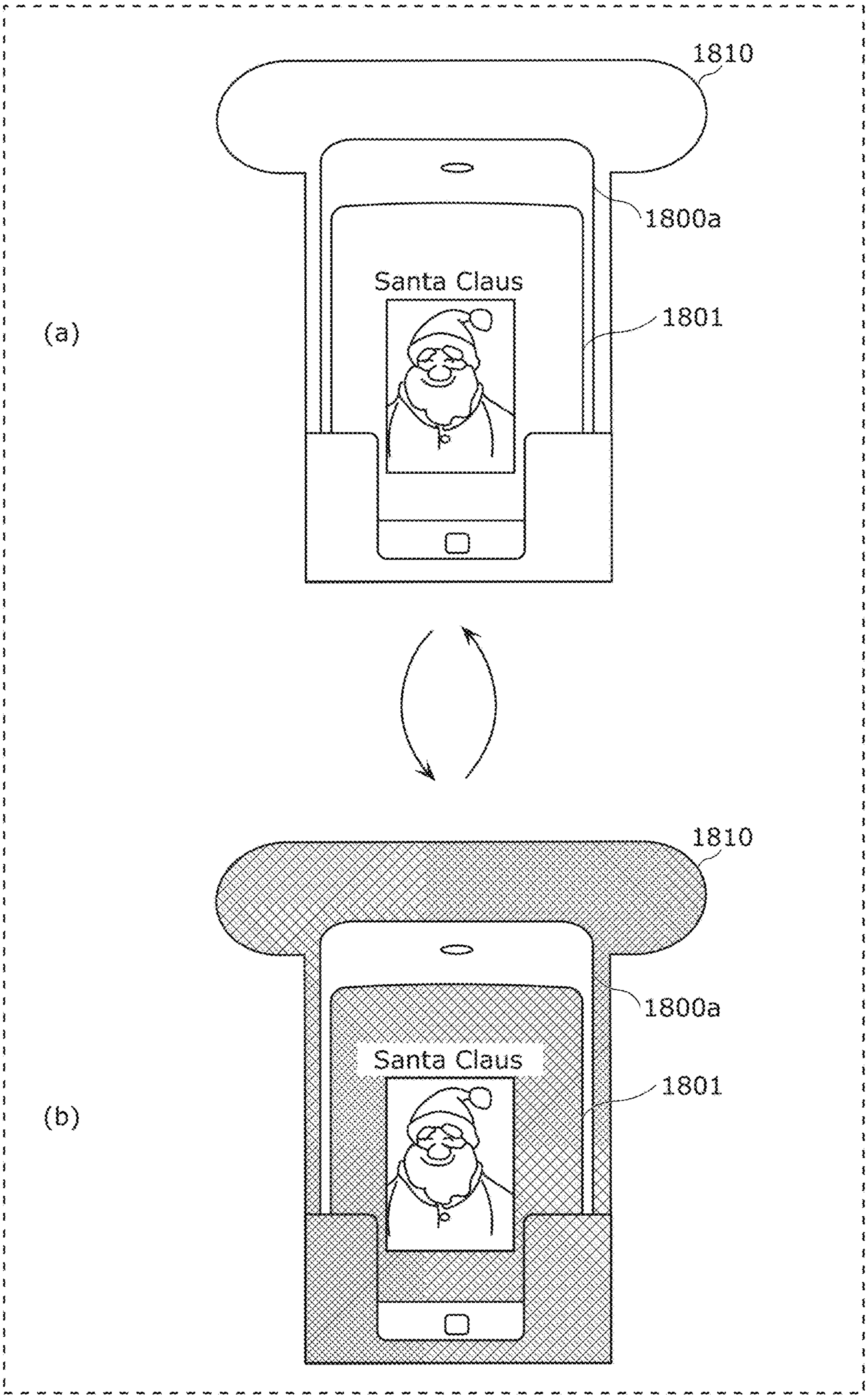
Figure 409:
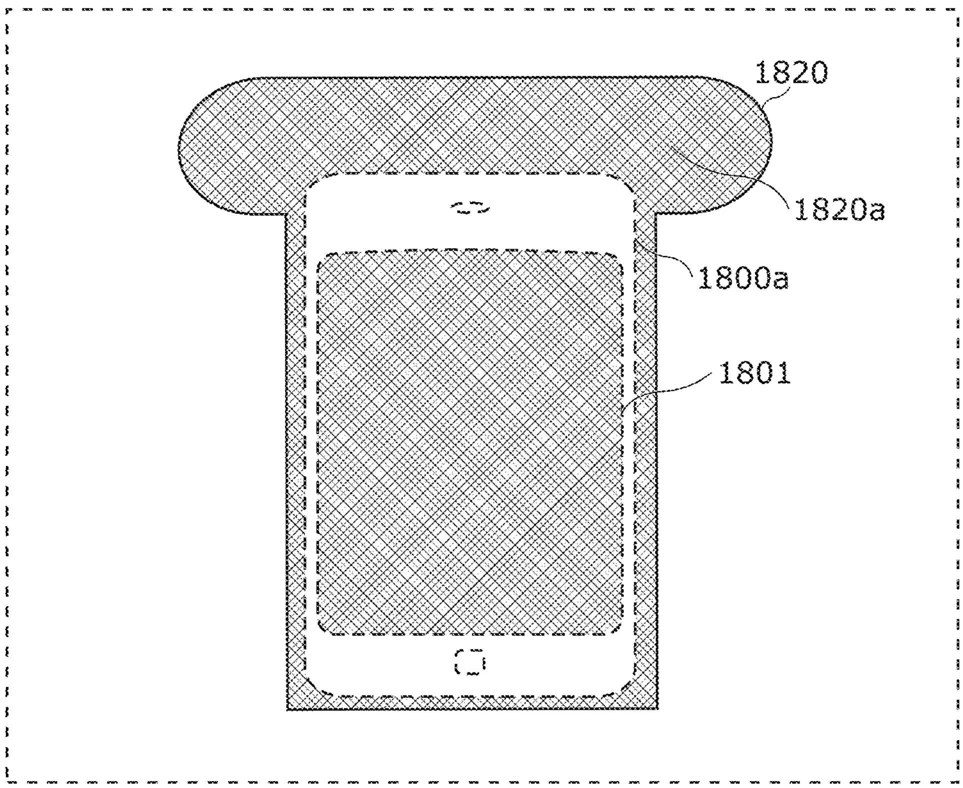
Figure 410A:
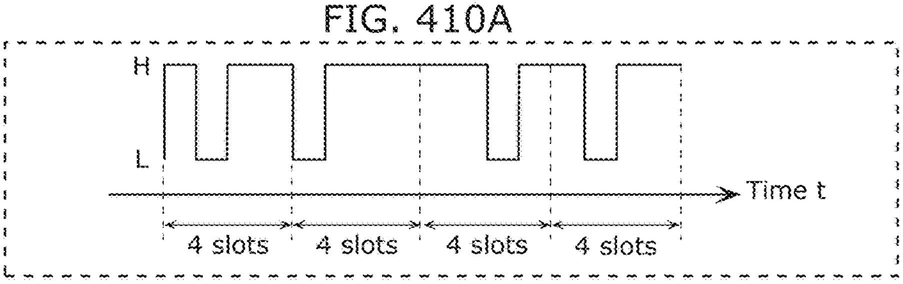
Figure 410B:
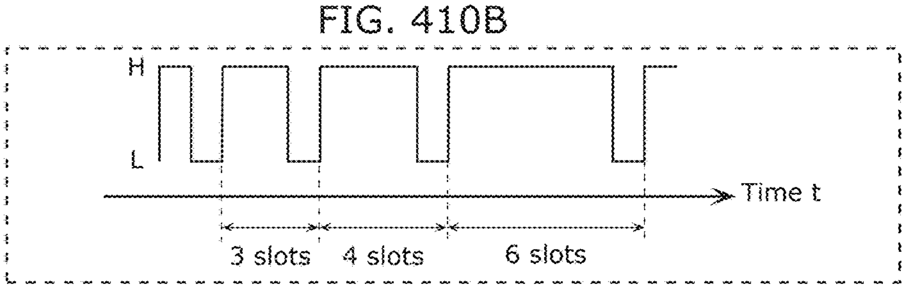
Figure 410C:
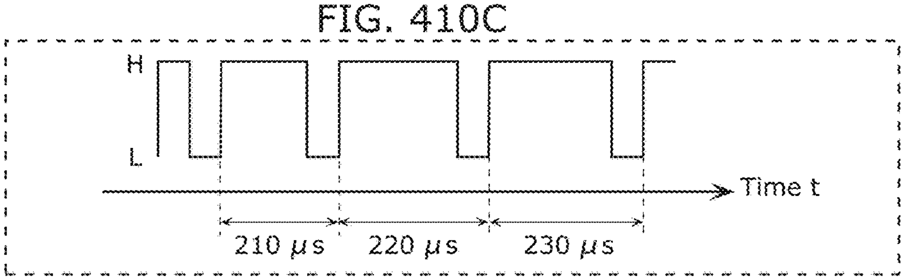
Figure 410D:
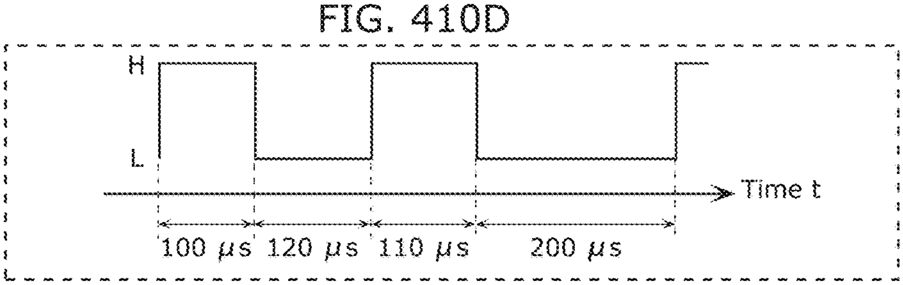
Figure 411:
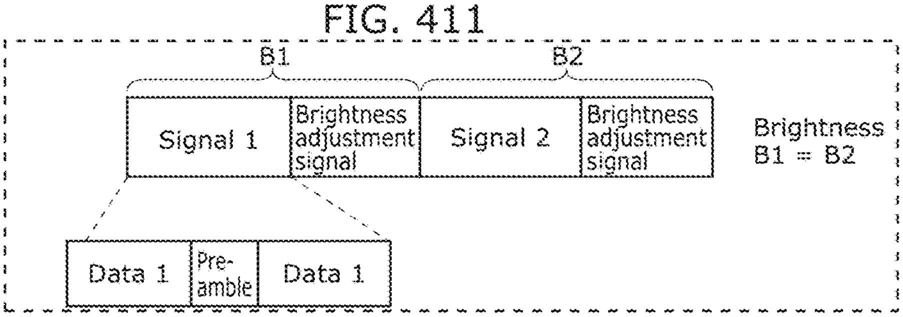
Figure 412:
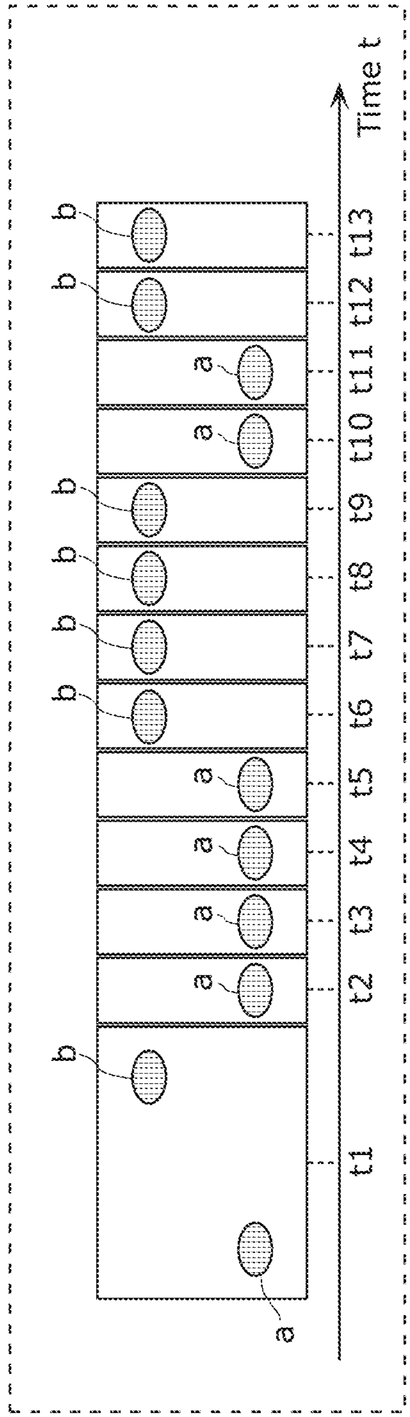
Figure 413:
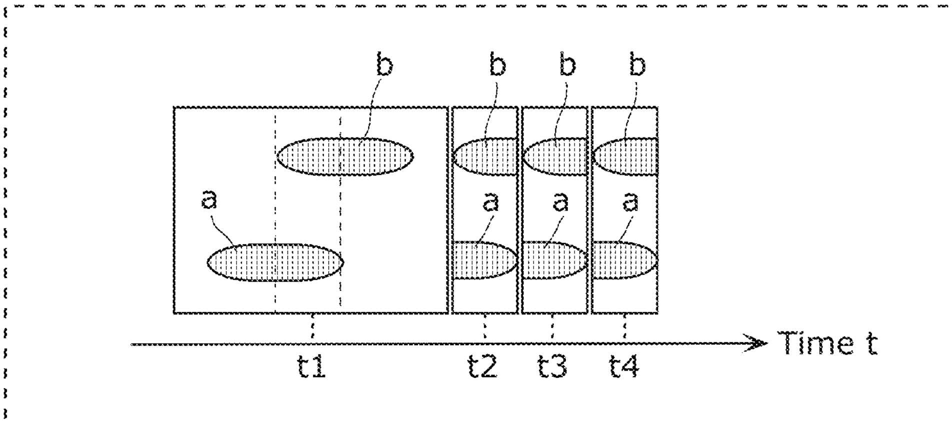
Figure 414:
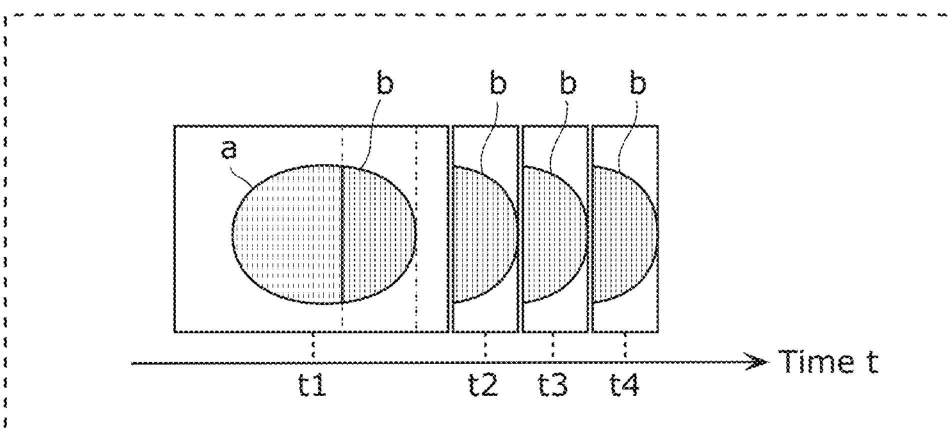
Figure 415:
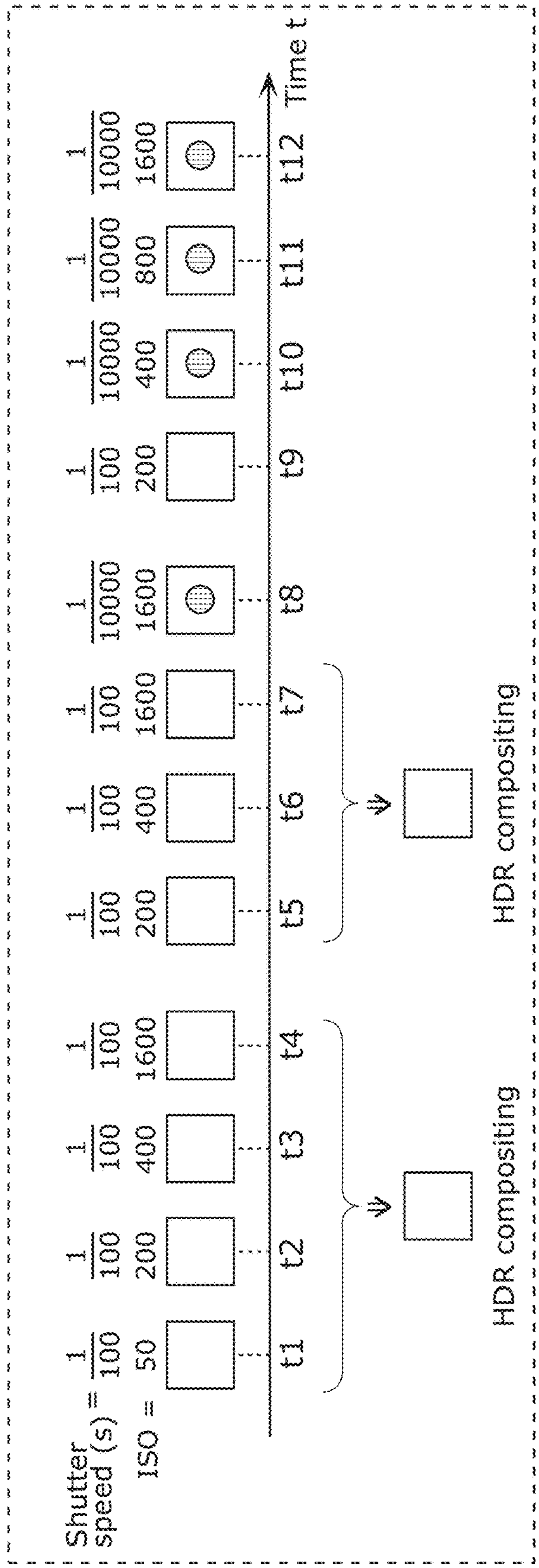
Figure 416:
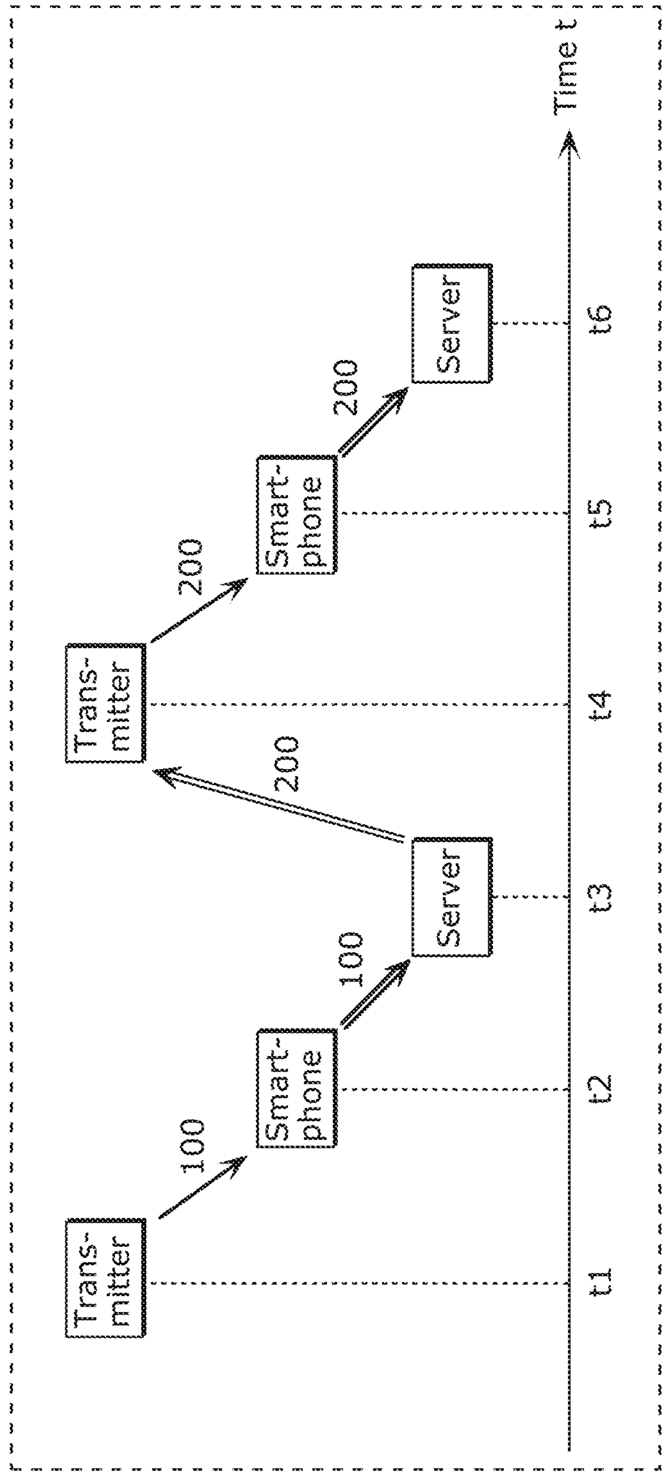
Figure 417A:
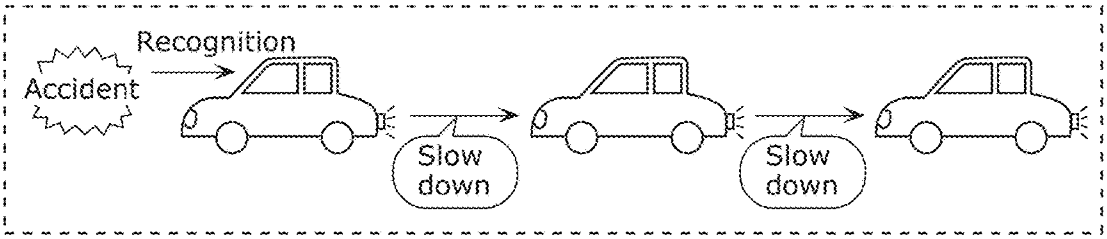
Figure 417B:
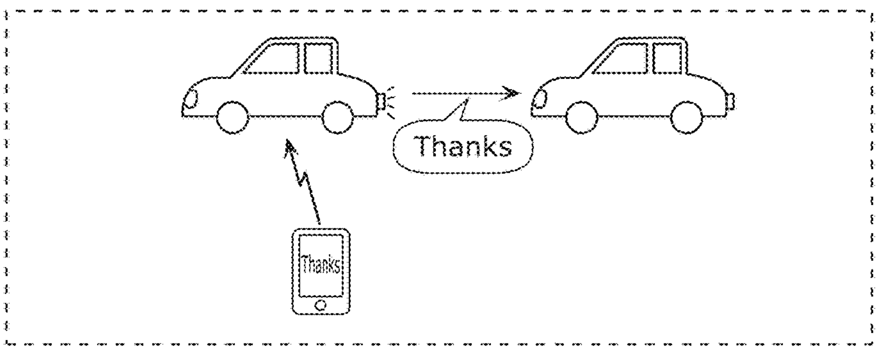
Figure 418:
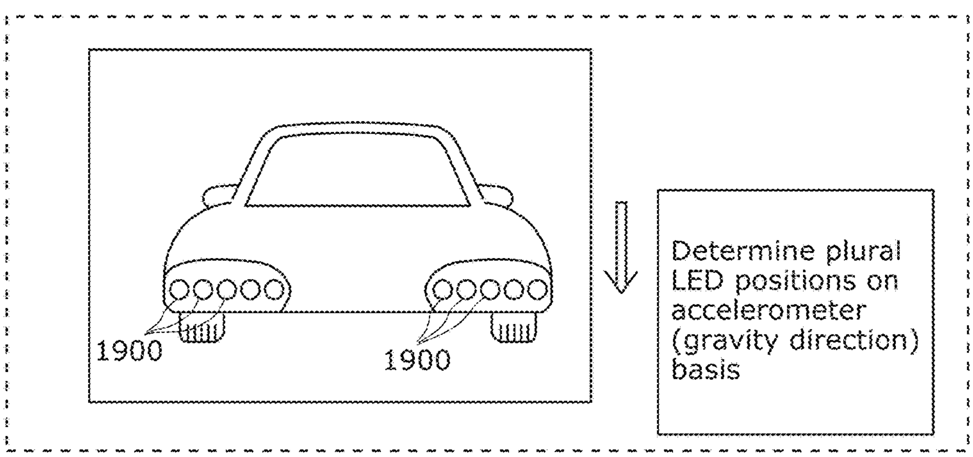
Figure 419:
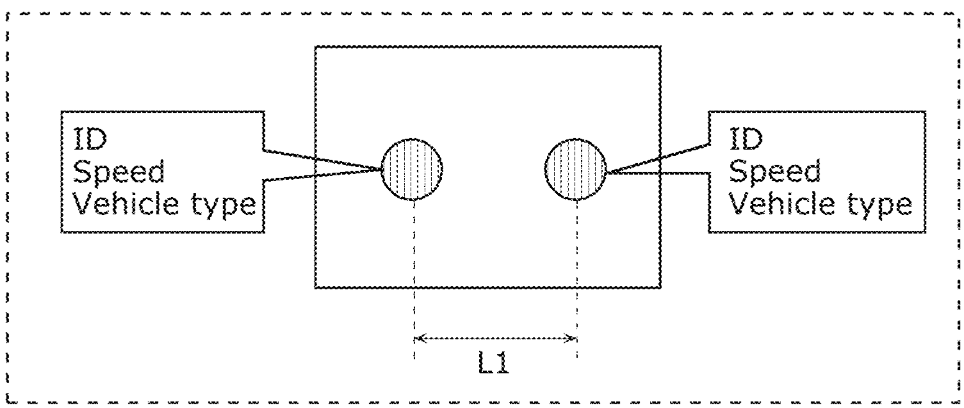
Figure 420:
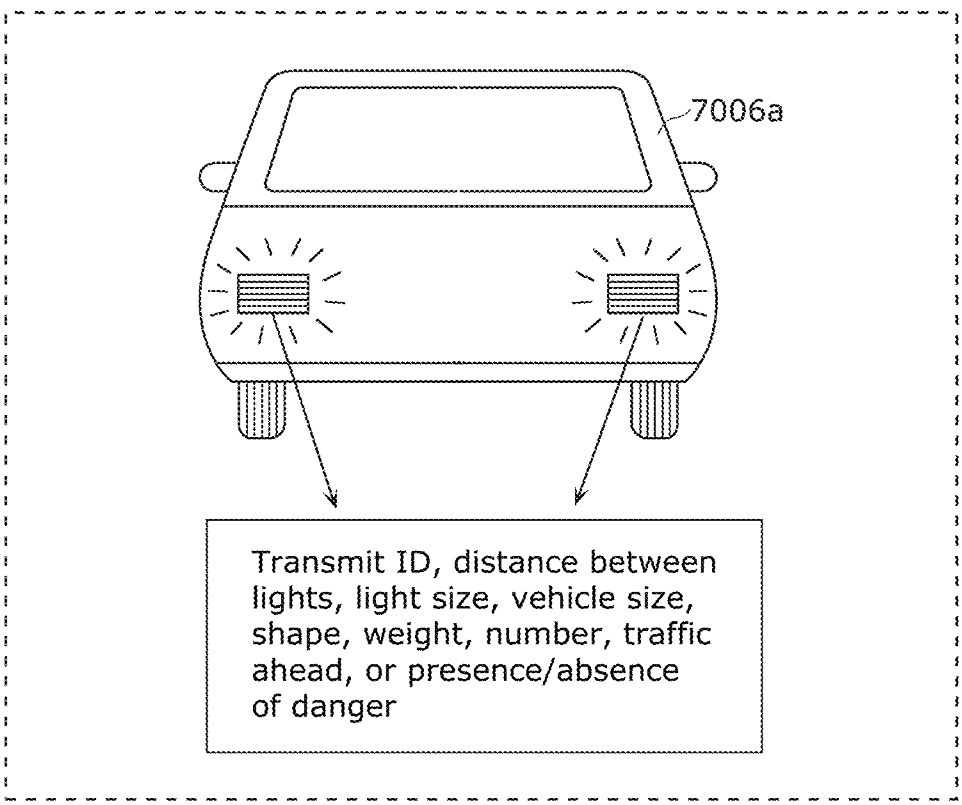
Figure 421:
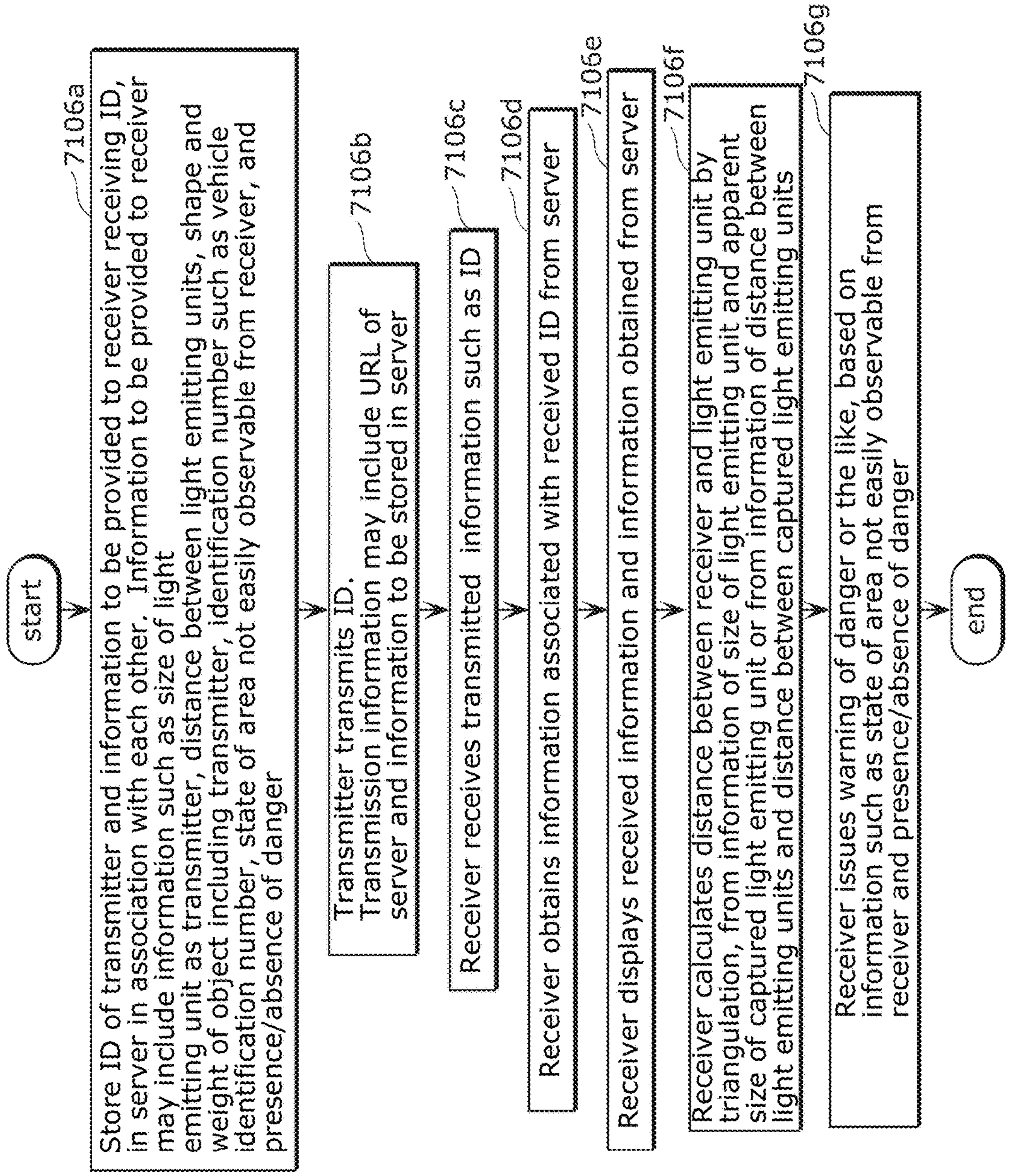
Figure 422:
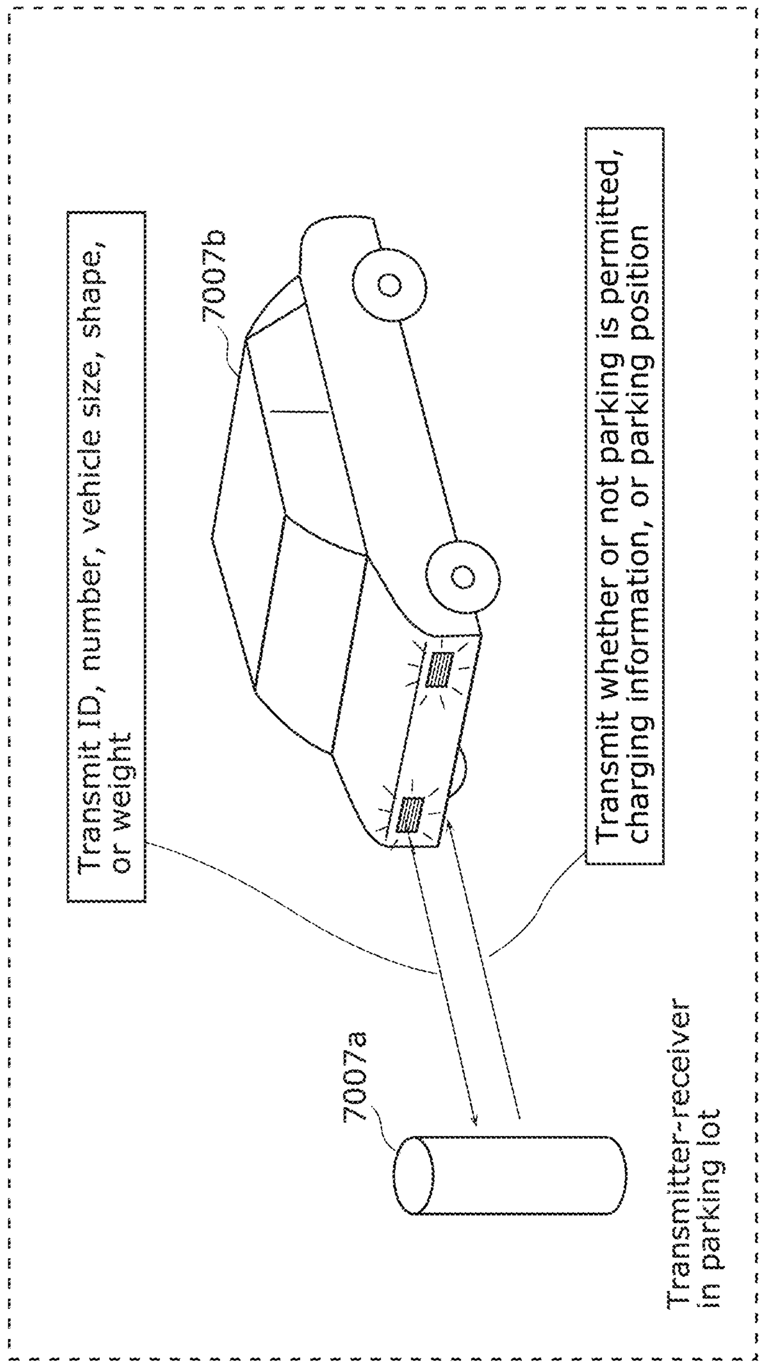
Figure 423:
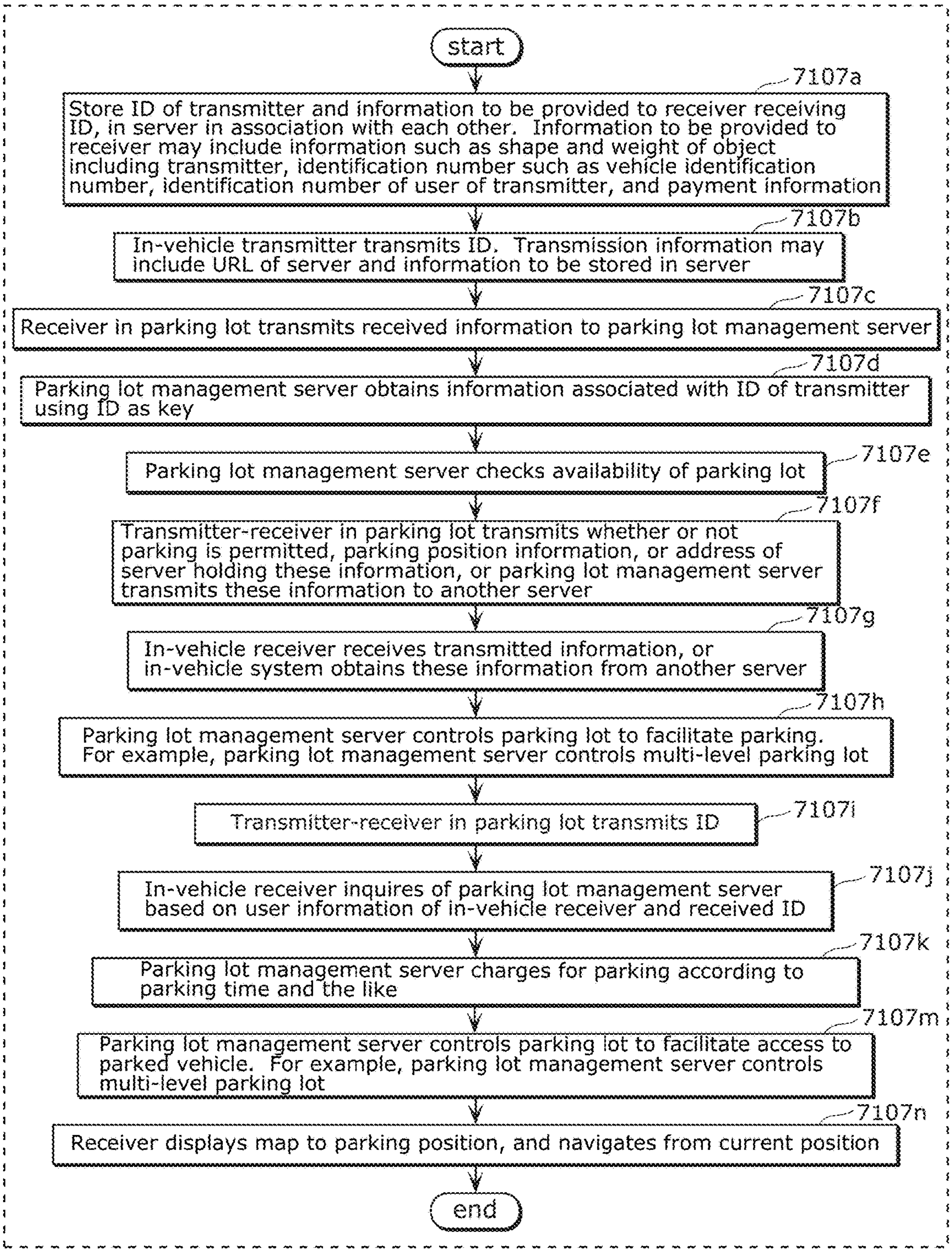
Figure 424:
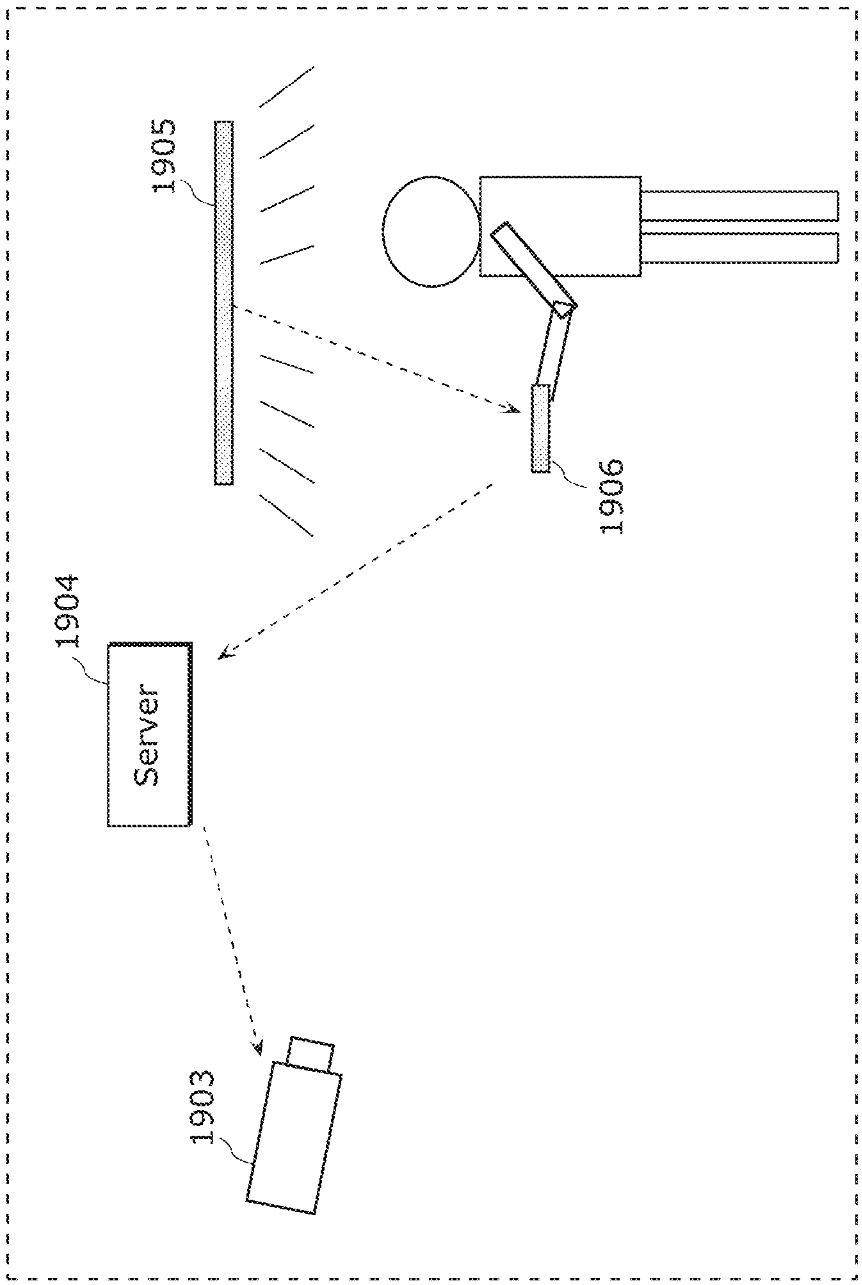
Figure 425:
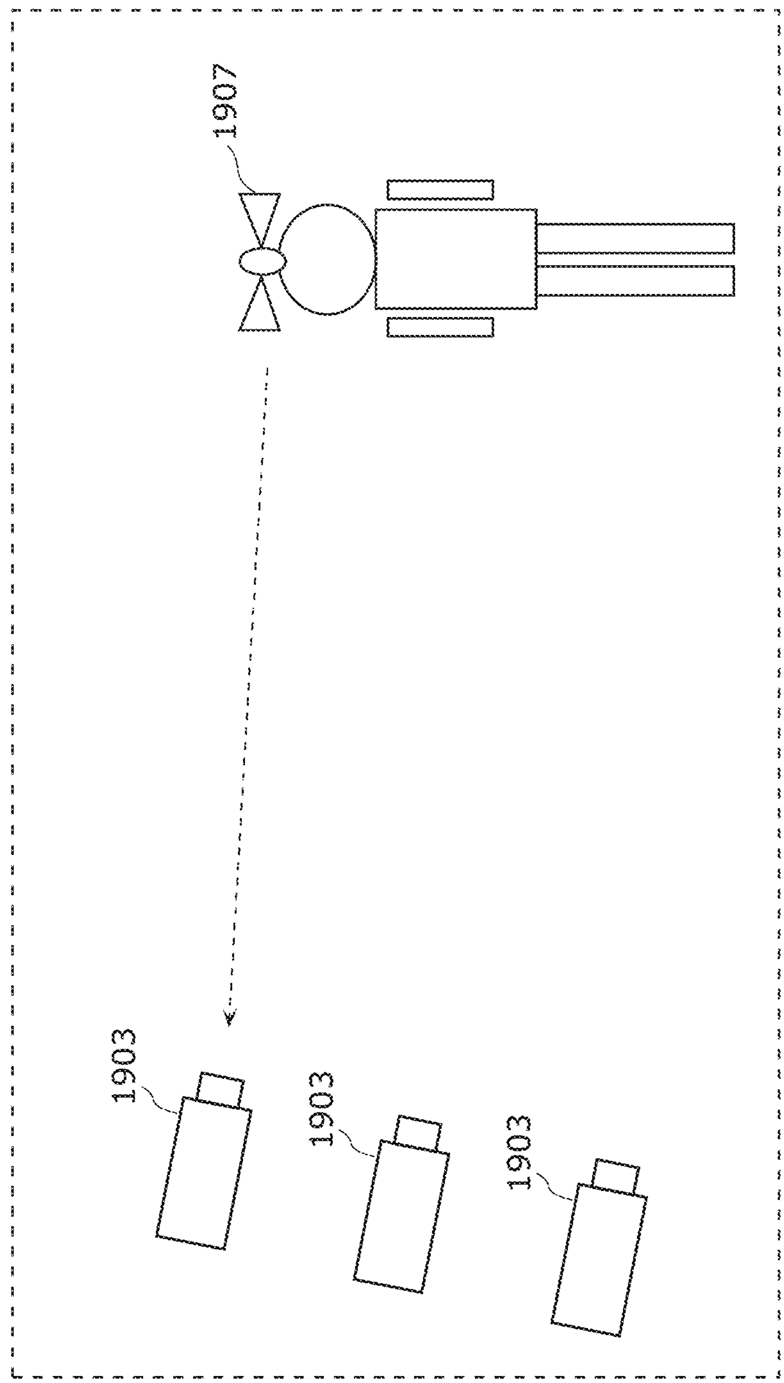
Figure 426:
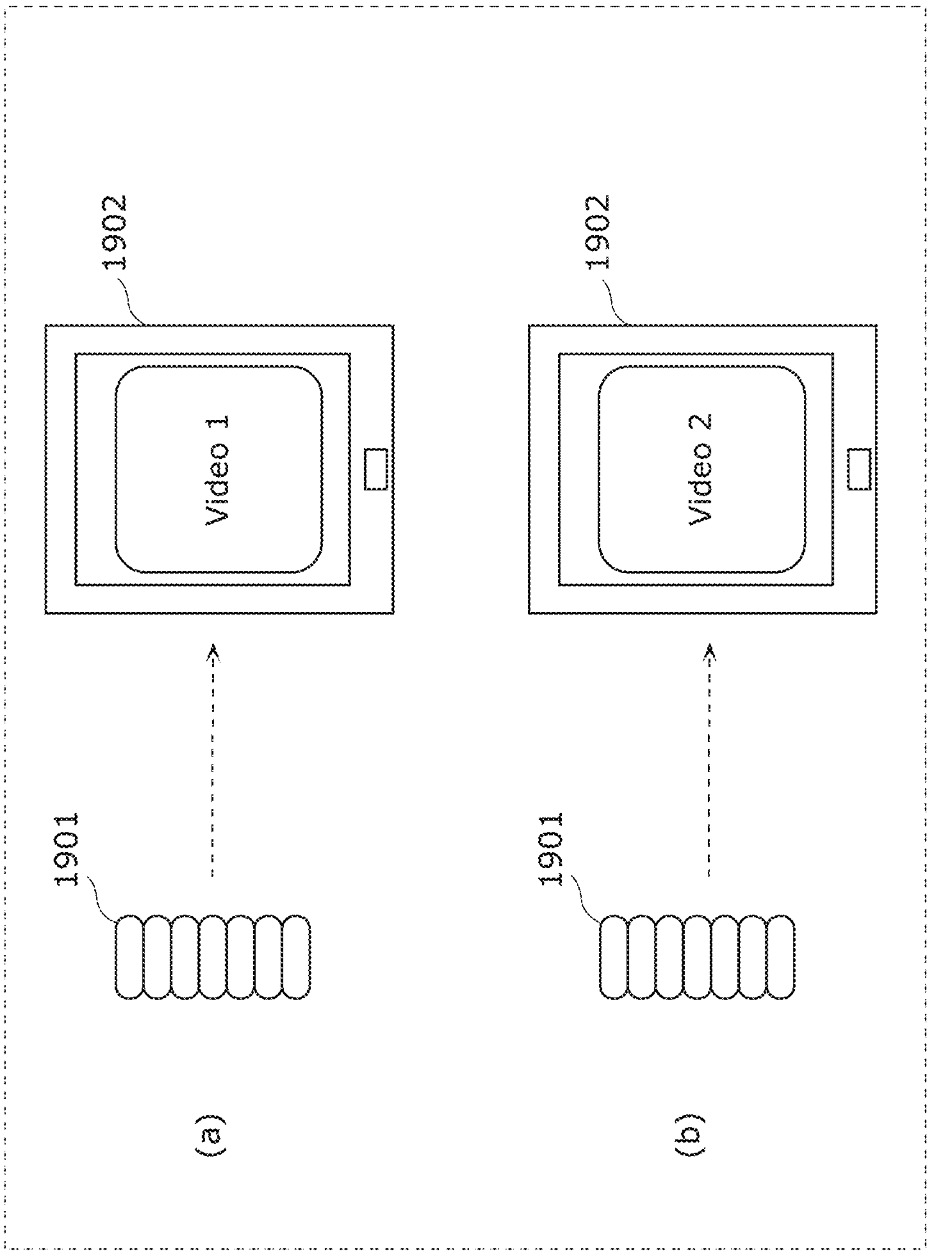
Figure 427:
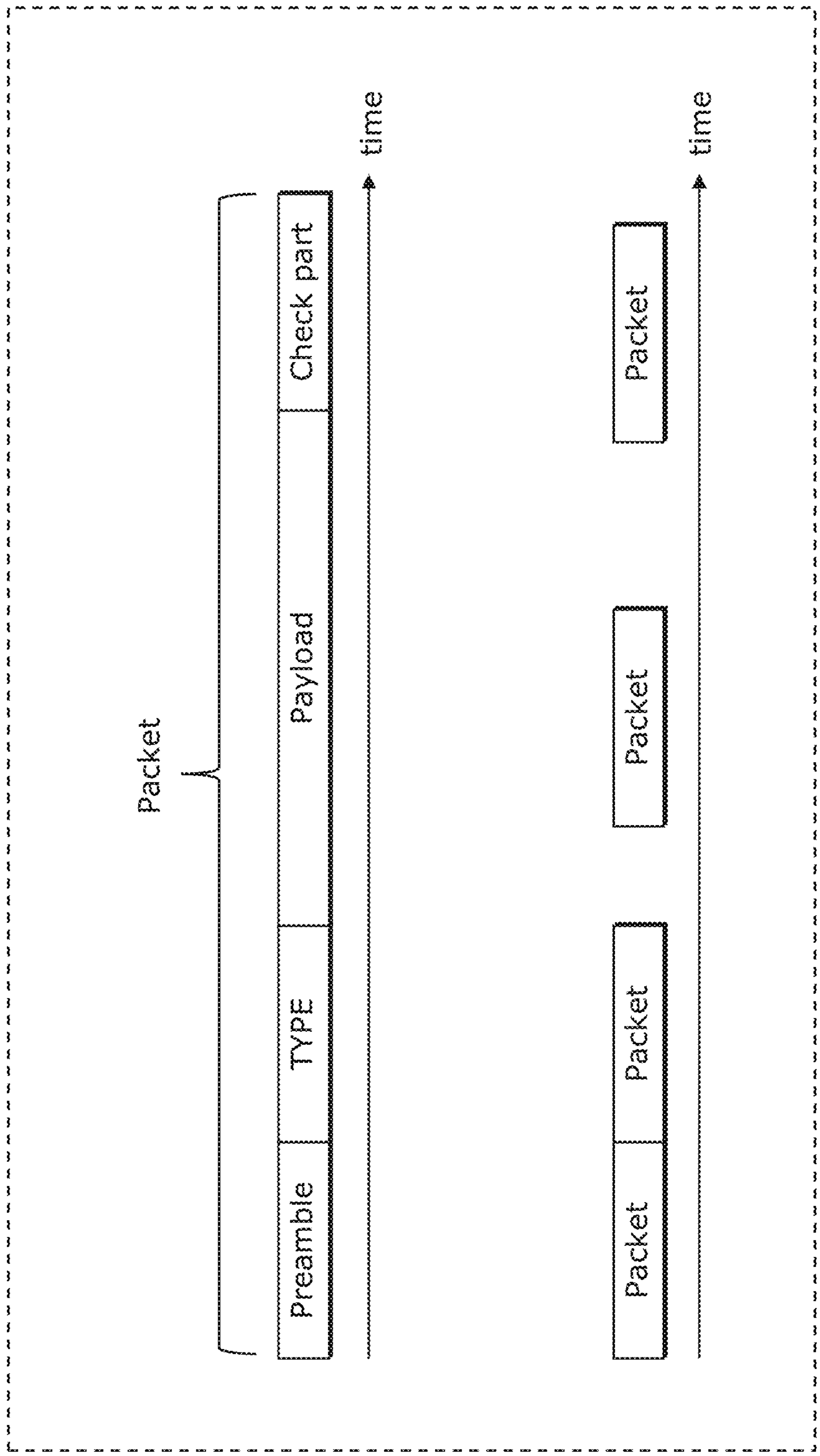
Figure 432:
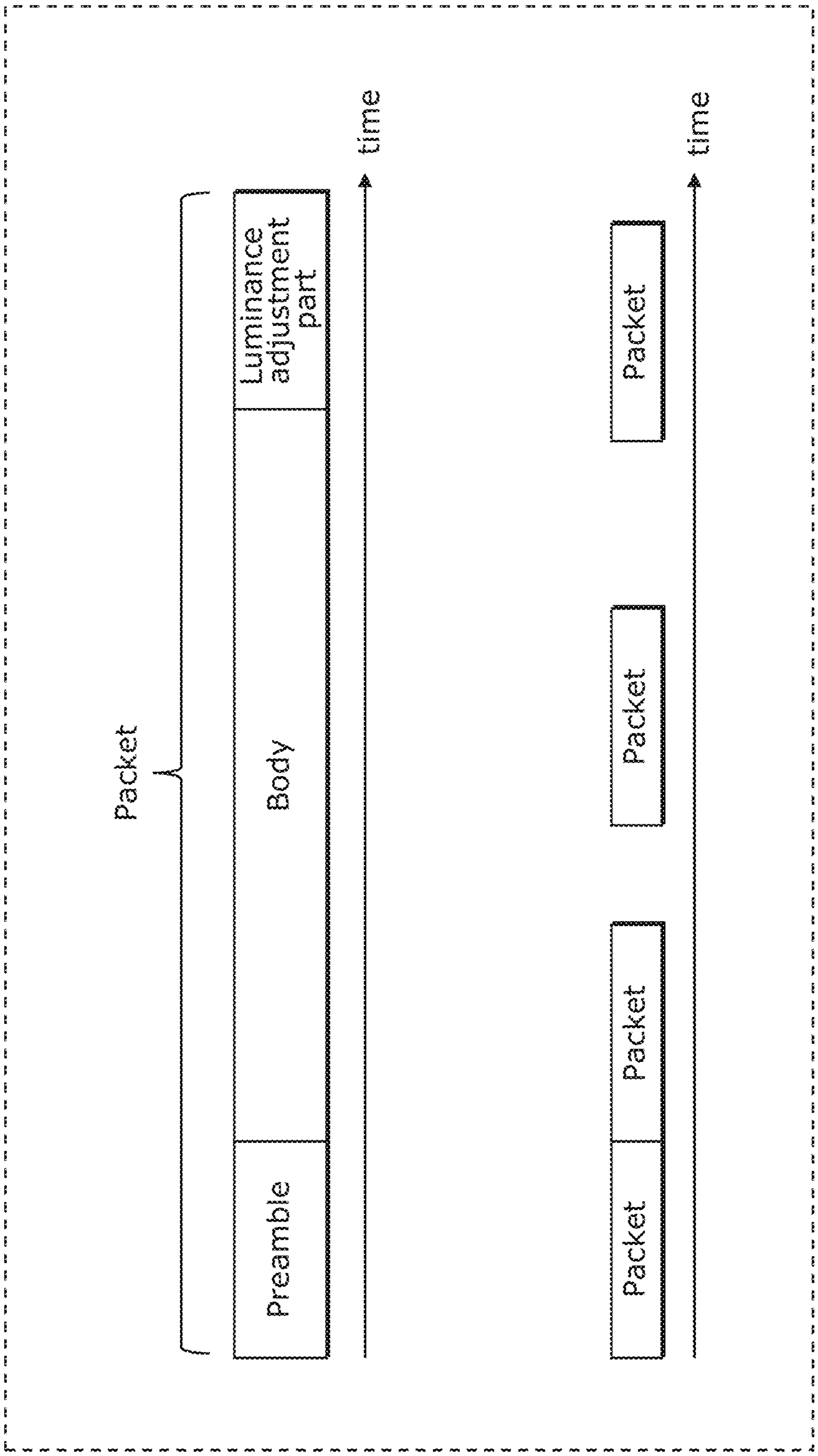
Figure 434:
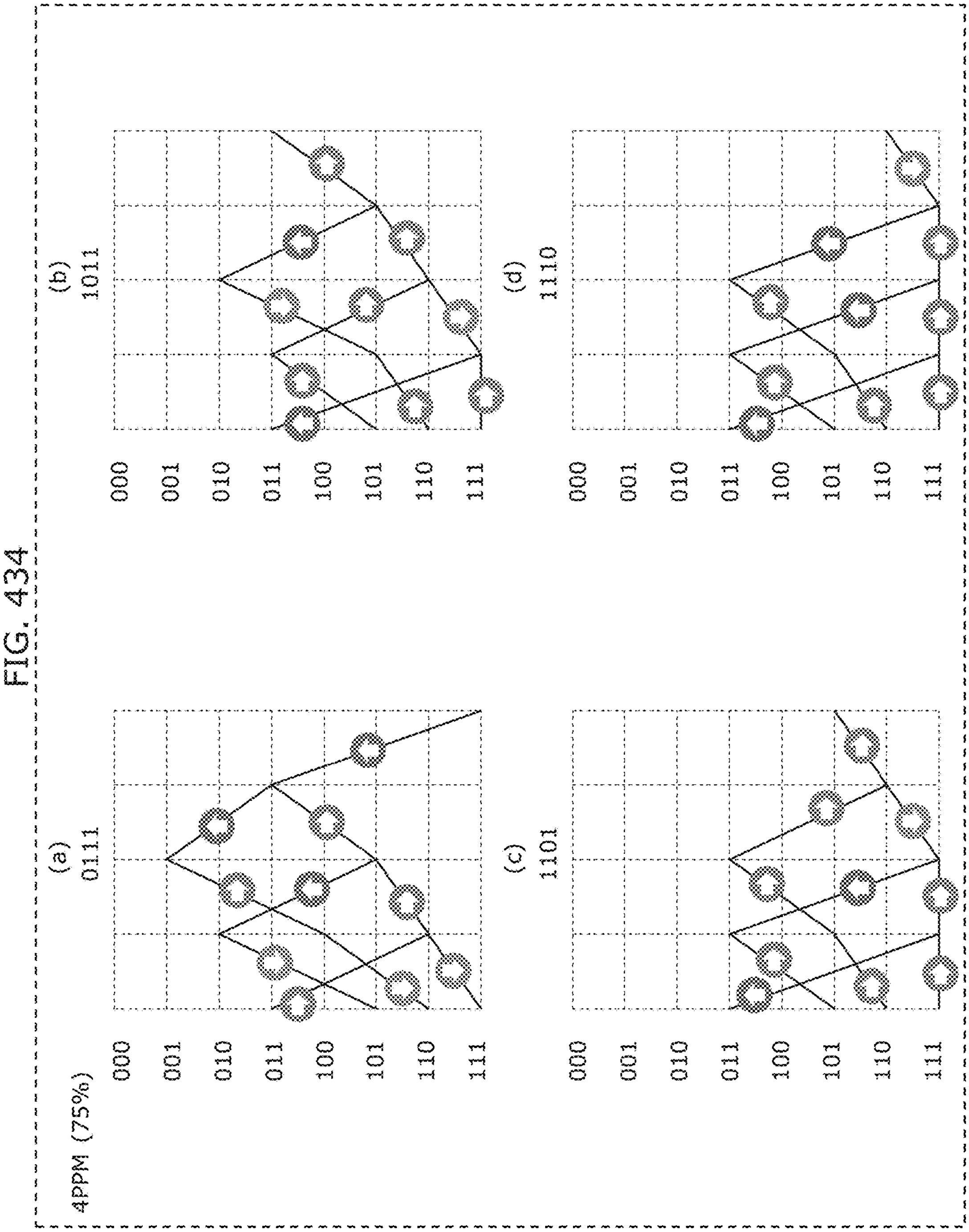
Figure 435:
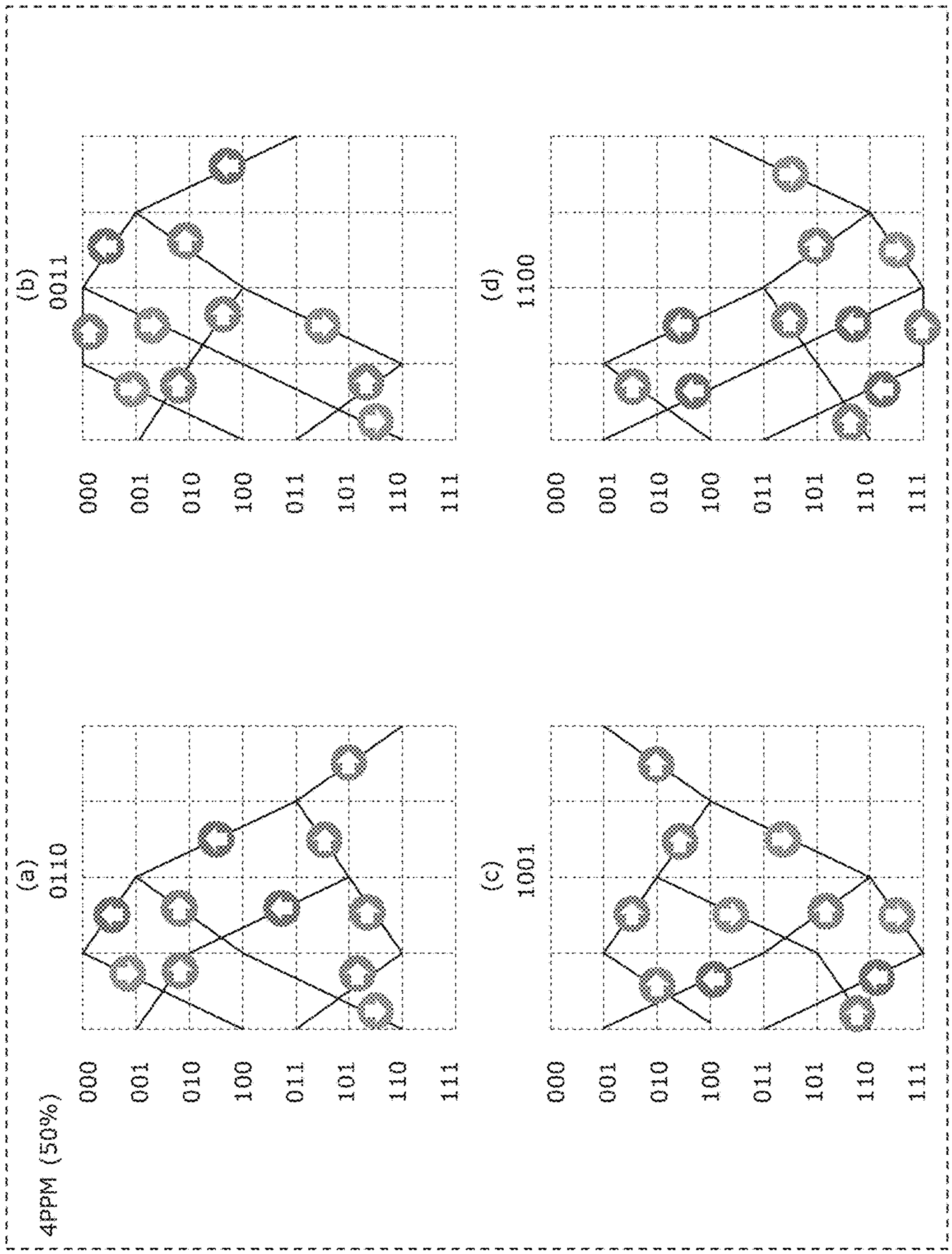
Figure 436:
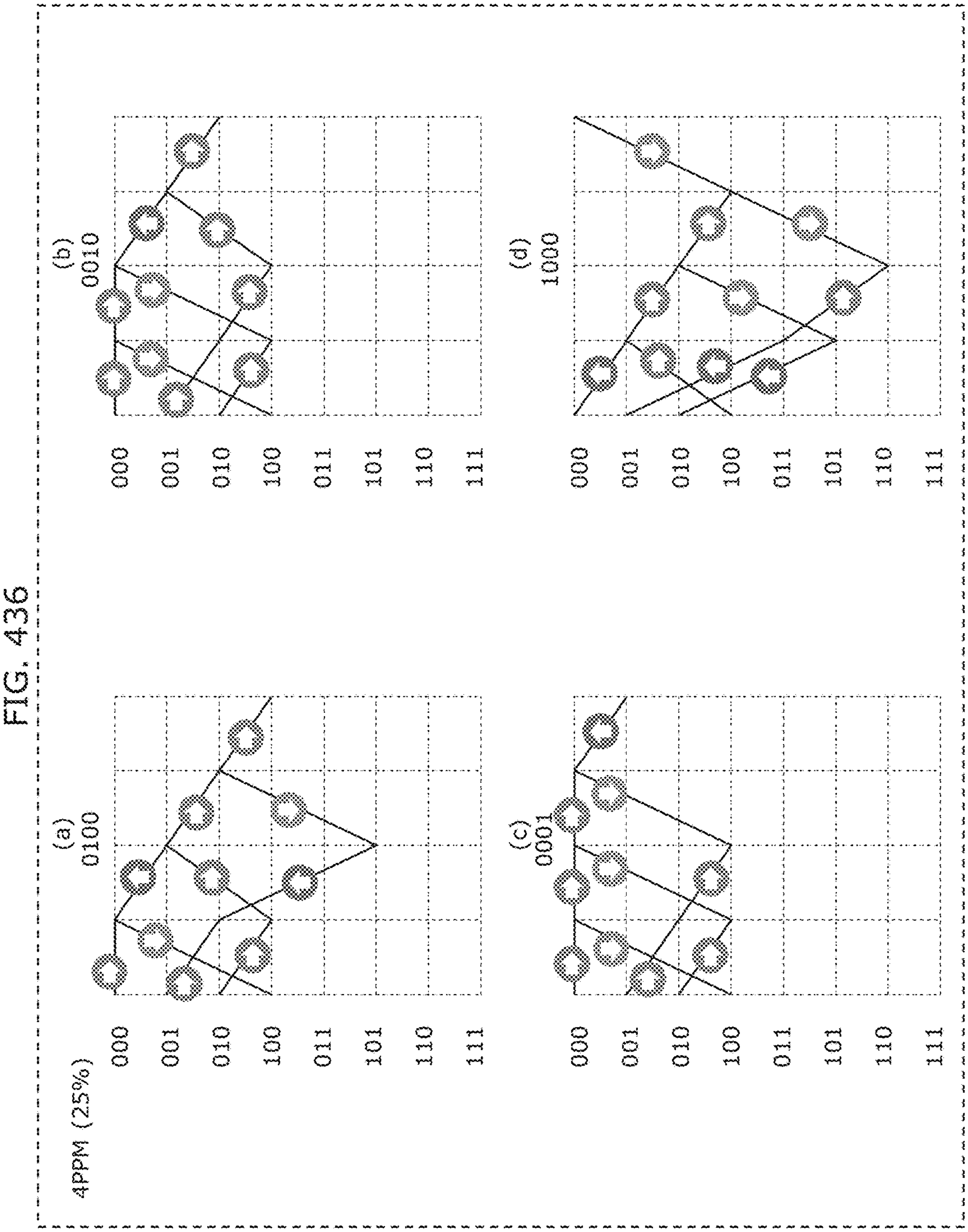
Figure 437:
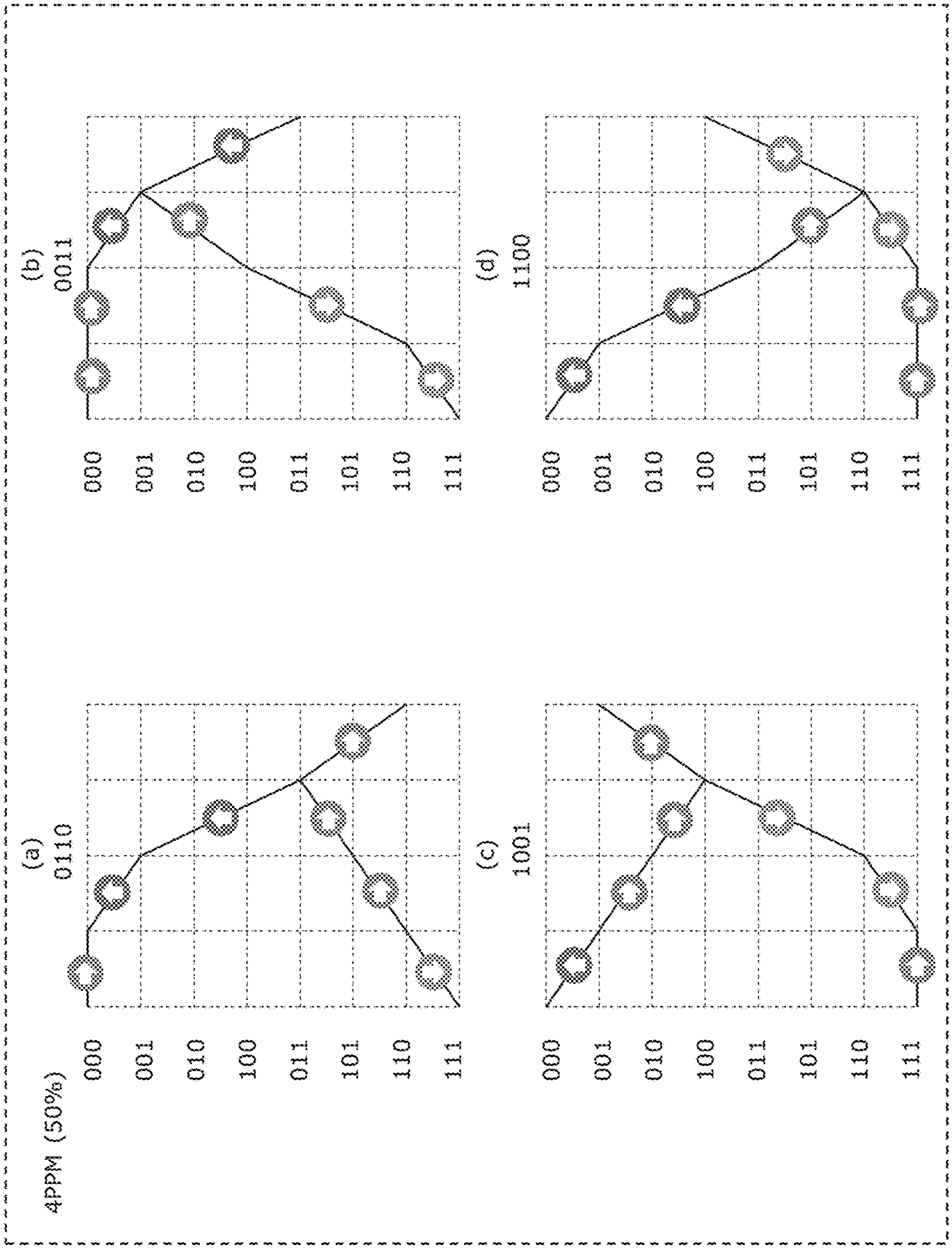
Figure 438:
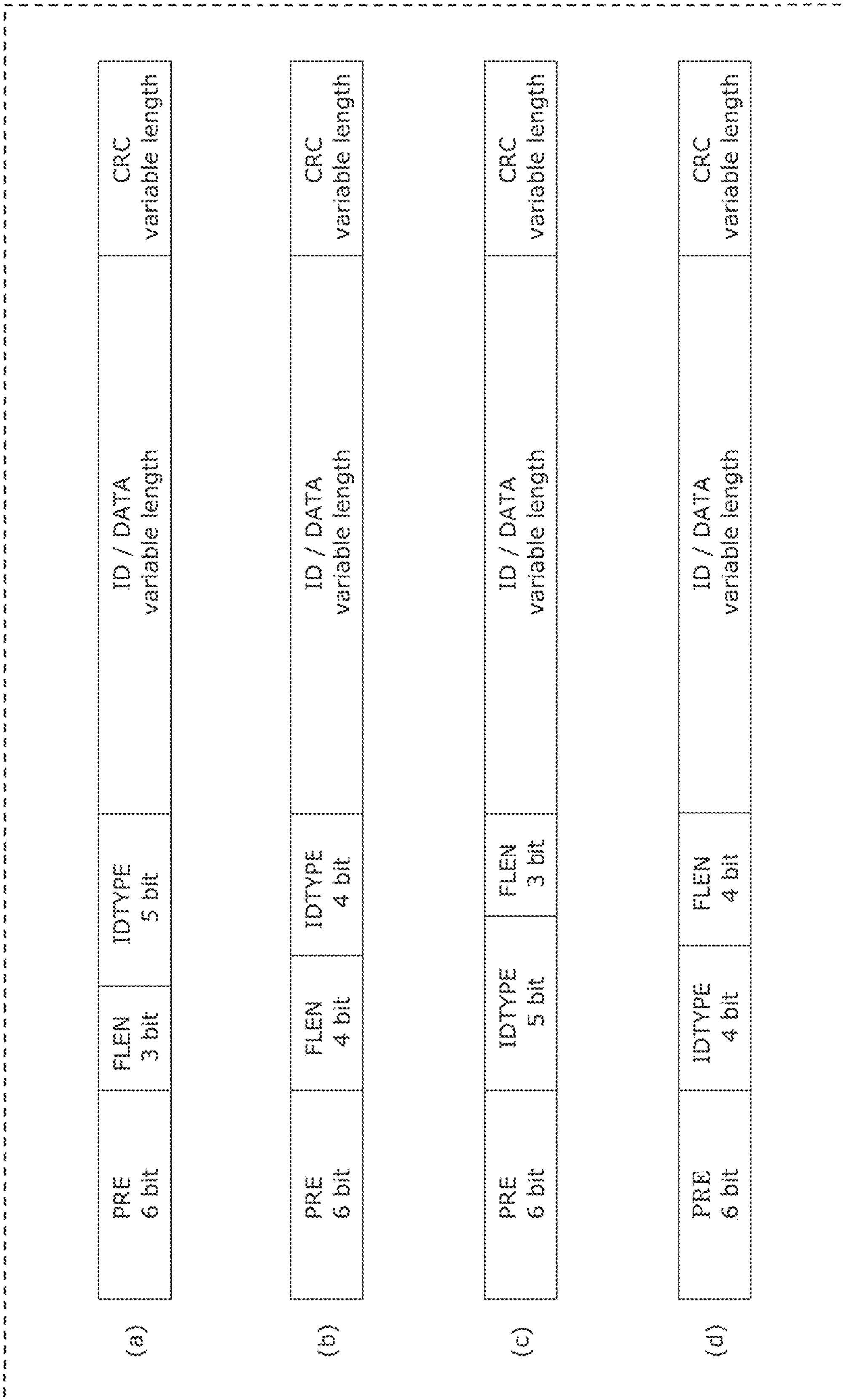
Figure 439:
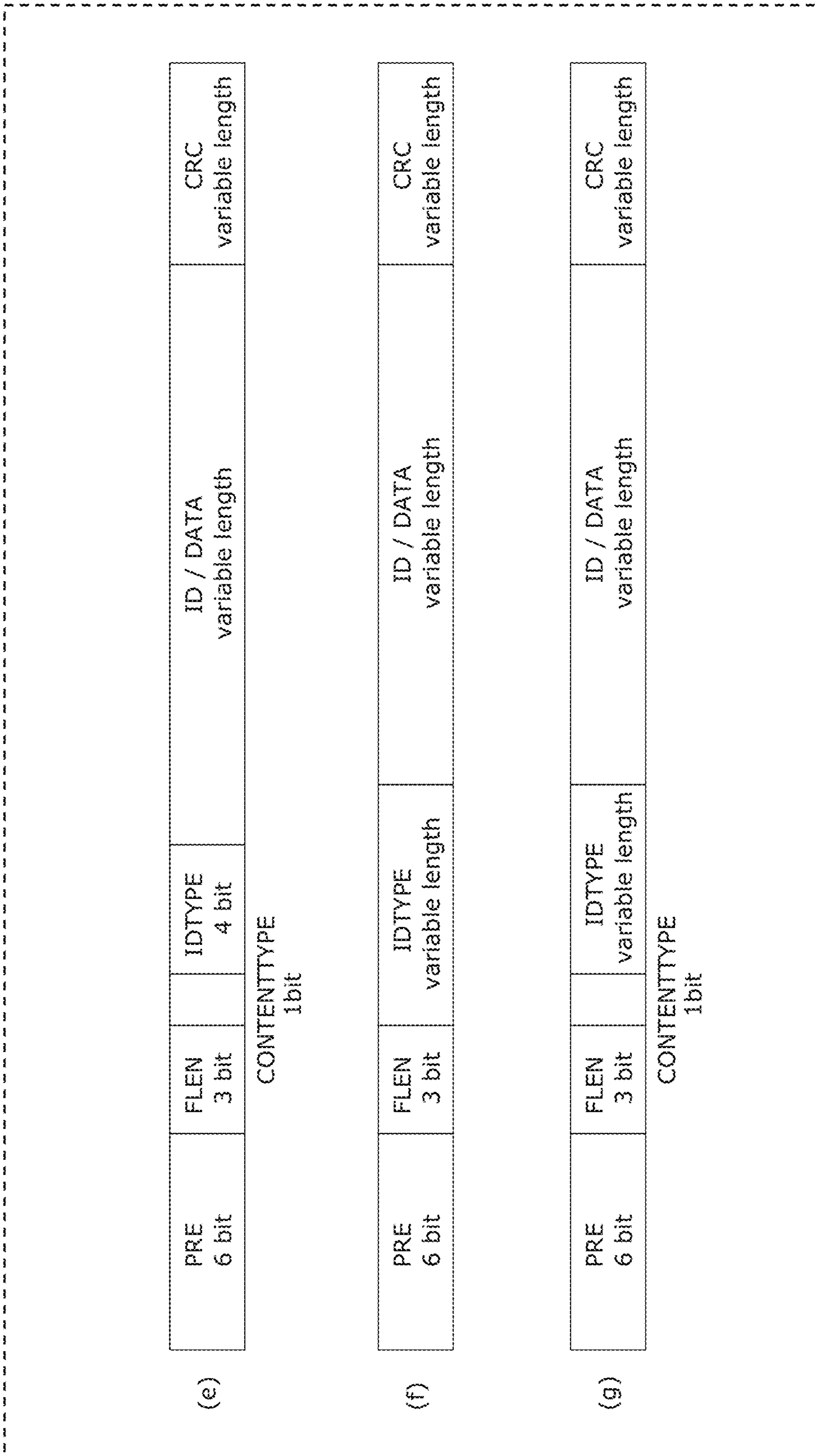
Figure 440:
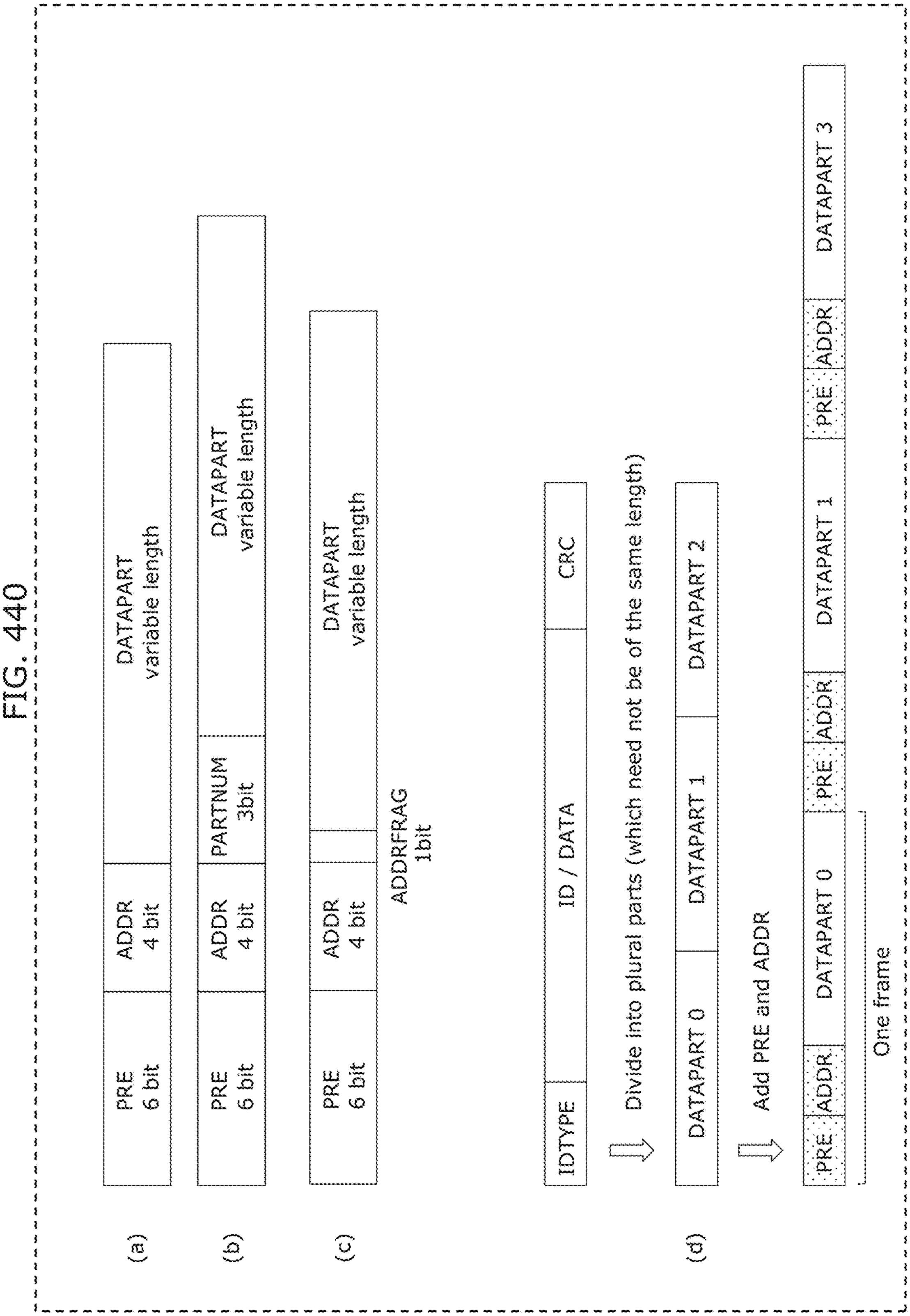
Figure 446:
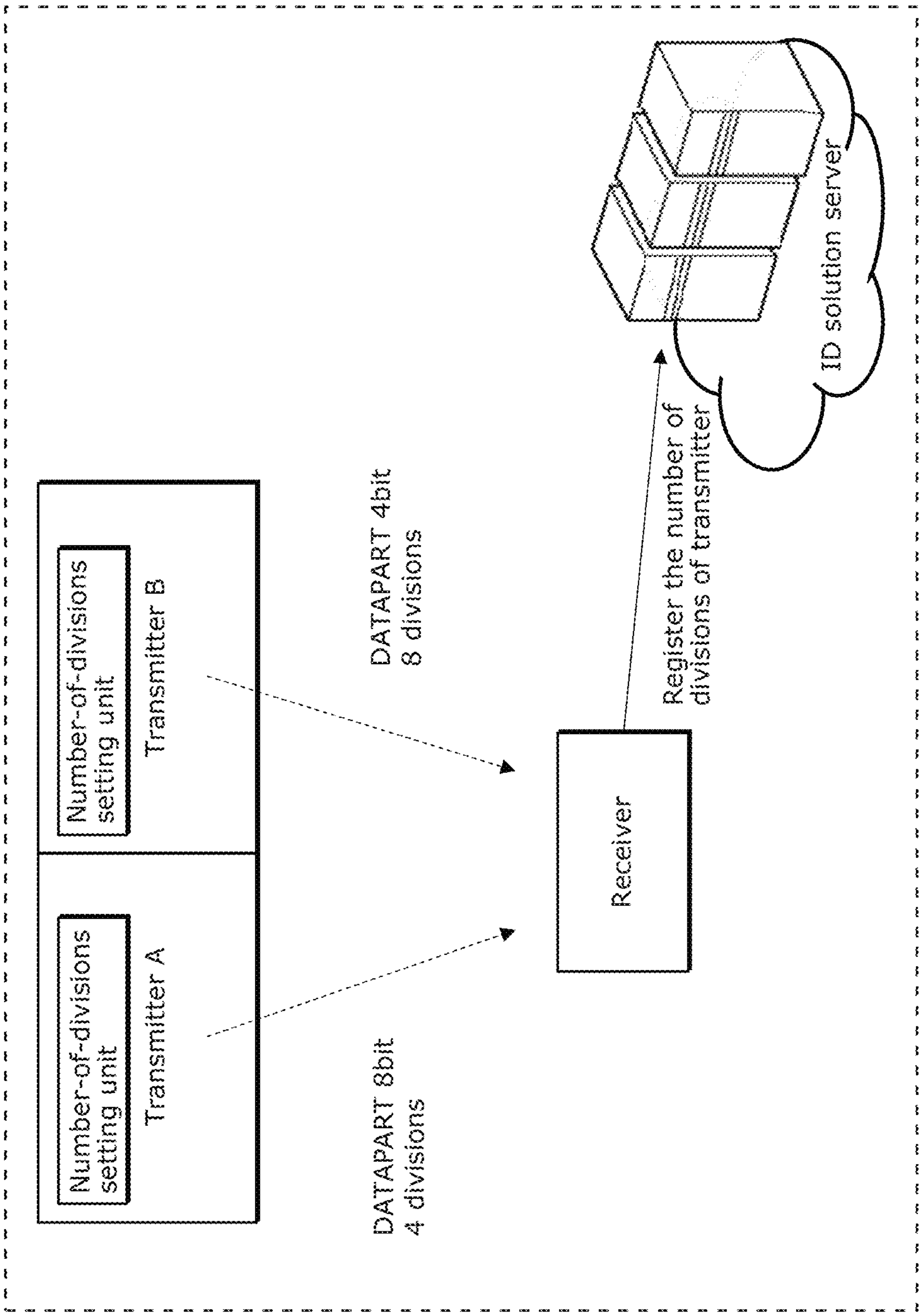
Figure 447:
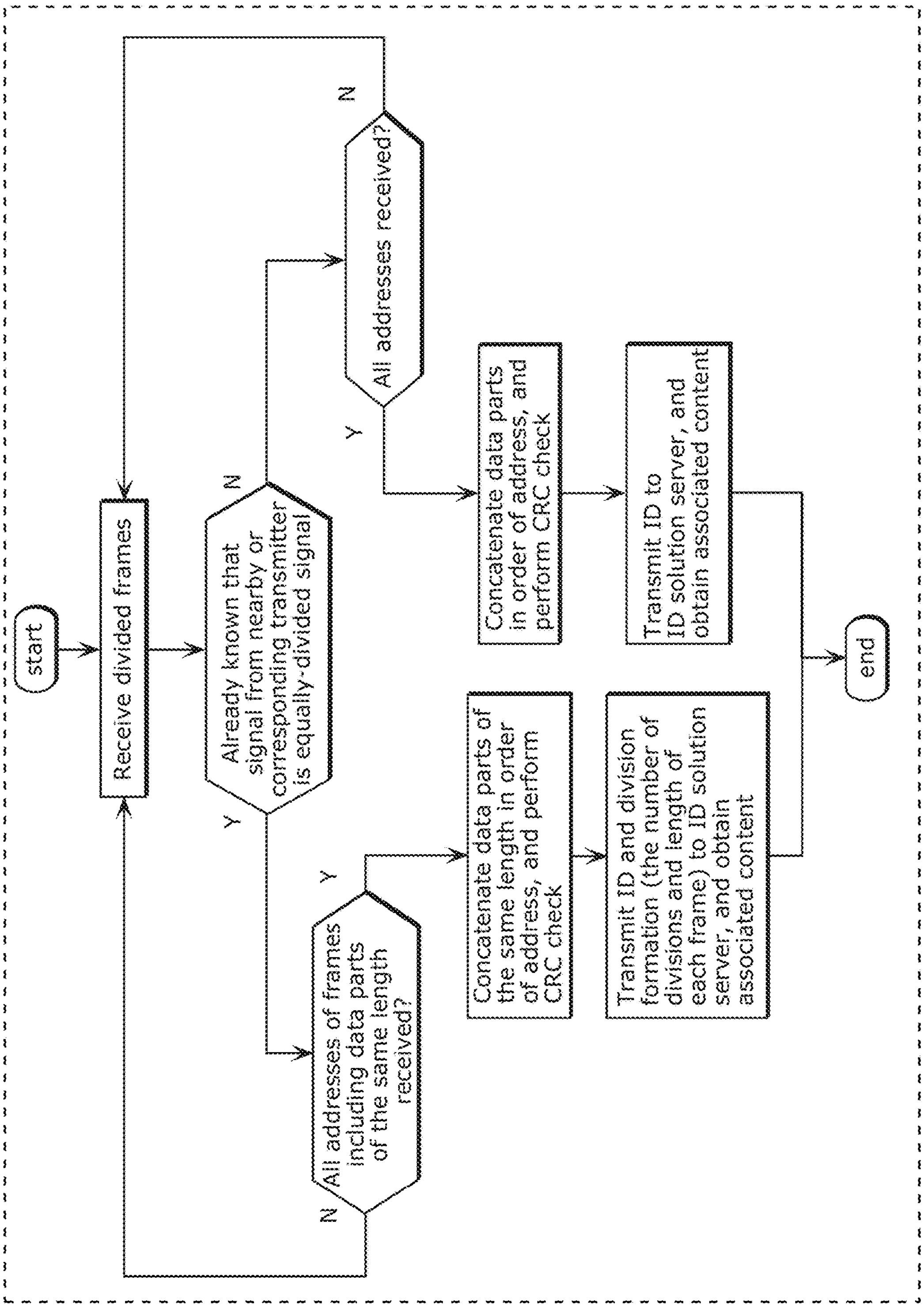
Figure 448:
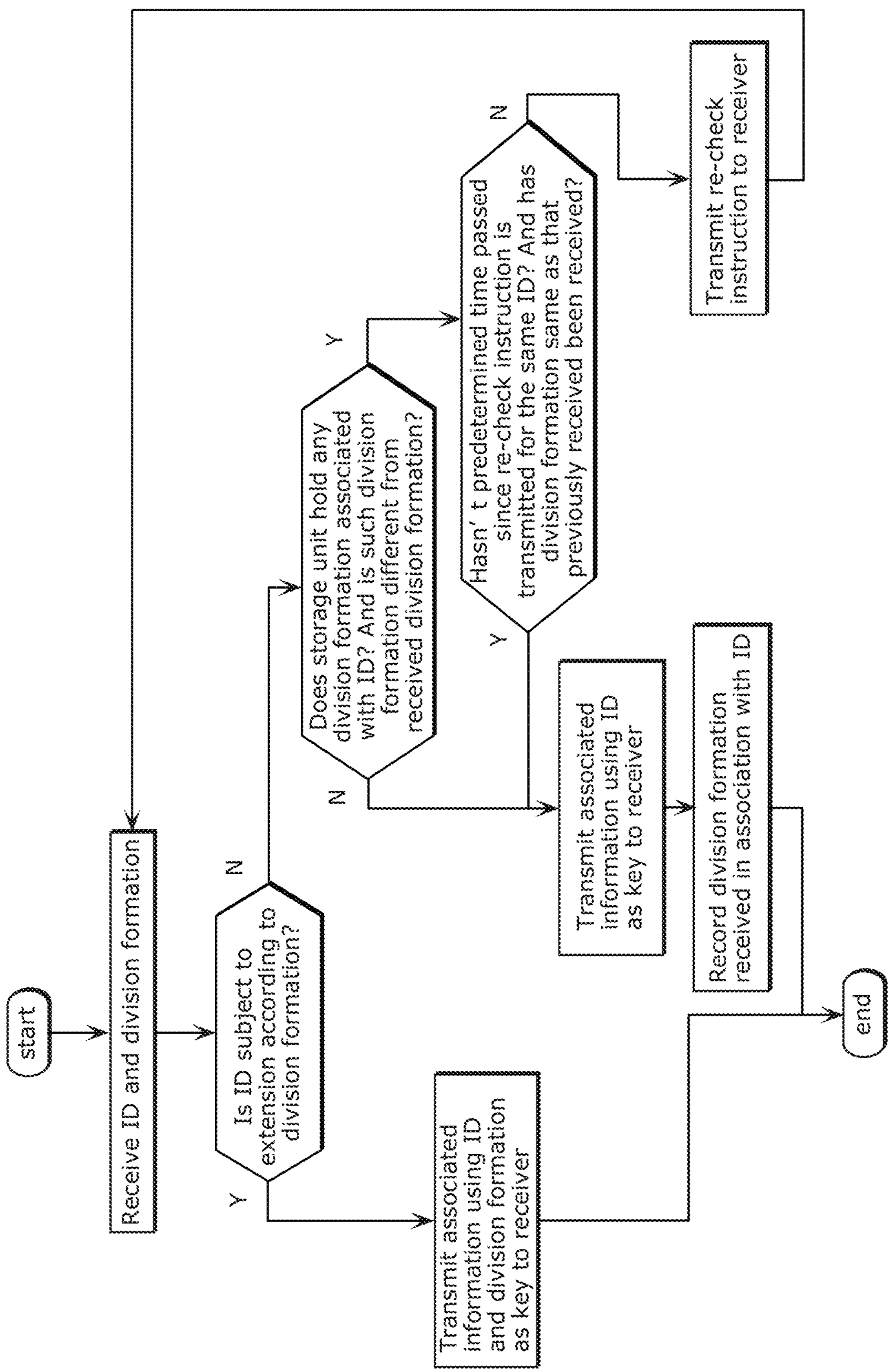
Figure 449:
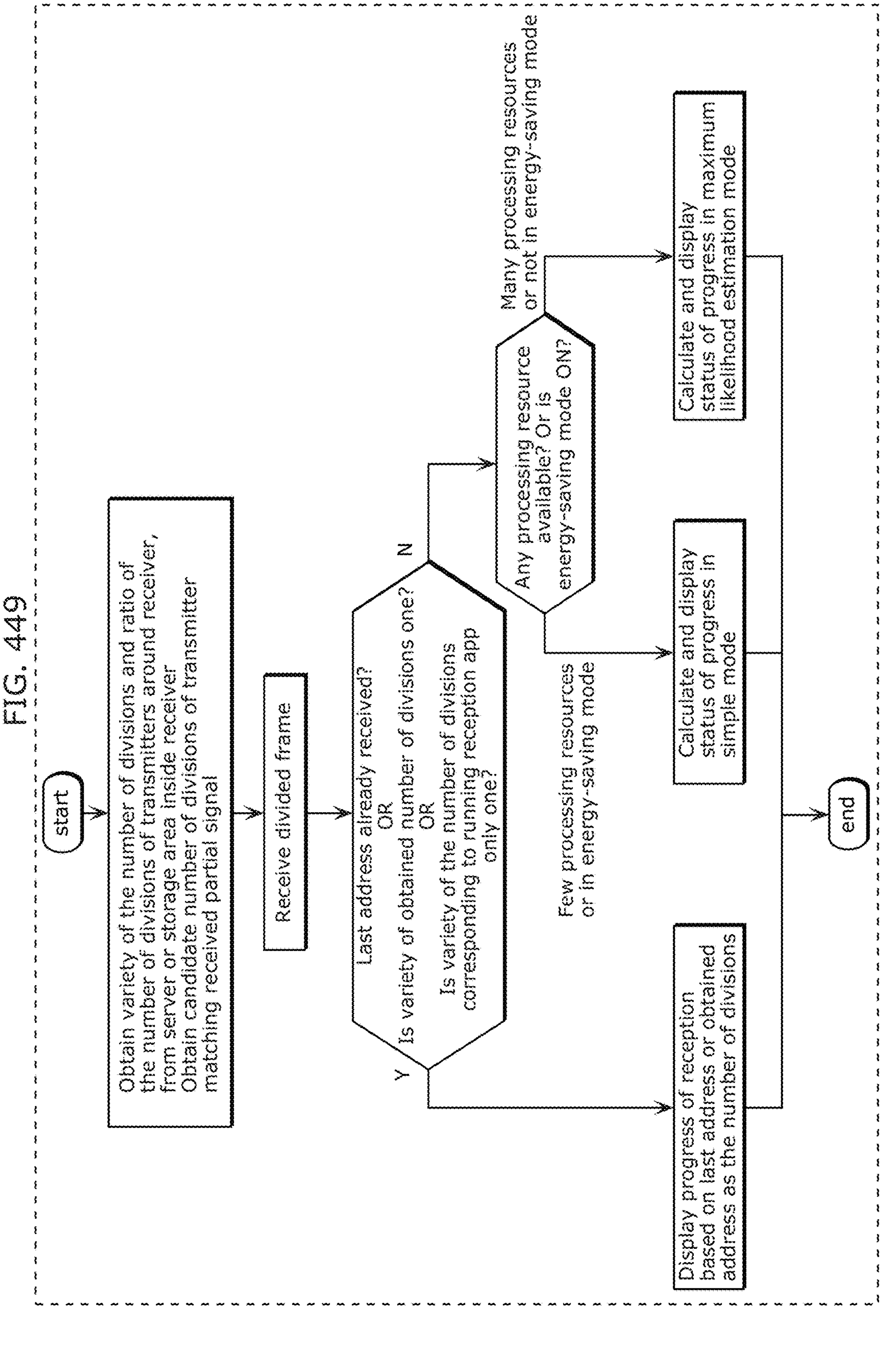
Figure 450:
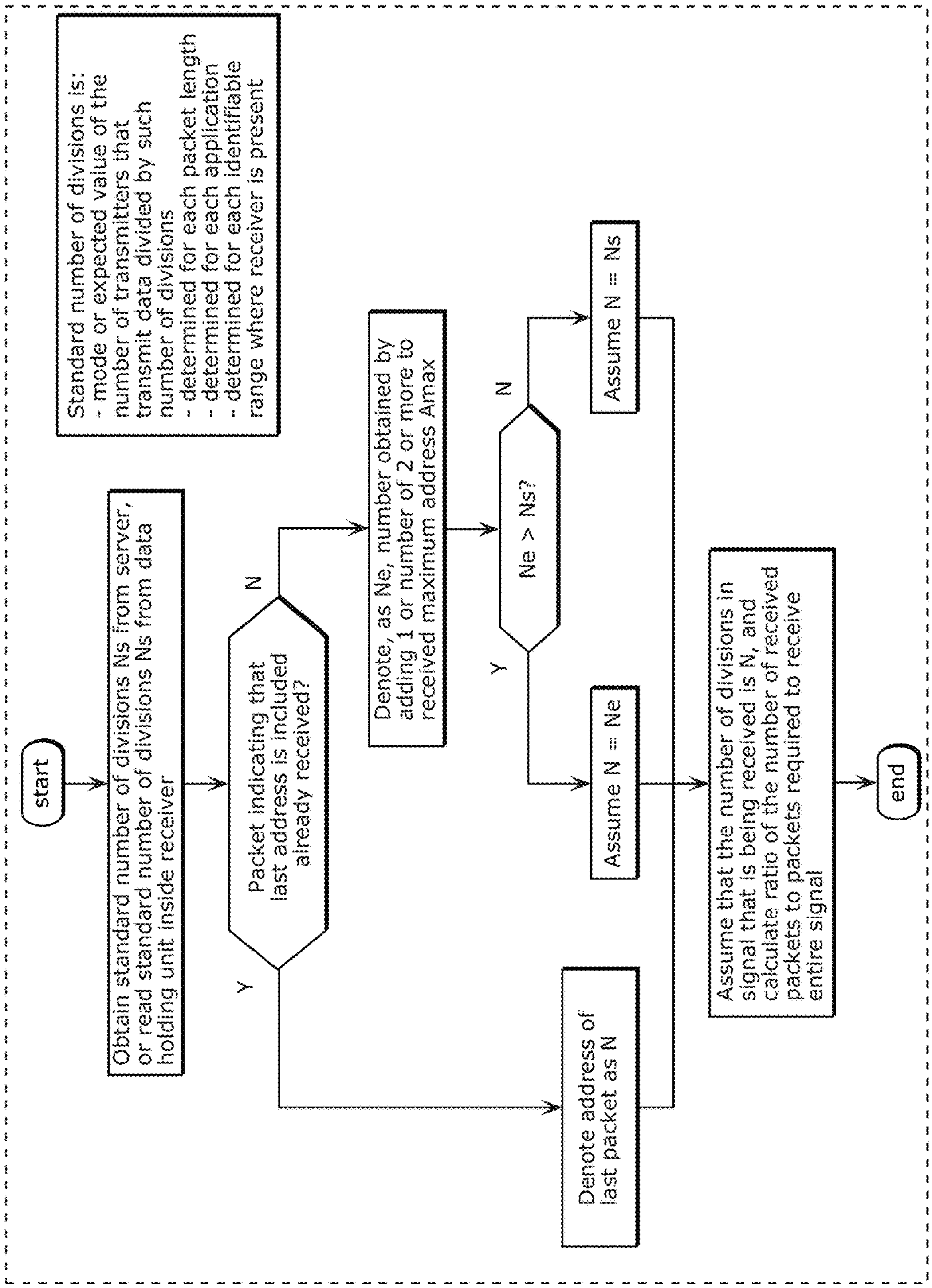
Figure 452:
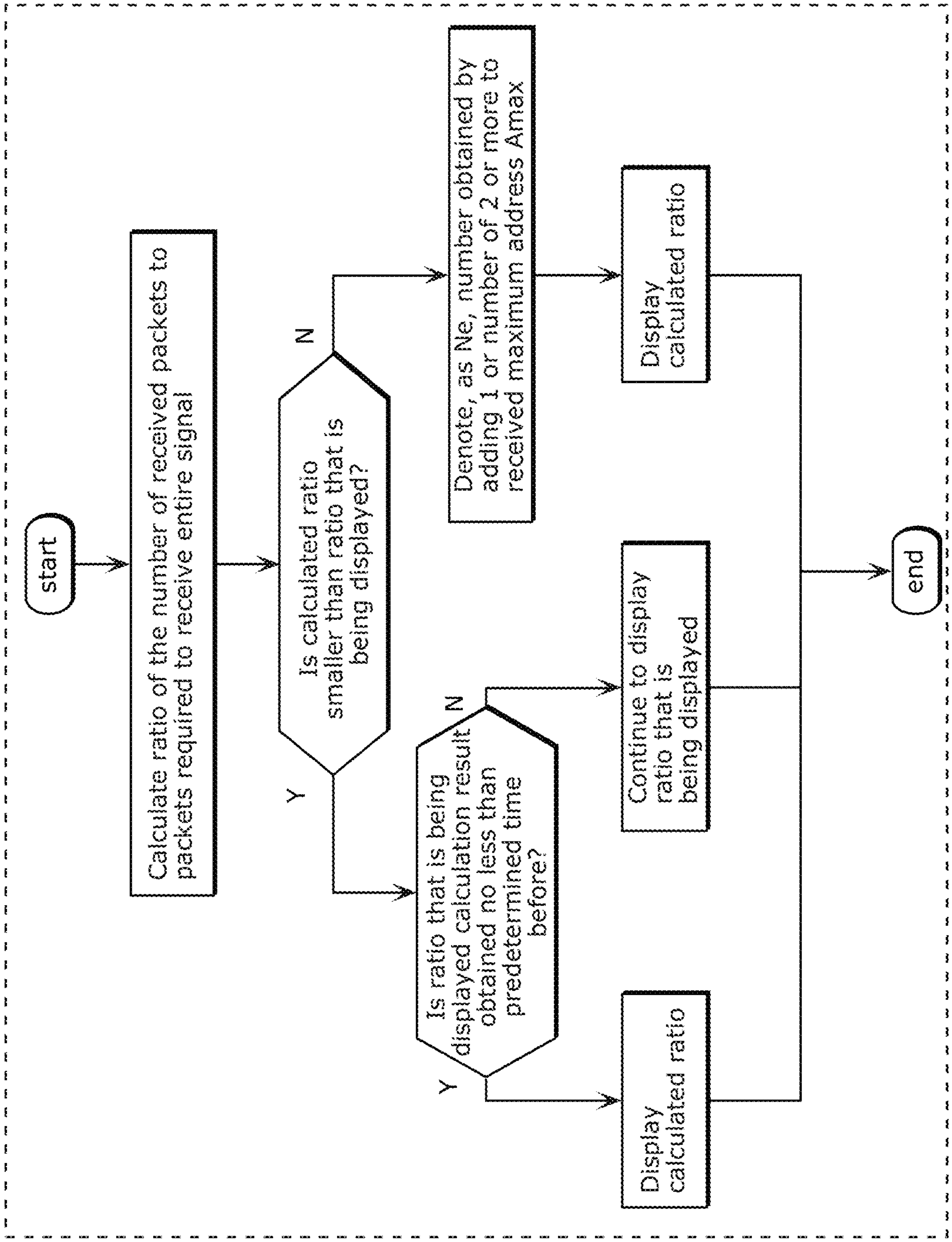
Figure 453:
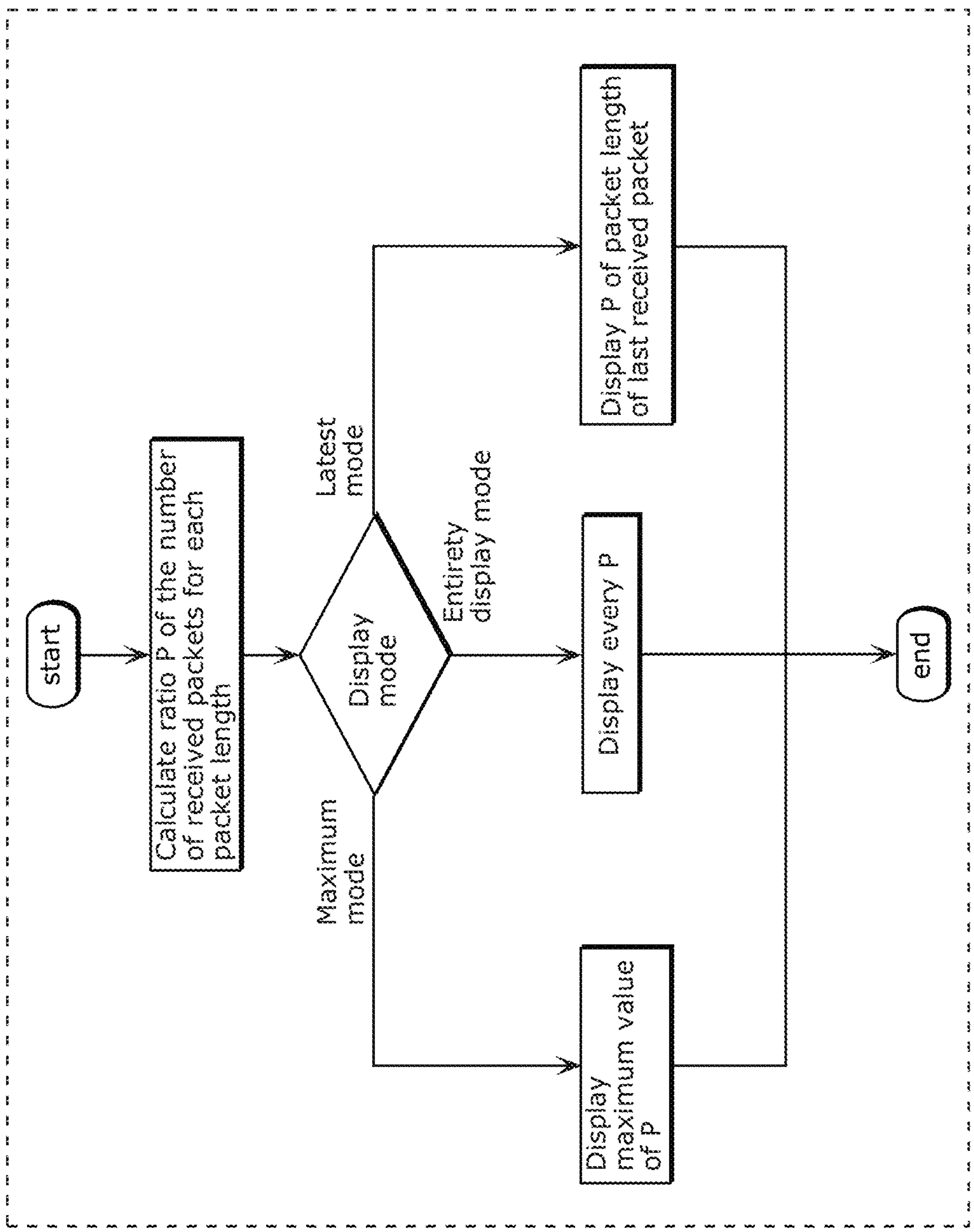
Figure 454:
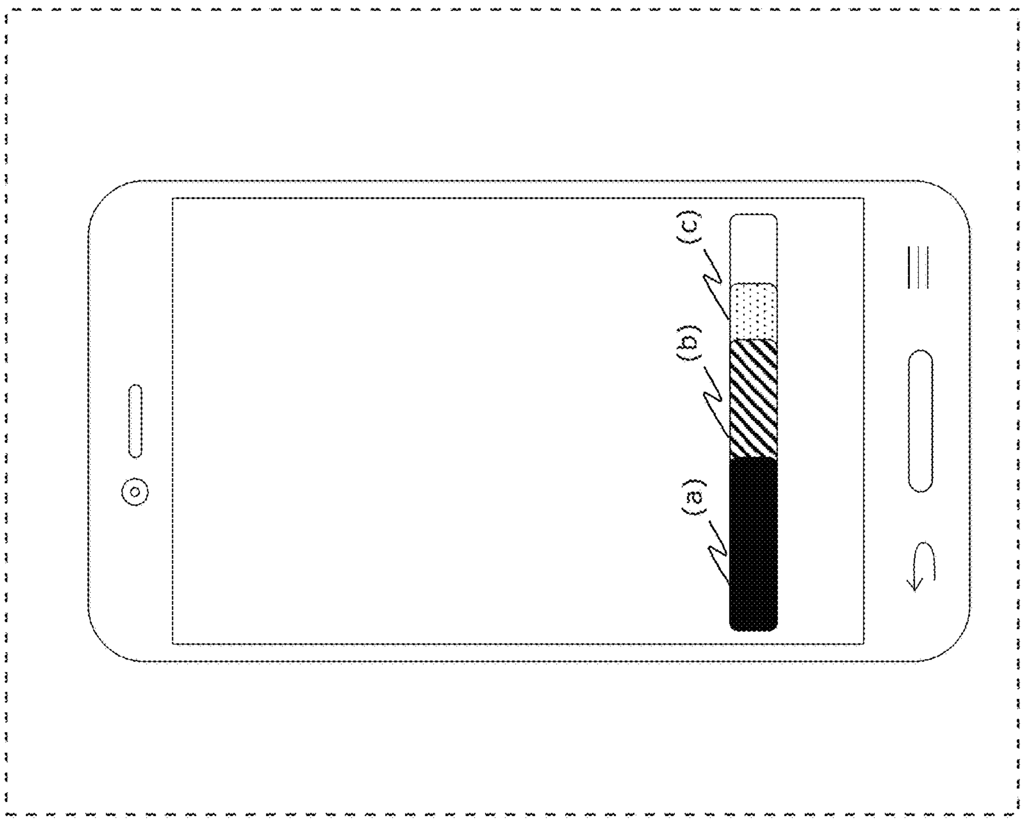
Figure 456:
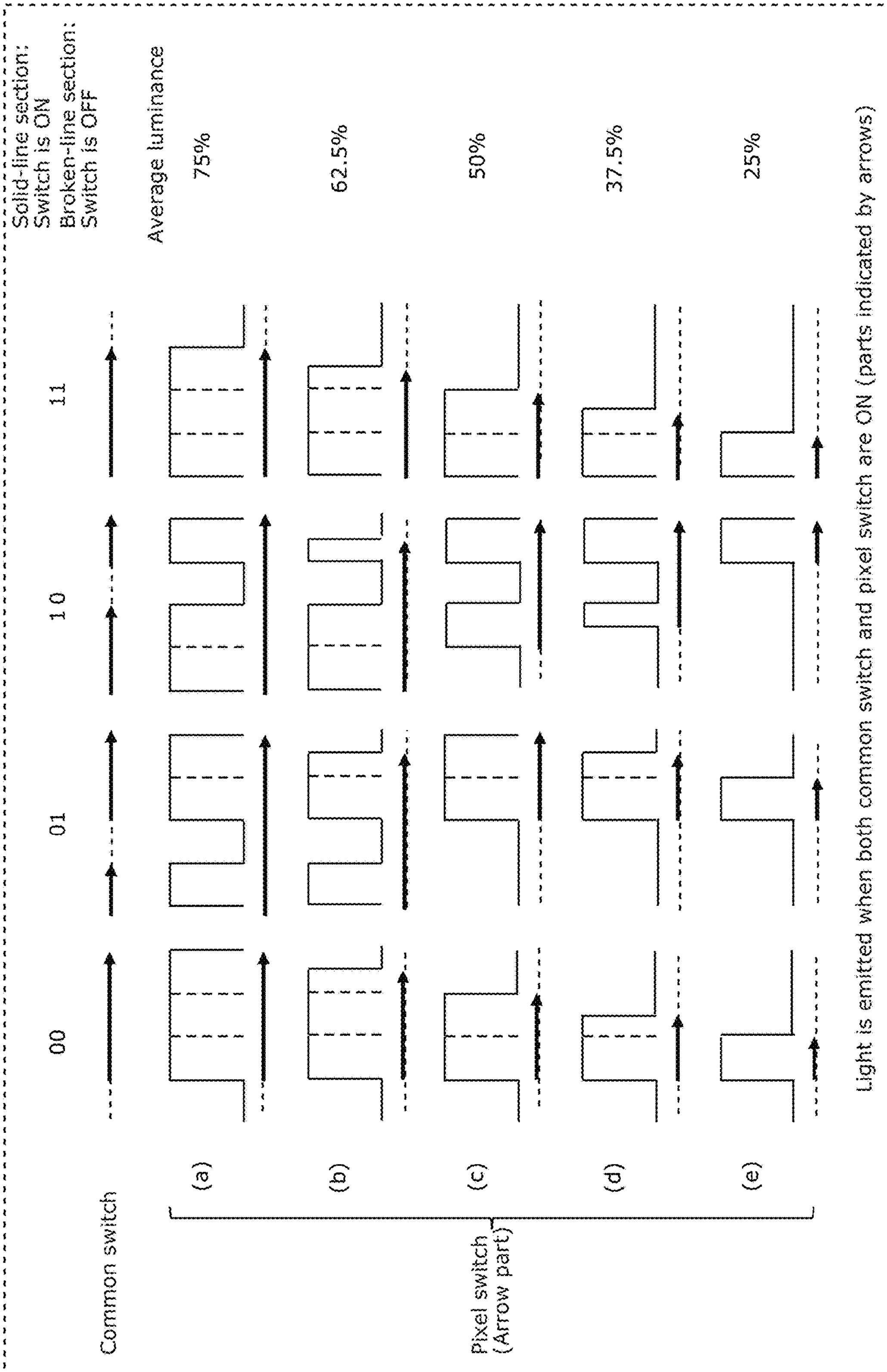
Figure 457:
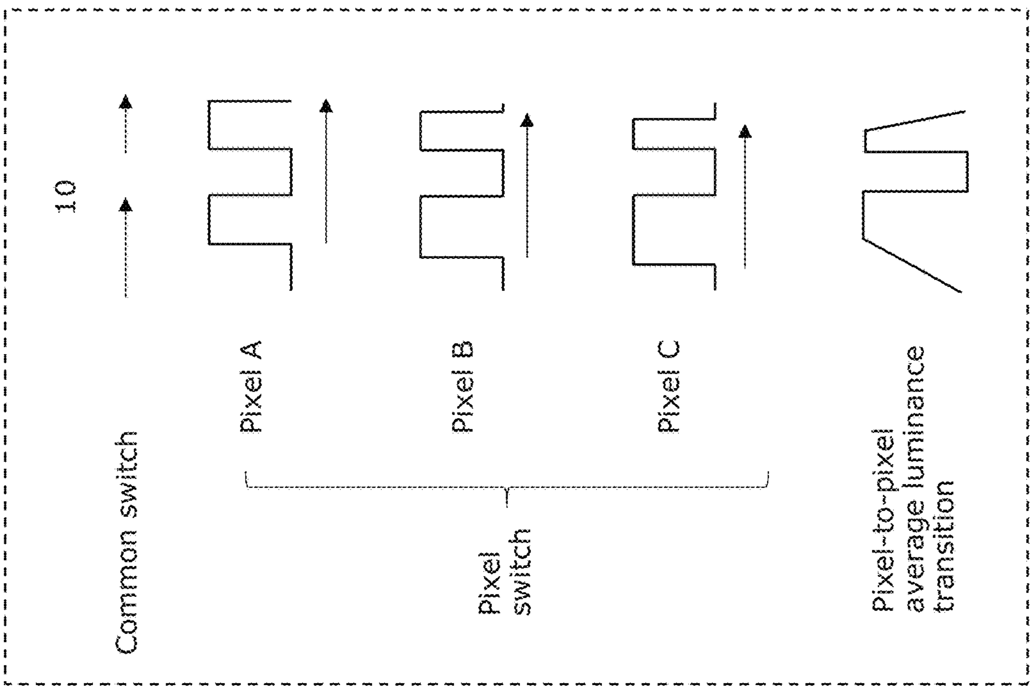
Figure 458:
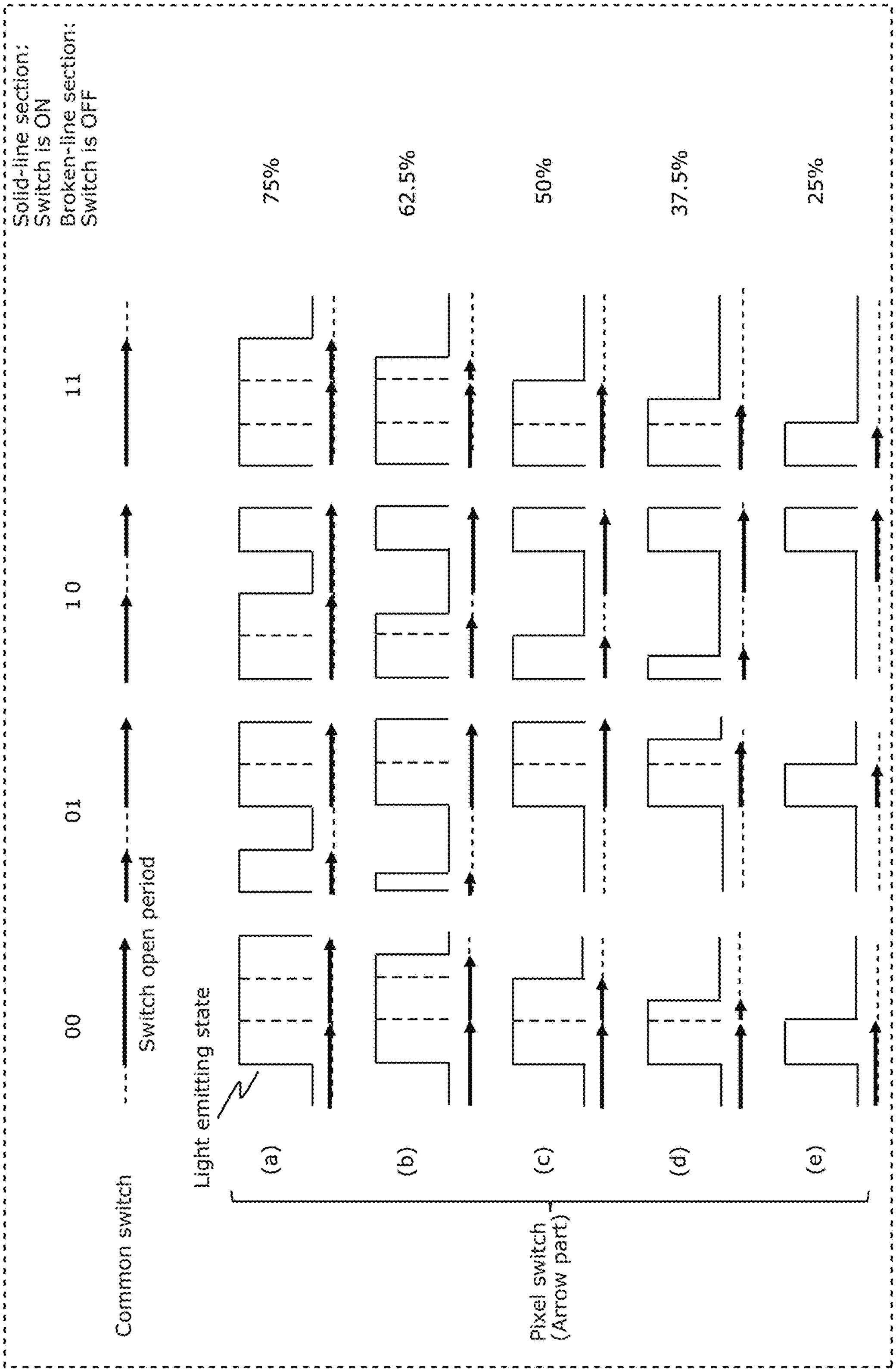
Figure 459:
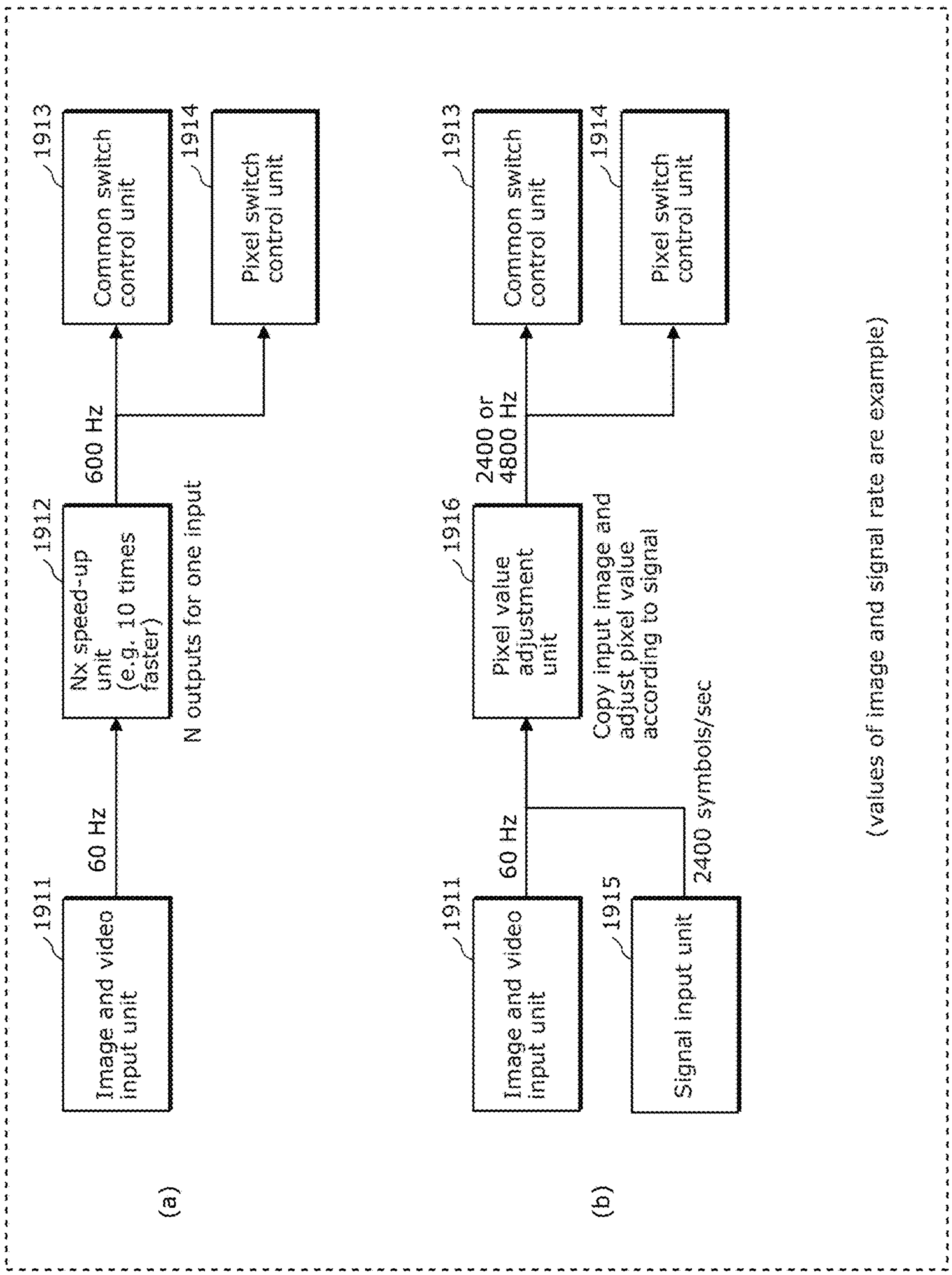
Figure 460:
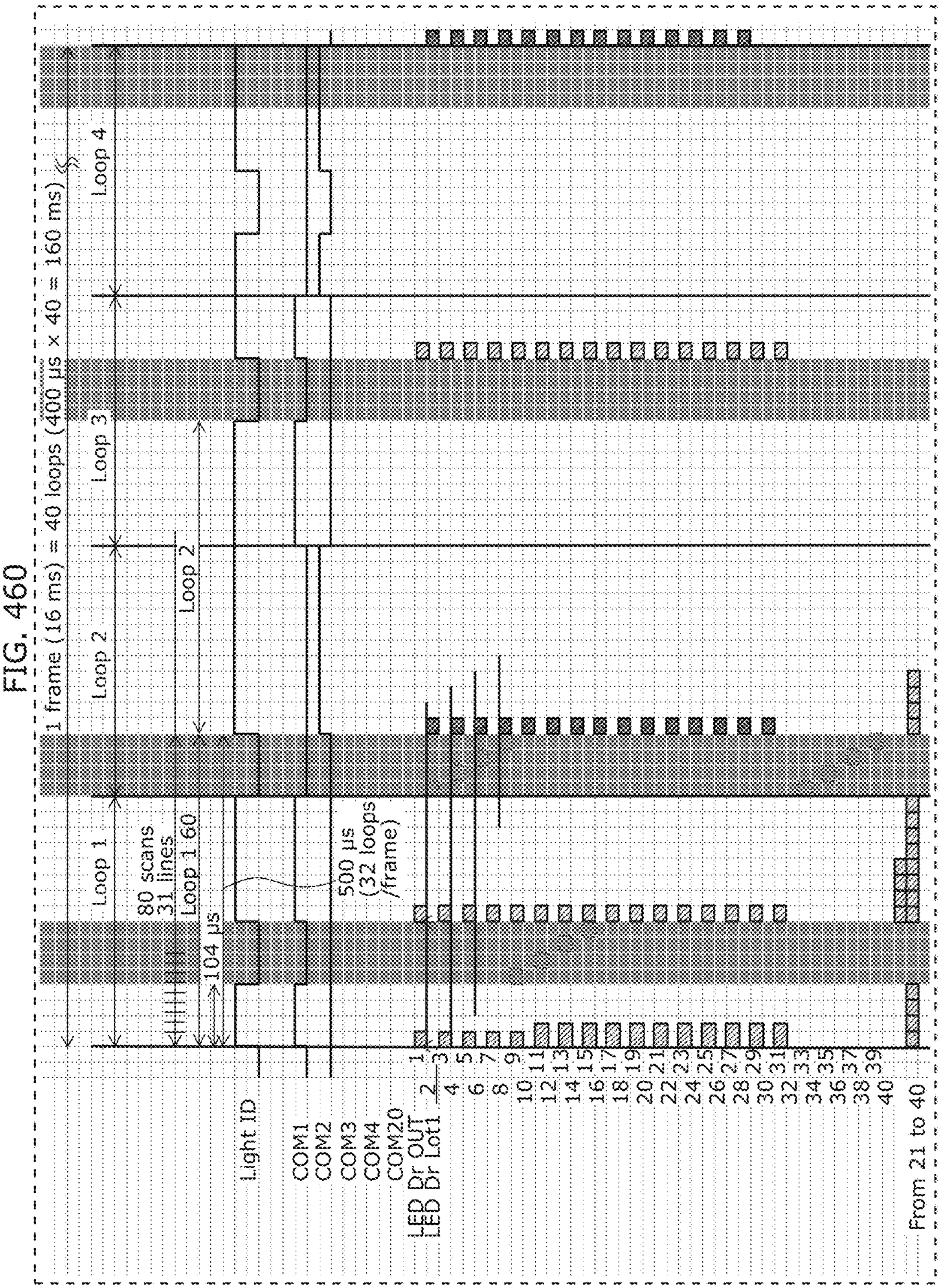
Figure 461:
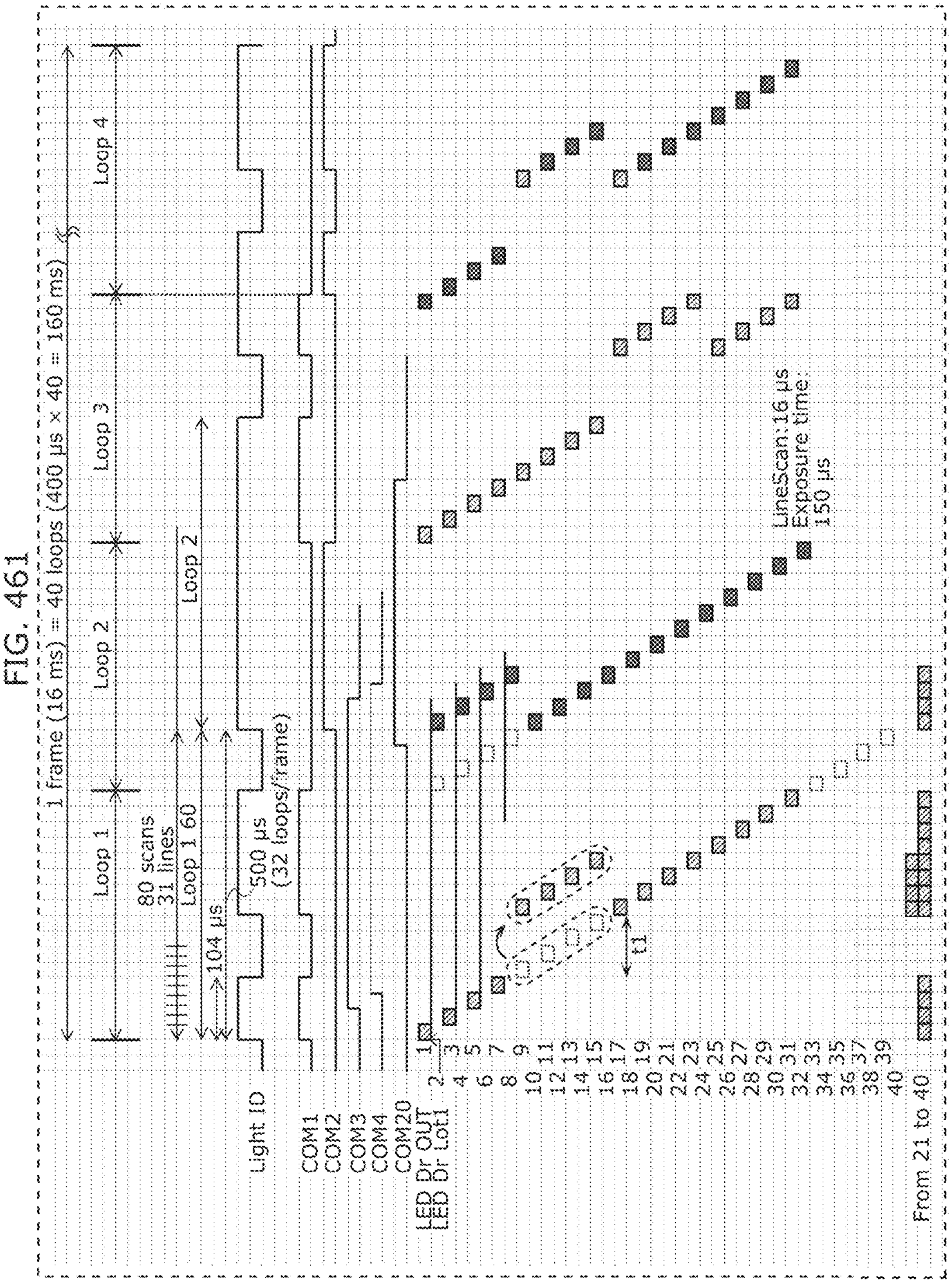
Figure 462:
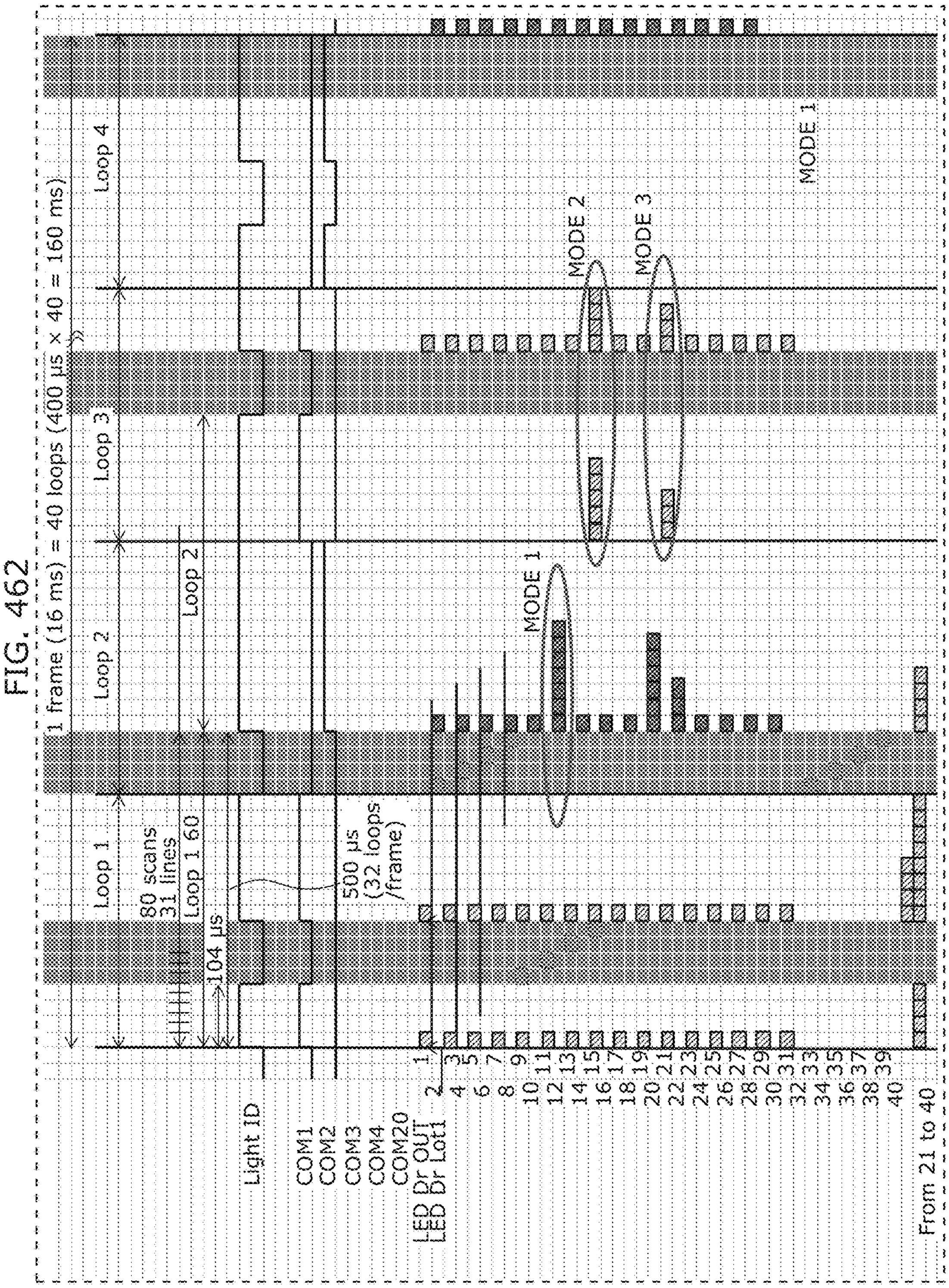
Figure 463A:
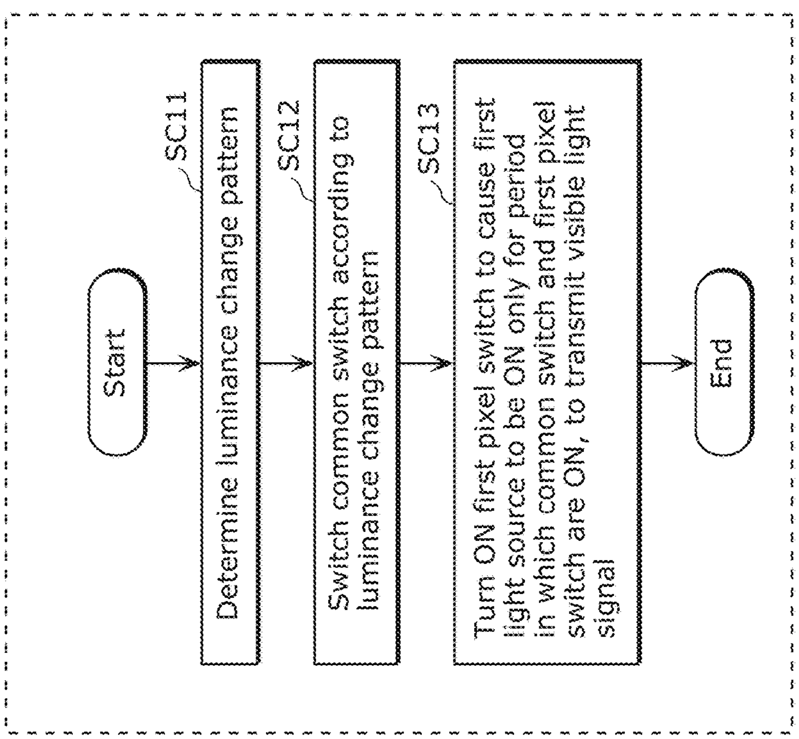
Figure 463B:
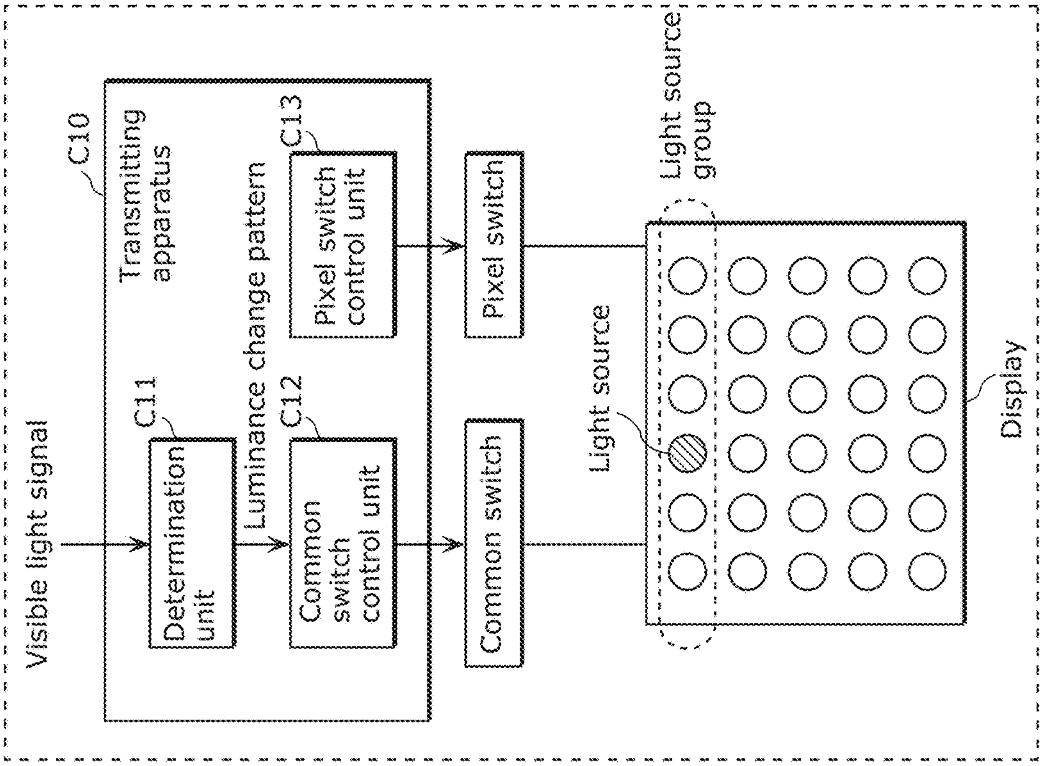
Figure 465:
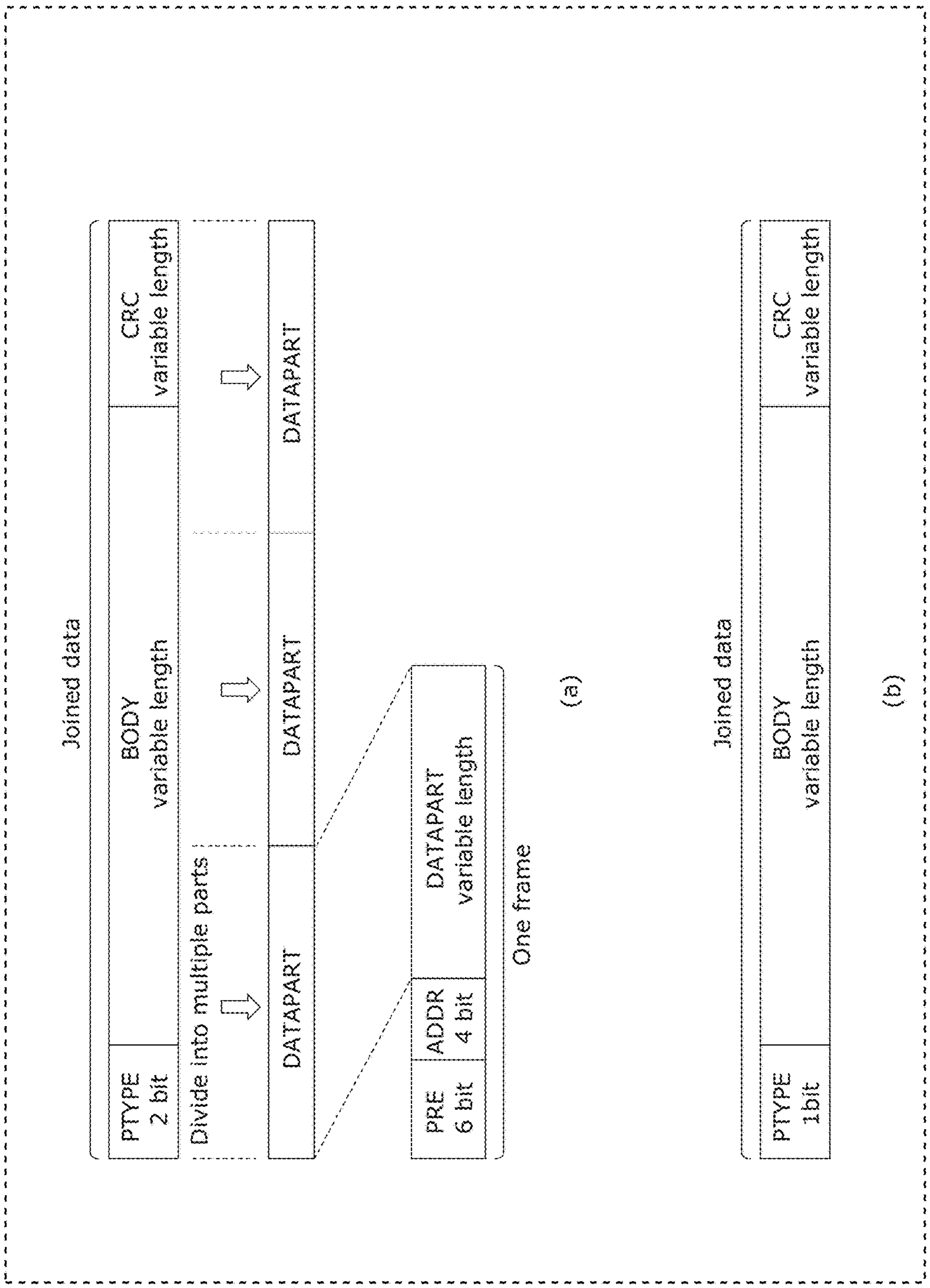
Figure 467:
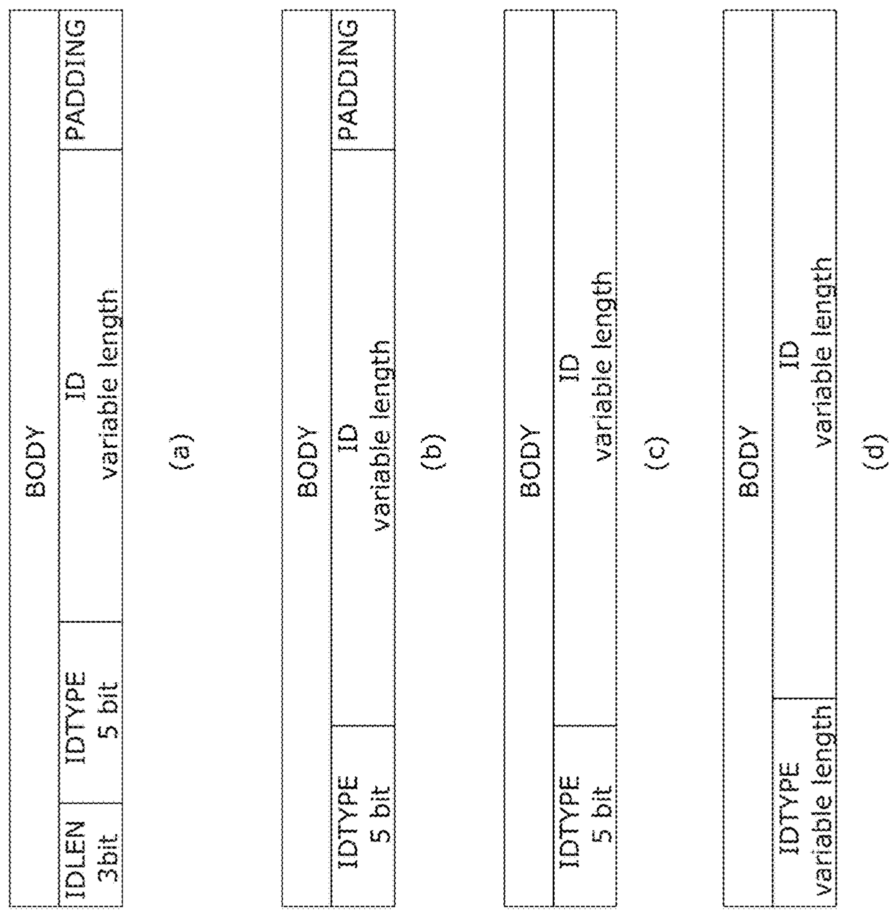
Figure 470A:
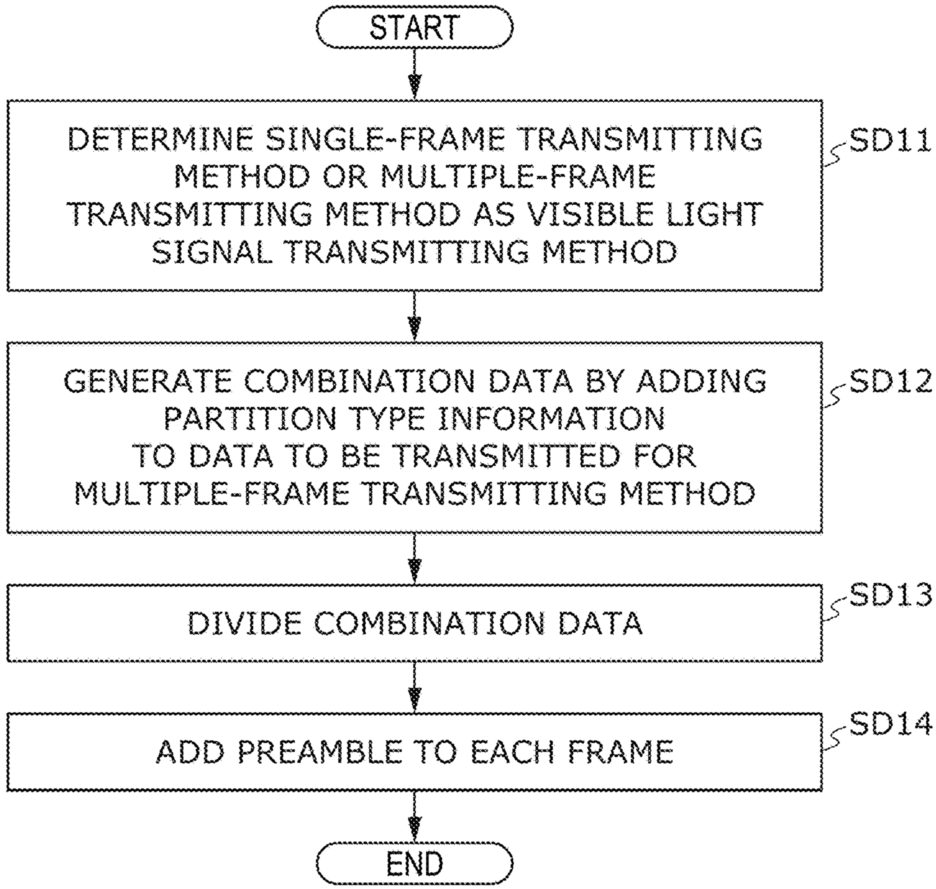
Figure 470B:
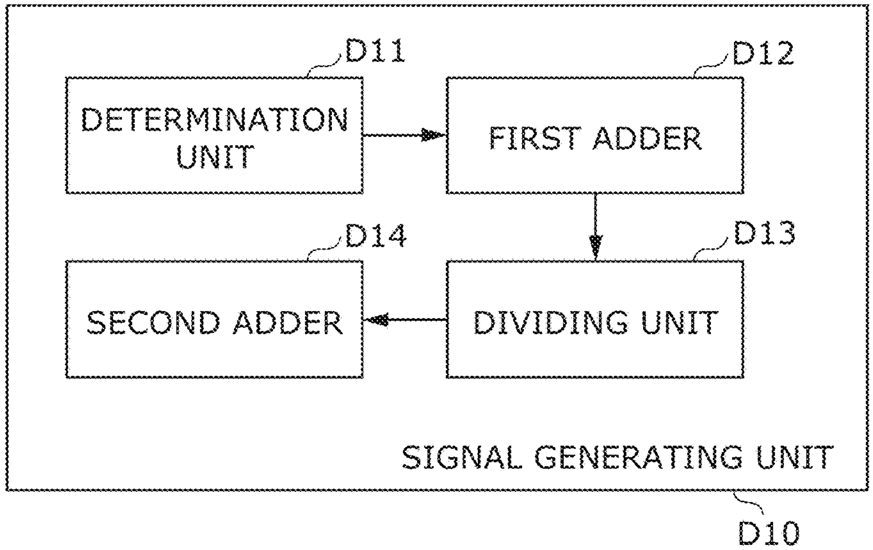

FIG. 249 is a flowchart illustrating a signal reception method in the case of a long exposure time in Embodiment 10;

FIG. 250 is a diagram illustrating an example of a transmitter light adjustment (brightness adjustment) method in Embodiment 10;

FIG. 251 is a diagram illustrating an exemplary method of performing a transmitter light adjustment function in Embodiment 10;

FIG. 252A is a flowchart illustrating an example of operation of a receiver in Embodiment 11;

FIG. 252B is a flowchart illustrating an example of operation of a receiver in Embodiment 11;

FIG. 252C is a flowchart illustrating an example of operation of a receiver in Embodiment 11;

FIG. 252D is a flowchart illustrating an example of operation of a receiver in Embodiment 11;

FIG. 253 is a diagram for describing EX zoom;

FIG. 254A is a flowchart illustrating processing of a reception program in Embodiment 10;

FIG. 254B is a block diagram of a reception device in Embodiment 10;

FIG. 255 is a diagram illustrating an example of a signal reception method in Embodiment 12;

FIG. 256 is a diagram illustrating an example of a signal reception method in Embodiment 12;

FIG. 257 is a diagram illustrating an example of a signal reception method in Embodiment 12;

FIG. 258 is a diagram illustrating an example of a screen display method used by a receiver in Embodiment 12;

FIG. 259 is a diagram illustrating an example of a signal reception method in Embodiment 12;

FIG. 260 is a diagram illustrating an example of a signal reception method in Embodiment 12;

FIG. 261 is a flowchart illustrating an example of a signal reception method in Embodiment 12;

FIG. 262 is a diagram illustrating an example of a signal reception method in Embodiment 12;

FIG. 263A is a flowchart illustrating processing of a reception program in Embodiment 12;

FIG. 263B is a block diagram of a reception device in Embodiment 12;

FIG. 264 is a diagram illustrating an example of what is displayed on a receiver when a visible light signal is received;

FIG. 265 is a diagram illustrating an example of what is displayed on a receiver when a visible light signal is received;

FIG. 266 is a diagram illustrating a display example of obtained data image;

FIG. 267 is a diagram illustrating an operation example for storing or discarding obtained data;

FIG. 268 is a diagram illustrating an example of what is displayed when obtained data is browsed;

FIG. 269 is a diagram illustrating an example of a transmitter in Embodiment 12;

FIG. 270 is a diagram illustrating an example of a reception method in Embodiment 12;

FIG. 271 is a diagram illustrating an example of a header pattern in Embodiment 13;

FIG. 272 is a diagram for describing an example of a packet structure in a communication protocol in Embodiment 13;

FIG. 273 is a flowchart illustrating an example of a reception method in Embodiment 13;

FIG. 274 is a flowchart illustrating an example of a reception method in Embodiment 13;

FIG. 275 is a flowchart illustrating an example of a reception method in Embodiment 13;

FIG. 276 is a diagram for describing a reception method in which a receiver in Embodiment 13 uses a exposure time longer than a period of a modulation frequency (a modulation period);

FIG. 277 is a diagram for describing a reception method in which a receiver in Embodiment 13 uses a exposure time longer than a period of a modulation frequency (a modulation period);

FIG. 278 is a diagram indicating an efficient number of divisions relative to a size of transmission data in Embodiment 13;

FIG. 279A is a diagram illustrating an example of a setting method in Embodiment 13;

FIG. 279B is a diagram illustrating another example of a setting method in Embodiment 13;

FIG. 280A is a flowchart illustrating processing of an image processing program in Embodiment 13;

FIG. 280B is a block diagram of an information processing apparatus in Embodiment 13;

FIG. 281 is a diagram for describing an example of application of a transmission and reception system in Embodiment 13;

FIG. 282 is a flowchart illustrating processing operation of a transmission and reception system in Embodiment 13;

FIG. 283 is a diagram for describing an example of application of a transmission and reception system in Embodiment 13;

FIG. 284 is a flowchart illustrating processing operation of a transmission and reception system in Embodiment 13;

FIG. 285 is a diagram for describing an example of application of a transmission and reception system in Embodiment 13;

FIG. 286 is a flowchart illustrating processing operation of a transmission and reception system in Embodiment 13;

FIG. 287 is a diagram for describing an example of application of a transmitter in Embodiment 13;

FIG. 288 is a diagram for describing an example of application of a transmission and reception system in Embodiment 14;

FIG. 289 is a diagram for describing an example of application of a transmission and reception system in Embodiment 14;

FIG. 290 is a diagram for describing an example of application of a transmission and reception system in Embodiment 14;

FIG. 291 is a diagram for describing an example of application of a transmission and reception system in Embodiment 14;

FIG. 292 is a diagram for describing an example of application of a transmission and reception system in Embodiment 14;

FIG. 293 is a diagram for describing an example of application of a transmission and reception system in Embodiment 14;

FIG. 294 is a diagram for describing an example of application of a transmission and reception system in Embodiment 14;

FIG. 295 is a diagram for describing an example of application of a transmission and reception system in Embodiment 14;

FIG. 296 is a diagram for describing an example of application of a transmission and reception system in Embodiment 14;

FIG. 297 is a diagram for describing an example of application of a transmission and reception system in Embodiment 14;

FIG. 298 is a diagram for describing an example of application of a transmission and reception system in Embodiment 14;

FIG. 299 is a diagram for describing an example of application of a transmission and reception system in Embodiment 14;

FIG. 300 is a diagram for describing an example of application of a transmission and reception system in Embodiment 14;

FIG. 301 is a diagram for describing an example of application of a transmission and reception system in Embodiment 14;

FIG. 302 is a diagram for describing operation of a receiver in Embodiment 15;

FIG. 303A is a diagram for describing another operation of a receiver in Embodiment 15;

FIG. 303B is a diagram illustrating an example of an indicator displayed by an output unit 1215 in Embodiment 15;

FIG. 303C is a diagram illustrating an AR display example in Embodiment 15;

FIG. 304A is a diagram for describing an example of a transmitter in Embodiment 15;

FIG. 304B is a diagram for describing another example of a transmitter in Embodiment 15;

FIG. 305A is a diagram for describing an example of synchronous transmission from a plurality of transmitters in Embodiment 15;

FIG. 305B is a diagram for describing another example of synchronous transmission from a plurality of transmitters in Embodiment 15;

FIG. 306 is a diagram for describing another example of synchronous transmission from a plurality of transmitters in Embodiment 15;

FIG. 307 is a diagram for describing signal processing of a transmitter in Embodiment 15;

FIG. 308 is a flowchart illustrating an example of a reception method in Embodiment 15;

FIG. 309 is a diagram for describing an example of a reception method in Embodiment 15;

FIG. 310 is a flowchart illustrating another example of a reception method in Embodiment 15;

FIG. 311 is a diagram illustrating an example in which an exposure time is three times longer than a transmission period and a transmission signal is a binary signal of 0 or 1 in Embodiment 15;

FIG. 312 is a diagram illustrating a state transition path in Embodiment 15;

FIG. 313 is images captured of a high-speed blinking object in Embodiment 16;

FIG. 314 is a diagram illustrating a receiving period and a blind period by LSS in Embodiment 16;

FIG. 315 is a diagram illustrating cutting out scanning for continuous receiving in Embodiment 16;

FIG. 316 illustrates an example of frequency-modulated symbols in Embodiment 16;

FIG. 317 illustrates a frequency response of LSS in Embodiment 16;

FIG. 318 is a diagram illustrating an example of 4 PPM symbols and V4 PPM symbols in Embodiment 16;

FIG. 319 is a diagram illustrating an example of Manchester coding symbols and VPPM symbols in Embodiment 16;

FIG. 320 is a diagram for describing efficiency of V4 PPM and VPPM by comparison in Embodiment 16;

FIG. 321 illustrates signal and noise power in frequency domain in Embodiment 16;

FIG. 322A illustrates a difference between a transmission frequency and a reception frequency (the maximum frequency of received signals) in Embodiment 16;

FIG. 322B illustrates an example of error rates for each frequency margin in Embodiment 16;

FIG. 322C illustrates another example of error rates for each frequency margin in Embodiment 16;

FIG. 322D illustrates another example of error rates for each frequency margin in Embodiment 16;

FIG. 322E illustrates another example of error rates for each frequency margin in Embodiment 16;

FIG. 322F illustrates another example of error rates for each frequency margin in Embodiment 16;

FIG. 323 illustrates a packet receiving error rate of V4 PPM symbols in Embodiment 16;

FIG. 324 is a block diagram illustrating a configuration of a display system according to Embodiment 17;

FIG. 325 illustrates a configuration of signal transmission by an image standard signal sending unit and signal receipt by an image standard signal receiving unit, according to Embodiment 17;

FIG. 326 illustrates an example of a specific configuration of signal transmission by the image standard signal sending unit and signal receipt by the image standard signal receiving unit, according to Embodiment 17;

FIG. 327 illustrates another example of a specific configuration of signal transmission by the image standard signal sending unit and signal receipt by the image standard signal receiving unit, according to Embodiment 17;

FIG. 328 illustrates another example of a specific configuration of signal transmission by the image standard signal sending unit and signal receipt by the image standard signal receiving unit, according to Embodiment 17;

FIG. 329A illustrates an example of power which is sent through a power sending transmission path, according to Embodiment 17;

FIG. 329B illustrates another example of power which is sent through the power sending transmission path, according to Embodiment 17;

FIG. 330 illustrates another example of a specific configuration of signal transmission by the image standard signal sending unit and signal receipt by the image standard signal receiving unit, according to Embodiment 17;

FIG. 331 illustrates another example of a specific configuration of signal transmission by the image standard signal sending unit and signal receipt by the image standard signal receiving unit, according to Embodiment 17;

FIG. 332 is a schematic view of one example of a visible light communication system according to Embodiment 18;

FIG. 333 is a block diagram of one example of an outline configuration of a display device according to Embodiment 18;

FIG. 334A illustrates one example of a state before visible light communication signals are superimposed on BL control signals according to Example 1 of Embodiment 18;

FIG. 334B illustrates one example of a state after the visible light communication signals have been superimposed on the BL control signals according to Example 1 of Embodiment 18;

FIG. 335 is a timing chart illustrating a first method according to Example 2 of Embodiment 18;

FIG. 336 is a timing chart illustrating the first method according to Example 2 of Embodiment 18;

FIG. 337A is a timing chart illustrating a second method according to Example 2 of Embodiment 18;

FIG. 337B is a timing chart illustrating the second method according to Example 2 of Embodiment 18;

FIG. 337C is a timing chart illustrating the second method according to Example 2 of Embodiment 18;

FIG. 337D is a timing chart illustrating the second method according to Example 2 of Embodiment 18;

FIG. 338A is a timing chart illustrating the second method according to Example 2 of Embodiment 18;

FIG. 338B is a timing chart illustrating the second method according to Example 2 of Embodiment 18;

FIG. 338C is a timing chart illustrating the second method according to Example 2 of Embodiment 18;

FIG. 338D is a timing chart illustrating the second method according to Example 2 of Embodiment 18;

FIG. 339 is a timing chart illustrating a method according to Example 3 of Embodiment 18 of superimposing visible light communication signals on BL control signals;

FIG. 340 is a flow chart illustrating operations performed by the second processor according to Embodiment 19;

FIG. 341A illustrates a specific method for superimposing encoded signals on BL control signals according to Embodiment 19;

FIG. 341B illustrates a specific method for superimposing encoded signals on BL control signals according to Embodiment 19;

FIG. 341C illustrates a specific method for superimposing encoded signals on BL control signals according to Embodiment 19;

FIG. 341D illustrates a specific method for superimposing encoded signals on BL control signals according to Embodiment 19;

FIG. 342 illustrates a different specific method for superimposing encoded signals on BL control signals according to Embodiment 19;

FIG. 343 is a flow chart illustrating operations performed by the second processor according to Embodiment 20;

FIG. 344 is a timing chart of an example of the division of the regions into groups according to Embodiment 20;

FIG. 345 is a timing chart of another example of the division of the regions into groups according to Embodiment 20;

FIG. 346 is a timing chart of another example of the division of the regions into groups according to Embodiment 20;

FIG. 347 is a flow chart illustrating operations performed by the second processor according to Embodiment 21;

FIG. 348A illustrates the relationship between the phases of the BL control signal and the visible light communication signal according to Embodiment 21;

FIG. 348B illustrates the relationship between the phases of the BL control signal and the visible light communication signal according to Embodiment 21;

FIG. 349A is a timing chart illustrating operations performed by the second processor according to Embodiment 21;

FIG. 349B is a timing chart illustrating operations performed by the second processor according to Embodiment 21;

FIG. 349C is a timing chart illustrating operations performed by the second processor according to Embodiment 21;

FIG. 350A is a timing chart illustrating operations performed by the second processor according to Embodiment 22;

FIG. 350B is a timing chart illustrating operations performed by the second processor according to Embodiment 22;

FIG. 351 is a timing chart illustrating backlight control when local dimming is used according to Embodiment 23;

FIG. 352 is a flow chart illustrating an example of operations performed by the second processor according to Embodiment 23;

FIG. 353 is a timing chart illustrating an example of operations performed by the second processor according to Embodiment 23;

FIG. 354 is a flow chart illustrating an example of operations performed by the second processor according to Embodiment 23;

FIG. 355 is a timing chart illustrating an example of operations performed by the second processor according to Embodiment 23;

FIG. 356 is a timing chart illustrating an example of operations performed by the second processor according to Embodiment 23;

FIG. 357 schematically illustrates a visible light communication system according to Embodiment 24;

FIG. 358 is a block diagram of a display device according to Embodiment 24;

FIG. 359 is a diagram for describing an example of generating a visible light communication signal according to Embodiment 24;

FIG. 360 is a block diagram of a reception device according to Embodiment 24;

FIG. 361 is a diagram for describing a captured image in a reception device for ON and OFF states of a backlight of a display device according to Embodiment 24;

FIG. 362 is a diagram for describing a captured image in a reception device for a transmission frame from a display device according to Embodiment 24;

FIG. 363 is a diagram for describing the relationship between a transmission clock frequency of a display device and a frame rate of an imaging unit of a reception device according to Embodiment 24;

FIG. 364 is a diagram for describing a first example of generating a transmission frame for one signal unit according to Embodiment 24;

FIG. 365A is a diagram for describing a second example of generating a transmission frame for one signal unit according to Embodiment 24;

FIG. 365B is a diagram for describing a third example of generating a transmission frame for one signal unit according to Embodiment 24;

FIG. 365C is a diagram for describing a fourth example of generating a transmission frame for one signal unit according to Embodiment 24;

FIG. 365D is a diagram for describing a fifth example of generating a transmission frame for one signal unit according to Embodiment 24;

FIG. 365E is a diagram for describing a sixth example of generating a transmission frame for one signal unit according to Embodiment 24;

FIG. 366 is a flowchart for describing operation of a visible light communication signal processing unit of a display device according to Embodiment 24;

FIG. 367 is a flowchart for describing operation of a visible light communication signal processing unit of a display device according to Embodiment 25;

FIG. 368 is a diagram for describing an example of how to determine the number of times of transmission of an arbitrary block of a transmission frame for one signal unit according to Embodiment 25;

FIG. 369 is a diagram for describing an example of generating a transmission frame for one signal unit according to Embodiment 25;

FIG. 370 is a flowchart for describing operation of a visible light communication signal processing unit of a display device according to Embodiment 26;

FIG. 371 is a diagram for describing an example of how to determine the number of times of transmitting an arbitrary block of a transmission frame for one signal unit according to Embodiment 26;

FIG. 372 is a diagram for describing an example of generating a transmission frame for one signal unit that is output from a display device according to Embodiment 26;

FIG. 373 is a diagram for describing another example of generating a transmission frame for one signal unit that is output from a display device according to Embodiment 26;

FIG. 374 is a diagram for describing a first example of generating a transmission frame for one signal unit according to Embodiment 27;

FIG. 375A is a diagram for describing a second example of generating a transmission frame for one signal unit according to Embodiment 27;

FIG. 375B is a diagram for describing a third example of generating a transmission frame for one signal unit according to Embodiment 27;

FIG. 375C is a diagram for describing a fourth example of generating a transmission frame for one signal unit according to Embodiment 27;

FIG. 376 is a flowchart for describing operation of a visible light communication signal processing unit of a display device according to Embodiment 27;

FIG. 377 is a diagram for describing control of switching visible light communication according to Embodiment 28 in which a transmitting apparatus is a video display device such as a television;

FIG. 378 is a diagram illustrating a process of transmitting logical data via visible light communication according to Embodiment 29;

FIG. 379 is a diagram illustrating a process of transmitting logical data via visible light communication according to Embodiment 29;

FIG. 380 is a diagram for describing a dividing process performed by a logical data dividing unit according to Embodiment 29;

FIG. 381 is a diagram for describing a dividing process performed by a logical data dividing unit according to Embodiment 29;

FIG. 382 is a diagram illustrating an example of a transmission signal in Embodiment 29;

FIG. 383 is a diagram illustrating another example of a transmission signal in Embodiment 29;

FIG. 384 is a diagram illustrating another example of a transmission signal in Embodiment 29;

FIG. 385A is a diagram for describing a transmitter in Embodiment 30;

FIG. 385B is a diagram illustrating a change in luminance of each of R, G, and B in Embodiment 30;

FIG. 386 is a diagram illustrating persistence properties of a green phosphorus element and a red phosphorus element in Embodiment 30;

FIG. 387 is a diagram for explaining a new problem that will occur in an attempt to reduce errors in reading a barcode in Embodiment 30;

FIG. 388 is a diagram for describing downsampling performed by a receiver in Embodiment 30;

FIG. 389 is a flowchart illustrating processing operation of a receiver in Embodiment 30;

FIG. 390 is a diagram illustrating processing operation of a reception device (an imaging device) in Embodiment 31;

FIG. 391 is a diagram illustrating processing operation of a reception device (an imaging device) in Embodiment 31;

FIG. 392 is a diagram illustrating processing operation of a reception device (an imaging device) in Embodiment 31;

FIG. 393 is a diagram illustrating processing operation of a reception device (an imaging device) in Embodiment 31;

FIG. 394 is a diagram illustrating an example of an application in Embodiment 32;

FIG. 395 is a diagram illustrating an example of an application in Embodiment 32;

FIG. 396 is a diagram illustrating an example of a transmission signal and an example of an audio synchronization method in Embodiment 32;

FIG. 397 is a diagram illustrating an example of a transmission signal in Embodiment 32;

FIG. 398 is a diagram illustrating an example of a process flow of a receiver in Embodiment 32;

FIG. 399 is a diagram illustrating an example of a user interface of a receiver in Embodiment 32;

FIG. 400 is a diagram illustrating an example of a process flow of a receiver in Embodiment 32;

FIG. 401 is a diagram illustrating another example of a process flow of a receiver in Embodiment 32;

FIG. 402A is a diagram for describing a specific method of synchronous reproduction in Embodiment 32;

FIG. 402B is a block diagram illustrating a configuration of a reproduction apparatus (a receiver) which performs synchronous reproduction in Embodiment 32;

FIG. 402C is a flowchart illustrating processing operation of a reproduction apparatus (a receiver) which performs synchronous reproduction in Embodiment 32;

FIG. 403 is a diagram for describing advance preparation of synchronous reproduction in Embodiment 32;

FIG. 404 is a diagram illustrating an example of application of a receiver in Embodiment 32;

FIG. 405A is a front view of a receiver held by a holder in Embodiment 32;

FIG. 405B is a rear view of a receiver held by a holder in Embodiment 32;

FIG. 406 is a diagram for describing a use case of a receiver held by a holder in Embodiment 32;

FIG. 407 is a flowchart illustrating processing operation of a receiver held by a holder in Embodiment 32;

FIG. 408 is a diagram illustrating an example of an image displayed by a receiver in Embodiment 32;

FIG. 409 is a diagram illustrating another example of a holder in Embodiment 32;

FIG. 410A is a diagram illustrating an example of a visible light signal in Embodiment 33;

FIG. 410B is a diagram illustrating an example of a visible light signal in Embodiment 33;

FIG. 410C is a diagram illustrating an example of a visible light signal in Embodiment 33;

FIG. 410D is a diagram illustrating an example of a visible light signal in Embodiment 33;

FIG. 411 is a diagram illustrating a structure of a visible light signal in Embodiment 33;

FIG. 412 is a diagram illustrating an example of a bright line image obtained through imaging by a receiver in Embodiment 33;

FIG. 413 is a diagram illustrating another example of a bright line image obtained through imaging by a receiver in Embodiment 33;

FIG. 414 is a diagram illustrating another example of a bright line image obtained through imaging by a receiver in Embodiment 33;

FIG. 415 is a diagram for describing application of a receiver to a camera system which performs HDR compositing in Embodiment 33;

FIG. 416 is a diagram for describing processing operation of a visible light communication system in Embodiment 33;

FIG. 417A is a diagram illustrating an example of vehicle-to-vehicle communication using visible light in Embodiment 33;

FIG. 417B is a diagram illustrating another example of vehicle-to-vehicle communication using visible light in Embodiment 33;

FIG. 418 is a diagram illustrating an example of a method of determining positions of a plurality of LEDs in Embodiment 33;

FIG. 419 is a diagram illustrating an example of a bright line image obtained by capturing an image of a vehicle in Embodiment 33;

FIG. 420 is a diagram illustrating an example of application of a receiver and a transmitter in Embodiment 33. A rear view of a vehicle is given in FIG. 420;

FIG. 421 is a flowchart illustrating an example of processing operation of a receiver and a transmitter in Embodiment 33;

FIG. 422 is a diagram illustrating an example of application of a receiver and a transmitter in Embodiment 33;

FIG. 423 is a flowchart illustrating an example of processing operation of a receiver 7007*a* and a transmitter 7007*b* in Embodiment 33;

FIG. 424 is a diagram illustrating components of a visible light communication system applied to the interior of a train in Embodiment 33;

FIG. 425 is a diagram illustrating components of a visible light communication system applied to amusement parks and the like facilities in Embodiment 33;

FIG. 426 is a diagram illustrating an example of a visible light communication system including a play tool and a smartphone in Embodiment 33;

FIG. 427 is a diagram illustrating an example of a transmission signal in Embodiment 34;

FIG. 428 is a diagram illustrating an example of a transmission signal in Embodiment 34;

FIG. 429 is a diagram illustrating an example of a transmission signal in Embodiment 34;

FIG. 430 is a diagram illustrating an example of a transmission signal in Embodiment 34;

FIG. 431 is a diagram illustrating an example of a transmission signal in Embodiment 34;

FIG. 432 is a diagram illustrating an example of a transmission signal in Embodiment 34;

FIG. 433 is a diagram illustrating an example of a transmission signal in Embodiment 34;

FIG. 434 is a diagram illustrating an example of a reception algorithm in Embodiment 34;

FIG. 435 is a diagram illustrating an example of a reception algorithm in Embodiment 34;

FIG. 436 is a diagram illustrating an example of a reception algorithm in Embodiment 34;

FIG. 437 is a diagram illustrating an example of a reception algorithm in Embodiment 34;

FIG. 438 is a diagram illustrating an example of a transmission signal in Embodiment 35;

FIG. 439 is a diagram illustrating an example of a transmission signal in Embodiment 35;

FIG. 440 is a diagram illustrating an example of a transmission signal in Embodiment 35;

FIG. 441 is a diagram illustrating an example of a transmission signal in Embodiment 35;

FIG. 442 is a diagram illustrating an example of a transmission signal in Embodiment 35;

FIG. 443 is a diagram illustrating an example of a transmission signal in Embodiment 35;

FIG. 444 is a diagram illustrating an example of a transmission signal in Embodiment 35;

FIG. 445 is a diagram illustrating an example of a transmission signal in Embodiment 35;

FIG. 446 is a diagram illustrating an example of a transmission and reception system in Embodiment 35;

FIG. 447 is a flowchart illustrating an example of processing operation of a transmission and reception system in Embodiment 35;

FIG. 448 is a flowchart illustrating operation of a server in Embodiment 35;

FIG. 449 is a flowchart illustrating an example of operation of a receiver in Embodiment 35;

FIG. 450 is a flowchart illustrating a method of calculating a status of progress in a simple mode in Embodiment 35;

FIG. 451 is a flowchart illustrating a method of calculating a status of progress in a maximum likelihood estimation mode in Embodiment 35;

FIG. 452 is a flowchart illustrating a display method in which a status of progress does not change downward in Embodiment 35;

FIG. 453 is a flowchart illustrating a method of displaying a status of progress when there is a plurality of packet lengths in Embodiment 35;

FIG. 454 is a diagram illustrating an example of an operating state of a receiver in Embodiment 35;

FIG. 455 is a diagram illustrating an example of a transmission signal in Embodiment 35;

FIG. 456 is a diagram illustrating an example of a transmission signal in Embodiment 35;

FIG. 457 is a diagram illustrating an example of a transmission signal in Embodiment 35;

FIG. 458 is a diagram illustrating an example of a transmission signal in Embodiment 35;

FIG. 459 is a block diagram illustrating an example of a transmitter in Embodiment 35;

FIG. 460 is a diagram illustrating a timing chart of when an LED display in Embodiment 35 is driven by a light ID modulated signal according to the present disclosure;

FIG. 461 is a diagram illustrating a timing chart of when an LED display in Embodiment 35 is driven by a light ID modulated signal according to the present disclosure;

FIG. 462 is a diagram illustrating a timing chart of when an LED display in Embodiment 35 is driven by a light ID modulated signal according to the present disclosure;

FIG. 463A is a flowchart illustrating a transmission method according to an aspect of the present disclosure;

FIG. 463B is a block diagram illustrating a functional configuration of a transmitting apparatus according to an aspect of the present disclosure;

FIG. 464 is a diagram illustrating an example of a transmission signal in Embodiment 35;

FIG. 465 is a diagram illustrating an example of a transmission signal in Embodiment 35;

FIG. 466 is a diagram illustrating an example of a transmission signal in Embodiment 35;

FIG. 467 is a diagram illustrating an example of a transmission signal in Embodiment 35;

FIG. 468 is a diagram illustrating an example of a transmission signal in Embodiment 35;

FIG. 469 is a diagram illustrating an example of a transmission signal in Embodiment 35;

FIG. 470A is a flowchart illustrating an example of a signal generating method of Embodiment 35; and FIG. 470B is a block diagram illustrating an example of a configuration of a signal generating unit of embodiment 35.

DETAILED DESCRIPTION

A signal generating method according to one aspect of the present disclosure is a signal generating method for generating a visible light signal to be transmitted by way of a luminance change of a light source included in a transmitter, the method including: determining, as a method for transmitting the visible light signal from the transmitter, one of a single-frame transmitting method for transmitting data as one frame and a multiple-frame transmitting method for transmitting the data while dividing the data into a plurality of frames; when the multiple-frame transmitting method is determined to be the method for transmitting the visible light signal, generating partition type information indicating a type of data to be transmitted, and generating combination data by adding the partition type information to the data to be transmitted; generating the plurality of frames each of which includes each of a plurality of data parts by dividing the combination data into the plurality of data parts; and generating the visible light signal by adding a preamble, being data indicating a head of a frame, to the head of each of the plurality of frames.

For example, the single-frame transmitting method is a method for transmitting the data with a frame configuration of the single frame transmission illustrated in FIG. 438 or FIG. 464. The multiple-frame transmitting method is a method for transmitting the data with a frame configuration of the multiple frame transmission illustrated in FIG. 440 or FIG. 465. One of the single-frame transmitting method and the multiple-frame transmitting method is determined. When the multiple-frame transmitting method is determined, PTYPE illustrated in FIG. 465 is generated as the partition type information, and the combination data is generated by adding the partition type information to the data to be transmitted that is BODY. The visible light signal constructed with the plurality of frames each of which includes the preamble (PRE) is generated by dividing the combination data.

When the multiple-frame transmitting method is determined, the data to be transmitted is transmitted as the visible light signal constructed with the plurality of frames, so that long-distance communication is conducted, and a reception error and a reception delay can be reduced. Because the single-frame transmitting method and the multiple-frame transmitting method can be switched, the transmission method can properly be selected according to a communication distance or an amount of data to be transmitted. For example, when the reception delay occurs by dividing the small amount of data to be transmitted, the reception delay can be prevented by selecting the single-frame transmitting method. The partition type information is added to the data to be transmitted, so that the receiver can properly receive the data to be transmitted based on the partition type information. Accordingly, the communication can be conducted between various devices. The frame is a data unit, and is also referred to as a packet or a block.

In the second addition step, a first preamble may be added to the head of the frame located at a last position in an array of the plurality of frames as the preamble, and a second preamble different from the first preamble may be added to the head of the frame located at a position that is not the last position in the array as the preamble. In the second addition step, when a plurality of frames located at the positions that are not the last position are present in the array of the plurality of frames, the second preamble may be added to the head of each of the plurality of frames located at the positions that are not the last position.

For example, as illustrated in (a) of FIG. 444, the first preamble (a last address of PRE) is added to the head of the frame located at the last position, and the second preamble (a not-last address of PRE) is added to the head of the frame located at the position that is not the last position. Therefore, the receiver that receives the visible light signal can easily find a break or boundary between the data to be transmitted and the next data to be transmitted, and the receiver can receive the plurality of pieces of data to be transmitted while properly distinguishing the plurality of pieces of data to be transmitted from each other.

Each of the first and second preambles may be constructed with an N-bit (N is an integer of 2 or more) bit string, and the bit string may indicate a number previously correlated with a bit length of the data part included in each of the plurality of frames.

For example, as illustrated in (a) of FIG. 444, each of the first and second preambles is a 12-bit bit string. The bit string indicates a number (for example, "1101 0000 0000" or "0000 0000 1101") previously correlated with the bit length (for example, 64 bits) of the data part (DATAPART). Therefore, because the first and second preambles indicate the bit length of the data part while indicating the head of the frame, data that is used only to notify the receiver of the bit length of the data part needs not to be provided in the frame. Accordingly, time necessary for the transmission of the data to be transmitted can be shortened. When receiving the first or second preamble, the receiver can identify the bit length of the data part subsequent to the preambles. Resultantly, the receiver can properly receive the data part.

Each of the first and second preambles may be constructed with an M-bit (M is an integer that is greater than or equal to 2 and less than N) first bit string indicating an identical number greater than or equal to 1 and a K-bit (K=N−M) second bit string indicating 0, and the first preamble may differ from the second preamble in the order in which the first bit string and the second bit string are disposed.

For example, as illustrated in (a) of FIG. 444, each of the first and second preambles correlated with a 64-bit data part is constructed with a 4-bit first bit string indicating "1101" and an 8-bit second bit string indicating "0000 0000". In the 12-bit bit string that is the first preamble, the second bit string "0000 0000" is disposed next to the first bit string "1101". On the other hand, in the 12-bit bit string that is the second preamble, the first bit string "1101" is disposed next to the second bit string "0000 0000". Thus, the first preamble differs from the second preamble in the order in which the first bit string "1101" and the second bit string "0000 0000" are disposed. That is, the first and second preambles are constructed as the bit strings different from each other, and include the partially common bit string. Therefore, the receiver can search the first and second preambles using the partially common bit string without distinguishing the first and second preambles from each other, and can search only the first preamble or the second preamble using the whole bit string of the preamble. Accordingly, data search efficiency can be improved.

The partition type information may indicate, as the type of the data to be transmitted, a first type or a second type in which a restriction of a data configuration is stricter than that of the first type, and when the partition type information indicating the second type is added in the first addition step, length information indicating the bit length of the data to be transmitted, and ID type information indicating a type of identification information expressed by the data to be transmitted may further be added to the data to be transmitted.

For example, as illustrated in FIG. 468, PTYPE that is the partition type information indicates the first type that is a data stream or the second type that is a single frame compatible. When PTYPE indicates the single frame compatible, for example, IDLEN and IDTYPE are added to the data to be transmitted (ID) as illustrated in (a) of FIG. 467. IDLEN is length information indicating the bit length of the data to be transmitted, and IDTYPE indicates a type of ID (identification information) expressed by the data to be transmitted. At this point, when the data to be transmitted is transmitted by the single-frame transmitting method, for example, IDLEN and IDTYPE are also added to the data to be transmitted (ID/DATA) as illustrated in FIG. 464. Accordingly, even if one of the single-frame transmitting method and the multiple-frame transmitting method is determined to be the method for transmitting the data to be transmitted, a data format can be commonalized. That is, the receiver can properly receive the data to be transmitted irrespective of whether the data to be transmitted is transmitted by either the single-frame transmitting method or the multiple-frame transmitting method.

These general and specific aspects may be implemented using an apparatus, a system, a method, an integrated circuit, a computer program, or a computer-readable recording medium such as a CD-ROM, or any combination of apparatuses, systems, methods, integrated circuits, computer programs, or computer-readable recording media.

Each of the embodiments described below shows a general or specific example.

Each of the embodiments described below shows a general or specific example. The numerical values, shapes, materials, structural elements, the arrangement and connection of the structural elements, steps, the processing order of the steps etc. shown in the following embodiments are mere examples, and therefore do not limit the scope of the present disclosure. Therefore, among the structural elements in the following embodiments, structural elements not recited in any one of the independent claims representing the broadest concepts are described as arbitrary structural elements.

Embodiment 1

The following describes Embodiment 1.

(Observation of Luminance of Light Emitting Unit)

Figure 1:
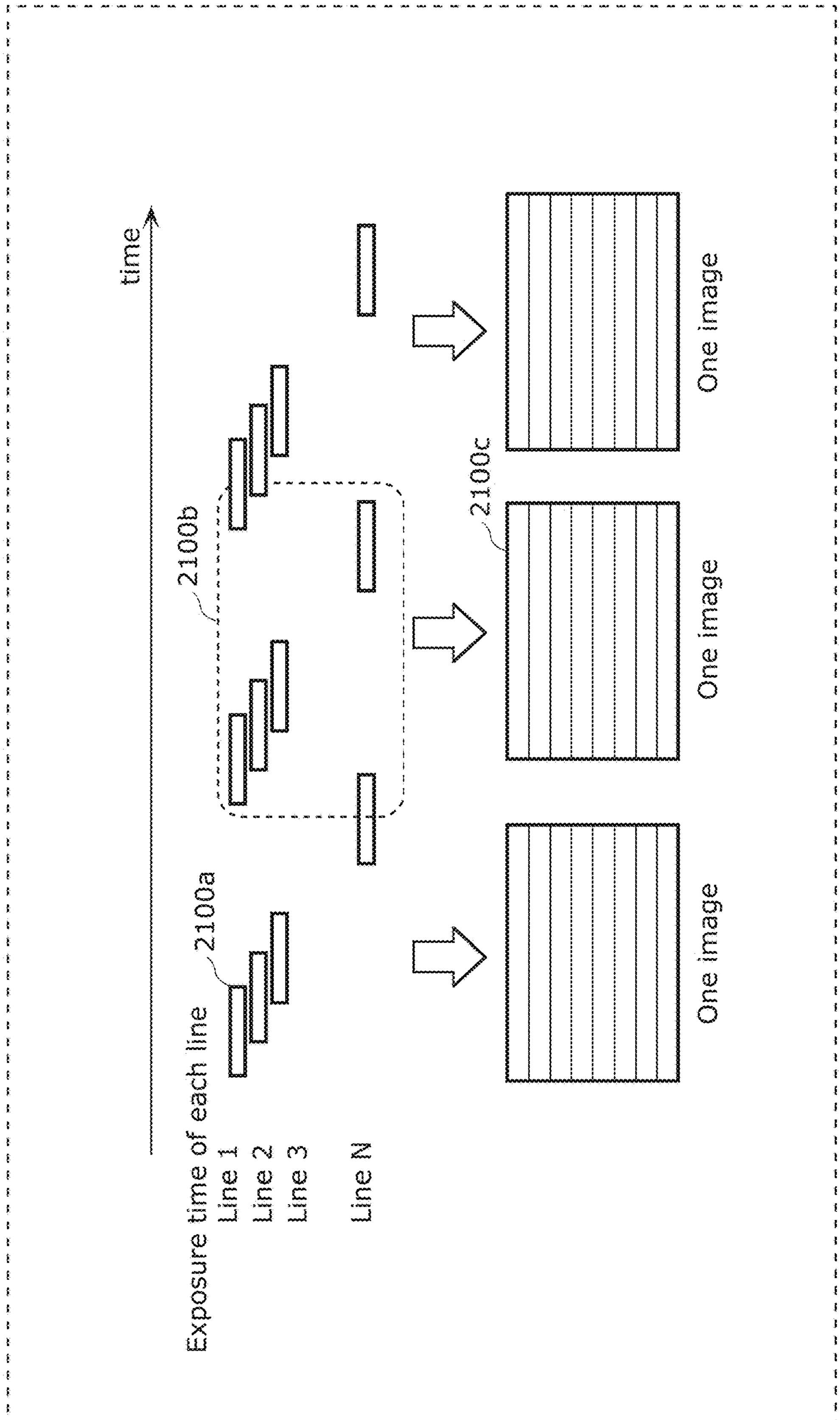
FIG. 1 is a diagram illustrating an example of an observation method of luminance of a light emitting unit in Embodiment 1.

The following proposes an imaging method in which, when capturing one image, all imaging elements are not exposed simultaneously but the times of starting and ending the exposure differ between the imaging elements. FIG. 1 illustrates an example of imaging where imaging elements arranged in a line are exposed simultaneously, with the exposure start time being shifted in order of lines. Here, the simultaneously exposed imaging elements are referred to as "exposure line", and the line of pixels in the image corresponding to the imaging elements is referred to as "bright line".

Figure 2:
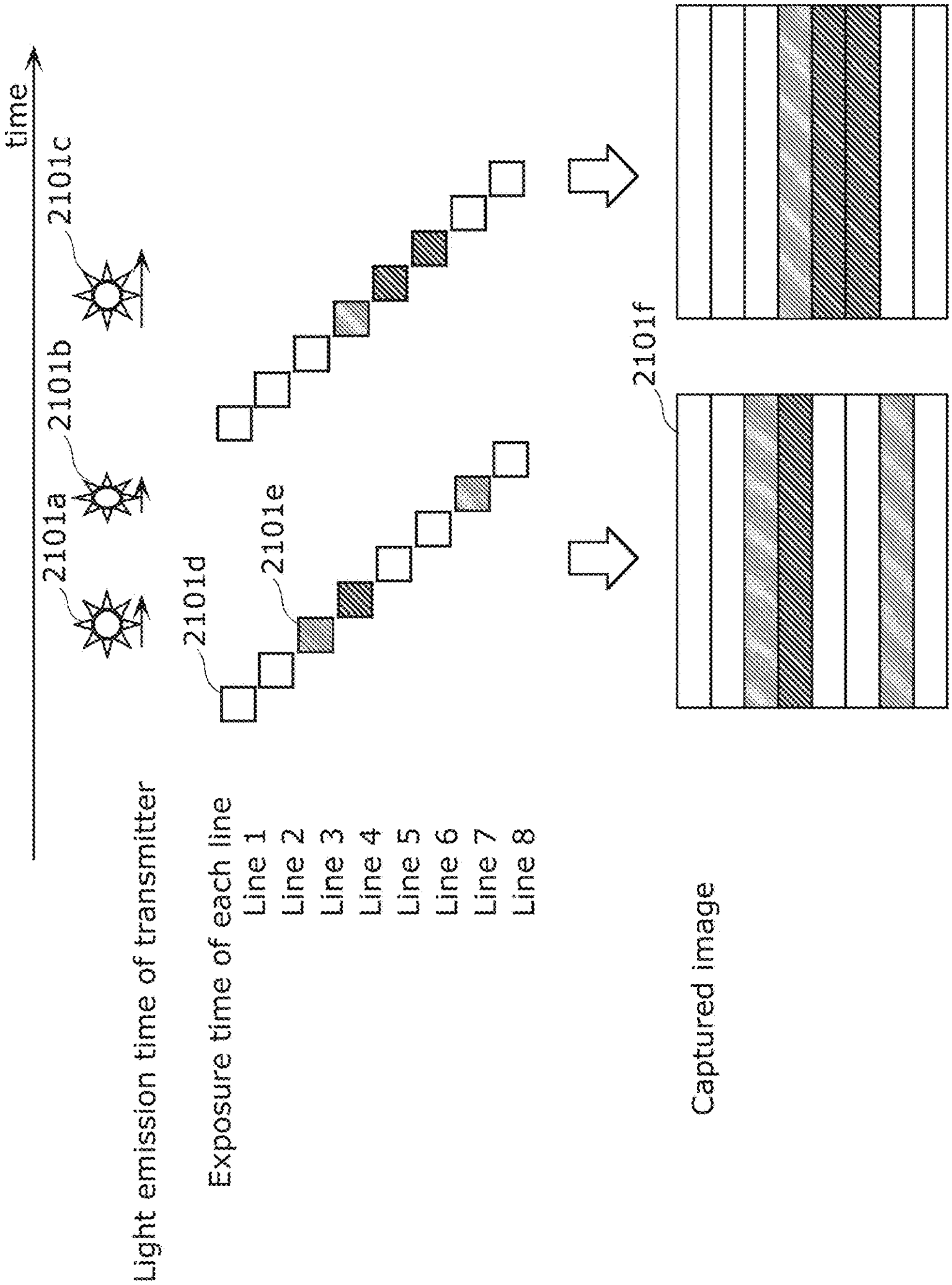
FIG. 2 is a diagram illustrating an example of an observation method of luminance of a light emitting unit in Embodiment 1.

In the case of capturing a blinking light source shown on the entire imaging elements using this imaging method, bright lines (lines of brightness in pixel value) along exposure lines appear in the captured image as illustrated in FIG. 2. By recognizing this bright line pattern, the luminance change of the light source at a speed higher than the imaging frame rate can be estimated. Hence, transmitting a signal as the luminance change of the light source enables communication at a speed not less than the imaging frame rate. In the case where the light source takes two luminance values to express a signal, the lower luminance value is referred to as "low" (LO), and the higher luminance value is referred to as "high" (HI). The low may be a state in which the light source emits no light, or a state in which the light source emits weaker light than in the high.

By this method, information transmission is performed at a speed higher than the imaging frame rate.

In the case where the number of exposure lines whose exposure times do not overlap each other is 20 in one captured image and the imaging frame rate is 30 fps, it is possible to recognize a luminance change in a period of 1.67 millisecond. In the case where the number of exposure lines whose exposure times do not overlap each other is 1000, it is possible to recognize a luminance change in a period of 1/30000 second (about 33 microseconds). Note that the exposure time is set to less than 10 milliseconds, for example.

FIG. 2 illustrates a situation where, after the exposure of one exposure line ends, the exposure of the next exposure line starts.

In this situation, when transmitting information based on whether or not each exposure line receives at least a predetermined amount of light, information transmission at a speed of fl bits per second at the maximum can be realized where f is the number of frames per second (frame rate) and l is the number of exposure lines constituting one image.

Note that faster communication is possible in the case of performing time-difference exposure not on a line basis but on a pixel basis.

In such a case, when transmitting information based on whether or not each pixel receives at least a predetermined amount of light, the transmission speed is flm bits per second at the maximum, where m is the number of pixels per exposure line.

Figure 3:
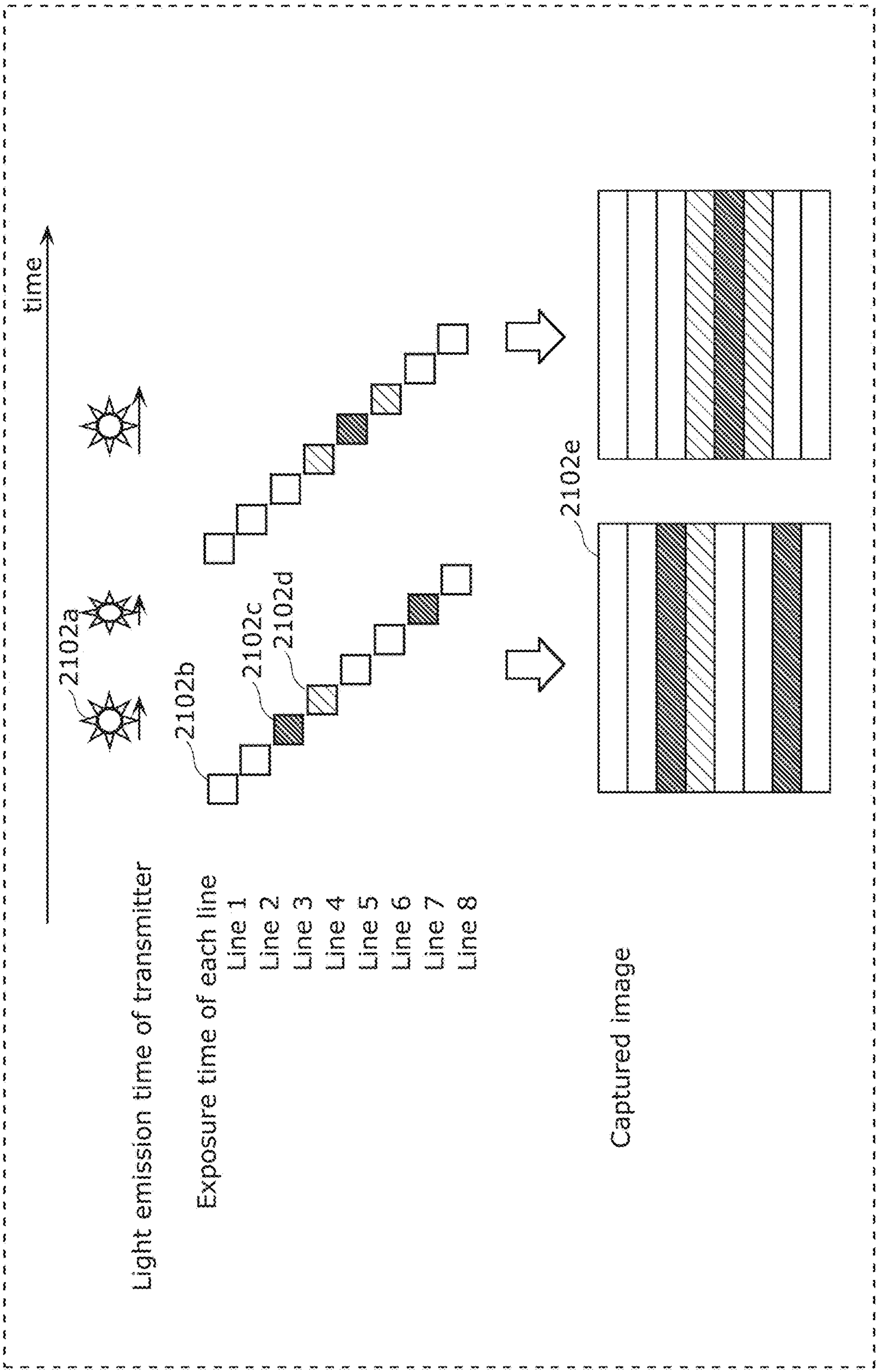
FIG. 3 is a diagram illustrating an example of an observation method of luminance of a light emitting unit in Embodiment 1.

If the exposure state of each exposure line caused by the light emission of the light emitting unit is recognizable in a plurality of levels as illustrated in FIG. 3, more information can be transmitted by controlling the light emission time of the light emitting unit in a shorter unit of time than the exposure time of each exposure line.

In the case where the exposure state is recognizable in Elv levels, information can be transmitted at a speed of flElv bits per second at the maximum.

Moreover, a fundamental period of transmission can be recognized by causing the light emitting unit to emit light with a timing slightly different from the timing of exposure of each exposure line.

Figure 4:
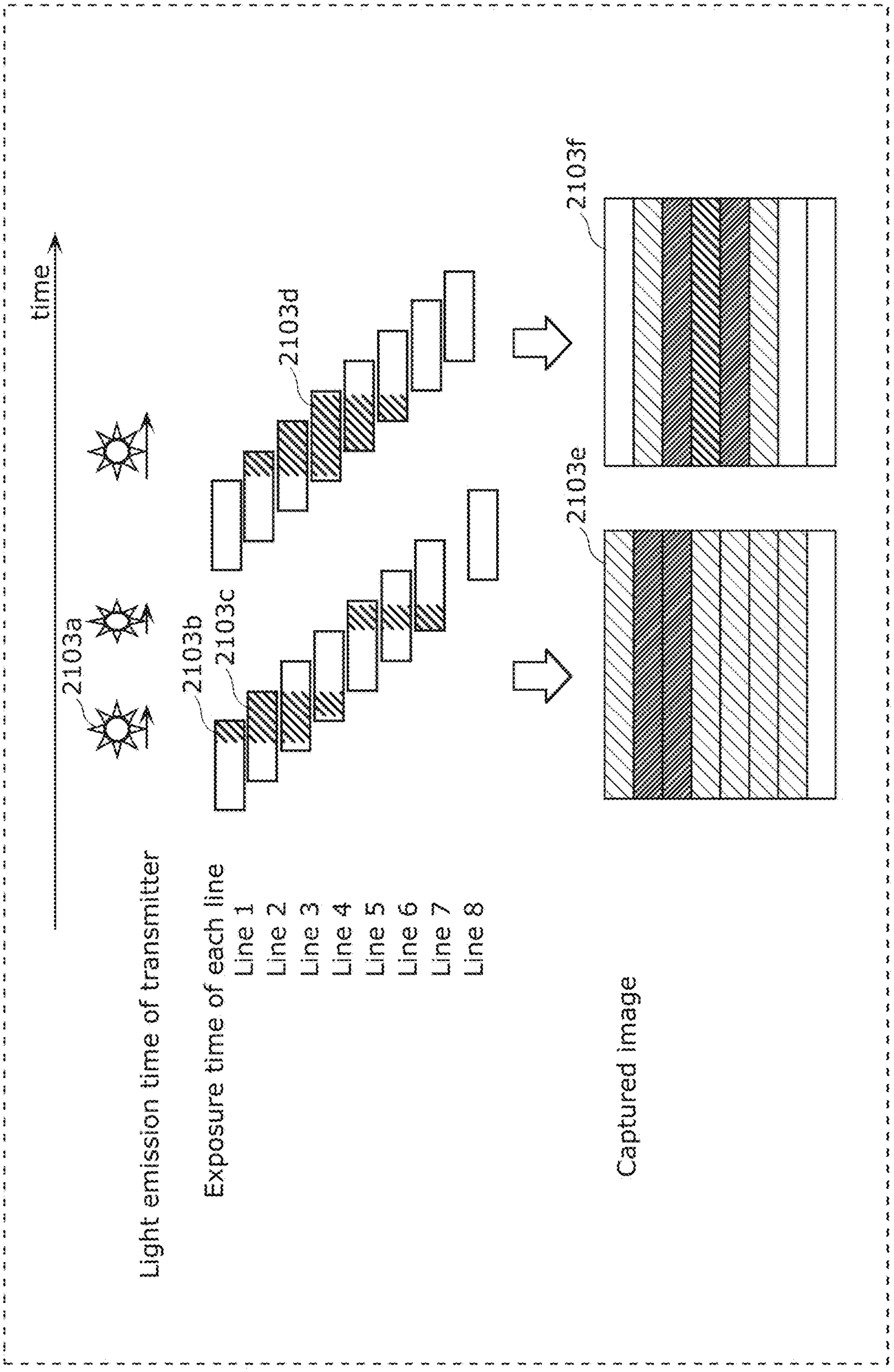
FIG. 4 is a diagram illustrating an example of an observation method of luminance of a light emitting unit in Embodiment 1.

FIG. 4 illustrates a situation where, before the exposure of one exposure line ends, the exposure of the next exposure line starts. That is, the exposure times of adjacent exposure lines partially overlap each other. This structure has the feature (1): the number of samples in a predetermined time can be increased as compared with the case where, after the exposure of one exposure line ends, the exposure of the next exposure line starts. The increase of the number of samples in the predetermined time leads to more appropriate detection of the light signal emitted from the light transmitter which is the subject. In other words, the error rate when detecting the light signal can be reduced. The structure also has the feature (2): the exposure time of each exposure line can be increased as compared with the case where, after the exposure of one exposure line ends, the exposure of the next exposure line starts. Accordingly, even in the case where the subject is dark, a brighter image can be obtained, i.e. the S/N ratio can be improved. Here, the structure in which the exposure times of adjacent exposure lines partially overlap each other does not need to be applied to all exposure lines, and part of the exposure lines may not have the structure of partially overlapping in exposure time. By keeping part of the exposure lines from partially overlapping in exposure time, the occurrence of an intermediate color caused by exposure time overlap is suppressed on the imaging screen, as a result of which bright lines can be detected more appropriately.

In this situation, the exposure time is calculated from the brightness of each exposure line, to recognize the light emission state of the light emitting unit.

Note that, in the case of determining the brightness of each exposure line in a binary fashion of whether or not the luminance is greater than or equal to a threshold, it is necessary for the light emitting unit to continue the state of emitting no light for at least the exposure time of each line, to enable the no light emission state to be recognized.

Figure 5A:
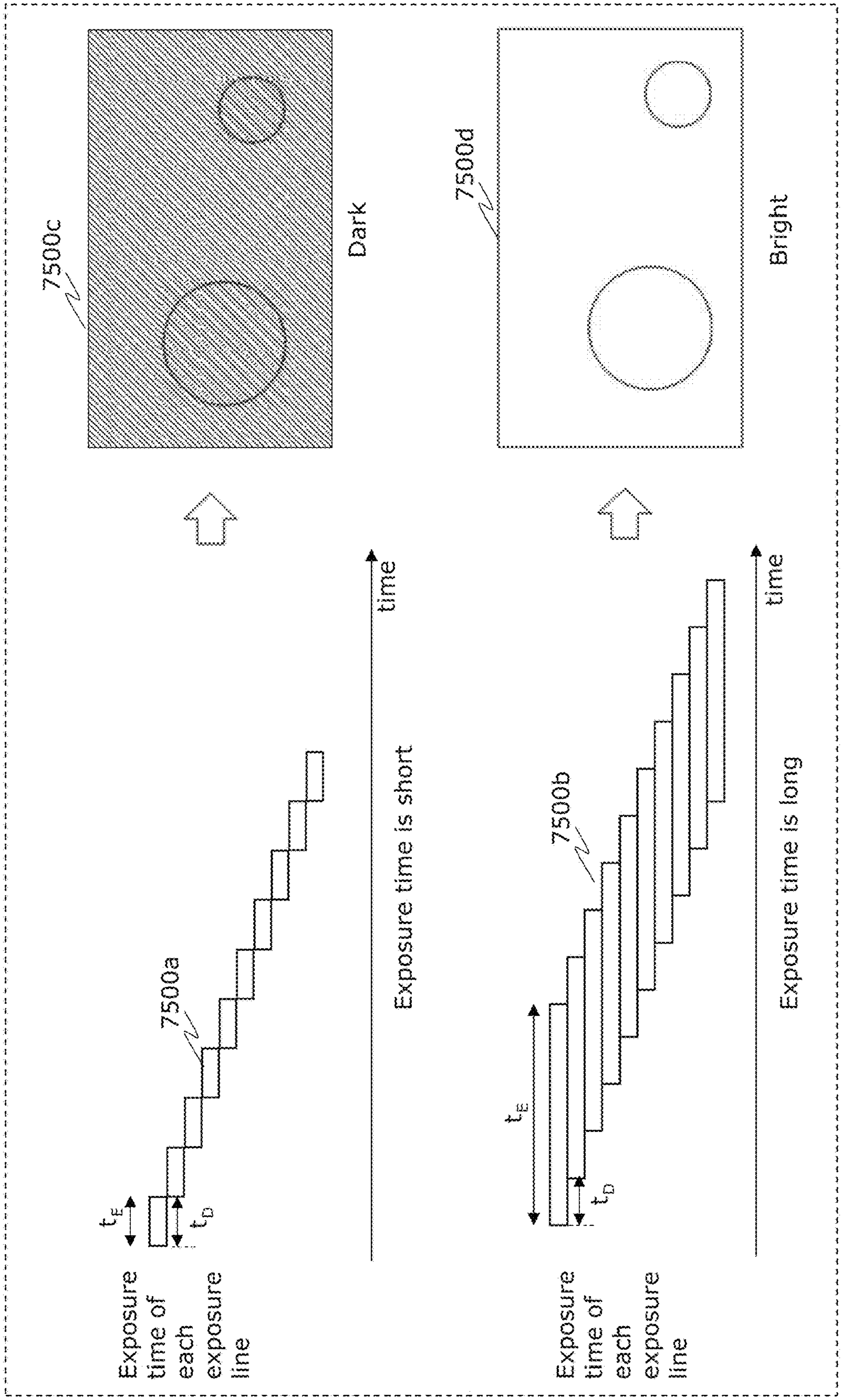
FIG. 5A is a diagram illustrating an example of an observation method of luminance of a light emitting unit in Embodiment 1.

FIG. 5A illustrates the influence of the difference in exposure time in the case where the exposure start time of each exposure line is the same. In 7500*a*, the exposure end time of one exposure line and the exposure start time of the next exposure line are the same. In 7500*b*, the exposure time is longer than that in 7500*a*. The structure in which the exposure times of adjacent exposure lines partially overlap each other as in 7500*b* allows a longer exposure time to be used. That is, more light enters the imaging element, so that a brighter image can be obtained. In addition, since the imaging sensitivity for capturing an image of the same brightness can be reduced, an image with less noise can be obtained. Communication errors are prevented in this way.

Figure 5B:
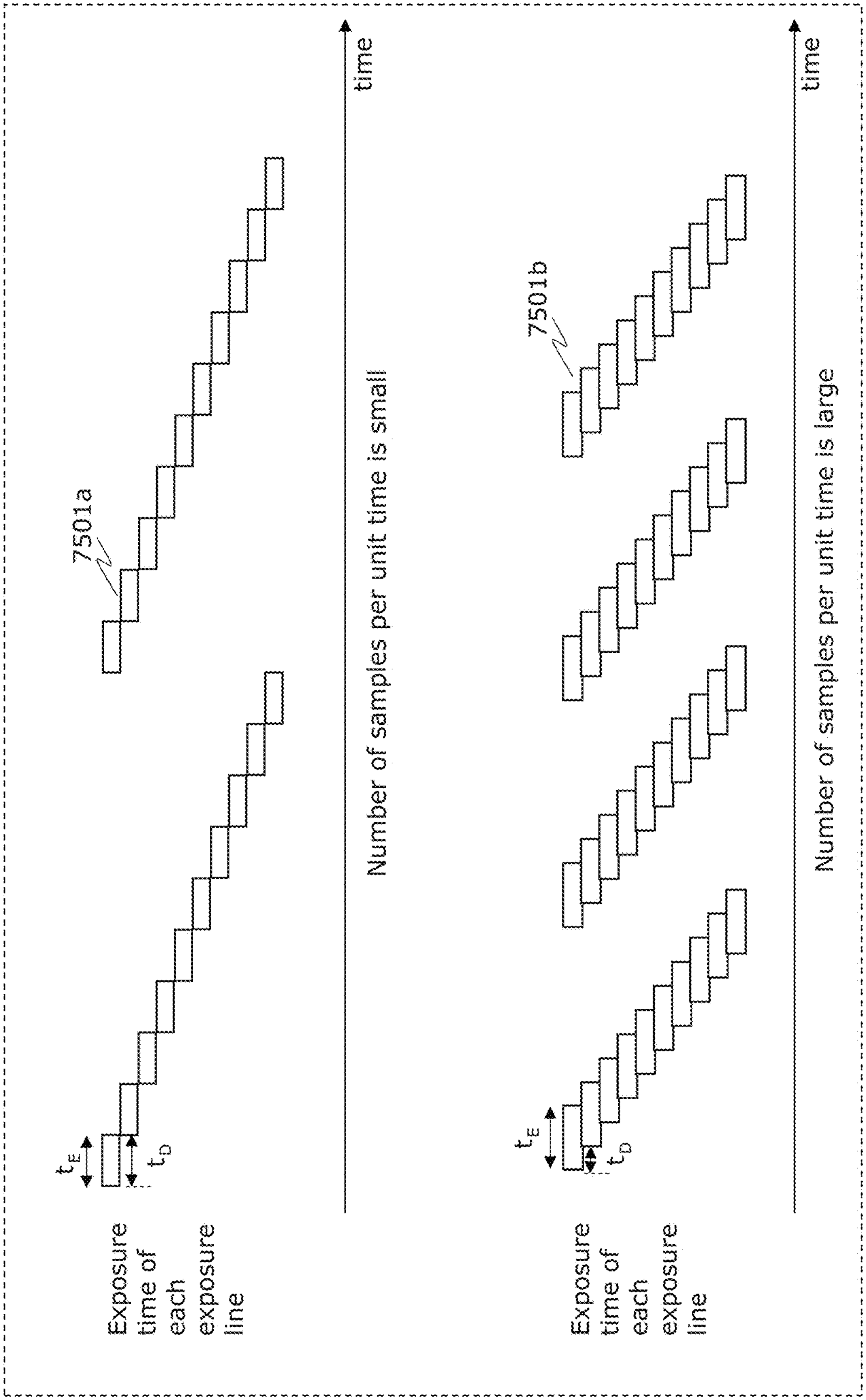
FIG. 5B is a diagram illustrating an example of an observation method of luminance of a light emitting unit in Embodiment 1.

FIG. 5B illustrates the influence of the difference in exposure start time of each exposure line in the case where the exposure time is the same. In 7501*a*, the exposure end time of one exposure line and the exposure start time of the next exposure line are the same. In 7501*b*, the exposure of one exposure line ends after the exposure of the next exposure line starts. The structure in which the exposure times of adjacent exposure lines partially overlap each other as in 7501*b* allows more lines to be exposed per unit time. This increases the resolution, so that more information can be obtained. Since the sample interval (i.e. the difference in exposure start time) is shorter, the luminance change of the light source can be estimated more accurately, contributing to a lower error rate. Moreover, the luminance change of the light source in a shorter time can be recognized. By exposure time overlap, light source blinking shorter than the exposure time can be recognized using the difference of the amount of exposure between adjacent exposure lines.

As described with reference to FIGS. 5A and 5B, in the structure in which each exposure line is sequentially exposed so that the exposure times of adjacent exposure lines partially overlap each other, the communication speed can be dramatically improved by using, for signal transmission, the bright line pattern generated by setting the exposure time shorter than in the normal imaging mode. Setting the exposure time in visible light communication to less than or equal to 1/480 second enables an appropriate bright line pattern to be generated. Here, it is necessary to set (exposure time)<1/8×f, where f is the frame frequency. Blanking during imaging is half of one frame at the maximum. That is, the blanking time is less than or equal to half of the imaging time. The actual imaging time is therefore 1/2f at the shortest. Besides, since 4-value information needs to be received within the time of 1/2f, it is necessary to at least set the exposure time to less than 1/(2f×4). Given that the normal frame rate is less than or equal to 60 frames per second, by setting the exposure time to less than or equal to 1/480 second, an appropriate bright line pattern is generated in the image data and thus fast signal transmission is achieved.

Figure 5C:
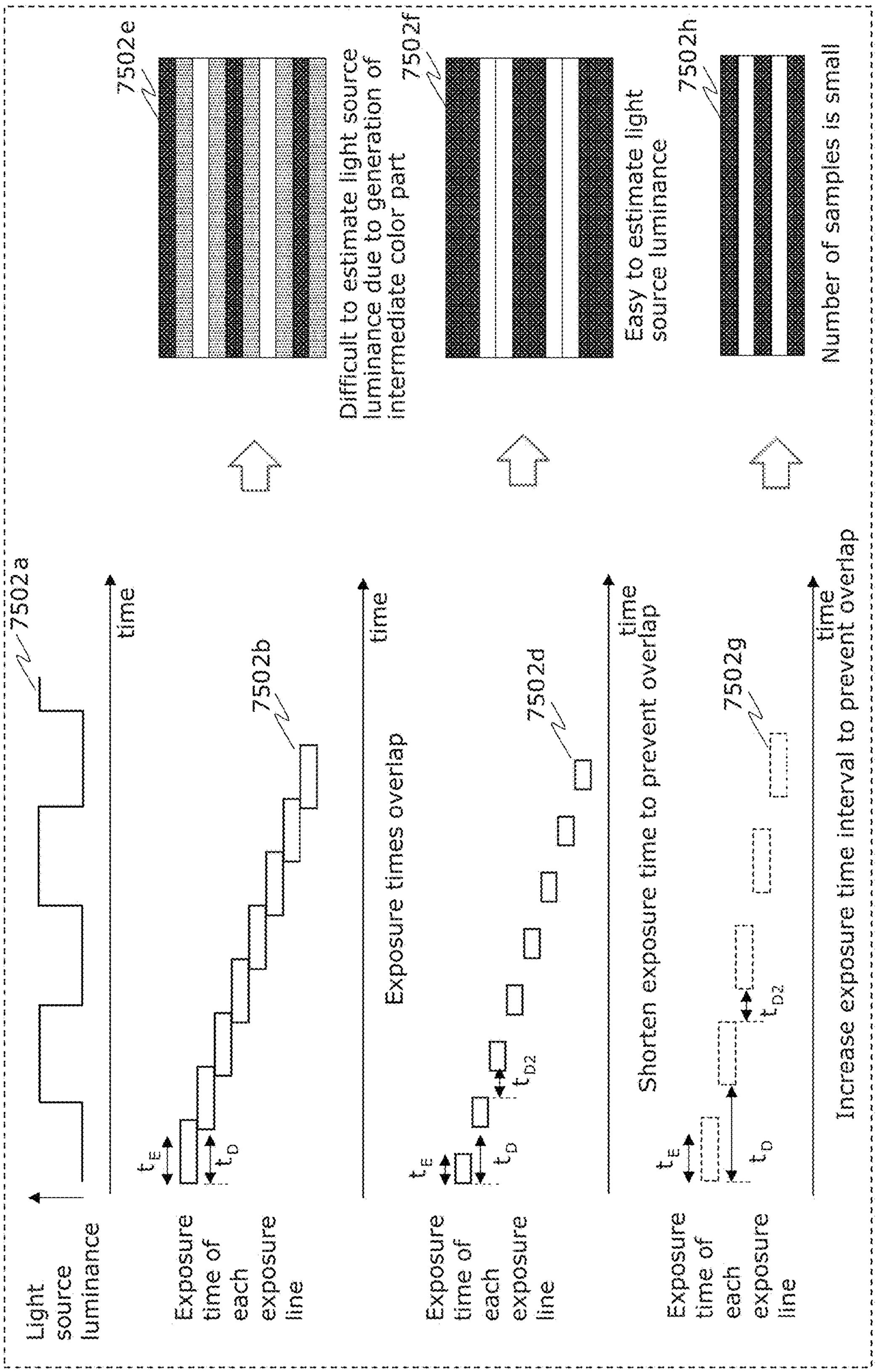
FIG. 5C is a diagram illustrating an example of an observation method of luminance of a light emitting unit in Embodiment 1.

FIG. 5C illustrates the advantage of using a short exposure time in the case where each exposure line does not overlap in exposure time. In the case where the exposure time is long, even when the light source changes in luminance in a binary fashion as in 7502*a*, an intermediate-color part tends to appear in the captured image as in 7502*e*, making it difficult to recognize the luminance change of the light source. By providing a predetermined non-exposure blank time (predetermined wait time) $t_{D2}$ from when the exposure of one exposure line ends to when the exposure of the next exposure line starts as in 7502*d*, however, the luminance change of the light source can be recognized more easily. That is, a more appropriate bright line pattern can be detected as in 7502*f*. The provision of the predetermined non-exposure blank time is possible by setting a shorter exposure time $t_E$ than the time difference $t_D$ between the exposure start times of the exposure lines, as in 7502*d*. In the case where the exposure times of adjacent exposure lines partially overlap each other in the normal imaging mode, the exposure time is shortened from the normal imaging mode so as to provide the predetermined non-exposure blank time. In the case where the exposure end time of one exposure line and the exposure start time of the next exposure line are the same in the normal imaging mode, too, the exposure time is shortened so as to provide the predetermined non-exposure time. Alternatively, the predetermined non-exposure blank time (predetermined wait time) $t_{D2}$ from when the exposure of one exposure line ends to when the exposure of the next exposure line starts may be provided by increasing the interval $t_D$ between the exposure start times of the exposure lines, as in 7502*g*. This structure allows a longer exposure time to be used, so that a brighter image can be captured. Moreover, a reduction in noise contributes to higher error tolerance. Meanwhile, this structure is disadvantageous in that the number of samples is small as in 7502*h*, because fewer exposure lines can be exposed in a predetermined time. Accordingly, it is desirable to use these structures depending on circumstances. For example, the estimation error of the luminance change of the light source can be reduced by using the former structure in the case where the imaging object is bright and using the latter structure in the case where the imaging object is dark.

Here, the structure in which the exposure times of adjacent exposure lines partially overlap each other does not need to be applied to all exposure lines, and part of the exposure lines may not have the structure of partially overlapping in exposure time. Moreover, the structure in which the predetermined non-exposure blank time (predetermined wait time) is provided from when the exposure of one exposure line ends to when the exposure of the next exposure line starts does not need to be applied to all exposure lines, and part of the exposure lines may have the structure of partially overlapping in exposure time. This makes it possible to take advantage of each of the structures. Furthermore, the same reading method or circuit may be used to read a signal in the normal imaging mode in which imaging is performed at the normal frame rate (30 fps, 60 fps) and the visible light communication mode in which imaging is performed with the exposure time less than or equal to 1/480 second for visible light communication. The use of the same reading method or circuit to read a signal eliminates the need to employ separate circuits for the normal imaging mode and the visible light communication mode. The circuit size can be reduced in this way.

Figure 5D:
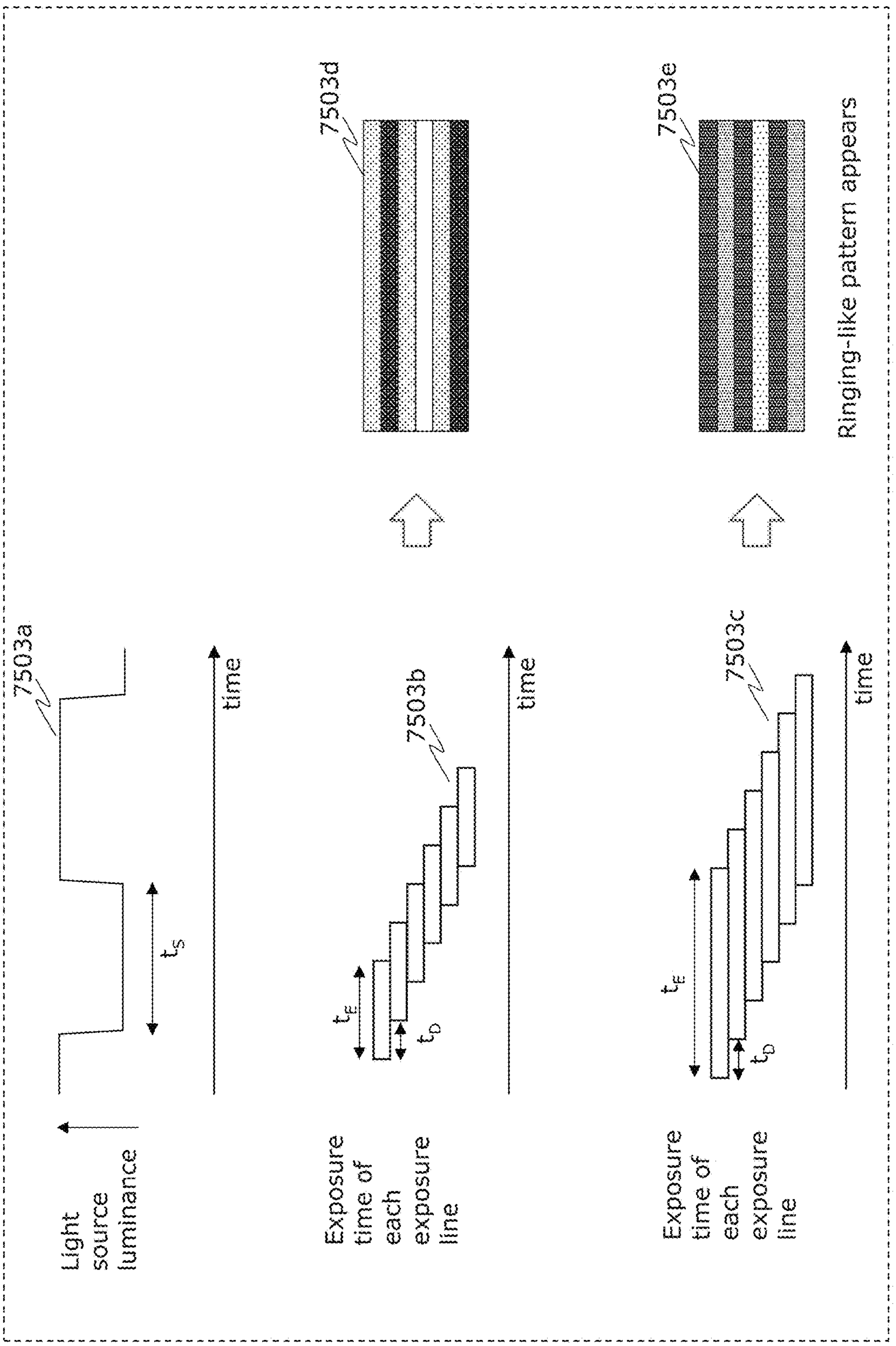
FIG. 5D is a diagram illustrating an example of an observation method of luminance of a light emitting unit in Embodiment 1.

FIG. 5D illustrates the relation between the minimum change time $t_S$ of light source luminance, the exposure time $t_E$, the time difference $t_D$ between the exposure start times of the exposure lines, and the captured image. In the case where $t_E+t_D<t_S$, imaging is always performed in a state where the light source does not change from the start to end of the exposure of at least one exposure line. As a result, an image with clear luminance is obtained as in 7503*d*, from which the luminance change of the light source is easily recognizable. In the case where $2t_E>t_S$, a bright line pattern different from the luminance change of the light source might be obtained, making it difficult to recognize the luminance change of the light source from the captured image.

Figure 5E:
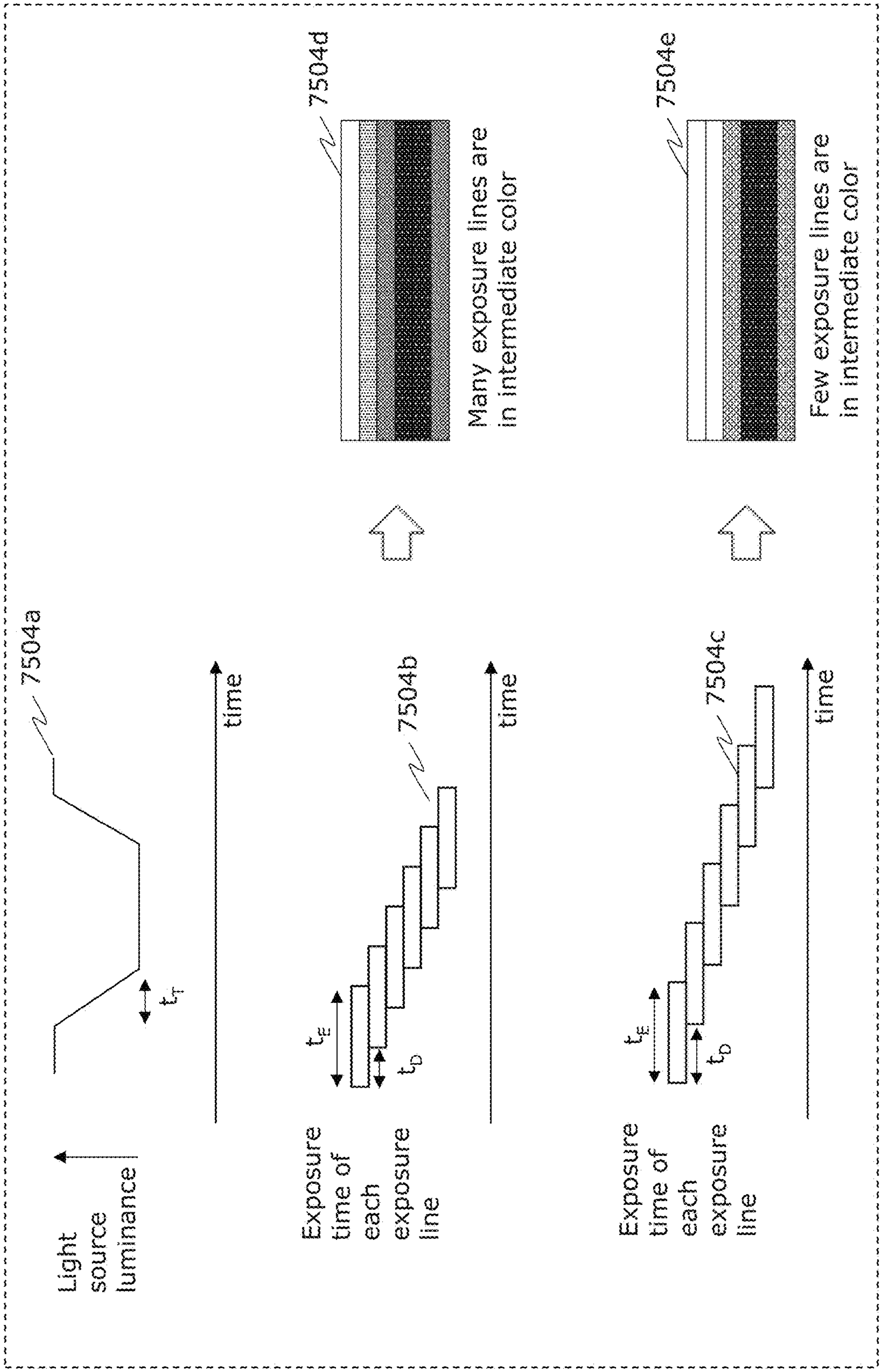
FIG. 5E is a diagram illustrating an example of an observation method of luminance of a light emitting unit in Embodiment 1.

FIG. 5E illustrates the relation between the transition time $t_T$ of light source luminance and the time difference $t_D$ between the exposure start times of the exposure lines. When $t_D$ is large as compared with $t_T$, fewer exposure lines are in the intermediate color, which facilitates estimation of light source luminance. It is desirable that $t_D>t_T$, because the number of exposure lines in the intermediate color is two or less consecutively. Since $t_T$ is less than or equal to 1 microsecond in the case where the light source is an LED and about 5 microseconds in the case where the light source is an organic EL device, setting $t_D$ to greater than or equal to 5 microseconds facilitates estimation of light source luminance.

Figure 5F:
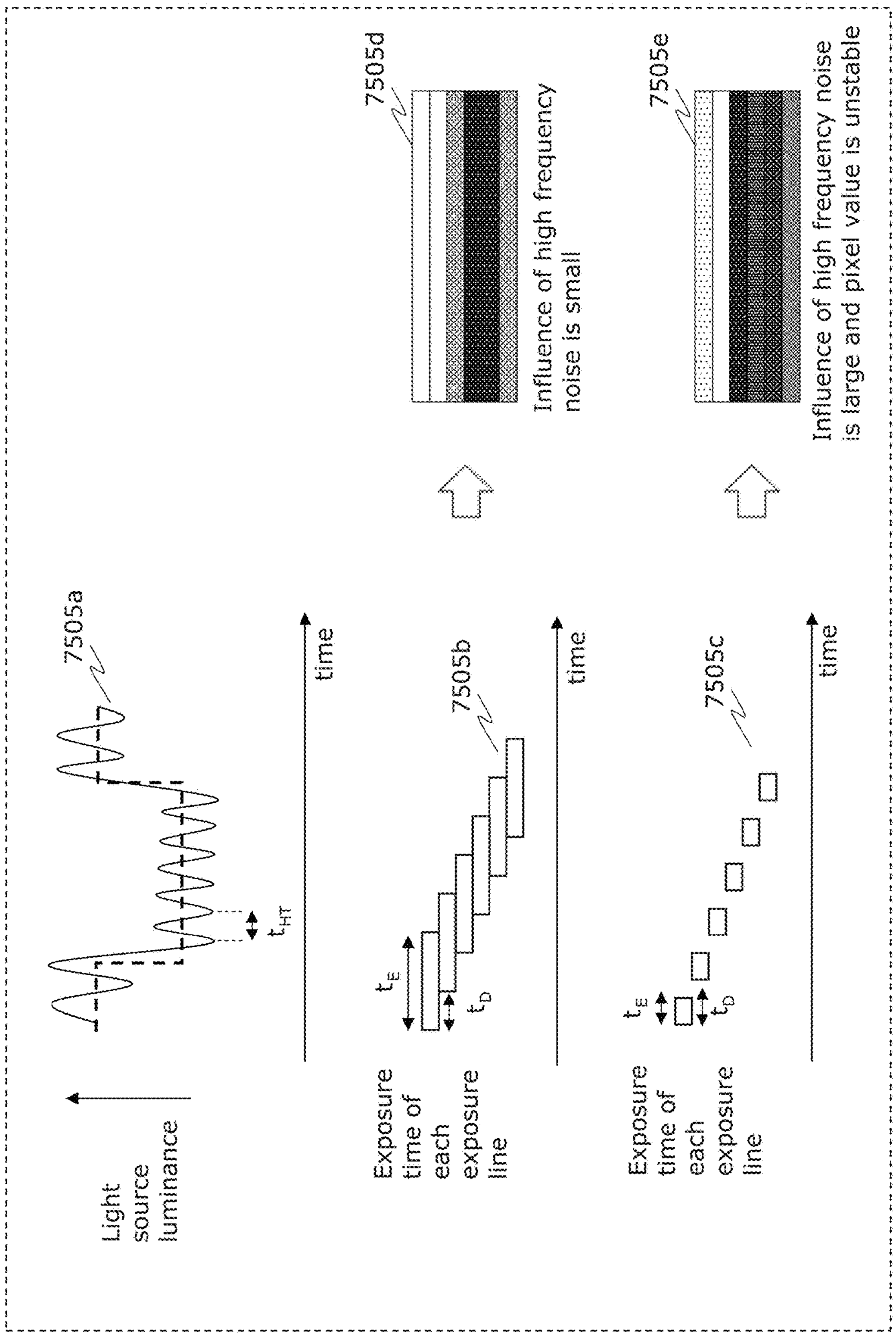
FIG. 5F is a diagram illustrating an example of an observation method of luminance of a light emitting unit in Embodiment 1.

FIG. 5F illustrates the relation between the high frequency noise $t_{HT}$ of light source luminance and the exposure time $t_E$. When $t_E$ is large as compared with $t_{HT}$, the captured image is less influenced by high frequency noise, which facilitates estimation of light source luminance. When $t_E$ is an integral multiple of $t_{HT}$, there is no influence of high frequency noise, and estimation of light source luminance is easiest. For estimation of light source luminance, it is desirable that $t_E>t_{HT}$. High frequency noise is mainly caused by a switching power supply circuit. Since $t_{HT}$ is less than or equal to 20 microseconds in many switching power supplies for lightings, setting $t_E$ to greater than or equal to 20 microseconds facilitates estimation of light source luminance.

Figure 5G:
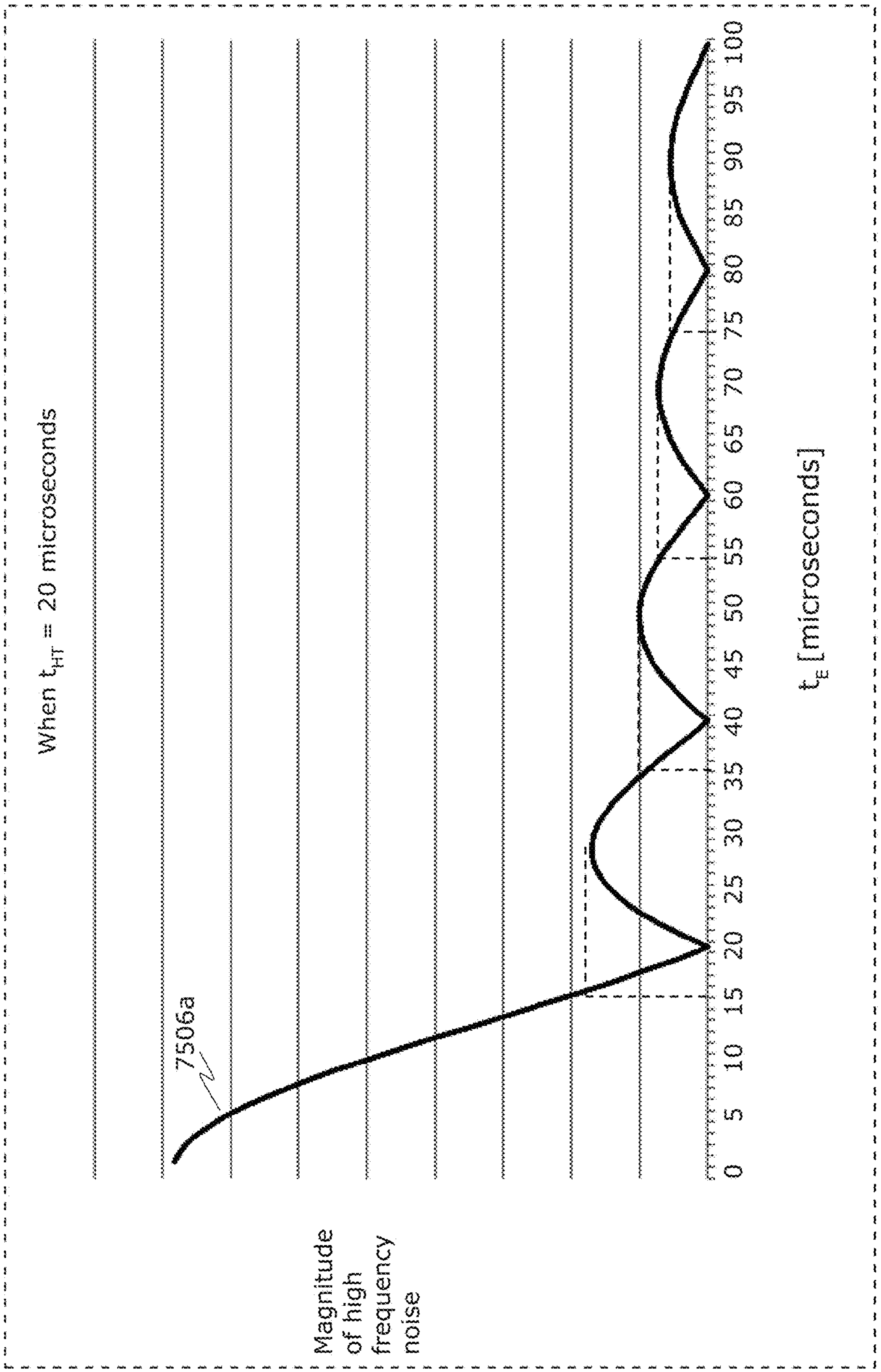
FIG. 5G is a diagram illustrating an example of an observation method of luminance of a light emitting unit in Embodiment 1.

FIG. 5G is a graph representing the relation between the exposure time $t_E$ and the magnitude of high frequency noise when $t_{HT}$ is 20 microseconds. Given that $t_{HT}$ varies depending on the light source, the graph demonstrates that it is efficient to set $t_E$ to greater than or equal to 15 microseconds, greater than or equal to 35 microseconds, greater than or equal to 54 microseconds, or greater than or equal to 74 microseconds, each of which is a value equal to the value when the amount of noise is at the maximum. Though $t_E$ is desirably larger in terms of high frequency noise reduction, there is also the above-mentioned property that, when $t_E$ is smaller, an intermediate-color part is less likely to occur and estimation of light source luminance is easier. Therefore, $t_E$ may be set to greater than or equal to 15 microseconds when the light source luminance change period is 15 to 35 microseconds, to greater than or equal to 35 microseconds when the light source luminance change period is 35 to 54 microseconds, to greater than or equal to 54 microseconds when the light source luminance change period is 54 to 74 microseconds, and to greater than or equal to 74 microseconds when the light source luminance change period is greater than or equal to 74 microseconds.

Figure 5H:
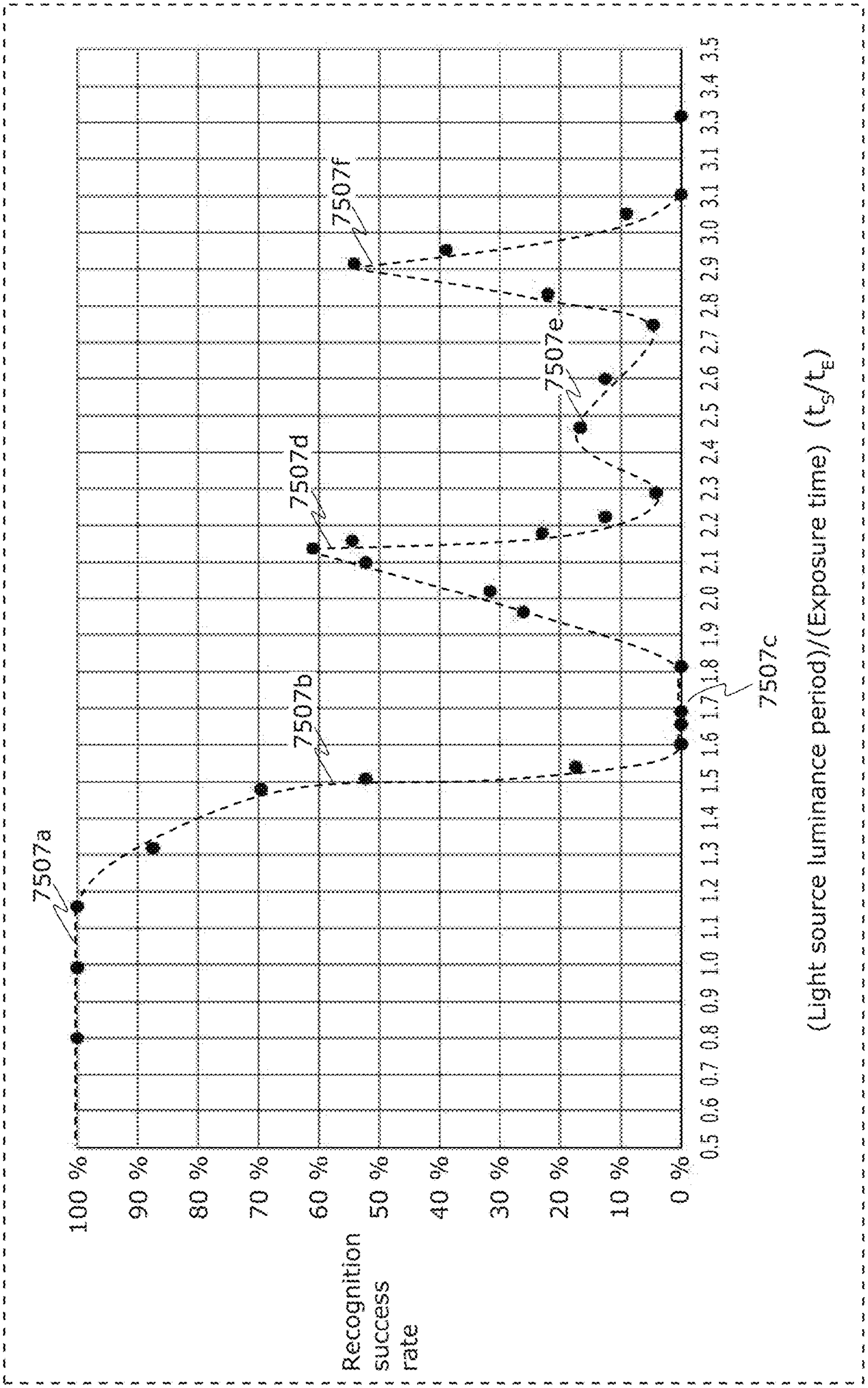
FIG. 5H is a diagram illustrating an example of an observation method of luminance of a light emitting unit in Embodiment 1.

FIG. 5H illustrates the relation between the exposure time $t_E$ and the recognition success rate. Since the exposure time $t_E$ is relative to the time during which the light source luminance is constant, the horizontal axis represents the value (relative exposure time) obtained by dividing the light source luminance change period $i_S$ by the exposure time $t_E$. It can be understood from the graph that the recognition success rate of approximately 100% can be attained by setting the relative exposure time to less than or equal to 1.2. For example, the exposure time may be set to less than or equal to approximately 0.83 millisecond in the case where the transmission signal is 1 kHz. Likewise, the recognition success rate greater than or equal to 95% can be attained by setting the relative exposure time to less than or equal to 1.25, and the recognition success rate greater than or equal to 80% can be attained by setting the relative exposure time to less than or equal to 1.4. Moreover, since the recognition success rate sharply decreases when the relative exposure time is about 1.5 and becomes roughly 0% when the relative exposure time is 1.6, it is necessary to set the relative exposure time not to exceed 1.5. After the recognition rate becomes 0% at 7507*c*, it increases again at 7507*d*, 7507*e*, and 7507*f*. Accordingly, for example to capture a bright image with a longer exposure time, the exposure time may be set so that the relative exposure time is 1.9 to 2.2, 2.4 to 2.6, or 2.8 to 3.0. Such an exposure time may be used, for instance, as an intermediate mode in FIG. 7.

Figure 6A:
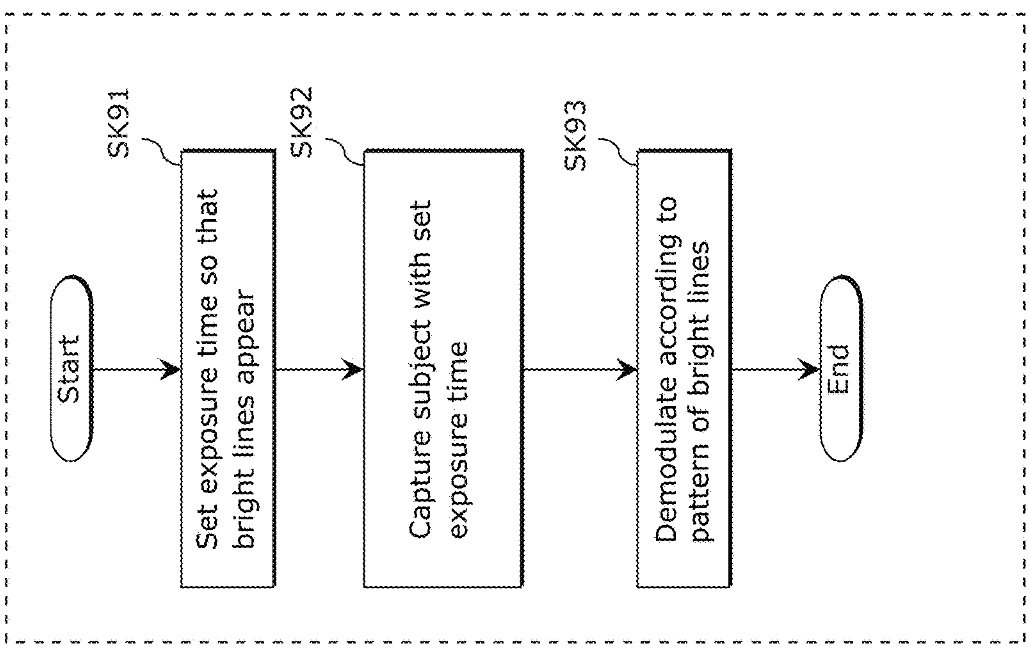
FIG. 6A is a flowchart of an information communication method in Embodiment 1.

FIG. 6A is a flowchart of an information communication method in this embodiment.

The information communication method in this embodiment is an information communication method of obtaining information from a subject, and includes Steps SK91 to SK93.

In detail, the information communication method includes: a first exposure time setting step SK91 of setting a first exposure time of an image sensor so that, in an image obtained by capturing the subject by the image sensor, a plurality of bright lines corresponding to a plurality of exposure lines included in the image sensor appear according to a change in luminance of the subject; a first image obtainment step SK92 of obtaining a bright line image including the plurality of bright lines, by capturing the subject changing in luminance by the image sensor with the set first exposure time; and an information obtainment step SK93 of obtaining the information by demodulating data specified by a pattern of the plurality of bright lines included in the obtained bright line image, wherein in the first image obtainment step SK92, exposure starts sequentially for the plurality of exposure lines each at a different time, and exposure of each of the plurality of exposure lines starts after a predetermined blank time elapses from when exposure of an adjacent exposure line adjacent to the exposure line ends.

Figure 6B:
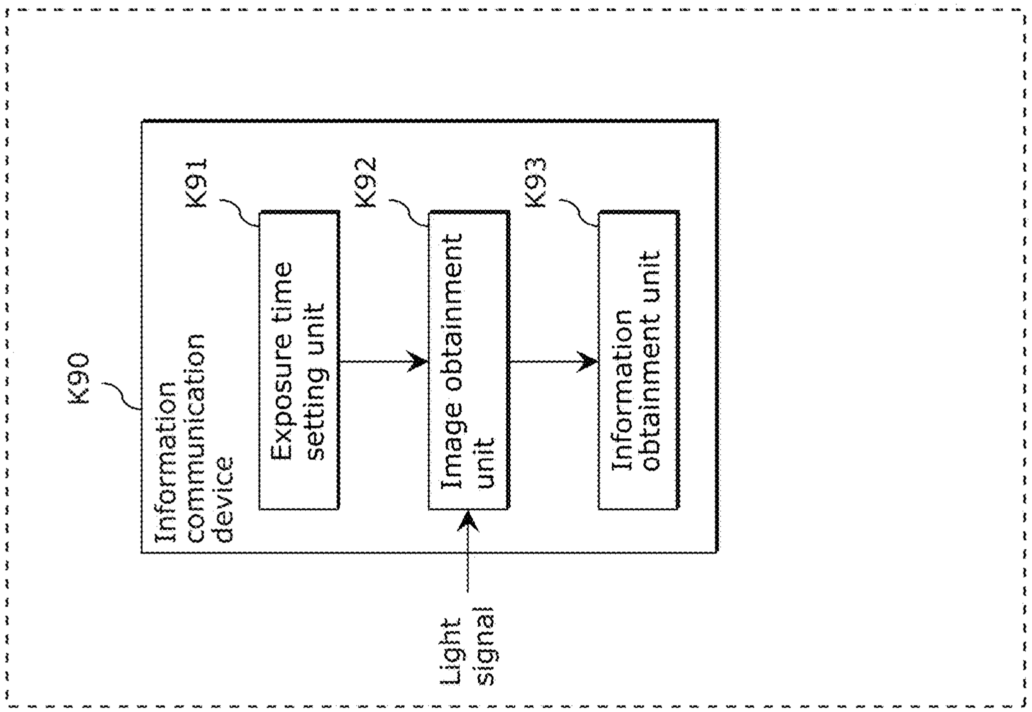
FIG. 6B is a block diagram of an information communication device in Embodiment 1.

FIG. 6B is a block diagram of an information communication device in this embodiment.

An information communication device K90 in this embodiment is an information communication device that obtains information from a subject, and includes structural elements K91 to K93.

In detail, the information communication device K90 includes: an exposure time setting unit K91 that sets an exposure time of an image sensor so that, in an image obtained by capturing the subject by the image sensor, a plurality of bright lines corresponding to a plurality of exposure lines included in the image sensor appear according to a change in luminance of the subject; an image obtainment unit K92 that includes the image sensor, and obtains a bright line image including the plurality of bright lines by capturing the subject changing in luminance with the set exposure time; and an information obtainment unit K93 that obtains the information by demodulating data specified by a pattern of the plurality of bright lines included in the obtained bright line image, wherein exposure starts sequentially for the plurality of exposure lines each at a different time, and exposure of each of the plurality of exposure lines starts after a predetermined blank time elapses from when exposure of an adjacent exposure line adjacent to the exposure line ends.

In the information communication method and the information communication device K90 illustrated in FIGS. 6A and 6B, the exposure of each of the plurality of exposure lines starts a predetermined blank time after the exposure of the adjacent exposure line adjacent to the exposure line ends, for instance as illustrated in FIG. 5C. This eases the recognition of the change in luminance of the subject. As a result, the information can be appropriately obtained from the subject.

It should be noted that in the above embodiment, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. For example, the program causes a computer to execute the information communication method illustrated in the flowchart of FIG. 6A.

Embodiment 2

This embodiment describes each example of application using a receiver such as a smartphone which is the information communication device K90 and a transmitter for transmitting information as a blink pattern of the light source such as an LED or an organic EL device in Embodiment 1 described above.

Figure 7:
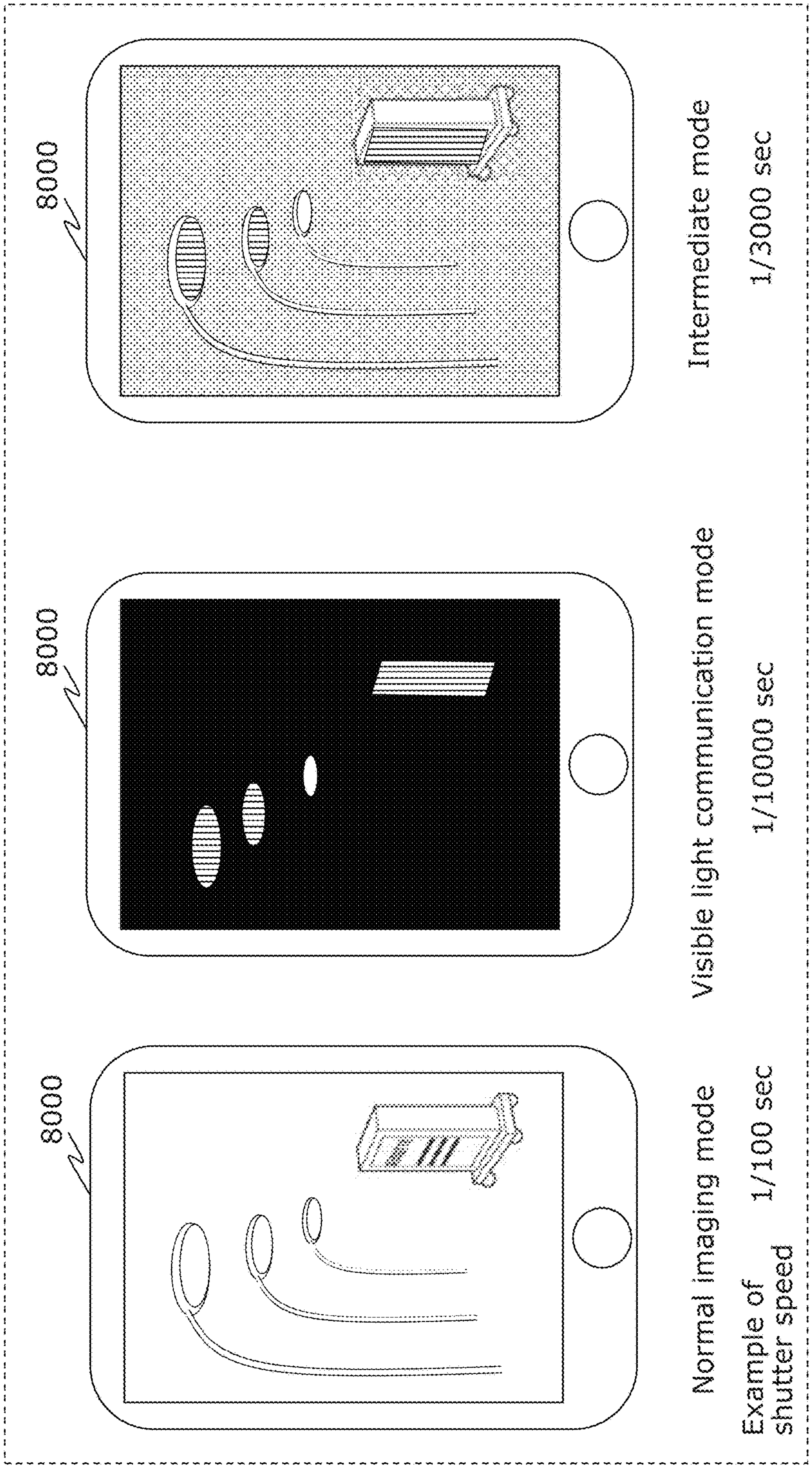
FIG. 7 is a diagram illustrating an example of each mode of a receiver in Embodiment 2.

FIG. 7 is a diagram illustrating an example of each mode of a receiver in this embodiment.

In the normal imaging mode, a receiver 8000 performs imaging at a shutter speed of 1/100 second as an example to obtain a normal captured image, and displays the normal captured image on a display. For example, a subject such as a street lighting or a signage as a store sign and its surroundings are clearly shown in the normal captured image.

In the visible light communication mode, the receiver 8000 performs imaging at a shutter speed of 1/10000 second as an example, to obtain a visible light communication image. For example, in the case where the above-mentioned street lighting or signage is transmitting a signal by way of luminance change as the light source described in Embodiment 1, that is, a transmitter, one or more bright lines (hereafter referred to as "bright line pattern") are shown in the signal transmission part of the visible light communication image, while nothing is shown in the other part. That is, in the visible light communication image, only the bright line pattern is shown and the part of the subject not changing in luminance and the surroundings of the subject are not shown.

In the intermediate mode, the receiver 8000 performs imaging at a shutter speed of 1/3000 second as an example, to obtain an intermediate image. In the intermediate image, the bright line pattern is shown, and the part of the subject not changing in luminance and the surroundings of the subject are shown, too. By the receiver 8000 displaying the intermediate image on the display, the user can find out from where or from which position the signal is being transmitted. Note that the bright line pattern, the subject, and its surroundings shown in the intermediate image are not as clear as the bright line pattern in the visible light communication image and the subject and its surroundings in the normal captured image respectively, but have the level of clarity recognizable by the user.

In the following description, the normal imaging mode or imaging in the normal imaging mode is referred to as "normal imaging", and the visible light communication mode or imaging in the visible light communication mode is referred to as "visible light imaging" (visible light communication). Imaging in the intermediate mode may be used instead of normal imaging and visible light imaging, and the intermediate image may be used instead of the below-mentioned synthetic image.

Figure 8:
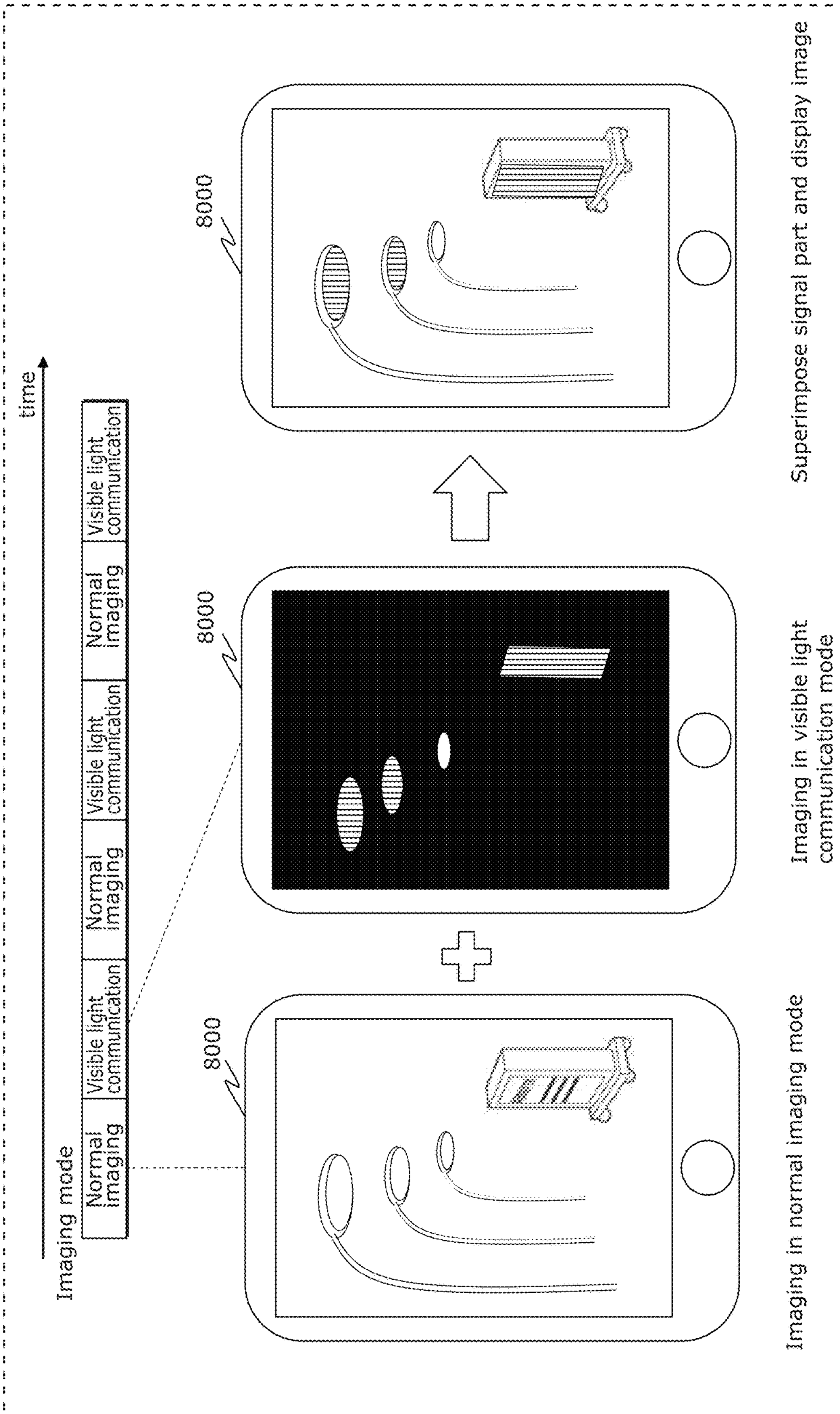
FIG. 8 is a diagram illustrating an example of imaging operation of a receiver in Embodiment 2.

FIG. 8 is a diagram illustrating an example of imaging operation of a receiver in this embodiment.

The receiver 8000 switches the imaging mode in such a manner as normal imaging, visible light communication, normal imaging, . . . . The receiver 8000 synthesizes the normal captured image and the visible light communication image to generate a synthetic image in which the bright line pattern, the subject, and its surroundings are clearly shown, and displays the synthetic image on the display. The synthetic image is an image generated by superimposing the bright line pattern of the visible light communication image on the signal transmission part of the normal captured image. The bright line pattern, the subject, and its surroundings shown in the synthetic image are clear, and have the level of clarity sufficiently recognizable by the user. Displaying such a synthetic image enables the user to more distinctly find out from which position the signal is being transmitted.

Figure 9:
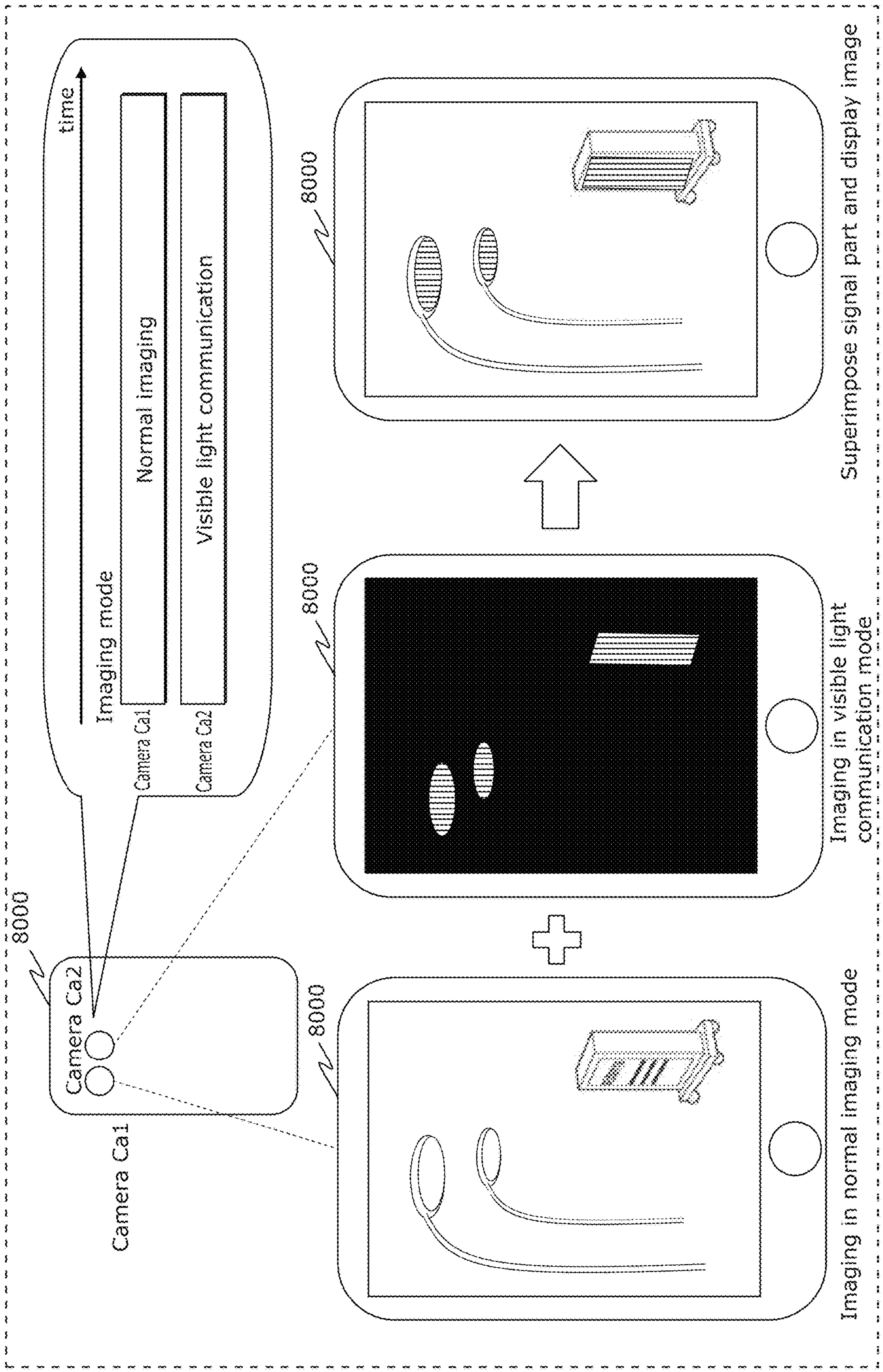
FIG. 9 is a diagram illustrating another example of imaging operation of a receiver in Embodiment 2.

FIG. 9 is a diagram illustrating another example of imaging operation of a receiver in this embodiment.

The receiver 8000 includes a camera Ca1 and a camera Ca2. In the receiver 8000, the camera Ca1 performs normal imaging, and the camera Ca2 performs visible light imaging. Thus, the camera Ca1 obtains the above-mentioned normal captured image, and the camera Ca2 obtains the above-mentioned visible light communication image. The receiver 8000 synthesizes the normal captured image and the visible light communication image to generate the above-mentioned synthetic image, and displays the synthetic image on the display.

Figures 10A, 10B, 10C:
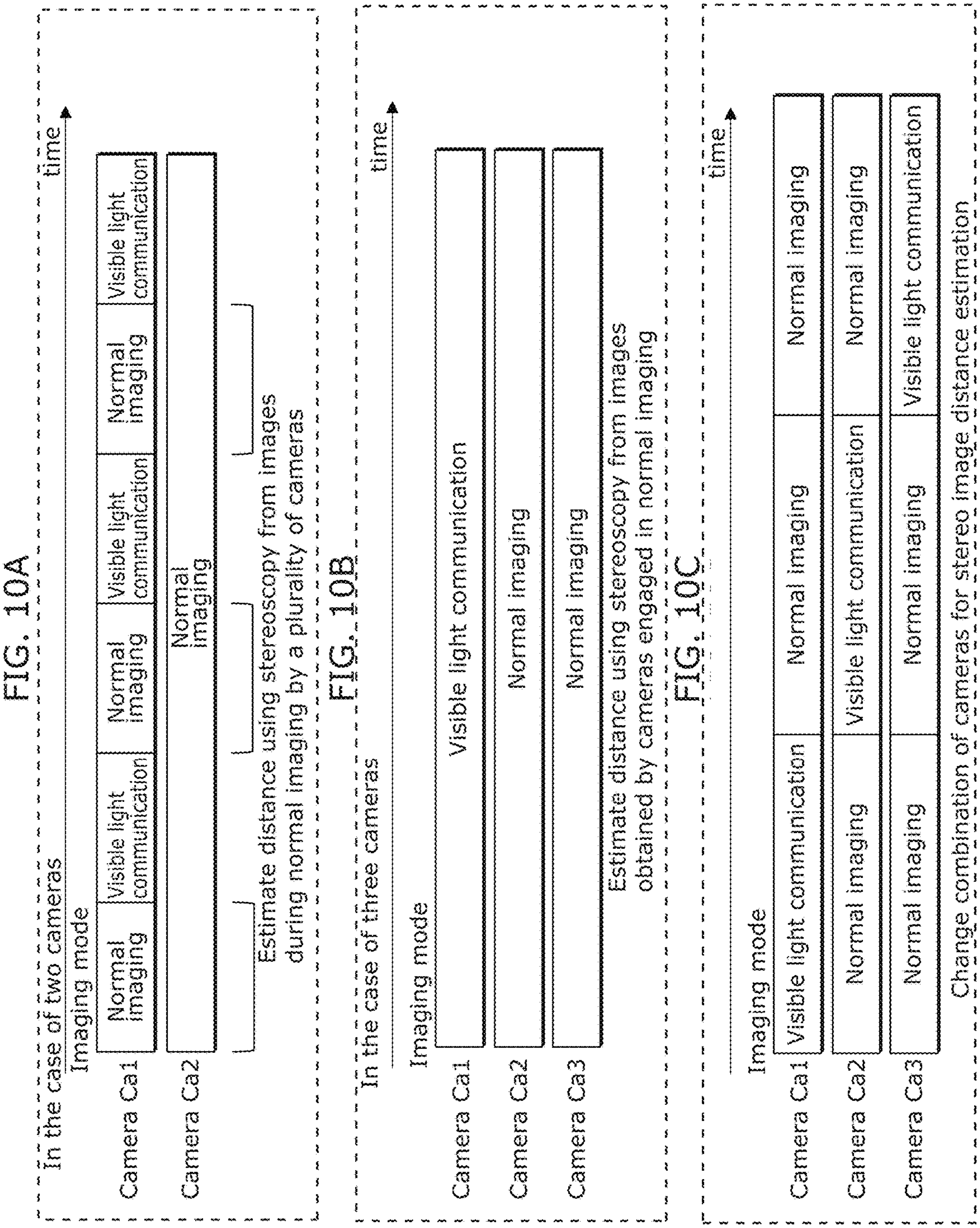
FIG. 10A is a diagram illustrating another example of imaging operation of a receiver in Embodiment 2.
FIG. 10B is a diagram illustrating another example of imaging operation of a receiver in Embodiment 2.

FIG. 10A is a diagram illustrating another example of imaging operation of a receiver in this embodiment.

In the receiver 8000 including two cameras, the camera Ca1 switches the imaging mode in such a manner as normal imaging, visible light communication, normal imaging, . . . . Meanwhile, the camera Ca2 continuously performs normal imaging. When normal imaging is being performed by the cameras Ca1 and Ca2 simultaneously, the receiver 8000 estimates the distance (hereafter referred to as "subject distance") from the receiver 8000 to the subject based on the normal captured images obtained by these cameras, through the use of stereoscopy (triangulation principle). By using such estimated subject distance, the receiver 8000 can superimpose the bright line pattern of the visible light communication image on the normal captured image at the appropriate position. The appropriate synthetic image can be generated in this way.

FIG. 10B is a diagram illustrating another example of imaging operation of a receiver in this embodiment.

The receiver 8000 includes three cameras (cameras Ca1, Ca2, and Ca3) as an example. In the receiver 8000, two cameras (cameras Ca2 and Ca3) continuously perform normal imaging, and the remaining camera (camera Ca1) continuously performs visible light communication. Hence, the subject distance can be estimated at any timing, based on the normal captured images obtained by two cameras engaged in normal imaging.

FIG. 10C is a diagram illustrating another example of imaging operation of a receiver in this embodiment.

The receiver 8000 includes three cameras (cameras Ca1, Ca2, and Ca3) as an example. In the receiver 8000, each camera switches the imaging mode in such a manner as normal imaging, visible light communication, normal imaging, . . . . The imaging mode of each camera is switched per period so that, in one period, two cameras perform normal imaging and the remaining camera performs visible light communication. That is, the combination of cameras engaged in normal imaging is changed periodically. Hence, the subject distance can be estimated in any period, based on the normal captured images obtained by two cameras engaged in normal imaging.

Figure 11A:
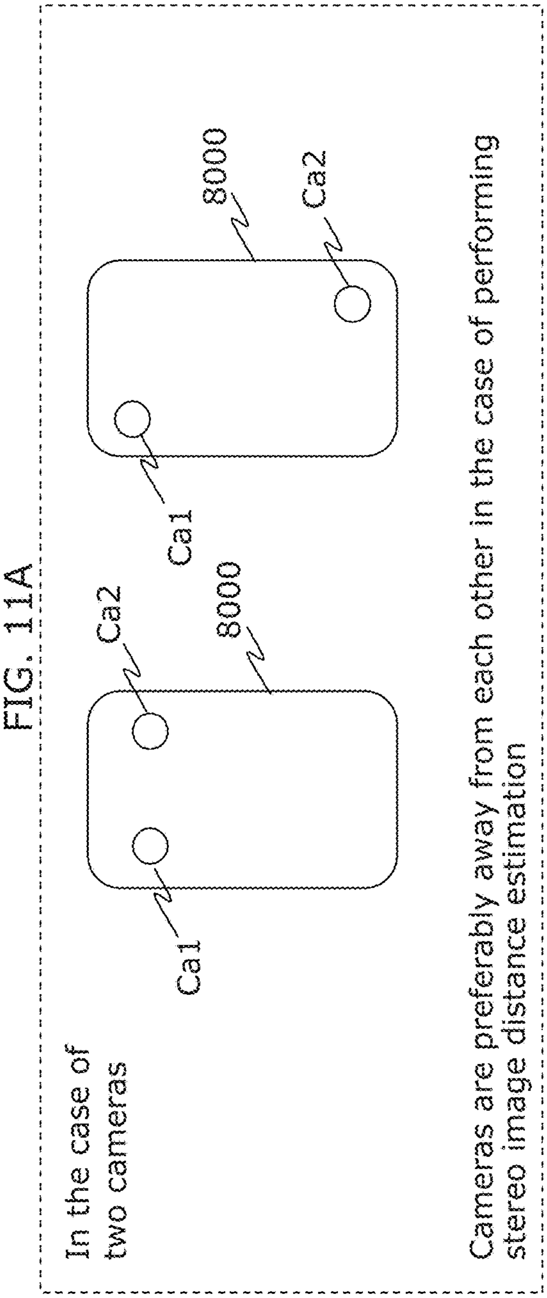
FIG. 11A is a diagram illustrating an example of camera arrangement of a receiver in Embodiment 2.

FIG. 11A is a diagram illustrating an example of camera arrangement of a receiver in this embodiment.

In the case where the receiver 8000 includes two cameras Ca1 and Ca2, the two cameras Ca1 and Ca2 are positioned away from each other as illustrated in FIG. 11A. The subject distance can be accurately estimated in this way. In other words, the subject distance can be estimated more accurately when the distance between two cameras is longer.

Figure 11B:
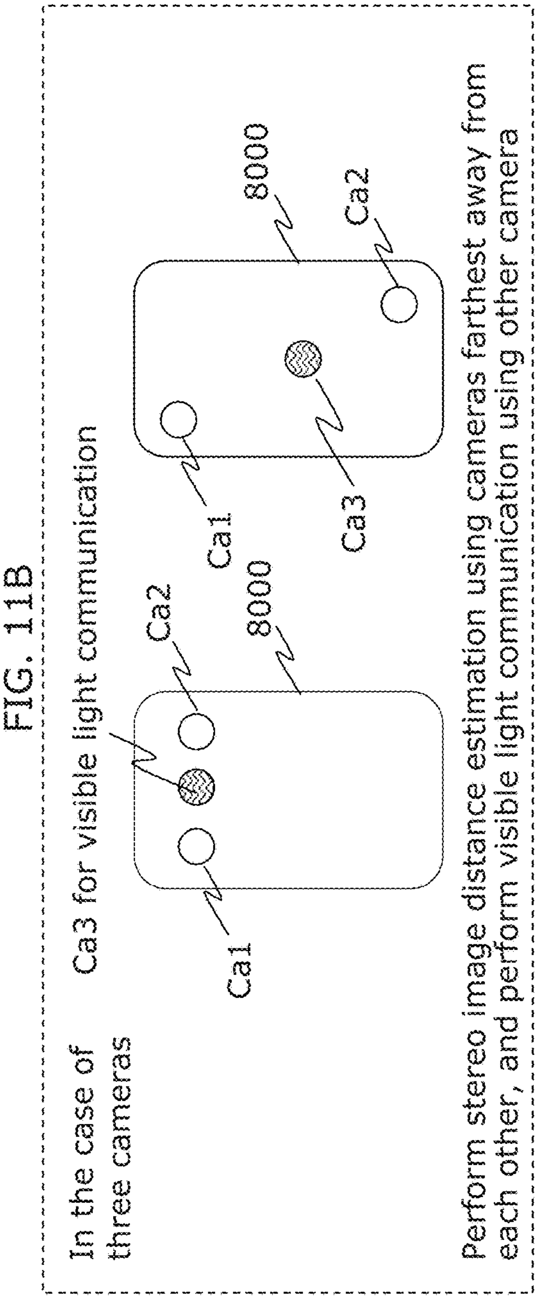
FIG. 11B is a diagram illustrating another example of camera arrangement of a receiver in Embodiment 2.

FIG. 11B is a diagram illustrating another example of camera arrangement of a receiver in this embodiment.

In the case where the receiver 8000 includes three cameras Ca1, Ca2, and Ca3, the two cameras Ca1 and Ca2 for normal imaging are positioned away from each other as illustrated in FIG. 11B, and the camera Ca3 for visible light communication is, for example, positioned between the cameras Ca1 and Ca2. The subject distance can be accurately estimated in this way. In other words, the subject distance can be accurately estimated by using two farthest cameras for normal imaging.

Figure 12:
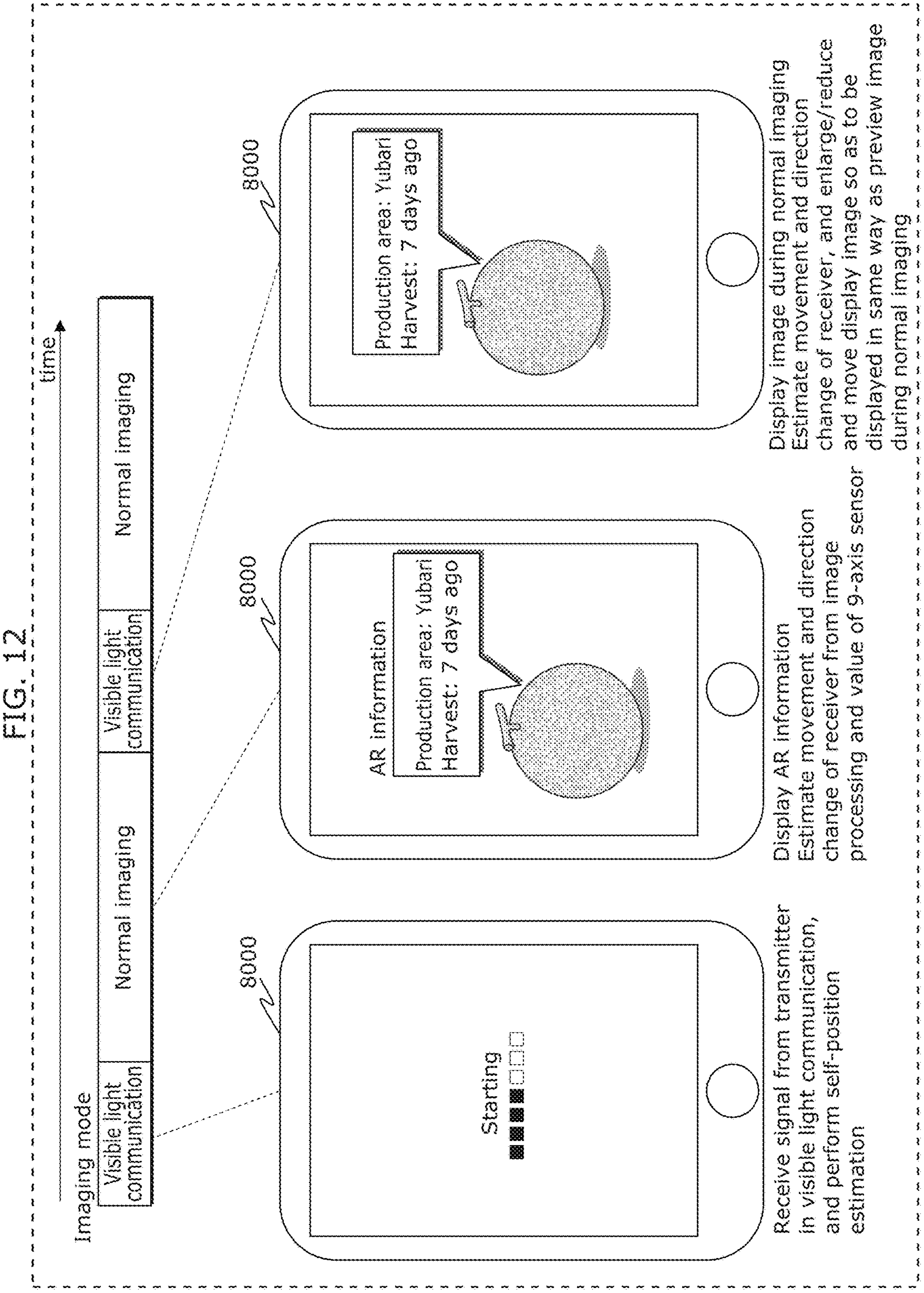
FIG. 12 is a diagram illustrating an example of display operation of a receiver in Embodiment 2.

FIG. 12 is a diagram illustrating an example of display operation of a receiver in this embodiment.

The receiver 8000 switches the imaging mode in such a manner as visible light communication, normal imaging, visible light communication, . . . , as mentioned above. Upon performing visible light communication first, the receiver 8000 starts an application program. The receiver 8000 then estimates its position based on the signal received by visible light communication. Next, when performing normal imaging, the receiver 8000 displays AR (Augmented Reality) information on the normal captured image obtained by normal imaging. The AR information is obtained based on, for example, the position estimated as mentioned above. The receiver 8000 also estimates the change in movement and direction of the receiver 8000 based on the detection result of the 9-axis sensor, the motion detection in the normal captured image, and the like, and moves the display position of the AR information according to the estimated change in movement and direction. This enables the AR information to follow the subject image in the normal captured image.

When switching the imaging mode from normal imaging to visible light communication, in visible light communication the receiver 8000 superimposes the AR information on the latest normal captured image obtained in immediately previous normal imaging. The receiver 8000 then displays the normal captured image on which the AR information is superimposed. The receiver 8000 also estimates the change in movement and direction of the receiver 8000 based on the detection result of the 9-axis sensor, and moves the AR information and the normal captured image according to the estimated change in movement and direction, in the same way as in normal imaging. This enables the AR information to follow the subject image in the normal captured image according to the movement of the receiver 8000 and the like in visible light communication, as in normal imaging. Moreover, the normal image can be enlarged or reduced according to the movement of the receiver 8000 and the like.

Figure 13:
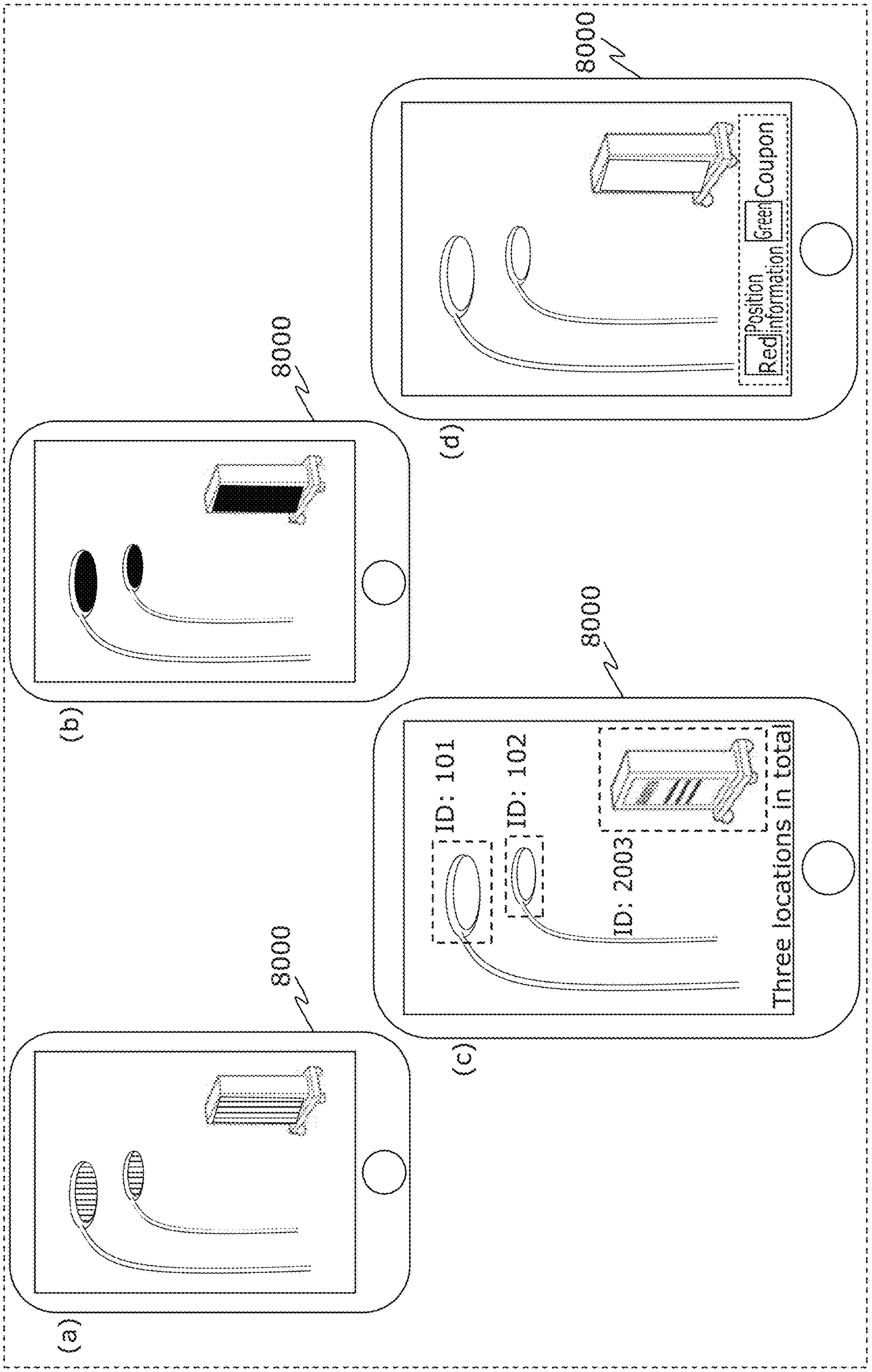
FIG. 13 is a diagram illustrating an example of display operation of a receiver in Embodiment 2.

FIG. 13 is a diagram illustrating an example of display operation of a receiver in this embodiment.

For example, the receiver 8000 may display the synthetic image in which the bright line pattern is shown, as illustrated in (a) in FIG. 13. As an alternative, the receiver 8000 may superimpose, instead of the bright line pattern, a signal specification object which is an image having a predetermined color for notifying signal transmission on the normal captured image to generate the synthetic image, and display the synthetic image, as illustrated in (b) in FIG. 13.

As another alternative, the receiver 8000 may display, as the synthetic image, the normal captured image in which the signal transmission part is indicated by a dotted frame and an identifier (e.g. ID: 101, ID: 102, etc.), as illustrated in (c) in FIG. 13. As another alternative, the receiver 8000 may superimpose, instead of the bright line pattern, a signal identification object which is an image having a predetermined color for notifying transmission of a specific type of signal on the normal captured image to generate the synthetic image, and display the synthetic image, as illustrated in (d) in FIG. 13. In this case, the color of the signal identification object differs depending on the type of signal output from the transmitter. For example, a red signal identification object is superimposed in the case where the signal output from the transmitter is position information, and a green signal identification object is superimposed in the case where the signal output from the transmitter is a coupon.

Figure 14:
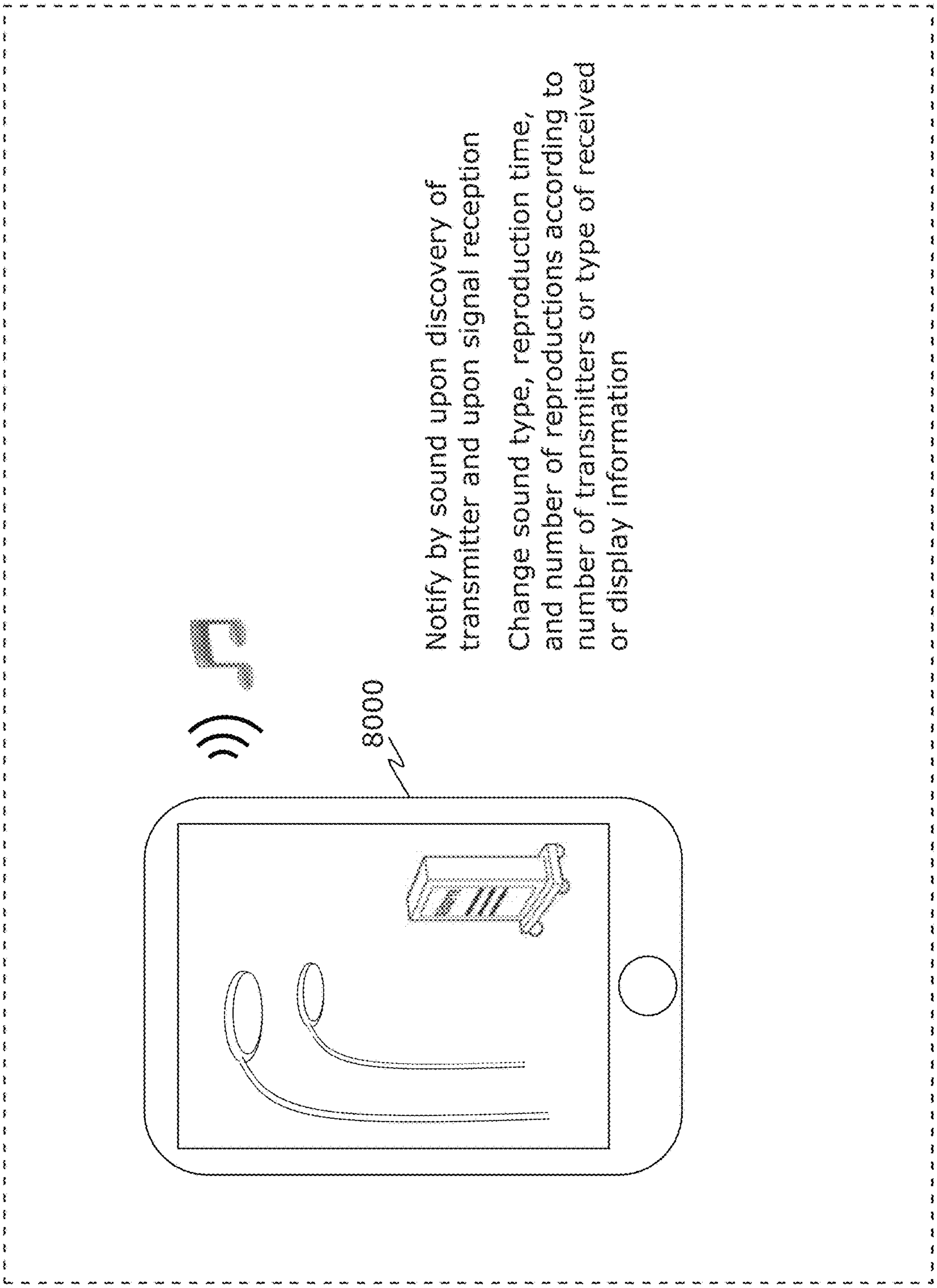
FIG. 14 is a diagram illustrating an example of operation of a receiver in Embodiment 2.

FIG. 14 is a diagram illustrating an example of display operation of a receiver in this embodiment.

For example, in the case of receiving the signal by visible light communication, the receiver 8000 may output a sound for notifying the user that the transmitter has been discovered, while displaying the normal captured image. In this case, the receiver 8000 may change the type of output sound, the number of outputs, or the output time depending on the number of discovered transmitters, the type of received signal, the type of information specified by the signal, or the like.

Figure 15:
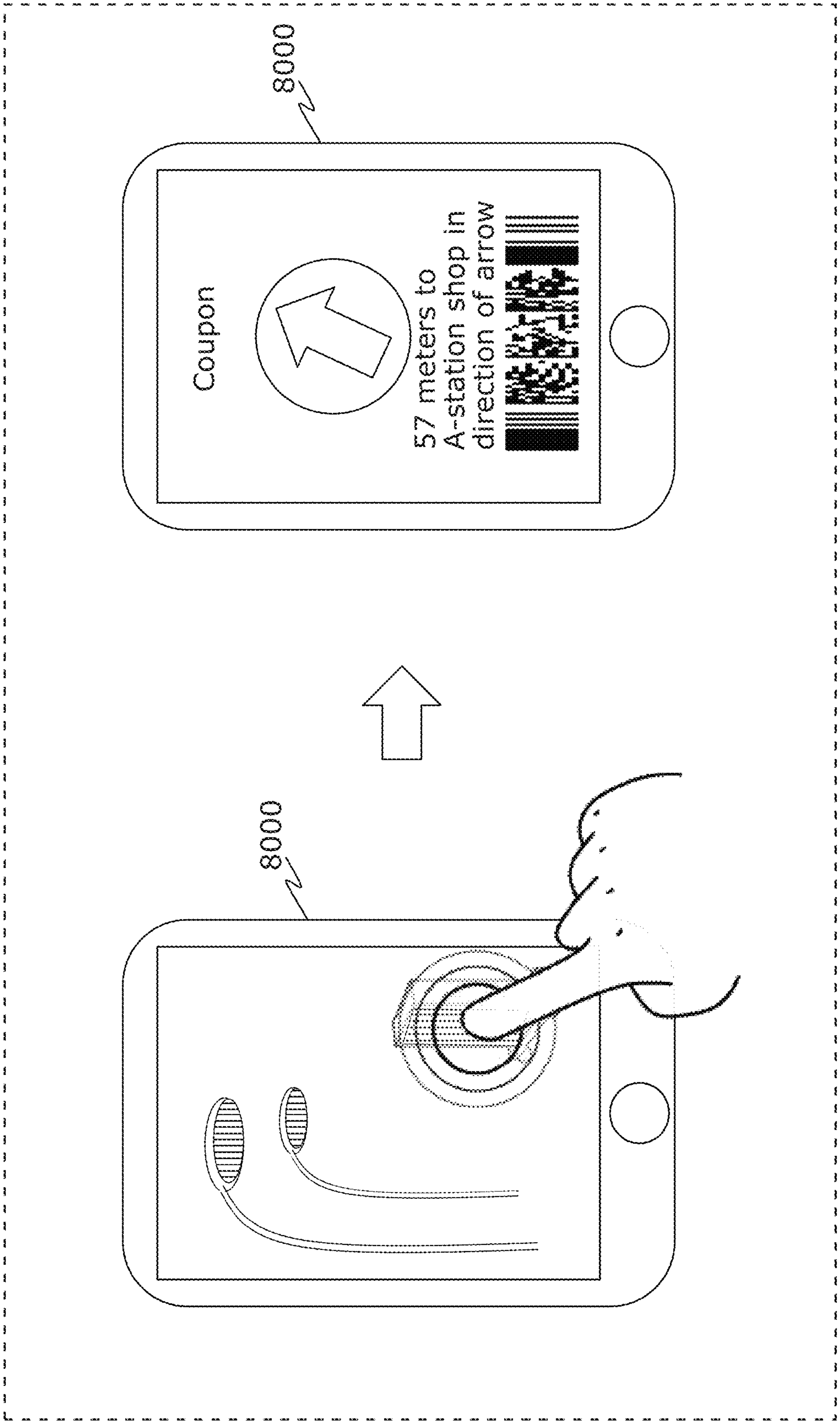
FIG. 15 is a diagram illustrating another example of operation of a receiver in Embodiment 2.

FIG. 15 is a diagram illustrating another example of operation of a receiver in this embodiment.

For example, when the user touches the bright line pattern shown in the synthetic image, the receiver 8000 generates an information notification image based on the signal transmitted from the subject corresponding to the touched bright line pattern, and displays the information notification image. The information notification image indicates, for example, a coupon or a location of a store. The bright line pattern may be the signal specification object, the signal identification object, or the dotted frame illustrated in FIG. 13. The same applies to the below-mentioned bright line pattern.

Figure 16:
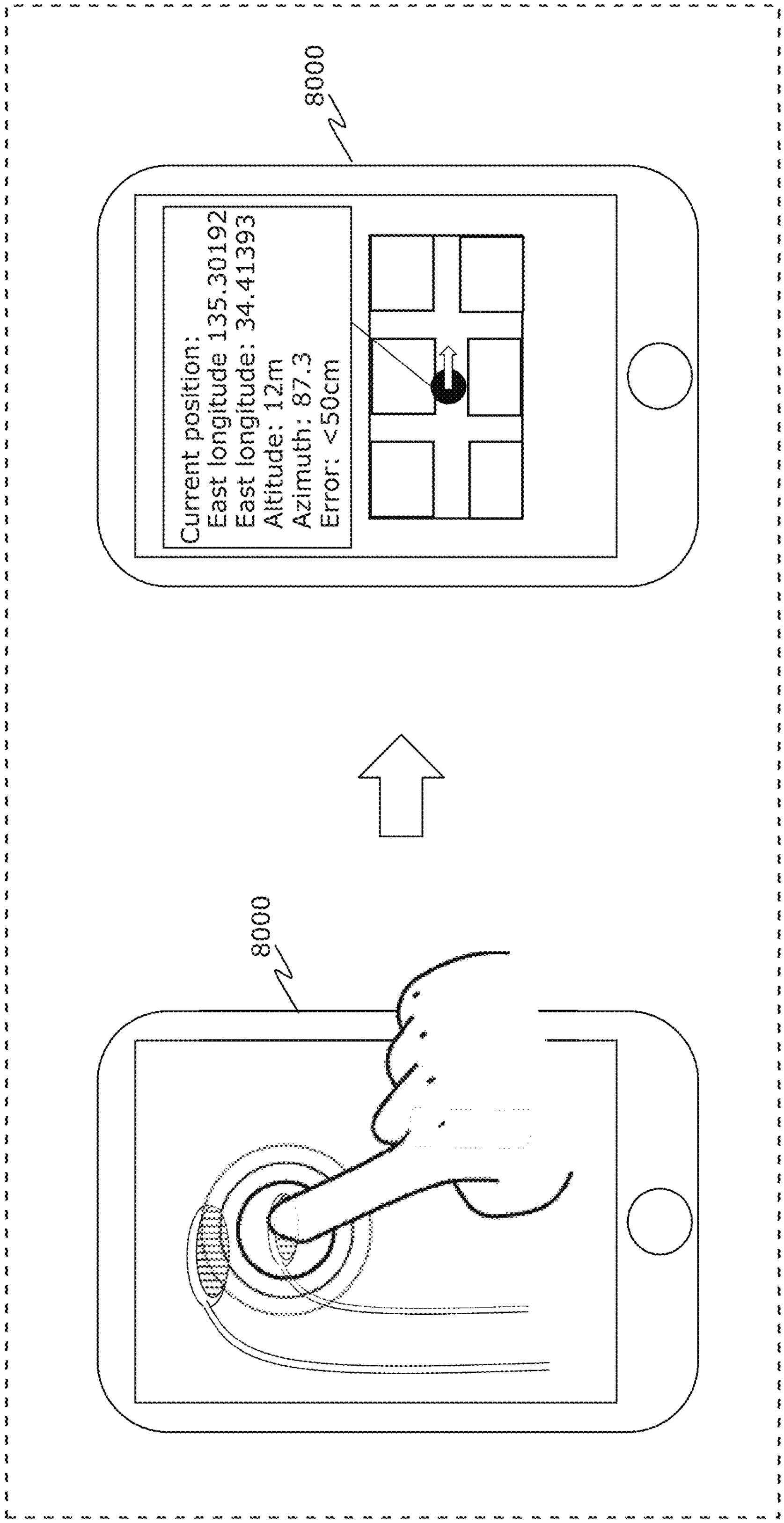
FIG. 16 is a diagram illustrating another example of operation of a receiver in Embodiment 2.

FIG. 16 is a diagram illustrating another example of operation of a receiver in this embodiment.

For example, when the user touches the bright line pattern shown in the synthetic image, the receiver 8000 generates an information notification image based on the signal transmitted from the subject corresponding to the touched bright line pattern, and displays the information notification image. The information notification image indicates, for example, the current position of the receiver 8000 by a map or the like.

Figure 17:
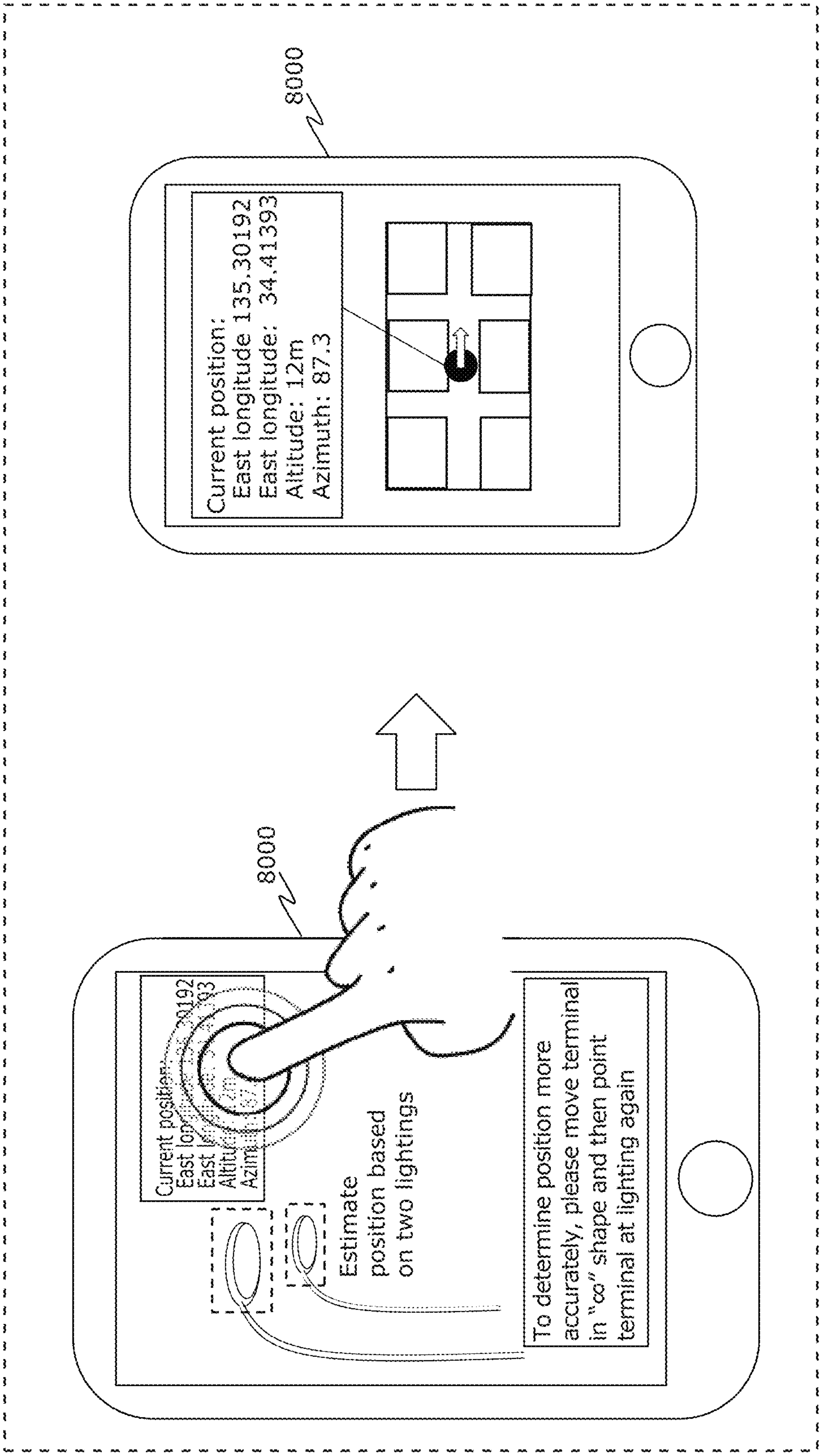
FIG. 17 is a diagram illustrating another example of operation of a receiver in Embodiment 2.

FIG. 17 is a diagram illustrating another example of operation of a receiver in this embodiment.

For example, the receiver 8000 receives signals from two street lightings which are subjects as transmitters. The receiver 8000 estimates the current position of the receiver 8000 based on these signals, in the same way as above. The receiver 8000 then displays the normal captured image, and also superimposes an information notification image (an image showing latitude, longitude, and the like) indicating the estimation result on the normal captured image. The receiver 8000 may also display an auxiliary information notification image on the normal captured image. For instance, the auxiliary information notification image prompts the user to perform an operation for calibrating the 9-axis sensor (particularly the geomagnetic sensor), i.e. an operation for drift cancellation. As a result of such an operation, the current position can be estimated with high accuracy.

When the user touches the displayed information notification image, the receiver 8000 may display the map showing the estimated position, instead of the normal captured image.

Figure 18:
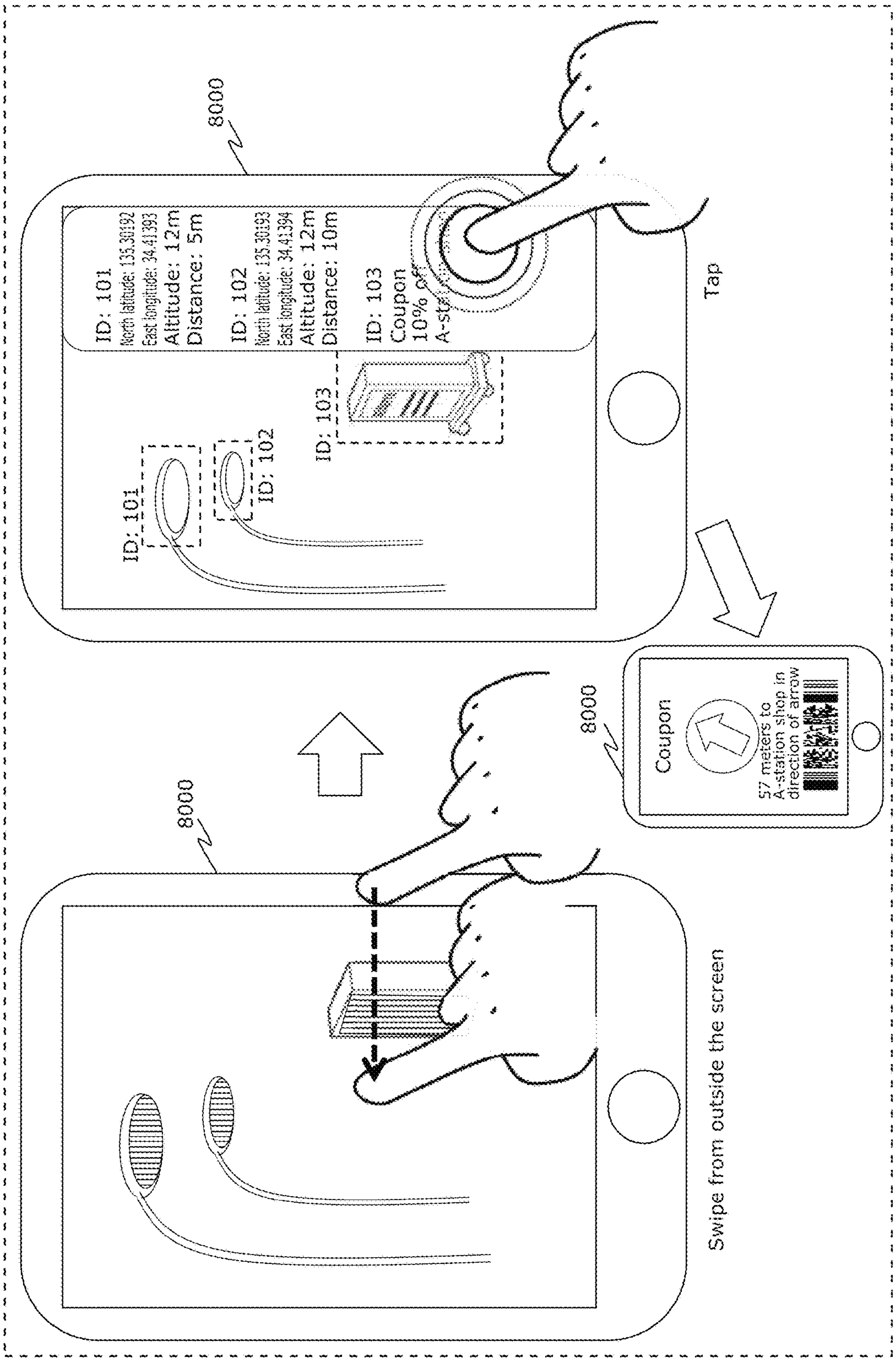
FIG. 18 is a diagram illustrating another example of operation of a receiver in Embodiment 2.

FIG. 18 is a diagram illustrating another example of operation of a receiver in this embodiment.

For example, when the user swipes on the receiver 8000 on which the synthetic image is displayed, the receiver 8000 displays the normal captured image including the dotted frame and the identifier like the normal captured image illustrated in (c) in FIG. 13, and also displays a list of information to follow the swipe operation. The list includes information specified by the signal transmitted from the part (transmitter) identified by each identifier. The swipe may be, for example, an operation of moving the user's finger from outside the display of the receiver 8000 on the right side into the display. The swipe may be an operation of moving the user's finger from the top, bottom, or left side of the display into the display.

When the user taps information included in the list, the receiver 8000 may display an information notification image (e.g. an image showing a coupon) indicating the information in more detail.

Figure 19:
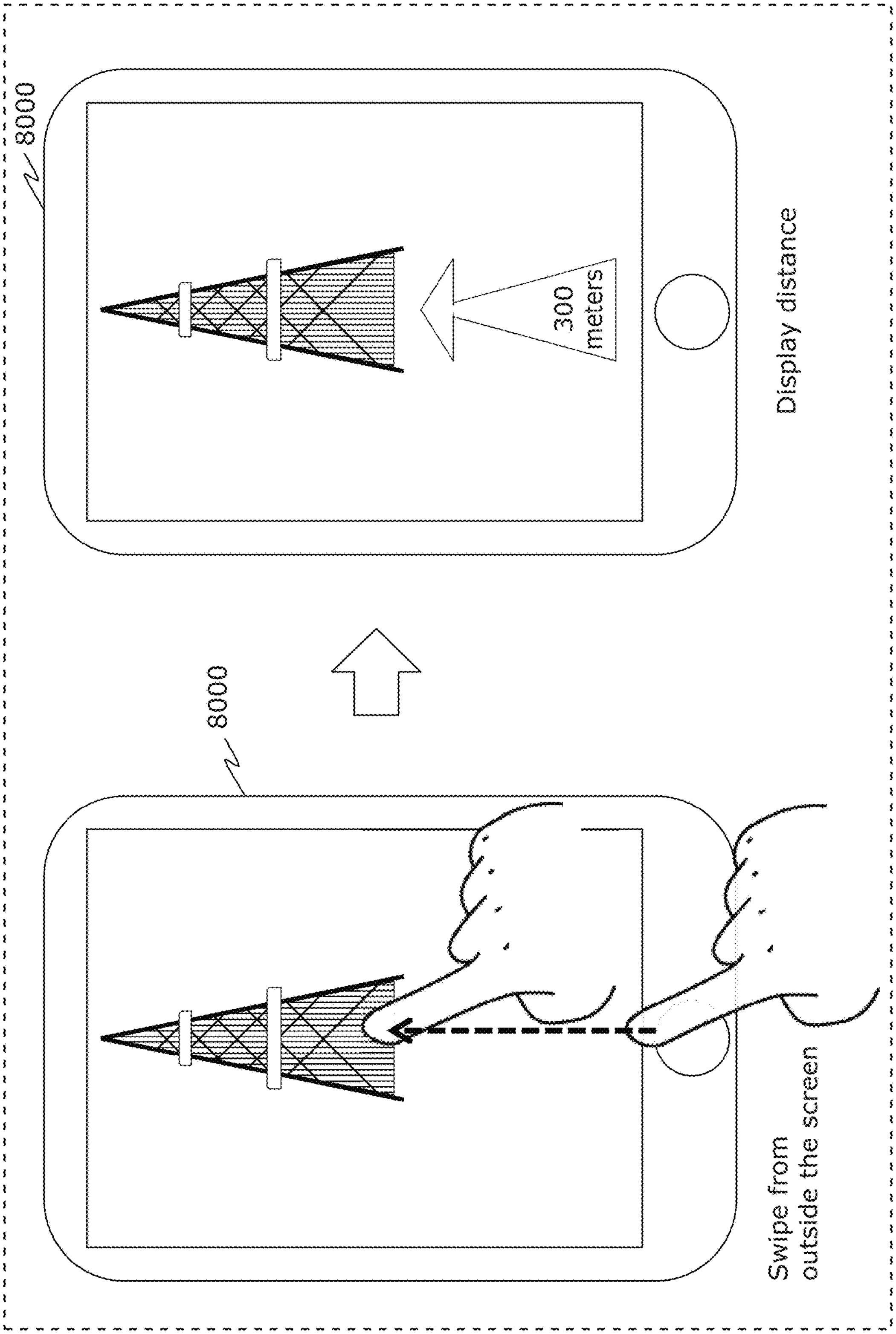
FIG. 19 is a diagram illustrating another example of operation of a receiver in Embodiment 2.

FIG. 19 is a diagram illustrating another example of operation of a receiver in this embodiment.

For example, when the user swipes on the receiver 8000 on which the synthetic image is displayed, the receiver 8000 superimposes an information notification image on the synthetic image, to follow the swipe operation. The information notification image indicates the subject distance with an arrow so as to be easily recognizable by the user. The swipe may be, for example, an operation of moving the user's finger from outside the display of the receiver 8000 on the bottom side into the display. The swipe may be an operation of moving the user's finger from the left, top, or right side of the display into the display.

Figure 20:
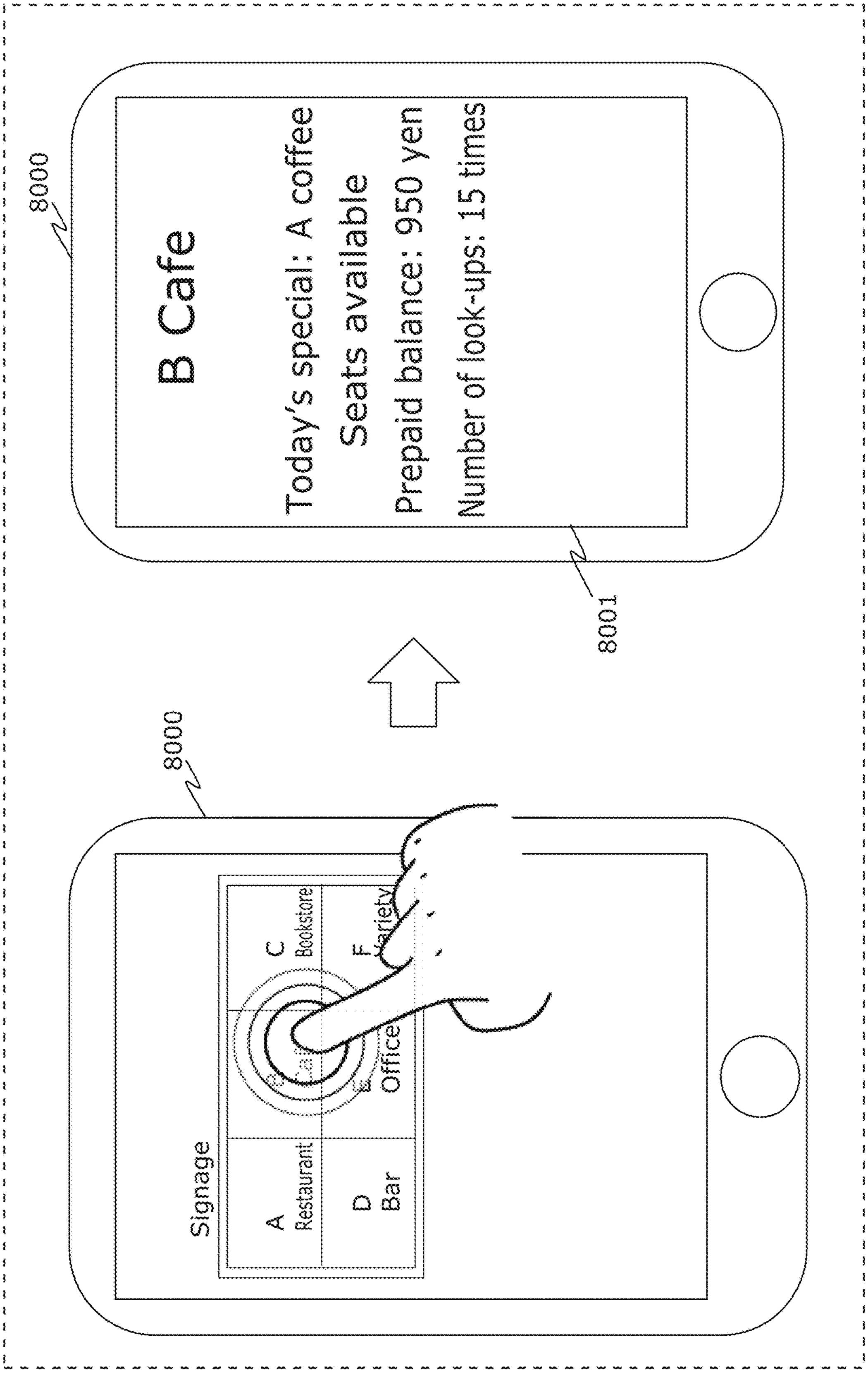
FIG. 20 is a diagram illustrating another example of operation of a receiver in Embodiment 2.

FIG. 20 is a diagram illustrating another example of operation of a receiver in this embodiment.

For example, the receiver 8000 captures, as a subject, a transmitter which is a signage showing a plurality of stores, and displays the normal captured image obtained as a result. When the user taps a signage image of one store included in the subject shown in the normal captured image, the receiver 8000 generates an information notification image based on the signal transmitted from the signage of the store, and displays an information notification image 8001. The information notification image 8001 is, for example, an image showing the availability of the store and the like.

Figure 21:
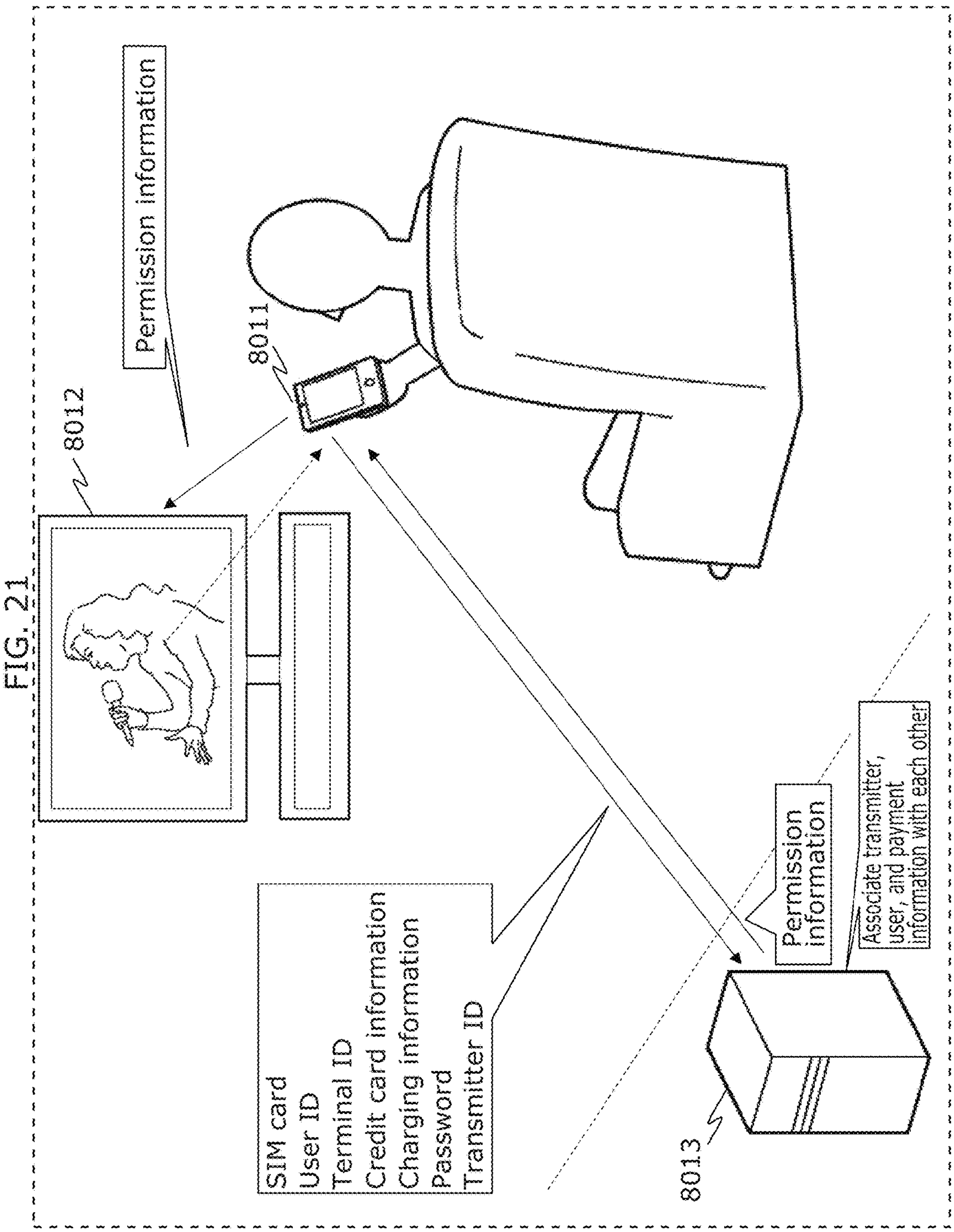
FIG. 21 is a diagram illustrating an example of operation of a receiver, a transmitter, and a server in Embodiment 2.

FIG. 21 is a diagram illustrating an example of operation of a receiver, a transmitter, and a server in this embodiment.

A transmitter 8012 as a television transmits a signal to a receiver 8011 by way of luminance change. The signal includes information prompting the user to buy content relating to a program being viewed. Having received the signal by visible light communication, the receiver 8011 displays an information notification image prompting the user to buy content, based on the signal. When the user performs an operation for buying the content, the receiver 8011 transmits at least one of information included in a SIM (Subscriber Identity Module) card inserted in the receiver 8011, a user ID, a terminal ID, credit card information, charging information, a password, and a transmitter ID, to a server 8013. The server 8013 manages a user ID and payment information in association with each other, for each user. The server 8013 specifies a user ID based on the information transmitted from the receiver 8011, and checks payment information associated with the user ID. By this check, the server 8013 determines whether or not to permit the user to buy the content. In the case of determining to permit the user to buy the content, the server 8013 transmits permission information to the receiver 8011. Having received the permission information, the receiver 8011 transmits the permission information to the transmitter 8012. Having received the permission information, the transmitter 8012 obtains the content via a network as an example, and reproduces the content.

The transmitter 8012 may transmit information including the ID of the transmitter 8012 to the receiver 8011, by way of luminance change. In this case, the receiver 8011 transmits the information to the server 8013. Having obtained the information, the server 8013 can determine that, for example, the television program is being viewed on the transmitter 8012, and conduct television program rating research.

The receiver 8011 may include information of an operation (e.g. voting) performed by the user in the above-mentioned information and transmit the information to the server 8013, to allow the server 8013 to reflect the information on the television program. An audience participation program can be realized in this way. Besides, in the case of receiving a post from the user, the receiver 8011 may include the post in the above-mentioned information and transmit the information to the server 8013, to allow the server 8013 to reflect the post on the television program, a network message board, or the like.

Furthermore, by the transmitter 8012 transmitting the above-mentioned information, the server 8013 can charge for television program viewing by paid broadcasting or on-demand TV. The server 8013 can also cause the receiver 8011 to display an advertisement, or the transmitter 8012 to display detailed information of the displayed television program or an URL of a site showing the detailed information. The server 8013 may also obtain the number of times the advertisement is displayed on the receiver 8011, the price of a product bought from the advertisement, or the like, and charge the advertiser according to the number of times or the price. Such price-based charging is possible even in the case where the user seeing the advertisement does not buy the product immediately. When the server 8013 obtains information indicating the manufacturer of the transmitter 8012 from the transmitter 8012 via the receiver 8011, the server 8013 may provide a service (e.g. payment for selling the product) to the manufacturer indicated by the information.

Figure 22:
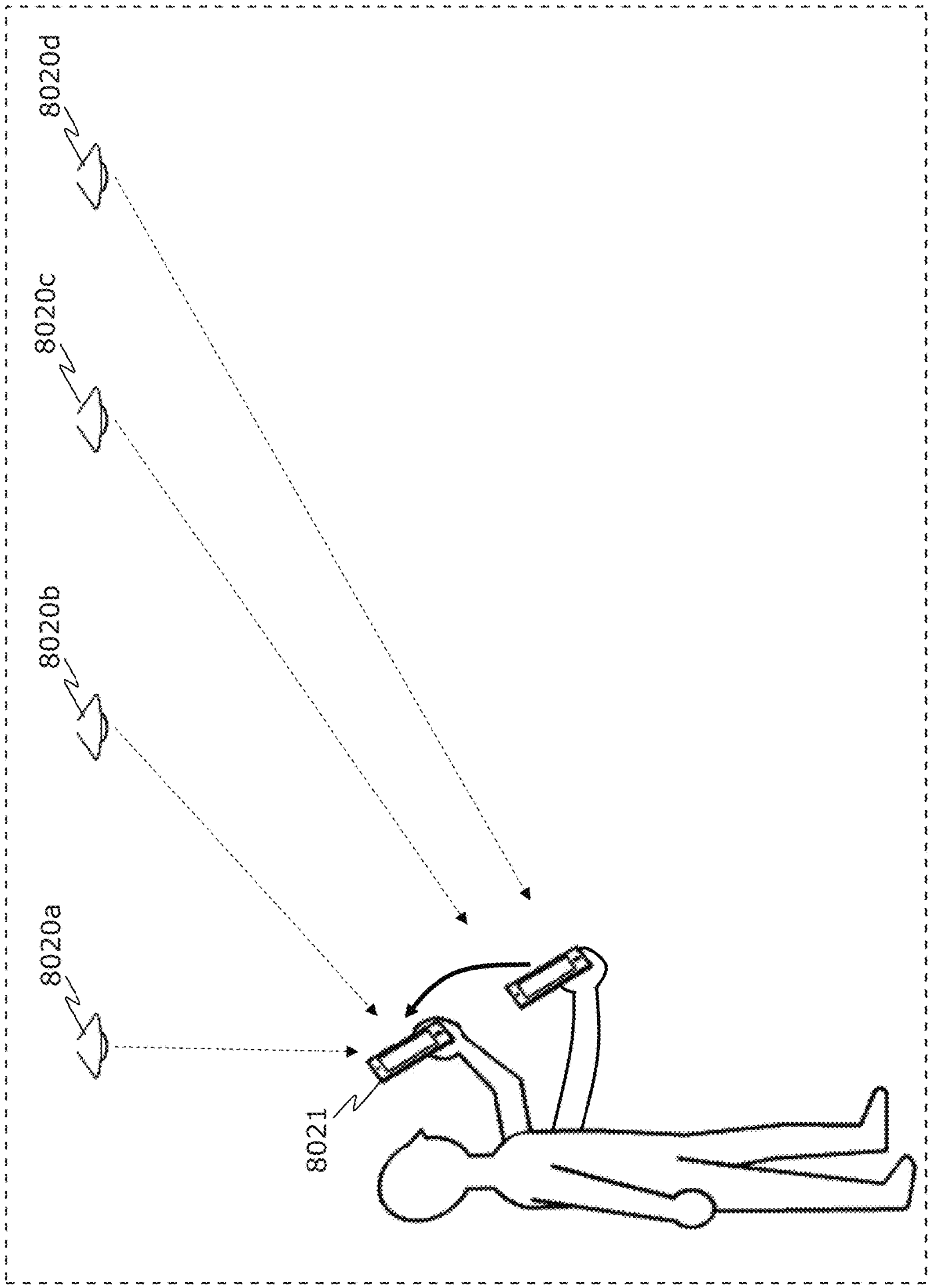
FIG. 22 is a diagram illustrating another example of operation of a receiver in Embodiment 2.

FIG. 22 is a diagram illustrating another example of operation of a receiver in this embodiment.

For example, the user points a camera of a receiver 8021 at a plurality of transmitters 8020*a* to 8020*d* as lightings. Here, the receiver 8021 is moved so that the transmitters 8020*a* to 8020*d* are sequentially captured as a subject. By performing visible light communication during the movement, the receiver 8021 receives a signal from each of the transmitters 8020*a* to 8020*d*. The signal includes information indicating the position of the transmitter. The receiver 8021 estimates the position of the receiver 8021 using the triangulation principle, based on the positions indicated by the signals received from the transmitters 8020*a* to 8020*d*, the detection result of the 9-axis sensor included in the receiver 8021, and the movement of the captured image. In this case, the drift of the 9-axis sensor (particularly the geomagnetic sensor) is canceled by moving the receiver 8021, so that the position can be estimated with higher accuracy.

Figure 23:
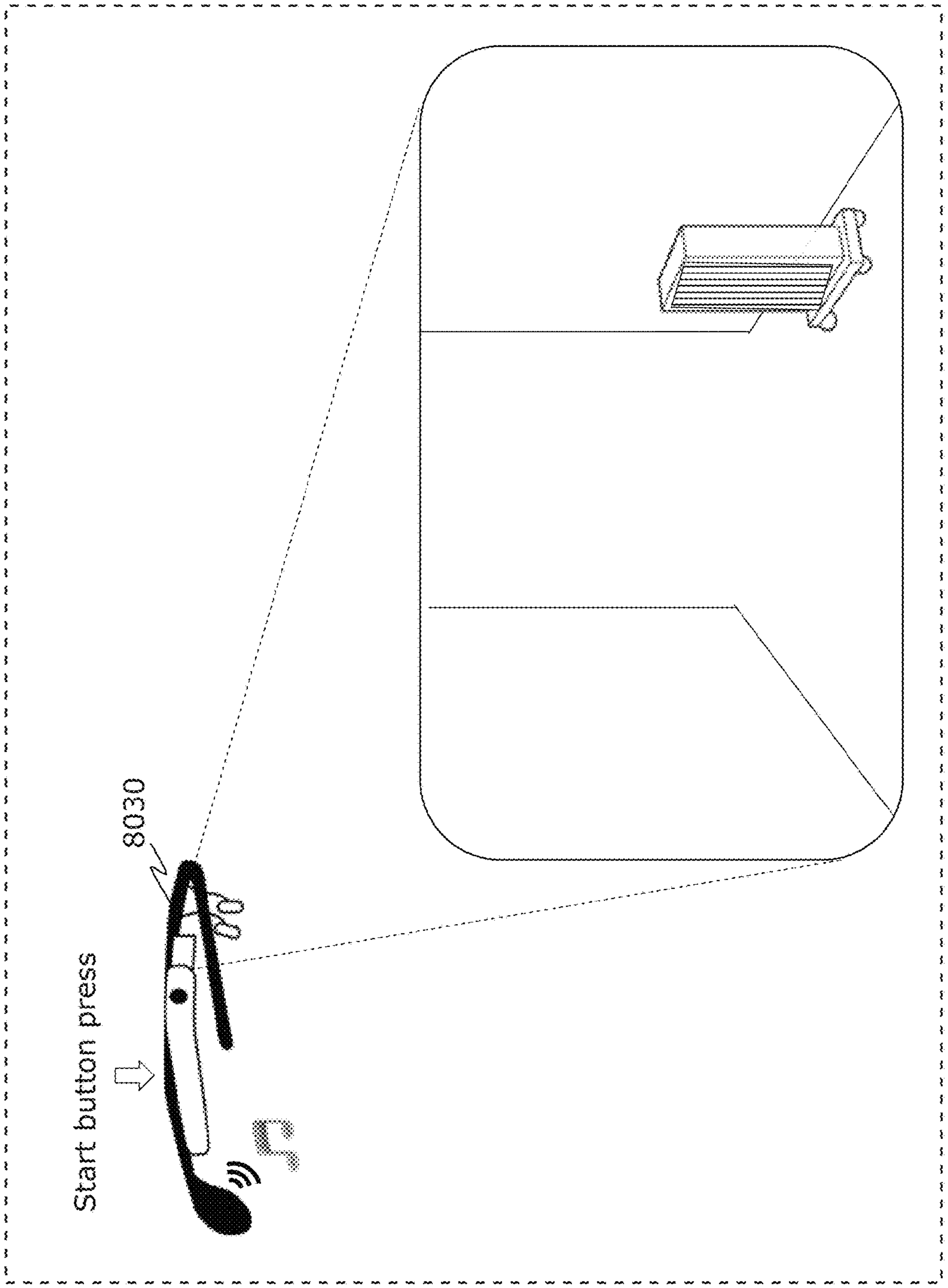
FIG. 23 is a diagram illustrating another example of operation of a receiver in Embodiment 2.

FIG. 23 is a diagram illustrating another example of operation of a receiver in this embodiment.

For example, a receiver 8030 is a head-mounted display including a camera. When a start button is pressed, the receiver 8030 starts imaging in the visible light communication mode, i.e. visible light communication. In the case of receiving a signal by visible light communication, the receiver 8030 notifies the user of information corresponding to the received signal. The notification is made, for example, by outputting a sound from a speaker included in the receiver 8030, or by displaying an image. Visible light communication may be started not only when the start button is pressed, but also when the receiver 8030 receives a sound instructing the start or when the receiver 8030 receives a signal instructing the start by wireless communication. Visible light communication may also be started when the change width of the value obtained by a 9-axis sensor included in the receiver 8030 exceeds a predetermined range or when a bright line pattern, even if only slightly, appears in the normal captured image.

Figure 24:
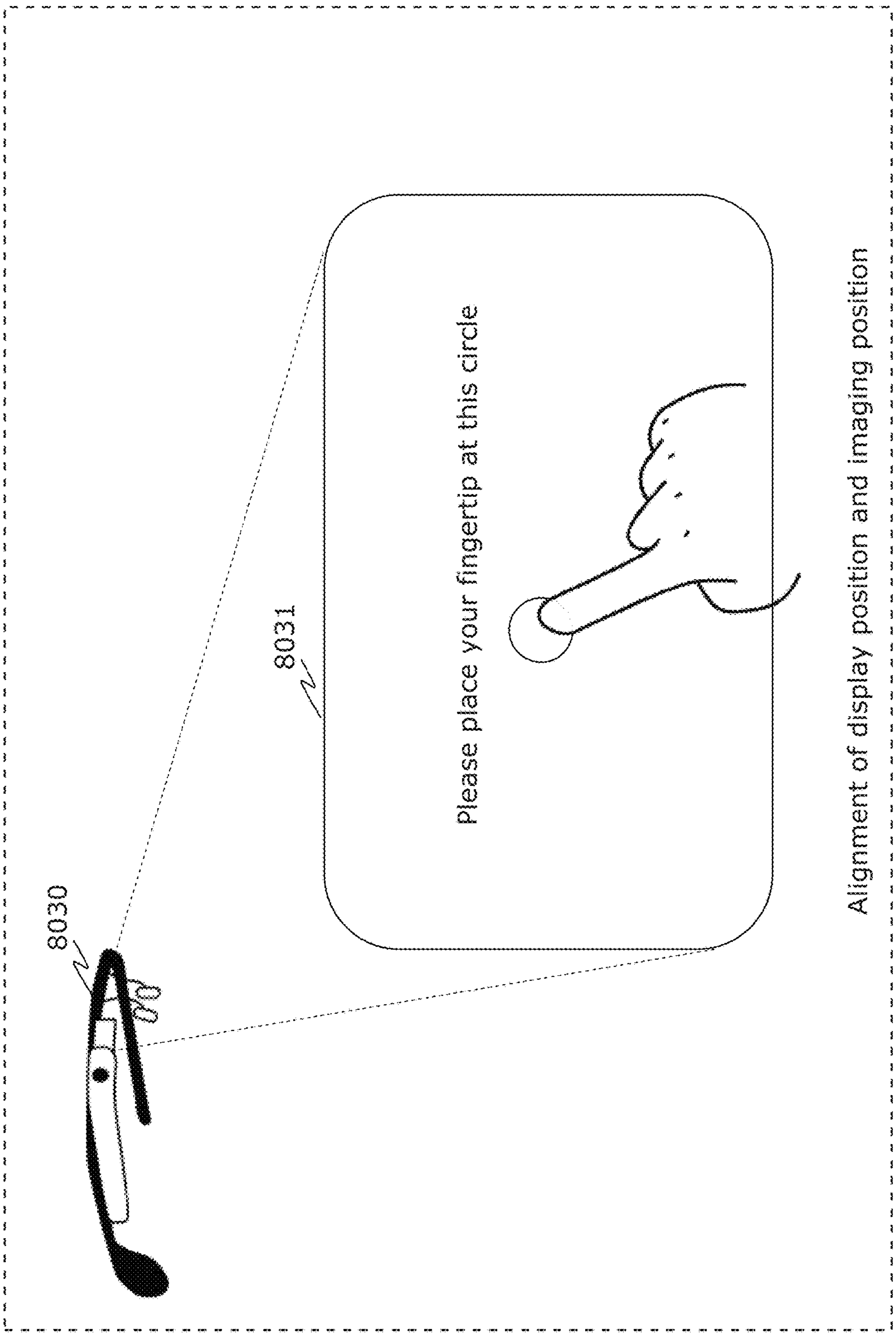
FIG. 24 is a diagram illustrating an example of initial setting of a receiver in Embodiment 2.

FIG. 24 is a diagram illustrating an example of initial setting of a receiver in this embodiment.

The receiver 8030 displays an alignment image 8031 upon initial setting. The alignment image 8031 is used to align the position pointed by the user in the image captured by the camera of the receiver 8030 and the image displayed on the receiver 8030. When the user places his or her fingertip at the position of a circle shown in the alignment image 8031, the receiver 8030 associates the position of the fingertip and the position of the circle, and performs alignment. That is, the position pointed by the user is calibrated.

Figure 25:
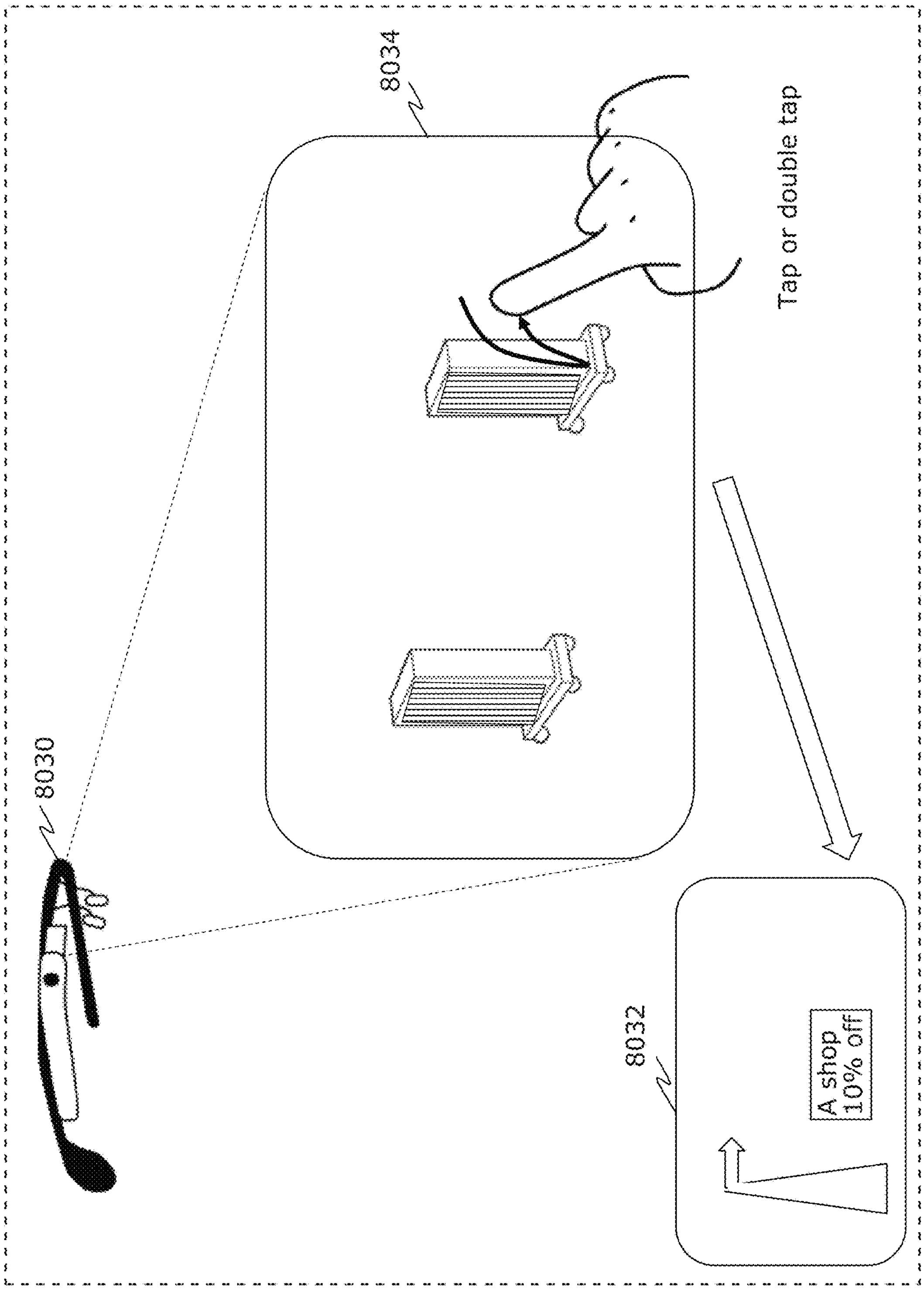
FIG. 25 is a diagram illustrating another example of operation of a receiver in Embodiment 2.

FIG. 25 is a diagram illustrating another example of operation of a receiver in this embodiment.

The receiver 8030 specifies a signal transmission part by visible light communication, and displays a synthetic image 8034 in which a bright line pattern is shown in the part. The user performs an operation such as a tap or a double tap, on the bright line pattern. The receiver 8030 receives the operation, specifies the bright line pattern subjected to the operation, and displays an information notification image 8032 based on a signal transmitted from the part corresponding to the bright line pattern.

Figure 26:
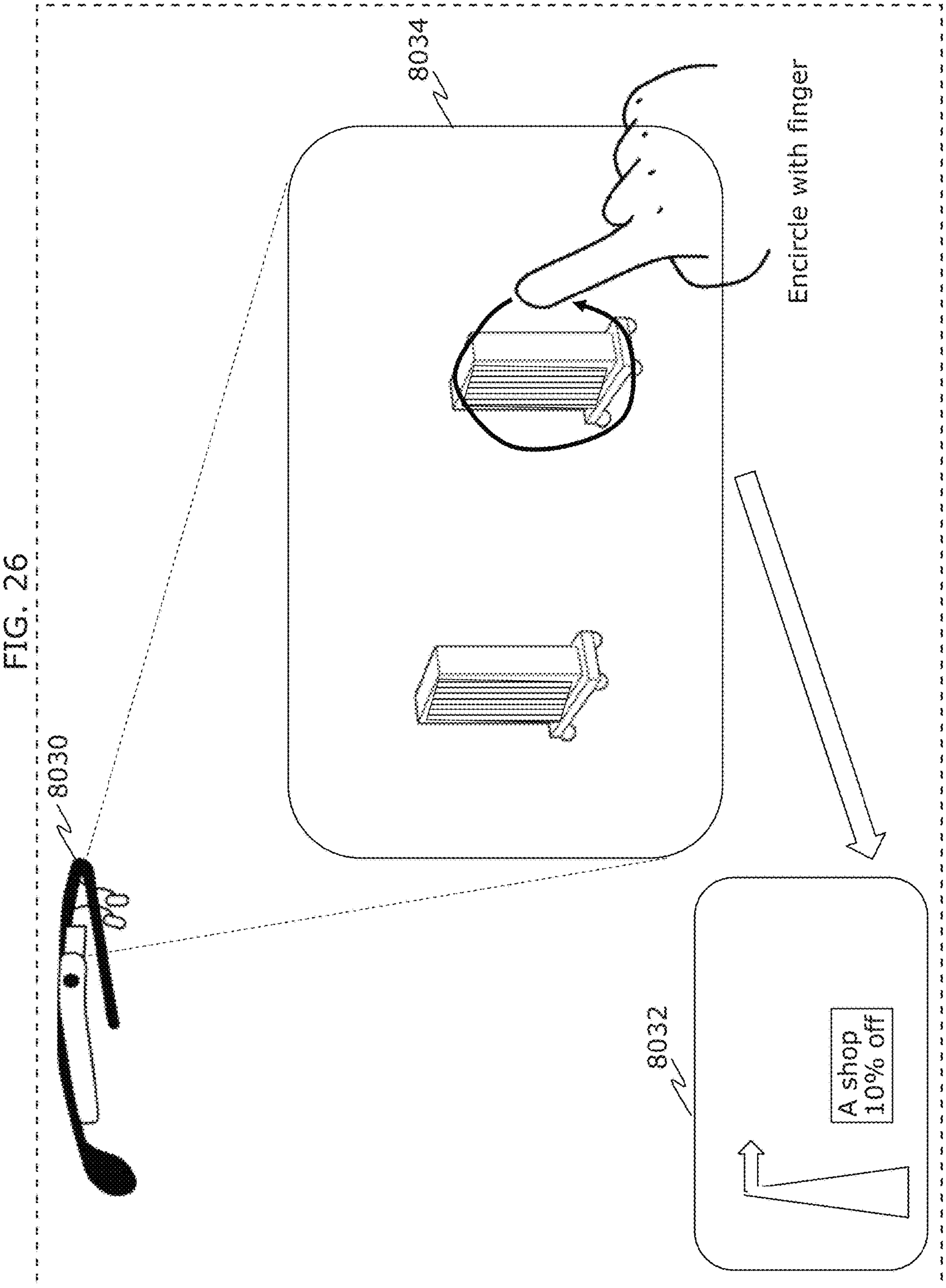
FIG. 26 is a diagram illustrating another example of operation of a receiver in Embodiment 2.

FIG. 26 is a diagram illustrating another example of operation of a receiver in this embodiment.

The receiver 8030 displays the synthetic image 8034 in the same way as above. The user performs an operation of moving his or her fingertip so as to encircle the bright line pattern in the synthetic image 8034. The receiver 8030 receives the operation, specifies the bright line pattern subjected to the operation, and displays an information notification image 8032 based on a signal transmitted from the part corresponding to the bright line pattern.

Figure 27:
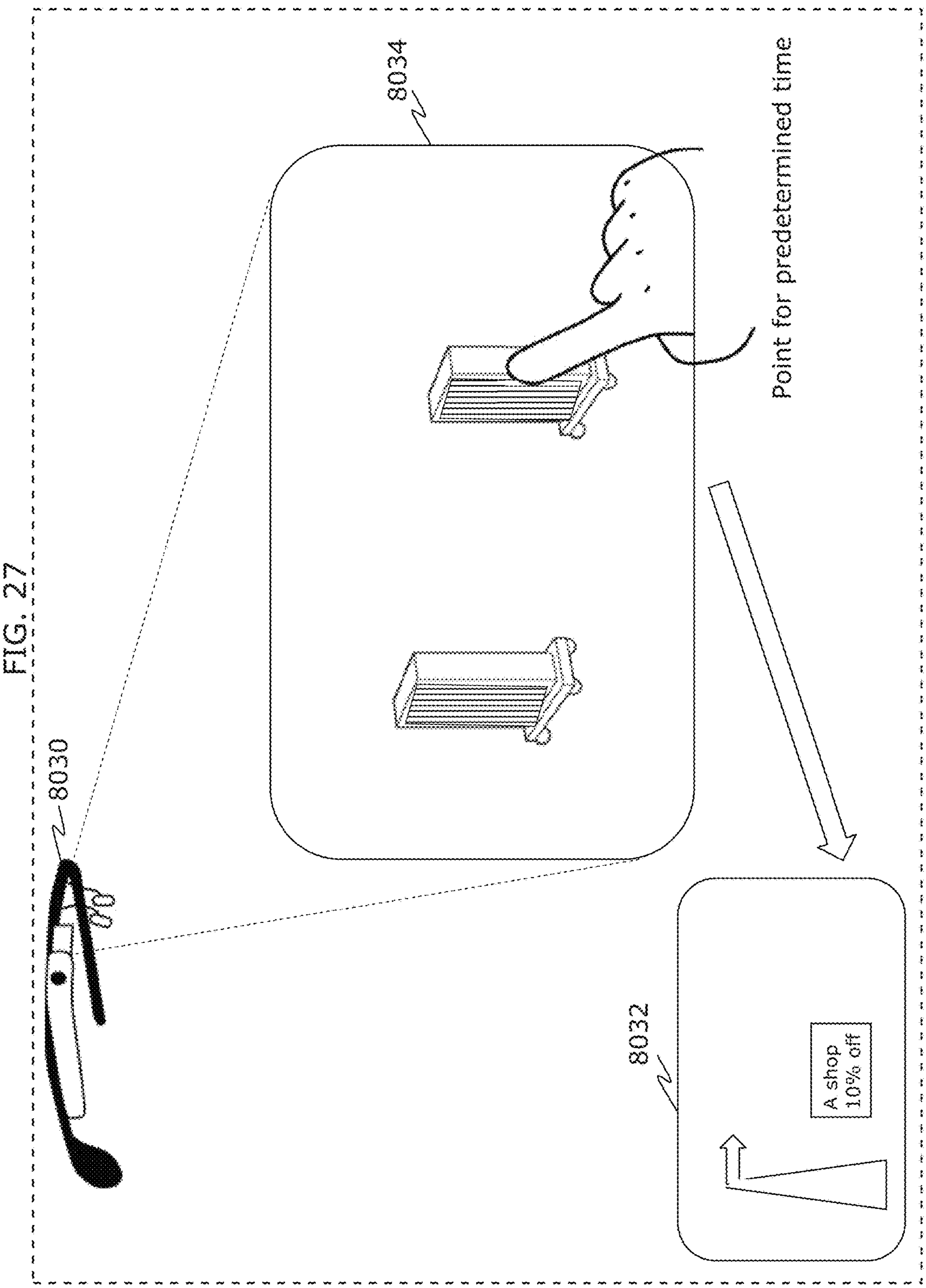
FIG. 27 is a diagram illustrating another example of operation of a receiver in Embodiment 2.

FIG. 27 is a diagram illustrating another example of operation of a receiver in this embodiment.

The receiver 8030 displays the synthetic image 8034 in the same way as above. The user performs an operation of placing his or her fingertip at the bright line pattern in the synthetic image 8034 for a predetermined time or more. The receiver 8030 receives the operation, specifies the bright line pattern subjected to the operation, and displays an information notification image 8032 based on a signal transmitted from the part corresponding to the bright line pattern.

Figure 28:
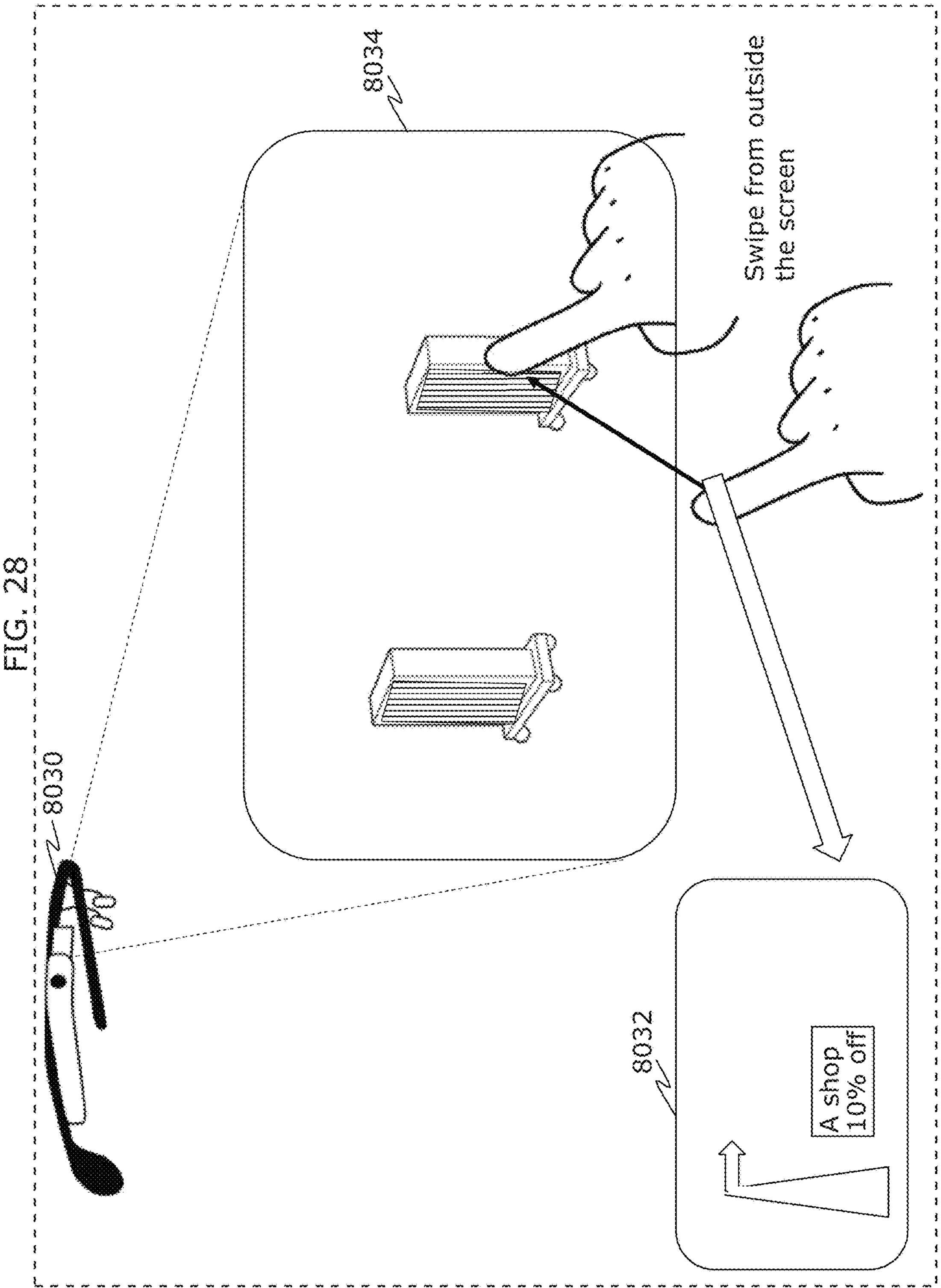
FIG. 28 is a diagram illustrating another example of operation of a receiver in Embodiment 2.

FIG. 28 is a diagram illustrating another example of operation of a receiver in this embodiment.

The receiver 8030 displays the synthetic image 8034 in the same way as above. The user performs an operation of moving his or her fingertip toward the bright line pattern in the synthetic image 8034 by a swipe. The receiver 8030 receives the operation, specifies the bright line pattern subjected to the operation, and displays an information notification image 8032 based on a signal transmitted from the part corresponding to the bright line pattern.

Figure 29:
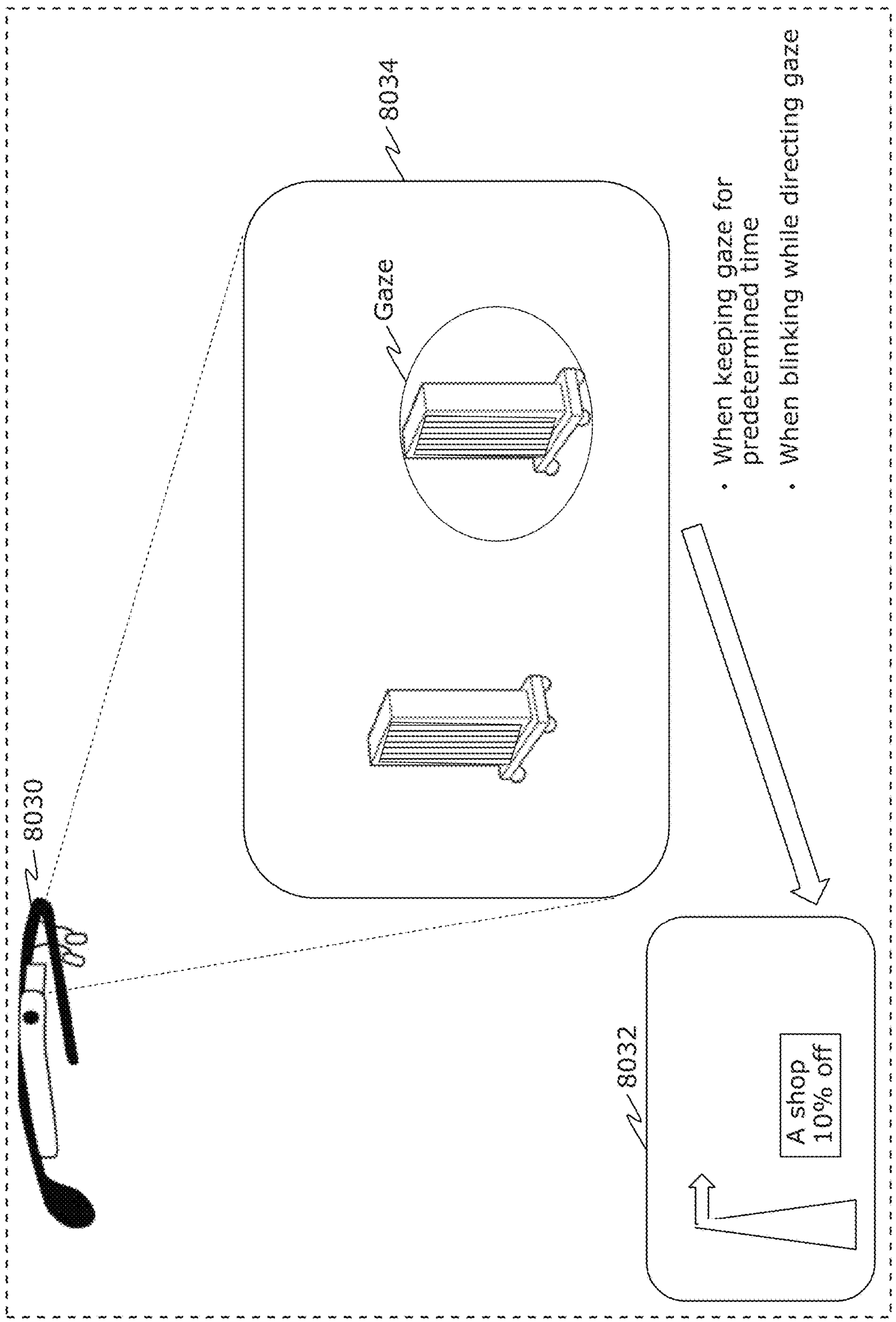
FIG. 29 is a diagram illustrating another example of operation of a receiver in Embodiment 2.

FIG. 29 is a diagram illustrating another example of operation of a receiver in this embodiment.

The receiver 8030 displays the synthetic image 8034 in the same way as above. The user performs an operation of continuously directing his or her gaze to the bright line pattern in the synthetic image 8034 for a predetermined time or more. Alternatively, the user performs an operation of blinking a predetermined number of times while directing his or her gaze to the bright line pattern. The receiver 8030 receives the operation, specifies the bright line pattern subjected to the operation, and displays an information notification image 8032 based on a signal transmitted from the part corresponding to the bright line pattern.

Figure 30:
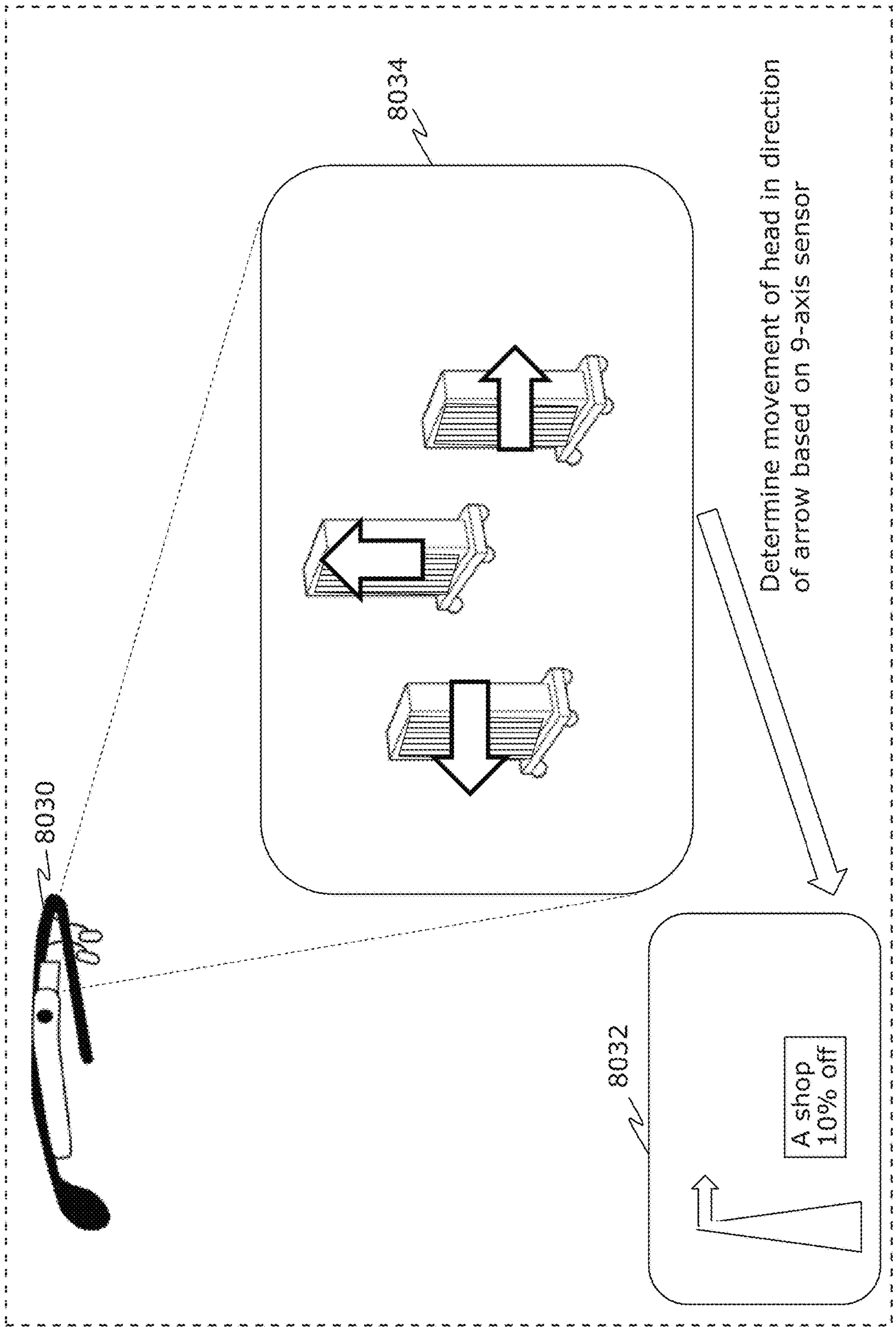
FIG. 30 is a diagram illustrating another example of operation of a receiver in Embodiment 2.

FIG. 30 is a diagram illustrating another example of operation of a receiver in this embodiment.

The receiver 8030 displays the synthetic image 8034 in the same way as above, and also displays an arrow associated with each bright line pattern in the synthetic image 8034. The arrow of each bright line pattern differs in direction. The user performs an operation of moving his or her head along one of the arrows. The receiver 8030 receives the operation based on the detection result of the 9-axis sensor, and specifies the bright line pattern associated with the arrow corresponding to the operation, i.e. the arrow in the direction in which the head is moved. The receiver 8030 displays the information notification image 8032 based on the signal transmitted from the part corresponding to the bright line pattern.

Figure 31A:
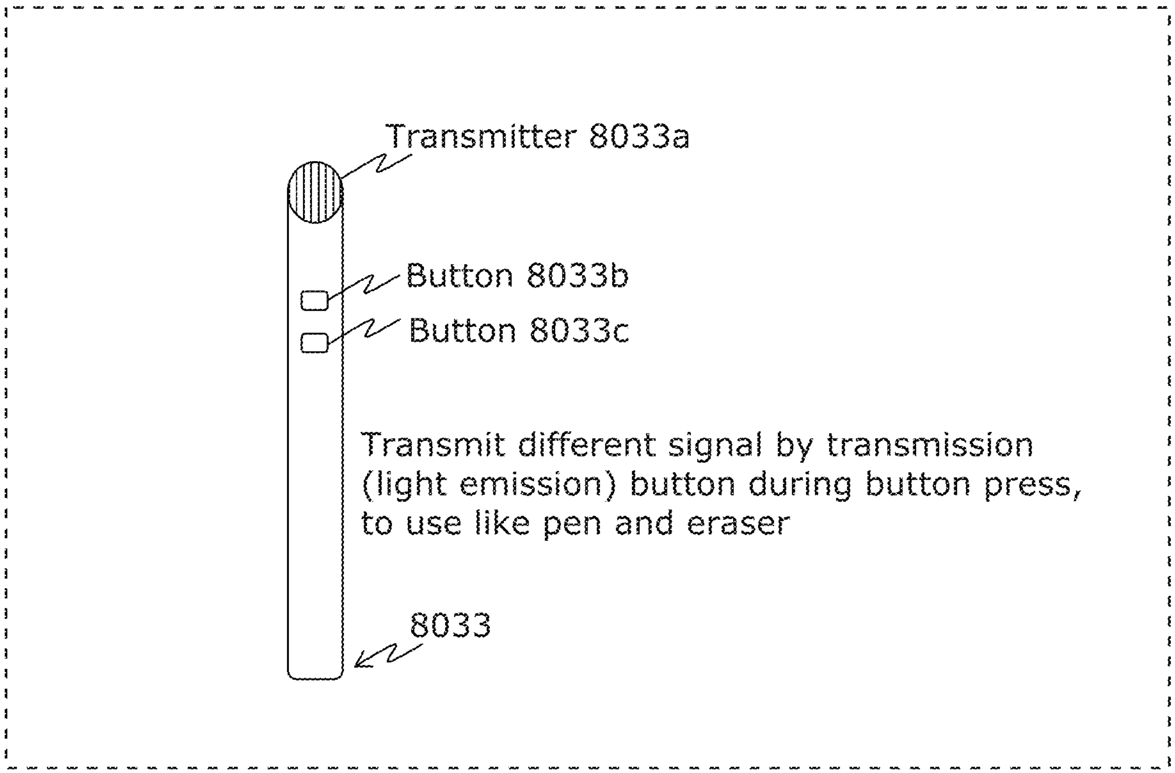
FIG. 31A is a diagram illustrating a pen used to operate a receiver in Embodiment 2.

FIG. 31A is a diagram illustrating a pen used to operate a receiver in this embodiment.

A pen 8033 includes a transmitter 8033*a* for transmitting a signal by way of luminance change, and buttons 8033*b* and 8033*c*. When the button 8033*b* is pressed, the transmitter 8033*a* transmits a predetermined first signal. When the button 8033*c* is pressed, the transmitter 8033*a* transmits a predetermined second signal different from the first signal.

Figure 31B:
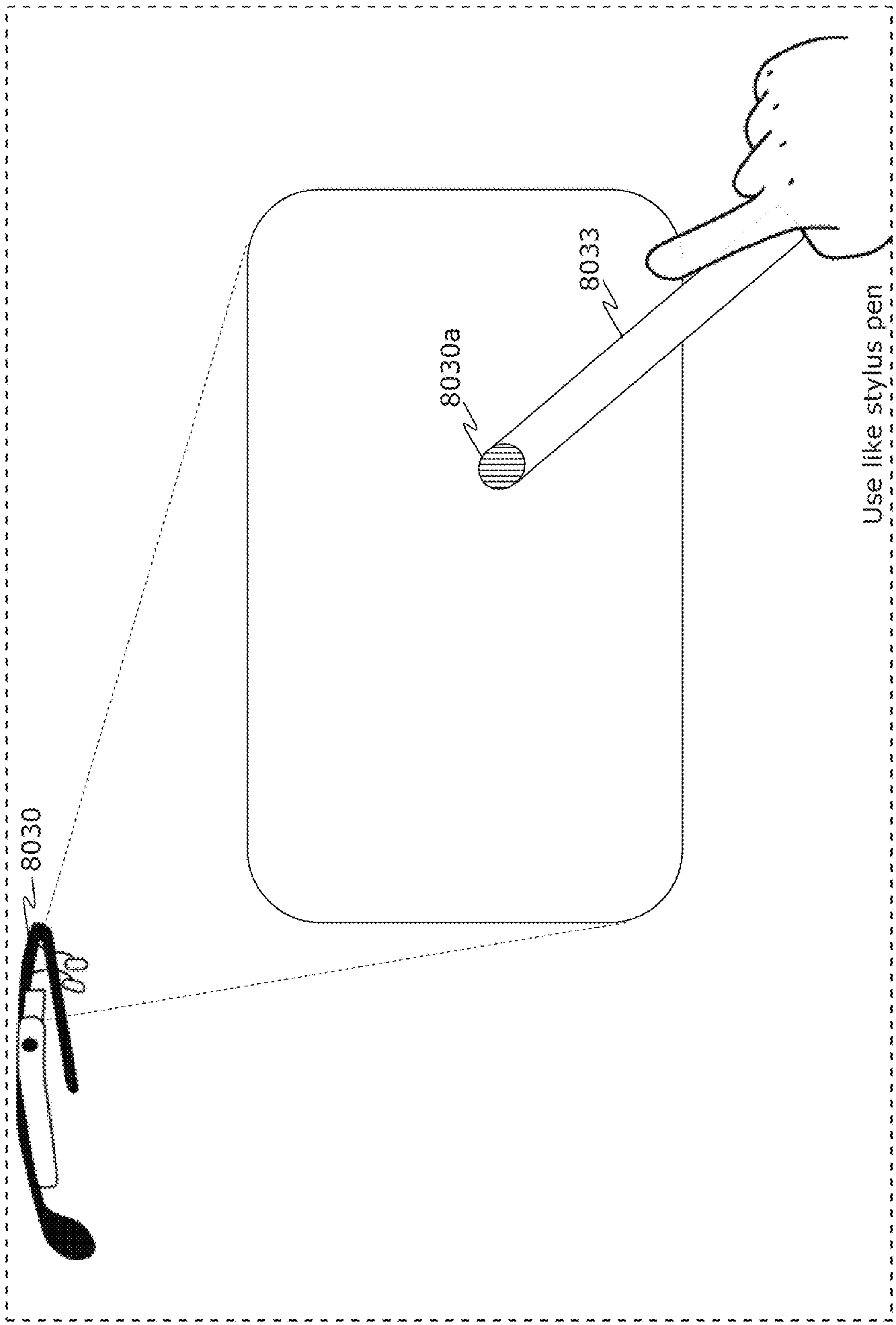
FIG. 31B is a diagram illustrating operation of a receiver using a pen in Embodiment 2.

FIG. 31B is a diagram illustrating operation of a receiver using a pen in this embodiment.

The pen 8033 is used instead of the user's finger mentioned above, like a stylus pen. By selective use of the buttons 8033*b* and 8033*c*, the pen 8033 can be used like a normal pen or an eraser.

Figure 32:
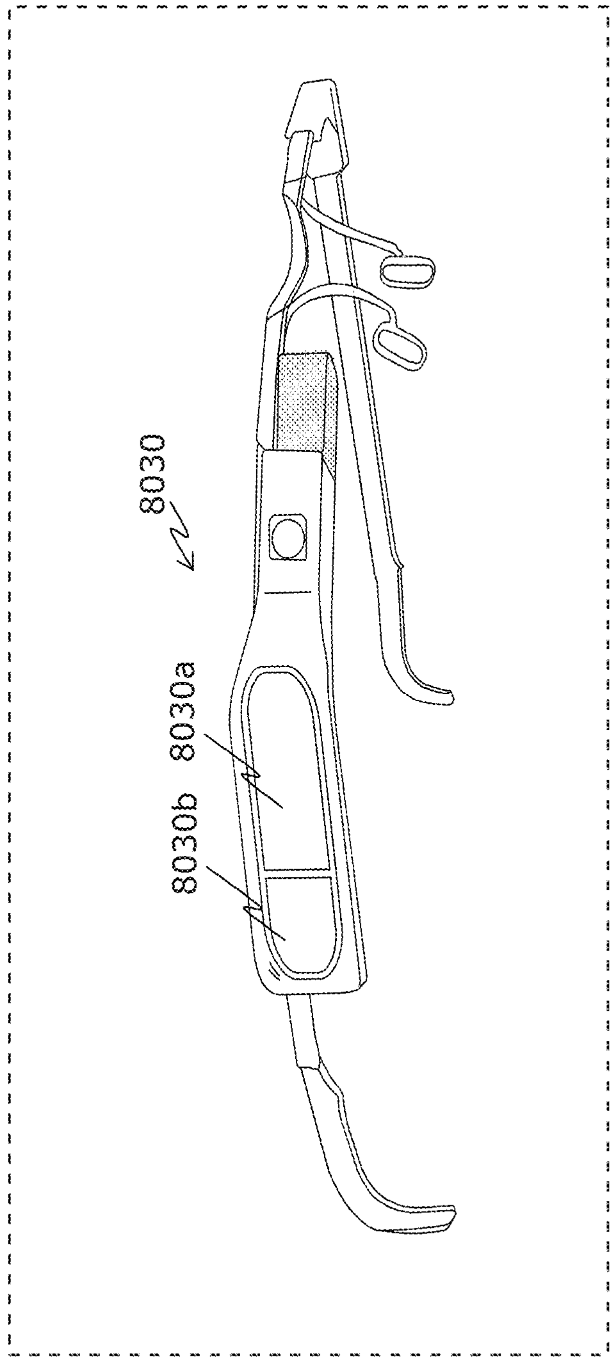
FIG. 32 is a diagram illustrating an example of appearance of a receiver in Embodiment 2.

FIG. 32 is a diagram illustrating an example of appearance of a receiver in this embodiment.

The receiver 8030 includes a first touch sensor 8030*a* and a second touch sensor 8030*b*. These touch sensors are attached to the frame of the receiver 8030. For example, when the user places his or her fingertip on the first touch sensor 8030*a* and moves the fingertip, the receiver 8030 moves the pointer in the image displayed to the user, according to the movement of the fingertip. When the user touches the second touch sensor 8030*b*, the receiver 8030 selects the object pointed by the pointer in the image displayed to the user.

Figure 33:
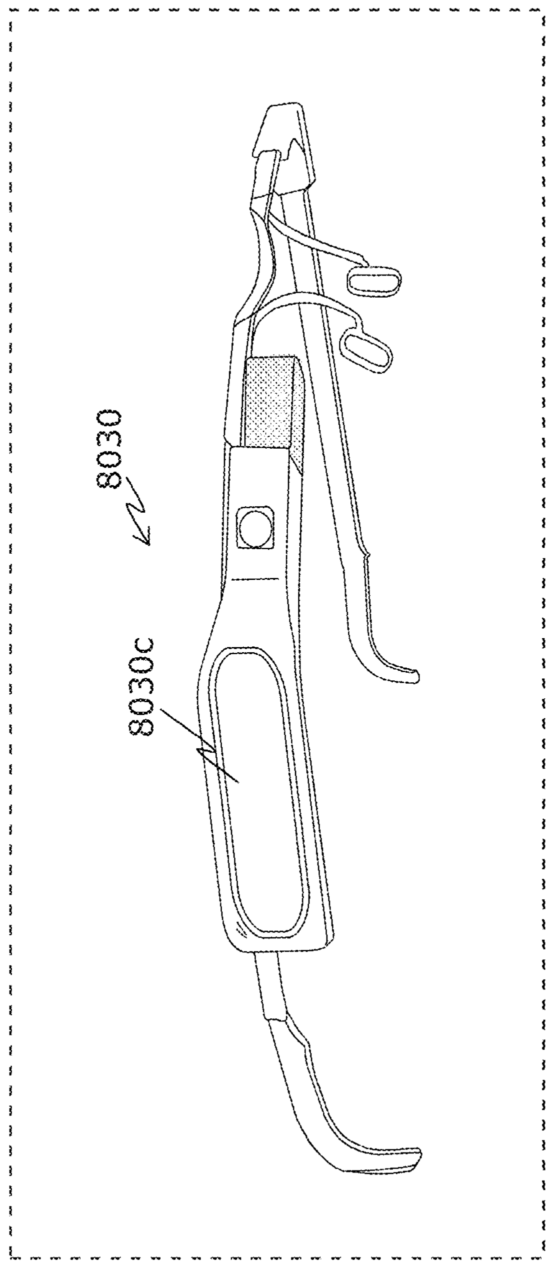
FIG. 33 is a diagram illustrating another example of appearance of a receiver in Embodiment 2.

FIG. 33 is a diagram illustrating another example of appearance of a receiver in this embodiment.

The receiver 8030 includes a touch sensor 8030*c*. The touch sensor 8030*c* is attached to the frame of the receiver 8030. For example, when the user places his or her fingertip on the touch sensor 8030*c* and moves the fingertip, the receiver 8030 moves the pointer in the image displayed to the user, according to the movement of the fingertip. When the user presses the touch sensor 8030*c*, the receiver 8030 selects the object pointed by the pointer in the image displayed to the user. The touch sensor 8030*c* is thus realized as a clickable touch sensor.

Figure 34:
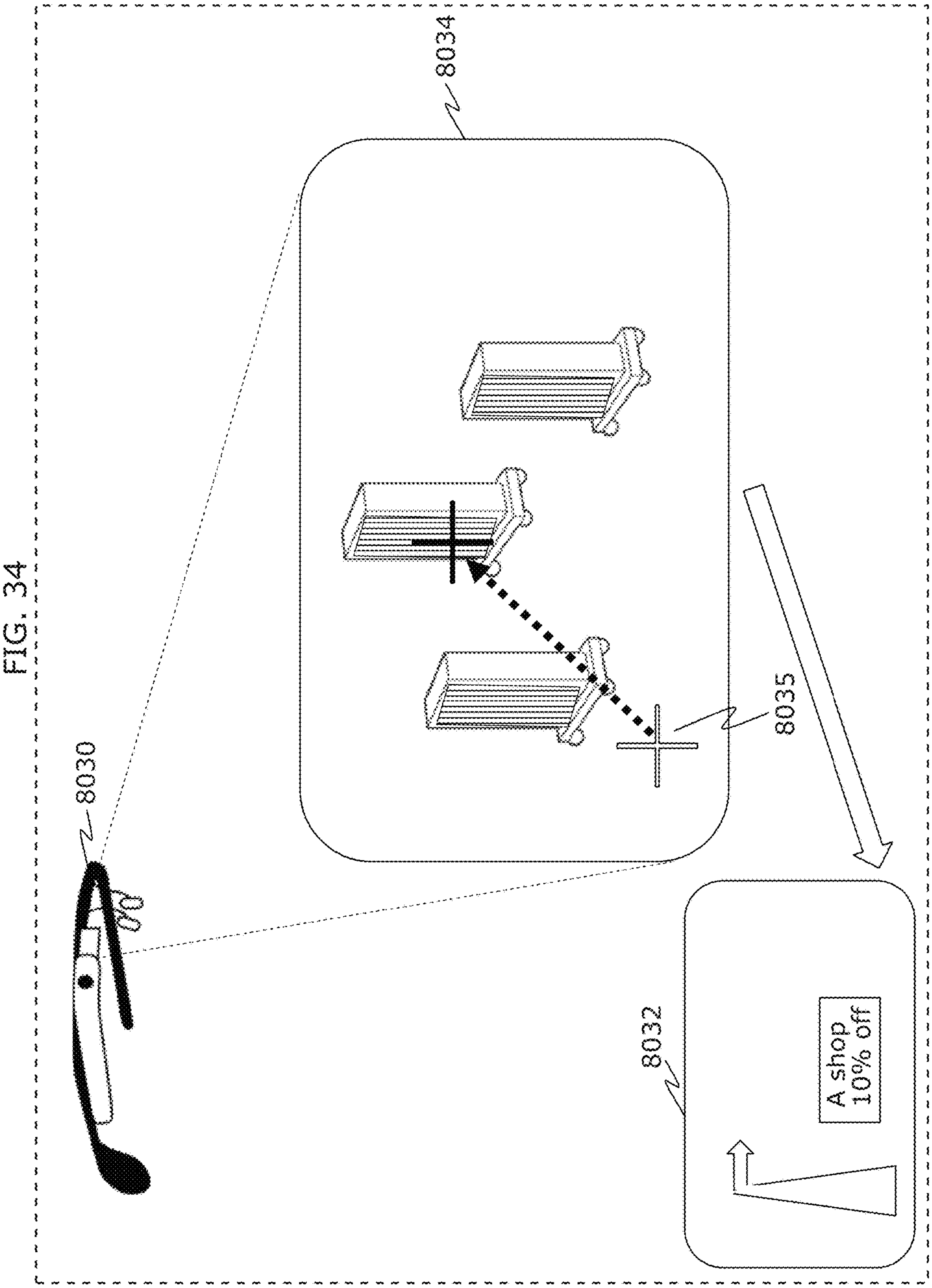
FIG. 34 is a diagram illustrating another example of operation of a receiver in Embodiment 2.

FIG. 34 is a diagram illustrating another example of operation of a receiver in this embodiment.

The receiver 8030 displays the synthetic image 8034 in the same way as above, and also displays a pointer 8035 in the synthetic image 8034. In the case where the receiver 8030 includes the first touch sensor 8030*a* and the second touch sensor 8030*b*, the user places his or her fingertip on the first touch sensor 8030*a* and moves the fingertip, to move the pointer to the object as the bright line pattern. The user then touches the second touch sensor 8030*b*, to cause the receiver 8030 to select the bright line pattern. Having selected the bright line pattern, the receiver 8030 displays the information notification image 8032 based on the signal transmitted from the part corresponding to the bright line pattern.

In the case where the receiver 8030 includes the touch sensor 8030*c*, the user places his or her fingertip on the touch sensor 8030*c* and moves the fingertip, to move the pointer to the object as the bright line pattern. The user then presses the touch sensor 8030*c*, to cause the receiver 8030 to select the bright line pattern. Having selected the bright line pattern, the receiver 8030 displays the information notification image 8032 based on the signal transmitted from the part corresponding to the bright line pattern.

FIG. 35A is a diagram illustrating another example of operation of a receiver in this embodiment.

The receiver 8030 displays a gesture confirmation image 8036 based on a signal obtained by visible light communication. The gesture confirmation image 8036 prompts the user to make a predetermined gesture, to provide a service to the user as an example.

FIG. 35B is a diagram illustrating an example of application using a receiver in this embodiment.

A user 8038 carrying the receiver 8030 is in a shop or the like. Here, the receiver 8030 displays the above-mentioned gesture confirmation image 8036 to the user 8038. The user 8038 makes the predetermined gesture according to the gesture confirmation image 8036. A staff 8039 in the shop carries a receiver 8037. The receiver 8037 is a head-mounted display including a camera, and may have the same structure as the receiver 8030. The receiver 8037 displays the gesture confirmation image 8036 based on a signal obtained by visible light communication, too. The staff 8039 determines whether or not the predetermined gesture indicated by the displayed gesture confirmation image 8036 and the gesture made by the user 8038 match. In the case of determining that the predetermined gesture and the gesture made by the user 8038 match, the staff 8039 provides the service associated with the gesture confirmation image 8036, to the user 8038.

FIG. 36A is a diagram illustrating another example of operation of a receiver in this embodiment.

The receiver 8030 displays a gesture confirmation image 8040 based on a signal obtained by visible light communication. The gesture confirmation image 8040 prompts the user to make a predetermined gesture, to permit wireless communication as an example.

FIG. 36B is a diagram illustrating an example of application using a receiver in this embodiment.

The user 8038 carries the receiver 8030. Here, the receiver 8030 displays the above-mentioned gesture confirmation image 8040 to the user 8038. The user 8038 makes the predetermined gesture according to the gesture confirmation image 8040. A person 8041 around the user 8038 carries the receiver 8037. The receiver 8037 is a head-mounted display including a camera, and may have the same structure as the receiver 8030. The receiver 8037 captures the predetermined gesture made by the user 8038, to obtain authentication information such as a password included in the gesture. In the case where the receiver 8037 determines that the authentication information matches predetermined information, the receiver 8037 establishes wireless connection with the receiver 8030. Subsequently, the receivers 8030 and 8037 can wirelessly communicate with each other.

Figure 37A:
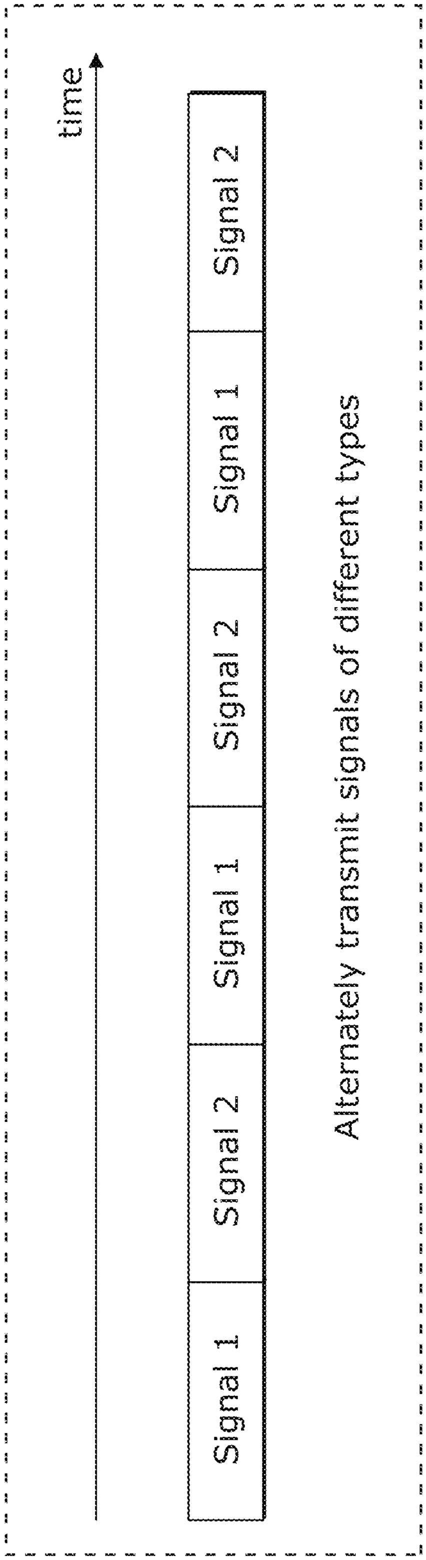
FIG. 37A is a diagram illustrating an example of operation of a transmitter in Embodiment 2.

FIG. 37A is a diagram illustrating an example of operation of a transmitter in this embodiment.

The transmitter alternately transmits signals 1 and 2, for example in a predetermined period. The transmission of the signal 1 and the transmission of the signal 2 are each carried out by way of luminance change such as blinking of visible light. A luminance change pattern for transmitting the signal 1 and a luminance change pattern for transmitting the signal 2 are different from each other.

Figure 37B:
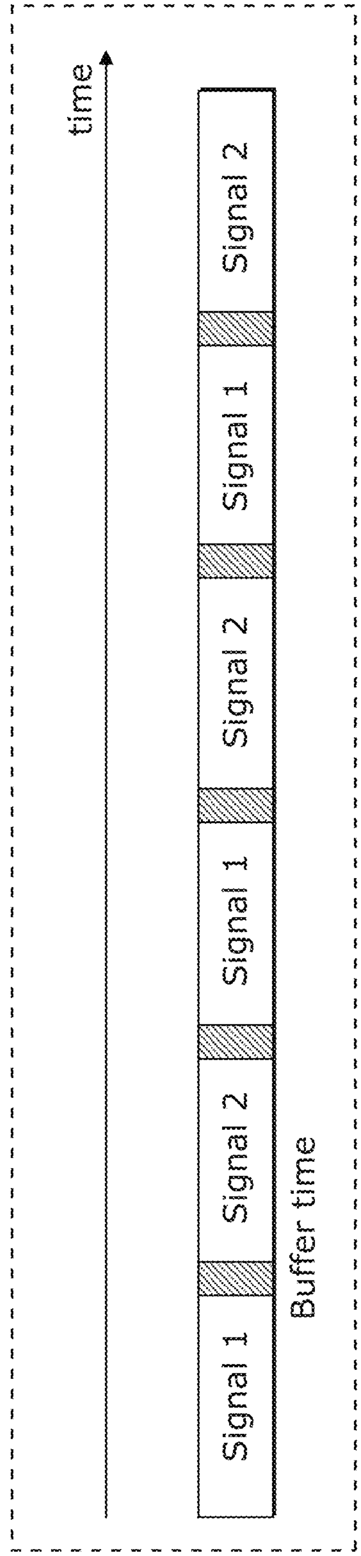
FIG. 37B is a diagram illustrating another example of operation of a transmitter in Embodiment 2.

FIG. 37B is a diagram illustrating another example of operation of a transmitter in this embodiment.

The transmitter may transmit the signals 1 and 2 intermittently with a buffer time, instead of continuously transmitting the signals 1 and 2 as mentioned above. In the buffer time, the transmitter does not change in luminance. Alternatively, in the buffer time, the transmitter may transmit a signal indicating that the transmitter is in the buffer time by way of luminance change, or perform a luminance change different from the luminance change for transmitting the signal 1 or the luminance change for transmitting the signal 2. This enables the receiver to appropriately receive the signals 1 and 2 without interference.

Figure 38:
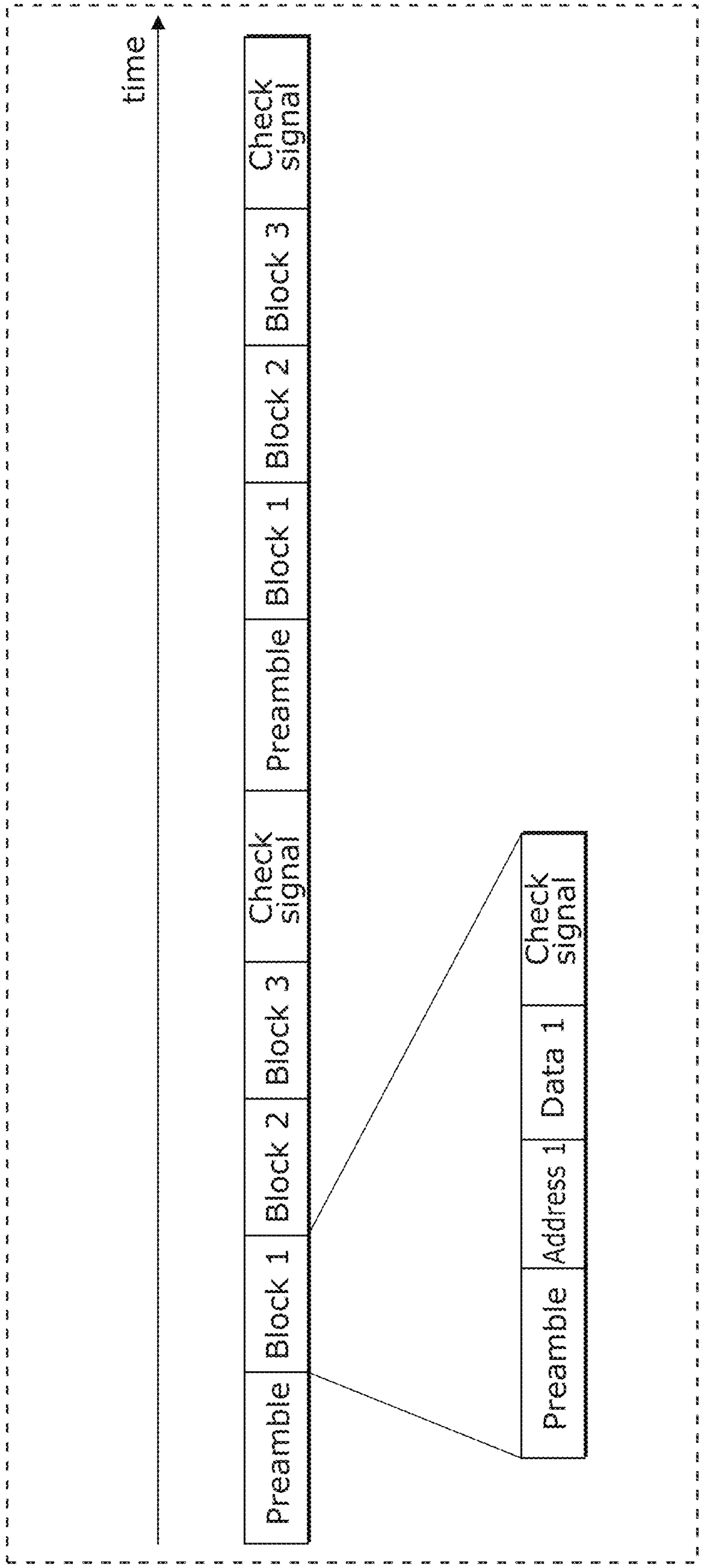
FIG. 38 is a diagram illustrating another example of operation of a transmitter in Embodiment 2.

FIG. 38 is a diagram illustrating another example of operation of a transmitter in this embodiment.

The transmitter repeatedly transmits a signal sequence made up of a preamble, a block 1, a block 2, a block 3, and a check signal, by way of luminance change. The block 1 includes a preamble, an address 1, data 1, and a check signal. The blocks 2 and 3 each have the same structure as the block 1. Specific information is obtained by using data included in the blocks 1, 2, and 3.

In detail, in the above-mentioned signal sequence, one set of data or information is stored in a state of being divided into three blocks. Accordingly, even when a receiver that needs a blanking interval for imaging cannot receive all data of the blocks 1, 2, and 3 from one signal sequence, the receiver can receive the remaining data from another signal sequence. As a result, even a receiver that needs a blanking interval can appropriately obtain the specific information from at least one signal sequence.

In the above-mentioned signal sequence, a preamble and a check signal are provided for a set of three blocks. Hence, a receiver capable of receiving light without needing a blanking interval, such as a receiver including an illuminance sensor, can receive one signal sequence at one time through the use of the preamble and the check signal provided for the set, thus obtaining the specific information in a short time.

Figure 39:
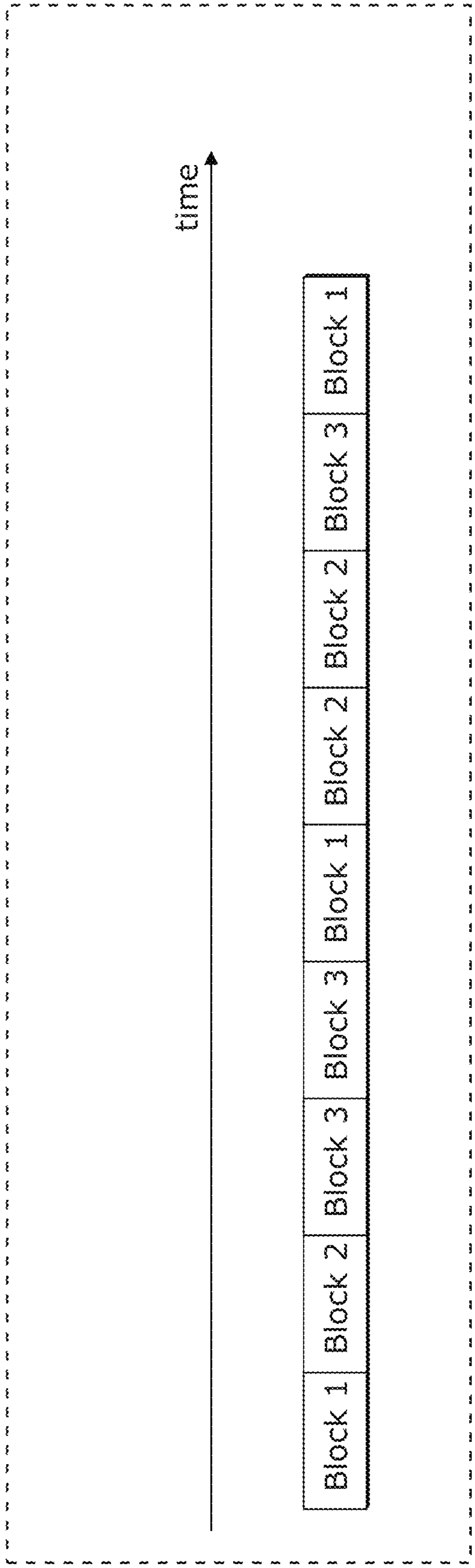
FIG. 39 is a diagram illustrating another example of operation of a transmitter in Embodiment 2.

FIG. 39 is a diagram illustrating another example of operation of a transmitter in this embodiment.

When repeatedly transmitting the signal sequence including the blocks 1, 2, and 3 as described above, the transmitter may change, for each signal sequence, the order of the blocks included in the signal sequence. For example, the blocks 1, 2, and 3 are included in this order in the first signal sequence, and the blocks 3, 1, and 2 are included in this order in the next signal sequence. A receiver that requires a periodic blanking interval can therefore avoid obtaining only the same block.

Figure 40:
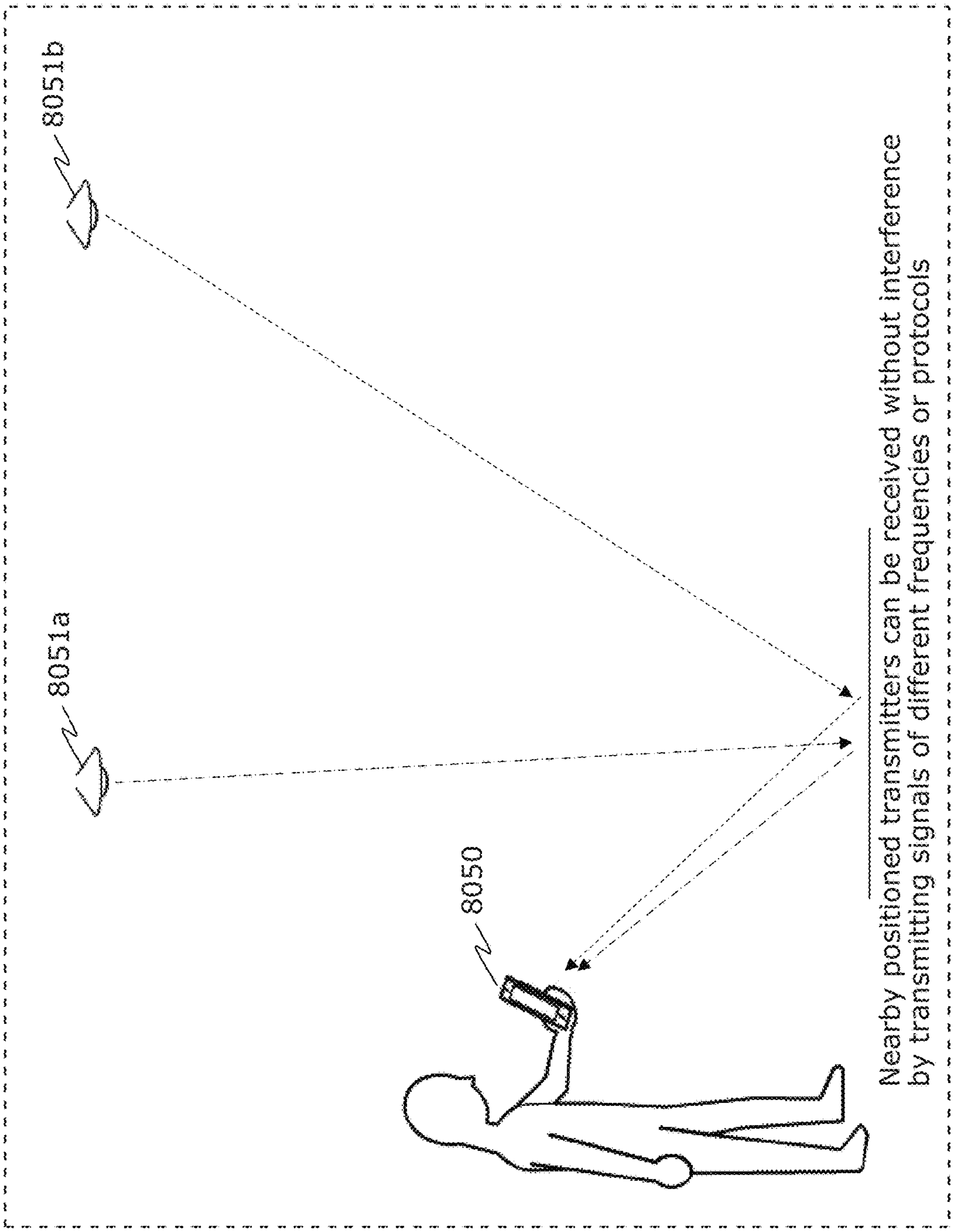
FIG. 40 is a diagram illustrating an example of communication form between a plurality of transmitters and a receiver in Embodiment 2.

FIG. 40 is a diagram illustrating an example of communication form between a plurality of transmitters and a receiver in this embodiment.

A receiver 8050 may receive signals (visible light) transmitted from transmitters 8051*a* and 8051*b* as lightings and reflected by a reflection surface. The receiver 8050 can thus receive signals from many transmitters all together. In this case, the transmitters 8051*a* and 8051*b* transmit signals of different frequencies or protocols. As a result, the receiver 8050 can receive the signals from the transmitters without interference.

Figure 41:
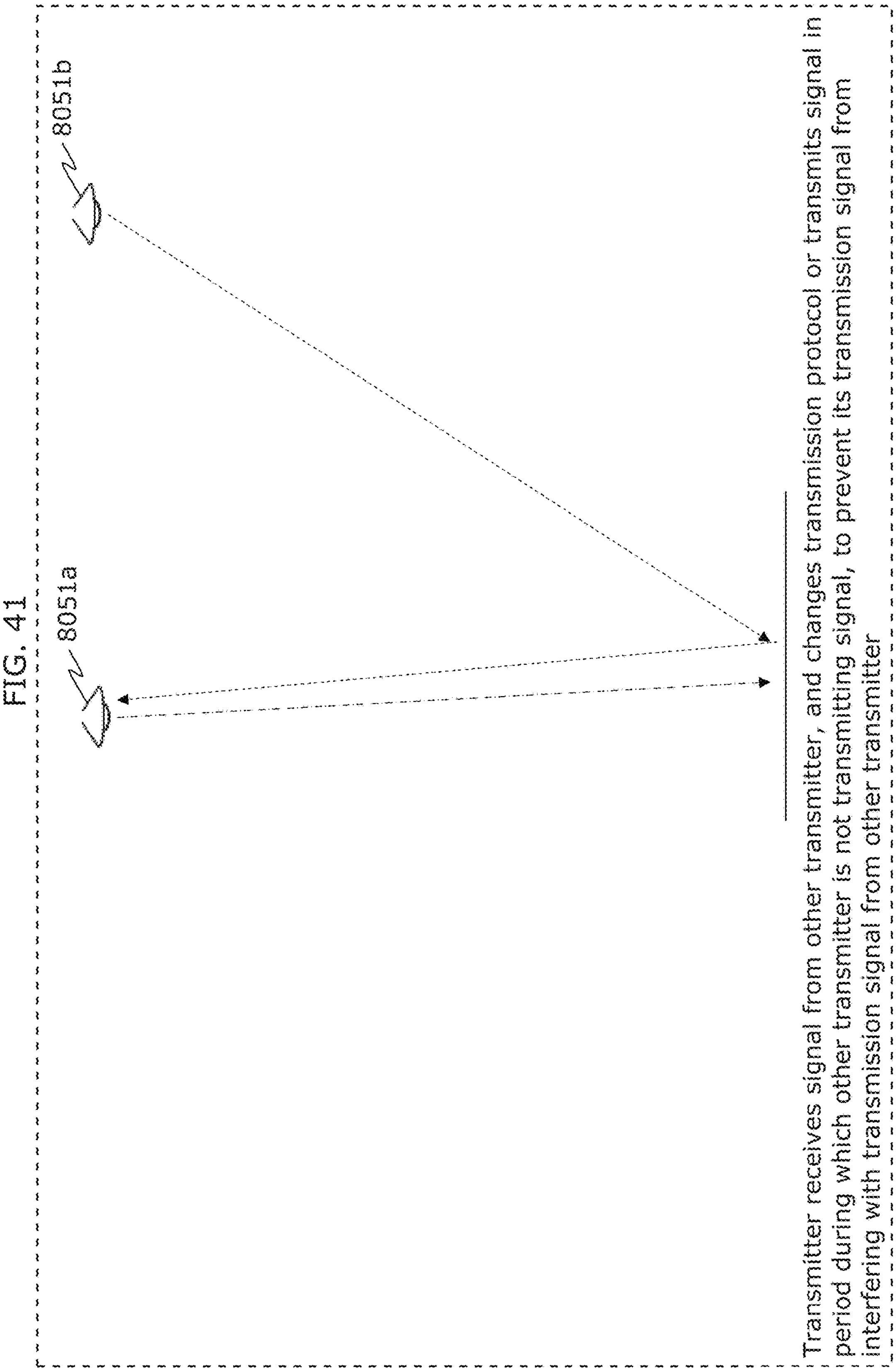
FIG. 41 is a diagram illustrating an example of operation of a plurality of transmitters in Embodiment 2.

FIG. 41 is a diagram illustrating an example of operation of a plurality of transmitters in this embodiment.

One of the transmitters 8051*a* and 8051*b* may monitor the signal transmission state of the other transmitter, and transmit a signal to avoid interference with a signal of the other transmitter. For instance, one transmitter receives a signal transmitted from the other transmitter, and transmits a signal of a protocol different from the received signal. Alternatively, one transmitter detects a time period during which no signal is transmitted from the other transmitter, and transmits a signal during the time period.

Figure 42:
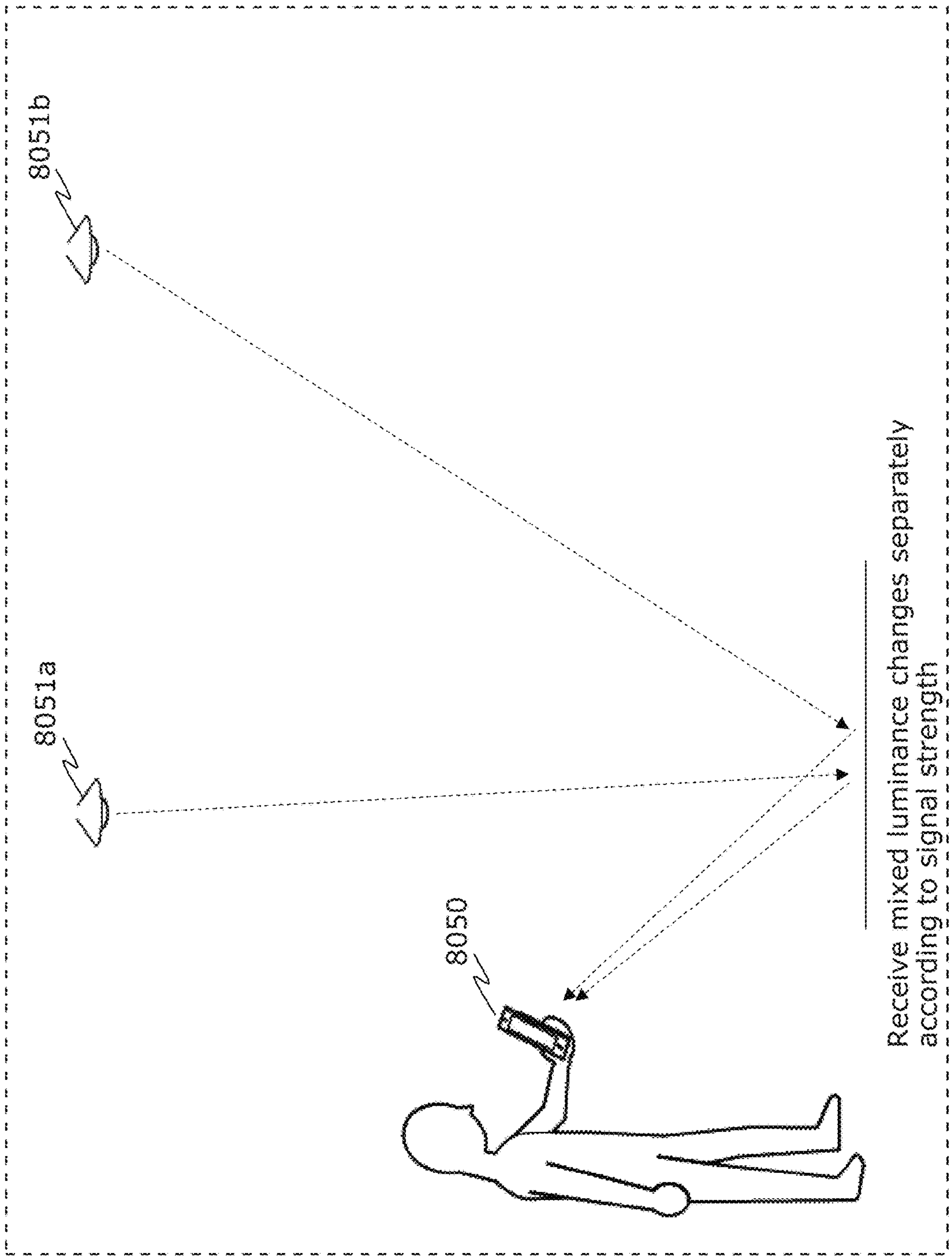
FIG. 42 is a diagram illustrating another example of communication form between a plurality of transmitters and a receiver in Embodiment 2.

FIG. 42 is a diagram illustrating another example of communication form between a plurality of transmitters and a receiver in this embodiment.

The transmitters 8051*a* and 8051*b* may transmit signals of the same frequency or protocol. In this case, the receiver 8050 specifies the strength of the signal transmitted from each of the transmitters, i.e. the edge strength of the bright line included in the captured image. The strength is lower when the distance between the receiver 8050 and the transmitter is longer. In the case where the distance between the receiver 8050 and the transmitter 8051*a* and the distance between the receiver 8050 and the transmitter 8051*b* are different from each other, the difference in distance can be exploited in this way. Thus, the receiver 8050 can separately receive the signals transmitted from the transmitters 8051*a* and 8051*b* appropriately, according to the specified strengths.

Figure 43:
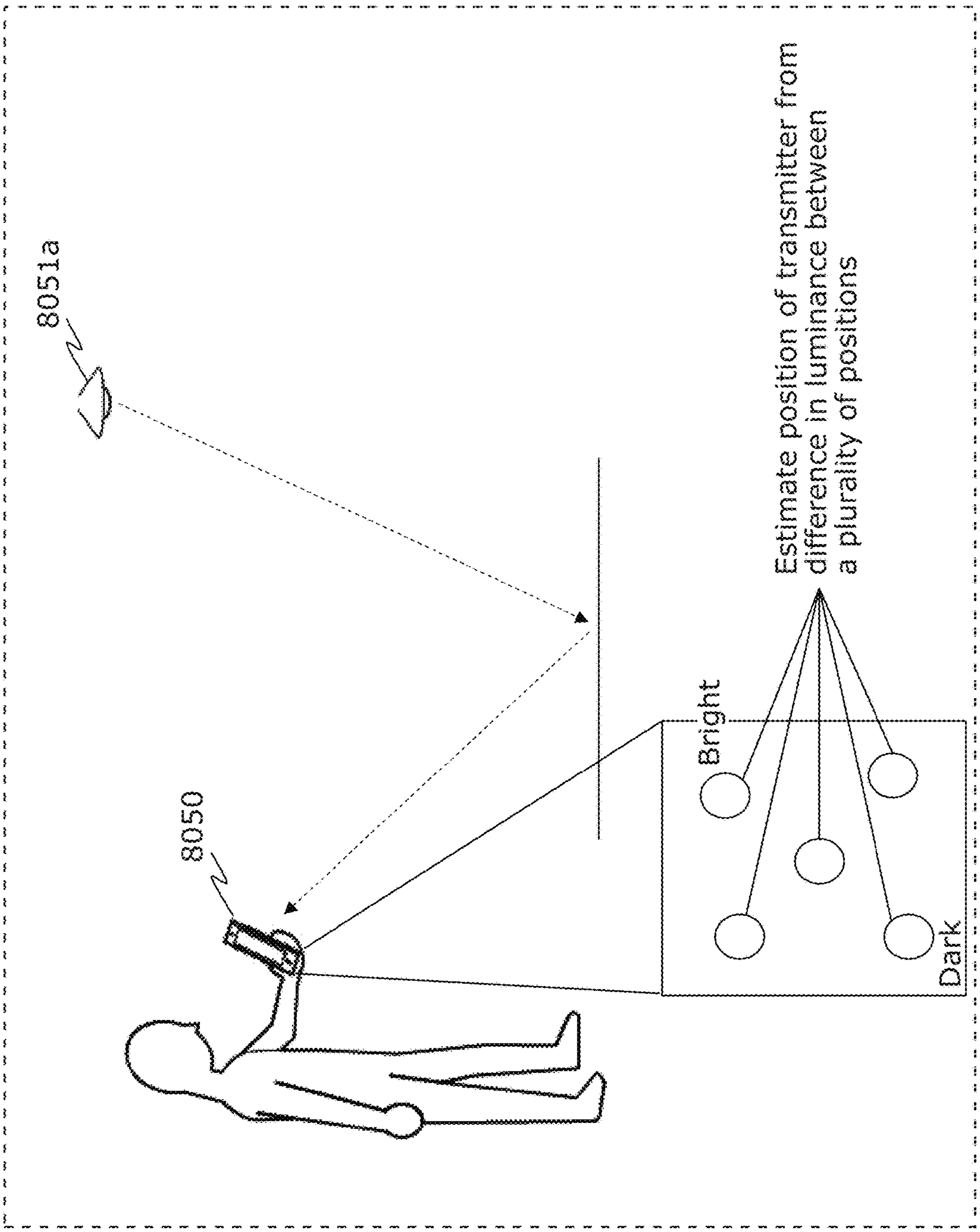
FIG. 43 is a diagram illustrating another example of operation of a receiver in Embodiment 2.

FIG. 43 is a diagram illustrating another example of operation of a receiver in this embodiment.

The receiver 8050 receives a signal transmitted from the transmitter 8051*a* and reflected by a reflection surface. Here, the receiver 8050 may estimate the position of the transmitter 8051*a*, based on the strength distribution of luminance (the difference in luminance between a plurality of positions) in the captured image.

Figure 44:
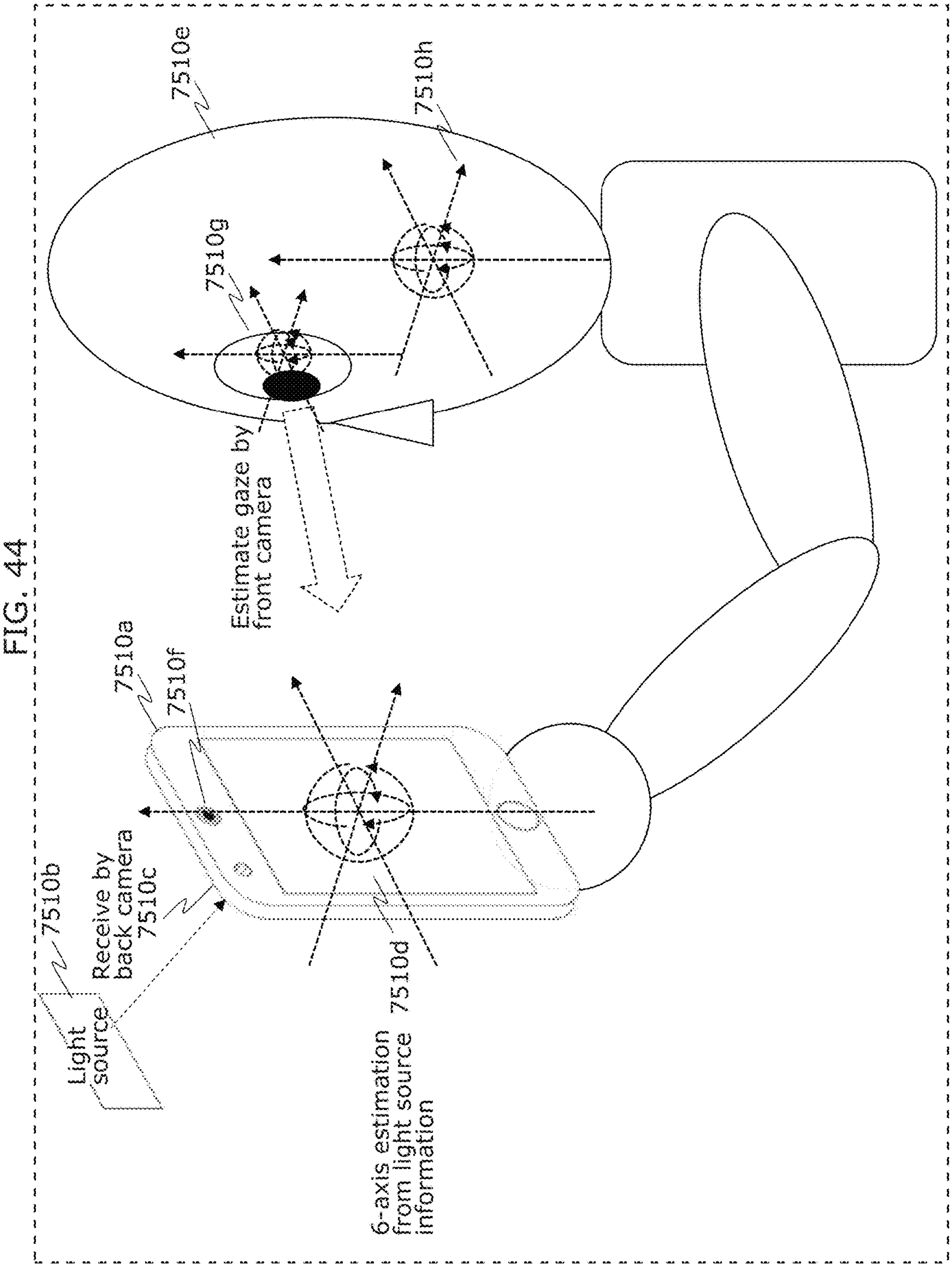
FIG. 44 is a diagram illustrating an example of application of a receiver in Embodiment 2.

FIG. 44 is a diagram illustrating an example of application of a receiver in this embodiment.

A receiver 7510*a* such as a smartphone captures a light source 7510*b* by a back camera (out camera) 7510*c* to receive a signal transmitted from the light source 7510*b*, and obtains the position and direction of the light source 7510*b* from the received signal. The receiver 7510*a* estimates the position and direction of the receiver 7510*a*, from the state of the light source 7510*b* in the captured image and the sensor value of the 9-axis sensor included in the receiver 7510*a*. The receiver 7510*a* captures a user 7510*e* by a front camera (face camera, in camera) 7510*f*, and estimates the position and direction of the head and the gaze direction (the position and direction of the eye) of the user 7510*e* by image processing. The receiver 7510*a* transmits the estimation result to the server. The receiver 7510*a* changes the behavior (display content or playback sound) according to the gaze direction of the user 7510*e*. The imaging by the back camera 7510*c* and the imaging by the front camera 7510*f* may be performed simultaneously or alternately.

Figure 45:
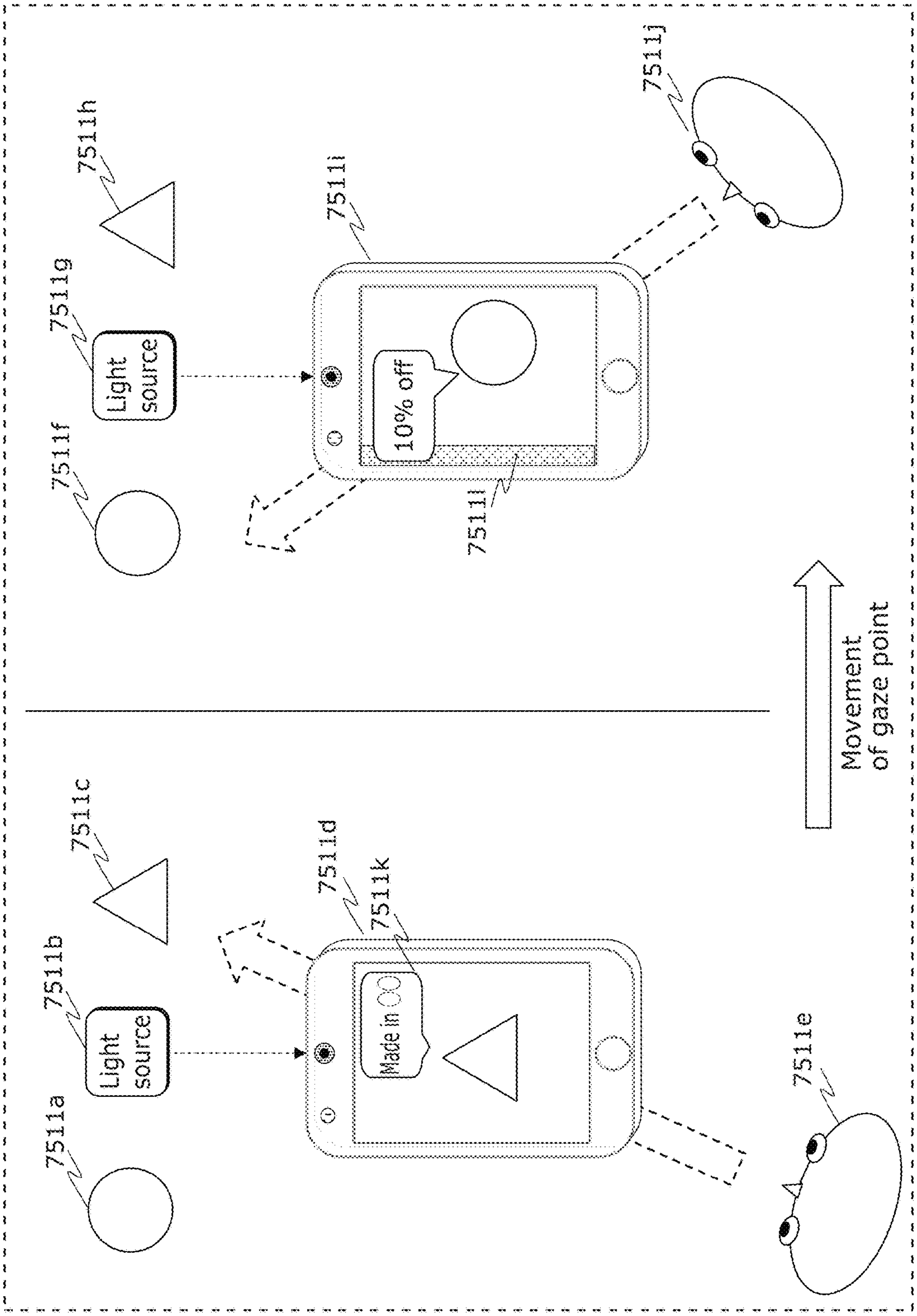
FIG. 45 is a diagram illustrating an example of application of a receiver in Embodiment 2.

FIG. 45 is a diagram illustrating an example of application of a receiver in this embodiment.

Receivers 7511*d* and 7511*i* such as smartphones respectively receive signals from light sources 7511*b* and 7511*g*, estimate the positions and directions of the receivers 7511*d* and 7511*i*, and estimate the gaze directions of users 7511*e* and 7511*j*, as in the above-mentioned way. The receivers 7511*d* and 7511*i* respectively obtain information of surrounding objects 7511*a* to 7511*c* and 7511*f* to 7511*h* from a server, based on the received data. The receivers 7511*d* and 7511*i* change their display contents as if the users can see the objects on the opposite side through the receivers 7511*d* and 7511*i*. The receivers 7511*d* and 7511*i* display an AR (Augmented Reality) object such as 7511*k*, according to the display contents. When the gaze of the user 7511*j* exceeds the imaging range of the camera, the receiver 7511*i* displays that the range is exceeded, as in 7511*l*. As an alternative, the receiver 7511*i* displays an AR object or other information in the area outside the range. As another alternative, the receiver 7511*i* displays a previously captured image in the area outside the range in a state of being connected to the current image.

Figure 46:
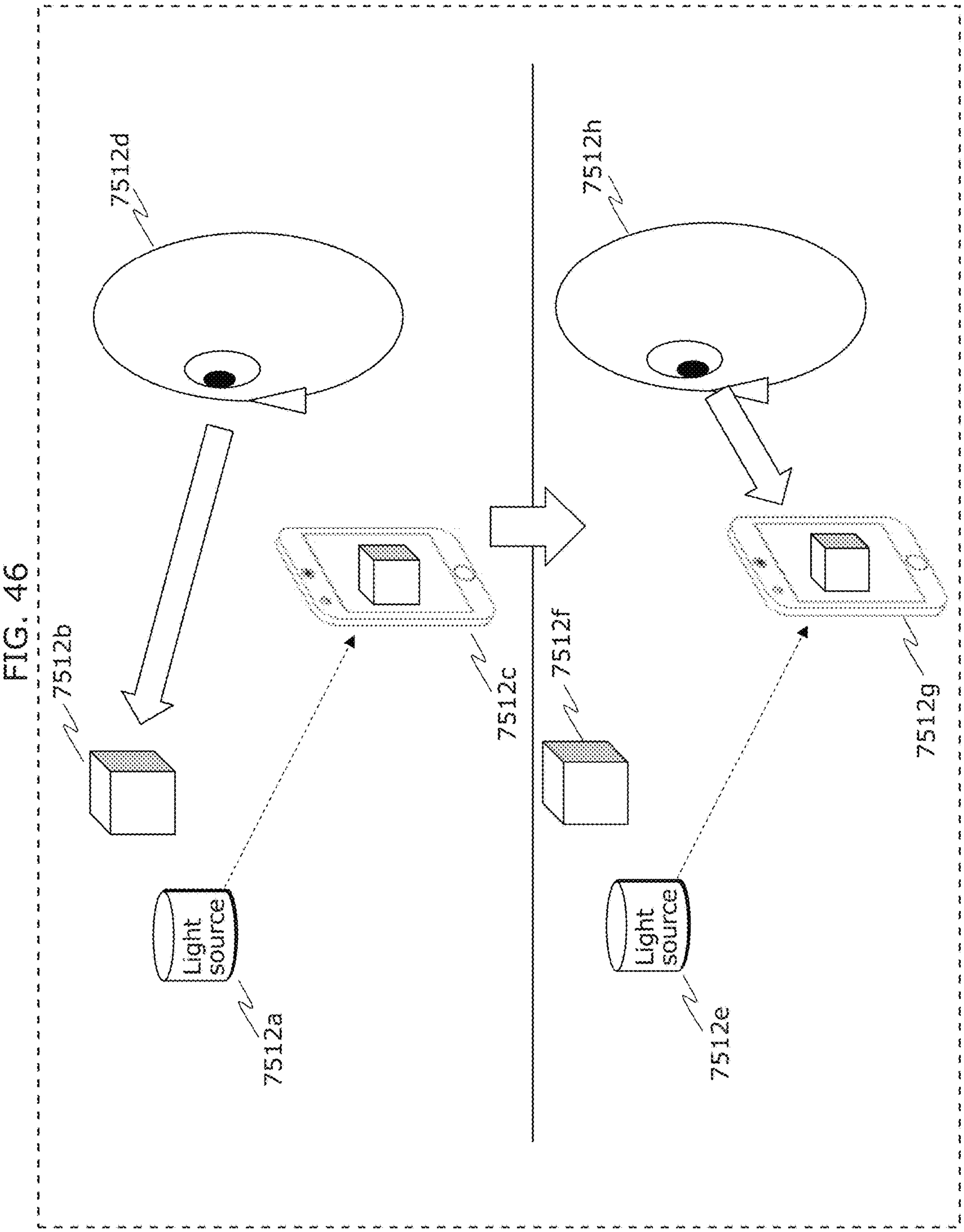
FIG. 46 is a diagram illustrating an example of application of a receiver in Embodiment 2.

FIG. 46 is a diagram illustrating an example of application of a receiver in this embodiment.

A receiver 7512*c* such as a smartphone receives a signal from a light source 7512*a*, estimates the position and direction of the receiver 7512*c*, and estimates the gaze direction of a user 7512*d*, as in the above-mentioned way. The receiver 7512*c* performs a process relating to an object 7512*b* in the gaze direction of the user 7512*d*. For example, the receiver 7512*c* displays information about the object 7512*b* on the screen. When the gaze direction of a user 7512*h* moves from an object 7512*f* to a receiver 7512*g*, the receiver 7512*g* determines that the user 7512*h* is interested in the object 7512*f*, and continues the process relating to the object 7512*f*. For example, the receiver 7512*g* keeps displaying the information of the object 7512*f* on the screen.

Figure 47:
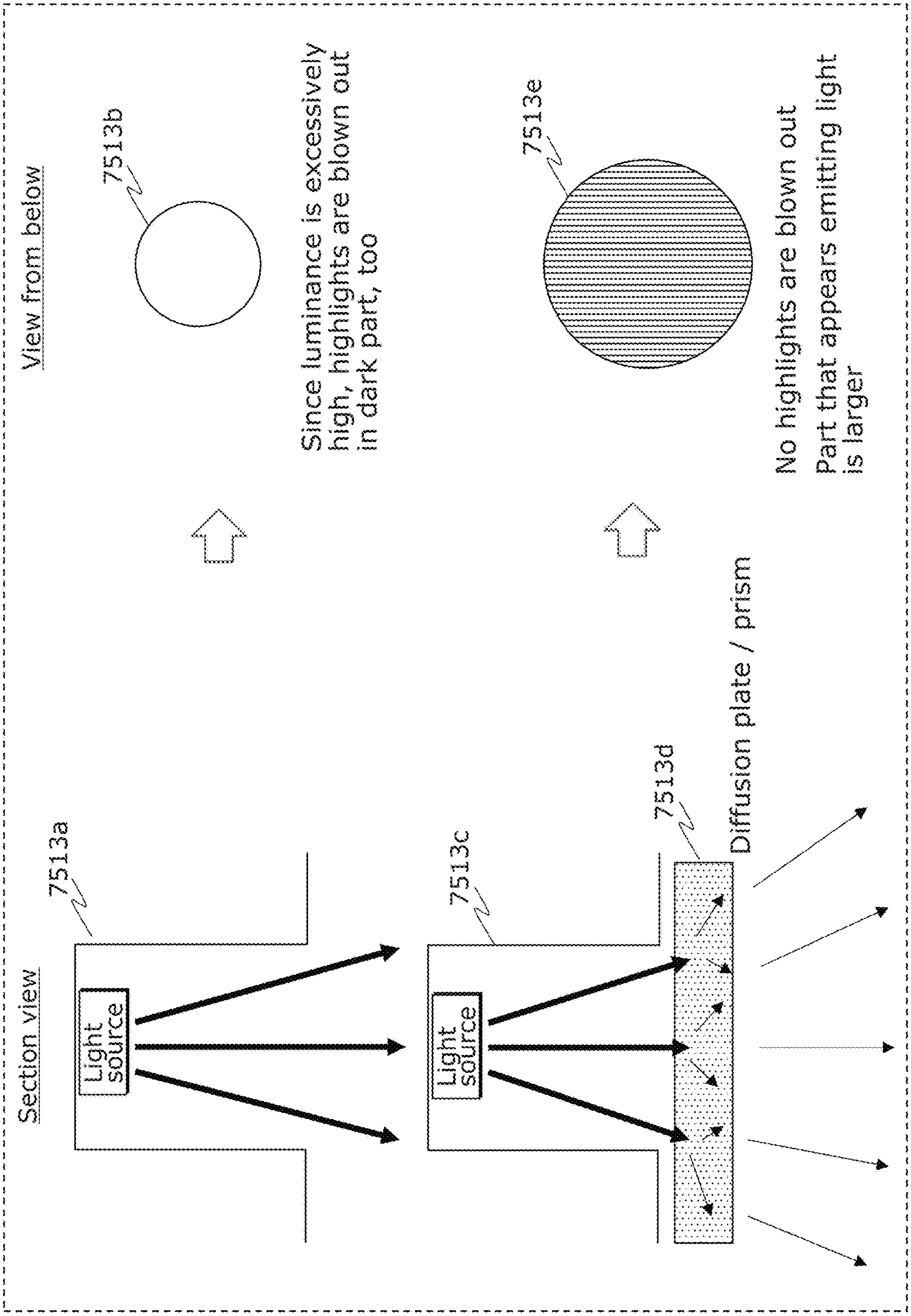
FIG. 47 is a diagram illustrating an example of application of a transmitter in Embodiment 2.

FIG. 47 is a diagram illustrating an example of application of a transmitter in this embodiment.

A transmitter 7513*a* such as a lighting is high in luminance. Regardless of whether the luminance is high or low as a transmission signal, the transmitter 7513*a* captured by a receiver exceeds an upper limit of brightness, and as a result no bright line appears as in 7513*b*. Accordingly, a transmitter 7513*c* includes a part 7513*d* such as a diffusion plate or a prism for diffusing or weakening light, to reduce the luminance. As a result, the receiver can capture bright lines as in 7513*e*.

Figure 48:
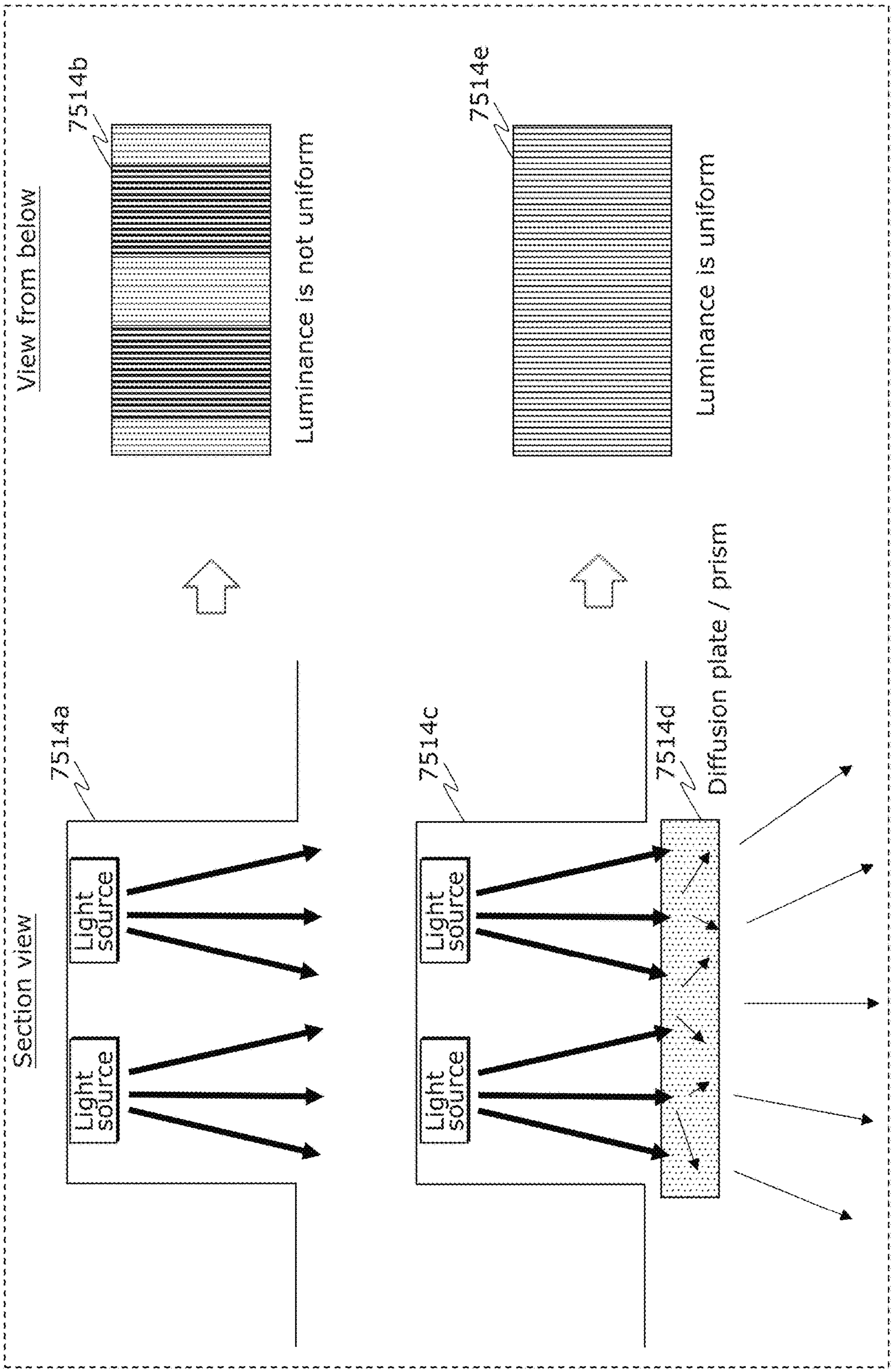
FIG. 48 is a diagram illustrating an example of application of a transmitter in Embodiment 2.

FIG. 48 is a diagram illustrating an example of application of a transmitter in this embodiment.

A transmitter 7514*a* such as a lighting does not have a uniform light source, and so the luminance is not uniform in a captured image 7514*b*, causing a reception error. Accordingly, a transmitter 7514*c* includes a part 7514*d* such as a diffusion plate or a prism for diffusing light, to attain uniform luminance as in 7514*c*. A reception error can be prevented in this way.

Figure 49:
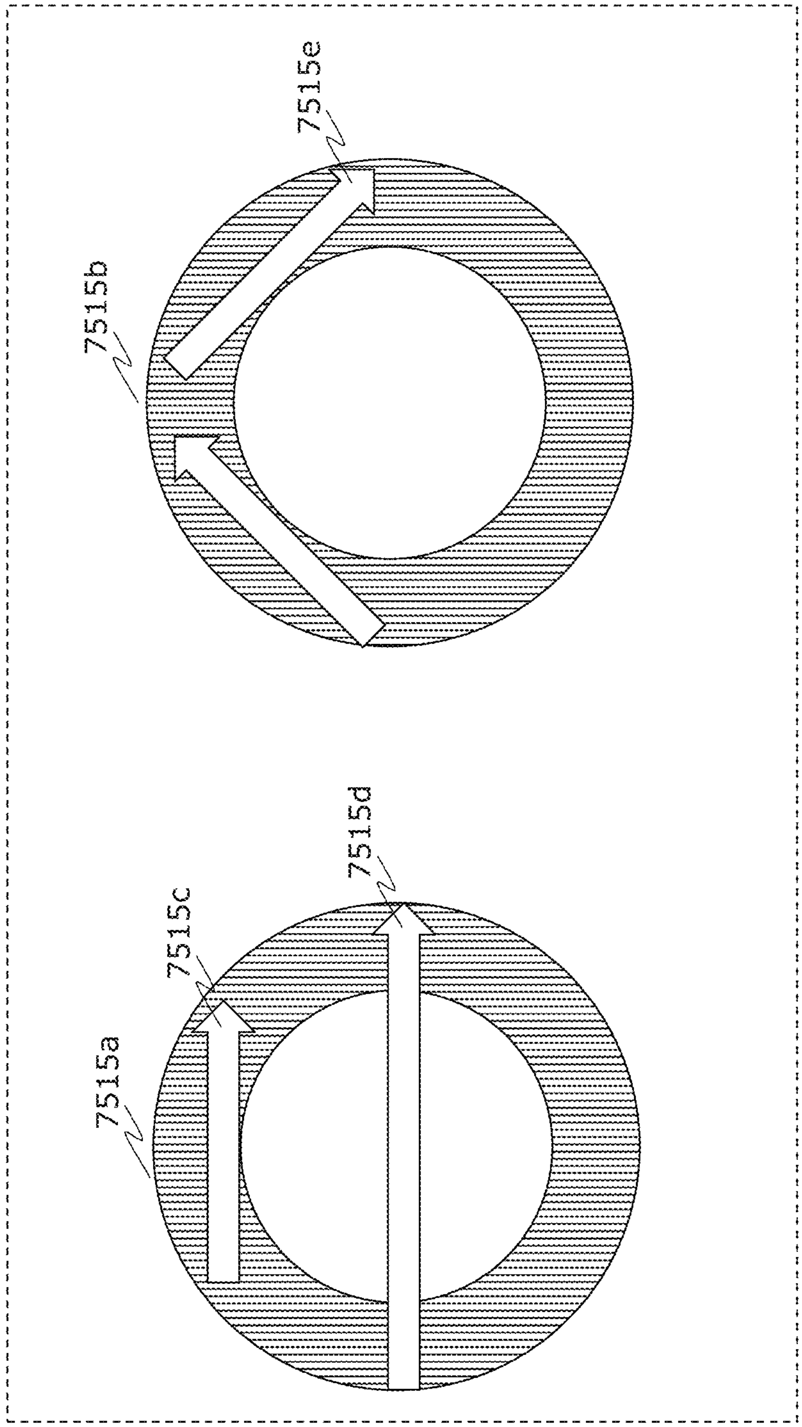
FIG. 49 is a diagram illustrating an example of application of a reception method in Embodiment 2.

FIG. 49 is a diagram illustrating an example of application of a receiver in this embodiment.

Transmitters 7515*a* and 7515*b* are each high in luminance in the center part, so that bright lines appear not in the center part but in the peripheral part in an image captured by a receiver. Since the bright lines are discontinuous, the receiver cannot receive a signal from a part 7515*d*, but can receive a signal from a part 7515*c*. By reading bright lines along a path 7515*e*, the receiver can receive a signal from more bright lines than in the part 7515*c*.

Figure 50:
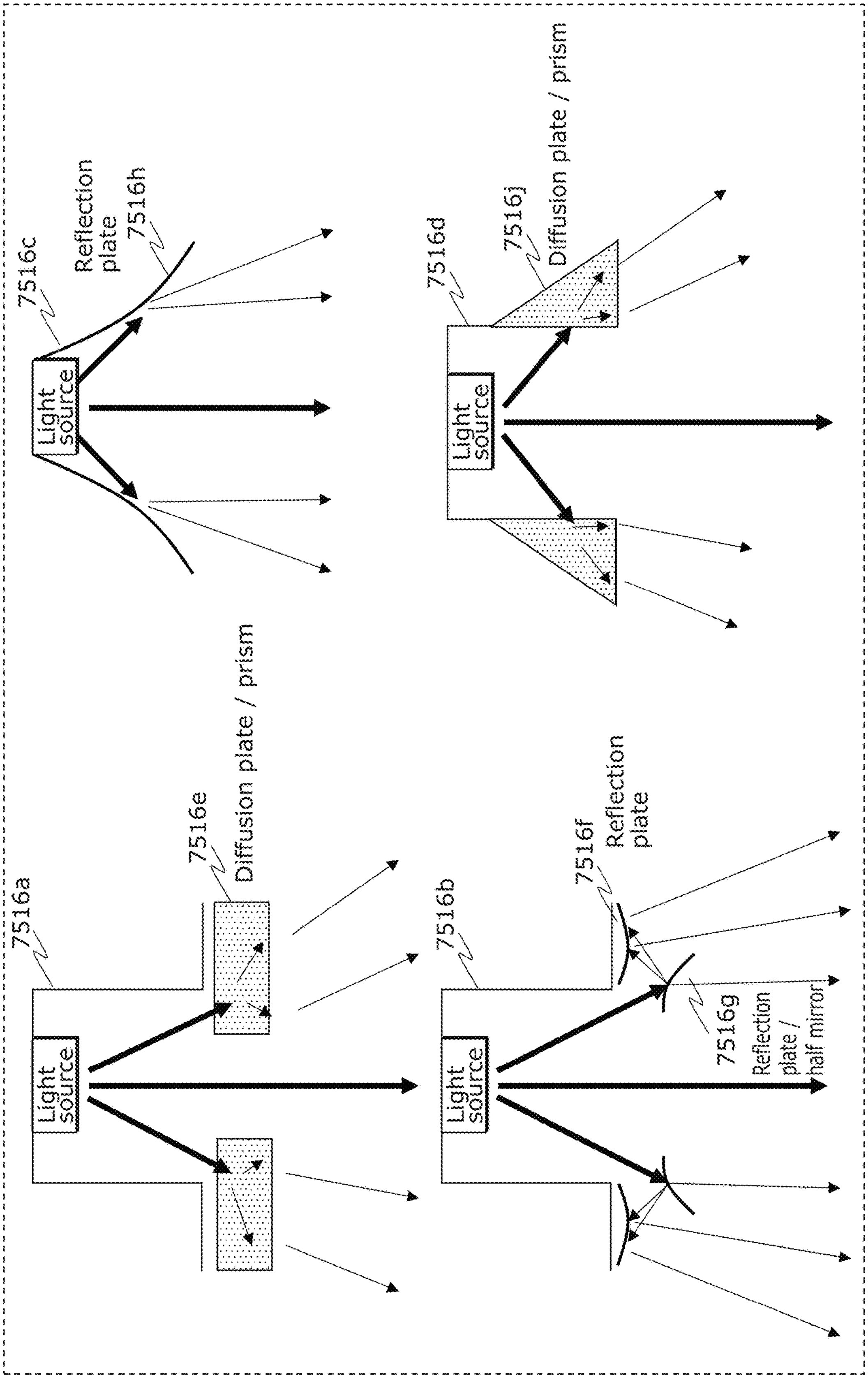
FIG. 50 is a diagram illustrating an example of application of a transmitter in Embodiment 2.

FIG. 50 is a diagram illustrating an example of application of a transmitter in this embodiment.

Transmitters 7516*a*, 7516*b*, 7516*c*, and 7516*d* such as lightings are high in luminance like 7513*a*, and bright lines tend not to appear when captured by a receiver. Accordingly, a diffusion plate/prism 7516*e*, a reflection plate 7516*f*, a reflection plate/half mirror 7516*g*, a reflection plate 7516*h*, or a diffusion plate/prism 7516*j* is included to diffuse light, with it being possible to widen the part where bright lines appear. These transmitters are each captured with bright lines appearing in the periphery, like 7515*a*. Since the receiver estimates the distance between the receiver and the transmitter using the size of the transmitter in the captured image, the part where light is diffused is set as the size of the light source and stored in a server or the like in association with the transmission ID, as a result of which the receiver can accurately estimate the distance to the transmitter.

Figure 51:
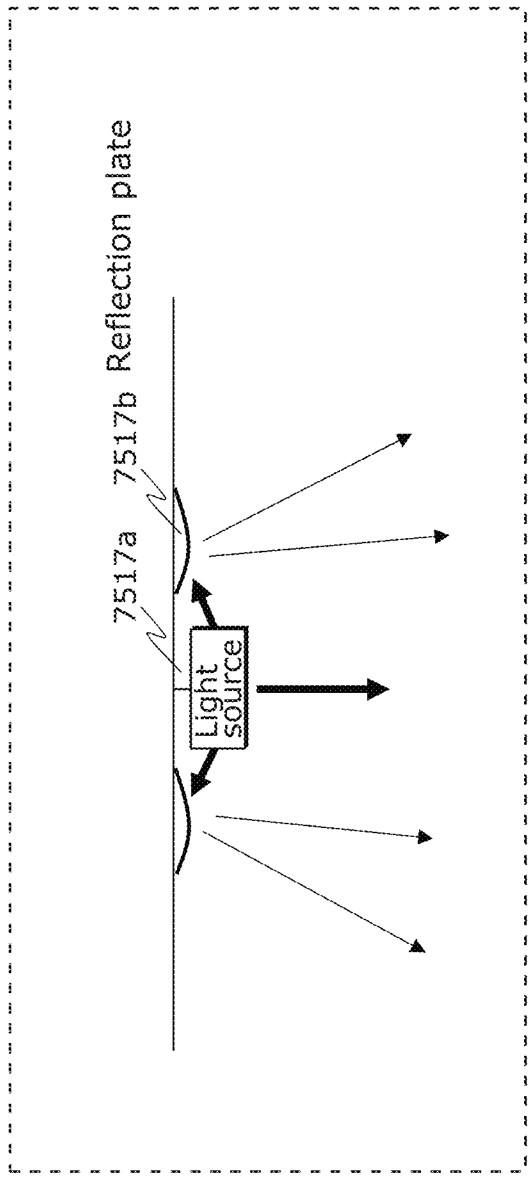
FIG. 51 is a diagram illustrating an example of application of a transmitter in Embodiment 2.

FIG. 51 is a diagram illustrating an example of application of a transmitter in this embodiment.

A transmitter 7517*a* such as a lighting is high in luminance like 7513*a*, and bright lines tend not to appear when captured by a receiver. Accordingly, a reflection plate 7517*b* is included to diffuse light, with it being possible to widen the part where bright lines appear.

Figure 52:
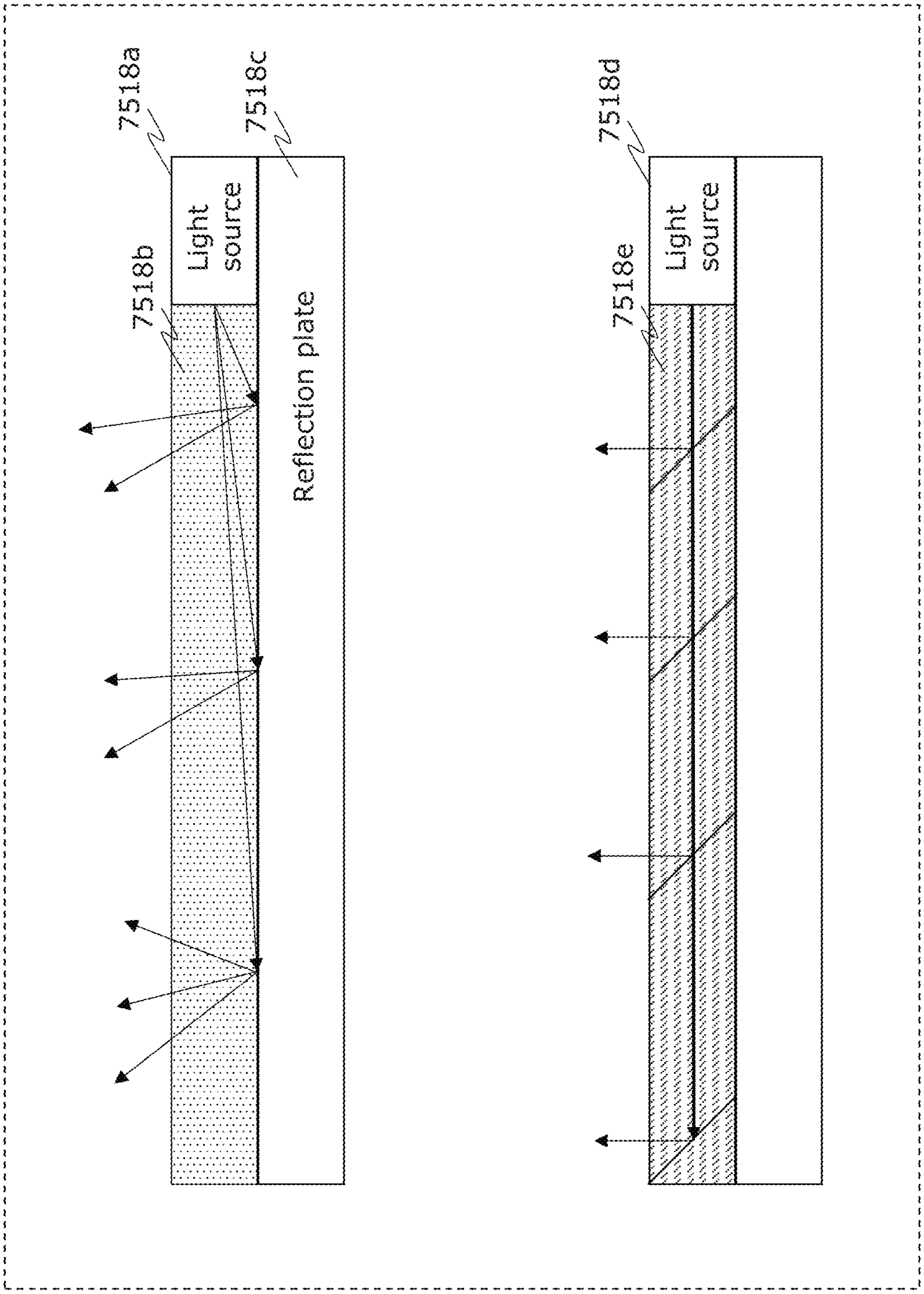
FIG. 52 is a diagram illustrating an example of application of a transmitter in Embodiment 2.

FIG. 52 is a diagram illustrating an example of application of a transmitter in this embodiment.

A transmitter 7518*a* reflects light from a light source by a reflection plate 7518*c*, as a result of which a receiver can capture bright lines in a wide range. A transmitter 7518*d* directs a light source toward a diffusion plate or prism 7518*e*, as a result of which a receiver can capture bright lines in a wide range.

Figure 53:
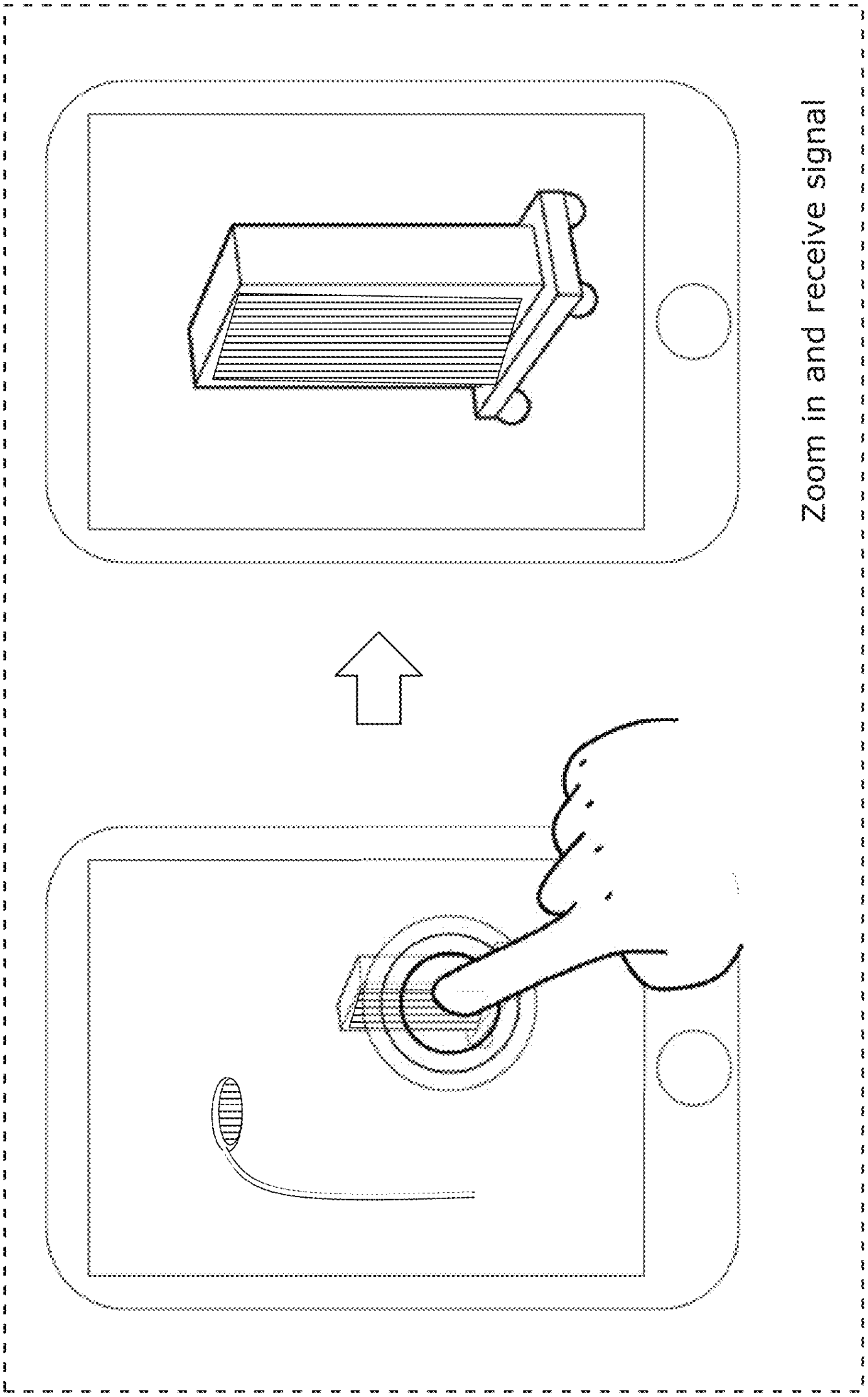
FIG. 53 is a diagram illustrating another example of operation of a receiver in Embodiment 2.

FIG. 53 is a diagram illustrating another example of operation of a receiver in this embodiment.

A receiver displays a bright line pattern using the above-mentioned synthetic image, intermediate image, or the like. Here, the receiver may be incapable of receiving a signal from a transmitter corresponding to the bright line pattern. When the user performs an operation (e.g. a tap) on the bright line pattern to select the bright line pattern, the receiver displays the synthetic image or intermediate image in which the bright line pattern is enlarged by optical zoom. Through such optical zoom, the receiver can appropriately receive the signal from the transmitter corresponding to the bright line pattern. That is, even when the captured image is too small to obtain the signal, the signal can be appropriately received by performing optical zoom. In the case where the displayed image is large enough to obtain the signal, too, faster reception is possible by optical zoom.

Summary of this Embodiment

An information communication method in this embodiment is an information communication method of obtaining information from a subject, the information communication method including: setting an exposure time of an image sensor so that, in an image obtained by capturing the subject by the image sensor, a bright line corresponding to an exposure line included in the image sensor appears according to a change in luminance of the subject; obtaining a bright line image by capturing the subject that changes in luminance by the image sensor with the set exposure time, the bright line image being an image including the bright line; displaying, based on the bright line image, a display image in which the subject and surroundings of the subject are shown, in a form that enables identification of a spatial position of a part where the bright line appears; and obtaining transmission information by demodulating data specified by a pattern of the bright line included in the obtained bright line image.

In this way, a synthetic image or an intermediate image illustrated in, for instance, FIGS. 7 to 9 and 13 is displayed as the display image. In the display image in which the subject and the surroundings of the subject are shown, the spatial position of the part where the bright line appears is identified by a bright line pattern, a signal specification object, a signal identification object, a dotted frame, or the like. By looking at such a display image, the user can easily find the subject that is transmitting the signal through the change in luminance.

For example, the information communication method may further include: setting a longer exposure time than the exposure time; obtaining a normal captured image by capturing the subject and the surroundings of the subject by the image sensor with the longer exposure time; and generating a synthetic image by specifying, based on the bright line image, the part where the bright line appears in the normal captured image, and superimposing a signal object on the normal captured image, the signal object being an image indicating the part, wherein in the displaying, the synthetic image is displayed as the display image.

In this way, the signal object is, for example, a bright line pattern, a signal specification object, a signal identification object, a dotted frame, or the like, and the synthetic image is displayed as the display image as illustrated in FIGS. 8, 9, and 13. Hence, the user can more easily find the subject that is transmitting the signal through the change in luminance.

For example, in the setting of an exposure time, the exposure time may be set to 1/3000 second, in the obtaining of a bright line image, the bright line image in which the surroundings of the subject are shown may be obtained, and in the displaying, the bright line image may be displayed as the display image.

In this way, the bright line image is obtained and displayed as an intermediate image, for instance as illustrated in FIG. 7. This eliminates the need for a process of obtaining a normal captured image and a visible light communication image and synthesizing them, thus contributing to a simpler process.

For example, the image sensor may include a first image sensor and a second image sensor, in the obtaining of the normal captured image, the normal captured image may be obtained by image capture by the first image sensor, and in the obtaining of a bright line image, the bright line image may be obtained by image capture by the second image sensor simultaneously with the first image sensor.

In this way, the normal captured image and the visible light communication image which is the bright line image are obtained by the respective cameras, for instance as illustrated in FIG. 9. As compared with the case of obtaining the normal captured image and the visible light communication image by one camera, the images can be obtained promptly, contributing to a faster process.

For example, the information communication method may further include presenting, in the case where the part where the bright line appears is designated in the display image by an operation by a user, presentation information based on the transmission information obtained from the pattern of the bright line in the designated part. Examples of the operation by the user include: a tap; a swipe; an operation of continuously placing the user's fingertip on the part for a predetermined time or more; an operation of continuously directing the user's gaze to the part for a predetermined time or more; an operation of moving a part of the user's body according to an arrow displayed in association with the part; an operation of placing a pen tip that changes in luminance on the part; and an operation of pointing to the part with a pointer displayed in the display image by touching a touch sensor.

In this way, the presentation information is displayed as an information notification image, for instance as illustrated in FIGS. 15 to 20 and 25 to 34. Desired information can thus be presented to the user.

For example, the image sensor may be included in a head-mounted display, and in the displaying, the display image may be displayed by a projector included in the head-mounted display.

In this way, the information can be easily presented to the user, for instance as illustrated in FIGS. 23 to 30.

For example, an information communication method of obtaining information from a subject may include: setting an exposure time of an image sensor so that, in an image obtained by capturing the subject by the image sensor, a bright line corresponding to an exposure line included in the image sensor appears according to a change in luminance of the subject; obtaining a bright line image by capturing the subject that changes in luminance by the image sensor with the set exposure time, the bright line image being an image including the bright line; and obtaining the information by demodulating data specified by a pattern of the bright line included in the obtained bright line image, wherein in the obtaining of a bright line image, the bright line image including a plurality of parts where the bright line appears is obtained by capturing a plurality of subjects in a period during which the image sensor is being moved, and in the obtaining of the information, a position of each of the plurality of subjects is obtained by demodulating, for each of the plurality of parts, the data specified by the pattern of the bright line in the part, and the information communication method may further include estimating a position of the image sensor, based on the obtained position of each of the plurality of subjects and a moving state of the image sensor.

In this way, the position of the receiver including the image sensor can be accurately estimated based on the changes in luminance of the plurality of subjects such as lightings, for instance as illustrated in FIG. 22.

For example, an information communication method of obtaining information from a subject may include: setting an exposure time of an image sensor so that, in an image obtained by capturing the subject by the image sensor, a bright line corresponding to an exposure line included in the image sensor appears according to a change in luminance of the subject; obtaining a bright line image by capturing the subject that changes in luminance by the image sensor with the set exposure time, the bright line image being an image including the bright line; obtaining the information by demodulating data specified by a pattern of the bright line included in the obtained bright line image; and presenting the obtained information, wherein in the presenting, an image prompting to make a predetermined gesture is presented to a user of the image sensor as the information.

In this way, user authentication and the like can be conducted according to whether or not the user makes the gesture as prompted, for instance as illustrated in FIGS. 35A to 36B. This enhances convenience.

For example, an information communication method of obtaining information from a subject may include: setting an exposure time of an image sensor so that, in an image obtained by capturing the subject by the image sensor, a bright line corresponding to an exposure line included in the image sensor appears according to a change in luminance of the subject; obtaining a bright line image by capturing the subject that changes in luminance by the image sensor with the set exposure time, the bright line image being an image including the bright line; and obtaining the information by demodulating data specified by a pattern of the bright line included in the obtained bright line image, wherein in the obtaining of a bright line image, the bright line image is obtained by capturing a plurality of subjects reflected on a reflection surface, and in the obtaining of the information, the information is obtained by separating a bright line corresponding to each of the plurality of subjects from bright lines included in the bright line image according to a strength of the bright line and demodulating, for each of the plurality of subjects, the data specified by the pattern of the bright line corresponding to the subject.

In this way, even in the case where the plurality of subjects such as lightings each change in luminance, appropriate information can be obtained from each subject, for instance as illustrated in FIG. 42.

For example, an information communication method of obtaining information from a subject may include: setting an exposure time of an image sensor so that, in an image obtained by capturing the subject by the image sensor, a bright line corresponding to an exposure line included in the image sensor appears according to a change in luminance of the subject; obtaining a bright line image by capturing the subject that changes in luminance by the image sensor with the set exposure time, the bright line image being an image including the bright line; and obtaining the information by demodulating data specified by a pattern of the bright line included in the obtained bright line image, wherein in the obtaining of a bright line image, the bright line image is obtained by capturing the subject reflected on a reflection surface, and the information communication method may further include estimating a position of the subject based on a luminance distribution in the bright line image.

In this way, the appropriate position of the subject can be estimated based on the luminance distribution, for instance as illustrated in FIG. 43.

For example, an information communication method of transmitting a signal using a change in luminance may include: determining a first pattern of the change in luminance, by modulating a first signal to be transmitted; determining a second pattern of the change in luminance, by modulating a second signal to be transmitted; and transmitting the first signal and the second signal by a light emitter alternately changing in luminance according to the determined first pattern and changing in luminance according to the determined second pattern.

In this way, the first signal and the second signal can each be transmitted without a delay, for instance as illustrated in FIG. 37A.

For example, in the transmitting, a buffer time may be provided when switching the change in luminance between the change in luminance according to the first pattern and the change in luminance according to the second pattern.

In this way, interference between the first signal and the second signal can be suppressed, for instance as illustrated in FIG. 37B.

For example, an information communication method of transmitting a signal using a change in luminance may include: determining a pattern of the change in luminance by modulating the signal to be transmitted; and transmitting the signal by a light emitter changing in luminance according to the determined pattern, wherein the signal is made up of a plurality of main blocks, each of the plurality of main blocks includes first data, a preamble for the first data, and a check signal for the first data, the first data is made up of a plurality of sub-blocks, and each of the plurality of sub-blocks includes second data, a preamble for the second data, and a check signal for the second data.

In this way, data can be appropriately obtained regardless of whether or not the receiver needs a blanking interval, for instance as illustrated in FIG. 38.

For example, an information communication method of transmitting a signal using a change in luminance may include: determining, by each of a plurality of transmitters, a pattern of the change in luminance by modulating the signal to be transmitted; and transmitting, by each of the plurality of transmitters, the signal by a light emitter in the transmitter changing in luminance according to the determined pattern, wherein in the transmitting, the signal of a different frequency or protocol is transmitted.

In this way, interference between signals from the plurality of transmitters can be suppressed, for instance as illustrated in FIG. 40.

For example, an information communication method of transmitting a signal using a change in luminance may include: determining, by each of a plurality of transmitters, a pattern of the change in luminance by modulating the signal to be transmitted; and transmitting, by each of the plurality of transmitters, the signal by a light emitter in the transmitter changing in luminance according to the determined pattern, wherein in the transmitting, one of the plurality of transmitters receives a signal transmitted from a remaining one of the plurality of transmitters, and transmits an other signal in a form that does not interfere with the received signal.

In this way, interference between signals from the plurality of transmitters can be suppressed, for instance as illustrated in FIG. 41.

Embodiment 3

This embodiment describes each example of application using a receiver such as a smartphone and a transmitter for transmitting information as a blink pattern of an LED, an organic EL device, or the like in Embodiment 1 or 2 described above.

Figure 54:
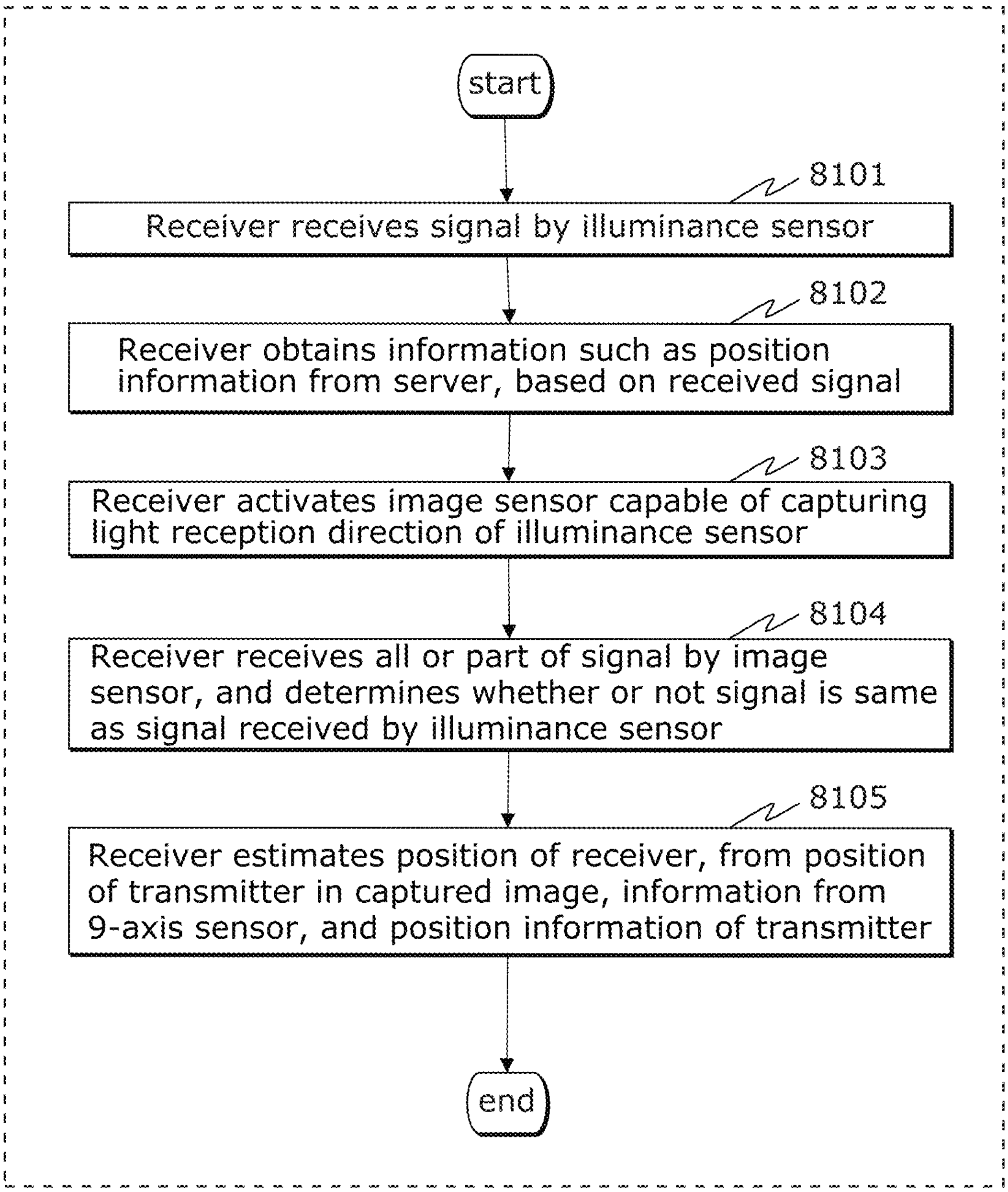
FIG. 54 is a flowchart illustrating an example of operation of a receiver in Embodiment 3.

FIG. 54 is a flowchart illustrating an example of operation of a receiver in Embodiment 3.

First, a receiver receives a signal by an illuminance sensor (Step 8101). Next, the receiver obtains information such as position information from a server, based on the received signal (Step 8102). The receiver then activates an image sensor capable of capturing the light reception direction of the illuminance sensor (Step 8103). The receiver receives all or part of a signal by the image sensor, and determines whether or not all or part of the signal is the same as the signal received by the illuminance sensor (Step 8104). Following this, the receiver estimates the position of the receiver, from the position of the transmitter in the captured image, information from a 9-axis sensor included in the receiver, and the position information of the transmitter (Step 8105). Thus, the receiver activates the illuminance sensor of low power consumption and, in the case where the signal is received by the illuminance sensor, activates the image sensor. The receiver then performs position estimation using image capture by the image sensor. In this way, the position of the receiver can be accurately estimated while saving power.

Figure 55:
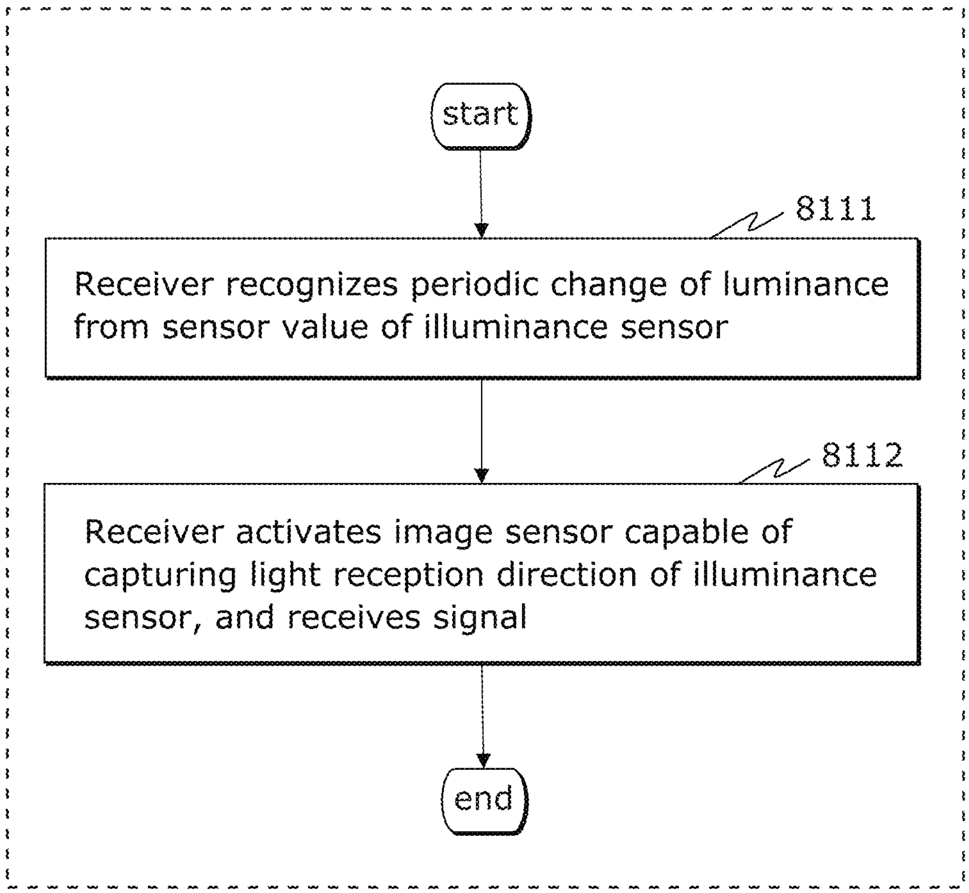
FIG. 55 is a flowchart illustrating another example of operation of a receiver in Embodiment 3.

FIG. 55 is a flowchart illustrating another example of operation of a receiver in Embodiment 3.

A receiver recognizes a periodic change of luminance from the sensor value of an illuminance sensor (Step 8111). The receiver then activates an image sensor capable of capturing the light reception direction of the illuminance sensor, and receives a signal (Step 8112). Thus, the receiver activates the illuminance sensor of low power consumption and, in the case where the periodic change of luminance is received by the illuminance sensor, activates the image sensor, in the same way as above. The receiver then receives the accurate signal using image capture by the image sensor. In this way, the accurate signal can be received while saving power.

Figure 56A:
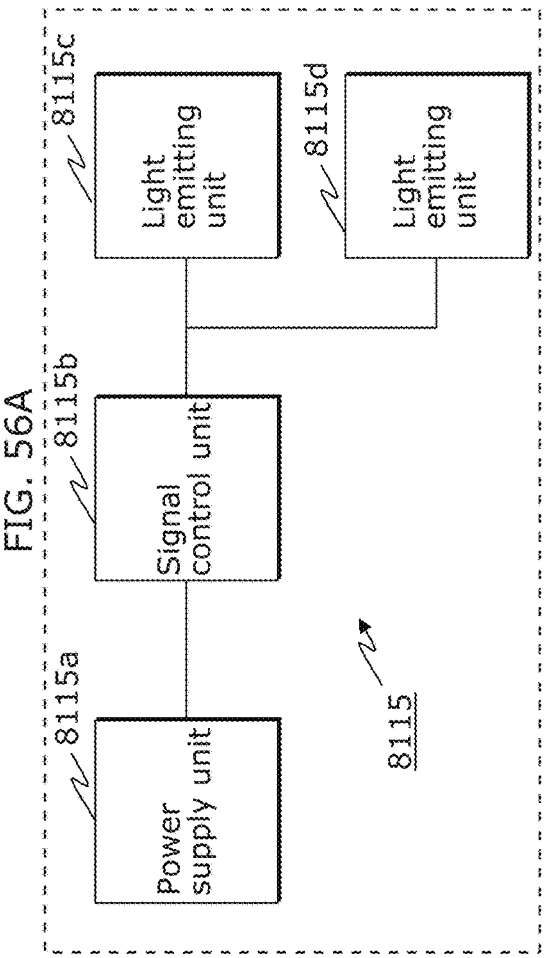
FIG. 56A is a block diagram illustrating an example of a transmitter in Embodiment 3.

FIG. 56A is a diagram illustrating an example of operation of a transmitter in Embodiment 3.

A transmitter 8115 includes a power supply unit 8115*a*, a signal control unit 8115*b*, a light emitting unit 8115*c*, and a light emitting unit 8115*d*. The power supply unit 8115*a* supplies power to the signal control unit 8115*b*. The signal control unit 8115*b* divides the power supplied from the power supply unit 8115*a* into the light emitting units 8115*c* and 8115*d*, and controls the luminance changes of the light emitting units 8115*c* and 8115*d*.

Figure 56B:
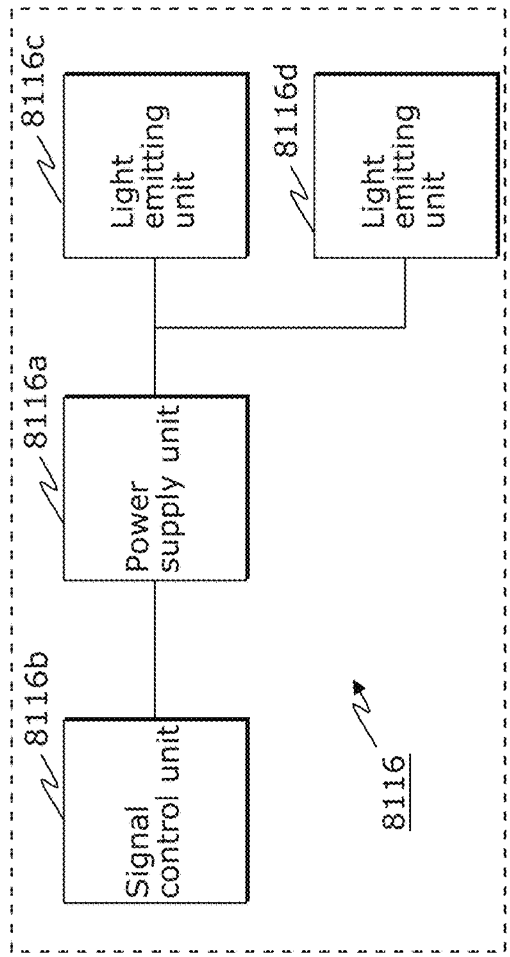
FIG. 56B is a block diagram illustrating another example of a transmitter in Embodiment 3.

FIG. 56B is a diagram illustrating another example of operation of a transmitter in Embodiment 3.

A transmitter 8116 includes a power supply unit 8116*a*, a signal control unit 8116*b*, a light emitting unit 8116*c*, and a light emitting unit 8116*d*. The power supply unit 8116*a* supplies power to the light emitting units 8116*c* and 8116*d*. The signal control unit 8116*b* controls the power supplied from the power supply unit 8116*a*, thereby controlling the luminance changes of the light emitting units 8116*c* and 8116*d*. The power use efficiency can be enhanced by the signal control unit 8116*b* controlling the power supply unit 8116*a* that supplies power to each of the light emitting units 8116*c* and 8116*d*.

Figure 57:
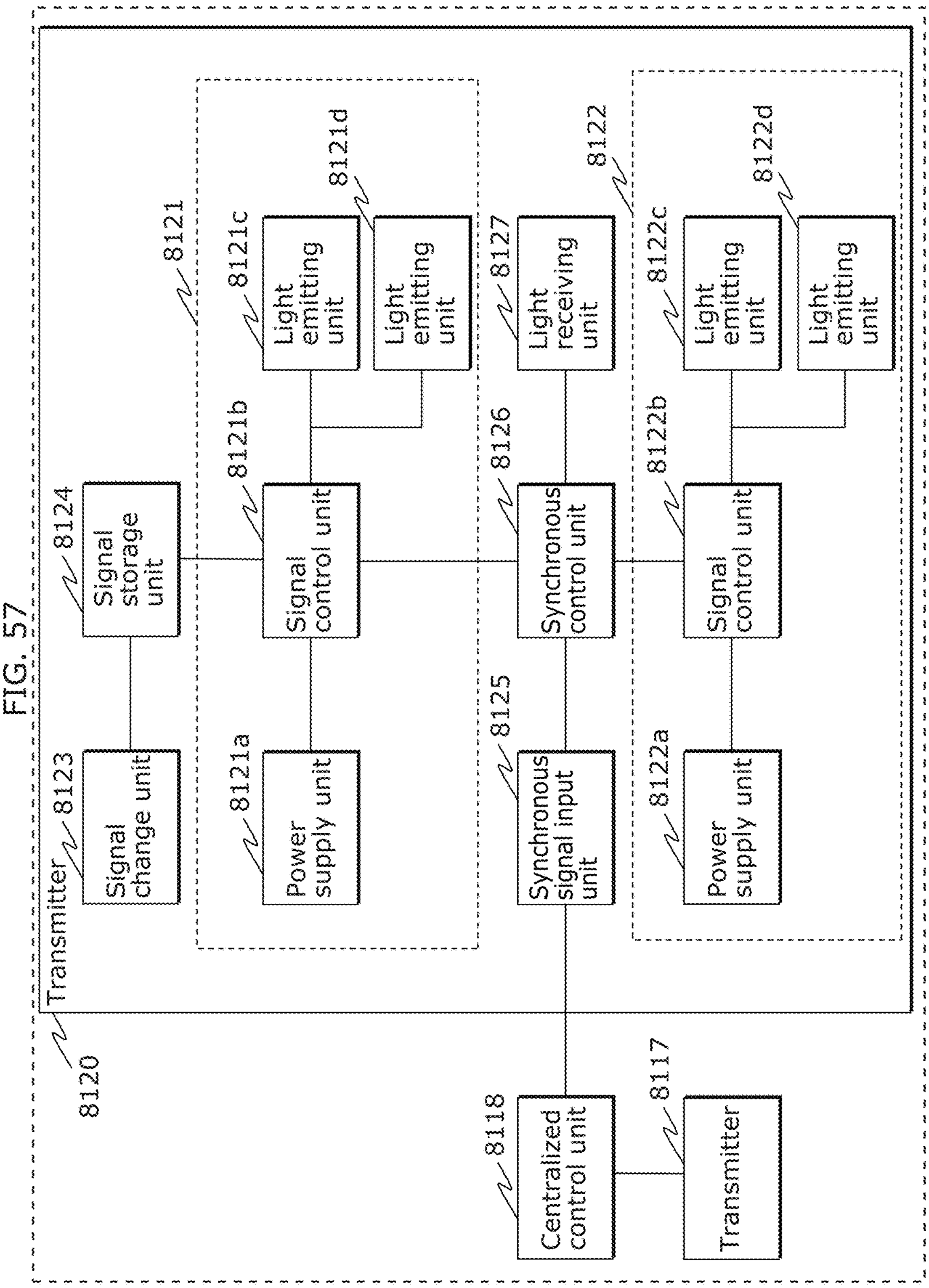
FIG. 57 is a diagram illustrating an example of a structure of a system including a plurality of transmitters in Embodiment 3.

FIG. 57 is a diagram illustrating an example of a structure of a system including a plurality of transmitters in Embodiment 3.

The system includes a centralized control unit 8118, a transmitter 8117, and a transmitter 8120. The centralized control unit 8118 controls signal transmission by a change in luminance of each of the transmitters 8117 and 8120. For example, the centralized control unit 8118 causes the transmitters 8117 and 8120 to transmit the same signal at the same time, or causes one of the transmitters to transmit a signal unique to the transmitter.

The transmitter 8120 includes two transmission units 8121 and 8122, a signal change unit 8123, a signal storage unit 8124, a synchronous signal input unit 8125, a synchronous control unit 8126, and a light receiving unit 8127.

The two transmission units 8121 and 8122 each have the same structure as the transmitter 8115 illustrated in FIG. 56A, and transmits a signal by changing in luminance. In detail, the transmission unit 8121 includes a power supply unit 8121*a*, a signal control unit 8121*b*, a light emitting unit 8121*c*, and a light emitting unit 8121*d*. The transmission unit 8122 includes a power supply unit 8122*a*, a signal control unit 8122*b*, a light emitting unit 8122*c*, and a light emitting unit 8122*d*.

The signal change unit 8123 modulates a signal to be transmitted, to a signal indicating a luminance change pattern. The signal storage unit 8124 stores the signal indicating the luminance change pattern. The signal control unit 8121*b* in the transmission unit 8121 reads the signal stored in the signal storage unit 8124, and causes the light emitting units 8121*c* and 8121*d* to change in luminance according to the signal.

The synchronous signal input unit 8125 obtains a synchronous signal according to control by the centralized control unit 8118. The synchronous control unit 8126 synchronizes the luminance changes of the transmission units 8121 and 8122, when the synchronous signal is obtained. That is, the synchronous control unit 8126 controls the signal control units 8121*b* and 8122*b*, to synchronize the luminance changes of the transmission units 8121 and 8122. Here, the light receiving unit 8127 detects light emission from the transmission units 8121 and 8122. The synchronous control unit 8126 feedback-controls the signal control units 8121*b* and 8122*b*, according to the light detected by the light receiving unit 8127.

Figure 58:
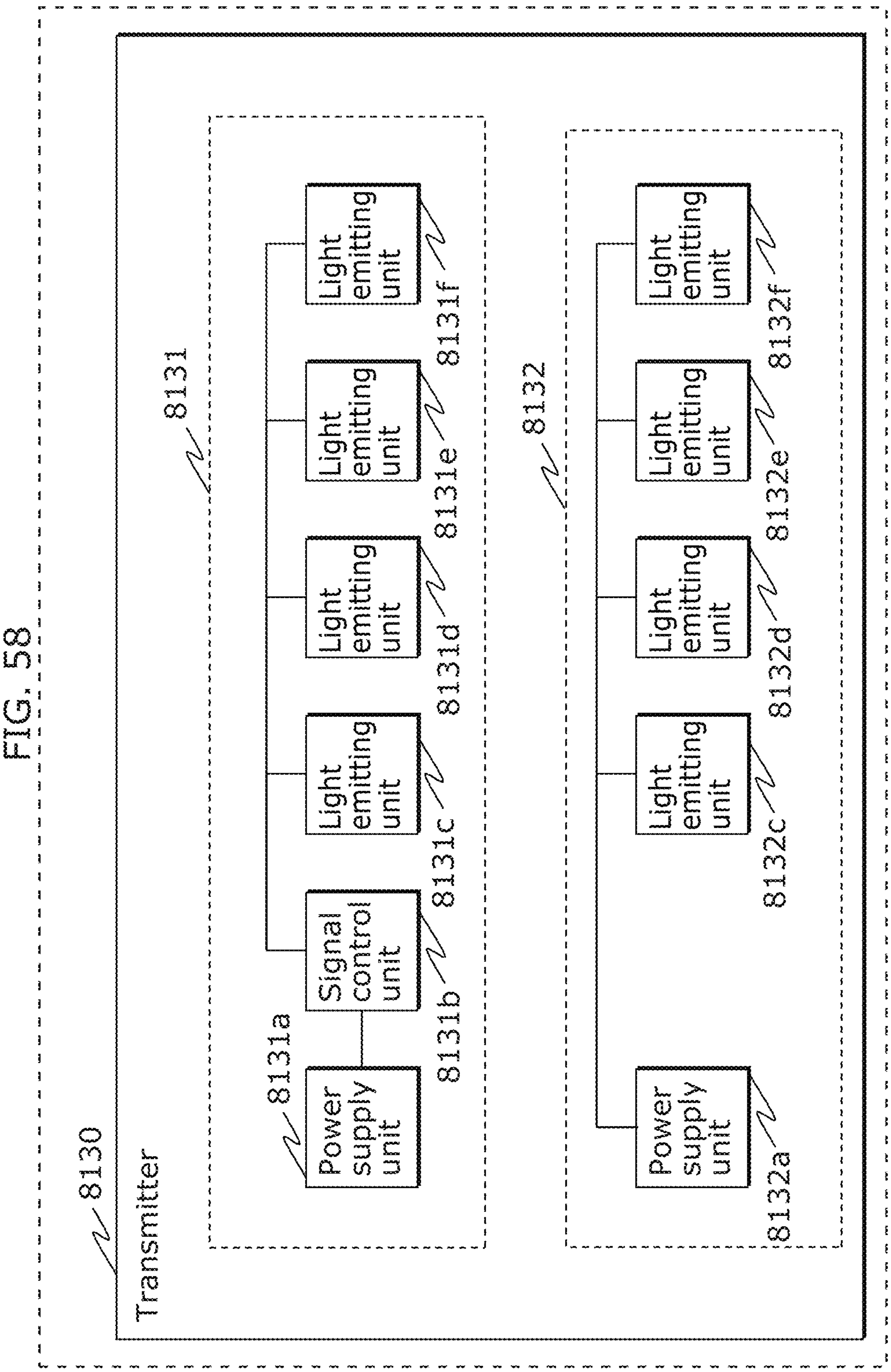
FIG. 58 is a block diagram illustrating another example of a transmitter in Embodiment 3.

FIG. 58 is a block diagram illustrating another example of a transmitter in Embodiment 3.

A transmitter 8130 includes a transmission unit 8131 that transmits a signal by changing in luminance, and a non-transmission unit 8132 that emits light without transmitting a signal.

The transmission unit 8131 has the same structure as the transmitter 8115 illustrated in FIG. 56A, and includes a power supply unit 8131*a*, a signal control unit 8131*b*, and light emitting units 8131*c* to 8131*f*. The non-transmission unit 8132 includes a power supply unit 8132*a* and light emitting units 8132*c* to 8132*f*, but does not include a signal control unit. In other words, in the case where there are a plurality of units each including a power supply and luminance change synchronous control cannot be performed between the plurality of units, a signal control unit is provided in only one of the plurality of units to cause the unit to change in luminance, as in the structure illustrated in FIG. 58.

In the transmitter 8130, the light emitting units 8131*c* to 8131*f* in the transmission unit 8131 are continuously arranged in a line. That is, none of the light emitting units 8132*c* to 8132*f* in the non-transmission unit 8132 is mixed in the set of the light emitting units 8131*c* to 8131*f*. This makes the light emitter that changes in luminance larger in size, so that the receiver can easily receive the signal transmitted using the change in luminance.

Figure 59A:
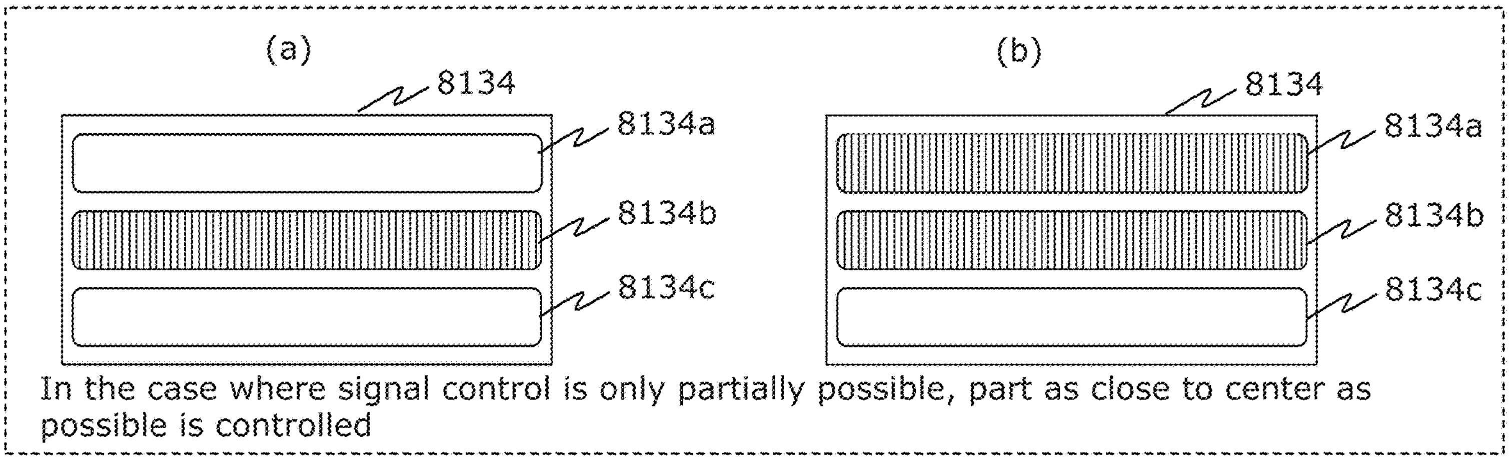
FIG. 59A is a diagram illustrating an example of a transmitter in Embodiment 3.

FIG. 59A is a diagram illustrating an example of a transmitter in Embodiment 3.

A transmitter 8134 such as a signage includes three light emitting units (light emitting areas) 8134*a* to 8134*c*. Light from these light emitting units 8134*a* to 8134*c* do not interfere with each other. In the case where only one of the light emitting units 8134*a* to 8134*c* can be changed in luminance to transmit a signal, it is desirable to change in luminance the light emitting unit 8134*b* at the center, as illustrated in (a) in FIG. 59A. In the case where two of the light emitting units 8134*a* to 8134*c* can be changed in luminance, it is desirable to change in luminance the light emitting unit 8134*b* at the center and the light emitting unit 8134*a* or 8134*c* at either edge, as illustrated in (b) in FIG. 59A. Changing in luminance the light emitting units at such positions enables the receiver to appropriately receive the signal transmitted using the change in luminance.

Figure 59B:
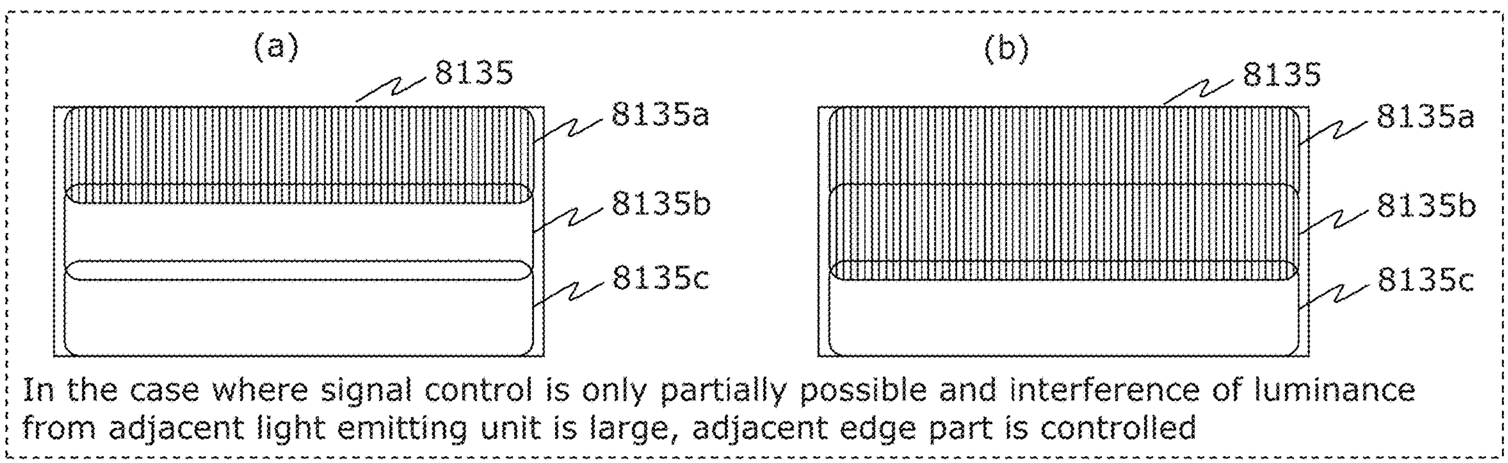
FIG. 59B is a diagram illustrating an example of a transmitter in Embodiment 3.

FIG. 59B is a diagram illustrating an example of a transmitter in Embodiment 3.

A transmitter 8135 such as a signage includes three light emitting units 8135*a* to 8135*c*. Light from adjacent light emitting units of these light emitting units 8135*a* to 8135*c* interferes with each other. In the case where only one of the light emitting units 8135*a* to 8135*c* can be changed in luminance to transmit a signal, it is desirable to change in luminance the light emitting unit 8135*a* or 8135*c* at either edge, as illustrated in (a) in FIG. 59B. This prevents light from another light emitting unit from interfering with the luminance change for signal transmission. In the case where two of the light emitting units 8135*a* to 8135*c* can be changed in luminance, it is desirable to change in luminance the light emitting unit 8135*b* at the center and the light emitting unit 8135*a* or 8135*c* at either edge, as illustrated in (b) in FIG. 59B. Changing in luminance the light emitting units at such positions contributes to a larger luminance change area, and so enables the receiver to appropriately receive the signal transmitted using the change in luminance.

Figure 59C:
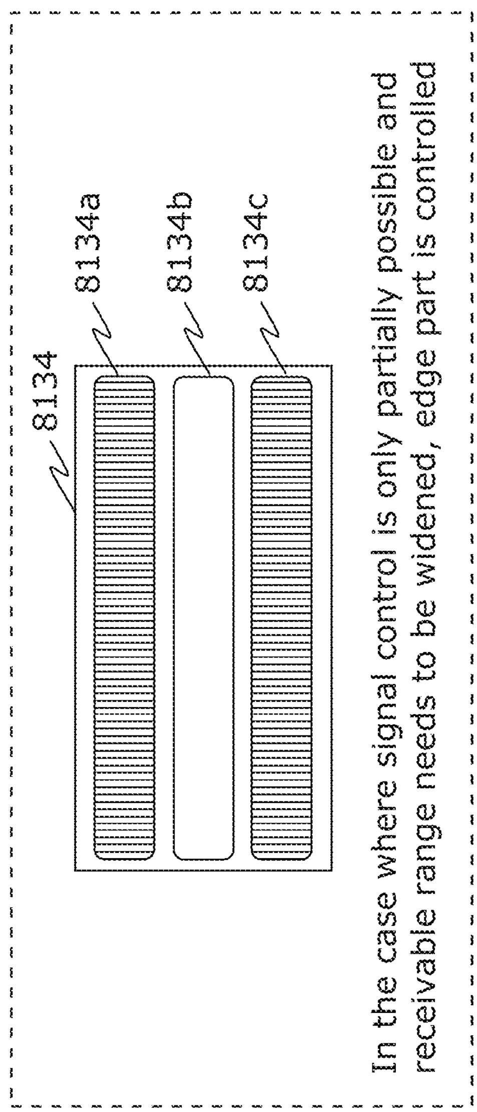
FIG. 59C is a diagram illustrating an example of a transmitter in Embodiment 3.

FIG. 59C is a diagram illustrating an example of a transmitter in Embodiment 3.

In the case where two of the light emitting units 8134*a* to 8134*c* can be changed in luminance in the transmitter 8134, the light emitting units 8134*a* and 8134*c* at both edges may be changed in luminance, as illustrated in FIG. 50C. In this case, the imaging range in which the luminance change part is shown can be widened in the image capture by the receiver.

Figure 60A:
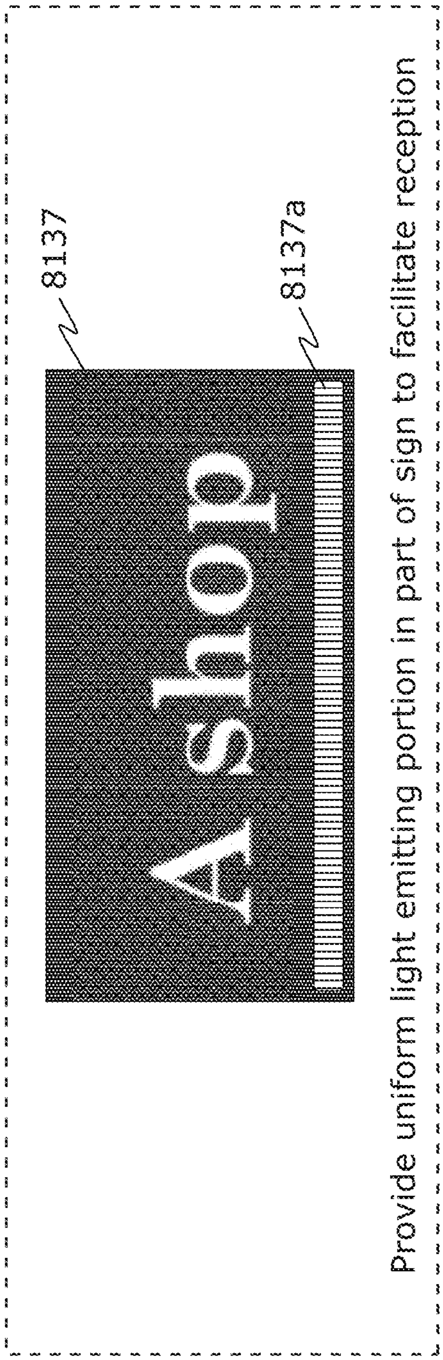
FIG. 60A is a diagram illustrating an example of a transmitter in Embodiment 3.

FIG. 60A is a diagram illustrating an example of a transmitter in Embodiment 3.

A transmitter 8137 such as a signage transmits a signal by a character part “A Shop” and a light emitting unit 8137*a* changing in luminance. For example, the light emitting unit 8137*a* is formed like a horizontally long rectangle, and uniformly changes in luminance. The uniform change in luminance of the light emitting unit 8137*a* enables the receiver to appropriately receive the signal transmitted using the change in luminance.

Figure 60B:
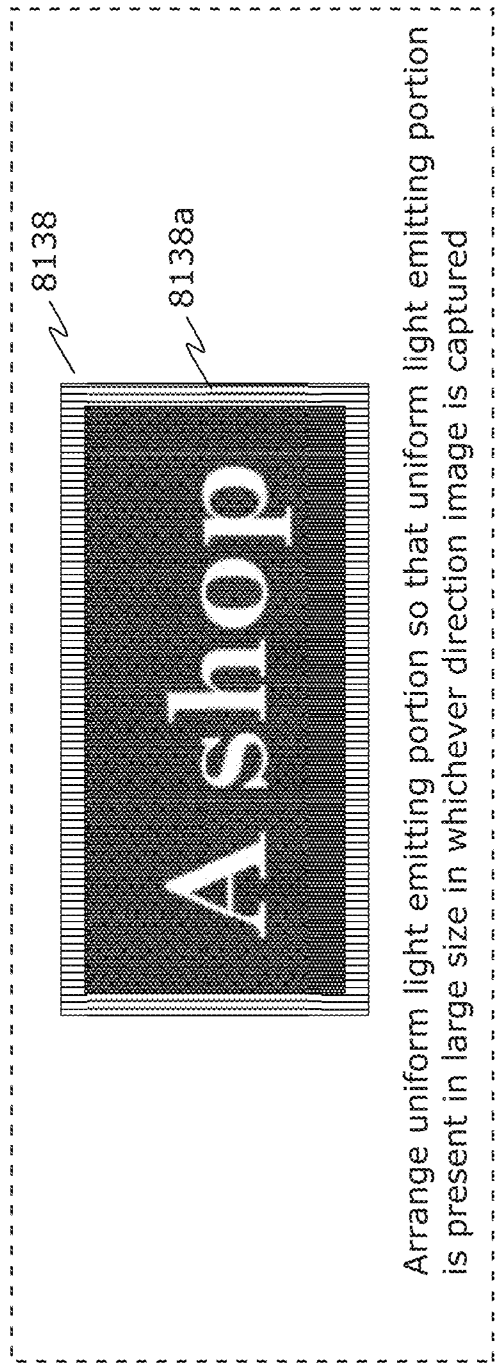
FIG. 60B is a diagram illustrating an example of a transmitter in Embodiment 3.

FIG. 60B is a diagram illustrating an example of a transmitter in Embodiment 3.

A transmitter 8138 such as a signage transmits a signal by a character part “A Shop” and a light emitting unit 8138*a* changing in luminance. For example, the light emitting unit 8138*a* is formed like a frame along the edges of the signage, and uniformly changes in luminance. That is, the light emitting unit 8138*a* is formed so that, when the light emitting unit is projected onto an arbitrary straight line, the length of the continuous projection part is at the maximum. The uniform change in luminance of the light emitting unit 8138*a* enables the receiver to more appropriately receive the signal transmitted using the change in luminance.

Figure 61:
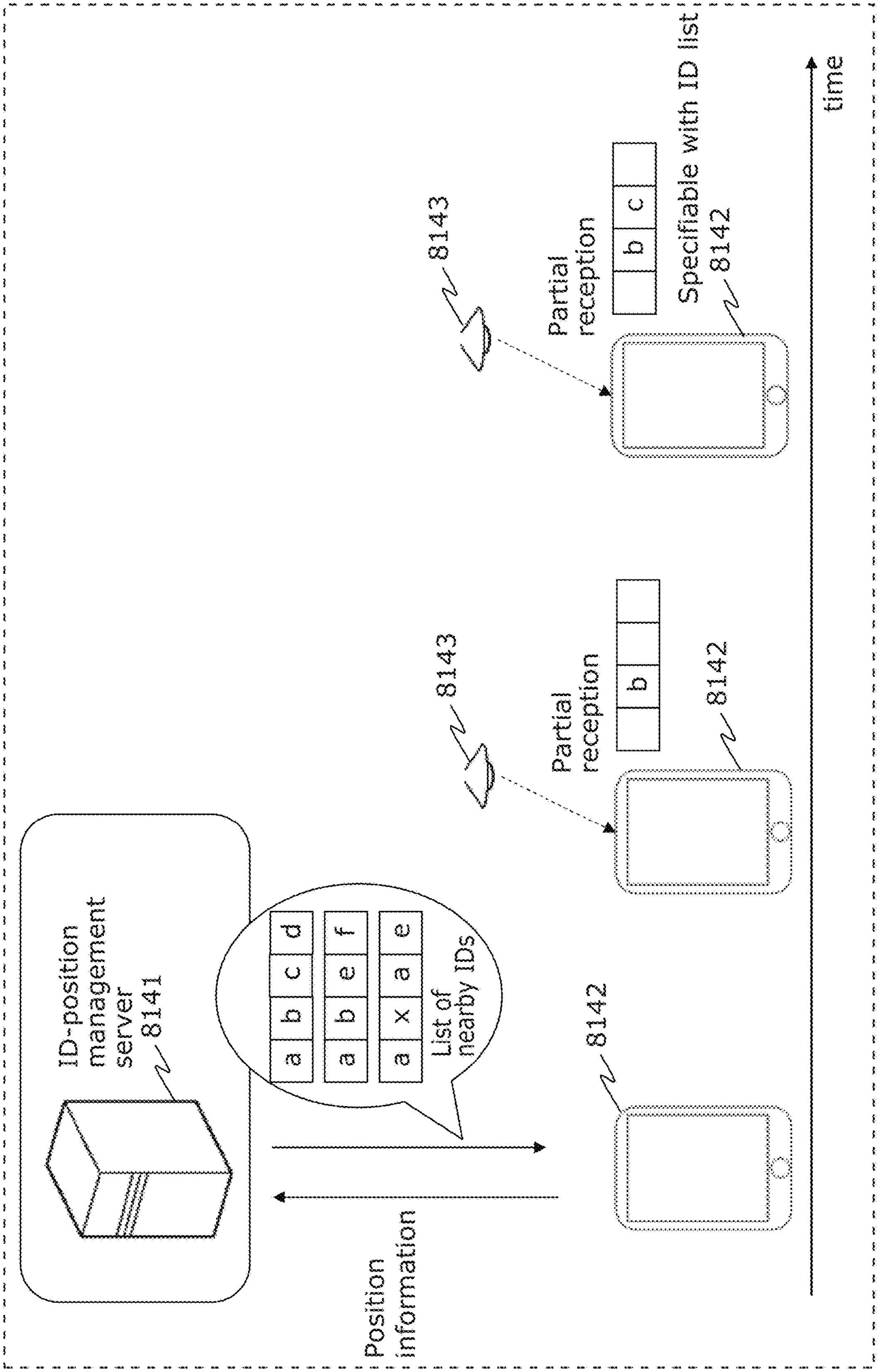
FIG. 61 is a diagram illustrating an example of processing operation of a receiver, a transmitter, and a server in Embodiment 3.

FIG. 61 is a diagram illustrating an example of processing operation of a receiver, a transmitter, and a server in Embodiment 3.

A receiver 8142 such as a smartphone obtains position information indicating the position of the receiver 8142, and transmits the position information to a server 8141. For example, the receiver 8142 obtains the position information when using a GPS or the like or receiving another signal. The server 8141 transmits an ID list associated with the position indicated by the position information, to the receiver 8142. The ID list includes each ID such as "abcd" and information associated with the ID.

The receiver 8142 receives a signal from a transmitter 8143 such as a lighting device. Here, the receiver 8142 may be able to receive only a part (e.g. "b") of an ID as the above-mentioned signal. In such a case, the receiver 8142 searches the ID list for the ID including the part. In the case where the unique ID is not found, the receiver 8142 further receives a signal including another part of the ID, from the transmitter 8143. The receiver 8142 thus obtains a larger part (e.g. "bc") of the ID. The receiver 8142 again searches the ID list for the ID including the part (e.g. "bc"). Through such search, the receiver 8142 can specify the whole ID even in the case where the ID can be obtained only partially. Note that, when receiving the signal from the transmitter 8143, the receiver 8142 receives not only the part of the ID but also a check portion such as a CRC (Cyclic Redundancy Check).

Figure 62:
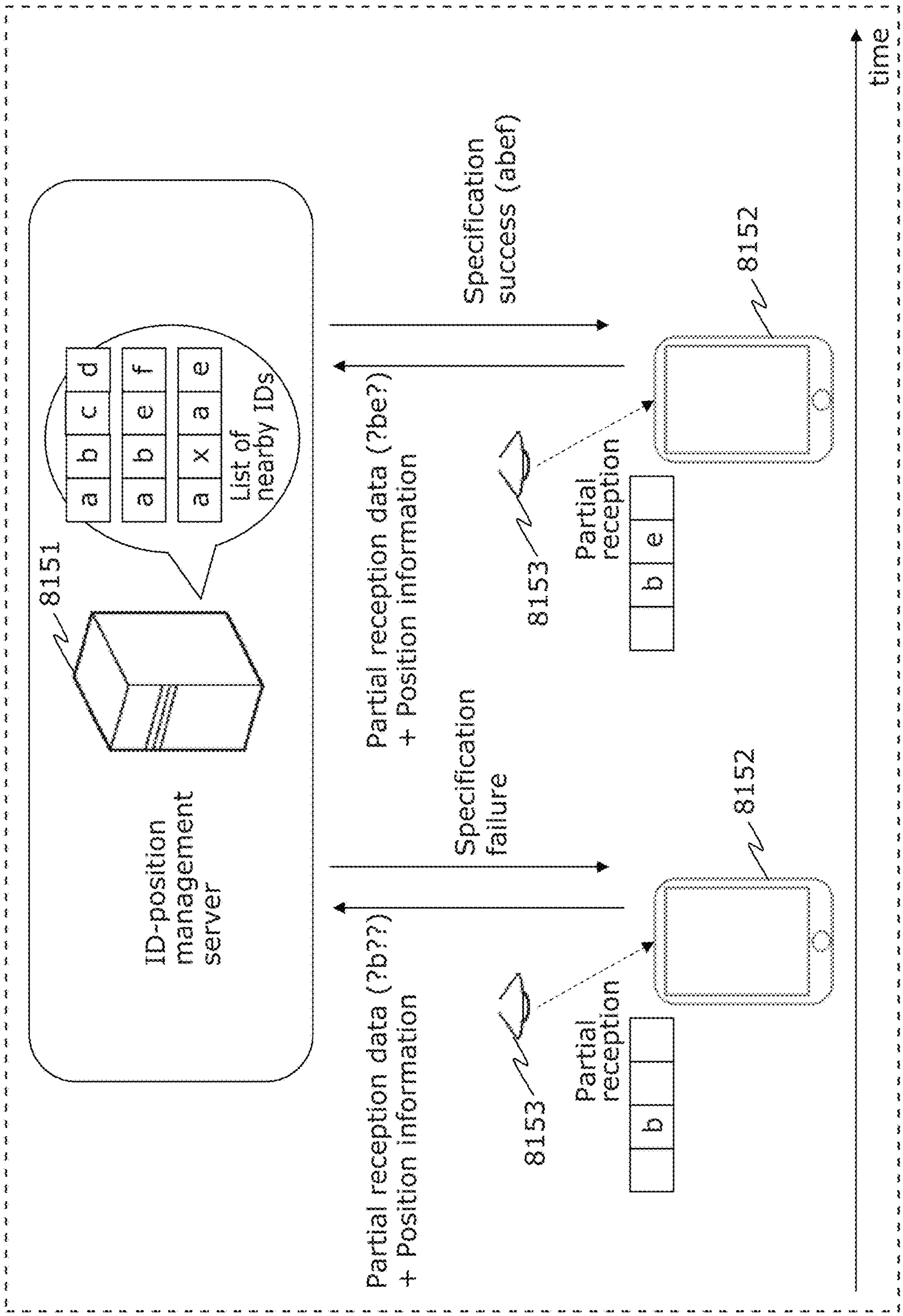
FIG. 62 is a diagram illustrating an example of processing operation of a receiver, a transmitter, and a server in Embodiment 3.

FIG. 62 is a diagram illustrating an example of processing operation of a receiver, a transmitter, and a server in Embodiment 3.

A receiver 8152 such as a smartphone obtains position information indicating the position of the receiver 8152. For example, the receiver 8152 obtains the position information when using a GPS or the like or receiving another signal. The receiver 8152 also receives a signal from a transmitter 8153 such as a lighting device. The signal includes only a part (e.g. "b") of an ID. The receiver 8152 transmits the position information and the part of the ID to a server 8151.

The server 8151 searches an ID list associated with the position indicated by the position information, for the ID including the part. In the case where the unique ID is not found, the server 8151 notifies the receiver 8152 that the specification of the ID has failed.

Following this, the receiver 8152 receives a signal including another part of the ID, from the transmitter 8153. The receiver 8152 thus obtains a large part (e.g. "be") of the ID. The receiver 8152 transmits the part (e.g. "be") of the ID and the position information to the server 8151.

The server 8151 searches the ID list associated with the position indicated by the position information, for the ID including the part. When the unique ID is found, the server 8151 notifies the receiver 8152 that the ID (e.g. "abef") has been specified, and transmits information associated with the ID to the receiver 8152.

Figure 63:
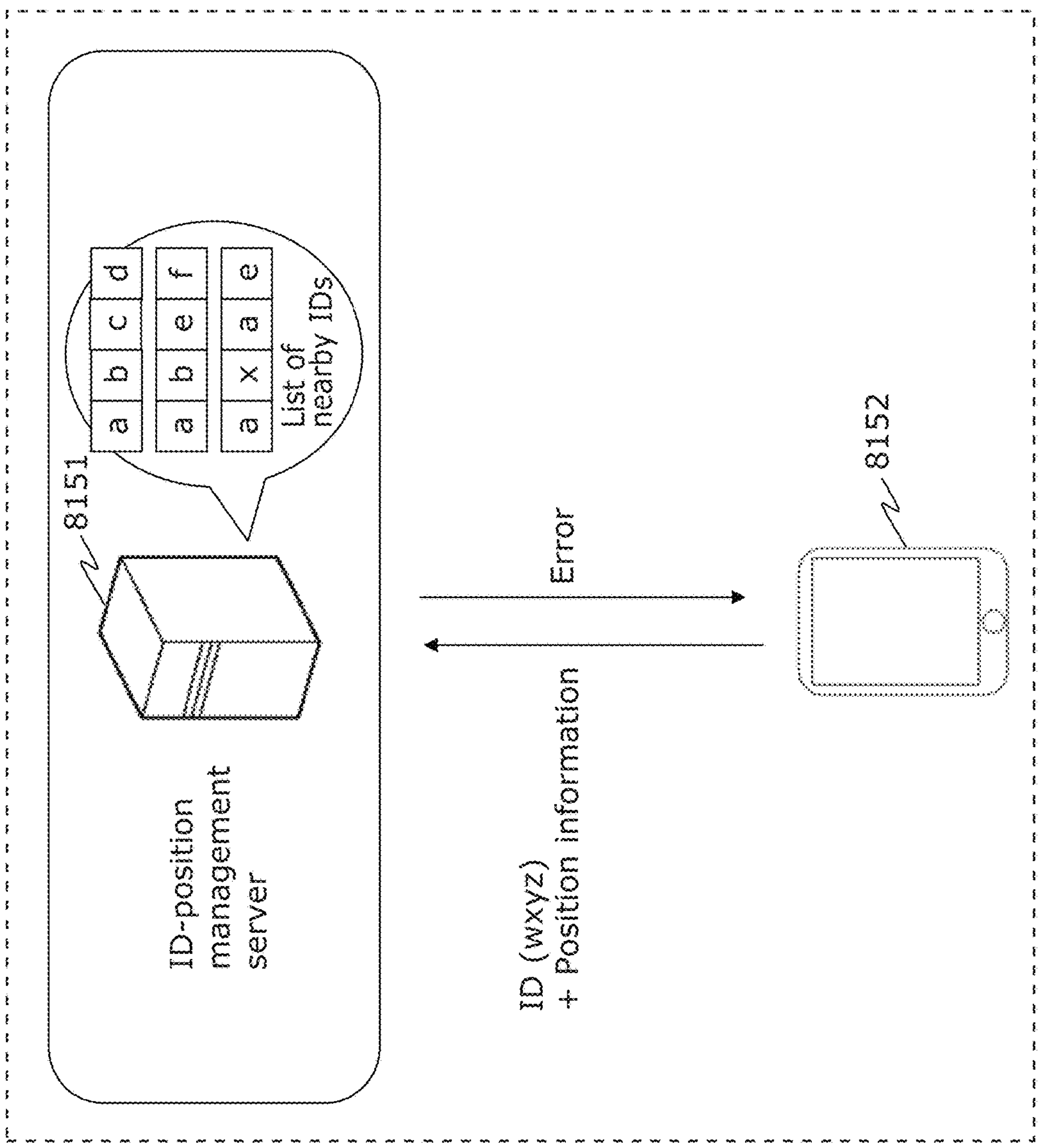
FIG. 63 is a diagram illustrating an example of processing operation of a receiver, a transmitter, and a server in Embodiment 3.

FIG. 63 is a diagram illustrating an example of processing operation of a receiver, a transmitter, and a server in Embodiment 3.

The receiver 8152 may transmit not the part of the ID but the whole ID to the server 8151, together with the position information. In the case where the complete ID (e.g. "wxyz") is not included in the ID list, the server 8151 notifies the receiver 8152 of an error.

Figure 64A:
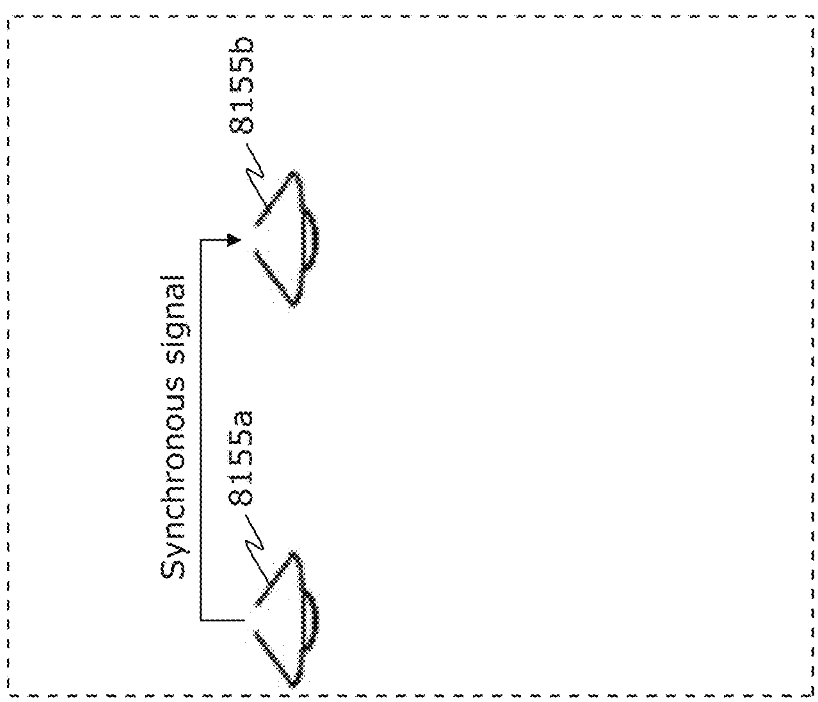
FIG. 64A is a diagram for describing synchronization between a plurality of transmitters in Embodiment 3.

FIG. 64A is a diagram for describing synchronization between a plurality of transmitters in Embodiment 3.

Transmitters 8155*a* and 8155*b* transmit a signal by changing in luminance. Here, the transmitter 8155*a* transmits a synchronous signal to the transmitter 8155*b*, thereby changing in luminance synchronously with the transmitter 8155*b*. Further, the transmitters 8155*a* and 8155*b* each obtain a signal from a source, and change in luminance according to the signal. There is a possibility that the time (first delay time) taken for the signal transmission from the source to the transmitter 8155*a* and the time (second delay time) taken for the signal transmission from the source to the transmitter 8155*b* are different. In view of this, the signal round-trip time between each of the transmitters 8155*a* and 8155*b* and the source is measured, and ½ of the round-trip time is specified as the first or second delay time. The transmitter 8155*a* transmits the synchronous signal so as to cancel out the difference between the first and second delay times, thereby changing in luminance synchronously with the transmitter 8155*b*.

Figure 64B:
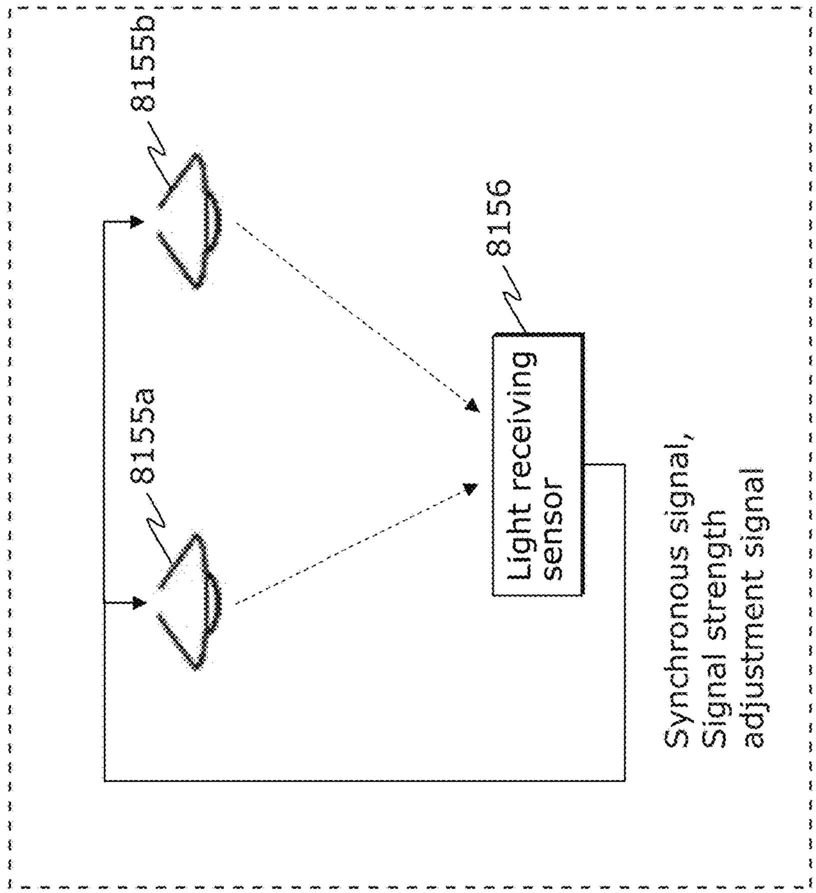
FIG. 64B is a diagram for describing synchronization between a plurality of transmitters in Embodiment 3.

FIG. 64B is a diagram for describing synchronization between a plurality of transmitters in Embodiment 3.

A light receiving sensor 8156 detects light from the transmitters 8155*a* and 8155*b*, and outputs the result to the transmitters 8155*a* and 8155*b* as a detection signal. Having received the detection signal from the light receiving sensor 8156, the transmitters 8155*a* and 8155*b* change in luminance synchronously or adjust the signal strength based on the detection signal.

Figure 65:
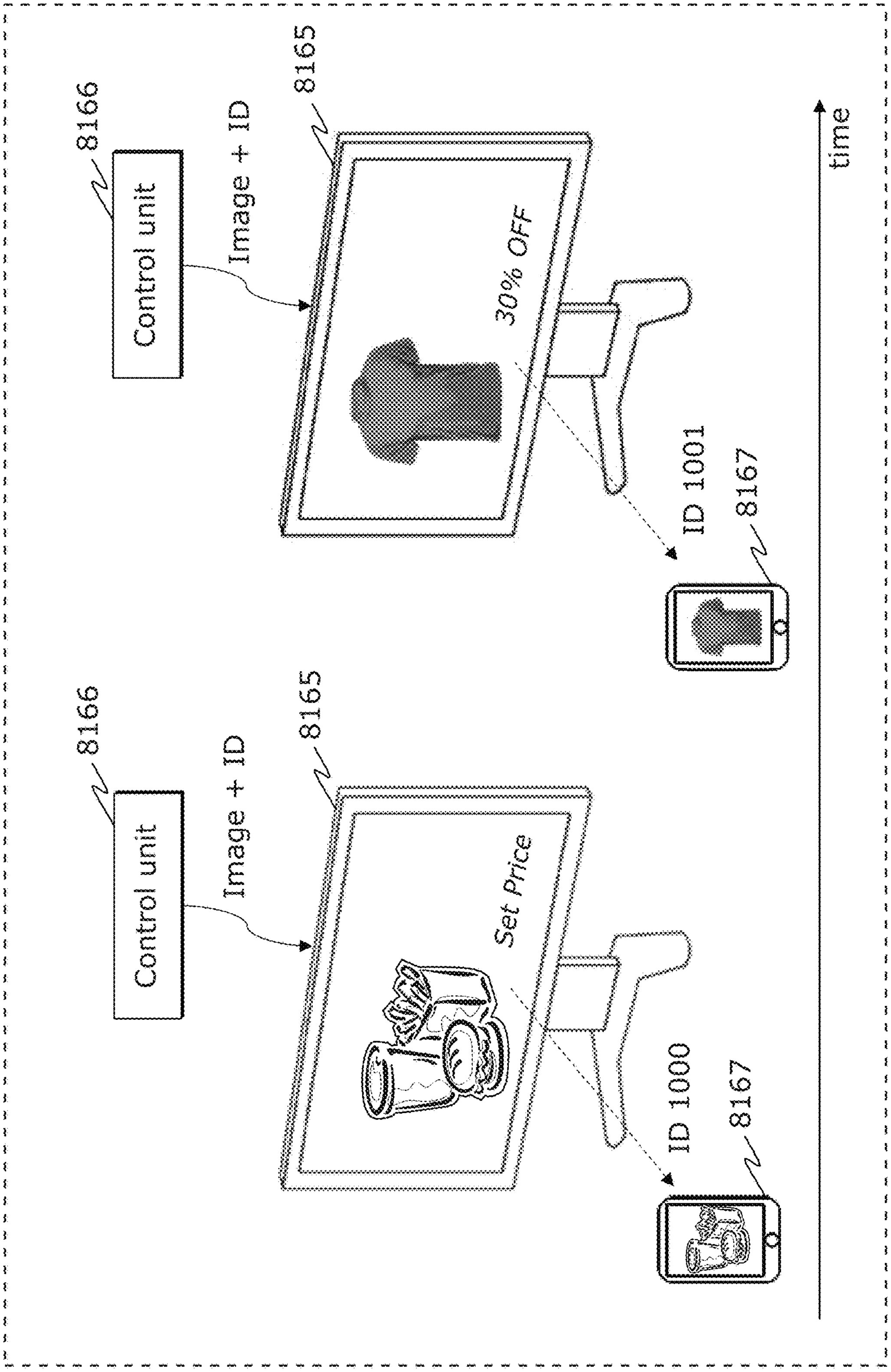
FIG. 65 is a diagram illustrating an example of operation of a transmitter and a receiver in Embodiment 3.

FIG. 65 is a diagram illustrating an example of operation of a transmitter and a receiver in Embodiment 3.

A transmitter 8165 such as a television obtains an image and an ID (ID 1000) associated with the image, from a control unit 8166. The transmitter 8165 displays the image, and also transmits the ID (ID 1000) to a receiver 8167 by changing in luminance. The receiver 8167 captures the transmitter 8165 to receive the ID (ID 1000), and displays information associated with the ID (ID 1000). The control unit 8166 then changes the image output to the transmitter 8165, to another image. The control unit 8166 also changes the ID output to the transmitter 8165. That is, the control unit 8166 outputs the other image and the other ID (ID 1001) associated with the other image, to the transmitter 8165. The transmitter 8165 displays the other image, and transmits the other ID (ID 1001) to the receiver 8167 by changing in luminance. The receiver 8167 captures the transmitter 8165 to receive the other ID (ID 1001), and displays information associated with the other ID (ID 1001).

Figure 66:
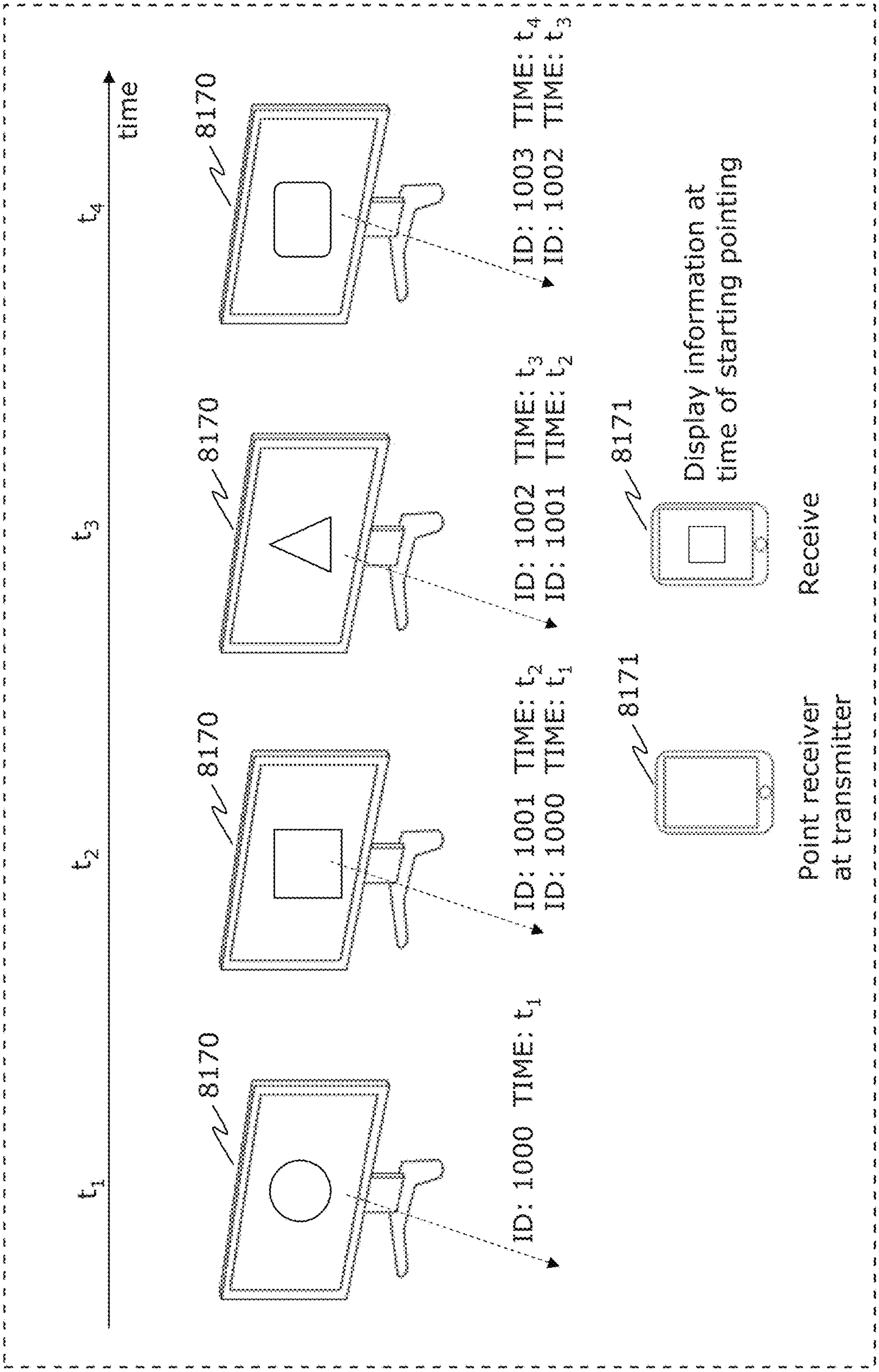
FIG. 66 is a diagram illustrating an example of operation of a transmitter and a receiver in Embodiment 3.

FIG. 66 is a diagram illustrating an example of operation of a transmitter and a receiver in Embodiment 3.

A transmitter 8170 such as a signage displays images by switching between them. When displaying an image, the transmitter 8170 transmits, to a receiver 8171, ID time information indicating the ID corresponding to the displayed image and the time at which the image is displayed, by changing in luminance. For example, at time t1, the transmitter 8170 displays an image showing a circle, and transmits ID time information indicating the ID (ID: 1000) corresponding to the image and the time (TIME: t1) at which the image is displayed.

Here, the transmitter 8170 transmits not only the ID time information corresponding to the currently displayed image but also ID time information corresponding to at least one previously displayed image. For example, at time t2, the transmitter 8170 displays an image showing a square, and transmits ID time information indicating the ID (ID: 1001) corresponding to the image and the time (TIME: t2) at which the image is displayed. At this time, the transmitter 8170 also transmits the ID time information indicating the ID (ID: 1000) corresponding to the image showing the circle and the time (TIME: t1) at which the image is displayed. Likewise, at time t3, the transmitter 8170 displays an image showing a triangle, and transmits ID time information indicating the ID (ID: 1002) corresponding to the image and the time (TIME: t3) at which the image is displayed. At this time, the transmitter 8170 also transmits the ID time information indicating the ID (ID: 1001) corresponding to the image showing the square and the time (TIME: t2) at which the image is displayed. Thus, the transmitter 8170 transmits a plurality of sets of ID time information at the same time.

Suppose, to obtain information related to the image showing the square, the user points an image sensor of the receiver 8171 at the transmitter 8170 and starts image capture by the receiver 8171, at the time t2 at which the image showing the square is displayed.

Even when the receiver 8171 starts capturing at time t2, the receiver 8171 may not be able to obtain the ID time information corresponding to the image showing the square while the image is displayed on the transmitter 8170. Even in such a case, since the ID time information corresponding to the previously displayed image is also transmitted from the transmitter 8170 as mentioned above, at time t3 the receiver 8171 can obtain not only the ID time information (ID: 1002, TIME: t3) corresponding to the image showing the triangle but also the ID time information (ID: 1001, TIME: t2) corresponding to the image showing the square. The receiver 8171 selects, from these ID time information, the ID time information (ID: 1001, TIME: t2) indicating the time (t2) at which the receiver 8171 is pointed at the transmitter 8170, and specifies the ID (ID: 1001) indicated by the ID time information. As a result, at time t3, the receiver 8171 can obtain, from a server or the like, information related to the image showing the square based on the specified ID (ID: 1001).

The above-mentioned time is not limited to an absolute time, and may be a time (relative time) between the time at which the receiver 8171 is pointed at the transmitter 8170 and the time at which the receiver 8171 receives the ID time information. Moreover, though the transmitter 8170 transmits the ID time information corresponding to the previously displayed image together with the ID time information corresponding to the currently displayed image, the transmitter 8170 may transmit ID time information corresponding to an image to be displayed in the future. Furthermore, in a situation where the reception by the receiver 8171 is difficult, the transmitter 8170 may transmit more sets of previous or future ID time information.

In the case where the transmitter 8170 is not a signage but a television, the transmitter 8170 may transmit information indicating a channel corresponding to a displayed image, instead of ID time information. In detail, in the case where an image of a television program being broadcasted is displayed on the transmitter 8170 in real time, the display time of the image displayed on the transmitter 8170 can be uniquely specified for each channel. Accordingly, the receiver 8171 can specify the time at which the receiver 8171 is pointed at the transmitter 8170, i.e. the time at which the receiver 8171 starts capturing, based on the captured image and the channel. The receiver 8171 can then obtain, from a server or the like, information related to the captured image based on the channel and the time. Here, the transmitter 8170 may transmit information indicating the display time of the displayed image, instead of ID time information. In such a case, the receiver 8171 searches all television programs being broadcasted, for a television program including the captured image. The receiver 8171 can then obtain, from a server or the like, information related to the image based on the channel and display time of the television program.

Figure 67:
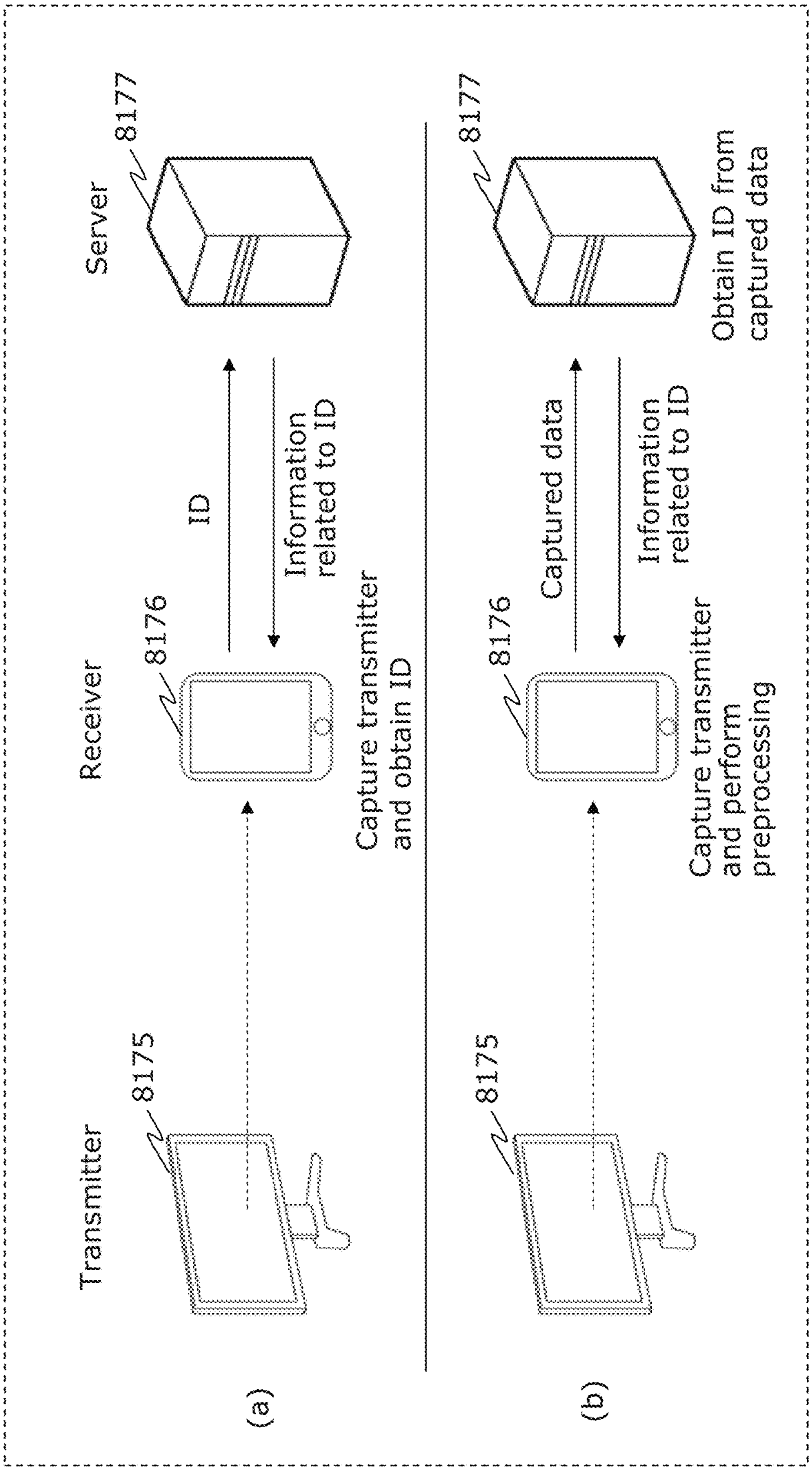
FIG. 67 is a diagram illustrating an example of operation of a transmitter, a receiver, and a server in Embodiment 3.

FIG. 67 is a diagram illustrating an example of operation of a transmitter, a receiver, and a server in Embodiment 3.

As illustrated in (a) in FIG. 67, a receiver 8176 captures a transmitter 8175 to obtain an image including a bright line, and specifies (obtains) the ID of the transmitter 8175 from the image. The receiver 8176 transmits the ID to a server 8177, and obtains information associated with the ID from the server 8177.

On the other hand, as illustrated in (b) in FIG. 67, the receiver 8176 may capture the transmitter 8175 to obtain the image including the bright line, and transmit the image to the server 8177 as captured data. The receiver 8176 may also perform, on the image including the bright line, such preprocessing that reduces the amount of information of the image, and transmit the preprocessed image to the server 8177 as captured data. The preprocessing is, for instance, image binarization. Having received the captured data, the server 8177 specifies (obtains) the ID of the transmitter 8175 from the image indicated by the captured data. The server 8177 then transmits the information associated with the ID to the receiver 8176.

Figure 68:
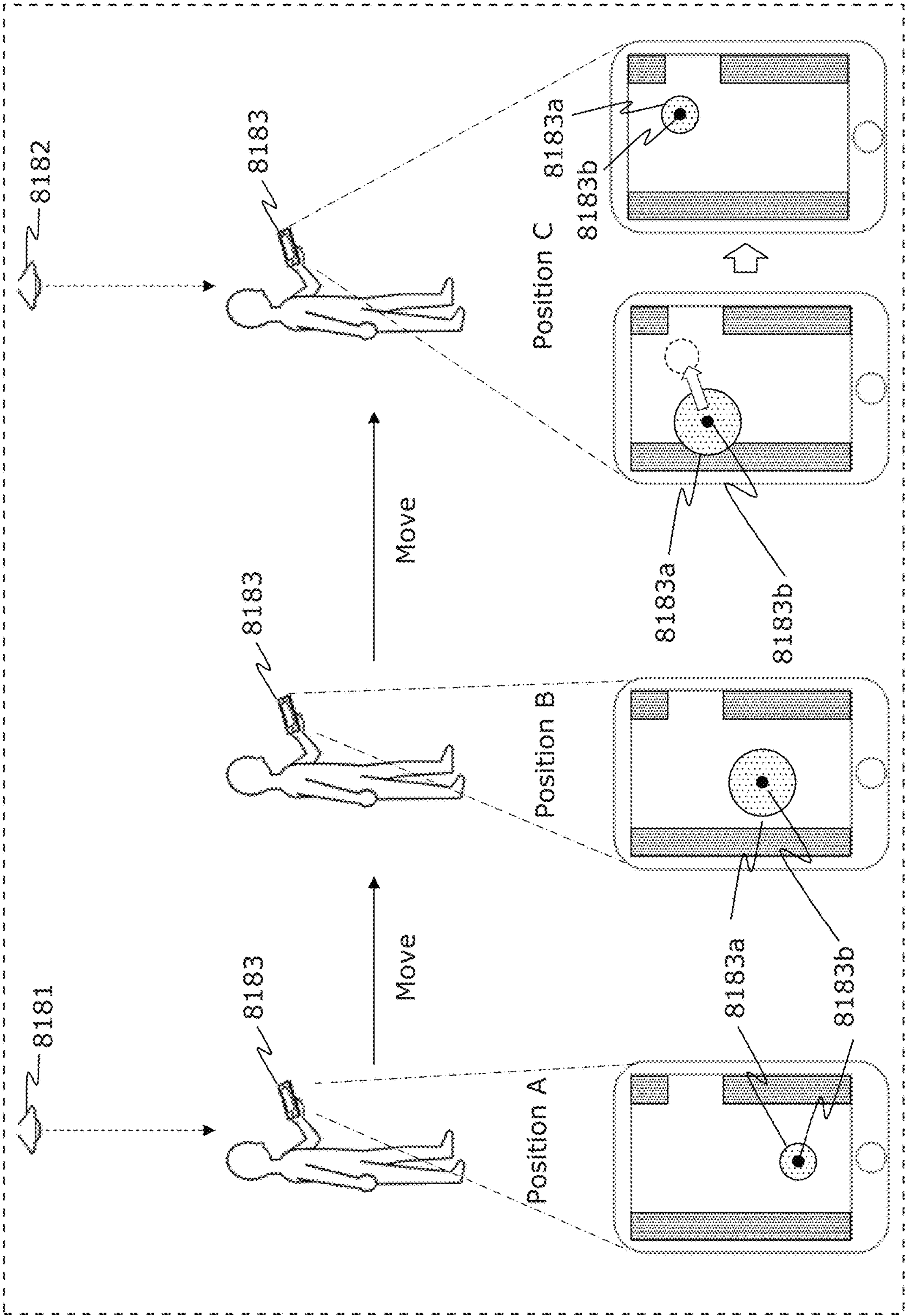
FIG. 68 is a diagram illustrating an example of operation of a transmitter and a receiver in Embodiment 3.

FIG. 68 is a diagram illustrating an example of operation of a transmitter and a receiver in Embodiment 3.

When the user is located at position A, a receiver 8183 specifies the position of the receiver 8183, by obtaining a signal transmitted from a transmitter 8181 that changes in luminance. The receiver 8183 displays a point 8183*b* indicating the specified position, together with an error range 8183*a* of the position.

Next, when the user moves from position A to position B, the receiver 8183 cannot obtain a signal from the transmitter 8181. The receiver 8183 accordingly estimates the position of the receiver 8183, using a 9-axis sensor and the like included in the receiver 8183. The receiver 8183 displays the point 8183*b* indicating the estimated position, together with the error range 8183*a* of the position. Since this position is estimated by the 9-axis sensor, a larger error range 8183*a* is displayed.

Next, when the user moves from position B to position C, the receiver 8183 specifies the position of the receiver 8183, by obtaining a signal transmitted from another transmitter 8182 that changes in luminance. The receiver 8183 displays the point 8183*b* indicating the specified position, together with the error range 8183*a* of the position. Here, the receiver 8183 does not instantly switch the display from the point 8183*b* indicating the position estimated using the 9-axis sensor and its error range 8183*a* to the position specified as mentioned above and its error range, but smoothly switches the display with movement. The error range 8183*a* becomes smaller as a result.

Figure 69:
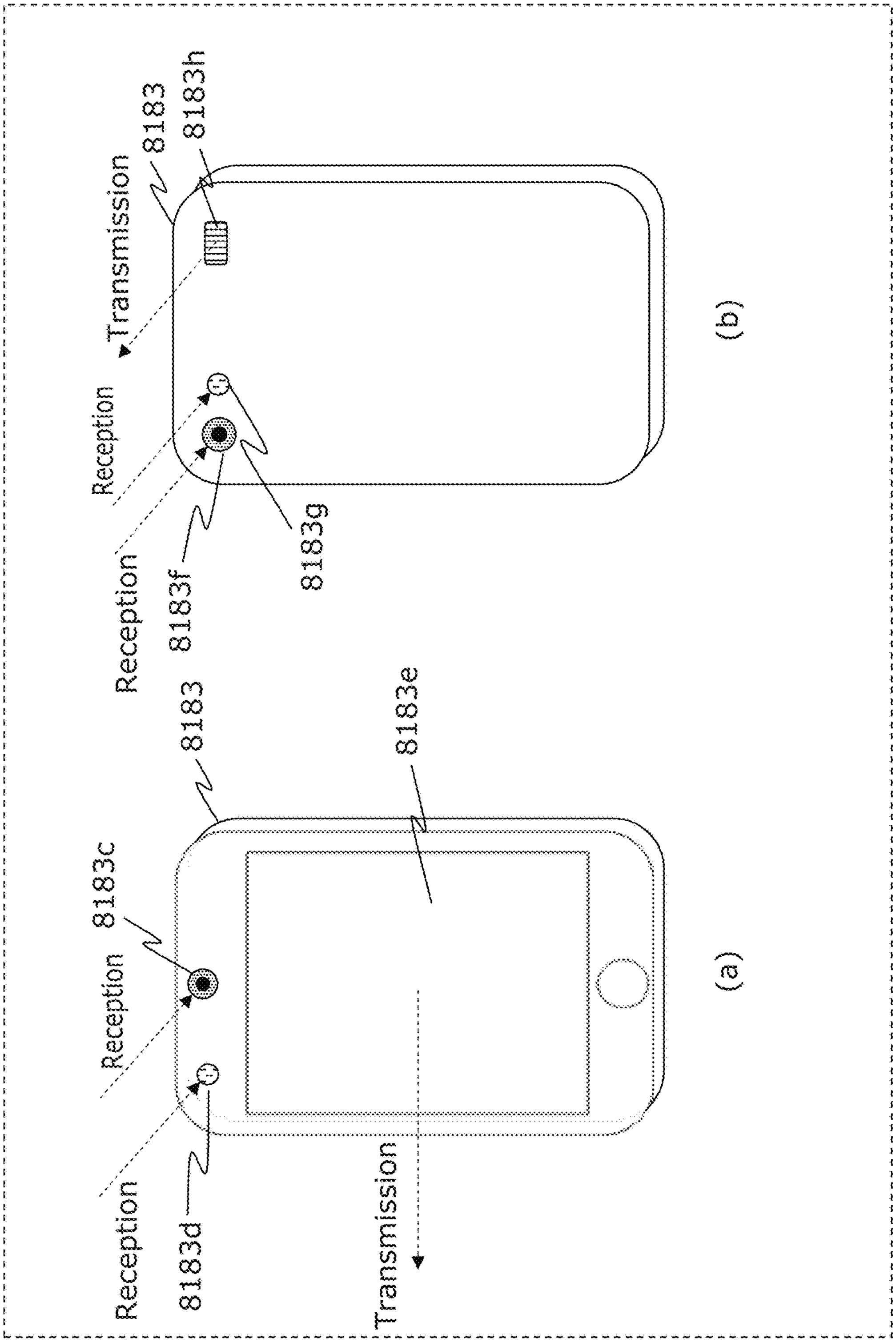
FIG. 69 is a diagram illustrating an example of appearance of a receiver in Embodiment 3.

FIG. 69 is a diagram illustrating an example of appearance of a receiver in Embodiment 3.

The receiver 8183 such as a smartphone (advanced mobile phone) includes an image sensor 8183*c*, an illuminance sensor 8183*d*, and a display 8183*e* on its front surface, as illustrated in (a) in FIG. 69. The image sensor 8183*c* obtains an image including a bright line by capturing a subject that changes in luminance as mentioned above. The illuminance sensor 8183*d* detects the change in luminance of the subject. Hence, the illuminance sensor 8183*d* can be used in place of the image sensor 8183*c*, depending on the state or situation of the subject. The display 8183*e* displays an image and the like. The receiver 8183 may also have a function as a subject that changes in luminance. In this case, the receiver 8183 transmits a signal by causing the display 8183*e* to change in luminance.

The receiver 8183 also includes an image sensor 8183*f*, an illuminance sensor 8183*g*, and a flash light emitting unit 8183*h* on its back surface, as illustrated in (b) in FIG. 69. The image sensor 8183*f* is the same as the above-mentioned image sensor 8183*c*, and obtains an image including a bright line by capturing a subject that changes in luminance as mentioned above. The illuminance sensor 8183*g* is the same as the above-mentioned illuminance sensor 8183*d*, and detects the change in luminance of the subject. Hence, the illuminance sensor 8183*g* can be used in place of the image sensor 8183*f*, depending on the state or situation of the subject. The flash light emitting unit 8183*h* emits a flash for imaging. The receiver 8183 may also have a function as a subject that changes in luminance. In this case, the receiver 8183 transmits a signal by causing the flash light emitting unit 8183*h* to change in luminance.

Figure 70:
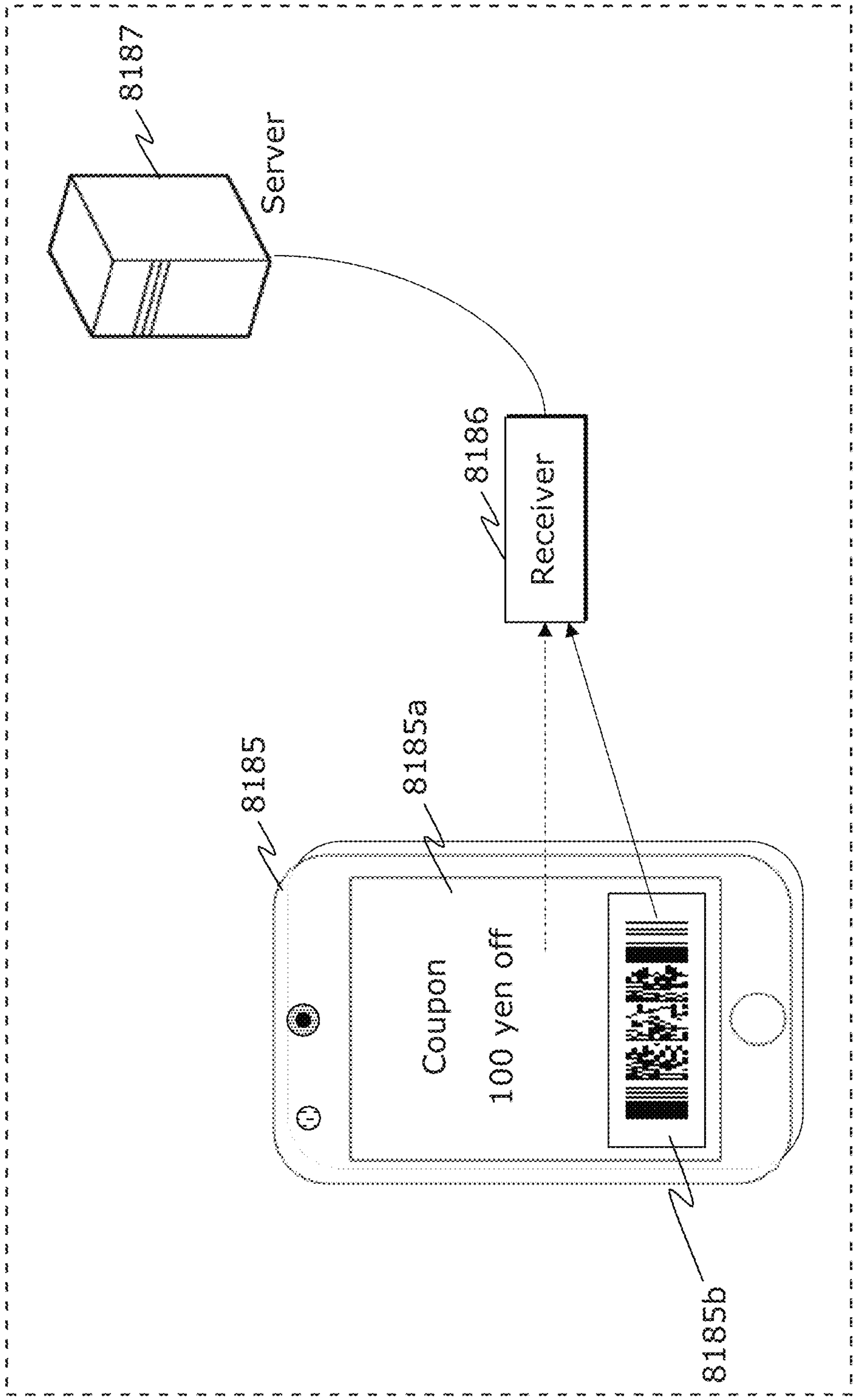
FIG. 70 is a diagram illustrating an example of operation of a transmitter, a receiver, and a server in Embodiment 3.

FIG. 70 is a diagram illustrating an example of operation of a transmitter, a receiver, and a server in Embodiment 3.

A transmitter 8185 such as a smartphone transmits information indicating "Coupon 100 yen off" as an example, by causing a part of a display 8185*a* except a barcode part 8185*b* to change in luminance, i.e. by visible light communication. The transmitter 8185 also causes the barcode part 8185*b* to display a barcode without changing in luminance. The barcode indicates the same information as the above-mentioned information transmitted by visible light communication. The transmitter 8185 further causes the part of the display 8185*a* except the barcode part 8185*b* to display the characters or pictures, e.g. the characters "Coupon 100 yen off", indicating the information transmitted by visible light communication. Displaying such characters or pictures allows the user of the transmitter 8185 to easily recognize what kind of information is being transmitted.

A receiver 8186 performs image capture to obtain the information transmitted by visible light communication and the information indicated by the barcode, and transmits these information to a server 8187. The server 8187 determines whether or not these information match or relate to each other. In the case of determining that these information match or relate to each other, the server 8187 executes a process according to these information. Alternatively, the server 8187 transmits the determination result to the receiver 8186 so that the receiver 8186 executes the process according to these information.

The transmitter 8185 may transmit a part of the information indicated by the barcode, by visible light communication. Moreover, the URL of the server 8187 may be indicated in the barcode. Furthermore, the transmitter 8185 may obtain an ID as a receiver, and transmit the ID to the server 8187 to thereby obtain information associated with the ID. The information associated with the ID is the same as the information transmitted by visible light communication or the information indicated by the barcode. The server 8187 may transmit an ID associated with information (visible light communication information or barcode information) transmitted from the transmitter 8185 via the receiver 8186, to the transmitter 8185.

Figure 71:
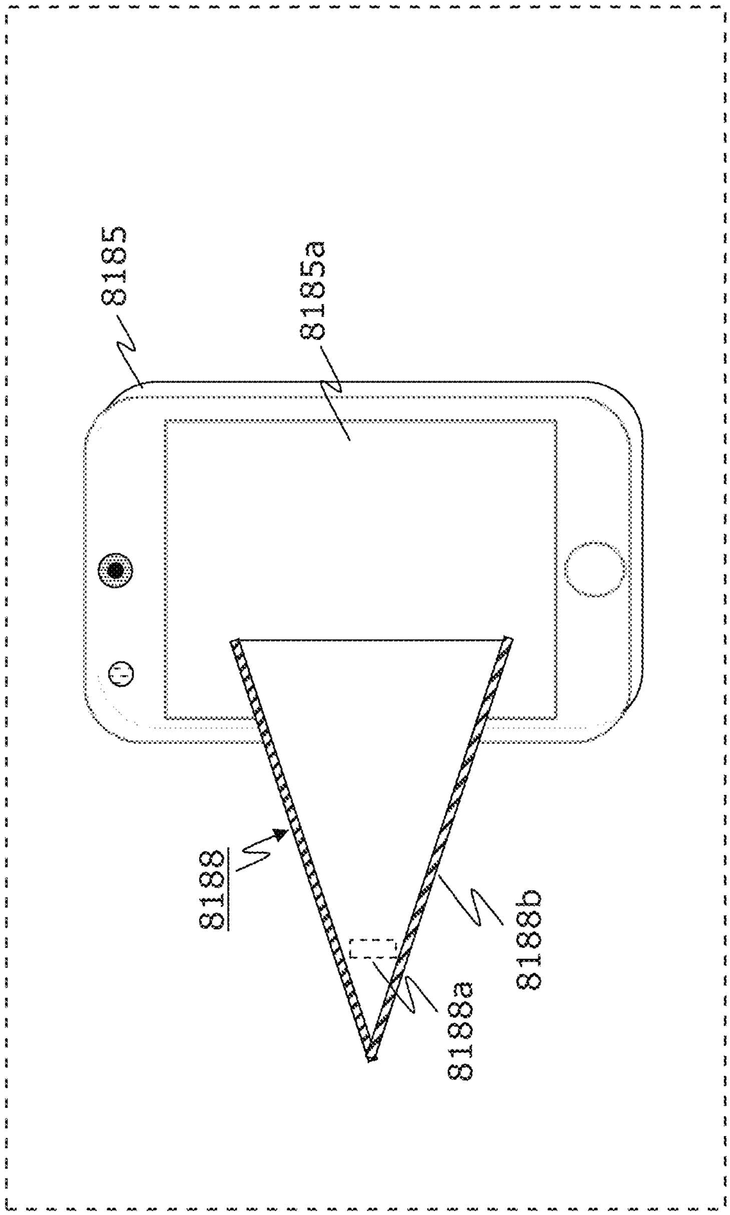
FIG. 71 is a diagram illustrating an example of operation of a transmitter and a receiver in Embodiment 3.

FIG. 71 is a diagram illustrating an example of operation of a transmitter and a receiver in Embodiment 3.

The transmitter 8185 such as a smartphone transmits a signal by causing the display 8185*a* to change in luminance. A receiver 8188 includes a light-resistant cone-shaped container 8188*b* and an illuminance sensor 8188*a*. The illuminance sensor 8188*a* is contained in the container 8188*b*, and located near the tip of the container 8188*b*. When the signal is transmitted from the transmitter 8185 by visible light communication, the opening (bottom) of the container 8188*b* in the receiver 8188 is directed to the display 8185*a*. Since no light other than the light from the display 8185*a* enters the container 8188*b*, the illuminance sensor 8188*a* in the receiver 8188 can appropriately receive the light from the display 8185*a* without being affected by any light which is noise. As a result, the receiver 8188 can appropriately receive the signal from the transmitter 8185.

Figure 72:
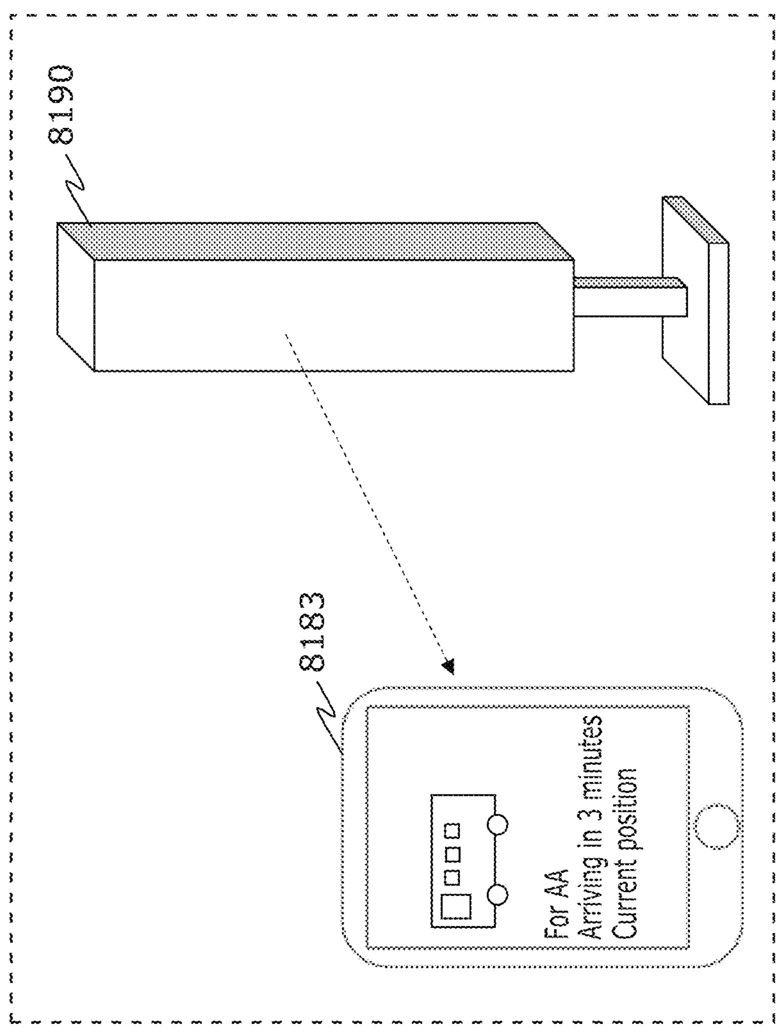
FIG. 72 is a diagram illustrating an example of operation of a transmitter and a receiver in Embodiment 3.

FIG. 72 is a diagram illustrating an example of operation of a transmitter and a receiver in Embodiment 3.

A transmitter 8190 such as a bus stop sign transmits operation information indicating a bus operation state and the like to the receiver 8183, by changing in luminance. For instance, the operation information indicating the destination of a bus, the arrival time of the bus at the bus stop, the current position of the bus, and the like is transmitted to the receiver 8183. Having received the operation information, the receiver 8183 displays the contents of the operation information on its display.

For example, suppose buses with different destinations stop at the bus stop. The transmitter 8190 transmits operation information about these buses with the different destinations. Having received these operation information, the receiver 8183 selects operation information of a bus with a destination that is frequently used by the user, and displays the contents of the selected operation information on the display. In detail, the receiver 8183 specifies the destination of each bus used by the user through a GPS or the like, and records a history of destinations. With reference to this history, the receiver 8183 selects operation information of a bus with a destination frequently used by the user. As an alternative, the receiver 8183 may display the contents of operation information selected by the user from these operation information, on the display. As another alternative, the receiver 8183 may display, with priority, operation information of a bus with a destination frequently selected by the user.

Figure 73:
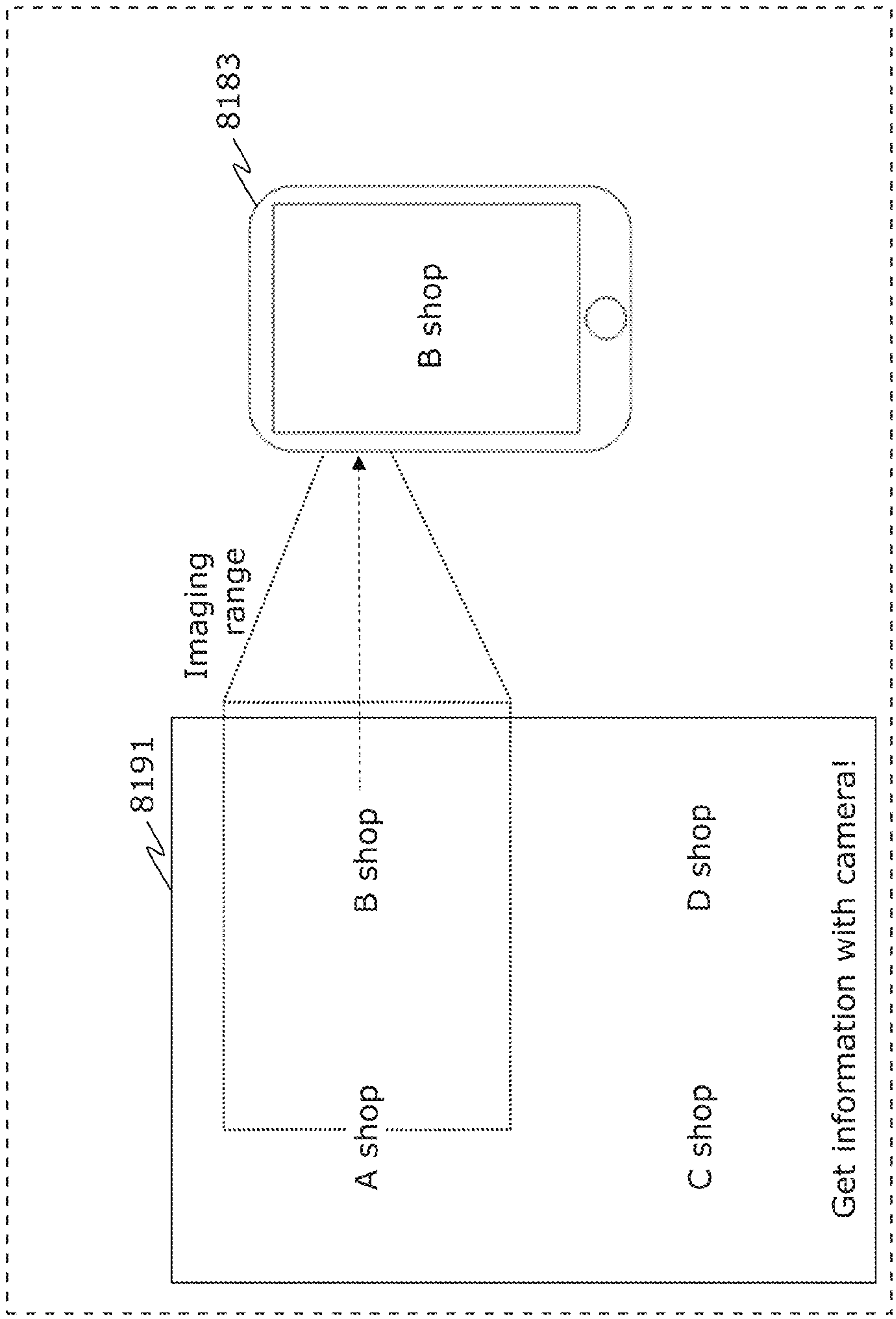
FIG. 73 is a diagram illustrating an example of operation of a transmitter and a receiver in Embodiment 3.

FIG. 73 is a diagram illustrating an example of operation of a transmitter and a receiver in Embodiment 3.

A transmitter 8191 such as a signage transmits information of a plurality of shops to the receiver 8183, by changing in luminance. This information summarizes information about the plurality of shops, and is not information unique to each shop. Accordingly, having received the information by image capture, the receiver 8183 can display information about not only one shop but the plurality of shops. The receiver 8183 selects information about a shop (e.g. "B shop") within the imaging range from the information about the plurality of shops, and displays the selected information. When displaying the information, the receiver 8183 translates the language for expressing the information to a language registered beforehand, and displays the information in the translated language. Moreover, a message prompting for image capture by an image sensor (camera) of the receiver 8183 may be displayed on the transmitter 8191 using characters or the like. In detail, a special application program is started to display, on the transmitter 8191, a message (e.g. "Get information with camera") informing that information can be provided if the transmitter 8191 is captured by camera.

Figure 74:
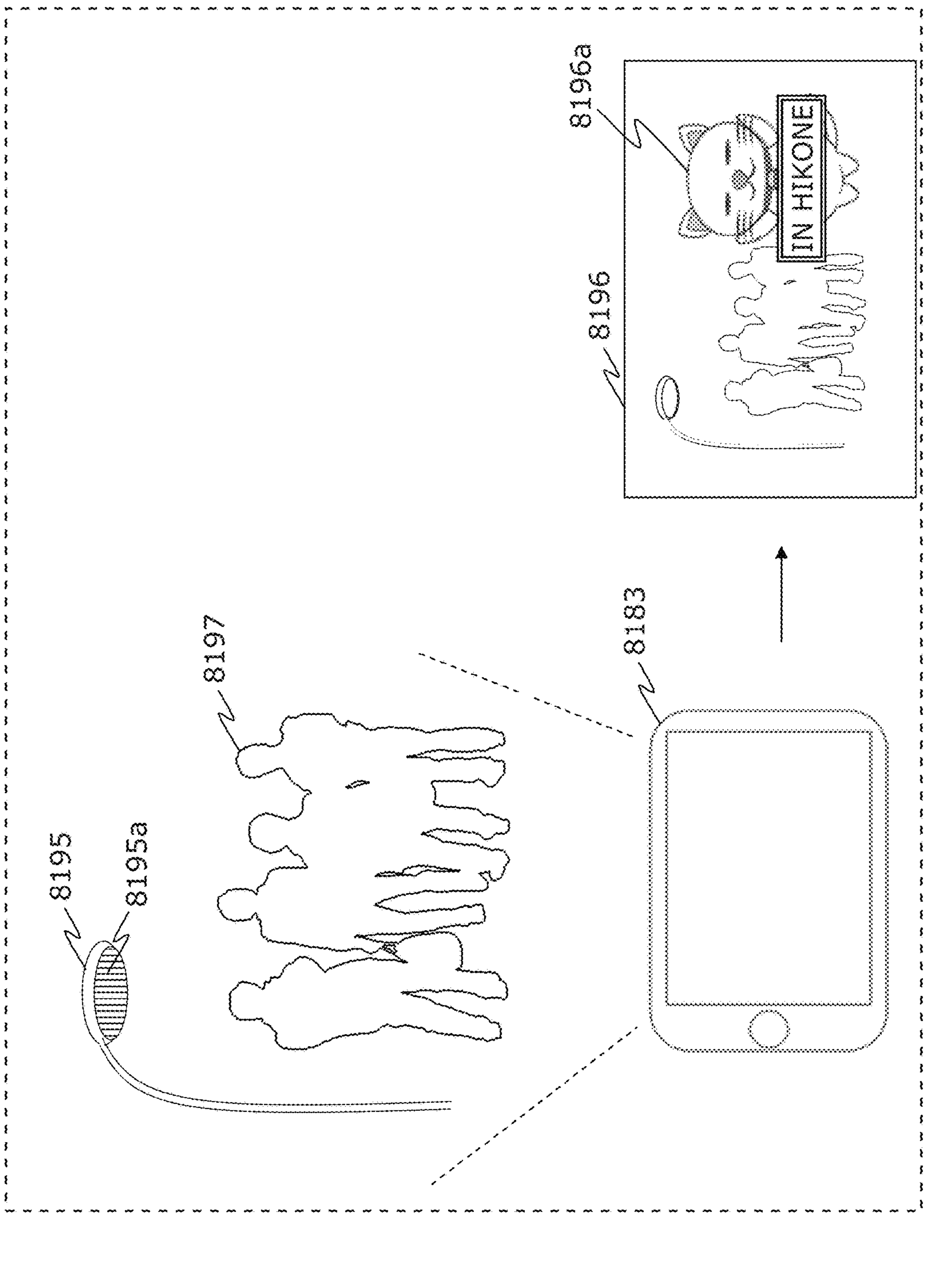
FIG. 74 is a diagram illustrating an example of operation of a transmitter and a receiver in Embodiment 3.

FIG. 74 is a diagram illustrating an example of operation of a transmitter and a receiver in Embodiment 3.

For example, the receiver 8183 captures a subject including a plurality of persons 8197 and a street lighting 8195. The street lighting 8195 includes a transmitter 8195*a* that transmits information by changing in luminance. By capturing the subject, the receiver 8183 obtains an image in which the image of the transmitter 8195*a* appears as the above-mentioned bright line pattern. The receiver 8183 obtains an AR object 8196*a* associated with an ID indicated by the bright line pattern, from a server or the like. The receiver 8183 superimposes the AR object 8196*a* on a normal captured image 8196 obtained by normal imaging, and displays the normal captured image 8196 on which the AR object 8196*a* is superimposed.

Figure 75A:
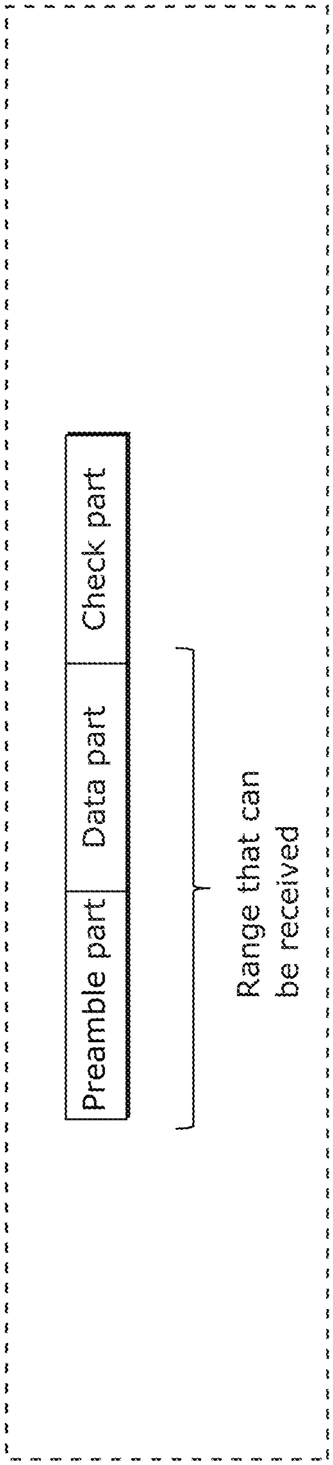
FIG. 75A is a diagram illustrating another example of a structure of information transmitted by a transmitter in Embodiment 3.

FIG. 75A is a diagram illustrating an example of a structure of information transmitted by a transmitter in Embodiment 3.

For example, information transmitted by a transmitter is made up of a preamble part, a data part of fixed length, and a check part. A receiver checks the data part using the check part, thus successfully receiving the information made up of these units. When the receiver receives the preamble part and the data part but cannot receive the check part, the receiver omits the check using the check part. Even in such a case where the check is omitted, the receiver can successfully receive the information made up of these units.

Figure 75B:
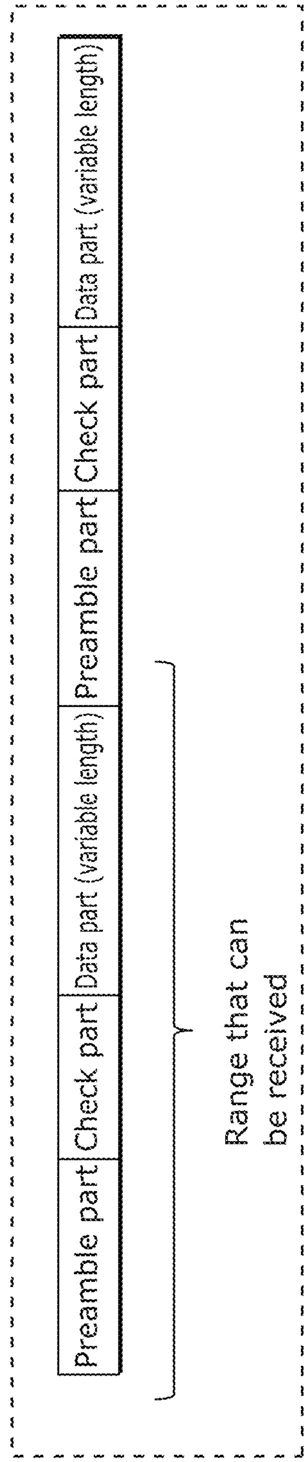
FIG. 75B is a diagram illustrating another example of a structure of information transmitted by a transmitter in Embodiment 3.

FIG. 75B is a diagram illustrating another example of a structure of information transmitted by a transmitter in Embodiment 3.

For example, information transmitted by a transmitter is made up of a preamble part, a check part, and a data part of variable length. The next information transmitted by the transmitter is equally made up of the preamble part, the check part, and the data part of variable length. When a receiver receives one preamble part and the next preamble part, the receiver recognizes information from the preamble part to immediately before the next preamble part, as one set of significant information. The receiver may also use the check part, to specify the end of the data part received following the check part. In this case, even when the receiver cannot receive the above-mentioned next preamble part (all or part of the preamble part), the receiver can appropriately receive one set of significant information transmitted immediately before.

Figure 76:
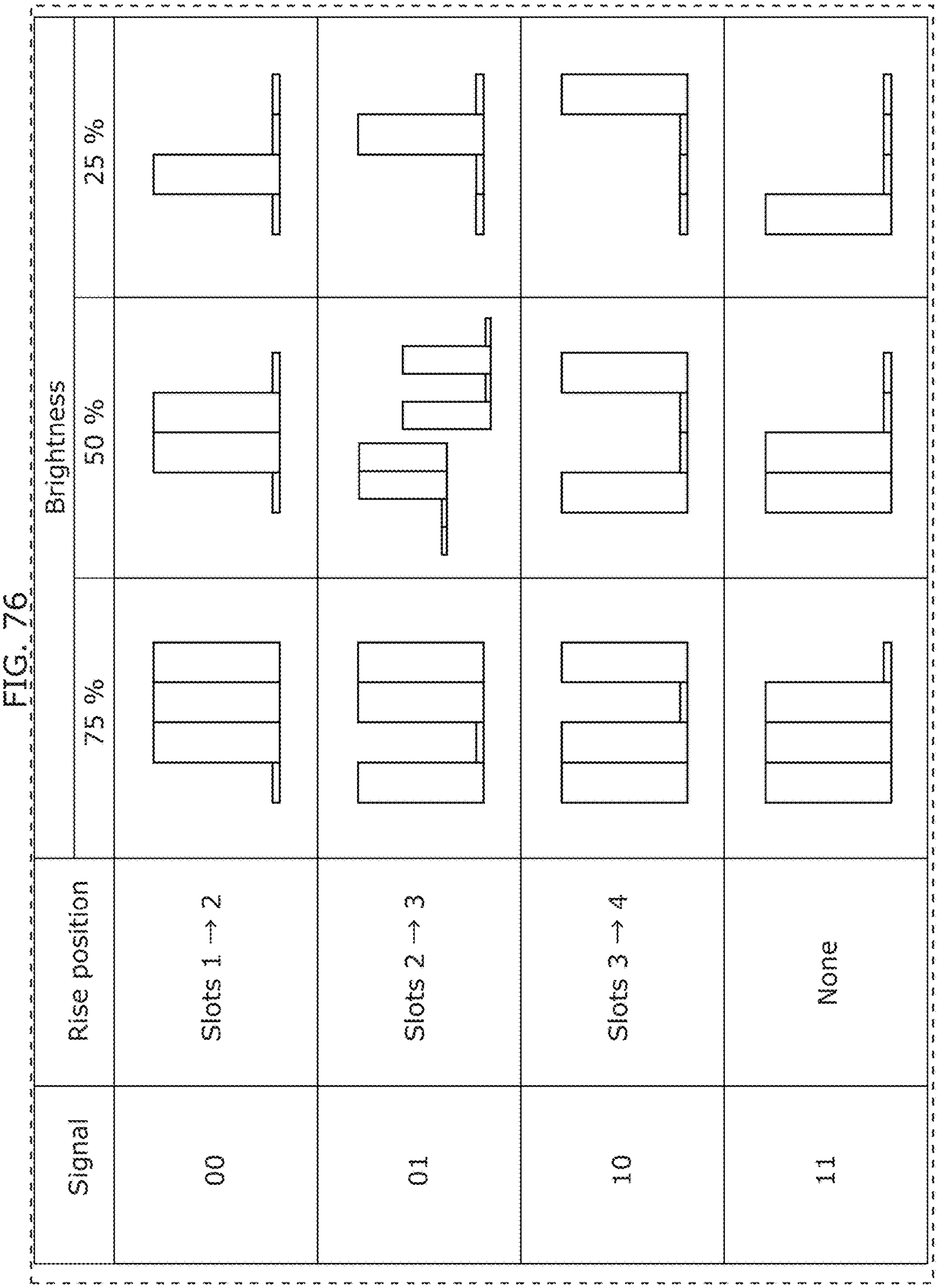
FIG. 76 is a diagram illustrating an example of a 4-value PPM modulation scheme by a transmitter in Embodiment 3.

FIG. 76 is a diagram illustrating an example of a 4-value PPM modulation scheme by a transmitter in Embodiment 3.

A transmitter modulates a transmission signal (signal to be transmitted) to a luminance change pattern by a 4-value PPM modulation scheme. When doing so, the transmitter can maintain the brightness of light that changes in luminance constant, regardless of the transmission signal.

For instance, in the case of maintaining the brightness at 75%, the transmitter modulates each of the transmission signals "00", "01", "10", and "11" to a luminance change pattern in which luminance L (Low) is represented in one of four consecutive slots and luminance H (High) is represented in the other three slots. In detail, the transmitter modulates the transmission signal "00" to a luminance change pattern (L, H, H, H) in which luminance L is represented in the first slot and luminance H is represented in the second to fourth slots. In this luminance change, the luminance rises between the first and second slots. Likewise, the transmitter modulates the transmission signal "01" to a luminance change pattern (H, L, H, H) in which luminance L is represented in the second slot and luminance H is represented in the first, third, and fourth slots. In this luminance change, the luminance rises between the second and third slots.

In the case of maintaining the brightness at 50%, the transmitter modulates each of the transmission signals "00", "01", "10", and "11" to a luminance change pattern in which luminance L (Low) is represented in two of the four slots and luminance H (High) is represented in the other two slots. In detail, the transmitter modulates the transmission signal "00" to a luminance change pattern (L, H, H, L) in which luminance L is represented in the first and fourth slots and luminance H is represented in the second and third slots. In this luminance change, the luminance rises between the first and second slots. Likewise, the transmitter modulates the transmission signal "01" to a luminance change pattern (L, L, H, H) in which luminance L is represented in the first and second slots and luminance H is represented in the third and fourth slots. Alternatively, the transmitter modulates the transmission signal "01" to a luminance change pattern (H, L, H, L) in which luminance L is represented in the second and fourth slots and luminance H is represented in the first and third slots. In this luminance change, the luminance rises between the second and third slots.

In the case of maintaining the brightness at 25%, the transmitter modulates each of the transmission signals "00", "01", "10", and "11" to a luminance change pattern in which luminance L (Low) is represented in three of the four slots and luminance H (High) is represented in the other slot. In detail, the transmitter modulates the transmission signal "00" to a luminance change pattern (L, H, L, L) in which luminance L is represented in the first, third, and fourth slots and luminance H is represented in the second slot. In this luminance change, the luminance rises between the first and second slots. Likewise, the transmitter modulates the transmission signal "01" to a luminance change pattern (L, L, H, L) in which luminance L is represented in the first, second, and fourth slots and luminance H is represented in the third slot. In this luminance change, the luminance rises between the second and third slots.

By the above-mentioned 4-value PPM modulation scheme, the transmitter can suppress flicker, and also easily adjust the brightness in levels. Moreover, a receiver can appropriately demodulate the luminance change pattern by specifying the position at which the luminance rises. Here, the receiver does not use but ignores whether or not the luminance rises at the boundary between one slot group made up of four slots and the next slot group, when demodulating the luminance change pattern.

Figure 77:
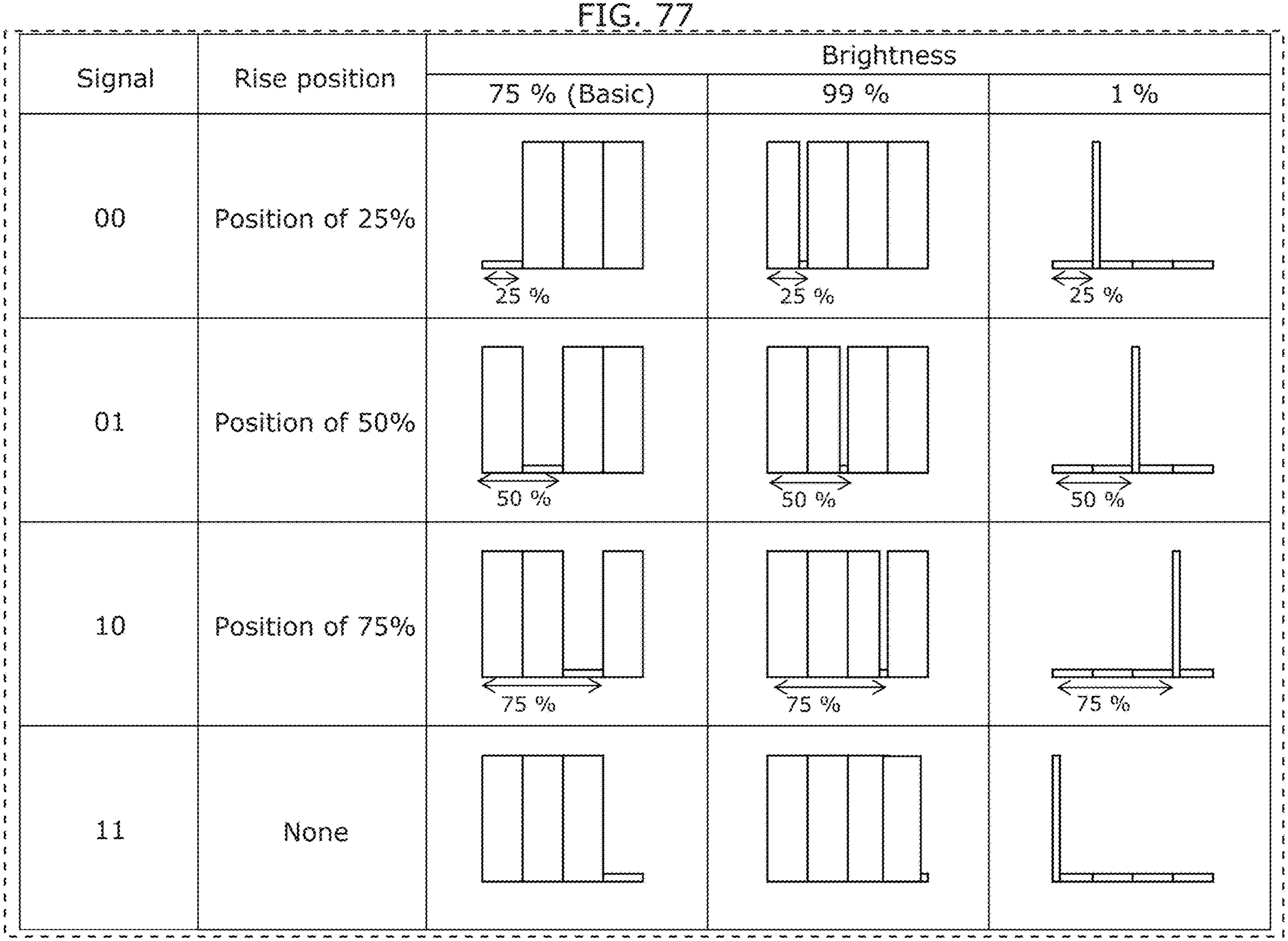
FIG. 77 is a diagram illustrating an example of a PPM modulation scheme by a transmitter in Embodiment 3.

FIG. 77 is a diagram illustrating an example of a PPM modulation scheme by a transmitter in Embodiment 3.

A transmitter modulates a transmission signal to a luminance change pattern, as in the 4-value PPM modulation scheme illustrated in FIG. 76. Here, the transmitter may perform PPM modulation without switching the luminance between L and H per slot. In detail, the transmitter performs PPM modulation by switching the position at which the luminance rises in the duration (time width) (hereafter referred to as "unit duration") of four consecutive slots illustrated in FIG. 76, depending on the transmission signal. For example, the transmitter modulates the transmission signal "00" to a luminance change pattern in which the luminance rises at the position of 25% in the unit duration, as illustrated in FIG. 77. Likewise, the transmitter modulates the transmission signal "01" to a luminance change pattern in which the luminance rises at the position of 50% of the unit duration, as illustrated in FIG. 77.

In the case of maintaining the brightness at 75%, the transmitter modulates the transmission signal "00" to a luminance change pattern in which luminance L is represented in the position of 0 to 25% and luminance H is represented in the position of 25 to 100% in the unit duration. In the case of maintaining the brightness at 99%, the transmitter modulates the transmission signal "00" to a luminance change pattern in which luminance L is represented in the position of 24 to 25% and luminance H is represented in the position of 0 to 24% and the position of 25 to 100% in the unit duration. Likewise, in the case of maintaining the brightness at 1%, the transmitter modulates the transmission signal "00" to a luminance change pattern in which luminance L is represented in the position of 0 to 25% and the position of 26 to 100% and luminance H is represented in the position of 25 to 26% in the unit duration.

By such switching the luminance between L and H at an arbitrary position in the unit duration without switching the luminance between L and H per slot, it is possible to adjust the brightness continuously.

FIG. 78 is a diagram illustrating an example of a PPM modulation scheme by a transmitter in Embodiment 3.

A transmitter performs modulation in the same way as in the PPM modulation scheme illustrated in FIG. 77. Here, regardless of the transmission signal, the transmitter modulates the signal to a luminance change pattern in which luminance H is represented at the start of the unit duration and luminance L is represented at the end of the unit duration. Since the luminance rises at the boundary between one unit duration and the next unit duration, a receiver can appropriately specify the boundary. Therefore, the receiver and the transmitter can correct clock discrepancies.

Figure 79A:
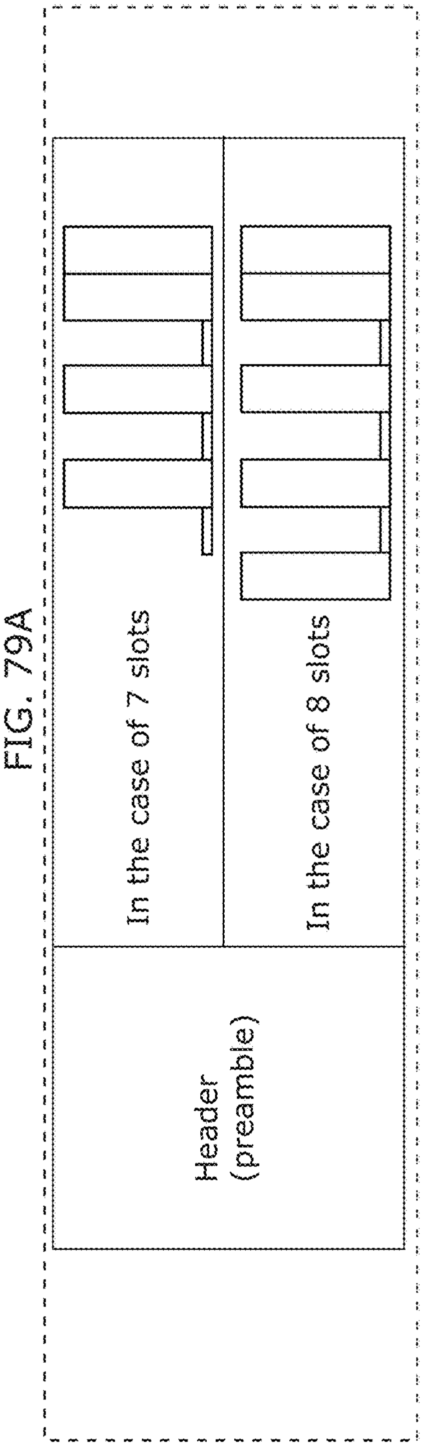
FIG. 79A is a diagram illustrating an example of a luminance change pattern corresponding to a header (preamble part) in Embodiment 3.

FIG. 79A is a diagram illustrating an example of a luminance change pattern corresponding to a header (preamble part) in Embodiment 3.

For example, in the case of transmitting the header (preamble part) illustrated in FIGS. 75A and 75B, a transmitter changes in luminance according to a pattern illustrated in FIG. 79A. In detail, in the case where the header is made up of 7 slots, the transmitter changes in luminance according to the pattern "L, H, L, H, L, H, H". In the case where the header is made up of 8 slots, the transmitter changes in luminance according to the pattern "H, L, H, L, H, L, H, H". These patterns are distinguishable from the luminance change patterns illustrated in FIG. 76, with it being possible to clearly inform a receiver that the signal indicated by any of these patterns is the header.

Figure 79B:
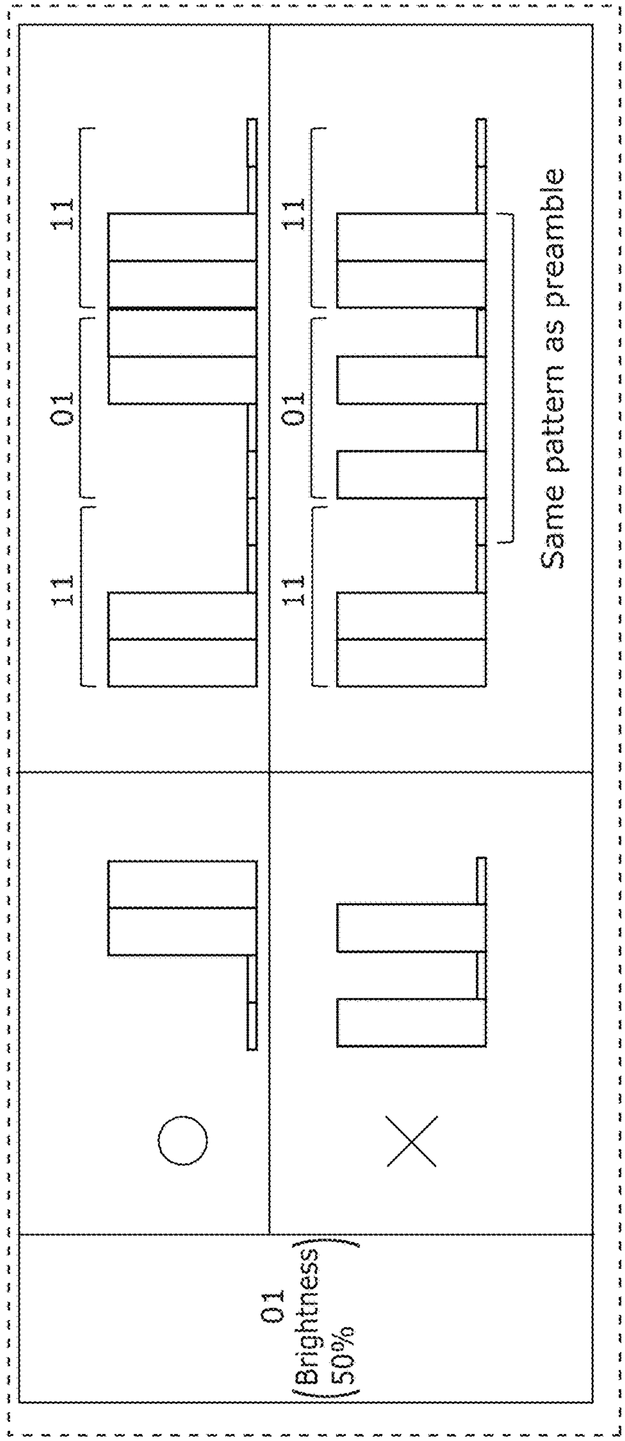
FIG. 79B is a diagram illustrating an example of a luminance change pattern in Embodiment 3.

FIG. 79B is a diagram illustrating an example of a luminance change pattern in Embodiment 3.

In the 4-value PPM modulation scheme, in the case of modulating the transmission signal "01" included in the data part while maintaining the brightness at 50%, the transmitter modulates the signal to one of the two patterns, as illustrated in FIG. 76. In detail, the transmitter modulates the signal to the first pattern "L, L, H, H" or the second pattern "H, L, H, L".

Here, suppose the luminance change pattern corresponding to the header is such a pattern as illustrated in FIG. 79A. In this case, it is desirable that the transmitter modulates the transmission signal "01" to the first pattern "L, L, H, H". For instance, in the case of using the first pattern, the transmission signal "11, 01, 11" included in the data part is modulated to the pattern "H, H, L, L, L, L, H, H, H, H, L, L". In the case of using the second pattern, on the other hand, the transmission signal "11, 01, 11" included in the data part is modulated to the pattern "H, H, L, L, H, L, H, L, H, H, L, L". The pattern "H, H, L, L, H, L, H, L, H, H, L, L" includes the same pattern as the pattern of the header made up of 7 slots illustrated in FIG. 79A. For clear distinction between the header and the data part, it is desirable to modulate the transmission signal "01" to the first pattern.

Figure 80A:
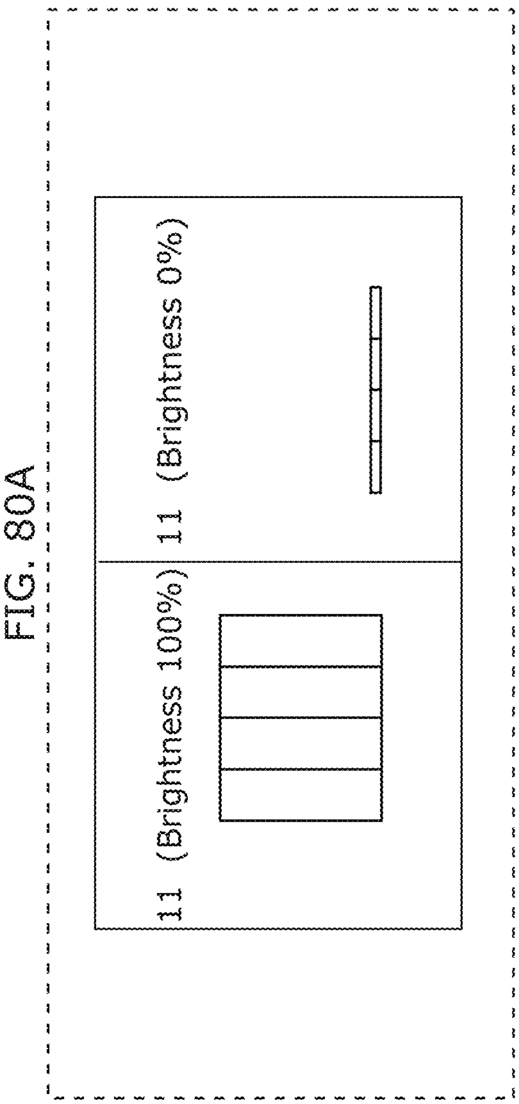
FIG. 80A is a diagram illustrating an example of a luminance change pattern in Embodiment 3.

FIG. 80A is a diagram illustrating an example of a luminance change pattern in Embodiment 3.

In the 4-value PPM modulation scheme, in the case of modulating the transmission signal "11", the transmitter modulates the signal to the pattern "H, H, H, L", the pattern "H, H, L, L", or the pattern "H, L, L, L" so as not to cause a rise in luminance, as illustrated in FIG. 76. However, the transmitter may modulate the transmission signal "11" to the pattern "H, H, H, H" or the pattern "L, L, L, L" in order to adjust the brightness, as illustrated in FIG. 80A.

Figure 80B:
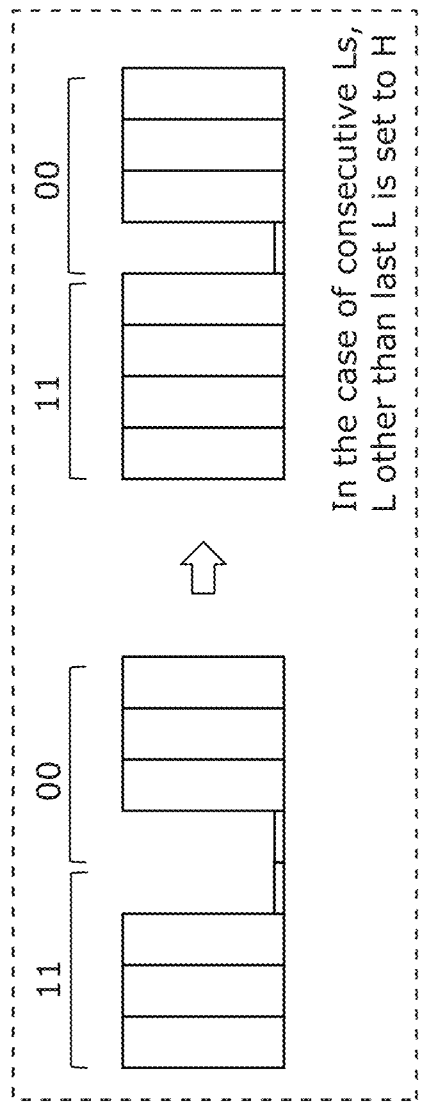
FIG. 80B is a diagram illustrating an example of a luminance change pattern in Embodiment 3.

FIG. 80B is a diagram illustrating an example of a luminance change pattern in Embodiment 3.

In the 4-value PPM modulation scheme, in the case of modulating the transmission signal "11, 00" while maintaining the brightness at 75%, the transmitter modulates the signal to the pattern "H, H, H, L, L, H, H, H", as illustrated in FIG. 76. However, if luminance L is consecutive, each of the consecutive values of luminance L other than the last value may be changed to H so that luminance L is not consecutive. That is, the transmitter modulates the signal "11, 00" to the pattern "H, H, H, H, L, H, H, H".

Since luminance L is not consecutive, the load on the transmitter can be reduced. Moreover, the capacitance of the capacitor included in the transmitter can be reduced, enabling a reduction in control circuit capacity. Furthermore, a lighter load on the light source of the transmitter facilitates the production of the light source. The power efficiency of the transmitter can also be enhanced. Besides, since it is ensured that luminance L is not consecutive, the receiver can easily demodulate the luminance change pattern.

Summary of this Embodiment

An information communication method in this embodiment is an information communication method of transmitting a signal using a change in luminance, the information communication method including: determining a pattern of the change in luminance by modulating the signal to be transmitted; and transmitting the signal by a light emitter changing in luminance according to the determined pattern, wherein the pattern of the change in luminance is a pattern in which one of two different luminance values occurs in each arbitrary position in a predetermined duration, and in the determining, the pattern of the change in luminance is determined so that, for each of different signals to be transmitted, a luminance change position in the duration is different and an integral of luminance of the light emitter in the duration is a same value corresponding to preset brightness, the luminance change position being a position at which the luminance rises or a position at which the luminance falls.

In this way, the luminance change pattern is determined so that, for each of the different signals "00", "01", "10", and "11" to be transmitted, the position at which the luminance rises (luminance change position) is different and also the integral of luminance of the light emitter in the predetermined duration (unit duration) is the same value corresponding to the preset brightness (e.g. 99% or 1%), for instance as illustrated in FIG. 77. Thus, the brightness of the light emitter can be maintained constant for each signal to be transmitted, with it being possible to suppress flicker. In addition, a receiver that captures the light emitter can appropriately demodulate the luminance change pattern based on the luminance change position. Furthermore, since the luminance change pattern is a pattern in which one of two different luminance values (luminance H (High) or luminance L (Low)) occurs in each arbitrary position in the unit duration, the brightness of the light emitter can be changed continuously.

For example, the information communication method may include sequentially displaying a plurality of images by switching between the plurality of images, wherein in the determining, each time an image is displayed in the sequentially displaying, the pattern of the change in luminance for identification information corresponding to the displayed image is determined by modulating the identification information as the signal, and in the transmitting, each time the image is displayed in the sequentially displaying, the identification information corresponding to the displayed image is transmitted by the light emitter changing in luminance according to the pattern of the change in luminance determined for the identification information.

In this way, each time an image is displayed, the identification information corresponding to the displayed image is transmitted, for instance as illustrated in FIG. 65. Based on the displayed image, the user can easily select the identification information to be received by the receiver.

For example, in the transmitting, each time the image is displayed in the sequentially displaying, identification information corresponding to a previously displayed image may be further transmitted by the light emitter changing in luminance according to the pattern of the change in luminance determined for the identification information.

In this way, even in the case where, as a result of switching the displayed image, the receiver cannot receive the identification signal transmitted before the switching, the receiver can appropriately receive the identification information transmitted before the switching because the identification information corresponding to the previously displayed image is transmitted together with the identification information corresponding to the currently displayed image, for instance as illustrated in FIG. 66.

For example, in the determining, each time the image is displayed in the sequentially displaying, the pattern of the change in luminance for the identification information corresponding to the displayed image and a time at which the image is displayed may be determined by modulating the identification information and the time as the signal, and in the transmitting, each time the image is displayed in the sequentially displaying, the identification information and the time corresponding to the displayed image may be transmitted by the light emitter changing in luminance according to the pattern of the change in luminance determined for the identification information and the time, and the identification information and a time corresponding to the previously displayed image may be further transmitted by the light emitter changing in luminance according to the pattern of the change in luminance determined for the identification information and the time.

In this way, each time an image is displayed, a plurality of sets of ID time information (information made up of identification information and a time) are transmitted, for instance as illustrated in FIG. 66. The receiver can easily select, from the received plurality of sets of ID time information, a previously transmitted identification signal which the receiver cannot be received, based on the time included in each set of ID time information.

For example, the light emitter may have a plurality of areas each of which emits light, and in the transmitting, in the case where light from adjacent areas of the plurality of areas interferes with each other and only one of the plurality of areas changes in luminance according to the determined pattern of the change in luminance, only an area located at an edge from among the plurality of areas may change in luminance according to the determined pattern of the change in luminance.

In this way, only the area (light emitting unit) located at the edge changes in luminance, for instance as illustrated in (a) in FIG. 59B. The influence of light from another area on the luminance change can therefore be suppressed as compared with the case where only an area not located at the edge changes in luminance. As a result, the receiver can capture the luminance change pattern appropriately.

For example, in the transmitting, in the case where only two of the plurality of areas change in luminance according to the determined pattern of the change in luminance, the area located at the edge and an area adjacent to the area located at the edge from among the plurality of areas may change in luminance according to the determined pattern of the change in luminance.

In this way, the area (light emitting unit) located at the edge and the area (light emitting unit) adjacent to the area located at the edge change in luminance, for instance as illustrated in (b) in FIG. 59B. The spatially continuous luminance change range has a wide area, as compared with the case where areas apart from each other change in luminance. As a result, the receiver can capture the luminance change pattern appropriately.

An information communication method in this embodiment is an information communication method of obtaining information from a subject, the information communication method including: transmitting position information indicating a position of an image sensor used to capture the subject; receiving an ID list that is associated with the position indicated by the position information and includes a plurality of sets of identification information; setting an exposure time of the image sensor so that, in an image obtained by capturing the subject by the image sensor, a bright line corresponding to an exposure line included in the image sensor appears according to a change in luminance of the subject; obtaining a bright line image including the bright line, by capturing the subject that changes in luminance by the image sensor with the set exposure time; obtaining the information by demodulating data specified by a pattern of the bright line included in the obtained bright line image; and searching the ID list for identification information that includes the obtained information.

In this way, since the ID list is received beforehand, even when the obtained information "bc" is only a part of identification information, the appropriate identification information "abcd" can be specified based on the ID list, for instance as illustrated in FIG. 61.

For example, in the case where the identification information that includes the obtained information is not uniquely specified in the searching, the obtaining of a bright line image and the obtaining of the information may be repeated to obtain new information, and the information communication method may further include searching the ID list for the identification information that includes the obtained information and the new information.

In this way, even in the case where the obtained information "b" is only a part of identification information and the identification information cannot be uniquely specified with this information alone, the new information "c" is obtained and so the appropriate identification information "abcd" can be specified based on the new information and the ID list, for instance as illustrated in FIG. 61.

An information communication method in this embodiment is an information communication method of obtaining information from a subject, the information communication method including: setting an exposure time of an image sensor so that, in an image obtained by capturing the subject by the image sensor, a bright line corresponding to an exposure line included in the image sensor appears according to a change in luminance of the subject; obtaining a bright line image including the bright line, by capturing the subject that changes in luminance by the image sensor with the set exposure time; obtaining identification information by demodulating data specified by a pattern of the bright line included in the obtained bright line image; transmitting the obtained identification information and position information indicating a position of the image sensor; and receiving error notification information for notifying an error, in the case where the obtained identification information is not included in an ID list that is associated with the position indicated by the position information and includes a plurality of sets of identification information.

In this way, the error notification information is received in the case where the obtained identification information is not included in the ID list, for instance as illustrated in FIG. 63. Upon receiving the error notification information, the user of the receiver can easily recognize that information associated with the obtained identification information cannot be obtained.

Embodiment 4

This embodiment describes each example of application using a receiver such as a smartphone and a transmitter for transmitting information as a blink pattern of an LED, an organic EL device, or the like in Embodiments 1 to 3 described above, according to situation.

(Situation: In Front of Store)

An example of application in a situation where a user carrying a receiver is in front of a store bearing an advertisement sign which functions as a transmitter is described first, with reference to FIGS. 81 to 85.

Figure 81:
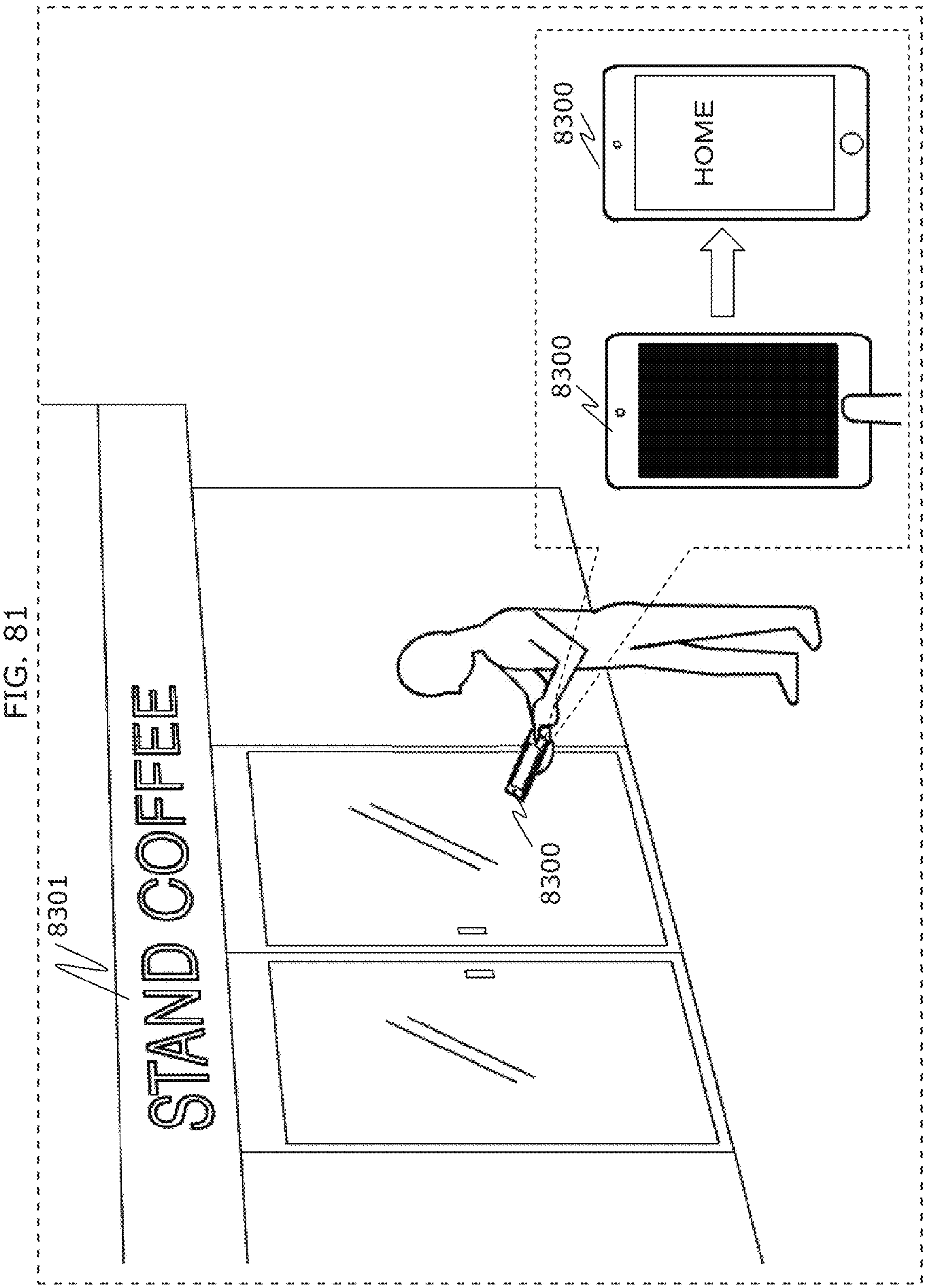
FIG. 81 is a diagram illustrating an example of operation of a receiver in an in-front-of-store situation in Embodiment 4.

FIG. 81 is a diagram illustrating an example of operation of a receiver in the in-front-of-store situation.

For example, when a user carrying a receiver 8300 (terminal device) such as a smartphone is walking, the user finds a sign 8301 of a store. The sign 8301 is a transmitter (subject) that transmits a signal using a change in luminance, like the transmitter in any of Embodiments 1 to 3 described above. The user is interested in the store and, upon determining that the sign 8301 is transmitting a signal by changing in luminance, operates the receiver 8300 to start visible light communication application software (hereafter referred to as "communication application") of the receiver 8300.

Figure 82:
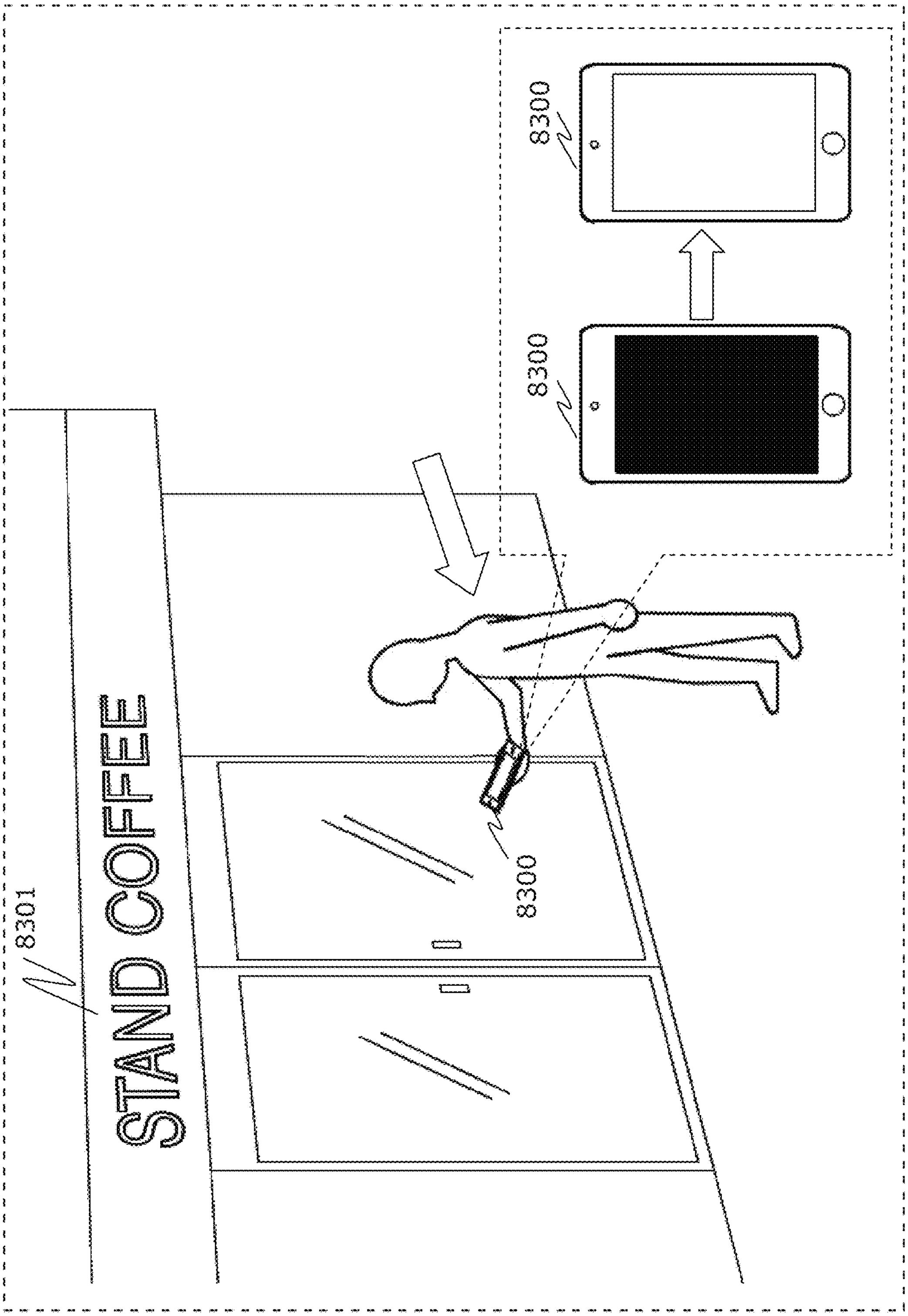
FIG. 82 is a diagram illustrating another example of operation of a receiver in an in-front-of-store situation in Embodiment 4.

FIG. 82 is a diagram illustrating another example of operation of the receiver 8300 in the in-front-of-store situation.

The receiver 8300 may automatically start the communication application, without being operated by the user. For example, the receiver 8300 detects the current position of the receiver 8300 using a GPS, a 9-axis sensor, or the like, and determines whether or not the current position is in a predetermined specific area for the sign 8301. The specific area is an area near the sign 8301. In the case of determining that the current position of the receiver 8300 is in the specific area, the receiver 8300 starts the communication application. The receiver 8300 may also start the communication application upon detecting, through its 9-axis sensor or the like, the user sticking the receiver 8300 out or turning the receiver 8300. This saves the user operation, and provides ease of use.

Figure 83:
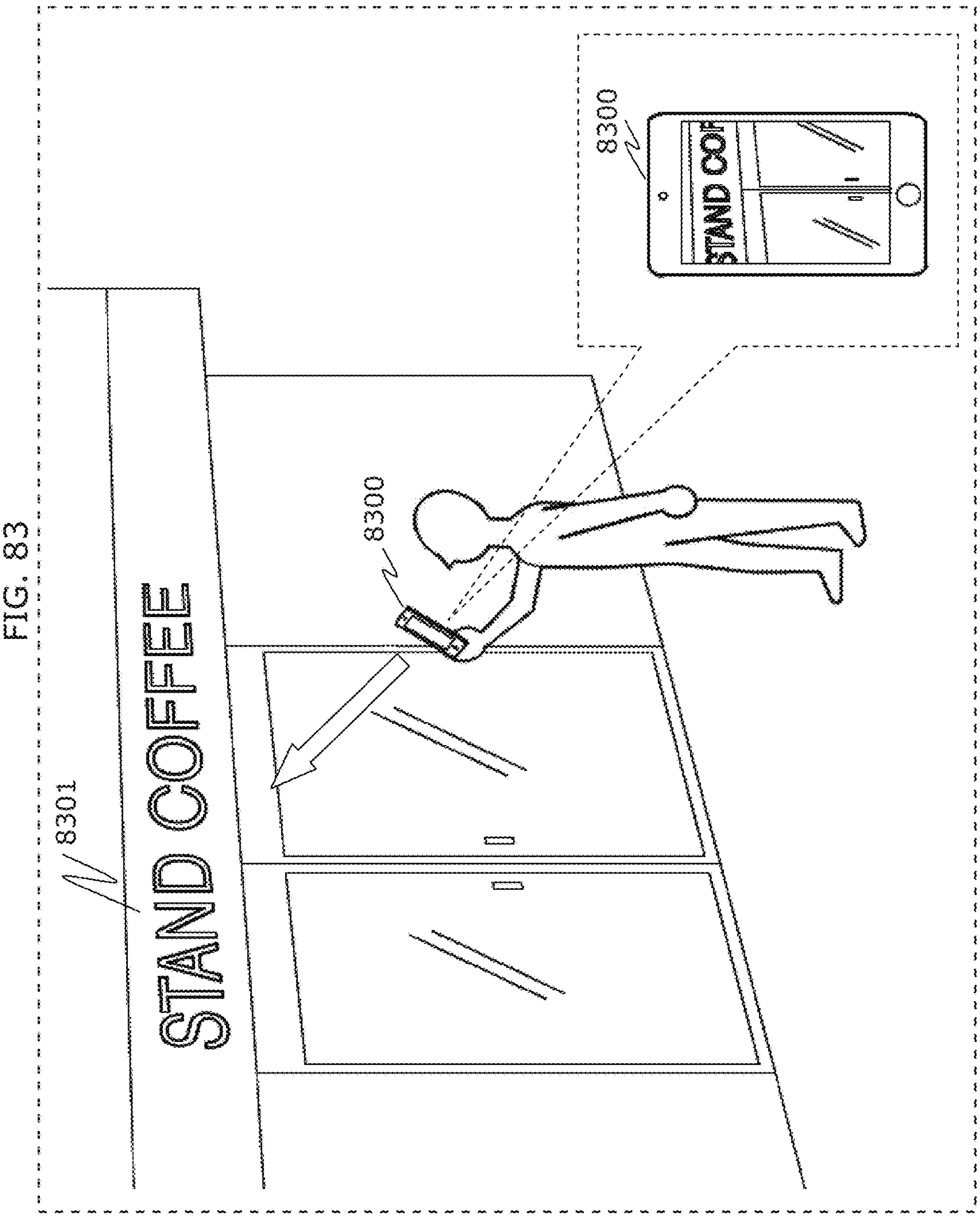
FIG. 83 is a diagram illustrating an example of next operation of a receiver in an in-front-of-store situation in Embodiment 4.

FIG. 83 is a diagram illustrating an example of next operation of the receiver 8300 in the in-front-of-store situation.

After starting the communication application as described above, the receiver 8300 captures (visible light imaging) the sign 8301 that functions as a transmitter for transmitting a signal using a change in luminance. That is, the receiver 8300 performs visible light communication with the sign 8301.

Figure 84:
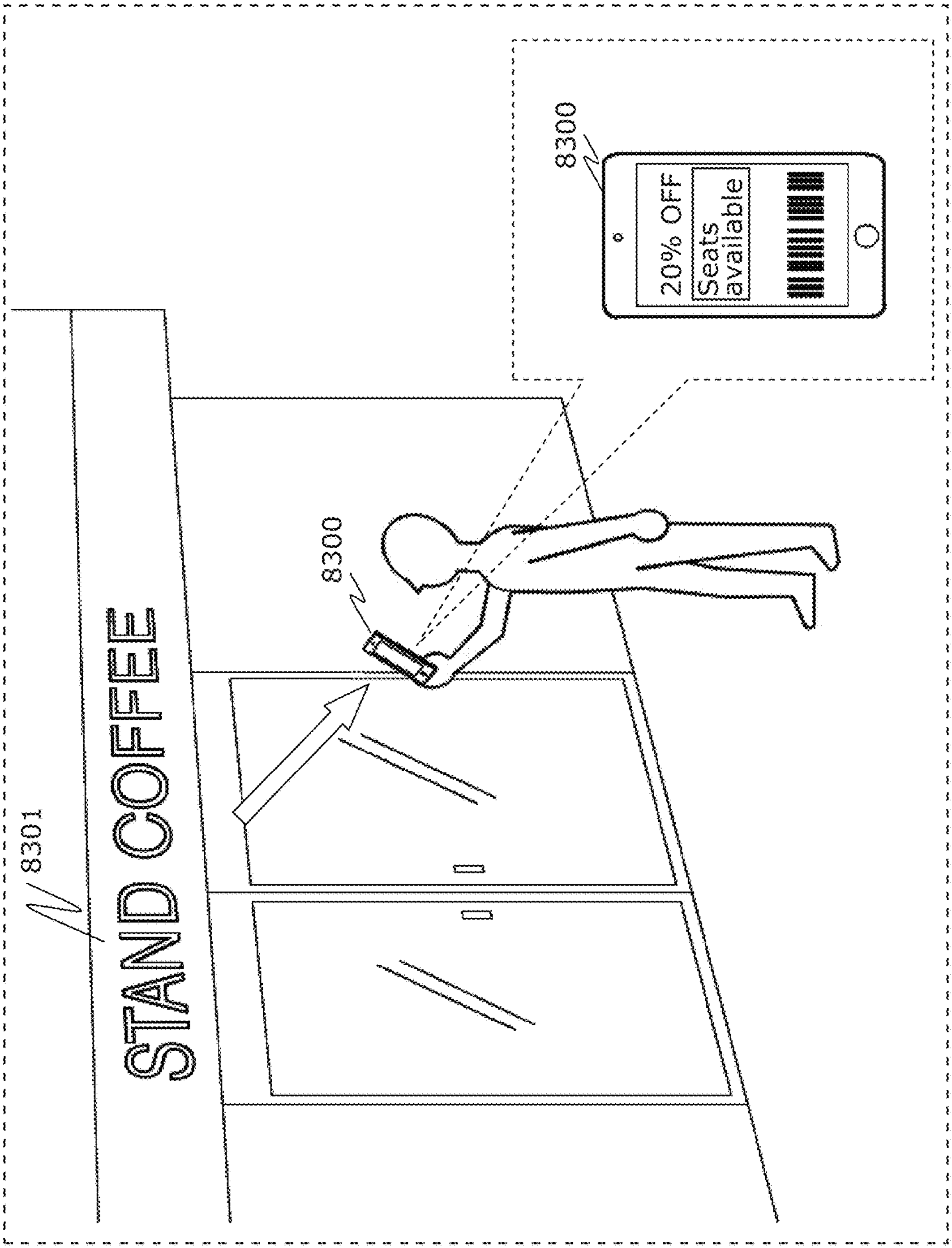
FIG. 84 is a diagram illustrating an example of next operation of a receiver in an in-front-of-store situation in Embodiment 4.

FIG. 84 is a diagram illustrating an example of next operation of the receiver 8300 in the in-front-of-store situation.

The receiver 8300 obtains an image including a bright line, as a result of capturing the sign 8301. The receiver 8300 obtains a device ID of the sign 8301, by demodulating data specified by the pattern of the bright line. That is, the receiver 8300 obtains the device ID from the sign 8301, by visible light imaging or visible light communication in Embodiments 1 to 3. The receiver 8300 transmits the device ID to a server, and obtains advertisement information (service information) associated with the device ID from the server.

The receiver 8300 may obtain the advertisement information associated with the device ID, from a plurality of sets of advertisement information held beforehand. In this case, when determining that the current position of the receiver 8300 is in the above-mentioned specific area, the receiver 8300 notifies the server of the specific area or the current position, and obtains all device IDs corresponding to the specific area and advertisement information associated with each of the device IDs from the server and holds (caches) them beforehand. By doing so, upon obtaining the device ID of the sign 8301 in the specific area, the receiver 8300 can promptly obtain the advertisement information associated with the device ID of the sign 8301 from the pre-stored advertisement information associated with each device ID, with no need to request the advertisement information associated with the device ID from the server.

Upon obtaining the advertisement information associated with the device ID of the sign 8301, the receiver 8300 displays the advertisement information. For instance, the receiver 8300 displays a coupon and availability of the store shown by the sign 8301 and a barcode indicating the same contents.

The receiver 8300 may obtain not only the device ID but also privilege data from the sign 8301 by visible light communication. For example, the privilege data indicates a random ID (random number), the time at which or period during which the privilege data is transmitted, or the like. In the case of receiving the privilege data, the receiver 8300 transmits the privilege data to the server together with the device ID. The receiver 8300 then obtains advertisement information associated with the device ID and the privilege data. The receiver 8300 can thus receive different advertisement information according to the privilege data. As an example, if the sign 8301 is captured early in the morning, the receiver 8300 can obtain and display advertisement information indicating an early bird discount coupon. In other words, the advertisement by the same sign can be varied according to the privilege data (e.g. hours). As a result, the user can be provided with a service suitable for hours and the like. In this embodiment, the presentation (display) of information such as service information to the user is referred to as "service provision".

The receiver 8300 may also obtain, by visible light communication, 3D information indicating the spatial placement of the sign 8301 with high accuracy (within a tolerance of 1 m), from the sign 8301 together with the device ID. Alternatively, the receiver 8300 may obtain the 3D information associated with the device ID from the server. The receiver 8300 may obtain size information indicating the size of the sign 8301, instead of or together with the 3D information. In the case of receiving the size information, the receiver 8300 can calculate the distance from the receiver 8300 to the sign 8301, based on the difference between the size of the sign 8301 indicated by the size information and the size of the sign 8301 shown in the captured image.

Moreover, when transmitting the device ID obtained by visible light communication to the server, the receiver 8300 may transmit retention information (ancillary information) retained in the receiver 8300 to the server together with the device ID. For instance, the retention information is personal information (e.g. age, sex) or a user ID of the user of the receiver 8300. Having received the retention information together with the device ID, the server transmits advertisement information associated with the retention information (the personal information or user ID) from among one or more sets of advertisement information associated with the device ID, to the receiver 8300. The receiver 8300 can thus receive store advertisement information suitable for the personal information and the like, store advertisement information corresponding to the user ID, or the like. As a result, the user can be provided with a more valuable service.

As an alternative, the retention information indicates a reception condition set in the receiver 8300 beforehand. For example, in the case where the store is a restaurant, the reception condition is the number of customers. Having received such retention information together with the device ID, the server transmits advertisement information associated with the reception condition (the number of customers) from among one or more sets of advertisement information associated with the device ID, to the receiver 8300. The receiver 8300 can thus receive store advertisement information suitable for the number of customers, such as availability information for the number of customers. The store can achieve customer attraction and profit optimization, by displaying advertisement information with a different discount rate according to the number of customers, the day of the week, or the time of day.

As another alternative, the retention information indicates the current position detected by the receiver 8300 beforehand. Having received such retention information together with the device ID, the server transmits not only advertisement information associated with the device ID but also one or more other device IDs corresponding to the current position (the current position and its surroundings) indicated by the retention information and advertisement information associated with each of the other device IDs, to the receiver 8300. The receiver 8300 can cache the other device IDs and the advertisement information associated with each of the other device IDs. Accordingly, when the receiver 8300 performs visible light communication with another transmitter in the current position (the current position and its surroundings), the receiver 8300 can promptly obtain advertisement information associated with the device ID of this other transmitter, with no need to access the server.

Figure 85:
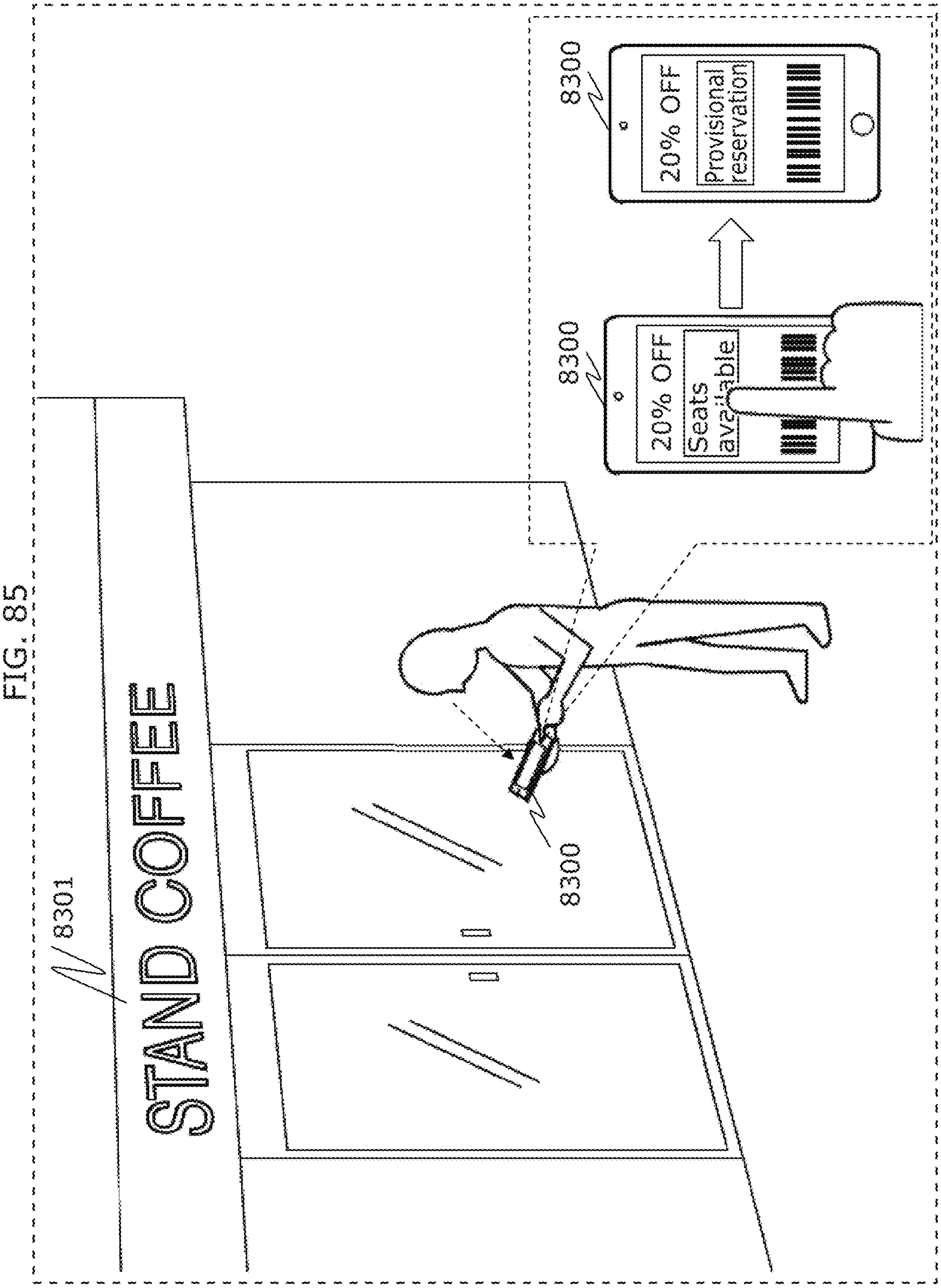
FIG. 85 is a diagram illustrating an example of next operation of a receiver in an in-front-of-store situation in Embodiment 4.

FIG. 85 is a diagram illustrating an example of next operation of the receiver 8300 in the in-front-of-store situation.

Upon obtaining the advertisement information from the server as described above, the receiver 8300 displays, for example, the "Seats available" button as the availability indicated by the advertisement information. When the user performs an operation of touching the "Seats available" button with his or her finger, the receiver 8300 notifies the server of the operation. When notified of the operation, the server makes a provisional reservation at the store of the sign 8301, and notifies the receiver 8300 of the completion of the provisional reservation. The receiver 8300 receives the notification from the server, and displays the character string "Provisional reservation" indicating the completion of the provisional reservation, instead of the "Seats available" button. The receiver 8300 stores an image including: the coupon of the store shown by the sign 8301; the character string "Provisional reservation" proving the provisional reservation at the store; and a barcode indicating the same contents, in a memory as a prior obtainment image.

Here, the server can log information relating to visible light communication performed between the sign 8301 and the receiver 8300, by the operation described with reference to FIGS. 84 and 85. In detail, the server can log the device ID of the transmitter (sign) performing visible light communication, the location where visible light communication is performed (the current position of the receiver 8300), the privilege data indicating, for example, the time when visible light communication is performed, the personal information of the user of the receiver 8300 performing visible light communication, and so on. Through the use of at least one of these logged sets of information, the server can analyze the value of the sign 8301, i.e. the contribution of the sign 8301 to the advertisement of the store, as advertising effectiveness.

(Situation: In Store)

An example of application in a situation where the user carrying the receiver 8300 enters the store corresponding to the displayed advertisement information (service information) is described next, with reference to FIGS. 86 to 94.

Figure 86:
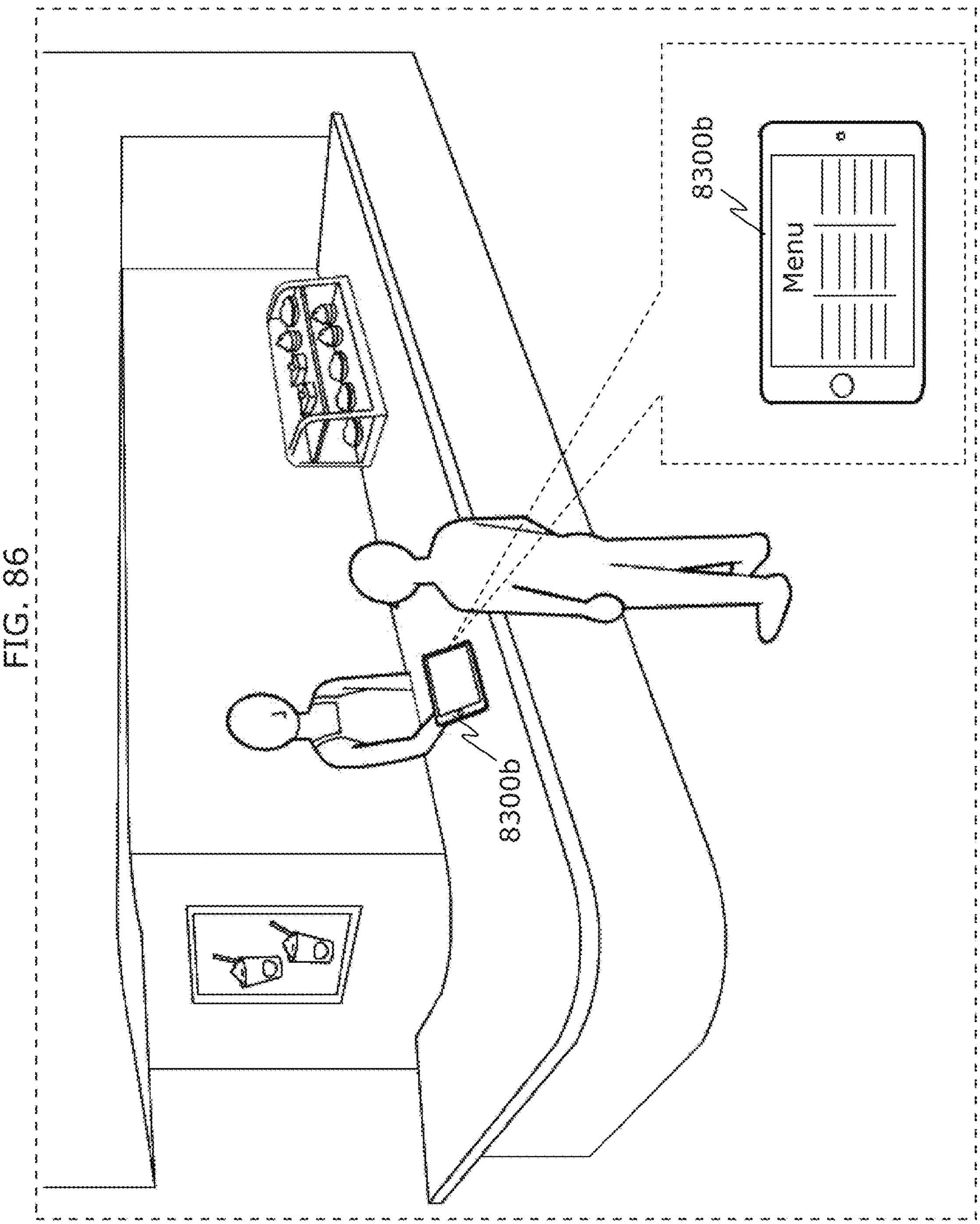
FIG. 86 is a diagram illustrating an example of operation of a display device in an in-front-of-store situation in Embodiment 4.

FIG. 86 is a diagram illustrating an example of operation of a display device in the in-store situation.

For example, the user of the receiver 8300 that has performed visible light communication with the above-mentioned sign 8301 enters the store corresponding to the displayed advertisement information. At this time, the receiver 8300 detects the user entering the store corresponding to the advertisement information displayed using visible light communication (i.e. detects the entrance). For instance, after performing visible light communication with the sign 8301, the receiver 8300 obtains store information indicating the location of the store associated with the device ID of the sign 8301, from the server. The receiver 8300 then determines whether or not the current position of the receiver 8300 obtained using the GPS, the 9-axis sensor, or the like enters the location of the store indicated by the store information. The receiver 8300 detects the above-mentioned entrance, by determining that the current position enters the location of the store.

Upon detecting the entrance, the receiver 8300 notifies a display device 8300*b* of the entrance, via the server or the like. Alternatively, the receiver 8300 notifies the display device 8300*b* of the entrance by visible light communication or wireless communication. When notified of the entrance, the display device 8300*b* obtains product service information indicating, for example, a menu of products or services provided in the store, and displays the menu indicated by the product service information. The display device 8300*b* may be a mobile terminal carried by the user of the receiver 8300 or the store staff, or a device installed in the store.

Figure 87:
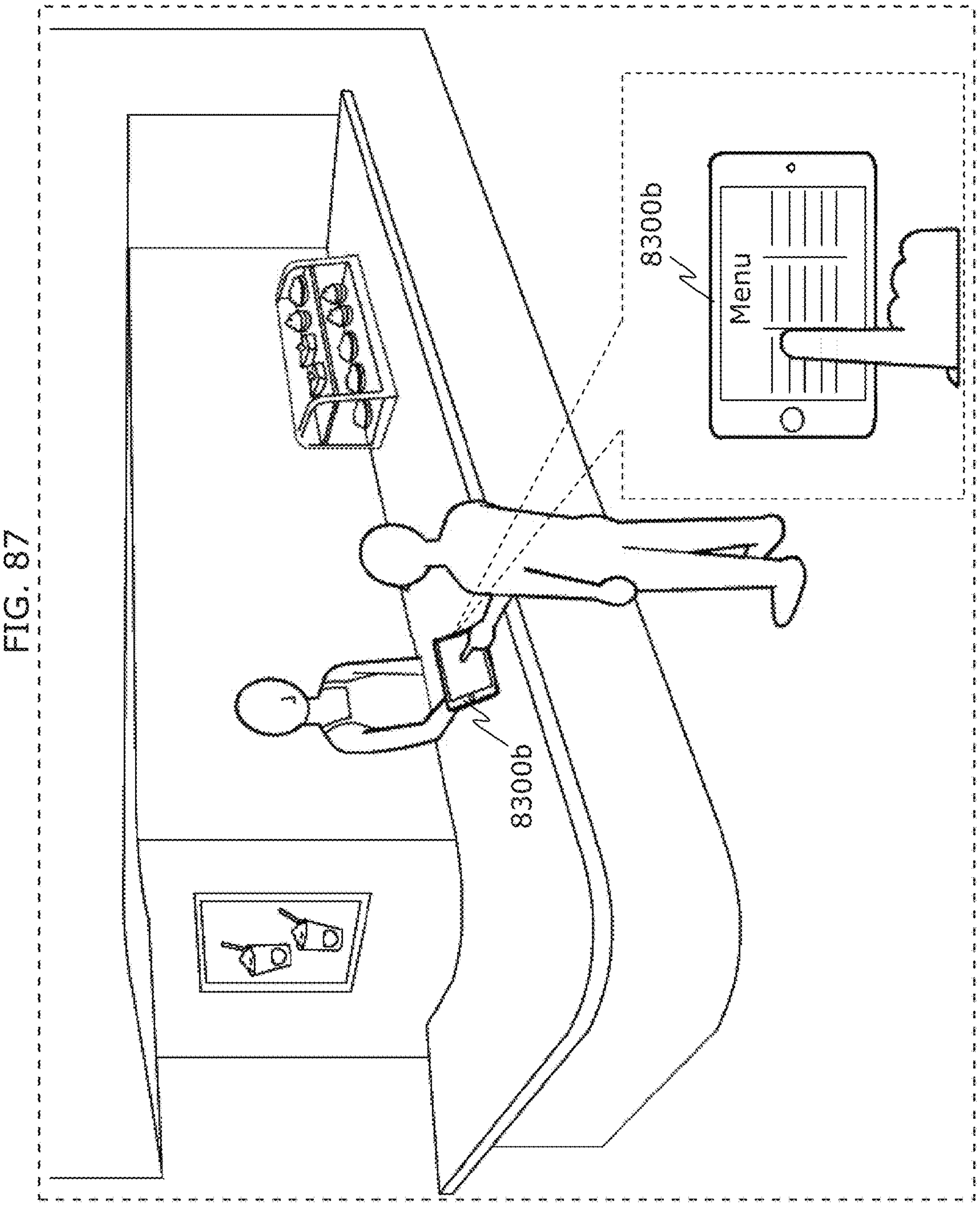
FIG. 87 is a diagram illustrating an example of next operation of a display device in an in-front-of-store situation in Embodiment 4.

FIG. 87 is a diagram illustrating an example of next operation of the display device 8300*b* in the in-store situation.

The user selects a desired product from the menu displayed on the display device 8300*b*. In detail, the user performs an operation of touching the part of the menu where the name of the desired product is displayed. The display device 8300*b* receives the product selection operation result.

Figure 88:
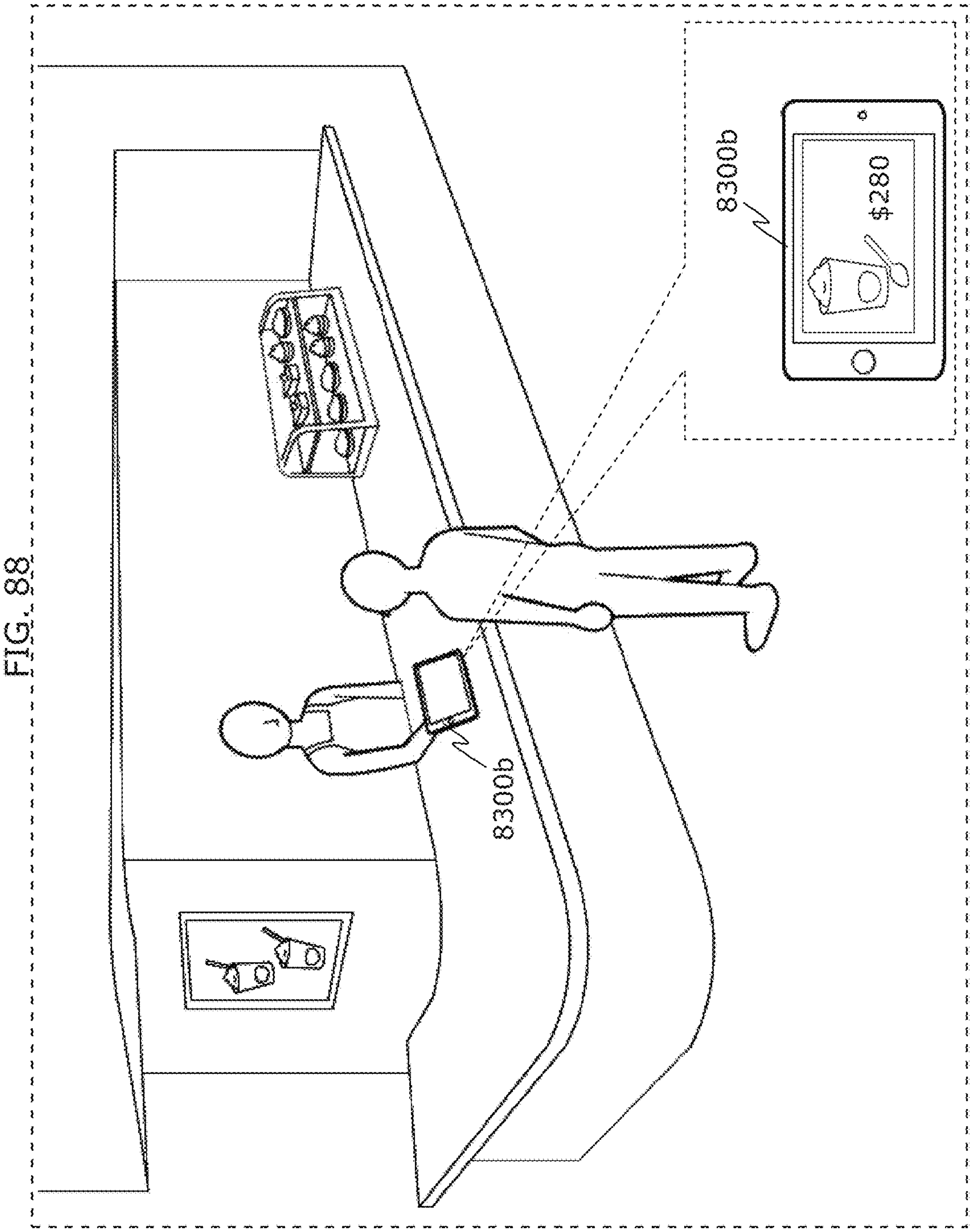
FIG. 88 is a diagram illustrating an example of next operation of a display device in an in-front-of-store situation in Embodiment 4.

FIG. 88 is a diagram illustrating an example of next operation of the display device 8300*b* in the in-store situation.

Upon receiving the product selection operation result, the display device 8300*b* displays an image representing the selected product and the price of the product. The display device 8300*b* thus prompts the user to confirm the selected product. The image representing the product, information indicating the price of the product, and the like are included, for example, in the above-mentioned product service information.

Figure 89:
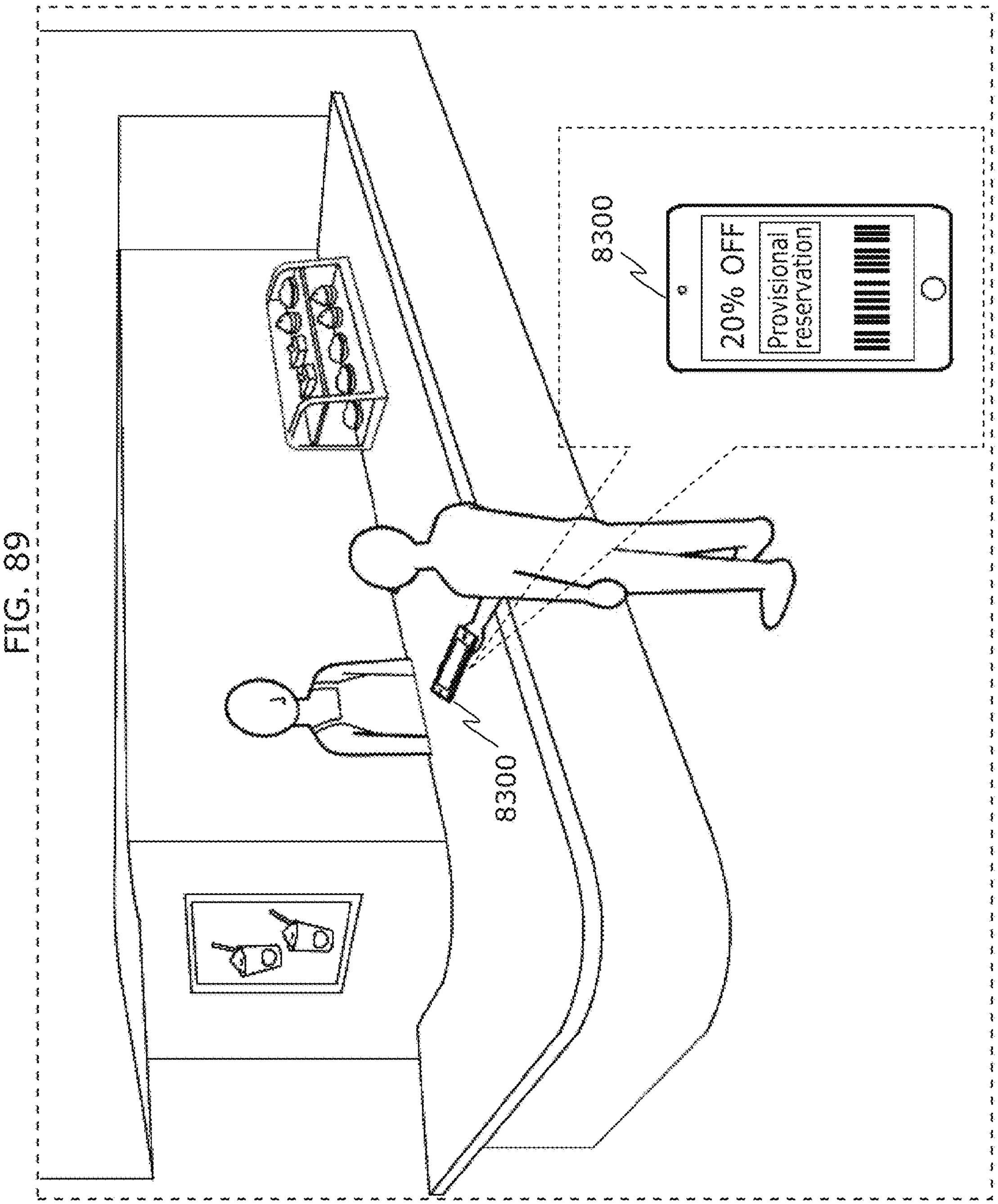
FIG. 89 is a diagram illustrating an example of next operation of a receiver in an in-front-of-store situation in Embodiment 4.

FIG. 89 is a diagram illustrating an example of next operation of the receiver 8300 in the in-store situation.

When prompted to confirm the selected product, the user performs an operation for ordering the product. After the operation is performed, the receiver 8300 notifies payment information necessary for electronic payment to a POS (Point of Sale) system of the store via the display device 8300*b* or the server. The receiver 8300 also determines whether or not there is the above-mentioned prior obtainment image which is obtained using visible light communication with the sign 8301 of the store and stored. In the case of determining that there is the prior obtainment image, the receiver 8300 displays the prior obtainment image.

Though the display device 8300*b* is used in this situation, the receiver 8300 may perform the processes by the display device 8300*b* instead, without using the display device 8300*b*. In this case, upon detecting the entrance, the receiver 8300 obtains, from the server, the product service information indicating, for example, the menu of products or services provided in the store, and displays the menu indicated by the product service information. Moreover, upon receiving the operation for ordering the product, the receiver 8300 notifies the ordered product and the payment information necessary for electronic payment, to the POS system of the store via the server.

Figure 90:
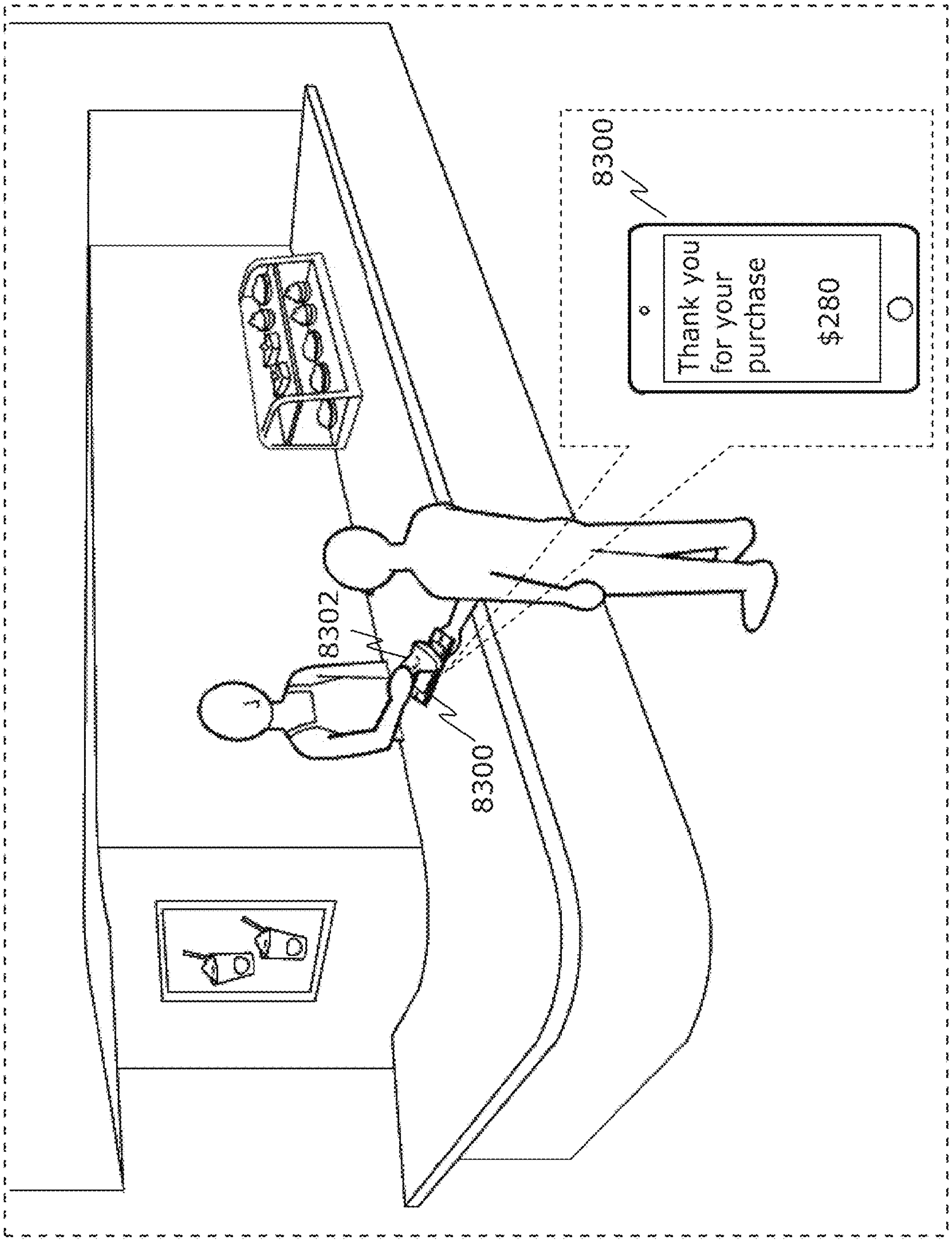
FIG. 90 is a diagram illustrating an example of next operation of a receiver in an in-front-of-store situation in Embodiment 4.

FIG. 90 is a diagram illustrating an example of next operation of the receiver 8300 in the in-store situation.

The store staff applies a barcode scanner 8302 of the POS system to the barcode in the prior obtainment image displayed on the receiver 8300. The barcode scanner 8302 reads the barcode in the prior obtainment image. As a result, the POS system completes the electronic payment according to the coupon indicated by the barcode. The barcode scanner 8302 of the POS system then transmits, to the receiver 8300, payment completion information indicating the completion of the electronic payment, by changing in luminance. Thus, the barcode scanner 8302 also has a function as a transmitter in visible light communication. The receiver 8300 receives the payment completion information by visible light communication, and displays the payment completion information. For example, the payment completion information indicates the message "Thank you for your purchase" and the amount paid. As a result of such electronic payment, the POS system, the server, and the receiver 8300 can determine that, in the store corresponding to the advertisement information (service information) displayed in front of the store, the user uses the service indicated by the advertisement information.

As described above, the product in the store is ordered through the operation of the receiver 8300, the POS system, and the like as illustrated in FIGS. 86 to 90. Accordingly, the user who has entered the store can order the product from the menu of the store automatically displayed on the display device 8300*b* or the receiver 8300. In other words, there is no need for the store staff to show the menu to the user and directly receive the order for the product from the user. This significantly reduces the burden on the store staff. Though the barcode scanner 8302 reads the barcode in the above example, the barcode scanner 8302 may not be used. For instance, the receiver 8300 may transmit the information indicated by the barcode, to the POS system via the server. The receiver 8300 may then obtain the payment completion information from the POS system via the server. This further reduces the store staff's workload, and allows the user to order the product without the store staff. Alternatively, the display device 8300*b* and the receiver 8300 may transfer the order and charging data with each other by visible light communication, or transfer the data by wireless communication using a key exchanged by visible light communication.

There is the case where the sign 8301 is displayed by one of a plurality of stores belonging to a chain. In such a case, the advertisement information obtained from the sign 8301 using visible light communication can be used in all stores of the chain. Here, the service provided to the user may be different between a store (advertisement store) displaying the sign 8301 and a store (non-advertisement store) not displaying the sign 8301, even though they belong to the same chain. For example, in the case where the user enters the non-advertisement store, the user receives the service of the discount rate (e.g. 20%) according to the coupon indicated by the prior obtainment image. In the case where the user enters the advertisement store, the user receives the service of a higher discount rate (e.g. 30%) than the discount rate of the coupon. In detail, in the case of detecting the entrance into the advertisement store, the receiver 8300 obtains additional service information indicating an additional discount of 10% from the server, and displays an image indicating a discount rate of 30% (20%+10%) instead of the prior obtainment image illustrated in FIG. 89. Here, the receiver 8300 detects whether the user enters the advertisement store or the non-advertisement store, based on the above-mentioned store information obtained from the server. The store information indicates the location of each of the plurality of stores belonging to the chain, and whether the store is the advertisement store or the non-advertisement store.

In the case where a plurality of non-advertisement stores are included in the chain, the service provided to the user may be different in each of the non-advertisement stores. For instance, the service according to the distance from the position of the sign 8301 or the current position of the receiver 8300 when performing visible light communication with the sign 8301 to the non-advertisement store is provided to the user entering the non-advertisement store. Alternatively, the service according to the difference (time difference) between the time at which the receiver 8300 and the sign 8301 perform visible light communication and the time at which the user enters the non-advertisement store is provided to the user entering the non-advertisement store. That is, the receiver 8300 obtains, from the server, additional service information indicating an additional discount that differs depending on the above-mentioned distance (the position of the sign 8301) and time difference, and displays an image indicating a discount rate (e.g. 30%) on which the additional discount has been reflected, instead of the prior obtainment image illustrated in FIG. 89. Note that such a service is determined by the server or the POS system, or by cooperation between the server and the POS system. The service may be applied to every store belonging to the chain, regardless of whether the store is the advertisement store or the non-advertisement store.

In the case where the user enters the non-advertisement store and makes the order using the advertisement information, the POS system of the non-advertisement store may pass part of the amount earned as a result of the order, to the POS system of the advertisement store.

Each time the advertisement information is displayed, the server may determine whether or not the advertisement information is used. By collecting the determination results, the server can easily analyze the advertising effectiveness of the sign 8301. Moreover, by collecting at least one of: the position of the sign 8301; the time at which the advertisement information is displayed; the position of the store in which the advertisement information is used; the time at which the advertisement information is used; and the time at which the user enters the store, the server can improve the accuracy of analyzing the advertising effectiveness of the sign 8301, and find the position of the sign 8301 highest in advertising effectiveness.

The receiver 8300 may also obtain, from the server, additional service information indicating an additional discount corresponding to the number of times the advertisement information is used to order the product (the number of uses), and display an image indicating a discount rate (e.g. 30%) on which the additional discount corresponding to the number of uses has been reflected, instead of the prior obtainment image illustrated in FIG. 89. For example, the server may provide such a service that sets a higher discount rate when the number of uses is larger, in cooperation with the POS system.

In the case where the receiver 8300 receives advertisement information associated with each of the device IDs of all signs 8301 displayed by the store (i.e. in the case where the obtainment of all advertisement information is completed), the server may provide a good-value service to the user entering the store of the sign 8301. Examples of the good-value service include a service of a very high discount rate and a service of offering a product other than the ordered product free of charge. When the receiver 8300 detects the entrance of the user into the store, the server determines whether or not the receiver 8300 has performed the process including visible light communication and the like on each of all signs associated with the store. In the case where the server determines that the receiver 8300 has performed the process, the receiver 8300 obtains additional service information indicating an additional discount from the server as the above-mentioned good-value service, and displays an image indicating a discount rate (e.g. 50%) on which the additional discount has been reflected, instead of the prior obtainment image illustrated in FIG. 89.

The receiver 8300 may also obtain, from the server, additional service information indicating an additional discount that differs depending on the difference between the time at which the receiver 8300 performs visible light communication with the sign 8301 and displays the advertisement information and the time at which the user enters the store, and display an image indicating a discount rate (e.g. 30%) on which the additional discount has been reflected, instead of the prior obtainment image illustrated in FIG. 89. For instance, the receiver 8300 obtains additional service information indicating a higher discount rate when the difference is smaller, from the server.

Figure 91:
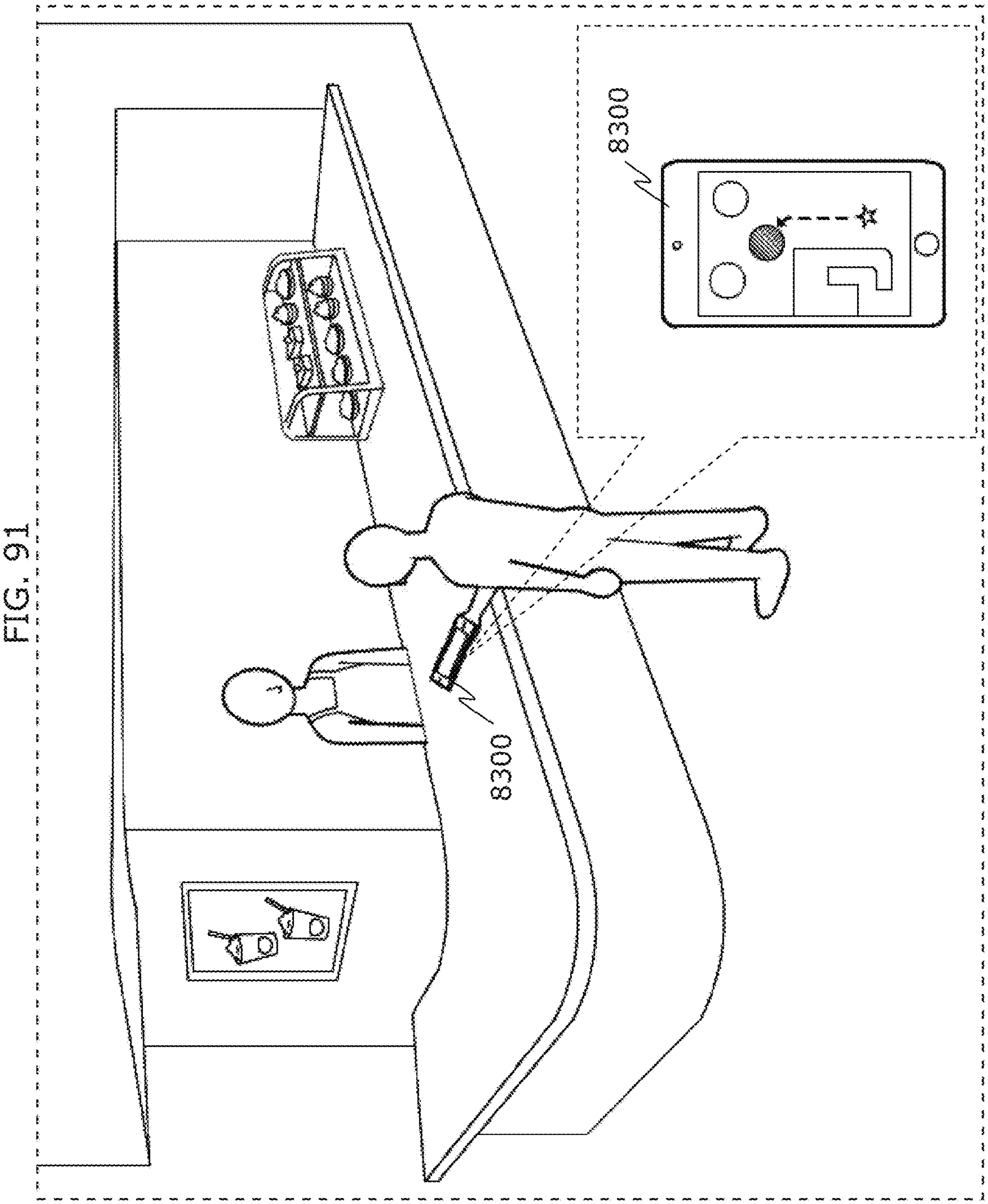
FIG. 91 is a diagram illustrating an example of next operation of a receiver in an in-front-of-store situation in Embodiment 4.

FIG. 91 is a diagram illustrating an example of next operation of the receiver 8300 in the in-store situation.

Having completed the order and the electronic payment, the receiver 8300 receives a signal transmitted from a transmitter such as a lighting device in the store by changing in luminance, and transmits the signal to the server, thus obtaining an in-store guide map indicating the seat position (e.g. black circle) of the user. The receiver 8300 also specifies the position of the receiver 8300 using the received signal, as in any of Embodiments 1 to 3 described above. The receiver 8300 displays the specified position (e.g. star) of the receiver 8300 in the guide map. This enables the user to easily find the way to his or her seat.

While the user is moving, too, the receiver 8300 frequently specifies the position of the receiver 8300 by performing visible light communication with a nearby transmitter such as a lighting device in the store. Hence, the receiver 8300 sequentially updates the displayed position (e.g. start) of the receiver 8300. The user can be appropriately guided to the seat in this manner.

Figure 92:
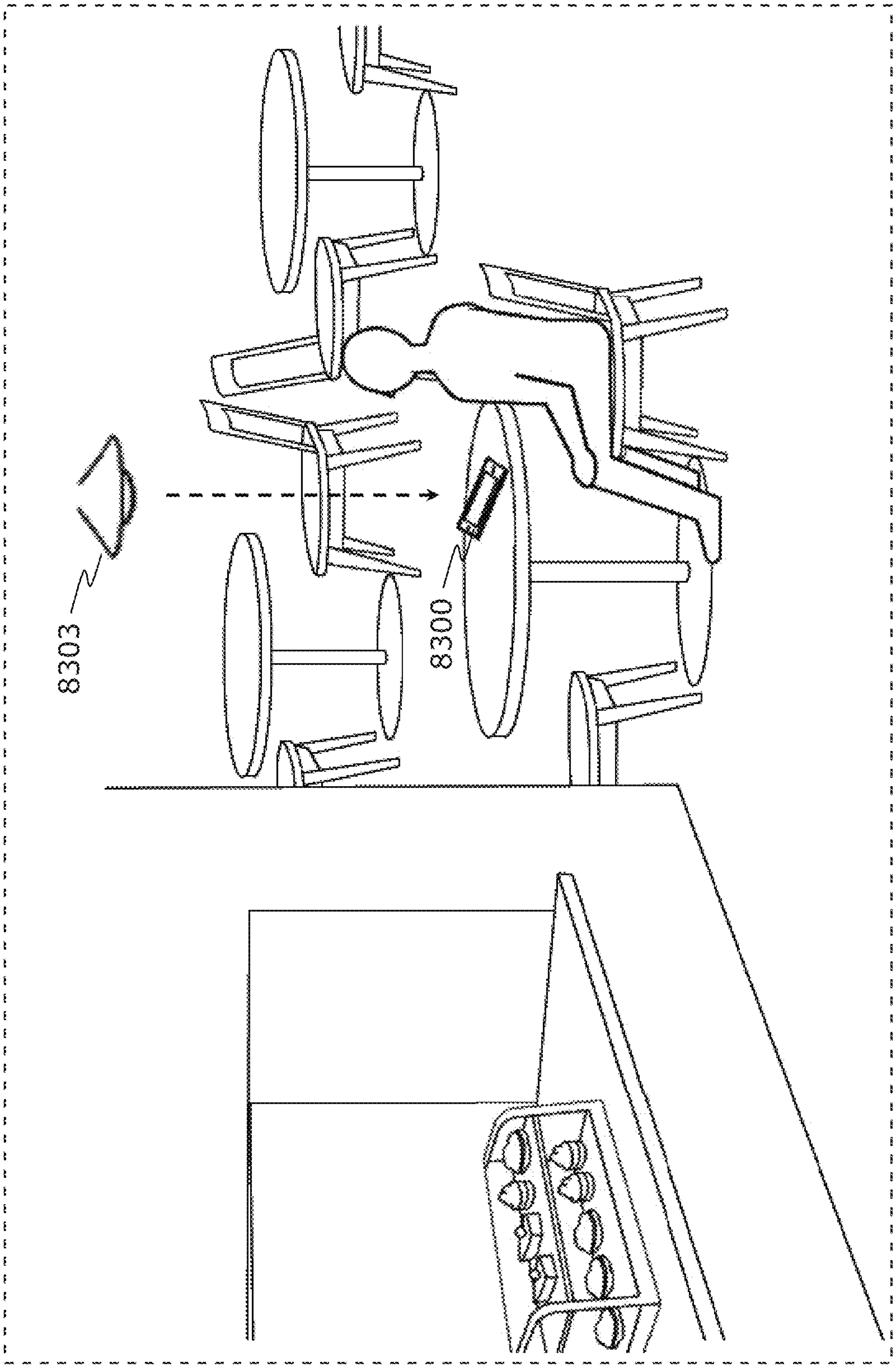
FIG. 92 is a diagram illustrating an example of next operation of a receiver in an in-front-of-store situation in Embodiment 4.

FIG. 92 is a diagram illustrating an example of next operation of the receiver 8300 in the in-store situation.

When the user is seated, the receiver 8300 specifies the position of the receiver 8300 by performing visible light communication with a transmitter 8303 such as a lighting device, and determines that the position is the seat position of the user. The receiver 8300 notifies, together with the user name or nickname, that the user is seated, to a terminal in the store via the server. This enables the store staff to recognize which seat the user is in.

Figure 93:
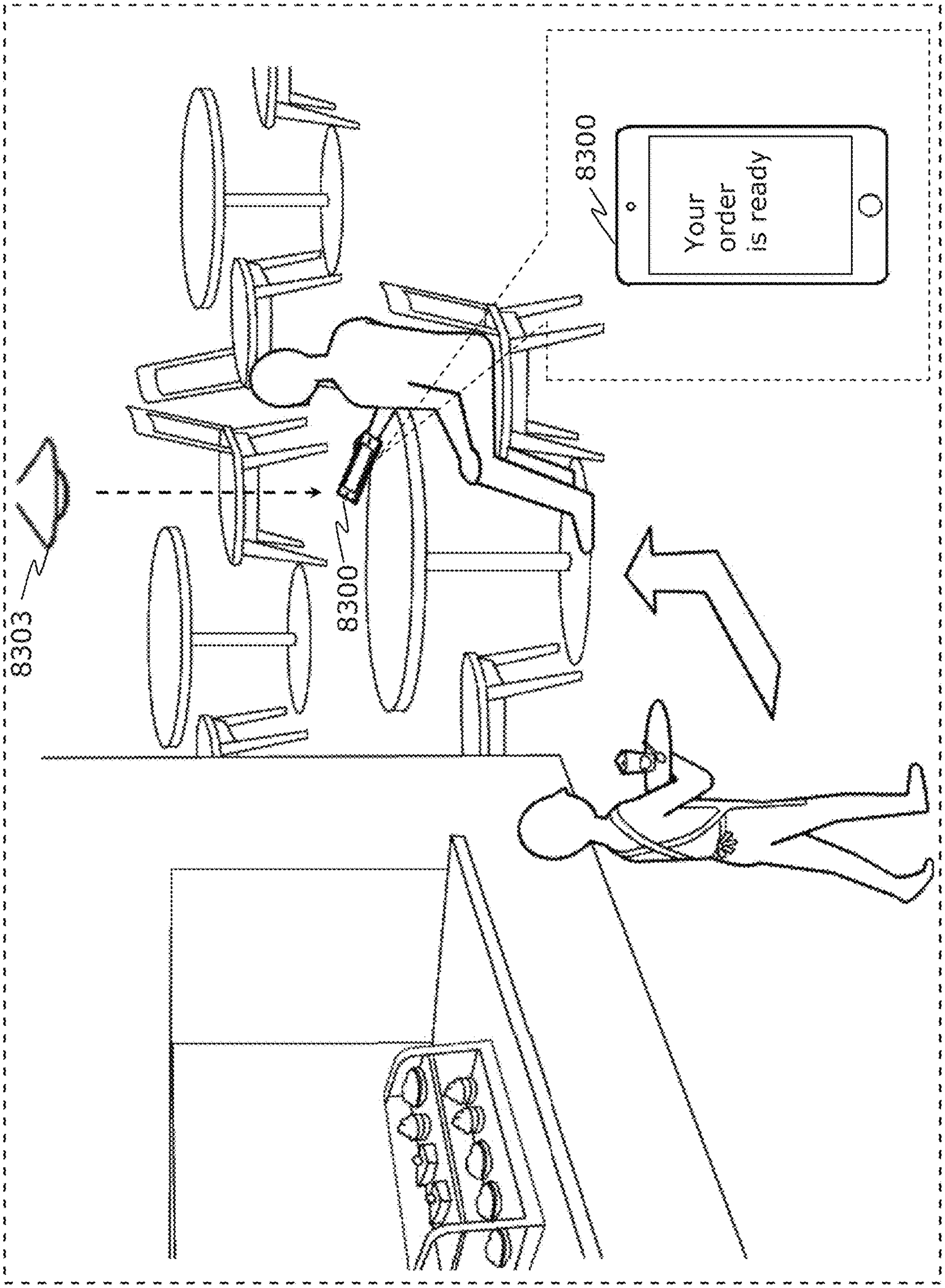
FIG. 93 is a diagram illustrating an example of next operation of a receiver in an in-front-of-store situation in Embodiment 4.

FIG. 93 is a diagram illustrating an example of next operation of the receiver 8300 in the in-store situation.

The transmitter 8303 transmits a signal including a customer ID and a message informing that the ordered product is ready, by changing in luminance. Note that, for example when obtaining the product service information indicating the product menu and the like from the server, the receiver 8300 also obtains the customer ID from the server and holds it. The receiver 8300 receives the signal, by performing visible light imaging on the transmitter 8303. The receiver 8300 determines whether or not the customer ID included in the signal matches the customer ID held beforehand. In the case of determining that they match, the receiver 8300 displays the message (e.g. "Your order is ready") included in the signal.

Figure 94:
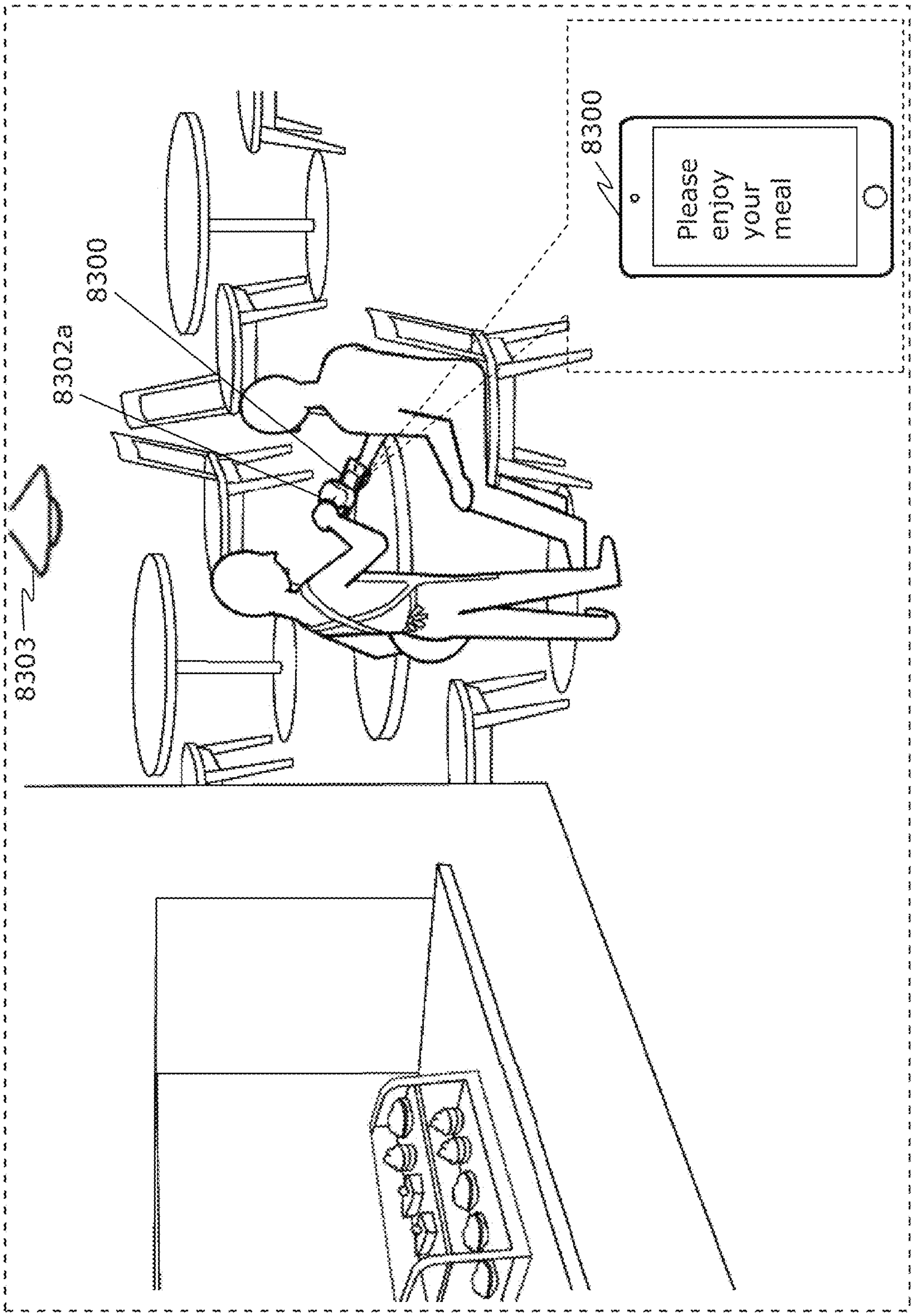
FIG. 94 is a diagram illustrating an example of next operation of a receiver in an in-front-of-store situation in Embodiment 4.

FIG. 94 is a diagram illustrating an example of next operation of the receiver 8300 in the in-store situation.

The store staff, having delivered the ordered product to the user's seat, directs a handheld terminal 8302*a* to the receiver 8300 in order to prove that the ordered product has been delivered. The handheld terminal 8302*a* functions as a transmitter. The handheld terminal 8302*a* transmits, to the receiver 8300, a signal indicating the delivery of the ordered product by changing in luminance. The receiver 8300 captures the handheld terminal 8302*a* to receive the signal, and displays a message (e.g. "Please enjoy your meal") indicated by the signal.

(Situation: Store Search)

An example of application in a situation where the user carrying the receiver 8300 is searching for a store of interest is described below, with reference to FIGS. 95 to 97.

Figure 95:
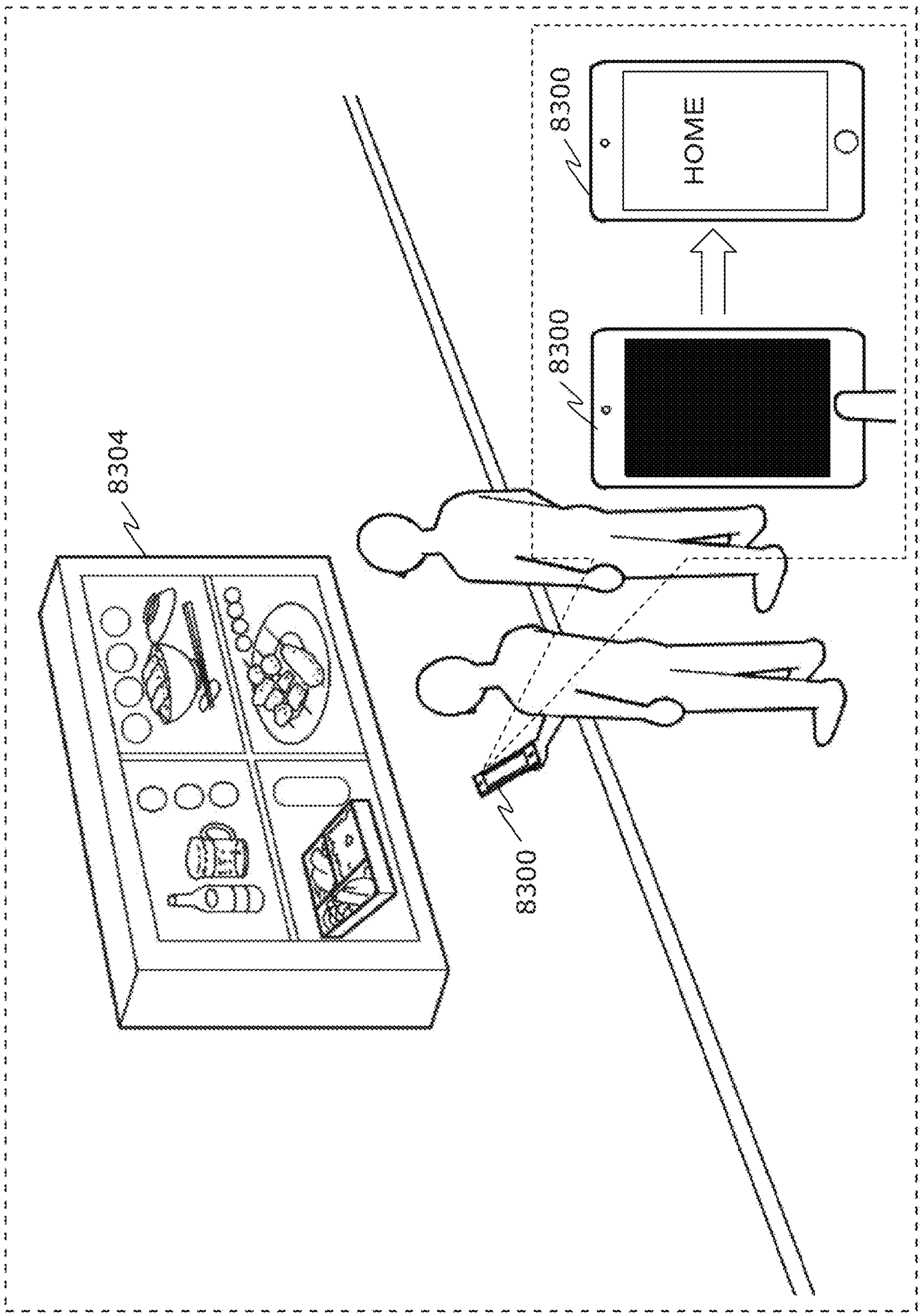
FIG. 95 is a diagram illustrating an example of operation of a receiver in a store search situation in Embodiment 4.

FIG. 95 is a diagram illustrating an example of operation of the receiver 8300 in the store search situation.

The user finds a signage 8304 showing restaurants of interest. Upon determining that the signage 8304 is transmitting a signal by changing in luminance, the user operates the receiver 8300 to start the communication application of the receiver 8300, as in the example illustrated in FIG. 81. Alternatively, the receiver 8300 may automatically start the communication application as in the example illustrated in FIG. 82.

Figure 96:
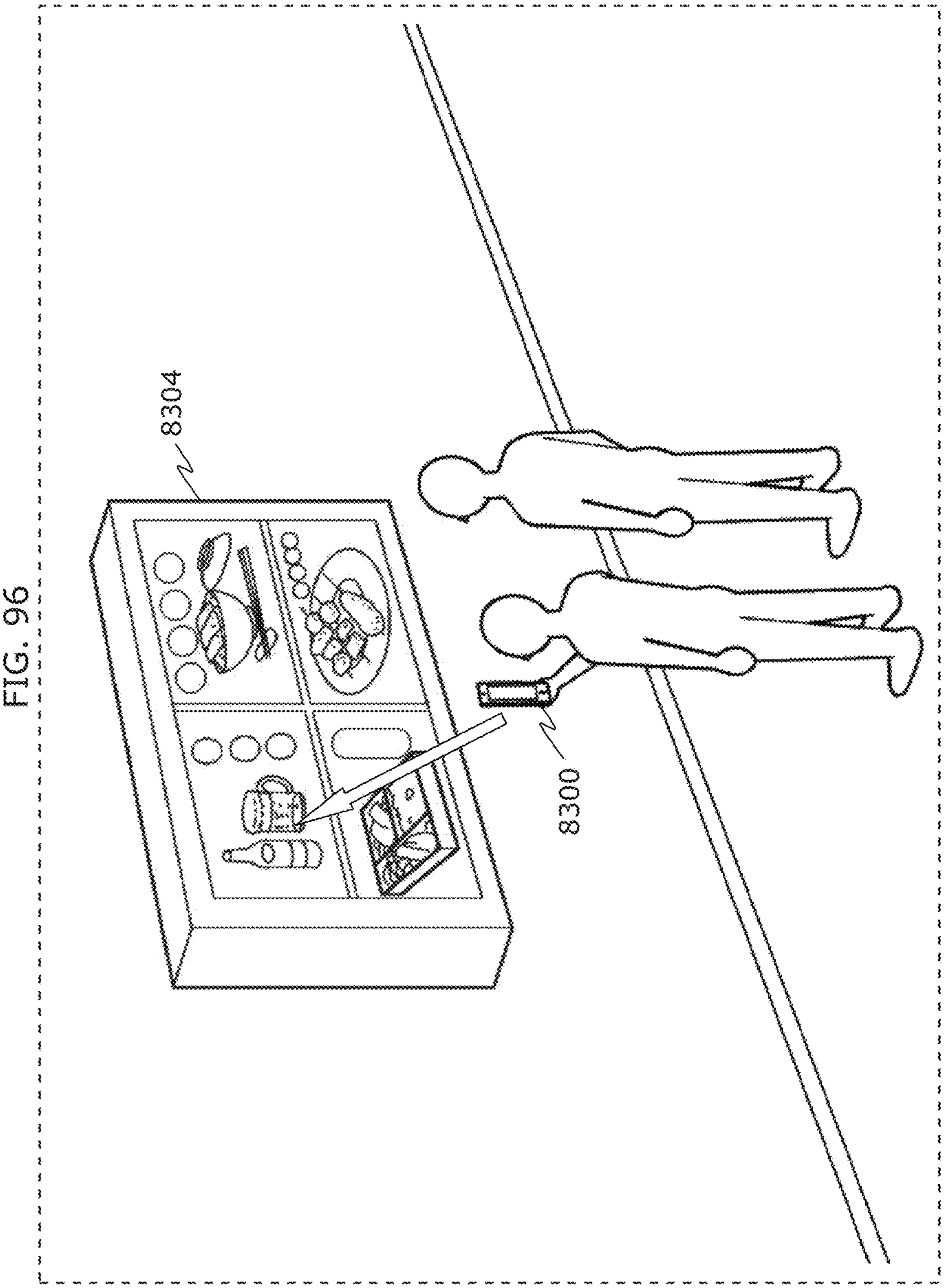
FIG. 96 is a diagram illustrating an example of next operation of a receiver in a store search situation in Embodiment 4.

FIG. 96 is a diagram illustrating an example of next operation of the receiver 8300 in the store search situation.

The receiver 8300 captures the entire signage 8304 or a part of the signage 8304 showing a restaurant of the user's interest, to receive an ID for identifying the signage 8304 or the restaurant.

Figure 97:
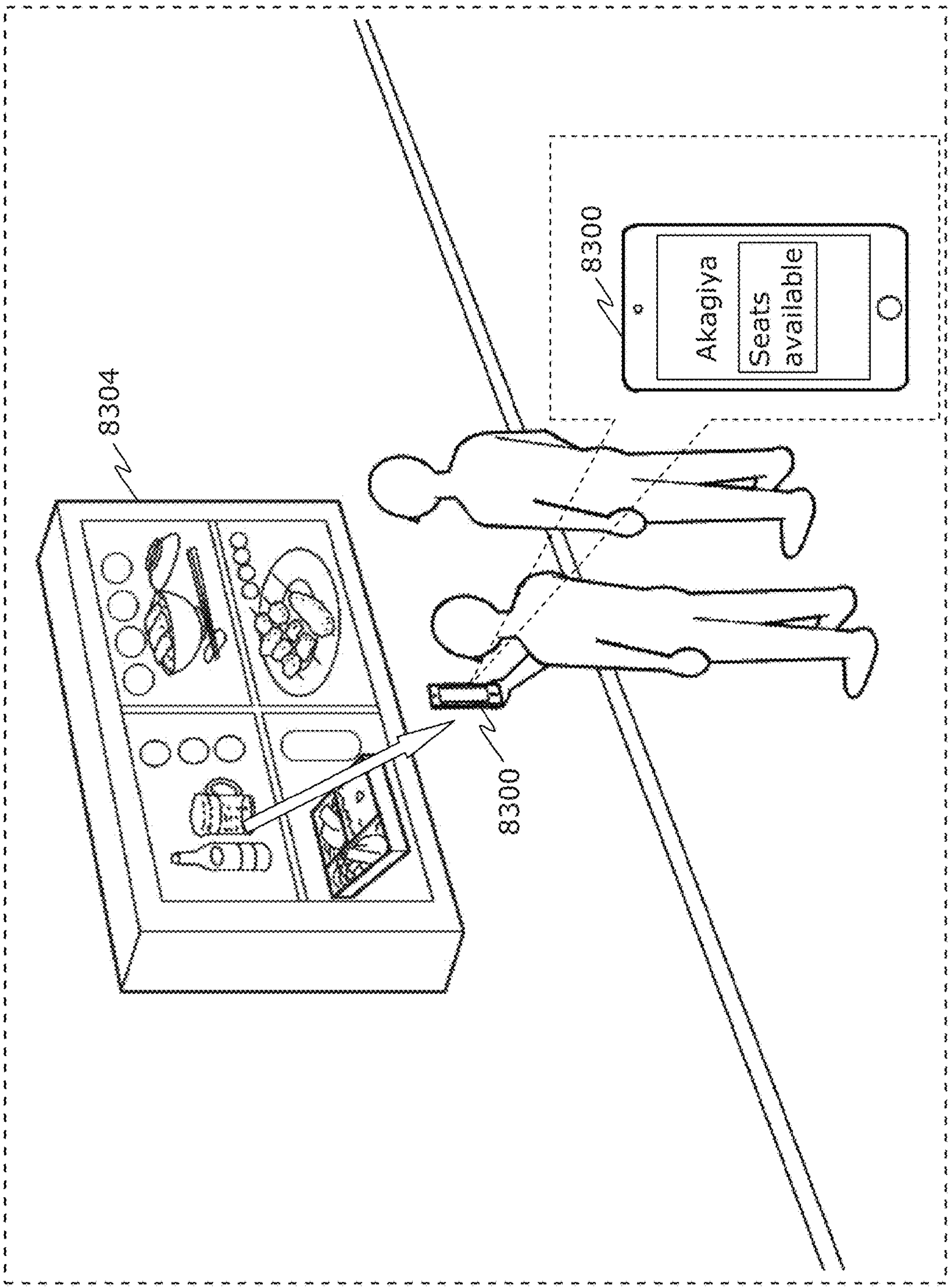

FIG. 97 is a diagram illustrating an example of next operation of the receiver 8300 in the store search situation.

Upon receiving the ID mentioned above, the receiver 8300 transmits the ID to the server, and obtains advertisement information (service information) associated with the ID from the server and displays it. Here, the receiver 8300 may notify the number of people (ancillary information) who are about to enter the restaurant, to the server together with the ID. As a result, the receiver 8300 can obtain advertisement information corresponding to the number of people. For example, the receiver 8300 can obtain advertisement information indicating that seats are available in the restaurant for the notified number of people.

(Situation: Movie Advertisement)

An example of application in a situation where the user carrying the receiver 8300 is in front of a signage including a movie advertisement of interest is described below, with reference to FIGS. 98 to 101.

Figure 98:
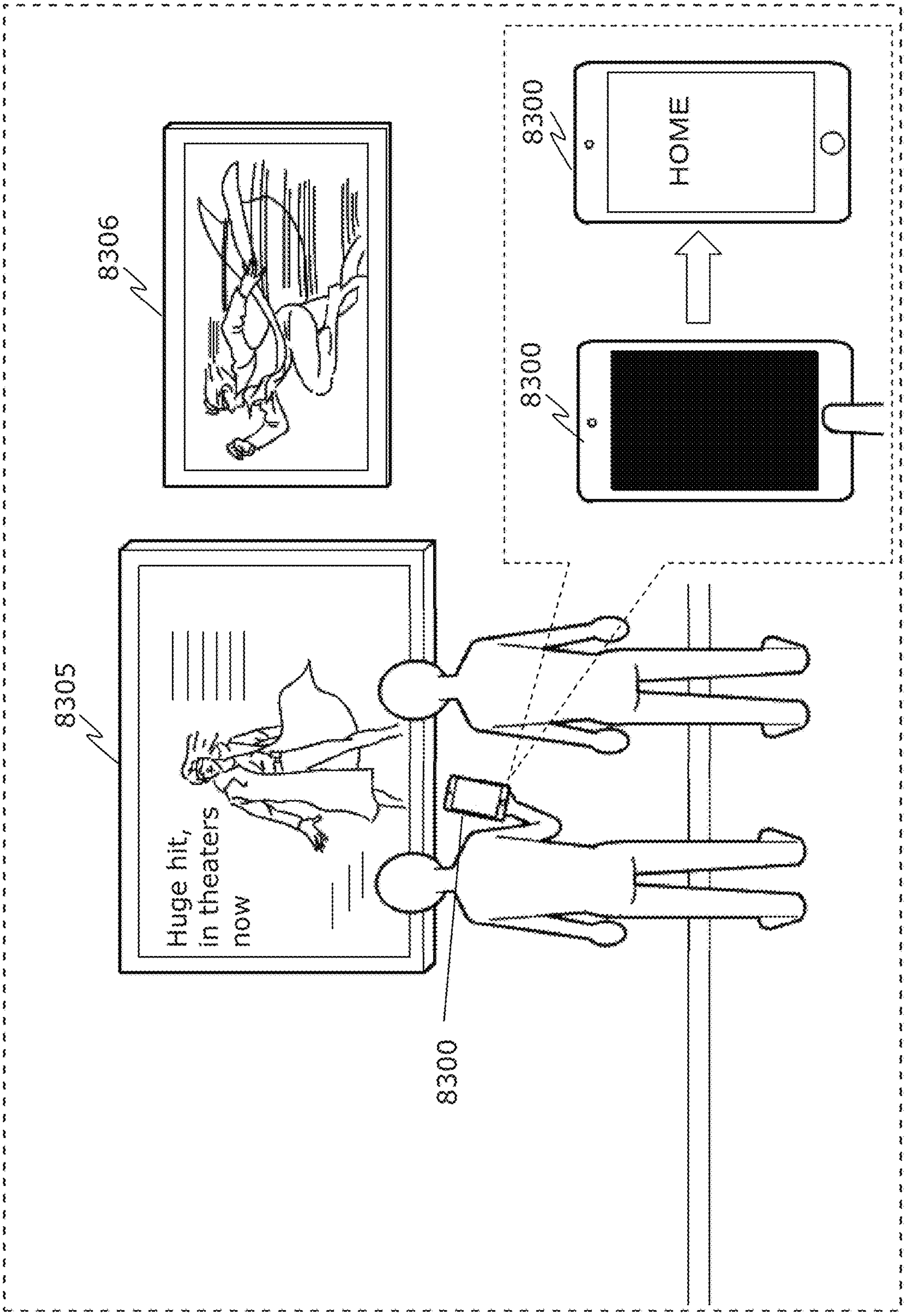

FIG. 98 is a diagram illustrating an example of operation of the receiver 8300 in the movie advertisement situation.

The user finds a signage 8305 including a movie advertisement of interest, and a signage 8306 such as a liquid crystal display for displaying movie advertisement video. The signage 8305 includes, for example, a transparent film on which an image representing the movie advertisement is drawn, and a plurality of LEDs arranged on the back side of the film and lights the film. That is, the signage 8305 brightly displays the image drawn on the film by the light emission from the plurality of LEDs, as a still image. The signage 8305 is a transmitter for transmitting a signal by changing in luminance.

Upon determining that the signage 8305 is transmitting a signal by changing in luminance, the user operates the receiver 8300 to start the communication application of the receiver 8300, as in the example illustrated in FIG. 81. Alternatively, the receiver 8300 may automatically start the communication application as in the example illustrated in FIG. 82.

Figure 99:
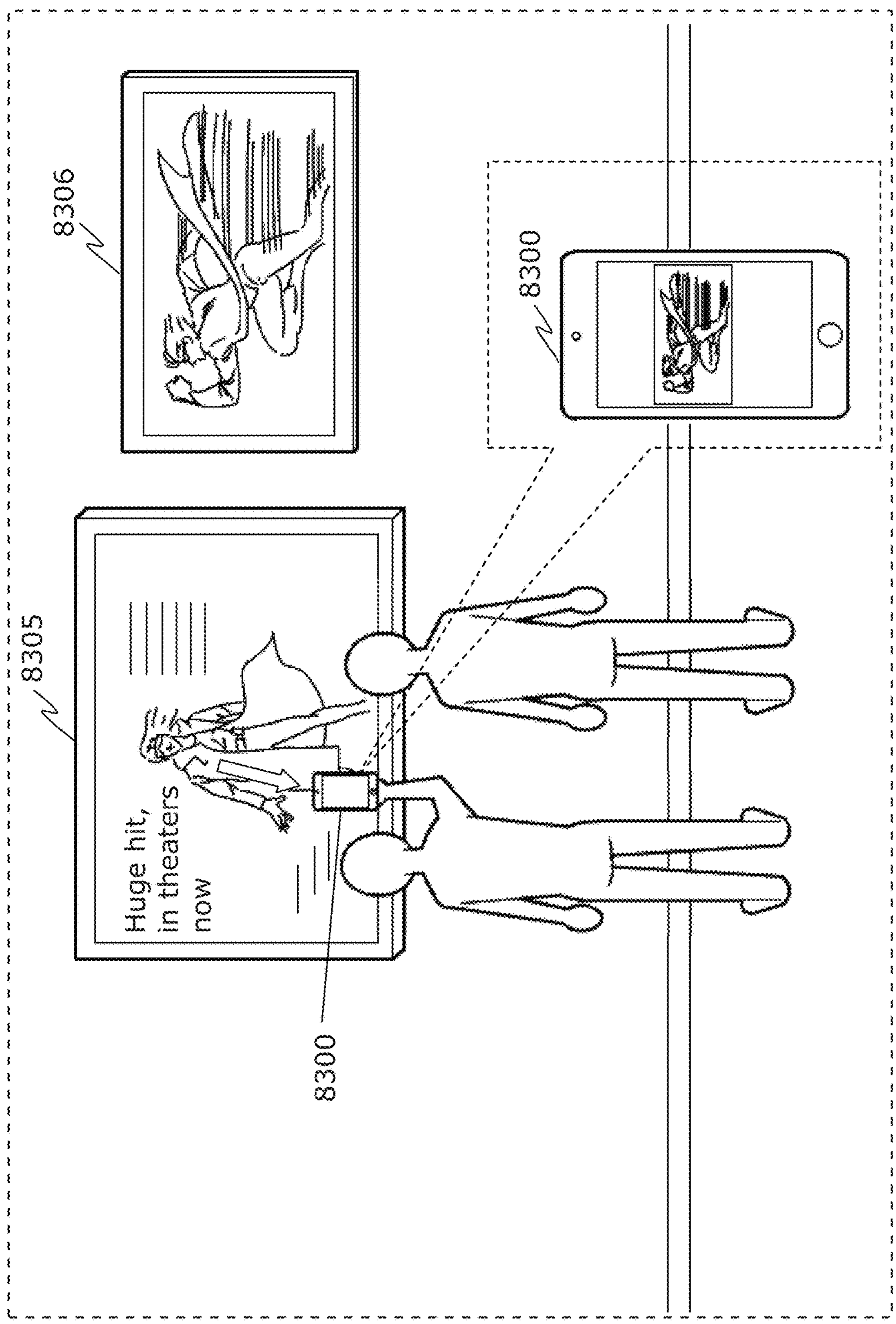

FIG. 99 is a diagram illustrating an example of next operation of the receiver 8300 in the movie advertisement situation.

The receiver 8300 captures the signage 8305, to obtain the ID of the signage 8305. The receiver 8300 transmits the ID to the server, downloads movie advertisement video data associated with the ID from the server as service information, and reproduces the video.

Figure 100:
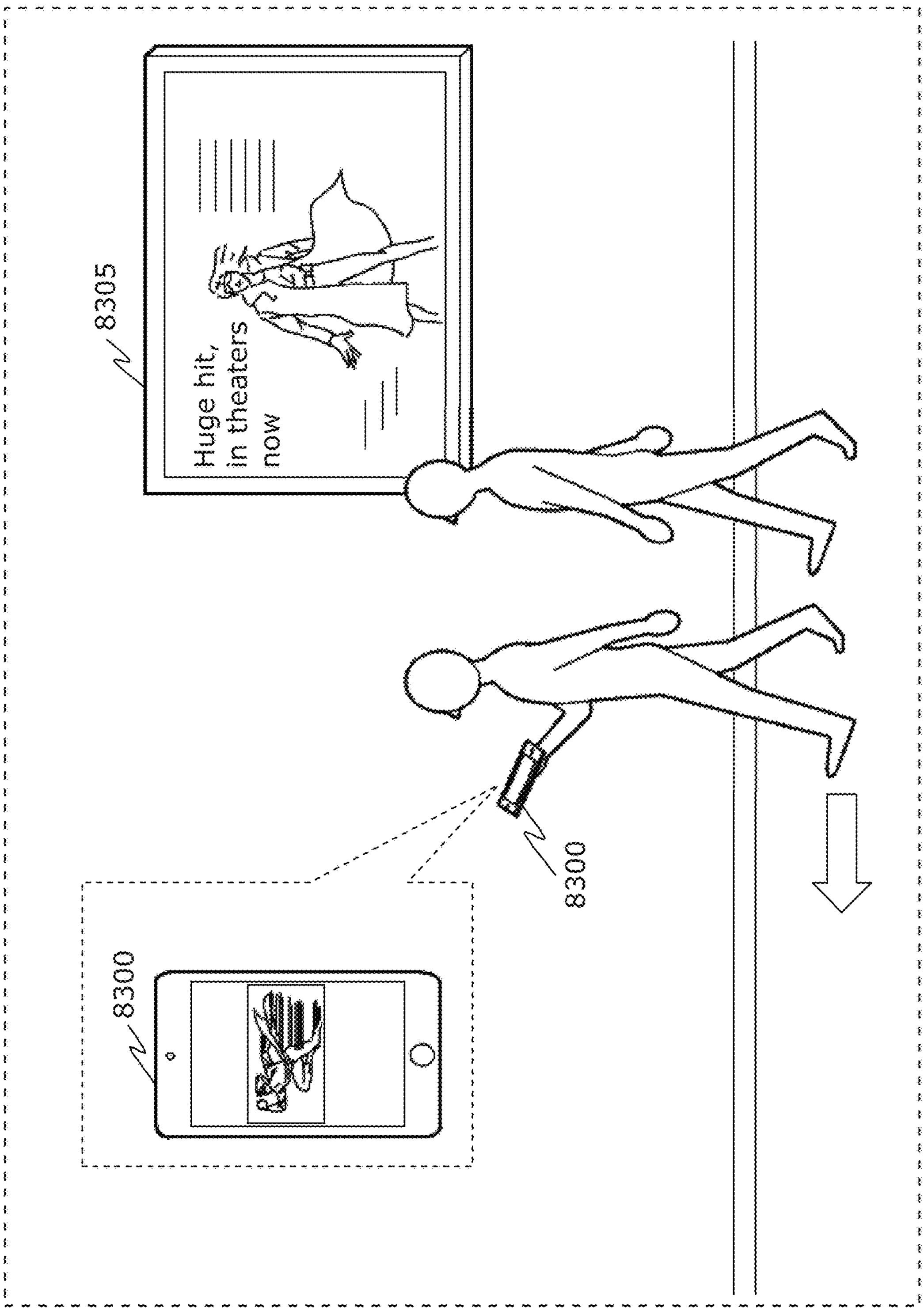
FIG. 100 is a diagram illustrating another example of imaging operation of a receiver in Embodiment 2.

FIG. 100 is a diagram illustrating an example of next operation of the receiver 8300 in the movie advertisement situation.

Video displayed by reproducing the downloaded video data as mentioned above is the same as the video displayed by the signage 8306 as an example. Accordingly, in the case where the user wants to watch the movie advertisement video, the user can watch the video in any location without stopping in front of the signage 8306.

Figure 101:
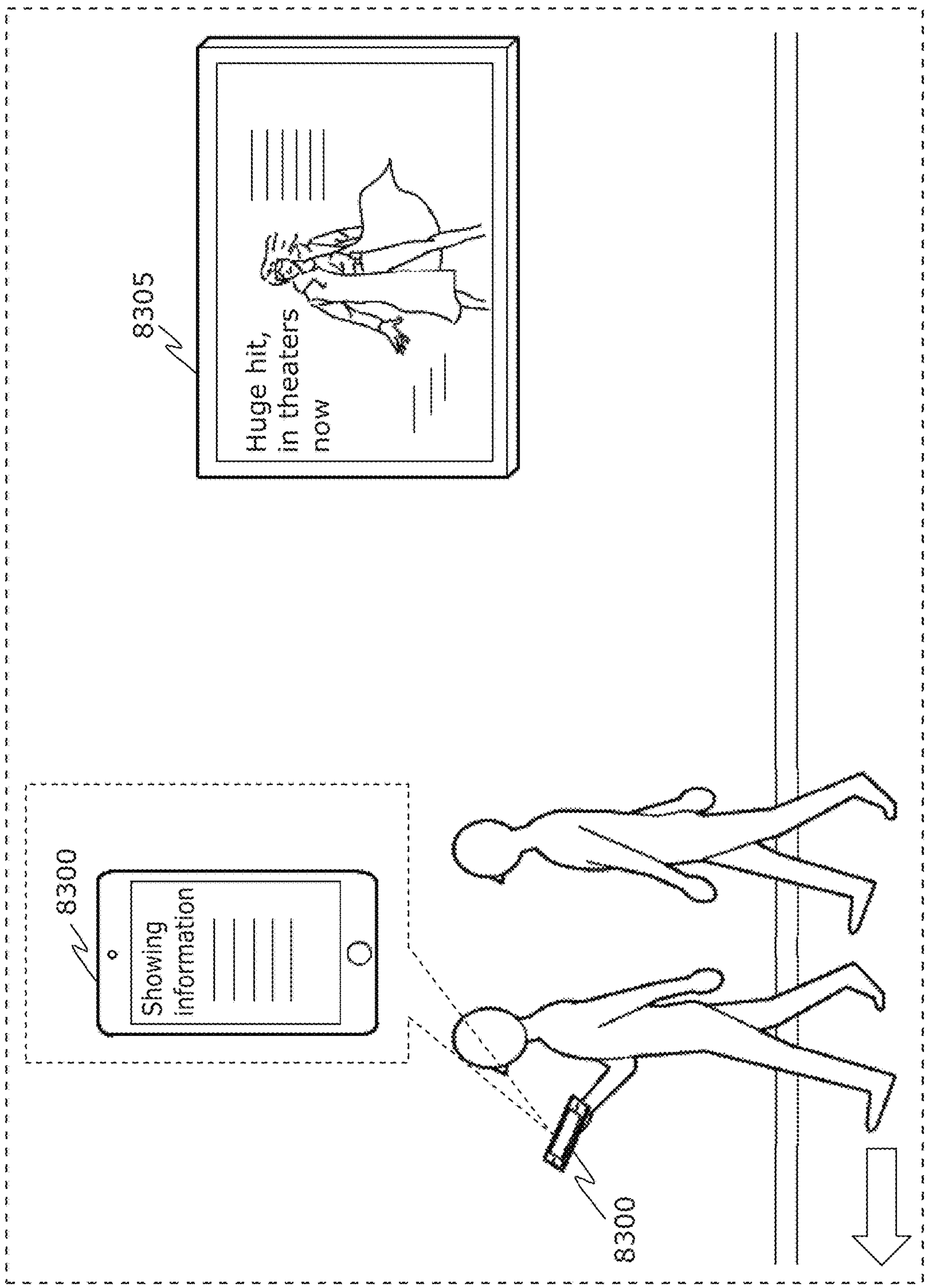

FIG. 101 is a diagram illustrating an example of next operation of the receiver 8300 in the movie advertisement situation.

The receiver 8300 may download not only the video data but also showing information indicating the showtimes of the movie and the like together with the video data, as service information. The receiver 8300 can then display the showing information to inform the user, and also share the showing information with other terminals (e.g. other smartphones).

(Situation: Museum)

An example of application in a situation where the user carrying the receiver 8300 enters a museum to appreciate each exhibit in the museum is described below, with reference to FIGS. 102 to 107.

Figure 102:
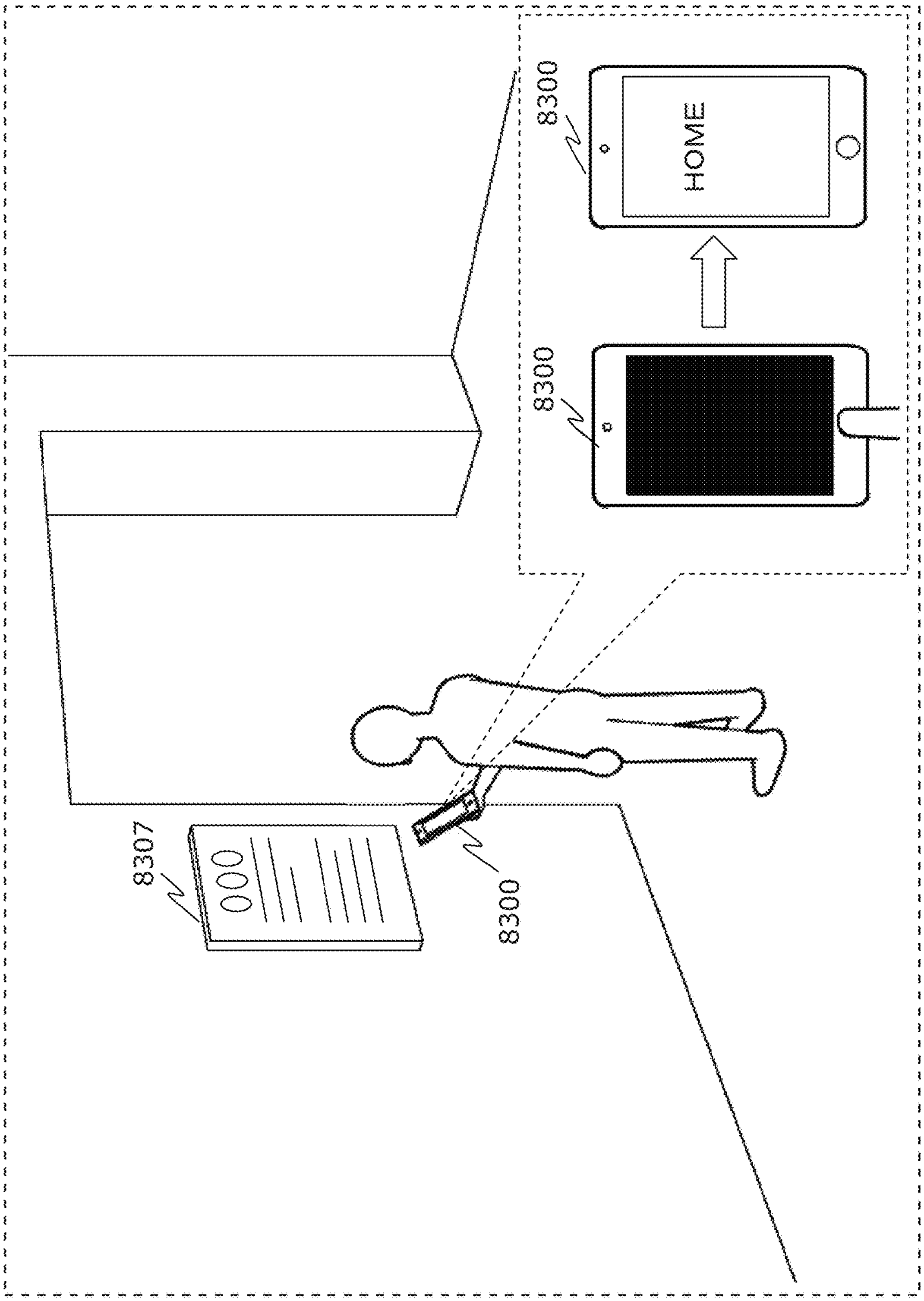

FIG. 102 is a diagram illustrating an example of operation of the receiver 8300 in the museum situation.

For example, when entering the museum, the user finds a signboard 8307 on the entrance of the museum. Upon determining that the signboard 8307 is transmitting a signal by changing in luminance, the user operates the receiver 8300 to start the communication application of the receiver 8300, as in the example illustrated in FIG. 81. Alternatively, the receiver 8300 may automatically start the communication application as in the example illustrated in FIG. 82.

Figure 103:
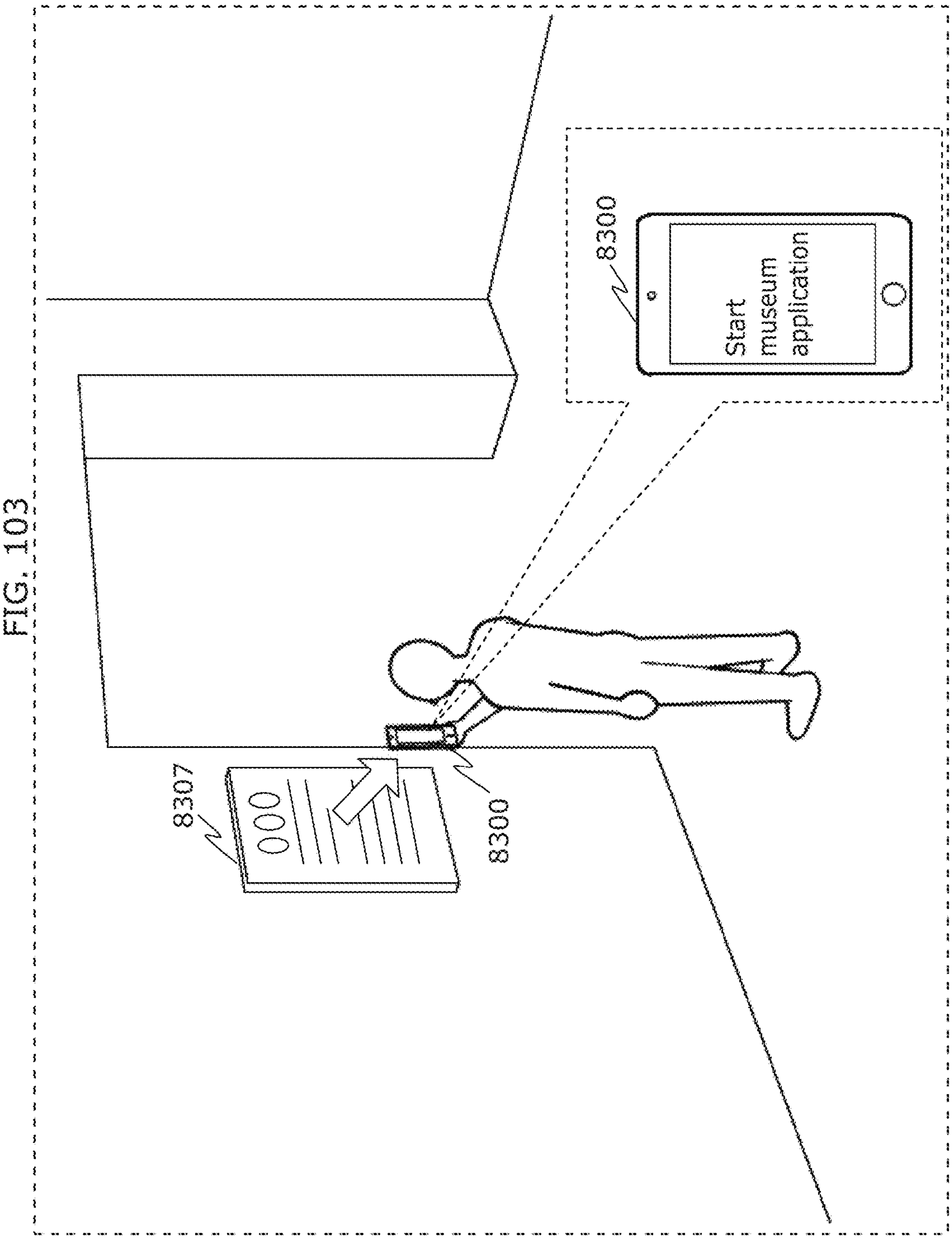

FIG. 103 is a diagram illustrating an example of operation of the receiver 8300 in the museum situation.

The receiver 8300 captures the signboard 8307, to obtain the ID of the signboard 8307. The receiver 8300 transmits the ID to the server, downloads a guide application program of the museum (hereafter referred to as "museum application") from the server as service information associated with the ID, and starts the museum application.

Figure 104:
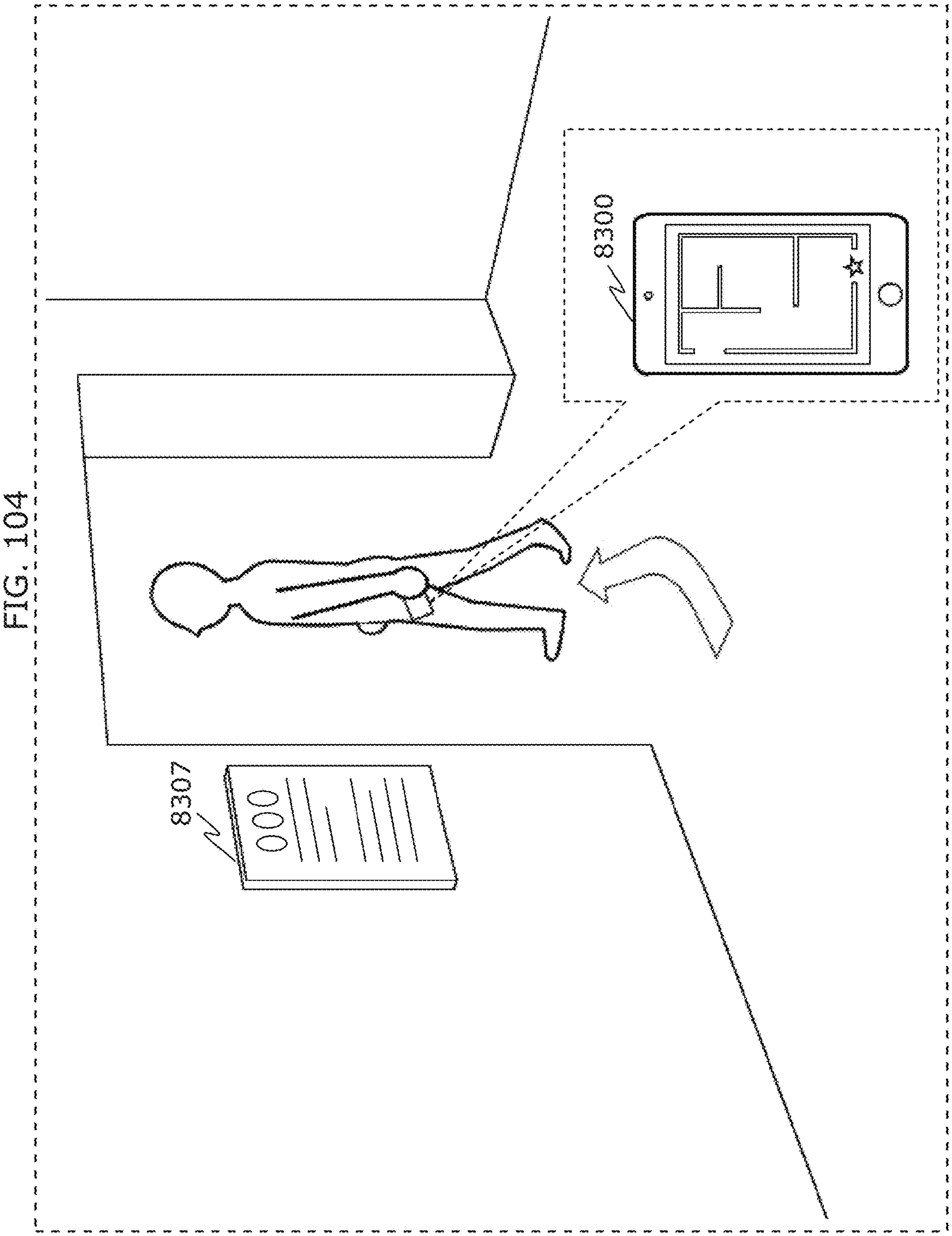

FIG. 104 is a diagram illustrating an example of next operation of the receiver 8300 in the museum situation.

After the museum application starts, the receiver 8300 displays a museum guide map according to the museum application. The receiver 8300 also specifies the position of the receiver 8300 in the museum, as in any of Embodiments 1 to 3 described above. The receiver 8300 displays the specified position (e.g. star) of the receiver 8300 in the guide map.

To specify the position as mentioned above, the receiver 8300 obtains form information indicating the size, shape, and the like of the signboard 8307 from the server, for example when downloading the museum application. The receiver 8300 specifies the relative position of the receiver 8300 to the signboard 8307 by triangulation or the like, based on the size and shape of the signboard 8307 indicated by the form information and the size and shape of the signboard 8307 shown in the captured image.

Figure 105:
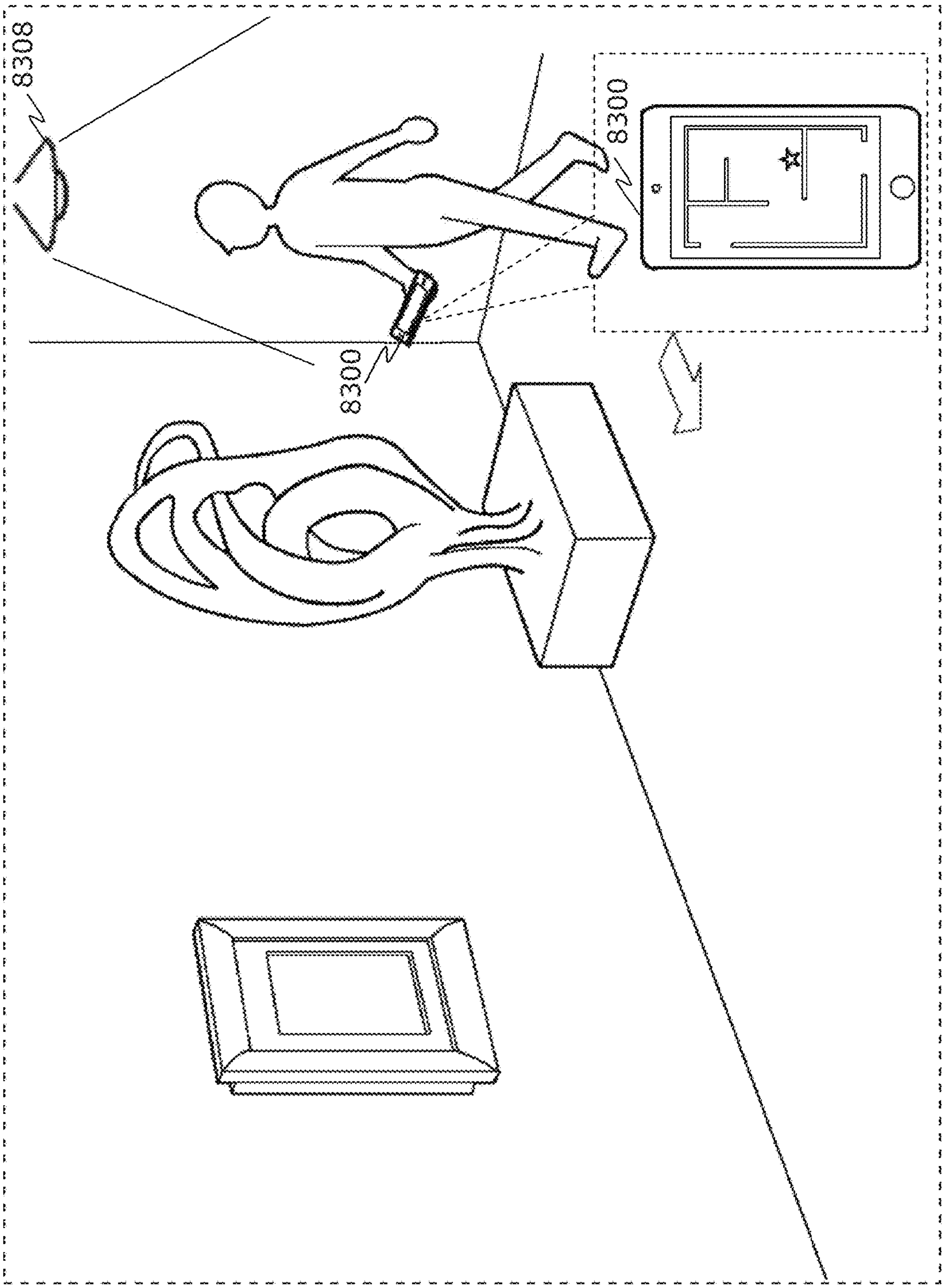

FIG. 105 is a diagram illustrating an example of next operation of the receiver 8300 in the museum situation.

When the user enters the museum, the receiver 8300 which has started the museum application as mentioned above frequently specifies the position of the receiver 8300 by performing visible light communication with a nearby transmitter such as a lighting device in the museum. For example, the receiver 8300 captures a transmitter 8308 such as a lighting device, to obtain the ID of the transmitter 8308 from the transmitter 8308. The receiver 8300 then obtains position information indicating the position of the transmitter 8308 and form information indicating the size, shape, and the like of the transmitter 8308 which are associated with the ID, from the server. The receiver 8300 estimates the relative position of the receiver 8300 to the transmitter 8308 by triangulation or the like, based on the size and shape of the transmitter 8308 indicated by the form information and the size and shape of the transmitter 8308 shown in the captured image. The receiver 8300 also specifies the position of the receiver 8300 in the museum, based on the position of the transmitter 8308 indicated by the position information obtained from the server and the estimated relative position of the receiver 8300.

Each time the position of the receiver 8300 is specified, the receiver 8300 moves the displayed star to the specified new position. The user who has entered the museum can easily know his or her position in the museum, from the guide map and the star displayed on the receiver 8300.

Figure 106:
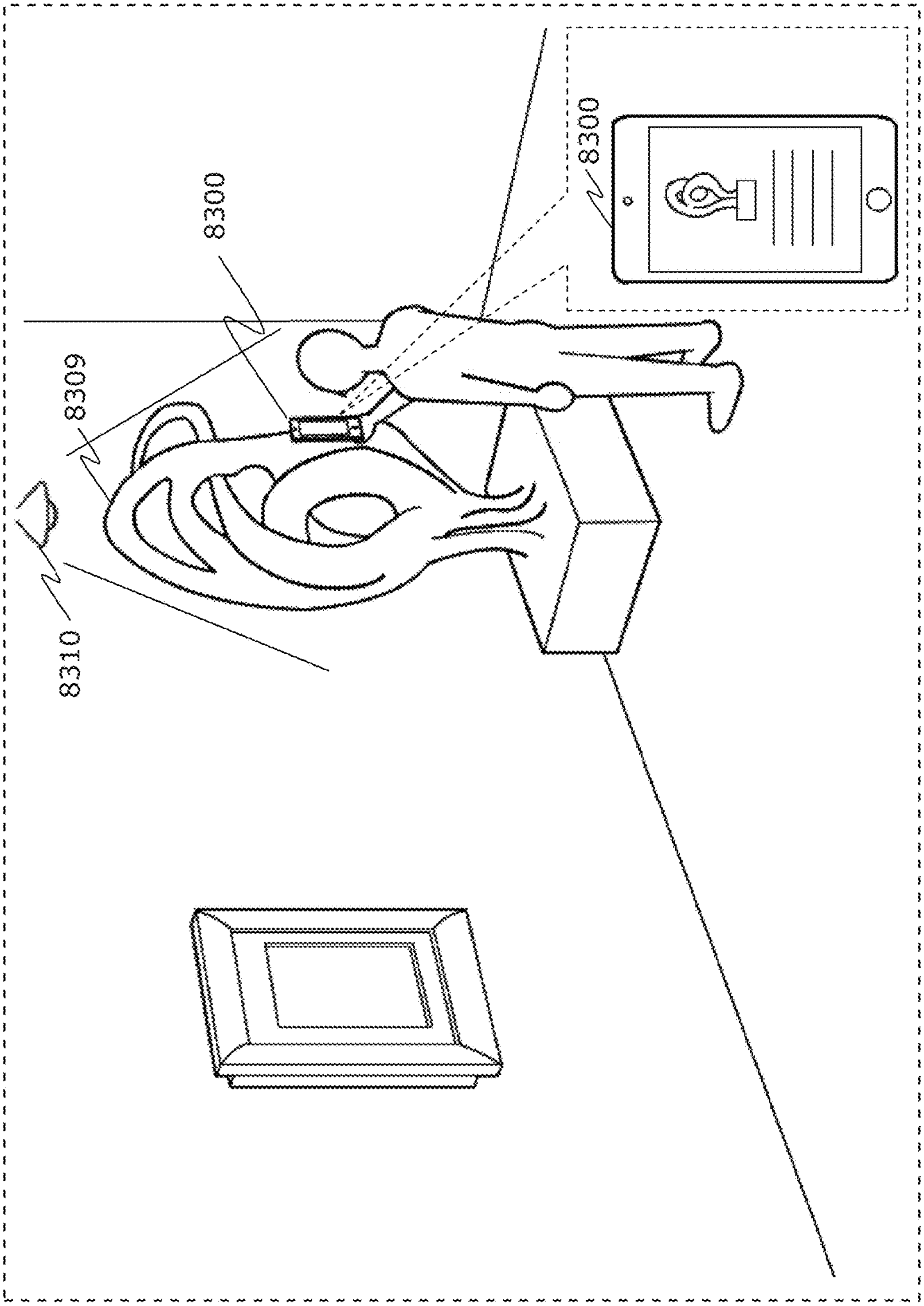

FIG. 106 is a diagram illustrating an example of next operation of the receiver 8300 in the museum situation.

The user who has entered the museum, upon finding an exhibit 8309 of interest, performs an operation of pointing the receiver 8300 at the exhibit 8309 so that the receiver 8300 can capture the exhibit 8309. Here, the exhibit 8309 is lit by light from a lighting device 8310. The lighting device 8310 is used exclusively for the exhibit 8309, and is a transmitter for transmitting a signal by changing in luminance. Accordingly, the exhibit 8309 which is lit by the light changing in luminance is indirectly transmitting the signal from the lighting device 8310.

Upon detecting the operation of pointing the receiver 8300 at the exhibit 8309 based on the output from the internal 9-axis sensor or the like, the receiver 8300 captures the exhibit 8309 to receive the signal from the lighting device 8310. The signal indicates the ID of the exhibit 8309, as an example. The receiver 8300 then obtains introduction information (service information) of the exhibit 8309 associated with the ID, from the server. The introduction information indicates a figure for introducing the exhibit 8309, and text for introduction in the language of each country such as Japanese, English, and French.

Having obtained the introduction information from the server, the receiver 8300 displays the figure and the text indicated by the introduction information. When displaying the text, the receiver 8300 extracts text of a language set by the user beforehand from among text of each language, and displays only the text of the language. The receiver 8300 may change the language according to a selection operation by the user.

Figure 107:
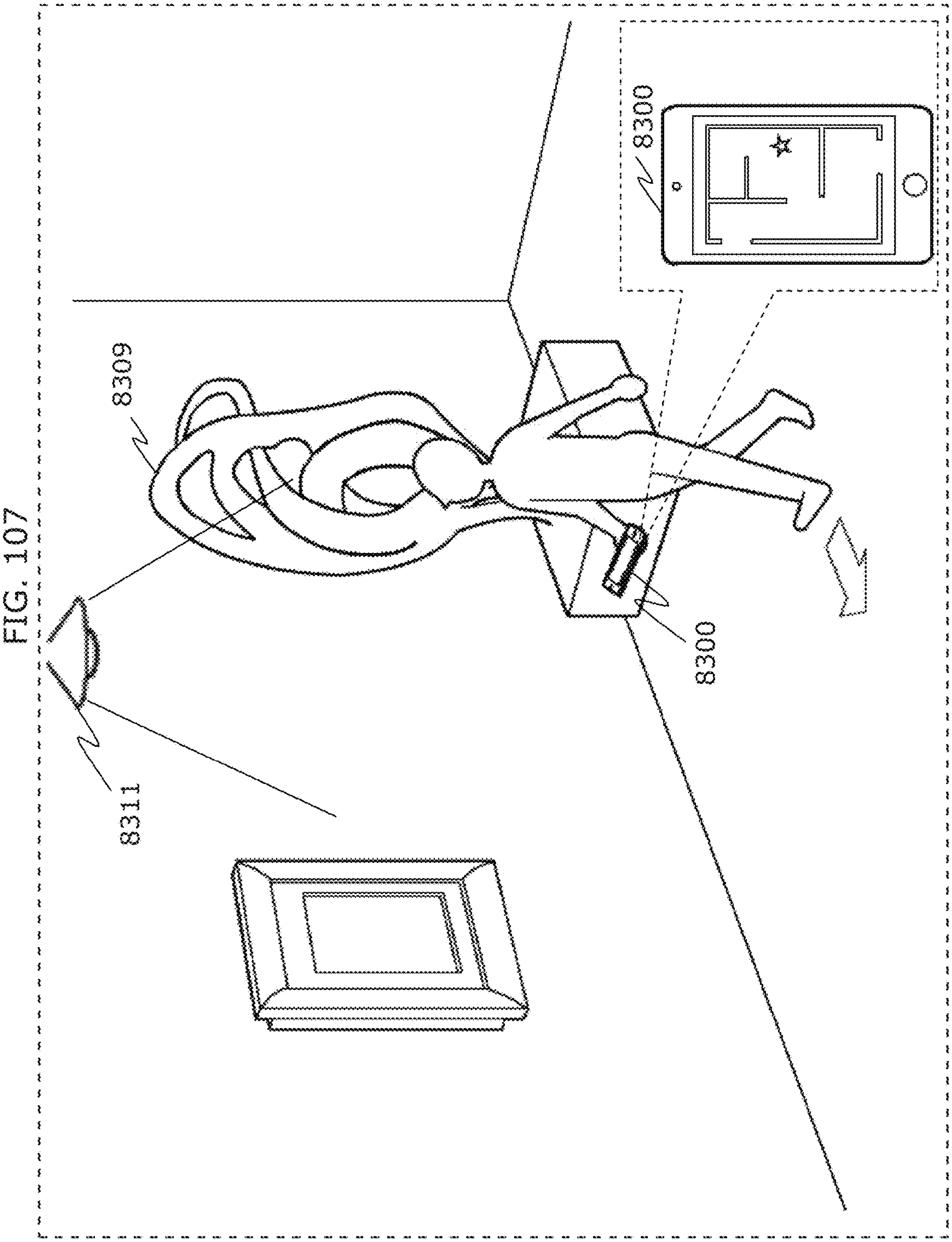

FIG. 107 is a diagram illustrating an example of next operation of the receiver 8300 in the museum situation.

After the display of the figure and the text in the introduction information ends according to a user operation, the receiver 8300 again specifies the position of the receiver 8300 by performing visible light communication with a nearby transmitter such as a lighting device (e.g. a lighting device 8311). Upon specifying the new position of the receiver 8300, the receiver 8300 moves the displayed star to the specified new position. Hence, the user who has appreciated the exhibit 8309 can easily move to the next exhibit of interest, by referring to the guide map and the star displayed on the receiver 8300.

(Situation: Bus Stop)

An example of application in a situation where the user carrying the receiver 8300 is at a bus stop is described below, with reference to FIGS. 108 to 109.

Figure 108:
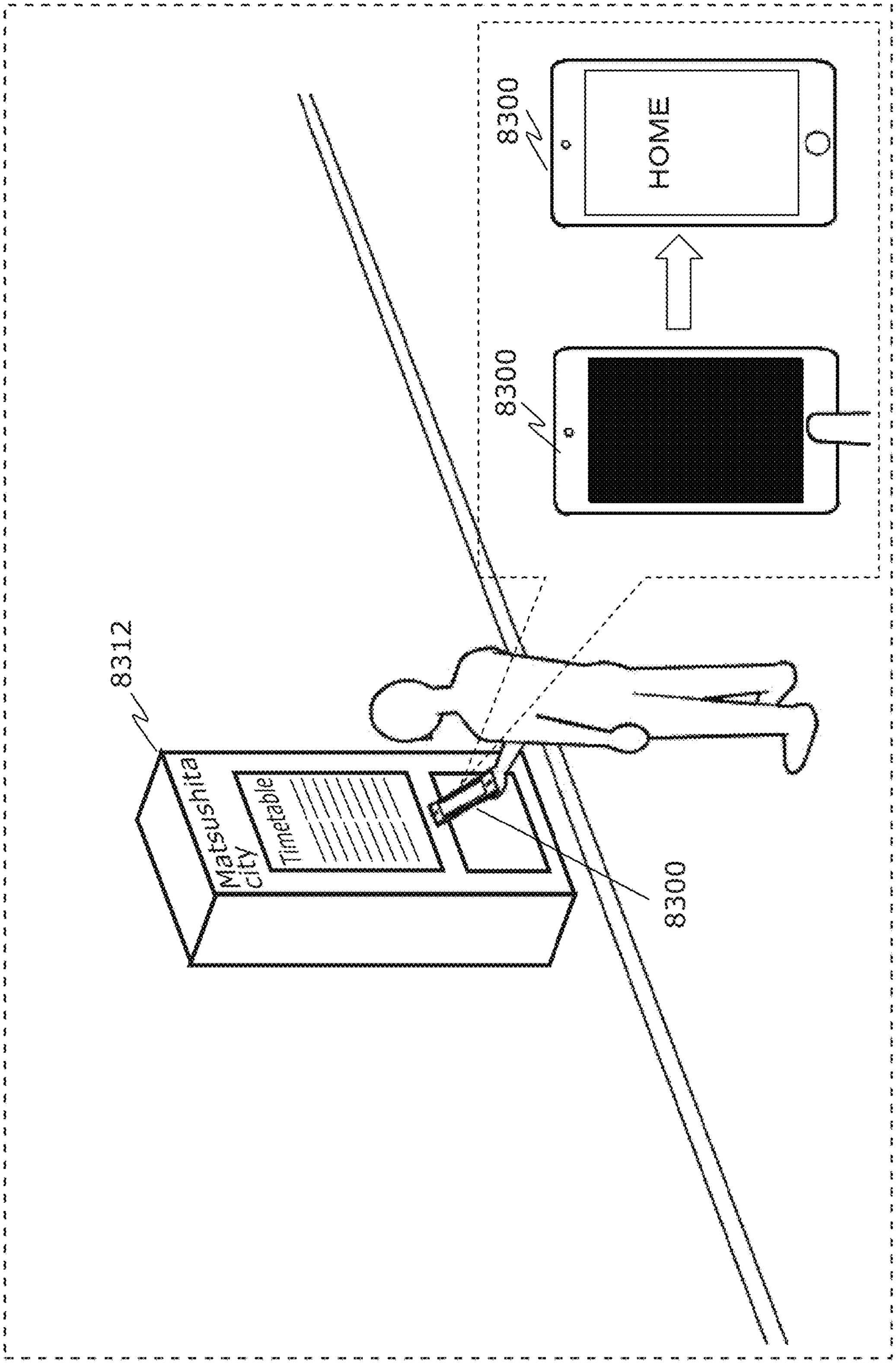

FIG. 108 is a diagram illustrating an example of operation of the receiver 8300 in the bus stop situation.

For example, the user goes to the bus stop to ride a bus. Upon determining that a sign 8312 at the bus stop is transmitting a signal by changing in luminance, the user operates the receiver 8300 to start the communication application of the receiver 8300, as in the example illustrated in FIG. 81. Alternatively, the receiver 8300 may automatically start the communication application as in the example illustrated in FIG. 82.

FIG. 109 is a diagram illustrating an example of next operation of the receiver 8300 in the bus stop situation.

The receiver 8300 captures the sign 8312, to obtain the ID of the bus stop where the sign 8312 is placed. The receiver 8300 transmits the ID to the server, and obtains operation state information associated with the ID from the server. The operation state information indicates the traffic state, and is service information indicating a service provided to the user.

Here, the server collects information from each bus operating in an area including the bus stop, to manage the operation state of each bus. Hence, upon obtaining the ID of the bus stop from the receiver 8300, the server estimates the time at which a bus arrives at the bus stop of the ID based on the managed operation state, and transmits the operation state information indicating the estimated time to the receiver 8300.

Having obtained the operation state information, the receiver 8300 displays the time indicated by the operation state information in a form such as "Arriving in 10 minutes". This enables the user to easily recognize the operation state of the bus.

(Supplementary Note)

In the case where the scan direction on the imaging side is the vertical direction (up-down direction) of a mobile terminal, when an LED lighting device is captured with a shorter exposure time, bright lines of a black and white pattern can be captured in the same direction as the scan direction for ON/OFF of the entire LED lighting device, as illustrated in (a) in FIG. 110. In (a) in FIG. 110, a vertically long LED lighting device is captured so that its longitudinal direction is perpendicular to the scan direction on the imaging side (the left-right direction of the mobile terminal), and therefore many bright lines of the black and white pattern can be captured in the same direction as the scan direction. In other words, a larger amount of information can be transmitted and received. On the other hand, in the case where the vertically long LED lighting device is captured so as to be parallel to the scan direction on the imaging side (the up-down direction of the mobile terminal) as illustrated in (b) in FIG. 110, the number of bright lines of the black and white pattern that can be captured decreases. In other words, the amount of information that can be transmitted decreases.

Thus, depending on the direction of the LED lighting device with respect to the scan direction on the imaging side, many bright lines of the black and white pattern can be captured (in the case where the vertically long LED lighting device is captured so that its longitudinal direction is perpendicular to the scan direction on the imaging side) or only a few bright lines of the black and white pattern can be captured (in the case where the vertically long LED lighting device is captured so that its longitudinal direction is parallel to the scan direction on the imaging side).

This embodiment describes a lighting device control method capable of capturing many bright lines even in the case where only a few bright lines of the black and white pattern can be captured.

FIG. 111 illustrates an example of a lighting device having a plurality of LEDs in the vertical direction, and a drive signal for the lighting device. (a) in FIG. 111 illustrates the lighting device having the plurality of LEDs in the vertical direction. Suppose each LED element corresponds to a smallest unit of horizontal stripes obtained by coding a visible light communication signal, and corresponds to a coded ON/OFF signal. By generating the black and white pattern and turning each LED element ON or OFF for lighting in this way, the black and white pattern on an LED element basis can be captured even when the scan direction on the imaging side and the longitudinal direction of the vertically long LED lighting device are parallel to each other.

(c) and (d) in FIG. 111 illustrate an example of generating the black and white pattern and turning each LED element ON or OFF for lighting. When the lighting device lights as the black and white pattern, the light may become not uniform even in a short time. In view of this, an example of generating a reverse phase pattern and performing lighting alternately between the two patterns is illustrated in (c) and (d) in FIG. 111. Each element that is ON in (c) in FIG. 111 is OFF in (d) in FIG. 111, whereas each element that is OFF in (c) in FIG. 111 is ON in (d) in FIG. 111. By lighting in the black and white pattern alternately between the normal phase pattern and the reverse phase pattern in this way, a lot of information can be transmitted and received in visible light communication, without causing the light to become not uniform and without being affected by the relation between the scan direction on the imaging side and the direction of the lighting device. The present disclosure is not limited to the case of alternately generating two types of patterns, i.e. the normal phase pattern and the reverse phase pattern, for lighting, as three or more types of patterns may be generated for lighting. FIG. 112 illustrates an example of lighting in four types of patterns in sequence.

A structure in which usually the entire LED lighting blinks ((b) in FIG. 111) and, only for a predetermined time, the black and white pattern is generated to perform lighting on an LED element basis is also available. As an example, the entire LED lighting blinks for a transmission and reception time of a predetermined data part, and subsequently lighting is performed in the black and white pattern on an LED element basis for a short time. The predetermined data part is, for instance, a data part from the first header to the next header. In this case, when the LED lighting is captured in the direction in (a) in FIG. 110, a signal is received from bright lines obtained by capturing the blink of the entire LED lighting. When the LED lighting is captured in the direction in (b) in FIG. 110, a signal is received from a light emission pattern on an LED element basis.

This embodiment is not limited to an LED lighting device, and is applicable to any device whose ON/OFF can be controlled in units of small elements like LED elements. Moreover, this embodiment is not limited to a lighting device, and is applicable to other devices such as a television, a projector, and a signage.

Though an example of lighting in the black and white pattern is described in this embodiment, colors may be used instead of the black and white pattern. As an example, in RGB, blink may be performed using only B, while R and G are constantly ON. The use of only B rather than R or G prevents recognition by humans, and therefore suppresses flicker. As another example, additive complementary colors (e.g. a red and cyan pattern, a green and magenta pattern, a yellow and blue pattern) may be used to display ON/OFF, instead of the black and white pattern. The use of additive complementary colors suppresses flicker.

Though an example of one-dimensionally arranging LED elements is described in this embodiment, LED elements may be arranged not one-dimensionally but two-dimensionally so as to be displayed like a 2D barcode.

Summary of this Embodiment

A service provision method in this embodiment is a service provision method of providing, using a terminal device that includes an image sensor having a plurality of exposure lines, a service to a user of the terminal device, the service provision method including: obtaining image data, by starting exposure sequentially for the plurality of exposure lines in the image sensor each at a different time and capturing a subject with an exposure time less than or equal to 1/480 second so that an exposure time of each of the plurality of exposure lines partially overlaps an exposure time of an adjacent one of the plurality of exposure lines; obtaining identification information of the subject, by demodulating a bright line pattern that appears in the image data, the bright line pattern corresponding to the plurality of exposure lines; and presenting service information associated with the identification information of the subject, to the user.

In this way, through the use of communication between the subject and the terminal device respectively as a transmitter and a receiver, the service information relating to the subject can be presented to the user of the terminal device. The user can thus be provided with information variable to the user in various forms, as a service. For example, in the presenting, at least one of: information indicating an advertisement, availability, or reservation status of a store relating to the subject; information indicating a discount rate of a product or a service; movie advertisement video; information indicating a showtime of a movie; information for guiding in a building; information for introducing an exhibit; and information indicating a traffic state may be presented as the service information.

For example, the service provision method may further include: transmitting, by the terminal device, the identification information of the subject to a server; and obtaining, by the terminal device, the service information associated with the identification information of the subject from the server, wherein in the presenting, the terminal device presents the obtained service information to the user.

In this way, the service information can be managed in the server in association with the identification information of the subject, which contributes to ease of maintenance such as service information update.

For example, in the transmitting, ancillary information may be transmitted to the server together with the identification information of the subject, and in the obtaining of the service information, the service information associated with the identification information of the subject and the ancillary information may be obtained.

In this way, a more suitable service for the user can be provided according to the ancillary information. For example, in the transmitting, personal information of the user, identification information of the user, number information indicating the number of people of a group including the user, or position information indicating a position of the terminal device may be transmitted as the ancillary information, as in the operation described with reference to FIGS. 84 and 97.

For example, the service provision method may further include: transmitting, by the terminal device, position information indicating a position of the terminal device to the server; and obtaining, by the terminal device, one or more sets of identification information of respective one or more devices located in a predetermined range including the position indicated by the position information and one or more sets of service information respectively associated with the one or more sets of identification information, from the server and holding the one or more sets of identification information and the one or more sets of service information, wherein in the presenting, the terminal device selects service information associated with the identification information of the subject from the one or more sets of service information held in the obtaining of the identification information, and presents the service information to the user.

In this way, when the terminal device obtains the identification information of the subject, the terminal device can obtain the service information associated with the identification information of the subject from the one or more sets of service information held beforehand and present the service information without communicating with the server or the like, as in the operation described with reference to FIG. 82 as an example. Faster service provision can therefore be achieved.

For example, the service provision method may further include: determining whether or not the user enters a store corresponding to the service information presented in the presenting, by specifying a position of the user; and in the case of determining that the user enters the store, obtaining, by the terminal device, product service information relating to a product or a service of the store from the server, and presenting the product service information to the user.

In this way, when the user enters the store, the menu of the store or the like can be automatically presented to the user as the product service information, as in the operation described with reference to FIGS. 86 to 90 as an example. This saves the need for the store staff to present the menu or the like to the user, and enables the user to make an order to the store in a simple manner.

For example, the service provision method may further include: determining whether or not the user enters a store corresponding to the service information presented in the presenting, by specifying a position of the user; and in the case of determining that the user enters the store, presenting, by the terminal device, additional service information of the store to the user, the additional service information being different depending on at least one of the position of the subject and a time at which the service information is presented.

In this way, when the subject is closer to the store which the user enters or when the time at which the user enters the store and the time at which the service information is presented (or the time at which the subject is captured) are closer to each other, service information more valuable to the user can be presented to the user as the additional service information, as in the process described with reference to FIGS. 86 to 90 as an example. Suppose each of a plurality of stores belonging to a chain is a store corresponding to the presented service information, and a sign which is the subject is displayed by one (advertisement store) of the plurality of stores. In such a case, the advertisement store is usually closest to the subject (sign) from among the plurality of stores belonging to the chain. Accordingly, when the subject is closer to the store which the user enters or when the time at which the user enters the store and the time at which the service information is presented are closer to each other, there is a high possibility that the store which the user enters is the advertisement store. In the case where there is a high possibility that the user enters the advertisement store, service information more valuable to the user can be presented to the user as the additional service information.

For example, the service provision method may further include: determining whether or not the user enters a store corresponding to the service information presented in the presenting, by specifying a position of the user; and in the case of determining that the user enters the store, presenting, by the terminal device, additional service information of the store to the user, the additional service information being different depending on the number of times the user uses a service indicated by the service information in the store.

In this way, when the number of times the service is used is larger, service information more valuable to the user can be presented to the user as the additional service information, as in the operation described with reference to FIGS. 86 to 90 as an example. For instance, when the number of uses of service information indicating 20% product price discount exceeds a threshold, additional service information indicating additional 10% discount can be presented to the user.

For example, the service provision method may further include: determining whether or not the user enters a store corresponding to the service information presented in the presenting, by specifying a position of the user; in the case of determining that the user enters the store, determining whether or not a process including the obtaining of image data, the obtaining of identification information, and the presenting is also performed for all subjects associated with the store other than the subject; and presenting, by the terminal device, additional service information of the store to the user in the case of determining that the process is performed.

In this way, for instance in the case where the store displays several subjects as signs and the obtaining of image data, the obtaining of identification information, and the presenting have been performed for all of these signs, service information most valuable to the user can be presented to the user as the additional service information, as in the operation described with reference to FIGS. 86 to 90 as an example.

For example, the service provision method may further include: determining whether or not the user enters a store corresponding to the service information presented in the presenting, by specifying a position of the user; and in the case of determining that the user enters the store, presenting, by the terminal device, additional service information of the store to the user, the additional service information being different depending on a difference between a time at which the service information is presented and a time at which the user enters the store.

In this way, when the difference between the time at which the service information is presented (or the time at which the subject is captured) and the time at which the user enters the store is smaller, service information more valuable to the user can be presented to the user as the additional service information, as in the operation described with reference to FIGS. 86 to 90 as an example. That is, the time from when the service information is presented to the user as a result of capturing the subject to when the user enters the store is shorter, the user is additionally provided with a more valuable service.

For example, the service provision method may further include: determining whether or not the user uses a service indicated by the service information in a store corresponding to the service information presented in the presenting; and accumulating, each time the service information is presented, a determination result in the determining, and analyzing an advertising effect of the subject based on an accumulation result.

In this way, in the case where the service information indicates a service such as 20% product price discount or the like, it is determined whether or not the service is used by electronic payment or the like, as in the operation described with reference to FIGS. 86 to 90 as an example. Thus, each time the service is provided to the user upon capturing the subject, whether or not the service is used is determined. As a result, the advertising effect of the subject is analyzed as high in the case where, for example, it is frequently determined that the service is used. Hence, the advertising effect of the subject can be appropriately analyzed based on the use result.

For example, in the analyzing, at least one of a position of the subject, a time at which the service information is presented, a position of the store, and a time at which the user enters the store may be accumulated together with the determination result in the determining, to analyze the advertising effect of the subject based on an accumulation result.

In this way, the advertising effect of the subject can be analyzed in more detail. For instance, in the case where the position of the subject is changed, it is possible to compare the advertising effect between the original position and the changed position, as a result of which the subject can be displayed at a position with higher advertising effectiveness.

For example, the service provision method may further include: determining whether or not the user uses a service indicated by the service information in a store corresponding to the service information presented in the presenting; in the case of determining that the user uses the service, determining whether or not a used store which is the store where the service is used is a specific store associated with the subject; and in the case of determining that the used store is not the specific store, returning at least a part of an amount paid for using the service in the store, to the specific store using electronic commerce.

In this way, even in the case where the service is not used in the specific store (e.g. the advertisement store displaying the sign which is the subject), the specific store can earn a profit for the cost of installing the sign which is the subject, as in the operation described with reference to FIGS. 86 to 90 as an example.

For example, in the presenting, the terminal device may present the service information for introducing the subject to the user in the case where the subject lit by light changing in luminance is captured in the obtaining of the image data, and the terminal device may present the service information for guiding in a building in which the subject is placed in the case where a lighting device changing in luminance is captured as the subject in the obtaining of the image data.

In this way, a guide service in a building such as a museum and an introduction service for an exhibit which is the subject can be appropriately provided to the user, as in the operation described with reference to FIGS. 105 and 106 as an example.

An information communication method in this embodiment is an information communication method of obtaining information from a subject having a plurality of light emitting elements, the information communication method including: setting an exposure time of an image sensor so that, in an image obtained by capturing the subject by the image sensor, a bright line corresponding to an exposure line included in the image sensor appears according to a change in luminance of the subject; obtaining a bright line image by capturing, by the image sensor with the set exposure time, the subject in which the plurality of light emitting elements all change in luminance in the same manner according to a pattern of the change in luminance for representing first information, the bright line image being an image including the bright line; obtaining the first information by demodulating data specified by a pattern of the bright line included in the obtained bright line image; and obtaining second information, by capturing the subject in which each of the plurality of light emitting elements emits light with one of two different luminance values and demodulating data specified by a light and dark sequence of luminance along a direction parallel to the exposure line, the light and dark sequence being shown in an image obtained by capturing the subject.

Alternatively, an information communication method in this embodiment is an information communication method of transmitting a signal using a change in luminance, the information communication method including: determining a pattern of the change in luminance, by modulating a first signal to be transmitted; transmitting the first signal, by all of a plurality of light emitting elements in a light emitter changing in luminance in the same manner according to the determined pattern of the change in luminance; and transmitting a second signal to be transmitted, by each of the plurality of light emitting elements emitting light with one of two different luminance values so that a light and dark sequence of luminance appears in a space where the light emitter is placed.

In this way, even when a lighting device which is the subject or the light emitter has a long and thin shape including a plurality of LEDs arranged in a line, the receiver can appropriately obtain the information or signal from the lighting device regardless of the imaging direction, as in the operation described with reference to FIGS. 110 to 112 as an example. In detail, in the case where the exposure line (the operation direction on the imaging side) of the image sensor included in the receiver is not parallel to the arrangement direction of the plurality of LEDs, the receiver can appropriately obtain the information or signal from the luminance change of the entire lighting device. Even in the case where the exposure line is parallel to the arrangement direction, the receiver can appropriately obtain the information or signal from the light and dark sequence of luminance along the direction parallel to the exposure line. In other words, the dependence of information reception on the imaging direction can be reduced.

Embodiment 5

This embodiment describes each example of application using a receiver such as a smartphone and a transmitter for transmitting information as a blink pattern of an LED, an organic EL device, or the like in Embodiments 1 to 4 described above.

FIG. 113 is a diagram illustrating an example of operation of a transmitter in Embodiment 5.

Transmitters 8321, 8322, and 8323 each have the same function as the transmitter in any of Embodiments 1 to 4 described above, and is a lighting device that transmits a signal by changing in luminance (visible light communication). The transmitters 8321 to 8323 each transmit a signal by changing in luminance at a different frequency. For example, the transmitter 8321 transmits the ID "1000" of the transmitter 8321, by changing in luminance at frequency a (e.g. 9200 Hz). The transmitter 8322 transmits the ID "2000" of the transmitter 8322, by changing in luminance at frequency b (e.g. 9600 Hz). The transmitter 8323 transmits the ID "3000" of the transmitter 8322, by changing in luminance at frequency c (e.g. 10000 Hz).

A receiver captures (visible light imaging) the transmitters 8321 to 8323 so that the transmitters 8321 to 8323 are all included in the angle of view, in the same way as in Embodiments 1 to 4. A bright line pattern corresponding to each transmitter appears in an image obtained as a result of image capture. It is possible to specify, from the bright line pattern, the luminance change frequency of the transmitter corresponding to the bright line pattern.

Suppose the frequencies of the transmitters 8321 to 8323 are the same. In such a case, the same frequency is specified from the bright line pattern corresponding to each transmitter. In the case where these bright line patterns are adjacent to each other, it is difficult to distinguish between the bright line patterns because the frequency specified from each of the bright line patterns is the same.

In view of this, the transmitters 8321 to 8323 each change in luminance at a different frequency, as mentioned above. As a result, the receiver can easily distinguish between the bright line patterns and, by demodulating data specified by each bright line pattern, appropriately obtain the ID of each of the transmitters 8321 to 8323. Thus, the receiver can appropriately distinguish between the signals from the transmitters 8321 to 8323.

The frequency of each of the transmitters 8321 to 8323 may be set by a remote control, and may be set randomly. Each of the transmitters 8321 to 8323 may communicate with its adjacent transmitter, and automatically set the frequency of the transmitter so as to be different from the frequency of the adjacent transmitter.

FIG. 114 is a diagram illustrating an example of operation of a transmitter in Embodiment 5.

In the above example, each transmitter changes in luminance at a different frequency. In the case where there are at least five transmitters, however, each transmitter need not change in luminance at a different frequency. In detail, each of the at least five transmitters may change in luminance at any one of four types of frequencies.

For example as illustrated in FIG. 114, even in a situation where the bright line patterns (rectangles in FIG. 114) respectively corresponding to the at least five transmitters are adjacent, the same number of types of frequencies as the number of transmitters are not needed. So long as there are four types (frequencies a, b, c, and d), it can be ensured that the frequencies of adjacent bright line patterns are different. This is reasoned by the four color theorem or the four color problem.

In detail, in this embodiment, each of the plurality of transmitters changes in luminance at any one of at least four types of frequencies, and two or more light emitters of the plurality of transmitters change in luminance at the same frequency. Moreover, the plurality of transmitters each change in luminance so that the luminance change frequency is different between all transmitters (bright line patterns as transmitter images) which, in the case where the plurality of transmitters are projected on the light receiving surface of the image sensor of the receiver, are adjacent to each other on the light receiving surface.

FIG. 115 is a diagram illustrating an example of operation of a transmitter in Embodiment 5.

A transmitter changes in luminance to output high-luminance light (H) or low-luminance light (L) per predetermined time unit (slot), thereby transmitting a signal. Here, the transmitter transmits a signal for each block made up of a header and a body. The header is expressed as (L, H, L, H, L, H, H) using seven slots, as illustrated in FIG. 79A as an example. The body is made up of a plurality of symbols (00, 01, 10, or 11), where each symbol is expressed using four slots (4-value PPM). The block is expressed using a predetermined number (19 in the example in FIG. 115) of slots. For instance, an ID is obtained by combining the body included in each of four blocks. The block may instead be expressed using 33 slots.

A bright line pattern obtained by image capture by a receiver includes a pattern (header pattern) corresponding to the header and a pattern (data pattern) corresponding to the body. The data pattern does not include the same pattern as the header pattern. Accordingly, the receiver can easily find the header pattern from the bright line pattern, and measure the number of pixels between the header pattern and the next header pattern (the number of exposure lines corresponding to the block). Since the number of slots per block (19 in the example in FIG. 115) is set to a fixed number regardless of the frequency, the receiver can specify the frequency (the inverse of the duration of one slot) of the transmitter according to the measured number of pixels. That is, the receiver specifies a lower frequency when the number of pixels is larger, and a higher frequency when the number of pixels is smaller.

Thus, by capturing the transmitter, the receiver can obtain the ID of the transmitter, and also specify the frequency of the transmitter. Through the use of the specified frequency, the receiver can determine whether or not the obtained ID is correct, that is, perform error detection on the ID. In detail, the receiver calculates a hash value for the ID, and compares the hash value with the specified frequency. In the case where the hash value and the frequency match, the receiver determines that the obtained ID is correct. In the case where the hash value and the frequency do not match, the receiver determines that the obtained ID is incorrect (error). For instance, the receiver uses the remainder when dividing the ID by a predetermined divisor, as the hash value. Conversely, the transmitter transmits the ID, by changing in luminance at the frequency (the inverse of the duration of one slot) of the same value as the hash value for the ID.

FIG. 116 is a diagram illustrating an example of operation of a transmitter and a receiver in Embodiment 5.

The transmitter may change in luminance using an arbitrary frequency, instead of using the frequency of the same value as the hash value as mentioned above. In this case, the transmitter transmits a signal indicating a value different from the ID of the transmitter. For example, in the case where the ID of the transmitter is “100” and the transmitter uses 2 kHz as an arbitrary frequency, the transmitter transmits the signal “1002” that combines the ID and the frequency. Likewise, in the case where the ID of another transmitter is “110” and this other transmitter uses 1 kHz as an arbitrary frequency, the other transmitter transmits the signal “1101” that combines the ID and the frequency.

In such a case, the receiver uses the value of the last digit of the signal obtained from the transmitter for error detection, and extracts the value of the other digits as the ID of the transmitter. The receiver compares the frequency specified from the luminance pattern and the value of the last digit of the obtained signal. In the case where the value of the last digit and the frequency match, the receiver determines that the extracted ID is correct. In the case where the value of the last digit and the frequency do not match, the receiver determines that the extracted ID is incorrect (error).

In this way, the degree of freedom in setting the luminance change frequency in the transmitter can be increased, while enabling error detection in the receiver.

FIG. 117 is a diagram illustrating an example of operation of a receiver in Embodiment 5.

As illustrated in FIG. 117, there is the case where, in an image obtained by image capture (visible light imaging) by the receiver, a part of a bright line pattern 8327*a* and a part of a bright line pattern 8327*b* overlap each other. In such a case, the receiver does not demodulate data from an overlapping part 8327*c* of the bright line patterns 8327*a* and 8327*b*, and demodulates data from the parts of the bright line patterns 8327*a* and 8327*b* other than the part 8327*c*. By doing so, the receiver can obtain an appropriate ID from each of the bright line patterns 8327_a_ and 8327_b_.

FIG. 118 is a diagram illustrating an example of operation of a receiver in Embodiment 5.

The transmitter switches, for each block as an example, the luminance change frequency for transmitting the block, as illustrated in (a) in FIG. 118. This enables the receiver to detect the block boundary more easily.

Moreover, the transmitter uses different frequencies as the luminance change frequency for transmitting the header of the block and the luminance change frequency for transmitting the body of the block as an example, as illustrated in (b) in FIG. 118. This prevents the same pattern as the header from occurring in the body. As a result, the receiver can distinguish between the header and the body more appropriately.

FIG. 119 is a diagram illustrating an example of operation of a system including a transmitter, a receiver, and a server in Embodiment 5.

The system in this embodiment includes a transmitter 8331, a receiver 8332, and a server 8333. The transmitter 8331 has the same function as the transmitter in any of Embodiments 1 to 4 described above, and is a lighting device that transmits the ID of the transmitter 8331 by changing in luminance (visible light communication). The receiver 8332 has the same function as the receiver in any of Embodiments 1 to 4 described above, and obtains the ID of the transmitter 8331 from the transmitter 8331 by capturing the transmitter 8331 (visible light imaging). The server 8333 communicates with the transmitter 8331 and the receiver 8332 via a network such as the Internet.

Note that, in this embodiment, the ID of the transmitter 8331 is fixed without a change. Meanwhile, the frequency used for the luminance change (visible light communication) of the transmitter 8331 can be arbitrarily changed by setting.

In such a system, first the transmitter 8331 registers the frequency used for the luminance change (visible light communication), in the server 8333. In detail, the transmitter 8331 transmits the ID of the transmitter 8331, registered frequency information indicating the frequency of the transmitter 8331, and related information relating to the transmitter 8331, to the server 8333. Upon receiving the ID, registered frequency information, and related information of the transmitter 8331, the server 8333 records them in association with each other. That is, the ID of the transmitter 8331, the frequency used for the luminance change of the transmitter 8331, and the related information are recorded in association with each other. The frequency used for the luminance change of the transmitter 8331 is registered in this way.

Next, the transmitter 8331 transmits the ID of the transmitter 8331, by changing in luminance at the registered frequency. The receiver 8332 captures the transmitter 8331 to obtain the ID of the transmitter 8331, and specifies the luminance change frequency of the transmitter 8331 as mentioned above.

The receiver 8332 then transmits the obtained ID and specified frequency information indicating the specified frequency, to the server 8333. Upon receiving the ID and the specified frequency information transmitted from the receiver 8332, the server 8333 searches for the frequency (the frequency indicated by the registered frequency information) recorded in association with the ID, and determines whether or not the recorded frequency and the frequency indicated by the specified frequency information match. In the case of determining that the frequencies match, the server 8333 transmits the related information (data) recorded in association with the ID and the frequency, to the receiver 8332.

If the frequency specified by the receiver 8332 does not match the frequency registered in the server 8333, the related information is not transmitted from the server 8333 to the receiver 8332. Therefore, by changing the frequency registered in the server 8333 according to need, it is possible to prevent a situation where, once the receiver 8332 has obtained the ID from the transmitter 8331, the receiver 8332 can receive the related information from the server 8333 at any time. In detail, by changing the frequency registered in the server 8333 (i.e. the frequency used for the luminance change), the transmitter 8331 can prohibit the receiver 8332 that has obtained the ID before the change, from obtaining the related information. In other words, by changing the frequency, it is possible to set a time limit for the obtainment of the related information. As an example, in the case where the user of the receiver 8332 stays at a hotel in which the transmitter 8331 is installed, an administrator in the hotel changes the frequency after the stay. Hence, the receiver 8332 can obtain the related information only on the date when the user stays at the hotel, and is prohibited from obtaining the related information after the stay.

The server 8333 may register a plurality of frequencies in association with one ID. For instance, each time the server 8333 receives the registered frequency information from the receiver 8332, the server 8333 registers the frequencies indicated by four latest sets of registered frequency information, in association with the ID. This allows even the receiver 8332 which obtained the ID in the past, to obtain the related information from the server 8333 until the frequency is changed three times. The server 8333 may also manage, for each registered frequency, the time at which or period during which the frequency is set in the transmitter 8331. In such a case, upon receiving the ID and the specified frequency information from the receiver 8332, the server 8333 can specify the period during which the receiver 8332 obtains the ID, by referring to the time period and the like managed for the frequency indicated by the specified frequency information.

FIG. 120 is a block diagram illustrating a structure of a transmitter in Embodiment 5.

A transmitter 8334 has the same function as the transmitter in any of Embodiments 1 to 4 described above, and includes a frequency storage unit 8335, an ID storage unit 8336, a check value storage unit 8337, a check value comparison unit 8338, a check value calculation unit 8339, a frequency calculation unit 8340, a frequency comparison unit 8341, a transmission unit 8342, and an error reporting unit 8343.

The frequency storage unit 8335 stores the frequency used for the luminance change (visible light communication). The ID storage unit 8336 stores the ID of the transmitter 8334. The check value storage unit 8337 stores a check value for determining whether or not the ID stored in the ID storage unit 8336 is correct.

The check value calculation unit 8339 reads the ID stored in the ID storage unit 8336, and applies a predetermined function to the ID to calculate a check value (calculated check value) for the ID. The check value comparison unit 8338 reads the check value stored in the check value storage unit 8337, and compares the check value with the calculated check value calculated by the check value calculation unit 8339. In the case of determining that the calculated check value is different from the check value, the check value comparison unit 8338 notifies an error to the error reporting unit 8343. For example, the check value storage unit 8337 stores the value "0" indicating that the ID stored in the ID storage unit 8336 is an even number, as the check value. The check value calculation unit 8339 reads the ID stored in the ID storage unit 8336, and divides it by the value "2" to calculate the remainder as the calculated check value. The check value comparison unit 8338 compares the check value "0" and the calculated check value which is the remainder of the division mentioned above.

The frequency calculation unit 8340 reads the ID stored in the ID storage unit 8336 via the check value calculation unit 8339, and calculates the frequency (calculated frequency) from the ID. For instance, the frequency calculation unit 8340 divides the ID by a predetermined value, to calculate the remainder as the frequency. The frequency comparison unit 8341 compares the frequency (stored frequency) stored in the frequency storage unit 8335 and the calculated frequency. In the case of determining that the calculated frequency is different from the stored frequency, the frequency comparison unit 8341 notifies an error to the error reporting unit 8343.

The transmission unit 8342 transmits the ID stored in the ID storage unit 8336, by changing in luminance at the calculated frequency calculated by the frequency calculation unit 8340.

The error reporting unit 8343, when notified of the error from at least one of the check value comparison unit 8338 and the frequency comparison unit 8341, reports the error by buzzer sound, blink, or lighting. In detail, the error reporting unit 8343 includes a lamp for error reporting, and reports the error by lighting or blinking the lamp. Alternatively, when the power switch of the transmitter 8334 is turned on, the error reporting unit 8343 reports the error by blinking, at a frequency perceivable by humans, a light source that changes in luminance to transmit a signal such as an ID, for a predetermined period (e.g. 10 seconds).

Thus, whether or not the ID stored in the ID storage unit 8336 and the frequency calculated from the ID are correct is checked, with it being possible to prevent erroneous ID transmission and luminance change at an erroneous frequency.

FIG. 121 is a block diagram illustrating a structure of a receiver in Embodiment 5.

A receiver 8344 has the same function as the receiver in any of Embodiments 1 to 4 described above, and includes a light receiving unit 8345, a frequency detection unit 8346, an ID detection unit 8347, a frequency comparison unit 8348, and a frequency calculation unit 8349.

The light receiving unit 8345 includes an image sensor as an example, and captures (visible light imaging) a transmitter that changes in luminance to obtain an image including a bright line pattern. The ID detection unit 8347 detects the ID of the transmitter from the image. That is, the ID detection unit 8347 obtains the ID of the transmitter, by demodulating data specified by the bright line pattern included in the image. The frequency detection unit 8346 detects the luminance change frequency of the transmitter, from the image. That is, the frequency detection unit 8346 specifies the frequency of the transmitter from the bright line pattern included in the image, as in the example described with reference to FIG. 115.

The frequency calculation unit 8349 calculates the frequency of the transmitter from the ID detected by the ID detection unit 8347, for example by dividing the ID as mentioned above. The frequency comparison unit 8348 compares the frequency detected by the frequency detection unit 8346 and the frequency calculated by the frequency calculation unit 8349. In the case where these frequencies are different, the frequency comparison unit 8348 determines that the detected ID is an error, and causes the ID detection unit 8347 to detect the ID again. Obtainment of an erroneous ID can be prevented in this way.

FIG. 122 is a diagram illustrating an example of operation of a transmitter in Embodiment 5.

The transmitter may transmit each of the symbols "00, 01, 10, 11" separately, by making the luminance change position in a predetermined time unit different.

For example, when transmitting the symbol "00", the transmitter transmits the symbol "00" by changing in luminance only for a first section which is the first section in the time unit. When transmitting the symbol "01", the transmitter transmits the symbol "01" by changing in luminance only for a second section which is the second section in the time unit. Likewise, when transmitting the symbol "10", the transmitter transmits the symbol "10" by changing in luminance only for a third section which is the third section in the time unit. When transmitting the symbol "11", the transmitter transmits the symbol "11" by changing in luminance only for a fourth section which is the fourth section in the time unit.

Thus, in this embodiment, the luminance changes in one section regardless of which symbol is transmitted, so that flicker can be suppressed as compared with the above-mentioned transmitter that causes one entire section (slot) to be low in luminance.

FIG. 123 is a diagram illustrating an example of operation of a transmitter in Embodiment 5.

The transmitter may transmit each of the symbols "0, 1" separately, by making whether or not the luminance changes in a predetermined time unit different. For example, when transmitting the symbol "0", the transmitter transmits the symbol "0" by not changing in luminance in the time unit. When transmitting the symbol "1", the transmitter transmits the symbol "1" by changing in luminance in the time unit.

FIG. 124 is a diagram illustrating an example of operation of a transmitter in Embodiment 5.

The transmitter may transmit each of the symbols "00, 01, 10, 11" separately, by making the luminance change frequency in a predetermined time unit different. For example, when transmitting the symbol "00", the transmitter transmits the symbol "00" by not changing in luminance in the time unit. When transmitting the symbol "01", the transmitter transmits the symbol "01" by changing in luminance (changing in luminance at a low frequency) in the time unit. When transmitting the symbol "10", the transmitter transmits the symbol "10" by changing in luminance sharply (changing in luminance at a high frequency) in the time unit. When transmitting the symbol "11", the transmitter transmits the symbol "11" by changing in luminance more sharply (changing in luminance at a higher frequency) in the time unit.

FIG. 125 is a diagram illustrating an example of operation of a transmitter in Embodiment 5.

The transmitter may transmit each of the symbols "0, 1" separately, by making the phase of the luminance change in a predetermined time unit different. For example, when transmitting the symbol "0", the transmitter transmits the symbol "0" by changing in luminance in a predetermined phase in the time unit. When transmitting the symbol "1", the transmitter transmits the symbol "1" by changing in luminance in the reverse phase of the above-mentioned phase in the time unit.

FIG. 126 is a diagram illustrating an example of operation of a transmitter in Embodiment 5.

When transmitting a signal such as an ID, the transmitter changes in luminance according to color such as red, green and blue. The transmitter can therefore transmit a signal of a larger amount of information, to a receiver capable of recognizing the luminance change according to color. The luminance change of any of the colors may be used for clock synchronization. For example, the luminance change of red color may be used for clock synchronization. In this case, the luminance change of red color serves as a header. Since there is no need to use a header for the luminance change of each color (green and blue) other than red, redundant data transmission can be avoided.

FIG. 127 is a diagram illustrating an example of operation of a transmitter in Embodiment 5.

The transmitter may express the luminance of synthetic color (e.g. white) by synthesizing a plurality of colors such as red, green, and blue. In other words, the transmitter expresses the luminance change of synthetic color, by changing in luminance according to color such as red, green, and blue. A signal is transmitted using this luminance change of synthetic color, as in the above-mentioned visible light communication. Here, the luminance of one or more colors of red, green, and blue may be used for adjustment when expressing predetermined luminance of synthetic color. This enables the signal to be transmitted using the luminance change of synthetic color, and also enables the signal to be transmitted using the luminance change of any two colors of red, green, and blue. The transmitter can therefore transmit a signal even to a receiver capable of recognizing only the luminance change of the above-mentioned synthetic color (e.g. white), and also transmit more signals as ancillary information to a receiver capable of recognizing each color such as red, green, and blue.

FIG. 128 is a diagram illustrating an example of operation of a transmitter in Embodiment 5.

The transmitter includes four light sources. The four light sources (e.g. LED lights) emit light of the colors expressed by different positions 8351*a*, 8351*b*, 8352*a*, and 8352*b* in a CIExy chromaticity diagram illustrated in FIG. 128.

The transmitter transmits each signal by switching between first lighting transmission and second lighting transmission. The first lighting transmission is a process of transmitting the signal "0" by turning on the light source for emitting light of the color of the position 8351*a* and the light source for emitting the light of the color of the position 8351*b* from among the four light sources. The second lighting transmission is a process of transmitting the signal "1" by turning on the light source for emitting light of the color of the position 8352*a* and the light source for emitting the light of the color of the position 8352*b*. The image sensor in the receiver can identify the color expressed by each of the positions 8351*a*, 8351*b*, 8352*a*, and 8352*b*, and so the receiver can appropriately receive the signal "0" and the signal "1".

During the first lighting transmission, the color expressed by the intermediate position between the positions 8351*a* and 8351*b* in the CIExy chromaticity diagram is seen by the human eye. Likewise, during the second lighting transmission, the color expressed by the intermediate position between the positions 8352*a* and 8352*b* in the CIExy chromaticity diagram is seen by the human eye. Therefore, by appropriately adjusting the color and luminance of each of the four light sources, it is possible to match the intermediate position between the positions 8351*a* and 8351*b* and the intermediate position between the positions 8352*a* and 8352*b* to each other (to a position 8353). As a result, even when the transmitter switches between the first lighting transmission and the second lighting transmission, to the human eye the light emission color of the transmitter appears to be fixed. Flicker perceived by humans can thus be suppressed.

FIG. 129 is a diagram illustrating an example of operation of a transmitter and a receiver in Embodiment 5.

The transmitter includes an ID storage unit 8361, a random number generation unit 8362, an addition unit 8363, an encryption unit 8364, and a transmission unit 8365. The ID storage unit 8361 stores the ID of the transmitter. The random number generation unit 8362 generates a different random number at regular time intervals. The addition unit 8363 combines the ID stored in the ID storage unit 8361 with the latest random number generated by the random number generation unit 8362, and outputs the result as an edited ID. The encryption unit 8364 encrypts the edited ID to generate an encrypted edited ID. The transmission unit 8365 transmits the encrypted edited ID to the receiver by changing in luminance.

The receiver includes a reception unit 8366, a decryption unit 8367, and an ID obtainment unit 8368. The reception unit 8366 receives the encrypted edited ID from the transmitter, by capturing the transmitter (visible light imaging). The decryption unit 8367 decrypts the received encrypted edited ID to restore the edited ID. The ID obtainment unit 8368 extracts the ID from the edited ID, thus obtaining the ID.

For instance, the ID storage unit 8361 stores the ID "100", and the random number generation unit 8362 generates a new random number "817" (example 1). In this case, the addition unit 8363 combines the ID "100" with the random number "817" to generate the edited ID "100817", and outputs it. The encryption unit 8364 encrypts the edited ID "100817" to generate the encrypted edited ID "abced". The decryption unit 8367 in the receiver decrypts the encrypted edited ID "abced" to restore the edited ID "100817". The ID obtainment unit 8368 extracts the ID "100" from the restored edited ID "100817". In other words, the ID obtainment unit 8368 obtains the ID "100" by deleting the last three digits of the edited ID.

Next, the random number generation unit 8362 generates a new random number "619" (example 2). In this case, the addition unit 8363 combines the ID "100" with the random number "619" to generate the edited ID "100619", and outputs it. The encryption unit 8364 encrypts the edited ID "100619" to generate the encrypted edited ID "difia". The decryption unit 8367 in the receiver decrypts the encrypted edited ID "difia" to restore the edited ID "100619". The ID obtainment unit 8368 extracts the ID "100" from the restored edited ID "100619". In other words, the ID obtainment unit 8368 obtains the ID "100" by deleting the last three digits of the edited ID.

Thus, the transmitter does not simply encrypt the ID but encrypts its combination with the random number changed at regular time intervals, with it being possible to prevent the ID from being easily cracked from the signal transmitted from the transmission unit 8365. That is, in the case where the simply encrypted ID is transmitted from the transmitter to the receiver a plurality of times, even though the ID is encrypted, the signal transmitted from the transmitter to the receiver is the same if the ID is the same, so that there is a possibility of the ID being cracked. In the example illustrated in FIG. 129, however, the ID is combined with the random number changed at regular time intervals, and the ID combined with the random number is encrypted. Therefore, even in the case where the same ID is transmitted to the receiver a plurality of times, if the time of transmitting the ID is different, the signal transmitted from the transmitter to the receiver is different. This protects the ID from being cracked easily.

FIG. 130 is a diagram illustrating an example of operation of a transmitter and a receiver in Embodiment 5.

The transmitter includes an ID storage unit 8371, a timer unit 8372, an addition unit 8373, an encryption unit 8374, and a transmission unit 8375. The ID storage unit 8371 stores the ID of the transmitter. The timer unit 8372 counts time, and outputs the current date and time (the current year, month, day, and time). The addition unit 8373 combines the ID stored in the ID storage unit 8371 with the current date and time output from the timer unit 8372 as a transmission date and time, and outputs the result as an edited ID. The encryption unit 8374 encrypts the edited ID to generate an encrypted edited ID. The transmission unit 8375 transmits the encrypted edited ID to the receiver by changing in luminance.

The receiver includes a reception unit 8376, a decryption unit 8377, a validity determination unit 8378, and a timer unit 8379. The reception unit 8376 receives the encrypted edited ID from the transmitter, by capturing the transmitter (visible light imaging). The decryption unit 8377 decrypts the received encrypted edited ID to restore the edited ID. The timer unit 8379 counts time, and outputs the current date and time (the current year, month, day, and time). The validity determination unit 8378 extracts the ID from the restored edited ID, thus obtaining the ID. The validity determination unit 8378 also extracts the transmission date and time from the restored edited ID, and compares the transmission date and time with the current date and time output from the timer unit 8379 to determine the validity of the ID. For example, in the case where the difference between the transmission date and time and the current date and time is longer than a predetermined time or in the case where the transmission date and time is later than the current date and time, the validity determination unit 8378 determines that the ID is invalid.

For instance, the ID storage unit 8371 stores the ID "100", and the timer unit 8372 outputs the current date and time "201305011200" (2013/5/1 12:00) as the transmission date and time (example 1). In this case, the addition unit 8373 combines the ID "100" with the transmission date and time "201305011200" to generate the edited ID "100201305011200", and outputs it. The encryption unit 8374 encrypts the edited ID "100201305011200" to generate the encrypted edited ID "ei39ks". The decryption unit 8377 in the receiver decrypts the encrypted edited ID "ei39ks" to restore the edited ID "100201305011200". The validity determination unit 8378 extracts the ID "100" from the restored edited ID "100201305011200". In other words, the validity determination unit 8378 obtains the ID "100" by deleting the last 12 digits of the edited ID. The validity determination unit 8378 also extracts the transmission date and time "201305011200" from the restored edited ID "100201305011200". If the transmission date and time "201305011200" is earlier than the current date and time output from the timer unit 8379 and the difference between the transmission date and time and the current date and time is within, for example, 10 minutes, the validity determination unit 8378 determines that the ID "100" is valid.

On the other hand, the ID storage unit 8371 stores the ID "100", and the timer unit 8372 outputs the current date and time "201401011730" (2014/1/1 17:30) as the transmission date and time (example 2). In this case, the addition unit 8373 combines the ID "100" with the transmission date and time "201401011730" to generate the edited ID "100201401011730", and outputs it. The encryption unit 8374 encrypts the edited ID "100201401011730" to generate the encrypted edited ID "002jflk". The decryption unit 8377 in the receiver decrypts the encrypted edited ID "002jflk" to restore the edited ID "100201401011730". The validity determination unit 8378 extracts the ID "100" from the restored edited ID "100201401011730". In other words, the validity determination unit 8378 obtains the ID "100" by deleting the last 12 digits of the edited ID. The validity determination unit 8378 also extracts the transmission date and time "201401011730" from the restored edited ID "100201401011730". If the transmission date and time "201401011730" is later than the current date and time output from the timer unit 8379, the validity determination unit 8378 determines that the ID "100" is invalid.

Thus, the transmitter does not simply encrypt the ID but encrypts its combination with the current date and time changed at regular time intervals, with it being possible to prevent the ID from being easily cracked from the signal transmitted from the transmission unit 8375. That is, in the case where the simply encrypted ID is transmitted from the transmitter to the receiver a plurality of times, even though the ID is encrypted, the signal transmitted from the transmitter to the receiver is the same if the ID is the same, so that there is a possibility of the ID being cracked. In the example illustrated in FIG. 130, however, the ID is combined with the current date and time changed at regular time intervals, and the ID combined with the current date and time is encrypted. Therefore, even in the case where the same ID is transmitted to the receiver a plurality of times, if the time of transmitting the ID is different, the signal transmitted from the transmitter to the receiver is different. This protects the ID from being cracked easily.

Moreover, whether or not the obtained ID is valid is determined by comparing the transmission date and time of the encrypted edited ID and the current date and time. Thus, the validity of the ID can be managed based on the transmission/reception time.

Note that the receiver illustrated in each of FIGS. 129 and 130 may, upon obtaining the encrypted edited ID, transmit the encrypted edited ID to the server, and obtain the ID from the server.

(Station Guide)

FIG. 131 is a diagram illustrating an example of use according to the present disclosure on a train platform. A user points a mobile terminal at an electronic display board or a lighting, and obtains information displayed on the electronic display board or train information or station information of a station where the electronic display board is installed, by visible light communication. Here, the information displayed on the electronic display board may be directly transmitted to the mobile terminal by visible light communication, or ID information corresponding to the electronic display board may be transmitted to the mobile terminal so that the mobile terminal inquires of a server using the obtained ID information to obtain the information displayed on the electronic display board. In the case where the ID information is transmitted from the mobile terminal, the server transmits the information displayed on the electronic display board to the mobile terminal, based on the ID information. Train ticket information stored in a memory of the mobile terminal is compared with the information displayed on the electronic display board and, in the case where ticket information corresponding to the ticket of the user is displayed on the electronic display board, an arrow indicating the way to the platform at which the train the user is going to ride arrives is displayed on a display of the mobile terminal. An exit or a path to a train car near a transfer route may be displayed when the user gets off a train. When a seat is reserved, a path to the seat may be displayed. When displaying the arrow, the same color as the train line in a map or train guide information may be used to display the arrow, to facilitate understanding. Reservation information (platform number, car number, departure time, seat number) of the user may be displayed together with the arrow. A recognition error can be prevented by also displaying the reservation information of the user. In the case where the ticket is stored in a server, the mobile terminal inquires of the server to obtain the ticket information and compares it with the information displayed on the electronic display board, or the server compares the ticket information with the information displayed on the electronic display board. Information relating to the ticket information can be obtained in this way. The intended train line may be estimated from a history of transfer search made by the user, to display the route. Not only the information displayed on the electronic display board but also the train information or station information of the station where the electronic display board is installed may be obtained and used for comparison. Information relating to the user in the electronic display board displayed on the display may be highlighted or modified. In the case where the train ride schedule of the user is unknown, a guide arrow to each train line platform may be displayed. When the station information is obtained, a guide arrow to souvenir shops and toilets may be displayed on the display. The behavior characteristics of the user may be managed in the server so that, in the case where the user frequently goes to souvenir shops or toilets in a train station, the guide arrow to souvenir shops and toilets is displayed on the display. By displaying the guide arrow to souvenir shops and toilets only to each user having the behavior characteristics of going to souvenir shops or toilets while not displaying the guide arrow to other users, it is possible to reduce processing. The guide arrow to souvenir shops and toilets may be displayed in a different color from the guide arrow to the platform. When displaying both arrows simultaneously, a recognition error can be prevented by displaying them in different colors. Though a train example is illustrated in FIG. 131, the same structure is applicable to display for planes, buses, and so on.

(Guide Sign Translation)

FIG. 132 is a diagram illustrating an example of obtaining information from an electronic guidance display board installed in an airport, a train station, a hospital, or the like by visible light communication. Information displayed on the electronic guidance display board is obtained by visible light communication and, after the displayed information is translated into language information set in a mobile terminal, the information is displayed on a display of the mobile terminal. Since the displayed information has been translated into the language of the user, the user can easily understand the information. The language translation may be performed in the mobile terminal or in a server. In the case of performing the translation in the server, the mobile terminal may transmit the displayed information obtained by visible light communication and the language information of the mobile terminal to the server. The server then performs the translation and transmits the translated information to the mobile terminal, and the mobile terminal displays the information on the display. In the case of obtaining ID information from the electronic guidance display board, the mobile terminal may transmit ID information to the server, and obtain display information corresponding to the ID information from the server. Furthermore, a guide arrow indicating where the user should go next may be displayed based on nationality information, ticket information, or baggage check information stored in the mobile terminal.

(Coupon Popup)

FIG. 133 is a diagram illustrating an example of displaying, on a display of a mobile terminal, coupon information obtained by visible light communication or a popup when a user comes close to a store. The user obtains the coupon information of the store from an electronic display board or the like by visible light communication, using his or her mobile terminal. After this, when the user enters a predetermined range from the store, the coupon information of the store or a popup is displayed. Whether or not the user enters the predetermined range from the store is determined using GPS information of the mobile terminal and store information included in the coupon information. The information is not limited to coupon information, and may be ticket information. Since the user is automatically alerted when coming close to a store where a coupon or a ticket can be used, the user can use the coupon or the ticket effectively.

FIG. 134 is a diagram illustrating an example of displaying coupon information, ticket information, or a popup on a display of a mobile terminal at a cash register, a ticket gate, or the like. Position information is obtained from a lighting installed at the cash register or the ticket gate, by visible light communication. In the case where the obtained position information matches information included in the coupon information or the ticket information, the display is performed. A barcode reader may include a light emitting unit so that the position information is obtained by performing visible light communication with the light emitting unit. Alternatively, the position information may be obtained from the GPS of the mobile terminal. A transmitter may be installed near the cash register so that, when the user points the receiver at the transmitter, the coupon or payment information is displayed on the display of the receiver. The receiver may also perform the payment process by communicating with the server. The coupon information or the ticket information may include Wi-Fi information installed in a store or the like so that, in the case where the mobile terminal of the user obtains the same information as the Wi-Fi information included in the coupon information or the ticket information, the display is performed.

(Start of Operation Application)

FIG. 135 is a diagram illustrating an example where a user obtains information from a home appliance by visible light communication using a mobile terminal. In the case where ID information or information related to the home appliance is obtained from the home appliance by visible light communication, an application for operating the home appliance starts automatically. FIG. 135 illustrates an example of using a TV. Thus, merely pointing the mobile terminal at the home appliance enables the application for operating the home appliance to start.

(Stopping Transmission During Operation of Barcode Reader)

FIG. 136 is a diagram illustrating an example of stopping, when a barcode reader 8405*a* reads a barcode of a product, data communication for visible light communication is stopped near the barcode reader 8405*a*. By stopping visible light communication during barcode read, the barcode reader 8405*a* can be kept from erroneously recognizing the barcode. When a barcode read button is pressed, the barcode reader 8405*a* transmits a transmission stop signal to a visible light signal transmitter 8405*b*. When the finger is released from the button or when a predetermined time has elapsed after the release, the barcode reader 8405*a* transmits a transmission restart signal to the visible light signal transmitter 8405*b*. The transmission stop signal or the transmission restart signal is transmitted by wired/wireless communication, infrared communication, or sound wave communication. The barcode reader 8405*a* may transmit the transmission stop signal upon estimating that the barcode reader 8405*a* is moved, and transmit the transmission restart signal upon estimating that the barcode reader 8405*a* is not moved for a predetermined time, based on the measurement of an accelerometer included in the barcode reader 8405*a*. The barcode reader 8405*a* may transmit the transmission stop signal upon estimating that the barcode reader 8405*a* is grasped, and transmit the transmission restart signal upon estimating that the hand is released from the barcode reader 8405*a*, based on the measurement of an electrostatic sensor or an illuminance sensor included in the barcode reader 8405*a*. The barcode reader 8405*a* may transmit the transmission stop signal upon detecting that the barcode reader 8405*a* is lifted on the ground that a switch on the supporting surface of the barcode reader 8405*a* is released from the pressed state, and transmit the transmission restart signal upon detecting that the barcode reader 8405*a* is placed on the ground that the button is pressed. The barcode reader 8405*a* may transmit the transmission stop signal upon detecting that the barcode reader 8405*a* is lifted, and transmit the transmission restart signal upon detecting that the barcode reader 8405*a* is placed again, based on the measurement of a switch or an infrared sensor of a barcode reader receptacle. A cash register 8405*c* may transmit the transmission stop signal when operation is started, and transmit the transmission restart signal when settlement is completed.

Upon receiving the transmission stop signal, the transmitter 8405*b* such as a lighting stops signal transmission, or operates so that the ripple (luminance change) from 100 Hz to 100 kHz is smaller. As an alternative, the transmitter 8405*b* continues signal transmission while reducing the luminance change of the signal pattern. As another alternative, the transmitter 8405*b* makes the carrier wave period longer than the barcode read time of the barcode reader 8405*a*, or makes the carrier wave period shorter than the exposure time of the barcode reader 8405*a*. Malfunction of the barcode reader 8405*a* can be prevented in this way.

As illustrated in FIG. 137, a transmitter 8406*b* such as a lighting detects, by a motion sensor or a camera, that there is a person near a barcode reader 8406*a*, and stops signal transmission. As an alternative, the transmitter 8406*b* performs the same operation as the transmitter 8405*b* when receiving the transmission stop signal. The transmitter 8406*b* restarts signal transmission, upon detecting that no one is present near the barcode reader 8406*a* any longer. The transmitter 8406*b* may detect the operation sound of the barcode reader 8406*a*, and stop signal transmission for a predetermined time.

(Information Transmission from Personal Computer)

FIG. 138 is a diagram illustrating an example of use according to the present disclosure.

A transmitter 8407*a* such as a personal computer transmits a visible light signal, through a display device such as a display included in the transmitter 8407*a*, a display connected to the transmitter 8407*a*, or a projector. The transmitter 8407*a* transmits an URL of a website displayed by a browser, information of a clipboard, or information defined by a focused application. For example, the transmitter 8407*a* transmits coupon information obtained in a website.

(Database)

FIG. 139 is a diagram illustrating an example of a structure of a database held in a server that manages an ID transmitted from a transmitter.

The database includes an ID-data table holding data provided in response to an inquiry using an ID as a key, and an access log table holding each record of inquiry using an ID as a key. The ID-data table includes an ID transmitted from a transmitter, data provided in response to an inquiry using the ID as a key, a data provision condition, the number of times access is made using the ID as a key, and the number of times the data is provided as a result of clearing the condition. Examples of the data provision condition include the date and time, the number of accesses, the number of successful accesses, terminal information of the inquirer (terminal model, application making inquiry, current position of terminal, etc.), and user information of the inquirer (age, sex, occupation, nationality, language, religion, etc.). By using the number of successful accesses as the condition, a method of providing such a service that "1 yen per access, though no data is returned after 100 yen as upper limit" is possible. When access is made using an ID as a key, the log table records the ID, the user ID of the requester, the time, other ancillary information, whether or not data is provided as a result of clearing the condition, and the provided data.

(Reception Start Gesture)

FIG. 140 is a diagram illustrating an example of gesture operation for starting reception by the present communication scheme.

A user sticks out a receiver such as a smartphone and turns his or her wrist right and left, to start reception. The receiver detects these operations from the measurement of a 9-axis sensor, and starts reception. The receiver may start reception in the case of detecting at least one of these operations. The operation of sticking out the receiver has the effect of enhancing the reception speed and accuracy, because the receiver comes closer to a transmitter and so captures the transmitter in a larger size. The operation of turning the wrist right and left has the effect of stabilizing reception, because the angle dependence of the scheme is resolved by changing the angle of the receiver.

Note that these operations may be performed only when the receiver's home screen is in the foreground. This can prevent the communication from being launched despite the user's intension while the user is using another application.

The following modification is also possible: an image sensor is activated upon detection of the operation of sticking out the receiver and, if the operation of turning the wrist right and left is not conducted, the reception is canceled. Since activating the image sensor takes about several hundred milliseconds to 2 seconds, the responsiveness can be enhanced in this way.

(Control of Transmitter by Power Line)

FIG. 141 is a diagram illustrating an example of a transmitter according to the present disclosure.

A signal control unit 8410*g* controls the transmission state (the contents of a transmission signal, whether or not to transmit the signal, the intensity of luminance change used for transmission, etc.) of a transmitter 8410*a*. The signal control unit 8410*g* transmits the details of control of the transmitter 8410*a*, to a power distribution control unit 8410*f*. The power distribution control unit 8410*f* changes the voltage or current supplied to a power supply unit 8410*b* of the transmitter 8410*a* or its frequency, thereby notifying the details of control in the form of the magnitude of the change or the time of the change. The power supply unit 8410*b* produces constant output, without being affected by a slight change in voltage, current, or frequency. Accordingly, the signal is transmitted by being expressed by such a change that exceeds the stabilizing ability of the power supply unit 8410*b*, e.g. a timing or duration that cuts power supply. A luminance control unit 8410*d* receives the signal transmitted from the power distribution control unit 8410*f* while taking into account the conversion by the power supply unit 8410*b*, and changes the luminance change pattern of a light emitting unit.

(Coding Scheme)

FIG. 142 is a diagram illustrating a coding scheme for a visible light communication image.

This coding scheme has the advantage that flicker is unlikely to be perceived by humans, because black and white are substantially equal in proportion and so the normal phase image and the reverse phase image are substantially equal in average luminance.

(Coding Scheme Capable of Light Reception Even in the Case of Capturing Image from Diagonal Direction)

FIG. 143 is a diagram illustrating a coding scheme for a visible light communication image.

An image 1001*a* is an image displayed with black and white lines of uniform width. In an image 1001*b* obtained by capturing the image 1001*a* from a diagonal direction, left lines appear thinner and right lines appear thicker. In an image 1001*i* obtained by capturing the image 1001*a* in a manner of projecting the image 1001*a* on a curved surface, lines that differ in thickness appear.

In view of this, a visible light communication image is generated by the following coding scheme. A visible light communication image 1001*c* is made up of a white line, a black line whose thickness is three times that of the white line, and a white line whose thickness is ⅓ that of the black line, from left. A preamble is coded as such an image in which a line whose thickness is three times that of its left adjacent line is followed by a line whose thickness is ⅓ that of its left adjacent line. As in visible light communication images 1001*d* and 1001*e*, a line whose thickness is equal to that of its left adjacent line is coded as “0”. As in visible light communication images 1001*f* and 1001*g*, a line whose thickness is twice that of its left adjacent line or ½ that of its left adjacent line is coded as “1”. That is, a line whose thickness is different from that of its left adjacent line is coded as “1”. As an example using this coding scheme, a signal including “010110001011” following the preamble is expressed by an image such as a visible light communication image 1001*h*. Though the line whose thickness is equal to that of its left adjacent line is coded as “0” and the line whose thickness is different from that of its left adjacent line is coded as “1” in this example, the line whose thickness is equal to that of its left adjacent line may be coded as “1” and the line whose thickness is different from that of its left adjacent line as “0”. Moreover, the reference thickness is not limited to the thickness of the left adjacent line, and may be the thickness of the right adjacent line. In detail, “1” or “0” may be coded depending on whether the thickness of the line to be coded is equal to or different from the thickness of its right adjacent line. Thus, a transmitter codes “0” by setting the line to be coded to be equal in thickness to the line that is different in color from and adjacent to the line to be coded, and codes “1” by setting the line to be coded to be different in thickness from the line that is different in color from and adjacent to the line to be coded.

A receiver captures the visible light communication image, and detects the thickness of the white or black line in the captured visible light communication image. The receiver compares the thickness of the line to be decoded, with the thickness of the line that is different in color from and adjacent (left adjacent or right adjacent) to the line to be decoded. The line is decoded as “0” in the case where the thicknesses are equal, and “1” in the case where the thicknesses are different. Alternatively, the line may be decoded as “1” in the case where the thicknesses are equal, and “0” in the case where the thicknesses are different. The receiver lastly decodes the data based on the decoded data sequence of 1 and 0.

This coding scheme employs the local line thickness relation. Since the thickness ratio between neighboring lines does not change significantly as seen in the images 1001*b* and 1001*i*, the visible light communication image generated by this coding scheme can be properly decoded even in the case of being captured from a diagonal direction or being projected on a curved surface.

This coding scheme has the advantage that flicker is unlikely to be perceived by humans, because black and white are substantially equal in proportion and so the normal phase image and the reverse phase image are substantially equal in average luminance. This coding scheme also has the advantage that the visible light communication images of both the normal phase signal and the reverse phase signal are decodable by the same algorithm, because the coding scheme does not depend on the distinction between black and white.

This coding scheme further has the advantage that a code can be added easily. As an example, a visible light communication image 1001*j* is a combination of a line whose thickness is four times that of its left adjacent line and a line whose thickness is ¼ that of its left adjacent line. Like this, many unique patterns such as “five times that of its left adjacent line and ⅕ that of its left adjacent line” and “three times that of its left adjacent line and ⅔ that of its left adjacent line” are available, enabling definition as a signal having a special meaning. For instance, given that one set of data can be expressed by a plurality of visible light communication images, the visible light communication image 1001*j* may be used as a cancel signal indicating that, since the transmission data is changed, part of the previously received data is no longer valid. Note that the colors are not limited to black and white, and any colors may be used so long as they are different. For instance, complementary colors may be used.

(Coding Scheme that Differs in Information Amount Depending on Distance)

FIGS. 144 and 145 are diagrams illustrating a coding scheme for a visible light communication image.

As in (a-1) in FIG. 144, when a 2-bit signal is expressed in a form that one part of an image divided by four is black and the other parts are white, the average luminance of the image is 75%, where white is 100% and black is 0%. As in (a-2) in FIG. 144, when black and white are reversed, the average luminance is 25%.

An image 1003*a* is a visible light communication image in which the white part of the visible light communication image generated by the coding scheme in FIG. 143 is expressed by the image in (a-1) in FIG. 144 and the black part is expressed by the image in (a-2) in FIG. 144. This visible light communication image represents signal A coded by the coding scheme in FIG. 143 and signal B coded by (a-1) and (a-2) in FIG. 144. When a nearby receiver 1003*b* captures the visible light communication image 1003*a*, a fine image 1003*d* is obtained and both of signals A and B can be received. When a distant receiver 1003*c* captures the visible light communication image 1003*a*, a small image 1003*e* is obtained. In the image 1003*e*, the details are not recognizable, and the part corresponding to (a-1) in FIG. 144 is white and the part corresponding to (a-2) in FIG. 144 is black, so that only signal A can be received. Thus, more information can be transmitted when the distance between the visible light communication image and the receiver is shorter. The scheme for coding signal B may be the combination of (b-1) and (b-2) or the combination of (c-1) and (c-2) in FIG. 144.

The use of signals A and B enables basic important information to be expressed by signal A and additional information to be expressed by signal B. In the case where the receiver transmits signals A and B to a server as ID information and the server transmits information corresponding to the ID information to the receiver, the information transmitted from the server may be varied depending on whether or not signal B is present.

(Coding Scheme with Data Division)

FIG. 146 is a diagram illustrating a coding scheme for a visible light communication image.

A transmission signal 1005*a* is divided into a plurality of data segments 1005*b*, 1005*c*, and 1005*d*. Frame data 1005*e*, 1005*f*, and 1005*g* are generated by adding, to each data segment, an address indicating the position of the data segment, a preamble, an error detection/correction code, a frame type description, and the like. The frame data are coded to generate visible light communication images 1005*h*, 1005*i*, and 1005*j*, and the visible light communication images 1005*h*, 1005*i*, and 1005*j* are displayed. In the case where the display area is sufficiently large, a visible light communication image 1005*k* obtained by concatenating the plurality of visible light communication images is displayed.

A method of inserting the visible light communication image in video as in FIG. 146 is described below. In the case of a display device including a solid state light source, the visible light communication image is displayed in normal time, and the solid state light source is on only during the period for displaying the visible light communication image and off during the other period. This method is applicable to a wide range of display devices including a projector using a DMD, a projector using a liquid crystal such as LCOS, and a display device using MEMS. The method is also applicable to display devices that divide image display into subframes, e.g. a display device such as a PDP or an EL display that does not use a light source such as a backlight, by replacing part of the subframes with the visible light communication image. Examples of the solid state light source include a semiconductor laser and an LED light source.

(Effect of Inserting Reverse Phase Image)

FIGS. 147 and 148 are diagrams illustrating a coding scheme for a visible light communication image.

As in (1006*a*) in FIG. 147, a transmitter inserts a black image between video and a visible light communication image (normal phase image). An image obtained by capturing this by a receiver is as illustrated in (1006*b*) in FIG. 147. Since it is easy to search for a part where a simultaneously exposed pixel line is all black, the receiver can easily specify the position where the visible light communication image is captured, as the pixel position exposed at the next timing.

As in (1006*a*) in FIG. 147, after displaying a visible light communication image (normal phase image), the transmitter displays a visible light communication image of reverse phase with black and white being inverted. The receiver calculates the difference in pixel value between the normal phase image and the reverse phase image, thus attaining an SN ratio that is twice as compared with the case of using only the normal phase image. Conversely, when ensuring the same SN ratio, the luminance difference between black and white can be reduced to half, with it being possible to suppress flicker perceived by humans. As in (1007*a*) and (1007*b*) in FIG. 148, the moving average of the expected value of the luminance difference between the video and the visible light communication image is canceled out by the normal phase image and the reverse phase image. Since the temporal resolution of human vision is about 1/60 second, by setting the time for displaying the visible light communication image to less than or equal to this, it is possible to make humans perceive as if the visible light communication image is not being displayed.

As in (1006*c*) in FIG. 147, the transmitter may further insert a black image between the normal phase image and the reverse phase image. In this case, an image illustrated in (1006*d*) in FIG. 147 is obtained as a result of image capture by the receiver. In the image illustrated in (1006*b*) in FIG. 147, the pattern of the normal phase image and the pattern of the reverse phase image are adjacent to each other, which might cause averaging of pixel values at the boundary. In the image illustrated in (1006*d*) in FIG. 147, no such problem occurs.

(Superresolution)

FIG. 149 is a diagram illustrating a coding scheme for a visible light communication image.

In (a) in FIG. 149, in the case where video data and signal data transmitted by visible light communication are separated, a superresolution process is performed on the video data, and the visible light communication image is superimposed on the obtained superresolution image. That is, the superresolution process is not performed on the visible light communication image. In (b) in FIG. 149, in the case where a visible light communication image is already superimposed on video data, the superresolution process is performed so that (1) the edges (parts indicating data by the difference between colors such as black and white) of the visible light communication image are maintained sharp and (2) the average image of the normal phase image and the reverse phase image of the visible light communication image is of uniform luminance. By changing the process for the visible light communication image depending on whether or not the visible light communication image is superimposed on the video data in this way, visible light communication can be performed more appropriately (with reduced error rate).

(Display of Support for Visible Light Communication)

FIG. 150 is a diagram illustrating operation of a transmitter.

A transmitter 8500*a* displays information indicating that the transmitter 8500*a* is capable of visible light communication, by superimposing the information on a projected or displayed image. The information is displayed, for example, only for a predetermined time after the transmitter 8500*a* is activated.

The transmitter 8500*a* transmits the information indicating that the transmitter 8500*a* is capable of visible light communication, to a connected device 8500*c*. The device 8500*c* displays that the transmitter 8500*a* is capable of visible light communication. As an example, the device 8500*c* displays that the transmitter 8500*a* is capable of visible light communication, on a display of the device 8500*c*. In the case where the connected transmitter 8500*a* is capable of visible light communication, the device 8500*c* transmits visible light communication data to the transmitter 8500*a*. The information that the transmitter 8500*a* is capable of visible light communication may be displayed when the device 8500*c* is connected to the transmitter 8500*a* or when the visible light communication data is transmitted from the device 8500*c* to the transmitter 8500*a*. In the case of displaying the information when the visible light communication data is transmitted from the device 8500*c*, the transmitter 8500*a* may obtain identification information indicating visible light communication from the data and, if the identification information indicates that the visible light communication data is included in the data, display that the transmitter 8500*a* is capable of visible light communication.

By displaying that the transmitter (lighting, projector, video display device, etc.) is capable of visible light communication or whether or not the transmitter is capable of visible light communication on the projection screen or the display of the device in this way, the user can easily recognize whether or not the transmitter is capable of visible light communication. This prevents a failure of visible light communication even though visible light communication data is transmitted from the device to the transmitter.

(Information Obtainment Using Visible Light Communication Signal)

FIG. 151 is a diagram illustrating an example of application of visible light communication.

A transmitter 8501*a* receives video data and signal data from a device 8501*c*, and displays a visible light communication image 8501*b*. A receiver 8501*d* captures the visible light communication image 8501*b*, to receive a signal included in the visible light communication image. The receiver 8501*d* communicates with the device 8501*c* based on information (address, password, etc.) included in the received signal, and receives the video displayed by the transmitter 8501*a* and its ancillary information (video ID, URL, password, SSID, translation data, audio data, hash tag, product information, purchase information, coupon, availability information, etc.). The device 8501*c* may transmit, to a server 8501*e*, the status of transmission to the transmitter 8501*a* so that the receiver 8501*d* may obtain the information from the server 8501*e*.

(Data Format)

FIG. 152 is a diagram illustrating a format of visible light communication data.

Data illustrated in (a) in FIG. 152 has a video address table indicating the position of video data in a storage area, and a position address table indicating the position of signal data transmitted by visible light communication. A video display device not capable of visible light communication refers only to the video address table, and therefore video display is not affected even when the signal address table and signal data are included in the input. Backward compatibility with the video display device not capable of visible light communication is maintained in this manner.

In a data format illustrated in (b) in FIG. 152, an identifier indicating that data which follows is video data is positioned before video data, and an identifier indicating that data which follows is signal data is positioned before signal data. Since the identifier is inserted in the data only when there is video data or signal data, the total amount of code can be reduced. Alternatively, identification information indicating whether data is video data or signal data may be provided. Moreover, program information may include identification information indicating whether or not the program information includes visible light communication data. The inclusion of the identification information indicating whether or not the program information includes visible light communication data allows the user to determine, upon program search, whether or not visible light communication is possible. The program information may include an identifier indicating that the program information includes visible light communication data. Furthermore, adding an identifier or identification information on a data basis makes it possible to switch the luminance or switch the process such as superresolution on a data basis, which contributes to a lower error rate in visible light communication.

The data format illustrated in (a) in FIG. 152 is suitable for a situation of reading data from a storage medium such a an optical disc, and the data format illustrated in (b) in FIG. 152 is suitable for streaming data such as television broadcasting. Note that the signal data includes information such as the signal value transmitted by visible light communication, the transmission start time, the transmission end time, the area used for transmission on a display or a projection surface, the luminance of the visible light communication image, the direction of barcode of the visible light communication image, and so on.

(Estimation of Stereoscopic Shape and Reception)

FIGS. 153 and 154 are diagrams illustrating an example of application of visible light communication.

As illustrated in FIG. 153, a transmitter 8503*a* such as a projector projects not only video and a visible light communication image but also a distance measurement image. A dot pattern indicated by the distance measurement image is a dot pattern in which the position relation between a predetermined number of dots near an arbitrary dot is different from the position relation between other arbitrary combination of dots. A receiver captures the distance measurement image to specify a local dot pattern, with it being possible to estimate the stereoscopic shape of a projection surface 8503*b*. The receiver restores the visible light communication image distorted due to the stereoscopic shape of the projection surface to a 2D image, thereby receiving a signal. The distance measurement image and the visible light communication image may be projected by infrared which is not perceivable by humans.

As illustrated in FIG. 154, a transmitter 8504*a* such as a projector includes an infrared projection device 8504*b* for projecting a distance measurement image by infrared. A receiver estimates the stereoscopic shape of a projection surface 8504*c*, and restores a distorted visible light communication image to receive a signal. The transmitter 8504*a* may project video by visible light, and a visible light communication image by infrared. The infrared projection device 8504*b* may project a visible light communication image by infrared.

(Stereoscopic Projection)

FIGS. 155 and 156 are diagrams illustrating a visible light communication image display method.

In the case of performing stereoscopic projection or in the case of displaying a visible light communication image on a cylindrical display surface, displaying visible light communication images 8505*a* to 8505*f* as illustrated in FIG. 155 enables reception from a wide angle. Displaying the visible light communication images 8505*a* and 8505*b* enables reception from a horizontally wide angle. By combining the visible light communication images 8505*a* and 8505*b*, reception is possible even when a receiver is tilted. The visible light communication images 8505*a* and 8505*b* may be displayed alternately, or the visible light communication image 8505*f* obtained by synthesizing these images may be displayed. Moreover, adding the visible light communication images 8505*c* and 8505*d* enables reception from a vertically wide angle. The visible light communication image boundary may be expressed by providing a part projected in an intermediate color or an unprojected part, as in the visible light communication image 8505*e*. Rotating the visible light communication images 8505_a_ to 8505_f_ enables reception from a wider angle. Though the visible light communication image is displayed on the cylindrical display surface in FIG. 155, the visible light communication image may be displayed on a columnar display surface.

In the case of performing stereoscopic projection or in the case of displaying a visible light communication image on a spherical display surface, displaying visible light communication images 8506_a_ to 8506_d_ as illustrated in FIG. 156 enables reception from a wide angle. In the visible light communication image 8506_a_, the receivable area in the horizontal direction is wide, but the receivable area in the vertical direction is narrow. Hence, the visible light communication image 8506_a_ is combined with the visible light communication image 8506_b_ having the opposite property. The visible light communication images 8506_a_ and 8506_b_ may be displayed alternately, or the visible light communication image 8506_c_ obtained by synthesizing these images may be displayed. The part where barcodes concentrate as in the upper part of the visible light communication image 8506_a_ is fine in display, and there is a high possibility of a signal reception error. Such a reception error can be prevented by displaying this part in an intermediate color as in the visible light communication image 8506_d_ or by not projecting any image in this part.

(Communication Protocol Different According to Zone)

FIG. 157 is a diagram illustrating an example of operation of a transmitter and a receiver in Embodiment 5.

A receiver 8420_a_ receives zone information form a base station 8420_h_, recognizes in which position the receiver 8420_a_ is located, and selects a reception protocol. The base station 8420_h_ is, for example, a mobile phone communication base station, a Wi-Fi access point, an IMES transmitter, a speaker, or a wireless transmitter (Bluetooth®, ZigBee, specified low power radio station, etc.). The receiver 8420_a_ may specify the zone based on position information obtained from GPS or the like. As an example, it is assumed that communication is performed at a signal frequency of 9.6 kHz in zone A, and communication is performed at a signal frequency of 15 kHz by a ceiling light and at a signal frequency of 4.8 kHz by a signage in zone B. At a position 8420_j_, the receiver 8420_a_ recognizes that the current position is zone A from information from the base station 8420_h_, and performs reception at the signal frequency of 9.6 kHz, thus receiving signals transmitted from transmitters 8420_b_ and 8420_c_. At a position 84201, the receiver 8420_a_ recognizes that the current position is zone B from information from a base station 8420_i_, and also estimates that a signal from a ceiling light is to be received from the movement of directing the in camera upward. The receiver 8420_a_ performs reception at the signal frequency of 15 kHz, thus receiving signals transmitted from transmitters 8420_e_ and 8420_f_. At a position 8420_m_, the receiver 8420_a_ recognizes that the current position is zone B from information from the base station 8420_i_, and also estimates that a signal transmitted from a signage is to be received from the movement of sticking out the out camera. The receiver 8420_a_ performs reception at the signal frequency of 4.8 kHz, thus receiving a signal transmitted from a transmitter 8420_g_. At a position 8420_k_, the receiver 8420_a_ receives signals from both of the base stations 8420_h_ and 8420_i_ and cannot determine whether the current position is zone A or zone B. The receiver 8420_a_ accordingly performs reception at both 9.6 kHz and 15 kHz. The part of the protocol different according to zone is not limited to the frequency, and may be the transmission signal modulation scheme, the signal format, or the server inquired using an ID. The base station 8420_h_ or 8420_i_ may transmit the protocol in the zone to the receiver, or transmit only the ID indicating the zone to the receiver so that the receiver obtains protocol information from a server using the zone ID as a key.

Transmitters 8420_b_ to 8420_f_ each receive the zone ID or protocol information from the base station 8420_h_ or 8420_i_, and determine the signal transmission protocol. The transmitter 8420_d_ that can receive the signals from both the base stations 8420_h_ and 8420_i_ uses the protocol of the zone of the base station with a higher signal strength, or alternately use both protocols.

(Recognition of Zone and Service for Each Zone)

FIG. 158 is a diagram illustrating an example of operation of a transmitter and a receiver in Embodiment 5.

A receiver 8421_a_ recognizes a zone to which the position of the receiver 8421_a_ belongs, from a received signal. The receiver 8421_a_ provides a service (coupon distribution, point assignment, route guidance, etc.) determined for each zone. As an example, the receiver 8421_a_ receives a signal transmitted from the left of a transmitter 8421_b_, and recognizes that the receiver 8421_a_ is located in zone A. Here, the transmitter 8421_b_ may transmit a different signal depending on the transmission direction. Moreover, the transmitter 8421_b_ may, through the use of a signal of the light emission pattern such as 2217_a_, transmit a signal so that a different signal is received depending on the distance to the receiver. The receiver 8421_a_ may recognize the position relation with the transmitter 8421_b_ from the direction and size in which the transmitter 8421_b_ is captured, and recognize the zone in which the receiver 8421_a_ is located.

Signals indicating the same zone may have a common part. For example, the first half of an ID indicating zone A, which is transmitted from each of the transmitters 8421_b_ and 8421_c_, is common. This enables the receiver 8421_a_ to recognize the zone where the receiver 8421_a_ is located, merely by receiving the first half of the signal.

Summary of this Embodiment

An information communication method in this embodiment is an information communication method of transmitting a signal using a change in luminance, the information communication method including: determining a plurality of patterns of the change in luminance, by modulating each of a plurality of signals to be transmitted; and transmitting, by each of a plurality of light emitters changing in luminance according to any one of the plurality of determined patterns of the change in luminance, a signal corresponding to the pattern, wherein in the transmitting, each of two or more light emitters of the plurality of light emitters changes in luminance at a different frequency so that light of one of two types of light different in luminance is output per a time unit determined for the light emitter beforehand and that the time unit determined for each of the two or more light emitters is different.

In this way, two or more light emitters (e.g. transmitters as lighting devices) each change in luminance at a different frequency, as in the operation described with reference to FIG. 113. Therefore, a receiver that receives signals (e.g. light emitter IDs) from these light emitters can easily obtain the signals separately from each other.

For example, in the transmitting, each of the plurality of light emitters may change in luminance at any one of at least four types of frequencies, and the two or more light emitters of the plurality of transmitters may change in luminance at the same frequency. For example, in the transmitting, the plurality of light emitters each change in luminance so that a luminance change frequency is different between all light emitters which, in the case where the plurality of light emitters are projected on a light receiving surface of an image sensor for receiving the plurality of signals, are adjacent to each other on the light receiving surface.

In this way, as long as there are at least four types of frequencies used for luminance changes, even in the case where two or more light emitters change in luminance at the same frequency, i.e. in the case where the number of types of frequencies is smaller than the number of light emitters, it can be ensured that the luminance change frequency is different between all light emitters adjacent to each other on the light receiving surface of the image sensor based on the four color problem or the four color theorem, as in the operation described with reference to FIG. 114. As a result, the receiver can easily obtain the signals transmitted from the plurality of light emitters, separately from each other.

For example, in the transmitting, each of the plurality of light emitters may transmit the signal, by changing in luminance at a frequency specified by a hash value of the signal.

In this way, each of the plurality of light emitters changes in luminance at the frequency specified by the hash value of the signal (e.g. light emitter ID), as in the operation described with reference to FIG. 113. Accordingly, upon receiving the signal, the receiver can determine whether or not the frequency specified from the actual change in luminance and the frequency specified by the hash value match. That is, the receiver can determine whether or not the received signal (e.g. light emitter ID) has an error.

For example, the information communication method may further include: calculating, from a signal to be transmitted which is stored in a signal storage unit, a frequency corresponding to the signal according to a predetermined function, as a first frequency; determining whether or not a second frequency stored in a frequency storage unit and the calculated first frequency match; and in the case of determining that the first frequency and the second frequency do not match, reporting an error, wherein in the case of determining that the first frequency and the second frequency match, in the determining, a pattern of the change in luminance is determined by modulating the signal stored in the signal storage unit, and in the transmitting, the signal stored in the signal storage unit is transmitted by any one of the plurality of light emitters changing in luminance at the first frequency according to the determined pattern.

In this way, whether or not the frequency stored in the frequency storage unit and the frequency calculated from the signal stored in the signal storage unit (ID storage unit) match is determined and, in the case of determining that the frequencies do not match, an error is reported, as in the operation described with reference to FIG. 120. This eases abnormality detection on the signal transmission function of the light emitter.

For example, the information communication method may further include: calculating a first check value from a signal to be transmitted which is stored in a signal storage unit, according to a predetermined function; determining whether or not a second check value stored in a check value storage unit and the calculated first check value match; and in the case of determining that the first check value and the second check value do not match, reporting an error, wherein in the case of determining that the first check value and the second check value match, in the determining, a pattern of the change in luminance is determined by modulating the signal stored in the signal storage unit, and in the transmitting, the signal stored in the signal storage unit is transmitted by any one of the plurality of light emitters changing in luminance at the first frequency according to the determined pattern.

In this way, whether or not the check value stored in the check value storage unit and the check value calculated from the signal stored in the signal storage unit (ID storage unit) match is determined and, in the case of determining that the check values do not match, an error is reported, as in the operation described with reference to FIG. 120. This eases abnormality detection on the signal transmission function of the light emitter.

An information communication method in this embodiment is an information communication method of obtaining information from a subject, the information communication method including: setting an exposure time of an image sensor so that, in an image obtained by capturing the subject by the image sensor, a plurality of bright lines corresponding to a plurality of exposure lines included in the image sensor appear according to a change in luminance of the subject; obtaining a bright line image including the plurality of bright lines, by capturing the subject that changes in luminance by the image sensor with the set exposure time; obtaining the information by demodulating data specified by a pattern of the plurality of bright lines included in the obtained image; and specifying a luminance change frequency of the subject, based on the pattern of the plurality of bright lines included in the obtained bright line image. For example, in the specifying, a plurality of header patterns that are included in the pattern of the plurality of bright lines and are a plurality of patterns each determined beforehand to indicate a header are specified, and a frequency corresponding to the number of pixels between the plurality of header patterns is specified as the luminance change frequency of the subject.

In this way, the luminance change frequency of the subject is specified, as in the operation described with reference to FIG. 115. In the case where a plurality of subjects that differ in luminance change frequency are captured, information from these subjects can be easily obtained separately from each other.

For example, in the obtaining of a bright line image, the bright line image including a plurality of patterns represented respectively by the plurality of bright lines may be obtained by capturing a plurality of subjects each of which changes in luminance, and in the obtaining of the information, in the case where the plurality of patterns included in the obtained bright line image overlap each other in a part, the information may be obtained from each of the plurality of patterns by demodulating the data specified by a part of each of the plurality of patterns other than the part.

In this way, data is not demodulated from the overlapping part of the plurality of patterns (the plurality of bright line patterns), as in the operation described with reference to FIG. 117. Obtainment of wrong information can thus be prevented.

For example, in the obtaining of a bright line image, a plurality of bright line images may be obtained by capturing the plurality of subjects a plurality of times at different timings from each other, in the specifying, for each bright line image, a frequency corresponding to each of the plurality of patterns included in the bright line image may be specified, and in the obtaining of the information, the plurality of bright line images may be searched for a plurality of patterns for which the same frequency is specified, the plurality of patterns searched for may be combined, and the information may be obtained by demodulating the data specified by the combined plurality of patterns.

In this way, the plurality of bright line images are searched for the plurality of patterns (the plurality of bright line patterns) for which the same frequency is specified, the plurality of patterns searched for are combined, and the information is obtained from the combined plurality of patterns. Hence, even in the case where the plurality of subjects are moving, information from the plurality of subjects can be easily obtained separately from each other.

For example, the information communication method may further include: transmitting identification information of the subject included in the obtained information and specified frequency information indicating the specified frequency, to a server in which a frequency is registered for each set of identification information; and obtaining related information associated with the identification information and the frequency indicated by the specified frequency information, from the server.

In this way, the related information associated with the identification information (ID) obtained based on the luminance change of the subject (transmitter) and the frequency of the luminance change is obtained, as in the operation described with reference to FIG. 119. By changing the luminance change frequency of the subject and updating the frequency registered in the server with the changed frequency, a receiver that has obtained the identification information before the change of the frequency is prevented from obtaining the related information from the server. That is, by changing the frequency registered in the server according to the change of the luminance change frequency of the subject, it is possible to prevent a situation where a receiver that has previously obtained the identification information of the subject can obtain the related information from the server for an indefinite period of time.

For example, the information communication method may further include: obtaining identification information of the subject, by extracting a part from the obtained information; and specifying a number indicated by the obtained information other than the part, as a luminance change frequency set for the subject.

In this way, the identification information of the subject and the luminance change frequency set for the subject can be included independently of each other in the information obtained from the pattern of the plurality of bright lines, as in the operation described with reference to FIG. 116. This contributes to a higher degree of freedom of the identification information and the set frequency.

Embodiment 6

This embodiment describes each example of application using a receiver such as a smartphone and a transmitter for transmitting information as an LED blink pattern in Embodiments 1 to 5 described above.

FIG. 159 is a diagram illustrating an example of a transmission signal in Embodiment 6.

A transmission signal D is divided into data segments Dx (e.g. Dx=D1, D2, D3) of a predetermined size, and a header Hdr and an error detection/correction frame check sequence FCS calculated from each data segment are added to the data segment. A header Hdr2 and an error detection/correction frame check sequence FCS2 calculated from the original data are added, too. Data made up of Hdr, Dx, and FCS is a structure for reception by an image sensor. Since the image sensor is suitable for reception of continuous data in a short time, Hdr, Dx, and FCS are transmitted continuously. Data made up of Hdr2, Dx, and FCS2 is a structure for reception by an illuminance sensor. While Hdr and FCS received by the image sensor are desirably short, Hdr2 and FCS2 received by the illuminance sensor may each be a longer signal sequence. The use of a longer signal sequence for Hdr2 enhances the header detection accuracy. When FCS2 is longer, a code capable of detecting and correcting many bit errors can be employed, which leads to improved error detection/correction performance. Note that, instead of transmitting Hdr2 and FCS2, Hdr and FCS may be received by the illuminance sensor. The illuminance sensor may receive both Hdr and Hdr2 or both FCS and FCS2.

FIG. 160 is a diagram illustrating an example of a transmission signal in Embodiment 6.

FCS2 is a long signal. Frequently inserting such FCS2 causes a decrease in reception efficiency of the image sensor. In view of this, the insertion frequency of FCS2 is reduced, and a signal PoFCS2 indicating the location of FCS2 is inserted instead. For example, in the case of using 4-value PPM having 2-bit information per unit time for signal representation, 16 transmission time units are necessary when CRC32 is used for FCS2, whereas PoFCS2 with a range of 0 to 3 can be transmitted in one time unit. Since the transmission time is shortened as compared with the case of inserting only FCS2, the reception efficiency of the image sensor can be improved. The illuminance sensor receives PoFCS2 following the transmission signal D, specifies the transmission time of FCS2 from PoFCS2, and receives FCS2. The illuminance sensor further receives PoFCS2 following FCS2, specifies the transmission time of the next FCS2, and receives the next FCS2. If FCS2 received first and FCS2 received next are the same, the receiver estimates that the same signal is being received.

FIGS. 161A to 161C are each a diagram illustrating an example of an image (bright line image) captured by a receiver in Embodiment 6.

In the captured image illustrated in FIG. 161A, a transmitter is shown small and so the number of bright lines is small. Only a small amount of data can be received at one time from this captured image. The captured image illustrated in FIG. 161B is an image captured using zoom, where the transmitter is shown large and so the number of bright lines is large. Thus, a large amount of data can be received at one time by using zoom. In addition, data can be received from far away, and a signal of a small transmitter can be received. Optical zoom or Ex zoom is employed as the zoom method. Optical zoom is realized by increasing the focal length of a lens. Ex zoom is a zoom method in which, in the case of performing imaging with a lower resolution than the imaging element capacity, not all but only a part of the imaging elements is used to thereby enlarge a part of the captured image. The captured image illustrated in FIG. 161C is an image captured using electronic zoom (image enlargement). Though the transmitter is shown large, bright lines are thicker in the enlargement by electronic zoom, and the number of bright lines is unchanged from pre-zoom. Hence, the reception characteristics are unchanged from pre-zoom.

FIGS. 162A and 162B are each a diagram illustrating an example of an image (bright line image) captured by a receiver in Embodiment 6.

The captured image illustrated in FIG. 162A is an image captured with focus on a subject. The captured image illustrated in FIG. 162B is an image captured out of focus. In the captured image illustrated in FIG. 162B, bright lines can be observed even in the surroundings of the actual transmitter because the image is captured out of focus, so that more bright lines can be observed. Thus, more data can be received at one time and also data can be received farther away, by out-of-focus imaging. Imaging in macro mode can produce the same image as the captured image illustrated in FIG. 162B.

FIGS. 163A to 163C are each a diagram illustrating an example of an image (bright line image) captured by a receiver in Embodiment 6.

The image illustrated in FIG. 163A is obtained by setting the exposure time to be longer than that in the visible light communication mode and shorter than that in the normal imaging mode. The imaging mode for obtaining such an image is referred to as "bright line detection mode" (intermediate mode). In the image illustrated in FIG. 163A, bright lines of a transmitter are observed at the center left, while a darker normal captured image appears in the other part. When this image is displayed on the receiver, the user can easily point the receiver at the intended transmitter and capture the transmitter. In the bright line detection mode, an image is captured darker than in the normal imaging mode. Accordingly, imaging is performed in a high sensitivity mode to capture an image having brightness easily visible by humans, i.e. an image similar to that in the normal imaging mode. Since excessively high sensitivity causes the darker parts of the bright lines to become brighter, the sensitivity is set to such a level that allows the bright lines to be observed. The receiver switches to the visible light communication mode, and receives the transmission signal of the transmitter captured in the part designated by, for example, the user touching the image. The receiver may automatically switch to the visible light communication mode and receive the signal in the case where any bright line (transmission signal) is found in the captured image.

The receiver detects the transmission signal from the bright lines in the captured image, and highlights the detected part as illustrated in FIG. 163B. The receiver can thus present the signal transmission part clearly to the user. The bright lines may be observed with regard to not only the transmission signal but also the pattern of the subject. Therefore, instead of determining whether or not there is the transmission signal from the bright lines in one image, it may be determined that there is the transmission signal in the case where the positions of the bright lines change in a plurality of images.

The image captured in the bright line detection mode is darker than the image captured in the normal imaging mode, and is not easily visible. Hence, the image with visibility increased by image processing may be displayed. The image illustrated in FIG. 163C is an example of an image in which the edges are extracted and the boundary of the imaging object is enhanced.

FIG. 164 is a diagram illustrating an example of an image (bright line image) captured by a receiver in Embodiment 6. In detail, FIG. 164 illustrates an image obtained by capturing a transmitter whose signal transmission period is 1/9600 second, with the ratio of exposure time indicated in the lower part of the drawing. When the exposure time is shorter than the transmission period of 1/9600 second, the captured image is roughly the same, and clear bright lines can be captured. When the exposure time is longer, the bright line contours are blurred. In this signal representation example, however, the bright line pattern is observable and the signal can be received as long as the exposure time is up to about 1.5 times the transmission period. Moreover, in this signal representation example, the bright lines are observable as long as the exposure time is up to about 20 times the transmission period. The exposure time of this range is available as the exposure time in the bright line detection mode.

The upper limit of the exposure time that enables signal reception differs depending on the method of signal representation. The use of such a signal representation rule in which the number of bright lines is smaller and the interval between the bright lines is longer enables signal reception with a longer exposure time and also enables observation of bright lines with a longer exposure time, though the transmission efficiency is lower.

(Exposure Time in Intermediate Imaging Mode)

As illustrated in FIG. 164, clear bright lines are observable when the exposure time is up to about 3 times the modulation period. Since the modulation frequency is greater than or equal to 480 Hz, the exposure time in the intermediate imaging mode (intermediate mode) is desirably less than or equal to 1/160 second.

If the exposure time is less than or equal to 1/10000 second, an object not emitting light is hard to be seen under illumination light even when captured in the high sensitivity mode. Accordingly, the exposure time in the intermediate imaging mode is desirably greater than or equal to 1/10000 second. This limitation is, however, expected to be eased by future improvement in sensitivity of imaging elements.

FIG. 165 is a diagram illustrating an example of a transmission signal in Embodiment 6.

A receiver receives a series of signals by combining a plurality of received data segments. Therefore, if a transmission signal is abruptly changed, data segments before and after the change are mixed with each other, making it impossible to accurately combine the signals. In view of this, upon changing the transmission signal, a transmitter performs normal illumination for a predetermined time as a buffer zone while transmitting no signal, as in (a) in FIG. 165. In the case where no signal can be received for a predetermined time T2 shorter than the above-mentioned predetermined time T1, the receiver abandons previously received data segments, thus avoiding mixture of data segments before and after the change. As an alternative, upon changing the transmission signal, the transmitter repeatedly transmits a signal X for notifying the change of the transmission signal, as in (b) in FIG. 165. Such repeated transmission prevents a failure to receive the transmission signal change notification X. As another alternative, upon changing the transmission signal, the transmitter repeatedly transmits a preamble, as in (c) in FIG. 165. In the case of receiving the preamble in a shorter period than the period in which the preamble appears in the normal signal, the receiver abandons previously received data segments.

FIG. 166 is a diagram illustrating an example of operation of a receiver in Embodiment 6.

An image illustrated in (a) in FIG. 166 is an image obtained by capturing a transmitter in just focus. By out-of-focus imaging, a receiver can capture an image illustrated in (b) in FIG. 166. Further out of focus leads to a captured image illustrated in (c) in FIG. 166. In (c) in FIG. 166, bright lines of a plurality of transmitters overlap each other, and the receiver cannot perform signal reception. Hence, the receiver adjusts the focus so that the bright lines of the plurality of transmitters do not overlap each other. In the case where only one transmitter is present in the imaging range, the receiver adjusts the focus so that the size of the transmitter is maximum in the captured image.

The receiver may compress the captured image in the direction parallel to the bright lines, but do not perform image compression in the direction perpendicular to the bright lines. Alternatively, the receiver reduces the degree of compression in the perpendicular direction. This prevents a reception error caused by the bright lines being blurred by compression.

FIGS. 167 and 168 are each a diagram illustrating an example of an instruction to a user displayed on a screen of a receiver in Embodiment 6.

By capturing a plurality of transmitters, a receiver can estimate the position of the receiver using triangulation from position information of each transmitter and the position, size, and angle of each transmitter in the captured image. Accordingly, in the case where only one transmitter is captured in a receivable state, the receiver instructs the imaging direction or the moving direction by displaying an image including an arrow or the like, to cause the user to change the direction of the receiver or move backward so as to capture a plurality of transmitters. (a) in FIG. 167 illustrates a display example of an instruction to turn the receiver to the right to capture a transmitter on the right side. (b) in FIG. 167 illustrates a display example of an instruction to move backward to capture a transmitter in front. FIG. 168 illustrates a display example of an instruction to shake the receiver or the like to capture another transmitter, because the position of another transmitter is unknown to the receiver. Though it is desirable to capture a plurality of transmitters in one image, the position relation between transmitters in a plurality of images may be estimated using image processing or the sensor value of the 9-axis sensor. The receiver may inquire of a server about position information of nearby transmitters using an ID received from one transmitter, and instruct the user to capture a transmitter that is easiest to capture.

The receiver detects that the user is moving the receiver from the sensor value of the 9-axis sensor and, after a predetermined time from the end of the movement, displays a screen based on the last received signal. This prevents a situation where, when the user points the receiver to the intended transmitter, a signal of another transmitter is received during the movement of the receiver and as a result a process based on the transmission signal of the unintended transmitter is accidentally performed.

The receiver may continue the reception process during the movement, and perform a process based on the received signal, e.g. information obtainment from the server using the received signal as a key. In this case, after the process the receiver still continues the reception process, and performs a process based on the last received signal as a final process.

The receiver may process a signal received a predetermined number of times, or notify the signal received the predetermined number of times to the user. The receiver may process a signal received a largest number of times during the movement.

The receiver may include notification means for notifying the user when signal reception is successful or when a signal is detected in a captured image. The notification means performs notification by sound, vibration, display update (e.g. popup display), or the like. This enables the user to recognize the presence of a transmitter.

FIG. 169 is a diagram illustrating an example of a signal transmission method in Embodiment 6.

A plurality of transmitters such as displays are arranged adjacent to each other. In the case of transmitting the same signal, the plurality of transmitters synchronize the signal transmission timing, and transmit the signal from the entire surface as in (a) in FIG. 169. This allows a receiver to observe the plurality of displays as one large transmitter, so that the receiver can receive the signal faster or from a longer distance. In the case where the plurality of transmitters transmit different signals, the plurality of transmitters transmit the signals while providing a buffer zone (non-transmission area) where no signal is transmitted, as in (b) in FIG. 169. This allows the receiver to recognize the plurality of transmitters as separate transmitters with the buffer zone in between, so that the receiver can receive the signals separately.

FIG. 170 is a diagram illustrating an example of a signal transmission method in Embodiment 6.

As illustrated in (a) in FIG. 170, a liquid crystal display provides a backlight off period, and changes the liquid crystal state during backlight off to make the image in the state change invisible, thus enhancing dynamic resolution. On the liquid crystal display performing such backlight control, a signal is superimposed according to the backlight on period as illustrated in (b) in FIG. 170. Continuously transmitting the set of data (Hdr, Data, FCS) contributes to higher reception efficiency. The light emitting unit is in a bright state (Hi) in the first and last parts of the backlight on period. This is because, if the dark state (Lo) of the light emitting unit is continuous with the backlight off period, the receiver cannot determine whether Lo is transmitted as a signal or the light emitting unit is in a dark state due to the backlight off period.

A signal decreased in average luminance may be superimposed in the backlight off period.

Signal superimposition causes the average luminance to change as compared with the case where no signal is superimposed. Hence, adjustment such as increasing/decreasing the backlight off period or increasing/decreasing the luminance during backlight on is performed so that the average luminance is equal.

FIG. 171 is a diagram illustrating an example of a signal transmission method in Embodiment 6.

A liquid crystal display can reduce the luminance change of the entire screen, by performing backlight control at a different timing depending on position. This is called backlight scan. Backlight scan is typically performed so that the backlight is turned on sequentially from the end, as in (a) in FIG. 171. A captured image 8802*a* is obtained as a result. In the captured image 8802*a*, however, the part including the bright lines is divided, and there is a possibility that the entire screen of the display cannot be estimated as one transmitter. The backlight scan order is accordingly set so that all light emitting parts (signal superimposition parts) are connected when the vertical axis is the spatial axis in the backlight scan division direction and the horizontal axis is the time axis, as in (b) in FIG. 171. A captured image 8802*b* is obtained as a result. In the captured image 8802*b*, all bright line parts are connected, facilitating estimation that this is a transmission signal from one transmitter. Besides, since the number of continuously receivable bright lines increases, faster or longer-distance signal reception is possible. Moreover, the size of the transmitter is easily estimated, and therefore the position of the receiver can be accurately estimated from the position, size, and angle of the transmitter in the captured image.

FIG. 172 is a diagram illustrating an example of a signal transmission method in Embodiment 6.

In time-division backlight scan, in the case where the backlight on period is short and the light emitting parts (signal superimposition parts) cannot be connected on the graph in which the vertical axis is the spatial axis in the backlight scan division direction and the horizontal axis is the time axis, signal superimposition is performed in each light emitting part according to the backlight illumination timing, in the same way as in FIG. 170. Here, by controlling the backlight so that the distance from another backlight on part on the graph is maximum, it is possible to prevent mixture of bright lines in adjacent parts.

Embodiment 7

FIG. 173 is a diagram illustrating a service provision system using the reception method described in any of the foregoing embodiments.

First, a company A ex8000 managing a server ex8002 is requested to distribute information to a mobile terminal, by another company B or individual ex8001. For example, the distribution of detailed advertisement information, coupon information, map information, or the like to the mobile terminal that performs visible light communication with a signage is requested. The company A ex8000 managing the server manages information distributed to the mobile terminal in association with arbitrary ID information. A mobile terminal ex8003 obtains ID information from a subject ex8004 by visible light communication, and transmits the obtained ID information to the server ex8002. The server ex8002 transmits the information corresponding to the ID information to the mobile terminal, and counts the number of times the information corresponding to the ID information is transmitted. The company A ex8000 managing the server charges the fee corresponding to the count, to the requesting company B or individual ex8001. For example, a larger fee is charged when the count is larger.

FIG. 174 is a flowchart illustrating service provision flow.

In Step ex8000, the company A managing the server receives the request for information distribution from another company B. In Step ex8001, the information requested to be distributed is managed in association with the specific ID information in the server managed by the company A. In Step ex8002, the mobile terminal receives the specific ID information from the subject by visible light communication, and transmits it to the server managed by the company A. The visible light communication method has already been described in detail in the other embodiments, and so its description is omitted here. The server transmits the information corresponding to the specific ID information received from the mobile terminal, to the mobile terminal. In Step ex8003, the number of times the information is distributed is counted in the server. Lastly, in Step ex8004, the fee corresponding to the information distribution count is charged to the company B. By such charging according to the count, the appropriate fee corresponding to the advertising effect of the information distribution can be charged to the company B.

FIG. 175 is a flowchart illustrating service provision in another example. The description of the same steps as those in FIG. 174 is omitted here.

In Step ex8008, whether or not a predetermined time has elapsed from the start of the information distribution is determined. In the case of determining that the predetermined time has not elapsed, no fee is charged to the company B in Step ex8011. In the case of determining that the predetermined time has elapsed, the number of times the information is distributed is counted in Step ex8009. In Step ex8010, the fee corresponding to the information distribution count is charged to the company B. Since the information distribution is performed free of charge within the predetermined time, the company B can receive the accounting service after checking the advertising effect and the like.

FIG. 176 is a flowchart illustrating service provision in another example. The description of the same steps as those in FIG. 175 is omitted here.

In Step ex8014, the number of times the information is distributed is counted. In the case of determining that the predetermined time has not elapsed from the start of the information distribution in Step ex8015, no fee is charged in Step ex8016. In the case of determining that the predetermined time has elapsed, on the other hand, whether or not the number of times the information is distributed is greater than or equal to a predetermined number is determined in Step ex8017. In the case where the number of times the information is distributed is less than the predetermined number, the count is reset, and the number of times the information is distributed is counted again. In this case, no fee is charged to the company B regarding the predetermined time during which the number of times the information is distributed is less than the predetermined number. In the case where the count is greater than or equal to the predetermined number in Step ex8017, the count is reset and started again in Step ex8018. In Step ex8019, the fee corresponding to the count is charged to the company B. Thus, in the case where the count during the free distribution time is small, the free distribution time is provided again. This enables the company B to receive the accounting service at an appropriate time. Moreover, in the case where the count is small, the company A can analyze the information and, for example when the information is out of season, suggest the change of the information to the company B. In the case where the free distribution time is provided again, the time may be shorter than the predetermined time provided first. The shorter time than the predetermined time provided first reduces the burden on the company A. Further, the free distribution time may be provided again after a fixed time period. For instance, if the information is influenced by seasonality, the free distribution time is provided again after the fixed time period until the new season begins.

Note that the charge fee may be changed according to the amount of data, regardless of the number of times the information is distributed. Distribution of a predetermined amount of data or more may be charged, while distribution is free of charge within the predetermined amount of data. The charge fee may be increased with the increase of the amount of data. Moreover, when managing the information in association with the specific ID information, a management fee may be charged. By charging the management fee, it is possible to determine the fee upon requesting the information distribution.

Embodiment 8

This embodiment describes each example of application using a receiver such as a smartphone and a transmitter for transmitting information as a blink pattern of an LED or an organic EL device in each of the embodiments described above.

(Modulation Scheme that Facilitates Reception)

FIGS. 177A, 177B, and 178 are diagrams illustrating an example of signal coding in Embodiment 8.

A transmission signal is made up of a header (H) and a body (Body). The header includes a unique signal pattern. A receiver finds this unique pattern from a received signal, recognizes which part of the received signal represents the header or the body based on the position of the unique pattern, and receives data.

In the case where the transmission signal is modulated in a pattern (a) in FIG. 177A, the receiver can receive data when successively receiving the header and the body that follows the header. The duration in which the receiver can continuously receive the signal depends on the size of a transmitter shown in a captured image (taken image). In the case where the transmitter is small or the transmitter is captured from a distance, the duration in which the receiver can continuously receive the signal is short. In the case where the duration (continuous reception time) in which the receiver can continuously receive the signal is the same as the time taken for transmitting one block including the header and the body, the receiver can receive data only when the transmission start point and the reception start point of the header are the same. (a) in FIG. 177A illustrates the case where the continuous reception time is a little longer than the transmission time for one block including the header and the body. Each arrow indicates the continuous reception time. The receiver can receive data when receiving the signal at the timings indicated by the thick arrows, but cannot receive data when receiving the signal at the timings indicated by the thin arrows because the header and the body are not completely contained in the received signal.

In the case where the transmission signal is modulated in a pattern (b) in FIG. 177A, the receiver can receive data at more reception timings. The transmitter transmits the signal modulated with "body, header, body" as one set. The two bodies in the same set represent the same signal. The receiver does not need to continuously receive the whole signal included in the body, but can restore the body by concatenating the body parts before and after the header. Hence, the receiver can receive data so long as it can continuously receive the whole signal included in the header. In FIG. 177A, the reception timings at which data can be received are indicated by the thick lines. As illustrated in FIG. 177A, data reception is possible at more reception timings in (b) than in (a).

In the modulation scheme (b) in FIG. 177A, the receiver can restore the body in the case where the body signal length is fixed. The receiver can also restore the body in the case where information of the body signal length is included in the header.

In detail, as illustrated in FIG. 177B, the receiver first detects the header having a unique bright line pattern, from the captured image (bright line image) including bright lines. The receiver then sequentially reads each signal of the body following the header (in the direction (1) in FIG. 177B). Each time the receiver reads a signal, the receiver determines whether or not the signal of the body has been read for the body signal length. That is, the receiver determines whether or not the whole signal included in the body has been read. In the case of determining that the whole signal has not been read, the receiver reads a signal following the read signal. If there is no following signal, the receiver sequentially reads each signal of the body preceding the header (in the direction (2) in FIG. 177B). The whole signal included in the body is read in this way. Here, in the case where the body signal length is fixed, the receiver holds the body signal length beforehand, and makes the above-mentioned determination using the body signal length. Alternatively, the receiver specifies the body signal length from the header, and makes the above-mentioned determination using the body signal length.

Even in the case where the body signal length is variable, if the modulation scheme is defined so that the body modulated by the same transmitter has the same signal length, the receiver can restore the body by estimating the body signal length from the signal length between two headers. In this case, in the modulation scheme (b) in FIG. 177A, a signal corresponding to two headers and two bodies needs to be received at one time. In a modulation scheme illustrated in FIG. 178, on the other hand, merely receiving a signal corresponding to two headers and one body enables the body signal length to be estimated. FIG. 178 illustrates the modulation scheme in which "body, header, body, header 2 (H2)" constitute one set, where the receiver can receive data so long as it can continuously receive the whole signal included in the header.

Thus, the transmitter in this embodiment determines a first luminance change pattern corresponding to a body which is a part of a signal to be transmitted and a second luminance change pattern indicating a header for specifying the body, and transmits the header and the body by changing in luminance according to the first luminance change pattern, the second luminance change pattern, and the first luminance change pattern in this order. The transmitter may also determine a third luminance change pattern indicating another header different from the header, and transmit the header, the body, and the other header by changing in luminance according to the first luminance change pattern, the second luminance change pattern, the first luminance change pattern, and the third luminance change pattern in this order.

(Communication Using Bright Lines and Image Recognition)

FIG. 179 is a diagram illustrating an example of a captured image in Embodiment 8.

A receiver can not only read a signal from bright lines in the captured image, but also analyze a part other than the bright lines by image processing. For instance, the receiver receives a signal from a transmitter such as a digital signage. Even in the case where the receiver receives the same signal, the receiver can display a different advertisement depending on an image displayed on a screen of the transmitter.

Since the bright lines are noise in image processing, image processing may be performed after interpolating pixel values in the bright line part from pixels right and left of the bright lines. Alternatively, image processing may be performed on an image except the bright line part.

(Imaging Element Use Method Suitable for Visible Light Signal Reception)

FIGS. 180A to 180C are diagrams illustrating an example of a structure and operation of a receiver in Embodiment 8.

The receiver includes an imaging element 8910*a*, as illustrated in FIG. 180A. The imaging element includes effective pixels which constitute a part for capturing an image, optical black for measuring noise such as dark current, and an ineffective area 8910*b*. The optical black includes VOB for measuring vertical noise and HOB for measuring horizontal noise. Since bright lines appear in a direction 8910*c* (horizontal direction), during exposure of the VOB or the ineffective area 8910*b*, bright lines are not obtained and signal reception is impossible. The time during which signal reception is possible can be increased by switching, upon visible light communication, to such an imaging mode that does not use the VOB and the ineffective area 8910*b* or minimally uses the VOB and the ineffective area 8910*b*.

As illustrated in FIG. 180B, the exposure time in an effective pixel area which is an area including the effective pixels can be increased by not using the VOB and the ineffective area 8910*b*. In detail, in normal imaging, one captured image is obtained in each of time t0 to t10, time t10 to t20, and time t20 to t30, as illustrated in (a) in FIG. 180B. Since the VOB and the ineffective area 8910*b* are also used when obtaining each captured image, the exposure time (the time during which electric charge is read, the shaded part in FIG. 180B) in the effective pixel area is time t3 to t10, time t13 to t20, and time t23 to t30.

In visible light communication, by not using the VOB and the ineffective area 8910*b*, the exposure time in the effective pixel area can be increased by the time during which the VOB and the ineffective area 8910*b* are used, as illustrated in (b) in FIG. 180B. That is, the time during which reception is possible in visible light communication can be increased. This enables reception of more signals.

In normal imaging, the exposure of each exposure line in the effective pixel area starts after a predetermined time m elapses from when the exposure of its adjacent exposure line starts, as illustrated in (a) in FIG. 180C. In visible light communication, on the other hand, since the exposure time in the effective pixel area is increased, the exposure of each exposure line in the effective pixel area starts after a predetermined time n (n>m) elapses from when the exposure of its adjacent exposure line starts, as illustrated in (b) in FIG. 180C.

Thus, in normal imaging, the receiver in this embodiment performs electric charge reading on each of a plurality of exposure lines in an area including optical black in the image sensor, after a predetermined time elapses from when electric charge reading is performed on an exposure line adjacent to the exposure line. In visible light communication, the receiver performs electric charge reading on each of a plurality of exposure lines in an area other than the optical black in the image sensor, after a time longer than the predetermined time elapses from when electric charge reading is performed on an exposure line adjacent to the exposure line, the optical black not being used in electric charge reading.

The time during which signal reception is possible can be further increased by switching, upon visible light communication, to such an imaging mode that does not reduce the number of vertical pixels by a process such as demosaicing or clipping.

When an image is captured in such a mode that does not use the VOB and the ineffective area 8910*b* and does not reduce the number of vertical pixels, the timing of exposing the bottom edge of the captured image and the timing of exposing the top edge of the captured image at the next frame are continuous, so that continuous signal reception is possible. Even in the case where the VOB and the like cannot be completely disabled, by modulating the transmission signal by an error correctable scheme, continuous signal reception is possible.

In FIG. 180A, photodiodes in the horizontal direction are exposed simultaneously, as a result of which horizontal bright lines appear. In visible light communication, this exposure mode and an exposure mode of exposing photodiodes in the vertical direction simultaneously are alternately applied to obtain horizontal bright lines and vertical bright lines. Thus, the signal can be stably received regardless of the shape of the transmitter.

(Continuous Signal Reception)

FIG. 180D is a diagram illustrating an example of a signal reception method in Embodiment 8.

An imaging element includes effective pixels which are pixels for converting received light intensity to an image and ineffective pixels for not converting received light intensity to an image but using it as, for example, reference intensity of dark current. In the normal imaging mode, there is the time during which only the ineffective pixels receive light, i.e. the time during which signal reception is impossible, as illustrated in (a). In the visible light communication mode, the time during which reception is possible is increased by minimizing the time during which only the ineffective pixels receive light as illustrated in (b) or by setting the effective pixels to constantly receive light as illustrated in (c). This also enables continuous reception. Though there is the time during which reception is impossible in the case of (b), the use of error correction code in the transmission data allows the whole signal to be estimated even when a part of the signal cannot be received.

(Method of Receiving Signal from Transmitter Captured in Small Size)

FIG. 180E is a flowchart illustrating an example of a signal reception method in Embodiment 8.

As illustrated in FIG. 180E, the process starts in Step 9000*a*. In Step 9000*b*, a receiver receives a signal. In Step 9000*c*, the receiver detects a header. In Step 9000*d*, the receiver determines whether or not the data size of a body following the header is known. In the case of Yes, the process proceeds to Step 9000*f*. In the case of No, the process proceeds to Step 9000*e*, and the receiver reads the data size of the body following the header, from the header. The process then proceeds to Step 9000*f*. In Step 9000*f*, the receiver determines whether or not the signal indicating the body is all successively received following the header. In the case of Yes, the process proceeds to Step 9000*g*, and the receiver reads the body part from the signal received following the header. In Step 9000*p*, the process ends. In the case of No, the process proceeds to Step 9000*h*, and the receiver determines whether or not the total data length of the part received following the header and the part received before the header is sufficient for the data length of the body. In the case of Yes, the process proceeds to Step 9000*i*, and the receiver reads the body part by concatenating the part received following the header and the part received before the header. In Step 9000*p*, the process ends. In the case of No, the process proceeds to Step 9000*j*, and the receiver determines whether or not means for capturing many bright lines from a transmitter is available. In the case of Yes, the process proceeds to Step 9000*n*, and the receiver changes to a setting capable of capturing many bright lines. The process then returns to Step 9000*b*. In the case of No, the process proceeds to Step 9000*k*, and the receiver notifies that a transmitter is present but the image capture size is insufficient. In Step 9000*m*, the receiver notifies the direction toward the transmitter and that reception is possible if moving closer to the transmitter. In Step 9000*p*, the process ends.

With this method, the signal can be stably received even in the case where the number of exposure lines passing through the transmitter in the captured image is small.

(Captured Image Size Suitable for Visible Light Signal Reception)

FIGS. 181 and 182A are diagrams illustrating an example of a reception method in Embodiment 8.

In the case where an effective pixel area of an imaging element is 4:3, if an image is captured at 16:9, top and bottom parts of the image are clipped. When horizontal bright lines appear, bright lines are lost due to this clipping, and the time during which signal reception is possible is shortened. Likewise, in the case where the effective pixel area of the imaging element is 16:9, if an image is captured at 4:3, right and left parts of the image are clipped. When vertical bright lines appear, the time during which signal reception is possible is shortened. In view of this, an aspect ratio that involves no clipping, i.e. 4:3 in FIG. 181 and 16:9 in FIG. 182A, is set as an aspect ratio for imaging in the visible light communication mode. This contributes to a longer time during which reception is possible.

Thus, the receiver in this embodiment further sets an aspect ratio of an image obtained by the image sensor. In visible light communication, the receiver determines whether or not an edge of the image perpendicular to the exposure lines (bright lines) is clipped in the set aspect ratio, and changes the set aspect ratio to a non-clipping aspect ratio in which the edge is not clipped in the case of determining that the edge is clipped. The image sensor in the receiver obtains the bright line image in the non-clipping aspect ratio, by capturing the subject changing in luminance.

FIG. 182B is a flowchart illustrating an example of a reception method in Embodiment 8.

This reception method sets an imaging aspect ratio for increasing the reception time and receiving a signal from a small transmitter.

As illustrated in FIG. 182B, the process starts in Step 8911Ba. In Step 8911Bb, the receiver changes the imaging mode to the visible light communication mode. In Step 89116*c*, the receiver determines whether or not the captured image aspect ratio is set to be closest to the effective pixel aspect ratio. In the case of Yes, the process proceeds to Step 8911Bd, and the receiver sets the captured image aspect ratio to be closest to the effective pixel aspect ratio. In Step 8911Be, the process ends. In the case of No, the process ends in Step 8911Be. Setting the aspect ratio in the visible light communication mode in this way reduces the time during which reception is impossible, and also enables signal reception from a small transmitter or a distant transmitter.

FIG. 182C is a flowchart illustrating an example of a reception method in Embodiment 8.

This reception method sets an imaging aspect ratio for increasing the number of samples per unit time.

As illustrated in FIG. 182C, the process starts in Step 8911Ca. In Step 8911Cb, the receiver changes the imaging mode to the visible light communication mode. In Step 8911Cc, the receiver determines whether or not, though bright lines of exposure lines can be recognized, signal reception is impossible because the number of samples per unit time is small. In the case of Yes, the process proceeds to Step 8911Cd, and the receiver sets the captured image aspect ratio to be most different from the effective pixel aspect ratio. In Step 8911Ce, the receiver increases the imaging frame rate. The process then returns to Step 8911Cc. In the case of No, the process proceeds to Step 8911Cf, and the receiver receives a signal. The process then ends.

Setting the aspect ratio in the visible light communication mode in this way enables reception of a high frequency signal, and also enables reception even in an environment with a large amount of noise.

(Visible Light Signal Reception Using Zoom)

FIG. 183 is a diagram illustrating an example of a reception method in Embodiment 8.

A receiver finds an area where bright lines are present in a captured image 8913*a*, and performs zoom so that as many bright lines as possible appear. The number of bright lines can be maximized by enlarging the bright line area in the direction perpendicular to the bright line direction until the bright line area lies over the top and bottom edges of the screen as in a captured image 8913*b*.

The receiver may find an area where bright lines are displayed clearly, and perform zoom so that the area is shown in a large size as in a captured image 8913*c*.

In the case where a plurality of bright line areas are present in a captured image, the above-mentioned process may be performed for each of the bright line areas, or performed for a bright line area designated by a user from the captured image.

(Image Data Size Reduction Method Suitable for Visible Light Signal Reception)

FIG. 184 is a diagram illustrating an example of a reception method in Embodiment 8.

In the case where the image data size needs to be reduced when sending a captured image (a) from an imaging unit to an image processing unit or from an imaging terminal (receiver) to a server, reduction or pixel omission in the direction parallel to bright lines as in (c) enables the data size to be reduced without decreasing the amount of information of bright lines. When reduction or pixel omission is performed as in (b) or (d), on the other hand, the number of bright lines decreases or it becomes difficult to recognize bright lines. Upon image compression, too, a decrease in reception efficiency can be prevented by not performing compression in the direction perpendicular to bright lines or by setting the compression rate in the perpendicular direction lower than that in the parallel direction. Note that a moving average filter is applicable to any of the parallel and perpendicular directions, and is effective in both data size reduction and noise reduction.

Thus, the receiver in this embodiment further: compresses the bright line image in a direction parallel to each of the plurality of bright lines included in the bright line image, to generate a compressed image; and transmits the compressed image.

(Modulation Scheme with High Reception Error Detection Accuracy)

FIG. 185 is a diagram illustrating an example of a signal modulation method in Embodiment 8.

Error detection by a parity bit detects a 1-bit reception error, and so cannot detect a mix-up between “01” and “10” and a mix-up between “00” and “11”. In a modulation scheme (a), “01” and “10” tend to be mixed up because the L position differs only by one between “01” and “10”. In a modulation scheme (b), on the other hand, the L position differs by two between “01” and “10” and between “00” and “11”. Hence, a reception error can be detected with high accuracy through the use of the modulation scheme (b). The same applies to the modulation schemes in FIGS. 76 to 78.

Thus, in this embodiment, luminance change patterns between which the timing at which a predetermined luminance value (e.g. L) occurs is different are assigned to different signal units beforehand, to prevent two luminance change patterns from being assigned to signal units of the same parity (e.g. “01” and “10”), the timing at which the predetermined luminance value occurs in one of the two luminance change patterns being adjacent to the timing at which the predetermined luminance value occurs in the other one of the two luminance change patterns. The transmitter in this embodiment determines, for each signal unit included in the transmission signal, a luminance change pattern assigned to the signal unit.

(Change of Operation of Receiver According to Situation)

FIG. 186 is a diagram illustrating an example of operation of a receiver in Embodiment 8.

A receiver 8920*a* operates differently according to a situation in which reception starts. For instance, in the case of being activated in Japan, the receiver 8920*a* receives a signal modulated by phase shift keying at 60 kHz, and downloads data from a server 8920*d* using the received ID as a key. In the case of being activated in the US, the receiver 8920*a* receives a signal modulated by frequency shift keying at 50 kHz, and downloads data from a server 8920*e* using the received ID as a key. The situation according to which the operation of the receiver changes includes a location (country or building) where the receiver 8920*a* is present, a base station or a wireless access point (Wi-Fi, Bluetooth, IMES, etc.) in communication with the receiver 8920*a*, a time of day, and so on.

For example, the receiver 8920*a* transmits, to a server 8920*f*, position information, information of a last accessed wireless base station (a base station of a carrier communication network, Wi-Fi, Bluetooth®, IMES, etc.), or an ID last received by visible light communication. The server 8920*f* estimates the position of the receiver 8920*a* based on the received information, and transmits a reception algorithm capable of receiving transmission signals of transmitters near the position and information (e.g. URI) of an ID management server managing IDs of transmitters near the position. The receiver 8920*a* receives a signal of a transmitter 8920*b* or 8920*c* using the received algorithm, and inquires of an ID management server 8920*d* or 8920*e* indicated by the received information using the ID as a key.

With this method, communication can be performed by a scheme that differs depending on country, region, building, or the like. The receiver 8920*a* in this embodiment may, upon receiving a signal, switch the server to be accessed, the reception algorithm, or the signal modulation method illustrated in FIG. 185, according to the frequency used for modulating the signal.

(Notification of Visible Light Communication to Humans)

FIG. 187 is a diagram illustrating an example of operation of a transmitter in Embodiment 8.

A light emitting unit in a transmitter 8921*a* repeatedly performs blinking visually recognizable by humans and visible light communication, as illustrated in (a) in FIG. 187. Blinking visually recognizable by humans can notify humans that visible light communication is possible. Upon seeing that the transmitter 8921*a* is blinking, a user notices that visible light communication is possible. The user accordingly points a receiver 8921*b* at the transmitter 8921*a* to perform visible light communication, and conducts user registration of the transmitter 8921*a*.

Thus, the transmitter in this embodiment repeatedly alternates between a step of a light emitter transmitting a signal by changing in luminance and a step of the light emitter blinking so as to be visible to the human eye.

The transmitter may include a visible light communication unit and a blinking unit (communication state display unit) separately, as illustrated in (b) in FIG. 187.

The transmitter may operate as illustrated in (c) in FIG. 187 using the modulation scheme in FIG. 77 or 78, thereby making the light emitting unit appear blinking to humans while performing visible light communication. In detail, the transmitter repeatedly alternates between high-luminance visible light communication with brightness 75% and low-luminance visible light communication with brightness 1%. As an example, by operating as illustrated in (c) in FIG. 187 when an abnormal condition or the like occurs in the transmitter and the transmitter is transmitting a signal different from normal, the transmitter can alert the user without stopping visible light communication.

(Expansion in Reception Range by Diffusion Plate)

FIG. 188 is a diagram illustrating an example of a receiver in Embodiment 8.

A receiver 8922*a* is in a normal mode in (a) in FIG. 188, and in a visible light communication mode in (b) in FIG. 188. The receiver 8922*a* includes a diffusion plate 8922*b* in front of an imaging unit. In the visible light communication mode, the receiver 8922*a* moves the diffusion plate 8922*b* to be in front of the imaging unit so that a light source is captured wider. Here, the position of the diffusion plate 8922*b* is adjusted to prevent light from a plurality of light sources from overlapping each other. A macro lens or a zoom lens may be used instead of the diffusion plate 8922*b*. This enables signal reception from a distant transmitter or a small transmitter.

The imaging direction of the imaging unit may be moved instead of moving the diffusion plate 8922*b*.

An area of an image sensor where the diffusion plate 8922*b* is shown may be used only in the visible light communication mode and not in the normal imaging mode. In this way, the above-mentioned advantageous effect can be achieved without moving the diffusion plate 8922*b* or the imaging unit.

(Method of Synchronizing Signal Transmission from a Plurality of Transmitters)

FIGS. 189 and 190 are diagrams illustrating an example of a transmission system in Embodiment 8.

In the case of using a plurality of projectors for projection mapping or the like, for projection onto one part, there is a need to transmit a signal only from one projector or synchronize the signal transmission timings of the plurality of projectors, in order to avoid interference. FIG. 189 illustrates a mechanism for synchronization of transmission.

Projectors A and B that project onto the same projection surface transmit signals as illustrated in FIG. 189. A receiver captures the projection surface for signal reception, calculates the time difference between signals a and b, and adjusts the signal transmission timing of each projector.

Since the projectors A and B are not synchronous at the operation start, a time (total pause time) during which both the projectors A and B transmit no signal is provided to prevent the signals a and b from overlapping and being unable to be received. The signal transmitted from each projector may be changed as the timing adjustment for the projector progresses. For example, efficient timing adjustment can be made by taking a longer total pause time at the operation start and shortening the total pause time as the timing adjustment progresses.

For accurate timing adjustment, it is desirable that the signals a and b are contained in one captured image. The imaging frame rate of the receiver tends to be 60 fps to 7.5 fps. By setting the signal transmission period to less than or equal to 1/7.5 second, the signals a and b can be contained in an image captured at 7.5 fps. By setting the signal transmission period to less than or equal to 1/60 second, the signals a and b can be reliably contained in an image captured at 30 fps.

FIG. 190 illustrates synchronization of a plurality of transmitters as displays. The displays to be synchronized are captured so as to be contained within one image, to perform timing adjustment.

(Visible Light Signal Reception by Illuminance Sensor and Image Sensor)

FIG. 191 is a diagram illustrating an example of operation of a receiver in Embodiment 8.

An image sensor consumes more power than an illuminance sensor.

Accordingly, when a signal is detected by an illuminance sensor 8940*c*, a receiver 8940*a* activates an image sensor 8940*b* to receive the signal. As illustrated in (a) in FIG. 191, the receiver 8940*a* receives a signal transmitted from a transmitter 8940*d*, by the illuminance sensor 8940*c*. After this, the receiver 8940*a* activates the image sensor 8940*b*, receives the transmission signal of the transmitter 8940*d* by the image sensor, and also recognizes the position of the transmitter 8940*d*. At the time when the image sensor 8940*b* receives a part of the signal, if the part is the same as the signal received by the illuminance sensor 8940*c*, the receiver 8940*a* provisionally determines that the same signal is received, and performs a subsequent process such as displaying the current position. The determination is completed once the image sensor 8940*b* has successfully received the whole signal.

Upon the provisional determination, information that the determination is not completed may be displayed. For instance, the current position is displayed semi-transparently, or a position error is displayed.

The part of the signal may be, for example, 20% of the total signal length or an error detection code portion.

In a situation as illustrated in (b) in FIG. 191, the receiver 8940*a* cannot receive signals by the illuminance sensor 8940*c* due to interference, but can recognize the presence of signals. For example, the receiver 8940*a* can estimate that signals are present, in the case where a peak appears in transmission signal modulation frequency when the sensor value of the illuminance sensor 8940*c* is Fourier transformed. Upon estimating that signals are present from the sensor value of the illuminance sensor 8940*c*, the receiver 8940*a* activates the image sensor 8940*b* and receives signals from transmitters 8940*e* and 8940*f*.

(Reception Start Trigger)

FIG. 192 is a diagram illustrating an example of operation of a receiver in Embodiment 8.

Power is consumed while an image sensor or an illuminance sensor (hereafter collectively referred to as "light receiving sensor") is on. Stopping the light receiving sensor when not needed and activating it when needed contributes to improved power consumption efficiency. Here, since the illuminance sensor consumes less power than the image sensor, only the image sensor may be controlled while the illuminance sensor is always on.

In (a) in FIG. 192, a receiver 8941*a* detects movement from a sensor value of a 9-axis sensor, and activates a light receiving sensor to start reception.

In (b) in FIG. 192, the receiver 8941*a* detects an operation of tilting the receiver horizontally from the sensor value of the 9-axis sensor, and activates a light receiving sensor pointed upward to start reception.

In (c) in FIG. 192, the receiver 8941*a* detects an operation of sticking the receiver out from the sensor value of the 9-axis sensor, and activates a light receiving sensor in the stick out direction to start reception.

In (d) in FIG. 192, the receiver 8941*a* detects an operation of directing the receiver upward or shaking the receiver from the sensor value of the 9-axis sensor, and activates a light receiving sensor pointed upward to start reception.

Thus, the receiver in this embodiment further: determines whether or not the receiver (reception device) is moved in a predetermined manner; and activates the image sensor, in the case of determining that the reception device is moved in the predetermined manner.

(Reception Start Gesture)

FIG. 193 is a diagram illustrating an example of gesture operation for starting reception by the present communication scheme.

A receiver 8942*a* such as a smartphone detects an operation of setting the receiver upright and sliding the receiver in the horizontal direction or repeatedly sliding the receiver in the horizontal direction, from a sensor value of a 9-axis sensor. The receiver 8942*a* then starts reception, and obtains the position of each transmitter 8942*b* based on the received ID. The receiver 8942*a* obtains the position of the receiver, from the relative position relations between the receiver and the plurality of transmitters 8942*b*. The receiver 8942*a* can stably capture the plurality of transmitters 8942*b* by being slid, and estimate the position of the receiver with high accuracy by triangulation.

This operation may be performed only when the receiver's home screen is in the foreground. This can prevent the communication from being launched despite the user's intension while the user is using another application.

(Example of Application to Car Navigation System)

FIGS. 194 and 195 are diagrams illustrating an example of application of a transmission and reception system in Embodiment 8.

A transmitter 8950*b* such as a car navigation system transmits information for wirelessly connecting to the transmitter 8950*b*, such as Bluetooth® pairing information, Wi-Fi SSID and password, or an IP address. A receiver 8950*a* such as a smartphone establishes wireless connection with the transmitter 8950*b* based on the received information, and performs subsequent communication via the wireless connection.

As an example, a user inputs a destination, store information to be searched for, or the like to the smartphone 8950*a*. The smartphone 8950*a* transmits the input information to the car navigation system 8950*b* via the wireless connection, and the car navigation system 8950*b* displays route information. As another example, the smartphone 8950*a* operates as a controller of the car navigation system 8950*b*, to control music or video reproduced in the car navigation system 8950*b*. As another example, music or video held in the smartphone 8950*a* is reproduced in the car navigation system 8950*b*. As another example, the car navigation system 8950*b* obtains nearby store information or road congestion information, and has the smartphone 8950*a* display the information. As another example, upon receiving a call, the smartphone 8950*a* uses a microphone and a speaker of the wirelessly connected car navigation system 8950*b* for a conversation process. The smartphone 8950*a* may establish wireless connection and performs the above-mentioned operation upon receiving a call.

In the case where the car navigation system 8950*b* is set in an automatic connection mode for wireless connection, the car navigation system 8950*b* is wirelessly connected to a registered terminal automatically. In the case where the car navigation system 8950*b* is not in the automatic connection mode, the car navigation system 8950*b* transmits connection information using visible light communication, and waits for connection. The car navigation system 8950*b* may transmit connection information using visible light communication and wait for connection, even in the automatic connection mode. In the case where the car navigation system is manually connected, the automatic connection mode may be cleared, and a terminal automatically connected to the car navigation system may be disconnected.

(Example of Application to Content Protection)

FIG. 196 is a diagram illustrating an example of application of a transmission and reception system in Embodiment 8.

A transmitter 8951*b* such as a television transmits content protection information held in the transmitter 8951*b* or a device 8951*c* connected to the transmitter 8951*b*. A receiver 8951*a* such as a smartphone receives the content protection information, and performs content protection for a predetermined time afterward so that content protected by the content protection information in the transmitter 8951*b* or the device 8951*c* can be reproduced. Thus, content held in another device possessed by the user can be reproduced in the receiver.

The transmitter 8951*b* may store the content protection information in a server, and the receiver 8951*a* may obtain the content protection information from the server using a received ID of the transmitter 8951*b* as a key.

The receiver 8951*a* may transmit the obtained content protection information to another device.

(Example of Application to Electronic Lock)

FIG. 197A is a diagram illustrating an example of application of a transmission and reception system in Embodiment 8.

A receiver 8952*a* receives an ID transmitted from a transmitter 8952*b*, and transmits the ID to a server 8952*c*. When receiving the ID of the transmitter 8952*b* from the receiver 8952*a*, the server 8952*c* unlocks a door 8952*d*, opens an automatic door, or calls an elevator for moving to a floor registered in the receiver 8952*a* to a floor on which the receiver 8952*a* is present. The receiver 8952*a* thus functions as a key, allowing the user to unlock the door 8952*d* before reaching the door 8952*d* as an example.

Thus, the receiver in this embodiment: obtains a first bright line image which is an image including a plurality of bright lines, by capturing a subject (e.g. the above-mentioned transmitter) changing in luminance; and obtains first transmission information (e.g. the ID of the subject) by demodulating data specified by a pattern of the plurality of bright lines included in the obtained first bright line image. After the first transmission information is obtained, the receiver causes an opening and closing drive device of a door to open the door, by transmitting a control signal (e.g. the ID of the subject).

To prevent malicious operation, the server 8952*c* may verify that the device in communication is the receiver 8952*a*, through the use of security protection such as a secure element of the receiver 8952*a*. Moreover, to make sure that the receiver 8952*a* is near the transmitter 8952*b*, the server 8952*c* may, upon receiving the ID of the transmitter 8952*b*, issue an instruction to transmit a different signal to the transmitter 8952*b* and, in the case where the signal is transmitted from the receiver 8952*a*, unlock the door 8952*d*.

In the case where a plurality of transmitters 8952*b* as lighting devices are arranged along a passageway to the door 8952*d*, the receiver 8952*a* receives IDs from these transmitters 8952*b*, to determine whether or not the receiver 8952*a* is approaching the door 8952*d*. For example, in the case where the values indicated by the IDs decrease in the order in which the IDs are obtained, the receiver determines that the receiver is approaching the door. Alternatively, the receiver specifies the position of each transmitter 8952*b* based on the corresponding ID, and estimates the position of the receiver based on the position of each transmitter 8952*b* and the position of the transmitter 8952*b* shown in the captured image. The receiver then compares the position of the door 8952*d* held beforehand and the estimated position of the receiver as needed, to determine whether or not the receiver is approaching the door 8952*d*. Upon determining that the receiver is approaching the door 8952*d*, the receiver transmits any of the obtained IDs to the server 8952*c*. The server 8952*c* responsively performs a process for opening the door 8952*d* as an example.

Thus, the receiver in this embodiment: obtains a second bright line image which is an image including a plurality of bright lines, by capturing another subject changing in luminance; and obtains second transmission information (e.g. the ID of the other subject) by demodulating data specified by a pattern of the plurality of bright lines included in the obtained second bright line image. The receiver determines whether or not the receiver is approaching the door, based on the obtained first transmission information and second transmission information. In the case of determining that the receiver is approaching the door, the receiver transmits the control signal (e.g. the ID of any of the subjects).

FIG. 197B is a flowchart of an information communication method in this embodiment.

An information communication method in this embodiment is an information communication method of obtaining information from a subject, and includes steps SK21 to SK24.

In detail, the information communication method includes: a first exposure time setting step SK21 of setting a first exposure time of an image sensor so that, in an image obtained by capturing a first subject by the image sensor, a plurality of bright lines corresponding to exposure lines included in the image sensor appear according to a change in luminance of the first subject, the first subject being the subject; a first bright line image obtainment step SK22 of obtaining a first bright line image which is an image including the plurality of bright lines, by capturing the first subject changing in luminance by the image sensor with the set first exposure time; a first information obtainment step SK23 of obtaining first transmission information by demodulating data specified by a pattern of the plurality of bright lines included in the obtained first bright line image; and a door control step SK24 of causing an opening and closing drive device of a door to open the door, by transmitting a control signal after the first transmission information is obtained.

FIG. 197C is a block diagram of an information communication device in this embodiment.

An information communication device K20 in this embodiment is an information communication device that obtains information from a subject, and includes structural elements K21 to K24.

In detail, the information communication device K20 includes: an exposure time setting unit K21 that sets an exposure time of an image sensor so that, in an image obtained by capturing the subject by the image sensor, a plurality of bright lines corresponding to exposure lines included in the image sensor appear according to a change in luminance of the subject; a bright line image obtainment unit K22 that includes the image sensor, and obtains a bright line image which is an image including the plurality of bright lines, by capturing the subject changing in luminance with the set exposure time; an information obtainment unit K23 that obtains transmission information by demodulating data specified by a pattern of the plurality of bright lines included in the obtained bright line image; and a door control unit K24 that causes an opening and closing drive device of a door to open the door, by transmitting a control signal after the transmission information is obtained.

In the information communication method and the information communication device K20 illustrated in FIGS. 197B and 197C, the receiver including the image sensor can be used as a door key, thus eliminating the need for a special electronic lock, for instance as illustrated in FIG. 197A. This enables communication between various devices including a device with low computational performance.

It should be noted that in the above embodiments, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. For example, the program causes a computer to execute the information communication method illustrated in the flowchart of FIG. 197B.

(Example of Application to Store Visit Information Transmission)

FIG. 198 is a diagram illustrating an example of application of a transmission and reception system in Embodiment 8.

A receiver 8953*a* transmits an ID transmitted from a transmitter 8953*b*, to a server 8953*c*. The server 8953*c* notifies a store staff 8953*d* of order information associated with the receiver 8953*a*. The store staff 8953*d* prepares a product or the like, based on the order information. Since the order has already been processed when the user enters the store, the user can promptly receive the product or the like.

(Example of Application to Location-Dependent Order Control)

FIG. 199 is a diagram illustrating an example of application of a transmission and reception system in Embodiment 8.

A receiver 8954*a* displays a screen allowing an order only when a transmission signal of a transmitter 8954*b* is received. In this way, a store can avoid taking an order from a customer who is not nearby.

Alternatively, the receiver 8954*a* places an order by transmitting an ID of the transmitter 8954*b* in addition to order information. This enables the store to recognize the position of the orderer, and recognize the position to which a product is to be delivered or estimate the time by which the orderer is likely to arrive at the store. The receiver 8954*a* may add the travel time to the store calculated from the moving speed, to the order information. Regarding suspicious purchase based on the current position (e.g. purchase of a ticket of a train departing from a station other than the current position), the receiver may reject the purchase.

(Example of Application to Route Guidance)

FIG. 200 is a diagram illustrating an example of application of a transmission and reception system in Embodiment 8.

A receiver 8955*a* receives a transmission ID of a transmitter 8955*b* such as a guide sign, obtains data of a map displayed on the guide sign from a server, and displays the map data. Here, the server may transmit an advertisement suitable for the user of the receiver 8955*a*, so that the receiver 8955*a* displays the advertisement information, too. The receiver 8955*a* displays the route from the current position to the location designated by the user.

(Example of Application to Location Notification)

FIG. 201 is a diagram illustrating an example of application of a transmission and reception system in Embodiment 8.

A receiver 8956*a* receives an ID transmitted from a transmitter 8956*b* such as a home or school lighting, and transmits position information obtained using the ID as a key, to a terminal 8956*c*. A parent having the terminal 8956*c* can thus be notified that his or her child having the receiver 8956*a* has got back home or arrived at the school. As another example, a supervisor having the terminal 8956*c* can recognize the current position of a worker having the receiver 8956*a*.

(Example of Application to Use Log Storage and Analysis)

FIG. 202 is a diagram illustrating an example of application of a transmission and reception system in Embodiment 8.

A receiver 8957*a* receives an ID transmitted from a transmitter 8957*b* such as a sign, obtains coupon information from a server, and displays the coupon information. The receiver 8957*a* stores the subsequent behavior of the user such as saving the coupon, moving to a store displayed in the coupon, shopping in the store, or leaving without saving the coupon, in the server 8957*c*. In this way, the subsequent behavior of the user who has obtained information from the sign 8957*b* can be analyzed to estimate the advertisement value of the sign 8957*b*.

(Example of Application to Screen Sharing)

FIGS. 203 and 204 are diagrams illustrating an example of application of a transmission and reception system in Embodiment 8.

A transmitter 8960*b* such as a projector or a display transmits information (an SSID, a password for wireless connection, an IP address, a password for operating the transmitter) for wirelessly connecting to the transmitter 8960*b*, or transmits an ID which serves as a key for accessing such information. A receiver 8960*a* such as a smartphone, a tablet, a notebook computer, or a camera receives the signal transmitted from the transmitter 8960*b* to obtain the information, and establishes wireless connection with the transmitter 8960*b*. The wireless connection may be made via a router, or directly made by Wi-Fi Direct, Bluetooth®, Wireless Home Digital Interface, or the like. The receiver 8960*a* transmits a screen to be displayed by the transmitter 8960*b*. Thus, an image on the receiver can be easily displayed on the transmitter.

When connected with the receiver 8960*a*, the transmitter 8960*b* may notify the receiver 8960*a* that not only the information transmitted from the transmitter but also a password is needed for screen display, and refrain from displaying the transmitted screen if a correct password is not obtained. In this case, the receiver 8960*a* displays a password input screen 8960*d* or the like, and prompts the user to input the password.

FIG. 204 is a diagram illustrating an example where a screen of a transmitter 8961*c* is displayed on the transmitter 8960*b* via the receiver 8960*a*. The transmitter 8961*c* such as a notebook computer transmits information for connecting to the terminal 8961*c*, or an ID associated with the information. The receiver 8960*a* receives the signal transmitted from the transmitter 8960*b* and the signal transmitted from the transmitter 8961*c*, establishes connection with each of the transmitters, and causes the transmitter 8961*c* to transmit an image to be displayed on the transmitter 8960*b*. The transmitters 8960*b* and 8961*c* may communicate directly, or communicate via the receiver 8960*a* or a router. Hence, even in the case where the transmitter 8961*c* cannot receive the signal transmitted from the transmitter 8960*b*, an image on the transmitter 8961*c* can be easily displayed on the transmitter 8960*b*.

The above-mentioned operation may be performed only in the case where the difference between the time at which the receiver 8960*a* receives the signal transmitted from the transmitter 8960*b* and the time at which the receiver 8960*a* receives the signal transmitted from the transmitter 8961*c* is within a predetermined time.

The transmitter 8961*c* may transmit the image to the transmitter 8960*b* only in the case where the transmitter 8961*c* receives a correct password from the receiver 8960*a*.

(Example of Application to Position Estimation Using Wireless Access Point)

FIG. 205 is a diagram illustrating an example of application of a transmission and reception system in Embodiment 8.

A receiver 8963*a* such as a smartphone receives an ID transmitted from a transmitter 8963*b*. The receiver 8963*a* obtains position information of the transmitter 8963*b* using the received ID as a key, and estimates the position of the receiver 8963*a* based on the position and direction of the transmitter 8963*b* in the captured image. The receiver 8963*a* also receives a signal from a radio transmitter 8963*c* such as a Wi-Fi access point. The receiver 8963*a* estimates the position of the receiver 8963*a*, based on position information and radio wave transmission direction information of the radio transmitter 8963*c* included in the signal. The receiver 8963*a* estimates the position of the receiver 8963*a* by a plurality of means in this manner, and so can estimate its position with high accuracy.

A method of estimating the position of the receiver 8963*a* using the information of the radio transmitter 8963*c* is described below. The radio transmitter 8963*c* transmits synchronous signals in different directions, from a plurality of antennas. The radio transmitter 8963*c* also changes the signal transmission direction in sequence. The receiver 8963*a* estimates that a radio wave transmission direction in which the radio field intensity is highest is the direction from the radio transmitter 8963*c* to the receiver 8963*a*. Moreover, the receiver 8963*a* calculates path differences from the differences in arrival time of radio waves transmitted from the different antennas and respectively passing through paths 8963*d*, 8963*e*, and 8963*f*, and calculates the distance between the radio transmitter 8963*c* and the receiver 8963*a* from radio wave transmission angle differences θ12, θ13, and θ23. By further using surrounding electric field information and radio wave reflector information, the receiver 8963*a* can estimate its position with higher accuracy.

(Position Estimation by Visible Light Communication and Wireless Communication)

FIG. 206 is a diagram illustrating a structure for performing position estimation by visible light communication and wireless communication. In other words, FIG. 206 illustrates a structure for performing terminal position estimation using visible light communication and wireless communication.

A mobile terminal (a smartphone terminal) performs visible light communication with a light emitting unit, to obtain an ID of the light emitting unit. The mobile terminal inquires of a server using the obtained ID, and obtains position information of the light emitting unit. By doing so, the mobile terminal obtains an actual distance L1 and an actual distance L2 which are respective distances in the x-axis direction and in the y-axis direction between a multiple-input and multiple-output access point (MIMO) and the light emitting unit. Furthermore, the mobile terminal detects a tilt θ1 of the mobile terminal using a gyroscope or the like as already described in other embodiments.

In the case where beamforming is performed from an MIMO access point toward the mobile terminal, a beamforming angle θ2 is set by the MIMO access point and is a known value. Accordingly, the mobile terminal obtains the beamforming angle θ2 by wireless communication or the like.

As a result, using the actual distance L1, the actual distance L2, the tilt θ1 of the mobile terminal, and the beamforming angle θ2, the mobile terminal is capable of calculating a coordinate position (x1, y1) of the mobile terminal which is based on the MIMO access point. The MIMO access point is capable of forming a plurality of beams, and so a plurality of beamformings may be used for position estimation of higher accuracy.

As described above, according to this embodiment, the position estimation accuracy can be enhanced by employing both the position estimation by visible light communication and the position estimation by wireless communication.

Though the information communication method according to one or more aspects has been described by way of the embodiments above, the present disclosure is not limited to these embodiments. Modifications obtained by applying various changes conceivable by those skilled in the art to the embodiments and any combinations of structural elements in different embodiments are also included in the scope of one or more aspects without departing from the scope of the present disclosure.

An information communication method according to an aspect of the present disclosure may also be applied as illustrated in FIGS. 207, 208, and 209.

FIG. 207 is a diagram illustrating an example of application of a transmission and reception system in Embodiment 8.

A camera serving as a receiver in the visible light communication captures an image in a normal imaging mode (Step 1). Through this imaging, the camera obtains an image file in a format such as an exchangeable image file format (EXIF). Next, the camera captures an image in a visible light communication imaging mode (Step 2). The camera obtains, based on a pattern of bright lines in an image obtained by this imaging, a signal (visible light communication information) transmitted from a subject serving as a transmitter by visible light communication (Step 3). Furthermore, the camera accesses a server by using the signal (reception information) as a key and obtains, from the server, information corresponding to the key (Step 4). The camera stores each of the following as metadata of the above image file: the signal transmitted from the subject by visible light communication (visible light reception data); the information obtained from the server; data indicating a position of the subject serving as the transmitter in the image represented by the image file; data indicating the time at which the signal transmitted by visible light communication is received (time in the moving image); and others. Note that in the case where a plurality of transmitters are shown as subjects in a captured image (an image file), the camera stores, for each of the transmitters, pieces of the metadata corresponding to the transmitter into the image file.

When displaying an image represented by the above-described image file, a display or projector serving as a transmitter in the visible light communication transmits, by visible light communication, a signal corresponding to the metadata included in the image file. For example, in the visible light communication, the display or the projector may transmit the metadata itself or transmit, as a key, the signal associated with the transmitter shown in the image.

The mobile terminal (the smartphone) serving as the receiver in the visible light communication captures an image of the display or the projector, thereby receiving a signal transmitted from the display or the projector by visible light communication. When the received signal is the above-described key, the mobile terminal uses the key to obtain, from the display, the projector, or the server, metadata of the transmitter associated with the key. When the received signal is a signal transmitted from a really existing transmitter by visible light communication (visible light reception data or visible light communication information), the mobile terminal obtains information corresponding to the visible light reception data or the visible light communication information from the display, the projector, or the server.

FIG. 208 is a flowchart illustrating operation of a camera (a receiver) of a transmission and reception system in Embodiment 8.

First, upon detection of pressing of an image capture button (Step S901), the camera captures an image in the normal imaging mode (Step S902). The camera then increases its shutter speed to a predetermined speed or greater, that is, sets a shorter exposure time than that set in the normal imaging mode, and captures an image in a visible light imaging mode (Step S903). Thus, the camera obtains a signal transmitted from the subject by visible light communication.

Subsequently, the camera uses, as a key, a signal (information) obtained by visible light communication, thereby obtaining information associated with the key from the server (Step S905). Next, the camera stores the signal and each piece of information and data into a metadata area (e.g. an area into which EXIF metadata is stored) of an image file obtained by imaging in the normal imaging mode (Step S905). In detail, the camera stores a signal obtained by visible light communication, information obtained from the server, position data indicating a position, in an image (an image captured in the normal imaging mode), of a transmitter which is a subject that has transmitted the signal in the visible light communication, and the like.

The camera then determines whether to capture moving images (Step S906), and when determining to capture moving images (Step S906: Y), repeats the processes following Step S902, and when determining to not capture moving images (Step S906: N), ends the imaging process.

FIG. 209 is a flowchart illustrating operation of a display (a transmitter) of a transmission and reception system in Embodiment 8.

First, the display checks the metadata area of the image file to determine whether the number of transmitters shown in the image represented by the image file is one or more than one (Step S911). Here, when determining that the number of transmitters is more than one (Step S911: more than 1), the display further determines whether or not a divided transmission mode has been set as a mode in the visible light communication (Step S912). When determining that the divided transmission mode has been set (Step S912: Y), a display area (a transmission part) of the display is divided into display areas, and the display transmits a signal from each of the display areas (Step S914). Specifically, for each transmitter, the display handles, as a display area, an area in which the transmitter is shown or an area in which the transmitter and surroundings thereof are shown, and transmits a signal corresponding to the transmitter from the display area by visible light communication.

When determining in Step S912 that the divided transmission mode has not been set (Step S912: N), the display transmits a signal corresponding to each of the transmitters from the entire display area of the display by visible light communication (Step S913). In short, the display transmits, from the entire screen, a key associated with a plurality of pieces of information.

When determining in Step S911 that the number of transmitters is one (Step S911: 1), the display transmits a signal corresponding to the one transmitter from the entire display area of the display by visible light communication (Step S915). In short, the display transmits the signal from the entire screen.

Furthermore, when a mobile terminal (a smartphone) accesses the display by using the signal transmitted by visible light communication (the transmission information) as a key after any one of Steps S913 to S915, for example, the display provides the access source, i.e., the mobile terminal, with metadata of the image file that is associated with the key (Step S916).

Summary of this Embodiment

An information communication method in this embodiment is an information communication method of obtaining information from a subject, the information communication method including: setting a first exposure time of an image sensor so that, in an image obtained by capturing a first subject by the image sensor, a plurality of bright lines corresponding to exposure lines included in the image sensor appear according to a change in luminance of the first subject, the first subject being the subject; obtaining a first bright line image which is an image including the plurality of bright lines, by capturing the first subject changing in luminance by the image sensor with the set first exposure time; obtaining first transmission information by demodulating data specified by a pattern of the plurality of bright lines included in the obtained first bright line image; and causing an opening and closing drive device of a door to open the door, by transmitting a control signal after the first transmission information is obtained.

In this way, the receiver including the image sensor can be used as a door key, thus eliminating the need for a special electronic lock, for instance as illustrated in FIG. 197A. This enables communication between various devices including a device with low computational performance.

For example, the information communication method may further include: obtaining a second bright line image which is an image including a plurality of bright lines, by capturing a second subject changing in luminance by the image sensor with the set first exposure time; obtaining second transmission information by demodulating data specified by a pattern of the plurality of bright lines included in the obtained second bright line image; and determining whether or not a reception device including the image sensor is approaching the door, based on the obtained first transmission information and second transmission information, wherein in the causing of an opening and closing drive device, the control signal is transmitted in the case of determining that the reception device is approaching the door.

In this way, the door can be opened at appropriate timing, i.e. only when the reception device (receiver) is approaching the door, for instance as illustrated in FIG. 197A.

For example, the information communication method may further include: setting a second exposure time longer than the first exposure time; and obtaining a normal image in which a third subject is shown, by capturing the third subject by the image sensor with the set second exposure time, wherein in the obtaining of a normal image, electric charge reading is performed on each of a plurality of exposure lines in an area including optical black in the image sensor, after a predetermined time elapses from when electric charge reading is performed on an exposure line adjacent to the exposure line, and in the obtaining of a first bright line image, electric charge reading is performed on each of a plurality of exposure lines in an area other than the optical black in the image sensor, after a time longer than the predetermined time elapses from when electric charge reading is performed on an exposure line adjacent to the exposure line, the optical black not being used in electric charge reading.

In this way, electric charge reading (exposure) is not performed on the optical black when obtaining the first bright line image, so that the time for electric charge reading (exposure) on an effective pixel area, which is an area in the image sensor other than the optical black, can be increased, for instance as illustrated in FIGS. 180A to 180E. As a result, the time for signal reception in the effective pixel area can be increased, with it being possible to obtain more signals.

For example, the information communication method may further include: determining whether or not a length of the pattern of the plurality of bright lines included in the first bright line image is less than a predetermined length, the length being perpendicular to each of the plurality of bright lines; changing a frame rate of the image sensor to a second frame rate lower than a first frame rate used when obtaining the first bright line image, in the case of determining that the length of the pattern is less than the predetermined length; obtaining a third bright line image which is an image including a plurality of bright lines, by capturing the first subject changing in luminance by the image sensor with the set first exposure time at the second frame rate; and obtaining the first transmission information by demodulating data specified by a pattern of the plurality of bright lines included in the obtained third bright line image.

In this way, in the case where the signal length indicated by the bright line pattern (bright line area) included in the first bright line image is less than, for example, one block of the transmission signal, the frame rate is decreased and the bright line image is obtained again as the third bright line image, for instance as illustrated in FIG. 217A. Since the length of the bright line pattern included in the third bright line image is longer, one block of the transmission signal is successfully obtained.

For example, the information communication method may further include setting an aspect ratio of an image obtained by the image sensor, wherein the obtaining of a first bright line image includes: determining whether or not an edge of the image perpendicular to the exposure lines is clipped in the set aspect ratio; changing the set aspect ratio to a non-clipping aspect ratio in which the edge is not clipped, in the case of determining that the edge is clipped; and obtaining the first bright line image in the non-clipping aspect ratio, by capturing the first subject changing in luminance by the image sensor.

In this way, in the case where the aspect ratio of the effective pixel area in the image sensor is 4:3 but the aspect ratio of the image is set to 16:9 and horizontal bright lines appear, i.e. the exposure lines extend along the horizontal direction, it is determined that top and bottom edges of the image are clipped, i.e. edges of the first bright line image is lost, for instance as illustrated in FIGS. 181 and 182A to 182C. In such a case, the aspect ratio of the image is changed to an aspect ratio that involves no clipping, for example, 4:3. This prevents edges of the first bright line image from being lost, as a result of which a lot of information can be obtained from the first bright line image.

For example, the information communication method may further include: compressing the first bright line image in a direction parallel to each of the plurality of bright lines included in the first bright line image, to generate a compressed image; and transmitting the compressed image.

In this way, the first bright line image can be appropriately compressed without losing information indicated by the plurality of bright lines, for instance as illustrated in FIG. 184.

For example, the information communication method may further include: determining whether or not a reception device including the image sensor is moved in a predetermined manner; and activating the image sensor, in the case of determining that the reception device is moved in the predetermined manner.

In this way, the image sensor can be easily activated only when needed, for instance as illustrated in FIG. 192. This contributes to improved power consumption efficiency.

Embodiment 9

This embodiment describes each example of application using a receiver such as a smartphone and a transmitter for transmitting information as a blink pattern of an LED or an organic EL device in each of the embodiments described above.

FIG. 210 is a diagram illustrating an example of application of a transmitter and a receiver in Embodiment 9.

A robot 8970 has a function as, for example, a self-propelled vacuum cleaner and a function as a receiver in each of the above embodiments. Lighting devices 8971*a* and 8971*b* each have a function as a transmitter in each of the above embodiments.

For instance, the robot 8970 cleans a room and also captures the lighting device 8971*a* illuminating the interior of the room, while moving in the room. The lighting device 8971*a* transmits the ID of the lighting device 8971*a* by changing in luminance. The robot 8970 accordingly receives the ID from the lighting device 8971*a*, and estimates the position (self-position) of the robot 8970 based on the ID, as in each of the above embodiments. That is, the robot 8970 estimates the position of the robot 8970 while moving, based on the result of detection by a 9-axis sensor, the relative position of the lighting device 8971*a* shown in the captured image, and the absolute position of the lighting device 8971*a* specified by the ID.

When the robot 8970 moves away from the lighting device 8971*a*, the robot 8970 transmits a signal (turn off instruction) instructing to turn off, to the lighting device 8971*a*. For example, when the robot 8970 moves away from the lighting device 8971*a* by a predetermined distance, the robot 8970 transmits the turn off instruction. Alternatively, when the lighting device 8971*a* is no longer shown in the captured image or when another lighting device is shown in the image, the robot 8970 transmits the turn off instruction to the lighting device 8971*a*. Upon receiving the turn off instruction from the robot 8970, the lighting device 8971*a* turns off according to the turn off instruction.

The robot 8970 then detects that the robot 8970 approaches the lighting device 8971*b* based on the estimated position of the robot 8970, while moving and cleaning the room. In detail, the robot 8970 holds information indicating the position of the lighting device 8971*b* and, when the distance between the position of the robot 8970 and the position of the lighting device 8971*b* is less than or equal to a predetermined distance, detects that the robot 8970 approaches the lighting device 8971*b*. The robot 8970 transmits a signal (turn on instruction) instructing to turn on, to the lighting device 8971*b*. Upon receiving the turn on instruction, the lighting device 8971*b* turns on according to the turn on instruction.

In this way, the robot 8970 can easily perform cleaning while moving, by making only its surroundings illuminated.

FIG. 211 is a diagram illustrating an example of application of a transmitter in Embodiment 9.

For example, a plurality of light emitting areas A to F are arranged in a display, and each of the light emitting areas A to F changes in luminance to transmit a signal, as illustrated in (a) in FIG. 211. In the example illustrated in (a) in FIG. 211, the light emitting areas A to F are each a rectangle, and are aligned along the horizontal and vertical directions. In such a case, a non-luminance change area that does not change in luminance extends across the display along the horizontal direction of the display, between the light emitting areas A, B, and C and the light emitting areas D, E, and F. Another non-luminance change area that does not change in luminance also extends across the display along the vertical direction of the display, between the light emitting areas A and D and the light emitting areas B and E. Another non-luminance change area that does not change in luminance also extends across the display along the vertical direction of the display, between the light emitting areas B and E and the light emitting areas C and F.

When a receiver in each of the above embodiments captures the display in a state where the exposure lines of the receiver are in the horizontal direction, no bright line appears in the part of the image obtained by image capture (captured image) corresponding to the non-luminance change area along the horizontal direction. That is, the area (bright line area) where bright lines appear is discontinuous in the captured image. When the receiver captures the display in a state where the exposure lines of the receiver are in the vertical direction, no bright line appears in the parts of the captured image corresponding to the two non-luminance change areas along the vertical direction. In this case, too, the bright line area is discontinuous in the captured image. When the bright line area is discontinuous, it is difficult to receive the signal transmitted by luminance change.

In view of this, a display 8972 in this embodiment has a function as a transmitter in each of the above embodiments, and has each of the plurality of light emitting areas A to F shifted in position so that the bright line area is continuous.

For example, the upper light emitting areas A, B, and C and the lower light emitting areas D, E, and F are shifted in position from each other in the horizontal direction in the display 8972, as illustrated in (b) in FIG. 211. Alternatively, the light emitting areas A to F that are each a parallelogram or a rhombus are arranged in the display 8972, as illustrated in (c) in FIG. 211. This eliminates a non-luminance change area lying across the display 8972 along the vertical direction of the display 8972 between the light emitting areas A to F. As a result, the bright line area is continuous in the captured image, even when the receiver captures the display 8972 in a state where the exposure lines are in the vertical direction.

The light emitting areas A to F may be shifted in position in the vertical direction in the display 8972, as illustrated in (d) and (e) in FIG. 211. This eliminates a non-luminance change area lying across the display 8972 along the horizontal direction of the display 8972 between the light emitting areas A to F. As a result, the bright line area is continuous in the captured image, even when the receiver captures the display 8972 in a state where the exposure lines are in the horizontal direction.

The light emitting areas A to F that are each a hexagon may be arranged in the display 8972 so that the sides of the areas are parallel to each other, as illustrated in (f) in FIG. 211. This eliminates a non-luminance change area lying across the display 8972 along any of the horizontal and vertical directions of the display 8972 between the light emitting areas A to F, as in the above-mentioned cases. As a result, the bright line area is continuous in the captured image, even when the receiver captures the display 8972 in a state where the exposure lines are in the horizontal direction or captures the display 8972 in a state where the exposure lines are in the vertical direction.

FIG. 212 is a flowchart of an information communication method in this embodiment.

An information communication method in this embodiment is an information communication method of transmitting a signal by a change in luminance, and includes steps SK11 and SK12.

In detail, the information communication method includes: a determination step SK11 of determining a pattern of the change in luminance, by modulating the signal to be transmitted; and a transmission step SK12 of transmitting the signal, by a plurality of light emitters changing in luminance according to the determined pattern of the change in luminance. The plurality of light emitters are arranged on a surface so that a non-luminance change area does not extend across the surface between the plurality of light emitters along at least one of a horizontal direction and a vertical direction of the surface, the non-luminance change area being an area in the surface outside the plurality of light emitters and not changing in luminance.

FIG. 213 is a block diagram of an information communication device in this embodiment.

An information communication device K10 in this embodiment is an information communication device that transmits a signal by a change in luminance, and includes structural elements K11 and K12.

In detail, the information communication device K10 includes: a determination unit K11 that determines a pattern of the change in luminance, by modulating the signal to be transmitted; and a transmission unit K12 that transmits the signal, by a plurality of light emitters changing in luminance according to the determined pattern of the change in luminance. The plurality of light emitters are arranged on a surface so that a non-luminance change area does not extend across the surface between the plurality of light emitters along at least one of a horizontal direction and a vertical direction of the surface, the non-luminance change area being an area in the surface outside the plurality of light emitters and not changing in luminance.

In the information communication method and the information communication device K10 illustrated in FIGS. 212 and 213, the bright line area can be made continuous in the captured image obtained by capturing the surface (display) by the image sensor included in the receiver, for instance as illustrated in FIG. 211. This eases the reception of the transmission signal, and enables communication between various devices including a device with low computational performance.

It should be noted that in the above embodiments, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. For example, the program causes a computer to execute the information communication method illustrated in the flowchart of FIG. 212.

FIG. 214A is a diagram illustrating an example of application of a transmitter and a receiver in Embodiment 9.

A receiver 8973 is a smartphone having a function as a receiver in each of the above embodiments. As illustrated in (a) in FIG. 214A, the receiver 8973 captures a display 8972, and tries to read bright lines appearing in the captured image. In the case where the display 8972 is dark, the receiver 8973 may not be able to read the bright lines and receive the signal from the display 8972. In such a case, the receiver 8973 flashes in a predetermined rhythm, as illustrated in (b) in FIG. 214A. Upon receiving the flash, the display 8972 increases the luminance and produces bright display, as illustrated in (c) in FIG. 214A. As a result, the receiver 8973 can read the bright lines appearing in the captured image and receive the signal from the display 8972.

Figure 214B:
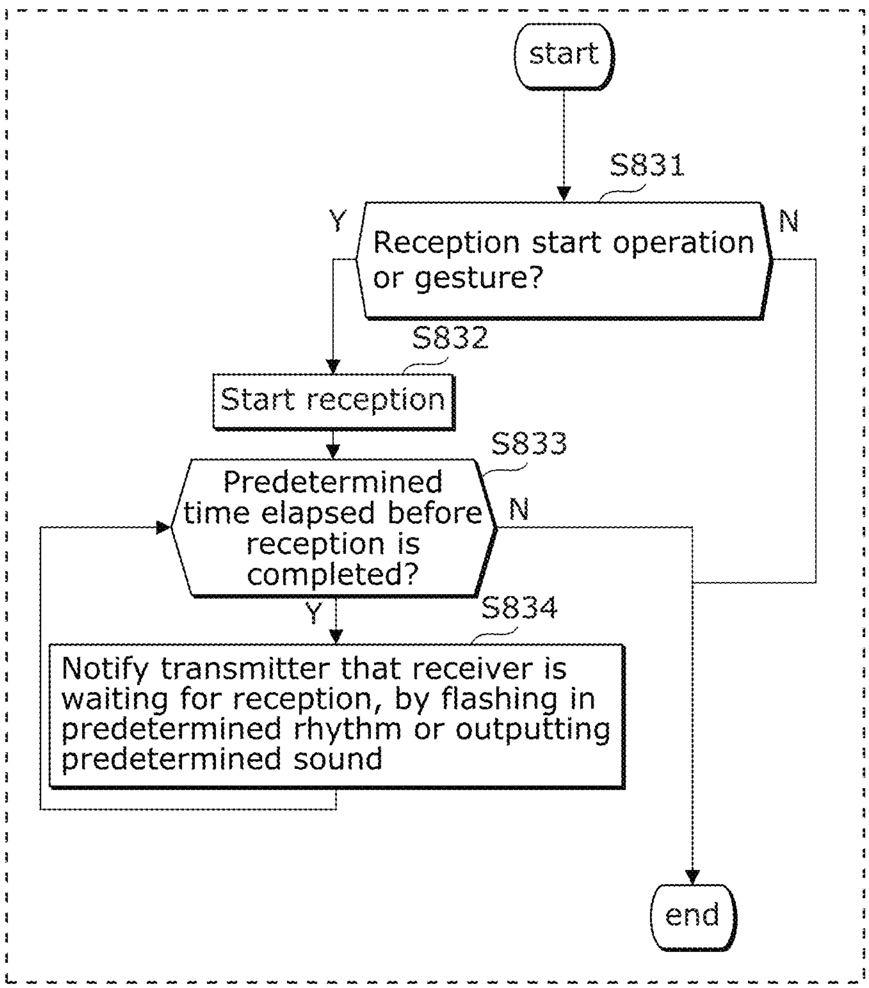

FIG. 214B is a flowchart illustrating operation of the receiver 8973 in Embodiment 9.

First, the receiver 8973 determines whether or not an operation or gesture by the user to start reception is received (Step S831). In the case of determining that the operation or gesture is received (Step S831: Y), the receiver 8973 starts reception by image capture using an image sensor (Step S832). The receiver 8973 then determines whether or not a predetermined time has elapsed from the reception start without completing the reception (Step S833). In the case of determining that the predetermined time has elapsed (Step S833: Y), the receiver 8973 flashes in a predetermined rhythm (Step S834), and repeats the process from Step S833. In the case of repeating the process from Step S833, the receiver 8973 determines whether or not a predetermined time has elapsed from the flash without completing the reception. In Step S834, instead of flashing, the receiver 8973 may output a predetermined sound of a frequency inaudible to humans, or transmit, to the transmitter which is the display 8972, a signal indicating that the receiver 8973 is waiting for reception.

FIG. 215 is a diagram illustrating an example of application of a transmitter and a receiver in Embodiment 9.

A lighting device 8974 has a function as a transmitter in each of the above embodiments. The lighting device 8974 illuminates, for example, a line guide sign 8975 in a train station, while changing in luminance. A receiver 8973 pointed at the line guide sign 8975 by the user captures the line guide sign 8975. The receiver 8973 thus obtains the ID of the line guide sign 8975, and obtains information associated with the ID, i.e. detailed information of each line shown in the line guide sign 8975. The receiver 8973 displays a guide image 8973*a* indicating the detailed information. For example, the guide image 8973*a* indicates the distance to the line shown in the line guide sign 8975, the direction to the line, and the time of arrival of the next train on the line.

When the user touches the guide image 8973*a*, the receiver 8973 displays a supplementary guide image 8973*b*. For instance, the supplementary guide image 8973*b* is an image for displaying any of a train timetable, information about lines other than the line shown by the guide image 8973*a*, and detailed information of the station, according to selection by the user.

FIG. 216 is a diagram illustrating an example of application of a transmitter in Embodiment 9.

Lighting devices 8976*a* to 8976*c* each have a function as a transmitter in each of the above embodiments, and illuminate a store sign 8977. As illustrated in (a) in FIG. 216, the lighting devices 8976*a* to 8976*c* may transmit the same ID by changing in luminance synchronously. As illustrated in (b) in FIG. 216, the lighting devices 8976*a* and 8976*c* located at both ends may transmit the same ID by changing in luminance synchronously, while the lighting device 8976*b* located between these lighting devices illuminates the sign 8977 without transmitting an ID by luminance change. As illustrated in (c) in FIG. 216, the lighting devices 8976*a* and 8976*c* located at both ends may transmit different IDs by changing in luminance, in a state where the lighting device 8976*b* does not transmit an ID. In this case, since the lighting device 8976*b* between the lighting devices 8976*a* and 8976*c* does not change in luminance for ID transmission, the signals from the lighting devices 8976*a* and 8976*c* can be kept from interfering with each other. Though the ID transmitted from the lighting device 8976*a* and the ID transmitted from the lighting device 8976*c* are different, these IDs may be associated with the same information.

FIG. 217A is a diagram illustrating an example of application of a transmitter and a receiver in Embodiment 9.

A lighting device 8978 has a function as a transmitter in each of the above embodiments, and constantly transmits a signal by changing in luminance as illustrated in (1) in FIG. 217A.

A receiver in this embodiment captures the lighting device 8978. Here, an imaging range 8979 of the receiver includes the lighting device 8978 and a part other than the lighting device 8978, as illustrated in FIG. 217A. In detail, a part other than the lighting device 8978 is included in each of an upper area a and a lower area c in the imaging range 8979, and the lighting device 8978 is included in a center area b in the imaging range 8979.

The receiver captures the lighting device 8978 to obtain a captured image (bright line image) including a plurality of bright lines that appear according to the change in luminance of the lighting device 8978, as illustrated in (2) and (3) in FIG. 217A. In the bright line image, bright lines appear only in the part corresponding to the center area b, while no bright line appears in the parts corresponding to the upper area a and the lower area c.

In the case where the receiver captures the lighting device 8978 at a frame rate of 30 fps as an example, the length b of the bright line area in the bright line image is short, as illustrated in (2) in FIG. 217A. In the case where the receiver captures the lighting device 8978 at a frame rate of 15 fps as an example, the length b of the bright line area in the bright line image is long, as illustrated in (3) in FIG. 217A. Note that the length of the bright line area (bright line pattern) is the length perpendicular to each bright line included in the bright line area.

Hence, the receiver in this embodiment captures the lighting device 8978 at a frame rate of 30 fps as an example, and determines whether or not the length b of the bright line area in the bright line image is less than a predetermined length. For example, the predetermined length is the length corresponding to one block of signal transmitted by luminance change by the lighting device 8978. In the case where the receiver determines that the length b is less than the predetermined length, the receiver changes the frame rate to 15 fps as an example. Thus, the receiver can receive one block of signal from the lighting device 8978 at one time.

FIG. 2178 is a flowchart illustrating operation of a receiver in Embodiment 9.

First, the receiver determines whether or not bright lines are included in a captured image, i.e. whether or not stripes by exposure lines are captured (Step S841). In the case of determining that the stripes are captured (Step S841: Y), the receiver determines in which imaging mode (image capture mode) the receiver is set (Step S842). In the case of determining that the imaging mode is the intermediate imaging mode (intermediate mode) or the normal imaging mode (normal image capture mode), the receiver changes the imaging mode to the visible light imaging mode (visible light communication mode) (Step S843).

The receiver then determines whether or not the length perpendicular to the bright lines in the bright line area (bright line pattern) is greater than or equal to a predetermined length (Step S844). That is, the receiver determines whether or not there is a stripe area greater than or equal to a predetermined size in the direction perpendicular to the exposure lines. In the case of determining that the length is not greater than or equal to the predetermined length (Step S844: N), the receiver determines whether or not optical zoom is available (Step S845). In the case of determining that optical zoom is available (Step S845: Y), the receiver performs optical zoom to lengthen the bright line area, i.e. to enlarge the stripe area (Step S846). In the case of determining that optical zoom is not available (Step S845: N), the receiver determines whether or not Ex zoom (Ex optical zoom) is available (Step S847). In the case of determining that Ex zoom is available (Step S847: Y), the receiver performs Ex zoom to lengthen the bright line area, i.e. to enlarge the stripe area (Step S848). In the case of determining that Ex zoom is not available (Step S847: N), the receiver decreases the imaging frame rate (Step S849). The receiver then captures the lighting device 8978 at the set frame rate, to receive a signal (Step S850).

Figure 217B:
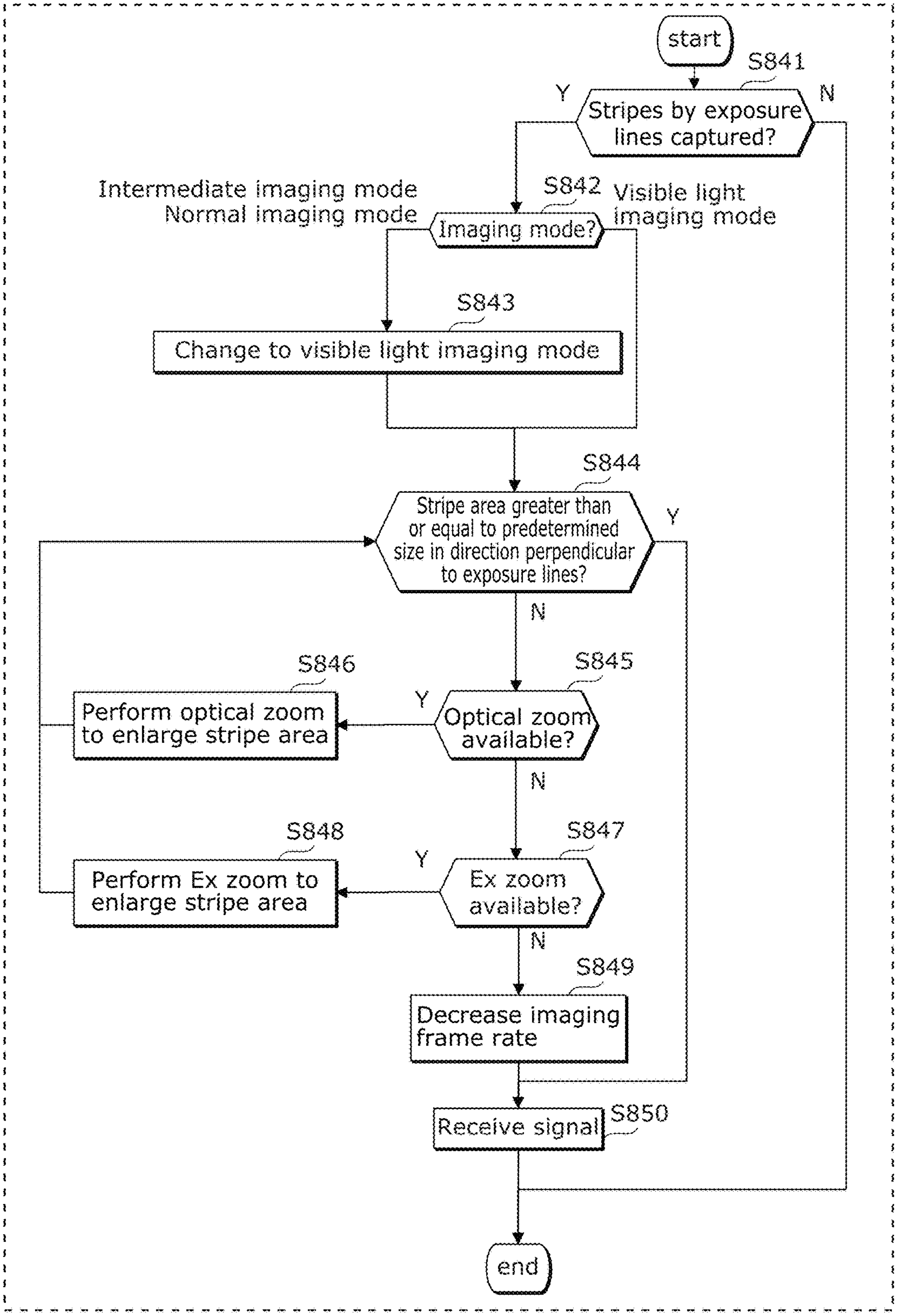

Though the frame rate is decreased in the case where optical zoom and Ex zoom are not available in the example illustrated in FIG. 217B, the frame rate may be decreased in the case where optical zoom and Ex zoom are available. Ex zoom is a function of limiting the use area of the image sensor and reducing the imaging angle of view so that the apparent focal length is telephoto.

FIG. 218 is a diagram illustrating operation of a receiver in Embodiment 9.

In the case where a lighting device 8978 which is a transmitter is shown in a small size in a captured image 8980*a*, the receiver can obtain a captured image 8980*b* in which the lighting device 8978 is shown in a larger size, through the use of optical zoom or Ex zoom. Thus, the use of optical zoom or Ex zoom enables the receiver to obtain a bright line image (captured image) having a bright line area that is long in the direction perpendicular to bright lines.

FIG. 219 is a diagram illustrating an example of application of a transmitter in Embodiment 9.

A transmitter 8981 has a function as a transmitter in each of the above embodiments, and communicates with an operation panel 8982 as an example. The operation panel 8982 includes a transmission switch 8982*a* and a power switch 8982*b*.

When the transmission switch 8982*a* is turned on, the operation panel 8982 instructs the transmitter 8981 to perform visible light communication. Upon receiving the instruction, the transmitter 8981 transmits a signal by changing in luminance. When the transmission switch 8982*a* is turned off, the operation panel 8982 instructs the transmitter 8981 to stop visible light communication. Upon receiving the instruction, the transmitter 8981 stops signal transmission without changing in luminance.

When the power switch 8982*b* is turned on, the operation panel 8982 instructs the transmitter 8981 to turn on the power of the transmitter 8981. Upon receiving the instruction, the transmitter 8981 turns its power on. For example, in the case where the transmitter 8981 is a lighting device, the transmitter 8981 turns its power on to illuminate the surroundings. In the case where the transmitter 8981 is a television, the transmitter 8981 turns its power on to display video and the like. When the power switch 8982*b* is turned off, the operation panel 8982 instructs the transmitter 8981 to turn off the power of the transmitter 8981. Upon receiving the instruction, the transmitter 8981 turns its power off and enters a standby state.

FIG. 220 is a diagram illustrating an example of application of a receiver in Embodiment 9.

For example, a receiver 8973 as a smartphone has a function as a transmitter in each of the above embodiments, and obtains an authentication ID and an expiration date from a server 8983. In the case where the current time is within the expiration date, the receiver 8973 transmits the authentication ID to a peripheral device 8984 by changing, for example, its display in luminance. Examples of the peripheral device 8984 include a camera, a barcode reader, and a personal computer.

Having received the authentication ID from the receiver 8973, the peripheral device 8984 transmits the authentication ID to the server 8983, and requests verification. The server 8983 compares the authentication ID transmitted from the peripheral device 8984 and the authentication ID held in the server 8983 and transmitted to the receiver 8973. When they match, the server 8983 notifies the peripheral device 8984 of the match. Having received the notification of the match from the server 8983, the peripheral device 8984 releases a lock set therein, executes electronic payment, or performs a login process or the like.

FIG. 221A is a flowchart illustrating an example of operation of a transmitter in Embodiment 9.

The transmitter in this embodiment has a function as a transmitter in each of the above embodiments, and is a lighting device or a display as an example. For instance, the transmitter determines whether or not the light control level (brightness level) is less than a predetermined level (Step S861*a*). In the case of determining that the light control level is less than the predetermined level (Step S861*a*: Y), the transmitter stops signal transmission by luminance change (Step S861*b*).

FIG. 221B is a flowchart illustrating an example of operation of a transmitter in Embodiment 9.

The transmitter in this embodiment determines whether or not the light control level (brightness level) is greater than a predetermined level (Step S862*a*). In the case of determining that the light control level is greater than the predetermined level (Step S862*a*: Y), the transmitter starts signal transmission by luminance change (Step S862*b*).

FIG. 222 is a flowchart illustrating an example of operation of a transmitter in this embodiment.

The transmitter in this embodiment determines whether or not a predetermined mode is selected (Step S863*a*). For example, the predetermined mode is eco mode or power saving mode. In the case of determining that the predetermined mode is selected (Step S863*a*: Y), the transmitter stops signal transmission by luminance change (Step S863*b*). In the case of determining that the predetermined mode is not selected (Step S863*a*: N), the transmitter starts signal transmission by luminance change (Step S863*c*).

FIG. 223 is a flowchart illustrating an example of operation of an imaging device in Embodiment 9.

The imaging device in this embodiment is a video camera as an example, and determines whether or not the imaging device is in a recording process (Step S864*a*). In the case of determining that the imaging device is in a recording process (Step S864*a*: Y), the imaging device transmits a visible light transmission stop instruction to a transmitter transmitting a signal by luminance change (Step S864*b*). Upon receiving the visible light transmission stop instruction, the transmitter stops signal transmission by luminance change (visible light transmission). In the case of determining that the imaging device is not in a recording process (Step S864*a*: N), the imaging device further determines whether or not recording has been stopped, i.e. the imaging device has just stopped recording (Step S864*c*). In the case of determining that recording has been stopped (Step S864*c*: Y), the imaging device transmits a visible light transmission start instruction to the transmitter (Step S864*d*). Upon receiving the visible light transmission start instruction, the transmitter starts signal transmission by luminance change (visible light transmission).

FIG. 224 is a flowchart illustrating an example of operation of an imaging device in Embodiment 9.

The imaging device in this embodiment is a digital still camera as an example, and determines whether or not an imaging button (shutter button) is being half pressed or whether or not focus is being adjusted (Step S865*a*). The imaging device then determines whether or not a light and dark area appears in the direction along exposure lines in an image sensor included in the imaging device (Step S865*b*). In the case of determining that the light and dark area appears (Step S865*b*: Y), there is a possibility that a transmitter transmitting a signal by luminance change is near the imaging device. The imaging device accordingly transmits a visible light transmission stop instruction to the transmitter (Step S865*c*). After this, the imaging device performs imaging to obtain a captured image (Step S865*d*). The imaging device then transmits a visible light transmission start instruction to the transmitter (Step S865*e*). Thus, the imaging device can obtain the captured image, without being affected by the luminance change by the transmitter. Moreover, since the time during which signal transmission by luminance change is stopped is a very short period of time when the imaging device performs imaging, the time during which visible light communication is disabled can be reduced.

FIG. 225 is a diagram illustrating an example of a signal transmitted by a transmitter in Embodiment 9.

The transmitter in this embodiment has a function as a transmitter in each of the above embodiments, and outputs high-luminance light (Hi) or low-luminance light (Lo) per slot, thereby transmitting a signal. In detail, the slot is a time unit of 104.2 μs. The transmitter outputs Hi to transmit a signal indicating 1, and outputs Lo to transmit a signal indicating 0.

FIG. 226 is a diagram illustrating an example of a signal transmitted by a transmitter in Embodiment 9.

The above-mentioned transmitter outputs Hi or Lo per slot, thereby transmitting each PHY (physical layer) frame which is a signal unit in sequence. The PHY frame includes a preamble made up of 8 slots, an FCS (Frame Check Sequence) made up of 2 slots, and a body made up of 20 slots. The parts included in the PHY frame are transmitted in the order of the preamble, the FCS, and the body.

The preamble corresponds to the header of the PHY frame, and includes “01010111” as an example. The preamble may be made up of 7 slots. In this case, the preamble includes “0101011”. The FCS includes “01” in the case where the number of 1s included in the body is an even number, and “11” in the case where the number of 1s included in the body is an odd number. The body includes 5 symbols each of which is made up of 4 slots. In the case of 4-value PPM, the symbol includes “0111”, “1011”, “1101”, or “1110”.

FIG. 227 is a diagram illustrating an example of a signal transmitted by a transmitter in Embodiment 9.

The above-mentioned symbol is converted to a 2-bit value by a receiver. For example, the symbols “0111”, “1011”, “1101”, and “1110” are respectively converted to “00”, “01”, “10”, and “11”. Accordingly, the body (20 slots) of the PHY frame is converted to a 10-bit signal. The 10-bit body includes 3-bit TYPE indicating the type of the PHY frame, 2-bit ADDR indicating the address of the PHY frame or the body, and 5-bit DATA indicating the entity of data. For example, in the case where the type of the PHY frame is TYPE1, TYPE indicates “000”. ADDR indicates “00”, “01”, “10”, or “11”.

The receiver concatenates DATA included in the respective bodies of 4 PHY frames. ADDR mentioned above is used in this concatenation. In detail, the receiver concatenates DATA included in the body of the PHY frame having ADDR “00”, DATA included in the body of the PHY frame having ADDR “01”, DATA included in the body of the PHY frame having ADDR “10”, and DATA included in the body of the PHY frame having ADDR “11”, thus generating 20-bit data. The four PHY frames are decoded in this way. The generated data includes 16-bit effective DATA and 4-bit CRC (Cyclic Redundancy Check).

FIG. 228 is a diagram illustrating an example of a signal transmitted by a transmitter in Embodiment 9.

The type of the PHY frame mentioned above includes TYPE1, TYPE2, TYPE3, and TYPE4. The body length, the ADDR length, the DATA length, the number of DATA concatenated (concatenation number), the effective DATA length, and the CRC type differ between these types.

For example, in TYPE1, TYPE (TYPEBIT) indicates “000”, the body length is 20 slots, the ADDR length is 2 bits, the DATA length is 5 bits, the concatenation number is 4, the effective DATA length is 16 bits, and the CRC type is CRC-4. In TYPE2, on the other hand, TYPE (TYPEBIT) indicates “001”, the body length is 24 slots, the ADDR length is 4 bits, the DATA length is 5 bits, the concatenation number is 8, the effective DATA length is 32 bits, and the CRC type is CRC-8.

The use of such a signal illustrated in FIGS. 225 to 228 enables visible light communication to be performed appropriately.

FIG. 229 is a diagram illustrating an example of a structure of a system including a transmitter and a receiver in Embodiment 9.

The system in this embodiment includes a transmitter 8991 having the same function as a transmitter in each of the above embodiments, a receiver 8973 such as a smartphone, a content sharing server 8992, and an ID management server 8993.

For instance, a content creator uploads, to the content sharing server 8992, content such as audio video data representing a still image or a moving image for introducing a product, and product information indicating the manufacturer, area of production, material, specifications, etc. of the product. The content sharing server 8992 registers the product information in the ID management server 8993, in association with a content ID for identifying the content.

Following this, the transmitter 8991 downloads the content and the content ID from the content sharing server 8992, displays the content, and transmits the content ID by changing in luminance, i.e. by visible light communication, according to an operation by the user. The user views the content. In the case where the user is interested in the product introduced in the content, the user points the receiver 8973 at the transmitter 8991 to capture the transmitter 8991. The receiver 8973 captures the content displayed on the transmitter 8991, thus receiving the content ID.

The receiver 8973 then accesses the ID management server 8993, and inquires of the ID management server 8993 for the content ID. As a result, the receiver 8973 receives the product information associated with the content ID from the ID management server 8993, and displays the product information. When the receiver 8973 receives an operation requesting to buy the product corresponding to the product information, the receiver 8973 accesses the manufacturer of the product and executes a process for buying the product.

Next, the ID management server notifies inquiry information indicating the number of inquiries or the number of accesses made for the content ID, to the manufacturer indicated by the product information associated with the content ID. Having received the inquiry information, the manufacturer pays an affiliate reward corresponding to the number of inquiries or the like indicated by the inquiry information to the content creator specified by the content ID, by electronic payment via the ID management server 8993 and the content sharing server 8992.

FIG. 230 is a diagram illustrating an example of a structure of a system including a transmitter and a receiver in Embodiment 9.

In the example illustrated in FIG. 229, when the content and the product information are uploaded, the content sharing server 8992 registers the product information in the ID management server 8993 in association with the content ID. However, such registration may be omitted. For example, the content sharing server 8992 searches the ID management server for a product ID for identifying the product of the uploaded product information, and embeds the product ID in the uploaded content, as illustrated in FIG. 230.

Following this, the transmitter 8991 downloads the content in which the product ID is embedded and the content ID from the content sharing server 8992, displays the content, and transmits the content ID and the product ID by changing in luminance, i.e. by visible light communication, according to an operation by the user. The user views the content. In the case where the user is interested in the product introduced in the content, the user points the receiver 8973 at the transmitter 8991 to capture the transmitter 8991. The receiver 8973 captures the content displayed on the transmitter 8991, thus receiving the content ID and the product ID.

The receiver 8973 then accesses the ID management server 8993, and inquires of the ID management server 8993 for the content ID and the product ID. As a result, the receiver 8973 receives the product information associated with the product ID from the ID management server 8993, and displays the product information. When the receiver 8973 receives an operation requesting to buy the product corresponding to the product information, the receiver 8973 accesses the manufacturer of the product and executes a process for buying the product.

Next, the ID management server notifies inquiry information indicating the number of inquiries or the number of accesses made for the content ID and the product ID, to the manufacturer indicated by the product information associated with the product ID. Having received the inquiry information, the manufacturer pays an affiliate reward corresponding to the number of inquiries or the like indicated by the inquiry information to the content creator specified by the content ID, by electronic payment via the ID management server 8993 and the content sharing server 8992.

FIG. 231 is a diagram illustrating an example of a structure of a system including a transmitter and a receiver in Embodiment 9.

The system in this embodiment includes a content sharing server 8992*a* instead of the content sharing server 8992 illustrated in FIG. 230, and further includes an SNS server 8994. The SNS server 8994 is a server providing a social networking service, and performs part of the process performed by the content sharing server 8992 illustrated in FIG. 230.

In detail, the SNS server 8994 obtains the content and the product information uploaded from the content creator, searches for the product ID corresponding to the product information, and embeds the product ID in the content. The SNS server 8994 then transfers the content in which the product ID is embedded, to the content sharing server 8992*a*. The content sharing server 8992*a* receives the content transferred from the SNS server 8994, and transmits the content in which the product ID is embedded and the content ID to the transmitter 8991.

Thus, in the example illustrated in FIG. 231, the unit including the SNS server 8994 and the content sharing server 8992*a* serves as the content sharing server 8992 illustrated in FIG. 230.

In the system illustrated in each of FIGS. 229 to 231, an appropriate affiliate reward can be paid for an advertisement (content) for which inquiries have been made using visible light communication.

Though the information communication method according to one or more aspects has been described by way of the embodiments above, the present disclosure is not limited to these embodiments. Modifications obtained by applying various changes conceivable by those skilled in the art to the embodiments and any combinations of structural elements in different embodiments are also included in the scope of one or more aspects without departing from the scope of the present disclosure.

The following describes the embodiment.

(Mixed Modulation Scheme)

FIGS. 232 and 233 are diagrams illustrating an example of operation of a transmitter in Embodiment 9.

As illustrated in FIG. 232, the transmitter modulates a transmission signal by a plurality of modulation schemes, and transmits modulated signals alternately or simultaneously.

By modulating the same signal by the plurality of modulation schemes and transmitting the modulated signals, even a receiver that supports only one of the modulation schemes can receive the signal. Moreover, for example, the combined use of a modulation scheme with high transmission speed, a modulation scheme with high noise resistance, and a modulation scheme with long communication distance allows reception to be performed using an optimal method according to the receiver environment.

In the case where the receiver supports reception by the plurality of modulation schemes, the receiver receives the signals modulated by the plurality of schemes. When modulating the same signal, the transmitter assigns the same signal ID to the modulated signals, and transmits the modulated signals. By checking the signal ID, the receiver can recognize that the same signal is modulated by the different modulation schemes. The receiver synthesizes the signal having the same signal ID from the plurality of types of modulated signals, with it being possible to receive the signal promptly and accurately.

For example, the transmitter includes a signal dividing unit and modulation units 1 to 3. The signal dividing unit divides a transmission signal into a partial signal 1 and a partial signal 2, and attaches a signal ID to the partial signal 1 and another signal ID to the partial signal 2. The modulation unit 1 generates a signal having sine waves by performing frequency modulation on the partial signal 1 with the signal ID. The modulation unit 2 generates a signal having square waves by performing, on the partial signal 1 with the signal ID, frequency modulation different from that performed by the modulation unit 1. Meanwhile, the modulation unit 3 generates a signal having square waves by performing pulse-position modulation on the partial signal 2 with the other signal ID.

As illustrated in FIG. 233, the transmitter transmits together the signals modulated by a plurality of modulation schemes. In the example in FIG. 233, with a long exposure time set, the receiver can receive only the signal modulated by a frequency modulation scheme that uses a low frequency. With a short exposure time set, the receiver can receive the signal modulated by the pulse-position modulation scheme that uses a high frequency band. In this case, the receiver will obtain a temporal average of strength of received light by calculating an average of luminance in a direction perpendicular to a bright line, and thus can obtain a signal that is the same as a signal obtained when the exposure time is long.

(Transmission Signal Verification and Digital Modulation)

FIGS. 234 and 235 are diagrams illustrating an example of a structure and operation of a transmitter in Embodiment 9.

As illustrated in FIG. 234, the transmitter includes a signal storage unit, a signal verification unit, a signal modulation unit, a light emitting unit, an abnormality notification unit, a source key storage unit, and a key generation unit. The signal storage unit stores a transmission signal and a signal conversion value obtained by converting the transmission signal using a verification key described later. A one-way function is used for this conversion. The source key storage unit stores a source key which is a source value of a key, for example as a circuit constant such as a time constant or a resistance. The key generation unit generates the verification key from the source key.

The signal verification unit converts the transmission signal stored in the signal storage unit using the verification key, to obtain a signal conversion value. The signal verification unit determines whether or not the signal has not been tampered with, depending on whether or not the obtained signal conversion value and the signal conversion value stored in the signal storage unit are equal. Even when the signal in the signal storage unit is copied to another transmitter, this other transmitter cannot transmit the signal because the verification key is different. Transmitter forgery can thus be prevented.

In the case where the signal has been tampered with, an abnormality notification unit notifies that the signal has been tampered with. Examples of the notification method include blinking a light emitting unit in a cycle visible to humans, outputting a sound, and so on. By limiting the abnormality notification to a predetermined time immediately after power on, the transmitter can be put to use other than transmission even in the case where the signal has an abnormality.

In the case where the signal has not been tampered with, a signal modulation unit converts the signal to a light emission pattern. Various modulation schemes are available. For example, the following modulation schemes are available: amplitude shift keying (ASK); phase shift keying (PSK); frequency shift keying (FSK); quadrature amplitude modulation (QAM); delta modulation (DM); minimum shift keying (MSK); complementary code keying (CCK); orthogonal frequency division multiplexing (OFDM); amplitude modulation (AM); frequency modulation (FM); phase modulation (PM); pulse width modulation (PWM); pulse amplitude modulation (PAM); pulse density modulation (PDM); pulse position modulation (PPM); pulse code modulation (PCM); frequency hopping spread spectrum (FHSS); and direct sequence spread spectrum (DSSS). A modulation scheme is selected according to the property of the transmission signal (whether analog or digital, whether continuous data transmission or not, etc.) and the required performance (transmission speed, noise resistance, transmission distance). Moreover, two or more modulation schemes may be used in combination.

In Embodiments 1 to 9, the same advantageous effects can be achieved in the case where the signal modulated by any of the above-mentioned modulation schemes is used.

As illustrated in FIG. 235, the transmitter may include a signal demodulation unit instead of the signal verification unit. In this case, a signal storage unit holds an encrypted transmission signal obtained by encrypting a transmission signal using an encryption key that is paired with a decryption key generated in a key generation unit. The signal demodulation unit decrypts the encrypted transmission signal, using the decryption key. This structure makes it difficult to forge a transmitter, i.e. to produce a transmitter for transmitting an arbitrary signal.

Embodiment 10

This embodiment describes each example of application using a receiver such as a smartphone and a transmitter for transmitting information as a blink pattern of an LED or an organic EL device in each of the embodiments described above.

(Signal Reception from a Plurality of Directions by a Plurality of Light Receiving Units)

FIG. 236 is a diagram illustrating a watch including light sensors.

This watch is configured as a receiver for visible light communication, and includes light sensors and collecting lenses corresponding to the respective light sensors. Specifically, a collecting lens is placed on the top surface of each sensor as illustrated in the cross sectional view in FIG. 236. In FIG. 236, the collecting lens has a predetermined tilt. The shape of the collecting lens is not limited to this, and may be any other shape capable of collecting light. With this structure, the light sensor can collect and receive light from a light source in the external world, by the lens. Even a small light sensor as included in a watch can thus perform visible light communication. In FIG. 236, the watch is divided into 12 areas and 12 light sensors are arranged in the areas, with the collecting lens being placed on the top surface of each light sensor. By dividing the inside of the watch into a plurality of areas and arranging a plurality of light sensors in this way, it is possible to obtain information from a plurality of light sources. For example, in FIG. 236, a first light sensor can receive light from a light source 1, and a second light sensor can receive light from a light source 2. A solar cell may be used as a light sensor. The use of a solar cell as a light sensor enables solar power to be generated and also visible light communication to be performed by a single sensor, which contributes to lower cost and a more compact shape. Moreover, in the case where a plurality of light sensors are arranged, information from a plurality of light sources can be obtained simultaneously, with it being possible to improve the position estimation accuracy. Though this embodiment describes a structure of providing light sensors in a watch, this is not a limit for the present disclosure, and it may be possible to provide light sensors in any movable device such as a mobile phone or a mobile terminal.

FIG. 237 is a diagram illustrating an example of a receiver in Embodiment 10.

A receiver 9020*a* such as a wristwatch includes a plurality of light receiving units. For example, the receiver 9020*a* includes, as illustrated in FIG. 237, a light receiving unit 9020*b* on the upper end of a rotation shaft that supports the minute hand and the hour hand of the wristwatch, and a light receiving unit 9020*c* near the character indicating the 12 o'clock on the periphery of the wristwatch. The light receiving unit 9020*b* receives light directed to thereto along the direction of the above-mentioned rotation shaft, and the light receiving unit 9020*c* receives light directed thereto along a direction connecting the rotation shaft and the character indicating the 12 o'clock. Thus, the light receiving unit 9020*b* can receive light from above when the user holds the receiver 9020*a* in front of his or her chest as when checking the time. As a result, the receiver 9020*a* is capable of receiving a signal from a ceiling light. The light receiving unit 9020*c* can receive light from front when the user holds the receiver 9020*a* in front of his or her chest as when checking the time. As a result, the receiver 9020*a* can receive a signal from a signage or the like in front of the user.

When these light receiving units 9020*b* and 9020*c* have directivity, the signal can be received without interference even in the case where a plurality of transmitters are located nearby.

FIG. 238 is a diagram illustrating an example of a receiver in Embodiment 10.

For example, as illustrated in (a) in FIG. 238, the receiver 9021 such as a wristwatch includes 17 light receiving elements (light receiving units). These light receiving elements are arranged on the watch face. Out of these light receiving elements, 12 light receiving elements are arranged at positions corresponding to 1 o'clock to 12 o'clock on the watch face, and the remaining five light receiving elements are arranged in a central area on the watch face. Each of these 17 light receiving elements has different directivity and receives light (a signal) in a corresponding direction. Thus, as a result of arranging a plurality of light receiving elements having directivity, the receiver 9021 can estimate the direction of the received signal. Furthermore, prisms for guiding light to the light receiving elements may be arranged in front of the light receiving elements as illustrated in (b) in FIG. 238. Specifically, the receiver 9021 includes eight light emitting elements arranged at regular intervals in a peripheral part on the watch face, and a plurality of prisms for guiding light to at least one of those light emitting elements. With such prisms, an accurate direction of the transmitter can be estimated even when the number of light receiving elements is small. For example, when only a light receiving element 9021*d* of the eight light receiving elements receives light, the receiver 9021 can estimate that the transmitter is situated in a direction connecting the center of the watch face and a prism 9021*a*. When light receiving elements 9021*d* and 9021*e* receive the same signal, the receiver 9021 can estimate that the transmitter is situated in a direction connecting the center of the watch face and a prism 9021*b*. Note that windshield glass of the wristwatch may be given the directivity function and the prism function.

FIG. 239A is a flowchart of an information communication method according to an aspect of the present disclosure.

The information communication method according to an aspect of the present disclosure is an information communication method of obtaining information by a mobile terminal and includes Steps SE11 and SE12.

Specifically, this information communication method includes: receiving, by at least one of a plurality of solar cells included in the mobile terminal and each having directivity, visible light released along a direction corresponding to the directivity of the at least one of the plurality of solar cells (SE11); and obtaining the information by demodulating a signal specified by the received visible light (SE12).

FIG. 239B is a block diagram of a mobile terminal according to an aspect of the present disclosure.

A mobile terminal E10 according to an aspect of the present disclosure is a mobile terminal that obtains information, and includes a plurality of solar cells E11 each having directivity, and an information obtainment unit E12. When at least one of the plurality of solar cells E11 receives visible light released along a direction corresponding to the directivity of the solar cell E11, the information obtainment unit E12 obtains information by demodulating a signal specified by the received visible light.

In the information communication method and the mobile terminal E10 illustrated in FIGS. 239A and 239B, the solar cell E11 can be used in power generation while being used as a light sensor for visible light communication, and thus it is possible to reduce the cost for the mobile terminal E10 that obtains information and also possible to downsize the mobile terminal E10. Furthermore, since each of the plurality of solar cells E11 has directivity, the direction where a transmitter that emits visible light is present can be estimated based on the directivity of the solar cell E11 that has received visible light. Moreover, since each of the plurality of solar cells E11 has directivity, it is possible that visible light emitted from one transmitter is received separately from visible light emitted from another, and thus it is possible to appropriately obtain information from each of the plurality of transmitters.

Furthermore, in the receiving (SE11), the solar cell E11 (9021*d*, 9021*e*) may receive visible light transmitted by the prism (9021*a*, 9021*b*, or 9021*c*) included in the mobile terminal E10 (9021) as illustrated in (b) in FIG. 238. This makes it possible to accurately estimate a direction where a transmitter that emits visible light is present while reducing the number of solar cells E11 included in the mobile terminal E10. Furthermore, as illustrated in FIG. 238, the mobile terminal E10 is a wristwatch, and the plurality of solar cells E11 (the light receiving elements) are arranged along an outer edge of the watch face of the wristwatch. The orientation of the visible light received by one of the plurality of solar cells E11 may be different from the orientation of the visible light received by another. With this, it is possible to appropriately obtain information by a wristwatch.

(Cooperation Between Watch-Type Receiver and Smartphone)

FIG. 240 is a diagram illustrating an example of a reception system in Embodiment 10.

A receiver 9022*b* such as a wristwatch is connected to a smartphone 9022*a* or a glasses-type display 9022*c* via wireless communication such as Bluetooth®. In the case where the receiver 9022*b* receives a signal or detects the presence of a signal, the receiver 9022*b* displays, on the display 9022*c*, information indicating reception of the signal, for example. The receiver 9022*b* transmits the received signal to the smartphone 9022*a*. The smartphone 9022*a* obtains data associated with the received signal from a server 9022*d*, and displays the obtained data on the glasses-type display 9022*c*.

(Route Guidance by Wristwatch-Type Display)

FIG. 241 is a diagram illustrating an example of a reception system in Embodiment 10.

A receiver 9023*b* such as a wristwatch is connected to a smartphone 9022*a* via wireless communication such as Bluetooth®. The receiver 9023*b* has a watch face composed of a display such as a liquid crystal display, and is capable of displaying information other than the time. The smartphone 9022_a_ recognizes the current position from a signal received by the receiver 9023_b_, and displays the route and distance to the destination on the display surface of the receiver 9023_b_.

(Frequency Shift Keying and Frequency Multiplex Modulation)

FIGS. 242A, 242B, and 242C are diagrams illustrating an example of a modulation scheme in Embodiment 10.

In (a) in FIG. 242A, a specific signal is expressed as a specific modulation frequency. The receiver performs frequency analysis on a light pattern (a pattern of luminance change of a light source) to determine a dominant modulation frequency, and reconstructs a signal.

In (a) in FIG. 242C, the modulation frequency is changed with time. This enables many values to be expressed. A typical image sensor has an imaging frame rate of 30 fps. Accordingly, reception can be ensured by continuing one modulation frequency for 1/30 second or more. In (b) in FIG. 242C, a time during which no signal is superimposed is inserted when changing the frequency. As a result, the receiver can easily recognize the change of the modulation frequency. A light pattern in the time during which no signal is superimposed can be distinguished from that in the signal superimposition part, by maintaining constant brightness or using a specific modulation frequency. When a frequency that is an integer multiple of 30 Hz is set as the specific modulation frequency, the non-signal superimposition part is unlikely to appear in the difference image and hamper the reception process. The length of the time during which no signal is superimposed may be greater than or equal to the same length as a signal of the longest period among light patterns used for signals. This facilitates reception. As an example, if a light pattern of a lowest modulation frequency is 100 Hz, the time during which no signal is superimposed is set to greater than or equal to 1/100 second.

FIG. 242A illustrates, in (b), an example (1) in which a specific bit and a specific modulation frequency are associated with each other, and a light pattern is expressed as a waveform in which modulation frequencies corresponding to bit "1" are overlapped. Specifically, when the first bit has 1 as information to be transmitted, the transmitter changes in luminance with a light pattern of frequency $f_1$ which is 1000 Hz. When the second bit has 1 as information to be transmitted, the transmitter changes in luminance with a light pattern of frequency $f_2$ which is 1100 Hz. When the third bit has 1 as information to be transmitted, the transmitter changes in luminance with a light pattern of frequency $f_3$ which is 1200 Hz. Therefore, when transmitting information of a bit string "110," for example, the transmitter changes in luminance with the light pattern of the frequency $f_2$ during time $T_2$ and changes in luminance with the light pattern of the frequency $f_1$ during time $T_1$ longer than the time $T_2$. When transmitting information of a bit string "111," for example, the transmitter changes in luminance with the light pattern of the frequency $f_2$ during time $T_2$, changes in luminance with the light pattern of the frequency $f_3$ during time $T_3$ shorter than the time $T_2$, and changes in luminance with the light pattern of the frequency $f_1$ during the time $T_1$. In this case, it is possible to express more values although a higher carrier to noise ratio (CN ratio) is necessary than the modulation scheme (a). In the example (1), when there is a large number of ON bits, that is, when the waveform includes many frequencies, there is a problem that energy per frequency becomes lower, requiring a higher CN ratio.

Therefore, in the example (2) in which a light pattern is expressed, the number of frequencies included in the waveform is limited to a predetermined number or less, that is, the number of frequencies is set variable below a predetermined number. Alternatively, in the example (3) in which a light pattern is expressed, the number of frequencies included in the waveform is limited to a predetermined number. By doing so, it is possible to avoid the above-described problem. As compared to the example (1) and the example (2), the example (3) allows signals and noise to be more easily separated and is most tolerant to noise because the number of included frequencies is predetermined.

When signals are represented using n different frequencies, $2^n-1$ different signals can be represented in the example (1). Furthermore, when the frequencies are limited to m different frequencies, $(\Sigma(k=1 \text{ to } m)_nC_k)-1$ different signals can be represented in the example (2), and $_nC_m$ different signals can be represented in the example (3).

As the method of overlapping a plurality of modulation frequencies, there are the following methods: (i) simply adding up waveforms; (ii) weighted averaging using weighted waveforms; and (iii) repeating the respective waveforms of the frequencies in sequence. When the receiver performs frequency analysis such as discrete cosine series expansion, an adjustment is preferably performed in the weighted averaging in (ii) such that the peak of each frequency is the same or similar, because there is a tendency for a higher frequency to have a lower peak. Specifically, it is preferred that more weight be given to a higher frequency. In (iii), it is possible to adjust the level of the frequency peak upon reception by adjusting the ratio of the number of outputs (the number of cycles) rather than repeating one output of the waveform of each frequency (on a per cycle basis). It may be that the number of output cycles is set larger for a higher frequency or that the length of time for output is set longer for a higher frequency. Through this adjustment, it is possible to facilitate the reception process by equalizing the levels of frequency peaks, and also possible to represent additional information by giving meaning to a difference between the levels of frequency peaks. For example, when the order of the levels of the frequency peaks is given meaning, it is possible to add information of $\log_2(n!)$ bits where n different frequencies are included. The frequency may be changed every period, every half a period, every multiple of half a period, or every length of predetermined time. The timing of changing the frequency may be when the luminance has the highest value, the lowest value, or any value. It is possible to reduce flicker by equalizing luminance before changing the frequency and luminance after changing the frequency (=continuously changing the luminance). This can be achieved when transmission signals are output at each frequency for a length of time that is an integral multiple of a half of the wavelength at the frequency. Here, the length of time of output at each frequency is different. Furthermore, when signals are output at a certain frequency for a length of time that is an integer multiple of a half of the period, the receiver can easily recognize by frequency analysis that the frequency is included in the signals even in the case of digital output. Discontinuous output rather than continuous output at the same frequency is better as it is hard to be caught by human eyes or cameras. For example, when period $T_1$ appears twice, $T_2$ appears twice, and $T_3$ appears once in terms of the proportion of output, $T_1T_2T_3T_2T_1$ is better than $T_1T_1T_2T_2T_3$. Instead of repeating the output in a predetermined order, output in varying order may also be applicable. This order may be given meaning to represent additional information. This order cannot be seen from the frequency peaks, but it is possible to obtain such information by analyzing the order of frequencies. Since the exposure time needs to be set shorter in the case of analyzing the order of the frequencies than the case of analyzing the frequency peaks, it may be possible to set the exposure time short only when the additional information is necessary, or it may be possible that only the receiver that can set the exposure time short can obtain the additional information.

In FIG. 242B, the signals of FIG. 242A are represented in a binary light pattern. In the methods (i) and (ii) among the methods of overlapping frequencies, analog waveforms are complicated, and even when such analog waveforms are binarized, it is not possible to represent a complicated form. Consequently, the receiver fails to obtain a correct frequency peak, leading to more reception errors. In the method (iii), analog waveforms are not complicated, meaning that binarization has less influence thereon, and thus a relatively correct frequency peak can be obtained. Therefore, the method (iii) is superior in the case of using a digitalized light pattern with, for example, a binary or a small number of values. This modulation method can be construed as one type of frequency modulation from the standpoint that signals are represented based on frequencies in a light pattern, or can alternatively be construed as one type of PWM from the standpoint that signals are represented through adjustment on the duration of pulses.

With the setting in which the unit of time for a change in luminance is a discrete value, it is possible to transmit and receive signals in the same or similar way as pulse modulation. The average luminance can be set high by setting a low luminance section as the shortest unit of time regardless of the length of the period of a transmission frequency. Here, since the average luminance increases when the period of the transmission frequency is longer, it is possible to increase the average luminance by increasing the number of outputs at this frequency with a long period. Even when low luminance sections have the same length, a high luminance section is set to have a length determined by subtracting the length of the low luminance section from the period of the transmission frequency. By doing so, a frequency peak will appear in the transmission frequency when the frequency analysis is performed. Thus, when a frequency analysis technique such as the discrete cosine transform is used, the exposure time of the receiver does not need to be set so short to enable the receiver to receive signals.

In (c) in FIG. 242C, the modulation frequency overlap is changed with time in the same way as (a) in FIG. 242C. This enables many values to be expressed.

A signal of a high modulation frequency cannot be received unless the exposure time is short. Up to a certain level of modulation frequency, however, can be used without setting the exposure time. When a signal modulated using frequencies from low to high modulation frequencies is transmitted, all terminals can receive the signal expressed by the low modulation frequency. Besides, a terminal capable of setting a short exposure time also receives the signal up to the high modulation frequency, with it being possible to receive more information from the same transmitter at high speed. Alternatively, it may be that when a modulation signal of a low frequency is found in a normal imaging mode, overall transmission signals including a modulation signal of a high frequency are received in a visible light communication mode.

The frequency shift keying scheme and the frequency multiplex modulation scheme have an advantageous effect of causing no flicker perceivable by the human eye even in the case where a lower modulation frequency than when expressing a signal by pulse position is used, and so can use many frequency bands.

In Embodiments 1 to 10, the same advantageous effects can be achieved in the case where the signal modulated by the above-mentioned reception scheme and modulation scheme is used.

(Separation of Mixed Signal)

FIGS. 242D and 242E are diagrams illustrating an example of separation of a mixed signal in Embodiment 10.

A receiver has functions of (a) in FIG. 242D. A light receiving unit receives a light pattern. A frequency analysis unit Fourier transforms the light pattern, to map a signal in a frequency domain. A peak detection unit detects a peak of a frequency component in the light pattern. In the case where no peak is detected by the peak detection unit, the subsequent process is suspended. A peak time change analysis unit analyzes a time change of a peak frequency. A signal source specification unit specifies, in the case where a plurality of frequency peaks are detected, a combination of modulation frequencies of signals transmitted from the same transmitter.

Thus, reception can be performed without signal interference even in the case where a plurality of transmitters are located nearby. When light from a transmitter is reflected off a floor, a wall, or a ceiling and received, light from a plurality of transmitters tends to be mixed. Even in such a case, reception can be performed without signal interference.

As an example, in the case where the receiver receives a light pattern in which a signal of a transmitter A and a signal of a transmitter B are mixed, frequency peaks are obtained as in (b) in FIG. 242D. Since $f_{A1}$ disappears and $f_{A2}$ appears, $f_{A1}$ and $f_{A2}$ can be specified as signals from the same transmitter. Likewise, $f_{A1}$, $f_{A2}$, and $f_{A3}$ can be specified as signals from the same transmitter, and $f_{B1}$, $f_{B2}$, and $f_{B3}$ can be specified as signals from the same transmitter.

By fixing the time interval at which one transmitter changes the modulation frequency, it is possible to easily specify the signals from the same transmitter.

When a plurality of transmitters change the modulation frequency at the same timing, the signals from the same transmitter cannot be specified by the above-mentioned method. Hence, the time interval at which the modulation frequency is changed differs between transmitters. This prevents a situation where the plurality of transmitters change the modulation frequency always at the same timing, so that the signals from the same transmitter can be specified.

As illustrated in (c) in FIG. 242D, the time from when the transmitter changes the modulation frequency to when the transmitter changes the modulation frequency next time is calculated from the current modulation frequency and the modulation frequency before the change. In so doing, even in the case where the plurality of transmitters change the modulation frequency at the same timing, it is possible to specify which signals of modulation frequencies are transmitted from the same transmitter.

Each transmitter may recognize the transmission signal of the other transmitter, and adjust the modulation frequency change timing to be different from the other transmitter.

The method described above produces the same advantageous effects not only in the case of frequency shift keying where one transmission signal has one modulation frequency but also in the case where one transmission signal has a plurality of modulation frequencies.

In the case where the light pattern is not changed with time in the frequency multiplex modulation scheme as illustrated in (a) in FIG. 242E, the signals from the same transmitter cannot be specified. However, by inserting a segment with no signal or by changing to a specific modulation frequency as illustrated in (b) in FIG. 242E, the signals from the same transmitter can be specified based on the time change of the peak.

FIG. 242F is a flowchart illustrating processing of an image processing program in Embodiment 10.

This information processing program is a program for causing the light emitter (or the light emitting unit) of the above-described transmitter to change in luminance with the light pattern illustrated in (b) in FIG. 242A or (b) in FIG. 242B.

In other words, this information processing program is an information processing program that causes a computer to process information to be transmitted, in order for the information to be transmitted by way of luminance change. In detail, this information processing program causes a computer to execute: an determination step SA11 of encoding the information to determine a luminance change frequency; and an output step SA12 of outputting a signal of the luminance change frequency determined, to cause a light emitter to change in luminance according to the luminance change frequency determined, to transmit the information. In the determination step SA11, each of a first frequency (e.g. the frequency $f_1$) and a second frequency (e.g. the frequency $f_2$) different from the first frequency is determined as the luminance change frequency. In the output step SA12, each of a signal of the first frequency and a signal of the second frequency is output as the signal of the luminance change frequency determined, to cause the light emitter to change in luminance according to the first frequency during a first time (e.g. time $T_1$) and change in luminance according to the second frequency during a second time (e.g. time $T_2$) different from the first time after the first time elapses.

With this, the information to be transmitted can be appropriately transmitted in the form of visible light signals of the first and second frequencies. Furthermore, with the first time and the second time being different, the transmission can be adapted to various situations. As a result, communication between various devices becomes possible.

For example, as illustrated in FIGS. 242A and 242B, the first time is a duration corresponding to one period of the first frequency, and the second time is a duration corresponding to one period of the second frequency.

Furthermore, in the output step SA12, at least one of the signal of the first frequency and the signal of the second frequency may be repeatedly output to make a total number of times the signal of the first frequency is output and a total number of times the signal of the second frequency is output different from each other. With this, the transmission can be adapted to various situations.

Furthermore, in the output step SA12, at least one of the signal of the first frequency and the signal of the second frequency may be repeatedly output to make a total number of times one of the signal of the first frequency and the signal of the second frequency that has a lower frequency is output, greater than a total number of times a remaining one of the signal of the first frequency and the signal of the second frequency that has a higher frequency is output.

With this, in the case where the light emitter changes in luminance according to the frequency specified by each output signal, the light emitter can transmit, with high luminance, the information to be transmitted. For example, suppose that the duration for which low luminance lasts is the same in the change in luminance according to a low frequency, namely, the first frequency, and the change in luminance according to a high frequency, namely, the second frequency. In this case, the duration for which high luminance lasts is longer in the change in luminance according to the first frequency (that is, a low frequency) than in the change in luminance according to the second frequency (that is, a high frequency). Therefore, when many signals having the first frequency are output, the light emitter can transmit, with high luminance, the information to be transmitted.

Furthermore, in the output step SA12, at least one of the signal of the first frequency and the signal of the second frequency may be repeatedly output to make a total number of times one of the signal of the first frequency and the signal of the second frequency that has a higher frequency is output, greater than a total number of times a remaining one of the signal of the first frequency and the signal of the second frequency that has a lower frequency is output. For example, the number of times the signal of the frequency $f_2$ is output becomes greater than the number of times the signal of the frequency $f_1$ is output as illustrated in FIGS. 242A and 242B.

With this, in the case where the light emitter changes in luminance according to the frequency specified by each output signal, the reception efficiency of the information to be transmitted by way of such luminance change can be higher. For example, when the information to be transmitted is transmitted to the receiver in the form of visible light signals represented by a plurality of frequencies, the receiver performs frequency analysis, such as the Fourier transform, on a captured image, to detect a frequency peak included in the visible light signal. Here, with a higher frequency, such peak detection is more difficult. Therefore, the signal of the first frequency and the signal of the second frequency are output so that the number of times one of the signals having a higher frequency is output becomes greater than the number of times a remaining one of the signals having a lower frequency is output as described above. By doing so, it is possible to facilitate peak detection of a high frequency. As a result, the reception efficiency can be improved.

Furthermore, in the output step SA12, at least one of the signal of the first frequency and the signal of the second frequency may be repeatedly output to avoid continuous output of a signal of the same frequency. For example, the signal of the frequency $f_1$ is not continuously output, and the signal of the frequency $f_2$ is not continuously output either, as illustrated in FIGS. 242A and 242B.

With this, in the case where the light emitter changes in luminance according to the frequency specified by each output signal, it can make it harder for human eyes or cameras to catch flicker of light from the light emitter.

FIG. 242G is a block diagram of an information processing apparatus in Embodiment 10.

This information processing apparatus A10 is an apparatus for causing the light emitter of the above-described transmitter to change in luminance with the light pattern illustrated in (b) in FIG. 242A or (b) in FIG. 242B.

In other words, this information processing apparatus A10 is an apparatus that processes information to be transmitted, in order for the information to be transmitted by way of luminance change. In detail, the information processing apparatus A10 includes: a frequency determination unit A11 configured to encode the information to determine a luminance change frequency; and an output unit A12 configured to output a signal of the luminance change frequency determined, to cause a light emitter to change in luminance according to the luminance change frequency determined, to transmit the information. Here, the frequency determination unit A11 is configured to determine, as the luminance change frequency, each of a first frequency and a second frequency different from the first frequency. The output unit A12 is configured to output each of a signal of the first frequency and a signal of the second frequency as the signal of the luminance change frequency determined, to cause the light emitter to change in luminance according to the first frequency during a first time and change in luminance according to the second frequency during a second time different from the first time after the first time elapses. The information processing apparatus A10 can produce the same advantageous effects as the above-described information processing program.

(Operation of Home Appliance Through Lighting by Visible Light Communication)

FIG. 243A is a diagram illustrating an example of a visible light communication system in Embodiment 10.

A transmitter such as a ceiling light (a lighting device) has a wireless communication function of Wi-Fi, Bluetooth®, or the like. The transmitter transmits, by visible light communication, information (such as a light emitter ID and an authentication ID) for connecting to the transmitter by wireless communication. A receiver A such as a smartphone (a mobile terminal) performs wireless communication with the transmitter, based on the received information. The receiver A may connect to the transmitter using other information. In such a case, the receiver A does not need to have a reception function. A receiver B is an electronic device (a control target device) such as a microwave, as an example. The transmitter transmits information of the paired receiver B, to the receiver A. The receiver A displays the information of the receiver B, as an operable device. The receiver A provides an instruction to operate the receiver B (a control signal) to the transmitter via wireless communication, and the transmitter provides the operation instruction to the receiver B via visible light communication. As a result, the user can operate the receiver B through the receiver A. Moreover, a device connected to the receiver A via the Internet or the like can operate the receiver B through the receiver A.

Bidirectional communication is possible when the receiver B has a transmission function and the transmitter has a reception function. The transmission function may be realized as visible light by light emission, or communication by sound. For instance, the transmitter includes a sound collection unit, and recognizes the sound output from the receiver B to thereby recognize the state of the receiver B. As an example, the transmitter recognizes the operation end sound of the receiver B, and notifies the receiver A of such recognition. The receiver A displays the operation end of the receiver B on the display, thus notifying the user.

The receivers A and B include NFC. The receiver A receives a signal from the transmitter, communicates with the receiver B via NFC, and registers in the receiver A and the transmitter that a signal from the transmitter transmitting the signal received immediately before is receivable by the receiver B. This is referred to as "pairing" between the transmitter and the receiver B. For example in the case where the receiver B is moved, the receiver A registers in the transmitter that the pairing is cleared. In the case where the receiver B is paired with another transmitter, the newly paired transmitter notifies this to the previously paired transmitter, to clear the previous pairing.

FIG. 243B is a diagram for describing a use case in Embodiment 10. An embodiment of using a reception unit 1028 that employs a modulation scheme such as PPM, FDM, FSK, or frequency allocation according to the present disclosure is described below, with reference to FIG. 243B.

Light emission operation by a light emitter 1003 which is a lighting device is described first. In a light emitter 1003 such as a lighting device or a TV monitor attached to a ceiling or a wall, an authentication ID generation unit 1010 generates an authentication ID, using a random number generation unit 1012 changing per time period. For the ID of the light emitter 1003 and this authentication ID 1004, in the case where there is no interrupt (Step 1011), the light emitter 1003 determines that there is no "transmission data string" transmitted from a mobile terminal 1020. Accordingly, a light emitting unit 1016 such as an LED continuously or intermittently outputs a light signal including: (1) the light emitter ID; (2) the authentication ID; and (3) a transmission data string flag=0 which is an identifier for identifying whether or not there is a transmission data string 1009 transmitted via a mobile terminal 1020 from an electronic device 1040 which is a control target device.

The transmitted light signal is received by a photosensor 1041 in the electronic device 1040 (Step 1042). The electronic device 1040 determines, in Step 1043, whether or not the device ID of the electronic device 1040 and the authentication ID (the device authentication ID and the light emitter ID) are valid. When the result of the determination is YES (the IDs are valid), the electronic device 1040 checks whether or not the transmission data string flag is 1 (Step 1051). Only when the result of the checking is YES (when the transmission data string flag is 1), the electronic device 1040 executes the data of the transmission data string, e.g. a user command for applying a cooking recipe or the like (Step 1045).

A mechanism of light transmission by the electronic device 1040 using the light modulation scheme according to the present disclosure is described below. The electronic device 1040 transmits the device ID, the authentication ID for authenticating the device, and the light emitter ID of the light emitter 1003 received by the electronic device 1040 as mentioned above, i.e. the light emitter ID of the light emitter 1003 the successful reception of which is ensured, for example using an LED backlight unit 1050 of a display unit 1047 (Step 1046).

The light signal according to the present disclosure is transmitted from the display unit 1047 such as a liquid crystal display of a microwave or a POS device, by PPM, FDM, or FSK at a modulation frequency of 60 Hz or more without flicker. Accordingly, ordinary consumers are unaware of the transmission of the light signal. It is therefore possible to produce independent display such as a microwave menu on the display unit 1047.

(Method of Detecting the ID of the Light Emitter 1003 Receivable by the Electronic Device 1040)

The user who intends to use the microwave or the like receives a light signal from the light emitter 1003 by an in camera unit 1017 of a mobile terminal 1020, thus receiving the light emitter ID and the light emitter authentication ID via an in camera processing unit 1026 (Step 1027). As the light emitter ID receivable by the electronic device 1040, a light emitter ID corresponding to the position, which is recorded in the mobile terminal or a cloud 1032 with position information using Wi-Fi or mobile reception such as 3G, may be detected (Step 1025).

When the user points an out camera 1019 of the mobile terminal 1020 at the display unit 1047 of the microwave (an electronic device) 1040 or the like, the light signal 1048 according to the present disclosure can be demodulated using a MOS camera. Increasing the shutter speed enables faster data reception. A reception unit 1028 receives the device ID of the electronic device 1040, the authentication ID, a service ID, or a service provision cloud URL or device status converted from the service ID.

In Step 1029, the mobile terminal 1020 connects to the external cloud 1032 using the URL received or held inside via a 3G/Wi-Fi communication unit 1031, and transmits the service ID and the device ID. In the cloud 1032, a database 1033 is searched for data corresponding to each of the device ID and the service ID. The data is then transmitted to the mobile terminal 1020. Video data, command buttons, and the like are displayed on the screen of the mobile terminal based on this data. Upon viewing the display, the user inputs a desired command by an input method of pressing a button on the screen or the like (Step 1030). In the case of Yes (input), a transmission unit 1022 of a BTLE (Bluetooth® Low Energy) transmission and reception unit 1021 transmits a transmission data string including the device ID of the electronic device 1040 or the like, the device authentication ID, the light emitter ID, the light emitter authentication ID, and the user command in Step 1030.

The light emitter 1003 receives the transmission data string by a reception unit 1007 in a BTLE transmission and reception unit 1004. When the interrupt processing unit 1011 detects that the transmission data string is received (Yes in Step 1013), data "(transmission data string)+ID+(transmission data flag=1)" is modulated by the modulation unit according to the present disclosure and transmitted by light from the light emitting unit 1016 such as an LED. When reception of the transmission data string is not detected (NO in Step 1013), the light emitter 1003 continuously transmits the light emitter ID and the like.

Since the electronic device 1040 has already confirmed, through actual reception, that the signal from the light emitter 1003 is receivable, the reception can be reliably performed.

In this case, the light emitter ID is included in the transmission data string, so that the interrupt processing unit 1011 recognizes that the electronic device as the transmission target is present in the light irradiation range of the light emitter of the ID. Therefore, the signal is transmitted only from the light emitter situated within the very narrow range where the electronic device is present, without transmitting the signal from other light emitters. The radio space can be efficiently used in this way.

In the case where this scheme is not employed, since a Bluetooth signal reaches far, a light signal will end up being transmitted from a light emitter at a different position from the electronic device. While one light emitter is emitting light, light transmission to another electronic device is impossible or is interfered with. Such a problem can be effectively solved by this scheme.

The following describes electronic device malfunction prevention.

In Step 1042, the photosensor 1041 receives the light signal. Since the light emitter ID is checked first, a light emission signal of another light emitter ID can be removed and so malfunctions are reduced.

In the present disclosure, the transmission data string 1009 includes the device ID and the device authentication ID of the electronic device that is to receive the signal. In Step 1043, whether or not the device authentication ID and the device ID belong to the electronic device 1040 is checked, thus preventing any malfunction. A malfunction of a microwave or the like caused by the electronic device 1040 erroneously processing a signal transmitted to another electronic device can be avoided, too.

The following describes user command execution error prevention.

In Step 1044, when the transmission data flag is 1, it is determined that there is a user command. When the transmission data flag is 0, the process is stopped. When the transmission data flag is 1, after the device ID and the authentication ID in the user data string are authenticated, the transmission data string of the user command and the like is executed. For example, the electronic device 1040 extracts and displays a recipe on the screen. When the user presses the corresponding button, the operation of the recipe such as 600 w for 3 minutes, 200 w for 1 minute, and steaming for 2 minutes can be started without an error.

When the user command is executed, electromagnetic noise of 2.4 GHz is generated in the microwave. To reduce this, in the case of operating according to instructions through the smartphone via Bluetooth or Wi-Fi, an intermittent drive unit 1061 intermittently stops microwave output, e.g. for about 100 ms in 2 seconds. Communication by Bluetooth, Wi-Fi 802.11n, etc. is possible during this period. For example, if the microwave is not stopped, transmission of a stop instruction from the smartphone to the light emitter 1003 by BTLE is interfered with. In the present disclosure, on the other hand, the transmission can be performed without any interference, with it being possible to stop the microwave or change the recipe by a light signal.

In this embodiment, by merely adding the photosensor 1041 which costs only several yen per unit to the electronic device including the display unit, bidirectional communication with the smartphone in interaction with the cloud can be realized. This has an advantageous effect of turning a low-cost home appliance into a smart home appliance. Though the home appliance is used in this embodiment, the same advantageous effects can be achieved with a POS terminal including a display unit, an electronic price board in a supermarket, a personal computer, etc.

In this embodiment, the light emitter ID can be received only from the lighting device situated above the electronic device. Since the reception area is narrow, a small zone ID of Wi-Fi or the like is defined for each light emitter, and the ID is assigned to the position in each zone, thereby reducing the number of digits of the light emitter ID. In such a case, since the number of digits of the light emitter ID transmitted by PPM, FSK, or FDM according to the present disclosure is reduced, it is possible to receive a light signal from a small light source, obtain an ID at high speed, receive data from a distant light source, etc.

FIG. 243C is a diagram illustrating an example of a signal transmission and reception system in Embodiment 10.

The signal transmission and reception system includes a smartphone which is a multifunctional mobile phone, an LED light emitter which is a lighting device, a home appliance such as a refrigerator, and a server. The LED light emitter performs communication using BTLE (Bluetooth® Low Energy) and also performs visible light communication using a light emitting diode (LED). For example, the LED light emitter controls a refrigerator or communicates with an air conditioner by BTLE. In addition, the LED light emitter controls a power supply of a microwave, an air cleaner, or a television (TV) by visible light communication.

For example, the television includes a solar power device and uses this solar power device as a photosensor. Specifically, when the LED light emitter transmits a signal using a change in luminance, the television detects the change in luminance of the LED light emitter by referring to a change in power generated by the solar power device. The television then demodulates the signal represented by the detected change in luminance, thereby obtaining the signal transmitted from the LED light emitter. When the signal is an instruction to power ON, the television switches a main power thereof to ON, and when the signal is an instruction to power OFF, the television switches the main power thereof to OFF.

The server is capable of communicating with an air conditioner via a router and a specified low-power radio station (specified low-power). Furthermore, the server is capable of communicating with the LED light emitter because the air conditioner is capable of communicating with the LED light emitter via BTLE. Therefore, the server is capable of switching the power supply of the TV between ON and OFF via the LED light emitter. The smartphone is capable of controlling the power supply of the TV via the server by communicating with the server via wireless fidelity (Wi-Fi), for example.

As illustrated in FIGS. 243A to 243C, the information communication method according to this embodiment includes: transmitting the control signal (the transmission data string or the user command) from the mobile terminal (the smartphone) to the lighting device (the light emitter) through the wireless communication (such as BTLE or Wi-Fi) different from the visible light communication; performing the visible light communication by the lighting device changing in luminance according to the control signal; and detecting a change in luminance of the lighting device, demodulating the signal specified by the detected change in luminance to obtain the control signal, and performing the processing according to the control signal, by the control target device (such as a microwave). By doing so, even the mobile terminal that is not capable of changing in luminance for visible light communication is capable of causing the lighting device to change in luminance instead of the mobile terminal and is thereby capable of appropriately controlling the control target device. Note that the mobile terminal may be a wristwatch instead of a smartphone.

(Reception in which Interference is Eliminated)

FIG. 244 is a flowchart illustrating a reception method in which interference is eliminated in Embodiment 10.

In Step 9001*a*, the process starts. In Step 9001*b*, the receiver determines whether or not there is a periodic change in the intensity of received light. In the case of Yes, the process proceeds to Step 9001*c*. In the case of No, the process proceeds to Step 9001*d*, and the receiver receives light in a wide range by setting the lens of the light receiving unit at wide angle. The process then returns to Step 9001*b*. In Step 9001*c*, the receiver determines whether or not signal reception is possible. In the case of Yes, the process proceeds to Step 9001*e*, and the receiver receives a signal. In Step 9001*g*, the process ends. In the case of No, the process proceeds to Step 9001*f*, and the receiver receives light in a narrow range by setting the lens of the light receiving unit at telephoto. The process then returns to Step 9001*c*.

With this method, a signal from a transmitter in a wide direction can be received while eliminating signal interference from a plurality of transmitters.

(Transmitter Direction Estimation)

FIG. 245 is a flowchart illustrating a transmitter direction estimation method in Embodiment 10.

In Step 9002*a*, the process starts. In Step 9002*b*, the receiver sets the lens of the light receiving unit at maximum telephoto. In Step 9002*c*, the receiver determines whether or not there is a periodic change in the intensity of received light. In the case of Yes, the process proceeds to Step 9002*d*. In the case of No, the process proceeds to Step 9002*e*, and the receiver receives light in a wide range by setting the lens of the light receiving unit at wide angle. The process then returns to Step 9002*c*. In Step 9002*d*, the receiver receives a signal. In Step 9002*f*, the receiver sets the lens of the light receiving unit at maximum telephoto, changes the light reception direction along the boundary of the light reception range, detects the direction in which the light reception intensity is maximum, and estimates that the transmitter is in the detected direction. In Step 9002*d*, the process ends.

With this method, the direction in which the transmitter is present can be estimated. Here, the lens may be initially set at maximum wide angle, and gradually changed to telephoto.

(Reception Start)

FIG. 246 is a flowchart illustrating a reception start method in Embodiment 10.

In Step 9003*a*, the process starts. In Step 9003*b*, the receiver determines whether or not a signal is received from a base station of Wi-Fi, Bluetooth®, IMES, or the like. In the case of Yes, the process proceeds to Step 9003*c*. In the case of No, the process returns to Step 9003*b*. In Step 9003*c*, the receiver determines whether or not the base station is registered in the receiver or the server as a reception start trigger. In the case of Yes, the process proceeds to Step 9003*d*, and the receiver starts signal reception. In Step 9003*e*, the process ends. In the case of No, the process returns to Step 9003*b*.

With this method, reception can be started without the user performing a reception start operation. Moreover, power can be saved as compared with the case of constantly performing reception.

(Generation of ID Additionally Using Information of Another Medium)

FIG. 247 is a flowchart illustrating a method of generating an ID additionally using information of another medium in Embodiment 10.

In Step 9004*a*, the process starts. In Step 9004*b*, the receiver transmits either an ID of a connected carrier communication network, Wi-Fi, Bluetooth®, etc. or position information obtained from the ID or position information obtained from GPS, etc., to a high order bit ID index server. In Step 9004*c*, the receiver receives the high order bits of a visible light ID from the high order bit ID index server. In Step 9004*d*, the receiver receives a signal from a transmitter, as the low order bits of the visible light ID. In Step 9004*e*, the receiver transmits the combination of the high order bits and the low order bits of the visible light ID, to an ID solution server. In Step 9004*f*, the process ends.

With this method, the high order bits commonly used in the neighborhood of the receiver can be obtained. This contributes to a smaller amount of data transmitted from the transmitter, and faster reception by the receiver.

Here, the transmitter may transmit both the high order bits and the low order bits. In such a case, a receiver employing this method can synthesize the ID upon receiving the low order bits, whereas a receiver not employing this method obtains the ID by receiving the whole ID from the transmitter.

(Reception Scheme Selection by Frequency Separation)

FIG. 248 is a flowchart illustrating a reception scheme selection method by frequency separation in Embodiment 10.

In Step 9005*a*, the process starts. In Step 9005*b*, the receiver applies a frequency filter circuit to a received light signal, or performs frequency resolution on the received light signal by discrete Fourier series expansion. In Step 9005*c*, the receiver determines whether or not a low frequency component is present. In the case of Yes, the process proceeds to Step 9005*d*, and the receiver decodes the signal expressed in a low frequency domain of frequency modulation or the like. The process then proceeds to Step 9005*e*. In the case of No, the process proceeds to Step 9005*e*. In Step 9005*e*, the receiver determines whether or not the base station is registered in the receiver or the server as a reception start trigger. In the case of Yes, the process proceeds to Step 9005*f*, and the receiver decodes the signal expressed in a high frequency domain of pulse position modulation or the like. The process then proceeds to Step 9005*g*. In the case of No, the process proceeds to Step 9005*g*. In Step 9005*g*, the receiver starts signal reception. In Step 9005*h*, the process ends.

With this method, signals modulated by a plurality of modulation schemes can be received.

(Signal Reception in the Case of Long Exposure Time)

FIG. 249 is a flowchart illustrating a signal reception method in the case of a long exposure time in Embodiment 10.

In Step 9030*a*, the process starts. In Step 9030*b*, in the case where the sensitivity is settable, the receiver sets the highest sensitivity. In Step 9030*c*, in the case where the exposure time is settable, the receiver sets the exposure time shorter than in the normal imaging mode. In Step 9030*d*, the receiver captures two images, and calculates the difference in luminance. In the case where the position or direction of the imaging unit changes while capturing two images, the receiver cancels the change, generates an image as if the image is captured in the same position and direction, and calculates the difference. In Step 9030*e*, the receiver calculates the average of luminance values in the direction parallel to the exposure lines in the captured image or the difference image. In Step 9030*f*, the receiver arranges the calculated average values in the direction perpendicular to the exposure lines, and performs discrete Fourier transform. In Step 9030*g*, the receiver recognizes whether or not there is a peak near a predetermined frequency. In Step 9030*h*, the process ends.

With this method, signal reception is possible even in the case where the exposure time is long, such as when the exposure time cannot be set or when a normal image is captured simultaneously.

In the case where the exposure time is automatically set, when the camera is pointed at a transmitter as a lighting, the exposure time is set to about 1/60 second to 1/480 second by an automatic exposure compensation function. If the exposure time cannot be set, signal reception is performed under this condition. In an experiment, when a lighting blinks periodically, stripes are visible in the direction perpendicular to the exposure lines if the period of one cycle is greater than or equal to about 1/16 of the exposure time, so that the blink period can be recognized by image processing. Since the part in which the lighting is shown is too high in luminance and the stripes are hard to be recognized, the signal period may be calculated from the part where light is reflected.

In the case of using a scheme, such as frequency shift keying or frequency multiplex modulation, that periodically turns on and off the light emitting unit, flicker is less visible to humans even with the same modulation frequency and also flicker is less likely to appear in video captured by a video camera, than in the case of using pulse position modulation. Hence, a low frequency can be used as the modulation frequency. Since the temporal resolution of human vision is about 60 Hz, a frequency not less than this frequency can be used as the modulation frequency.

When the modulation frequency is an integer multiple of the imaging frame rate of the receiver, bright lines do not appear in the difference image between pixels at the same position in two images and so reception is difficult, because imaging is performed when the light pattern of the transmitter is in the same phase. Since the imaging frame rate of the receiver is typically 30 fps, setting the modulation frequency to other than an integer multiple of 30 Hz eases reception. Moreover, given that there are various imaging frame rates of receivers, two relatively prime modulation frequencies may be assigned to the same signal so that the transmitter transmits the signal alternately using the two modulation frequencies. By receiving at least one signal, the receiver can easily reconstruct the signal.

FIG. 250 is a diagram illustrating an example of a transmitter light adjustment (brightness adjustment) method.

The ratio between a high luminance section and a low luminance section is adjusted to change the average luminance. Thus, brightness adjustment is possible. Here, when the period $T_1$ in which the luminance changes between HIGH and LOW is maintained constant, the frequency peak can be maintained constant. For example, in each of (a), (b), and (c) in FIG. 250, the time of brighter lighting than the average luminance is set short to adjust the transmitter to emit darker light, and the time of brighter lighting than the average luminance is set long to adjust the transmitter to emit brighter light, while time $T_1$ between a first change in luminance at which the luminance becomes higher than the average luminance and a second change in luminance is maintained constant. In FIG. 250, the light in (b) and (c) is adjusted to be darker than that in (a), and the light in (c) is adjusted to be darkest. With this, light adjustment can be performed while signals having the same meaning are transmitted.

It may be that the average luminance is changed by changing luminance in the high luminance section, luminance in the low luminance section, or luminance values in the both sections.

FIG. 251 is a diagram illustrating an exemplary method of performing a transmitter light adjustment function.

Since there is a limitation in component precision, the brightness of one transmitter will be slightly different from that of another even with the same setting of light adjustment. In the case where transmitters are arranged side by side, a difference in brightness between adjacent ones of the transmitters produces an unnatural impression. Hence, a user adjusts the brightness of the transmitters by operating a light adjustment correction/operation unit. A light adjustment correction unit holds a correction value. A light adjustment control unit controls the brightness of the light emitting unit according to the correction value. When the light adjustment level is changed by a user operating a light adjustment operation unit, the light adjustment control unit controls the brightness of the light emitting unit based on a light adjustment setting value after the change and the correction value held in the light adjustment correction unit. The light adjustment control unit transfers the light adjustment setting value to another transmitter through a cooperative light adjustment unit. When the light adjustment setting value is transferred from another transmitter through the cooperative light adjustment unit, the light adjustment control unit controls the brightness of the light emitting unit based on the light adjustment setting value and the correction value held in the light adjustment correction unit.

The control method of controlling an information communication device that transmits a signal by causing a light emitter to change in luminance according to an embodiment of the present disclosure may cause a computer of the information communication device to execute: determining, by modulating a signal to be transmitted that includes a plurality of different signals, a luminance change pattern corresponding to a different frequency for each of the different signals; and transmitting the signal to be transmitted, by causing the light emitter to change in luminance to include, in a time corresponding to a single frequency, only a luminance change pattern determined by modulating a single signal.

For example, when luminance change patterns determined by modulating more than one signal are included in the time corresponding to a single frequency, the waveform of changes in luminance with time will be complicated, making it difficult to appropriately receive signals. However, when only a luminance change pattern determined by modulating a single signal is included in the time corresponding to a single frequency, it is possible to more appropriately receive signals upon reception.

According to one embodiment of the present disclosure, the number of transmissions may be determined in the determining so as to make a total number of times one of the plurality of different signals is transmitted different from a total number of times a remaining one of the plurality of different signals is transmitted within a predetermined time.

When the number of times one signal is transmitted is different from the number of times another signal is transmitted, it is possible to prevent flicker at the time of transmission.

According to one embodiment of the present disclosure, in the determining, a total number of times a signal corresponding to a high frequency is transmitted may be set greater than a total number of times another signal is transmitted within a predetermined time.

At the time of frequency conversion at a receiver, a signal corresponding to a high frequency results in low luminance, but an increase in the number of transmissions makes it possible to increase a luminance value at the time of frequency conversion.

According to one embodiment of the present disclosure, changes in luminance with time in the luminance change pattern have a waveform of any of a square wave, a triangular wave, and a sawtooth wave.

With a square wave or the like, it is possible to more appropriately receive signals.

According to one embodiment of the present disclosure, when an average luminance of the light emitter is set to have a large value, a length of time for which luminance of the light emitter is greater than a predetermined value during the time corresponding to the single frequency may be set to be longer than when the average luminance of the light emitter is set to have a small value.

By adjusting the length of time for which the luminance of the light emitter is greater than the predetermined value during the time corresponding to a single frequency, it is possible to adjust the average luminance of the light emitter while transmitting signals. For example, when the light emitter is used as a lighting, signals can be transmitted while the overall brightness is decreased or increased.

Using an application programming interface (API) (indicating a unit for using OS functions) on which the exposure time is set, the receiver can set the exposure time to a predetermined value and stably receive the visible light signal. Furthermore, using the API on which sensitivity is set, the receiver can set sensitivity to a predetermined value, and even when the brightness of a transmission signal is low or high, can stably receive the visible light signal.

Embodiment 11

This embodiment describes each example of application using a receiver such as a smartphone and a transmitter for transmitting information as a blink pattern of an LED or an organic EL device in each of the embodiments described above.

(Setting of Exposure Time)

FIGS. 252A to 252D are flowcharts illustrating an example of operation of a receiver in Embodiment 11.

In order to receive the visible light signal by the image sensor in the scheme according to the present disclosure, it is necessary to set the exposure time shorter than a predetermined time. The predetermined time is determined according to a modulation scheme and a modulation frequency of the visible light signal. Generally, the exposure time needs to be shorter as the modulation frequency increases.

As the exposure time becomes shorter, the clarity of observed bright lines can increase. Meanwhile, a shorter exposure time leads to a reduction in the intensity of received light, resulting in an entire captured image being darker. In other words, the signal strength is attenuated. Therefore, it is possible to improve reception performance (such as a reception speed and an error rate) by setting a short exposure time within the range in which presence of the visible light signal is detectable.

As illustrated in FIG. 252A, the receiver sets the imaging mode to the visible light imaging mode (Step S9201). At this time, the receiver determines whether or not it includes a monochrome imaging function and is to receive a signal modulated with luminance information only (Step S9202). Here, when determining that it includes a monochrome imaging function and is to receive a signal modulated with luminance information only (Step S9202: Y), the receiver sets a color-related mode included in the imaging mode to a monochrome imaging mode in which the monochrome imaging function is used (Step S9203). By doing so, in the case of receiving a signal modulated with luminance information only, that is, in the case of receiving a visible light signal which represents information by changes in luminance only, it is possible to improve the processing speed by not handling color information. In contrast, when not determining in Step S9202 that it includes a monochrome imaging function and is to receive a signal modulated with luminance information only (Step S9202: N), that is, when the visible light signal is represented using color information, the receiver sets the color-related mode included in the imaging mode to a color imaging mode (Step S9204).

Next, the receiver determines whether or not an imaging unit including the above-stated image sensor includes a function of selecting an exposure time (Step S9205). Here, when determining that the function is included (Step S9205: Y), the receiver sets the exposure time shorter than the above-stated predetermined time using the function so that bright lines will appear in a captured image (Step S9206). Note that the receiver may set the exposure time to as short an exposure time as possible within the range in which the transmitter that transmits the visible light signal can be seen in the captured image.

In contrast, when determining in Step S9205 that the function of selecting the exposure time is not included (Step S9205: N), the receiver further determines whether or not the imaging unit includes a function of setting sensitivity (Step S9207). Here, when determining that the function of setting sensitivity is included (Step S9207: Y), the receiver sets the sensitivity to the maximum using the function (Step S9208). As a result, a captured image obtained by imaging with the maximum sensitivity will be bright. Therefore, in the receiver with automatic exposure enabled, the exposure time is set short by the automatic exposure so that the exposure falls within a predetermined range. Note that in the automatic exposure, every time an image is captured, the captured image is used as input of the automatic exposure, and the exposure time is adjusted as needed based on the captured image so that the exposure falls within the predetermined range. Details of the automatic exposure shall be described later.

Furthermore, the receiver determines whether or not the imaging unit includes a function of setting the F number (aperture) (Step S9209). Here, when the function of setting the F number (Step S9209: Y) is included, the receiver sets the F number to the minimum (opens the aperture) using the function (Step S9210). As a result, a captured image obtained by imaging with the minimum F number will be bright. Therefore, in the receiver with automatic exposure enabled, the exposure time is set short by the automatic exposure so that the exposure falls within a predetermined range.

Furthermore, the receiver determines whether or not the imaging unit includes a function of selecting an exposure compensation value (Step S9211). Here, when determining that the imaging unit includes the function of selecting an exposure compensation value (Step S9211: Y), the receiver sets the exposure compensation value to the minimum using the function (Step S9212). As a result, in the receiver with automatic exposure enabled, the exposure time is set short by the automatic exposure so that the exposure becomes low.

A scene mode (a high-speed scene mode) for capturing an image of a subject in high-speed motion is generally defined to have a name such as "Sport" or "Action."

As illustrated in FIG. 252B, the receiver determines, after Step S9211 or Step S9212, whether or not the following condition is satisfied (Step S9213): the imaging unit includes a function of setting the high-speed scene mode, and setting of the high-speed scene mode does not lead to setting the sensitivity lower than before the setting of the scene mode, or lead to setting the F number higher than before the setting of the scene mode, or lead to setting the exposure compensation value higher than before the setting of the scene mode. Here, when determining that the above condition is satisfied (Step S9213: Y), the receiver sets the scene mode to the high-speed scene mode (Step S9214). As a result, in the receiver with automatic exposure enabled, the exposure time is set short by the automatic exposure so that a blur-free image of the subject in high-speed motion can be captured.

Next, the receiver enables the automatic exposure (Step S9215) and captures an image of the subject (Step S9216).

As illustrated in FIG. 252C, the receiver determines after Step S9215 whether or not the imaging unit includes a zoom function (Step S9217). Here, when determining that the zoom function is included (Step S9217: Y), the receiver further determines whether or not a zoom center position is selectable, that is, whether or not the center position can be set to a given position within the captured image (Step S9218). When determining that the center position is selectable (Step S9218: Y), the receiver selects a bright part of the captured image as the zoom center position, and zooms to capture an image in which the subject corresponding to the bright part is shown large at the center (Step S9219). In contrast, when determining that the center position is not selectable (Step S9218: N), the receiver determines whether or not the center of the captured image is brighter than brightness having a predetermined value, or whether or not the center of the captured image is brighter than the average brightness of predetermined portions of the captured image (Step S9220). Here, when determining that the center is brighter (Step S9220: Y), the receiver zooms (Step S9221). Thus, also in this case, the subject corresponding to the bright part can be shown large at the center in a captured image.

Generally, in many of devices including an imaging unit, the center-weighted metering is adopted as a metering scheme, and when a captured image has a bright part at the center, the exposure is adjusted based on the bright part even when another position is not selected as the metering position. With this, the exposure time is set short. In addition, since the zooming results in an increase in the area of the bright part, and thus the exposure is adjusted based on a brighter screen, the exposure time is set short.

Next, the receiver determines whether or not a function of selecting a metering position or a focus position is included (Step S9222). Here, when determining that the function is included (Step S9222: Y), the receiver performs processing for finding a bright place within the captured image. That is, the receiver performs processing for finding, out of the captured image, a place in a region brighter than predetermined brightness and having predetermined shape and size. Specifically, the receiver first determines whether or not an exposure evaluation calculation expression for the automatic exposure is already known (Step S9224). When determining that the calculation expression is already known (Step S9224: Y), the receiver finds a place in the above-described bright region by evaluating the brightness of each region of the captured image with the use of the same calculation expression as the known calculation expression (Step S9226). In contrast, when determining that the exposure evaluation calculation expression is unknown (N in Step S9224), the receiver finds a place in the above-described bright region by evaluating the brightness of each region of the captured image with the use of a predetermined calculation expression for calculating an average value of brightness of pixels in a region having predetermined shape and size (Step S9225). Note that the predetermined shape is the shape of a rectangle, a circle, or a cross, for example. Furthermore, the region may be made up of a plurality of discontinuous regions. Furthermore, the calculation for the above-described average value may use, rather than a simple average, a weighted average calculated with a more weight in a part closer to the center.

The receiver determines whether or not a total area of all the bright regions found is smaller than a predetermined area (Step S9227). Here, when determined that the total area is smaller than the predetermined area (Step S9227: Y), the receiver zooms to capture an image in which the total area of the bright regions is no less than the predetermined area (Step S9228). Next, the receiver determines whether or not a metering position is selectable (Step S9229). When determining that the metering position is selectable (Step S9229: Y), the receiver selects a place in the brightest region as the metering position (Step S9230). In the automatic exposure, the exposure is adjusted based on the brightness of the metering position. Thus, when a place in the brightest region is selected as the metering position, the exposure time is set short by the automatic exposure. In contrast, when determining in Step S9229 that the metering position is not selectable (Step S9229: N), that is, when the focus position is selectable, the receiver selects a place in the brightest region as the focus position. Various imaging units can be mounted in the receiver. In the automatic exposure by some of these various imaging units, the exposure is adjusted based on brightness at the focus position. Therefore, when a place in the brightest region is selected as the focus position, the exposure time is set short by the automatic exposure. Here, the selected place may be different from the place in the region used to evaluate or calculate brightness and is set according to a setting scheme of the imaging unit. As an example, when the selected scheme is designed to select a center point, the receiver selects the center of the brightest region, and when the selected scheme is designed to select a rectangular region, the receiver selects a rectangular region including the center of the brightest region.

Next, the receiver determines whether or not any region of the captured image is brighter than the region of the place selected as the metering position or the focus position (Step S9232). Here, when determining that a brighter region is present (Step S9232: Y), the receiver repeats the processing following Step S9217. In contrast, when determining that no brighter region is present (Step S9232: N), the receiver captures an image of the subject (Step S9233).

Next, the receiver determines based on the image captured in Step S9233 whether or not the automatic exposure needs to be ended or whether or not a predetermined time has elapsed since the automatic exposure was enabled (Step S9234). Here, for example, when determining that the automatic exposure does not need to be ended (Step S9234: N), the receiver further determines based on the image captured in Step S9233 whether or not the position or the imaging direction of the imaging unit has changed (Step S9235). When determining that the position or the imaging direction of the imaging unit has changed (Step S9235: Y), the receiver performs the processing following Step S9217 again. By doing so, even when the place selected as the metering position or the focus position moves in the captured image, a place in the brightest region at that moment can be selected. In contrast, when determining in Step S9235 that the position or the imaging direction of the imaging unit has not changed (Step S9235: N), the receiver repeats the processing following Step S9232. Note that the receiver may search for the brightest region and select a metering position or a focus position every time one image is captured.

When determining in Step S9234 that the automatic exposure needs to be ended, when the exposure time does not change any more, or when determining in Step S9234 that the predetermined time has elapsed (Step S9234: Y), or when the exposure time is set in Step S9206, the receiver disables the automatic exposure (Step S9236) and captures an image of the subject (Step S9237). The receiver then determines whether or not a visible light signal has been received by capturing the image (Step S9238). Here, when determining that no visible light signal has been received (Step S9238: N), the receiver further determines whether or not a predetermined time has elapsed (Step S9239). When determining that the predetermined time has not elapsed (Step S9239: N), the receiver repeats the processing following Step S9237. In contrast, when determining that the predetermined time has elapsed (Step S9239: Y), that is, when failing to receive a visible light signal within the predetermined time, the receiver repeats the processing following Step S9232 to search for the brightest region again.

Note that the receiver may stop zooming at any point in time when the zoom function is used. This means that when not zooming, the receiver may detect whether or not a bright subject is present in a range that is not captured when zoomed in, but is captured when not zoomed in. Note that this bright subject is likely to be a transmitter that transmits a visible light signal by way of luminance change. By doing so, it is possible to receive signals from transmitters present in a wide range.

The automatic exposure and a metering method are described below.

The automatic exposure in FIGS. 252A to 252D is described below. The automatic exposure is an operation, a process, or a function of automatically adjusting a metering result to a predetermined value by the imaging unit of the receiver by way of adjusting the exposure time, the sensitivity, and the aperture.

The metering method for obtaining a metering result includes average metering (full-frame metering), center-weighted metering, spot metering (partial metering), and segment metering. The average metering calculates average brightness of an entire image to be captured. The center-weighted metering calculates a weighted average value of brightness that is more weighted toward the center (or a selected portion) of an image. The spot metering calculates an average value (or a weighted average value) of brightness of one predetermined area (or a few predetermined areas) defined with the center or the selected portion of the image as its center. The segment metering segments the image into portions, measures light at each of the portions, and calculates a value of total brightness.

Even being unable to directly set the exposure time short, the imaging unit including an automatic exposure function is capable of indirectly setting an exposure time by the automatic exposure function. For example, when the sensitivity is set high (e.g. to the maximum value), a captured image is bright where the other parameters are the same, and therefore the exposure time can be set short by the automatic exposure. When the aperture is set to be open (i.e. uncovered), the exposure time can be set short likewise. When a value indicating an exposure compensation level is set low (e.g. to the minimum value), the automatic exposure causes a dark image to be captured, that is, the exposure time is set short. When the brightest place in an image is selected as the metering position, the exposure time can be set short. If it a metering method is selectable, the exposure time can be set short when the spot metering is selected. If a metering range is selectable, the exposure time can be set short when the minimum metering range is selected. In the case where the area of the bright part in the image is large, the exposure time can be set short when the largest possible metering range that does not exceed the bright part is selected. If more than one metering position is selectable, the exposure time can be set short when the same place is selected as the metering position more than one time. When a zoomed-in image of a bright place in the image is captured and this place is selected as the metering position, the exposure time can be set short.

EX zoom is described below.

FIG. 253 is a diagram for describing EX zoom.

The zoom in FIG. 252C, that is, the way to obtain a magnified image, includes optical zoom which adjusts the focal length of a lens to change the size of an image formed on an imaging element, digital zoom which interpolates an image formed on an imaging element through digital processing to obtain a magnified image, and EX zoom which changes imaging elements that are used for imaging, to obtain a magnified image. The EX zoom is applicable when the number of imaging elements included in an image sensor is great relative to a resolution of a captured image.

For example, an image sensor 10080*a* illustrated in FIG. 253 includes 32 by 24 imaging elements arranged in matrix. Specifically, 32 imaging elements in width by 24 imaging elements in height are arranged. When this image sensor 10080*a* captures an image having a resolution of 16 pixels in width and 12 pixels in height, out of the 32 by 24 imaging elements included in the image sensor 10080*a*, only 16 by 12 imaging elements evenly dispersed as a whole in the image sensor 10080*a* (e.g. the imaging elements of the image sensor 1080*a* indicated by black squares in (a) in FIG. 253) are used for imaging as illustrated in (a) in FIG. 253. In other words, only odd-numbered or even-numbered imaging elements in each of the heightwise and widthwise arrangements of imaging elements is used to capture an image. By doing so, an image 10080*b* having a desired resolution is obtained. Note that although a subject appears on the image sensor 1008*a* in FIG. 253, this is for facilitating the understanding of a relationship between each of the imaging elements and a captured image.

When capturing an image of a wide range to search for a transmitter or to receive information from many transmitters, a receiver including the above image sensor 10080*a* captures an image using only a part of the imaging elements evenly dispersed as a whole in the image sensor 10080*a*.

When using the EX zoom, the receiver captures an image by only a part of the imaging elements that is locally dense in the image sensor 10080*a* (e.g. the 16 by 12 image sensors indicated by black squares in the image sensor 1080*a* in (b) in FIG. 253) as illustrated in (b) in FIG. 253. By doing so, an image 10080*d* is obtained which is a zoomed-in image of a part of the image 10080*b* that corresponds to that part of the imaging elements. With such EX zoom, a magnified image of a transmitter is captured, which makes it possible to receive visible light signals for a long time, as well as to increase the reception speed and to receive a visible light signal from far way.

In the digital zoom, it is not possible to increase the number of exposure lines that receive visible light signals, and the length of time for which the visible light signals are received does not increase; therefore, it is preferable to use other kinds of zoom as much as possible. The optical zoom requires time for physical movement of a lens, an image sensor, or the like; in this regard, the EX zoom requires only a digital setting change and is therefore advantageous in that it takes a short time to zoom. From this perspective, the order of priority of the zooms is as follows: (1) the EX zoom; (2) the optical zoom; and (3) the digital zoom. The receiver may use one or more of these zooms selected according to the above order of priority and the need of zoom magnification. Note that the imaging elements that are not used in the imaging methods represented in (a) and (b) in FIG. 253 may be used to reduce image noise.

FIG. 254A is a flowchart illustrating processing of a reception program in Embodiment 10.

This reception program is a program for causing a computer included in a receiver to execute the processing illustrated in FIGS. 252A to 253, for example.

In other words, this reception program is a reception program for receiving information from a light emitter. In detail, this reception program causes a computer to execute: an exposure time setting step SA21 of setting an exposure time of an image sensor using automatic exposure; a bright line image obtainment step SA22 of obtaining a bright line image which is an image including a plurality of bright lines corresponding to a plurality of exposure lines included in the image sensor, by capturing an image of a light emitter changing in luminance by the image sensor with the set exposure time; and an information obtainment step SA23 of obtaining information by decoding a pattern of the plurality of the bright lines included in the obtained bright line image.

In the exposure time setting step SA21, the sensitivity of the image sensor is set to the maximum value within a predetermined range for the image sensor as in Step S9208 in FIG. 252A, and an exposure time according to the sensitivity at the maximum value is set by the automatic exposure.

By doing so, a short exposure time that allows for an appropriate bright line image to be obtained can be set using an automatic exposure function included in a commonly used camera even when the exposure time of the image sensor cannot be directly set. Thus, in the automatic exposure, the exposure is adjusted based on brightness of an image captured by the image sensor. Therefore, when the sensitivity of the image sensor is set to a large value, the image is bright, and thus the exposure time of the image sensor is set short to reduce exposure. Setting the sensitivity of the image sensor to the maximum value allows the exposure time to be set shorter, and thus it is possible to obtain an appropriate bright line image. That is, it is possible to appropriately receive information from the light emitter. As a result, it is possible to enable communication between various devices. Note that the sensitivity is ISO speed, for example.

In the exposure time setting step SA21, a value indicating an exposure compensation level of the image sensor is set to the minimum value within a preset range for the image sensor as in Step S9212 in FIG. 252A, and an exposure time according to the sensitivity at the maximum value and the exposure compensation level at the minimum value is set by the automatic exposure.

By doing so, since the value indicating the exposure compensation level is set to the minimum value, processing in the automatic exposure to reduce exposure allows the exposure time to be set shorter, and thus it is possible to obtain an appropriate bright line image. Note that the unit of the value indicating the exposure compensation level is EV, for example.

Furthermore, in the exposure time setting step SA21, a brighter part than the other part in a first image, captured by the image sensor, of a subject including a light emitter is specified as in FIG. 252C. The optical zoom is then used to enlarge an image of a part of the subject that corresponds to this bright part. Furthermore, a second image obtained by capturing the enlarged image of the part of the subject by the image sensor is used as input of the automatic exposure to set the exposure time. Moreover, in the bright line image obtainment step SA22, the enlarged image of the part of the subject is captured by the image sensor with the set exposure time to obtain a bright line image.

Thus, the optical zoom enlarges an image of a part of the subject that corresponds to the bright part in the first image, that is, the optical zoom enlarges an image of a bright light emitter, with the result that the second image can be brighter than the first image as a whole. Since this bright second image is used as input of the automatic exposure, processing in the automatic exposure to reduce exposure allows the exposure time to be set shorter, and thus it is possible to obtain an appropriate bright line image.

Furthermore, in the exposure time setting step SA21, it is determined as illustrated in FIG. 252C whether or not a central part of the first image, captured by the image sensor, of the subject including the light emitter is brighter than the average brightness of a plurality of points in the first image. When the central part is determined to be brighter, the optical zoom enlarges an image of a part of the subject that corresponds to the central part. Furthermore, a second image obtained by capturing the enlarged image of the part of the subject by the image sensor is used as input of the automatic exposure to set the exposure time. Moreover, in the bright line image obtainment step SA22, the enlarged image of the part of the subject is captured by the image sensor with the set exposure time to obtain a bright line image.

Thus, the optical zoom enlarges an image of a part of the subject that corresponds to the bright central part in the first image, that is, the optical zoom enlarges an image of a bright light emitter, with the result that the second image can be brighter than the first image as a whole. Since this bright second image is used as input of the automatic exposure, processing in the automatic exposure to reduce exposure allows the exposure time to be set shorter, and thus it is possible to obtain an appropriate bright line image. If arbitrary setting of a center position for the enlargement is not possible, the optical zoom enlarges a central part of the angle of view or the image. Therefore, even when arbitrary setting of the center position is not possible, the optical zoom can be used to make the second image brighter as a whole as long as the central part of the first image is bright. Here, if the enlargement by the optical zoom is performed even when the central part of the first image is dark, the second image will be dark, resulting in the exposure time becoming long. Therefore, as described above, the enlargement by the optical zoom is performed only when the central part is determined to be bright so that the exposure time can be prevented from becoming long.

Furthermore, in the exposure time setting step SA21, a brighter part than the other part in a first image of a subject including a light emitter captured by, among K imaging elements (where K is an integer of 3 or more) included in an image sensor, only N imaging elements (where N is an integer less than K and no less than 2) evenly dispersed in the image sensor is specified as illustrated in FIG. 253. Moreover, a second image captured by only N densely arranged imaging elements corresponding to the bright part among the K imaging elements included in the image sensor is used as input of the automatic exposure to set the exposure time. In the bright line image obtainment step SA22, an image is captured by only the N densely arrange imaging elements included in the image sensor with the set exposure time to obtain a bright line image.

By doing so, the second image can be bright as a whole through what is called the EX zoom even when the bright part is not located at the center of the first image, with the result that the exposure time can be set short.

Furthermore, in the exposure time setting step SA21, a metering position in the image of the subject captured by the image sensor is set as illustrated in FIG. 252C, and an exposure time according to brightness at the set metering position is set by the automatic exposure.

By doing so, when the bright part in the captured image is set as the metering position, processing in the automatic exposure to reduce exposure allows the exposure time to be set shorter, and thus it is possible to obtain an appropriate bright line image.

Furthermore, the reception program may further cause a computer to execute an imaging mode setting step of switching an imaging mode of the image sensor from a color imaging mode for obtaining a color image by imaging to a monochrome imaging mode for obtaining a monochrome image by imaging. In this case, in the exposure time setting step SA21, an image obtained in the monochrome imaging mode is used as input of the automatic exposure to set the exposure time.

Thus, an image obtained in the monochrome imaging mode is used as input of the automatic exposure, with the result that an appropriate exposure time can be set without influence of color information. When the exposure time is set in the monochrome imaging mode, the bright line image is obtained by imaging according to this mode. Therefore, when the light emitter transmits information only by changing in luminance, the information can be appropriately obtained.

Furthermore, in the exposure time setting step SA21, every time an image is obtained by capturing an image of the light emitter by the image sensor, the obtained image is used as input of the automatic exposure to update the exposure time of the image sensor. Here, as illustrated in Step S9234 in FIG. 252D, for example, the updating of the exposure time by the automatic exposure is brought to an end when the fluctuation range of the exposure time that is updated as needed falls below a predetermined range, and thus the exposure time is set.

Thus, when the fluctuation of the exposure time is stable, that is, when brightness of an image obtained by imaging is within a target brightness range, the exposure time set at the point is used in the imaging for obtaining a bright line image. Therefore, an appropriate bright line image can be obtained.

FIG. 254B is a block diagram of a reception device in Embodiment 10.

This reception device A20 is the above-described receiver that performs the processing illustrated in FIGS. 252A to 253, for example.

In detail, this reception device A20 is a device for receiving information from a light emitter and includes: an exposure time setting unit A21 configured to set an exposure time of an image sensor using automatic exposure; an imaging unit A22 configured to obtain a bright line image which is an image including a plurality of bright lines corresponding to a plurality of exposure lines included in the image sensor, by capturing an image of a light emitter changing in luminance by the image sensor with the set exposure time; and a decoding unit A23 configured to obtain information by decoding a pattern of the plurality of the bright lines included in the obtained bright line image. The exposure time setting unit A21 sets the sensitivity of the image sensor to the maximum value within a predetermined range for the image sensor and sets the exposure time according to the sensitivity at the maximum value by the automatic exposure. This reception device A20 can produce the same advantageous effects as the above-described reception program.

A reception program according to an aspect of the present disclosure is a reception program for receiving information from a light emitter changing in luminance according to a signal output using the above-described image processing program, and causes a computer to execute: an exposure time setting step of setting an exposure time of an image sensor using automatic exposure; a bright line image obtainment step of obtaining a bright line image which is an image including a plurality of bright lines corresponding to a plurality of exposure lines included in the image sensor, by capturing an image of a subject including a light emitter changing in luminance by the image sensor with the set exposure time; and an information obtainment step of obtaining information by decoding a pattern of the plurality of the bright lines included in the obtained bright line image. In the exposure time setting step, the sensitivity of the image sensor is set to the maximum value within a predetermined range for the image sensor, and the exposure time according to the sensitivity at the maximum value is set by the automatic exposure.

By doing so, as illustrated in FIG. 252A to FIG. 254B, a short exposure time that allows for an appropriate bright line image to be obtained can be set using an automatic exposure function included in a commonly used camera even when the exposure time of the image sensor cannot be directly set. Thus, in the automatic exposure, the exposure is adjusted based on brightness of an image captured by the image sensor. Therefore, when the sensitivity of the image sensor is set to a large value, the image is bright, and thus the exposure time of the image sensor is set short to reduce exposure. Setting the sensitivity of the image sensor to the maximum value allows the exposure time to be set shorter, and thus it is possible to obtain an appropriate bright line image. That is, it is possible to appropriately receive information from the light emitter. As a result, communication between various devices becomes possible. Note that the sensitivity is ISO speed, for example.

In the exposure time setting step, a value indicating an exposure compensation level of the image sensor is set to the minimum value within a preset range for the image sensor, and an exposure time according to the sensitivity at the maximum value and the exposure compensation level at the minimum value may be set by the automatic exposure.

By doing so, since the value indicating the exposure compensation level is set to the minimum value, processing in the automatic exposure to reduce exposure allows the exposure time to be set shorter, and thus it is possible to obtain an appropriate bright line image. Note that the unit of the value indicating the exposure compensation level is EV, for example.

Furthermore, in the exposure time setting step, a brighter part than the other part in a first image, captured by the image sensor, of a subject including a light emitter may be specified. The optical zoom may be then used to enlarge an image of a part of the subject that corresponds to this bright part. Furthermore, a second image obtained by capturing the enlarged image of the part of the subject by the image sensor may be used as input of the automatic exposure to set the exposure time. Moreover, in the bright line image obtainment step, the enlarged image of the part of the subject may be captured by the image sensor with the set exposure time to obtain a bright line image.

Thus, the optical zoom enlarges an image of a part of the subject that corresponds to the bright part in the first image, that is, the optical zoom enlarges an image of a bright light emitter, with the result that the second image can be brighter than the first image as a whole. Since this bright second image is used as input of the automatic exposure, processing in the automatic exposure to reduce exposure allows the exposure time to be set shorter, and thus it is possible to obtain an appropriate bright line image.

Furthermore, in the exposure time setting step, it may be determined whether or not a central part of the first image, captured by the image sensor, of the subject including the light emitter is brighter than the average brightness of a plurality of points in the first image. When the central part is determined to be brighter, the optical zoom may enlarge an image of a part of the subject that corresponds to the central part. Furthermore, a second image obtained by capturing the enlarged image of the part of the subject by the image sensor may be used as input of the automatic exposure to set the exposure time. Moreover, in the bright line image obtainment step, the enlarged image of the part of the subject may be captured by the image sensor with the set exposure time to obtain a bright line image.

Thus, the optical zoom enlarges an image of a part of the subject that corresponds to the bright central part in the first image, that is, the optical zoom enlarges an image of a bright light emitter, with the result that the second image can be brighter than the first image as a whole. Since this bright second image is used as input of the automatic exposure, processing in the automatic exposure to reduce exposure allows the exposure time to be set shorter, and thus it is possible to obtain an appropriate bright line image. If arbitrary setting of a center position for the enlargement is not possible, the optical zoom enlarges a central part of the angle of view or the image. Therefore, even when arbitrary setting of the center position is not possible, the optical zoom can be used to make the second image brighter as a whole as long as the central part of the first image is bright. Here, if the enlargement by the optical zoom is performed even when the central part of the first image is dark, the second image will be dark, resulting in the exposure time becoming long. Therefore, as described above, the enlargement by the optical zoom is performed only when the central part is determined to be bright so that the exposure time can be prevented from becoming long.

Furthermore, in the exposure time setting step, a brighter part than the other part in a first image of a subject including a light emitter captured by, among K imaging elements (where K is an integer of 3 or more) included in an image sensor, only N imaging elements (where N is an integer less than K and no less than 2) evenly dispersed in the image sensor may be specified. Moreover, a second image captured by only N densely arranged imaging elements corresponding to the bright part among the K imaging elements included in the image sensor may be used as input of the automatic exposure to set the exposure time. In the bright line image obtainment step, an image may be captured by only the N densely arrange imaging elements included in the image sensor with the set exposure time to obtain a bright line image.

By doing so, the second image can be bright as a whole through what is called the EX zoom even when the bright part is not located at the center of the first image, with the result that the exposure time can be set short.

Furthermore, in the exposure time setting step, a metering position in the image of the subject captured by the image sensor may be set, and an exposure time according to brightness at the set metering position may be set by the automatic exposure.

By doing so, when the bright part in the captured image is set as the metering position, processing in the automatic exposure to reduce exposure allows the exposure time to be set shorter, and thus it is possible to obtain an appropriate bright line image.

Furthermore, the reception program may further cause a computer to execute an imaging mode setting step of switching an imaging mode of the image sensor from a color imaging mode for obtaining a color image by imaging to a monochrome imaging mode for obtaining a monochrome image by imaging. In this case, in the exposure time setting step, an image obtained in the monochrome imaging mode may be used as input of the automatic exposure to set the exposure time.

Thus, an image obtained in the monochrome imaging mode is used as input of the automatic exposure, with the result that an appropriate exposure time can be set without influence of color information. When the exposure time is set in the monochrome imaging mode, the bright line image is obtained by imaging according to this mode. Therefore, when the light emitter transmits information only by changing in luminance, the information can be appropriately obtained.

Furthermore, in the exposure time setting step, every time an image is obtained by capturing an image of the light emitter by the image sensor, the obtained image may be used as input of the automatic exposure to update the exposure time of the image sensor, and when the fluctuation range of the exposure time that is updated as needed falls below a predetermined range, the updating of the exposure time by the automatic exposure may be brought to an end; thus the exposure time may be set.

Thus, when the fluctuation of the exposure time is stable, that is, when brightness of an image obtained by imaging is within a target brightness range, the exposure time set at the point is used in the imaging for obtaining a bright line image.

Therefore, an appropriate bright line image can be obtained.

Embodiment 12

This embodiment describes each example of application using a receiver such as a smartphone and a transmitter for transmitting information as a blink pattern of an LED or an organic EL device in each of the embodiments described above.

In this embodiment, the exposure time is set for each exposure line or each imaging element.

FIGS. 255, 256, and 257 are diagrams illustrating an example of a signal reception method in Embodiment 12.

As illustrated in FIG. 255, the exposure time is set for each exposure line in an image sensor 10010*a* which is an imaging unit included in a receiver. Specifically, a long exposure time for normal imaging is set for a predetermined exposure line (white exposure lines in FIG. 255) and a short exposure time for visible light imaging is set for another exposure line (black exposure lines in FIG. 255). For example, a long exposure time and a short exposure line are alternately set for exposure lines arranged in the vertical direction. By doing so, normal imaging and visible light imaging (visible light communication) can be performed almost simultaneously upon capturing an image of a transmitter that transmits a visible light signal by changing in luminance. Note that out of the two exposure times, different exposure times may be alternately set on a per line basis, or a different exposure time may be set for each set of several lines or each of an upper part and a lower part of the image sensor 10010*a*. With the use of two exposure times in this way, combining data of images captured with the exposure lines for which the same exposure time is set results in each of a normal captured image 10010*b* and a visible light captured image 10010*c* which is a bright line image having a pattern of a plurality of bright lines. Since the normal captured image 10010*b* lacks an image portion not captured with the long exposure time (that is, an image corresponding to the exposure lines for which the short exposure time is set), the normal captured image 10010*b* is interpolated for the image portion so that a preview image 10010*d* can be displayed. Here, information obtained by visible light communication can be superimposed on the preview image 10010*d*. This information is information associated with the visible light signal, obtained by decoding the pattern of the plurality of the bright lines included in the visible light captured image 10010*c*. Note that it is possible that the receiver stores, as a captured image, the normal captured image 10010*b* or an interpolated image of the normal captured image 10010*b*, and adds to the stored captured image the received visible light signal or the information associated with the visible light signal as additional information.

As illustrated in FIG. 256, an image sensor 10011*a* may be used instead of the image sensor 10010*a*. In the image sensor 1011*a*, the exposure time is set for each column of a plurality of imaging elements arranged in the direction perpendicular to the exposure lines (the column is hereinafter referred to as a vertical line) rather than for each exposure line. Specifically, a long exposure time for normal imaging is set for a predetermined vertical line (white vertical lines in FIG. 256) and a short exposure time for visible light imaging is set for another vertical line (black vertical lines in FIG. 256). In this case, in the image sensor 10011*a*, the exposure of each of the exposure lines starts at a different point in time as in the image sensor 10010*a*, but the exposure time of each imaging element included in each of the exposure lines is different. Through imaging by this image sensor 10011*a*, the receiver obtains a normal captured image 10011*b* and a visible light captured image 10011*c*. Furthermore, the receiver generates and displays a preview image 10011*d* based on this normal captured image 10011*b* and information associated with the visible light signal obtained from the visible light captured image 10011*c*.

This image sensor 10011*a* is capable of using all the exposure lines for visible light imaging unlike the image sensor 10010*a*. Consequently, the visible light captured image 10011*c* obtained by the image sensor 10011*a* includes a larger number of bright lines than in the visible light captured image 10010*c*, and therefore allows the visible light signal to be received with increased accuracy.

As illustrated in FIG. 257, an image sensor 10012*a* may be used instead of the image sensor 10010*a*. In the image sensor 10012*a*, the exposure time is set for each imaging element in such a way that the same exposure time is not set for imaging elements next to each other in the horizontal direction and the vertical direction. In other words, the exposure time is set for each imaging element in such a way that a plurality of imaging elements for which a long exposure time is set and a plurality of imaging elements for which a short exposure time is set are distributed in a grid or a checkered pattern. Also in this case, the exposure of each of the exposure lines starts at a different point in time as in the image sensor 10010*a*, but the exposure time of each imaging element included in each of the exposure lines is different. Through imaging by this image sensor 10012*a*, the receiver obtains a normal captured image 10012*b* and a visible light captured image 10012*c*. Furthermore, the receiver generates and displays a preview image 10012*d* based on this normal captured image 10012*b* and information associated with the visible light signal obtained from the visible light captured image 10012*c*.

The normal captured image 10012*b* obtained by the image sensor 10012*a* has data of the plurality of the imaging elements arranged in a grid or evenly arranged, and therefore interpolation and resizing thereof can be more accurate than those of the normal captured image 10010*b* and the normal captured image 10011*b*. The visible light captured image 10012*c* is generated by imaging that uses all the exposure lines of the image sensor 10012*a*. Thus, this image sensor 10012*a* is capable of using all the exposure lines for visible light imaging unlike the image sensor 10010*a*. Consequently, as with the visible light captured image 10011*c*, the visible light captured image 10012*c* obtained by the image sensor 10012*a* includes a larger number of bright lines than in the visible light captured image 10010*c*, and therefore allows the visible light signal to be received with increased accuracy.

Interlaced display of the preview image is described below.

FIG. 258 is a diagram illustrating an example of a screen display method used by a receiver in Embodiment 12.

The receiver including the above-described image sensor 10010*a* illustrated in FIG. 255 switches, at predetermined intervals, between an exposure time that is set in an odd-numbered exposure line (hereinafter referred to as an odd line) and an exposure line that is set in an even-numbered exposure line (hereinafter referred to as an even line). For example, as illustrated in FIG. 258, at time t1, the receiver sets a long exposure time for each imaging element in the odd lines, and sets a short exposure time for each imaging element in the even lines, and an image is captured with these set exposure times. At time t2, the receiver sets a short exposure time for each imaging element in the odd lines, and sets a long exposure time for each imaging element in the even lines, and an image is captured with these set exposure times. At time t3, the receiver captures an image with the same exposure times set as those set at time t1. At time t4, the receiver captures an image with the same exposure times set as those set at time t2.

At time t1, the receiver obtains Image 1 which includes captured images obtained from the plurality of the odd lines (hereinafter referred to as odd-line images) and captured images obtained from the plurality of the even lines (hereinafter referred to as even-line images). At this time, the exposure time for each of the even lines is short, resulting in the subject failing to appear clear in each of the even-line images. Therefore, the receiver generates interpolated line images by interpolating even-line images with pixel values. The receiver then displays a preview image including the interpolated line images instead of the even-line images. Thus, the odd-line images and the interpolated line images are alternately arranged in the preview image.

At time t2, the receiver obtains Image 2 which includes captured odd-line images and even-line images. At this time, the exposure time for each of the odd lines is short, resulting in the subject failing to appear clear in each of the odd-line images. Therefore, the receiver displays a preview image including the odd-line images of the Image 1 instead of the odd-line images of the Image 2. Thus, the odd-line images of the Image 1 and the even-line images of the Image 2 are alternately arranged in the preview image.

At time t3, the receiver obtains Image 3 which includes captured odd-line images and even-line images. At this time, the exposure time for each of the even lines is short, resulting in the subject failing to appear clear in each of the even-line images, as in the case of time t1. Therefore, the receiver displays a preview image including the even-line images of the Image 2 instead of the even-line images of the Image 3. Thus, the even-line images of the Image 2 and the odd-line images of the Image 3 are alternately arranged in the preview image. At time t4, the receiver obtains Image 4 which includes captured odd-line images and even-line images. At this time, the exposure time for each of the odd lines is short, resulting in the subject failing to appear clear in each of the odd-line images, as in the case of time t2. Therefore, the receiver displays a preview image including the odd-line images of the Image 3 instead of the odd-line images of the Image 4. Thus, the odd-line images of the Image 3 and the even-line images of the Image 4 are alternately arranged in the preview image.

In this way, the receiver displays the image including the even-line images and the odd-line images obtained at different times, that is, displays what is called an interlaced image.

The receiver is capable of displaying a high-definition preview image while performing visible light imaging. Note that the imaging elements for which the same exposure time is set may be imaging elements arranged along a direction horizontal to the exposure line as in the image sensor 10010*a*, or imaging elements arranged along a direction perpendicular to the exposure line as in the image sensor 10011*a*, or imaging elements arranged in a checkered pattern as in the image sensor 10012*a*. The receiver may store the preview image as captured image data.

Next, a spatial ratio between normal imaging and visible light imaging is described.

FIG. 259 is a diagram illustrating an example of a signal reception method in Embodiment 12.

In an image sensor 10014*b* included in the receiver, a long exposure time or a short exposure time is set for each exposure line as in the above-described image sensor 10010*a*. In this image sensor 10014*b*, the ratio between the number of imaging elements for which the long exposure time is set and the number of imaging elements for which the short exposure time is set is one to one. This ratio is a ratio between normal imaging and visible light imaging and hereinafter referred to as a spatial ratio.

In this embodiment, however, this spatial ratio does not need to be one to one. For example, the receiver may include an image sensor 10014*a*. In this image sensor 10014*a*, the number of imaging elements for which a short exposure time is set is greater than the number of imaging elements for which a long exposure time is set, that is, the spatial ratio is one to N (N>1). Alternatively, the receiver may include an image sensor 10014*c*. In this image sensor 10014*c*, the number of imaging elements for which a short exposure time is set is less than the number of imaging elements for which a long exposure time is set, that is, the spatial ratio is N (N>1) to one. It may also be that the exposure time is set for each vertical line described above, and thus the receiver includes, instead of the image sensors 10014*a* to 10014*c*, any one of image sensors 10015*a* to 10015*c* having spatial ratios one to N, one to one, and N to one, respectively.

These image sensors 10014*a* and 10015*a* are capable of receiving the visible light signal with increased accuracy or speed because they include a large number of imaging elements for which the short exposure time is set. These image sensors 10014*c* and 10015*c* are capable of displaying a high-definition preview image because they include a large number of imaging elements for which the long exposure time is set.

Furthermore, using the image sensors 10014*a*, 10014*c*, 10015*a*, and 10015*c*, the receiver may display an interlaced image as illustrated in FIG. 258.

Next, a temporal ratio between normal imaging and visible light imaging is described.

FIG. 260 is a diagram illustrating an example of a signal reception method in Embodiment 12.

The receiver may switch the imaging mode between a normal imaging mode and a visible light imaging mode for each frame as illustrated in (a) in FIG. 260. The normal imaging mode is an image mode in which a long exposure time for normal imaging is set for all the imaging elements of the image sensor in the receiver. The visible light imaging mode is an image mode in which a short exposure time for visible light imaging is set for all the imaging elements of the image sensor in the receiver. Such switching between the long and short exposure times makes it possible to display a preview image using an image captured with the long exposure time while receiving a visible light signal using an image captured with the short exposure time.

Note that in the case of determining a long exposure time by the automatic exposure, the receiver may ignore an image captured with a short exposure time so as to perform the automatic exposure based on only brightness of an image captured with a long exposure time. By doing so, it is possible to determine an appropriate long exposure time.

Alternatively, the receiver may switch the imaging mode between the normal imaging mode and the visible light imaging mode for each set of frames as illustrated in (b) in FIG. 260. If it takes time to switch the exposure time or if it takes time for the exposure time to stabilize, changing the exposure time for each set of frames as in (b) in FIG. 260 enables the visible light imaging (reception of a visible light signal) and the normal imaging at the same time. The number of times the exposure time is switched is reduced as the number of frames included in the set increases, and thus it is possible to reduce power consumption and heat generation in the receiver.

The ratio between the number of frames continuously generated by imaging in the normal imaging mode using a long exposure time and the number of frames continuously generated by imaging in the visible light imaging mode using a short exposure time (hereinafter referred to as a temporal ratio) does not need to be one to one. That is, although the temporal ratio is one to one in the case illustrated in (a) and (b) of FIG. 260, this temporal ratio does not need to be one to one.

For example, the receiver can make the number of frames in the visible light imaging mode greater than the number of frames in the normal imaging mode as illustrated in (c) in FIG. 260. By doing so, it is possible to receive the visible light signal with increased speed. When the frame rate of the preview image is greater than or equal to a predetermined rate, a difference in the preview image depending on the frame rate is not visible to human eyes. When the imaging frame rate is sufficiently high, for example, when this frame rate is 120 fps, the receiver sets the visible light imaging mode for three consecutive frames and sets the normal imaging mode for one following frame. By doing so, it is possible to receive the visible light signal with high speed while displaying the preview image at 30 fps which is a frame rate sufficiently higher than the above predetermined rate. Furthermore, the number of switching operations is small, and thus it is possible to obtain the effects described with reference to (b) in FIG. 260.

Alternatively, the receiver can make the number of frames in the normal imaging mode greater than the number of frames in the visible light imaging mode as illustrated in (d) in FIG. 260. When the number of frames in the normal imaging mode, that is, the number of frames captured with the long exposure time, is set large as just mentioned, a smooth preview image can be displayed. In this case, there is a power saving effect because of a reduced number of times the processing of receiving a visible light signal is performed. Furthermore, the number of switching operations is small, and thus it is possible to obtain the effects described with reference to (b) in FIG. 260.

It may also be possible that, as illustrated in (e) in FIG. 260, the receiver first switches the imaging mode for each frame as in the case illustrated in (a) in FIG. 260 and next, upon completing receiving the visible light signal, increases the number of frames in the normal imaging mode as in the case illustrated in (d) in FIG. 260. By doing so, it is possible to continue searching for a new visible light signal while displaying a smooth preview image after completion of the reception of the visible light signal. Furthermore, since the number of switching operations is small, it is possible to obtain the effects described with reference to (b) in FIG. 260.

FIG. 261 is a flowchart illustrating an example of a signal reception method in Embodiment 12.

The receiver starts visible light reception which is processing of receiving a visible light signal (Step S10017a) and sets a preset long/short exposure time ratio to a value specified by a user (Step S10017b). The preset long/short exposure time ratio is at least one of the above spatial ratio and temporal ratio. A user may specify only the spatial ratio, only the temporal ratio, or values of both the spatial ratio and the temporal ratio. Alternatively, the receiver may automatically set the preset long/short exposure time ratio without depending on a ratio specified by a user.

Next, the receiver determines whether or not the reception performance is no more than a predetermined value (Step S10017c). When determining that the reception performance is no more than the predetermined value (Y in Step S10017c), the receiver sets the ratio of the short exposure time high (Step S10017d). By doing so, it is possible to increase the reception performance. Note that the ratio of the short exposure time is, when the spatial ratio is used, a ratio of the number of imaging elements for which the short exposure time is set to the number of imaging elements for which the long exposure time is set, and is, when the temporal ratio is used, a ratio of the number of frames continuously generated in the visible light imaging mode to the number of frames continuously generated in the normal imaging mode.

Next, the receiver receives at least part of the visible light signal and determines whether or not at least part of the visible light signal received (hereinafter referred to as a received signal) has a priority assigned (Step S10017e). The received signal that has a priority assigned contains an identifier indicating a priority. When determining that the received signal has a priority assigned (Step S10017e: Y), the receiver sets the preset long/short exposure time ratio according to the priority (Step S10017f). Specifically, the receiver sets the ratio of the short exposure time high when the priority is high. For example, an emergency light as a transmitter transmits an identifier indicating a high priority by changing in luminance. In this case, the receiver can increase the ratio of the short exposure time to increase the reception speed and thereby promptly display an escape route and the like.

Next, the receiver determines whether or not the reception of all the visible light signals has been completed (Step S10017g). When determining that the reception has not been completed (Step S10017g: N), the receiver repeats the processes following Step S10017c. In contrast, when determining that the reception has been completed (Step S10017g: Y), the receiver sets the ratio of the long exposure time high and effects a transition to a power saving mode (Step S10017h). Note that the ratio of the long exposure time is, when the spatial ratio is used, a ratio of the number of imaging elements for which the long exposure time is set to the number of imaging elements for which the short exposure time is set, and is, when the temporal ratio is used, a ratio of the number of frames continuously generated in the normal imaging mode to the number of frames continuously generated in the visible light imaging mode. This makes it possible to display a smooth preview image without performing unnecessary visible light reception.

Next, the receiver determines whether or not another visible light signal has been found (Step S10017i). When another visible light signal has been found (Step S10017i: Y), the receiver repeats the processes following Step S10017b.

Next, simultaneous operation of visible light imaging and normal imaging is described.

FIG. 262 is a diagram illustrating an example of a signal reception method in Embodiment 12.

The receiver may set two or more exposure times in the image sensor. Specifically, as illustrated in (a) in FIG. 262, each of the exposure lines included in the image sensor is exposed continuously for the longest exposure time of the two or more set exposure times. For each exposure line, the receiver reads out captured image data obtained by exposure of the exposure line, at a point in time when each of the above-described two or more set exposure times ends. The receiver does not reset the read captured image data until the longest exposure time ends. Therefore, the receiver records cumulative values of the read captured image data, so that the receiver will be able to obtain captured image data corresponding to a plurality of exposure times by exposure of the longest exposure time only. Note that it is optional whether the image sensor records cumulative values of captured image data. When the image sensor does not record cumulative values of captured image data, a structural element of the receiver that reads out data from the image sensor performs cumulative calculation, that is, records cumulative values of captured image data.

For example, when two exposure times are set, the receiver reads out visible light imaging data generated by exposure for a short exposure time that includes a visible light signal, and subsequently reads out normal imaging data generated by exposure for a long exposure time as illustrated in (a) in FIG. 262.

By doing so, visible light imaging which is imaging for receiving a visible light signal and normal imaging can be performed at the same time, that is, it is possible to perform the normal imaging while receiving the visible light signal. Furthermore, the use of data across exposure times allows a signal of no less than the frequency indicated by the sampling theorem to be recognized, making it possible to receive a high frequency signal, a high-density modulated signal, or the like.

When outputting captured image data, the receiver outputs a data sequence that contains the captured image data as an imaging data body as illustrated in (b) in FIG. 262. Specifically, the receiver generates the above data sequence by adding additional information to the imaging data body and outputs the generated data sequence. The additional information contains: an imaging mode identifier indicating an imaging mode (the visible light imaging or the normal imaging); an imaging element identifier for identifying an imaging element or an exposure line included in the imaging element; an imaging data number indicating a place of the exposure time of the captured image data in the order of the exposure times; and an imaging data length indicating a size of the imaging data body. In the method of reading out captured image data described with reference to (a) in FIG. 262, the captured image data is not necessarily output in the order of the exposure lines. Therefore, the additional information illustrated in (b) in FIG. 262 is added so that which exposure line the captured image data is based on can be identified.

FIG. 263A is a flowchart illustrating processing of a reception program in Embodiment 12.

This reception program is a program for causing a computer included in a receiver to execute the processing illustrated in FIGS. 255 to 262, for example.

In other words, this reception program is a reception program for receiving information from a light emitter changing in luminance. In detail, this reception program causes a computer to execute Step SA31, Step SA32, and Step SA33. In Step SA31, a first exposure time is set for a plurality of imaging elements which are a part of K imaging elements (where K is an integer of 4 or more) included in an image sensor, and a second exposure time shorter than the first exposure time is set for a plurality of imaging elements which are a remainder of the K imaging elements. In Step SA32, the image sensor captures a subject, i.e., a light emitter changing in luminance, with the set first exposure time and the set second exposure time, to obtain a normal image according to output from the plurality of the imaging elements for which the first exposure time is set, and obtain a bright line image according to output from the plurality of the imaging elements for which the second exposure time is set. The bright light image includes a plurality of bright lines each of which corresponds to a different one of a plurality of exposure lines included in the image sensor. In Step SA33, a pattern of the plurality of the bright lines included in the obtained bright line image is decoded to obtain information.

With this, imaging is performed by the plurality of the imaging elements for which the first exposure time is set and the plurality of the imaging elements for which the second exposure time is set, with the result that a normal image and a bright line image can be obtained in a single imaging operation by the image sensor. That is, it is possible to capture a normal image and obtain information by visible light communication at the same time.

Furthermore, in the exposure time setting step SA31, a first exposure time is set for a plurality of imaging element lines which are a part of L imaging element lines (where L is an integer of 4 or more) included in the image sensor, and the second exposure time is set for a plurality of imaging element lines which are a remainder of the L imaging element lines. Each of the L imaging element lines includes a plurality of imaging elements included in the image sensor and arranged in a line.

With this, it is possible to set an exposure time for each imaging element line, which is a large unit, without individually setting an exposure time for each imaging element, which is a small unit, so that the processing load can be reduced.

For example, each of the L imaging element lines is an exposure line included in the image sensor as illustrated in FIG. 255. Alternatively, each of the L imaging element lines includes a plurality of imaging elements included in the image sensor and arranged along a direction perpendicular to the plurality of the exposure lines as illustrated in FIG. 256.

It may be that in the exposure time setting step SA31, one of the first exposure time and the second exposure time is set for each of odd-numbered imaging element lines of the L imaging element lines included in the image sensor, to set the same exposure time for each of the odd-numbered imaging element lines, and a remaining one of the first exposure time and the second exposure time is set for each of even-numbered imaging element lines of the L imaging element lines, to set the same exposure time for each of the even-numbered imaging element lines, as illustrated in FIG. 258. In the case where the exposure time setting step SA31, the image obtainment step SA32, and the information obtainment step SA33 are repeated, in the current round of the exposure time setting step S31, an exposure time for each of the odd-numbered imaging element lines is set to an exposure time set for each of the even-numbered imaging element lines in an immediately previous round of the exposure time setting step S31, and an exposure time for each of the even-numbered imaging element lines is set to an exposure time set for each of the odd-numbered imaging element lines in the immediately previous round of the exposure time setting step S31.

With this, at every operation to obtain a normal image, the plurality of the imaging element lines that are to be used in the obtainment can be switched between the odd-numbered imaging element lines and the even-numbered imaging element lines. As a result, each of the sequentially obtained normal images can be displayed in an interlaced format. Furthermore, by interpolating two continuously obtained normal images with each other, it is possible to generate a new normal image that includes an image obtained by the odd-numbered imaging element lines and an image obtained by the even-numbered imaging element lines.

It may be that in the exposure time setting step SA31, a preset mode is switched between a normal imaging priority mode and a visible light imaging priority mode, and when the preset mode is switched to the normal imaging priority mode, the total number of the imaging elements for which the first exposure time is set is greater than the total number of the imaging elements for which the second exposure time is set, and when the preset mode is switched to the visible light imaging priority mode, the total number of the imaging elements for which the first exposure time is set is less than the total number of the imaging elements for which the second exposure time is set, as illustrated in FIG. 259.

With this, when the preset mode is switched to the normal imaging priority mode, the quality of the normal image can be improved, and when the preset mode is switched to the visible light imaging priority mode, the reception efficiency for information from the light emitter can be improved.

It may be that in the exposure time setting step SA31, an exposure time is set for each imaging element included in the image sensor, to distribute, in a checkered pattern, the plurality of the imaging elements for which the first exposure time is set and the plurality of the imaging elements for which the second exposure time is set, as illustrated in FIG. 257.

This results in uniform distribution of the plurality of the imaging elements for which the first exposure time is set and the plurality of the imaging elements for which the second exposure time is set, so that it is possible to obtain the normal image and the bright line image, the quality of which is not unbalanced between the horizontal direction and the vertical direction.

FIG. 263B is a block diagram of a reception device in Embodiment 12.

This reception device A30 is the above-described receiver that performs the processing illustrated in FIGS. 255 to 262, for example.

In detail, this reception device A30 is a reception device that receives information from a light emitter changing in luminance, and includes a plural exposure time setting unit A31, an imaging unit A32, and a decoding unit A33. The plural exposure time setting unit A31 sets a first exposure time for a plurality of imaging elements which are a part of K imaging elements (where K is an integer of 4 or more) included in an image sensor, and sets a second exposure time shorter than the first exposure time for a plurality of imaging elements which are a remainder of the K imaging elements. The imaging unit A32 causes the image sensor to capture a subject, i.e., a light emitter changing in luminance, with the set first exposure time and the set second exposure time, to obtain a normal image according to output from the plurality of the imaging elements for which the first exposure time is set, and obtain a bright line image according to output from the plurality of the imaging elements for which the second exposure time is set. The bright line image includes a plurality of bright lines each of which corresponds to a different one of a plurality of exposure lines included in the image sensor. The decoding unit A33 obtains information by decoding a pattern of the plurality of the bright lines included in the obtained bright line image. This reception device A30 can produce the same advantageous effects as the above-described reception program.

Next, displaying of content related to a received visible light signal is described.

FIGS. 264 and 265 are diagram illustrating an example of what is displayed on a receiver when a visible light signal is received.

The receiver captures an image of a transmitter 10020*d* and then displays an image 10020*a* including the image of the transmitter 10020*d* as illustrated in (a) in FIG. 264. Furthermore, the receiver generates an image 10020*b* by superimposing an object 10020*e* on the image 10020*a* and displays the image 10020*b*. The object 10020*e* is an image indicating a location of the transmitter 10020*d* and that a visible light signal is being received from the transmitter 10020*d*. The object 10020*e* may be an image that is different depending on the reception status for the visible light signal (such as a state in which a visible light signal is being received or the transmitter is being searched for, an extent of reception progress, a reception speed, or an error rate). For example, the receiver changes a color, a line thickness, a line type (single line, double line, dotted line, etc.), or a dotted-line interval of the object 1020*e*. This allows a user to recognize the reception status. Next, the receiver generates an image 10020*c* by superimposing on the image 10020*a* an obtained data image 10020*f* which represents content of obtained data, and displays the image 10020*c*. The obtained data is the received visible light signal or data associated with an ID indicated by the received visible light signal.

Upon displaying this obtained data image 10020*f*, the receiver displays the obtained data image 10020*f* in a speech balloon extending from the transmitter 10020*d* as illustrated in (a) in FIG. 264, or displays the obtained data image 10020*f* near the transmitter 10020*d*. Alternatively, the receiver may display the obtained data image 10020*f* in such a way that the obtained data image 10020*f* can be displayed gradually closer to the transmitter 10020*d* as illustrated in (b) of FIG. 264. This allows a user to recognize which transmitter transmitted the visible light signal on which the obtained data image 10020*f* is based. Alternatively, the receiver may display the obtained data image 10020*f* as illustrated in FIG. 265 in such a way that the obtained data image 10020*f* gradually comes in from an edge of a display of the receiver. This allows a user to easily recognize that the visible light signal was obtained at that time.

Next, Augmented Reality (AR) is described.

FIG. 266 is a diagram illustrating a display example of the obtained data image 10020*f*.

When the image of the transmitter moves on the display, the receiver moves the obtained data image 10020*f* according to the movement of the image of the transmitter. This allows a user to recognize that the obtained data image 10020*f* is associated with the transmitter. The receiver may alternatively display the obtained data image 10020*f* in association with something different from the image of the transmitter. With this, data can be displayed in AR.

Next, storing and discarding the obtained data is described.

FIG. 267 is a diagram illustrating an operation example for storing or discarding obtained data.

For example, when a user swipes the obtained data image 10020*f* down as illustrated in (a) in FIG. 267, the receiver stores obtained data represented by the obtained data image 10020*f*. The receiver positions the obtained data image 10020*f* representing the obtained data stored, at an end of arrangement of the obtained data image representing one or more pieces of other obtained data already stored. This allows a user to recognize that the obtained data represented by the obtained data image 10020*f* is the obtained data stored last. For example, the receiver positions the obtained data image 10020*f* in front of any other one of obtained data images as illustrated in (a) in FIG. 267.

When a user swipes the obtained data image 10020*f* to the right as illustrated in (b) in FIG. 267, the receiver discards obtained data represented by the obtained data image 10020*f*. Alternatively, it may be that when a user moves the receiver so that the image of the transmitter goes out of the frame of the display, the receiver discards obtained data represented by the obtained data image 10020*f*. Here, all the upward, downward, leftward, and rightward swipes produce the same or similar effect as that described above. The receiver may display a swipe direction for storing or discarding. This allows a user to recognize that data can be stored or discarded with such operation.

Next, browsing of obtained data is described.

FIG. 268 is a diagram illustrating an example of what is displayed when obtained data is browsed.

In the receiver, obtained data images of a plurality of pieces of obtained data stored are displayed on top of each other, appearing small, in a bottom area of the display as illustrated in (a) in FIG. 268. When a user taps a part of the obtained data images displayed in this state, the receiver displays an expanded view of each of the obtained data images as illustrated in (b) in FIG. 268. Thus, it is possible to display an expanded view of each obtained data only when it is necessary to browse the obtained data, and efficiently use the display to display other content when it is not necessary to browse the obtained data.

When a user taps the obtained data image that is desired to be displayed in a state illustrated in (b) in FIG. 268, a further expanded view of the obtained data image tapped is displayed as illustrated in (c) in FIG. 268 so that a large amount of information is displayed out of the obtained data image. Furthermore, when a user taps a back-side display button 10024*a*, the receiver displays the back side of the obtained data image, displaying other data related to the obtained data.

Next, turning off of an image stabilization function upon self-position estimation is described.

By disabling (turning off) the image stabilization function or converting a captured image according to an image stabilization direction and an image stabilization amount, the receiver is capable of obtaining an accurate imaging direction and accurately performing self-position estimation. The captured image is an image captured by an imaging unit of the receiver. Self-position estimation means that the receiver estimates its position. Specifically, in the self-position estimation, the receiver identifies a position of a transmitter based on a received visible light signal and identifies a relative positional relationship between the receiver and the transmitter based on the size, position, shape, or the like of the transmitter appearing in a captured image. The receiver then estimates a position of the receiver based on the position of the transmitter and the relative positional relationship between the receiver and the transmitter.

The transmitter moves out of the frame due to even a little shake of the receiver at the time of partial read-out illustrated in, for example, FIG. 255, in which an image is captured only with the use of a part of the exposure lines, that is, when imaging illustrated in, for example, FIG. 255, is performed. In such a case, the receiver enables the image stabilization function and thereby can continue signal reception.

Next, self-position estimation using an asymmetrically shaped light emitting unit is described.

FIG. 269 is a diagram illustrating an example of a transmitter in Embodiment 12.

The above-described transmitter includes a light emitting unit and causes the light emitting unit to change in luminance to transmit a visible light signal. In the above-described self-position estimation, the receiver determines, as a relative positional relationship between the receiver and the transmitter, a relative angle between the receiver and the transmitter based on the shape of the transmitter (specifically, the light emitting unit) in a captured image. Here, in the case where the transmitter includes a light emitting unit 10090*a* having a rotationally symmetrical shape as illustrated in, for example, FIG. 269, the determination of a relative angle between the transmitter and the receiver based on the shape of the transmitter in a captured image as described above cannot be accurate. Thus, it is desirable that the transmitter include a light emitting unit having a non-rotationally symmetrical shape. This allows the receiver to accurately determine the above-described relative angle. This is because a bearing sensor for obtaining an angle has a wide margin of error in measurement; therefore, the use of the relative angle determined in the above-described method allows the receiver to perform accurate self-position estimation.

The transmitter may include a light emitting unit 10090*b*, the shape of which is not a perfect rotation symmetry as illustrated in FIG. 269. The shape of this light emitting unit 10090*b* is symmetrical at 90 degree rotation, but not perfect rotational symmetry. In this case, the receiver determines a rough angle using the bearing sensor and can further use the shape of the transmitter in a captured image to uniquely limit the relative angle between the receiver and the transmitter, and thus it is possible to perform accurate self-position estimation.

The transmitter may include a light emitting unit 10090*c* illustrated in FIG. 269. The shape of this light emitting unit 10090*c* is basically rotational symmetry. However, with a light guide plate or the like placed in a part of the light emitting unit 10090*c*, the light emitting unit 10090*c* is formed into a non-rotationally symmetrical shape.

The transmitter may include a light emitting unit 10090*d* illustrated in FIG. 269. This light emitting unit 10090*d* includes lightings each having a rotationally symmetrical shape. These lightings are arranged in combination to form the light emitting unit 10090*d*, and the whole shape thereof is not rotationally symmetrical. Therefore, the receiver is capable of performing accurate self-position estimation by capturing an image of the transmitter. It is not necessary that all the lightings included in the light emitting unit 10090*d* are each a lighting for visible light communication which changes in luminance for transmitting a visible light signal; it may be that only a part of the lightings is the lighting for visible light communication.

The transmitter may include a light emitting unit 10090*e* and an object 10090*f* illustrated in FIG. 269. The object 10090*f* is an object configured such that its positional relationship with the light emitting unit 10090*e* does not change (e.g. a fire alarm or a pipe). The shape of the combination of the light emitting unit 10090*e* and the object 10090*f* is not rotationally symmetrical. Therefore, the receiver is capable of performing self-position estimation with accuracy by capturing images of the light emitting unit 10090e and the object 10090f.

Next, time-series processing of the self-position estimation is described.

Every time the receiver captures an image, the receiver can perform the self-position estimation based on the position and the shape of the transmitter in the captured image. As a result, the receiver can estimate a direction and a distance in which the receiver moved while capturing images. Furthermore, the receiver can perform triangulation using frames or images to perform more accurate self-position estimation. By combining the results of estimation using images or the results of estimation using different combinations of images, the receiver is capable of performing the self-position estimation with higher accuracy. At this time, the results of estimation based on the most recently captured images are combined with a high priority, making it possible to perform the self-position estimation with higher accuracy.

Next, skipping read-out of optical black is described.

FIG. 270 is a diagram illustrating an example of a reception method in Embodiment 12. In the graph illustrated in FIG. 270, the horizontal axis represents time, and the vertical axis represents a position of each exposure line in the image sensor. A solid arrow in this graph indicates a point in time when exposure of each exposure line in the image sensor starts (an exposure timing).

The receiver reads out a signal of horizontal optical black as illustrated in (a) in FIG. 270 at the time of normal imaging, but can skip reading out a signal of horizontal optical black as illustrated in (b) of FIG. 270. By doing so, it is possible to continuously receive visible light signals.

The horizontal optical black is optical black that extends in the horizontal direction with respect to the exposure line. Vertical optical black is part of the optical black that is other than the horizontal optical black.

The receiver adjusts the black level based on a signal read out from the optical black and therefore, at a start of visible light imaging, can adjust the black level using the optical black as does at the time of normal imaging. Continuous signal reception and black level adjustment are possible when the receiver is designed to adjust the black level using only the vertical optical black if the vertical optical black is usable. The receiver may adjust the black level using the horizontal optical black at predetermined time intervals during continuous visible light imaging. In the case of alternately performing the normal imaging and the visible light imaging, the receiver skips reading out a signal of horizontal optical black when continuously performing the visible light imaging, and reads out a signal of horizontal optical black at a time other than that. The receiver then adjusts the black level based on the read-out signals and thus can adjust the black level while continuously receiving visible light signals. The receiver may adjust the black level assuming that the darkest part of a visible light captured image is black.

Thus, it is possible to continuously receive visible light signals when the optical black from which signals are read out is the vertical optical black only. Furthermore, with a mode for skipping reading out a signal of the horizontal optical black, it is possible to adjust the black level at the time of normal imaging and perform continuous communication according to the need at the time of visible light imaging. Moreover, by skipping reading out a signal of the horizontal optical black, the difference in timing of starting exposure between the exposure lines increases, with the result that a visible light signal can be received even from a transmitter that appears small in the captured image.

Next, an identifier indicating a type of the transmitter is described.

The transmitter may transmit a visible light signal after adding to the visible light signal a transmitter identifier indicating the type of the transmitter. In this case, the receiver is capable of performing a reception operation according to the type of the transmitter at the point in time when the receiver receives the transmitter identifier. For example, when the transmitter identifier indicates a digital signage, the transmitter transmits, as a visible light signal, a content ID indicating which content is currently displayed, in addition to a transmitter ID for individual identification of the transmitter. Based on the transmitter identifier, the receiver can handle these IDs separately to display information associated with the content currently displayed by the transmitter. Furthermore, for example, when the transmitter identifier indicates a digital signage, an emergency light, or the like, the receiver captures an image with increased sensitivity so that reception errors can be reduced.

Embodiment 13

This embodiment describes each example of application using a receiver such as a smartphone and a transmitter for transmitting information as a blink pattern of an LED or an organic EL device in each of the embodiments described above.

First, a header pattern in this embodiment is described.

FIG. 271 is a diagram illustrating an example of a header pattern in this embodiment.

The transmitter divides data to be transmitted into packets and transmits the packets. A packet is made up of a header and a body, for example. A luminance change pattern of the header, that is, a header pattern, needs to be a luminance change pattern that does not exist in the body. With this, it is possible to identify a position of a packet in data to be continuously transmitted.

For example, data to be transmitted is modulated using a 4 PPM scheme. Specifically, in this 4 PPM, data to be transmitted is modulated into a luminance change pattern having four slots, one of which indicates "0" and the other three of which indicate "1." Therefore, when data to be continuously transmitted is modulated, the number of continuous slots indicating "0" is no more than two, and the number of slots indicating "0" in four slots and next four slots is no more than two.

In this embodiment, the header pattern is represented as "111111111000" indicated in (a) in FIG. 271, "111111110001" indicated in (b) in FIG. 271, "111111101001" indicated in (c) in FIG. 271, or "111111100101" indicated in (d) in FIG. 271. With this, the header and the data to be continuously transmitted (i.e. the body) can be identified. Specifically, in the header pattern indicated in (a) in FIG. 271, the last four slots "1000" of the header pattern can show that the four slots are a part of the header. In this case, the receiver can easily recognize a change in luminance because the number of slots indicating "0" in the header is three and the largest number of continuous slots indicating "0" is four. This means that the receiver can easily receive data from a small transmitter or a distant transmitter.

In the header pattern indicated in (b) in FIG. 271, the last five slots "10001" of the header pattern can show that the five slots are a part of the header. In this case, flicker due to a change in luminance can be reduced because the largest number of continuous slots indicating "0" is three, which is fewer than in the case of (a) in FIG. 271. As a result, the load on a circuit of the transmitter or the request for design therefore can be reduced. That is, it is possible to downsize the capacitor, reducing the power consumption, the calorific value, or the load on the power supply.

In the header pattern indicated in (c) or (d) in FIG. 271, the last six slots "101001" or "100101" of the header pattern can show that the six slots are a part of the header. In this case, flicker due to a change in luminance can be further reduced because the largest number of continuous slots indicating "0" is two, which is still fewer than in the case of (b) in FIG. 271.

FIG. 272 is a diagram for describing an example of a packet structure in a communication protocol in this embodiment.

The transmitter divides data to be transmitted into packets and transmits the packets. A packet is made up of a header, an address part, a data part, and an error correction code part. When the header has a luminance change pattern that does not exist in the other part, it is possible to identify a position of a packet in continuous data. Part of the divided data is stored into the data part. An address indicating which part of the whole the data in the data part is present is stored into the address part. A code for detecting or correcting a reception error of part of a packet or the whole packet (which is specifically ECC1, ECC2, or ECC3 illustrated in FIG. 272 and are collectively referred to as an error correction code) is stored into the error correction code part.

The ECC1 is an error correction code of the address part. When the error correction code of the address part is provided rather than the error correction code of the whole packet, the reliability of the address part can be higher than the reliability of the whole packet. With this, when a plurality of packets have been received, data parts of packets that have the same address are compared so that the data parts can be verified, allowing for a reduction in the reception error rate. The same or similar advantageous effects can be produced when the error correction code of the address part is longer than the error correction code of the data part.

Each of the ECC2 and the ECC3 is an error correction code of the data part. The number of error correction code parts may be other than two. When the data part has a plurality of error correction codes, it is possible to perform error correction using only the error correction code for a part successfully received so far, and thus it is possible to receive highly reliable data even when the packet has not been fully received.

The transmitter may be configured to transmit a predetermined number of error correction codes or less. This allows the receiver to receive data with high speed. This transmission method is effective for a transmitter having a light emitting unit which is small in size and high in luminance, such as a downlighting. This is because when the luminance is high, the error probability is low, meaning that there is no need for many error correction codes. In the case of a failure to transmit the ECC3, the header in next transmission starts with the ECC2, resulting in a high luminance state continuing over four or more slots, and thus the receiver can recognize that this part is not ECC3.

Note that the header, the address part, and the ECC1 are transmitted with a frequency lower than the data part, the ECC2, and the ECC3 as illustrated in (b) in FIG. 272. Conversely, the data part, the ECC2, and the ECC3 are transmitted with a frequency higher than the header, the address part, and the ECC1. With this, it is possible to reduce the reception error rate of data such as the header, and it is also possible to transmit a large amount of data in the data part with high speed.

Thus, in this embodiment, the packet includes the first error correction codes (ECC2 and ECC3) for the data part, and the second error correction code (ECC1) for the address part. When receiving such packet, the receiver receives the address part and the second error correction code transmitted from the transmitter by changing in luminance according to the second frequency. Furthermore, the receiver receives the data part and the first error correction code transmitted from the transmitter by changing in luminance according to the first frequency higher than the second frequency.

A reception method in which data parts having the same addresses are compared is described below.

FIG. 273 is a flowchart illustrating an example of a reception method in this embodiment.

The receiver receives a packet (Step S10101) and performs error correction (Step S10102). The receiver then determines whether or not a packet having the same address as the address of the received packet has already been received (Step S10103). When determining that a packet having the same address has been received (Step S10103: Y), the receiver compares data in these packets. The receiver determines whether or not the data parts are identical (Step S10104). When determining that the data parts are not identical (Step S10104: N), the receiver further determines whether or not the number of differences between the data parts is a predetermined number or more, specifically, whether or not the number of different bits or the number of slots indicating different luminance states is a predetermined number or more (Step S10105). When determining that the number of differences is the predetermined number or more (Step S10105: N), the receiver discards the already received packet (Step S10106). By doing so, when a packet from another transmitter starts being received, interference with the packet received from a previous transmitter can be avoided. In contrast, when determining that the number of differences is not the predetermined number or more (Step S10105: N), the receiver regards, as data of the address, data of the data part of packets having an identical data part, the number of which is largest (Step S10107). Alternatively, the receiver regards identical bits, the number of which is largest, as a value of a bit of the address. Still alternatively, the receiver demodulates data of the address, regarding an identical luminance state, the number of which is largest, as a luminance state of a slot of the address.

Thus, in this embodiment, the receiver first obtains a first packet including the data part and the address part from a pattern of a plurality of bright lines. Next, the receiver determines whether or not at least one packet already obtained before the first packet includes at least one second packet which is a packet including the same address part as the address part of the first packet. Next, when the receiver determines that at least one such second packet is included, the receiver determines whether or not all the data parts in at least one such second packet and the first packet are the same. When the receiver determines that all the data parts are not the same, the receiver determines, for each of at least one such second packet, whether or not the number of parts, among parts included in the data part of the second packet, which are different from parts included in the data part of the first packet, is a predetermined number or more. Here, when at least one such second packet includes the second packet in which the number of different parts is determined as the predetermined number or more, the receiver discards at least one such second packet. When at least one such second packet does not include the second packet in which the number of different parts is determined as the predetermined number or more, the receiver identifies, among the first packet and at least one such second packet, a plurality of packets in which the number of packets having the same data parts is highest. The receiver then obtains at least a part of the visible light identifier (ID) by decoding the data part included in each of the plurality of packets as the data part corresponding to the address part included in the first packet.

With this, even when a plurality of packets having the same address part are received and the data parts in the packets are different, an appropriate data part can be decoded, and thus at least a part of the visible light identifier can be properly obtained. This means that a plurality of packets transmitted from the same transmitter and having the same address part basically have the same data part. However, there are cases where the receiver receives a plurality of packets which have mutually different data parts even with the same address part, when the receiver switches the transmitter serving as a transmission source of packets from one to another. In such a case, in this embodiment, the already received packet (the second packet) is discarded as in step S10106 in FIG. 273, allowing the data part of the latest packet (the first packet) to be decoded as a proper data part corresponding to the address part therein. Furthermore, even when no such switch of transmitters as mentioned above occurs, there are cases where the data parts in the plurality of packets having the same address part are slightly different, depending on the visible light signal transmitting and receiving status. In such cases, in this embodiment, what is called a decision by the majority as in Step S10107 in FIG. 273 makes it possible to decode a proper data part.

A reception method of demodulating data of the data part based on a plurality of packets is described.

FIG. 274 is a flowchart illustrating an example of a reception method in this embodiment.

First, the receiver receives a packet (Step S10111) and performs error correction on the address part (Step S10112). Here, the receiver does not demodulate the data part and retains pixel values in the captured image as they are. The receiver then determines whether or not no less than a predetermined number of packets out of the already received packets have the same address (Step S10113). When determining that no less than the predetermined number of packets have the same address (Step S10113: Y), the receiver performs a demodulation process on a combination of pixel values corresponding to the data parts in the packets having the same address (Step S10114).

Thus, in the reception method in this embodiment, a first packet including the data part and the address part is obtained from a pattern of a plurality of bright lines. It is then determined whether or not at least one packet already obtained before the first packet includes no less than a predetermined number of second packets which are each a packet including the same address part as the address part of the first packet. When it is determined that no less than the predetermined number of second packets is included, pixel values of a partial region of a bright line image corresponding to the data parts in no less than the predetermined number of second packets and pixel values of a partial region of a bright line image corresponding to the data part of the first packet are combined. That is, the pixel values are added. A combined pixel value is calculated through this addition, and at least a part of a visible light identifier (ID) is obtained by decoding the data part including the combined pixel value.

Since the packets have been received at different points in time, each of the pixel values for the data parts reflects luminance of the transmitter that is at a slightly different point in time. Therefore, the part subject to the above-described demodulation process will contain a larger amount of data (a larger number of samples) than the data part of a single packet. This makes it possible to demodulate the data part with higher accuracy. Furthermore, the increase in the number of samples makes it possible to demodulate a signal modulated with a higher modulation frequency.

As illustrated in (b) in FIG. 272, the data part and the error correction code part for the data part are modulated with a higher frequency than the header unit, the address part, and the error correction code part for the address part. In the above-described demodulation method, data following the data part can be demodulated even when the data has been modulated with a high modulation frequency. With this configuration, it is possible to shorten the time for the whole packet to be transmitted, and it is possible to receive a visible light signal with higher speed from far away and from a smaller light source.

Next, a reception method of receiving data of a variable length address is described.

FIG. 275 is a flowchart illustrating an example of a reception method in this embodiment.

The receiver receives packets (Step S10121), and determines whether or not a packet including the data part in which all the bits are zero (hereinafter referred to as a 0-end packet) has been received (Step S10122). When determining that the packet has been received, that is, when determining that a 0-end packet is present (Step S10122: Y), the receiver determines whether or not all the packets having addresses following the address of the 0-end packet are present, that is, have been received (Step S10123). Note that the address of a packet to be transmitted later among packets generated by dividing data to be transmitted is assigned a larger value. When determining that all the packets have been received (Step S10123: Y), the receiver determines that the address of the 0-end packet is the last address of the packets to be transmitted from the transmitter. The receiver then reconstructs data by combining data of all the packets having the addresses up to the 0-end packet (Step S10124). In addition, the receiver checks the reconstructed data for an error (Step S10125). By doing so, even when it is not known how many parts the data to be transmitted has been divided into, that is, when the address has a variable length rather than a fixed length, data having a variable-length address can be transmitted and received, meaning that it is possible to efficiently transmit and receive more IDs than with data having a fixed-length address.

Thus, in this embodiment, the receiver obtains a plurality of packets each including the data part and the address part from a pattern of a plurality of bright lines. The receiver then determines whether or not the obtained packets include a 0-end packet which is a packet including the data part in which all the bits are 0. When determining that the 0-end packet is included, the receiver determines whether or not the packets include all N associated packets (where N is an integer of 1 or more) which are each a packet including the address part associated with the address part of the 0-end packet. Next, when determining that all the N associated packets are included, the receiver obtains a visible light identifier (ID) by arranging and decoding the data parts in the N associated packets. Here, the address part associated with the address part of the 0-end packet is an address part representing an address greater than or equal to 0 and smaller than the address represented by the address part of the 0-end packet.

Next, a reception method using an exposure time longer than a period of a modulation frequency is described.

FIGS. 276 and 277 are each a diagram for describing a reception method in which a receiver in this embodiment uses an exposure time longer than a period of a modulation frequency (a modulation period).

For example, as illustrated in (a) in FIG. 276, there is a case where the visible light signal cannot be properly received when the exposure time is set to time equal to a modulation period. Note that the modulation period is a length of time for one slot described above. Specifically, in such a case, the number of exposure lines that reflect a luminance state in a particular slot (black exposure lines in FIG. 276) is small. As a result, when there happens to be much noise in pixel values of these exposure lines, it is difficult to estimate luminance of the transmitter.

In contrast, the visible light signal can be properly received when the exposure time is set to time longer than the modulation period as illustrated in (b) in FIG. 276, for example. Specifically, in such a case, the number of exposure lines that reflect luminance in a particular slot is large, and therefore it is possible to estimate luminance of the transmitter based on pixel values of a large number of exposure lines, resulting in high resistance to noise.

However, when the exposure time is too long, the visible light signal cannot be properly received.

For example, as illustrated in (a) in FIG. 277, when the exposure time is equal to the modulation period, a luminance change (that is, a change in pixel value of each exposure line) received by the receiver follows a luminance change used in the transmission. However, as illustrated in (b) in FIG. 277, when the exposure time is three times as long as the modulation period, a luminance change received by the receiver cannot fully follow a luminance change used in the transmission. Furthermore, as illustrated in (c) in FIG. 277, when the exposure time is 10 times as long as the modulation period, a luminance change received by the receiver cannot at all follow a luminance change used in the transmission. To sum up, when the exposure time is longer, luminance can be estimated based on a larger number of exposure lines and therefore noise resistance increases, but a longer exposure time causes a reduction in identification margin or a reduction in the noise resistance due to the reduced identification margin. Considering the balance between these effects, the exposure time is set to time that is approximately two to five times as long as the modulation period, so that the highest noise resistance can be obtained.

Next, the number of packets after division is described.

FIG. 278 is a diagram indicating an efficient number of divisions relative to a size of transmission data.

When the transmitter transmits data by changing in luminance, the data size of one packet will be large if all pieces of data to be transmitted (transmission data) are included in the packet. However, as described with reference to FIG. 272, when the transmission data is divided into data parts and each of these data parts is included in a packet, the data size of the packet is small. The receiver receives this packet by imaging. As the data size of the packet increases, the receiver has more difficulty in receiving the packet in a single imaging operation, and needs to repeat the imaging operation.

Therefore, it is desirable that as the data size of the transmission data increases, the transmitter increase the number of divisions in the transmission data as illustrated in (a) and (b) in FIG. 278. However, when the number of divisions is too large, the transmission data cannot be reconstructed unless all the data parts are received, resulting in lower reception efficiency.

Therefore, as illustrated in (a) in FIG. 278, when the data size of the address (address size) is variable and the data size of the transmission data is 2 to 16 bits, 16 to 24 bits, 24 to 64 bits, 66 to 78 bits, 78 bits to 128 bits, and 128 bits or more, the transmission data is divided into 1 to 2, 2 to 4, 4, 4 to 6, 6 to 8, and 7 or more data parts, respectively, so that the transmission data can be efficiently transmitted in the form of visible light signals. As illustrated in (b) in FIG. 278, when the data size of the address (address size) is fixed to 4 bits and the data size of the transmission data is 2 to 8 bits, 8 to 16 bits, 16 to 30 bits, 30 to 64 bits, 66 to 80 bits, 80 to 96 bits, 96 to 132 bits, and 132 bits or more, the transmission data is divided into 1 to 2, 2 to 3, 2 to 4, 4 to 5, 4 to 7, 6, 6 to 8, and 7 or more data parts, respectively, so that the transmission data can be efficiently transmitted in the form of visible light signals.

The transmitter sequentially changes in luminance based on packets containing respective ones of the data parts. For example, according to the sequence of the addresses of packets, the transmitter changes in luminance based on the packets. Furthermore, the transmitter may change in luminance again based on data parts of the packets according to a sequence different from the sequence of the addresses. This allows the receiver to reliably receive each of the data parts.

Next, a method of setting a notification operation by the receiver is described.

FIG. 279A is a diagram illustrating an example of a setting method in this embodiment.

First, the receiver obtains, from a server near the receiver, a notification operation identifier for identifying a notification operation and a priority of the notification operation identifier (specifically, an identifier indicating the priority) (Step S10131). The notification operation is an operation of the receiver to notify a user using the receiver that packets containing data parts have been received, when the packets have been transmitted by way of luminance change and then received by the receiver. For example, this operation is making sound, vibration, indication on a display, or the like.

Next, the receiver receives packetized visible light signals, that is, packets containing respective data parts (Step S10132). The receiver obtains a notification operation identifier and a priority of the notification operation identifier (specifically, an identifier indicating the priority) which are included in the visible light signals (Step S10133).

Furthermore, the receiver reads out setting details of a current notification operation of the receiver, that is, a notification operation identifier preset in the receiver and a priority of the notification operation identifier (specifically, an identifier indicating the priority) (Step S10134). Note that the notification operation identifier preset in the receiver is one set by an operation by a user, for example.

The receiver then selects an identifier having the highest priority from among the preset notification operation identifier and the notification operation identifiers respectively obtained in Step S10131 and Step S10133 (Step S10135). Next, the receiver sets the selected notification operation identifier in the receiver itself to operate as indicated by the selected notification operation identifier, notifying a user of the reception of the visible light signals (Step S10136).

Note that the receiver may skip one of Step S10131 and Step S10133 and select a notification operation identifier with a higher priority from among two notification operation identifiers.

Note that a high priority may be assigned to a notification operation identifier transmitted from a server installed in a theater, a museum, or the like, or a notification operation identifier included in the visible light signal transmitted inside these facilities. With this, it can be made possible that sound for receipt notification is not played inside the facilities regardless of settings set by a user. In other facilities, a low priority is assigned to the notification operation identifier so that the receiver can operate according to settings set by a user to notify a user of signal reception.

FIG. 279B is a diagram illustrating an example of a setting method in this embodiment.

First, the receiver obtains, from a server near the receiver, a notification operation identifier for identifying a notification operation and a priority of the notification operation identifier (specifically, an identifier indicating the priority) (Step S10141). Next, the receiver receives packetized visible light signals, that is, packets containing respective data parts (Step S10142). The receiver obtains a notification operation identifier and a priority of the notification operation identifier (specifically, an identifier indicating the priority) which are included in the visible light signals (Step S10143).

Furthermore, the receiver reads out setting details of a current notification operation of the receiver, that is, a notification operation identifier preset in the receiver and a priority of the notification operation identifier (specifically, an identifier indicating the priority) (Step S10144).

The receiver then determines whether or not an operation notification identifier indicating an operation that prohibits notification sound reproduction is included in the preset notification operation identifier and the notification operation identifiers respectively obtained in Step S10141 and Step S10143 (Step S10145). When determining that the operation notification identifier is included (Step S10145: Y), the receiver outputs a notification sound for notifying a user of completion of the reception (Step S10146). In contrast, when determining that the operation notification identifier is not included (Step S10145: N), the receiver notifies a user of completion of the reception by vibration, for example (Step S10147).

Note that the receiver may skip one of Step S10141 and Step S10143 and determine whether or not an operation notifying identifier indicating an operation that prohibits notification sound reproduction is included in two notification operation identifiers.

Furthermore, the receiver may perform self-position estimation based on a captured image and notify a user of the reception by an operation associated with the estimated position or facilities located at the estimated position.

FIG. 280A is a flowchart illustrating processing of an image processing program in Embodiment 13.

This information processing program is a program for causing the light emitter of the above-described transmitter to change in luminance according to the number of divisions illustrated in FIG. 278.

In other words, this information processing program is an information processing program that causes a computer to process information to be transmitted, in order for the information to be transmitted by way of luminance change. In detail, this information processing program causes a computer to execute: an encoding step SA41 of encoding the information to generate an encoded signal; a dividing step SA42 of dividing the encoded signal into four signal parts when a total number of bits in the encoded signal is in a range of 24 bits to 64 bits; and an output step S43 of sequentially outputting the four signal parts. Note that each of these signal parts is output in the form of the packet illustrated in (a) in FIG. 272. Furthermore, this information processing program may cause a computer to identify the number of bits in the encoded signal and determine the number of signal parts based on the identified number of bits. In this case, the information processing program causes the computer to divide the encoded signal into the determined number of signal parts.

Thus, when the number of bits in the encoded signal is in the range of 24 bits to 64 bits, the encoded signal is divided into four signal parts, and the four signal parts are output. As a result, the light emitter changes in luminance according to the outputted four signal parts, and these four signal parts are transmitted in the form of visible light signals and received by the receiver. As the number of bits in an output signal increases, the level of difficulty for the receiver to properly receive the signal by imaging increases, meaning that the reception efficiency is reduced. Therefore, it is desirable that the signal have a small number of bits, that is, a signal be divided into small signals. However, when a signal is too finely divided into many small signals, the receiver cannot receive the original signal unless it receives all the small signals individually, meaning that the reception efficiency is reduced. Therefore, when the number of bits in the encoded signal is in the range of 24 bits to 64 bits, the encoded signal is divided into four signal parts and the four signal parts are sequentially output as described above. By doing so, the encoded signal representing the information to be transmitted can be transmitted in the form of a visible light signal with the best reception efficiency. As a result, it is possible to enable communication between various devices.

In the output step SA43, it may be that the four signal parts are output in a first sequence and then, the four signal parts are output in a second sequence different from the first sequence.

By doing so, since these four signals parts are repeatedly output in different sequences, these four signal parts can be received with still higher efficiency when each of the output signals is transmitted to the receiver in the form of a visible light signal. In other words, if the four signal parts are repeatedly output in the same sequence, there are cases where the receiver fails to receive the same signal part, but it is possible to reduce these cases by changing the output sequence.

Furthermore, the four signal parts may be each assigned with a notification operation identifier and output in the output step SA43 as indicated in FIGS. 279A and 279B. The notification operation identifier is an identifier for identifying an operation of the receiver by which a user using the receiver is notified that the four signal parts have been received when the four signal parts have been transmitted by way of luminance change and received by the receiver.

With this, in the case where the notification operation identifier is transmitted in the form of a visible light signal and received by the receiver, the receiver can notify a user of the reception of the four signal parts according to an operation identified by the notification operation identifier. This means that a transmitter that transmits information to be transmitted can set a notification operation to be performed by a receiver.

Furthermore, the four signal parts may be each assigned with a priority identifier for identifying a priority of the notification operation identifier and output in the output step SA43 as indicated in FIGS. 279A and 279B.

With this, in the case where the priority identifier and the notification operation identifier are transmitted in the form of visible light signals and received by the receiver, the receiver can handle the notification operation identifier according to the priority identified by the priority identifier. This means that when the receiver obtained another notification operation identifier, the receiver can select, based on the priority, one of the notification operation identified by the notification operation identifier transmitted in the form of the visible light signal and the notification operation identified by the other notification operation identifier.

FIG. 280B is a block diagram of an information processing apparatus in Embodiment 13.

This information processing apparatus A40 is an apparatus for causing the light emitter (the light emitting unit) of the above-described transmitter to change in luminance according to the number of divisions illustrated in FIG. 278.

In other words, this information processing apparatus A40 is an apparatus that processes information to be transmitted, in order for the information to be transmitted by way of luminance change. In detail, this information processing apparatus A40 includes: an encoding unit A41 that encodes the information to generate an encoded signal; a dividing unit A42 that divides the encoded signal into four signal parts when a total number of bits in the encoded signal is in a range of 24 bits to 64 bits; and an output unit A43 that sequentially outputs the four signal parts. The information processing apparatus A40 can produce the same advantageous effects as the above-described information processing program.

An image processing program according to an aspect of the present disclosure is an image processing program that causes a computer to process information to be transmitted, in order for the information to be transmitted by way of luminance change, and causes the computer to execute: an encoding step of encoding the information to generate an encoded signal; a dividing step of dividing the encoded signal into four signal parts when a total number of bits in the encoded signal is in a range of 24 bits to 64 bits; and an output step of sequentially outputting the four signal parts.

Thus, as illustrated in FIG. 277 to FIG. 280B, when the number of bits in the encoded signal is in the range of 24 bits to 64 bits, the encoded signal is divided into four signal parts, and the four signal parts are output. As a result, the light emitter changes in luminance according to the outputted four signal parts, and these four signal parts are transmitted in the form of visible light signals and received by the receiver. As the number of bits in an output signal increases, the level of difficulty for the receiver to properly receive the signal by imaging increases, meaning that the reception efficiency is reduced. Therefore, it is desirable that the signal have a small number of bits, that is, a signal be divided into small signals. However, when a signal is too finely divided into many small signals, the receiver cannot receive the original signal unless it receives all the small signals individually, meaning that the reception efficiency is reduced. Therefore, when the number of bits in the encoded signal is in the range of 24 bits to 64 bits, the encoded signal is divided into four signal parts and the four signal parts are sequentially output as described above. By doing so, the encoded signal representing the information to be transmitted can be transmitted in the form of a visible light signal with the best reception efficiency. As a result, it is possible to enable communication between various devices.

Furthermore, in the output step, the four signal parts may be output in a first sequence and then, the four signal parts may be output in a second sequence different from the first sequence.

By doing so, since these four signals parts are repeatedly output in different sequences, these four signal parts can be received with still higher efficiency when each of the output signals is transmitted to the receiver in the form of a visible light signal. In other words, if the four signal parts are repeatedly output in the same sequence, there are cases where the receiver fails to receive the same signal part, but it is possible to reduce these cases by changing the output sequence.

Furthermore, in the output step, the four signal parts may further be each assigned with a notification operation identifier and output, and the notification operation identifier may be an identifier for identifying an operation of the receiver by which a user using the receiver is notified that the four signal parts have been received when the four signal parts have been transmitted by way of luminance change and received by the receiver.

With this, in the case where the notification operation identifier is transmitted in the form of a visible light signal and received by the receiver, the receiver can notify a user of the reception of the four signal parts according to an operation identified by the notification operation identifier. This means that a transmitter that transmits information to be transmitted can set a notification operation to be performed by a receiver.

Furthermore, in the output step, the four signal parts may further be each assigned with a priority identifier for identifying a priority of the notification operation identifier and output.

With this, in the case where the priority identifier and the notification operation identifier are transmitted in the form of visible light signals and received by the receiver, the receiver can handle the notification operation identifier according to the priority identified by the priority identifier. This means that when the receiver obtained another notification operation identifier, the receiver can select, based on the priority, one of the notification operation identified by the notification operation identifier transmitted in the form of the visible light signal and the notification operation identified by the other notification operation identifier.

Next, registration of a network connection of an electronic device is described.

FIG. 281 is a diagram for describing an example of application of a transmission and reception system in this embodiment.

This transmission and reception system includes: a transmitter 10131*b* configured as an electronic device such as a washing machine, for example; a receiver 10131*a* configured as a smartphone, for example, and a communication device 10131*c* configured as an access point or a router.

FIG. 282 is a flowchart illustrating processing operation of a transmission and reception system in this embodiment.

When a start button is pressed (Step S10165), the transmitter 10131*b* transmits, via Wi-Fi, Bluetooth®, Ethernet®, or the like, information for connecting to the transmitter itself, such as SSID, password, IP address, MAC address, or decryption key (Step S10166), and then waits for connection. The transmitter 10131*b* may directly transmit these pieces of information, or may indirectly transmit these pieces of information. In the case of indirectly transmitting these pieces of information, the transmitter 10131*b* transmits ID associated with these pieces of information. When the receiver 10131a receives the ID, the receiver 10131a then downloads, from a server or the like, information associated with the ID, for example.

The receiver 10131a receives the information (Step S10151), connects to the transmitter 10131b, and transmits to the transmitter 10131b information for connecting to the communication device 10131c configured as an access point or a router (such as SSID, password, IP address, MAC address, or decryption key) (Step S10152). The receiver 10131a registers, with the communication device 10131c, information for the transmitter 10131b to connect to the communication device 10131c (such as MAC address, IP address, or decryption key), to have the communication device 10131c wait for connection. Furthermore, the receiver 10131a notifies the transmitter 10131b that preparation for connection from the transmitter 10131b to the communication device 10131c has been completed (Step S10153).

The transmitter 10131b disconnects from the receiver 10131a (Step S10168) and connects to the communication device 10131c (Step S10169). When the connection is successful (Step S10170: Y), the transmitter 10131b notifies the receiver 10131a that the connection is successful, via the communication device 10131c, and notifies a user that the connection is successful, by an indication on the display, an LED state, sound, or the like (Step S10171). When the connection fails (Step S10170: N), the transmitter 10131b notifies the receiver 10131a that the connection fails, via the visible light communication, and notifies a user that the connection fails, using the same means as in the case where the connection is successful (Step S10172). Note that the visible light communication may be used to notify that the connection is successful.

The receiver 10131a connects to the communication device 10131c (Step S10154), and when the notifications to the effect that the connection is successful and that the connection fails (Step S10155: N and Step S10156: N) are absent, the receiver 10131a checks whether or not the transmitter 10131b is accessible via the communication device 10131c (Step S10157). When the transmitter 10131b is not accessible (Step S10157: N), the receiver 10131a determines whether or not no less than a predetermined number of attempts to connect to the transmitter 10131b using the information received from the transmitter 10131b have been made (Step S10158). When determining that the number of attempts is less than the predetermined number (Step S10158: N), the receiver 10131a repeats the processes following Step S10152. In contrast, when the number of attempts is no less than the predetermined number (Step S10158: Y), the receiver 10131a notifies a user that the processing fails (Step S10159). When determining in Step S10156 that the notification to the effect that the connection is successful is present (Step S10156: Y), the receiver 10131a notifies a user that the processing is successful (Step S10160). Specifically, using an indication on the display, sound, or the like, the receiver 10131a notifies a user whether or not the connection from the transmitter 10131b to the communication device 10131c has been successful. By doing so, it is possible to connect the transmitter 10131b to the communication device 10131c without requiring for cumbersome input from a user.

Next, registration of a network connection of an electronic device (in the case of connection via another electronic device) is described.

FIG. 283 is a diagram for describing an example of application of a transmission and reception system in this embodiment.

This transmission and reception system includes: an air conditioner 10133b; a transmitter 10133c configured as an electronic device such as a wireless adaptor or the like connected to the air conditioner 10133b; a receiver 10133a configured as a smartphone, for example; a communication device 10133d configured as an access point or a router; and another electronic device 10133e configured as a wireless adaptor, a wireless access point, a router, or the like, for example.

FIG. 284 is a flowchart illustrating processing operation of a transmission and reception system in this embodiment. Hereinafter, the air conditioner 10133b or the transmitter 10133c is referred to as an electronic device A, and the electronic device 10133e is referred to as an electronic device B.

First, when a start button is pressed (Step S10188), the electronic device A transmits information for connecting to the electronic device A itself (such as individual ID, password, IP address, MAC address, or decryption key) (Step S10189), and then waits for connection (Step S10190). The electronic device A may directly transmit these pieces of information, or may indirectly transmit these pieces of information, in the same manner as described above.

The receiver 10133a receives the information from the electronic device A (Step S10181) and transmits the information to the electronic device B (Step S10182). When the electronic device B receives the information (Step S10196), the electronic device B connects to the electronic device A according to the received information (Step S10197). The electronic device B determines whether or not connection to the electronic device A has been established (Step S10198), and notifies the receiver 10133a of the result (Step S10199 or Step S101200).

When the connection to the electronic device B is established within a predetermine time (Step S10191: Y), the electronic device A notifies the receiver 10133a that the connection is successful, via the electronic device B (Step S10192), and when the connection fails (Step S10191: N), the electronic device A notifies the receiver 10133a that the connection fails, via the visible light communication (Step S10193). Furthermore, using an indication on the display, a light emitting state, sound, or the like, the electronic device A notifies a user whether or not the connection is successful. By doing so, it is possible to connect the electronic device A (the transmitter 10133c) to the electronic device B (the electronic device 10133e) without requiring for cumbersome input from a user. Note that the air conditioner 10133b and the transmitter 10133c illustrated in FIG. 283 may be integrated together and likewise, the communication device 10133d and the electronic device 10133e illustrated in FIG. 283 may be integrated together.

Next, transmission of proper imaging information is described.

FIG. 285 is a diagram for describing an example of application of a transmission and reception system in this embodiment.

This transmission and reception system includes: a receiver 10135a configured as a digital still camera or a digital video camera, for example; and a transmitter 10135b configured as a lighting, for example.

FIG. 286 is a flowchart illustrating processing operation of a transmission and reception system in this embodiment.

First, the receiver 10135a transmits an imaging information transmission instruction to the transmitter 10135b (Step S10211). Next, when the transmitter 10135b receives the imaging information transmission instruction, when an imaging information transmission button is pressed, when an imaging information transmission switch is ON, or when a power source is turned ON (Step S10221: Y), the transmitter 10135*b* transmits imaging information (Step S10222). The imaging information transmission instruction is an instruction to transmit imaging information. The imaging information indicates a color temperature, a spectrum distribution, illuminance, or luminous intensity distribution of a lighting, for example. The transmitter 10135*b* may directly transmit the imaging information, or may indirectly transmit the imaging information. In the case of indirectly transmitting the imaging information, the transmitter 10135*b* transmits ID associated with the imaging information. When the receiver 10135*a* receives the ID, the receiver 10135*a* then downloads, from a server or the like, the imaging information associated with the ID, for example. At this time, the transmitter 10135*b* may transmit a method for transmitting a transmission stop instruction to the transmitter 10135*b* itself (e.g. a frequency of radio waves, infrared rays, or sound waves for transmitting a transmission stop instruction, or SSID, password, or IP address for connecting to the transmitter 10135*b* itself).

When the receiver 10135*a* receives the imaging information (Step S10212), the receiver 10135*a* transmits the transmission stop instruction to the transmitter 10135*b* (Step S10213). When the transmitter 10135*b* receives the transmission stop instruction from the receiver 10135*a* (Step S10223), the transmitter 10135*b* stops transmitting the imaging information and uniformly emits light (Step S10224).

Furthermore, the receiver 10135*a* sets an imaging parameter according to the imaging information received in Step S10212 (Step S10214) or notifies a user of the imaging information. The imaging parameter is, for example, white balance, an exposure time, a focal length, sensitivity, or a scene mode. With this, it is possible to capture an image with optimum settings according to a lighting. Next, after the transmitter 10135*b* stops transmitting the imaging information (Step S10215: Y), the receiver 10135*a* captures an image (Step S10216). Thus, it is possible to capture an image while a subject does not change in brightness for signal transmission. Note that after Step S10216, the receiver 10135*a* may transmit to the transmitter 10135*b* a transmission start instruction to request to start transmission of the imaging information (Step S10217).

Next, an indication of a state of charge is described.

FIG. 287 is a diagram for describing an example of application of a transmitter in this embodiment.

For example, a transmitter 10137*b* configured as a charger includes a light emitting unit, and transmits from the light emitting unit a visible light signal indicating a state of charge of a battery. With this, a costly display device is not needed to allow a user to be notified of a state of charge of the battery. When a small LED is used as the light emitting unit, the visible light signal cannot be received unless an image of the LED is captured from a nearby position. In the case of a transmitter 10137*c* which has a protrusion near the LED, the protrusion becomes an obstacle for closeup of the LED. Therefore, it is easier to receive a visible light signal from the transmitter 10137*b* having no protrusion near the LED than a visible light signal from the transmitter 10137*c*.

Embodiment 14

This embodiment describes each example of application using a receiver such as a smartphone and a transmitter for transmitting information as a blink pattern of an LED or an organic EL in each of the embodiments described above.

First, transmission in a demo mode and upon malfunction is described.

FIG. 288 is a diagram for describing an example of operation of a transmitter in this embodiment.

When an error occurs, the transmitter transmits a signal indicating that an error has occurred or a signal corresponding to an error code so that the receiver can be notified that an error has occurred or of details of an error. The receiver takes an appropriate measure according to details of an error so that the error can be corrected or the details of the error can be properly reported to a service center.

In the demo mode, the transmitter transmits a demo code. With this, during a demonstration of a transmitter as a product in a store, for example, a customer can receive a demo code and obtain a product description associated with the demo code. Whether or not the transmitter is in the demo mode can be determined based on the fact that the transmitter is set to the demo mode, that a CAS card for the store is inserted, that no CAS card is inserted, or that no recording medium is inserted.

Next, signal transmission from a remote controller is described.

FIG. 289 is a diagram for describing an example of operation of a transmitter in this embodiment.

For example, when a transmitter configured as a remote controller of an air conditioner receives main-unit information, the transmitter transmits the main-unit information so that the receiver can receive from the nearby transmitter the information on the distant main unit. The receiver can receive information from a main unit located at a site where the visible light communication is unavailable, for example, across a network.

Next, a process of transmitting information only when the transmitter is in a bright place is described.

FIG. 290 is a diagram for describing an example of operation of a transmitter in this embodiment.

The transmitter transmits information when the brightness in its surrounding area is no less than a predetermined level, and stops transmitting information when the brightness falls below the predetermined level. By doing so, for example, a transmitter configured as an advertisement on a train can automatically stop its operation when the car enters a train depot. Thus, it is possible to reduce battery power consumption.

Next, content distribution according to an indication on the transmitter (changes in association and scheduling) is described.

FIG. 291 is a diagram for describing an example of operation of a transmitter in this embodiment.

The transmitter associates, with a transmission ID, content to be obtained by the receiver in line with the timing at which the content is displayed. Every time the content to be displayed is changed, a change in the association is registered with the server.

When the timing at which the content to be displayed is displayed is known, the transmitter sets the server so that other content is transmitted to the receiver according to the timing of a change in the content to be displayed. When the server receives from the receiver a request for content associated with the transmission ID, the server transmits to the receiver corresponding content according to the set schedule.

By doing so, for example, when content displayed by a transmitter configured as a digital signage changes one after another, the receiver can obtain content that corresponds to the content displayed by the transmitter.

Next, content distribution corresponding to what is displayed by the transmitter (synchronization using a time point) is described.

FIG. 292 is a diagram for describing an example of operation of a transmitter in this embodiment.

The server holds previously registered settings to transfer different content at each time point in response to a request for content associated with a predetermined ID.

The transmitter synchronizes the server with a time point, and adjusts timing to display content so that a predetermined part is displayed at a predetermined time point.

By doing so, for example, when content displayed by a transmitter configured as a digital signage changes one after another, the receiver can obtain content that corresponds to the content displayed by the transmitter.

Next, content distribution corresponding to what is displayed by the transmitter (transmission of a display time point) is described.

FIG. 293 is a diagram for describing an example of operation of a transmitter and a receiver in this embodiment.

The transmitter transmits, in addition to the ID of the transmitter, a display time point of content being displayed. The display time point of content is information with which the content currently being displayed can be identified, and can be represented by an elapsed time from a start time point of the content, for example.

The receiver obtains from the server content associated with the received ID and displays the content according to the received display time point. By doing so, for example, when content displayed by a transmitter configured as a digital signage changes one after another, the receiver can obtain content that corresponds to the content displayed by the transmitter.

Furthermore, the receiver displays content while changing the content with time. By doing so, even when content being displayed by the transmitter changes, there is no need to renew signal reception to display content corresponding to displayed content.

Next, data upload according to a grant status of a user is described.

FIG. 294 is a diagram for describing an example of operation of a receiver in this embodiment.

In the case where a user has a registered account, the receiver transmits to the server the received ID and information to which the user granted access upon registering the account or other occasions (such as position, telephone number, ID, installed applications, etc. of the receiver, or age, sex, occupation, preferences, etc. of the user).

In the case where a user has no registered account, the above information is transmitted likewise to the server when the user has granted uploading of the above information, and when the user has not granted uploading of the above information, only the received ID is transmitted to the server.

With this, a user can receive content suitable to a reception situation or own personality, and as a result of obtaining information on a user, the server can make use of the information in data analysis.

Next, running of an application for reproducing content is described.

FIG. 295 is a diagram for describing an example of operation of a receiver in this embodiment.

The receiver obtains from the server content associated with the received ID. When an application currently running supports the obtained content (the application can displays or reproduces the obtained content), the obtained content is displayed or reproduced using the application currently running. When the application does not support the obtained content, whether or not any of the applications installed on the receiver supports the obtained content is checked, and when an application supporting the obtained content has been installed, the application is started to display and reproduce the obtained content. When all the applications installed do not support the obtained content, an application supporting the obtained content is automatically installed, or an indication or a download page is displayed to prompt a user to install an application supporting the obtained content, for example, and after the application is installed, the obtained content is displayed and reproduced.

By doing so, the obtained content can be appropriately supported (displayed, reproduced, etc.).

Next, running of a designated application is described.

FIG. 296 is a diagram for describing an example of operation of a receiver in this embodiment.

The receiver obtains, from the server, content associated with the received ID and information designating an application to be started (an application ID). When the application currently running is a designated application, the obtained content is displayed and reproduced. When a designated application has been installed on the receiver, the designated application is started to display and reproduce the obtained content. When the designated application has not been installed, the designated application is automatically installed, or an indication or a download page is displayed to prompt a user to install the designated application, for example, and after the designated application is installed, the obtained content is displayed and reproduced.

The receiver may be designed to obtain only the application ID from the server and start the designated application.

The receiver may be configured with designated settings. The receiver may be designed to start the designated application when a designated parameter is set.

Next, selecting between streaming reception and normal reception is described.

FIG. 297 is a diagram for describing an example of operation of a receiver in this embodiment.

When a predetermined address of the received data has a predetermined value or when the received data contains a predetermined identifier, the receiver determines that signal transmission is streaming distribution, and receives signals by a streaming data reception method. Otherwise, a normal reception method is used to receive the signals.

By doing so, signals can be received regardless of which method, streaming distribution or normal distribution, is used to transmit the signals.

Next, private data is described.

FIG. 298 is a diagram for describing an example of operation of a receiver in this embodiment.

When the value of the received ID is within a predetermined range or when the received ID contains a predetermined identifier, the receiver refers to a table in an application and when the table has the reception ID, content indicated in the table is obtained. Otherwise, content identified by the reception ID is obtained from the server.

By doing so, it is possible to receive content without registration with the server. Furthermore, response can be quick because no communication is performed with the server.

Next, setting of an exposure time according to a frequency is described.

FIG. 299 is a diagram for describing an example of operation of a receiver in this embodiment.

The receiver detects a signal and recognizes a modulation frequency of the signal. The receiver sets an exposure time according to a period of the modulation frequency (a modulation period). For example, the exposure time is set to a value substantially equal to the modulation frequency so that signals can be more easily received. When the exposure time is set to an integer multiple of the modulation frequency or an approximate value (roughly plus/minus 30%) thereof, for example, convolutional decoding can facilitate reception of signals.

Next, setting of an optimum parameter in the transmitter is described.

FIG. 300 is a diagram for describing an example of operation of a receiver in this embodiment.

The receiver transmits, to the server, data received from the transmitter, and current position information, information related to a user (address, sex, age, preferences, etc.), and the like. The server transmits to the receiver a parameter for the optimum operation of the transmitter according to the received information. The receiver sets the received parameter in the transmitter when possible. When not possible, the parameter is displayed to prompt a user to set the parameter in the transmitter.

With this, it is possible to operate a washing machine in a manner optimized according to the nature of water in a district where the transmitter is used, or to operate a rice cooker in such a way that rice is cooked in an optimal way for the kind of rice used by a user, for example.

Next, an identifier indicating a data structure is described.

FIG. 301 is a diagram for describing an example of a structure of transmission data in this embodiment.

Information to be transmitted contains an identifier, the value of which shows to the receiver a structure of a part following the identifier. For example, it is possible to identify a length of data, kind and length of an error correction code, a dividing point of data, and the like.

This allows the transmitter to change the kind and length of data body, the error correction code, and the like according to characteristics of the transmitter, a communication path, and the like. Furthermore, the transmitter can transmit a content ID in addition to an ID of the transmitter, to allow the receiver to obtain an ID corresponding to the content ID.

Embodiment 15

This embodiment describes each example of application using a receiver such as a smartphone and a transmitter for transmitting information as a blink pattern of an LED or an organic EL device in each of the embodiments described above.

FIG. 302 is a diagram for describing operation of a receiver in this embodiment.

A receiver 1210*a* in this embodiment switches the shutter speed between high and low speeds, for example, on the frame basis, upon continuous imaging with the image sensor. Furthermore, on the basis of a frame obtained by such imaging, the receiver 1210*a* switches processing on the frame between a barcode recognition process and a visible light recognition process. Here, the barcode recognition process is a process of decoding a barcode appearing in a frame obtained at a low shutter speed. The visible light recognition process is a process of decoding the above-described pattern of bright lines appearing on a frame obtained at a high shutter speed.

This receiver 1210*a* includes an image input unit 1211, a barcode and visible light identifying unit 1212, a barcode recognition unit 1212*a*, a visible light recognition unit 1212*b*, and an output unit 1213.

The image input unit 1211 includes an image sensor and switches a shutter speed for imaging with the image sensor. This means that the image input unit 1211 sets the shutter speed to a low speed and a high speed alternately, for example, on the frame basis. More specifically, the image input unit 1211 switches the shutter speed to a high speed for an odd-numbered frame, and switches the shutter speed to a low speed for an even-numbered frame. Imaging at a low shutter speed is imaging in the above-described normal imaging mode, and imaging at a high shutter speed is imaging in the above-described visible light communication mode. Specifically, when the shutter speed is a low speed, the exposure time of each exposure line included in the image sensor is long, and a normal captured image in which a subject is shown is obtained as a frame. When the shutter speed is a high speed, the exposure time of each exposure line included in the image sensor is short, and a visible light communication image in which the above-described bright lines are shown is obtained as a frame.

The barcode and visible light identifying unit 1212 determines whether or not a barcode appears, or a bright line appears, in an image obtained by the image input unit 1211, and switches processing on the image accordingly. For example, when a barcode appears in a frame obtained by imaging at a low shutter speed, the barcode and visible light identifying unit 1212 causes the barcode recognition unit 1212*a* to perform the processing on the image. When a bright line appears in a frame obtained by imaging at a high shutter speed, the barcode and visible light identifying unit 1212 causes the visible light recognition unit 1212*b* to perform the processing on the image.

The barcode recognition unit 1212*a* decodes a barcode appearing in a frame obtained by imaging at a low shutter speed. The barcode recognition unit 1212*a* obtains data of the barcode (for example, a barcode identifier) as a result of such decoding, and outputs the barcode identifier to the output unit 1213. Note that the barcode may be a one-dimensional code or may be a two-dimensional code (for example, QR Code®).

The visible light recognition unit 1212*b* decodes a pattern of bright lines appearing in a frame obtained by imaging at a high shutter speed. The visible light recognition unit 1212*b* obtains data of visible light (for example, a visible light identifier) as a result of such decoding, and outputs the visible light identifier to the output unit 1213. Note that the data of visible light is the above-described visible light signal.

The output unit 1213 displays only frames obtained by imaging at a low shutter speed. Therefore, when the subject imaged with the image input unit 1211 is a barcode, the output unit 1213 displays the barcode. When the subject imaged with the image input unit 1211 is a digital signage or the like which transmits a visible light signal, the output unit 1213 displays an image of the digital signage without displaying a pattern of bright lines. Subsequently, when the output unit 1213 obtains a barcode identifier, the output unit 1213 obtains, from a server, for example, information associated with the barcode identifier, and displays the information. When the output unit 1213 obtains a visible light identifier, the output unit 1213 obtains, from a server, for example, information associated with the visible light identifier, and displays the information.

Stated differently, the receiver 1210*a* which is a terminal device includes an image sensor, and performs continuous imaging with the image sensor while a shutter speed of the image sensor is alternately switched between a first speed and a second speed higher than the first speed. (a) When a subject imaged with the image sensor is a barcode, the receiver 1210*a* obtains an image in which the barcode appears, as a result of imaging performed when the shutter speed is the first speed, and obtains a barcode identifier by decoding the barcode appearing in the image. (b) When a subject imaged with the image sensor is a light source (for example, a digital signage), the receiver 1210*a* obtains a bright line image which is an image including bright lines corresponding to a plurality of exposure lines included in the image sensor, as a result of imaging performed when the shutter speed is the second speed. The receiver 1210*a* then obtains, as a visible light identifier, a visible light signal by decoding the pattern of bright lines included in the obtained bright line image. Furthermore, this receiver 1210*a* displays an image obtained through imaging performed when the shutter speed is the first speed.

The receiver 1210*a* in this embodiment is capable of both decoding a barcode and receiving a visible light signal by switching between and performing the barcode recognition process and the visible light recognition process. Furthermore, such switching allows for a reduction in power consumption.

The receiver in this embodiment may perform an image recognition process, instead of the barcode recognition process, and the visible light process simultaneously.

FIG. 303A is a diagram for describing another operation of a receiver in this embodiment.

A receiver 1210*b* in this embodiment switches the shutter speed between high and low speeds, for example, on the frame basis, upon continuous imaging with the image sensor. Furthermore, the receiver 1210*b* performs an image recognition process and the above-described visible light recognition process simultaneously on an image (frame) obtained by such imaging. The image recognition process is a process of recognizing a subject appearing in a frame obtained at a low shutter speed.

The receiver 1210*b* includes an image input unit 1211, an image recognition unit 1212*c*, a visible light recognition unit 1212*b*, and an output unit 1215.

The image input unit 1211 includes an image sensor and switches a shutter speed for imaging with the image sensor. This means that the image input unit 1211 sets the shutter speed to a low speed and a high speed alternately, for example, on the frame basis. More specifically, the image input unit 1211 switches the shutter speed to a high speed for an odd-numbered frame, and switches the shutter speed to a low speed for an even-numbered frame. Imaging at a low shutter speed is imaging in the above-described normal imaging mode, and imaging at a high shutter speed is imaging in the above-described visible light communication mode. Specifically, when the shutter speed is a low speed, the exposure time of each exposure line included in the image sensor is long, and a normal captured image in which a subject is shown is obtained as a frame. When the shutter speed is a high speed, the exposure time of each exposure line included in the image sensor is short, and a visible light communication image in which the above-described bright lines are shown is obtained as a frame.

The image recognition unit 1212*c* recognizes a subject appearing in a frame obtained by imaging at a low shutter speed, and identifies a position of the subject in the frame. As a result of the recognition, the image recognition unit 1212*c* determines whether or not the subject is a target of augment reality (AR) (hereinafter referred to as an AR target). When determining that the subject is an AR target, the image recognition unit 1212*c* generates image recognition data which is data for displaying information related to the subject (for example, a position of the subject, an AR marker thereof, etc.), and outputs the AR marker to the output unit 1215.

The output unit 1215 displays only frames obtained by imaging at a low shutter speed, as with the above-described output unit 1213. Therefore, when the subject imaged by the image input unit 1211 is a digital signage or the like which transmits a visible light signal, the output unit 1213 displays an image of the digital signage without displaying a pattern of bright lines. Furthermore, when the output unit 1215 obtains the image recognition data from the image recognition unit 1212*c*, the output unit 1215 refers to a position of the subject in a frame represented by the image recognition data, and superimposes on the frame an indicator in the form of a white frame enclosing the subject, based on the position referred to.

FIG. 303B is a diagram illustrating an example of an indicator displayed by the output unit 1215.

The output unit 1215 superimposes, on the frame, an indicator 1215*b* in the form of a white frame enclosing a subject image 1215*a* formed as a digital signage, for example. In other words, the output unit 1215 displays the indicator 1215*b* indicating the subject recognized in the image recognition process. Furthermore, when the output unit 1215 obtains the visible light identifier from the visible light recognition unit 1212*b*, the output unit 1215 changes the color of the indicator 1215*b* from white to red, for example.

FIG. 303C is a diagram illustrating an AR display example.

The output unit 1215 further obtains, as related information, information related to the subject and associated with the visible light identifier, for example, from a server or the like. The output unit 1215 adds the related information to an AR marker 1215*c* represented by the image recognition data, and displays the AR marker 1215*c* with the related information added thereto, in association with the subject image 1215*a* in the frame.

The receiver 1210*b* in this embodiment is capable of realizing AR which uses visible light communication, by performing the image recognition process and the visible light recognition process simultaneously. Note that the receiver 1210*a* illustrated in FIG. 303A may display the indicator 1215*b* illustrated in FIG. 303B, as with the receiver 1210*b*. In this case, when a barcode is recognized in a frame obtained by imaging at a low shutter speed, the receiver 1210*a* displays the indicator 1215*b* in the form of a white frame enclosing the barcode. When the barcode is decoded, the receiver 1210*a* changes the color of the indicator 1215*b* from white to red. Likewise, when a pattern of bright lines is recognized in a frame obtained by imaging at a high shutter speed, the receiver 1210*a* identifies a portion of a low-speed frame which corresponds to a portion where the pattern of bright lines is located. For example, when a digital signage transmits a visible light signal, an image of the digital signage in the low-speed frame is identified. Note that the low-speed frame is a frame obtained by imaging at a low shutter speed. The receiver 1210*a* superimposes, on the low-speed frame, the indicator 1215*b* in the form of a white frame enclosing the identified portion in the low-speed frame (for example, the above-described image of the digital signage), and displays the resultant image. When the pattern of bright lines is decoded, the receiver 1210*a* changes the color of the indicator 1215*b* from white to red.

FIG. 304A is a diagram for describing an example of a receiver in this embodiment.

A transmitter 1220*a* in this embodiment transmits a visible light signal in synchronization with a transmitter 1230. Specifically, at the timing of transmission of a visible light signal by the transmitter 1230, the transmitter 1220*a* transmits the same visible light signal. Note that the transmitter 1230 includes a light emitting unit 1231 and transmits a visible light signal by the light emitting unit 1231 changing in luminance.

This transmitter 1220*a* includes a light receiving unit 1221, a signal analysis unit 1222, a transmission clock adjustment unit 1223*a*, and a light emitting unit 1224. The light emitting unit 1224 transmits, by changing in luminance, the same visible light signal as the visible light signal which the transmitter 1230 transmits. The light receiving unit 1221 receives a visible light signal from the transmitter 1230 by receiving visible light from the transmitter 1230. The signal analysis unit 1222 analyzes the visible light signal received by the light receiving unit 1221, and transmits the analysis result to the transmission clock adjustment unit 1223*a*. On the basis of the analysis result, the transmission clock adjustment unit 1223*a* adjusts the timing of transmission of a visible light signal from the light emitting unit 1224. Specifically, the transmission clock adjustment unit 1223*a* adjusts timing of luminance change of the light emitting unit 1224 so that the timing of transmission of a visible light signal from the light emitting unit 1231 of the transmitter 1230 and the timing of transmission of a visible light signal from the light emitting unit 1224 match each other.

With this, the waveform of a visible light signal transmitted by the transmitter 1220*a* and the waveform of a visible light signal transmitted by the transmitter 1230 can be the same in terms of timing.

FIG. 304B is a diagram for describing another example of a transmitter in this embodiment.

As with the transmitter 1220*a*, a transmitter 1220*b* in this embodiment transmits a visible light signal in synchronization with the transmitter 1230. Specifically, at the timing of transmission of a visible light signal by the transmitter 1230, the transmitter 1200*b* transmits the same visible light signal.

This transmitter 1220*b* includes a first light receiving unit 1221*a*, a second light receiving unit 1221*b*, a comparison unit 1225, a transmission clock adjustment unit 1223*b*, and the light emitting unit 1224.

As with the light receiving unit 1221, the first light receiving unit 1221*a* receives a visible light signal from the transmitter 1230 by receiving visible light from the transmitter 1230. The second light receiving unit 1221*b* receives visible light from the light emitting unit 1224. The comparison unit 1225 compares a first timing in which the visible light is received by the first light receiving unit 1221*a* and a second timing in which the visible light is received by the second light receiving unit 1221*b*. The comparison unit 1225 then outputs a difference between the first timing and the second timing (that is, delay time) to the transmission clock adjustment unit 1223*b*. The transmission clock adjustment unit 1223*b* adjusts the timing of transmission of a visible light signal from the light emitting unit 1224 so that the delay time is reduced.

With this, the waveform of a visible light signal transmitted by the transmitter 1220*b* and the waveform of a visible light signal transmitted by the transmitter 1230 can be more exactly the same in terms of timing.

Note that two transmitters transmit the same visible light signals in the examples illustrated in FIG. 304A and FIG. 304B, but may transmit different visible light signals.

This means that when two transmitters transmit the same visible light signals, the transmitters transmit them in synchronization as described above. When two transmitters transmit different visible light signals, only one of the two transmitters transmits a visible light signal, and the other transmitter remains ON or OFF while the one transmitter transmits a visible light signal. The one transmitter is thereafter turned ON or OFF, and only the other transmitter transmits a visible light signal while the one transmitter remains ON or OFF. Note that two transmitters may transmit mutually different visible light signals simultaneously.

FIG. 305A is a diagram for describing an example of synchronous transmission from a plurality of transmitters in this embodiment.

A plurality of transmitters 1220 in this embodiment are, for example, arranged in a row as illustrated in FIG. 305A. Note that these transmitters 1220 have the same configuration as the transmitter 1220*a* illustrated in FIG. 304A or the transmitter 1220*b* illustrated in FIG. 304B. Each of the transmitters 1220 transmits a visible light signal in synchronization with one of adjacent transmitters 1220 on both sides.

This allows many transmitters to transmit visible light signals in synchronization.

FIG. 305B is a diagram for describing an example of synchronous transmission from a plurality of transmitters in this embodiment.

Among the plurality of transmitters 1220 in this embodiment, one transmitter 1220 serves as a basis for synchronization of visible light signals, and the other transmitters 1220 transmit visible light signals in line with this basis.

This allows many transmitters to transmit visible light signals in more accurate synchronization.

FIG. 306 is a diagram for describing another example of synchronous transmission from a plurality of transmitters in this embodiment.

Each of the transmitters 1240 in this embodiment receives a synchronization signal and transmits a visible light signal according to the synchronization signal. Thus, visible light signals are transmitted from the transmitters 1240 in synchronization.

Specifically, each of the transmitters 1240 includes a control unit 1241, a synchronization control unit 1242, a photocoupler 1243, an LED drive circuit 1244, an LED 1245, and a photodiode 1246.

The control unit 1241 receives a synchronization signal and outputs the synchronization signal to the synchronization control unit 1242.

The LED 1245 is a light source which outputs visible light and blinks (that is, changes in luminance) under the control of the LED drive circuit 1244. Thus, a visible light signal is transmitted from the LED 1245 to the outside of the transmitter 1240.

The photocoupler 1243 transfers signals between the synchronization control unit 1242 and the LED drive circuit 1244 while providing electrical insulation therebetween. Specifically, the photocoupler 1243 transfers to the LED drive circuit 1244 the later-described transmission start signal transmitted from the synchronization control unit 1242.

When the LED drive circuit 1244 receives a transmission start signal from the synchronization control unit 1242 via the photocoupler 1243, the LED drive circuit 1244 causes the LED 1245 to transmit a visible light signal at the timing of reception of the transmission start signal.

The photodiode 1246 detects visible light output from the LED 1245, and outputs to the synchronization control unit 1242 a detection signal indicating that visible light has been detected.

When the synchronization control unit 1242 receives a synchronization signal from the control unit 1241, the synchronization control unit 1242 transmits a transmission start signal to the LED drive circuit 1244 via the photocoupler 1243. Transmission of this transmission start signal triggers the start of transmission of the visible light signal. When the synchronization control unit 1242 receives the detection signal transmitted from the photodiode 1246 as a result of the transmission of the visible light signal, the synchronization control unit 1242 calculates delay time which is a difference between the timing of reception of the detection signal and the timing of reception of the synchronization signal from the control unit 1241. When the synchronization control unit 1242 receives the next synchronization signal from the control unit 1241, the synchronization control unit 1242 adjusts the timing of transmitting the next transmission start signal based on the calculated delay time. Specifically, the synchronization control unit 1242 adjusts the timing of transmitting the next transmission start signal so that the delay time for the next synchronization signal becomes preset delay time which has been predetermined. Thus, the synchronization control unit 1242 transmits the next transmission start signal at the adjusted timing.

FIG. 307 is a diagram for describing signal processing of the transmitter 1240.

When the synchronization control unit 1242 receives a synchronization signal, the synchronization control unit 1242 generates a delay time setting signal which has a delay time setting pulse at a predetermined timing. Note that the specific meaning of receiving a synchronization signal is receiving a synchronization pulse. More specifically, the synchronization control unit 1242 generates the delay time setting signal so that a rising edge of the delay time setting pulse is observed at a point in time when the above-described preset delay time has elapsed since a falling edge of the synchronization pulse.

The synchronization control unit 1242 then transmits the transmission start signal to the LED drive circuit 1244 via the photocoupler 1243 at the timing delayed by a previously obtained correction value N from the falling edge of the synchronization pulse. As a result, the LED drive circuit 1244 transmits the visible light signal from the LED 1245. In this case, the synchronization control unit 1242 receives the detection signal from the photodiode 1246 at the timing delayed by a sum of unique delay time and the correction value N from the falling edge of the synchronization pulse. This means that transmission of the visible light signal starts at this timing. This timing is hereinafter referred to as a transmission start timing. Note that the above-described unique delay time is delay time attributed to the photocoupler 1243 or the like circuit, and this delay time is inevitable even when the synchronization control unit 1242 transmits the transmission start signal immediately after receiving the synchronization signal.

The synchronization control unit 1242 identifies, as a modified correction value N, a difference in time between the transmission start timing and a rising edge in the delay time setting pulse. The synchronization control unit 1242 calculates a correction value (N+1) according to correction value (N+1)=correction value N+modified correction value N, and holds the calculation result. With this, when the synchronization control unit 1242 receives the next synchronization signal (synchronization pulse), the synchronization control unit 1242 transmits the transmission start signal to the LED drive circuit 1244 at the timing delayed by the correction value (N+1) from a falling edge of the synchronization pulse. Note that the modified correction value N can be not only a positive value but also a negative value.

Thus, since each of the transmitters 1240 receives the synchronization signal (the synchronization pulse) and then transmits the visible light signal after the preset delay time elapses, the visible light signals can be transmitted in accurate synchronization. Specifically, even when there is a variation in the unique delay time for the transmitters 1240 which is attributed to the photocoupler 1243 and the like circuit, transmission of visible light signals from the transmitters 1240 can be accurately synchronized without being affected by the variation.

Note that the LED drive circuit consumes high power and is electrically insulated using the photocoupler or the like from the control circuit which handles the synchronization signals. Therefore, when such a photocoupler is used, the above-mentioned variation in the unique delay time makes it difficult to synchronize transmission of visible light signals from transmitters. However, in the transmitters 1240 in this embodiment, the photodiode 1246 detects a timing of light emission of the LED 1245, and the synchronization control unit 1242 detects delay time based on the synchronization signal and makes adjustments so that the delay time becomes the preset delay time (the above-described preset delay time). With this, even when there is an individual-based variation in the photocouplers provided in the transmitters configured as LED lightings, for example, it is possible to transmit visible light signals (for example, visible light IDs) from the LED lightings in highly accurate synchronization.

Note that the LED lighting may be ON or may be OFF in periods other than a visible light signal transmission period. In the case where the LED lighting is ON in periods other than the visible light signal transmission period, the first falling edge of the visible light signal is detected. In the case where the LED lighting is OFF in periods other than the visible light signal transmission period, the first rising edge of the visible light signal is detected.

Note that every time the transmitter 1240 receives the synchronization signal, the transmitter 1240 transmits the visible light signal in the above-described example, but may transmit the visible light signal even when the transmitter 1240 does not receive the synchronization signal. This means that after the transmitter 1240 transmits the visible light signal following the reception of the synchronization signal once, the transmitter 1240 may sequentially transmit visible light signals even without having received synchronization signals. Specifically, the transmitter 1240 may perform sequential transmission, specifically, two to a few thousand time transmission, of a visible light signal, following one-time synchronization signal reception. The transmitter 1240 may transmit a visible light signal according to the synchronization signal once in every 100 milliseconds or once in every few seconds.

When the transmission of a visible light signal according to a synchronization signal is repeated, there is a possibility that the continuity of light emission by the LED 1245 is lost due to the above-described preset delay time. In other words, there may be a slightly long blanking interval. As a result, there is a possibility that blinking of the LED 1245 is visually recognized by humans, that is, what is called flicker may occur. Therefore, the cycle of transmission of the visible light signal by the transmitter 1240 according to the synchronization signal may be 60 Hz or more. With this, blinking is fast and less easily visually recognized by humans. As a result, it is possible to reduce the occurrence of flicker. Alternatively, the transmitter 1240 may transmit a visible light signal according to a synchronization signal in a sufficiently long cycle, for example, once in every few minutes. Although this allows humans to visually recognize blinking, it is possible to prevent blinking from being repeatedly visually recognized in sequence, reducing discomfort brought by flicker to humans.

(Preprocessing for Reception Method)

FIG. 308 is a flowchart illustrating an example of a reception method in this embodiment. FIG. 309 is a diagram for describing an example of a reception method in this embodiment.

First, the receiver calculates an average value of respective pixel values of the plurality of pixels aligned parallel to the exposure lines (Step S1211). Averaging the pixel values of N pixels based on the central limit theorem results in the expected value of the amount of noise being N to the negative one-half power, which leads to an improvement of the SN ratio.

Next, the receiver leaves only the portion where changes in the pixel values are the same in the perpendicular direction for all the colors, and removes changes in the pixel values where such changes are different (Step S1212). In the case where a transmission signal (visible light signal) is represented by luminance of the light emitting unit included in the transmitter, the luminance of a backlight in a lighting or a display which is the transmitter changes. In this case, the pixel values change in the same direction for all the colors as in (b) of FIG. 309. In the portions of (a) and (c) of FIG. 309, the pixels values change differently for each color. Since the pixel values in these portions fluctuate due to reception noise or a picture on the display or in a signage, the SN ratio can be improved by removing such fluctuation.

Next, the receiver obtains a luminance value (Step S1213). Since the luminance is less susceptible to color changes, it is possible to remove the influence of a picture on the display or in a signage and improve the SN ratio.

Next, the receiver runs the luminance value through a low-pass filter (Step S1214). In the reception method in this embodiment, a moving average filter based on the length of exposure time is used, with the result that in the high-frequency domain, almost no signals are included; noise is dominant. Therefore, the SN ratio can be improved with the use of the low-pass filter which cuts off high frequency components. Since the amount of signal components is large at the frequencies lower than and equal to the reciprocal of exposure time, it is possible to increase the effect of improving the SN ratio by cutting off signals with frequencies higher than and equal to the reciprocal. If frequency components contained in a signal are limited, the SN ratio can be improved by cutting off components with frequencies higher than the limit of frequencies of the frequency components. A filter which excludes frequency fluctuating components (such as a Butterworth filter) is suitable for the low-pass filter.

(Reception Method Using Convolutional Maximum Likelihood Decoding)

FIG. 310 is a flowchart illustrating another example of a reception method in this embodiment. FIG. 311 and FIG. 312 are diagrams for describing another example of a reception method in this embodiment. Hereinafter, a reception method used when the exposure time is longer than the transmission period is described with reference to these figures.

Signals can be received most accurately when the exposure time is an integer multiple of the transmission period. Even when the exposure time is not an integer multiple of the transmission period, signals can be received as long as the exposure time is in the range of about (N±0.33) times (N is an integer) the transmission period.

First, the receiver sets the transmission and reception offset to 0 (Step S1221). The transmission and reception offset is a value for use in modifying a difference between the transmission timing and the reception timing. This difference is unknown, and therefore the receiver changes a candidate value for the transmission and reception offset little by little and adopts, as the transmission and reception offset, a value that agrees most.

Next, the receiver determines whether or not the transmission and reception offset is shorter than the transmission period (Step S1222). Here, since the reception period and the transmission period are not synchronized, the obtained reception value is not always in line with the transmission period. Therefore, when the receiver determines in Step S1222 that the transmission and reception offset is shorter than the transmission period (Step S1222: Y), the receiver calculates, for each transmission period, a reception value (for example, a pixel value) that is in line with the transmission period, by interpolation using a nearby reception value (Step S1223). Linear interpolation, the nearest value, spline interpolation, or the like can be used as the interpolation method. Next, the receiver calculates a difference between the reception values calculated for the respective transmission periods (Step S1224).

FIG. 311 illustrates an example in which the exposure time is three times longer than the transmission period and the transmission signal is a binary signal of 0 or 1. The reception value at a certain time point is a sum of three transmission signals. A value of a newly received signal can be calculated by calculating a difference from the reception value at the next time point. At this time, the difference between the reception values includes noise, and therefore it is not clear which signal has been received. Thus, the receiver calculates a probability (estimated likelihood) of either one of the signals being received (Step S1225). This probability can be represented by a conditional probability $P(x|y)$ where x represents the transmission signal and y represents the difference between the reception values. However, since $P(x|y)$ is difficult to calculate, the receiver performs calculation using the right-hand value of $P(x|y) \propto P(y|x)P(x)$ according to Bayes' rule.

It is conceivable to perform this calculation on all the reception values. When the number of reception values is N, the number of convolutional transition patterns is 2 to the power of N, making NP difficult, but the use of the Viterbi algorithm in the calculation allows the calculation to be efficient.

Most of the state transition paths in FIG. 312 are paths that do not conform to the transmission format. Therefore, upon every state transition, a format check is performed, and when the current path does not conform to the transmission format, the likelihood of the path is set to 0 so that the accuracy of estimating a correct reception signal can be enhanced.

The receiver adds a predetermined value to the transmission and reception offset (Step S1226) and repeatedly performs the processing in Step S1222 and the following steps. When the receiver determines in Step S1222 that the transmission and reception offset is not shorter than the transmission period (Step S1222: N), the receiver identifies the highest likelihood among the likelihoods of the reception signals calculated for the respective transmission and reception offsets. The receiver then determines whether or not the highest likelihood is greater than or equal to a predetermined value (Step S1227). When the receiver determines that the highest likelihood is greater than or equal to the predetermined value (Step S1227: Y), the receiver uses, as a final estimation result, a reception signal having the highest likelihood. Alternatively, the receiver uses, as a reception signal candidate, a reception signal having a likelihood less than the highest likelihood by a predetermined value or less (Step S1228). When the receiver determines in Step S1227 that the highest likelihood is less than the predetermined value (Step S1227: N), the receiver discards the estimation result (Step S1229).

When there is too much noise, the reception signal often cannot be properly estimated, and the likelihood is low at the same time. Therefore, the reliability of reception signals can be enhanced by discarding the estimation result when the likelihood is low. The maximum likelihood decoding has a problem that even when an input image does not contain an effective signal, an effective signal is output as an estimation result. However, also in this case, the likelihood is low, and therefore this problem can be avoided by discarding the estimation result when the likelihood is low.

Embodiment 16

[1 Introduction]

Conventional visible light communication schemes include one method that employs a general-purpose image sensor as a light-receiving device and another featuring a photosensor or a special high-speed image sensor. CASIO's Picapiamera® is an example of the former type. Since the upper limit of the imaging frame rate of many general-purpose image sensors is 30 fps, changes in luminance of a light source that transmits signals need to be at a frequency not higher than this upper limit. However, changes in luminance at such a low frequency can be perceived as flicker by the human eye, so in this case, light fixtures cannot be used as signal transmitters, that is, it is necessary to use dedicated transmitters. IEEE802.15.7 and CP1223 standards employ a high-speed photosensor as the latter type. The modulation frequency adopted in these methods equals or exceeds 9.6 kHz. Since the luminance change at such a high frequency is imperceptible to the human eye, incoming light that is subject to high-frequency luminance changes looks steady to the human eye, thus allowing fixtures to be used as transmitters. However, they require a dedicated reception device. This hampers the spread of visible light communication.

We have developed a technique in which a general-purpose image sensor built into a conventional smartphone is used as a reception device for detecting optical signals modulated at high frequencies that are imperceptible to the human eye. CMOS image sensors, which are superior to CCD image sensors in terms of high-speed response, highly integrated structure, low power consumption, and low-voltage drive, are incorporated into nearly all types of smartphones and digital cameras. A CMOS image sensor captures images by line scanning, which sequentially exposes each pixel line to light. The drawback to this method is that images of moving objects are distorted. To utilize the characteristics of line scanning, we set an optimal exposure time and developed a line-scan sampling (LSS) method that samples at 30 kHz or higher, a thousand times faster than the conventional sampling frequency that samples a single luminance state per image. We also devised an appropriate modulation method for LSS and applied it to LED light fixtures and display backlights. We applied our LSS-based reception method to currently-available smartphones and confirmed that it enables the reception of optical signals modulated at 10 kHz.

[2 Line-Scan Sampling]

A CMOS image sensor converts light into pixel values that read as one-dimensional data using the following process.

1. A photodiode in a pixel is exposed to light and produces electric charge according to the amount of exposure. This charge is amplified and converted into voltage.

2. The voltage is supplied to a vertical signal line by a line selection switch. Fixed pattern noise is eliminated and the signal is temporarily stored.

3. The stored voltage is transmitted sequentially to a horizontal signal line by a column selection switch and is finally read out as one-dimensional data.

Image sensors that are built into smartphones and digital cameras are highly micro-fabricated devices in which each pixel has no frame memory. For this reason, light exposure in Step 1 does not occur simultaneously for all pixels, but takes place as described in Step 2, in a sequential line-by-line process. This means that the timing of the start and end of light exposure progresses by degrees from line to line. As a result, the CMOS image sensor provides images taken at different points in time on different lines. Using this image-capturing mechanism allows the sampling of luminance changes from a transmitter that is much faster than that needed for whole frames. We refer to a line of pixels exposed to light at the same time as an "exposure line."

FIG. 313 shows images of a light source transmitting a 10-kHz modulated signal with exposure time of 1/100, 1/1,000 and 1/10,000 second. The pixel values of a captured image are obtained by multiplying the integral of the luminance of an imaging subject within the exposure time, by a value determined according to the brightness of a lens or a preset sensitivity value. An exposure time of about 1/30 to 1/200 is usually adopted for ordinary photography under room illumination. If an exposure time Te is sufficiently long compared to cycle time Ts of signal modulation, the luminance ratio between exposure lines that capture the brightest period and the darkest period is about Ts/Te. If Te=1/100 second and Ts=1/10,000 second (10 kHz), the pixel value difference is only 1%. Therefore, when photographing under ordinary conditions, this luminance difference is not recognized as blinking. However, if the exposure time is shortened, as indicated in (c) of FIG. 313, a blinking pattern clearly appears as pixel values on the exposure line. In this manner, with a very short exposure time, a high frequency luminance change can be detected.

Not all photodiodes are directly used to capture images in a CMOS image sensor. An optical black section is masked from exposure. Subtracting the output potential of the optical black section from the output potential of the effective pixels cancels the dark current that arises from heat noise. There are also some "blind" sections for layout reasons. The effective pixel aspect ratio is often 4:3, but when the size of a captured image is set to 16:9, the top and bottom portions of the effective pixel area are clipped off and, as a result, are handled in the same way as blind sections. The image sensor not only reads the data from the effective pixels but also that from the optical black and blind sections in sequence along each line. Because of this sequential procedure, the time required for exposing the optical black and blind sections is the time taken to jump from the bottom line of one image to the top line of the next image. This time difference is called the "blanking time."

The period during which the luminance changes at the light source can be sampled by LSS is equivalent to the period during which the exposure line that captures an image from the light source is exposed. FIG. 314 illustrates this situation. Even if a light source is captured over the entire image, samples will be discontinuous because of the blanking time. Signal transmission must therefore be based on an appropriate protocol for LSS that takes into account the fact that the signals are received discontinuously. Although today's smartphones do not incorporate such a function, devices become capable of continuous signal reception and significantly improve communication efficiency if settings allow the devices to identify the location of the light source and capture a limited image of the location as shown in FIG. 315.

If the sampling frequency, i.e., the image-capturing frequency, is 30 fps and the vertical size of an image is 1080 pixels, LSS sampling is carried out 30×1,080=32,400 times per second. However, because no sampling results are produced during the above blanking time, the actual sampling frequency exceeds 32,400 Hz. The blanking time varies depending on the settings of each model and the imaging conditions that include a frame rate and image resolution, but ranges from approximately around 1 to 10 milliseconds. Accordingly, the sampling frequency is in the range from about 33 to 46 kHz.

[3 Transmitter Conditions]

To be able to use illumination light as a light source for visible light communication, the luminance changes used for signal transmission must not be perceivable by the human eye. Average luminance (effective luminance) must therefore be constant, regardless of what signals are being transmitted. The luminance change frequency should also be sufficiently high or the luminance change rate should be sufficiently small. The frequency limit perceived by humans is called the critical flicker frequency (CFF), and is approximately 60 Hz although it differs depending on the conditions. Note that this is a limit for periodic blinking, and a higher modulation frequency is required for the irregular luminance changes used for signal transmission. Photographs taken with still or video cameras also must be free from luminance changes. As described above, with the exposure time setting in the range of ordinary photography, the effects of luminance changes in still images are so small as not to cause problems. However, when shooting video, even changes in luminance at a frequency higher than CFF may be perceived as a shadow that resembles a scanning line. This is because of the alias created by a shift between the frame and signal frequencies when shooting video. To eliminate this effect, a frequency substantially higher than CFF or a low luminance change ratio is required.

The brightness of a light fixture can be controlled by managing the amount of current that flows through the light source (current control) or the duration of the light emission time (PWM control). Using luminance changes to transmit signals does not permit the PWM control. However, in order to replace the control method for devices which conventionally employ the PWM control, such as display backlights, with the current control, large-scale circuit modification is required, which would hamper the adoption of visible light communication. It is therefore preferable for any modulation scheme to include a function for adjusting average luminance.

High luminance is desirable as the basic function of lighting equipment. The withstand voltage and number of LED elements serving as the light source are determined by maximum luminance. The modulation method in which the ratio of averaged luminance to the maximum luminance (the effective luminance rate (ELR)) has a higher value is therefore desirable.

A display can be employed as a transmitter by controlling the luminance of its backlight. A display transmitter, however, requires attention on the following points that are not seen in a lighting fixture transmitter. The SN ratio is low because the light source has low luminance. In order to improve the resolution of moving pictures the SN ratio of which would drop even further when a picture on a screen generates noise and the picture is dark, there are cases where the backlight needs to be switched off while the transmittance of liquid crystals is being changed. The refresh rate of a screen in a higher-grade product is higher, and the maximum refresh rate of existing products is 240 Hz. In this case, signals are intermittently transmitted on a $\frac{1}{240}$-second basis.

[4 Modulation Schemes for LSS]

Discontinuous reception is the main characteristic of LSS. The modulation method adapted to discontinuous reception includes a small symbol method and a large symbol method.

[4.1 Large Symbol Method]

The large symbol method uses a uniform symbol continuously transmitted for a longer duration than with the image-capturing period. The uniform symbol refers to the symbol that allows decoding of the signal when any part of the symbol is received, such as a frequency-modulated symbol. The receiver receives one symbol for one image and connects incoming symbols from multiple images to reconstruct the communication data. The symbol-per-image reception method, which is similar to the conventional reception method by image sensors, is different in that the information volume per symbol is far greater, and the human eye cannot perceive any flicker in the modulated light. Communication data may be reconstructed by putting together a series of reception data in sequence. This, however, lacks reliability because, if processing on image frames is dropped due to a processing load, etc., of the receiver, for example, the reception data cannot be properly reconstructed. Even in such cases, data can be properly received when part of the signal is used as an address.

Signals coded using frequency modulation are uniform and provide a large volume of information per symbol. They are therefore useful for the large symbol method. FIG. 316 illustrates, in (b), an example of frequency modulation by means of on/off control. A simple frequency modulation achieves an ELR of 50% that can be improved by fixing the cycle periods and securing longer periods of high luminance. FIG. 316 shows, in (b) and (c), results of frequency analysis of signals that have the same frequency but different ELR. It reveals that the frequencies represented by the signals can be recognized from their basic frequency.

Signal sampling by LSS produces a luminance average during an exposure period, which means that the signals are subjected to a moving average filter for the length of the exposure time. FIG. 317 depicts the frequency characteristics of this filter. Thus, it is to be noted that the exposure time of the receiver needs to be constant, and the frequencies cut by this filter cannot be used.

[4.2 Small Symbol Method]

In the small symbol method, the receiver receives multiple symbols in a series of reception periods of time, and reconstructs communication data by connecting the received parts over multiple image frames. If the repetitive period of the transmission signals is constant, the received parts can be combined based on the result of calculation of the length of the blanking time from the imaging frame rate. It would not, however, be reliable because many of today's smartphones control the imaging frame rate variably in relation to the processing load and the temperature in the processor. Therefore, communication data is divided into multiple packets, and a header indicating a packet boundary and an address indicating a packet number are added to each of packets so that the received data can be combined regardless of the length of the blind period. Furthermore, in the former method, only the same part of the communication data can be received when the ratio between the reception period (the imaging frame rate) and the transmission period is expressed as a small integer, whereas, in the latter method, this problem can be solved by randomizing the order of packet transmission.

Pulse-position modulation and frequency modulation are suitable for the small symbol method because their symbol transmission period can be short and their ELRs can be high.

Pulse-position modulation coding scheme that maintains constant luminance includes Manchester coding and four pulse-position modulation (4 PPM) coding (FIG. 318 and FIG. 319). Both coding schemes offer a coding efficiency of 50%, but the 4 PPM coding achieves an effective luminance rate of 75%, which outperforms the Manchester coding the effective luminance rate of which is 50%. FIG. 318 illustrates coding schemes (variable 4 PPM, V4 PPM) supporting luminance adjustment based on the 4 PPM coding. This coding scheme allows the effective luminance rate to continuously change from 25% to 75%. Furthermore, this has a characteristic that the signal rising position remains constant regardless of the luminance, and therefore the reception side can receive signals without heeding the luminance setting values. As a Manchester code-based coding scheme supporting luminance adjustment, there is the variable PPM (VPPM) scheme. When the effective luminance rate in the VPPM scheme can be changed from 25% to 75%, the pulse width which is 25% of the symbol length is, if calculated based on the shortest recognizable pulse width, equal to the width of one pulse in the 4 PPM as illustrated in FIG. 320. In this case, the coding efficiency of V4 PPM is double that of VPPM, meaning that V4 PPM outperforms VPPM.

Frequency analysis, such as discrete cosine transform, can be used to receive frequency-modulated symbols. Its advantage is that it is usable with longer exposure time. However, since the information on the symbol sequence is lost, the combination of frequencies available in consideration of harmonic frequencies is limited. In the following experiments, V4 PPM is used as a symbol modulation method, more specifically, as the small symbol method.

[4.3 Performance Evaluation]

Performance in two modulation schemes is evaluated. A smartphone P-03E is used as a receiver, and a liquid-crystal television TH-L47DT5 is used as a transmitter. The backlight of the display is switched off when the liquid crystals are refreshed. The refresh rate of the liquid crystals is 240 Hz, and in the standard mode, the backlight lights up 75% of the time during the refresh cycle, so that continuous transmitting time is 1,000,000/240×0.75=3,125 micro seconds. FIG. 321 illustrates, in (a), signal and noise powers measured using the above-described transmitter and receiver when the exposure time is set to $1/10{,}000$ seconds, a 50% gray image is displayed on the screen of the display, and a 1 kHz on-off signal is transmitted. The following experiments were conducted using the simulated signal having this SN ratio ((b) in FIG. 321). As the reception signal, a value obtained by averaging pixel values of 256 pixels in the horizontal direction to the exposure line was used. The following results were obtained from 1,000 simulations in each condition.

A single-frequency symbol is used as a symbol in the large symbol method. The effective luminance rate is set to 75% which is the same as the ELR used in the experiment for the small symbol method although the reception error decreases as the effective luminance rate approaches 50%. The reception signals are calculated by discrete cosine transform of pixel values vertical to exposure lines. FIG. 322A shows reception errors (the differences between the transmission signal frequencies and the reception signal frequencies). The reception error soared at over around 9 kHz. This is because the signal power is reduced by the moving average filter of LSS shown in FIG. 317, and is buried in noise. A large reception error occurs in the low frequency range because only signals at a lower number of cycles can be transmitted during the transmission period. FIG. 322B to FIG. 322F show the reception error rates for each frequency margin. For example, when the allowable error rate is assumed to be 5%, values can be allocated in 50-Hz steps in the frequency range from 1.6 kHz to 8 kHz. Therefore, information of (8,000−1,600)/50=128=7 bits can be represented. For example, when 2 bits are allocated to an address and 5 bits are allocated to data, information of 20 bits can be represented. Since communication data can be decoded from four frame images at the maximum speed, the effective communication speed is 150 bps when images are captured at 30 fps. An error check code needs to be contained for practical use to detect reception errors.

V4 PPM was used for symbols in the small symbol method. FIG. 323 shows the reception success rate in each symbol rate. This reception success rate indicates the rate at which all symbols in one packet are successfully received. The modulation frequency herein indicates the number of time slots of luminance changes included in one second. Specifically, in the case of the modulation frequency of 10 kHz, 2,500 V4 PPM symbols are contained. When the allowable error rate is 5%, the modulation frequency can be set to 10 kHz. Assuming that the entire continuous transmission period is one packet, its boundary can be determined as long as the state at the beginning of the transmission period is an ON-state (a state in which the luminance is high), meaning that the header indicating a boundary of a packet can be provided in one slot. Each packet, therefore, contains as many V4 PPM symbols as the number indicated by (Expression 1) below.

[Math. 1]

$$\lfloor (0.003125/(1/10{,}000)-1)/4 \rfloor - 7 \qquad \text{(Expression 1)}$$

This means that each packet contains 14 bits of information. If two bits are allocated to the address and twelve bits to the data, 48 bits of information can be represented. Since more than one packet can be received if the transmitter size in the captured image is large enough, the effective communication speed is highest when all the packets are successfully received from one image, and is 1,440 bps at the imaging rate of 30 fps.

The small symbol method allows a larger number of bits to be represented, and therefore was implemented, followed by a performance test. The packet composition was the same as that described above, with the combined 48 bits of data containing four bits of CRC code. When packets with the same address but different data are received, the largest number of the same data packets was employed. When there as the same number of packets with the same data, reception was continued until the number of any data packets takes the sole lead. If any error was detected through CRC, all the received packets were discarded. The distance between the receiver and the transmitter was set to four meters. With this distance, at least one packet image is contained per image. The average reception time in 200 trials was 351 milliseconds without any errors left after the CRC error check. The expected value of the number of times of packet reception necessary to collect N types of packets can be calculated according to (Expression 2) below.

[Math. 2]

$$\Sigma_{r=1}^{N} N/r \qquad \text{(Expression 2)}$$

Thus, the expected value is 8.33 when N=4. Therefore, the expected reception time is 8.33×33=275 milliseconds, assuming no packet reception errors and one packet reception per image. If the average reception time is longer than the expected reception time, it would have been necessary to receive two or more packets due to a reception error. The reception time can be improved by reducing reception errors through measures such as including an error detection code in the packet.

[5 Conclusion]

The visible light communication is one type of wireless communication which uses electromagnetic waves in the visible light band that are visible to the human eyes. This attracts attention because of a social aspect thereof that lighting becomes applicable as a communication infrastructure. As characteristics, this does not require authorization under the Radio Act, this is safe without affecting living organisms, this does not cause other devices to be affected by electromagnetic waves, the range of communication can be recognized at a glance because the signal transmission source and the communication path are visible, fraudulent communication can be easily prevented, it is easy to block signals, this is highly directional, being communicable with a specified device only, and the energy for communication can be shared with lighting. Furthermore, how to use this technique not only in bi-direction communication corresponding to the existing wireless communication represented by WiFi and the like, but also as a sign using unidirectional communication has been studied. An example of expected application is to transmit signals carrying position information from a ceiling light so as to locate a user in an indoor space where GPS signals do not reach.

This embodiment proposes high-speed sampling that utilizes the line-scan characteristics of the conventional CMOS image sensors and confirms that currently available smartphones can receive signals modulated at a modulation frequency of 10 kHz.

A smartphone's ability to receive visible light signals from light fixtures serving as the transmitter paves the way for a wide range of applications. An example of expected application is to transmit signals carrying position information from a ceiling light so as to locate a user in an indoor space where GPS signals do not reach. Another conceivable application is to use a signboard as the transmitter by allowing smartphones to obtain coupons or check for available seats, for example.

The visible light communication method proposed in this embodiment is superior to the illuminance sensor reception method not only in that smartphones are usable as the receiver, but also with the following advantages. Incoming light can be spatially separated, and can therefore be separately received without interference even when multiple transmitters are present nearby. Furthermore, the direction of the incoming light can be identified, which allows the position relative to the light source to be calculated. Specifically, by obtaining the absolute position of the light source based on the incoming signals, the absolute position of the receiver can be determined precisely with a margin of error of within a few centimeters. Displays and signboards can be used as transmitters in this communication system. Although it is difficult to receive signals from displays and signboards using photosensors due to luminance and illuminance thereof being lower than those of lighting, signals can be received regardless of environmental illuminance. Furthermore, although noise arises from moving images on a display screen, a flat area with less noise is selected and signals can be received from the area in the image sensor reception method.

Our future work will focus on improving our reception algorithm and studying the potential for further improvements in communication performance. We will also investigate various applications of visible light communication and test its industrial applicability.

Embodiment 17

This embodiment describes a display system which transmits a visible light signal while displaying an image, the display system being configured as a transmitter as described in the above embodiments.

FIG. 324 is a block diagram illustrating a configuration of a display system according to this embodiment.

The display system according to this embodiment includes an image signal sender 1250 which generates and sends an image signal, and an image display 1270 which transmits a visible light signal while displaying an image.

The image signal sender 1250 includes an image signal generation unit 1251, a visible light signal generation unit 1252, a visible light synchronization signal generation unit 1253, and an image standard signal sending unit 1254.

The image signal generation unit 1251 generates an image signal, and outputs the image signal to the image standard signal sending unit 1254. The visible light signal generation unit 1252 generates a visible light signal in the form of an electrical signal, and outputs the visible light signal to the image standard signal sending unit 1254. The visible light synchronization signal generation unit 1253 generates a visible light synchronization signal, and outputs the visible light synchronization signal to the image standard signal sending unit 1254.

The image standard signal sending unit 1254 outputs, to the image display 1270 via an image standard transmission path group 1260, an image signal, a visible light signal, and a visible light synchronization signal which are generated as described above.

The image display 1270 includes an image standard signal receiving unit 1271, an image display unit 1272, and a visible light signal output unit 1273.

The image standard signal receiving unit 1271 receives, from the image standard signal sending unit 1254, an image signal, a visible light signal, and a visible light synchronization signal via the image standard transmission path group 1260. The image standard signal receiving unit 1271 then outputs the image signal to the image display unit 1272, and outputs the visible light signal and the visible light synchronization signal to the visible light signal output unit 1273.

The image display unit 1272 includes, for example, a liquid crystal display, an organic EL display, or a plasma display, and upon receiving an image signal from the image standard signal receiving unit 1271, displays an image according to the image signal. If the image display 1270 is, for instance, a projector, the image display unit 1272 has a projection mechanism which includes a light source and an optical system, and upon receiving an image signal from the image standard signal receiving unit 1271, projects an image according to the image signal on a screen.

The visible light signal output unit 1273 obtains a visible light signal and a visible light synchronization signal from the image standard signal receiving unit 1271. If the visible light signal output unit 1273 receives a visible light synchronization signal, the visible light signal output unit 1273 causes, at the time of receipt of the visible light synchronization signal, the image display unit 1272 to start blinking according to the visible light signal already obtained. In this manner, the image display unit 1272 transmits a visible light signal in the form of an optical signal by changing in luminance while displaying an image. Note that the visible light signal output unit 1273 may include a light source such as an LED, and may change the luminance of the light source.

FIG. 325 illustrates a configuration of signal transmission by the image standard signal sending unit 1254 and signal receipt by the image standard signal receiving unit 1271.

The image standard signal sending unit 1254 sends, to the image standard signal receiving unit 1271, an image signal, a visible light signal, and a visible light synchronization signal, using a plurality of image standard transmission paths included in the image standard transmission path group 1260.

If the image standard signal receiving unit 1271 receives an image signal, a visible light signal, and a visible light synchronization signal, the image standard signal receiving unit 1271 outputs the visible light synchronization signal to the visible light signal output unit 1273, before interpreting the image signal and the visible light signal. This prevents a delay in outputting a visible light synchronization signal, due to interpreting an image signal and a visible light signal.

FIG. 326 illustrates an example of a specific configuration of signal transmission by the image standard signal sending unit 1254 and signal receipt by the image standard signal receiving unit 1271.

The image standard signal sending unit 1254 sends an image signal, a visible light signal, and a visible light synchronization signal to the image standard signal receiving unit 1271, using the plurality of image standard transmission paths included in the image standard transmission path group 1260. At this time, the image standard signal sending unit 1254 sends an image signal and a visible light signal to the image standard signal receiving unit 1271, via image standard transmission paths used in the image standard, among the plurality of image standard transmission paths included in the image standard transmission path group 1260. The image standard signal sending unit 1254 sends a visible light synchronization signal to the image standard signal receiving unit 1271, via an image standard transmission path which is not used in the image standard, among the plurality of image standard transmission paths included in the image standard transmission path group 1260.

FIG. 327 illustrates another example of a specific configuration of signal transmission by the image standard signal sending unit 1254 and signal receipt by the image standard signal receiving unit 1271.

The image standard signal sending unit 1254 sends an image signal and a visible light signal to the image standard signal receiving unit 1271 via image standard transmission paths used in the image standard, as with the description given above, whereas the image standard signal sending unit 1254 may send a visible light synchronization signal to the image standard signal receiving unit 1271 via an image standard transmission path for future extension. Note that the image standard transmission path for future extension is an image standard transmission path which is included for future extension in the standard.

FIG. 328 illustrates another example of a specific configuration of signal transmission by the image standard signal sending unit 1254 and signal receipt by the image standard signal receiving unit 1271.

The image standard signal sending unit 1254 sends an image signal and a visible light signal to the image standard signal receiving unit 1271 via image standard transmission paths used in the image standard, as with the description given above, whereas the image standard signal sending unit 1254 may send a visible light synchronization signal to the image standard signal receiving unit 1271 via an image standard transmission path used for sending power which is to be consumed by the image display 1270 (hereinafter, referred to as a power sending transmission path). In this manner, a visible light synchronization signal is sent together with power. Specifically, the image standard signal sending unit 1254 superimposes a visible light synchronization signal on power, and sends the signal and power.

FIGS. 329A and 329B illustrate power which is sent through the power sending transmission path.

If no visible light synchronization signal is sent via the power sending transmission path, a voltage specified by the image standard is continuously applied to the power sending transmission path, as illustrated in FIG. 329A, whereas if a visible light synchronization signal is sent via the power sending transmission path, a voltage of the visible light synchronization signal is superimposed on the voltage specified by the image standard in the power sending transmission path, as illustrated in FIG. 329B. In this case, a visible light synchronization signal is superimposed on power such that the maximum voltage of the visible light synchronization signal is at or below the maximum rated voltage of an image standard transmission path, and the minimum voltage of the visible light synchronization signal is at or above the minimum rated voltage of an image standard transmission path. Furthermore, in this case, a visible light synchronization signal is superimposed on power such that the average of a voltage during a period when a visible light synchronization signal is superimposed on power is equivalent to the voltage specified by the image standard.

FIG. 330 illustrates another example of a specific configuration of signal transmission by the image standard signal sending unit 1254 and signal receipt by the image standard signal receiving unit 1271.

The image standard signal sending unit 1254 sends an image signal and a visible light signal to the image standard signal receiving unit 1271 via image standard transmission paths used in the image standard, as with the description given above, whereas the image standard signal sending unit 1254 may send a visible light synchronization signal to the image standard signal receiving unit 1271 via an image standard transmission path used in the image standard to send a vertical synchronization signal. A vertical synchronization signal is a signal for vertically synchronizing an image. The image standard signal sending unit 1254 sends a visible light synchronization signal which serves as a vertical synchronization signal.

FIG. 331 illustrates another example of a specific configuration of signal transmission by the image standard signal sending unit 1254 and signal receipt by the image standard signal receiving unit 1271.

The image standard signal sending unit 1254 sends an image signal and a visible light signal to the image standard signal receiving unit 1271, via image standard transmission paths used in the image standard, as with the description given above, whereas the image standard signal sending unit 1254 may send a visible light synchronization signal to the image standard signal receiving unit 1271 via an image standard transmission path (hereinafter, referred to as a combined transmission path) used in the image standard to send an image signal, a control signal, and a vertical synchronization signal. The image standard signal sending unit 1254 sends a visible light synchronization signal which serves as a vertical synchronization signal.

In this case, the image standard signal receiving unit 1271 extracts a visible light synchronization signal from signals sent and received via the combined transmission path, and outputs the visible light synchronization signal to the visible light signal output unit 1273, before interpreting an image signal and a control signal.

In this manner, in this embodiment, a visible light synchronization signal is extracted before interpreting an image signal and a visible light signal, thus preventing a delay in outputting the visible light synchronization signal due to interpreting the image signal and the visible light signal.

Embodiment 18

The present disclosure relates to a display device that outputs visible light communication signals and a method of controlling such a display device.

For example, Japanese Unexamined Patent Application Publications No. 2007-43706 and No. 2009-212768 disclose techniques related to visual light communication. Japanese Unexamined Patent Application Publications No. 2007-43706 and No. 2009-212768 disclose communication techniques of superimposing communication information via visible light during normal video display in a video display device including a display or projector, for example.

The present disclosure provides a display device capable of outputting visible light communication signals without significantly deteriorating the quality of the display image, and capable of reducing reception error of output visible light communication signals, and a method for controlling such a display device.

The display device according to the present disclosure outputs visible light communication signals, and includes: a display panel including a display screen on which an image is displayed; a display controller that causes the display panel to display an image on the display screen of the display panel based on an image signal; a backlight having a light emission surface that illuminates the display screen of the display panel from behind; a signal processor that superimposes the visible light communication signals on backlight control signals generated based on the image signal; and a backlight controller that divides the light emission surface of the backlight into regions and establishes an interval during which control of light emission in each of the regions and control for turning off the backlight in each of the regions a different time are performed based on the backlight control signals outputted by the signal processor. When superimposing the visible light communication signals on the backlight control signals, the signal processor does not superimpose a visible light communication signal in an interval indicating an OFF state of the backlight in the backlight control signals.

The display device according to the present disclosure is capable of outputting visible light communication signals without significantly deteriorating the quality of the display image, and capable of reducing reception error of output visible light communication signals.

(Underlying Knowledge Forming Basis of the Present Disclosure)

In recent years, in fields related to display devices, and in particular liquid crystal displays and projectors that use liquid crystals, a technique known as backlight scanning has been employed in an effort to improve image quality. Backlight scanning is a backlight control method which improves the slow reaction speed of the liquid crystals and improves motion blur that can be seen in sample-and-hold displays. In this method, the display screen is divided into regions (backlight regions), and light emission of the backlight is controlled such that the regions sequentially emit light at fixed intervals. More specifically, backlight scanning is a control method that establishes backlight OFF intervals, and the timing for these cyclic OFF intervals (blanking intervals) for each of the backlight regions are set to be different from one another. Generally, control is often performed to synchronize the timing of the blanking interval with the timing of the scanning.

However, as disclosed in Japanese Unexamined Patent Application Publication No. 2007-43706, in visible light communication, visible light communication signals are superimposed by strobing the backlight. As such, transmission of visible light communication signals is not possible during the backlight OFF interval. Moreover, this OFF interval can cause signal transmission failure. As such, the only choice is to stop the scanning of the backlight and transmit the visible light communication signals, which sacrifices image quality.

In light of this, the present disclosure provides a display device capable of outputting visible light communication signals without significantly deteriorating the quality of the display image, and capable of reducing reception error of output visible light communication signals.

Hereinafter, an embodiment is described in detail with reference to the drawings as necessary. It should be noted that unnecessarily detailed descriptions may be omitted below. For example, detailed descriptions about already well-known matters and overlapping descriptions for substantially the same configurations may be omitted. Such descriptions are omitted to prevent the descriptions below from being unnecessarily redundant and help a person skilled in the art to understand the present disclosure easily.

It should be noted that the Applicant provides the accompanying drawings and the following description to assist those skilled in the art in fully understanding the present disclosure, and does not intend to limit the scope of the claims.

Hereinafter, Embodiment 18 will be described with reference to FIG. 332 through FIG. 339.

[1. Configuration]

FIG. 332 is a schematic view of one example of a visible light communication system according to Embodiment 18.

[1.1 Visible Light Communication System Configuration]

The visible light communication system 1300 illustrated in FIG. 332 includes a display device 1400 and a smartphone 1350.

The display device 1400 is, for example, a television, and can display an image on a display screen 1410. The display device 1400 can also superimpose visible light communication signals onto the display screen 1410.

The smartphone 1350 is one example of an electronic device that receives visible light communication signals, and can receive the visible light communication signals transmitted from the display device 1400. With this, the user of the smartphone 1350 can obtain, for example, information on the image being displayed on the display device 1400.

Note that in this embodiment, the display device 1400 is merely exemplified as a monitor that displays an image, such as a television or display; the display device 1400 is not limited to this example. The display device 1400 may be a device that projects an image such as a projector. Similarly, the smartphone 1350 is merely given as an example of an electronic device that receives visible light communication signals output from the display device 1400; any device that can receive visible light communication signals is acceptable and is not limited to a smartphone. For example, the electronic device may be a receiver that conforms to the JEITA CP-1222 standard. Moreover, the electronic device is not limited to a smartphone and may be a general handheld device. Moreover, the electronic device may obtain information by receiving visible light communication signal and decoding the received visible light communication signals.

The information transmission method used to transmit the visible light communication signals may be a method that conforms to the JEITA CP-1223 standard currently being developed as an international standard, or the IEEE P802.15 standard already instituted. Stated differently, the electronic device may use a receiver that conforms to one or more of these standards.

[1.2 Configuration of Display Device]

FIG. 333 is a block diagram of one example of an outline configuration of a display device according to Embodiment 18.

The display device 1400 illustrated in FIG. 333 is a display device that outputs visible light communication signals, and includes a first input unit 1420, a first processor 1430, a first controller 1440, a display panel 1450, a second input unit 1460, a second processor 1470, a second controller 1480, and a backlight 1490.

The first input unit 1420 receives an input of an image signal related to an image displayed on the display panel 1450. The image signal is input into the first input unit 1420 via, for example, an antenna cable, image signal line, composite cable, HDMI® cable, PJLink cable, or LAN cable, from, for example, a broadcast wave, a video recording and playback device, or PC. Here, the image signal may be stored on various kinds of recording mediums using a video recording device or playback device, for example.

The first processor 1430 receives an input of the image signal from the first input unit 1420. The first processor 1430 performs general image processing, such as image enhancement, on the image signal. The first processor 1430 transmits the image-processed image signal to the first controller 1440. The first processor 1430 also transmits information indicating the size, display timing, brightness, etc., of the subframes and image signal to the first controller 1440 and the second processor 1470.

Note that the first processor 1430 may output a duty ratio calculated based on the image signal and the backlight control signal (hereinafter also referred to as BL control signal) for each region to the second processing unit.

The display panel 1450 is, for example, a liquid crystal display panel, and includes the display screen 1410 that displays an image.

The first controller 1440 is one example of the display controller. The first controller 1440 causes the display panel 1450 to display an image on the display screen 1410 of the display panel 1450 based on an image signal. In Embodiment 1, the first controller 1440 causes the display panel 1450 to display an image based on an image signal transmitted from the first processor 1430. More specifically, the first controller 1440 controls the aperture of the liquid crystals of the display panel 1450 based on an image signal transmitted from the first processor 1430.

The second input unit 1460 receives an input of a signal used in visible light communication (hereinafter also referred to as a visible light communication signal), and transmits the input visible light communication signal to the second processor 1470. In this embodiment, a visible light communication signal generated on, for example, a PC, is input into the second input unit 1460 via a proprietary cable or a LAN cable, for example.

Note that the visible light communication signal may be superimposed on part of a radio wave and input into the second input unit 1460 via an antenna cable. The visible light communication signal may also be recorded on a variety of different types of recordable mediums via a video recording device or playback device and input into the second input unit 1460. For example, a visible light communication signal recorded by a video recording device may be placed on a portion of a line of a HDMI (R) cable or a PJLink cable, for example, and input into the second input unit 1460. Moreover, a visible light communication signal generated on a separate PC may be superimposed on an image signal, and the image signal may be input into the second input unit 1460 from a video recording device or playback device.

Note that other than receiving inputs from external devices, the second input unit 1460 may obtain the visible light communication signal by reading server information via the internet using information internally stored in the display device, such as the ID of the display device.

The second processor 1470 generates an encoded signal by encoding the visible light communication signal input via the second input unit 1460, and calculates a duty based on at least one of the image signal and the visible light communication signal. The second processor 1470 superimposes the encoded signal onto the BL control signal input from the first processor 1430.

In this embodiment, the encoded signal is described as a signal having a given proportion of ON intervals and OFF intervals. Moreover, the encoded signal is described as a signal encoded using an inverted-4 PPM method. Note that the encoded signal may be encoded using Manchester encoding, for example. Moreover, the modulated signal is described as having a 100% ON/OFF modulation percentage, but the modulated signal is not limited to this example. For example, when high/low modulation is used rather than 100% modulation percentage, ON/OFF in the following description may be read as high/low and implemented. Regarding the duty of the visible light communication signal as well, in addition to the ON interval being a value determined by a standard for the whole interval during which the signal is transmitted, it may be read in concert with (high level×high interval+low level×low interval)/(signal transmission interval×high level).

More specifically, the second processor 1470 is one example of the signal processor, and superimposes the visible light communication signals on the backlight control signals generated based on the image signals. However, when the second processor 1470 superimposes the visible light communication signals on the backlight control signals, the second processor 1470 does not superimpose the visible light communication signals in intervals indicating an OFF state of the backlight in the backlight control signals. Note that the encoded visible light communication signal (encoded signal) may also be referred to simply as the visible light communication signal.

The second controller 1480 is one example of the backlight controller. The second controller 1480 divides the light emission surface of the backlight 1490 into regions and, based on the backlight control signal (BL control signal) outputted by the second processor 1470, establishes an interval during which control of light emission in each of the regions and control for turning off each of the regions a different time are performed. In this embodiment, the second controller 1480 controls the brightness of and timing for the backlight 1490 based on the backlight control signal (BL control signal) transmitted from the second processor 1470.

The backlight 1490 emits light from behind the display panel 1450. More specifically, the backlight 1490 has a light emission surface that emits light from behind the display screen 1410 of the display panel 1450. This allows the viewer to view an image displayed on the display panel 1450.

In this embodiment, the light emission surface of the backlight 1490 is divided into a plurality of regions, and the light emission of each region is sequentially controlled to scan the backlight. Note that the regions of the light emission surface of the backlight 1490 correspond to regions of the display screen 1410.

[2. Display Device Operations]

Next, operations performed by the display device 1400 having the above configuration will be described.

The display device 1400 sequentially scans the backlight across the entire screen of the display panel 1450 by sequentially turning off the backlight in conjunction with writing of the image signal.

Typically, with liquid crystal display panels, the phase change of the liquid crystals is slow, and even if image signals are switched to indicate different gradations, switching between the signals takes time. Thus, by temporarily turning off the backlight of the display panel to scan the backlight, video characteristics can be improved, such as bleeding resulting from video being displayed while switching the signals. However, scanning speed for switching continues to improve year by year; typical scanning speed of 60 frames per second has improved to where double or four times that scanning speed is possible. When scanning at high speeds, more fluid video characteristics can be achieved by interpolating frames between normal frames to change the images in more gradual steps.

For this reason, backlight scanning in which the backlight is turned off while scanning the backlight is significantly important to improving video characteristics, and not superimposing the visible light communication signal during the OFF intervals associated with backlight scanning is better in terms of video characteristics.

For the above reasons, in the display device 1400, visible light communication signals are not output during the OFF intervals (hereinafter also referred to as blanking intervals) associated with backlight scanning.

Hereinafter a method for (operations for) receiving visible light communication signals at a high success rate with a receiver such as the smartphone 1350 even when the display device 1400 does not output visible light communication signals during the blanking intervals of the backlight control signals (BL control signals) will be described.

Example 1 of Embodiment 18

[2.1.1 One Example of Operations Performed by Second Processor]

FIG. 334A illustrates one example of a state before the visible light communication signals are superimposed on the BL control signals according to Example 1 of Embodiment 18, and FIG. 334B illustrates one example of a state after the visible light communication signals have been superimposed on the BL control signals according to Example 1 of Embodiment 18.

FIG. 334A and FIG. 334B illustrate an example in which BL control signals A through H, which correspond to the eight regions A through H resulting from dividing the display region of the display screen 1410, are input to control the backlight 1490. The hatched portions indicate regions where encoded signal (visible light communication signal) is present.

The encoded signal illustrated in FIG. 334A is superimposed on the BL control signals A through H at different phases, and when out of phase encoded signals are mixed within the reception range of the receiver, an error (visible light communication signal reception error) occurs when the receiver decodes the encoded signals.

Therefore, in this example, in a given region of the display region, the encoded signals (visible light communication signals) are superimposed in phase, as illustrated in FIG. 334B.

Here, "in phase" is exemplified as meaning the synchronization of the rise timing, but "in phase" is not limited to this example. Any point from a state before the start of the rise to a state at which the rise ends may determined as the rise time. Moreover, since there is a delay time along the control signal voltage, for example, in synchronization does not mean that the timings simply match; "in phase" also includes instances where a given delay time or a delay time within a given period exist. The same applies to the following embodiments (Embodiments 18 to 23).

Here, since the backlight sequentially turns off with each region in the case of sequential scanning, it is difficult to superimpose the encoded signals without including the OFF intervals (blanking intervals) at all. Thus, in this example, in a specific region among regions into which the display region is divided (hereinafter the specific region is also referred to as the reference region), the timing at which the encoded signal is superimposed is synchronized with the end of the OFF interval (the blanking interval). Note that in regions other than the specific region (the reference region), encoded signals are superimposed in phase with the encoded signal of the reference region as well, but the encoded signals are not superimposed during the OFF intervals (the blanking intervals), which are the intervals during which the backlight is turned off.

In the example illustrated in FIG. 334B, the second processor 1470 sets region C into which BL control signal C is inputted as the reference region, and the encoded signals are superimposed on the BL control signals A through H in phase after adjusting the superimposition timing of the encoded signals to synchronize the head (rise timing) P2 of the encoded signal with the rise timing P1 of BL control signal C in FIG. 334A. Then, upon superimposing the encoded signals on the BL control signals A through H, the second processor 1470 superimposes the encoded signals during the ON intervals of the BL control signal but does not superimpose the encoded signals during the OFF intervals.

Note that the reference region is not limited to region C. Hereinafter, examples will be given of regions that can be set as the reference region in this example. For example, the reference region may be the brightest region among regions into which the display region is divided (in other words, the region whose blanking interval is the shortest or the region where the light transmissivity of the display panel is the greatest).

Note that even when the brightest region is set as the reference region, when the position of the reference region is changed every frame, further provision is required. This is because the position of the encoded signal superimposed every frame changes, and the balance of the video drastically changes every frame, leading to flickering. Moreover, when provisions such as cutting off one of overlapping encoded signals midway when intervals of encoded signals to be superimposed overlap between regions or not superimposing during a first predetermined period are not implemented, reception errors at the receiver may arise. Thus, when changing the position of the reference region every frame, at least for one frame interval, an interval where the encoded signal is not superimposed may be established.

Moreover, when a bright region is set as the reference region, the bright region may be determined with reference to transition of the center of the brightness of the image based on the image signal by the first processor 1430, rather than the bright region bring determined with reference to the brightness of the display region in every frame.

Moreover, when there is no change in brightness of the entire display region above a certain level, such as when the scene does not switch for a given period of time, a region including the brightest location in the display region based on the average of the image signal during the given period of time may be set as the reference region. Note that the reference region may be determined in advance.

[2.1.2. Advantageous Effects, Etc.]

As described above, the display device (1400) according this example outputs visible light communication signals, and includes: a display panel (1450) including a display screen on which an image is displayed; a display controller (the first controller 1440) that causes the display panel to display an image on the display screen of the display panel based on an image signal; a backlight (1490) having a light emission surface that illuminates the display screen of the display panel (1450) from behind; a signal processor (the second processor 1470) that superimposes the visible light communication signals on backlight control signals generated based on the image signal; and a backlight controller (the second controller 1480) that divides the light emission surface of the backlight (1490) into regions and establishes an interval during which control of light emission in each of the regions and control for turning off the backlight in each of the regions a different time are performed based on the backlight control signals outputted by the signal processor (the second processor 1470). When superimposing the visible light communication signals on the backlight control signals, the signal processor (the second processor 1470) does not superimpose a visible light communication signal in intervals indicating an OFF state of the backlight (1490) in the backlight control signals.

This configuration provides a display device capable of outputting visible light communication signals without significantly deteriorating the quality of the display image, and capable of reducing reception error of output visible light communication signals.

Moreover, the signal processor (the second processor 1470) may superimpose the visible light communication signals on the backlight control signals corresponding to the regions in a one-to-one manner, and the visible light communication signals superimposed on the backlight control signals corresponding to the regions may be in phase with one another.

With this, reception error of the visible light communication signals can be inhibited.

Here, for example, based on the backlight control signal corresponding to a predetermined region among the regions, the signal processor may match phases of the visible light communication signals superimposed on the backlight control signals corresponding to the regions.

With this, intervals of visible light communication signals not superimposed during blanking intervals can be minimized.

Moreover, the predetermined region may be the brightest region among the regions, and may be a region corresponding to an edge portion of the display screen among the regions.

With this, the effect of the decrease in brightness due to the turning off of the backlight due to the visible light communication signal can be inhibited.

Example 2 of Embodiment 18

Hereinafter an example will be given where the length of the blanking interval is the same for each region in the display region.

The total time the backlight 1490 is turned off (the total OFF interval) is calculated by adding the blanking interval, which is the OFF interval of the BL control signal, and the OFF interval of the encoded signal.

As such, even if the encoded signal is superimposed right after the end of the blanking interval in the reference region and the encoded signal is completely included from that blanking interval to the next blanking interval, the interval during which the backlight 1490 is turned off is extended by the length of the OFF interval of the encoded signal superimposed on the BL control signal. In other words, when the encoded signal is superimposed, the reference region is darker than before the encoded signal is superimposed.

However, in a region other than the reference region, for example, since the encoded signal is not superimposed during the blanking interval, this overlaps with the blanking interval, and the length of time the backlight 1490 is turned off is shorter than the reference region by the length of the OFF interval among the encoded signal intervals during which the encoded signals are not superimposed. In other words, in a region other than the reference region, for example, if the encoded signal is superimposed, there are instances where that region will become brighter than the reference region.

In order to improve this, two methods for establishing an adjustment interval during which the backlight 1490 is either turned on or turned off are conceivable. The first method is matching the total OFF intervals of the other regions to the total OFF interval of the reference region in order to make the total OFF interval of the reference region the longest. The second method is matching the total OFF intervals for all regions to a total OFF interval determined based on the original image signal.

[2.2.1 One Example of Operations Performed by Second Processor in Accordance with First Method]

First, operations performed by the second processor 1470 in accordance with the first method will be described with reference to FIG. 335 and FIG. 336.

FIG. 335 and FIG. 336 are timing charts illustrating the first method according to Example 2 of Embodiment 18. (a) in FIG. 335 illustrates the BL control signal corresponding to the reference region before superimposition of the encoded signal, and (b) in FIG. 335 illustrates the BL control signal corresponding to the reference region after superimposition of the encoded signal. (a) in FIG. 336 illustrates the BL control signal corresponding to a different region before superimposition of the encoded signal, and (b) in FIG. 336 illustrates the BL control signal corresponding to a different region after superimposition of the encoded signal.

More specifically, FIG. 335 illustrates an example of when the second processor 1470 superimposes the encoded signal on the BL control signal after adjusting the head (rise timing) of the encoded signal to the rise timing of the BL control signal of the reference region (time t12). FIG. 336 illustrates an example of when the second processor 1470 superimposes, on the BL control signal corresponding to a different region, an encoded signal in phase with the encoded signal superimposed on the BL control signal corresponding to the reference region.

In other words, FIG. 335 and FIG. 336 illustrate an example of when the second processor 1470 superimposes, on the BL control signals corresponding to the regions, encoded signals in phase with the other regions at the same time as the blanking interval of the reference region ends. Note that not superimposing the encoded signal during the blanking interval is a priority for the blanking intervals for each of the regions, similar to Example 1.

As illustrated in (b) in FIG. 335, in the reference region, other than the blanking interval B1 from, for example, time t11 to time t12, encoded signal OFF interval T1, which is the total OFF interval of the encoded signal during the encoded signal interval C1 from, for example, time t12 to time t14, is also present.

Thus, in the reference region illustrated in (b) in FIG. 335, when the duty of the encoded signal is used, the total OFF interval of the encoded signal in one frame from, for example, time t11 to time t13 (the encoded signal OFF interval) can be represented as encoded signal OFF interval T1=encoded signal interval C1×(1−Duty).

As illustrated in (b) in FIG. 335, in the reference region, since there is generally no interval in which the encoded signal interval C1 and the blanking interval B1 overlap, total OFF interval T2 for one frame=blanking interval B1+encoded signal OFF interval T1. In other words, the total OFF interval in the reference region longer than the other regions.

However, in a region other than the reference region, there is a chance that the encoded signal interval and the blanking interval will overlap. As described above, with respect to the blanking interval, the BL control signal takes priority over the encoded signal, so the encoded signal is not superimposed.

As such, as is illustrated in (b) in FIG. 336, in a region other than the reference region, in the encoded signal interval C1 between, for example, time t21 and time t24, the total OFF interval is shorter than that of the reference region by the length of the encoded signal OFF interval in the encoded signal interval C1 that overlaps with the blanking interval B2 between time t22 and time t23.

Here, when the interval of the encoded signal that overlaps with the blanking interval is B2, the total encoded signal OFF interval in the encoded signal interval C1 (the encoded signal OFF interval) can be represented as (encoded signal OFF interval)=(encoded signal interval C1−blanking interval B2)×(1−Duty).

As described above, when the total OFF interval for each region of the screen (display region) is different, the brightness of the regions is uneven, which reduces image quality.

Therefore, by operating according to the first method where an adjustment interval during which the backlight 1490 is either turned on or turned off is established, the second processor 1470 can match the total OFF intervals for the regions in the screen.

More specifically, the second processor 1470 matches the total OFF interval for the regions other than the reference region with the total OFF interval of the reference region in accordance with the first method, and establishes an adjustment interval for adjusting the difference in the regions other than the reference region with the total OFF interval per frame in the reference region. Note that as described above, in this example, it is presumed that the length of the blanking interval for each region is the same.

Here, in (b) in FIG. 336, the adjustment interval A1 from time t24 to time t26 is represented as blanking interval B2×(1−Duty). In other words, the adjustment interval in each region other than the reference region can be calculated from the blanking interval, encoded signal interval, and encoded signal phase of each region including the reference region. In (b) in FIG. 336, the adjustment interval is exemplified as being located in one frame between one frame from time t21 to time t25.

In this way, the display device 1400 according to this example causes the second processor 1470 to establish an adjustment interval according to the first method. With this, the display device 1400 can output encoded signals without greatly altering image quality, although the brightness of the screen (display region) as a whole decreases by a certain amount due to the superimposition of the encoded signals on the BL control signals.

Note that the second processor 1470 establishing the adjustment interval directly after the encoded signal interval is preferred because the adjustment interval can be stably located as close as possible to the blanking interval, during which change in phase of the liquid crystals of the display panel 1450 is great, but this is merely an example to which the placement of the adjustment interval should not be limited. The second processor 1470 may establish the adjustment interval up to the time when the next encoded signal is to be superimposed.

[2.2.2 One Example of Operations Performed by Second Processor in Accordance with Second Method]

Next, operations performed by the second processor 1470 in accordance with the second method will be described.

The adjustment interval during which the backlight 1490 is either turned on or off to adjust the total OFF interval generally can be defined as follows. When the original OFF interval of the backlight 1490 based on the image signal (the blanking interval and the black video interval) is T4, the total OFF interval of the encoded signal in an encoded signal interval not overlapping with the blanking interval among encoded signal intervals is T5, and the blanking interval after superimposition of the visible light communication signal is T6, the adjustment interval can be represented as T4-T5-T6. Note that, as previously described, the adjustment interval is preferably located as close as possible to the blanking interval.

For example, in the reference region, T5 can be calculated by first summing the totals of encoded signal OFF intervals in the encoded signal interval and then subtracting the totals of OFF intervals in the portion of the encoded signal overlapping the blanking interval.

Hereinafter, operations performed by the second processor 1470 in accordance with the second method will be described in detail with reference to FIG. 337A through FIG. 338D.

FIG. 337A through FIG. 338D are timing charts illustrating the second method according to Example 2 of Embodiment 18.

First, with reference to FIG. 337A through FIG. 337D, operations performed by the second processor 1470 with respect to establishing an adjustment interval according to the second method when the encoded signal interval and the blanking interval do not overlap will be described.

In FIG. 337A through FIG. 337D, the top half, as indicated by (a), illustrates the BL control signal before superimposition of the encoded signal, and the bottom half, as indicated by (b) through (e), indicates the (i) BL control signal after superimposition of the encoded signal and (ii) the BL control signal adjusted in accordance with the second method. In these figures, the blanking interval is indicated as B1 and the encoded signal interval is indicated as C1.

The method of adjusting the BL control signal superimposed with the encoded signal in accordance with the second method is separated into four different cases illustrated in FIG. 337A through FIG. 337D based on the relationship between (i) a sum (temporal sum) of the adjustment interval, the encoded signal interval, and the blanking interval and (ii) whether the adjustment interval is positive or negative. Hereinafter, each case will be described.

[Adjustment Method for when Encoded Signal Interval and Blanking Interval do not Overlap (Case 1)]

FIG. 337A illustrates an example where the adjustment interval is 0 or greater and (adjustment interval+encoded signal interval+blanking interval) is shorter than or equal to the length of one frame.

As illustrated in the top half of (b) in FIG. 337A, part of the adjustment interval starts at the end time P2 of blanking interval B1 and ends at the start time P3 of the encoded signal interval C1, and the remaining part of the adjustment interval is located after the encoded signal interval, preferably directly after the encoded signal interval (at time P5).

As a result of the second processor 1470 establishing the adjustment interval indicated in the top half of (b) in FIG. 337A, the BL control signal superimposed with the encoded signal is adjusted, as indicated in the bottom half of (b) in FIG. 337A.

In this way, the second controller 1480 turns off the backlight 1490 even after the blanking interval B1 until before the start of the encoded signal interval C1 in accordance with the adjusted BL control signal, and further turns off the backlight 1490 until an interval from the adjustment interval minus the interval from P2 to P3, during the encoded signal interval C1 and after the end of the encoded signal interval C1.

Note that when the adjustment interval is shorter than the interval from P2 to P3, the adjustment interval may be established between P2 and P3 only. Moreover, when P2=P3, the entire adjustment interval may be established after the end of the encoded signal interval C.

[Adjustment Method for when Encoded Signal Interval and Blanking Interval do not Overlap (Case 2)]

FIG. 337B illustrates an example where the adjustment interval is 0 or greater and (adjustment interval+encoded signal interval+blanking interval) is longer than the length of one frame.

As illustrated in the top half of (c) in FIG. 337B, part of the adjustment interval starts at the end time P2 of blanking interval B1 and ends at the start time P3 of the encoded signal interval C1, and the remaining part of the adjustment interval goes back from the end time P4 of one frame.

As a result of the second processor 1470 establishing the adjustment interval indicated in the top half of (c) in FIG. 337B, the BL control signal superimposed with the encoded signal is adjusted, as indicated in the bottom half of (c) in FIG. 337B.

In this way, the second controller 1480 turns off the backlight 1490 after the blanking interval B1 until the start time P3 of the encoded signal interval C1 in accordance with the adjusted BL control signal, and turns off the backlight 1490 from time P5 before the end of the encoded signal interval C1 until time P4. In other words, during the interval from time P5, which overlaps with the remaining adjustment interval and the encoded signal interval C1, to the end time P10 of encoded signal interval C1, the encoded signal is not superimposed on the adjusted BL control signal (or the signal is set to OFF) so as not to transmit the encoded signal.

Note that when P2=P3 (i.e., they are the same point in time), the entire adjustment interval may be established after the encoded signal interval.

[Adjustment Method for when Encoded Signal Interval and Blanking Interval do not Overlap (Case 3)]

FIG. 337C illustrates an example where the adjustment interval is less than 0 and (adjustment interval+encoded signal interval+blanking interval) is shorter than or equal to the length of one frame. Here, an adjustment interval less than 0 means an adjustment interval during which the backlight 1490 is turned on.

As illustrated in the top half of (d) in FIG. 337C, the adjustment interval is located from the end time P2 of the blanking interval B1 counting back by an amount of time corresponding to the absolute value of the adjustment interval (i.e., the adjustment interval is between time P6 and time P2).

As a result of the second processor 1470 establishing the adjustment interval indicated in the top half of (d) in FIG. 337C, the BL control signal superimposed with the encoded signal is adjusted, as indicated in the bottom half of (d) in FIG. 337C.

In this way, the second controller 1480 turns on the backlight 1490 during the interval from time P6 during the blanking interval B1 until time P2, based on the adjusted BL control signal.

Moreover, when P2=P3, the entire adjustment interval may be established after the encoded signal interval C1. Moreover, when the adjustment interval is longer than the blanking interval, taking into consideration the duty cycle of the encoded signal, the OFF interval may be set counting back from the end time of the encoded signal interval C1 until an amount of on-time required to supply the deficiency can be secured, without superimposing the encoded signal.

[Adjustment Method for when Encoded Signal Interval and Blanking Interval do not Overlap (Case 4)]

FIG. 337D illustrates an example where the adjustment interval is less than 0 and (adjustment interval+encoded signal interval+blanking interval) is longer than the length of one frame.

As illustrated in the top half of (e) in FIG. 337D, the adjustment interval is located from the end time P2 of the blanking interval B1 counting back by an amount of time corresponding to the absolute value of the adjustment interval (i.e., the adjustment interval is between time P7 and time P2). With this, the backlight 1490 is turned on during the interval from time P7 to time P2 in the blanking interval B1.

Note that regardless of the fact that the blanking interval and the encoded signal interval do not overlap and that the adjustment interval is negative, there are instance where the absolute value of the adjustment interval may be longer than the blanking interval. In this case, when the entire adjustment interval is located based on time P2 at the end of the blanking interval B1, time P7 is equal to or ahead of time P1, whereby the blanking interval is no longer present. When not all are to be turned on during the blanking interval and still some regions require the backlight 1490 to be turned on (some regions are required to be brightened), the backlight may be turned on during the OFF interval of the encoded signal of the encoded signal interval as the interval remaining after excluding the blanking interval portion of the adjustment interval. In other words, the remaining adjustment interval may be located from time P9 counting back (until time P8), and superimposition of the encoded signal may be skipped and turning-on of the backlight may be continued.

Here, time P8 needs to be determined because blanking interval B1 is equal to the total OFF interval during an interval obtained by subtracting the interval between time P8 and time P9 from the encoded signal interval C1. More specifically, time P8 can be calculated based on the relationship: blanking interval B1=(encoded signal interval C1−(time P9−time P8))×(1−Duty).

With this, the second processor 1470 can adjust the BL control signal such that the second controller 1480 causes the backlight 1490 to continue being on from time P8 to the start of the next blanking interval in addition to during the blanking interval B1.

Note that when P2=P3, the entire adjustment interval may be located after the encoded signal interval C1.

Next, with reference to FIG. 338A through FIG. 337D, operations performed by the second processor 1470 with respect to establishing an adjustment interval according to the second method when the encoded signal interval and the blanking interval overlap will be described.

In FIG. 338A through FIG. 338D, the top half, as indicated by (a), illustrates the BL control signal before superimposition of the encoded signal, and the bottom half, as indicated by (b) through (e), indicates the (i) BL control signal after superimposition of the encoded signal and (ii) the BL control signal adjusted in accordance with the second method. In these figures, the blanking interval is indicated as B1, the encoded signal interval is indicated as C1, and the interval from time Q1 to time Q6 is one frame.

The method of adjusting the BL control signal superimposed with the encoded signal in accordance with the second method is separated into four different cases illustrated in FIG. 338A through FIG. 338D based on the relationship between (i) a sum of the adjustment interval, the encoded signal interval, and the blanking interval and (ii) whether the adjustment interval is positive or negative. Hereinafter, each case will be described.

[Adjustment Method for when Encoded Signal Interval and Blanking Interval Overlap (Case 1)] FIG. 338A illustrates an example where the adjustment interval is 0 or greater and (adjustment interval+encoded signal interval+blanking interval) is shorter than or equal to the length of one frame.

As indicated by the top half of (b) in FIG. 7A, the adjustment interval is located based on the end time Q4 of the encoded signal interval C1.

As a result of the second processor 1470 establishing the adjustment interval indicated in the top half of (b) in FIG. 337A, the BL control signal is adjusted so as to not be superimposed with the encoded signal during the interval from time Q4 to time Q5, which is the adjustment interval, and the interval from time Q2 to time Q3, which overlaps with the blanking interval B1, as indicated in the bottom half of (b) in FIG. 338A.

In this way, the second controller 1480 turns off the backlight 1490 during the interval from time Q2 to time Q3, which overlaps with the blanking interval B1, and during the interval from time Q4 to time Q5 in accordance with the adjusted BL control signal. Note that during the period from time Q4 to time Q5, the backlight 1490 is turned off and encoded signals are not transmitted.

[Adjustment Method for when Encoded Signal Interval and Blanking Interval Overlap (Case 2)]

FIG. 338B illustrates an example where the adjustment interval is 0 or greater and (adjustment interval+encoded signal interval+blanking interval) is longer than or equal to the length of one frame.

As indicated in the top half of (c) in FIG. 338B, based on the start time Q6 of the encoded signal for the next frame and counting backwards, the adjustment interval is located between time Q8 and time Q6, which is the adjustment interval.

As a result of the second processor 1470 establishing the adjustment interval indicated in the top half of (c) in FIG. 338B, the BL control signal is adjusted so as to not be superimposed with the encoded signal during the interval from time Q8 to time Q6, which is the adjustment interval, and the interval from time Q2 to time Q3, which overlaps with the blanking interval B1, as indicated in the bottom half of (c) in FIG. 338B.

In this way, the second controller 1480 turns off the backlight 1490 during the interval from time Q2 to time Q3, which overlaps with the blanking interval B1, and during the interval from time Q8 to time Q6 in accordance with the adjusted BL control signal. Note that during the period from time Q8 to time Q6, the backlight 1490 is turned off and encoded signals are not transmitted.

[Adjustment Method for when Encoded Signal Interval and Blanking Interval Overlap (Case 3)]

FIG. 338C illustrates an example where the adjustment interval is less than 0 and (adjustment interval+encoded signal interval+blanking interval) is longer than or equal to the length of one frame.

As illustrated in the top half of (d) in FIG. 338C, the adjustment interval is located from the end time Q3 of the blanking interval B1 counting back by an amount of time corresponding to the absolute value of the adjustment interval.

As a result of the second processor 1470 establishing the adjustment interval indicated in the top half of (d) in FIG. 338C, the BL control signal is adjusted such that the backlight 1490 turns on during the interval from time Q9 to time Q3, which is the adjustment interval, and adjusted so as to not be superimposed with the encoded signal during the blanking interval B1, as indicated in the bottom half of (d) in FIG. 338C.

In this way, the second controller 1480 turns on the backlight 1490 during the interval from time Q9 until time Q3, in accordance with the adjusted BL control signal.

Note that the encoded signal may be superimposed during the adjustment interval. In this case, the adjustment interval may be elongated by the total encoded signal OFF interval. Furthermore, when the adjustment interval is longer than the blanking interval, based on the duty cycle of the encoded signal, the deficient on-time during the adjustment interval can be supplemented by turning on the backlight 1490 without superimposing the encoded signal during a predetermined period counting back from the end time of the encoded signal interval C1.

[Adjustment Method for when Encoded Signal Interval and Blanking Interval Overlap (Case 4)]

FIG. 338D illustrates an example where the adjustment interval is less than 0 and (adjustment interval+encoded signal interval+blanking interval) is longer than the length of one frame.

As illustrated in the top half of (e) in FIG. 338D, the adjustment interval is located from the end time Q3 of the blanking interval B1 counting back by an amount of time corresponding to the absolute value of the adjustment interval until time Q10.

With this, the backlight 1490 is turned on during the interval from time Q10 to time Q3 overlapping with the blanking interval B1.

Note that the adjustment interval may be elongated by the encoded signal total OFF interval, and the encoded signal may be superimposed during the adjustment interval.

Moreover, similar to (e) in FIG. 337D, when the adjustment interval is substantially long and the absolute value thereof is greater than that of the blanking interval B1, the backlight may be turned on during the OFF interval of the encoded signal of the encoded signal interval as the interval remaining after excluding the blanking interval B1 portion of the adjustment interval.

Here, time Q11 needs to be determined because the original blanking interval B1 is equal to the total OFF interval during an interval obtained by subtracting the interval between time Q11 and time Q12 from the encoded signal interval C1. More specifically, time Q11 can be calculated based on the relationship: blanking interval B1=(encoded signal interval C1−(time Q12−time Q11))×(1−Duty).

With this, the second processor 1470 can adjust the BL control signal such that the second controller 1480 causes the backlight 1490 to continue being on from time Q11 to the start time Q7 of the next blanking interval in addition to during the blanking interval B1.

[2.2.3. Advantageous Effects Etc.]

As described above, with this example, backlight control methods for improving video characteristics such as backlight scanning and transmission of visible light communication signals using the backlight can both be achieved by performing adjustment that equalizes the OFF intervals by the visual light communication encoded signals or reverts the OFF interval to that of the original image signal.

Here, for example, in the display device according to this example, when superimposing the visible light communication signals on the backlight control signals, if the regions include a region whose backlight control signal indicates an OFF state of the backlight in an interval that overlaps an interval of the visible light communication signal being superimposed, the signal processor (the second processor 1470) may establish a ON adjustment interval for the region with overlapping intervals and adjust ON/OFF of the backlight control signal during the ON adjustment interval, the ON adjustment interval being for adjusting brightness of the region with overlapping intervals.

With this, by establishing the adjustment interval in a region in which the visible light communication signal interval and the backlight OFF interval overlap, when the visible light communication signals (encoded signals) are superimposed on the BL control signals, differences in brightness across the display region are less perceivable.

Note that in this example, the reference region is described as a “bright” region, but this may be interpreted as a region in which the aperture of the display panel 1450 is set to a large value.

Example 3 of Embodiment 18

[2.3.1 One Example of Operations Performed by Second Processor in Accordance with Second Method]

In Example 2, the brightness of the display screen 1410 (display region) of the display panel 1450 is equalized by establishing an adjustment interval during which the backlight 1490 is either turned on or off, but this is merely one example.

In this example, a method with which an adjustment interval is not established will be described with reference to FIG. 339.

FIG. 339 is a timing chart illustrating a method according to Example 3 of Embodiment 18 of superimposing visible light communication signals on BL control signals. Here, in (a) in FIG. 339, the BL control signal for a predetermined region is shown. Note that in this example, signal detection is performed only with rising waveform signals.

As illustrated in FIG. 339, without establishing an adjustment interval, the duty cycle of the visible light communication signal for only the portion corresponding to the adjustment interval—i.e., the high interval of the signal—may be varied to adjust the brightness of the region.

More specifically, for example, when the adjustment interval in Example 2 is positive—i.e., when the adjustment turns off the backlight 1490—the high interval of the BL control signal may be shortened as illustrated in (b) in FIG. 339.

More specifically, for example, when the adjustment interval in Example 2 is negative—i.e., when the adjustment turns on the backlight 1490—the high interval of the BL control signal may be lengthened as illustrated in (c) in FIG. 339.

Note that varying the duty cycle of the BL control signal for each region in the display region is also conceivable. In this case, in order to drive the BL control signals at a constant duty cycle in the screen, a mixture of the adjustment interval in Example 2 recalculated to include the duty cycle variation and the method of varying the high interval of the visible light communication signals according to this example may be used.

Furthermore, in the above description, a uniform brightness across the screen and prevention of a decrease in image quality are achieved by performing brightness control utilizing control (PWM (pulse width modification) control) of the high interval of the backlight 1490, but this is merely an example. The second controller 180 that controls the backlight may approximate the brightness of the visible light communication regions to the brightness of the other regions by controlling the current supplied to the backlight 1490 of each region. Furthermore, the brightness of the visible light communication regions may be approximated to the brightness of the other regions with a combination of the PWM control of the backlight 1490 and the electrical current control.

[2.3.2. Advantageous Effects Etc.]

As described above, with this example, backlight control methods for improving video characteristics relating to backlight scanning and transmission of visible light communication signals using the backlight can both be achieved by performing adjustment that equalizes the OFF intervals by the visual light communication encoded signals or reverts the OFF interval to that of the original image signal.

Note that in this example, it is described that signal detection is performed only with rising signals, but this is merely an example. When the BL control signal maintains the position of the fall of the waveform and changes the position of the rise of the waveform, signal detection may be performed with a falling signal. In this example, the encoded signals are superimposed using the rise of the BL control signals as a reference, but the timing at which the encoded signals are superimposed may be based on other characteristics of the BL control signals such as the fall of the BL control signals, and may be based on a synchronization signal of the image signal itself. Moreover, a signal of the synchronization signal of the image delayed by a certain amount of time may be generated, and that signal may be used as a reference.

[3. Advantageous Effects Etc.]

This embodiment provides a display device capable of outputting visible light communication signals without significantly deteriorating the quality of the display image, and capable of reducing reception error of output visible light communication signals.

Embodiment 19

In Embodiment 18, operations performed by the display device 1400 when the encoded signal interval is shorter than the BL control signal ON interval are described. In this embodiment, operations performed by the display device 1400 when the encoded signal interval is longer than the BL control signal ON interval will be described.

[1. Display Device Operations]

The following description will focus on operations performed by the second processor 1470.

FIG. 340 is a flow chart illustrating operations performed by the second processor according to Embodiment 19.

First, in step S1301, the second processor 1470 re-encodes the visible light communication signal. More specifically, after the second processor 1470 encodes the visible light communication signal, the second processor 1470 generates (re-encodes) the encoded signal added with a header, for example. Moreover, the second processor 1470 calculates the transmission time for the encoded signal based on the carrier frequency of the encoded signal.

Next, in step S1302, the second processor 1470 determines whether the length of the encoded signal is greater than the BL control signal ON interval (the time during which the backlight is turned on, i.e., the ON duration).

More specifically, the second processor 1470 compares the time during which the backlight 1490 is turned on (the ON duration) based on the BL control signal duty cycle calculated by the first processor 1430 against the transmission time for the encoded signal (encoded signal length). When the second processor 1470 determines that the transmission time for the encoded signal is shorter (No in S1302), the process proceeds to step S1306, and when the second processor 1470 determines that the transmission time for the encoded signal is longer (Yes in S1302), the process proceeds to step S1303.

Next, in step S1303, the second processor 1470 determines whether to perform visible light communication. When the second processor 1470 determines to perform visible light communication (Yes in S1303), the process proceeds to step S1304, and when the second processor 1470 determines to not perform visible light communication (No in S1303), the process proceeds to step S1309.

Next, in step S1304, the second processor 1470 re-encodes the visible light communication signal. More specifically, the second processor 1470 generates the signal (re-encodes the visible light communication signal) such that the signal duty cycle of the header is for the most part OFF when the signal is encoded with a signal array such that it is inconceivable that the data in the header is the payload. Next, the second processor 1470 advances the encoded signal transmission start time such that the timing of the rise of the BL control signal matches the final signal in the header (the signal indicating an ON state at the final edge of the header). Note that further detailed description is omitted.

Next, in step S1305, the second processor 1470 determines whether the length of the encoded signal is greater than the BL control signal ON interval (the ON duration).

More specifically, the second processor 1470 compares the ON duration of the backlight 1490 based on the BL control signal duty cycle against the encoded signal transmission time. Then, when the second processor 1470 determines that the encoded signal transmission time is shorter (No in S1305), the process proceeds to step S1306, and when the second processor 1470 determines that the encoded signal transmission time is longer (Yes in S1305), the process proceeds to step S1307.

Here, in step S1306, the second processor 1470 superimposes the encoded signal on the part of the BL control signal other than the blanking interval part (in other words, the ON interval of the BL control signal, outputs it to second controller 1480, and ends the process.

On the other hand, in step S1307, the second processor 1470 determines whether to divide the encoded signal. More specifically, the second processor 1470 compares the transmission time of the re-encoded encoded signal against the ON duration of the backlight 1490. Then, when the encoded signal transmission time is longer, the second processor 1470 determines to divide the encoded signal (Yes in S1307) and proceeds to step S1308, and when the encoded signal transmission time is shorter, the second processor 1470 determines to not divide the encoded signal (No in S1307) and proceeds to step S1309.

Next, in step S1308, the second processor 1470 divides the encoded signal to achieve a data length that fits in the ON duration of the backlight. The second processor 1470 then adjusts the encoded signal such that the encoded signal is superimposed on a part of the backlight control signal other than the blanking interval (i.e., the BL control signal ON interval), and ends the process.

Note that in step S1309, the second processor 1470 does not transmit the encoded signal to the second controller 1480. In other words, transmission of the visible light communication signal is cancelled.

[2. Operation Details]

Hereinafter, details regarding (i.e., a specific example of) operations performed by the display device 1400 according to Embodiment 19 will be described with reference to FIG. 341A through FIG. 341D and FIG. 342.

2.1. Specific Example 1

FIG. 341A through FIG. 341D illustrate a specific method for superimposing encoded signals on BL control signals according to Embodiment 19.

In this embodiment, the second processor 1470 encodes visible light communication signal using an encoding method such as 4 PPM or inverted-4 PPM. Significant variations in brightness due to the signal can be relatively mitigated by encoding using 4 PPM or inverted-4 PPM, making it possible to avoid instability in brightness. Note that the visible light communication signals may be encoded using, for example, Manchester encoding.

For example, as illustrated in FIG. 341A, the encoded signal includes a header 1310 and a payload 1311 in which code, for example, is stored. The header 1310 is assumed to include a signal array inconceivable for data signals. Here, when encoding using inverse-4 PPM, in principle, the high interval accounts for 75% of the signal interval. Moreover, ON states are generally input into the header in three continuous slots or more (three slots being the smallest unit of the encoded signal). The header also generally ends in an OFF state at the separation point of the header.

FIG. 341B illustrates a case where the encoded signal interval is shorter than the BL control signal ON interval. In other words, as illustrated in FIG. 341B, when the entire encoded signal including the header is shorter than the interval excluding the blanking interval in one frame of the BL control signal (i.e., the BL control signal ON interval), the encoded signal can be superimposed in the BL control signal ON interval with no problem.

However, when the encoded signal interval is longer than the BL control signal ON interval, the entire encoded signal including the header cannot be included in the BL control signal ON interval, so the encoded signal is divided and included in the BL control signal ON interval, as described above with regard to step S1307.

FIG. 341C illustrates an example of when the encoded signal is divided and superimposed in the BL control signal ON interval due to the entire encoded signal including the header exceeding the length of one frame of the BL control signal. More specifically, the payload 1311 of the encoded signal is divided into a payload 1311-1 and a payload 1311-2, included with a header 1310 and a header 92, and superimposed in the BL control signal ON interval. The header 92 includes a discriminant signal indicating that the payload 1311-2 is divided from payload 1311 and the payload 1311-2 follows the payload 1311-1.

Note that when the encoded signal interval is longer than the BL control signal ON interval, only the header 1310 may be superimposed in the BL control signal blanking interval and the payload 1311 may be superimposed in the BL control signal ON interval, as illustrated in FIG. 341D.

2.2. Specific Example 2

Next, an aspect different from that shown in FIG. 341D will be described. More specifically, a specific example where only the header of the encoded signal is superimposed in the BL control signal blanking interval if the encoded signal interval is longer than the BL control signal ON interval will be described.

FIG. 342 illustrates a specific method for superimposing encoded signals on BL control signals according to Embodiment 19.

(a) in FIG. 342 illustrates an encoded signal encoded using inverse-4PRM.

As illustrated in (b) in FIG. 342, the header from (a) in FIG. 342 may be re-encoded using 4 PPM instead of inverse-4 PPM. In this case, as illustrated in (b) in FIG. 342, the header has been changed from an ON state leading into an OFF state to an OFF state leading into an ON state.

Then, as illustrated in (c) in FIG. 342, the encoded signal illustrated in (b) in FIG. 342 is superimposed on the BL control signal. In the example illustrated in (c) in FIG. 342, an encoded signal including the header 1330, which is a signal of an OFF state, the header 1321, which is a signal of an ON state, and the payload 1322 is superimposed on the BL control signal.

More specifically, the second processor 1470 encodes the visible light communication signals to generate encoded signals and superimposes the encoded signals, as the visible light communication signals, on the backlight control signals, and when superimposing the encoded signals on the backlight control signals, if the regions include a region whose backlight control signal indicates an OFF state of the backlight in an interval that overlaps an interval of the encoded signal being superimposed, a header portion of the encoded signal is superimposed on the backlight control signal during the interval indicating an OFF state of the backlight 1490, and a portion of the encoded signal other than the header portion is superimposed on the backlight control signal during an interval other than the interval indicating an OFF state of the backlight.

With this, even when the encoded signal interval is longer than the BL control signal ON interval, the payload of the encoded signal can be superimposed in the BL control signal ON interval.

In other words, for example, as illustrated in (c) in FIG. 342, by superimposing the header 1330, which is a signal of an OFF state, during the BL control signal blanking interval, the encoding time can be reduced.

Note that when the adjustment interval described in Embodiment 18 is established, an interval during which the header 1310 of the encoded signal illustrated in, for example, FIG. 341D is superimposed in the BL control signal blanking interval and the backlight is turned on during the blanking interval needs to be subtracted from the adjustment interval.

However, as illustrated in (c) in FIG. 342, for example, when the end time of the header 1330 of the encoded signal (the point in time of the final ON state) is synchronized with the end time of the blanking interval and the phase is determined, the backlight is not turned on during the blanking interval, so there is no need to subtract from the adjustment interval.

[3. Advantageous Effects Etc.]

This embodiment provides a display device capable of outputting visible light communication signals without significantly deteriorating the quality of the display image, and capable of reducing reception error of output visible light communication signals.

Note that in this embodiment, an example of using the header of the encoded signal encoded using a typical 4 PPM encoding method is given, but this is merely an example. For example, when the average duty cycle of the header of the encoded signal is high, a header in which the ON signals and OFF signals have been reversed may be superimposed in the blanking interval. In this case, as previously described, adjustment in which the decrease in the OFF interval of the blanking interval is inserted into the adjustment interval is preferable.

Moreover, when the entire encoded signal including the header can be superimposed in the BL control signal ON interval (i.e., in the ON duration of the backlight 1490), encoding may be performed such that the duty cycle of the header increases.

Moreover, even when the header is superimposed in the blanking interval, there are cases when the header will not fit in the blanking interval due to the length of the blanking interval. In this case, different types of headers may be prepared and used in accordance with the length of the blanking interval.

Embodiment 20

In this embodiment, a method of dividing the plurality of regions of the display region into groups and superimposing the encoded signal so that it is possible to superimpose the entire encoded signal interval of the encoded signal in the BL control signal ON interval will be described.

[1. Second Processor Operations]

Hereinafter, an example will be given of a method of determining a time at which to superimpose the encoded signal about the brightest region, based on region brightness.

FIG. 343 is a flow chart illustrating operations performed by the second processor according to Embodiment 20.

First, in step S1311, the second processor 1470 encodes the visible light communication signal. More specifically, after the second processor 1470 encodes the visible light communication signal, the second processor 1470 generates the encoded signal added with a header, for example. Moreover, the second processor 1470 calculates the transmission time for the encoded signal based on the carrier frequency of the encoded signal.

Next, in step S1312, the second processor 1470 divides the display region into a plurality of regions.

Next, in step S1313, the second processor 1470 divides the display region into a plurality of regions. More specifically, the second processor 1470 detects the brightness of each of the regions, and based on the result, selects the brightest region with respect to display. Here, brightness with respect to display means the brightest place with respect to signal level indicating light emission energy of the image, and not a place where the BL control signal duty cycle is large. Detection of the bright location will be described in detail later.

Next, in step S1314, the second processor 1470 matches the phase of the encoded signal to that of the bright region with respect to display. More specifically, the second processor 1470 superimposes an in-phase encoded signal on a BL control signal corresponding to all regions in time with the BL control signal of the brightest region, or corresponding to a portion of selected regions (a plurality of selected regions).

However, similar to other embodiments, the encoded signal is not superimposed in the blanking interval of the BL control signal. This is equivalent to operations of AND calculations for each BL control signal and the encoded signal. Note that step S1301 through step S1309 in FIG. 340 may be performed as necessary.

Next, in step S1315, the second processor 1470 determines whether the encoded signal and the blanking interval overlap. More specifically, the second processor 1470 determines whether part of the encoded signal interval and the blanking interval of the BL control signal overlap on a per region basis, and when the encoded signal interval and the blanking interval of the BL control signal do not overlap (Yes in S1315), the process proceeds to step S1316, where the second processor 1470 superimposes the encoded signal on the BL control signal and ends the processing. When there is an overlapping portion (No in S1315), the process proceeds to S1317.

In step S1317, the second processor 1470 determines whether to perform visible light communication. When the second processor 1470 determines to not perform visible light communication (No in S1317), the process proceeds to step S1318. When the second processor 1470 determines to perform visible light communication (Yes in S1317), the process proceeds to step S1320, where the second processor 1470 adjusts the duty cycle such that the encoded signal is not transmitted, and ends the processing.

Next, in step S1318, the second processor 1470 changes the phase of the encoded signal, and superimposes the encoded signal with the changed phase on the BL control signal.

Next, in step S1319, the second processor 1470 determines whether the blanking interval overlaps a bright region or not. When the second processor 1470 determines that the blanking interval does not overlap a bright region (No in S1319), the process proceeds to step S1320. When the second processor 1470 determines that the blanking interval does overlap a bright region (Yes in S1319), the process proceeds to step S1321.

Next, in step S1321, the second processor 1470 determines whether processing has been performed for all regions. When the second processor 1470 determines that processing has not been performed for all regions (No in S1321), the process returns to step S1315. When the second processor 1470 determines that processing has been performed for all regions (Yes in S1321), the process proceeds to step S1322.

Next, in step S1322, the second processor 1470 determines whether there is a region for which no encoded signal has been superimposed. When the second processor 1470 determines that there is no region for which no encoded signal has been superimposed (No in S1322), the process returns to step S1313. When the second processor 1470 determines that there is a region for which no encoded signal has been superimposed (Yes in S1322), the process ends.

[2. Operation Details]

Next, details regarding (i.e., a specific example of) the display device 1400 according to Embodiment 20 will be described with reference to FIG. 344 and FIG. 345.

FIG. 344 is a timing chart of one example of the division of the regions into groups according to Embodiment 20, and FIG. 345 is a timing chart of another example of the division of the regions into groups according to Embodiment 20. In FIG. 344 and FIG. 345, the shaded (hatched) portions indicate the intervals in which the encoded signals are interposed (i.e., the encoded signal intervals).

For example, as illustrated in FIG. 344, the regions of the display region are divided into three groups. More specifically, region A, region B, and region C are divided into group G1; region F, region G, and region H are divided into group G2; and region D and region E are divided into group G3. Then, as illustrated in FIG. 344, the encoded signals are superimposed in each group, at the same time in the same interval. For example, in group G1, superimposition is performed using the brightest region—region C—as a reference, and in group G2, superimposition is performed using the brightest region—region E—as a reference.

Note that, as illustrated in FIG. 345, the regions of the display region may be divided into two groups. In other words, region A, region B, region C, and region D may be divided into group G1, and region E, region F, region G, and region H may be divided into group G2. Then, the encoded signals are superimposed in each group, at the same time in the same interval.

[3. Advantageous Effects Etc.]

In this way, with the display device according to this embodiment, the signal processor (the second processor 1470) superimposes the visible light communication signals on the backlight control signals corresponding to groups of neighboring regions among the regions, the visible light communication signals superimposed on the backlight control signals in the same group are in phase with one another, and for each group, corresponding visible light communication signals are superimposed in entirety in an interval during which control of light emission of the backlight (1490) based on the backlight control signals corresponding to the groups is performed.

With this, since the display device can superimpose the entirety of the encoded signals for the encoded signal intervals during the BL control signal ON intervals, reception error of output visible light communication signals can be reduced. Stated differently, since the visible light communication signals can be superimposed without loss of data in the BL control signal ON intervals, reception error of output visible light communication signals can be reduced.

Moreover, based on the backlight control signal corresponding to a predetermined region among the groups, the signal processor (the second processor 1470) may match phases of the visible light communication signals superimposed on the backlight control signals corresponding to the groups.

With this, for each of the selected groups, the display device can output the visible light communication signal with less loss of data.

Here, the predetermined region is the brightest region among the regions.

With this, the display device 1400 can make the difference in brightness across the display region less perceivable.

Moreover, among the visible light communication signals superimposed on the backlight control signal phases corresponding to the groups, a visible light communication signal superimposed on a backlight control signal corresponding to a first group among the groups and a visible light communication signal superimposed on a backlight control signal corresponding to a second group among the groups are out of phase.

With this, for each of the selected groups, the display device 1400 can output the visible light communication signal with less loss of data.

Note that there are instances where the regions cannot be divided into groups, as described above. In other words, there are instances where there are regions in which in-phase encoded signals cannot fit even when the regions are divided into groups. Operations performed in this case are described hereinafter.

FIG. 346 is a timing chart of another example of the division of the regions into groups according to Embodiment 20. In FIG. 346, the shaded (hatched) portions indicate the intervals in which the encoded signals are interposed (i.e., the encoded signal intervals).

For example, the example illustrated in FIG. 346 is a special example of FIG. 344 and FIG. 345. As illustrated in FIG. 346, after the regions have been divided into groups, when there is an in-phase encoded signal that cannot fit, transmission of the encoded signal may be cancelled.

More specifically, region A, region B, region C, and region D are divided into one group, and all other regions are divided into another group, and encoded signals in phase with one another are superimposed in region A, region B, region C, and region D. Here, in region D, the encoded signal is not superimposed in the overlapping interval of the encoded signal and the blanking interval. Furthermore, in the example illustrated in FIG. 346, encoded signals are not superimposed in the regions after region D (i.e., regions E through H).

Note that when there are regions in which in-phase encoded signals cannot fit even when the regions are divided into groups, a reference region may be designated, and the encoded signals may be superimposed only in regions surrounding the reference region (i.e., regions neighboring the reference region). In this case, the range of the superimposition of the encoded signals may be determined based on previously described flow charts, and may be limited to a predetermined range.

Moreover, the above-described adjustment interval may be established to prevent brightness difference between regions in which the encoded signals are superimposed and regions in which the encoded signals are not superimposed, as well as within the region in which the encoded signals are superimposed.

Note that in this embodiment, the encoded signals are superimposed using the rise of the BL control signals as a reference, but the timing at which the encoded signals are superimposed may be based on other characteristics of the BL control signals such as the fall of the BL control signals, and may be based on a synchronization signal of the image signal itself. Moreover, a signal of the synchronization signal of the image delayed by a certain amount of time may be generated, and that signal may be used as a reference.

In all regions of the display region, searching for intervals which are not blanking intervals is very difficult, and even if there is such an interval, it is significantly short. In the present disclosure, even when the encoded signals are superimposed on the BL control signal, by giving the blanking interval as much priority as possible, loss of image quality is avoided by controlling the turning on of the backlight during the blanking interval.

However, even if the blanking interval and the encoded signal interval do not overlap in a given region, most of the time there are other regions in which the blanking interval and the encoded signal interval do overlap.

As such, in this embodiment, a method is disclosed for avoiding overlapping of the blanking interval and the encoded signal interval in as many regions as possible among the regions of the display region. In other words, in this embodiment, the regions are divided into groups, and in each group, the encoded signals are superimposed at a given phase. With this, overlapping of the blanking interval and the encoded signal in the groups can be reduced.

Note that in this embodiment, examples are given in which the groups are divided into two or three groups, but these are merely examples.

Moreover, regarding the method of dividing the regions into groups, the regions into a predetermined number of groups, and how the phase will be shifted, for example, may be set in advance.

Moreover, in this embodiment, the regions are divided into groups in such a manner that the length of the encoded signal (i.e., the entirety of the encoded signal interval) can be superimposed based on the bright region, but this is merely an example. Since dividing the regions into groups based on this may yield a large number of groups, the number of groups may be limited. Regarding the division of the regions into groups, it is not necessarily required for the entirety of the encoded signal interval to be superimposable.

Moreover, the encoded signals superimposed in the regions in each group may be the same or may be different. Note that when the encoded signal obtained on the receiver side is composed of two or more signals mixed together, the chance of a false recognition or error increases. Here, "two or more signals" means when different encoded signals are received by the same receiver at the same time, two or more of the same encoded signals that are out of phase are received by the same receiver at the same time, or a combination thereof. With this, the chance of a false recognition or error can be reduced.

Moreover, division of groups based on some reference is not limited to the example described above; the second processor 1470 may divide the groups based on a signal processing result based on the relationship between the image signal and the encoded signal.

Moreover, with a backlight that uses, for example, LEDs, since the light sources are substantially small (nearly spots of light), in order to light up the screen like in a LCD, a light guide plate or a diffuser panel is used to spread the region. As such, when controlling the LEDs in each region, adjacent regions are designed to overlap one another, and leak light of a certain amount of more is present.

Thus, with a backlight that uses LEDs, for example, even when dividing the regions into groups, since a different signal bleeds in as noise from leak light from at least adjacent regions, there is a need to avoid encoded signals of regions including adjacent blocks temporally overlapping. As such, for example, encoded signals are not transmitted in that frame at that location, or temporally consecutive or overlapping encoded signals in a different region may be transmitted.

When encoded signals are not transmitted in that frame at that location, a region from which to output the encoded signal may be determined on a per frame basis. Alternatively, an encoded signal from a specified location (linked to the image signal) may be preferentially transmitted.

Moreover, when transmission intervals of out of phase encoded signals from different regions overlap one another, this is acceptable so long as the regions are not continuous or a given interval is between them. When limiting the region and receiving the signals, this is acceptable because the signals are receivable. Note that the interval between out of phase regions must be determined based on the range of the light of the backlight leaking, and thus is a numerical value that changes depending on the characteristics of the display device used.

Moreover, each of the regions may be divided into blocks, and the above method may be applied to the blocks.

Embodiment 21

When using a light intensity sensor with a substantially fast response time, such as a photodiode, to receive the encoded signals, the phase difference between the image and the encoded signal is not very problematic.

However, when the encoded signal is imaged and obtained using an image sensor such as a smartphone or cellular phone camera or a digital still camera, due to a slight phase difference, the exposure timing and the ON-OFF edge of the signal or the timing of the start and/or the end of sequential encoded signal intervals are off by a slight difference in time or occur at the same time, which can cause a useful signal to be unobtainable. In other words, since a typical imaging cycle for an image sensor is 30 FPS, when a 60 FPS image signal is synchronized with an encoded signal, for example, if the timing of the encoded signal cycle is not synchronized with the timing of the imaging by the image sensor, the timing of the imaging cycle and the encoded signal cycle will never match.

Thus, in this embodiment, in order to avoid the above, a method of shifting the phases of the encoded signals will be described.

[1. Display Device Operations]

The following description will focus on operations performed by the second processor 1470.

FIG. 347 is a flow chart illustrating operations performed by the second processor according to Embodiment 21.

First, in step S1331, the second processor 1470 shifts the synchronization of the signal. More specifically, the second processor 1470 shifts the synchronization of the encoded signal when the synchronization of the display panel 1450 and the backlight 1490 is not fixed. This is effective in increasing the probability of successful imaging by the smartphone 1350.

Next, in step S1332, the second processor 1470 calculates the AND of the BL control signal and the encoded signal from the duty cycle based on the image signal output by the first processor 1430.

Next, in step S1333, the second processor 1470 adjusts the duty cycle based on at least one of the image signal and the visible light communication signal.

More specifically, the second processor 1470 finds out whether the encoded signal interval and the blanking interval overlap one another and establishes an adjustment interval accordingly, as described in Embodiment 18. When the duty cycle of the BL control signal for a frame is different from the duty cycle of the BL control signal based on the original image signal by an amount equivalent to the adjustment interval, the second processor 1470 adjusts the duty cycle using, for example, an interval in which transmission of the encoded signal is stopped. Here, for example, the second processor 1470 adjusts the duty cycle by setting the interval during which the backlight 1490 is turned off (the OFF interval of the BL control signal) to an interval other than the blanking interval. Then, the second processor 1470 outputs to the second controller 1480 the BL control signal superimposed with the encoded signal adjusted by establishment of the adjustment interval.

Note that when the phase relationship of the encoded signal and the image signal return to the original relationship after a certain interval, the signals may be corrected to a predetermined phase difference.

Furthermore, so long as the phase of the encoded signal and the phase of the image signal change temporally at a frequency other than the frequency of the image signal—that is to say, one is not equal to approximately the integer multiple of the other—there is no particular need to perform phase matching control. This is because, even if the two phases are not matched in particular, after a certain amount of time passes, the relationship between both phases will return to the original state, whereby at some point in time there will be a time period in which signal reception is difficult and a time period in which signal reception can be done without complication.

FIG. 348A and FIG. 348B illustrate the relationship between the phases of the BL control signal and the visible light communication signal according to Embodiment 21.

For example, in FIG. 348A, using BL control signal X as a reference, it can be seen that the encoded signal based on the visible light communication signal and the BL control signal X become in-phase at a certain interval. Note in the figures, the diagonal line portions indicate intervals in which the encoded signal is actually transmitted, and as one example, the encoded signal is output at a longer cycle than the BL control signal and in shorter intervals than the BL control signal, but the relationship between signal lengths is such that one is longer than the other, as previously described. Moreover, it is not required that one of the actual transmission interval of the encoded signal and the length of the BL control signal is not long, but the encoded signal transmission interval is preferably shorter than the BL control signal. Here, the encoded signal repeats 7 times in the interval during which the BL control signal X repeats 12 times, and when the BL control signal is 60 fps, for example, both are in-phase at intervals of 0.2 seconds. However, as illustrated in FIG. 348B, there is no particular correlation between the BL control signal X and the encoded signal, but the phase relationship between the start of the transmission interval of the encoded signal and the start of a BL control signal per frame changes. For example f1 is located in the first half of a BL control signal, f2 is located at the second half of a BL control signal, and f3 is located roughly in the middle of a BL control signal. However, although the two have a least common multiple and the phase relationship will not return to the original state, since the phases gradually shift, error due to imaging timing can be avoided at somewhere along the line. Moreover, although the encoded signal is cut-off midway in region×at points f2, at which the encoded signal is transmitted in the interval falling on the segue of the BL control signal, and f5, this is not a problem since the encoded signal can be transmitted in a different region without fail. The correlation between the video and the communication information is saved in a buffer, for example, and the previously written data is read, encoded as a communication signal and used. Moreover, when the time it takes for the phase relationship of both to return to the original relationship is substantially long (for example, a few seconds or longer), the phase relationship may be forcefully reset to the original relationship. For example, time is provided between the end of the encoded signal at f8 and f9 in FIG. 348B. The phases of the BL control signal and the encoded signal may or may not be resynchronized during this time. Moreover, the cycle for synchronizing them can be every one second, for example, or can be skipped.

[2. Operation Details]

Next, details regarding (i.e., a specific example of) operations performed by the display device 1400 according to Embodiment 20 will be described with reference to FIG. 349A, FIG. 349B and FIG. 349C.

FIG. 349A, FIG. 349B, and FIG. 349C are timing charts illustrating operations performed by the second processor according to Embodiment 21. The shaded (hatched) portions indicate regions where encoded signals are present. FIG. 349A illustrates a timing change for the BL control signals before superimposition of the encoded signals, and FIG. 349B illustrates a timing chart for the BL control signals after superimposition of the encoded signals. FIG. 349C illustrates an example of when the relationship between the phases of the backlight control signal and the visible light communication signal is temporally changed by setting a delay time from the point in time of the rise or fall of the backlight control signal, which is used as a reference for the encoded signal.

For example, as illustrated in FIG. 349A, the synchronization of the encoded signal and the BL control signal is shifted. With this, on the reception side, such as at the smartphone 1350, timing at which reception of the encoded signal is possible can be achieved with certainty. Here, the above-described adjustment interval may be calculated per phase difference in each frame and established.

Note that, for example, using region A as a reference, the time difference β1 between the rise U2 of the backlight control signal and the start V2 of the visible light communication signal may be set as the delay time in advance and superimposition may be performed, as illustrated in FIG. 349C. Moreover, with regard to the time difference β2 between the rise U3 and the start V3 of the visible light communication signal in the next frame, the same operations may be performed as with β1 or different operations may be performed. Moreover, in the example illustrated in FIG. 349C, β represents a positive numerical value of delay (time), but may represent a negative value (time) as well.

Moreover, a frame where β=0 maybe mixed in. The region to be used as a reference may be any region, and may be selected based on the above described criteria. The reference time is described as being the rise of the backlight control signal, but the reference time may be the fall or any other waveform characteristic. Moreover, other than a characteristic portion of a backlight control signal in a predetermined region, a synchronization signal of the image signal itself may be used as a reference and, alternatively, a signal of the synchronization signal of the image delayed by a certain amount of time may be generated, and that signal may be used as a reference.

Moreover, in this embodiment, since the image signal and the encoded signal do not correspond on a one-to-one basis, various encoding data and imaging data may be buffered in advance in memory (not shown in the drawings) in the display device 1400 before performing the above processing.

Note that the cycle (one frame length) of the image signal and the cycle on which the encoded signal is superimposed preferably have a least common multiple within one second, and further preferably within 0.5 seconds. Moreover, when these two cycles synchronize, tracking may be performed from the time of synchronization on a cycle equivalent to a least common multiple or an integer multiple, and the minute temporal offset (phase difference) resulting from the margin of error may be corrected.

Moreover, as described above, when the cycle and/or frequency of the image signal and the cycle and/or frequency of the encoded signal have a relationship that changes the temporal phase relationship thereof, even if each cycle does not include a least common multiple within one second, if the rate of change is fast—for example, when the above change that repeats the same phase relationship can be achieved within one second—there is no particular need to control the relationship between the two phases. Regarding the rate of change, a relationship such as the one described hereinafter is preferable, but is merely an example.

[3. Advantageous Effects Etc.]

As described above, in the display device according to this embodiment, the signal processor (the second processor 1470) temporally changes a delay time of encoding the visible light communication signals (encoded signals) on the backlight control signals corresponding to the regions, based on one backlight control signal corresponding to a given region among the regions.

With this, on the reception side, such as at the smartphone 1350, timing at which reception of the encoded signal is possible can be achieved with certainty.

Note that the signal processor (the second processor 1470) may superimpose the visible light communication signals (encoded signals) on the backlight control signals on a different cycle than a cycle of the backlight control signals, and in each of the regions a relationship between a phase of the backlight control signal and a phase of the visible light communication signal may change with a change in frames.

Here, the cycle of the backlight control signals and the different cycle on which the visible light communication signals are superimposed may change temporally.

Moreover, the visible light communication signals to be superimposed on the backlight control signals may be in phase with one another across all regions in which the visible light communication signals are superimposed.

Moreover, a phase-shift cycle of the visible light communication signals superimposed on the backlight control signals corresponding to the regions and a cycle of one frame of the backlight control signals may have a least common multiple within one second, inclusive.

With this, on the reception side, such as at the smartphone 1350, timing at which reception of the encoded signal is possible can be achieved with certainty in a relatively short period of time.

Moreover, the signal processor (the second processor 1470) may correct a start of a phase-shift cycle of the visible light communication signals (encoded signals) superimposed on the backlight control signals corresponding to the regions to a cycle of one frame of the backlight control signals on a cycle equivalent to a least common multiple or an integer multiple of the phase-shift cycle of the visible light communication signals (encoded signals) superimposed on the backlight control signals corresponding to the regions and the cycle of one frame of the backlight control signals.

With this, by correcting the phase shift, on the reception side, such as at the smartphone 1350, timing at which reception of the encoded signal is possible can be kept from happening over a long period of time.

Here, assuming that the positional relationship and environment allows for reception of communication signals, so long as the time indicating the least common multiple of the above described two types of cycles is a value (time) sufficient for reception to be performed, the time must be no longer than a person trying to receive the data with the receiver is willing to hold the receiver and wait to receive the data. With typical NFC, for example, the amount of time a person is willing to hold the receiver and wait can be one second, and thus one second or less is preferable. Furthermore, as an amount of time that strain the psyche, 0.5 seconds can be used as a further preferable amount of time within which the least common multiple is included.

Embodiment 22

In Embodiments 18 through 21, cases in which each area is sequentially controlled at a normal scanning speed when displaying an image signal, but each area may be sequentially controlled at a sped-up speed scanning speed faster than the normal scanning speed when displaying an image signal.

In this embodiment, a case in which each area is sequentially controlled when a 2× speed video signal is scanned at 4× scanning speed will be given as an example. Hereinafter, the example will be based on the assumption that the blanking interval is 2× speed.

[1. Display Device Operations]

The following description will focus on operations performed by the second processor 1470.

FIG. 350A and FIG. 350B are timing charts illustrating operations performed by the second processor according to Embodiment 22. The shaded (hatched) portions indicate regions where encoded signals are present. FIG. 350A illustrates a timing chart for the BL control signals before superimposition of the encoded signals, and FIG. 350B illustrates a timing chart for the BL control signals after superimposition of the encoded signals.

For example, as illustrated in FIG. 350A, there are no intervals across BL control signal A through BL control signal H in which the backlight is turned on at the same time. In other words, this indicates that the encoded signals cannot be superimposed for all regions of the display region at the same time.

Thus, in this embodiment, for example, the scanning interval for the blanking intervals between regions may be set to half the normal amount, as illustrated in FIG. 350B. Then, the region whose BL control signal blanking interval has the latest start time among a plurality of regions (among all regions is also acceptable)—region H—is selected.

The second processor 1470 superimposes the encoded signal on the selected region H in synchronization with the timing of the end of the blanking interval for region H and the start of the turning on of the backlight 1490 (i.e., the point in time at which the BL control signal H turns "ON").

In the example illustrated in FIG. 350B, the second processor 1470 superimposes the encoded signals on all regions in the display region in synchronization with the timing of the end of the blanking interval for the BL control signal H and the time at which the BL control signal H turns "ON".

As a result, the second processor 1470 can set the interval for superimposing the encoded signal for any region in the display region to an interval that is at most one half of a frame.

[2. Advantageous Effects Etc.]

As described above, in the display device according to this embodiment, the display controller (first controller 1440) causes the display panel (1450) to display an image on the display screen of the display panel in accordance with a sped-up scanning speed faster than a scanning speed indicated by the image signal.

With this, the display device can lengthen the interval in which the encoded signals can be output.

Note that when the encoded signal length (encoded signal interval), is long, the encoded signal cannot be superimposed only in the BL control signal ON interval (interval other than the blanking interval), and there is a region that overlaps the blanking interval, the encoded signal is not superimposed during the blanking interval in that region.

Moreover, an adjustment interval for turning on the backlight 1490 in the blanking interval that is equivalent in length to the ON time from the encoded signal superimposed during the BL control signal ON interval may be established. In this case, the adjustment interval may be generated using a method described in the above embodiments or the header of the encoded signal may be superimposed in the blanking interval. Moreover, the regions of the display region may be divided into groups and the encoded signals may be superimposed.

Moreover, the same processes may be performed in a region above the above-described region (in another region), and no signal may be outputted at all. In this case, using methods described in the above embodiments, an OFF adjustment interval may be established to equalize, across the entire screen, duty cycles based on at least one of the visible light communication signals and the image signals. Moreover, similar to Embodiment 20, the brightest region may be selected and encoded signals may be superimposed at timings determined based on that region. Note that in this embodiment, the encoded signals are superimposed using the rise of the BL control signals as a reference, but the timing at which the encoded signals are superimposed may be based on other characteristics of the BL control signals such as the fall of the BL control signals, and may be based on a synchronization signal of the image signal itself. Moreover, a signal of the synchronization signal of the image delayed by a certain amount of time may be generated, and that signal may be used as a reference.

Note that in this embodiment, an example is given in which the scanning speed is sped from 2× scanning speed to 4× scanning speed, but this is merely an example. The number of frames may be kept the same and only the scanning speed may be increased.

Moreover, in this embodiment, this sort of embodiment is achieved in advance and signals are transmitted, but the second processor may use a method in which signals according to this embodiment are transmitted based on the relationship between the image signal and the encoded signal. In this case, in order for the signals to be transmitted from the second processor 1470 to the first processor 1430 in FIG. 333, the arrow that connects these two blocks may be a two-headed arrow.

Embodiment 23

In Embodiments 18 through 22, the control method in which an interval for controlling the turning off of a backlight at a different timing for each of a plurality of regions is exemplified as being applied to backlight scanning, but this is merely an example. This method may be applied to local dimming.

In this embodiment, operations performed when the method is applied to local dimming will be described.

Here, local dimming is a backlight control method for reducing power by dividing the display region (screen) into a plurality of regions, increasing the transmittivity of the liquid crystals in the region beyond the normal amount, and decreasing the brightness of the backlight by the corresponding amount (i.e., decreasing the duty cycle). When the transmittivity of the brightest pixel in the region can be increased (when the brightness of the brightest pixel is a relatively low value), it is possible to reduce power consumption with the above method. Moreover, by receding the duty cycle of the backlight, the interval during which the backlight is on can be reduced, leading to an increase in contrast.

[1. Backlight Control by Local Dimming]

Next, BL control signals controlled by local dimming will be described.

FIG. 351 is a timing chart illustrating backlight control when local dimming is used according to Embodiment 23.

When local dimming is used to control the backlight, for example, in adjacent regions, although the interval T between the start of each blanking interval is the same throughout, the lengths of the blanking intervals are different, as illustrated in FIG. 351.

For this reason, in each of the regions of the display region, the display device 1400 according to this embodiment may store the BL control signal blanking interval determined based on an image signal previously displayed in memory and perform processing (operations) as follows.

[2. Display Device Operations]

The following description will focus on operations performed by the second processor 1470. Note that this embodiment relates to signal control when OFF intervals per frame for each region in the display region are aligned.

[2.1. One Example of Operations Performed by Second Processor]

FIG. 352 is a flow chart illustrating operations performed by the second processor according to Embodiment 23.

First, in step S1341, the second processor 1470 calculates the adjustment interval. More specifically, when the OFF time in the encoded signal is N1 and the OFF time in the BL control signal input by the first processor is N2, adjustment interval N=N2−N1. With this, the second processor 1470 can calculate the adjustment interval.

Next, in step S1342, the second processor 1470 determines whether the sum of adjustment interval N and encoded signal interval C (i.e., N+C) is less than or equal to one frame interval.

When the second processor 1470 determines that (N+C) is less than or equal to one frame interval (Yes in S1342), the process proceeds to step S1343. When the second processor 1470 determines that (N+C) is greater than one frame interval (No in S1342), the process proceeds to step S1346, where no encoded signal is output, and processing ends.

Next, in step S1343, the second processor 1470 determines whether the adjustment interval N is greater than or equal to 0.

When the second processor 1470 determines that N is greater than or equal to 0 (Yes in S1343), the process proceeds to S1344, where a OFF interval is established from the start of the next encoded signal counting back by a length of time equivalent to the adjustment interval. Moreover, the encoded signal is not output in this interval, and processing is ended.

When the second processor 1470 determines that N is smaller than 0 (No in S1343), the process proceeds to S1345, where an ON interval equivalent to the length of the adjustment interval is established in the blanking interval of the BL control signal, counting back from the end time of the blanking interval of the BL control signal. Moreover, the encoded signal is not output in this adjustment interval.

FIG. 353 is a timing chart illustrating one example of operations performed by the second processor according to Embodiment 23. Here, the bold lines indicate the ON intervals and the OFF intervals of the BL control signals, and in the following description, region A will be the reference region. Note that the region controlled by BL control signal X (where X is one of A through H) in each figure is also referred to as region X.

For example, as illustrated in FIG. 353, the second processor 1470 superimposes in-phase encoded signals on all of the regions at a timing determined based on the start of the frame region A, which is the reference region, and establishes an adjustment interval. Note that the adjustment interval may be established in accordance with the second method described in Embodiment 18, but since the second method has already been described above, duplication here will be omitted.

In this embodiment, in principle, encoded signals are not superimposed during the BL control signal OFF intervals (blanking intervals), and are superimposed during the BL control signal ON intervals, similar to Embodiments 18 through 22. Note that the adjustment interval may be changed based on the duty cycle of the encoded signal, and in that case, if the adjustment interval is an interval in which the encoded signal is output, the encoded signal may be superimposed and output.

[2.2. One Example of Operations Performed by Second Processor]

In local dimming as well, provision of a sequential blanking interval may be given priority similar to when normal backlight scanning control is performed. Operations performed in this case are described hereinafter.

FIG. 354 is a flow chart illustrating an example of operations performed by the second processor according to Embodiment 23.

First, in step S2101, the second processor 1470 calculates the adjustment interval. More specifically, when the blanking interval in a predetermined region is N1, the OFF time in the encoded signal is N2, and the blanking interval for that interval is N3, adjustment interval N=N1−N2−N3. With this, the second processor 1470 can calculate the adjustment interval.

Next, in step S2102, the second processor 1470 determines whether the sum of adjustment interval N, encoded signal interval C, and the blanking interval N2 of that region (i.e., N+C+N3) is less than or equal to one frame interval, and stores the determination result.

Next, in step S2103, the second processor 1470 determines whether the adjustment interval N is greater than or equal to 0, and stores the determination result.

After completing the above steps, the second processor 1470, for example, establishes an adjustment interval and displays the visible light communication signal through video, based on the N1 through N3 stored per region and the determination results from steps S2102 and S2103.

Note that the adjustment interval may be established based on a combination of the second method described in Embodiment 18 and the methods described in Embodiments 19 through 22, for example.

FIG. 355 is a timing chart illustrating one example of operations performed by the second processor according to Embodiment 23. In FIG. 355, the adjustment interval is established based on the second method described in Embodiment 18. Here, the bold lines indicate the ON intervals and the OFF intervals of the BL control signals, and in the following description, region A will be the reference region.

For example, as illustrated in FIG. 355, the second processor 1470 superimposes in-phase encoded signals on all of the regions in an interval from time P to time Q starting after a predetermined amount of time has elapsed from the start of the frame region A, which is the reference region, and establishes an adjustment interval. Note that the adjustment interval may be established in accordance with the second method described in Embodiment 18, but since the second method has already been described above, duplication here will be omitted.

In this embodiment, in principle, encoded signals are not superimposed during the BL control signal OFF intervals (blanking intervals), and are superimposed during the BL control signal ON intervals, similar to Embodiments 18 through 22. As such, for example, in region A, since a given interval starting at time P is a blanking interval where the BL control signal A is OFF, the encoded signal is not superimposed. The adjustment interval is established after the encoded signal interval C.

Note that the adjustment interval may be changed based on the duty cycle of the encoded signal, and in that case, if the adjustment interval is an interval in which the encoded signal is output, the encoded signal may be superimposed and output.

[2.3. One Example of Operations Performed by Second Processor]

FIG. 356 is a timing chart illustrating one example of operations performed by the second processor according to Embodiment 23.

When the backlight is controlled with a local dimming method, the blanking interval of the BL control signal is typically different for each frame and each region. As such, to expedite calculations, a temporary blanking interval (hereinafter also referred to as a provisional blanking interval) is established. The adjustment interval can then be calculated in accordance with the second method described in Embodiment 19 based on the provisional blanking interval, the encoded signal interval, the phase difference between the two, and the original blanking interval. Hereinafter, an example when this is the case is described with reference to FIG. 356. The bold line in FIG. 356 indicates the waveform of the original blanking interval.

The provisional blanking interval is established based on the average length of the blanking intervals on the screen, or the shortest interval. Here, the provisional blanking interval is exemplified as an OFF interval during which the encoded signal is not superimposed. The encoded signal interval is an interval during which the encoded signal is superimposed.

Moreover, the adjustment interval may be established using the second method described in Embodiment 18. If the adjustment interval is positive, the BL control signal may be adjusted such that the backlight 1490 is turned off during this interval, and if the adjustment interval is negative, the BL control signal may be adjusted such that the backlight 1490 is turned on during this interval. When the adjustment interval is established counting back from the blanking interval, the BL control signal may be adjusted such that the backlight 1490 is also turned on during the blanking interval. Note that when the adjustment interval is negative, if the encoded signal is superimposed on the BL control signal in the adjustment interval, the adjustment interval may be corrected based on the duty cycle.

[3. Advantageous Effects Etc.]

As described above, in the display device according to this embodiment, the backlight controller (the second controller 1480) establishes an interval during which control of light emission in each of the regions and control for turning off each of the regions a different time in accordance with a light emission amount of the backlight based on each of image signals, each of which is the image signal, are performed based on the backlight control signals outputted by the signal processor (the second processor 1470), and changes a duty of the backlight, the duty being based on the image signals and the visible light communication signals.

Note that in this embodiment, the encoded signals are superimposed using the rise of the BL control signals as a reference, but the timing at which the encoded signals are superimposed may be based on other characteristics of the BL control signals such as the fall of the BL control signals, and may be based on a synchronization signal of the image signal itself. Moreover, a signal of the synchronization signal of the image delayed by a certain amount of time may be generated, and that signal may be used as a reference.

Although the above embodiment describes a case where local dimming is applied, since local dimming also includes a case in which the regions are two-dimensionally divided and the image signals are scanned and written concurrently in a given direction, there are combinations are regions whose blanking intervals are different but in-phase, but the techniques described in this embodiment can be applied in this case as well.

As described above, the non-limiting embodiment has been described by way of example of techniques of the present disclosure. To this extent, the accompanying drawings and detailed description are provided.

Thus, the components set forth in the accompanying drawings and detailed description include not only components essential to solve the problems but also components unnecessary to solve the problems for the purpose of illustrating the above non-limiting embodiments. Thus, those unnecessary components should not be deemed essential due to the mere fact that they are described in the accompanying drawings and the detailed description.

The above non-limiting embodiment illustrates techniques of the present disclosure, and thus various modifications, permutations, additions and omissions are possible in the scope of the appended claims and the equivalents thereof.

For example, in the above embodiments, the encoded signals are described as being superimposed using the rise of the BL control signals as a reference, but this is merely an example. For example, the timing at which the encoded signals are superimposed may be based on a characteristic timing of the BL control signal, and may be based on a synchronization signal of the image signal itself. Moreover, a signal of the synchronization signal of the image delayed by a certain amount of time may be generated, and that signal may be used as a reference.

The present disclosure is applicable to a display device capable of outputting visible light communication signals without significantly deteriorating the quality of the display image, and capable of reducing reception error of output visible light communication signals, and a method for controlling such a display device. More specifically, the display device according to the present disclosure is applicable to a wide variety of applications relating to the forwarding and transmission of all sorts of information accompanying images, such as outdoor signage, information devices, information display devices since they can actively and securely obtain necessary information as needed, in addition to household devices such as televisions, personal computers and tablets since they can actively and securely obtain information other than images.

Moreover, for example, the display device according to Embodiments 18 to 23 outputs visible light communication signals, and includes: a display panel including a display screen on which an image is displayed; a display controller that causes the display panel to display an image on the display screen of the display panel based on an image signal; a backlight having a light emission surface that illuminates the display screen of the display panel from behind; a signal processor that superimposes the visible light communication signals on backlight control signals generated based on the image signal; and a backlight controller that divides the light emission surface of the backlight into regions and establishes an interval during which control of light emission in each of the regions and control for turning off the backlight in each of the regions a different time are performed based on the backlight control signals outputted by the signal processor. When superimposing the visible light communication signals on the backlight control signals, the signal processor does not superimpose a visible light communication signal in an interval indicating an OFF state of the backlight in the backlight control signals.

Moreover, for example, the signal processor may superimpose the visible light communication signals on the backlight control signals corresponding to the regions in a one-to-one manner, and the visible light communication signals superimposed on the backlight control signals corresponding to the regions may be in phase with one another. Here, for example, in the display device according to Embodiments 18 to 23, based on the backlight control signal corresponding to a predetermined region among the regions, the signal processor may match phases of the visible light communication signals superimposed on the backlight control signals corresponding to the regions.

Moreover, for example, the predetermined region may be the brightest region among the regions, and may be a region corresponding to an edge portion of the display screen among the regions.

Moreover, for example, the signal processor may superimpose the visible light communication signals on the backlight control signals corresponding to groups of neighboring regions among the regions, the visible light communication signals superimposed on the backlight control signals in the same group may be in phase with one another, and for each group, corresponding visible light communication signals may be superimposed in entirety in an interval during which control of light emission of the backlight based on the backlight control signals corresponding to the groups is performed.

Here, for example, based on the backlight control signal corresponding to a predetermined region among the groups, the signal processor may match phases of the visible light communication signals superimposed on the backlight control signals corresponding to the groups. Alternatively, the predetermined region may be the brightest region among the regions.

Moreover, for example, among the visible light communication signals superimposed on the backlight control signal phases corresponding to the groups, a visible light communication signal superimposed on a backlight control signal corresponding to a first group among the groups and a visible light communication signal superimposed on a backlight control signal corresponding to a second group among the groups may be out of phase.

Moreover, for example, when superimposing the visible light communication signals on the backlight control signals, if the regions include a region whose backlight control signal indicates an OFF state of the backlight in an interval that overlaps an interval of the visible light communication signal being superimposed, the signal processor may establish a ON adjustment interval for the region with overlapping intervals and adjust ON/OFF of the backlight control signal during the ON adjustment interval, the ON adjustment interval being for adjusting brightness of the region with overlapping intervals.

Moreover, for example, the signal processor may encode the visible light communication signals to generate encoded signals and superimpose the encoded signals, as the visible light communication signals, on the backlight control signals, and when superimposing the encoded signals on the backlight control signals, if the regions include a region whose backlight control signal indicates an OFF state of the backlight in an interval that overlaps an interval of the encoded signal being superimposed, a header portion of the encoded signal may be superimposed on the backlight control signal during the interval indicating an OFF state of the backlight, and a portion of the encoded signal other than the header portion may be superimposed on the backlight control signal during an interval other than the interval indicating an OFF state of the backlight.

Moreover, for example, the signal processor may superimpose the visible light communication signals on the backlight control signals on a different cycle than a cycle of the backlight control signals, and in each of the regions a relationship between a phase of the backlight control signal and a phase of the visible light communication signal may change with a change in frames. Here, the cycle of the backlight control signals and the different cycle on which the visible light communication signals are superimposed may change temporally.

Moreover, for example, the signal processor may temporally change a delay time of encoding the visible light communication signals on the backlight control signals corresponding to the regions, based on one backlight control signal corresponding to a given region among the regions.

Moreover, for example, the visible light communication signals to be superimposed on the backlight control signals may be in phase with one another across all regions in which the visible light communication signals are superimposed.

Moreover, for example, a phase-shift cycle of the visible light communication signals superimposed on the backlight control signals corresponding to the regions and a cycle of one frame of the backlight control signals may have a least common multiple within one second, inclusive.

Moreover, for example, the signal processor may correct a start of a phase-shift cycle of the visible light communication signals superimposed on the backlight control signals corresponding to the regions to a cycle of one frame of the backlight control signals on a cycle equivalent to a least common multiple or an integer multiple of the phase-shift cycle of the visible light communication signals superimposed on the backlight control signals corresponding to the regions and the cycle of one frame of the backlight control signals.

Note that for example, the display controller may cause the display panel to display an image on the display screen of the display panel in accordance with a sped-up scanning speed faster than a scanning speed indicated by the image signal.

Moreover, the backlight controller may establish an interval during which control of light emission in each of the regions and control for turning off each of the regions a different time in accordance with a light emission amount of the backlight based on each of image signals, each of which is the image signal, are performed based on the backlight control signals outputted by the signal processor, and change a duty of the backlight, the duty being based on the image signals and the visible light communication signals.

Moreover, the method of controlling the display device according to Embodiments 18 to 23 is a method of controlling a display device that outputs visible light communication signals, the display device including: a display panel including a display screen that displays an image; and a backlight having a light emission surface that illuminates the display screen of the display panel from behind, and includes: causing the display panel to display an image on the display screen of the display panel based on an image signal; superimposing the visible light communication signals on backlight control signals generated based on the image signal; and dividing the light emission surface of the backlight into regions and establishing an interval during which control of light emission in each of the regions and control for turning off the backlight in each of the regions a different time are performed based on the backlight control signals outputted by the signal processor. When superimposing the visible light communication signals on the backlight control signals, a visible light communication signal is not superimposed in an interval indicating an OFF state of the backlight in the backlight control signals.

Note that the disclosure of Embodiments 18 to 23 is applicable to a display device capable of outputting visible light communication signals without significantly deteriorating the quality of the display image, and capable of reducing reception error of output visible light communication signals. More specifically, the display device according to Embodiments 18 to 23 is applicable to a wide variety of applications relating to the forwarding and transmission of all sorts of information accompanying images, such as outdoor signage, information devices, information display devices since they can actively and securely obtain necessary information as needed, in addition to household devices such as televisions, personal computers and tablets since they can actively and securely obtain information other than images.

Embodiment 24

The present disclosure relates to a display device capable of outputting a visible light communication signal, and a display method performed thereby.

Japanese Unexamined Patent Application Publications No. 2007-43706 and No. 2009-212768 related to visible light communication techniques each using the backlight of a display disclose a display device which superimposes communication information via visible light on an image signal and displays the image signal with the superimposed communication information.

The present disclosure provides a display device which outputs a visible light communication signal which can be reconstructed by a reception device.

The display device according to the present disclosure is a display device capable of outputting a visible light communication signal including a plurality of signal units according to a carousel scheme, and includes: a display panel which displays an image signal; a visible light communication processing unit which codes the signal units, divides each of the signal units into a plurality of blocks, and generates a plurality of transmission frames using the plurality of blocks to generate a backlight control signal; and a backlight which illuminates the display panel from behind based on the backlight control signal. The plurality of blocks are arranged in different orders in at least two of the plurality of transmission frames for one of the signal units generated by the visible light communication processing unit.

The display device according to the present disclosure is capable of outputting a visible light communication signal which can be reconstructed by a reception device.

Hereinafter, an embodiment is described in detail with reference to the drawings as necessary. It should be noted that unnecessarily detailed descriptions may be omitted below. For example, detailed descriptions of well-known matters or descriptions of components that are substantially the same as components described previous thereto may be omitted. This is to avoid unnecessary redundancy and provide easily read descriptions for those skilled in the art.

It should be noted that the accompanying drawings and the following description are provided to assist those skilled in the art in fully understanding the present disclosure, and are not intended to limit the scope of the claims.

Hereinafter, Embodiment 24 is described with reference to FIGS. 357 to 372E.

[1-1. Configuration of Visible Light Communication System]

FIG. 357 schematically illustrates a visible light communication system according to Embodiment 24. In FIG. 357, a visible light communication system 1500S includes a display device 1500 and a reception device 1520.

The display device 1500 is a display for example, and displays images on a display surface 1510. In addition, on the images displayed on the display surface 1510, a visible light communication signal is inserted or superimposed as information related to the displayed images.

The reception device 1520 captures the images displayed on the display surface 1510 of the display device 1500 to thereby receive the visible light communication signal output by being displayed on the display surface 1510. The reception device 1520 is configured as, for example, a smartphone in which an image sensor for sequential exposure is embedded. In this way, a user of the reception device 1520 can receive, for example, the information related to the images displayed on the display device 1500.

Note that although the display is given as an example of the display device 1500 in this embodiment, this example is not limiting. The display device 1500 may be a projecting display device such as a projector.

In addition, although the smartphone is given as an example of the reception device 1520, any other electronic device capable of receiving a visible light communication signal is possible. For example, the electronic device may be a reception device conforming to "JEITA-CP1222 Visible Light ID System" defined by the Japan Electronics and Information Technology Industries Association (JEITA). Furthermore, the electronic device may be a general communication terminal.

In addition, "being capable of receiving a visible light communication signal" means that it is possible to receive the visible light communication signal, and decode the received visible light communication signal to obtain information.

In addition, a scheme for communicating a visible light communication signal may be, for example, a communication scheme conforming to the "JEITA-CP-1223 Visible Light Beacon System" defined by the JEITA, a communication scheme conforming to IEEE-P802.15 standardized by the Institute of Electrical and Electronics Engineers, Inc. (IEEE).

Stated differently, the reception device 1520 may be any electronic device capable of performing communication using any of these communication schemes and receiving such a visible light communication signal.

[1.2 Configuration of Display Device]

FIG. 358 is a block diagram of a display device according to Embodiment 24. In FIG. 358, the display device 1500 includes: an image signal input unit 1501; an image signal processing unit 1502; a display control unit 1503; a display panel 1504; a visible light communication signal input unit 1505; a visible light communication signal processing unit 1506; a backlight control unit 1507; and a backlight 1508.

The image signal input unit 1501 receives an image signal related to images to be displayed on the display panel 1504 via an antenna cable, a composite cable, a high-definition multimedia interface (HDMI: registered trademark) cable, a PJLink cable, a local area network (LAN) cable, or the like. The image signal input unit 1501 outputs the input image signal to the image signal processing unit 1502.

It is to be noted that the image signal to be used may be an image signal stored in a recording medium.

The image signal processing unit 1502 performs general image processing such as decoding on the input image signal. The image signal processing unit 1502 transmits the image signal on which the image processing has been performed to the display control unit 1503 and the backlight control unit 1507. The image signal includes information related to brightness etc. of images.

The display control unit 1503 controls the display panel 1504 based on the input image signal so that the video is displayed on the display surface 1510 of the display panel 1504. More specifically, the display control unit 1503 performs aperture control etc. of liquid crystals of the display panel 1504 based on the image signal input from the image signal processing unit 1502.

The display panel 1504 is a liquid crystal panel for example, and includes the display surface 1510 on which images are displayed.

The visible light communication signal input unit 1505 receives a visible light communication signal via a cable exclusive for visible light communication signals, a LAN cable, or the like.

It is to be noted that the visible light communication signal to be used may be a visible light communication signal stored in a recording medium. Furthermore, the visible light communication signal may have been superimposed on an image signal.

The visible light communication signal input unit 1505 outputs the input visible light communication signal to the visible light communication signal processing unit 1506.

The visible light communication signal processing unit 1506 codes the input visible light communication signal according to a predetermined coding method, and further performs, for example, processing for determining the order of transmission of visible light communication signals. The visible light communication signal processing unit 1506 converts the coded visible light communication signal into a backlight control signal. The visible light communication signal processing unit 1506 outputs the generated backlight control signal to the backlight control unit 1507.

The backlight control unit 1507 divides the light emitting surface of the backlight 1508 into a plurality of areas, performs light emission control on each of the areas, and performs control for providing the respective areas on the light emitting surface with OFF periods at different timings.

The backlight control unit 1507 controls luminance and timing for the backlight 1508 based on the information related to the image brightness etc. of images and included in the input image signal. In addition, the backlight control unit 1507 controls light emission of the backlight 1508 based on the input backlight control signal.

The backlight 1508 is provided on the rear surface of the display panel 1504, and has a light emitting surface which illuminates the display surface 1510 of the display panel 1504 from the rear surface. The backlight 1508 emits light from behind the display panel 1504. A viewer can visually recognize images displayed on the display panel 1504.

In this embodiment, the entire display surface 1510 is assumed to be a visible light communication area.

FIG. 359 is a diagram for describing an example of generating a visible light communication signal. As illustrated in FIG. 359, the visible light communication signal input to the visible light communication signal input unit 1505 includes a plurality of signal units each having a predetermined length. The visible light communication signal processing unit 1506 divides each signal unit into a predetermined number of pieces of data. In FIG. 359, one signal unit is composed of four pieces of data having the same data length. In other words, the one signal unit is divided into four parts, namely, Data 1, Data 2, Data 3, and Data 4. Division of the one signal unit may be determined based on a carrier frequency of the visible light communication signal output from the display device 1500, the data length of the signal unit of the visible light communication signal, and further based on, for example, a period in which the backlight 1508 does not emit light.

It has been described that the data lengths of the pieces of data obtained by dividing one signal unit are the same with reference to FIG. 359. However, it is to be noted that the data lengths of the pieces of data obtained by dividing one signal unit may be different from each other, or the data length of one of the pieces of data obtained by dividing one signal unit may be different from the data lengths of the other pieces of data.

Next, the visible light communication signal processing unit 1506 codes the resulting pieces of data, adds a header part to each piece of data, determines the order of transmission of the pieces of data, and generate blocks. Specifically, the visible light communication signal processing unit 1506 generates Block 1, Block 2, Block 3, and Block 4 from Data 1, Data 2, Data 3, and Data 4, respectively. The visible light communication signal processing unit 1506 transmits the generated blocks as a backlight control signal in the order of Block 1, Block 2, Block 3, and Block 4 to the backlight control unit 1507.

The header part of a block is composed of a "preamble", an "address", and a "parity". The preamble is a pattern indicating the beginning of the block, and includes an identifier indicating that the data is a visible light communication signal. For example, a signal out of a coding rule such as 4 pulse position modulation (4 PPM) or inverted 4 PPM (i-4 PPM) is used. The parity is used to detect data error. The address indicates the order of transmission of the blocks in the signal unit.

The four blocks generated from one signal unit are referred to as a transmission frame.

[1-3. Configuration of reception device]

FIG. 360 is a block diagram of a reception device according to Embodiment 24. In FIG. 360, the reception device 1520 includes an imaging unit 1521, a captured image generation unit 1522, and a captured image processing unit 1523.

The imaging unit 1521 captures images displayed on a visible light communication area of the display device 1500. The imaging unit 1521 is, for example, an image sensor for sequential exposure. Upon starting the imaging, the image sensor performs sequential exposure, and transmits the exposure data to the captured image generation unit 1522.

The captured image generation unit 1522 temporarily stores, in memory installed therein, exposure data transmitted from the imaging unit 1521. The captured image generation unit 1522 generates a captured image based on the exposure data stored in the memory.

The captured image processing unit 1523 reconstructs the visible light communication signal from the captured image generated by the captured image generation unit 1522.

[1-4. Output and Reception of Visible Light Communication Signal]

Next, a description is given of basic operation performed by the reception device 1520 to receive transmission frames output from the visible light communication area of the display device 1500.

[1-4-1. Captured Image for ON and OFF States of Backlight]

FIG. 361 is a diagram for describing a captured image in the reception device 1520 for ON and OFF states of the backlight 1508 of the display device 1500.

The imaging unit 1521 is an image sensor for sequential exposure, and performs exposure while performing temporal scanning on a per line basis. To simplify the description, this embodiment is described assuming that exposure elements of the image sensor are in 8 lines. The exposure lines are assumed to have been configured in an elongated, belt-like shape in the reception device 1520.

As illustrated in FIG. 361, the backlight 1508 of the display device 1500 is turned ON and OFF along with time. The image sensor performs sequential exposure from the first line to the eighth line. When the sequential exposure up to the eighth line is finished, the captured image generation unit 1522 of the reception device 1520 generates a captured image based on the exposure data of the eight lines. Here, it is assumed that the period for sequential exposure of the image sensor is an imaging period, and that a captured image generated based on the exposure data obtained through the sequential exposure of the image sensor in the imaging period is a reception frame L. The exposure of the image sensor is performed such that a return to the first line is made when exposure on the eighth line is finished, and the next exposure is started from the first line. The captured image generated next is assumed to be a reception frame L+1. There is a blanking interval such as time for storing exposure data in the memory between when the exposure up to the eighth line is finished and when the next exposure on the first line is started, and no exposure is performed in the blanking interval.

In the reception frame L, each of the first, second, fifth, sixth, and eighth lines in the exposure of the image sensor of the reception device 1520 is light because the backlight 1508 of the display device 1500 is ON at the time of the exposure. Each of the third and fourth lines in the exposure of the image sensor of the reception device 1520 is dark because the backlight 1508 of the display device 1500 is OFF at the time of the exposure. The visible light communication signal is reconstructed based on the reception frame L.

In the reception frame L+1, each of the first, second, third, seventh, and eighth lines in the exposure of the image sensor of the reception device 1520 is light because the backlight 1508 of the display device 1500 is ON at the time of the exposure. Each of the fourth, fifth, and sixth lines of the exposure of the image sensor of the reception device 1520 is dark because the backlight 1508 of the display device 1500 is OFF at the time of the exposure. The visible light communication signal is reconstructed based on the reception frame L+1.

[1-4-2. Captured Image for Transmission Frame]

FIG. 362 is a diagram for describing a captured image in the reception device 1520 for the transmission frame from the display device 1500.

As illustrated in FIG. 359, the visible light communication signal includes a plurality of signal units, one signal unit is divided into four pieces of data, and the four pieces of data are coded into four blocks respectively.

In the visible light communication area which is the display surface 1510 of the display device 1500, there may be a period in which ON and OFF states of the backlight 1508 cannot be distinguished depending on the content of an image signal. There is a possibility that the reception device 1520 cannot receive a transmission frame output from the display device 1500 in this period.

For this reason, the carousel scheme according to which the transmission frame generated from one signal unit is output repeatedly, that is, more than once, is used for the transmission frames to be output from the backlight 1508 of the display device 1500. In FIG. 362, the display device 1500 outputs a transmission frame in one signal unit of the visible light communication signal two times sequentially.

As illustrated in FIG. 362, the transmission frame is output by way of turning ON and OFF of the backlight 1508 of the display device 1500 along with time. The exposure of the image sensor of the reception device 1520 is sequential exposure from the first line to the eighth line. When the exposure up to the eighth line by the image sensor is finished, the captured image generation unit 1522 of the reception device 1520 generates a captured image based on the exposure data of the eight lines. To generate the reception frame L which is a captured image, with the exposure of the image sensor of the reception device 1520, Block 1 is received at the first and second lines, Block 2 is received at the third and fourth lines, Block 3 is received at the fifth and sixth lines, and Block 4 is received at the seventh and eighth lines. The reception frame L corresponds to the first transmission frame of one signal unit output from the display device 1500.

In addition, with reference to FIG. 362, to generate the reception frame L+1 which is a captured image, with the exposure of the image sensor of the reception device 1520, Block 1 is received at the first and second lines, Block 2 is received at the third and fourth lines, Block 3 is received at the fifth and sixth lines, and Block 4 is received at the seventh and eighth lines. The reception frame L+1 corresponds to the second transmission frame of one signal unit output from the display device 1500.

In this way, the transmission frames generated from one signal unit are output sequentially according to the carousel scheme, which makes it possible to receive, in the second transmission frame, a block which was not able to be received in the first transmission frame even when radio disturbance occurs in the transmission of the first transmission frame. When all the blocks, that is, the four blocks, are received throughout the first and second transmission frames, one signal unit can be reconstructed.

In addition, when the transmission frame is output sequentially according to the carousel scheme, the display device 1500 may output a reset signal indicating transition from a current signal unit to the next signal unit before outputting the transmission frame of the next signal unit.

This reset signal may be included in the preamble or data of the blocks of the transmission frame.

[1-5. Problem with Output and Reception of Visible Light Communication Signal]

Next, a description is given of a problem with output and reception of a visible light communication signal. FIG. 363 is a diagram for describing the relationship between a transmission clock frequency of the display device 1500 and a frame rate of the imaging unit 1521 of the reception device 1520.

A liquid crystal panel which is the display panel 1504 of the display device 1500 in this embodiment is driven at a drive frequency of 120 Hz.

It is to be noted that some type of liquid crystal panel operates at a drive frequency of 60 Hz or 240 Hz.

In addition, the image sensor of the imaging unit 1521 of the reception device 1520 in this embodiment operates at a frame rate of 30 frame per second (fps).

At this time, the drive frequency of the liquid crystal panel and the frame rate of the image sensor are in the relationship of an integral multiple or a unit fraction. Furthermore, in order for luminance control and control on video resolution etc. in the backlight control unit 1507 of the display device 1500, ON and OFF timings of the backlight 1508 of the display device 1500 may be synchronized with the drive frequency of the liquid crystal panel. In other words, as illustrated in FIG. 363, the transmission frames are to be output from the display device 1500 in synchronization with the drive frequency of the liquid crystal panel. FIG. 363 indicates a case in which the transmission frame generated from one signal unit which is output from the display device 1500 in this situation is output three times according to the carousel scheme.

Exposure of the image sensor is performed for the first transmission frame output from the display device 1500 in an imaging period of one frame rate. The reception device 1520 generates a reception frame L which is a captured image based on exposure data. The reception device 1520 reconstructs the visible light communication signal from the reception frame L. Only Block 2 and Block 3 whose data are fully included in the reception frame L can be reconstructed as a visible light communication signal.

Exposure of the image sensor is performed for the second transmission frame output from the display device 1500 in an imaging period of one frame rate. The reception device 1520 generates a reception frame L+1 which is a captured image based on exposure data. The reception device 1520 reconstructs the visible light communication signal from the reception frame L+1. Only Block 2 and Block 3 whose data are fully included in the reception frame L+1 can be reconstructed as a visible light communication signal.

Exposure of the image sensor is performed for the third transmission frame output from the display device 1500 in an imaging period of one frame rate. The reception device 1520 generates a reception frame L+2 which is a captured image based on exposure data. The reception device 1520 reconstructs the visible light communication signal from the reception frame L+2. Only Block 2 and Block 3 whose data are fully included in the reception frame L+2 can be reconstructed as a visible light communication signal.

In this way, in the case where the drive frequency of the liquid crystal panel and the frame rate of the image sensor are in the relationship of an integral multiple or a unit fraction, and the transmission frames for one signal unit to be output from the display device 1500 are output in synchronization with the drive frequency of the liquid crystal panel, even when the same transmission frame is output three times according to the carousel scheme, only Block 2 and Block 3 among Block 1, Block 2, Block 3, and Block 4 can be reconstructed as a visible light communication signal. Block 1 and Block 4 cannot be reconstructed as a visible light communication signal.

[1-6. Method for Generating Transmission Frame]

In order to solve the above-described problem, that is, in order that the reception device 1520 reconstructs all of the four blocks of one signal unit output from the display device 1500 as a visible light communication signal, a different transmission frame is generated and output each time instead of using the same transmission frame each time as the transmission frame to be output for the one signal unit more than one time according to the carousel scheme. In other words, the transmission frames to be output more than one time for the one signal unit according to the carousel scheme are generated such that the blocks in each of the transmission frames for one signal unit will be transmitted in a different order each time.

FIG. 364 is a diagram for describing a first example of generating a transmission frame for one signal unit according to Embodiment 24. FIG. 364 illustrates a case in which one signal unit to be output from the display device 1500 is output three times according to the carousel scheme, in the same manner as in the case of FIG. 363. The difference from FIG. 363 is that the order of transmission of blocks of transmission frames that are to be output from the display device 1500 three times is not the same, that is, is different each time.

The blocks of the first transmission frame to be output from the display device 1500 are arranged in the following order: Block 1; Block 2; Block 3; and Block 4. The reception device 1520 performs exposure of the image sensor for the first transmission frame output from the display device 1500, in an imaging period of one frame rate. The reception device 1520 generates a reception frame L which is a captured image based on exposure data. The reception device 1520 reconstructs the visible light communication signal from the reception frame L. Only Block 2 and Block 3 whose data are fully included in the reception frame L can be reconstructed as a visible light communication signal.

The blocks of the second transmission frame to be output from the display device 1500 are arranged in the following order: Block 2; Block 3; Block 4; and Block 1. The reception device 1520 performs exposure of the image sensor for the second transmission frame output from the display device 1500, in an imaging period of one frame rate. The reception device 1520 generates a reception frame L+1 which is a captured image based on exposure data. The reception device 1520 reconstructs the visible light communication signal from the reception frame L+1. Only Block 3 and Block 4 whose data are fully included in the reception frame L+1 can be reconstructed as a visible light communication signal.

The blocks of the third transmission frame to be output from the display device 1500 are arranged in the following order: Block 3; Block 4; Block 1; and Block 2. Exposure of the image sensor is performed for the third transmission frame output from the display device 1500 in an imaging period of one frame rate. The reception device 1520 generates a reception frame L+2 which is a captured image based on exposure data. The reception device 1520 reconstructs the visible light communication signal from the reception frame L+2. Only Block 4 and Block 1 whose data are fully included in the reception frame L+2 can be reconstructed as a visible light communication signal.

In the case where the drive frequency of the liquid crystal panel and the frame rate of the image sensor are in the relationship of an integral multiple or a unit fraction, and the transmission frames are output from the display device 1500 in synchronization with the drive frequency of the liquid crystal panel, it is possible to reconstruct all of Block 1, Block 2, Block 3, and Block 4 in one signal unit as a visible light communication signal by outputting the transmission frame for one signal unit three times according to the carousel scheme in such a way that the order of transmission of the blocks is different each time.

In a generation example of FIG. 364, the second and third blocks in transmission frames output from the display device 1500 are blocks which can be reconstructed as a visible light communication signal, and thus the order of transmission of the blocks of the signal unit is changed so that each Block is output as one of the second and third blocks throughout the three outputs.

Note that in the generation example of FIG. 364, the transmission frame to be output for one signal unit more than one time according to the carousel scheme is changed in such a way that the order of transmission of the blocks in each of the transmission frames for one signal unit is different each time, but this example is not limiting. The order of transmission of the blocks in the transmission frame to be output for one signal unit more than one time according to the carousel scheme may be changed in such a way that the order of transmission of the blocks in two adjacent transmission frames for one signal unit is different from each other.

Furthermore, generation examples of transmission frames to be output from the display device 1500 are not limited to the example described above.

FIG. 365A is a diagram for describing a second example of generating a transmission frame for one signal unit according to Embodiment 24.

In FIG. 365A, an ascending order of the blocks in the transmission frame, that is, the order of Block 1, Block 2, Block 3, and Block 4, and a descending order of the blocks in the transmission frame, that is, the order of Block 4, Block 3, Block 2, and Block 1, are repeated.

In the case where a reception frame to be generated by the reception device 1520 is composed of the former or latter half part of the transmission frame, it is possible to reconstruct all of Block 1, Block 2, Block 3, and Block 4 of one signal unit as a visible light communication signal by outputting a transmission frame such as that in the second generation example more than one times according to the carousel scheme.

FIG. 365B is a diagram for describing a third example of generating a transmission frame for one signal unit according to Embodiment 24. In FIG. 365B, one block among the four blocks of the signal unit is eliminated and the order of transmission of the blocks is changed for each transmission frame. The blocks of the first transmission frame to be output from the display device 1500 are arranged in the following order: Block 1; Block 2; Block 3; and Block 2, without Block 4. The blocks of the second transmission frame to be output from the display device 1500 are arranged in the following order: Block 3; Block 4; Block 1; and Block 3, without Block 2. The blocks of the third transmission frame to be output from the display device 1500 are arranged in the following order: Block 4; Block 1; Block 2; and Block 4, without Block 3. By changing the transmission order to that just described, it is possible to transmit all of the blocks the same number of times.

FIG. 365C is a diagram for describing a fourth example of generating a transmission frame for one signal unit according to Embodiment 24. In FIG. 365C, one block is added in the sequence of Block 1, Block 2, Block 3, and Block 4 arranged in this order in the signal unit. The blocks of the first transmission frame to be output from the display device 1500 are arranged in the following order: Block 1; Block 1; Block 2; and Block 3, as a result of one Block 1 being added. The blocks of the second transmission frame to be output from the display device 1500 are arranged in the following order: Block 4; Block 1; Block 2; and Block 2, starting with Block 4, which is not included in the first transmission frame, and as a result of one Block 2 being added. The blocks of the third transmission frame to be output from the display device 1500 are arranged in the following order: Block 3; Block 4; Block 1; and Block 2, starting with Block 3, which is not included in the second transmission frame.

In this way, it is possible to reconstruct all of Block 1, Block 2, Block 3, and Block 4 of one signal unit as a visible light communication signal by outputting a transmission frame such as that in the fourth generation example more than one time according to the carousel scheme.

FIG. 365D is a diagram for describing a fifth example of generating a transmission frame for one signal unit according to Embodiment 24. In FIG. 365D, the blocks in each signal unit are reordered at random. The blocks of the first transmission frame to be output from the display device 1500 are arranged in the following order: Block 1; Block 3; Block 2; and Block 4. The blocks of the second transmission frame to be output from the display device 1500 are arranged in the following order: Block 3; Block 1; Block 2; and Block 4. The blocks of the third transmission frame to be output from the display device 1500 are arranged in the following order: Block 2; Block 3; Block 1; and Block 4. It is possible to reconstruct all of Block 1, Block 2, Block 3, and Block 4 of one signal unit as a visible light communication signal by reordering the blocks in the transmission frame for one signal unit at random and transmitting the transmission frame more than one time according to the carousel scheme.

FIG. 365E is a diagram for describing a sixth example of generating a transmission frame for one signal unit according to Embodiment 24. In FIG. 365E, two consecutive blocks in one transmission frame are the same. The blocks of the first transmission frame to be output from the display device 1500 are arranged in the following order: Block 1; Block 1; Block 2; and Block 2. The blocks of the second transmission frame to be output from the display device 1500 are arranged in the following order: Block 3; Block 3; Block 4; and Block 4. The blocks of the third transmission frame to be output from the display device 1500 are arranged in the following order: Block 1; Block 1; Block 2; and Block 2.

[1-7. Operation Performed by Visible Light Communication Signal Processing Unit]

Next, a description is given of operation performed by the visible light communication signal processing unit 1506 of the display device 1500. FIG. 366 is a flowchart for describing operation of the visible light communication signal processing unit 1506 of the display device 1500.

(Step S1501) The visible light communication signal processing unit 1506 determines whether or not a visible light communication signal has been received from the visible light communication signal input unit 1505. When it is determined that the visible light communication signal has been received (in the case of Yes), processing is advanced to Step S1502. When it is determined that the visible light communication signal has not been received (in the case of No), processing of Step S1501 is repeated.

(Step S1502) The input visible light communication signal includes a plurality of signal units. The visible light communication signal processing unit 1506 reads one signal unit.

(Step S1503) The visible light communication signal processing unit 1506 generates blocks by dividing the read one signal unit into a predetermined number of pieces of data, coding the pieces of data, and adding a header part to each of the pieces of data.

(Step S1504) Based on the generated blocks, the visible light communication signal processing unit 1506 determines the order of transmission of blocks to be included in each of the plurality of transmission frames to be transmitted according to the carousel scheme.

(Step S1505) The visible light communication signal processing unit 1506 generates a plurality of transmission frames and outputs them to the backlight control unit 1507.

(Step S1506) The visible light communication signal processing unit 1506 determines whether or not any signal unit is left. When it is determined that a signal unit is left (in the case of Yes), a return is made to Step S1501. When it is determined that no signal unit is left (in the case of No), the processing is terminated.

[1-8. Advantageous Effects, Etc.]

As described above, the display device according to this embodiment is the display device capable of outputting the visible light communication signal including the plurality of signal units according to the carousel scheme, and includes: the display panel which displays the image signal; the visible light communication processing unit which codes the signal units, divides each of the signal units into the plurality of blocks, and generates the plurality of transmission frames using the plurality of blocks to generate the backlight control signal; and the backlight which emits light from behind the display panel based on the backlight control signal. The plurality of blocks are arranged in different orders in at least two of the plurality of transmission frames for one of the signal units generated by the visible light communication processing unit.

In this way, the display device 1500 outputs, for one signal unit, the plurality of transmission frames including blocks which are different in the order of transmission, to allow the reception device 1520 to reconstruct the visible light communication signal.

In addition, in the display device in this embodiment, among the plurality of transmission frames for one of the signal units generated by the visible light communication processing unit, at least two adjacent transmission frames include identical blocks.

In this way, the display device 1500 includes the identical blocks in at least two adjacent transmission frames for the one signal unit, to allow the reception device 1520 to reconstruct the visible light communication signal.

In addition, in the display device in this embodiment, at least one of the plurality of transmission frames for one of the signal units generated by the visible light communication processing unit includes a plurality of identical blocks, and each of the plurality of blocks is included in one of the plurality of transmission frames.

In this way, the display device 1500 includes a plurality of identical blocks in one transmission frame and includes each of the blocks in one of the plurality of transmission frames, to allow the reception device 1520 to reconstruct the visible light communication signal.

In addition, in the display device in this embodiment, the visible light communication signal processing unit inserts a reset signal between two adjacent ones of the signal units.

In this way, the display device 1500 is capable of indicating transition from a current signal unit to the next signal unit.

The display device 1500 in this embodiment is particularly effective in the case where the drive frequency of the liquid crystal panel and the frame rate of the image sensor are in the relationship of an integral multiple or a unit fraction, and the transmission frames are output from the display device 1500 in synchronization with the drive frequency of the liquid crystal panel.

Note that the number of times of transmission of the transmission frame to be output from the display device 1500 according to the carousel scheme is described as being three times in this embodiment, but this example is not limiting. The number of times of transmission of the transmission frame to be output according to the carousel scheme may be any number more than one.

Embodiment 25

The following describes Embodiment 25 with reference to FIG. 367 to FIG. 369.

[2-1. Configuration of Visible Light Communication System]

A visible light communication system according to this embodiment has the same configuration as the visible light communication system 1500S described in Embodiment 24. The following description of the visible light communication system according to this embodiment focuses on differences from the visible light communication system 1500S.

[2-2. Relationship Between Brightness of Images and Output of Visible Light Communication Signal]

A display panel 1504 of a display device 1500 according to this embodiment is a liquid crystal panel. In the liquid crystal display, when images are displayed, a liquid-crystal shutter of a display surface 1510 is opened and closed or tones and a backlight 1508 are controlled so that the images are viewed.

For that reason, even in the case where the brightness of the backlight 1508 is set to significantly high, a visible light communication region includes a dark region when an image signal is dark. In a region with a dark image signal, light of the backlight 1508 is shielded by the liquid-crystal shutter of the display panel 1504. When a visible light communication signal is output to a dark region, there are instances where the visible light communication signal cannot be reconstructed from an image captured by an imaging unit 1521 of a reception device 1520.

In view of the above, according to this embodiment, when the proportion of a high-luminance region, which is a region having brightness higher than or equal to predetermined brightness, in the visible light communication region, which is the entire display surface 1510 of the display device 1500, is low, a block included in one signal unit is output more than one time so that a visible light communication signal can be reconstructed. In contrast, when the proportion of the high-luminance region in the visible light communication region is high, the number of times of transmission of a block included in one signal unit is reduced to be smaller than when the proportion of the high-luminance region in the visible light communication region is low, or the number of times of transmission of a block included in one signal unit is set to one.

[2-3. Operations of Visible Light Communication Signal Processing Unit]

Embodiment 25 is different from Embodiment 24 mainly in the operation of the visible light communication signal processing unit 1506. The following describes the operation of the visible light communication signal processing unit 1506. FIG. 367 is a flowchart for describing the operation of the visible light communication signal processing unit 1506 of the display device 1500 according to Embodiment 25.

Operations in step S1501 to step S1503 are same as the operations described in Embodiment 24.

(Step S1511) The visible light communication signal processing unit 1506 detects a high-luminance region in a visible light communication region, from an image signal provided by the image signal processing unit 1502. The visible light communication signal processing unit determines the number of times of transmission of each block of a transmitting unit, based on the proportion of the high-luminance region in the visible light communication region. The method of determining the number of times of transmission will be described later.

(Step S1512) The visible light communication signal processing unit 1506 determines an order of transmission of blocks, based on the number of times of transmission of each block of the signal unit. The method of determining the order of transmission of blocks will be described later.

Operations in step S1505 and step S1506 are the same as the operations described in Embodiment 24.

[2-4. Method of Determining the Number of Times of Transmission of Block]

The following describes how to determine the number of transmission of a block. FIG. 368 illustrates an example of how to determine the number of times of transmission of an arbitrary block of a transmission frame for one signal unit.

In FIG. 368, the horizontal axis represents a proportion of the high-luminance region in the visible light communication region, and the vertical axis represents the number of times of transmission of an arbitrary block in a signal unit.

It is expected from FIG. 368 that when the proportion of the high-luminance region in the visible light communication region is approximately 80% or more, the number of times an arbitrary block in a signal unit is to be transmitted so that the visible light communication signal can be reconstructed by the reception device 1520 is one, and that as the proportion of the high-luminance region in the visible light communication region is reduced, the number of times the arbitrary block in the signal unit is to be transmitted so that the visible light communication signal can be reconstructed by the reception device 1520 increases. More specifically, the arbitrary block in the signal unit is transmitted once when the proportion of the high-luminance region in the visible light communication region is 90% (point A), the arbitrary block in the signal unit is transmitted three times when the proportion of the high-luminance region in the visible light communication region is 50% (point B), and the arbitrary block in the signal unit is transmitted six times when the proportion of the high-luminance region in the visible light communication region is 10% (point C). In FIG. 368, the number of times of transmission of an arbitrary block in a signal unit is incremented by one as the proportion of the high-luminance region in the visible light communication region decreases from 80% to approximately 15%.

It should be noted that the rate of the number of times of transmission is not limited to this example, and may be changed as necessary.

[2-5. Method of Determining Order of Transmission of Blocks]

The following describes how to determine the order of transmission of blocks for one signal unit. FIG. 369 is a diagram for describing an example of generating a transmission frame for one signal unit according to Embodiment 25. A drive frequency of a liquid crystal panel that is the display panel 1504 of the display device 1500 according to this embodiment is 120 Hz, and an image sensor of the imaging unit 1521 of the reception device 1520 operates at a frame rate of 30 fps. Moreover, a transmission frame of the display device 1500 is output in synchronization with the drive frequency of the liquid crystal panel. FIG. 369 illustrates the case where one signal unit of the visible light communication signal that is output from the display device 1500 is output three times according to the carousel scheme. The one signal unit includes six data items each having the same data length, and is coded to generate six blocks.

In FIG. 369, the number of times of transmission of blocks included in three transmission frames for one signal unit is determined according to the proportion of the high-luminance region in the visible light communication region.

Since the proportion of the high-luminance region in the first transmission frame that is output first from the display device 1500 is 80%, an arbitrary block in a signal unit is transmitted once. Accordingly, blocks in the first transmission frame that is output from the display device 1500 are arranged in the following order: Block 1, Block 2; Block 3; Block 4; Block 5; and Block 6. The reception device 1520 exposes the image sensor in an imaging period of one frame rate, for the first transmission frame output from the display device 1500. The reception device 1520 generates a reception frame L which is a captured image based on exposure data. The reception device 1520 reconstructs a visible light communication signal from the reception frame L. Only Block 2, Block 3, Block 4, and Block 5 whose data are fully included in the reception frame L can be reconstructed as a visible light communication signal.

Next, since the proportion of the high-luminance region in the second transmission frame that is output for the second time from the display device 1500 is 50%, an arbitrary block in a signal unit is transmitted three times. Accordingly, in the second transmission frame that is output from the display device 1500, blocks are arranged in the following order: Block 1; and Block 2, which is repeated three times. The reception device 1520 exposes the image sensor in an imaging period of one frame rate, for the second transmission frame output from the display device 1500. The reception device 1520 generates a reception frame L+1 which is a captured image based on exposure data. In the reception frame L+1, a block in a region other than the high-luminance region cannot be reconstructed. The reception device 1520 reconstructs a visible light communication signal from the reception frame L+1. Block 1 and Block 2 whose data are fully included in the reception frame L+1 can be reconstructed as a visible light communication signal.

Next, since the proportion of the high-luminance region of the third transmission frame that is output for the third time from the display device 1500 is 10%, an arbitrary block in a signal unit is transmitted six times. In the third transmission frame that is output from the display device 1500, blocks are arranged such that Block 6 is repeated six times. The reception device 1520 exposes the image sensor in an imaging period of one frame rate, for the third transmission frame output from the display device 1500. The reception device 1520 generates a reception frame L+2 which is a captured image based on exposure data. In the reception frame L+2, a block in a region other than the high-luminance region cannot be reconstructed. The reception device 1520 reconstructs a visible light communication signal from the reception frame L+2. Block 6 whose data is fully included in the reception frame L+2 can be reconstructed as a visible light communication signal.

It is possible to reconstruct all of Block 1, Block 2, Block 3, Block 4, Block 5, and Block 6 in one signal unit as a visible light communication signal, by determining the order of transmission of blocks for a transmission frame of one signal unit, based on the proportion of the high-luminance region, and outputting the transmission frame three times according to the carousel scheme.

[2-6. Advantageous Effects, Etc.]

As described above, the display device according to this embodiment includes the visible light communication processing unit which detects a region of the display panel that has luminance higher than or equal to predetermined luminance, determines the number of identical blocks to be included in the transmission frame according to a size of the region, and generates the plurality of transmission frames for each of the signal units.

This allows the display device 1500 to output a plurality of transmission frames by changing the number of times of transmission of blocks according to the proportion of the high-luminance region for one signal unit, thereby enabling the reception device 1520 to reconstruct a visible light communication signal.

It should be noted that, although a transmission frame is output three times according to the carousel scheme for one signal unit that is output from the display device 1500 according to this embodiment, this example is not limiting. For example, when a transmission frame is output three times or more according to the carousel scheme, it is possible to use transmission frames different from the combination of transmission frames including the second transmission frame in which the blocks are arranged in the following order: Block 1; and Block 2, which is repeated three times.

The display device 1500 according to this embodiment is particularly effective in the case where the drive frequency of the liquid crystal panel and the frame rate of the image sensor are in the relationship of an integral multiple or a unit fraction, and the transmission frames are output from the display device 1500 in synchronization with the drive frequency of the liquid crystal panel.

Embodiment 26

The following describes Embodiment 26 with reference to FIG. 370 to FIG. 373.

[3-1. Configuration of Visible Light Communication System]

A visible light communication system according to this embodiment has the same configuration as the visible light communication system 1500S described in Embodiment 24. The following description of the visible light communication system according to this embodiment focuses on differences from the visible light communication system 1500S.

[3-2. Relationship Between Distance from Display Device and Transmission of Visible Light Communication Signal]

The following describes comparison between the case where a distance between the display device 1500 and the reception device 1520 is relatively small and the case where a distance between the display device 1500 and the reception device 1520 is relatively great. When the distance between the display device 1500 and the reception device 1520 is relatively small, the number of blocks included in a image captured by the reception device 1520 is larger than in the case where the distance between the display device 1500 and the reception device 1520 is relatively great.

This is because a captured image that can be generated by the imaging unit 1521 of the reception device 1520 is relatively large when the distance between the display device 1500 and the reception device 1520 is relatively small, and a captured image that can be generated by the imaging unit 1521 of the reception device 1520 is relatively small when the distance between the display device 1500 and the reception device 1520 is relatively large.

In view of the above, the display device 1500 according to this embodiment changes the number of times of transmission of an arbitrary block of a transmission frame for one signal unit, based on a distance from the reception device 1520.

[3-3. Operations of the Visible Light Communication Signal Processing Unit]

Embodiment 26 is different from Embodiment 24 mainly in the operation of the visible light communication signal processing unit 1506. The following describes the operation of the visible light communication signal processing unit 1506. FIG. 370 is a flowchart for describing the operation of the visible light communication signal processing unit 1506 of the display device 1500 according to Embodiment 26.

Operations in step S1501 to step S1503 are the same as the operations described in Embodiment 24.

(Step S1401) The visible light communication signal processing unit 1506 determines the number of times of transmission of each block of a transmitting unit, based on the distance from the reception device 1520. The method of determining the number of times of transmission will be described later.

(Step S1402) The visible light communication signal processing unit 1506 determines an order of transmission of blocks, based on the number of times of transmission of each block of the signal unit. The method of determining the order of transmission will be described later.

Operations in step S1505 and step S1506 are the same as the operations described in Embodiment 24.

[3-4. Method of Determining the Number of Times of Transmission of Block]

The following describes how to determine the number of times of transmission of a block. FIG. 371 illustrates an example of how to determine the number of times of transmitting an arbitrary block of a transmission frame for one signal unit.

In FIG. 371, the horizontal axis represents a distance between the display device 1500 and the reception device 1520, and the vertical axis represents the number of times of transmission of an arbitrary block in a signal unit. When the distance is small, the number of times of transmission of each block in a signal unit is reduced. In FIG. 371, each block in a signal unit is transmitted once when the distance is three meters (m) or smaller.

When the distance is great, the number of times of transmission of each block in a signal unit is increased. In FIG. 371, the number of times of transmission of each block in a signal unit is incremented by one for every two meters of increase in the distance starting at three meters.

It should be noted that the rate of increase in the distance may be changed as necessary.

[3-5. Method of Determining Order of Transmission of Blocks]

The following describes how to determine the order of transmission of blocks for one signal unit. FIG. 372 is a diagram for describing an example of generating a transmission frame for one signal unit that is output from the display device 1500 according to Embodiment 26. FIG. 372 illustrates the case where the distance is three meters. A drive frequency of a liquid crystal panel that is the display panel 1504 of the display device 1500 according to this embodiment is 120 Hz, and an image sensor of the imaging unit 1521 of the reception device 1520 operates at a frame rate of 30 fps. Moreover, a transmission frame of the display device 1500 is output in synchronization with the drive frequency of the liquid crystal panel. FIG. 372 illustrates the case where one signal unit of a visible light communication signal that is output from the display device 1500 is output four times according to the carousel scheme. The one signal unit includes four data items each having the same data length, and is coded to generate four blocks.

In FIG. 371, an arbitrary block of one transmission frame in a signal unit is transmitted twice when the distance is three meters. Accordingly, an arbitrary block is transmitted twice in one transmission frame, as illustrated in FIG. 372.

Blocks of the first transmission frame that is output from the display device 1500 are arranged in the following order: Block 1; Block 1; Block 2; and Block 2 so that Block 1 and Block 2 are each output twice. The reception device 1520 exposes the image sensor in an imaging period of one frame rate, for the first transmission frame output from the display device 1500. The reception device 1520 generates a reception frame L which is a captured image based on exposure data. The reception device 1520 reconstructs a visible light communication signal from the reception frame L. Block 1 and Block 2 whose data are fully included in the reception frame L can be reconstructed as a visible light communication signal.

Blocks of the second transmission frame that is output from the display device 1500 are arranged in the following order: Block 3; Block 3; Block 4; and Block 4 so that Block 3 and Block 4 are each output twice. The reception device 1520 exposes the image sensor in an imaging period of one frame rate, for the second transmission frame output from the display device 1500. The reception device 1520 generates a reception frame L+1 which is a captured image based on exposure data. The reception device 1520 reconstructs a visible light communication signal from the reception frame L+1. Block 3 and Block 4 whose data are fully included in the reception frame L+1 can be reconstructed as a visible light communication signal.

Blocks of the third transmission frame that is output from the display device 1500 are arranged in the following order: Block 1; Block 1; Block 2; and Block 2 so that Block 1 and Block 2 are each output twice. The reception device 1520 exposes the image sensor in an imaging period of one frame rate, for the third transmission frame output from the display device 1500. The reception device 1520 generates a reception frame L+2 which is a captured image based on exposure data. The reception device 1520 reconstructs a visible light communication signal from the reception frame L+2. Block 1 and Block 2 whose data are included in the reception frame L+2 can be reconstructed as a visible light communication signal.

Blocks of the fourth transmission frame that is output from the display device 1500 are arranged in the following order: Block 3; Block 3; Block 4; and Block 4 so that Block 3 and Block 4 are each output twice. The reception device 1520 exposes the image sensor in an imaging period of one frame rate, for the fourth transmission frame output from the display device 1500. The reception device 1520 generates a reception frame L+3 which is a captured image based on exposure data. The reception device 1520 reconstructs a visible light communication signal from the reception frame L+3. Block 3 and Block 4 whose data are fully included in the reception frame L+3 can be reconstructed as a visible light communication signal.

As described above, it is possible receive, in each reception frame, one of the blocks resulting from an arbitrary block included in the transmission frame being output twice. Thus, two different blocks can be received from each of the reception frames.

FIG. 373 is a diagram for describing another example of generating a transmission frame for one signal unit that is output from the display device according to Embodiment 26. FIG. 373 illustrates the case where the distance is eight meters. A drive frequency of a liquid crystal panel that is the display panel 1504 of the display device 1500 according to this embodiment is 120 Hz, and an image sensor of the imaging unit 1521 of the reception device 1520 operates at a frame rate of 30 fps. Moreover, a transmission frame of the display device 1500 is output in synchronization with the drive frequency of the liquid crystal panel. FIG. 373 illustrates the case where one signal unit of a visible light communication signal that is output from the display device 1500 is transmitted four times according to the carousel scheme. The one signal unit includes four data items each having the same data length, and is coded to generate four blocks.

In FIG. 371, an arbitrary block of one transmission frame in a signal unit is transmitted four times when the distance is eight meters. Accordingly, an arbitrary block is transmitted four times in one transmission frame, as illustrated in FIG. 373.

Blocks in the first transmission frame that is output from the display device 1500 are arranged so that Block 1 is output four times. The reception device 1520 exposes the image sensor in an imaging period of one frame rate, for the first transmission frame output from the display device 1500. The reception device 1520 generates a reception frame L which is a captured image based on exposure data. The reception device 1520 reconstructs a visible light communication signal from the reception frame L. Block 1 whose data is fully included in the reception frame L can be reconstructed as a visible light communication signal.

Blocks in the second transmission frame that is output for the second time from the display device 1500 are arranged so that Block 2 is output four times. The reception device 1520 exposes the image sensor in an imaging period of one frame rate, for the second transmission frame output from the display device 1500. The reception device 1520 generates a reception frame L+1 which is a captured image based on exposure data. The reception device 1520 reconstructs a visible light communication signal from the reception frame L+1. Block 2 whose data is fully included in the reception frame L+1 can be reconstructed as a visible light communication signal.

Blocks in the third transmission frame that is output from the display device 1500 are arranged so that Block 3 is output four times. The reception device 1520 exposes the image sensor in an imaging period of one frame rate, for the third transmission frame output from the display device 1500. The reception device 1520 generates a reception frame L+2 which is a captured image based on exposure data. The reception device 1520 reconstructs a visible light communication signal from the reception frame L+2. Block 3 whose data is fully included in the reception frame L+2 can be reconstructed as a visible light communication signal.

Blocks in the fourth transmission frame that is output from the display device 1500 are arranged so that Block 4 is output four times. The reception device 1520 exposes the image sensor in an imaging period of one frame rate, for the fourth transmission frame output from the display device 1500. The reception device 1520 generates a reception frame L+3 which is a captured image based on exposure data. The reception device 1520 reconstructs a visible light communication signal from the reception frame L+3. Block 2 whose data is fully included in the reception frame L+3 can be reconstructed as a visible light communication signal.

As described above, it is possible receive, in each reception frame, one of the blocks resulting from an arbitrary block included in the transmission frame being output four times. Thus, one block can be received from each of the reception frames.

[3-6. Advantageous Effects, Etc.]

As described above, according to this embodiment, the visible light communication processing unit determines the number of identical blocks to be included in a transmission frame and generates a plurality of transmission frames for a signal unit, according to a distance between the display device and the reception device capable of receiving a visible light communication signal that has been output.

This allows the display device 1500 to output a plurality of transmission frames by changing the number of times of transmission of blocks according to the distance between the display device 1500 and the reception device 1520, thereby enabling the reception device 1520 to reconstruct a visible light communication signal.

The display device 1500 according to this embodiment is particularly effective in the case where the drive frequency of the liquid crystal panel and the frame rate of the image sensor are in the relationship of an integral multiple or a unit fraction, and the transmission frames are output from the display device 1500 in synchronization with the drive frequency of the liquid crystal panel.

It should be noted that it is desirable that the distance between the display device 1500 and the reception device 1520 can be preset by the display device 1500 and further can be changed as necessary according to the purpose or the placement state of the display device 1500.

The reception device 1520, in specifying a distance, may transmit a setting request to the display device 1500 via wireless communications such as Wireless Fidelity (Wi-Fi), Bluetooth®, and Long Term Evolution (LTE).

In addition, the distance may be estimated by either the display device 1500 or the reception device 1520 using a sensor or a camera.

Furthermore, the generated transmission frame in this embodiment is an example, and this example is not limiting.

In addition, in this embodiment, when two blocks are output more than one time in a transmission frame, the two blocks are output the same number of times. However, it is not necessary to output the two blocks the same number of times.

Embodiment 27

The following describes Embodiment 27 with reference to FIG. 374 to FIG. 376.

[4-1. Configuration of Visible Light Communication System]

A visible light communication system according to this embodiment has the same structure as the visible light communication system 1500S described in Embodiment 24. The following description of the visible light communication system according to this embodiment focuses on differences from the visible light communication system 1500S.

[4-2. Inserting Blank]

FIG. 374 is a diagram for describing an example of generating a transmission frame for one signal unit according to Embodiment 27. A drive frequency of a liquid crystal panel that is the display panel 1504 of the display device 1500 according to this embodiment is 120 Hz, and an image sensor of the imaging unit 1521 of the reception device 1520 operates at a frame rate of 30 fps. Moreover, a transmission frame of the display device 1500 is output in synchronization with the drive frequency of the liquid crystal panel. One signal unit of the visible light communication signal that is output from the display device 1500 is output four times according to the carousel scheme. The one signal unit includes four data items each having the same data length, and is coded to generate four blocks.

According to this embodiment, a blank having the same size as the block is inserted into the transmission frames in such a way that the same blocks are not at the same position therein.

In FIG. 374, blocks and blanks in the first transmission frame that is output from the display device 1500 are arranged in the following order: Block 1; Block 2; Block 3; Block 4; and a blank. The reception device 1520 exposes the image sensor in an imaging period of one frame rate, for the first transmission frame output from the display device 1500. The reception device 1520 generates a reception frame L which is a captured image based on exposure data. The reception device 1520 reconstructs a visible light communication signal from the reception frame L. Only Block 2 and Block 3 whose data are fully included in the reception frame L can be reconstructed as a visible light communication signal.

Blocks and blanks in the second transmission frame that is output from the display device 1500 are arranged in the following order: Block 1; Block 2; Block 3; Block 4; and a blank. Exposure is performed on the image sensor in an imaging period of one frame rate, for the second transmission frame output from the display device 1500. The reception device 1520 generates a reception frame L+1 which is a captured image based on exposure data. The reception device 1520 reconstructs a visible light communication signal from the reception frame L+1. Only Block 1 and Block 2 whose data are fully included in the reception frame L+1 can be reconstructed as a visible light communication signal.

Blocks are blanks in the third transmission frame that is output from the display device 1500 are arranged in the following order: Block 1; Block 2; Block 3; Block 4; and a blank. Exposure is performed on the image sensor in an imaging period of one frame rate, for the third transmission frame output from the display device 1500. The reception device 1520 generates a reception frame L+2 which is a captured image based on exposure data. The reception device 1520 reconstructs a visible light communication signal from the reception frame L+2. Only Block 1 whose data is fully included in the reception frame L+2 can be reconstructed as a visible light communication signal.

Blocks and blanks in the fourth transmission frame that is output from the display device 1500 are arranged in the following order: Block 1; Block 2; Block 3; Block 4; and a blank. Exposure is performed on the image sensor in an imaging period of one frame rate, for the fourth transmission frame output from the display device 1500. The reception device 1520 generates a reception frame L+3 which is a captured image based on exposure data. The reception device 1520 reconstructs a visible light communication signal from the reception frame L+3. Only Block 4 whose data is fully included in the reception frame L+3 can be reconstructed as a visible light communication signal.

It should be noted that a signal pattern of a blank to be inserted may be any pattern as long as the pattern is different from data included in a signal unit.

As described above, when the drive frequency of the liquid crystal panel and the frame rate of the image sensor are in the relationship of an integral multiple or a unit fraction, and the transmission frames are output from the display device 1500 in synchronization with the drive frequency of the liquid crystal panel, it is possible, by inserting a blank to the transmission frames for one signal unit, to avoid synchronization of timing of turning ON and OFF of the backlight 1508 of the display device 1500 with the drive frequency of the liquid crystal panel, and to reconstruct all of Block 1, Block 2, Block 3, and Block 4 of the one signal unit as a visible light communication signal even when the same transmission frame is output four times.

In addition, by setting a size of a blank to be inserted to the same size as a size of a block, it is possible to prevent luminance of an image signal from fluctuating, and the blank is also effective as a luminance adjusting period.

It should be noted that although it has been described that the size of a blank to be inserted is set to the same size as the size of a block, the size of the blank to be inserted is not limited to this example. It is sufficient to determine the size of a blank to be inserted in such a way that the timing of turning ON and OFF of the backlight 1508 of the display device 1500 is not in synchronization with a drive frequency of the liquid crystal panel.

In addition, the size of each blank to be inserted is not necessarily the same size.

Furthermore, the example of generating a transmission frame in which a blank is inserted is not limiting.

FIG. 375A is a diagram for describing a second example of generating a transmission frame for one signal unit according to Embodiment 27.

In FIG. 375A, a blank is provided at the end of the transmission frame, and the order of transmitting blocks of each transmission frame is different as described in Embodiment 24. Accordingly, blocks and blanks in the first transmission frame that is output from the display device 1500 are arranged in the following order: Block 1; Block 2; Block 3; Block 3; and a blank. Blocks and blanks in the second transmission frame that is output from the display device 1500 are arranged in the following order: Block 4; Block 3; Block 2; Block 1; and a blank. Blocks and blanks in the third transmission frame that is output from the display device 1500 are arranged in the following order: Block 2; Block 3; Block 4; Block 1; and a blank.

FIG. 375B is a diagram for describing a third example of generating a transmission frame for one signal unit according to Embodiment 27.

In FIG. 375B, a blank is provided next to each block of the transmission frame. More specifically, blocks and blanks in the transmission frame that is output from the display device 1500 are arranged in the following order: Block 1; a blank; Block 2; a blank; Block 3; a blank; Block 4; and a blank. The size of a blank to be inserted is a length of a block×α (α is a decimal of $0<\alpha\leq 1$), and α is determined in such a way that the timing of turning ON and OFF of the backlight 1508 of the display device 1500 is not in synchronization with a drive frequency of the liquid crystal panel.

FIG. 375C is a diagram for describing a fourth example of generating a transmission frame for one signal unit according to Embodiment 27.

In FIG. 375C, a blank is provided next to an arbitrary block of the transmission frame. More specifically, blocks and blanks in the transmission frame that is output from the display device 1500 are arranged in the following order: Block 1; a blank; Block 2; a blank; Block 3; and Block 4.

[4-3. Operations of Visible Light Communication Signal Processing Unit]

Embodiment 27 is different from Embodiment 24 mainly in the operation of the visible light communication signal processing unit 1506. The following describes the operation of the visible light communication signal processing unit 1506. FIG. 376 is a flowchart for describing the operation of the visible light communication signal processing unit 1506 of the display device 1500 according to Embodiment 27.

Operations in step S1501 and step S1502 are the same as the operations described in Embodiment 24.

(Step S1531) The visible light communication signal processing unit 1506 determines a position of inserting a blank in a transmitting unit.

(Step S1532) The visible light communication signal processing unit 1506 determines a size of the blank.

Operations in step S1503 to step S1506 are the same as the operations described in Embodiment 24.

[4-4. Advantageous Effects, Etc.]

As described above, in the display device according to this embodiment, the visible light communication processing unit inserts a blank into at least one transmission frame among a plurality of transmission frames for one signal unit.

With this, it is possible, by inserting a blank to the transmission frames for one signal unit, to avoid synchronization of timing of turning ON and OFF of the backlight 1508 of the display device 1500 with a drive frequency of a liquid crystal panel, and to reconstruct a visible light communication signal by the reception device 1520.

The display device 1500 according to this embodiment is particularly effective in the case where the drive frequency of the liquid crystal panel and the frame rate of the image sensor are in the relationship of an integral multiple or a unit fraction, and the transmission frames are output from the display device 1500 in synchronization with the drive frequency of the liquid crystal panel.

Other Embodiments

Embodiments 24 to 27 are described above as examples of a technique of the present disclosure. The technique of the present disclosure is not limited to the examples described above, and is applicable also to an embodiment including changes, substitutions, additions, omissions, etc. In addition, it is also possible to combine the structural elements described in Embodiments 24 to 27 above to form a new embodiment.

It should be noted that although generating a transmission frame in the case where the transmission frames are output in synchronization with a drive frequency of a liquid crystal panel is exemplified, the display device according to the present disclosure is not limited to this example.

For example, even when a transmission frame is output from the display device not in synchronization with a drive frequency of a liquid crystal panel, this embodiment is effective in the case where a carrier frequency for outputting the transmission frame is an integral multiple of a frequency of an image sensor.

In addition, although the case where the display panel of the display device is a liquid crystal panel has been described, this example is not limiting.

For example, even when the display device is a signboard including an image film which is illuminated from behind by an LED or the like, this embodiment is effective in the case where a carrier frequency of a transmission frame that is output from the display device is an integral multiple of a frequency of an image sensor of the reception device.

The display device according to the present disclosure is applicable to display devices capable of outputting a visible light communication signal. Examples of such display devices include: household devices such as televisions, personal computers, and tablet terminals; outdoor signage terminals; information terminals; and information display devices.

(Summary)

The display device according to a first aspect of the present disclosure is a display device capable of outputting a visible light communication signal including a plurality of signal units according to a carousel scheme, and includes: a display panel which displays an image signal; a visible light communication processing unit which codes the signal units, divides each of the signal units into a plurality of blocks, and generates a plurality of transmission frames using the plurality of blocks to generate a backlight control signal; and a backlight which illuminates the display panel from behind based on the backlight control signal. The plurality of blocks are arranged in different orders in at least two of the plurality of transmission frames for one of the signal units generated by the visible light communication processing unit.

The display device according to a second aspect of the present disclosure is the display device according to the first aspect, in which, among the plurality of transmission frames for one of the signal units generated by the visible light communication processing unit, at least two adjacent transmission frames include identical blocks.

The display device according to a third aspect of the present disclosure is the display device according to the first aspect, in which at least one of the plurality of transmission frames for one of the signal units generated by the visible light communication processing unit includes a plurality of identical blocks, and each of the plurality of blocks is included in one of the plurality of transmission frames.

The display device according to a fourth aspect of the present disclosure is the display device according to the third aspect, in which the visible light communication processing unit detects a region of the display panel that has luminance higher than or equal to predetermined luminance, determines the number of identical blocks to be included in the transmission frame according to a size of the region, and generates the plurality of transmission frames for each of the signal units.

The display device according to a fifth aspect of the present disclosure is the display device according to the third aspect, in which the visible light communication processing unit determines the number of identical blocks to be included in the transmission frame according to a distance between the display device and a reception device capable of receiving the visible light communication signal that has been output, and generates the plurality of transmission frames for each of the signal units.

The display device according to a sixth aspect of the present disclosure is the display device according to the first aspect, in which the visible light communication processing unit inserts a reset signal between two adjacent ones of the signal units.

The display device according to a seventh aspect of the present disclosure is the display device according to the first aspect, in which the visible light communication processing unit inserts a blank into at least one of the plurality of transmission frames for one of the signal unit.

The display method according to an eighth aspect of the present disclosure is a display method that allows output of a visible light communication signal including a plurality of signal units according to a carousel scheme, and includes: a first step of coding the signal units, dividing the signal units into a plurality of blocks, generating a plurality of transmission frames to be output according to the carousel scheme using the plurality of blocks, and outputting the transmission frames as a backlight control signal; and a second step of controlling a backlight based on the backlight control signal. The plurality of blocks are arranged in different orders in at least two of the plurality of transmission frames for one of the signal units generated in the first step.

Embodiment 28

FIG. 377 is a diagram for describing control of switching visible light communication (VLC) performed when a transmitting apparatus is a video display device such as a television.

Specifically, (a) of FIG. 377 illustrates video including a plurality of pictures, (b) of FIG. 377 illustrates ON and OFF control of a backlight of a video display device performed when the visible light communication is OFF, and (c) of FIG. 377 illustrates ON and OFF control of the backlight of the video display device performed when the visible light communication is ON.

As illustrated in (a) of FIG. 377, when video 1600 including a plurality of pictures P1601, P1602, P1603, P1604, P1605, P1606, . . . , is reproduced, the plurality of pictures P1601, P1602, P1603, P1604, P1605, P1606, . . . , are displayed on the video display device at time t1601, t1603, t1605, t1607, t1609, t1611, . . . , respectively. Note that time t1 is a point of time at which the video 1600 starts being displayed, and may be an absolute point in time or may be a point of time selected by a user. Time t1603, t1605, t1607, t1609, t1611, . . . , are points of time at a predetermined time interval Δt1600 starting from time t1. In other words, time t1603, t1605, t1607, t1609, t1611, . . . , are points of time determined in a cycle (at the predetermined time interval Δt1600).

When the video 1600 is reproduced, some liquid crystal displays, in particular, perform control of inserting an all-black picture between adjacent pictures in order to reduce the occurrence of blurred images being displayed as the video 1600. In the case of such a video display device, at time t1602, t1604, t1606, t1608, t1610, t1612, . . . , between time t1601, t1603, t1605, t1607, t1609, t1611, . . . at which the plurality of pictures P1601, P1602, P1603, P1604, P1605, P1606, . . . , are displayed, the backlight of the video display device is turned OFF under control as illustrated in (b) of FIG. 377 in order that the all-black pictures are inserted. In other words, the control is such that the backlight is turned ON at time t1601, t1603, t1605, t1607, t1609, t1611, . . . , at which the plurality of pictures P1601, P1602, P1603, P1604, P1605, P1606, . . . , are displayed, and the backlight is turned OFF at time t1602, t1604, t1606, t1608, t1610, t1612, . . . .

Turning OFF of the backlight while visible light communication is performed, however, results in loss of the communication during the period in which the backlight is OFF. Therefore, as illustrated in (c) of FIG. 377, the control is performed such that the backlight remains ON even while the video 1600 is being reproduced when the visible light communication is performed (that is, when the VLC is ON). Thus, the transmitting apparatus in this case switches the control between keeping the backlight ON as in (c) of FIG. 377 when the visible light communication is performed, and repeating turning ON and OFF of the backlight as in (b) of FIG. 377 when the visible light communication is not performed. With this, the occurrence of communication loss can be reduced when the visible light communication is performed, and the occurrence of blurred images being reproduced as the video 1600 can be reduced when the visible light communication is not performed.

Embodiment 29

In this embodiment, how to send a protocol of the visible light communication is described.

FIG. 378 and FIG. 379 illustrate a flow for transmitting, via visible light communication, logical data (for example, ID or the like) to be used in an app layer.

First, a logical data error correction code assigning unit 1701 assigns a logical data correction code 1712 which is an error correction code to logical data 1711 which is to be used in the app layer.

Next, a logical data dividing unit 1702 divides the logical data 1711 and the logical data correction code 1712 into data parts of such a size that the data parts can be transmitted, to generate a plurality of divided logical data items 1713. Furthermore, the logical data dividing unit 1702 assigns a dividing type 1714 and an address 1715 to each of the divided logical data items 1713.

A data modulation unit 1703 converts the data generated by the logical data dividing unit 1702, into a data sequence that can be transmitted, to generate physical data 1716 that is to be transmitted.

Note that the logical data error correction code assigning unit 1701 uses a coding scheme involving CRC, Reed-Solomon codes, or the like according to the size of logical data or the status of the transmission path. There are cases where the logical data correction code 1712 is assigned to the start of the logical data 1711, where the logical data correction code 1712 is assigned to the end of the logical data 1711, and where the logical data correction code 1712 is provided at a specified position of the logical data 1711.

Note that the logical data dividing unit 1702 can vary the size of data that is to be obtained by the division, to determine a limit distance and a reception speed that allow signals to be received via the visible light communication. Furthermore, by varying the dividing method, the logical data dividing unit 1702 is capable of not only improving resistance to burst errors in addition to error resilience provided by way of the logical data correction code 1712 and a physical data correction code 1717, but also improving confidentiality at the time of decoding the data.

Note that the data modulation unit 1703 is capable of brightness control or modulation percentage control by varying quantization or sampling data equivalent to one bit of logical data depending on the device characteristics of a visible light communication transmission unit (for example, a lighting device is required to place the highest priority to maintain brightness, and a display is required to be compatible with video or still images) regardless of the type of modulation such as PPM or Manchester modulation. For example, the data modulation unit 1703 is capable of brightness control by switching between a process using binary values such as the case where “1” of physical data indicates a state where light is being emitted and “0” of physical data indicates a state where no light is being emitted and a process with the settings in which “2” indicates 100% brightness of light emission, “1” indicates 50% brightness of light emission, and “0” indicates 0% brightness of light emission. Furthermore, with the settings in which “1” of physical data indicates a state where light is being emitted and “0” of physical data indicates a state where no light is being emitted, the data modulation unit 1703 can switch, for example, between modulating logical data “01” into physical data “0100” and modulating the logical data “01” into physical data “11001111,” to control the average brightness depending on the transmission size of the physical data.

Next, the physical data error correction code assigning unit 1704 assigns the physical data correction code 1717 which is an error correction code to the physical data 1716 generated by the data modulation unit 1703.

Next, a physical data header inserting unit 1705 assigns a header 1718 for indicating the start position of the physical data 1716 to the physical data 1716. The resultant data is transmitted by the visible light communication transmission unit as visible light communication data.

Note that the physical data error correction code assigning unit 1704 uses a coding scheme involving CRC, Reed-Solomon codes, or the like according to the size of the physical data 1716 or the status of the transmission path. There are cases where the physical data correction code 1717 is assigned to the start of the physical data 1716, where the physical data correction code 1717 is assigned to the end of the physical data 1716, and where the physical data correction code 1717 is provided at a specified position of the physical data 1716.

Note that the physical data header inserting unit 1705 inserts, as a header, preamble data with which a visible light communication reception unit can identify the start of the physical data of the visible light communication data. The preamble data to be inserted is a data sequence which never appears in data obtained by combining the physical data 1716 and the physical data correction code 1717 which are to be transmitted. The physical data header inserting unit 1705 can control a flicker level and necessary brightness of the visible light communication transmission unit by changing the size of the preamble data and a preamble data sequence. Furthermore, the preamble data can be used by the visible light communication reception unit, for example, to identify the type of the device. For example, the preamble data is set in such a way that the difference between the brightness of combined data of the physical data 1716 and the physical data correction code 1717 being transmitted and the brightness of the preamble data being transmitted is minimized, and thus it is possible to reduce flicker. In addition, it is possible to make an adjustment to reduce the brightness of the preamble data by reducing the length of light emission in the preamble.

Furthermore, a general interleaving method can be used in the dividing process by the logical data dividing unit 1702. FIG. 380 is a diagram for describing the dividing process performed by the logical data dividing unit 1702.

FIG. 380 illustrates an example of divided data resulting from dividing data including logical data "010011000111010" into three parts. For example, as illustrated in (a) of FIG. 380, the logical data dividing unit 1702 partitions the logical data 1711 and the logical data correction code 1712 sequentially from the start into a plurality of 5-bit divided logical data items 1713. Alternatively, as illustrated in (b) of FIG. 380, the logical data dividing unit 1702 generates a plurality of divided logical data items 1713 by assigning the logical data 1711 and the logical data correction code 1712 on a bit-by-bit basis sequentially from the start to the divided logical data items 1713.

Furthermore, as illustrated in FIG. 381, the logical data dividing unit 1702 may generate a plurality of divided logical data items 1713 by defining the number of skips required to divide the logical data, and assigning, sequentially from the start, the number of bits of the logical data 1711 and the logical data correction code 1712 that is equal to the number of skips to each of the divided logical data items 1713.

In this case, when the logical data dividing unit 1702 arbitrarily selects the number of skips, it is possible to provide confidentiality such that a visible light communication reception unit that is not informed of the number of skips is not able to reconstruct the logical data. Note that the logical data dividing unit 1702 may perform the dividing process by using a hash value output as a result of applying a hash function based on the arbitrary value, or may use an arbitrary arithmetic expression according to which a selected bit for division is uniquely identified.

Furthermore, the logical data dividing unit 1702 can use time as an arbitrary value to provide confidentiality such that data can be received only at specified time. Moreover, the logical data dividing unit 1702 can use a television channel number as an arbitrary value as well, to develop a service in which data can be received only on a specified channel. In addition, the logical data dividing unit 1702 can use a location-related value as an arbitrary value such that data can be used only at the location.

Note that the present disclosure may include the following embodiments.

A transmitter includes a visible light transmission unit and a human sensor unit. A person is sensed by the human sensor, and then transmission starts. The transmission is performed in a direction in which the person is sensed by the human sensor. With this, power consumption can be reduced.

A receiver receives an ID of the transmitter, adds address information or current position information thereto, and transmits resultant data. A server transmits, to the receiver, a code for providing settings that are most appropriate for the received address or position. The receiver displays, on a screen, the code received from the server, and thus prompts a user to configure the transmitter with the settings. This makes it possible, for example, to configure rice cookers, washing machines, and the like with the most appropriate settings for water quality in a residential area.

The receiver changes the setting of exposure time for each of the captured frames to receive a visible light signal in a frame captured with short exposure time and receive another signal or a marker, for example, a two-dimensional barcode, or perform object recognition, image recognition, etc., in a frame captured with long exposure time. Thus, it is possible to receive visible light and receive another signal or marker at the same time.

The receiver makes a small change to the exposure time for each frame, and captures images with different exposure time. With this, even when the modulation frequency of the transmission signal is unknown, the captured images include an image of a frame captured with appropriate exposure time, allowing the signal to be demodulated. When a plurality of images based on the same signal is captured with different exposure time, it is possible to demodulate a reception signal more efficiently.

When the receiver receives an ID included in a predetermined range, the receiver directly sends the received ID to another processing unit without sending an inquiry to the server. With this, a quick response can be obtained. Furthermore, processing can be performed even when the receiver cannot be connected to the server. In addition, it is possible to check operation before setting content in the server.

The transmitter represents a transmission signal by way of amplitude modulation. Here, the duration of one of a low-luminance state and a high-luminance state is the same in a plurality of symbols representing different signals. This enables the signal representation even under a low-frequency clock control.

The transmitter registers a transmission ID and content with the server at the time of startup. Thus, desired content can be transmitted from the server to the receiver.

A part of the ID can be freely set by the transmitter. Thus, a code indicating a state of the transmitter can be included in the ID. The receiver and the server may refer to this part to change content which is to be displayed, or may ignore this part.

(Multi-Level Amplitude Pulse Signal)

FIG. 382, FIG. 383, and FIG. 384 are diagrams illustrating an example of a transmission signal in this embodiment.

Pulse amplitude is given a meaning, and thus it is possible to represent a larger amount of information per unit time. For example, amplitude is classified into three levels, which allows three values to be represented in 2-slot transmission time with the average luminance maintained at 50% as in FIG. 382. However, when (c) of FIG. 382 continues in transmission, it is hard to notice the presence of the signal because the luminance does not change. In addition, three values are a little hard to handle in digital processing.

In view of this, four symbols of (a) to (d) of FIG. 383 are used to allow four values to be represented in average 3-slot transmission time with the average luminance maintained at 50%. Although the transmission time differs depending on the symbol, the last state of a symbol is set to a low-luminance state so that the end of the symbol can be recognized. The same effect can be obtained also when the high-luminance state and the low-luminance state are interchanged. It is not appropriate to use (e) of FIG. 383 because this is indistinguishable from the case where the signal in (a) of FIG. 383 is transmitted twice. In the case of (f) and (g) of FIG. 383, it is a little hard to recognize such signals because intermediate luminance continues, but such signals are usable.

Assume that patterns in (a) and (b) of FIG. 384 are used as a header. Spectral analysis shows that a particular frequency component is strong in these patterns. Therefore, when these patterns are used as a header, the spectral analysis enables signal detection.

As in (c) of FIG. 384, a transmission packet is configured using the patterns illustrated in (a) and (b) of FIG. 384. The pattern of a specific length is provided as the header of the entire packet, and the pattern of a different length is used as a separator, which allows data to be partitioned. Furthermore, signal detection can be facilitated when this pattern is included at a midway position of the signal. With this, even when the length of one packet is longer than the length of time that an image of one frame is captured, data items can be combined and decoded. This also makes it possible to provide a variable-length packet by adjusting the number of separators. The length of the pattern of a packet header may represent the length of the entire packet. In addition, the separator may be used as the packet header, and the length of the separator may represent the address of data, allowing the receiver to combine partial data items that have been received.

The transmitter repeatedly transmits a packet configured as just described. Packets 1 to 4 in (c) of FIG. 384 may have the same content, or may be different data items which are combined at the receiver side.

Embodiment 30

This embodiment describes each example of application using a receiver such as a smartphone and a transmitter for transmitting information as a blink pattern of an LED or an organic EL device in each of the embodiments described above.

FIG. 385A is a diagram for describing a transmitter in this embodiment.

A transmitter in this embodiment is configured as a backlight of a liquid crystal display, for example, and includes a blue LED 2303 and a phosphor 2310 including a green phosphorus element 2304 and a red phosphorus element 2305.

The blue LED 2303 emits blue (B) light. When the phosphor 2310 receives as excitation light the blue light emitted by the blue LED 2303, the phosphor 2310 produces yellow (Y) luminescence. That is, the phosphor 2310 emits yellow light. In detail, since the phosphor 2310 includes the green phosphorus element 2304 and the red phosphorus element 2305, the phosphor 2130 emits yellow light by the luminescence of these phosphorus elements. When the green phosphorus element 2304 out of these two phosphorus elements receives as excitation light the blue light emitted by the blue LED 2303, the green phosphorus element 2304 produces green luminescence. That is, the green phosphorus element 2304 emits green (G) light. When the red phosphorus element 2305 out of these two phosphorus elements receives as excitation light the blue light emitted by the blue LED 2303, the red phosphorus element 2305 produces red luminescence. That is, the red phosphorus element 2305 emits red (R) light. Thus, each light of RGB or Y (RG) B is emitted, with the result that the transmitter outputs white light as a backlight.

This transmitter transmits a visible light signal of white light by changing luminance of the blue LED 2303 as in each of the above embodiments. At this time, the luminance of the white light is changed to output a visible light signal having a predetermined carrier frequency.

A barcode reader emits red laser light to a barcode and reads a barcode based on a change in the luminance of the red laser light reflected off the barcode. There is a case where a frequency of this red laser light used to read the barcode is equal or approximate to a carrier frequency of a visible light signal outputted from a typical transmitter that has been in practical use today. In this case, an attempt by the barcode reader to read the barcode irradiated with white light, i.e., a visible light signal transmitted from the typical transmitter, may fail due to a change in the luminance of red light included in the white light. In short, an error occurs in reading a barcode due to interference between the carrier frequency of a visible light signal (in particular, red light) and the frequency used to read the barcode.

In order to prevent this, in this embodiment, the red phosphorus element 2305 includes a phosphorus material having higher persistence than the green phosphorus element 2304. This means that in this embodiment, the red phosphorus element 2305 changes in luminance at a sufficiently lower frequency than a luminance change frequency of the blue LED 2303 and the green phosphorus element 2304. In other words, the red phosphorus element 2305 reduces the luminance change frequency of a red component included in the visible light signal.

FIG. 385B is a diagram illustrating a change in luminance of each of R, G, and B.

Blue light being outputted from the blue LED 2303 is included in the visible light signal as illustrated in (a) in FIG. 385B. The green phosphorus element 2304 receives the blue light from the blue LED 2303 and produces green luminescence as illustrated in (b) in FIG. 385B. This green phosphorus element 2304 has low persistence. Therefore, when the blue LED 2303 changes in luminance, the green phosphorus element 2304 emits green light that changes in luminance at substantially the same frequency as the luminance change frequency of the blue LED 2303 (that is, the carrier frequency of the visible light signal).

The red phosphorus element 2305 receives the blue light from the blue LED 2303 and produces red luminescence as illustrated in (c) in FIG. 385B. This red phosphorus element 2305 has high persistence. Therefore, when the blue LED 2303 changes in luminance, the red phosphorus element 2305 emits red light that changes in luminance at a lower frequency than the luminance change frequency of the blue LED 2303 (that is, the carrier frequency of the visible light signal).

FIG. 386 is a diagram illustrating persistence properties of the green phosphorus element 2304 and the red phosphorus element 2305 in this embodiment.

When the blue LED 2303 is ON without changing in luminance, for example, the green phosphorus element 2304 emits green light having intensity $I=I_0$ without changing in luminance (i.e. light having a luminance change frequency f=0). Furthermore, even when the blue LED 2303 changes in luminance at a low frequency, the green phosphorus element 2304 emits green light that has intensity $I=I_0$ and changes in luminance at frequency f that is substantially the same as the low frequency. In contrast, when the blue LED 2303 changes in luminance at a high frequency, the intensity I of the green light, emitted from the green phosphorus element 2304, that changes in luminance at the frequency f that is substantially the same as the high frequency, is lower than intensity $I_0$ due to influence of an afterglow of the green phosphorus element 2304. As a result, the intensity I of green light emitted from the green phosphorus element 2304 continues to be equal to $I_0$ ($I=I_0$) when the frequency f of luminance change of the light is less than a threshold $f_b$, and is gradually lowered when the frequency f increases over the threshold $f_b$ as indicated by a dotted line in FIG. 386.

Furthermore, in this embodiment, persistence of the red phosphorus element 2305 is higher than persistence of the green phosphorus element 2304. Therefore, the intensity I of red light emitted from the red phosphorus element 2305 continues to be equal to $I_0$ ($I=I_0$) when the frequency f of luminance change of the light is less than a threshold $f_a$ lower than the above threshold $f_b$, and is gradually lowered when the frequency f increases over the threshold $f_b$ as indicated by a solid line in FIG. 386. In other words, the red light emitted from the red phosphorus element 2305 is not seen in a high frequency region, but is seen only in a low frequency region, of a frequency band of the green light emitted from the green phosphorus element 2304.

More specifically, the red phosphorus element 2305 in this embodiment includes a phosphorus material with which the red light emitted at the frequency f that is the same as the carrier frequency $f_1$ of the visible light signal has intensity $I=I_1$. The carrier frequency $f_1$ is a carrier frequency of luminance change of the blue light LED 2303 included in the transmitter. The above intensity $I_1$ is one third intensity of the intensity $I_0$ or ($I_0$−10 dB) intensity. For example, the carrier frequency $f_1$ is 10 kHz or in the range of 5 kHz to 100 kHz.

In detail, the transmitter in this embodiment is a transmitter that transmits a visible light signal, and includes: a blue LED that emits, as light included in the visible light signal, blue light changing in luminance; a green phosphorus element that receives the blue light and emits green light as light included in the visible light signal; and a red phosphorus element that receives the blue light and emits red light as light included in the visible light signal. Persistence of the red phosphorus element is higher than persistence of the green phosphorus element. Each of the green phosphorus element and the red phosphorus element may be included in a single phosphor that receives the blue light and emits yellow light as light included in the visible light signal. Alternatively, it may be that the green phosphorus element is included in a green phosphor and the red phosphorus element is included in a red phosphor that is separate from the green phosphor.

This allows the red light to change in luminance at a lower frequency than a frequency of luminance change of the blue light and the green light because the red phosphorus element has higher persistence. Therefore, even when the frequency of luminance change of the blue light and the green light included in the visible light signal of the white light is equal or approximate to the frequency of red laser light used to read a barcode, the frequency of the red light included in the visible light signal of the white light can be significantly different from the frequency used to read a barcode. As a result, it is possible to reduce the occurrences of errors in reading a barcode.

The red phosphorus element may emit red light that changes in luminance at a lower frequency than a luminance change frequency of the light emitted from the blue LED.

Furthermore, the red phosphorus element may include: a red phosphorus material that receives blue light and emits red light; and a low-pass filter that transmits only light within a predetermined frequency band. For example, the low-pass filter transmits, out of the blue light emitted from the blue LED, only light within a low-frequency band so that the red phosphorus material is irradiated with the light. Note that the red phosphorus material may have the same persistence properties as the green phosphorus element. Alternatively, the low-pass filter transmits only light within a low-frequency band out of the red light emitted from the red phosphorus material as a result of the red phosphorus material being irradiated with the blue light emitted from the blue LED. Even when the low-pass filter is used, it is possible to reduce the occurrences of errors in reading a barcode as in the above-mentioned case.

Furthermore, the red phosphor element may be made of a phosphor material having a predetermined persistence property. For example, the predetermined persistence property is such that, assume that (a) $I_0$ is intensity of the red light emitted from the red phosphorus element when a frequency f of luminance change of the red light is 0 and (b) $f_1$ is a carrier frequency of luminance change of the light emitted from the blue LED, the intensity of the red light is not greater than one third of $I_0$ or ($I_0$−10 dB) when the frequency f of the red light is equal to ($f=f_1$).

With this, the frequency of the red light included in the visible light signal can be reliably significantly different from the frequency used to read a barcode. As a result, it is possible to reliably reduce the occurrences of errors in reading a barcode.

Furthermore, the carrier frequency $f_1$ may be approximately 10 kHz.

With this, since the carrier frequency actually used to transmit the visible light signal today is 9.6 kHz, it is possible to effectively reduce the occurrences of errors in reading a barcode during such actual transmission of the visible light signal.

Furthermore, the carrier frequency $f_1$ may be approximately 5 kHz to 100 kHz.

With the advancement of an image sensor (an imaging element) of the receiver that receives the visible light signal, a carrier frequency of 20 kHz, 40 kHz, 80 kHz, 100 kHz, or the like is expected to be used in future visible light communication. Therefore, as a result of setting the above carrier frequency $f_1$ to approximately 5 kHz to 100 kHz, it is possible to effectively reduce the occurrences of errors in reading a barcode even in future visible light communication.

Note that in this embodiment, the above advantageous effects can be produced regardless of whether the green phosphorus element and the red phosphorus element are included in a single phosphor or these two phosphor elements are respectively included in separate phosphors. This means that even when a single phosphor is used, respective persistence properties, that is, frequency characteristics, of red light and green light emitted from the phosphor are different from each other. Therefore, the above advantageous effects can be produced even with the use of a single phosphor in which the persistence property or frequency characteristic of red light is lower than the persistence property or frequency characteristic of green light. Note that lower persistence property or frequency characteristic means higher persistence or lower light intensity in a high-frequency band, and higher persistence property or frequency characteristic means lower persistence or higher light intensity in a high-frequency band.

Although the occurrences of errors in reading a barcode are reduced by reducing the luminance change frequency of the red component included in the visible light signal in the example illustrated in FIGS. 385A to 386, the occurrences of errors in reading a barcode may be reduced by increasing the carrier frequency of the visible light signal.

FIG. 387 is a diagram for explaining a new problem that will occur in an attempt to reduce errors in reading a barcode.

As illustrated in FIG. 387, when the carrier frequency $f_c$ of the visible light signal is about 10 kHz, the frequency of red laser light used to read a barcode is also about 10 kHz to 20 kHz, with the result that these frequencies are interfered with each other, causing an error in reading the barcode.

Therefore, the carrier frequency $f_c$ of the visible light signal is increased from about 10 kHz to, for example, 40 kHz so that the occurrences of errors in reading a barcode can be reduced.

However, when the carrier frequency $f_c$ of the visible light signal is about 40 kHz, a sampling frequency $f_s$ for the receiver to sample the visible light signal by capturing an image needs to be 80 kHz or more.

In other words, since the sampling frequency $f_s$ required by the receiver is high, an increase in the processing load on the receiver occurs as a new problem. Therefore, in order to solve this new problem, the receiver in this embodiment performs downsampling.

FIG. 388 is a diagram for describing downsampling performed by the receiver in this embodiment.

A transmitter 2301 in this embodiment is configured as a liquid crystal display, a digital signage, or a lighting device, for example. The transmitter 2301 outputs a visible light signal, the frequency of which has been modulated. At this time, the transmitter 2301 switches the carrier frequency $f_c$ of the visible light signal between 40 kHz and 45 kHz, for example.

A receiver 2302 in this embodiment captures images of the transmitter 2301 at a frame rate of 30 fps, for example. At this time, the receiver 2302 captures the images with a short exposure time so that a bright line appears in each of the captured images (specifically, frames), as with the receiver in each of the above embodiments. An image sensor used in the imaging by the receiver 2302 includes 1,000 exposure lines, for example. Therefore, upon capturing one frame, each of the 1,000 exposure lines starts exposure at different timings to sample a visible light signal. As a result, the sampling is performed 30,000 times (30 fps×1,000 lines) per second (30 ks/sec). In other words, the sampling frequency $f_s$ of the visible light signal is 30 kHz.

According to a general sampling theorem, only the visible light signals having a carrier frequency of 15 kHz or less can be demodulated at the sampling frequency $f_s$ of 30 kHz.

However, the receiver 2302 in this embodiment performs downsampling of the visible light signals having a carrier frequency $f_c$ of 40 kHz or 45 kHz at the sampling frequency $f_s$ of 30 kHz. This downsampling causes aliasing on the frames. The receiver 2302 in this embodiment observes and analyzes the aliasing to estimate the carrier frequency $f_c$ of the visible light signal.

FIG. 389 is a flowchart illustrating processing operation of the receiver 2302 in this embodiment.

First, the receiver 2302 captures an image of a subject and performs downsampling of the visible light signal of a carrier frequency $f_c$ of 40 kHz or 45 kHz at a sampling frequency $f_s$ of 30 kHz (Step S2310).

Next, the receiver 2302 observes and analyzes aliasing on a resultant frame caused by the downsampling (Step S2311). By doing so, the receiver 2302 identifies a frequency of the aliasing as, for example, 5.1 kHz or 5.5 kHz.

The receiver 2302 then estimates the carrier frequency $f_c$ of the visible light signal based on the identified frequency of the aliasing (Step S2311). That is, the receiver 2302 restores the original frequency based on the aliasing. Here, the receiver 2302 estimates the carrier frequency $f_c$ of the visible light signal as, for example, 40 kHz or 45 kHz.

Thus, the receiver 2302 in this embodiment can appropriately receive the visible light signal having a high carrier frequency by performing downsampling and restoring the frequency based on aliasing. For example, the receiver 2302 can receive the visible light signal of a carrier frequency of 30 kHz to 60 kHz even when the sampling frequency $f_s$ is 30 kHz. Therefore, it is possible to increase the carrier frequency of the visible light signal from a frequency actually used today (about 10 kHz) to between 30 kHz and 60 kHz. As a result, the carrier frequency of the visible light signal and the frequency used to read a barcode (10 kHz to 20 kHz) can be significantly different from each other so that interference between these frequencies can be reduced. As a result, it is possible to reduce the occurrences of errors in reading a barcode.

A reception method in this embodiment is a reception method of obtaining information from a subject, the reception method including: setting an exposure time of an image sensor so that, in a frame obtained by capturing the subject by the image sensor, a plurality of bright lines corresponding to a plurality of exposure lines included in the image sensor appear according to a change in luminance of the subject; capturing the subject changing in luminance, by the image sensor at a predetermined frame rate and with the set exposure time by repeating starting exposure sequentially for the plurality of the exposure lines in the image sensor each at a different time; and obtaining the information by demodulating, for each frame obtained by the capturing, data specified by a pattern of the plurality of the bright lines included in the frame. In the capturing, sequential starts of exposure for the plurality of exposure lines each at a different time are repeated to perform, on the visible light signal transmitted from the subject changing in luminance, downsampling at a sampling frequency lower than a carrier frequency of the visible light signal. In the obtaining, for each frame obtained by the capturing, a frequency of aliasing specified by a pattern of the plurality of bright lines included in the frame is identified, a frequency of the visible light signal is estimated based on the identified frequency of the aliasing, and the estimated frequency of the visible light signal is demodulated to obtain the information.

With this reception method, it is possible to appropriately receive the visible light signal having a high carrier frequency by performing downsampling and restoring the frequency based on aliasing.

The downsampling may be performed on the visible light signal having a carrier frequency higher than 30 kHz. This makes it possible to avoid interference between the carrier frequency of the visible light signal and the frequency used to read a barcode (10 kHz to 20 kHz) so that the occurrences of errors in reading a barcode can be effectively reduced.

Embodiment 31

FIG. 390 is a diagram illustrating processing operation of a reception device (an imaging device). Specifically, FIG. 390 is a diagram for describing an example of a process of switching between a normal imaging mode and a macro imaging mode in the case of reception in visible light communication.

A reception device 1610 receives visible light emitted by a transmission device including a plurality of light sources (four light sources in FIG. 390).

First, when shifted to a mode for visible light communication, the reception device 1610 starts an imaging unit in the normal imaging mode (S1601). Note that when shifted to the mode for visible light communication, the reception device 1610 displays, on a screen, a box 1611 for capturing images of the light sources.

After a predetermined time, the reception device 1610 switches an imaging mode of the imaging unit to the macro imaging mode (S1602). Note that the timing of switching from Step S1601 to Step S1602 may be, instead of when a predetermined time has elapsed after Step S1601, when the reception device 1610 determines that images of the light sources have been captured in such a way that they are included within the box 1611. Such switching to the macro imaging mode allows a user to include the light sources into the box 1611 in a clear image in the normal imaging mode before shifted to the macro imaging mode in which the image is blurred, and thus it is possible to easily include the light sources into the box 1611.

Next, the reception device 1610 determines whether or not a signal from the light source has been received (S1603). When it is determined that a signal from the light source has been received (S1603: Yes), the processing returns to Step S1601 in the normal imaging mode, and when it is determined that a signal from the light sources has not been received (S1603: No), the macro imaging mode in Step 1602 continues. Note that when Yes in Step S1603, a process based on the received signal (e.g. a process of displaying an image represented by the received signal) may be performed.

With this reception device 1610, a user can switch from the normal imaging mode to the macro imaging mode by touching, with a finger, a display unit of a smartphone where light sources 1611 appear, to capture an image of the light sources that appear blurred. Thus, an image captured in the macro imaging mode includes a larger number of bright regions than an image captured in the normal imaging mode. In particular, light beams from two adjacent light sources among the plurality of the light source cannot be received as continuous signals because striped images are separate from each other as illustrated in the left view in (a) in FIG. 390. However, this problem can be solved when the light beams from the two light sources overlap each other, allowing the light beams to be handled upon demodulation as continuously received signals that are to be continuous striped images as illustrated in the right view in (a) in FIG. 390. Since a long code can be received at a time, this produces an advantageous effect of shortening response time. As illustrated in (b) in FIG. 390, an image is captured with a normal shutter and a normal focal point first, resulting in a normal image which is clear. However, when the light sources are separate from each other like characters, even an increase in shutter speed cannot result in continuous data, leading to a demodulation failure. Next, the shutter speed is increased, and a driver for lens focus is set to close-up (macro), with the result that the four light sources are blurred and expanded to be connected to each other so that the data can be received. Thereafter, the focus is set back to the original one, and the shutter speed is set back to normal, to capture a clear image. Clear images are recorded in a memory and are displayed on the display unit as illustrated in (c). This produces an advantageous effect in that only clear images are displayed on the display unit. As compared to an image captured in the normal imaging mode, an image captured in the macro imaging mode includes a larger number of regions brighter than predetermined brightness. Thus, in the macro imaging mode, it is possible to increase the number of exposure lines that can generate bright lines for the subject.

FIG. 391 is a diagram illustrating processing operation of a reception device (an imaging device). Specifically, FIG. 391 is a diagram for describing another example of the process of switching between the normal imaging mode and the macro imaging mode in the case of reception in the visible light communication.

A reception device 1620 receives visible light emitted by a transmission device including a plurality of light sources (four light sources in FIG. 391).

First, when shifted to a mode for visible light communication, the reception device 1620 starts an imaging unit in the normal imaging mode and captures an image 1623 of a wider range than an image 1622 displayed on a screen of the reception device 1620. Image data and orientation information are held in a memory (S1611). The image data represent the image 1623 captured. The orientation information indicates an orientation of the reception device 1620 detected by a gyroscope, a geomagnetic sensor, and an accelerometer included in the reception device 1620 when the image 1623 is captured. The image 1623 captured is an image, the range of which is greater by a predetermined width in the vertical direction or the horizontal direction with reference to the image 1622 displayed on the screen of the reception device 1620. When shifted to the mode for visible light communication, the reception device 1620 displays, on the screen, a box 1621 for capturing images of the light sources.

After a predetermined time, the reception device 1620 switches an imaging mode of the imaging unit to the macro imaging mode (S1612). Note that the timing of switching from Step S1611 to Step S1612 may be, instead of when a predetermined time has elapsed after Step S1611, when the image 1623 is captured and it is determined that image data representing the image 1623 captured has been held in the memory. At this time, the reception device 1620 displays, out of the image 1623, an image 1624 having a size corresponding to the size of the screen of the reception device 1620 based on the image data held in the memory.

Note that the image 1624 displayed on the reception device 1620 at this time is a part of the image 1623 that corresponds to a region predicted to be currently captured by the reception device 1620, based on a difference between an orientation of the reception device 1620 represented by the orientation information obtained in Step 1611 (a position indicated by a white broken line) and a current orientation of the reception device 1620. In short, the image 1624 is an image that is a part of the image 1623 and is of a region corresponding to an imaging target of an image 1625 actually captured in the macro imaging mode. Specifically, in Step S1612, an orientation (an imaging direction) changed from that in Step S1611 is obtained, an imaging target predicted to be currently captured is identified based on the obtained current orientation (imaging direction), the image 1624 that corresponds to the current orientation (imaging direction) is identified based on the image 1623 captured in advance, and a process of displaying the image 1624 is performed. Therefore, when the reception device 1620 moves in a direction of a void arrow from the position indicated by the white broken line as illustrated in the image 1623 in FIG. 391, the reception device 1620 can determine, according to an amount of the movement, a region of the image 1623 that is to be clipped out as the image 1624, and display the image 1624 that is a determined region of the image 1623.

By doing so, even when capturing an image in the macro imaging mode, the reception device 1620 can display, without displaying the image 1625 captured in the macro imaging mode, the image 1624 clipped out of a clearer image, i.e., the image 1623 captured in the normal imaging mode, according to a current orientation of the reception device 1620. In a method in the present disclosure in which, using a blurred image, continuous pieces of visible light information are obtained from a plurality of light sources distant from each other, and at the same time, a stored normal image is displayed on the display unit, the following problem is expected to occur: when a user captures an image using a smartphone, a hand shake may result in an actually captured image and a still image displayed from the memory being different in direction, making it impossible for the user to adjust the direction toward target light sources. In this case, data from the light sources cannot be received. Therefore, a measure is necessary. With an improved technique in the present disclosure, even when a hand shake occurs, an oscillation detection unit such as an image oscillation detection unit or an oscillation gyroscope detects the hand shake, and a target image in a still image is shifted in a predetermined direction so that a user can view a difference from a direction of the camera. This display allows a user to direct the camera to the target light sources, making it possible to capture an optically connected image of separated light sources while displaying a normal image, and thus it is possible to continuously receive signals. With this, signals from separated light sources can be received while a normal image is displayed. In this case, it is easy to adjust an orientation of the reception device 1620 in such a way that images of the plurality of light sources can be included in the box 1621. Note that defocusing means light source dispersion, causing a reduction in luminance to an equivalent degree, and therefore, sensitivity of a camera such as ISO is increased to produce an advantageous effect in that visible light data can be more reliably received.

Next, the reception device 1620 determines whether or not a signal from the light sources has been received (S1613). When it is determined that a signal from the light sources has been received (S1613: Yes), the processing returns to Step S1611 in the normal imaging mode, and when it is determined that a signal from the light sources has not been received (S1613: No), the macro imaging mode in Step 1612 continues. Note that when Yes in Step S1613, a process based on the received signal (e.g. a process of displaying an image represented by the received signal) may be performed.

As in the case of the reception device 1610, this reception device 1620 can also capture an image including a brighter region in the macro imaging mode. Thus, in the macro imaging mode, it is possible to increase the number of exposure lines that can generate bright lines for the subject.

FIG. 392 is a diagram illustrating processing operation of a reception device (an imaging device).

A transmission device 1630 is, for example, a display device such as a television and transmits different transmission IDs at predetermined time intervals Δ1630 by visible light communication. Specifically, transmission IDs, i.e., ID1631, ID1632, ID1633, and ID1634, associated with data corresponding to respective images 1631, 1632, 1633, and 1634 to be displayed at time points t1631, t1632, t1633, and t1634 are transmitted. In short, the transmission device 1630 transmits the ID1631 to ID1634 one after another at the predetermined time intervals Δt1630.

Based on the transmission IDs received by the visible light communication, a reception device 1640 requests a server 1650 for data associated with each of the transmission IDs, receives the data from the server, and displays images corresponding to the data. Specifically, images 1641, 1642, 1643, and 1644 corresponding to the ID1631, ID1632, ID1633, and ID1634, respectively, are displayed at the time points t1631, t1632, t1633, and t1634.

When the reception device 1640 obtains the ID 1631 received at the time point t1631, the reception device 1640 may obtain, from the server 1650, ID information indicating transmission IDs scheduled to be transmitted from the transmission device 1630 at the following time points t1632 to t1634. In this case, the use of the obtained ID information allows the reception device 1640 to be saved from receiving a transmission ID from the transmission device 1630 each time, that is, to request the server 1650 for the data associated with the ID1632 to ID1634 for time points t1632 to t1634, and display the received data at the time points t1632 to t1634.

Furthermore, it may be that when the reception device 1640 requests the data corresponding to the ID1631 at the time point t1631 even if the reception device 1640 does not obtain from the server 1650 information indicating transmission IDs scheduled to be transmitted from the transmission device 1630 at the following time points t1632 to t1634, the reception device 1640 receives from the server 1650 the data associated with the transmission IDs corresponding to the following time points t1632 to t1634 and displays the received data at the time points t1632 to t1634. To put it differently, in the case where the server 1650 receives from the reception device 1640 a request for the data associated with the ID1631 transmitted at the time point t1631, the server 1650 transmits, even without requests from the reception device 1640 for the data associated with the transmission IDs corresponding to the following time points t1632 to t1634, the data to the reception device 1640 at the time points t1632 to t1634. This means that in this case, the server 1650 holds association information indicating association between the time points t1631 to t1634 and the data associated with the transmission IDs corresponding to the time points t1631 to t1634, and transmits, at a predetermined time, predetermined data associated with the predetermined time point, based on the association information.

Thus, once the reception device 1640 successfully obtains the transmission ID1631 at the time point t1631 by visible light communication, the reception device 1640 can receive, at the following time points t1632 to t1634, the data corresponding to the time points t1632 to t1634 from the server 1650 even without performing visible light communication. Therefore, a user no longer needs to keep directing the reception device 1640 to the transmission device 1630 to obtain a transmission ID by visible light communication, and thus the data obtained from the server 1650 can be easily displayed on the reception device 1640. In this case, when the reception device 1640 obtains data corresponding to an ID from the server each time, response time will be long due to time delay from the server. Therefore, in order to accelerate the response, data corresponding to an ID is obtained from the server or the like and stored into a storage unit of the receiver in advance so that the data corresponding to the ID in the storage unit is displayed. This can shorten the response time. In this way, when a transmission signal from a visible light transmitter contains time information on output of a next ID, the receiver does not have to continuously receive visible light signals because a transmission time of the next ID can be known at the time, which produces an advantageous effect in that there is no need to keep directing the reception device to the light source. An advantageous effect of this way is that when visible light is received, it is only necessary to synchronize time information (clock) in the transmitter with time information (clock) in the receiver, meaning that after the synchronization, images synchronized with the transmitter can be continuously displayed even when no data is received from the transmitter.

Furthermore, in the above-described example, the reception device 1640 displays the images 1641, 1642, 1643, and 1644 corresponding to respective transmission IDs, i.e. the ID1631, ID1632, ID1633, and ID1634, at the respective time points t1631, t1632, t1633, and t1634. Here, the reception device 1640 may present information other than images at the respective time points as illustrated in FIG. 393. Specifically, at the time point t1631, the reception device 1640 displays the image 1641 corresponding to the ID1631 and moreover outputs sound or audio corresponding to the ID1631. At this time, the reception device 1640 may further display, for example, a purchase website for a product appearing in the image. Such sound output and displaying of a purchase website are performed likewise at each of the time points other than the time point t1631, i.e., the time points t1632, t1633, and t1634.

Next, in the case of a smartphone including two cameras, left and right cameras, for stereoscopic imaging as illustrated in (b) in FIG. 390, the left-eye camera displays an image of normal quality with a normal shutter speed and a normal focal point, and at the same time, the right-eye camera uses a higher shutter speed and/or a closer focal point or a macro imaging mode, as compared to the left-eye camera, to obtain striped bright lines according to the present disclosure and demodulates data.

This has an advantageous effect in that an image of normal quality is displayed on the display unit while the right-eye camera can receive light communication data from a plurality of separate light sources that are distant from each other.

Embodiment 32

Here, an example of application of audio synchronous reproduction is described below.

FIG. 394 is a diagram illustrating an example of an application in Embodiment 32.

A receiver 1800*a* such as a smartphone receives a signal (a visible light signal) transmitted from a transmitter 1800*b* such as a street digital signage. This means that the receiver 1800*a* receives a timing of image reproduction performed by the transmitter 1800*b*. The receiver 1800*a* reproduces audio at the same timing as the image reproduction. In other words, in order that an image and audio reproduced by the transmitter 1800*b* are synchronized, the receiver 1800*a* performs synchronous reproduction of the audio. Note that the receiver 1800*a* may reproduce, together with the audio, the same image as the image reproduced by the transmitter 1800*b* (the reproduced image), or a related image that is related to the reproduced image. Furthermore, the receiver 1800*a* may cause a device connected to the receiver 1800*a* to reproduce audio, etc. Furthermore, after receiving a visible light signal, the receiver 1800*a* may download, from the server, content such as the audio or related image associated with the visible light signal. The receiver 1800*a* performs synchronous reproduction after the downloading.

This allows a user to hear audio that is in line with what is displayed by the transmitter 1800*b*, even when audio from the transmitter 1800*b* is inaudible or when audio is not reproduced from the transmitter 1800*b* because audio reproduction on the street is prohibited. Furthermore, audio in line with what is displayed can be heard even in such a distance that time is needed for audio to reach.

Here, multilingualization of audio synchronous reproduction is described below.

FIG. 395 is a diagram illustrating an example of an application in Embodiment 32.

Each of the receiver 1800*a* and a receiver 1800*c* obtains, from the server, audio that is in the language preset in the receiver itself and corresponds, for example, to images, such as a movie, displayed on the transmitter 1800*d*, and reproduces the audio. Specifically, the transmitter 1800*d* transmits, to the receiver, a visible light signal indicating an ID for identifying an image that is being displayed. The receiver receives the visible light signal and then transmits, to the server, a request signal including the ID indicated by the visible light signal and a language preset in the receiver itself. The receiver obtains audio corresponding to the request signal from the server, and reproduce the audio. This allows a user to enjoy a piece of work displayed on the transmitter 1800*d*, in the language preset by the user themselves.

Here, an audio synchronization method is described below.

FIG. 396 and FIG. 397 are diagrams illustrating an example of a transmission signal and an example of an audio synchronization method in Embodiment 32.

Mutually different data items (for example, data 1 to data 6 in FIG. 396) are associated with time points which are at a regular interval of predetermined time (N seconds). These data items may be an ID for identifying time, or may be time, or may be audio data (for example, data of 64 Kbps), for example. The following description is based on the premise that the data is an ID. Mutually different IDs may be ones accompanied by different additional information parts.

It is desirable that packets including IDs be different. Therefore, IDs are desirably not continuous. Alternatively, in packetizing IDs, it is desirable to adopt a packetizing method in which non-continuous parts are included in one packet. An error correction signal tends to have a different pattern even with continuous IDs, and therefore, error correction signals may be dispersed and included in plural packets, instead of being collectively included in one packet.

The transmitter 1800*d* transmits an ID at a point of time at which an image that is being displayed is reproduced, for example. The receiver is capable of recognizing a reproduction time point (a synchronization time point) of an image displayed on the transmitter 1800*d*, by detecting a timing at which the ID is changed.

In the case of (a), a point of time at which the ID changes from ID:1 to ID:2 is received, with the result that a synchronization time point can be accurately recognized.

When the duration N in which an ID is transmitted is long, such an occasion is rare, and there is a case where an ID is received as in (b). Even in this case, a synchronization time point can be recognized in the following method.

(b1) Assume a midpoint of a reception section in which the ID changes, to be an ID change point. Furthermore, a time point after an integer multiple of the duration N elapses from the ID change point estimated in the past is also estimated as an ID change point, and a midpoint of plural ID change points is estimated as a more accurate ID change point. It is possible to estimate an accurate ID change point gradually by such an algorithm of estimation.

(b2) In addition to the above condition, assume that no ID change point is included in the reception section in which the ID does not change and at a time point after an integer multiple of the duration N elapses from the reception section, gradually reducing sections in which there is a possibility that the ID change point is included, so that an accurate ID change point can be estimated.

When N is set to 0.5 seconds or less, the synchronization can be accurate.

When N is set to 2 seconds or less, the synchronization can be performed without a user feeling a delay.

When N is set to 10 seconds or less, the synchronization can be performed while ID waste is reduced.

FIG. 397 is a diagram illustrating an example of a transmission signal in Embodiment 32.

In FIG. 397, the synchronization is performed using a time packet so that the ID waste can be avoided. The time packet is a packet that holds a point of time at which the signal is transmitted. When a long time section needs to be expressed, the time packet is divided to include a time packet 1 representing a finely divided time section and a time packet 2 representing a roughly divided time section. For example, the time packet 2 indicates the hour and the minute of a time point, and the time packet 1 indicates only the second of the time point. A packet indicating a time point may be divided into three or more time packets. Since a roughly divided time section is not so necessary, a finely divided time packet is transmitted more than a roughly divided time packet, allowing the receiver to recognize a synchronization time point quickly and accurately.

This means that in this embodiment, the visible light signal indicates the time point at which the visible light signal is transmitted from the transmitter 1800*d*, by including second information (the time packet 2) indicating the hour and the minute of the time point, and first information (the time packet 1) indicating the second of the time point. The receiver 1800*a* then receives the second information, and receives the first information a greater number of times than a total number of times the second information is received.

Here, synchronization time point adjustment is described below.

FIG. 398 is a diagram illustrating an example of a process flow of the receiver 1800*a* in Embodiment 32.

After a signal is transmitted, a certain amount of time is needed before audio or video is reproduced as a result of processing on the signal in the receiver 1800*a*. Therefore, this processing time is taken into consideration in performing a process of reproducing audio or video so that synchronous reproduction can be accurately performed.

First, processing delay time is selected in the receiver 1800*a* (Step S1801). This may have been held in a processing program or may be selected by a user. When a user makes correction, more accurate synchronization for each receiver can be realized. This processing delay time can be changed for each model of receiver or according to the temperature or CPU usage rate of the receiver so that synchronization is more accurately performed.

The receiver 1800*a* determines whether or not any time packet has been received or whether or not any ID associated for audio synchronization has been received (Step S1802). When the receiver 1800*a* determines that any of these has been received (Step S1802: Y), the receiver 1800*a* further determines whether or not there is any backlogged image (Step S1804). When the receiver 1800*a* determines that there is a backlogged image (Step S1804: Y), the receiver 1800*a* discards the backlogged image, or postpones processing on the backlogged image and starts a reception process from the latest obtained image (Step S1805). With this, unexpected delay due to a backlog can be avoided.

The receiver 1800*a* performs measurement to find out a position of the visible light signal (specifically, a bright line) in an image (Step S1806). More specifically, in relation to the first exposure line in the image sensor, a position where the signal appears in a direction perpendicular to the exposure lines is found by measurement, to calculate a difference in time between a point of time at which image obtainment starts and a point of time at which the signal is received (intra-image delay time).

The receiver 1800*a* is capable of accurately performing synchronous reproduction by reproducing audio or video belonging to a time point determined by adding processing delay time and intra-image delay time to the recognized synchronization time point (Step S1807).

When the receiver 1800*a* determines in Step S1802 that the time packet or audio synchronous ID has not been received, the receiver 1800*a* receives a signal from a captured image (Step S1803).

FIG. 399 is a diagram illustrating an example of a user interface of the receiver 1800*a* in Embodiment 32.

As illustrated in (a) of FIG. 399, a user can adjust the above-described processing delay time by pressing any of buttons Bt1 to Bt4 displayed on the receiver 1800*a*. Furthermore, the processing delay time may be set with a swipe gesture as in (b) of FIG. 399. With this, the synchronous reproduction can be more accurately performed based on user's sensory feeling.

Next, reproduction by earphone limitation is described below.

FIG. 400 is a diagram illustrating an example of a process flow of the receiver 1800*a* in Embodiment 32.

The reproduction by earphone limitation in this process flow makes it possible to reproduce audio without causing trouble to others in surrounding areas.

The receiver 1800*a* checks whether or not the setting for earphone limitation is ON (Step S1811). In the case where the setting for earphone limitation is ON, the receiver 1800*a* has been set to the earphone limitation, for example. Alternatively, the received signal (visible light signal) includes the setting for earphone limitation. Yet another case is that information indicating that earphone limitation is ON is recorded in the server or the receiver 1800*a* in association with the received signal.

When the receiver 1800*a* confirms that the earphone limitation is ON (Step S1811: Y), the receiver 1800*a* determines whether or not an earphone is connected to the receiver 1800*a* (Step S1813).

When the receiver 1800*a* confirms that the earphone limitation is OFF (Step S1811: N) or determines that an earphone is connected (Step S1813: Y), the receiver 1800*a* reproduces audio (Step S1812). Upon reproducing audio, the receiver 1800*a* adjusts a volume of the audio so that the volume is within a preset range. This preset range is set in the same manner as with the setting for earphone limitation.

When the receiver 1800*a* determines that no earphone is connected (Step S1813: N), the receiver 1800*a* issues notification prompting a user to connect an earphone (Step S1814). This notification is issued in the form of, for example, an indication on the display, audio output, or vibration.

Furthermore, when a setting which prohibits forced audio playback has not been made, the receiver 1800*a* prepares an interface for forced playback, and determines whether or not a user has made an input for forced playback (Step S1815). Here, when the receiver 1800*a* determines that a user has made an input for forced playback (Step S1815: Y), the receiver 1800*a* reproduces audio even when no earphone is connected (Step S1812).

When the receiver 1800*a* determines that a user has not made an input for forced playback (Step S1815: N), the receiver 1800*a* holds previously received audio data and an analyzed synchronization time point, so as to perform synchronous audio reproduction immediately after an earphone is connected thereto.

FIG. 401 is a diagram illustrating another example of a process flow of the receiver 1800*a* in Embodiment 32.

The receiver 1800*a* first receives an ID from the transmitter 1800*d* (Step S1821). Specifically, the receiver 1800*a* receives a visible light signal indicating an ID of the transmitter 1800*d* or an ID of content that is being displayed on the transmitter 1800*d*.

Next, the receiver 1800*a* downloads, from the server, information (content) associated with the received ID (Step S1822). Alternatively, the receiver 1800*a* reads the information from a data holding unit included in the receiver 1800*a*. Hereinafter, this information is referred to as related information.

Next, the receiver 1800*a* determines whether or not a synchronous reproduction flag included in the related information represents ON (Step S1823). When the receiver 1800*a* determines that the synchronous reproduction flag does not represent ON (Step S1823: N), the receiver 1800*a* outputs content indicated in the related information (Step S1824). Specifically, when the content is an image, the receiver 1800*a* displays the image, and when the content is audio, the receiver 1800*a* outputs the audio.

When the receiver 1800*a* determines that the synchronous reproduction flag represents ON (Step S1823: Y), the receiver 1800*a* further determines whether a clock setting mode included in the related information has been set to a transmitter-based mode or an absolute-time mode (Step S1825). When the receiver 1800*a* determines that the clock setting mode has been set to the absolute-time mode, the receiver 1800*a* determines whether or not the last clock setting has been performed within a predetermined time before the current time point (Step S1826). This clock setting is a process of obtaining clock information by a predetermined method and setting time of a clock included in the receiver 1800*a* to the absolute time of a reference clock using the clock information. The predetermined method is, for example, a method using global positioning system (GPS) radio waves or network time protocol (NTP) radio waves. Note that the above-mentioned current time point may be a point of time at which a terminal device, that is, the receiver 1800*a*, received a visible light signal.

When the receiver 1800*a* determines that the last clock setting has been performed within the predetermined time (Step S1826: Y), the receiver 1800*a* outputs the related information based on time of the clock of the receiver 1800*a*, thereby synchronizing content to be displayed on the transmitter 1800*d* with the related information (Step S1827). When content indicated in the related information is, for example, moving images, the receiver 1800*a* displays the moving images in such a way that they are in synchronization with content that is displayed on the transmitter 1800*d*. When content indicated in the related information is, for example, audio, the receiver 1800*a* outputs the audio in such a way that it is in synchronization with content that is displayed on the transmitter 1800*d*. For example, when the related information indicates audio, the related information includes frames that constitute the audio, and each of these frames is assigned with a time stamp. The receiver 1800*a* outputs audio in synchronization with content from the transmitter 1800*d* by reproducing a frame assigned with a time stamp corresponding to time of the own clock.

When the receiver 1800*a* determines that the last clock setting has not been performed within the predetermined time (Step S1826: N), the receiver 1800*a* attempts to obtain clock information by a predetermined method, and determines whether or not the clock information has been successfully obtained (Step S1828). When the receiver 1800*a* determines that the clock information has been successfully obtained (Step S1828: Y), the receiver 1800*a* updates time of the clock of the receiver 1800*a* using the clock information (Step S1829). The receiver 1800*a* then performs the above-described process in Step S1827.

Furthermore, when the receiver 1800*a* determines in Step S1825 that the clock setting mode is the transmitter-based mode or when the receiver 1800*a* determines in Step S1828 that the clock information has not been successfully obtained (Step S1828: N), the receiver 1800*a* obtains clock information from the transmitter 1800*d* (Step S1830). Specifically, the receiver 1800*a* obtains a synchronization signal, that is, clock information, from the transmitter 1800*d* by visible light communication. For example, the synchronization signal is the time packet 1 and the time packet 2 illustrated in FIG. 397. Alternatively, the receiver 1800*a* receives clock information from the transmitter 1800*d* via radio waves of Bluetooth®, Wi-Fi, or the like. The receiver 1800*a* then performs the above-described processes in Step S1829 and Step S1827.

In this embodiment, as in Step S1829 and Step S1830, when a point of time at which the process for synchronizing the clock of the terminal device, i.e., the receiver 1800*a*, with the reference clock (the clock setting) is performed using GPS radio waves or NTP radio waves is at least a predetermined time before a point of time at which the terminal device receives a visible light signal, the clock of the terminal device is synchronized with the clock of the transmitter using a time point indicated in the visible light signal transmitted from the transmitter 1800*d*. With this, the terminal device is capable of reproducing content (video or audio) at a timing of synchronization with transmitter-side content that is reproduced on the transmitter 1800*d*.

FIG. 402A is a diagram for describing a specific method of synchronous reproduction in Embodiment 32. As a method of the synchronous reproduction, there are methods a to e illustrated in FIG. 402.

(Method a)

In the method a, the transmitter 1800*d* outputs a visible light signal indicating a content ID and an ongoing content reproduction time point, by changing luminance of the display as in the case of the above embodiments. The ongoing content reproduction time point is a reproduction time point for data that is part of the content and is being reproduced by the transmitter 1800*d* when the content ID is transmitted from the transmitter 1800*d*. When the content is video, the data is a picture, a sequence, or the like included in the video. When the content is audio, the data is a frame or the like included in the audio. The reproduction time point indicates, for example, time of reproduction from the beginning of the content as a time point. When the content is video, the reproduction time point is included in the content as a presentation time stamp (PTS). This means that content includes, for each data included in the content, a reproduction time point (a display time point) of the data.

The receiver 1800*a* receives the visible light signal by capturing an image of the transmitter 1800*d* as in the case of the above embodiments. The receiver 1800*a* then transmits to a server 1800*f* a request signal including the content ID indicated in the visible light signal. The server 1800*f* receives the request signal and transmits, to the receiver 1800*a*, content that is associated with the content ID included in the request signal.

The receiver 1800*a* receives the content and reproduces the content from a point of time of (the ongoing content reproduction time point+elapsed time since ID reception). The elapsed time since ID reception is time elapsed since the content ID is received by the receiver 1800*a*.

(Method b)

In the method b, the transmitter 1800*d* outputs a visible light signal indicating a content ID and an ongoing content reproduction time point, by changing luminance of the display as in the case of the above embodiments. The receiver 1800*a* receives the visible light signal by capturing an image of the transmitter 1800*d* as in the case of the above embodiments. The receiver 1800*a* then transmits to the server 1800*f* a request signal including the content ID and the ongoing content reproduction time point indicated in the visible light signal. The server 1800*f* receives the request signal and transmits, to the receiver 1800*a*, only partial content belonging to a time point on and after the ongoing content reproduction time point, among content that is associated with the content ID included in the request signal.

The receiver 1800*a* receives the partial content and reproduces the partial content from a point of time of (elapsed time since ID reception).

(Method c)

In the method c, the transmitter 1800*d* outputs a visible light signal indicating a transmitter ID and an ongoing content reproduction time point, by changing luminance of the display as in the case of the above embodiments. The transmitter ID is information for identifying a transmitter.

The receiver 1800*a* receives the visible light signal by capturing an image of the transmitter 1800*d* as in the case of the above embodiments. The receiver 1800*a* then transmits to the server 1800*f* a request signal including the transmitter ID indicated in the visible light signal.

The server 1800*f* holds, for each transmitter ID, a reproduction schedule which is a time table of content to be reproduced by a transmitter having the transmitter ID. Furthermore, the server 1800*f* includes a clock. The server 1800*f* receives the request signal and refers to the reproduction schedule to identify, as content that is being reproduced, content that is associated with the transmitter ID included in the request signal and time of the clock of the server 1800*f* (a server time point). The server 1800*f* then transmits the content to the receiver 1800*a*.

The receiver 1800*a* receives the content and reproduces the content from a point of time of (the ongoing content reproduction time point+elapsed time since ID reception).

(Method d)

In the method d, the transmitter 1800*d* outputs a visible light signal indicating a transmitter ID and a transmitter time point, by changing luminance of the display as in the case of the above embodiments. The transmitter time point is time indicated by the clock included in the transmitter 1800*d*.

The receiver 1800*a* receives the visible light signal by capturing an image of the transmitter 1800*d* as in the case of the above embodiments. The receiver 1800*a* then transmits to the server 1800*f* a request signal including the transmitter ID and the transmitter time point indicated in the visible light signal.

The server 1800*f* holds the above-described reproduction schedule. The server 1800*f* receives the request signal and refers to the reproduction schedule to identify, as content that is being reproduced, content that is associated with the transmitter ID and the transmitter time point included in the request signal. Furthermore, the server 1800*f* identifies an ongoing content reproduction time point based on the transmitter time point. Specifically, the server 1800*f* finds a reproduction start time point of the identified content from the reproduction schedule, and identifies, as an ongoing content reproduction time point, time between the transmitter time point and the reproduction start time point. The server 1800*f* then transmits the content and the ongoing content reproduction time point to the receiver 1800*a*.

The receiver 1800*a* receives the content and the ongoing content reproduction time point, and reproduces the content from a point of time of (the ongoing content reproduction time point+elapsed time since ID reception).

Thus, in this embodiment, the visible light signal indicates a time point at which the visible light signal is transmitted from the transmitter 1800*d*. Therefore, the terminal device, i.e., the receiver 1800*a*, is capable of receiving content associated with a time point at which the visible light signal is transmitted from the transmitter 1800*d* (the transmitter time point). For example, when the transmitter time point is 5:43, content that is reproduced at 5:43 can be received.

Furthermore, in this embodiment, the server 1800*f* has a plurality of content items associated with respective time points. However, there is a case where the content associated with the time point indicated in the visible light signal is not present in the server 1800*f*. In this case, the terminal device, i.e., the receiver 1800*a*, may receive, among the plurality of content items, content associated with a time point that is closest to the time point indicated in the visible light signal and after the time point indicated in the visible light signal. This makes it possible to receive appropriate content among the plurality of content items in the server 1800*f* even when content associated with a time point indicated in the visible light signal is not present in the server 1800*f*.

Furthermore, a reproduction method in this embodiment includes: receiving a visible light signal by a sensor of a receiver 1800*a* (the terminal device) from the transmitter 1800*d* which transmits the visible light signal by a light source changing in luminance; transmitting a request signal for requesting content associated with the visible light signal, from the receiver 1800*a* to the server 1800*f*; receiving, by the receiver 1800*a*, the content from the server 1800*f*; and reproducing the content. The visible light signal indicates a transmitter ID and a transmitter time point. The transmitter ID is ID information. The transmitter time point is time indicated by the clock of the transmitter 1800*d* and is a point of time at which the visible light signal is transmitted from the transmitter 1800*d*. In the receiving of content, the receiver 1800*a* receives content associated with the transmitter ID and the transmitter time point indicated in the visible light signal. This allows the receiver 1800*a* to reproduce appropriate content for the transmitter ID and the transmitter time point.

(Method e)

In the method e, the transmitter 1800*d* outputs a visible light signal indicating a transmitter ID, by changing luminance of the display as in the case of the above embodiments.

The receiver 1800*a* receives the visible light signal by capturing an image of the transmitter 1800*d* as in the case of the above embodiments. The receiver 1800*a* then transmits to the server 1800*f* a request signal including the transmitter ID indicated in the visible light signal.

The server 1800*f* holds the above-described reproduction schedule, and further includes a clock. The server 1800*f* receives the request signal and refers to the reproduction schedule to identify, as content that is being reproduced, content that is associated with the transmitter ID included in the request signal and a server time point. Note that the server time point is time indicated by the clock of the server 1800*f*. Furthermore, the server 1800*f* finds a reproduction start time point of the identified content from the reproduction schedule as well. The server 1800*f* then transmits the content and the content reproduction start time point to the receiver 1800*a*.

The receiver 1800*a* receives the content and the content reproduction start time point, and reproduces the content from a point of time of (a receiver time point—the content reproduction start time point). Note that the receiver time point is time indicated by a clock included in the receiver 1800*a*.

Thus, a reproduction method in this embodiment includes: receiving a visible light signal by a sensor of the receiver 1800*a* (the terminal device) from the transmitter 1800*d* which transmits the visible light signal by a light source changing in luminance; transmitting a request signal for requesting content associated with the visible light signal, from the receiver 1800*a* to the server 1800*f*; receiving, by the receiver 1800*a*, content including time points and data to be reproduced at the time points, from the server 1800*f*; and reproducing data included in the content and corresponding to time of a clock included in the receiver 1800*a*. Therefore, the receiver 1800*a* avoids reproducing data included in the content, at an incorrect point of time, and is capable of appropriately reproducing the data at a correct point of time indicated in the content. Furthermore, when content related to the above content (the transmitter-side content) is also reproduced on the transmitter 1800*d*, the receiver 1800*a* is capable of appropriately reproducing the content in synchronization with the transmitter-side content.

Note that even in the above methods c to e, the server 1800*f* may transmit, among the content, only partial content belonging to a time point on and after the ongoing content reproduction time point to the receiver 1800*a* as in method b.

Furthermore, in the above methods a to e, the receiver 1800*a* transmits the request signal to the server 1800*f* and receives necessary data from the server 1800*f*, but may skip such transmission and reception by holding the data in the server 1800*f* in advance.

FIG. 402B is a block diagram illustrating a configuration of a reproduction apparatus which performs synchronous reproduction in the above-described method e.

A reproduction apparatus B10 is the receiver 1800*a* or the terminal device which performs synchronous reproduction in the above-described method e, and includes a sensor B11, a request signal transmitting unit B12, a content receiving unit B13, a clock B14, and a reproduction unit B15.

The sensor B11 is, for example, an image sensor, and receives a visible light signal from the transmitter 1800*d* which transmits the visible light signal by the light source changing in luminance. The request signal transmitting unit B12 transmits to the server 1800*f* a request signal for requesting content associated with the visible light signal. The content receiving unit B13 receives from the server 1800*f* content including time points and data to be reproduced at the time points. The reproduction unit B15 reproduces data included in the content and corresponding to time of the clock B14.

FIG. 402C is flowchart illustrating processing operation of the terminal device which performs synchronous reproduction in the above-described method e.

The reproduction apparatus B10 is the receiver 1800*a* or the terminal device which performs synchronous reproduction in the above-described method e, and performs processes in Step SB11 to Step SB15.

In Step SB11, a visible light signal is received from the transmitter 1800*d* which transmits the visible light signal by the light source changing in luminance. In Step SB12, a request signal for requesting content associated with the visible light signal is transmitted to the server 1800*f*. In Step SB13, content including time points and data to be reproduced at the time points is received from the server 1800*f*. In Step SB15, data included in the content and corresponding to time of the clock B14 is reproduced.

Thus, in the reproduction apparatus B10 and the reproduction method in this embodiment, data in the content is not reproduced at an incorrect time point and is able to be appropriately reproduced at a correct time point indicated in the content.

Note that in this embodiment, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. A software which implements the reproduction apparatus B10, etc., in this embodiment is a program which causes a computer to execute steps included in the flowchart illustrated in FIG. 402C.

FIG. 403 is a diagram for describing advance preparation of synchronous reproduction in Embodiment 32.

The receiver 1800*a* performs, in order for synchronous reproduction, clock setting for setting a clock included in the receiver 1800*a* to time of the reference clock. The receiver 1800*a* performs the following processes (1) to (5) for this clock setting.

(1) The receiver 1800*a* receives a signal. This signal may be a visible light signal transmitted by the display of the transmitter 1800*d* changing in luminance or may be a radio signal from a wireless device via Wi-Fi or Bluetooth®. Alternatively, instead of receiving such a signal, the receiver 1800*a* obtains position information indicating a position of the receiver 1800*a*, for example, by GPS or the like. Using the position information, the receiver 1800*a* then recognizes that the receiver 1800*a* entered a predetermined place or building.

(2) When the receiver 1800*a* receives the above signal or recognizes that the receiver 1800*a* entered the predetermined place, the receiver 1800*a* transmits to the server (visible light ID solution server) 1800*f* a request signal for requesting data related to the received signal, place or the like (related information).

(3) The server 1800*f* transmits to the receiver 1800*a* the above-described data and a clock setting request for causing the receiver 1800*a* to perform the clock setting.

(4) The receiver 1800*a* receives the data and the clock setting request and transmits the clock setting request to a GPS time server, an NTP server, or a base station of a telecommunication corporation (carrier).

(5) The above server or base station receives the clock setting request and transmits to the receiver 1800*a* clock data (clock information) indicating a current time point (time of the reference clock or absolute time). The receiver 1800*a* performs the clock setting by setting time of a clock included in the receiver 1800*a* itself to the current time point indicated in the clock data.

Thus, in this embodiment, the clock included in the receiver 1800*a* (the terminal device) is synchronized with the reference clock by global positioning system (GPS) radio waves or network time protocol (NTP) radio waves. Therefore, the receiver 1800*a* is capable of reproducing, at an appropriate time point according to the reference clock, data corresponding to the time point.

FIG. 404 is a diagram illustrating an example of application of the receiver 1800*a* in Embodiment 32.

The receiver 1800*a* is configured as a smartphone as described above, and is used, for example, by being held by a holder 1810 formed of a translucent material such as resin or glass. This holder 1810 includes a back board 1810*a* and an engagement portion 1810*b* standing on the back board 1810*a*. The receiver 1800*a* is inserted into a gap between the back board 1810*a* and the engagement portion 1810*b* in such a way as to be placed along the back board 1810*a*.

FIG. 405A is a front view of the receiver 1800*a* held by the holder 1810 in Embodiment 32.

The receiver 1800*a* is inserted as described above and held by the holder 1810. At this time, the engagement portion 1810*b* engages with a lower portion of the receiver 1800*a*, and the lower portion is sandwiched between the engagement portion 1810*b* and the back board 1810*a*. The back surface of the receiver 1800*a* faces the back board 1810*a*, and a display 1801 of the receiver 1800*a* is exposed.

FIG. 405B is a rear view of the receiver 1800*a* held by the holder 1810 in Embodiment 32.

The back board 1810*a* has a through-hole 1811, and a variable filter 1812 is attached to the back board 1810*a*, at a position close to the through-hole 1811. A camera 1802 of the receiver 1800*a* which is being held by the holder 1810 is exposed on the back board 1810*a* through the through-hole 1811. A flash light 1803 of the receiver 1800*a* faces the variable filter 1812.

The variable filter 1812 is, for example, in the shape of a disc, and includes three color filters (a red filter, a yellow filter, and a green filter) each having the shape of a circular sector of the same size. The variable filter 1812 is attached to the back board 1810*a* in such a way as to be rotatable about the center of the variable filter 1812. The red filter is a translucent filter of a red color, the yellow filter is a translucent filter of a yellow color, and the green filter is a translucent filter of a green color.

Therefore, the variable filter 1812 is rotated, for example, until the red filter is at a position facing the flash light 1803*a*. In this case, light radiated from the flash light 1803*a* passes through the red filter, thereby being spread as red light inside the holder 1810. As a result, roughly the entire holder 1810 glows red.

Likewise, the variable filter 1812 is rotated, for example, until the yellow filter is at a position facing the flash light 1803*a*. In this case, light radiated from the flash light 1803*a* passes through the yellow filter, thereby being spread as yellow light inside the holder 1810. As a result, roughly the entire holder 1810 glows yellow.

Likewise, the variable filter 1812 is rotated, for example, until the green filter is at a position facing the flash light 1803*a*. In this case, light radiated from the flash light 1803*a* passes through the green filter, thereby being spread as green light inside the holder 1810. As a result, roughly the entire holder 1810 glows green.

This means that the holder 1810 lights up in red, yellow, or green just like a penlight.

FIG. 406 is a diagram for describing a use case of the receiver 1800*a* held by the holder 1810 in Embodiment 32.

For example, the receiver 1800*a* held by the holder 1810, namely, a holder-attached receiver, can be used in amusement parks and so on. Specifically, a plurality of holder-attached receivers directed to a float moving in an amusement park blink to music from the float in synchronization. This means that the float is configured as the transmitter in the above embodiments and transmits a visible light signal by the light source attached to the float changing in luminance. For example, the float transmits a visible light signal indicating the ID of the float. The holder-attached receiver then receives the visible light signal, that is, the ID, by capturing an image by the camera 1802 of the receiver 1800*a* as in the case of the above embodiments. The receiver 1800*a* which received the ID obtains, for example, from the server, a program associated with the ID. This program includes an instruction to turn ON the flash light 1803 of the receiver 1800*a* at predetermined time points. These predetermined time points are set according to music from the float (so as to be in synchronization therewith). The receiver 1800*a* then causes the flash light 1803*a* to blink according to the program.

With this, the holder 1810 for each receiver 1800*a* which received the ID repeatedly lights up at the same timing according to music from the float having the ID.

Each receiver 1800*a* causes the flash light 1803 to blink according to a preset color filter (hereinafter referred to as a preset filter). The preset filter is a color filter that faces the flash light 1803 of the receiver 1800*a*. Furthermore, each receiver 1800*a* recognizes the current preset filter based on an input by a user. Alternatively, each receiver 1800*a* recognizes the current preset filter based on, for example, the color of an image captured by the camera 1802.

Specifically, at a predetermined time point, only the holders 1810 for the receivers 1800*a* which have recognized that the preset filter is a red filter among the receivers 1800*a* which received the ID light up at the same time. At the next time point, only the holders 1810 for the receivers 1800*a* which have recognized that the preset filter is a green filter light up at the same time. Further, at the next time point, only the holders 1810 for the receivers 1800*a* which have recognized that the preset filter is a yellow filter light up at the same time.

Thus, the receiver 1800*a* held by the holder 1810 causes the flash light 1803, that is, the holder 1810, to blink in synchronization with music from the float and the receiver 1800*a* held by another holder 1810, as in the above-described case of synchronous reproduction illustrated in FIG. 394 to FIG. 400.

FIG. 407 is a flowchart illustrating processing operation of the receiver 1800*a* held by the holder 1810 in Embodiment 32.

The receiver 1800*a* receives an ID of a float indicated by a visible light signal from the float (Step S1831). Next, the receiver 1800*a* obtains a program associated with the ID from the server (Step S1832). Next, the receiver 1800*a* causes the flash light 1803 to be turned ON at predetermined time points according to the preset filter by executing the program (Step S1833).

At this time, the receiver 1800*a* may display, on the display 1801, an image according to the received ID or the obtained program.

FIG. 408 is a diagram illustrating an example of an image displayed by the receiver 1800*a* in Embodiment 32.

The receiver 1800*a* receives an ID, for example, from a Santa Clause float, and displays an image of Santa Clause as illustrated in (a) of FIG. 408. Furthermore, the receiver 1800*a* may change the color of the background of the image of Santa Clause to the color of the preset filter at the same time when the flash light 1803 is turned ON as illustrated in (b) of FIG. 408. For example, in the case where the color of the preset filter is red, when the flash light 1803 is turned ON, the holder 1810 glows red and at the same time, an image of Santa Clause with a red background is displayed on the display 1801. In short, blinking of the holder 1810 and what is displayed on the display 1801 are synchronized.

FIG. 409 is a diagram illustrating another example of a holder in Embodiment 32.

A holder 1820 is configured in the same manner as the above-described holder 1810 except for the absence of the through-hole 1811 and the variable filter 1812. The holder 1820 holds the receiver 1800*a* with a back board 1820*a* facing the display 1801 of the receiver 1800*a*. In this case, the receiver 1800*a* causes the display 1801 to emit light instead of the flash light 1803. With this, light from the display 1801 spreads across roughly the entire holder 1820. Therefore, when the receiver 1800*a* causes the display 1801 to emit red light according to the above-described program, the holder 1820 glows red. Likewise, when the receiver 1800*a* causes the display 1801 to emit yellow light according to the above-described program, the holder 1820 glows yellow. When the receiver 1800*a* causes the display 1801 to emit green light according to the above-described program, the holder 1820 glows green. With the use of the holder 1820 such as that just described, it is possible to omit the settings for the variable filter 1812.

Embodiment 33

(Visible Light Signal)

FIG. 410A to FIG. 410D are diagrams each illustrating an example of a visible light signal in Embodiment 33.

The transmitter generates a 4 PPM visible light signal and changes in luminance according to this visible light signal, for example, as illustrated in FIG. 410A as in the above-described case. Specifically, the transmitter allocates four slots to one signal unit and generates a visible light signal including a plurality of signal units. The signal unit indicates High (H) or Low (L) in each slot. The transmitter then emits bright light in the H slot and emits dark light or is turned OFF in the L slot. For example, one slot is a period of 1/9,600 seconds.

Furthermore, the transmitter may generate a visible light signal in which the number of slots allocated to one signal unit is variable as illustrated in FIG. 410B, for example. In this case, the signal unit includes a signal indicating H in one or more continuous slots and a signal indicating L in one slot subsequent to the H signal. The number of H slots is variable, and therefore a total number of slots in the signal unit is variable. For example, as illustrated in FIG. 4108, the transmitter generates a visible light signal including a 3-slot signal unit, a 4-slot signal unit, and a 6-slot signal unit in this order. The transmitter then emits bright light in the H slot and emits dark light or is turned OFF in the L slot in this case as well.

The transmitter may allocate an arbitrary period (signal unit period) to one signal unit without allocating a plurality of slots to one signal unit as illustrated in FIG. 410C, for example. This signal unit period includes an H period and an L period subsequent to the H period. The H period is adjusted according to a signal which has not yet been modulated. The L period is fixed and may be a period corresponding to the above slot. The H period and the L period are each a period of 100 μs or more, for example. For example, as illustrated in FIG. 410C, the transmitter transmits a visible light signal including a signal unit having a signal unit period of 210 μs, a signal unit having a signal unit period of 220 μs, and a signal unit having a signal unit period of 230 μs. The transmitter then emits bright light in the H period and emits dark light or is turned OFF in the L period in this case as well.

The transmitter may generate, as a visible light signal, a signal indicating L and H alternately as illustrated in FIG. 410D, for example. In this case, each of the L period and the H period in the visible light signal is adjusted according to a signal which has not yet been modulated. For example, as illustrated in FIG. 410D, the transmitter transmits a visible light signal indicating H in a 100-μs period, then L in a 120-μs period, then H in a 110-μs period, and then L in a 200-μs period. The transmitter then emits bright light in the H period and emits dark light or is turned OFF in the L period in this case as well.

FIG. 411 is a diagram illustrating a structure of a visible light signal in Embodiment 33.

The visible light signal includes, for example, a signal 1, a brightness adjustment signal corresponding to the signal 1, a signal 2, and a brightness adjustment signal corresponding to the signal 2. The transmitter generates the signal 1 and the signal 2 by modulating the signal which has not yet been modulated, and generates the brightness adjustment signals corresponding to these signals, thereby generating the above-described visible light signal.

The brightness adjustment signal corresponding to the signal 1 is a signal which compensates for brightness increased or decreased due to a change in luminance according to the signal 1. The brightness adjustment signal corresponding to the signal 2 is a signal which compensates for brightness increased or decreased due to a change in luminance according to the signal 2. A change in luminance according to the signal 1 and the brightness adjustment signal corresponding to the signal 1 represents brightness B1, and a change in luminance according to the signal 2 and the brightness adjustment signal corresponding to the signal 2 represents brightness B2. The transmitter in this embodiment generates the brightness adjustment signal corresponding to each of the signal 1 and the signal 2 as a part of the visible light signal in such a way that the brightness B1 and the brightness B2 are equal. With this, brightness is kept at a constant level so that flicker can be reduced.

When generating the above-described signal 1, the transmitter generates a signal 1 including data 1, a preamble (header) subsequent to the data 1, and data 1 subsequent to the preamble. The preamble is a signal corresponding to the data 1 located before and after the preamble. For example, this preamble is a signal serving as an identifier for reading the data 1. Thus, since the signal 1 includes two data items 1 and the preamble located between the two data items, the receiver is capable of properly demodulating the data 1 (that is, the signal 1) even when the receiver starts reading the visible light signal at the midway point in the first data item 1.

(Bright Line Image)

FIG. 412 is a diagram illustrating an example of a bright line image obtained through imaging by a receiver in Embodiment 33.

As described above, the receiver captures an image of a transmitter changing in luminance, to obtain a bright line image including, as a bright line pattern, a visible light signal transmitted from the transmitter. The visible light signal is received by the receiver through such imaging.

For example, the receiver captures an image at time t1 using N exposure lines included in the image sensor, obtaining a bright line image including a region a and a region b in each of which a bright line pattern appears as illustrated in FIG. 412. Each of the region a and the region b is where the bright line pattern appears because a subject, i.e., the transmitter, changes in luminance.

The receiver demodulates the visible light signal based on the bright line patterns in the region a and in the region b. However, when the receiver determines that the demodulated visible light signal alone is not sufficient, the receiver captures an image at time t2 using only M (M<N) continuous exposure lines corresponding to the region a among the N exposure lines. By doing so, the receiver obtains a bright line image including only the region a among the region a and the region b. The receiver repeatedly performs such imaging also at time t3 to time t5. As a result, it is possible to receive the visible light signal having a sufficient data amount from the subject corresponding to the region a at high speed. Furthermore, the receiver captures an image at time t6 using only L (L<N) continuous exposure lines corresponding to the region b among the N exposure lines. By doing so, the receiver obtains a bright line image including only the region b among the region a and the region b. The receiver repeatedly performs such imaging also at time t7 to time t9. As a result, it is possible to receive the visible light signal having a sufficient data amount from the subject corresponding to the region b at high speed.

Furthermore, the receiver may obtain a bright line image including only the region a by performing, at time t10 and time t11, the same or like imaging operation as that performed at time t2 to time t5. Furthermore, the receiver may obtain a bright line image including only the region b by performing, at time t12 and time t13, the same or like imaging operation as that performed at time t6 to time t9.

In the above-described example, when the receiver determines that the visible light signal is not sufficient, the receiver continuously captures the blight line image including only the region a at times t2 to t5, but this continuous imaging may be performed when a bright line appears in an image captured at time t1. Likewise, when the receiver determines that the visible light signal is not sufficient, the receiver continuously captures the blight line image including only the region b at time t6 to time t9, but this continuous imaging may be performed when a bright line appears in an image captured at time t1. The receiver may alternately obtain a bright line image including only the region a and obtain a bright line image including only the region b.

Note that the M continuous exposure lines corresponding to the above region a are exposure lines which contribute to generation of the region a, and the L continuous exposure lines corresponding to the above region b are exposure lines which contribute to generation of the region b.

FIG. 413 is a diagram illustrating another example of a bright line image obtained through imaging by a receiver in Embodiment 33.

For example, the receiver captures an image at time t1 using N exposure lines included in the image sensor, obtaining a bright line image including a region a and a region b in each of which a bright line pattern appears as illustrated in FIG. 413. Each of the region a and the region b is where the bright line pattern appears because a subject, i.e., the transmitter, changes in luminance. There is an overlap between the region a and the region b along the bright line or the exposure line (hereinafter referred to as an overlap region).

When the receiver determines that the visible light signal demodulated from the bright line patterns in the region a and the region b is not sufficient, the receiver captures an image at time t2 using only P (P<N) continuous exposure lines corresponding to the overlap region among the N exposure lines. By doing so, the receiver obtains a bright line image including only the overlap region between the region a and the region b. The receiver repeatedly performs such imaging also at time t3 and time t4. As a result, it is possible to receive the visible light signals having sufficient data amounts from the subjects corresponding to the region a and the region b at approximately the same time and at high speed.

FIG. 414 is a diagram illustrating another example of a bright line image obtained through imaging by a receiver in Embodiment 33.

For example, the receiver captures an image at time t1 using N exposure lines included in the image sensor, obtaining a bright line image including a region made up of an area a where an unclear bright line pattern appears and an area b where a clear bright line pattern appears as illustrated in FIG. 414. This region is, as in the above-described case, where the bright line pattern appears because a subject, i.e., the transmitter, changes in luminance.

In this case, when the receiver determines that the visible light signal demodulated from the bright line pattern in the above-described region is not sufficient, the receiver captures an image at time t2 using only Q (Q<N) continuous exposure lines corresponding to the area b among the N exposure lines. By doing so, the receiver obtains a bright line image including only the area b out of the above-described region. The receiver repeatedly performs such imaging also at time t3 and time t4. As a result, it is possible to receive the visible light signal having a sufficient data amount from the subject corresponding to the above-described region at high speed.

Furthermore, after continuously capturing the bright line image including only the area b, the receiver may further continuously captures a bright line image including only the area a.

When a bright line image includes a plurality of regions (or areas) where a bright line pattern appears as described above, the receiver assigns the regions with numbers in sequence and captures bright line images including only the regions according to the sequence. In this case, the sequence may be determined according to the magnitude of a signal (the size of the region or area) or may be determined according to the clarity level of a bright line. Alternatively, the sequence may be determined according to the color of light from the subjects corresponding to the regions. For example, the first continuous imaging may be performed for the region corresponding to red light, and the next continuous imaging may be performed for the region corresponding to white light. Alternatively, it may also be possible to perform only continuous imaging for the region corresponding to red light.

(Hdr Compositing)

FIG. 415 is a diagram for describing application of a receiver to a camera system which performs HDR compositing in Embodiment 33.

A camera system is mounted on a vehicle, for example, in order to prevent collision. This camera system performs high dynamic range (HDR) compositing using an image captured with a camera. This HDR compositing results in an image having a wide luminance dynamic range. The camera system recognizes surrounding vehicles, obstacles, humans or the like based on this image having a wide dynamic range.

For example, the setting mode of the camera system includes a normal setting mode and a communication setting mode. When the setting mode is the normal setting mode, the camera system captures four images at time t1 to time t4 at the same shutter speed of 1/100 seconds and with mutually different sensitivity levels, for example, as illustrated in FIG. 415. The camera system performs the HDR compositing using these four captured images.

When the setting mode is the communication setting mode, the camera system captures three images at time t5 to time t7 at the same shutter speed of 1/100 seconds and with mutually different sensitivity levels, for example, as illustrated in FIG. 415. Furthermore, the camera system captures an image at time t8 at a shutter speed of 1/10,000 seconds and with the highest sensitivity (for example, ISO=1,600). The camera system performs the HDR compositing using the first three images among these four captured images. Furthermore, the camera system receives a visible light signal from the last image among the above-described four captured images, and demodulates a bright line pattern appearing in the last image.

Furthermore, when the setting mode is the communication setting mode, the camera system is not required to perform the HDR compositing. For example, as illustrated in FIG. 415, the camera system captures an image at time t9 at a shutter speed of 1/100 seconds and with low sensitivity (for example, ISO=200). Furthermore, the camera system captures three images at time t10 to time t12 at a shutter speed of 1/10,000 seconds and with mutually different sensitivity levels. The camera system recognizes surrounding vehicles, obstacles, humans, or the like based on the first image among these four captured images. Furthermore, the camera system receives a visible light signal from the last three images among the above-described four captured images, and demodulates a bright line pattern appearing in the last three images.

Note that the images are captured at time t10 to time t12 with mutually different sensitivity levels in the example illustrated in FIG. 415, but may be captured with the same sensitivity.

A camera system such as that described above is capable of performing the HDR compositing and also is capable of receiving the visible light signal.

(Security)

FIG. 416 is a diagram for describing processing operation of a visible light communication system in Embodiment 33.

This visible light communication system includes, for example, a transmitter disposed at a cash register, a smartphone serving as a receiver, and a server. Note that communication between the smartphone and the server and communication between the transmitter and the server are each performed via a secure communication link. Communication between the transmitter and the smartphone is performed by visible light communication. The visible light communication system in this embodiment ensures security by determining whether or not the visible light signal from the transmitter has been properly received by the smartphone.

Specifically, the transmitter transmits a visible light signal indicating, for example, a value "100" to the smartphone by changing in luminance at time t1. At time t2, the smartphone receives the visible light signal and transmits a radio signal indicating the value "100" to the server. At time t3, the server receives the radio signal from the smartphone. At this time, the server performs a process for determining whether or not the value "100" indicated in the radio signal is a value of the visible light signal received by the smartphone from the transmitter. Specifically, the server transmits a radio signal indicating, for example, a value "200" to the transmitter. The transmitter receives the radio signal, and transmits a visible light signal indicating the value "200" to the smartphone by changing in luminance at time t4. At time t5, the smartphone receives the visible light signal and transmits a radio signal indicating the value "200" to the server. At time t6, the server receives the radio signal from the smartphone. The server determines whether or not the value indicated in this received radio signal is the same as the value indicated in the radio signal transmitted at time t3. When the values are the same, the server determines that the value "100" indicated in the visible light signal received at time t3 is a value of the visible light signal transmitted from the transmitter and received by the smartphone. When the values are not the same, the server determines that it is doubtful that the value "100" indicated in the visible light signal received at time t3 is a value of the visible light signal transmitted from the transmitter and received by the smartphone.

By doing so, the server is capable of determining whether or not the smartphone has certainly received the visible light signal from the transmitter. This means that when the smartphone has not received the visible light signal from the transmitter, signal transmission to the server as if the smartphone has received the visible light signal can be prevented.

Note that the communication between the smartphone, the server, and the transmitter is performed using the radio signal in the above-described example, but may be performed using an optical signal other than the visible light signal or using an electrical signal. The visible light signal transmitted from the transmitter to the smartphone indicates, for example, a value of a charged amount, a value of a coupon, a value of a monster, or a value of bingo.

(Vehicle Relationship)

FIG. 417A is a diagram illustrating an example of vehicle-to-vehicle communication using visible light in Embodiment 33.

For example, the leading vehicle recognizes using a sensor (such as a camera) mounted thereon that an accident occurred in a direction of travel. When the leading vehicle recognizes an accident as just described, the leading vehicle transmits a visible light signal by changing luminance of a taillight. For example, the leading vehicle transmits to a rear vehicle a visible light signal that encourages the rear vehicle to slow down. The rear vehicle receives the visible light signal by capturing an image with a camera mounted thereon, and slows down according to the visible light signal and transmits a visible light signal that encourages another rear vehicle to slow down.

Thus, the visible light signal that encourages a vehicle to slow down is transmitted in sequence from the leading vehicle to a plurality of vehicles which travel in line, and a vehicle that received the visible light signal slows down. Transmission of the visible light signal to the vehicles is so fast that these vehicles can slow down almost at the same time. Therefore, congestion due to accidents can be eased.

FIG. 417B is a diagram illustrating another example of vehicle-to-vehicle communication using visible light in Embodiment 33.

For example, a front vehicle may change luminance of a taillight thereof to transmit a visible light signal indicating a message (for example, "thanks") for the rear vehicle. This message is generated by user inputs to a smartphone, for example. The smartphone then transmits a signal indicating the message to the above front vehicle. As a result, the front vehicle is capable of transmitting the visible light signal indicating the message to the rear vehicle.

FIG. 418 is a diagram illustrating an example of a method of determining positions of a plurality of LEDs in Embodiment 33.

For example, a headlight of a vehicle includes a plurality of light emitting diodes (LEDs). The transmitter of this vehicle changes luminance of each of the LEDs of the headlight separately, thereby transmitting a visible light signal from each of the LEDs. The receiver of another vehicle receives these visible light signals from the plurality of LEDs by capturing an image of the vehicle having the headlight.

At this time, in order to recognize which LED transmitted the visible light signal that has been received, the receiver determines a position of each of the LEDs based on the captured image. Specifically, using an accelerometer installed on the same vehicle to which the receiver is fitted, the receiver determines a position of each of the LEDs on the basis of a gravity direction indicated by the accelerometer (a downward arrow in FIG. 418, for example).

Note that the LED is cited as an example of a light emitter which changes in luminance in the above-described example, but may be other light emitter than the LED.

FIG. 419 is a diagram illustrating an example of a bright line image obtained by capturing an image of a vehicle in Embodiment 33.

For example, the receiver mounted on a travelling vehicle obtains the bright line image illustrated in FIG. 419, by capturing an image of a vehicle behind the travelling vehicle (the rear vehicle). The transmitter mounted on the rear vehicle transmits a visible light signal to a front vehicle by changing luminance of two headlights of the vehicle. The front vehicle has a camera installed in a rear part, a side mirror, or the like for capturing an image of an area behind the vehicle. The receiver obtains the bright line image by capturing an image of a subject, that is, the rear vehicle, with the camera, and demodulates a bright line pattern (the visible light signal) included in the bright line image. Thus, the visible light signal transmitted from the transmitter of the rear vehicle is received by the receiver of the front vehicle.

At this time, on the basis of each of visible light signals transmitted from two headlights and demodulated, the receiver obtains an ID of the vehicle having the headlights, a speed of the vehicle, and a type of the vehicle. When IDs of two visible light signals are the same, the receiver determines that these two visible light signals are signals transmitted from the same vehicle. The receiver then identifies a length between the two headlights of the vehicle (a headlight-to-headlight distance) based on the type of the vehicle. Furthermore, the receiver measures a distance L1 between two regions included in the bright line image and where the bright line patterns appear. The receiver then calculates a distance between the vehicle on which the receiver is mounted and the rear vehicle (an inter-vehicle distance) by triangulation using the distance L1 and the headlight-to-headlight distance. The receiver determines a risk of collision based on the inter-vehicle distance and the speed of the vehicle obtained from the visible light signal, and provides a driver of the vehicle with a warning according to the result of the determination. With this, collision of vehicles can be avoided.

Note that the receiver identifies a headlight-to-headlight distance based on the vehicle type included in the visible light signal in the above-described example, but may identify a headlight-to-headlight distance based on information other than the vehicle type. Furthermore, when the receiver determines that there is a risk of collision, the receiver provides a warning in the above-described case, but may output to the vehicle a control signal for causing the vehicle to perform an operation of avoiding the risk. For example, the control signal is a signal for accelerating the vehicle or a signal for causing the vehicle to change lanes.

The camera captures an image of the rear vehicle in the above-described case, but may capture an image of an oncoming vehicle. When the receiver determines based on an image captured with the camera that it is foggy around the receiver (that is, the vehicle including the receiver), the receiver may be set to a mode of receiving a visible light signal such as that described above. With this, even when it is foggy around the receiver of the vehicle, the receiver is capable of identifying a position and a speed of an oncoming vehicle by receiving a visible light signal transmitted from a headlight of the oncoming vehicle.

FIG. 420 is a diagram illustrating an example of application of the receiver and the transmitter in Embodiment 33. A rear view of a vehicle is given in FIG. 420.

A transmitter (vehicle) 7006*a* having, for instance, two car taillights (light emitting units or lights) transmits identification information (ID) of the transmitter 7006*a* to a receiver such as a smartphone. Having received the ID, the receiver obtains information associated with the ID from a server. Examples of the information include the ID of the vehicle or the transmitter, the distance between the light emitting units, the size of the light emitting units, the size of the vehicle, the shape of the vehicle, the weight of the vehicle, the number of the vehicle, the traffic ahead, and information indicating the presence/absence of danger. The receiver may obtain these information directly from the transmitter 7006*a*.

FIG. 421 is a flowchart illustrating an example of processing operation of the receiver and the transmitter 7006*a* in Embodiment 33.

The ID of the transmitter 7006*a* and the information to be provided to the receiver receiving the ID are stored in the server in association with each other (Step 7106*a*). The information to be provided to the receiver may include information such as the size of the light emitting unit as the transmitter 7006*a*, the distance between the light emitting units, the shape and weight of the object including the transmitter 7006*a*, the identification number such as a vehicle identification number, the state of an area not easily observable from the receiver, and the presence/absence of danger.

The transmitter 7006*a* transmits the ID (Step 7106*b*). The transmission information may include the URL of the server and the information to be stored in the server.

The receiver receives the transmitted information such as the ID (Step 7106*c*). The receiver obtains the information associated with the received ID from the server (Step 7106*d*). The receiver displays the received information and the information obtained from the server (Step 7106*e*).

The receiver calculates the distance between the receiver and the light emitting unit by triangulation, from the information of the size of the light emitting unit and the apparent size of the captured light emitting unit or from the information of the distance between the light emitting units and the distance between the captured light emitting units (Step 7106*f*). The receiver issues a warning of danger or the like, based on the information such as the state of an area not easily observable from the receiver and the presence/absence of danger (Step 7106*g*).

FIG. 422 is a diagram illustrating an example of application of the receiver and the transmitter in Embodiment 33.

A transmitter (vehicle) 7007*b* having, for instance, two car taillights (light emitting units or lights) transmits information of the transmitter 7007*b* to a receiver 7007*a* such as a transmitter-receiver in a parking lot. The information of the transmitter 7007*b* indicates the identification information (ID) of the transmitter 7007*b*, the number of the vehicle, the size of the vehicle, the shape of the vehicle, or the weight of the vehicle. Having received the information, the receiver 7007*a* transmits information of whether or not parking is permitted, charging information, or a parking position. The receiver 7007a may receive the ID, and obtain information other than the ID from the server.

FIG. 423 is a flowchart illustrating an example of processing operation of the receiver 7007a and the transmitter 7007b in Embodiment 33. Since the transmitter 7007b performs not only transmission but also reception, the transmitter 7007b includes an in-vehicle transmitter and an in-vehicle receiver.

The ID of the transmitter 7007b and the information to be provided to the receiver 7007a receiving the ID are stored in the server (parking lot management server) in association with each other (Step 7107a). The information to be provided to the receiver 7007a may include information such as the shape and weight of the object including the transmitter 7007b, the identification number such as a vehicle identification number, the identification number of the user of the transmitter 7007b, and payment information.

The transmitter 7007b (in-vehicle transmitter) transmits the ID (Step 7107b). The transmission information may include the URL of the server and the information to be stored in the server. The receiver 7007a (transmitter-receiver) in the parking lot transmits the received information to the server for managing the parking lot (parking lot management server) (Step 7107c). The parking lot management server obtains the information associated with the ID of the transmitter 7007b, using the ID as a key (Step 7107d). The parking lot management server checks the availability of the parking lot (Step 7107e).

The receiver 7007a (transmitter-receiver) in the parking lot transmits information of whether or not parking is permitted, parking position information, or the address of the server holding these information (Step 7107f). Alternatively, the parking lot management server transmits these information to another server. The transmitter (in-vehicle receiver) 7007b receives the transmitted information (Step 7107g). Alternatively, the in-vehicle system obtains these information from another server.

The parking lot management server controls the parking lot to facilitate parking (Step 7107h). For example, the parking lot management server controls a multi-level parking lot. The transmitter-receiver in the parking lot transmits the ID (Step 7107i). The in-vehicle receiver (transmitter 7007b) inquires of the parking lot management server based on the user information of the in-vehicle receiver and the received ID (Step 7107j).

The parking lot management server charges for parking according to parking time and the like (Step 7107k). The parking lot management server controls the parking lot to facilitate access to the parked vehicle (Step 7107m). For example, the parking lot management server controls a multi-level parking lot. The in-vehicle receiver (transmitter 7007b) displays the map to the parking position, and navigates from the current position (Step 7107n).

(Interior of Train)

FIG. 424 is a diagram illustrating components of a visible light communication system applied to the interior of a train in Embodiment 33.

The visible light communication system includes, for example, a plurality of lighting devices 1905 disposed inside a train, a smartphone 1905 held by a user, a server 1904, and a camera 1903 disposed inside the train.

Each of the lighting devices 1905 is configured as the above-described transmitter, and not only radiates light, but also transmits a visible light signal by changing in luminance. This visible light signal indicates an ID of the lighting device 1905 which transmits the visible light signal.

The smartphone 1906 is configured as the above-described receiver, and receives the visible light signal transmitted from the lighting device 1905, by capturing an image of the lighting device 1905. For example, when a user is involved in troubles inside a train (such as molestation or fights), the user operates the smartphone 1906 so that the smartphone 1906 receives the visible light signal. When the smartphone 1906 receives a visible light signal, the smartphone 1906 notifies the server 1904 of an ID indicated in the visible light signal.

The server 1904 is notified of the ID, and identifies the camera 1903 which has a range of imaging that is a range of illumination by the lighting device 1905 identified by the ID. The server 1904 then causes the identified camera 1903 to capture an image of a range illuminated by the lighting device 1905.

The camera 1903 captures an image according to an instruction issued by the server 1904, and transmits the captured image to the server 1904.

By doing so, it is possible to obtain an image showing a situation where a trouble occurs in the train. This image can be used as an evidence of the trouble.

Furthermore, an image captured with the camera 1903 may be transmitted from the server 1904 to the smartphone 1906 by a user operation on the smartphone 1906.

Moreover, the smartphone 1906 may display an imaging button on a screen and when a user touches the imaging button, transmit a signal prompting an imaging operation to the server 1904. This allows a user to determine a timing of an imaging operation.

FIG. 425 is a diagram illustrating components of a visible light communication system applied to amusement parks and the like facilities in Embodiment 33.

The visible light communication system includes, for example, a plurality of cameras 1903 disposed in a facility and an accessory 1907 worn by a person.

The accessory 1907 is, for example, a headband with a ribbon to which a plurality of LEDs are attached. This accessory 1907 is configured as the above-described transmitter, and transmits a visible light signal by changing luminance of the LEDs.

Each of the cameras 1903 is configured as the above-described receiver, and has a visible light communication mode and a normal imaging mode. Furthermore, these cameras 1903 are disposed at mutually different positions in a path inside the facility.

Specifically, when an image of the accessory 1907 as a subject is captured with the camera 1903 in the visible light communication mode, the camera 1903 receives a visible light signal from the accessory 1907. When the camera 1903 receives the visible light signal, the camera 1903 switches the preset mode from the visible light communication mode to the normal imaging mode. As a result, the camera 1903 captures an image of a person wearing the accessory 1907 as a subject.

Therefore, when a person wearing the accessory 1907 walks in the path inside the facility, the cameras 1903 close to the person capture images of the person one after another. Thus, it is possible to automatically obtain and store images which show the person enjoying time in the facility.

Note that instead of capturing an image in the normal imaging mode immediately after receiving the visible light signal, the camera 1903 may capture an image in the normal imaging mode, for example, when the camera 1903 is given an imaging start instruction from the smartphone. This allows a user to operate the camera 1903 so that an image of the user is captured with the camera 1903 at a timing when the user touches an imaging start button displayed on the screen of the smartphone.

FIG. 426 is a diagram illustrating an example of a visible light communication system including a play tool and a smartphone in Embodiment 33.

A play tool 1901 is, for example, configured as the above-described transmitter including a plurality of LEDs. Specifically, the play tool 1901 transmits a visible light signal by changing luminance of the LEDs.

A smartphone 1902 receives the visible light signal from the play tool 1901 by capturing an image of the play tool 1901. As illustrated in (a) of FIG. 426, when the smartphone 1902 receives the visible light signal for the first time, the smartphone 1902 downloads, from the server or the like, for example, video 1 associated with the first transmission of the visible light signal. When the smartphone 1902 receives the visible light signal for the second time, the smartphone 1902 downloads, from the server or the like, for example, video 2 associated with the second transmission of the visible light signal as illustrated in (b) of FIG. 426.

This means that when the smartphone 1902 receives the same visible light signal, the smartphone 1902 switches video which is reproduced according to the number of times the smartphone 1902 has received the visible light signal. The number of times the smartphone 1902 has received the visible light single may be counted by the smartphone 1902 or may be counted by the server. Even when the smartphone 1902 has received the same visible light signal more than one time, the smartphone 1902 does not continuously reproduce the same video. The smartphone 1902 may decrease the probability of occurrence of video already reproduced and preferentially download and reproduce video with high probability of occurrence among a plurality of video items associated with the same visible light signal.

The smartphone 1902 may receive a visible light signal transmitted from a touch screen placed in an information office of a facility including a plurality of shops, and display an image according to the visible light signal. For example, when a default image representing an overview of the facility is displayed, the touch screen transmits a visible light signal indicating the overview of the facility by changing in luminance. Therefore, when the smartphone receives the visible light signal by capturing an image of the touch screen on which the default image is displayed, the smartphone can display on the display thereof an image showing the overview of the facility. In this case, when a user provides an input to the touch screen, the touch screen displays a shop image indicating information on a specified shop, for example. At this time, the touch screen transmits a visible light signal indicating the information on the specified shop. Therefore, the smartphone receives the visible light signal by capturing an image of the touch screen displaying the shop image, and thus can display the shop image indicating the information on the specified shop. Thus, the smartphone is capable of displaying an image in synchronization with the touch screen.

Summary of Above Embodiment

A reproduction method according to an aspect of the present disclosure includes: receiving a visible light signal by a sensor of a terminal device from a transmitter which transmits the visible light signal by a light source changing in luminance; transmitting a request signal for requesting content associated with the visible light signal, from the terminal device to a server; receiving, by the terminal device, content including time points and data to be reproduced at the time points, from the server; and reproducing data included in the content and corresponding to time of a clock included in the terminal device.

With this, as illustrated in FIG. 402C, content including time points and data to be reproduced at the time points is received by a terminal device, and data corresponding to time of a clock included in the terminal device is reproduced. Therefore, the terminal device avoids reproducing data included in the content, at an incorrect point of time, and is capable of appropriately reproducing the data at a correct point of time indicated in the content. Specifically, as in the method e in FIG. 402A, the terminal device, i.e., the receiver, reproduces the content from a point of time of (the receiver time point—the content reproduction start time point). The above-mentioned data corresponding to time of the clock included in the terminal device is data included in the content and which is at a point of time of (the receiver time point—the content reproduction start time point). Furthermore, when content related to the above content (the transmitter-side content) is also reproduced on the transmitter, the terminal device is capable of appropriately reproducing the content in synchronization with the transmitter-side content. Note that the content is audio or an image.

Furthermore, the clock included in the terminal device may be synchronized with a reference clock by global positioning system (GPS) radio waves or network time protocol (NTP) radio waves.

In this case, since the clock of the terminal device (the receiver) is synchronized with the reference clock, at an appropriate time point according to the reference clock, data corresponding to the time point can be reproduced as illustrated in FIG. 401 and FIG. 403.

Furthermore, the visible light signal may indicate a time point at which the visible light signal is transmitted from the transmitter.

With this, the terminal device (the receiver) is capable of receiving content associated with a time point at which the visible light signal is transmitted from the transmitter (the transmitter time point) as indicated in the method d in FIG. 402A. For example, when the transmitter time point is 5:43, content that is reproduced at 5:43 can be received.

Furthermore, in the above reproduction method, when the process for synchronizing the clock of the terminal device with the reference clock is performed using the GPS radio waves or the NTP radio waves is at least a predetermined time before a point of time at which the terminal device receives the visible light signal, the clock of the terminal device may be synchronized with a clock of the transmitter using a time point indicated in the visible light signal transmitted from the transmitter.

For example, when the predetermined time has elapsed after the process for synchronizing the clock of the terminal device with the reference clock, there are cases where the synchronization is not appropriately maintained. In this case, there is a risk that the terminal device cannot reproduce content at a point of time which is in synchronization with the transmitter-side content reproduced by the transmitter. Thus, in the reproduction method according to an aspect of the present disclosure described above, when the predetermined time has elapsed, the clock of the terminal device (the receiver) and the clock of the transmitter are synchronized with each other as in Step S1829 and Step S1830 of FIG. 401. Consequently, the terminal device is capable of reproducing content at a point of time which is in synchronization with the transmitter-side content reproduced by the transmitter.

Furthermore, the server may hold a plurality of content items associated with time points, and in the receiving of content, when content associated with the time point indicated in the visible light signal is not present in the server, among the plurality of content items, content associated with a time point that is closest to the time point indicated in the visible light signal and after the time point indicated in the visible light signal may be received.

With this, as illustrated in the method d in FIG. 402A, it is possible to receive appropriate content among the plurality of content items in the server even when the server does not have content associated with a time point indicated in the visible light signal.

Furthermore, the reproduction method may include: receiving a visible light signal by a sensor of a terminal device from a transmitter which transmits the visible light signal by a light source changing in luminance; transmitting a request signal for requesting content associated with the visible light signal, from the terminal device to a server; receiving, by the terminal device, content from the server; and reproducing the content, and the visible light signal may indicate ID information and a time point at which the visible light signal is transmitted from the transmitter, and in the receiving of content, the content that is associated with the ID information and the time point indicated in the visible light signal may be received.

With this, as in the method d in FIG. 402A, among the plurality of content items associated with the ID information (the transmitter ID), content associated with a time point at which the visible light signal is transmitted from the transmitter (the transmitter time point) is received and reproduced. Thus, it is possible to reproduce appropriate content for the transmitter ID and the transmitter time point.

Furthermore, the visible light signal may indicate the time point at which the visible light signal is transmitted from the transmitter, by including second information indicating an hour and a minute of the time point and first information indicating a second of the time point, and the receiving of a visible light signal may include receiving the second information and receiving the first information a greater number of times than a total number of times the second information is received.

With this, for example, when a time point at which each packet included in the visible light signal is transmitted is sent to the terminal device at a second rate, it is possible to reduce the burden of transmitting, every time one second passes, a packet indicating a current time point represented using all the hour, the minute, and the second. Specifically, as illustrated in FIG. 397, when the hour and the minute of a time point at which a packet is transmitted have not been updated from the hour and the minute indicated in the previously transmitted packet, it is sufficient that only the first information which is a packet indicating only the second (the time packet 1) is transmitted. Therefore, when an amount of the second information to be transmitted by the transmitter, which is a packet indicating the hour and the minute (the time packet 2), is set to less than an amount of the first information to be transmitted by the transmitter, which is a packet indicating the second (the time packet 1), it is possible to avoid transmission of a packet including redundant content.

Furthermore, the sensor of the terminal device may be an image sensor, in the receiving of a visible light signal, continuous imaging with the image sensor may be performed while a shutter speed of the image sensor is alternately switched between a first speed and a second speed higher than the first speed, (a) when a subject imaged with the image sensor is a barcode, an image in which the barcode appears may be obtained through imaging performed when the shutter speed is the first speed, and a barcode identifier may be obtained by decoding the barcode appearing in the image, and (b) when a subject imaged with the image sensor is the light source, a bright line image which is an image including bright lines corresponding to a plurality of exposure lines included in the image sensor may be obtained through imaging performed when the shutter speed is the second speed, and the visible light signal may be obtained as a visible light identifier by decoding a plurality of patterns of the bright lines included in the obtained bright line image, and the reproduction method may further include displaying an image obtained through imaging performed when the shutter speed is the first speed.

Thus, as illustrated in FIG. 302, it is possible to appropriately obtain, from any of a barcode and a visible light signal, an identifier adapted therefor, and it is also possible to display an image in which the barcode or light source serving as a subject appears.

Furthermore, in the obtaining of the visible light identifier, a first packet including a data part and an address part may be obtained from the plurality of patterns of the bright lines, whether or not at least one packet already obtained before the first packet includes at least a predetermined number of second packets each including the same address part as the address part of the first packet may be determined, and when it is determined that at least the predetermined number of the second packets are included, a combined pixel value may be calculated by combining a pixel value of a partial region of the bright line image that corresponds to a data part of each of at least the predetermined number of the second packets and a pixel value of a partial region of the bright line image that corresponds to the data part of the first packet, and at least a part of the visible light identifier may be obtained by decoding the data part including the combined pixel value.

With this, as illustrated in FIG. 274, even when the data parts of a plurality of packets including the same address part are slightly different, pixel values of the data parts are combined to enable appropriate data parts to be decoded, and thus it is possible to properly obtain at least a part of the visible light identifier.

Furthermore, the first packet may further include a first error correction code for the data part and a second error correction code for the address part, and in the receiving of a visible light signal, the address part and the second error correction code transmitted from the transmitter by changing in luminance according to a second frequency may be received, and the data part and the first error correction code transmitted from the transmitter by changing in luminance according to a first frequency higher than the second frequency may be received.

With this, as illustrated in FIG. 272, erroneous reception of the address part can be reduced, and the data part having a large data amount can be promptly obtained.

Furthermore, in the obtaining of the visible light identifier, a first packet including a data part and an address part may be obtained from the plurality of patterns of the bright lines, whether or not at least one packet already obtained before the first packet includes at least one second packet which is a packet including the same address part as the address part of the first packet may be determined, when it is determined that the at least one second packet is included, whether or not all the data parts of the at least one second packet and the first packet are the same may be determined, when it is determined that not all the data parts are the same, it may be determined for each of the at least one second packet whether or not a total number of parts, among parts included in the data part of the second packet, which are different from parts included in the data part of the first packet, is a predetermined number or more, when the at least one second packet includes the second packet in which the total number of different parts is determined as the predetermined number or more, the at least one second packet may be discarded, and when the at least one second packet does not include the second packet in which the total number of different parts is determined as the predetermined number or more, a plurality of packets in which a total number of packets having the same data part is highest may be identified among the first packet and the at least one second packet, and at least a part of the visible light identifier may be obtained by decoding a data part included in each of the plurality of packets as a data part corresponding to the address part included in the first packet.

With this, as illustrated in FIG. 273, even when a plurality of packets having the same address part are received and the data parts in the packets are different, an appropriate data part can be decoded, and thus at least a part of the visible light identifier can be properly obtained. This means that a plurality of packets transmitted from the same transmitter and having the same address part basically have the same data part. However, there are cases where the terminal device receives a plurality of packets which have the same address part but have mutually different data parts, when the terminal device switches the transmitter serving as a transmission source of packets from one to another. In such a case, in the reproduction method according to an aspect of the present disclosure described above, the already received packet (the second packet) is discarded as in Step S10106 of FIG. 273, allowing the data part of the latest packet (the first packet) to be decoded as a proper data part corresponding to the address part therein. Furthermore, even when no such switch of transmitters as mentioned above occurs, there are cases where the data parts of the plurality of packets having the same address part are slightly different, depending on the visible light signal transmitting and receiving status. In such cases, in the reproduction method according to an aspect of the present disclosure described above, what is called a decision by the majority as in Step S10107 of FIG. 273 makes it possible to decode a proper data part.

Furthermore, in the obtaining of the visible light identifier, a plurality of packets each including a data part and an address part may be obtained from the plurality of patterns of the bright lines, and whether or not the obtained packets include a 0-end packet which is a packet including the data part in which all bits are zero may be determined, and when it is determined that the 0-end packet is included, whether or not the plurality of packets include all N associated packets (where N is an integer of 1 or more) which are each a packet including an address part associated with an address part of the 0-end packet may be determined, and when it is determined that all the N associated packets are included, the visible light identifier may be obtained by arranging and decoding data parts of the N associated packets. For example, the address part associated with the address part of the 0-end packet is an address part representing an address greater than or equal to 0 and smaller than an address represented by the address part of the 0-end packet.

Specifically, as illustrated in FIG. 275, whether or not all the packets having addresses following the address of the 0-end packet are present as the associated packets is determined, and when it is determined that all the packets are present, data parts of the associated packets are decoded. With this, even when the terminal device does not previously have information on how many associated packets are necessary for obtaining the visible light identifier and furthermore, does not previously have the addresses of these associated packets, the terminal device is capable of easily obtaining such information at the time of obtaining the 0-end packet. As a result, the terminal device is capable of obtaining an appropriate visible light identifier by arranging and decoding the data parts of the N associated packets.

Embodiment 34

A protocol adapted for variable length and variable number of divisions is described.

FIGS. 427 to 431 are diagrams illustrating an example of a transmission signal in this embodiment.

A transmission packet is made up of a preamble, TYPE, a payload, and a check part. Packets may be continuously transmitted or may be intermittently transmitted. With a period in which no packet is transmitted, it is possible to change the state of liquid crystals when the backlight is turned off, to improve the sense of dynamic resolution of the liquid crystal display. When the packets are transmitted at random intervals, signal interference can be avoided.

For the preamble, a pattern that does not appear in the 4 PPM is used. The reception process can be facilitated with the use of a short basic pattern. With the basis pattern placed in a rear part as illustrated in (b) and (c) in FIG. 429, a packet can be received even when a short section is received. When the first bit and the last bit of the preamble are 1 (a high luminance state) like in (c) in FIG. 429, the preamble can be received with accuracy.

The kind of the preamble is used to represent the number of divisions in data so that the number of divisions in data can be made variable without unnecessarily using a transmission slot.

When the payload length varies according to the value of the TYPE, it is possible to make the transmission data variable. In the TYPE, the payload length may be represented, or the data length before division may be represented. When a value of the TYPE represents an address of a packet, the receiver can correctly arrange received packets. Since a required length of the address is different according to the number of divisions, the length of the TYPE may vary according to the number of divisions as illustrated in (c) in FIG. 430. Furthermore, the payload length (the data length) that is represented by a value of the TYPE may vary according to the kind of the preamble, the number of divisions, or the like.

When the length of the check part varies according to the payload length, efficient error correction (detection) is possible. When the shortest length of the check part is set to two bits, efficient conversion to the 4 PPM is possible. Furthermore, when the kind of the error correction (detection) code varies according to the payload length, error correction (detection) can be efficiently performed. The length of the check part and the kind of the error correction (detection) code may vary according to the kind of the preamble or the value of the TYPE.

Some of different combinations of the payload and the number of divisions lead to the same data length. In such a case, each combination even with the same data value is given a different meaning so that more values can be represented.

A high-speed transmission and luminance modulation protocols are described.

FIGS. 432 and 433 are diagrams illustrating an example of a transmission signal in this embodiment.

A transmission packet is made up of a preamble part, a body part, and a luminance adjustment part. The body includes an address part, a data part, and an error correction (detection) code part. When intermittent transmission is permitted, the same advantageous effects as described above can be obtained.

As illustrated in FIG. 433, luminance changes of the preamble part having two different averages of luminance, the body part having three different averages of luminance, and the luminance adjustment part having luminance that can continuously change are combined so that the average luminance can be changed continuously as a whole. The continuous changes in luminance of the luminance adjustment part can be achieved by changing the maximum luminance or by changing the ratio between a bright period and a dark period. Since there are two representation methods around 50% in luminance, 50% may be a border of usage therebetween, or the two representation methods may represent different pieces of data so that more values can be represented.

Upon reception, assuming four combinations of the preamble part and the body part, the maximum likelihood decoding is performed, and a pattern having the highest likelihood is regarded as a received signal, with the result that the signal can be received even when the light adjustment state is unknown.

Since the preamble part has a small number of variations, i.e. two variations, of luminance changes, and is a starting part of signal detection, efficient signal reception is possible when the reference of luminance is determined based on this part.

Hereinafter, a 4 PPM convolutional decoding pattern is described.

FIGS. 434 to 437 are diagrams illustrating an example of a reception algorism in this embodiment.

When the convolution length is three, the use of the preamble in FIG. 433 makes it possible to detect the preamble as it is without convolutional decoding because of three consecutive 1 and 0.

In each luminance of the 4 PPM, the state of convolution transitions as illustrated in FIGS. 434 to 437. Through the maximum likelihood estimation in each of these patterns, it is possible to receive a signal while performing convolutional decoding. The start states “000” and “111” in FIG. 437 are not present in the end state, but the end state of the preamble is one of these states. Therefore, with the use of this pattern in the maximum likelihood decoding of the first four slots of the body part, the maximum likelihood decoding can be performed with accuracy.

As the sensitivity is set higher or as the exposure time is set shorter, imaging accompanies more noise. Therefore, it is possible to reduce the noise by increasing the number of pixels to be used to determine the average luminance within the exposure line. When the sensitivity is set to a value N times larger, the number of pixels to be averaged is set to a value N squared times larger, to reduce an amount of noise to the same extent. Conversely, when the sensitivity is set low or the exposure time is set long, the number of pixels to be averaged is reduced, to reduce computational load.

When a value obtained by dividing the likelihood of the highest likelihood pass in the maximum likelihood decoding by the length of the pass is lower than a predetermined value, the result of the decoding is unreliable and the decoded signal is therefore decoded. Thus, it is possible to reduce reception errors.

When the likelihood in the maximum likelihood decoding is low or when error detection has been performed, there is a case where a signal can be properly received after another decoding process is performed in the state where the number of pixels to be averaged is reduced so that noise is reduced. Furthermore, in the same case, when a pixel has a large value, there is a case where a signal can be properly received after the sensitivity is set lower or the exposure time is set shorter, and when a pixel has a small value, there is a case where a signal can be properly received after the sensitivity is set higher or the exposure time is set longer.

Assume that when the receiver has a sampling rate (that is the reciprocal of a temporal difference in exposure timing between adjacent exposure lines) of f hertz, a transmission frequency is Nf/2+k hertz. In this case, assume that N is an integer and k<f/2. Here, a high frequency component is not observed through frequency analysis on a received signal, and k hertz is determined as aliasing. Therefore, for example, when four values are represented, k is assigned with (0, f/4, f/2, f×¾), which allows the receiver to identify each signal. At this time, the frequency is higher than in the case of using k hertz simply for a transmission signal, and thus it is possible to produce an advantageous effect such as flicker reduction. For example, a frequency of approximately a few kilo hertz to a few tens kilo hertz induces a reading error of a barcode reader, but this problem can be avoided with the use of a frequency no less than this frequency.

Since the barcode reader reads reflected light of a red ray, removal of a red component from a visible light communication signal can lead to removal of an adverse effect on a reading operation by a barcode reader. In order to remove a red component from a visible light communication signal, there is a method using a filter or a phosphor that increases an afterglow of a component that emits red light having a phase opposite to the signal and has a long wavelength, for example. The receiver can properly receive a signal by receiving the signal based on luminance of light containing a green or blue component.

According to the last operation on the transmitter by a user, the transmitter changes a signal to be transmitted. By doing so, information on a phenomenon resulting from the operation can be transmitted, or a signal that a user wishes to transmit can be transmitted.

The transmitter transmits signals only for a predetermined length of time after a user performs the last operation. This makes it possible to reduce power consumption and to assign a timer of a microcomputer to another function, for example.

The transmitter transmits a signal only when the timer of the microcomputer is not used for another function. Alternatively, the transmitter alternately performs functions of using the timer of the microcomputer including signal transmission. With this, a small number of timers can be enough in the transmitter.

The receiver performs a different operation only during a predetermined period after predetermined data is received by visible light communication. For example, within one hour after an ID is received from an advertisement sign, a product or service is offered at a discounted price, or a campaign item for a game can be downloaded. With this, it is possible to realize an offline-to-online service or an offline-to-online-to-offline service.

The receiver receives setting information from the transmitter, and stores into a storage of the receiver the setting information in association with identification information on the transmitter. The receiver receives identification information from the same or another transmitter, and sets the associated setting information in the transmitter. The setting information may be other than something received from the transmitter, for example, language setting of the receiver. By doing so, it is possible to quickly recover the setting of the transmitter. Furthermore, settings suitable for a user can be configured in the transmitter without input from a user.

The receiver performs normal imaging and displays an image on a preview screen while a reception process continues. By doing so, it is possible to display a smoother preview image without reducing the reception performance.

The receiver continuously or intermittently captures a predetermined number of visible light images, stores them in the memory until processing on the captured images in a previous frame ends, and sequentially performs a reception process. By doing so, it is possible to complete reception even when the receiver is directed to the transmitter for a short length of time.

Embodiment 35

(Frame Configuration in Single Frame Transmission)

FIG. 438 and FIG. 439 are diagrams illustrating an example of a transmission signal in this embodiment.

The transmission frame includes a preamble (PRE), a frame length (FLEN), an ID type (IDTYPE), a content (ID/DATA) that is the data to be transmitted, and a check code (CRC), and the transmission frame may include a content type (CONTENTTYPE). The bit number of each area is an example.

The content having a variable length can be transmitted by designating the length of ID/DATA using FLEN. The ID type indicates the type of the identification information (ID) expressed by the content (data to be transmitted). For example, the identification information is information that is used to identify the transmitter or the data such as an image and a sound. Alternatively, the identification information may be any information.

The CRC is a check code for correcting or detecting an error in other parts than the PRE. The CRC length varies according to the length of a part to be checked so that the check ability can be kept at a certain level or higher. Furthermore, the use of a different check code according to each length of a part to be checked allows an improvement in the check ability per CRC length.

As illustrated in (e) of FIG. 439, the ID/DATA is ID when the CONTENTTYPE has a predetermined bit, and the ID/DATA is data when the CONTENTTYPE does not have the predetermined bit. Furthermore, when the CONTENTTYPE does not have the predetermined bit, the IDTYPE area can be used as the ID/DATA area so that a larger amount of data is transmitted.

When the IDTYPE length varies according to the ID/DATA length as illustrated in (f) and (g) of FIG. 439, an appropriate amount of ID types can be defined according to the length of ID/DATA. For example, when the ID/DATA length is defined with a large number of ID types, the IDTYPE length is increased so that a large number of IDs can be defined. When the ID/DATA length is an easy-to-use short length, the IDTYPE length is increased so that a large number of ID systems can be defined. It is also possible to reduce the length of the entire frame for quick signal transmission and reception or long-distance communication by setting the IDTYPE length to 0 when the ID/DATA length is a particular length.

(Frame Configuration in Multiple Frame Transmission)

FIG. 440 is a diagram illustrating an example of a transmission signal in this embodiment.

A transmission frame includes a preamble (PRE), an address (ADDR), and a part of divided data (DATAPART), and may also include the number of divisions (PARTNUM) and an address flag (ADDRFRAG). The bit number of each area is an example. DATAPART is a part of a content (ID/DATA) that is the data to be transmitted, the part being obtained by dividing the content.

Content is divided into a plurality of parts before being transmitted, which enables long-distance communication.

When content is equally divided into parts of the same size, the maximum frame length is reduced, and communication is stabilized.

If content cannot be equally divided, the content is divided in such a way that one part is smaller in size than the other parts, allowing data of a moderate size to be transmitted.

When the content is divided into parts having different sizes and a combination of division sizes is given a meaning, a larger amount of information can be transmitted. One data item, for example, 32-bit data, can be treated as different data items between when 8-bit data is transmitted four times, when 16-bit data is transmitted twice, and when 15-bit data is transmitted once and 17-bit data is transmitted once; thus, a larger amount of information can be represented.

With PARTNUM representing the number of divisions, the receiver can be promptly informed of the number of divisions and can accurately display a progress of the reception.

With the settings that the address is not the last address when the ADDRFRAG is 0 and the address is the last address when the ADDRFRAG is 1, the area representing the number of divisions is no longer needed, and the information can be transmitted in a shorter period of time.

The CRC is, as described above, a check code for correcting or detecting an error in other parts than the PRE. Through this check, interference can be detected when transmission frames from a plurality of transmission sources are received. When the CRC length is an integer multiple of the DATAPART length, interference can be detected most efficiently.

At the end of the divided frame (the frame illustrated in (a), (b), or (c) of FIG. 440), a check code for checking other parts than the PRE of the frame may be added.

The IDTYPE illustrated in (d) of FIG. 440 may have a fixed length such as 4 bits or 5 bits as in (a) to (d) of FIG. 438, or the IDTYPE length may be variable according to the ID/DATA length as in (f) and (g) of FIG. 439. With this, the same advantageous effects as described above can be obtained.

(Selection of ID/DATA Length)

FIG. 441 and FIG. 442 are diagrams illustrating an example of a transmission signal in this embodiment.

In the cases of (a) to (d) of FIG. 438, ucode can be represented when data has 128 bits with the settings according to tables (a) and (b) illustrated in FIG. 441 and tables (a) and (b) illustrated in FIG. 442.

(CRC Length and Generator Polynomial)

FIG. 443 is a diagram illustrating an example of a transmission signal in this embodiment.

The CRC length is set in this way to keep the checking ability regardless of the length of a subject to be checked.

The generator polynomial is an example, and other generator polynomial may be used. Furthermore, a check code other than the CRC may also be used. With this, the checking ability can be improved.

(Selection of DATAPART Length and Selection of Last Address According to Type of Preamble)

FIG. 444 is a diagram illustrating an example of a transmission signal in this embodiment. In (a) of FIG. 444, the last address is PRE (first preamble) that is added to the frame located at the last position in the array of the plurality of frames obtained by the division of the data to be transmitted (ID/DATA). The not-last address is PRE (second preamble) that is added to the frame located at the position that is not the last position in the array of the plurality of frames obtained by the division of the data to be transmitted (ID/DATA).

When the DATAPART length is indicated with reference to the type of the preamble, the area representing the DATAPART length is no longer needed, and the information can be transmitted in a shorter period of time. Furthermore, when whether or not the address is the last address is indicated, the area representing the number of divisions is no longer needed, and the information can be transmitted in a shorter period of time. Furthermore, in the case of (b) of FIG. 444, the DATAPART length is unknown when the address is the last address, and therefore a reception process can be performed assuming that the DATAPART length is estimated to be the same as the DATAPART length of a frame which is received immediately before or after reception of the current frame and has an address which is not the last address so that the signal is properly received.

The address length may be different according to the type of the preamble. With this, the number of combinations of lengths of transmission information can be increased, and the information can be transmitted in a shorter period of time, for example.

In the case of (c) of FIG. 444, the preamble defines the number of divisions, and an area representing the DATAPART length is added.

(Selection of Address)

FIG. 445 is a diagram illustrating an example of a transmission signal in this embodiment.

A value of the ADDR indicates the address of the frame, with the result that the receiver can reconstruct properly transmitted information.

A value of PARTNUM indicates the number of divisions, with the result that the receiver can be informed of the number of divisions without fail at the time of receiving the first frame and can accurately display a progress of the reception.

(Prevention of Interference by Difference in Number of Divisions)

FIG. 446 and FIG. 447 are a diagram and a flowchart illustrating an example of a transmission and reception system in this embodiment.

When the transmission information is equally divided and transmitted, since signals from a transmitter A and a transmitter B in FIG. 446 have different preambles, the receiver can reconstruct the transmission information without mixing up transmission sources even when these signals are received at the same time.

When the transmitters A and B include a number-of-divisions setting unit, a user can prevent interference by setting the number of divisions of transmitters placed close to each other to different values.

The receiver registers the number of divisions of the received signal with the server so that the server can be informed of the number of divisions set to the transmitter, and other receiver can obtain the information from the server to accurately display a progress of the reception.

The receiver obtains, from the server or the storage unit of the receiver, information on whether or not a signal from a nearby or corresponding transmitter is an equally-divided signal. When the obtained information is equally-divided information, only a signal from a frame having the same DATAPART length is reconstructed. When the obtained information is not equally divided information or when a situation in which not all addresses in the frames having the same DATAPART length are present continues for a predetermined length of time or more, a signal obtained by combining frames having different DATAPART lengths is decoded.

(Prevention of Interference by Difference in Number of Divisions)

FIG. 448 is a flowchart illustrating operation of a server in this embodiment.

The server receives, from the receiver, ID and division formation (which is information on a combination of DATAPART lengths of the received signal) received by the receiver. When the ID is subject to extension according to the division formation, a value obtained by digitalizing a pattern of the division formation is defined as an auxiliary ID, and associated information using, as a key, an extended ID obtained by combining the ID and the auxiliary ID is sent to the receiver.

When the ID is not subject to the extension according to the division formation, whether or not the storage unit holds division formation associated with the ID is checked, and whether or not the division formation held in the storage unit is the same as the received division formation is checked. When the division formation held in the storage unit is different from the received division formation, a re-check instruction is transmitted to the receiver. With this, erroneous information due to a reception error in the receiver can be prevented from being presented.

When the same division formation with the same ID is received within a predetermined length of time after the re-check instruction is transmitted, it is determined that the division formation has been changed, and the division formation associated with the ID is updated. Thus, it is possible to adapt to the case where the division formation has been changed as described in the explanation with reference to FIG. 446.

When the division formation has not been stored, when the received division formation and the held division formation match, or when the division formation is updated, the associated information using the ID as a key is sent to the receiver, and the division formation is stored into the storage unit in association with the ID.

(Indication of Status of Reception Progress)

FIG. 449 to FIG. 454 are flowcharts each illustrating an example of operation of a receiver in this embodiment.

The receiver obtains, from the server or the storage area of the receiver, the variety and ratio of the number of divisions of a transmitter corresponding to the receiver or a transmitter around the receiver. Furthermore, when partial division data is already received, the variety and ratio of the number of divisions of the transmitter which has transmitted information matching the partial division data are obtained.

The receiver receives a divided frame.

When the last address has already been received, when the variety of the obtained number of divisions is only one, or when the variety of the number of divisions corresponding to a running reception app is only one, the number of divisions is already known, and therefore, the status of progress is displayed based on this number of divisions.

Otherwise, the receiver calculates and displays a status of progress in a simple mode when there is a few available processing resources or an energy-saving mode is ON. In contrast, when there are many available processing resources or the energy-saving mode is OFF, the receiver calculates and displays a status of progress in a maximum likelihood estimation mode.

FIG. 450 is a flowchart illustrating a method of calculating a status of progress in a simple mode.

First, the receiver obtains a standard number of divisions Ns from the server. Alternatively, the receiver reads the standard number of divisions Ns from a data holding unit included therein. Note that the standard number of divisions is (a) a mode or an expected value of the number of transmitters that transmit data divided by such number of divisions, (b) the number of divisions determined for each packet length, (c) the number of divisions determined for each application, or (d) the number of divisions determined for each identifiable range where the receiver is present.

Next, the receiver determines whether or not a packet indicating that the last address is included has already been received. When the receiver determines that the packet has been received, the address of the last packet is denoted as N. In contrast, when the receiver determines that the packet has not been received, a number obtained by adding 1 or a number of 2 or more to the received maximum address Amax is denoted as Ne. Here, the receiver determines whether or not Ne>Ns is satisfied. When the receiver determines that Ne>Ns is satisfied, the receiver assumes N=Ne. In contrast, when the receiver determines that Ne>Ns is not satisfied, the receiver assumes N=Ns.

Assuming that the number of divisions in the signal that is being received is N, the receiver then calculates a ratio of the number of the received packets to packets required to receive the entire signal.

In such a simple mode, the status of progress can be calculated by a simpler calculation than in the maximum likelihood estimation mode. Thus, the simple mode is advantageous in terms of processing time or energy consumption.

FIG. 451 is a flowchart illustrating a method of calculating a status of progress in a maximum likelihood estimation mode.

First, the receiver obtains a previous distribution of the number of divisions from the server. Alternatively, the receiver reads the previous distribution from the data holding unit included therein. Note that the previous distribution is (a) determined as a distribution of the number of transmitters that transmit data divided by the number of divisions, (b) determined for each packet length, (c) determined for each application, or (d) determined for each identifiable range where the receiver is present.

Next, the receiver receives a packet x and calculates a probability P(x|y) of receiving the packet x when the number of divisions is y. The receiver then determines a probability p(y|x) of the number of divisions of a transmission signal being y when the packet x is received, according to P(x|y)×P(y)÷A (where A is a multiplier for normalization). Furthermore, the receiver assumes P(y)=P(y|x).

Here, the receiver determines whether or not a number-of-divisions estimation mode is a maximum likelihood mode or a likelihood average mode. When the number-of-divisions estimation mode is the maximum likelihood mode, the receiver calculates a ratio of the number of packets that have been received, assuming that y maximizing P(y) is the number of divisions. When the number-of-divisions estimation mode is the likelihood average mode, the receiver calculates a ratio of the number of packets that have been received, assuming that a sum of y×P(y) is the number of divisions.

In the maximum likelihood estimation mode such as that just described, a more accurate degree of progress can be calculated than in the simple mode.

Furthermore, when the number-of-divisions estimation mode is the maximum likelihood mode, a likelihood of the last address being at a position of each number is calculated using the address that have so far been received, and the number having the highest likelihood is estimated as the number of divisions. With this, a progress of reception is displayed. In this display method, a status of progress closest to the actual status of progress can be displayed.

FIG. 452 is a flowchart illustrating a display method in which a status of progress does not change downward.

First, the receiver calculates a ratio of the number of packets that have been received to packets required to receive the entire signal. The receiver then determines whether or not the calculated ratio is smaller than a ratio that is being displayed. When the receiver determines that the calculated ratio is smaller than the ratio that is being displayed, the receiver further determines whether or not the ratio that is being displayed is a calculation result obtained no less than a predetermined time before. When the receiver determines that the ratio that is being displayed is a calculation result obtained no less than the predetermined time before, the receiver displays the calculated ratio. When the receiver determines that the ratio that is being displayed is not a calculation result obtained no less than the predetermined time before, the receiver continues to display the ratio that is being displayed.

Furthermore, the receiver determines that the calculated ratio is greater than or equal to the ratio that is being displayed, the receiver denotes, as Ne, the number obtained by adding 1 or the number of 2 or more to a received maximum address Amax. The receiver then displays the calculated ratio.

When the last packet is received, for example, a calculation result of the status of progress smaller than a previous result thereof, that is, a downward change in status of progress (degree of progress) which is displayed, is unnatural. In this regard, such an unnatural result can be prevented from being displayed in the above-described display method.

FIG. 453 is a flowchart illustrating a method of displaying a status of progress when there is a plurality of packet lengths.

First, the receiver calculates, for each packet length, a ratio P of the number of packets that have been received. At this time, the receiver determines which of the modes including a maximum mode, an entirety display mode, and a latest mode, the display mode is. When the receiver determines that the display mode is the maximum mode, the receiver displays the highest ratio out of the ratios P for the plurality of packet lengths. When the receiver determines that the display mode is the entirety display mode, the receiver displays all the ratios P. When the display mode is the latest mode, the receiver displays the ratio P for the packet length of the last received packet.

In FIG. 454, (a) is a status of progress calculated in the simple mode, (b) is a status of progress calculated in the maximum likelihood mode, and (c) is a status of progress calculated using the smallest one of the obtained numbers of divisions as the number of divisions. Since the status of progress changes upward in the ascending order of (a), (b), and (c), it is possible to display all the statuses at the same time by displaying (a), (b), and (c) in layers as in the illustration.

(Divided Transmission)

FIG. 455 is a diagram illustrating an example of a transmission signal in this embodiment.

A check code used in this frame configuration includes two CRCs illustrated in FIG. 438 to FIG. 440. As the bit length of a portion to be checked increases, the CRC length is increased so that the check ability can be prevented from being reduced.

A table (a) in FIG. 455 shows cases where the CRC length is a multiple of 4, and a table (b) in FIG. 455 shows cases where the CRC length is a multiple of 2. In the 4 PPM, since data is coded on a 2-bit basis, the CRC length set to a multiple of 2 can avoid waste in assignment. The CRC length is defined in such a way as not to fall below 2 log(N) where N is a bit length of a portion to be checked. Here, the log is a logarithm with a base 2. With this, settings can be made in such a way that the check ability does not fall below a predetermined level. Values in the tables are an example; another CRC length may be assigned, or the CRC length may be other than a multiple of 2 or 4.

The generator polynomial is an example, and other generator polynomial may be used. Furthermore, instead of the CRC, other check code may be used.

When the check code is divided, even in the case where a frame is not completely received, a check can be executed to some extent so that the error rate can be reduced.

(Light Emission Control Using Common Switch and Pixel Switch)

In the transmitting method in this embodiment, a visible light signal (which is also referred to as a visible light communication signal) is transmitted by each LED included in an LED display for displaying an image, changing in luminance according to switching of a common switch and a pixel switch, for example.

The LED display is configured as a large display installed in open space, for example. Furthermore, the LED display includes a plurality of LEDs arranged in a matrix, and displays an image by causing these LEDs to blink according to an image signal. The LED display includes a plurality of common lines (COM lines) and a plurality of pixel lines (SEG lines). Each of the common lines includes a plurality of LEDs horizontally arranged in line, and each of the pixel lines includes a plurality of LEDs vertically arranged in line. Each of the common lines is connected to common switches corresponding to the common line. The common switches are transistors, for example. Each of the pixel lines is connected to pixel switches corresponding to the pixel line. The pixel switches corresponding to the plurality of pixel lines are included in an LED driver circuit (a constant current circuit), for example. Note that the LED driver circuit is configured as a pixel switch control unit that switches the plurality of pixel switches.

More specifically, one of an anode and a cathode of each LED included in the common line is connected to a terminal, such as a connector, of the transistor corresponding to that common line. The other of the anode and the cathode of each LED included in the pixel line is connected to a terminal (a pixel switch) of the above LED driver circuit which corresponds to that pixel line.

When the LED display displays an image, a common switch control unit which controls the plurality of common switches turns ON the common switches in a time-division manner. For example, the common switch control unit keeps only a first common switch ON among the plurality of common switches during a first period, and keeps only a second common switch ON among the plurality of common switches during a second period following the first period. The LED driver circuit turns each pixel switch ON according to an image signal during a period in which any of the common switches is ON. With this, only for the period in which the common switch is ON and the pixel switch is ON, an LED corresponding to that common switch and that pixel switch is ON. Luminance of pixels in an image is represented using this ON period. This means that the luminance of pixels in an image is under the PWM control.

In the transmitting method in this embodiment, the visible light signal is transmitted using the LED display, the common switches, the pixel switches, the common switch control unit, and the pixel switch control unit such as those described above. A transmitting apparatus (referred to also as a transmitter) in this embodiment that transmits the visible light signal in the transmitting method includes the common switch control unit and the pixel switch control unit.

FIG. 456 is a diagram illustrating an example of a transmission signal in this embodiment.

The transmitter transmits each symbol included in the visible light signal, according to a predetermined symbol period. For example, when the transmitter transmits a symbol "00" in the 4 PPM, the common switches are switched according to the symbol (a luminance change pattern of "00") in the symbol period made up of four slots. The transmitter then switches the pixel switches according to average luminance indicated by an image signal or the like.

More specifically, when the average luminance in the symbol period is set to 75% ((a) in FIG. 456), the transmitter keeps the common switch OFF for the period of a first slot and keeps the common switch ON for the period of a second slot to a fourth slot. Furthermore, the transmitter keeps the pixel switch OFF for the period of the first slot, and keeps the pixel switch ON for the period of the second slot to the fourth slot. With this, only for the period in which the common switch is ON and the pixel switch is ON, an LED corresponding to that common switch and that pixel switch is ON. In other words, the LED changes in luminance by being turned ON with luminance of LO (Low), HI (High), HI, and HI in the four slots. As a result, the symbol "00" is transmitted.

When the average luminance in the symbol period is set to 25% ((e) in FIG. 456), the transmitter keeps the common switch OFF for the period of the first slot and keeps the common switch ON for the period of the second slot to the fourth slot. Furthermore, the transmitter keeps the pixel switch OFF for the period of the first slot, the third slot, and the fourth slot, and keeps the pixel switch ON for the period of the second slot. With this, only for the period in which the common switch is ON and the pixel switch is ON, an LED corresponding to that common switch and that pixel switch is ON. In other words, the LED changes in luminance by being turned ON with luminance of LO (Low), HI (High), LO, and LO in the four slots. As a result, the symbol "00" is transmitted. Note that the transmitter in this embodiment transmits a visible light signal similar to the above-described V4 PPM (variable 4 PPM) signal, meaning that the same symbol can be transmitted with variable average luminance. Specifically, when the same symbol (for example, "00") is transmitted with average luminance at mutually different levels, the transmitter sets the luminance rising position (timing) unique to the symbol, to a fixed position, regardless of the average luminance, as illustrated in (a) to (e) of FIG.

456. With this, the receiver is capable of receiving the visible light signal without caring about the luminance.

Note that the common switches are switched by the above-described common switch control unit, and the pixel switches are switched by the above-described pixel switch control unit.

Thus, the transmitting method in this embodiment is a transmitting method of transmitting a visible light signal by way of luminance change, and includes a determining step, a common switch control step, and a first pixel switch control step. In the determining step, a luminance change pattern is determined by modulating the visible light signal. In the common switch control step, a common switch for turning ON, in common, a plurality of light sources (LEDs) which are included in a light source group (the common line) of a display and are each used for representing a pixel in an image is switched according to the luminance change pattern. In the first pixel switch control step, a first pixel switch for turning ON a first light source among the plurality of light sources included in the light source group is turned ON, to cause the first light source to be ON only for a period in which the common switch is ON and the first pixel switch is ON, to transmit the visible light signal.

With this, a visible light signal can be properly transmitted from a display including a plurality of LEDs or the like as the light sources. Therefore, this enables communication between various devices including devices other than lightings. Furthermore, when the display is a display for displaying images under control of the common switch and the first pixel switch, the visible light signal can be transmitted using that common switch and that first pixel switch. Therefore, it is possible to easily transmit the visible light signal without a significant change in the structure for displaying images on the display.

Furthermore, the timing of controlling the pixel switch is adjusted to match the transmission symbol (one 4 PPM), that is, is controlled as in FIG. 456 so that the visible light signal can be transmitted from the LED display without flicker. An image signal usually changes in a period of 1/30 seconds or 1/60 seconds, but the image signal can be changed according to the symbol transmission period (the symbol period) to reach the goal without changes to the circuit.

Thus, in the above determining step of the transmitting method in this embodiment, the luminance change pattern is determined for each symbol period. Furthermore, in the above first pixel switch control step, the pixel switch is switched in synchronization with the symbol period. With this, even when the symbol period is 1/2400 seconds, for example, the visible light signal can be properly transmitted according to the symbol period.

When the signal (symbol) is "10" and the average luminance is around 50%, the luminance change pattern is similar to that of 0101 and there are two luminance rising edge positions. In this case, the latest one of the luminance rising positions is prioritized so that the receiver can properly receive the signal. This means that the latest one of the luminance rising edge positions is the timing at which a luminance rising edge unique to the symbol "10" is obtained.

As the average luminance increases, a signal more similar to the signal modulated in the 4 PPM can be output. Therefore, when the luminance of the entire screen or areas sharing a power line is low, the amount of current is reduced to lower the instantaneous value of the luminance so that the length of the HI section can be increased and errors can be reduced. In this case, although the maximum luminance of the screen is lowered, a switch for enabling this function is turned ON, for example, when high luminance is not necessary, such as for outdoor use, or when the visible light communication is given priority, with the result that a balance between the communication quality and the image quality can be set to the optimum.

Furthermore, in the above first pixel switch control step of the transmitting method in this embodiment, when the image is displayed on the display (the LED display), the first pixel switch is switched to increase a lighting period, which is for representing a pixel value of a pixel in the image and corresponds to the first light source, by a length of time equivalent to a period in which the first light source is OFF for transmission of the visible light signal. Specifically, in the transmitting method in this embodiment, the visible light signal is transmitted when an image is being displayed on the LED display. Accordingly, there are cases where in the period in which the LED is to be ON to represent a pixel value (specifically, a luminance value) indicated in the image signal, the LED is OFF for transmission of the visible light signal. In such a case, in the transmitting method in this embodiment, the first pixel switch is switched in such a way that the lighting period is increased by a length of time equivalent to a period in which the LED is OFF.

For example, when the image indicated in the image signal is displayed without the visible light signal being transmitted, the common switch is ON during one symbol period, and the pixel switch is ON only for the period depending on the average luminance, that is, the pixel value indicated in the image signal. When the average luminance is 75%, the common switch is ON in the first slot to the fourth slot of the symbol period. Furthermore, the pixel switch is ON in the first slot to the third slot of the symbol period. With this, the LED is ON in the first slot to the third slot during the symbol period, allowing the above-described pixel value to be represented. The LED is, however, OFF in the second slot in order to transmit the symbol "01." Thus, in the transmitting method in this embodiment, the pixel switch is switched in such a way that the lighting period of the LED is increased by a length of time equivalent to the length of the second slot in which the LED is OFF, that is, in such a way that the LED is ON in the fourth slot.

Furthermore, in the transmitting method in this embodiment, the pixel value of the pixel in the image is changed to increase the lighting period. For example, in the above-described case, the pixel value having the average luminance of 75% is changed to a pixel value having the average luminance of 100%. In the case where the average luminance is 100%, the LED attempts to be ON in the first slot to the fourth slot, but is OFF in the first slot for transmission of the symbol "01." Therefore, also when the visible light signal is transmitted, the LED can be ON with the original pixel value (the average luminance of 75%).

With this, the occurrence of breakup of the image due to transmission of the visible light signal can be reduced.

(Light Emission Control Shifted for Each Pixel)

FIG. 457 is a diagram illustrating an example of a transmission signal in this embodiment.

When the transmitter in this embodiment transmits the same symbol (for example, "10") from a pixel A and a pixel around the pixel A (for example, a pixel B and a pixel C), the transmitter shifts the timing of light emission of these pixels as illustrated in FIG. 457. The transmitter, however, causes these pixels to emit light, without shifting the timing of the luminance rising edge of these pixels that is unique to the symbol. Note that the pixels A to C each correspond to a light source (specifically, an LED). When the symbol is "10," the timing of the luminance rising edge unique to the symbol is at the boundary between the third slot and the fourth slot. This timing is hereinafter referred to as a unique-to-symbol timing. The receiver identifies this unique-to-symbol timing and therefore can receive a symbol according to the timing.

As a result of the timing of light emission being shifted, a waveform indicating a pixel-to-pixel average luminance transition has a gradual rising or falling edge except the rising edge at the unique-to-symbol timing as illustrated in FIG. 457. In other words, the rising edge at the unique-to-symbol timing is steeper than rising edges at other timings. Therefore, the receiver gives priority to the steepest rising edge of a plurality of rising edges upon receiving a signal, and thus can identify an appropriate unique-to-symbol timing and consequently reduce the occurrence of reception errors.

Specifically, when the symbol “10” is transmitted from a predetermined pixel and the luminance of the predetermined pixel is a value intermediate between 25% and 75%, the transmitter increases or decreases an open interval of the pixel switch corresponding to the predetermined pixel. Furthermore, the transmitter adjusts, in an opposite way, an open interval of the pixel switch corresponding to the pixel around the predetermined pixel. Thus, errors can be reduced also by setting the open interval of each of the pixel switches in such a way that the luminance of the entirety including the predetermined pixel and the nearby pixel does not change. The open interval is an interval for which a pixel switch is ON.

Thus, the transmitting method in this embodiment further includes a second pixel switch control step. In this second pixel switch control step, a second pixel switch for turning ON a second light source included in the above-described light source group (the common line) and located around the first light source is turned ON, to cause the second light source to be ON only for a period in which the common switch is ON and the second pixel switch is ON, to transmit the visible light signal. The second light source is, for example, a light source located adjacent to the first light source.

In the first and second pixel switch control steps, when the first light source transmits a symbol included in the visible light signal and the second light source transmits a symbol included in the visible light signal simultaneously, and the symbol transmitted from the first light source and the symbol transmitted from the second light source are the same, among a plurality of timings at which the first pixel switch and the second pixel switch are turned ON and OFF for transmission of the symbol, a timing at which a luminance rising edge unique to the symbol is obtained is adjusted to be the same for the first pixel switch and for the second pixel switch, and a remaining timing is adjusted to be different between the first pixel switch and the second pixel switch, and the average luminance of the entirety of the first light source and the second light source in a period in which the symbol is transmitted is matched with predetermined luminance.

This allows the spatially averaged luminance to have a steep rising edge only at the timing at which the luminance rising edge unique to the symbol is obtained, as in the pixel-to-pixel average luminance transition illustrated in FIG. 457, with the result that the occurrence of reception errors can be reduced. Thus, the reception errors of the visible light signal at the receiver can be reduced.

When the symbol “10” is transmitted from a predetermined pixel and the luminance of the predetermined pixel is a value intermediate between 25% and 75%, the transmitter increases or decreases an open interval of the pixel switch corresponding to the predetermined pixel, in a first period. Furthermore, the transmitter adjusts, in an opposite way, an open interval of the pixel switch in a second period (for example, a frame) temporally before or after the first period. Thus, errors can be reduced also by setting the open interval of the pixel switch in such a way that temporal average luminance of the entirety of the predetermined pixel including the first period and the second period does not change.

In other words, in the above-described first pixel switch control step of the transmitting method in this embodiment, a symbol included in the visible light signal is transmitted in the first period, a symbol included in the visible light signal is transmitted in the second period subsequent to the first period, and the symbol transmitted in the first period and the symbol transmitted in the second are the same, for example. At this time, among a plurality of timings at which the first pixel switch is turned ON and OFF for transmission of the symbol, a timing at which a luminance rising edge unique to the symbol is obtained is adjusted to be the same in the first period and in the second period, and a remaining timing is adjusted to be different between the first period and the second period. The average luminance of the first light source in the entirety of the first period and the second period is matched with predetermined luminance. The first period and the second period may be a period for displaying a frame and a period for displaying the next frame, respectively. Furthermore, each of the first period and the second period may be a symbol period. Specifically, the first period and the second period may be a period for one symbol to be transmitted and a period for the next symbol to be transmitted, respectively.

This allows the temporally averaged luminance to have a steep rising edge only at the timing at which the luminance rising edge unique to the symbol is obtained, similarly to the pixel-to-pixel average luminance transition illustrated in FIG. 457, with the result that the occurrence of reception errors can be reduced. Thus, the reception errors of the visible light signal at the receiver can be reduced.

(Light Emission Control when Pixel Switch can be Driven at Double Speed)

FIG. 458 is a diagram illustrating an example of a transmission signal in this embodiment.

When the pixel switch can be turned ON and OFF in a cycle that is one half of the symbol period, that is, when the pixel switch can be driven at double speed, the light emission pattern may be the same as that in the V4 PPM (see FIG. 318) as illustrated in FIG. 458.

In other words, when the symbol period (a period in which a symbol is transmitted) is made up of four slots, the pixel switch control unit such as an LED driver circuit which controls the pixel switch is capable of controlling the pixel switch on a 2-slot basis. Specifically, the pixel switch control unit can keep the pixel switch ON for an arbitrary length of time in the 2-slot period from the beginning of the symbol period. Furthermore, the pixel switch control unit can keep the pixel switch ON for an arbitrary length of time in the 2-slot period from the beginning of the third slot in the symbol period.

Thus, in the transmitting method in this embodiment, the pixel value may be changed in a cycle that is one half of the above-described symbol period.

In this case, there is a risk that the level of precision of each switching of the pixel switch is lowered (the accuracy is reduced). Therefore, this is performed only when a transmission priority switch is ON so that a balance between the image quality and the quality of transmission can be set to the optimum.

(Blocks for Light Emission Control Based on Pixel Value Adjustment)

FIG. 459 is a diagram illustrating an example of a transmitter in this embodiment.

FIG. 459 is a block diagram illustrating, in (a), a configuration of a device that only displays an image without transmitting the visible light signal, that is, a display device that displays an image on the above-described LED display. This display device includes, as illustrated in (a) of FIG. 459, an image and video input unit 1911, an Nx speed-up unit 1912, a common switch control unit 1913, and a pixel switch control unit 1914.

The image and video input unit 1911 outputs, to the Nx speed-up unit 1912, an image signal representing an image or video at a frame rate of 60 Hz, for example.

The Nx speed-up unit 1912 multiplies the frame rate of the image signal received from the image and video input unit 1911 by N (N>1), and outputs the resultant image signal. For example, the Nx speed-up unit 1912 multiplies the frame rate by 10 (N=10), that is, increases the frame rate to a frame rate of 600 Hz.

The common switch control unit 1913 switches the common switch based on images provided at the frame rate of 600 Hz. Likewise, the common switch control unit 1914 switches the pixel switch based on images provided at the frame rate of 600 Hz. Thus, as a result of the frame rate being increased by the Nx speed-up unit 1912, it is possible to prevent flicker which is caused by switching of a switch such as the common switch or the pixel switch. Furthermore, also when an image of the LED display is captured with the imaging device using a high-speed shutter, an image without defective pixels or flicker can be captured with the imaging device.

FIG. 459 is a block diagram illustrating, in (b), a configuration of a display device that not only displays an image but also transmits the above-described visible light signal, that is, the transmitter (the transmitting apparatus). This transmitter includes the image and video input unit 1911, the common switch control unit 1913, the pixel switch control unit 1914, a signal input unit 1915, and a pixel value adjustment unit 1916. The signal input unit 1915 outputs a visible light signal including a plurality of symbols to the pixel value adjustment unit 1916 at a symbol rate (a frequency) of 2400 symbols per second.

The pixel value adjustment unit 1916 copies the image received from the image and video input unit 1911, based on the symbol rate of the visible light signal, and adjusts the pixel value according to the above-described method. With this, the common switch control unit 1913 and the pixel switch control unit 1914 downstream to the pixel value adjustment unit 1916 can output the visible light signal without luminance of the image or video being changed.

For example, in the case of an example illustrated in FIG. 459, when the symbol rate of the visible light signal is 2400 symbols per second, the pixel value adjustment unit 1916 copies an image included in the image signal in such a way that the frame rate of the image signal is changed from 60 Hz to 4800 Hz. For example, assume that the value of a symbol included in the visible light signal is "00" and the pixel value (the luminance value) of a pixel included in the first image that has not been copied yet is 50%. In this case, the pixel value adjustment unit 1916 adjusts the pixel value in such a way that the first image that has been copied has a pixel value of 100% and the second image that has been copied has a pixel value of 50%. With this, as in the luminance change in the case of the symbol "00" illustrated in (c) of FIG. 458, AND-ing the common switch and the pixel switch results in luminance of 50%. Consequently, the visible light signal can be transmitted while the luminance remains equal to the luminance of the original image. Note that AND-ing the common switch and the pixel switch means that the light source (that is, the LED) corresponding to the common switch and the pixel switch is ON only for the period in which the common switch is ON and the pixel switch is ON.

Furthermore, in the transmitting method in this embodiment, the process of displaying an image and the process of transmitting a visible light signal do not need to be performed at the same time, that is, these processes may be performed in separate periods, i.e., a signal transmission period and an image display period.

Specifically, in the above-described first pixel switch control step in this embodiment, the first pixel switch is ON for the signal transmission period in which the common switch is switched according to the luminance change pattern. Moreover, the transmitting method in this embodiment may further include an image display step of displaying a pixel in an image to be displayed, by (i) keeping the common switch ON for an image display period different from the signal transmission period and (ii) turning ON the first pixel switch in the image display period according to the image, to cause the first light source to be ON only for a period in which the common switch is ON and the first pixel switch is ON.

With this, the process of displaying an image and the process of transmitting a visible light signal are performed in mutually different periods, and thus it is possible to easily display the image and transmit the visible light signal.

(Timing of Changing Power Supply)

Although a signal OFF interval is included in the case where the power line is changed, the power line is changed according to the transmission period of 4 PPM symbols because no light emission in the last part of the 4 PPM does not affect signal reception, and thus it is possible to change the power line without affecting the quality of signal reception.

Furthermore, it is possible to change the power line without affecting the quality of signal reception, by changing the power line in an LO period in the 4 PPM as well. In this case, it is also possible to maintain the maximum luminance at a high level when the signal is transmitted.

(Timing of Drive Operation)

In this embodiment, the LED display may be driven at the timings illustrated in FIG. 460 to FIG. 462.

FIG. 460 to FIG. 462 are timing charts of when an LED display is driven by a light ID modulated signal according to the present disclosure.

For example, as illustrated in FIG. 461, since the LED cannot be turned ON with the luminance indicated in the image signal when the common switch (COM1) is OFF for transmission of the visible light signal (light ID) (time period t1), the LED is turned ON after the time period t1. With this, the image indicated by the image signal can be properly displayed without breakup while the visible light signal is properly transmitted.

(Summary)

FIG. 463A is a flowchart illustrating a transmission method according to an aspect of the present disclosure.

The transmitting method according to an aspect of the present disclosure is a transmitting method of transmitting a visible light signal by way of luminance change, and includes Step SC11 to Step SC13.

In Step SC11, a luminance change pattern is determined by modulating the visible light signal as in the above-described embodiments.

In Step SC12, a common switch for turning ON, in common, a plurality of light sources which are included in a light source group of a display and are each used for representing a pixel in an image is switched according to the luminance change pattern.

In Step SC13, a first pixel switch (that is, the pixel switch) for turning ON a first light source among the plurality of light sources included in the light source group is turned ON, to cause the first light source to be ON only for a period in which the common switch is ON and the first pixel switch is ON, to transmit the visible light signal.

FIG. 463B is a block diagram illustrating a functional configuration of a transmitting apparatus according to an aspect of the present disclosure.

A transmitting apparatus C10 according to an aspect of the present disclosure is a transmitting apparatus (or a transmitter) that transmits a visible light signal by way of luminance change, and includes a determination unit C11, a common switch control unit C12, and a pixel switch control unit C13. The determination unit C11 determines a luminance change pattern by modulating the visible light signal as in the above-described embodiments. Note that this determination unit C11 is included in the signal input unit 1915 illustrated in FIG. 459, for example.

The common switch control unit C12 switches the common switch according to the luminance change pattern. This common switch is a switch for turning ON, in common, a plurality of light sources which are included in a light source group of a display and are each used for representing a pixel in an image.

The pixel switch control unit C13 turns ON a pixel switch which is for turning ON a light source to be controlled among the plurality of light sources included in the light source group, to cause the light source to be ON only for a period in which the common switch is ON and the pixel switch is ON, to transmit the visible light signal. Note that the light source to be controlled is the above-described first light source.

With this, a visible light signal can be properly transmitted from a display including a plurality of LEDs and the like as the light sources. Therefore, this enables communication between various devices including devices other than lightings. Furthermore, when the display is a display for displaying images under control of the common switch and the pixel switch, the visible light signal can be transmitted using the common switch and the pixel switch. Therefore, it is possible to easily transmit the visible light signal without a significant change in the structure for displaying images on the display (that is, the display device).

(Frame Configuration in Single Frame Transmission)

FIG. 464 is a diagram illustrating an example of a transmission signal in this embodiment.

A transmission frame includes, as illustrated in (a) of FIG. 464, a preamble (PRE), an ID length (IDLEN), an ID type (IDTYPE), content (ID/DATA), and a check code (CRC). The bit number of each area is an example. Note that the IDLEN is the same as FLEN illustrated in FIG. 438.

When a preamble such as that illustrated in (b) of FIG. 464 is used, the receiver can find a signal boundary by distinguishing the preamble from other part coded using the 4 PPM, I-4 PPM, or V4 PPM.

It is possible to transmit variable-length content by selecting a length of the ID/DATA in the IDLEN as illustrated in (c) of FIG. 464.

The CRC is a check code for correcting or detecting an error in other parts than the PRE. The CRC length varies according to the length of a part to be checked so that the check ability can be kept at a certain level or higher. Furthermore, the use of a different check code depending on the length of a part to be checked allows an improvement in the check ability per CRC length.

(Frame Configuration in Multiple Frame Transmission)

FIG. 465 and FIG. 466 are diagrams each illustrating an example of a transmission signal in this embodiment.

A partition type (PTYPE) and a check code (CRC) are added to transmission data (BODY), resulting in Joined data. The Joined data is divided into a certain number of DATAPARTs to each of which a preamble (PRE) and an address (ADDR) are added before transmission. The frame includes DATAPART, a preamble (PRE), and an address (ARDD). The transmission data is also referred to as data to be transmitted, and the partition type is also referred to as partition type information.

PTYPE (or partition mode (PMODE)) indicates a type of the data to be transmitted, specifically indicates a BODY dividing method or a BODY meaning. As illustrated in (a) of FIG. 465, PTYPE is set to 2 bits, which allows the coding to be performed by 4 PPM. As illustrated in (b) of FIG. 465, a transmission time can be shortened by setting PTYPE to 1 bit.

The CRC is a check code for checking the PTYPE and the BODY. The code length of the CRC varies according to the length of a part to be checked as provided in FIG. 443 so that the check ability can be kept at a certain level or higher.

The preamble is determined as in FIG. 444 so that the length of time for transmission can be reduced while a variety of dividing patterns is provided.

The address is determined as in FIG. 445 so that the receiver can reconstruct data regardless of the order of reception of the frame.

FIG. 466 illustrates combinations of available Joined data length and the number of frames. The underlined combinations are used in the later-described case where the PTYPE indicates a single frame compatible mode.

(Configuration of BODY Field)

FIG. 467 is a diagram illustrating an example of a transmission signal in this embodiment.

When the BODY has a field configuration such as that in the illustration, it is possible to transmit an ID that is the same as or similar to that in the single frame transmission method.

It is assumed that the same ID with the same IDTYPE represents the same meaning regardless of whether the transmission scheme is the single frame transmission method or the multiple frame transmission method and regardless of the combination of packets which are transmitted. This enables flexible signal transmission, for example, when data is continuously transmitted or when the length of time for reception is short.

The IDLEN indicates a length of the ID, and the remaining part is used to transmit PADDING. This part may be all 0 or 1, or may be used to transmit data that extends the ID, or may be a check code. The PADDING may be left-aligned.

With those in (b), (c), and (d) of FIG. 467, the length of time for transmission is shorter than that in (a) of FIG. 467. It is assumed that the length of the ID in this case is the maximum length that the ID can have.

In the case of (b) or (c) of FIG. 467, the bit number of the IDTYPE is an odd number which, however, can be an even number when the data is combined with the 1-bit PTYPE illustrated in (b) of FIG. 465, and thus the data can be efficiently encoded using the 4 PPM.

In the case of (c) of FIG. 467, a longer ID can be transmitted.

In the case of (d) of FIG. 467, the variety of representable IDTYPEs is greater.

(PTYPE)

FIG. 468 is a diagram illustrating an example of a transmission signal in this embodiment.

When the PTYPE has a predetermined number of bits, the PTYPE indicates that the BODY is in the single frame compatible mode. With this, it is possible to transmit the same ID as that in the case of the single frame transmission.

For example, when PTYPE=00, the ID or IDTYPE corresponding to the PTYPE can be treated in the same or similar way as the ID or IDTYPE transmitted in the case of the single frame transmission. Thus, the management of the ID or IDTYPE can be facilitated.

When the PTYPE has a predetermined number of bits, the PTYPE indicates that the BODY is in a data stream mode. At this time, all the combinations of the number of transmission frames and the DATAPART length can be used, and it can be assumed that data having a different combination has a different meaning. The bit of the PTYPE may indicate whether the different combination has the same meaning or a different meaning. This enables flexible selection of a transmitting method.

For example, ID having a size that is not defined in the single-frame transmitting method can be transmitted for PTYPE=01. Even if ID corresponding to PTYPE=01 is identical to ID of the single-frame transmitting method, ID corresponding to PTYPE=01 can be dealt with as ID different from ID of the single-frame transmitting method. Resultantly, the number of expressible IDs can be increased.

(Field Configuration in Single Frame Compatible Mode)

FIG. 469 is a diagram illustrating an example of a transmission signal of Embodiment 35.

For the use of the transmission signal in (a) of FIG. 467, in the single frame compatible mode, the transmission is performed most efficiently with a combination of a table in FIG. 469.

For the use of the transmission signal in (b), (c), or (d) of FIG. 467, a combination of the number of frames of 13 and the DATAPART length of 4 bits has good efficiency for the 32 bit ID, and a combination of the number of frames of 11 and the DATAPART length of 8 bits has good efficiency for the 64-bit ID.

When the transmission is performed only with the combination of the table, a combination different from the combination of the table is determined to be the reception error, so that the reception error rate can be lowered.

(Summary)

FIG. 470A is a flowchart illustrating an example of a signal generating method of Embodiment 35.

The signal generating method of Embodiment 35 is a method for generating the visible light signal to be transmitted by way of the luminance change of the light source included in the transmitter, and includes processes in steps SD11 to SD14.

In step SD11, one of the single-frame transmitting method for transmitting the data as one frame and the multiple-frame transmitting method for transmitting the data while dividing the data into the plurality of frames is determined to be the method for transmitting the visible light signal from the transmitter.

In step SD12, when the multiple-frame transmitting method is determined to be the method for transmitting the visible light signal, the partition type information indicating the type of the data to be transmitted is generated, and the combination data is generated by adding the partition type information to the data to be transmitted.

In step SD13, the plurality of frames each of which includes each of the plurality of data parts are generated by dividing the combination data into the plurality of data parts.

In step SD14, the visible light signal is generated by adding the preamble, which is the data indicating the head of the frame, to the head of each of the plurality of frames.

FIG. 470B is a block diagram illustrating an example of a configuration of a signal generating unit of Embodiment 35.

A signal generating unit D10 of Embodiment 35 is a device that generates the visible light signal to be transmitted by way of the luminance change of the light source included in the transmitter, and includes a determination unit D11, a first adder D12, a divider D13, and a second adder D14.

The determination unit D11 determines, as the method for transmitting the visible light signal from the transmitter, one of the single-frame transmitting method for transmitting the data as one frame and the multiple-frame transmitting method for transmitting the data while dividing the data into the plurality of frames.

When the multiple-frame transmitting method is determined to be the method for transmitting the visible light signal, the first adder D12 generates the partition type information indicating the type of the data to be transmitted, and generates the combination data by adding the partition type information to the data to be transmitted.

The divider D13 generates the plurality of frames each of which includes each of the plurality of data parts by dividing the combination data into the plurality of data parts.

The second adder D14 generates the visible light signal by adding the preamble, which is the data indicating the head of the frame, to the head of each of the plurality of frames.

For example, the single-frame transmitting method is a method for transmitting the data with the frame configuration of the single frame transmission illustrated in FIG. 438 or FIG. 464. The multiple-frame transmitting method is a method for transmitting the data with the frame configuration of the multiple frame transmission illustrated in FIG. 440 or FIG. 465. One of the single-frame transmitting method and the multiple-frame transmitting method is determined. When the multiple-frame transmitting method is determined, PTYPE illustrated in FIG. 465 is generated as the partition type information, and the combination data is generated by adding the partition type information to the data to be transmitted that is BODY. The visible light signal constructed with the plurality of frames each of which includes the preamble (PRE) is generated by dividing the combination data.

Therefore, when the multiple-frame transmitting method is determined, the data to be transmitted is transmitted as the visible light signal constructed with the plurality of frames, so that the long-distance communication is conducted, and the reception error and the reception delay can be reduced. Because the single-frame transmitting method and the multiple-frame transmitting method can be switched, the transmission method can properly be selected according to the communication distance or the amount of data to be transmitted. For example, when the reception delay occurs by dividing the small amount of data to be transmitted, the reception delay can be prevented by selecting the single-frame transmitting method. The partition type information is added to the data to be transmitted, so that the receiver can properly receive the data to be transmitted based on the partition type information. Accordingly, the communication can be conducted between various devices. The frame is a data unit, and is also referred to as a packet or a block.

In step SD14 or the second adder D14, the first preamble may be added to the head of the frame located at the last position in the array of the plurality of frames. Additionally, the second preamble different from the first preamble may be added to the head of the frame located at the position that is not the last position in the array. In step SD14 or the second adder D14, when the plurality of frames located at the positions that are not the last position are present in the array of the plurality of frames, the second preamble may be added to the head of each of the plurality of frames located at the positions that are not the last position.

For example, as illustrated in (a) of FIG. 444, the first preamble (the last address of PRE) is added to the head of the frame located at the last position, and the second preamble (the not-last address of PRE) is added to the head of the frame located at the position that is not the last position. Therefore, the receiver that receives the visible light signal can easily find the break or boundary between the data to be transmitted and the next data to be transmitted, and the receiver can receive the plurality of pieces of data to be transmitted while properly distinguishing the plurality of pieces of data to be transmitted from each other.

Each of the first and second preambles may be constructed with an N-bit (N is an integer of 2 or more) bit string, and the bit string may indicate the number previously correlated with the bit length of the data part included in each of the plurality of frames.

For example, as illustrated in (a) of FIG. 444, each of the first and second preambles is the 12-bit bit string. The bit string indicates a number (for example, "1101 0000 0000" or "0000 0000 1101") previously correlated with the bit length (for example, 64 bits) of the data part (DATAPART). Therefore, because the first and second preambles indicate the bit length of the data part while indicating the head of the frame, the data that is used only to notify the receiver of the bit length of the data part needs not to be provided in the frame. Accordingly, the time necessary for the transmission of the data to be transmitted can be shortened. When receiving the first or second preamble, the receiver can identify the bit length of the data part subsequent to the preambles. Resultantly, the receiver can properly receive the data part.

Each of the first and second preambles may be constructed with an M-bit (M is an integer that is greater than or equal to 2 and less than N) first bit string indicating the identical number greater than or equal to 1 and a K-bit (K=N−M) second bit string indicating 0, and the first preamble may differ from the second preamble in the order in which the first bit string and the second bit string are disposed.

For example, as illustrated in (a) of FIG. 444, each of the first and second preambles correlated with the 64-bit data part is constructed with the 4-bit first bit string indicating "1101" and the 8-bit second bit string indicating "0000 0000". In the 12-bit bit string that is the first preamble, the second bit string "0000 0000" is disposed next to the first bit string "1101". On the other hand, in the 12-bit bit string that is the second preamble, the first bit string "1101" is disposed next to the second bit string "0000 0000". Thus, the first preamble differs from the second preamble in the order in which the first bit string "1101" and the second bit string "0000 0000" are disposed. That is, the first and second preambles are constructed as the bit strings different from each other, and include the partially common bit string. Therefore, the receiver can search the first and second preambles using the partially common bit string without distinguishing the first and second preambles from each other, and can search only the first preamble or the second preamble using the whole bit string of the preamble. Accordingly, the data search efficiency can be improved.

The partition type information may indicate, as the type of the data to be transmitted, the first type or the second type in which the restriction of the data configuration is stricter than that of the first type. In step SD12 or the first adder D12, when the partition type information indicating the second type is added, the length information indicating the bit length of the data to be transmitted and the ID type information indicating the type of the identification information expressed by the data to be transmitted may further be added to the data to be transmitted.

For example, as illustrated in FIG. 468, PTYPE that is the partition type information indicates the first type that is the data stream or the second type that is the single frame compatible. When PTYPE indicates the single frame compatible, for example, IDLEN and IDTYPE are added to the data to be transmitted (ID) as illustrated in (a) of FIG. 467. IDLEN is the length information indicating the bit length of the data to be transmitted, and IDTYPE indicates the type of ID (identification information) expressed by the data to be transmitted. At this point, when the data to be transmitted is transmitted by the single-frame transmitting method, for example, IDLEN and IDTYPE are also added to the data to be transmitted (ID/DATA) as illustrated in FIG. 464. Accordingly, even if one of the single-frame transmitting method and the multiple-frame transmitting method is determined to be the method for transmitting the data to be transmitted, the data format can be commonalized. That is, the receiver can properly receive the data to be transmitted irrespective of whether the data to be transmitted is transmitted by either the single-frame transmitting method or the multiple-frame transmitting method.

It should be noted that in the above embodiments, each of the constituent elements may be constituted by dedicated hardware, or may be obtained by executing a software program suitable for the constituent element. Each constituent element may be achieved by a program execution unit such as a CPU or a processor reading and executing a software program stored in a recording medium such as a hard disk or semiconductor memory. For example, the program causes a computer to execute the signal generating method illustrated in the flowchart of FIG. 470A.

The present disclosure is applicable to the signal generating unit or the like that generates the visible light signal transmitted from, for example, a lighting display, a smartphone, a tablet, a mobile phone, a smart watch, a head mount display, an air conditioner, a rice cooker, a television set, a recorder, a projector, a display, or the like.

What is claimed is:

1. A signal generating method for generating a visible light signal transmitted by way of a luminance change of a light source included in a transmitter, the method comprising:

determining, by a processor and as a method for transmitting the visible light signal from the transmitter, one of a single-frame transmitting method for transmitting data as one frame and a multiple-frame transmitting method for transmitting the data while dividing the data into a plurality of frames;

when the multiple-frame transmitting method is determined to be the method for transmitting the visible light signal, generating, by the processor, partition type information indicating a type of data to be transmitted, and generating, by the processor, combination data by adding the partition type information to the data to be transmitted;

generating, by the processor, the plurality of frames, each of which includes each of a plurality of data parts, by dividing the combination data into the plurality of data parts;

generating, by the processor, the visible light signal by adding a preamble, being data indicating a head of a frame, to the head of each of the plurality of frames; and outputting, by the processor, the visible light signal to the transmitter, wherein in the generation of the visible light signal, a first preamble is added to the head of the frame located at a last position in an array of the plurality of frames as the preamble, and a second preamble different from the first preamble is added to the head of the frame located at a position that is not the last position in the array as the preamble.

2. The signal generating method according to claim 1, wherein in the generation of the visible light signal, when a plurality of frames located at positions that are not the last position are present in the array of the plurality of frames, the second preamble is added to the head of each of the plurality of frames located at the positions that are not the last position.

3. The signal generating method according to claim 1, wherein each of the first and second preambles is constructed with an N-bit (N is an integer of 2 or more) bit string, and the bit string indicates a number previously correlated with a bit length of a data part included in each of the plurality of frames.

4. The signal generating method according to claim 3, wherein each of the first and second preambles is constructed with an M-bit (M is an integer that is greater than or equal to 2 and less than N) first bit string indicating an identical number greater than or equal to 1 and a K-bit (K=N−M) second bit string indicating 0, and the first preamble differs from the second preamble in order in which the first bit string and the second bit string are disposed.

5. The signal generating method according to claim 4, wherein the partition type information indicates, as the type of the data to be transmitted, a first type or a second type in which a restriction of a data configuration is different from that of the first type, and when the partition type information indicating the second type is added in the generation of the combination data, length information indicating the bit length of the data to be transmitted and ID type information indicating a type of identification information expressed by the data to be transmitted are further added to the data to be transmitted.

6. A signal generating unit that generates a visible light signal to be transmitted by way of a luminance change of a light source included in a transmitter, the signal generating unit comprising:

a processor; and a memory storing thereon a computer program, which when executed by the processor, causes the processor to perform operations including:

determining, as a method for transmitting the visible light signal from the transmitter, one of a single-frame transmitting method for transmitting data as one frame and a multiple-frame transmitting method for transmitting the data while dividing the data into a plurality of frames;

when the multiple-frame transmitting method is determined to be the method for transmitting visible light signal, generating partition type information indicating a type of data to be transmitted, and generating combination data by adding the partition type information to the data to be transmitted;

generating the plurality of frames, each of which includes each of a plurality of data parts, by dividing the combination data into the plurality of data parts;

generating the visible light signal by adding a preamble that is data indicating a head of a frame to the head of each of the plurality of frames; and outputting the visible light signal to the transmitter, wherein in the generation of the visible light signal, a first preamble is added to the head of the frame located at a last position in an array of the plurality of frames as the preamble, and a second preamble different from the first preamble is added to the head of the frame located at a position that is not the last position in the array as the preamble.

7. A non-transitory recording medium having a computer program stored thereon, the computer program causing a processor which is included in a transmitter having a light source which transmits a visible light signal by change in luminance, to execute operations comprising:

determining, as a method for transmitting the visible light signal from the transmitter, one of a single-frame transmitting method for transmitting data as one frame and a multiple-frame transmitting method for transmitting the data while dividing the data into a plurality of frames;

when the multiple-frame transmitting method is determined to be the method for transmitting visible light signal, generating partition type information indicating a type of data to be transmitted, and generating combination data by adding the partition type information to the data to be transmitted;

generating the plurality of frames each of which includes each of a plurality of data parts by dividing the combination data into the plurality of data parts;

generating the visible light signal by adding a preamble, which is data indicating a head of a frame, to the head of each of the plurality of frames; and outputting the visible light signal to the transmitter, wherein in the generation of the visible light signal, a first preamble is added to the head of the frame located at a last position in an array of the plurality of frames as the preamble, and a second preamble different from the first preamble is added to the head of the frame located at a position that is not the last position in the array as the preamble.

* * * * *